US010889604B2

(12) United States Patent
Stoessel et al.

(10) Patent No.: US 10,889,604 B2
(45) Date of Patent: Jan. 12, 2021

(54) BINUCLEAR AND TRINUCLEAR METAL COMPLEXES COMPOSED OF TWO INTER-LINKED TRIPODAL HEXADENTATE LIGANDS FOR USE IN ELECTROLUMINESCENT DEVICES

(71) Applicant: Merck Patent GmbH, Darmstadt (DE)

(72) Inventors: Philipp Stoessel, Frankfurt am Main (DE); Christian Ehrenreich, Darmstadt (DE); Philipp Harbach, Muehltal (DE); Anna Hayer, Darmstadt (DE)

(73) Assignee: Merck Patent GmbH

( * ) Notice: Subject to any disclaimer, the term of this patent is extended or adjusted under 35 U.S.C. 154(b) by 10 days.

(21) Appl. No.: 16/329,363

(22) PCT Filed: Aug. 28, 2017

(86) PCT No.: PCT/EP2017/071521

§ 371 (c)(1),
(2) Date: Feb. 28, 2019

(87) PCT Pub. No.: WO2018/041769

PCT Pub. Date: Mar. 8, 2018

(65) Prior Publication Data

US 2019/0202851 A1 Jul. 4, 2019

(30) Foreign Application Priority Data

Aug. 30, 2016 (EP) .................................... 16186313
May 10, 2017 (KR) ........................ 10-2017-0058261

(51) Int. Cl.
*C07F 15/00* (2006.01)
*H01L 51/00* (2006.01)
*C09K 11/06* (2006.01)
*H01L 51/50* (2006.01)

(52) U.S. Cl.
CPC ...... *C07F 15/0073* (2013.01); *C07F 15/0033* (2013.01); *C09K 11/06* (2013.01); *H01L 51/009* (2013.01); *H01L 51/0072* (2013.01); *H01L 51/0085* (2013.01); *H01L 51/0067* (2013.01);
(Continued)

(58) Field of Classification Search
None
See application file for complete search history.

(56) References Cited

U.S. PATENT DOCUMENTS 7,332,232 B2 2/2008 Ma et al.
2003/0152802 A1 8/2003 Tsuboyama et al.
2006/0220004 A1 10/2006 Stoessel et al.
(Continued)

FOREIGN PATENT DOCUMENTS

KR 1020050070301 A 7/2005
KR 1020100084095 A 7/2010
(Continued)

OTHER PUBLICATIONS

Hofbeck, et al., "The Triplet State of fac-Ir(ppy)3," Inorg. Chem., vol. 49, No. 20, pp. 9290-9299 (2010).
(Continued)

*Primary Examiner* — Clinton A Brooks
(74) *Attorney, Agent, or Firm* — Faegre Drinker Biddle & Reath LLP

(57) ABSTRACT

The present invention relates to bi- and trinuclear metal complexes and to electronic devices, in particular organic electroluminescent devices, containing these complexes.

18 Claims, 3 Drawing Sheets a)

b)

(52) U.S. Cl.
CPC .. *H01L 51/5016* (2013.01); *H01L 2251/5384* (2013.01)

(56) References Cited

U.S. PATENT DOCUMENTS

| | | | |
|---|---|---|---|
| 2010/0308306 | A1 | 12/2010 | Schmid et al. |
| 2011/0012100 | A1 | 1/2011 | Stoessel |
| 2018/0026209 | A1 | 1/2018 | Stoessel et al. |

FOREIGN PATENT DOCUMENTS

| | | | |
|---|---|---|---|
| KR | 1020100128339 | A | 12/2010 |
| KR | 1020110086367 | A | 7/2011 |
| KR | 1020150103320 | A | 9/2015 |
| WO | 2004081017 | A1 | 9/2004 |
| WO | 2016124304 | A1 | 8/2016 |

OTHER PUBLICATIONS

Yang, et al., "From Mononuclear to Dinuclear Iridium(III) Complex: Effective Tuning of the Optoelectronic Characteristics for Organic Light-Emitting Diodes," Inorg. Chem., vol. 55, pp. 1720-1727 (2016).
Lanoe, et al., "Ditopic bis-terdentate cyclometallating ligands and their highly luminescent dinuclear iridium(III) complexes," Chem. Commun., vol. 50, pp. 6831-6834 (2014).
International Search Report for PCT/EP2017/071521, dated Dec. 7, 2017.

a)

b)

a)

b)

a)

b)

BINUCLEAR AND TRINUCLEAR METAL COMPLEXES COMPOSED OF TWO INTER-LINKED TRIPODAL HEXADENTATE LIGANDS FOR USE IN ELECTROLUMINESCENT DEVICES

RELATED APPLICATIONS

This application is a national stage entry, filed pursuant to 35 U.S.C. § 371, of PCT/EP2017/071521, filed Aug. 28, 2017, which claims the benefit of Korean Patent Application No. 10-2017-0058261, filed May 10, 2017, and European Patent Application No. 16186313.9, filed Aug. 30, 2016, both of which are incorporated herein by reference in their entireties.

The present invention relates to di- and trinuclear metal complexes which are suitable for use as emitters in organic electroluminescent devices.

In accordance with the prior art, the triplet emitters employed in phosphorescent organic electroluminescent devices (OLEDs) are, in particular, bis- and tris-ortho-metallated iridium complexes containing aromatic ligands, where the ligands are bonded to the metal via a negatively charged carbon atom and a neutral nitrogen atom or via a negatively charged carbon atom and a neutral carbene carbon atom. Examples of such complexes are tris(phenylpyridyl)iridium(III) and derivatives thereof, where the ligands employed are, for example, 1- or 3-phenylisoquinolines, 2-phenylquinolines or phenylcarbenes. These iridium complexes generally have a fairly long luminescence lifetime, for example 1.6 μs in the case of tris(phenyl-pyridyl) iridium(III) with a photoluminescence quantum yield of 90±5% in dichloromethane (Inorg. Chem. 2010, 9290). For use in OLEDs, however, short luminescence lifetimes are desired in order to be able to operate the OLEDs at high brightness with a low roll-off behaviour. There is also still a need for improvement in the efficiency of red-phosphorescent emitters. Due to the low triplet level T1, the photoluminescence quantum yield in conventional red-phosphorescent emitters is frequently significantly below the theoretically possible value, since, in the case of a low T1, non-radiative channels also play a greater role, in particular if the complex has a long luminescence lifetime. An improvement is desirable here by increasing the radiative rates, which can in turn be achieved by a reduction in the photoluminescence lifetime.

An improvement in the stability of the complexes has been achieved by the use of polypodal ligands, as described, for example, in WO 2004/081017, U.S. Pat. No. 7,332,232 and WO 2016/124304. Even if these complexes exhibit advantages compared with complexes which have the same ligand structure, but whose individual ligands are not polypodal, there is also still a need for improvement. Thus, even in the case of complexes having polypodal ligands, improvements are still desirable with respect to the properties, in particular in relation to efficiency, voltage and/or lifetime, on use in an organic electroluminescent device.

The object of the present invention is therefore the provision of novel metal complexes which are suitable as emitters for use in OLEDs. In particular, the object is to provide emitters which exhibit improved properties in relation to photoluminescence quantum yield and/or luminescence lifetime and/or which exhibit improved properties in relation to efficiency, operating voltage and/or lifetime on use in OLEDs.

Surprisingly, it has been found that the bi- and trinuclear rhodium and iridium complexes described below exhibit significant improvements in the photophysical properties compared with corresponding mononuclear complexes and thus also result in improved properties on use in an organic electroluminescent device. In particular, the compounds according to the invention have an improved photoluminescence quantum yield and a significantly reduced luminescence lifetime. A short luminescence lifetime results in improved roll-off behaviour of the organic electroluminescent device. The present invention relates to these complexes and to organic electroluminescent devices which contain these complexes.

The invention thus relates to a compound of the following formula (1) or (2), formula (1)

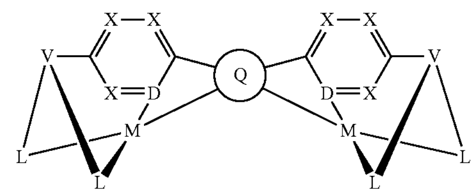

formula (2)

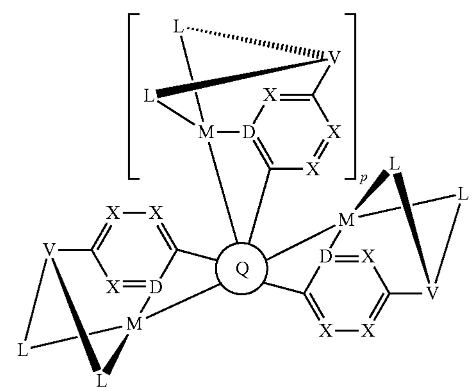

where the following applies to the symbols and indices used:

M is on each occurrence, identically or differently, iridium or rhodium;

Q is an aryl or heteroaryl group having 6 to 10 aromatic ring atoms, which is coordinated to each of the two or three M, identically or differently, via in each case a carbon or nitrogen atom and which may be substituted by one or more radicals R; the coordinating atoms in Q are not bonded in the ortho position to one another here;

D is on each occurrence, identically or differently, C or N;

X is identical or different on each occurrence and is CR or N;

p is 0 or 1;

V is on each occurrence, identically or differently, a group of the following formula (3) or (4), formula (3)

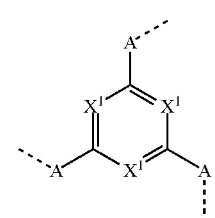

-continued formula (4)

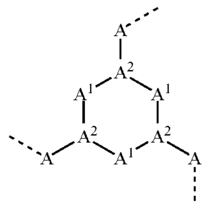

where one of the dashed bonds represents the bond to the corresponding 6-membered aryl or heteroaryl ring group depicted in formula (1) or (2) and the two other dashed bonds each represent the bonds to the part-ligands L;

L is on each occurrence, identically or differently, a bidentate, monoanionic part-ligand;

$X^1$ is on each occurrence, identically or differently, CR or N;

$A^1$ is on each occurrence, identically or differently, $C(R)_2$ or O;

$A^2$ is on each occurrence, identically or differently, CR, P(═O), B or SiR, with the proviso that, for $A^2$=P(═O), B or SiR, the symbol $A^1$ stands for O and the symbol A which is bonded to this $A^2$ does not stand for —C(═O)—NR'— or —C(═O)—O—;

A is on each occurrence, identically or differently, —CR═CR—, —C(═O)—NR'—, —C(═O)—O—, $—CR_2—CR_2—$, $—CR_2—O—$ or a group of the following formula (5), formula (5)

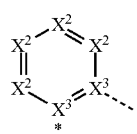

where the dashed bond represents the position of the bond from a bidentate part-ligand L or from the corresponding 6-membered aryl or heteroaryl ring group depicted in formula (1) or (2) to this structure and * represents the position of the linking of the unit of the formula (5) to the central cyclic group, i.e. the group which is explicitly shown in formula (3) or (4);

$X^2$ is on each occurrence, identically or differently, CR or N or two adjacent groups $X^2$ together stand for NR, O or S, so that a five-membered ring is formed, and the remaining $X^2$ stand, identically or differently on each occurrence, for CR or N; or two adjacent groups $X^2$ together stand for CR or N if one of the groups $X^3$ in the ring stands for N, so that a five-membered ring forms; with the proviso that a maximum of two adjacent groups $X^2$ stand for N;

$X^3$ is on each occurrence C or one group $X^3$ stands for N and the other group $X^3$ in the same ring stands for C; with the proviso that two adjacent groups $X^2$ together stand for CR or N if one of the groups $X^3$ in the ring stands for N;

R is on each occurrence, identically or differently, H, D, F, Cl, Br, I, $N(R^1)_2$, CN, $NO_2$, $OR^1$, $SR^1$, COOH, C(═O)$N(R^1)_2$, $Si(R^1)_3$, $B(OR^1)_2$, C(═O)$R^1$, P(═O)$(R^1)_2$, S(═O)$R^1$, S(═O)$_2R^1$, $OSO_2R^1$, COO(cation), $SO_3$(cation), $OSO_3$(cation), $OPO_3$(cation)$_2$, O(cation), $N(R^1)_3$(anion), $P(R^1)_3$(anion), a straight-chain alkyl group having 1 to 20 C atoms or an alkenyl or alkynyl group having 2 to 20 C atoms or a branched or cyclic alkyl group having 3 to 20 C atoms, where the alkyl, alkenyl or alkynyl group may in each case be substituted by one or more radicals $R^1$, where one or more non-adjacent $CH_2$ groups may be replaced by $Si(R^1)_2$, C═O, $NR^1$, O, S or $CONR^1$, or an aromatic or heteroaromatic ring system having 5 to 40 aromatic ring atoms, which may in each case be substituted by one or more radicals $R^1$; two radicals R here may also form a ring system with one another;

R' is on each occurrence, identically or differently, H, D, a straight-chain alkyl group having 1 to 20 C atoms or a branched or cyclic alkyl group having 3 to 20 C atoms, where the alkyl group may in each case be substituted by one or more radicals $R^1$ and where one or more non-adjacent $CH_2$ groups may be replaced by $Si(R^1)_2$, or an aromatic or heteroaromatic ring system having 5 to 40 aromatic ring atoms, which may in each case be substituted by one or more radicals $R^1$;

$R^1$ is on each occurrence, identically or differently, H, D, F, Cl, Br, I, $N(R^2)_2$, CN, $NO_2$, $OR^2$, $SR^2$, $Si(R^2)_3$, $B(OR^2)_2$, C(═O)$R^2$, P(═O)$(R^2)_2$, S(═O)$R^2$, S(═O)$_2R^2$, $OSO_2R^2$, COO(cation), $SO_3$(cation), $OSO_3$(cation), $OPO_3$(cation)$_2$, O(cation), $N(R^2)_3$(anion), $P(R^2)_3$(anion), a straight-chain alkyl group having 1 to 20 C atoms or an alkenyl or alkynyl group having 2 to 20 C atoms or a branched or cyclic alkyl group having 3 to 20 C atoms, where the alkyl, alkenyl or alkynyl group may in each case be substituted by one or more radicals $R^2$, where one or more non-adjacent $CH_2$ groups may be replaced by $Si(R^2)_2$, C═O, $NR^2$, O, S or $CONR^2$, or an aromatic or heteroaromatic ring system having 5 to 40 aromatic ring atoms, which may in each case be substituted by one or more radicals $R^2$; two or more radicals $R^1$ here may form a ring system with one another;

$R^2$ is on each occurrence, identically or differently, H, D, F or an aliphatic, aromatic or heteroaromatic organic radical, in particular a hydrocarbon radical, having 1 to 20 C atoms, in which, in addition, one or more H atoms may be replaced by F;

cation is selected on each occurrence, identically or differently, from the group consisting of proton, deuteron, alkali metal ions, alkaline-earth metal ions, ammonium, tetraalkylammonium and tetraalkylphosphonium;

anion is selected on each occurrence, identically or differently, from the group consisting of halides, carboxylates $R^2$—COO—, cyanide, cyanate, isocyanate, thiocyanate, thioisocyanate, hydroxide, $BF_4$—, $PF_6$—, $B(C_6F_5)_4$—, carbonate and sulfonates.

If two radicals R or $R^1$ form a ring system with one another, this may be mono- or polycyclic, aliphatic, heteroaliphatic, aromatic or heteroaromatic. The radicals which form a ring system with one another may be adjacent, i.e. these radicals are bonded to the same carbon atom or to carbon atoms which are bonded directly to one another, or they may be further remote from one another. A ring formation of this type is preferred in the case of radicals which are bonded to carbon atoms bonded directly to one another or which are bonded to the same carbon atom.

The formulation that two or more radicals may form a ring with one another is, for the purposes of the present description, intended to be taken to mean, inter alia, that the two radicals are linked to one another by a chemical bond with formal abstraction of two hydrogen atoms. This is illustrated by the following scheme:

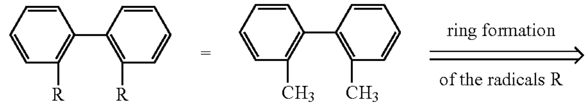

-continued

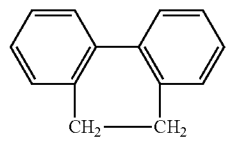

Furthermore, however, the above-mentioned formulation is also intended to be taken to mean that, in the case where one of the two radicals represents hydrogen, the second radical is bonded at the position to which the hydrogen atom was bonded, with formation of a ring. This is intended to be illustrated by the following scheme:

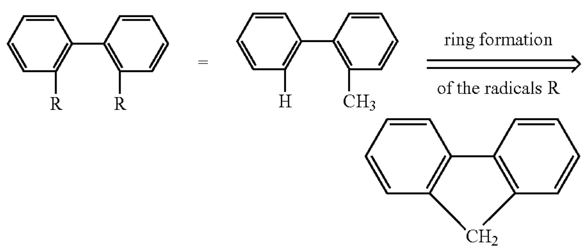

The formation of an aromatic ring system is intended to be illustrated by the following scheme:

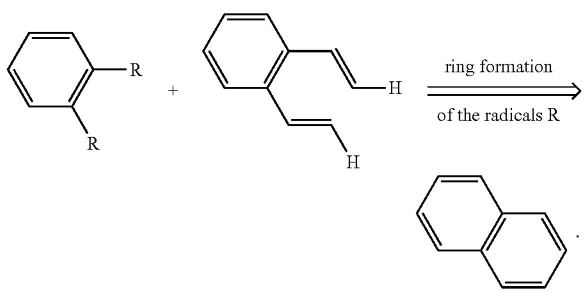

An aryl group in the sense of this invention contains 6 to 40 C atoms; a heteroaryl group in the sense of this invention contains 2 to 40 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, etc.

An aromatic ring system in the sense of this invention contains 6 to 40 C atoms in the ring system. A heteroaromatic ring system in the sense of this invention contains 1 to 40 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be interrupted by a non-aromatic unit (preferably less than 10% of the atoms other than H), such as, for example, a C, N or O atom or a carbonyl group. Thus, for example, systems such as 9,9'-spirobifluorene, 9,9-diarylfluorene, triarylamine, diaryl ether, stilbene, etc., are also intended to be taken to be aromatic ring systems in the sense of this invention, as are systems in which two or more aryl groups are interrupted, for example, by a linear or cyclic alkyl group or by a silyl group. Furthermore, systems in which two or more aryl or heteroaryl groups are bonded directly to one another, such as, for example, biphenyl, terphenyl, quaterphenyl or bipyridine are likewise intended to be taken to be an aromatic or heteroaromatic ring system. The aromatic or heteroaromatic ring system is preferably a system in which two or more aryl or heteroaryl groups are linked directly to one another via a single bond, or is fluorene, spirobifluorene or another aryl or heteroaryl group onto which an optionally substituted indene group has been condensed, such as, for example, indenocarbazole.

A cyclic alkyl group in the sense of this invention is taken to mean a mono-cyclic, bicyclic or polycyclic group.

For the purposes of the present invention, a $C_1$- to $C_{20}$-alkyl group, in which, in addition, individual H atoms or $CH_2$ groups may be substituted by the above-mentioned groups, is taken to mean, for example, the radicals methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoro-ethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl) cyclohex-1-yl and 1-(n-decyl)cyclohex-1-yl. An alkenyl group is taken to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is taken to mean, for example, ethynyl, propynyl, butynyl, pentynyl, hexynyl, heptynyl or octynyl. A $C_1$- to $C_{20}$-alkoxy group, as is present for $OR^1$ or $OR^2$, is taken to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system having 5-40 aromatic ring atoms, which may also in each case be substituted by the radicals mentioned above and which may be linked to the aromatic or heteroaromatic ring system via any desired positions, is taken to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or transindenofluorene, trans-monobenzoindenofluorene, cis- or trans-dibenzo-indenofluorene, truxene, isotruxene, spirotruxene, spiroisotruxene, furan, benzofuran, isobenzofuran, dibenzofuran, thiophene, benzothiophene, iso-benzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

For further illustration of the compound, a simple structure of the formula (1) is depicted in its entirety and explained below:

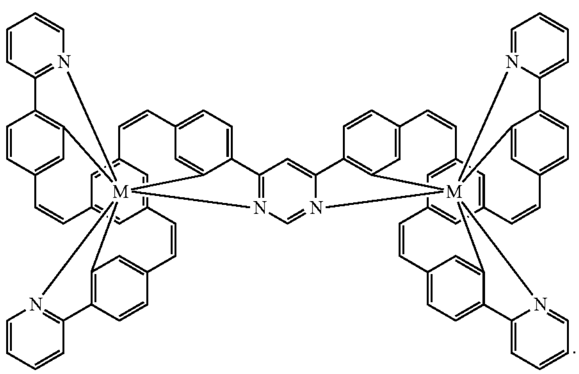

In this structure, Q stands for a pyrimidine group, where the pyrimidine is coordinated to in each case one of the two metals M via each of the two nitrogen atoms. Two phenyl groups, which correspond to the two six-membered aryl or heteroaryl ring groups in formula (1) containing D and which are in each case coordinated to one of the two metal M via a carbon atom, are bonded to the pyrimidine. In the illustrative structure depicted above, in each case a group of the formula (3) is bonded to each of these two phenyl groups, i.e. V in this structure stands for a group of the formula (3). The central ring therein is in each case a phenyl group and the three groups A each stand for —HC═CH—, i.e. for cis-alkenyl groups. In each case, two part-ligands L, which each stand for phenylpyridine in the structure depicted above, are also bonded to this group of the formula (3). Each of the two metals M in the structure depicted above is thus coordinated to in each case two phenylpyridine ligands and one phenylpyrimidine ligand, where the pyrimidine group of the phenylpyrimidine is coordinated to both metals M. The part-ligands here are each linked by the group of the formula (3) to form a polypodal system.

The term "bidentate part-ligand" for L in the sense of this application means that this unit would be a bidentate ligand if the group V, i.e. the group of the formula (3) or (4), were not present. The formal abstraction of a hydrogen atom on this bidentate ligand and the linking to the group V, i.e. the group of the formula (3) or (4), means, however, that this is not a separate ligand, but instead a part of the dodecadentate ligand formed in this way for p=0, i.e. a ligand having a total of 12 coordination sites, so that the term "part-ligand" is used for this. Correspondingly, the ligand has 18 coordination sites for p=1.

The bond from the ligand to the metal M can be either a coordination bond or a covalent bond or the covalent content of the bond can vary depending on the ligand. If the present application refers to the ligand or part-ligand being coordinated or bonded to M, this denotes in the sense of the present invention any type of bonding of the ligand or part-ligand to M, irrespective of the covalent content of the bond.

The compounds according to the invention are preferably not charged, i.e. they are electrically neutral. This is achieved by Rh or Ir in each case being in oxidation state+III. Each of the metals is then coordinated by three monoanionic bidentate part-ligands, so that the part-ligands compensate for the charge of the complexed metal atom.

As described above, the two metals M in the compound according to the invention may be identical or different and are preferably in oxidation state +III. For p=0, the combinations Ir/Ir, Ir/Rh and Rh/Rh are therefore possible. In a preferred embodiment of the invention, both metals M stand for Ir(III). Analogously, the combinations Ir/Ir/Ir, Ir/Ir/Rh, Ir/Rh/Rh and Rh/Rh/Rh are possible for p=1, and preferably all three metals M stand for Ir(III).

In a preferred embodiment of the invention, the compounds of the formulae (1) and (2) are selected from the compounds of the following formulae (1a) and (2a), formula (1a)

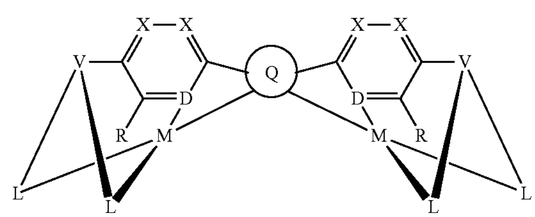

formula (2a)

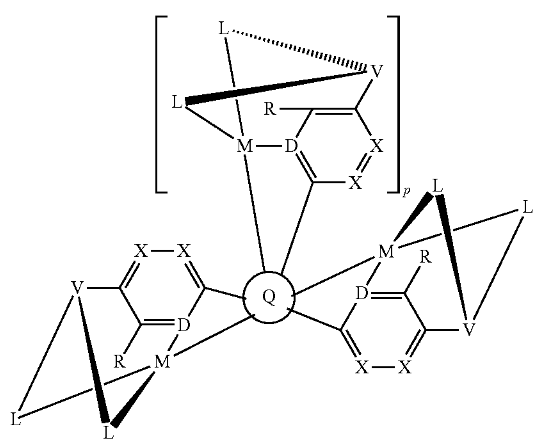

where the radical R explicitly drawn in in the ortho position to D is in each case selected, identically or differently on each occurrence, from the group consisting of H, D, F, $CH_3$ and $CD_3$ and preferably stands for H, and the other symbols and indices used have the meanings indicated above.

In a preferred embodiment, the group Q in formula (1) or (1a) stands for a group of one of the following formulae (Q-1) to (Q-3) and in formula (2) or (2a) stands for a group of one of the following formulae (Q-4) to (Q-15) for p=0 or for a group of the formulae (Q-16) to (Q-19) for p=1,
(Q-1)
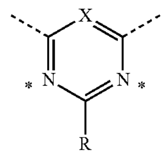
(Q-2)
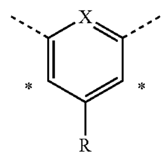
(Q-3)
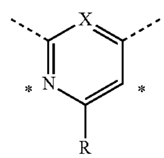
(Q-4)
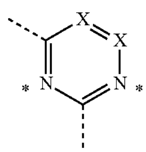
(Q-5)
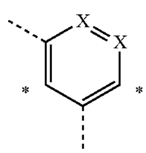
(Q-6)
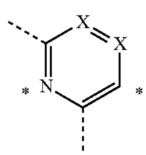
(Q-7)
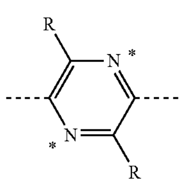
(Q-8)
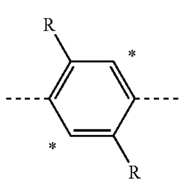
(Q-9)
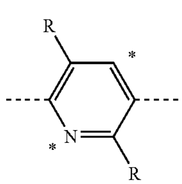
-continued
(Q-10)
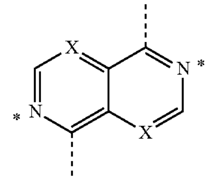
(Q-11)
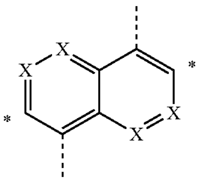
(Q-12)
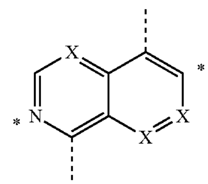
(Q-13)
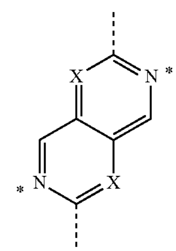
(Q-14)
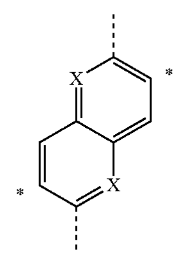
(Q-15)
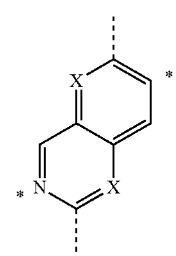
(Q-16)
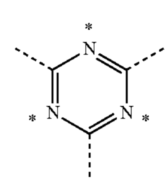

-continued (Q-17)

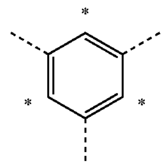

(Q-18)

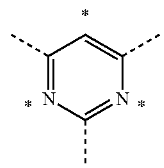

(Q-19)

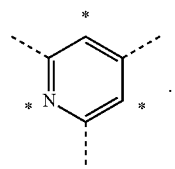

The dashed bond here in each case indicates the linking within the formula (1) or (2), and * marks the position at which this group is coordinated to M, and X and R have the meanings given above. Preferably, not more than two groups X per group Q which are not bonded directly to one another stand for N, and particularly preferably not more than one group X stands for N. Very particularly preferably, all X stand for CR and in particular for CH, and all R in (Q-1) to (Q-3) and (Q-7) to (Q-9) stand for H or D, in particular for H.

For compounds of the formula (2) or (2a), the groups (Q4), (Q-5) and (Q-7) to (Q-9) are preferred for p=0 and the group (Q-16) is preferred for p=1.

In a preferred embodiment of the invention, each of the two metals M in the compound of the formula (1) or (2) or the preferred embodiments is coordinated by precisely one carbon atom and one nitrogen atom, which are present as coordinating atoms in Q and as coordinating atom D, and is furthermore in each case coordinated by two part-ligands L. Thus, if the group Q represents a group of the formula (Q-1), (Q-4), (Q-7), (Q-10) or (Q-13), i.e. is coordinated to each of the two metals M via nitrogen atoms, the two groups D then preferably represents carbon atoms. If the group Q represents a group of the formula (Q-2), (Q-5), (Q-8), (Q-11) or (Q-14), i.e. is coordinated to each of the two metals M via carbon atoms, the two groups D then preferably represent nitrogen atoms. If the group Q represents a group of the formula (Q-3), (Q-6), (Q-9), (Q-12) or (Q-15), i.e. is coordinated to the two metals M via one carbon atom and one nitrogen atom, preferably the first of the two groups D then represents a nitrogen atom and the other group D represents a carbon atom, so that each M is coordinated by one carbon atom and one nitrogen atom. The same applies analogously to the groups of the formulae (Q-16) to (Q-19).

In a preferred embodiment of the present invention, the symbols X indicated in formula (1) or (2) or in the preferred embodiments furthermore stand, identically or differently on each occurrence, for CR, in particular for CH.

In a further preferred embodiment of the invention, p in formula (2)=0.

Preferred embodiments of V, i.e. the group of the formula (3) or (4), are shown below.

Suitable embodiments of the group of the formula (3) are the structures of the following formulae (6) to (9), and suitable embodiments of the groups of the formula (4) are the structures of the following formulae (10) to (14), formula (6)

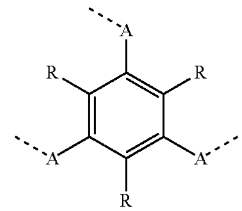

formula (7)

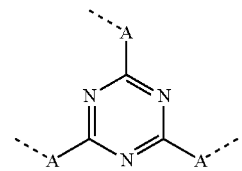

formula (8)

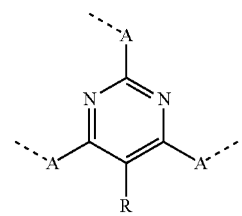

formula (9)

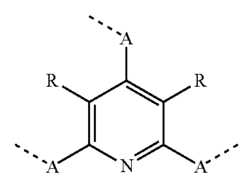

formula (10)

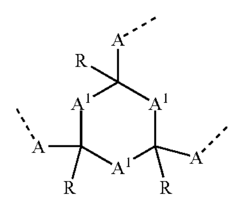

formula (11)

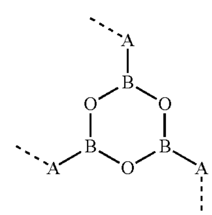

formula (12)

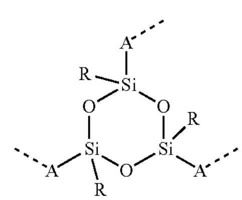

-continued formula (13)

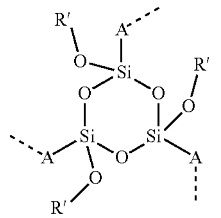

formula (14)

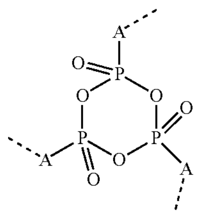

where the symbols have the meanings given above.

The following applies to preferred radicals R in formulae (6) to (14):

R is on each occurrence, identically or differently, H, D, F, CN, $OR^1$, a straight-chain alkyl group having 1 to 10 C atoms or an alkenyl group having 2 to 10 C atoms or a branched or cyclic alkyl group having 3 to 10 C atoms, which may in each case be substituted by one or more radicals $R^1$, or an aromatic or heteroaromatic ring system having 5 to 24 aromatic ring atoms, which may in each case be substituted by one or more radicals $R^1$;

$R^1$ is on each occurrence, identically or differently, H, D, F, CN, $OR^2$, a straight-chain alkyl group having 1 to 10 C atoms or an alkenyl group having 2 to 10 C atoms or a branched or cyclic alkyl group having 3 to 10 C atoms, which may in each case be substituted by one or more radicals $R^2$, or an aromatic or heteroaromatic ring system having 5 to 24 aromatic ring atoms, which may in each case be substituted by one or more radicals $R^2$; two or more adjacent radicals $R^1$ here may form a ring system with one another;

$R^2$ is on each occurrence, identically or differently, H, D, F or an aliphatic, aromatic or heteroaromatic organic radical having 1 to 20 C atoms, in which, in addition, one or more H atoms may be replaced by F.

The following applies to particularly preferred radicals R in formulae (6) to (14):

R is on each occurrence, identically or differently, H, D, F, CN, a straight-chain alkyl group having 1 to 4 C atoms or a branched or cyclic alkyl group having 3 to 6 C atoms, which may in each case be substituted by one or more radicals $R^1$, or an aromatic or heteroaromatic ring system 6 to 12 aromatic ring atoms, which may in each case be substituted by one or more radicals $R^1$;

$R^1$ is on each occurrence, identically or differently, H, D, F, CN, a straight-chain alkyl group having 1 to 4 C atoms or a branched or cyclic alkyl group having 3 to 6 C atoms, which may in each case be substituted by one or more radicals $R^2$, or an aromatic or heteroaromatic ring system having 6 to 12 aromatic ring atoms, which may in each case be substituted by one or more radicals $R^2$; two or more adjacent radicals $R^1$ here may form a ring system with one another;

$R^2$ is on each occurrence, identically or differently, H, D, F or an aliphatic or aromatic hydrocarbon radical having 1 to 12 C atoms.

In a preferred embodiment of the invention, all groups $X^1$ in the group of the formula (3) stand for CR, so that the central trivalent ring of the formula (3) represents a benzene. Particularly preferably, all groups $X^1$ stand for CH or CD, in particular for CH. In a further preferred embodiment of the invention, all groups $X^1$ stand for a nitrogen atom, so that the central trivalent ring of the formula (3) represents a triazine. Preferred embodiments of the formula (3) are thus the structures of the formulae (6) and (7) depicted above, in particular of the formula (6). The structure of the formula (6) is particularly preferably a structure of the following formula (6'), formula (6′)

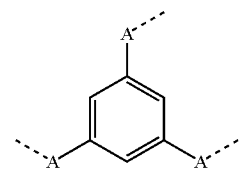

where the symbols have the meanings given above.

In a further preferred embodiment of the invention, all groups $A^2$ in the group of the formula (4) stand for CR. Particularly preferably, all groups $A^2$ stand for CH. Preferred embodiments of the formula (4) are thus the structures of the formula (10) depicted above. The structure of the formula (10) is particularly preferably a structure of the following formula (10') or (10"), formula (10′)

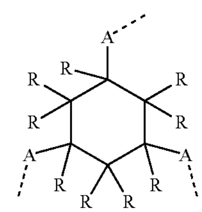

formula (10″)

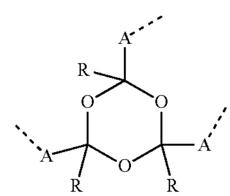

where the symbols have the meanings given above and R preferably stands for H.

The group V is particularly preferably a group of the formula (3) or the corresponding preferred embodiments.

Preferred groups A as occur in the structures of the formulae (3) and (4) and (6) to (14) are described below. The group A can represent, identically or differently on each occurrence, an alkenyl group, an amide group, an ester group, an alkylene group, a methylene ether group or an ortho-linked arylene or heteroarylene group of the formula (5). If A stands for an alkenyl group, it is a cis-linked alkenyl group. If A stands for an alkylene group, it is then preferably $—CH_2—CH_2—$. In the case of asymmetrical groups A, any orientation of the groups is possible. This is explained diagrammatically below for the example of A=—C(=O)—O— This gives rise to the following orientations of A, all of which are covered by the present invention:

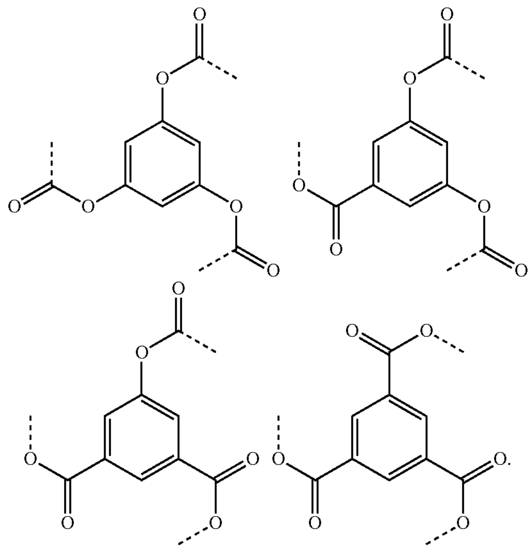

In a preferred embodiment of the invention, A is selected, identically or differently, preferably identically, on each occurrence, from the group consisting of —C(═O)—O—, —C(═O)—NR'—, —$CH_2$—$CH_2$— or a group of the formula (5). The groups A are particularly preferably selected, identically or differently, preferably identically, on each occurrence, from the group consisting of —C(═O)—O—, —C(═O)—NR'— or a group of the formula (5). A group of the formula (5) is very particularly preferred. Furthermore preferably, two groups A are identical and also identically substituted, and the third group A is different from the first two groups A, or all three groups A are identical and also identically substituted. Preferred combinations of the three groups A in formulae (3) and (4) and the preferred embodiments are:

| A | A | A |
|---|---|---|
| formula (5) | formula (5) | formula (5) |
| —C(═O)O— | —C(═O)O— | —C(═O)O— |
| —C(═O)O— | —C(═O)O— | formula (5) |
| —C(═O)O— | formula (5) | formula (5) |
| —C(═O)—NR'— | —C(═O)—NR'— | —C(═O)—NR'— |
| —C(═O)—NR'— | —C(═O)—NR'— | formula (5) |
| —C(═O)—NR'— | formula (5) | formula (5) |
| —$CH_2$—$CH_2$— | —$CH_2$—$CH_2$— | —$CH_2$—$CH_2$— |
| —$CH_2$—$CH_2$— | —$CH_2$—$CH_2$— | formula (5) |
| —$CH_2$—$CH_2$— | formula (5) | formula (5) |

If A stands for-C(═O)—NR'—, R' then preferably stands, identically or differently on each occurrence, for a straight-chain alkyl group having 1 to 10 C atoms or a branched or cyclic alkyl group having 3 to 10 C atoms or an aromatic or heteroaromatic ring system having 6 to 24 aromatic ring atoms, which may in each case be substituted by one or more radicals $R^1$. R' particularly preferably stands, identically or differently on each occurrence, for a straight-chain alkyl group having 1, 2, 3, 4 or 5 C atoms or a branched or cyclic alkyl group having 3, 4, 5 or 6 C atoms or an aromatic or heteroaromatic ring system having 6 to 12 aromatic ring atoms, which may in each case be substituted by one or more radicals $R^1$, but is preferably unsubstituted.

Preferred embodiments of the group of the formula (5) are described below. The group of the formula (5) can represent a heteroaromatic five-membered ring or an aromatic or heteroaromatic six-membered ring. In a preferred embodiment of the invention, the group of the formula (5) contains a maximum of two heteroatoms in the aromatic or heteroaromatic unit, particularly preferably a maximum of one heteroatom. This does not exclude substituents which may be bonded to this group from also possibly containing heteroatoms. Furthermore, this definition does not exclude the ring formation of substituents giving rise to condensed aromatic or heteroaromatic structures, such as, for example, naphthalene, benzimidazole, etc.

If both groups $X^3$ in formula (5) stand for carbon atoms, preferred embodiments of the group of the formula (5) are the structures of the following formulae (15) to (31), and if one group $X^3$ stands for a carbon atom and the other group $X^3$ in the same ring stands for a nitrogen atom, preferred embodiments of the group of the formula (5) are the structures of the following formulae (32) to (39),

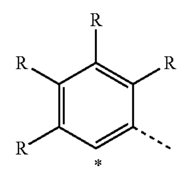

formula (15)

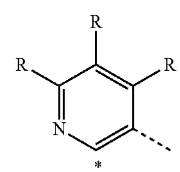

formula (16)

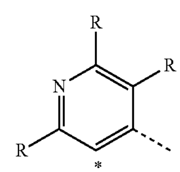

formula (17)

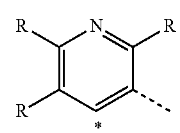

formula (18)

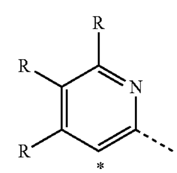

formula (19)

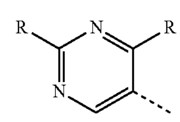

formula (20)

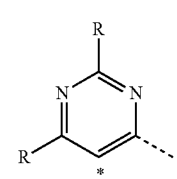

formula (21)

-continued formula (22)

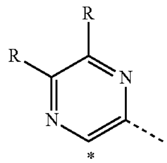

formula (23)

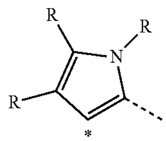

formula (24)

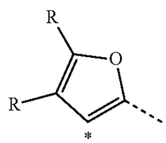

formula (25)

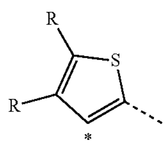

formula (26)

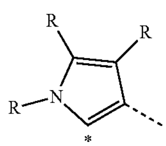

formula (27)

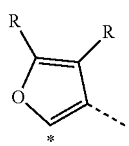

formula (28)

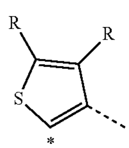

formula (29)

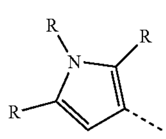

formula (30)

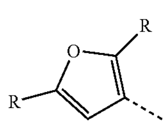

formula (31)

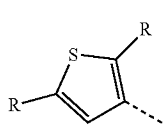

-continued formula (32)

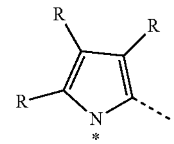

formula (33)

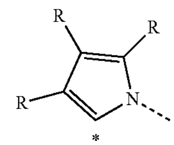

formula (34)

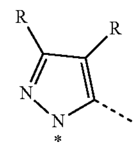

formula (35)

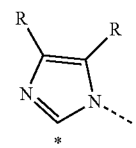

formula (36)

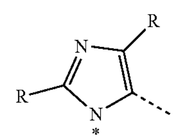

formula (37)

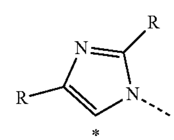

formula (38)

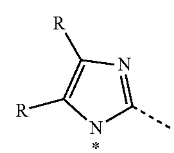

formula (39)

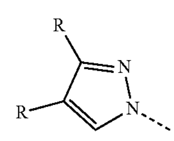

where the symbols have the meanings given above.

Particular preference is given to the six-membered aromatic and heteroaromatic groups of the formulae (15) to (19) depicted above. Very particular preference is given to ortho-phenylene, i.e. a group of the formula (15) shown above.

Adjacent substituents R may also form a ring system with one another here, so that condensed structures, also condensed aryl and heteroaryl groups, such as, for example, naphthalene, quinoline, benzimidazole, carbazole, dibenzofuran or dibenzothiophene, may form. Ring formation of this type is shown diagrammatically below for groups of the formula (15) shown above, which can result, for example, in groups of the following formulae (15a) to (15j):

-continued formula (15a)

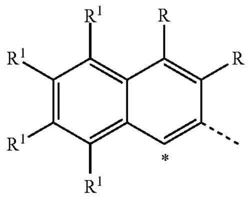

formula (15b)

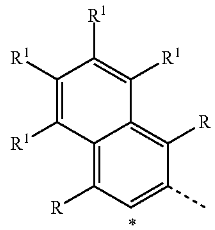

formula (15c)

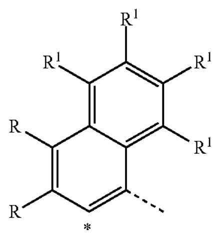

formula (15d)

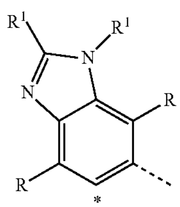

formula (15e)

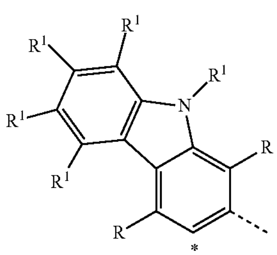

formula (15f)

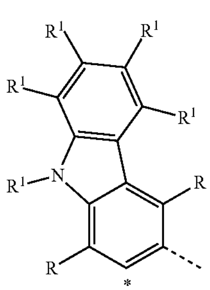

formula (15g)

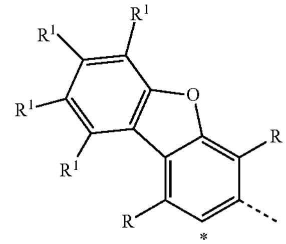

formula (15h)

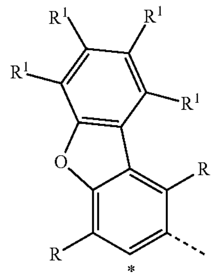

formula (15i)

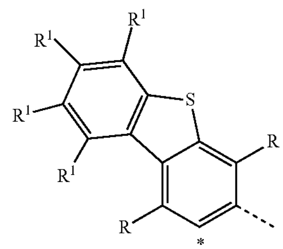

formula (15j)

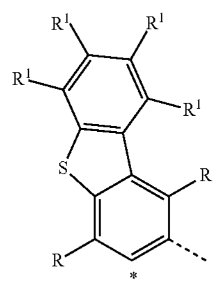

where the symbols have the meanings given above.

In general, the condensed-on groups can be condensed on at any position of the unit of the formula (5), as depicted by the condensed-on benzo group in the formulae (15a) to (15c). The groups as condensed onto the unit of the formula (5) in the formulae (15d) to (15j) can therefore also be condensed on at other positions of the unit of the formula (5).

The group of the formula (3) can preferably be represented by the following formulae (3a) to (3m), and the group of the formula (4) can preferably be represented by the following formulae (4a) to (4m):

formula (3a)
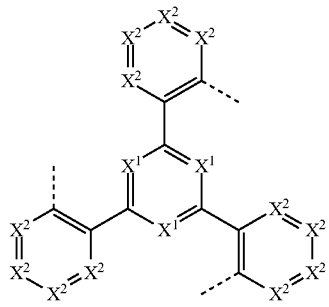
formula (3b)
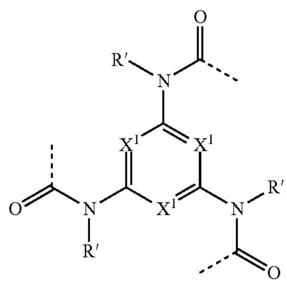
formula (3c)
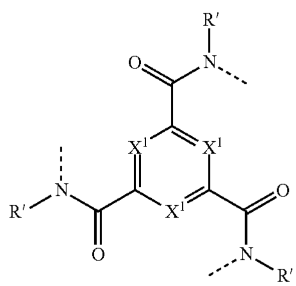
formula (3d)
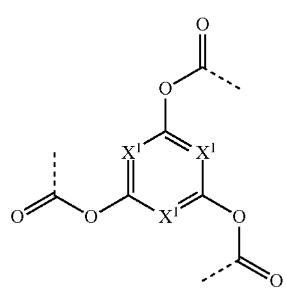
formula (3e)
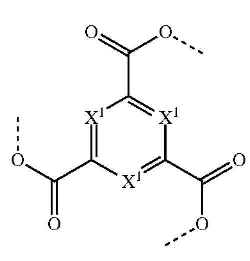
-continued
formula (3f)
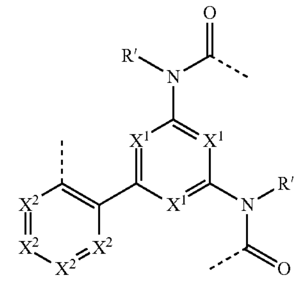
formula (3g)
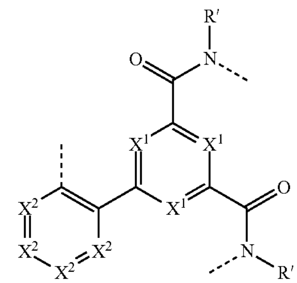
formula (3h)
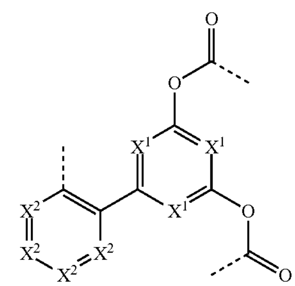
formula (3i)
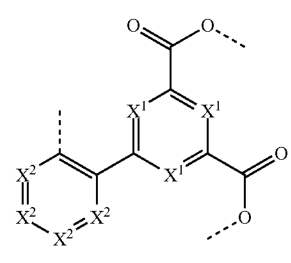
formula (3j)
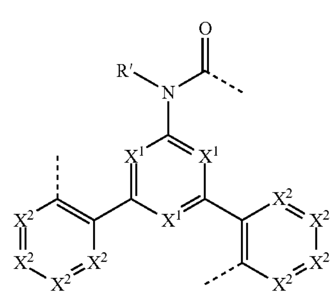

-continued
formula (3k)
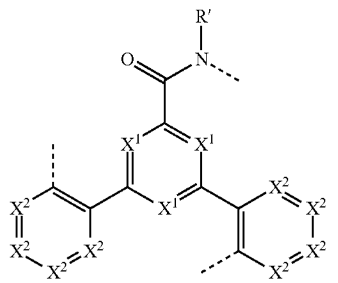
formula (3l)
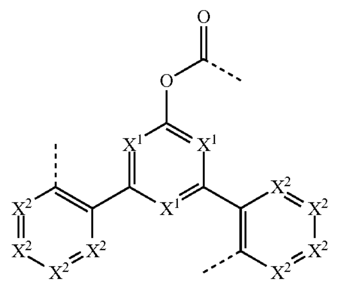
formula (3m)
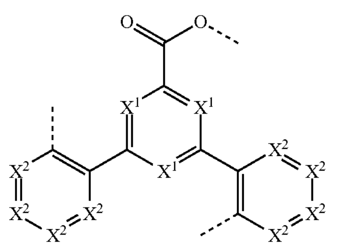
formula (4a)
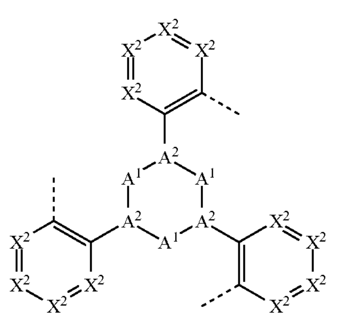
formula (4b)
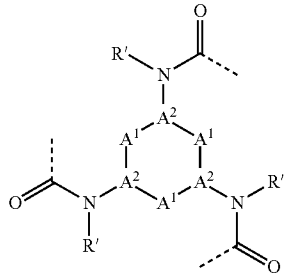
-continued
formula (4c)
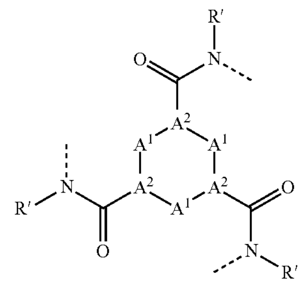
formula (4d)
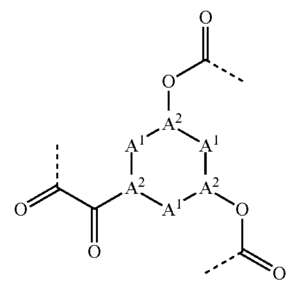
formula (4e)
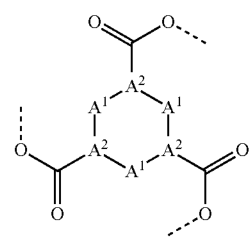
formula (4f)
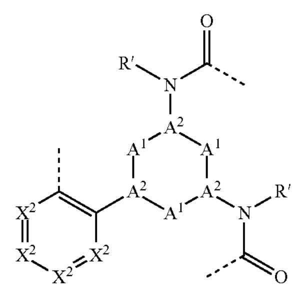
formula (4g)
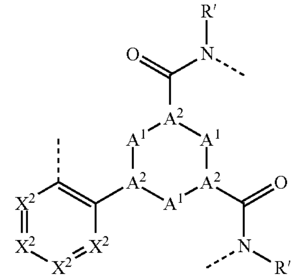

-continued formula (4h)

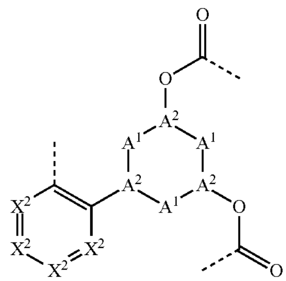

formula (4i)

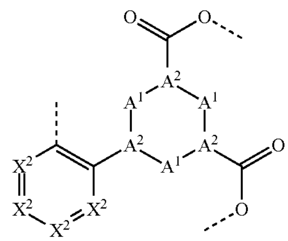

formula (4j)

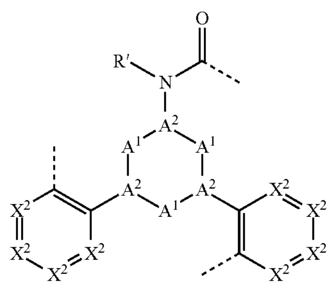

formula (4k)

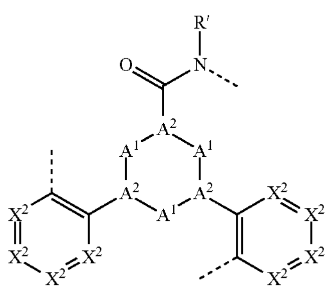

formula (4l)

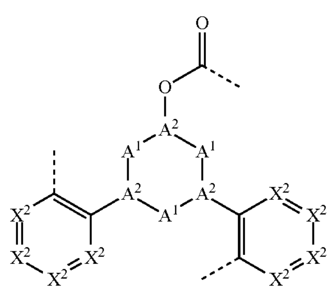

formula (4m)

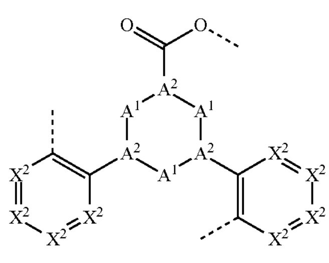

where the symbols have the meanings given above. $X^2$ preferably stands, identically or differently on each occurrence, for CR.

In a preferred embodiment of the invention, the group of the formulae (3a) to (3m) is selected from the groups of the formulae (6a') to (6m') and the group of the formulae (4a) to (4m) is selected from the groups of the formulae (10a') to (10m'), formula (6a′)

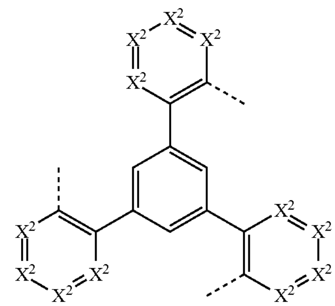

formula (6b′)

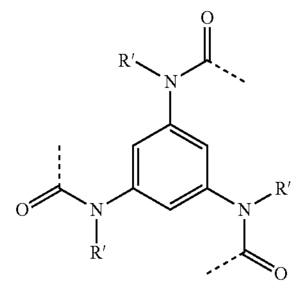

formula (6c′)

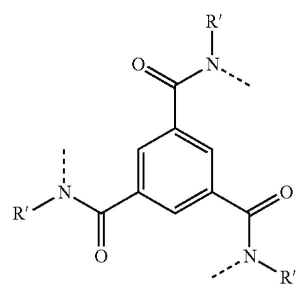

formula (6d′)

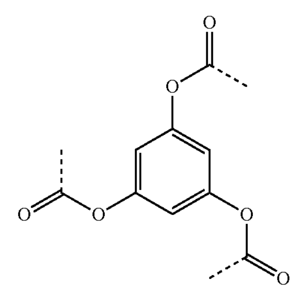

formula (6e′)

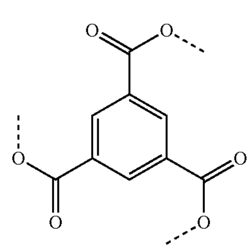

-continued
formula (6f′)
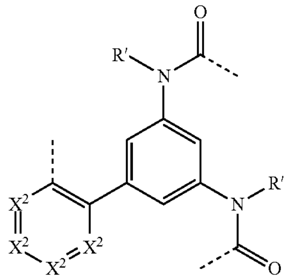
formula (6g′)
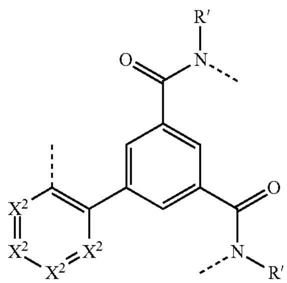
formula (6h′)
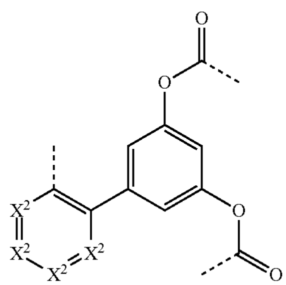
formula (6i′)
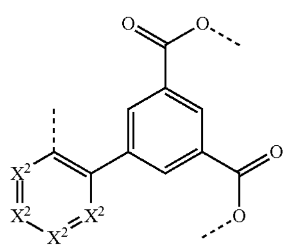
formula (6j′)
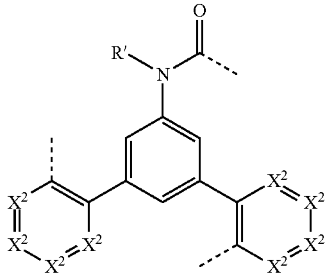
-continued
formula (6k′)
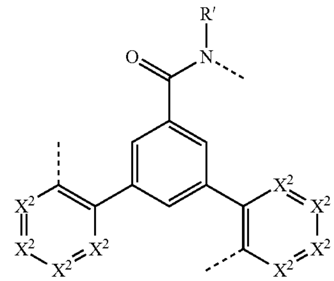
formula (6l′)
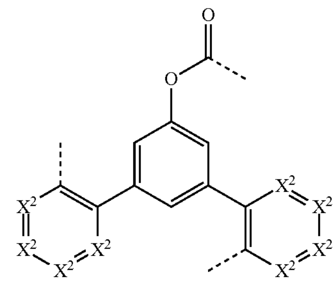
formula (6m′)
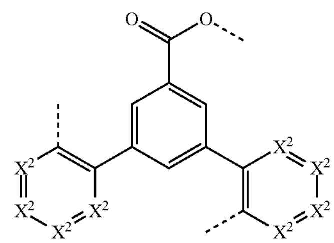
formula (10a′)
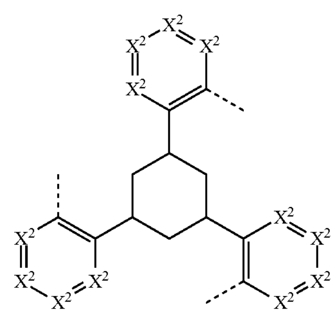
formula (10b′)
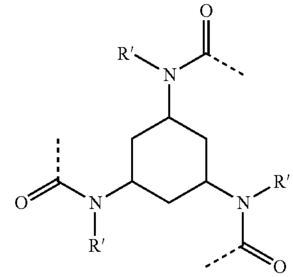

-continued
formula (10c′)
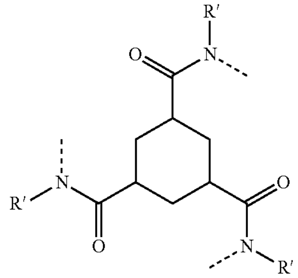
formula (10d′)
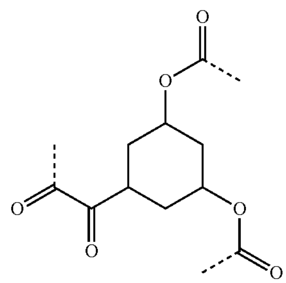
formula (10e′)
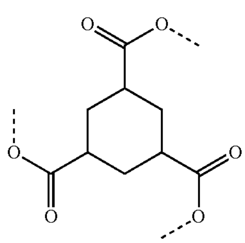
formula (10f′)
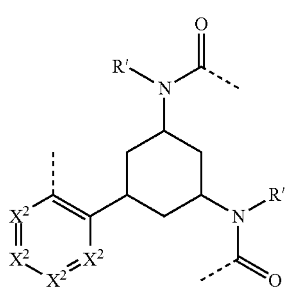
formula (10g′)
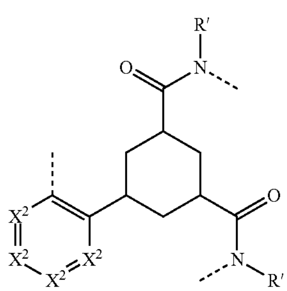
-continued
formula (10h′)
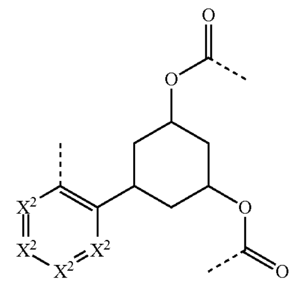
formula (10i′)
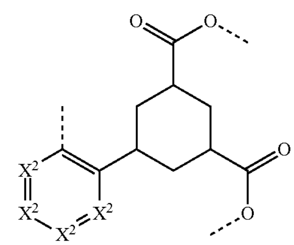
formula (10j′)
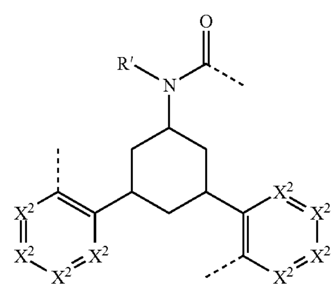
formula (10k′)
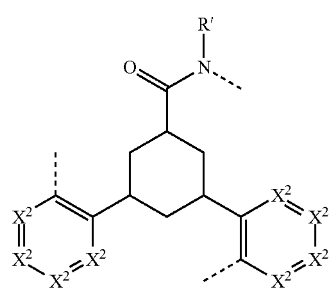
formula (10l′)
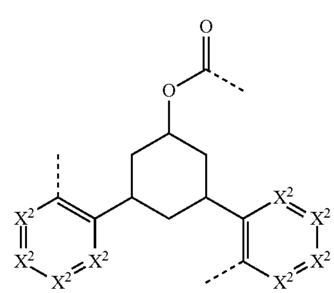

-continued formula (10m')

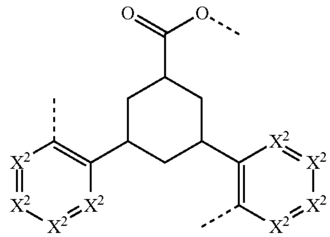

where the symbols have the meanings given above. $X^2$ preferably stands, identically or differently on each occurrence, for CR.

A particularly preferred embodiment of the group of the formula (3) is the group of the following formula (6a"), formula (6a")

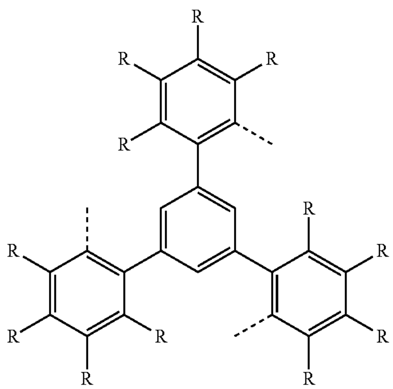

where the dashed bond has the meaning given above.

The groups R in the formulae shown above are particularly preferably, identically or differently, H, D or an alkyl group having 1 to 4 C atoms. R is very particularly preferably =H. Very particular preference is thus given to the structure of the following formula (6a'''), formula (6a''')

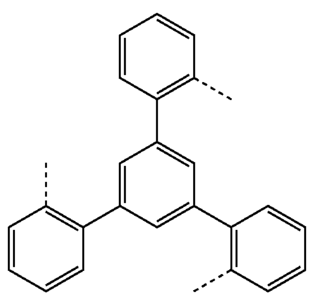

where the symbols have the meanings given above.

The bidentate, monoanionic part-ligands L are described below. The part-ligands may be identical or different. It is preferred here if in each case the two part-ligands L which are coordinated to the same metal M are identical and are also identically substituted. This preference is due to the simpler synthesis of the corresponding ligands.

In a further preferred embodiment, all four bidentate part-ligands L for p=0 or all six bidentate part-ligands L for p=1 are identical and are also identically substituted.

In a further preferred embodiment of the invention, the coordinating atoms of the bidentate part-ligands L are selected, identically or differently on each occurrence, from C, N, P, O, S and/or B, particularly preferably C, N and/or O and very particularly preferably C and/or N. The bidentate part-ligands L here preferably contain one carbon atom and one nitrogen atom or two carbon atoms or two nitrogen atoms or two oxygen atoms or one oxygen atom and one nitrogen atom as coordinating atoms. The coordinating atoms of each of the part-ligands L here may be identical or they may be different. Preferably, at least one of the two bidentate part-ligands L which are coordinated to the same metal M contains one carbon atom and one nitrogen atom or two carbon atoms as coordinating atoms, in particular one carbon atom and one nitrogen atom. Particularly preferably, all bidentate part-ligands contain one carbon atom and one nitrogen atom or two carbon atoms as coordinating atoms, in particular one carbon atom and one nitrogen atom. This is thus particularly preferably a metal complex in which all part-ligands are ortho-metallated, i.e. form a metallacycle with the metal M which contains at least one metal-carbon bond.

It is furthermore preferred if the metallacycle formed from the metal M and the bidentate part-ligand L is a five-membered ring, which is especially preferred if the coordinating atoms are C and N, N and N or N and O. If the coordinating atoms are 0, a six-membered metallacycle may also be preferred. This is depicted diagrammatically below:

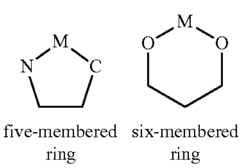

where N represents a coordinating nitrogen atom, C represents a coordinating carbon atom and O represent coordinating oxygen atoms and the carbon atoms drawn in represent atoms of the bidentate part-ligand L.

In a preferred embodiment of the invention, at least one of the bidentate part-ligands L per metal M and particularly preferably all bidentate part-ligands are selected, identically or differently on each occurrence, from the structures of the following formulae (L-1), (L-2) or (L-3), formula (L-1)

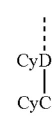

formula (L-2)

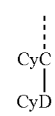

formula (L-3)

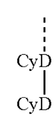

where the dashed bond represents the bond from the part-ligand L to V, i.e. to the group of the formula (3) or (4) or the preferred embodiments, and the following applies to the other symbols used:

CyC is, identically or differently on each occurrence, a substituted or unsubstituted aryl or heteroaryl group having 5 to 14 aromatic ring atoms, which is coordinated to M via a carbon atom and which is bonded to CyD via a covalent bond;

CyD is, identically or differently on each occurrence, a substituted or unsubstituted heteroaryl group having 5 to 14 aromatic ring atoms, which is coordinated to M via a nitrogen atom or via a carbene carbon atom and which is bonded to CyC via a covalent bond;

a plurality of the optional substituents here may form a ring system with one another; furthermore, the optional radicals are preferably selected from the above-mentioned radicals R.

CyD in the part-ligands of the formulae (L-1) and (L-2) here preferably coordinates via a neutral nitrogen atom or via a carbene carbon atom, in particular via a neutral nitrogen atom. Furthermore, one of the two groups CyD in the ligand of the formula (L-3) preferably coordinates via a neutral nitrogen atom and the other of the two groups CyD via an anionic nitrogen atom. Furthermore, CyC in the part-ligands of the formulae (L-1) and (L-2) preferably coordinates via anionic carbon atoms.

If a plurality of the substituents, in particular a plurality of radicals R, form a ring system with one another, the formation of a ring system from substituents which are bonded to directly adjacent carbon atoms is possible. It is furthermore also possible that the substituents on CyC and CyD in the formulae (L-1) and (L-2) or the substituents on the two groups CyD in formula (L-3) form a ring with one another, enabling CyC and CyD or the two groups CyD together also to form a single condensed aryl or heteroaryl group as bidentate ligands.

In a preferred embodiment of the present invention, CyC is an aryl or heteroaryl group having 6 to 13 aromatic ring atoms, particularly preferably having 6 to 10 aromatic ring atoms, very particularly preferably having 6 aromatic ring atoms, in particular a phenyl group which is coordinated to the metal via a carbon atom, may be substituted by one or more radicals R and is bonded to CyD via a covalent bond.

Preferred embodiments of the group CyC are the structures of the following formulae (CyC-1) to (CyC-20), (CyC-1)

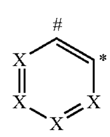

(CyC-2)

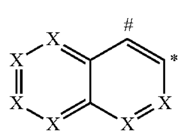

(CyC-3)

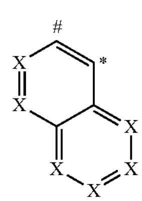

-continued (CyC-4)

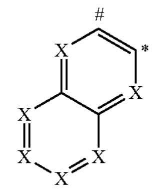

(CyC-5)

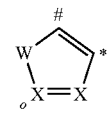

(CyC-6)

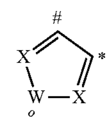

(CyC-7)

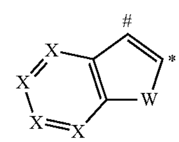

(CyC-8)

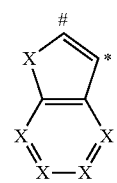

(CyC-9)

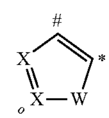

(CyC-10)

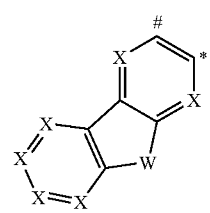

(CyC-11)

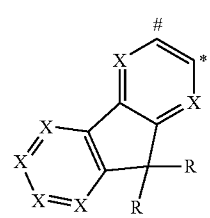

(CyC-12)

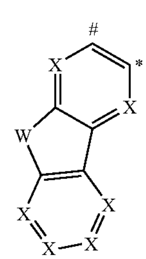

-continued (CyC-13)

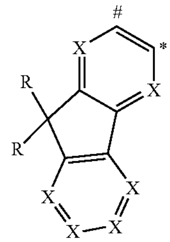

(CyC-14)

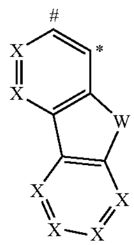

(CyC-15)

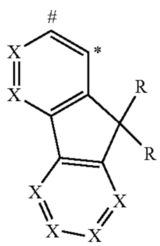

(CyC-16)

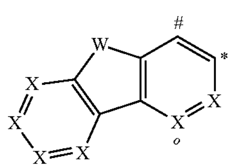

(CyC-17)

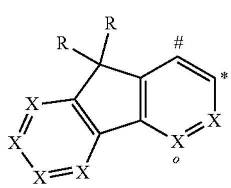

(CyC-18)

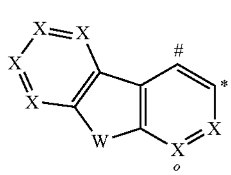

(CyC-19)

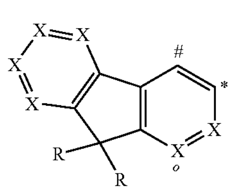

-continued (CyC-20)

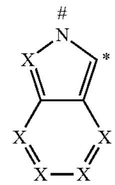

where CyC is in each case bonded to CyD at the position denoted by # and is coordinated to the metal at the position denoted by *, R has the meanings given above, and the following applies to the other symbols used:

X is on each occurrence, identically or differently, CR or N, with the proviso that a maximum of two symbols X per ring stand for N;

W is NR, O or S;

with the proviso that, if the part-ligand L is bonded to V, i.e. to the group of the formula (3) or (4), via CyC, one symbol X stands for C and the group V, i.e. the group of the formula (3) or (4) or the preferred embodiments, is bonded to this carbon atom. If the part-ligand L is bonded to the group of the formula (3) or (4) via the group CyC, the bonding preferably takes place via the position marked by "o" in the formulae depicted above, so that the symbol X marked by "o" then preferably stands for C. The structures depicted above which do not contain a symbol X marked by "o" are preferably not bonded to the group of the formula (3) or (4) since bonding of these groups to the group V is disadvantageous for steric reasons.

Preferably, in total a maximum of two symbols X in CyC stand for N, particularly preferably a maximum of one symbol X in CyC stands for N, very particularly preferably all symbols X stand for CR, with the proviso that, if CyC is bonded directly to the group V, i.e. to the group of the formula (3) or (4), one symbol X stands for C and the bridge of the formula (3) or (4) or the preferred embodiments is bonded to this carbon atom.

Particularly preferred groups CyC are the groups of the following formulae (CyC-1a) to (CyC-20a), (CyC-1a)

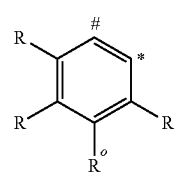

(CyC-1b)

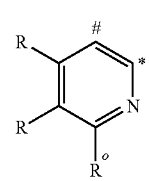

(CyC-1c)

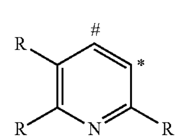

-continued
(CyC-1d)
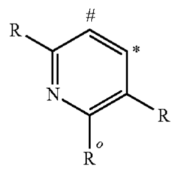
(CyC-1e)
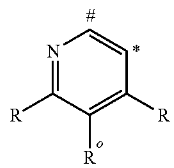
(CyC-1f)
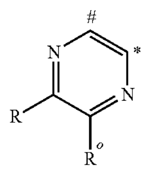
(CyC-1g)
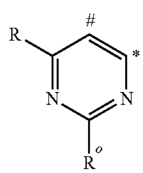
(CyC-1h)
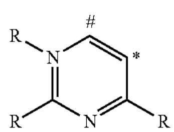
(CyC-2a)
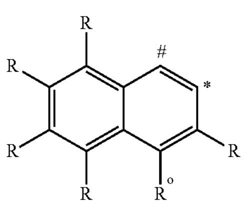
(CyC-2b)
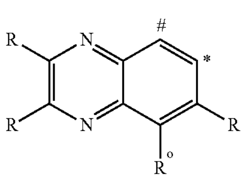
(CyC-3a)
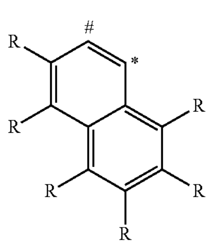
-continued
(CyC-3b)
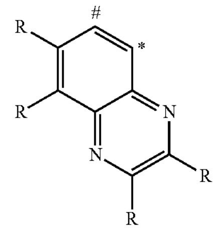
(CyC-4a)
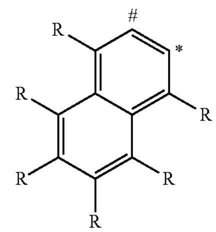
(CyC-4b)
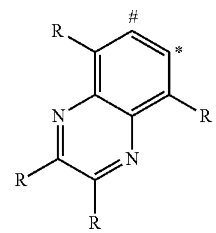
(CyC-5a)
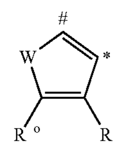
(CyC-6a)
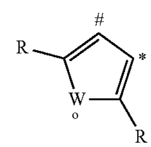
(CyC-7a)
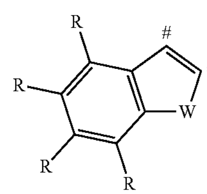
(CyC-8a)
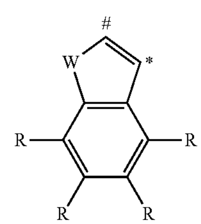
(CyC-9a)
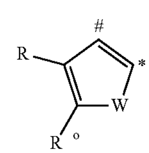

-continued (CyC-10a)

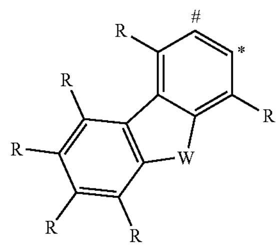

(CyC-11a)

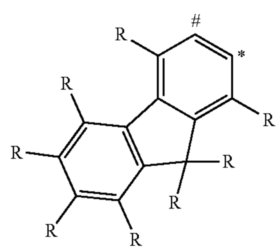

(CyC-12a)

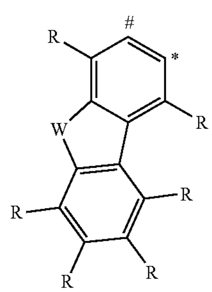

(CyC-13a)

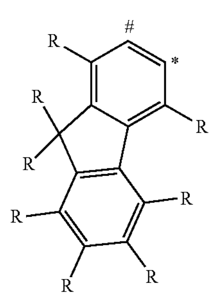

(CyC-14a)

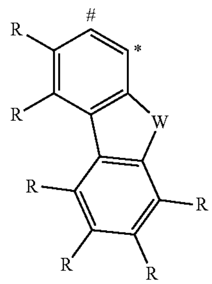

-continued (CyC-15a)

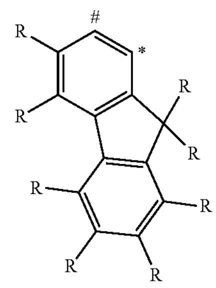

(CyC-16a)

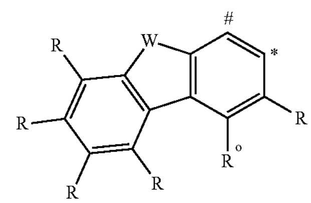

(CyC-17a)

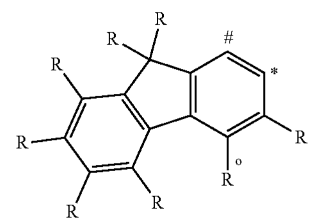

(CyC-18a)

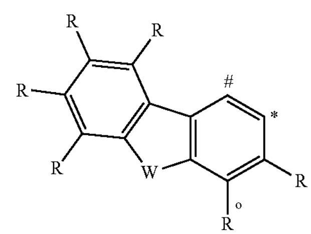

(CyC-19a)

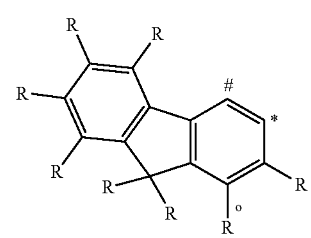

(CyC-20a)

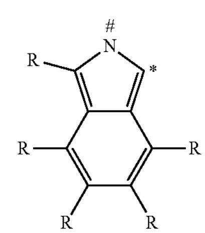

where the symbols have the meanings given above and, if CyC is bonded directly to the group V, i.e. to the group of the formula (3) or (4), a radical R is not present and the group of the formula (3) or (4) or the preferred embodiments is bonded to the corresponding carbon atom. If the group CyC is bonded directly to the group of the formula (3) or (4), the bonding preferably takes place via the position marked by "o" in the formulae depicted above, so that the radical R is then preferably not present in this position. The structures depicted above which do not contain a carbon atom marked by "o" are preferably not bonded directly to the group of the formula (3) or (4).

Preferred groups of the groups (CyC-1) to (CyC-20) are the groups (CyC-1), (CyC-3), (CyC-8), (CyC-10), (CyC-12), (CyC-13) and (CyC-16), and particular preference is given to the groups (CyC-1a), (CyC-3a), (CyC-8a), (CyC-10a), (CyC-12a), (CyC-13a) and (CyC-16a).

In a further preferred embodiment of the invention, CyD is a heteroaryl group having 5 to 13 aromatic ring atoms, particularly preferably having 6 to 10 aromatic ring atoms, which may be coordinated to the metal via a neutral nitrogen atom or via a carbene carbon atom and which may be substituted by one or more radicals R and which is bonded to CyC via a covalent bond.

Preferred embodiments of the group CyD are the structures of the following formulae (CyD-1) to (CyD-14), (CyD-1)

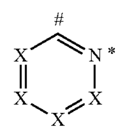

(CyD-2)

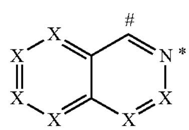

(CyD-3)

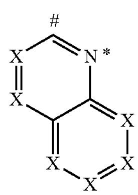

(CyD-4)

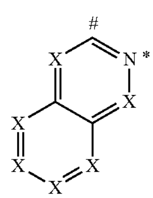

(CyD-5)

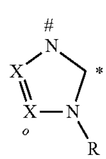

(CyD-6)

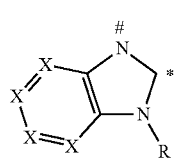

(CyD-7)

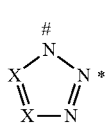

-continued (CyD-8)

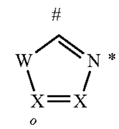

(CyD-9)

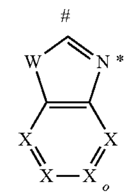

(CyD-10)

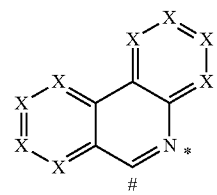

(CyD-11)

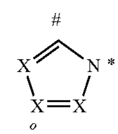

(CyD-12)

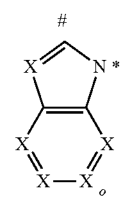

(CyD-13)

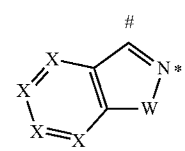

(CyD-14)

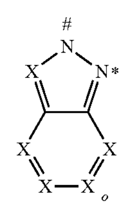

where the group CyD is in each case bonded to CyC at the position denoted by # and is coordinated to the metal at the position denoted by *, and where X, W and R have the meanings given above, with the proviso that, if CyD is bonded directly to the group V, i.e. to the group of the formula (3) or (4), one symbol X stands for C and the bridge of the formula (3) or (4) or the preferred embodiments is bonded to this carbon atom. If the group CyD is bonded directly to the group of the formula (3) or (4), the bonding preferably takes place via the position marked by "o" in the formulae depicted above, so that the symbol X marked by "o" then preferably stands for C. The structures depicted above which do not contain a symbol X marked by "o" are preferably not bonded directly to the group of the formula (3) or (4) since bonding of these groups to the group V is disadvantageous for steric reasons.

The groups (CyD-1) to (CyD-4), (CyD-7) to (CyD-10), (CyD-13) and (CyD-14) are coordinated to the metal via a neutral nitrogen atom, (CyD-5) and (CyD-6) are coordinated to the metal via a carbene carbon atom and (CyD-11) and (CyD-12) are coordinated to the metal via an anionic nitrogen atom.

Preferably, in total a maximum of two symbols X in CyD stand for N, particularly preferably a maximum of one symbol X is CyD stands for N, especially preferably all symbols X stand for CR, with the proviso that, if CyD is bonded directly to the group V, i.e. to the group of the formula (3) or (4), one symbol X stands for C and the bridge of the formula (3) or (4) for the preferred embodiments is bonded to this carbon atom.

Particularly preferred groups CyD are the groups of the following formulae (CyD-1a) to (CyD-14b), (CyD-1a)

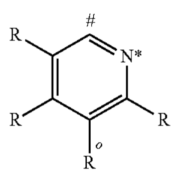

(CyD-2a)

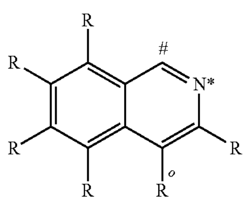

(CyD-3a)

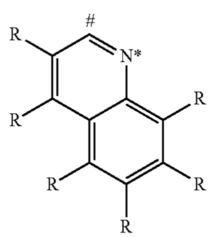

(CyD-3b)

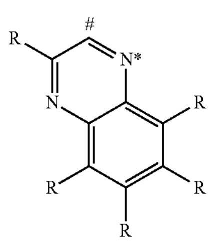

(CyD-4a)

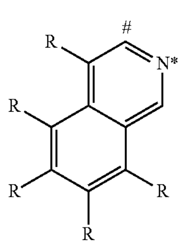

-continued (CyD-5a)

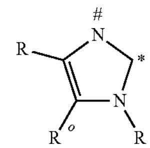

(CyD-6a)

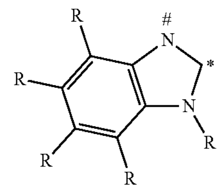

(CyD-7a)

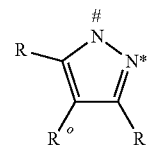

(CyD-8a)

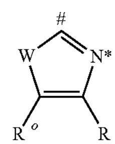

(CyD-9a)

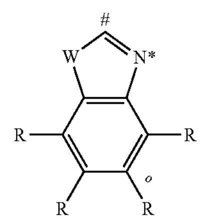

(CyD-10a)

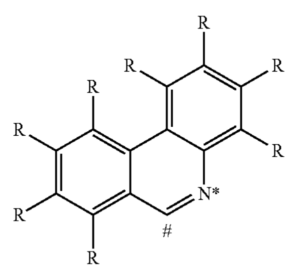

(CyD-11a)

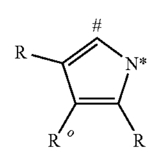

(CyD-11b)

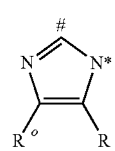

(CyD-11c)

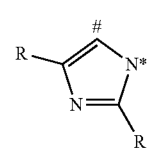

-continued (CyD-11d)

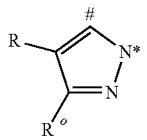

(CyD-12a)

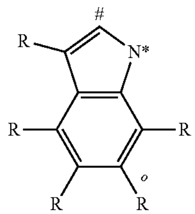

(CyD-12b)

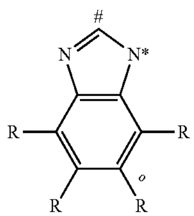

(CyD-13a)

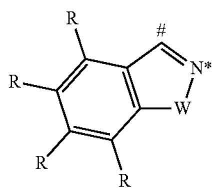

(CyD-14a)

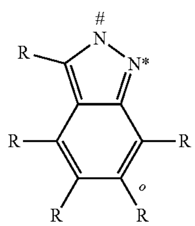

(CyD-14b)

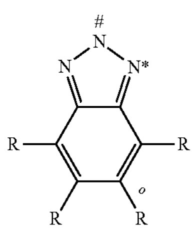

where the symbols used have the meanings given above and, if CyD is bonded directly to the group V, i.e. to the group of the formula (3) or (4), a radical R is not present and the bridge of the formula (3) or (4) or the preferred embodiments is bonded to the corresponding carbon atom. If CyD is bonded directly to the group of the formula (3) or (4), the bonding preferably takes place via the position marked by “o” in the formulae depicted above, so that the radical R is then preferably not present in this position. The structures depicted above which do not contain a carbon atom marked by “o” are preferably not bonded directly to the group of the formula (3) or (4).

Preferred groups of the groups (CyD-1) to (CyD-14) are the groups (CyD-1), (CyD-2), (CyD-3), (CyD-4), (CyD-5) and (CyD-6), in particular (CyD-1), (CyD-2) and (CyD-3), and particular preference is given to the groups (CyD-1a), (CyD-2a), (CyD-3a), (CyD-4a), (CyD-5a) and (CyD-6a), in particular (CyD-1a), (CyD-2a) and (CyD-3a).

In a preferred embodiment of the present invention, CyC is an aryl or heteroaryl group having 6 to 13 aromatic ring atoms, and at the same time CyD is a heteroaryl group having 5 to 13 aromatic ring atoms. CyC is particularly preferably an aryl or heteroaryl group having 6 to 10 aromatic ring atoms, and at the same time CyD is a heteroaryl group having 5 to 10 aromatic ring atoms. CyC is very particularly preferably an aryl or heteroaryl group having 6 aromatic ring atoms, in particular phenyl, and CyD is a heteroaryl group having 6 to 10 aromatic ring atoms. CyC and CyD here may be substituted by one or more radicals R.

The preferred groups (CyC-1) to (CyC-20) and (CyD-1) to (CyD-14) mentioned above can be combined with one another as desired in the part-ligands of the formulae (L-1) and (L-2) so long as at least one of the groups CyC and CyD has a suitable linking site to the group of the formula (3) or (4), where suitable linking sites in the above-mentioned formulae are denoted by “o”. It is especially preferred if the groups CyC and CyD mentioned above as particularly preferred, i.e. the groups of the formulae (CyC-1a) to (CyC-20a) and the groups of the formulae (CyD-1a) to (CyD-14b), are combined with one another, so long as at least one of the preferred groups CyC or CyD has a suitable linking site to the group of the formula (3) or (4), where suitable linking sites in the above-mentioned formulae are denoted by “o”. Combinations in which neither CyC nor CyD has such a suitable linking site to the bridge of the formula (3) or (4) are therefore not preferred.

It is very particularly preferred if one of the groups (CyC-1), (CyC-3), (CyC-8), (CyC-10), (CyC-12), (CyC-13) and (CyC-16), and in particular the groups (CyC-1a), (CyC-3a), (CyC-8a), (CyC-10a), (CyC-12a), (CyC-13a) and (CyC-16a), are combined with one of the groups (CyD-1), (CyD-2) and (CyD-3), and in particular with one of the groups (CyD-1a), (CyD-2a) and (CyD-3a).

Preferred part-ligands (L-1) are the structures of the following formulae (L-1-1) and (L-1-2), and preferred part-ligands (L-2) are the structures of the following formulae (L-2-1) to (L-2-3), (L-1-1)

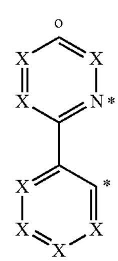

(L-1-2)

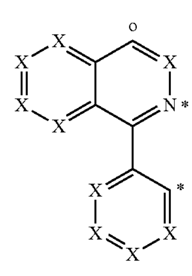

-continued (L-2-1)

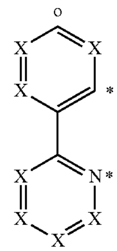

(L-2-2)

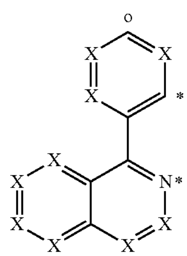

(L-2-3)

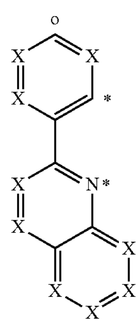

where the symbols used have the meanings given above, * indicates the position of the coordination to the metal M, and "o" represents the position of the bond to the group V, i.e. to the group of the formula (3) or (4).

Particularly preferred part-ligands (L-1) are the structures of the following formulae (L-1-1a) and (L-1-2b), and particularly preferred part-ligands (L-2) are the structures of the following formulae (L-2-1a) to (L-2-3a), (L-1-1a)

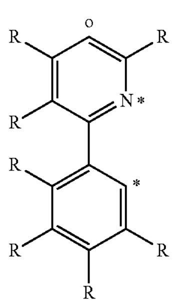

-continued (L-1-2a)

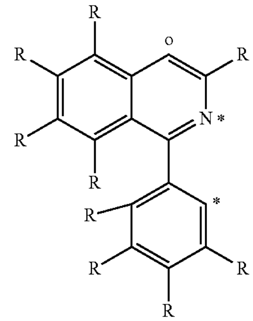

(L-2-1a)

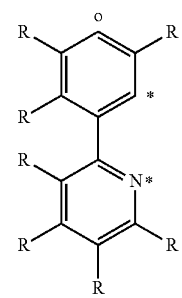

(L-2-2a)

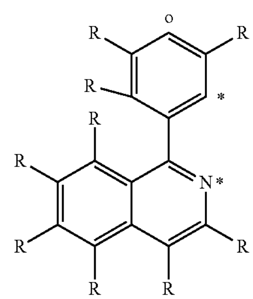

(L-2-3a)

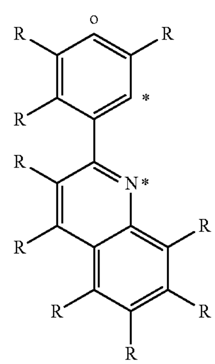

where the symbols used have the meanings given above and "o" represents the position of the bond to the group V, i.e. to the group of the formula (3) or (4).

The above-mentioned preferred groups CyD in the part-ligands of the formula (L-3) can likewise be combined with one another as desired, where a neutral group CyD, i.e. a group (CyD-1) to (CyD-10), (CyD-13) or (CyD-14), is combined with an anionic group CyD, i.e. a group (CyD-11) or (CyD-12), so long as at least one of the preferred groups CyD has a suitable linking site to the group of the formula (3) or (4), where suitable linking sites in the above-mentioned formulae are denoted by "o".

If two radicals R, one of which is bonded to CyC and the other to CyD in the formulae (L-1) and (L-2) or one of which is bonded to one group CyD and the other is bonded to the other group CyD in formula (L-3), form a ring system with one another, bridged part-ligands and also part-ligands which overall represent a single larger heteroaryl group, such as, for example, benzo[h]quinoline, etc., may arise. The ring formation between the substituents on CyC and CyD in the formulae (L-1) and (L-2) or between the substituents on the two groups CyD in the formula (L-3) preferably takes place here by a group of one of the following formulae (40) to (49), formula (40)

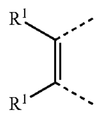

formula (41)

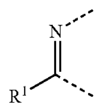

formula (42)

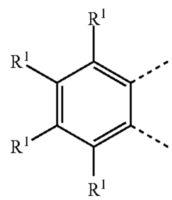

formula (43)

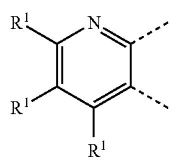

formula (44)

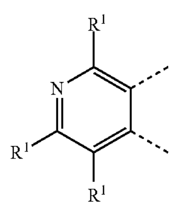

formula (45)

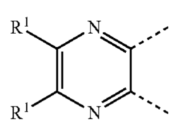

formula (46)

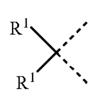

formula (47)

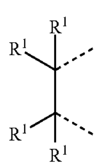

formula (48)

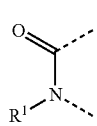

-continued formula (49)

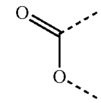

where $R^1$ has the meanings give above and the dashed bonds indicate the bonds to CyC or CyD. The asymmetrical groups of those mentioned above can be incorporated in each of the two orientations, for example in the case of the group of the formula (49) the oxygen atom can be bonded to the group CyC and the carbonyl group to the group CyD, or the oxygen atom can be bonded to the group CyD and the carbonyl group to the group CyC.

The group of the formula (46) is particularly preferred if the ring formation thus gives rise to a six-membered ring, as depicted, for example, below by the formulae (L-22) and (L-23).

Preferred ligands which arise through ring formation of two radicals R on the different rings are the structures of the formulae (L-4) to (L-31) shown below, (L-4)

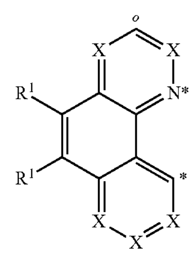

(L-5)

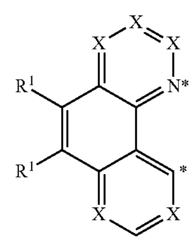

(L-6)

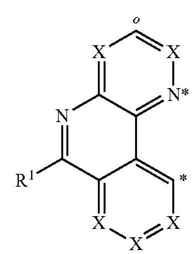

(L-7)

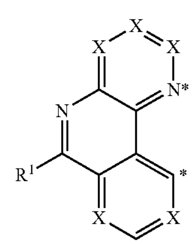

-continued
(L-8)
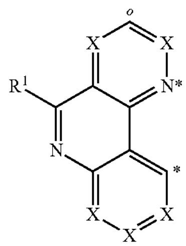
(L-9)
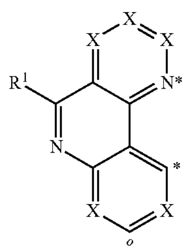
(L-10)
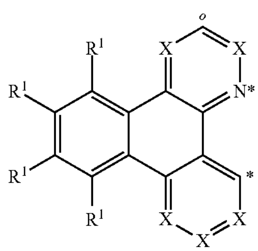
(L-11)
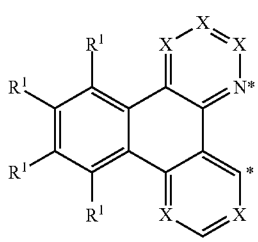
(L-12)
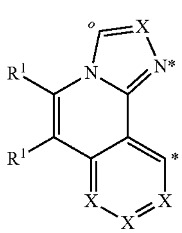
(L-13)
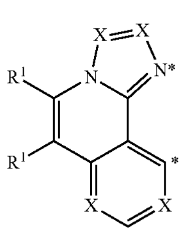
-continued
(L-14)
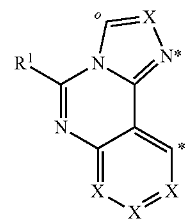
(L-15)
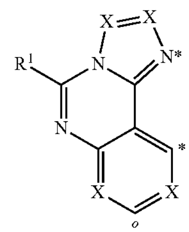
(L-16)
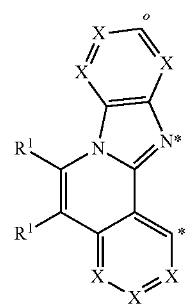
(L-17)
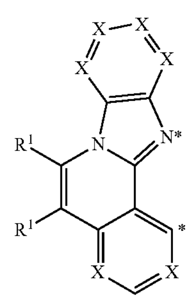
(L-18)
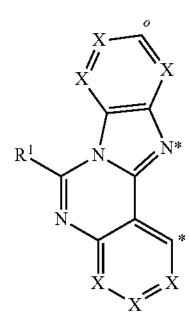

-continued
(L-19)
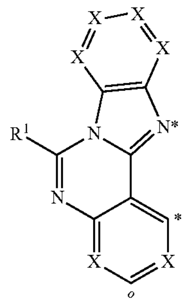
(L-20)
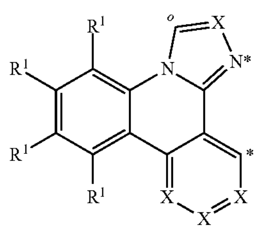
(L-21)
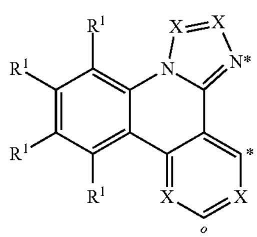
(L-22)
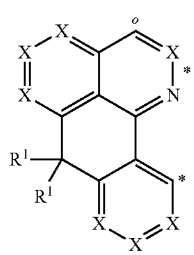
(L-23)
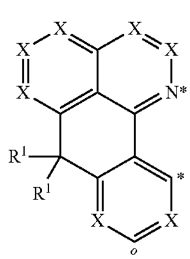
(L-24)
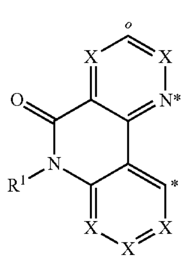
-continued
(L-25)
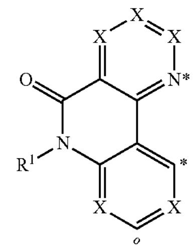
(L-26)
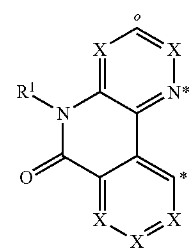
(L-27)
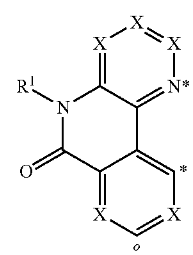
(L-28)
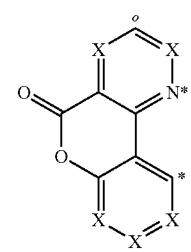
(L-29)
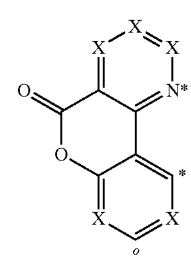
(L-30)
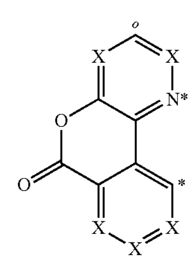

-continued (L-31)

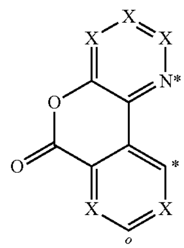

where the symbols used have the meanings given above and "o" indicates the position at which this part-ligand is linked of the group of the formula (3) or (4).

In a preferred embodiment of the part-ligands of the formulae (L-4) to (L-31), in total one symbol X stands for N and the other symbols X stand for CR, or all symbols X stand for CR.

In a further embodiment of the invention, it is preferred, in the case where one of the atoms X stands for N in the groups (CyC-1) to (CyC-20) or (CyD-1) to (CyD-14) or in the part-ligands (L-1-1) to (L-2-3), (L-4) to (L-31), if a group R which is not equal to hydrogen or deuterium is bonded as substituent adjacent to this nitrogen atom. This applies analogously to the preferred structures (CyC-1a) to (CyC-20a) or (CyD-1a) to (CyD-14b) in which a group R which is not equal to hydrogen or deuterium is preferably bonded as substituent adjacent to a non-coordinating nitrogen atom. This substituent R is preferably a group selected from $CF_3$, $OR^1$, where $R^1$ stands for an alkyl group having 1 to 10 C atoms, alkyl groups having 1 to 10 C atoms, in particular branched or cyclic alkyl groups having 3 to 10 C atoms, a dialkylamino group having 2 to 10 C atoms, aromatic or heteroaromatic ring systems or aralkyl or heteroaralkyl groups. These groups are sterically bulky groups. Furthermore preferably, this radical R may also form a ring with an adjacent radical R.

A further suitable bidentate part-ligand is the part-ligand of the following formula (L-32) or (L-33), (L-32)

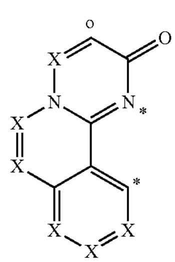

(L-33)

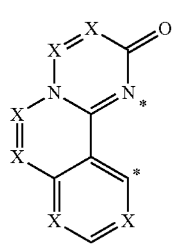

where R has the meanings given above, * represents the position of the coordination to the metal, "o" represents the position of the linking of the part-ligand to the group of the formula (3) or (4), and the following applies to the other symbols used:

X is on each occurrence, identically or differently, CR or N, with the proviso that a maximum of one symbol of X per ring stands for N and furthermore with the proviso that one symbol X stands for C and the part-ligand is bonded to the group V, i.e. to the group of the formula (3) or (4), via this carbon atom.

If two radicals R which are bonded to adjacent carbon atoms in the part-ligands (L-32) and (L-33) form an aromatic ring with one another, this together with the two adjacent carbon atoms is preferably a structure of the following formula (50), formula (50)

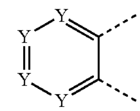

where the dashed bonds symbolise the linking of this group in the part-ligand and Y stands, identically or differently on each occurrence, for $CR^1$ or N and preferably a maximum of one symbol Y stands for N. In a preferred embodiment of the part-ligand (L-32) or (L-33), a maximum of one group of the formula (50) is present. In a preferred embodiment of the invention, a total of 0, 1 or 2 of the symbols X and, if present, Y stand for N in the part-ligands of the formulae (L-32) and (L-33). Particularly preferably, a total of 0 or 1 of the symbols X and, if present, Y stand for N.

Further suitable bidentate part-ligands are the structures of the following formulae (L-34) to (L-38), where preferably a maximum of one of the two bidentate part-ligands L per metal stands for one of these structures, (L-34)

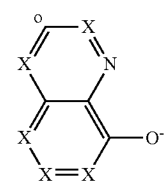

(L-35)

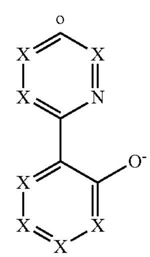

(L-36)

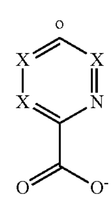

-continued (L-37)

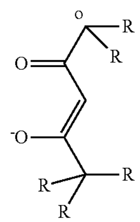

(L-38)

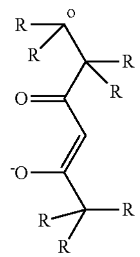

where the part-ligands (L-34) to (L-36) are each coordinated to the metal via the nitrogen atom explicitly drawn in and the negatively charged oxygen atom and the part-ligands (L-37) and (L-38) are coordinated to the metal via the two oxygen atoms, X stands, identically or differently on each occurrence, for CR or N and a maximum of two groups X per ring stand for N, and "o" indicates the position via which the part-ligand L is linked to the group of the formula (3) or (4).

The preferred embodiments for X indicated above are also preferred for the part-ligands of the formulae (L-34) to (L-36).

Preferred part-ligands of the formulae (L-34) to (L-36) are therefore the part-ligands of the following formulae (L-34a) to (L-36a), (L-34a)

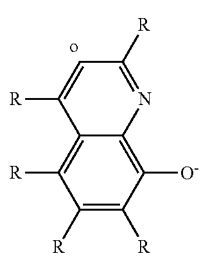

(L-35a)

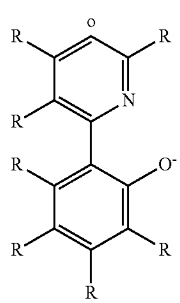

-continued (L-36a)

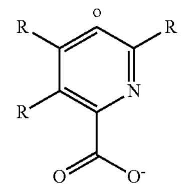

where the symbols used have the meanings given above and "o" indicates the position via which the part-ligand L is linked to the group of the formula (3) or (4).

In these formulae, R particularly preferably stands for hydrogen, where "o" indicates the position via which the part-ligand L is linked to the group V, i.e. to the group of the formula (3) or (4) or the preferred embodiments, so that the structures are those of the following formulae (L-34b) to (L-36b), (L-34b)

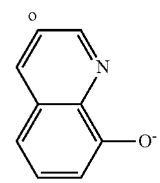

(L-34b)

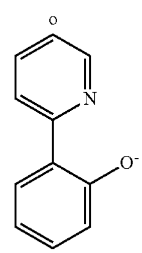

(L-34b)

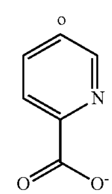

where the symbols used have the meanings given above.

Preferred substituents as may be present on the part-ligands described above, but also on A if A stands for a group of the formula (5), are described below.

In a preferred embodiment of the invention, the compound according to the invention contains two substituents R which are bonded to adjacent carbon atoms and which form an aliphatic ring of one of the formulae described below with one another. The two substituents R which form this aliphatic ring may be present here on the bridge of the formula (3) or (4) or the preferred embodiments and/or on one or more of the bidentate part-ligands L. The aliphatic ring which is formed by the ring formation of two substituents R with one another is preferably described by one of the following formulae (51) to (57), formula (51)

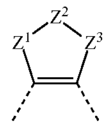

formula (52)

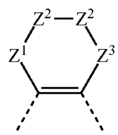

formula (53)

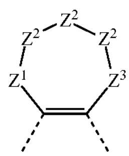

formula (54)

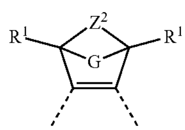

formula (55)

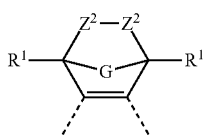

formula (56)

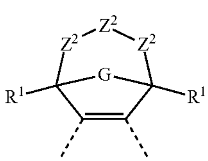

formula (57)

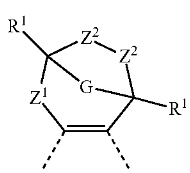

where $R^1$ and $R^2$ have the meanings given above, the dashed bonds indicate the linking of the two carbon atoms in the ligand, and furthermore:

$Z^1$, $Z^3$ are, identically or differently on each occurrence, $C(R^3)_2$, O, S, $NR^3$ or C(═O);

$Z^2$ is $C(R^1)_2$, O, S, $NR^3$ or C(═O);

G is an alkylene group having 1, 2 or 3 C atoms, which may be substituted by one or more radicals $R^2$, or is —$CR^2$═$CR^2$— or an ortho-linked arylene or heteroarylene group having 5 to 14 aromatic ring atoms, which may be substituted by one or more radicals $R^2$;

$R^3$ is, identically or differently on each occurrence, H, F, a straight-chain alkyl or alkoxy group having 1 to 10 C atoms, a branched or cyclic alkyl or alkoxy group having 3 to 10 C atoms, where the alkyl or alkoxy group may in each case be substituted by one or more radicals $R^2$, where one or more non-adjacent $CH_2$ groups may be replaced by $R^2C$═$CR^2$, C≡C, $Si(R^2)_2$, C═O, $NR^2$, O, S or $CONR^2$, or an aromatic or heteroaromatic ring system having 5 to 24 aromatic ring atoms, which may in each case be substituted by one or more radicals $R^2$, or an aryloxy or heteroaryloxy group having 5 to 24 aromatic ring atoms, which may be substituted by one or more radicals $R^2$; two radicals $R^3$ which are bonded to the same carbon atom may form an aliphatic or aromatic ring system with one another here and thus form a spiro system; furthermore, $R^3$ may form an aliphatic ring system with an adjacent radical R or $R^1$;

with the proviso that no two heteroatoms are bonded directly to one another and no two groups C═O are bonded directly to one another in these groups.

In a preferred embodiment of the invention, $R^3$ is not equal to H.

In the structures of the formulae (51) to (57) depicted above and the further embodiments of these structures indicated as preferred, a double bond is formally formed between the two carbon atoms. This represents a simplification of the chemical structure if these two carbon atoms are bonded into an aromatic or heteroaromatic system and the bond between these two carbon atoms is thus formally between the bond order of a single bond and that of a double bond. The drawing-in of the formal double bond should thus not be interpreted as limiting for the structure, but instead it is apparent to the person skilled in the art that this is an aromatic bond.

If adjacent radicals in the structures according to the invention form an aliphatic ring system, it is then preferred if this contains no acidic benzylic protons. Benzylic protons are taken to mean protons which are bonded to a carbon atom which is bonded directly to the ligand. This can be achieved by the carbon atoms of the aliphatic ring system which are bonded directly to an aryl or heteroaryl group being fully substituted and containing no bonded hydrogen atoms. Thus, the absence of acidic benzylic protons in the formulae (51) to (53) is achieved by $Z^1$ and $Z^3$, if they stand for $C(R^3)_2$, being defined in such a way that $R^3$ is not equal to hydrogen. This can furthermore also be achieved by the carbon atoms of the aliphatic ring system which are bonded directly to an aryl or heteroaryl group being the bridgeheads of a bi- or polycyclic structure. The protons bonded to bridgehead carbon atoms are, owing to the spatial structure of the bi- or poly-cycle, significantly less acidic than benzylic protons on carbon atoms which are not bonded in a bi- or polycyclic structure, and are regarded as non-acidic protons in the sense of the present invention. Thus, the absence of acidic benzylic protons is achieved in formula (54) to (57) by it being a bicyclic structure, meaning that $R^1$, if it stands for H, is significantly less acidic than benzylic protons, since the corresponding anion of the bicyclic structure is not resonance-stabilised. Even if $R^1$ in formulae (54) to (57) stands for H, this is therefore a non-acidic proton in the sense of the present application.

In a preferred embodiment of the structure of the formulae (51) to (57), a maximum of one of the groups $Z^1$, $Z^2$ and $Z^3$ stands for a heteroatom, in particular for O or $NR^3$, and the other groups stand for $C(R^3)_2$ or $C(R^1)_2$ or $Z^1$ and $Z^3$ stand, identically or differently on each occurrence, for O or $NR^3$ and $Z^2$ stands for $C(R^1)_2$. In a particularly preferred embodiment of the invention, $Z^1$ and $Z^3$ stand, identically or differently on each occurrence, for $C(R^3)_2$ and $Z^2$ stands for $C(R^1)_2$ and particularly preferably for $C(R^3)_2$ or $CH_2$.

Preferred embodiments of the formula (51) are thus the structures of the formulae (51-A), (51-B), (51-C) and (51-D), and a particularly preferred embodiment of the formula (51-A) are the structures of the formulae (51-E) and (51-F), formula (51-A)

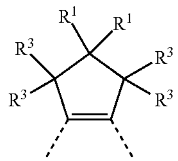

formula (51-B)

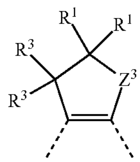

formula (51-C)

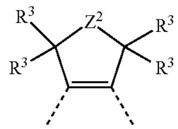

formula (51-D)

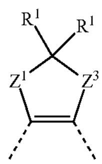

formula (51-E)

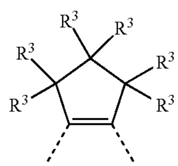

formula (51-F)

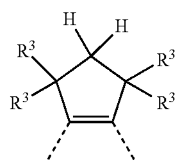

where $R^1$ and $R^3$ have the meanings given above and $Z^1$, $Z^2$ and $Z^3$ stand, identically or differently on each occurrence, for 0 or $NR^3$.

Preferred embodiments of the formula (52) are the structures of the following formulae (52-A) to (52-F), formula (52-A)

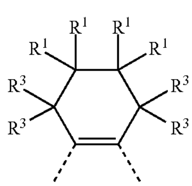

formula (52-B)

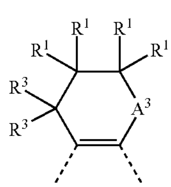

-continued formula (52-C)

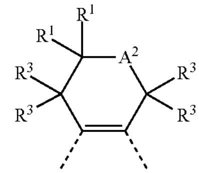

formula (52-D)

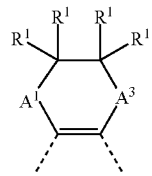

formula (52-E)

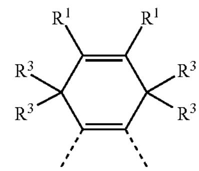

formula (52-F)

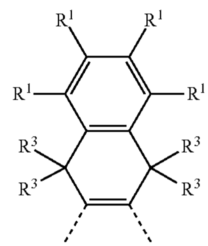

where $R^1$ and $R^3$ have the meanings given above and $Z^1$, $Z^2$ and $Z^3$ stand, identically or differently on each occurrence, for O or $NR^3$.

Preferred embodiments of the formula (53) are the structures of the following formulae (53-A) to (53-E), formula (53-A)

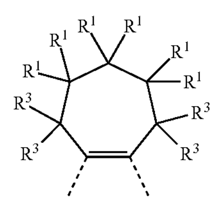

formula (53-B)

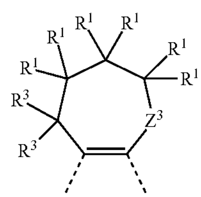

formula (53-C)

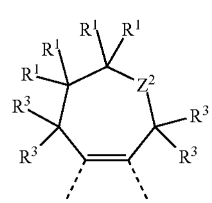

-continued formula (53-D)

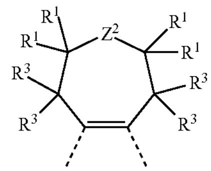

formula (53-E)

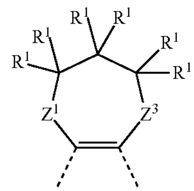

where $R^1$ and $R^3$ have the meanings given above and $Z^1$, $Z^2$ and $Z^3$ stand, identically or differently on each occurrence, for O or $NR^3$.

In a preferred embodiment of the structure of the formula (54), the radicals $R^1$ which are bonded to the bridgehead stand for H, D, F or $CH_3$. Furthermore preferably, $Z^2$ stands for $C(R^1)_2$ or 0, and particularly preferably for $C(R^3)_2$. Preferred embodiments of the formula (54) are thus the structures of the formulae (54-A) and (54-B), and a particularly preferred embodiment of the (54-A) is a structure of the formula (54-C), formula (54-A)

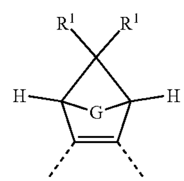

formula (54-B)

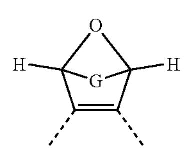

formula (54-C)

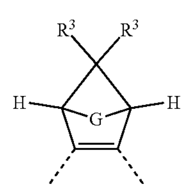

where the symbols used have the meanings given above.

In a preferred embodiment of the structures of the formulae (55), (56) and (57), the radicals $R^1$ which are bonded to the bridgehead stand for H, D, F or $CH_3$. Furthermore preferably, $Z^2$ stands for $C(R^1)_2$. Preferred embodiments of the formulae (55), (56) and (57) are thus the structures of the formulae (55-A), (56-A) and (57-A), formula (55-A)

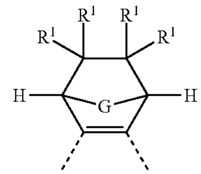

formula (56-A)

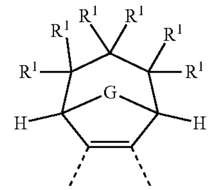

formula (57-A)

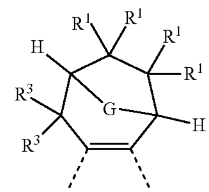

where the symbols used have the meanings given above.

The group G in the formulae (54), (54-A), (54-B), (54-C), (55), (55-A), (56), (56-A), (57) and (57-A) furthermore preferably stands for a 1,2-ethylene group, which may be substituted by one or more radicals $R^2$, where $R^2$ preferably stands, identically or differently on each occurrence, for H or an alkyl group having 1 to 4 C atoms, or an ortho-arylene group having 6 to 10 C atoms, which may be substituted by one or more radicals $R^2$, but is preferably unsubstituted, in particular an ortho-phenylene group, which may be substituted by one or more radicals $R^2$, but is preferably unsubstituted.

In a further preferred embodiment of the invention, $R^3$ in the groups of the formulae (51) to (57) and in the preferred embodiments stands, identically or differently on each occurrence, for F, a straight-chain alkyl group having 1 to 10 C atoms or a branched or cyclic alkyl group having 3 to 20 C atoms, where in each case one or more non-adjacent $CH_2$ groups may be replaced by $R^2C{=}CR^2$ and one or more H atoms may be replaced by D or F, or an aromatic or heteroaromatic ring system having 5 to 14 aromatic ring atoms, which may in each case be substituted by one or more radicals $R^2$; two radicals $R^3$ here which are bonded to the same carbon atom may form an aliphatic or aromatic ring system with one another and thus form a spiro system; furthermore, $R^3$ may form an aliphatic ring system with an adjacent radical R or $R^1$.

In a particularly preferred embodiment of the invention, $R^3$ in the groups of the formulae (51) to (57) and in the preferred embodiments stands, identically or differently on each occurrence, for F, a straight-chain alkyl group having 1 to 3 C atoms, in particular methyl, or an aromatic or heteroaromatic ring system having 5 to 12 aromatic ring atoms, which may in each case be substituted by one or more radicals $R^2$, but is preferably unsubstituted; two radicals $R^3$ here which are bonded to the same carbon atom may form an aliphatic or aromatic ring system with one another and thus form a spiro system; furthermore, $R^3$ may form an aliphatic ring system with an adjacent radical R or $R^1$.

Examples of particularly suitable groups of the formula (51) are the groups depicted below:

-continued
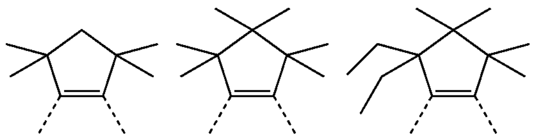
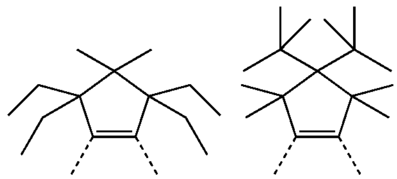
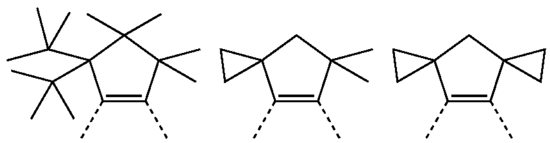
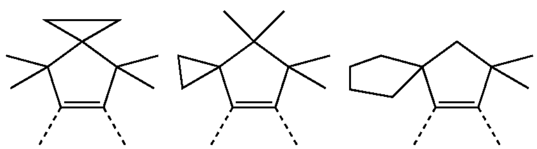
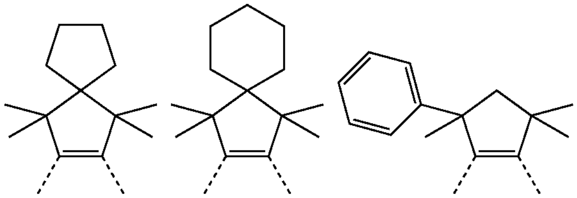
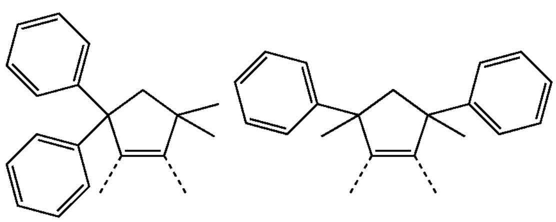
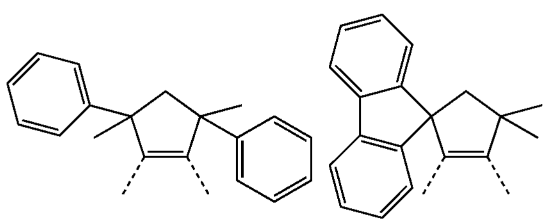
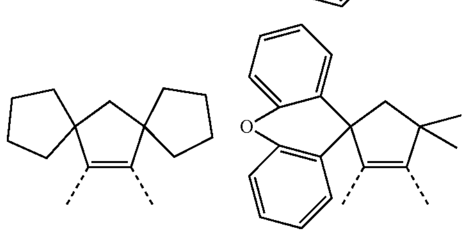
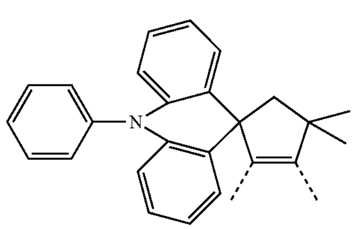
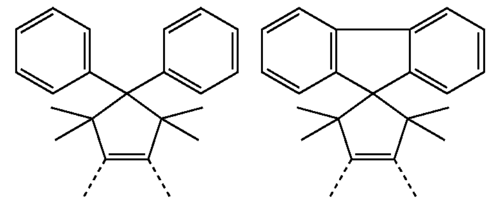
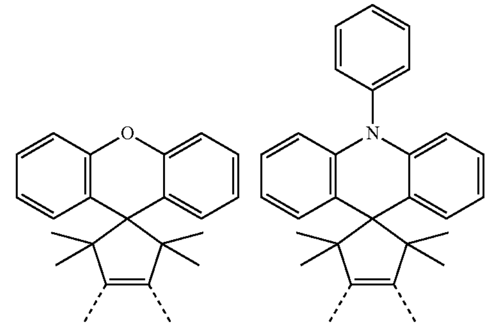
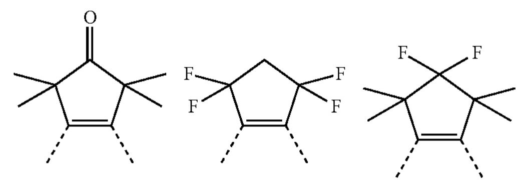
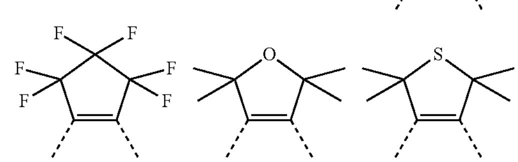
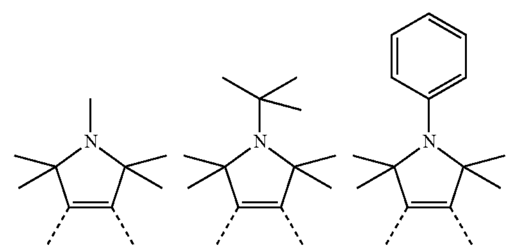
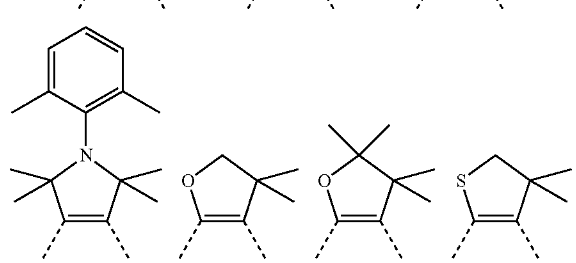
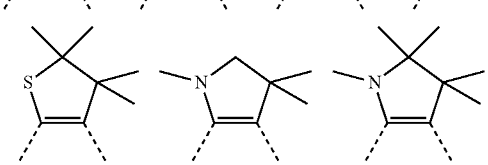
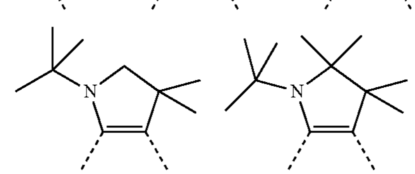

-continued
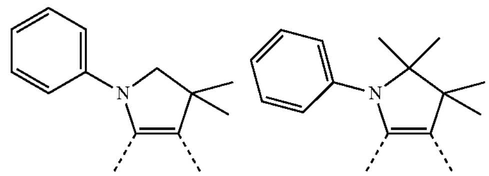
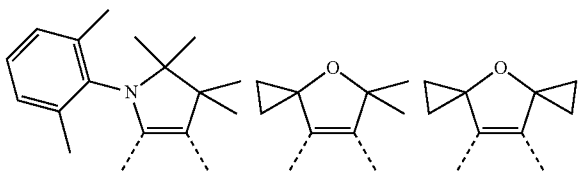
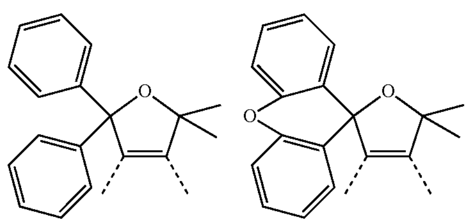
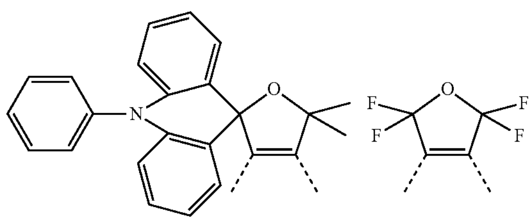
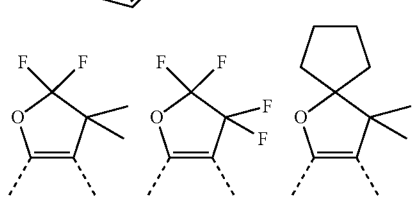
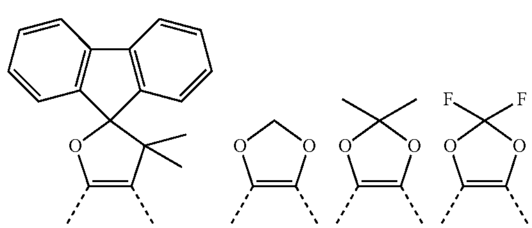
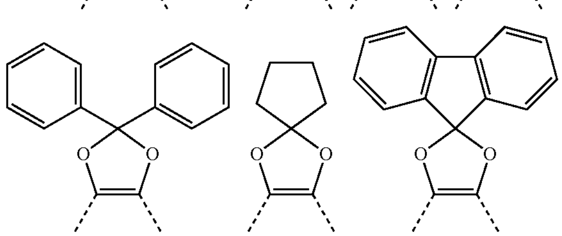
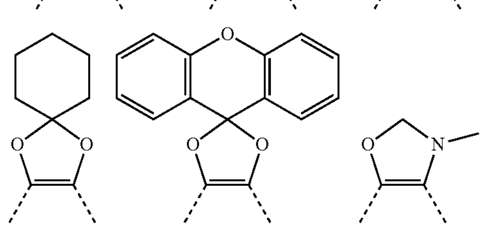
-continued
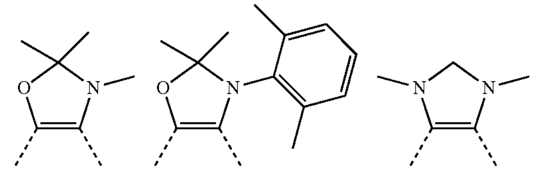
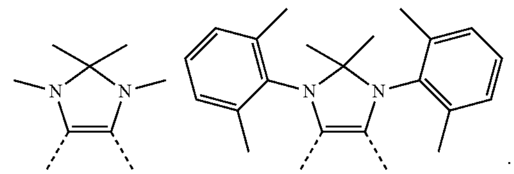
Examples of particularly suitable groups of the formula (51) are the groups depicted below:
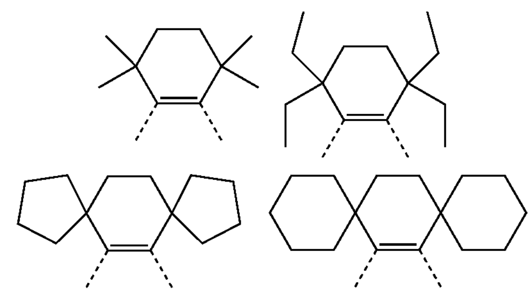
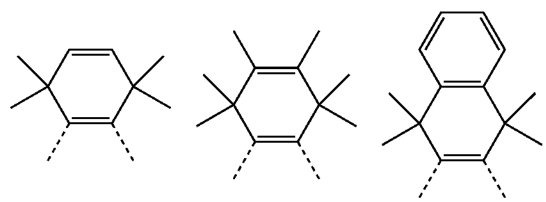
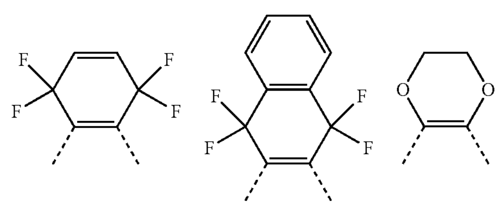
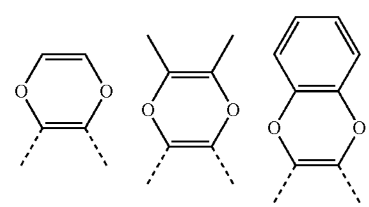
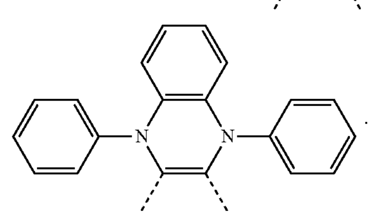
Examples of particularly suitable groups of the formulae (53), (56) and (57) are the groups depicted below:

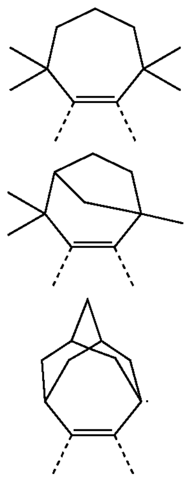

Examples of particularly suitable groups of the formula (54) are the groups depicted below:

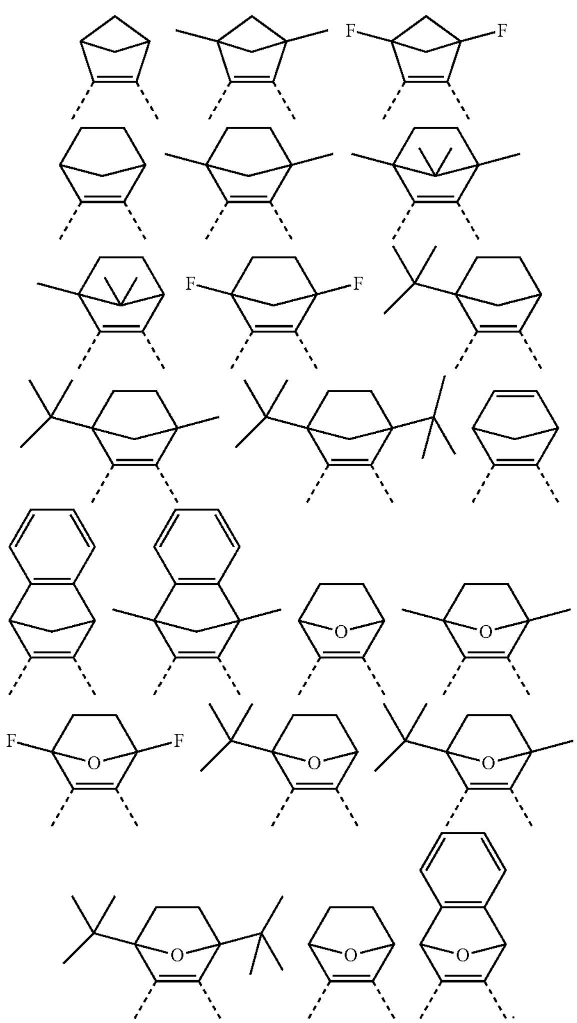

Examples of particularly suitable groups of the formula (55) are the groups depicted below:

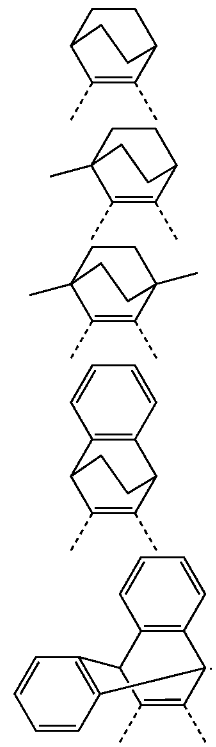

If radicals R are bonded in the bidentate part-ligands L or ligands or in the divalent arylene or hetereoarylene groups of the formula (5) which are bonded in the formula (3) or (4) or the preferred embodiments, these radicals R are preferably selected on each occurrence, identically or differently, from the group consisting of H, D, F, Br, I, $N(R^1)_2$, CN, $Si(R^1)_3$, $B(OR^1)_2$, $C(=O)R^1$, a straight-chain alkyl group having 1 to 10 C atoms or an alkenyl group having 2 to 10 C atoms or a branched or cyclic alkyl group having 3 to 10 C atoms, where the alkyl or alkenyl group may in each case be substituted by one or more radicals $R^1$, or an aromatic or heteroaromatic ring system having 5 to 30 aromatic ring atoms, which may in each case be substituted by one or more radicals $R^1$; two adjacent radical R here or R with $R^1$ may also form a mono- or polycyclic, aliphatic or aromatic ring system with one another. These radicals R are particularly preferably selected on each occurrence, identically or differently, from the group consisting of H, D, F, $N(R^1)_2$, a straight-chain alkyl group having 1 to 6 C atoms or a branched or cyclic alkyl group having 3 to 10 C atoms, where one or more H atoms may be replaced by D or F, or an aromatic or heteroaromatic ring system having 5 to 24 aromatic ring atoms, preferably having 6 to 13 aromatic ring atoms, which may in each case be substituted by one or more radicals $R^1$; two adjacent radicals R here or R with $R^1$ may also form a mono- or polycyclic, aliphatic or aromatic ring system with one another.

Preferred radicals $R^1$ which are bonded to R are, identically or differently on each occurrence, H, D, F, $N(R^2)_2$, ON, a straight-chain alkyl group having 1 to 10 C atoms or an alkenyl group having 2 to 10 C atoms or a branched or cyclic alkyl group having 3 to 10 C atoms, where the alkyl group may in each case be substituted by one or more radicals $R^2$, or an aromatic or heteroaromatic ring system having 5 to 24 aromatic ring atoms, which may in each case be substituted by one or more radicals $R^2$; two or more adjacent radicals $R^1$ here may form a mono- or polycyclic, aliphatic ring system with one another. Particularly preferred radicals $R^1$ which are bonded to R are, identically or differently on each occurrence, H, F, CN, a straight-chain alkyl group having 1 to 5 C atoms or a branched or cyclic alkyl group having 3 to 5 C atoms, which may in each case be substituted by one or more radicals $R^2$, or an aromatic or heteroaromatic ring system having 5 to 13 aromatic ring atoms, which may in each case be substituted by one or more radicals $R^2$; two or more adjacent radicals $R^1$ here may form a mono- or polycyclic, aliphatic ring system with one another.

Preferred radicals $R^2$ are, identically or differently on each occurrence, H, F or an aliphatic hydrocarbon radical having 1 to 5 C atoms or an aromatic hydrocarbon radical having 6 to 12 C atoms; two or more substituents $R^2$ here may also form a mono- or polycyclic, aliphatic ring system with one another.

The above-mentioned preferred embodiments can be combined with one another as desired within the scope of the claims. In a particularly preferred embodiment of the invention, the above-mentioned preferred embodiments apply simultaneously.

The compounds according to the invention are chiral structures. Depending on the precise structure of the complexes and ligands, the formation of diastereomers and a plurality of enantiomer pairs is possible. The complexes according to the invention then include both the mixtures of the various diastereomers or the corresponding racemates and also the individual isolated diastereomers or enantiomers.

In the ortho-metallation reaction of the ligands, the accompanying bimetallic complexes are typically formed as a mixture of $\Lambda\Lambda$ and $\Delta\Delta$ isomers and $\Delta\Lambda$ and $\Lambda\Delta$ isomers. The corresponding situation applies to the trimetallic complexes. $\Lambda\Lambda$ and $\Delta\Delta$ isomers form an enantiomer pair as do the $\Delta\Lambda$ and $\Lambda\Delta$ isomers. The diastereomer pairs can be separated using conventional methods, for example chromatography or fractional crystallisation. Depending on the symmetry of the ligands, stereocentres may coincide, meaning that meso forms are also possible. Thus, for example in the case of ortho-metallation of $C_{2v}$ or $C_s$ symmetrical ligands, $\Lambda\Lambda$ and $\Delta\Delta$ isomers (racemate, $C_2$-symmetrical) and a $\Lambda\Delta$ isomer (meso compound, $C_s$-symmetrical) are formed. The preparation and separation of the diastereomer pairs is intended to be illustrated with reference to the following example.

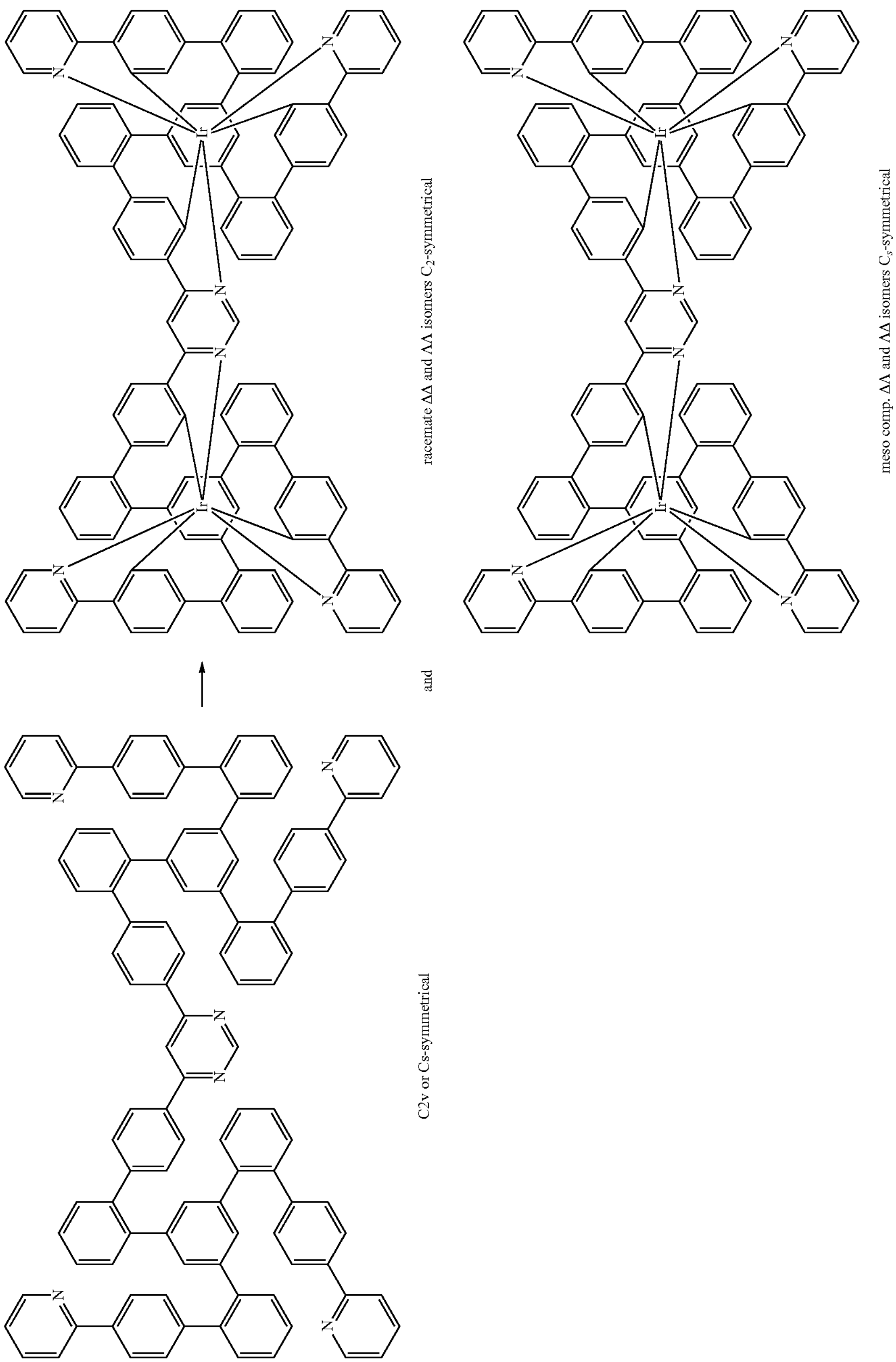
C2v or Cs-symmetrical
and
racemate ΔΔ and ΛΛ isomers C2-symmetrical
meso comp. ΔΛ and ΛΔ isomers Cs-symmetrical
Ir
N -continued
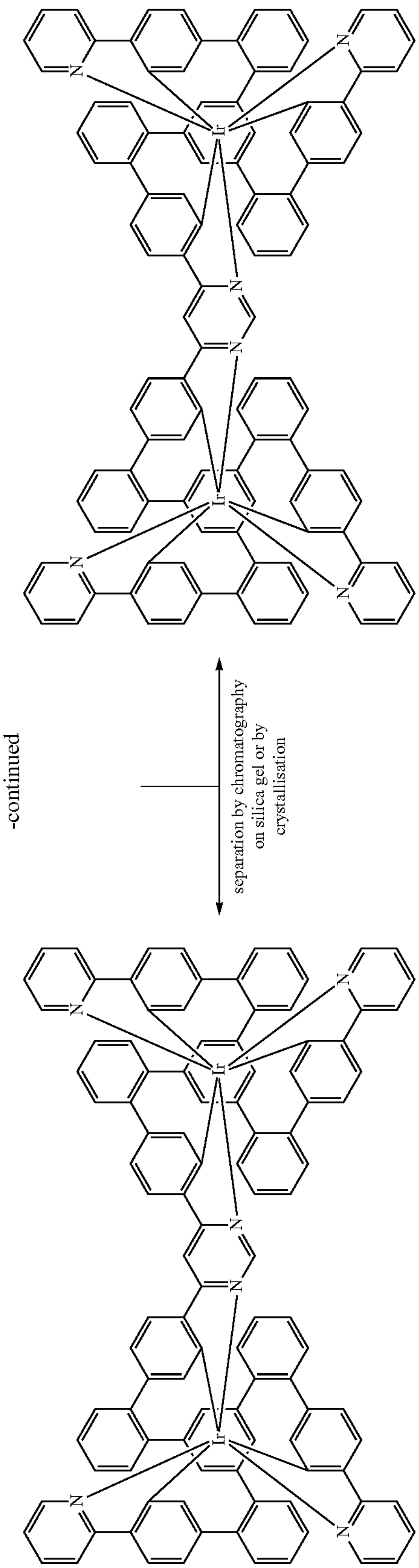
racemate ΔΔ and ΛΛ isomers $C_2$-symmetrical
meso comp. ΔΛ and ΛΔ isomers $C_s$-symmetrical The racemate separation of the ΔΔ and ΛΛ isomers can be carried out by fractional crystallisation of diastereomeric salt pairs or on chiral columns by conventional methods. To this end, the neutral Ir(III) complexes can be oxidised (for example using peroxides, $H_2O_2$ or electrochemically), the salt of an enantiomerically pure, monoanionic base (chiral base) can be added to the cationic Ir(III)/Ir(IV) or bicationic Ir(IV)/Ir(IV) complexes produced in this way, the diastereomeric salts produced in this way can be separated by fractional crystallisation, and these can then be reduced to the enantiomerically pure neutral complex with the aid of a reducing agent (for example zinc, hydrazine hydrate, ascorbic acid, etc.), as shown diagrammatically below.

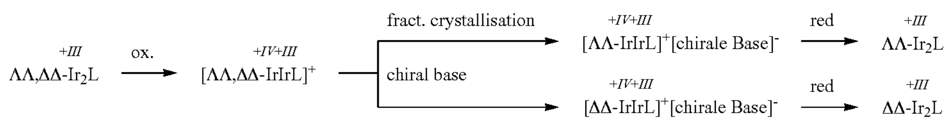

or

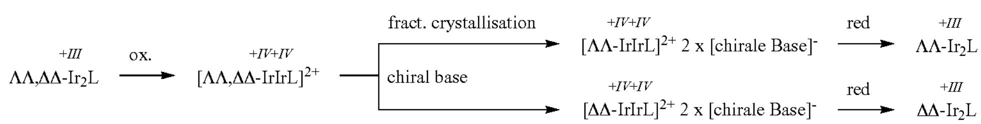

Enantiomerically pure complexes can also be synthesised specifically as depicted in the following scheme. To this end, as described above, the diastereomer pairs formed in the ortho-metallation are separated, brominated and then reacted with a boronic acid R*A-$B(OH)_2$ containing a chiral radical R* (preferably >99% enantiomeric excess) by a cross-coupling reaction. The diastereomer pairs formed can be separated by conventional methods by chromatography on silica gel or by fractional crystallisation. Thus, the enantiomerically enriched or enantiomerically pure complexes are obtained. The chiral group can subsequently optionally be cleaved off or can also remain in the molecule.

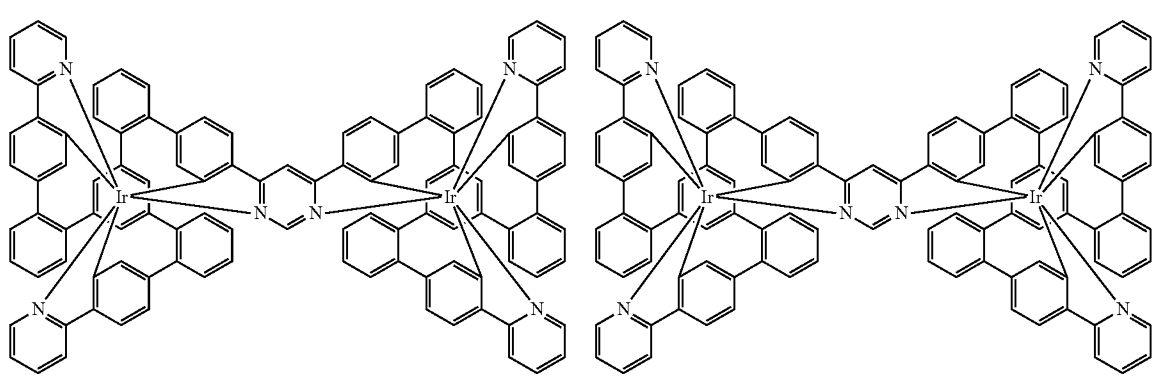

racemate ΔΔ and ΛΛ isomers $C_2$-symmetrical

Meso comp. ΔΛ and ΛΔ isomers $C_s$-symmetrical bromination: NBS in DCM bromination: NBS in DCM -continued
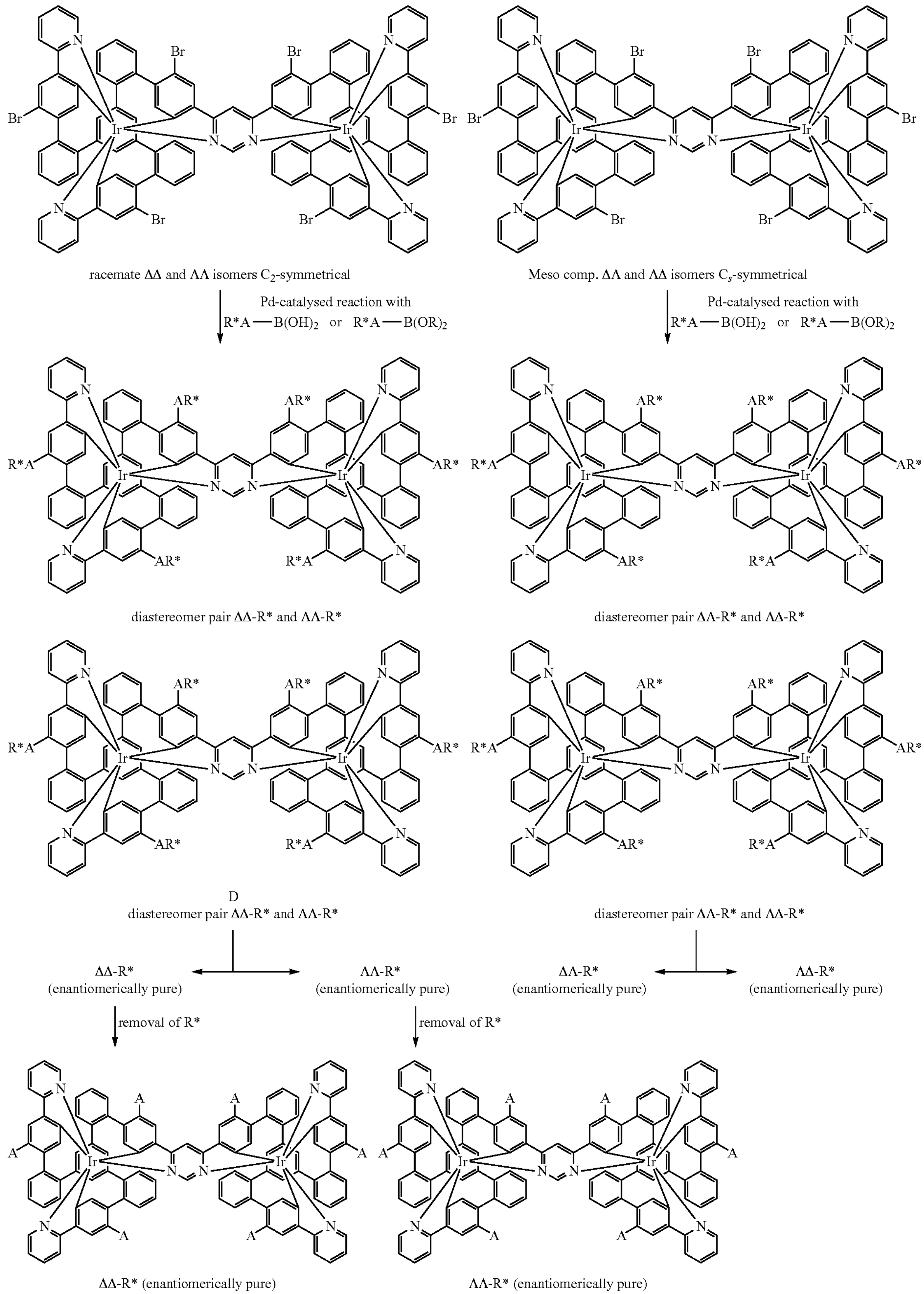

The complexes are usually formed as a mixture of diastereomer pairs in the ortho-metallation. However, it is also possible specifically to synthesise only one of the diastereomer pairs, since the other, depending on the ligand structure, does not form or forms less preferentially for steric reasons. This is intended to be illustrated with reference to the following example.

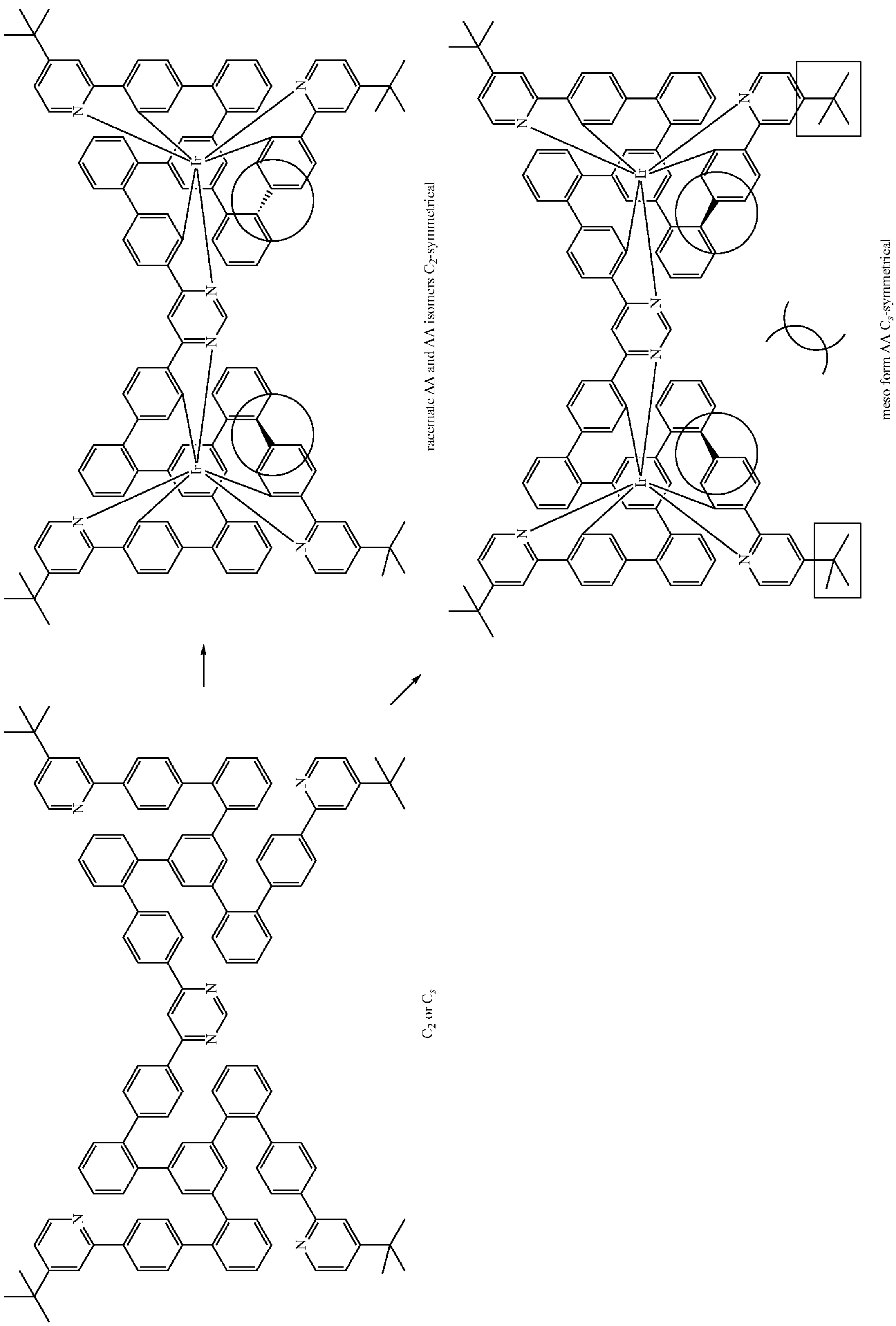
racemate ΔΔ and ΛΛ isomers $C_2$-symmetrical
meso form ΔΛ $C_s$-symmetrical
$C_2$ or $C_s$ Due to the high space requirement of the tert-butyl groups, the racemate of ΛΛ and ΔΔ isomers and not the meso form is preferentially or exclusively formed in the ortho-metallation. In the meso form ($C_s$-symmetrical), the circled bonds of the 2-phenylpyridine ligands project out of the drawing plane. Due to the high steric requirement of the tert-butyl groups on the pyridine ring, the meso isomer is not formed or is formed less preferentially. In the racemate ($C_2$-symmetrical), by contrast, one bond to the 2-phenylpyridine ligand points into the drawing plane, the other points out of the drawing plane. Depending on the steric requirement of the group, the racemate is formed preferentially or exclusively.

The complexes according to the invention can be prepared, in particular, by the route described below. To this end, the 12- or 18-dentate ligand is prepared and then coordinated to the metal M by an ortho-metallation reaction. To this end, an iridium or rhodium salt is generally reacted with the corresponding free ligand.

The present invention therefore furthermore relates to a process for the preparation of the compound according to the invention by reaction of the corresponding free ligands with metal alkoxides of the formula (58), with metal ketoketonates of the formula (59), with metal halides of the formula (60) or with metal carboxylates of the formula (61), formula (58)

$M(OR)_3$ formula (59)

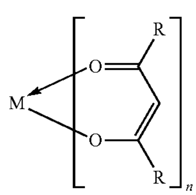

formula (60)

$MHal_3$ formula (61)

$M(OOCR)_3$ where M and R have the meanings indicated above, Hal=F, $C_1$, Br or I and the iridium or rhodium starting materials may also be in the form of the corresponding hydrates. R here preferably stands for an alkyl group having 1 to 4 C atoms.

It is likewise possible to use iridium or rhodium compounds which carry both alkoxide and/or halide and/or hydroxyl radicals as well as ketoketonate radicals. These compounds may also be charged. Corresponding iridium compounds which are particularly suitable as starting materials are disclosed in WO 2004/085449. $[IrCl_2(acac)_2]^-$, for example $Na[IrCl_2(acac)_2]$, are particularly suitable. Metal complexes with acetyl-acetonate derivatives as ligand, for example $Ir(acac)_3$ or tris(2,2,6,6-tetra-methylheptane-3,5-dionato)iridium, and $IrCl_3.xH_2O$, where x usually stands for a number between 2 and 4.

The synthesis of the complexes is preferably carried out as described in WO 2002/060910 and in WO 2004/085449. The synthesis here can also be activated, for example, thermally, photochemically and/or by microwave radiation. The synthesis can furthermore also be carried out in an autoclave under increased pressure and/or at elevated temperature.

The reactions can be carried out without addition of solvents or melting aids in a melt of the corresponding ligands to be o-metallated. If necessary, solvents or melting aids can be added. Suitable solvents are protic or aprotic solvents, such as aliphatic and/or aromatic alcohols (methanol, ethanol, isopropanol, t-butanol, etc.), oligo- and polyalcohols (ethylene glycol, 1,2-propanediol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexa-decane, etc.), amides (DMF, DMAC, etc.), lactams (NMP), sulfoxides (DMSO) or sulfones (dimethyl sulfone, sulfolane, etc.). Suitable melting aids are compounds which are in solid form at room temperature, but melt on warming of the reaction mixture and dissolve the reactants, so that a homogeneous melt forms. Particularly suitable are biphenyl, m-terphenyl, triphenylene, R- or S-binaphthol or the corresponding racemate, 1,2-, 1,3-, 1,4-bisphenoxybenzene, triphenylphosphine oxide, 18-crown-6, phenol, 1-naphthol, hydroquinone, etc. The use of hydroquinone is particularly preferred.

These processes, optionally followed by purification, such as, for example, recrystallisation or sublimation, enable the compounds of the formula (1) according to the invention to be obtained in high purity, preferably greater than 99% (determined by means of $^1$H-NMR and/or HPLC).

The compounds according to the invention can also be rendered soluble by suitable substitution, for example by relatively long alkyl groups (about 4 to 20 C atoms), in particular branched alkyl groups, or optionally substituted aryl groups, for example, xylyl, mesityl or branched terphenyl or quaterphenyl groups. In particular, the use of condensed-on aliphatic groups, as represented, for example, by the formulae (51) to (57) disclosed above, leads to a significant improvement in the solubility of the metal complexes. Compounds of this type are then soluble in common organic solvents, such as, for example, toluene or xylene, at room temperature in sufficient concentration to be able to process the complexes from solution. These soluble compounds are particularly suitable for processing from solution, for example by printing processes.

The processing of the metal complexes according to the invention from the liquid phase, for example by spin coating or by printing processes, requires formulations of the metal complexes according to the invention. These formulations can be, for example, solutions, dispersions or emulsions. It may be preferred to use mixtures of two or more solvents for this purpose. Suitable and preferred solvents are, for example, toluene, anisole, o-, m- or p-xylene, methyl benzoate, mesitylene, tetralin, veratrol, THF, methyl-THF, THP, chlorobenzene, dioxane, phenoxytoluene, in particular 3-phenoxytoluene, (-)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclo-hexylbenzene, decalin, dodecylbenzene, ethyl benzoate, indane, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, hexa-methylindane, 2-methylbiphenyl, 3-methylbiphenyl, 1-methylnaphthalene, 1-ethylnaphthalene, ethyl octanoate, diethyl sebacate, octyl octanoate, heptylbenzene, menthyl isovalerate, cyclohexyl hexanoate or mixtures of these solvents.

The present invention therefore furthermore relates to a formulation comprising at least one compound according to the invention and at least one further compound. The further compound may be, for example, a solvent, in particular one of the above-mentioned solvents or a mixture of these solvents. However, the further compound may also be a further organic or inorganic compound which is likewise employed in the electronic device, for example a matrix material. This further compound may also be polymeric.

The metal complex according to the invention described above or the preferred embodiments indicated above can be used in the electronic device as active component or as oxygen sensitisers. The present invention thus furthermore relates to the use of a compound according to the invention in an electronic device or as oxygen sensitiser. The present invention still furthermore relates to an electronic device comprising at least one compound according to the invention.

An electronic device is taken to mean a device which comprises an anode, a cathode and at least one layer, where this layer comprises at least one organic or organometallic compound. The electronic device according to the invention thus comprises an anode, a cathode and at least one layer which comprises at least one metal complex according to the invention. Preferred electronic devices here are selected from the group consisting of organic electroluminescent devices (OLEDs, PLEDs), organic infrared electroluminescence sensors, organic integrated circuits (O-ICs), organic field-effect transistors (O-FETs), organic thin-film transistors (O-TFTs), organic light-emitting transistors (O-LETs), organic solar cells (O-SCs), which are taken to mean both purely organic solar cells and dye-sensitised solar cells (Gratzel cells), organic optical detectors, organic photoreceptors, organic field-quench devices (O-FQDs), light-emitting electrochemical cells (LECs), oxygen sensors or organic laser diodes (O-lasers), comprising at least one metal complex according to the invention in at least one layer. Particular preference is given to organic electroluminescent devices. Active components are generally the organic or inorganic materials which have been introduced between the anode and cathode, for example charge-injection, charge-transport or charge-blocking materials, but in particular emission materials and matrix materials. The compounds according to the invention exhibit particularly good properties as emission material in organic electroluminescent devices. Organic electroluminescent devices are therefore a preferred embodiment of the invention. Furthermore, the compounds according to the invention can be employed for the generation of singlet oxygen or in photocatalysis.

The organic electroluminescent device comprises a cathode, an anode and at least one emitting layer. Apart from these layers, it may also comprise further layers, for example in each case one or more hole-injection layers, hole-transport layers, hole-blocking layers, electron-transport layers, electron-injection layers, exciton-blocking layers, electron-blocking layers, charge-generation layers and/or organic or inorganic p/n junctions.

It is possible here for one or more hole-transport layers to be p-doped, for example with metal oxides, such as $MoO_3$ or $WO_3$, or with (per)fluorinated electron-deficient aromatic compounds, and/or for one or more electron-transport layers to be n-doped. Interlayers which have, for example, an exciton-blocking function and/or control the charge balance in the electroluminescent device may likewise be introduced between two emitting layers. However, it should be pointed out that each of these layers does not necessarily have to be present.

The organic electroluminescent device here may comprise one emitting layer or a plurality of emitting layers. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems, where the three layers exhibit blue, green and orange or red emission (for the basic structure see, for example, WO 2005/011013), or systems which have more than three emitting layers. It may also be a hybrid system, where one or more layers fluoresce and one or more other layers phosphoresce. White-emitting organic electroluminescent devices can be used for lighting applications or, with colour filters, also for full-colour displays. White-emitting OLEDs can also be achieved by tandem OLEDs. Furthermore, white-emitting OLEDs can also be achieved by two or more emitters which emit light in different colours and at least one of which is a compound according to invention being present in an emitting layer, so that the light emitted by the individual emitters adds up to white light.

In a preferred embodiment of the invention, the organic electroluminescent device comprises the metal complex according to the invention as emitting compound in one or more emitting layers.

Many of the compounds according to the invention emit light in the red spectral region. However, it is also possible, through a suitable choice of the ligands and substitution pattern, on the one hand to shift the emission into the infrared region and on the other hand to shift the emission hypsochromically, preferably into the orange, yellow or green region, but also into the blue region.

If the metal complex according to the invention is employed as emitting compound in an emitting layer, it is preferably employed in combination with one or more matrix materials, where the terms "matrix material" and "host material" are used synonymously below. The mixture of the metal complex according to the invention and the matrix material comprises between 1 and 99% by weight, preferably between 1 and 90% by weight, particularly preferably between 3 and 40% by weight, in particular between 5 and 25% by weight, of the metal complex according to the invention, based on the mixture as a whole comprising emitter and matrix material. Correspondingly, the mixture comprises between 99.9 and 1% by weight, preferably between 99 and 10% by weight, particularly preferably between 97 and 60% by weight, in particular between 95 and 75% by weight, of the matrix material, based on the mixture as a whole comprising emitter and matrix material.

The matrix material employed can in general be all materials which are known for this purpose in accordance with the prior art. The triplet level of the matrix material is preferably higher than the triplet level of the emitter.

Suitable matrix materials for the compounds according to the invention are ketones, phosphine oxides, sulfoxides and sulfones, for example in accordance with WO 2004/013080, WO 2004/093207, WO 2006/005627 or WO 2010/006680, triarylamines, carbazole derivatives, for example CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example in accordance with WO 2007/063754 or WO 2008/056746, indenocarbazole derivatives, for example in accordance with WO 2010/136109 or WO 2011/000455, azacarbazoles, for example in accordance with EP 1617710, EP 1617711, EP 1731584, JP 2005/347160, bipolar matrix materials, for example in accordance with WO 2007/137725, silanes, for example in accordance with WO 2005/111172, azaboroles or boronic esters, for example in accordance with WO 2006/117052, diaza-silole derivatives, for example in accordance with WO 2010/054729, diazaphosphole derivatives, for example in accordance with WO 2010/054730, triazine derivatives, for example in accordance with WO 2010/015306, WO 2007/063754 or WO 2008/056746, zinc complexes, for example in accordance with EP 652273 or WO 2009/062578, dibenzofuran derivatives, for example in accordance with WO 2009/148015 or WO 2015/169412, or bridged carbazole derivatives, for example in accordance with US 2009/0136779, WO 2010/050778, WO 2011/042107 or WO 2011/088877.

Fort solution-processed OLEDs, suitable matrix materials are also polymers, example in accordance with WO 2012/008550 or WO 2012/048778, oh oligomers or dendrimers, for example in accordance with Journal of Luminescence 183 (2017), 150-158.

It may also be preferred to employ a plurality of different matrix materials as a mixture, in particular at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex according to the invention. Preference is likewise given to the use of a mixture of a charge-transporting matrix material and an electrically inert matrix material (so-called "wide bandgap host") which is not involved or not essentially involved in charge transport, as described, for example, in WO 2010/108579 or WO 2016/184540. Preference is likewise given to the use of two electron-transporting matrix materials, for example triazine derivatives and lactam derivatives, as described, for example, in WO 2014/094964.

Examples of compounds which are suitable as matrix materials for the compounds according to invention are depicted below.

Examples of compounds which are suitable as matrix materials for the compounds according to the invention are depicted below.

Examples of triazines and pyrimidines which can be employed as electron-transporting matrix materials:

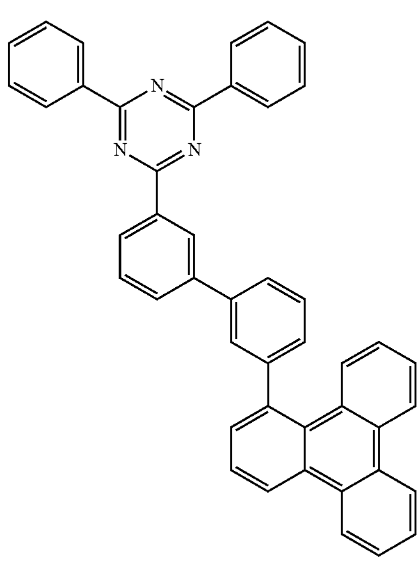

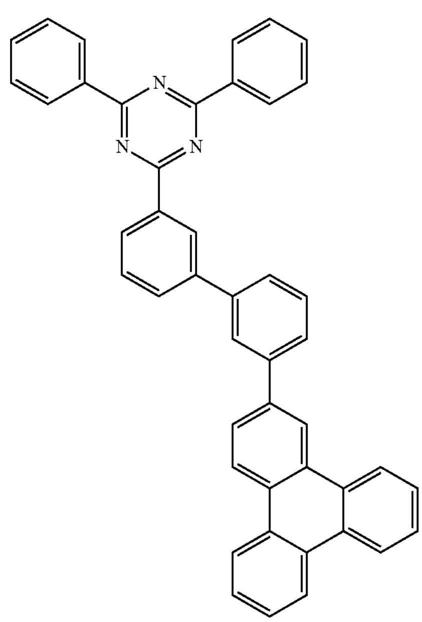

-continued
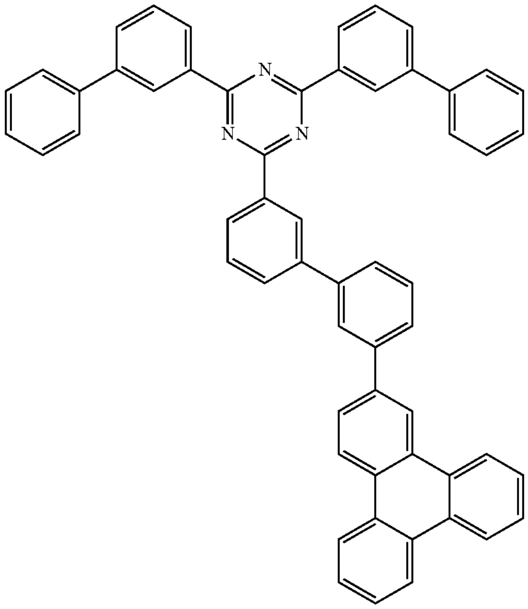
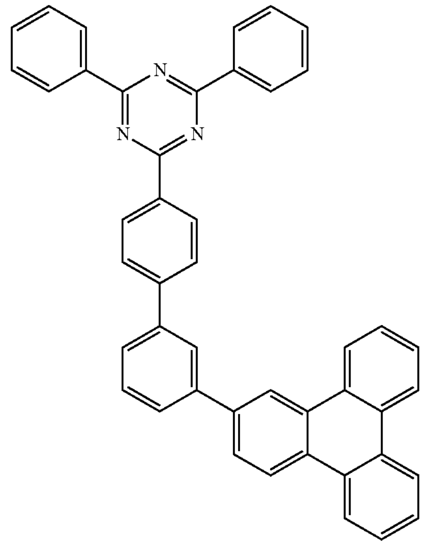
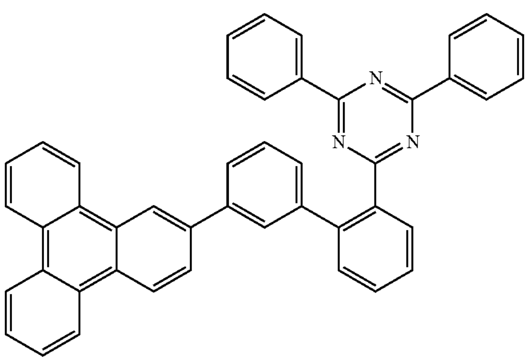
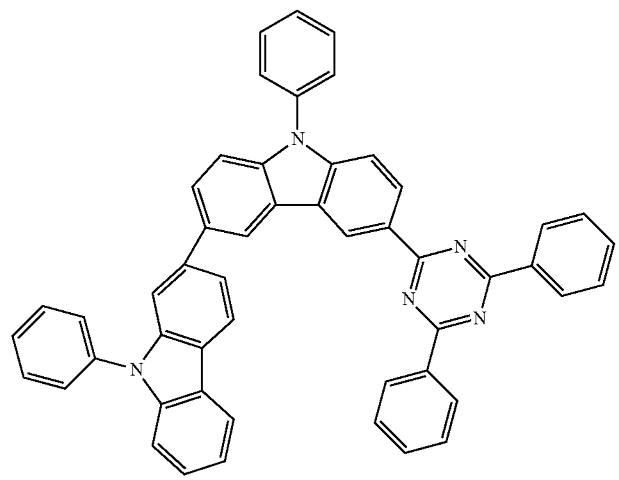
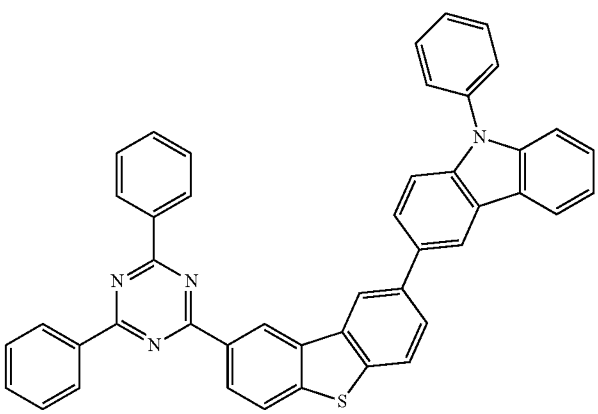
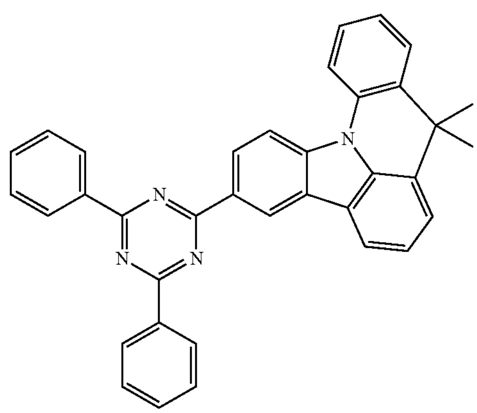

-continued
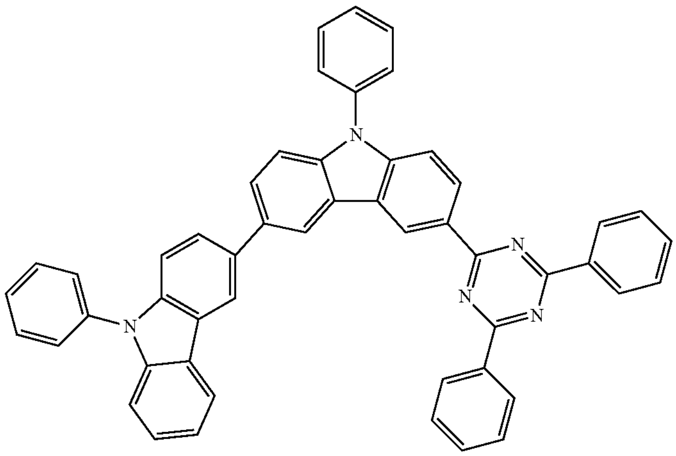
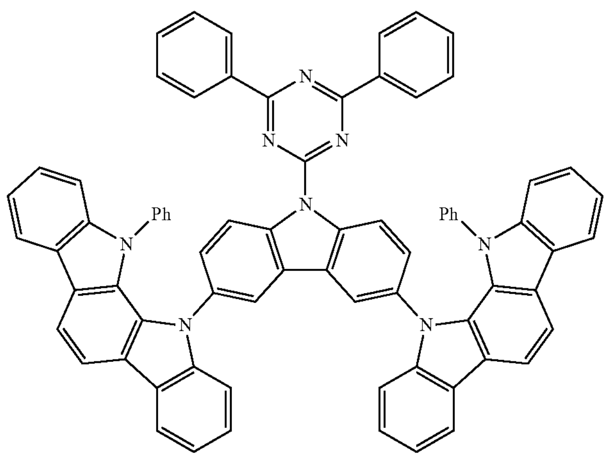
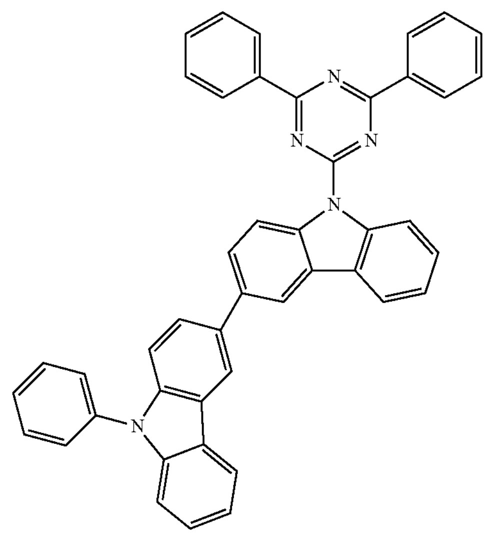
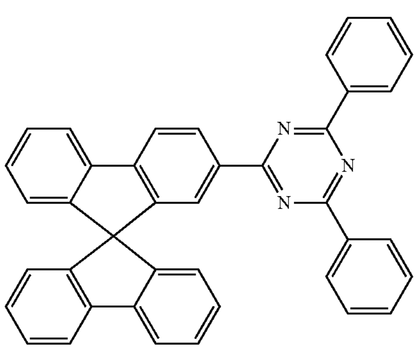
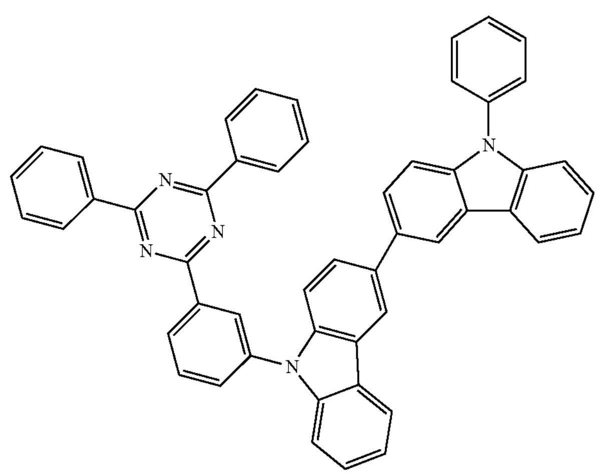

-continued
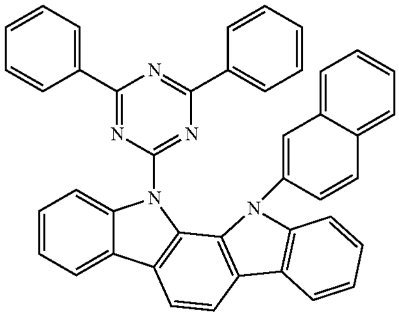
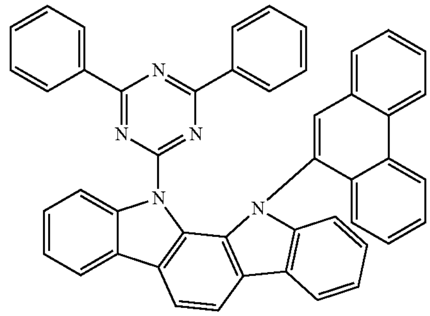
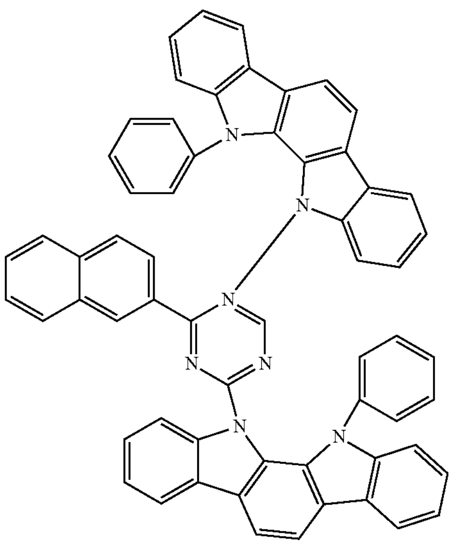
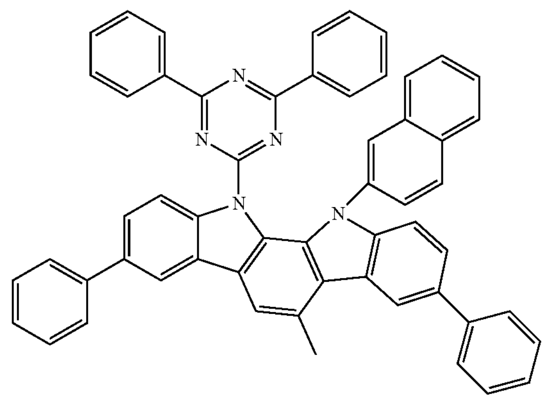
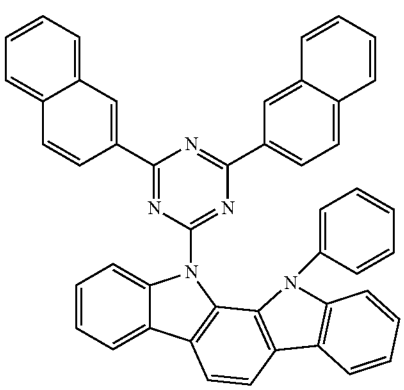
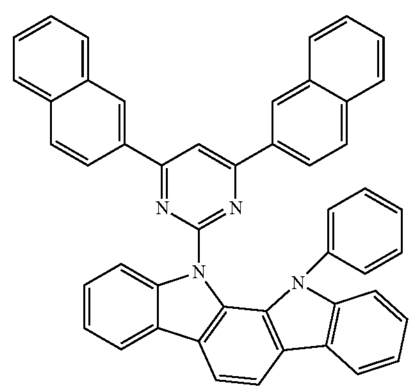
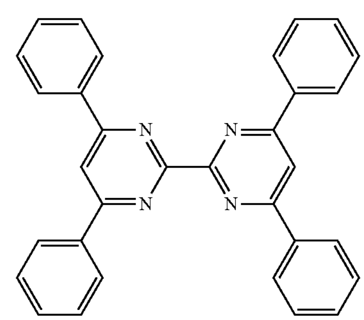
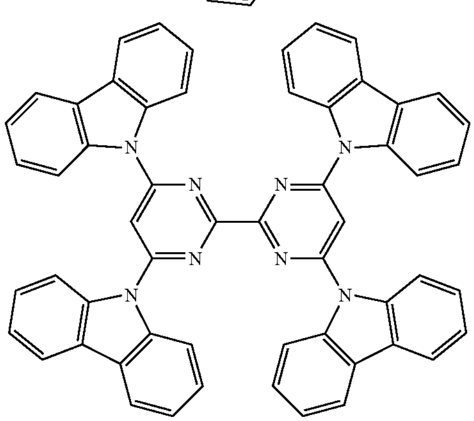
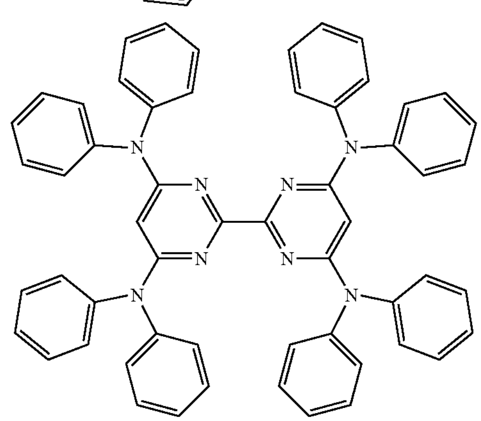

-continued
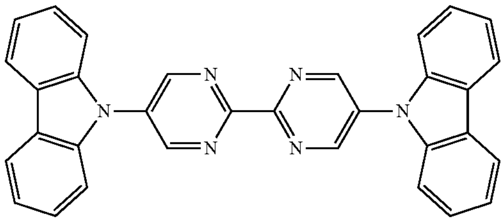
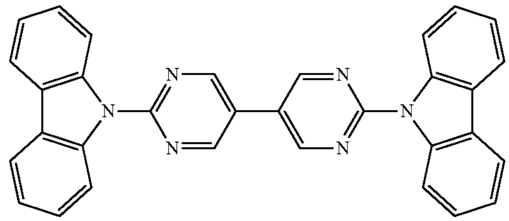
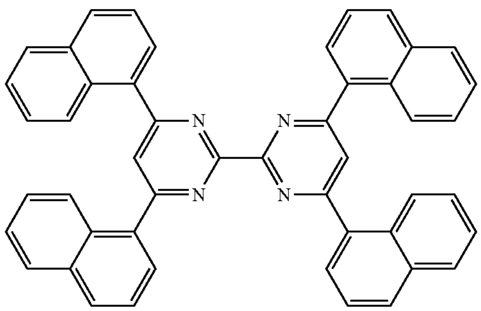
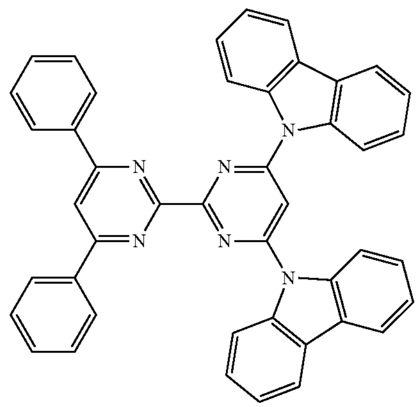
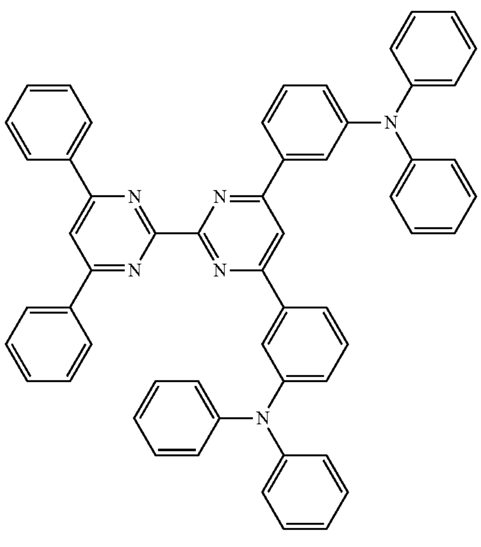
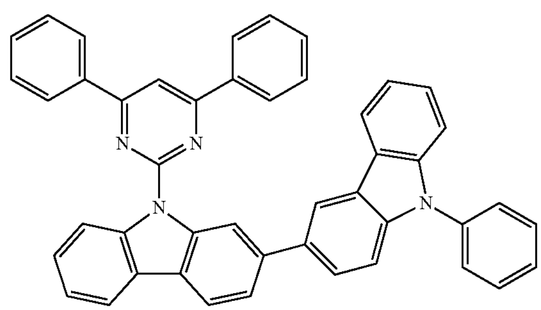
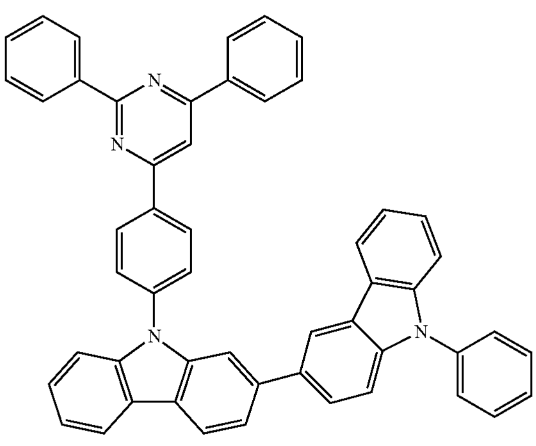
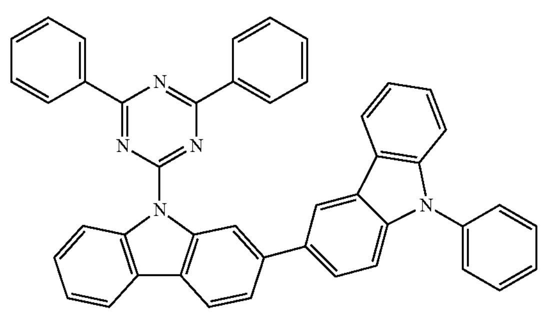

-continued
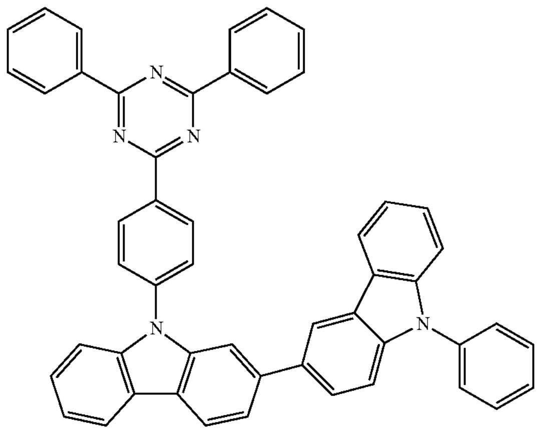
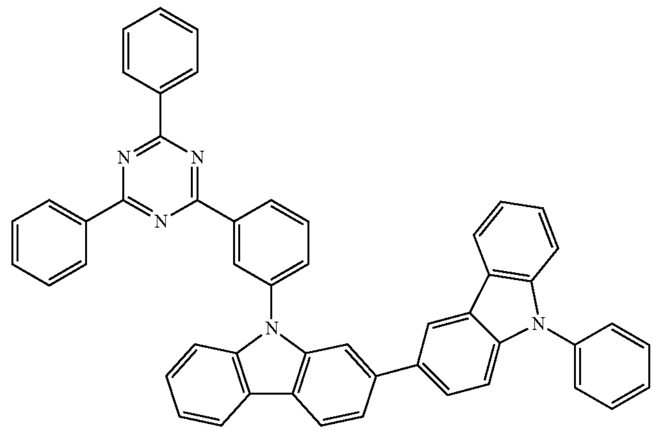
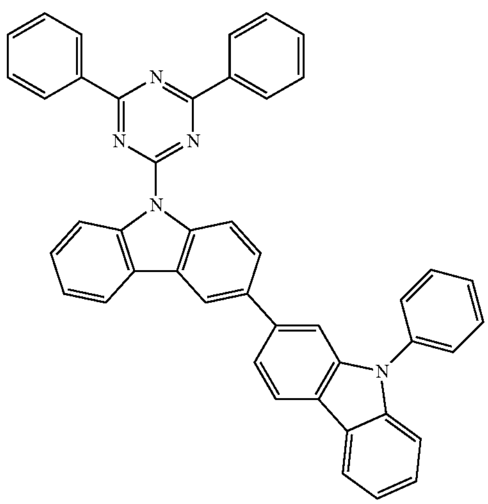
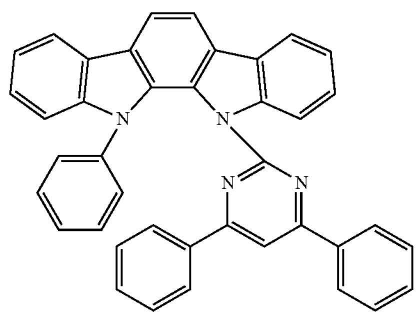
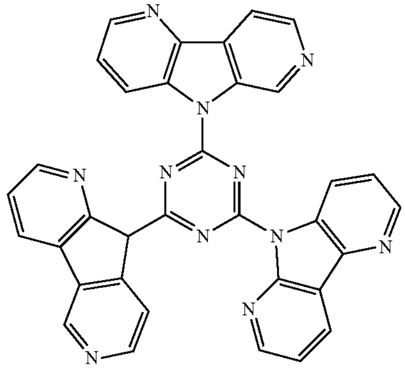
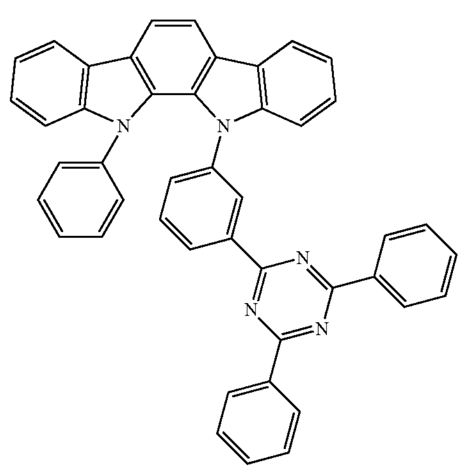

-continued
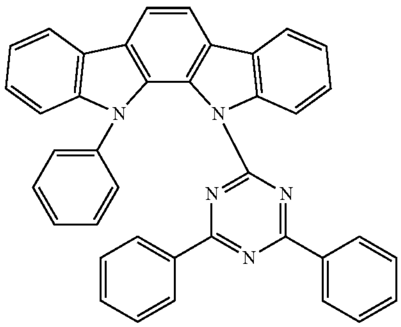
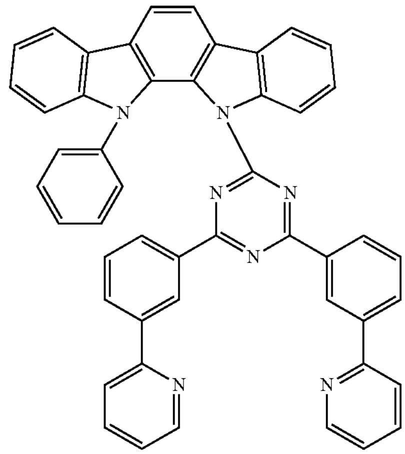
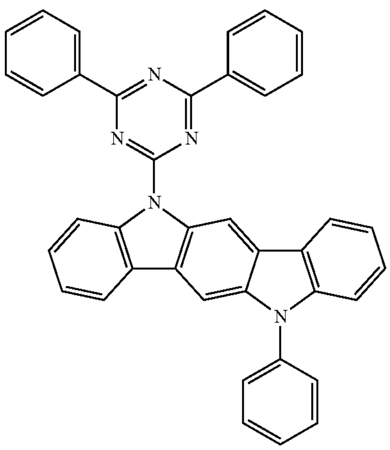
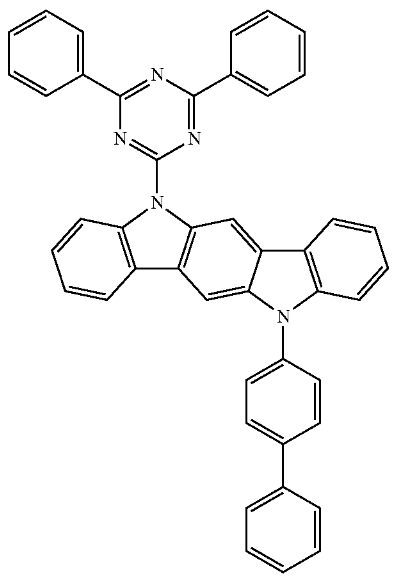
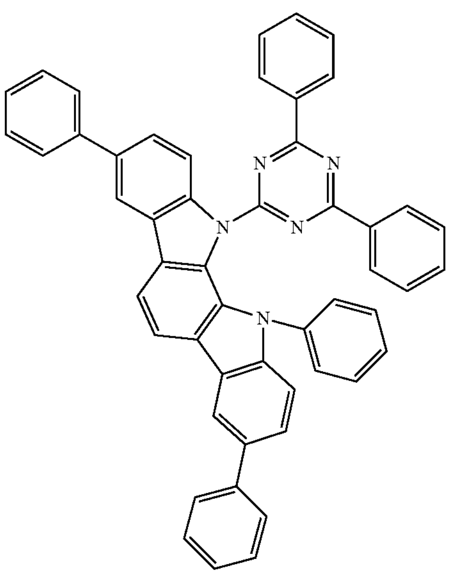
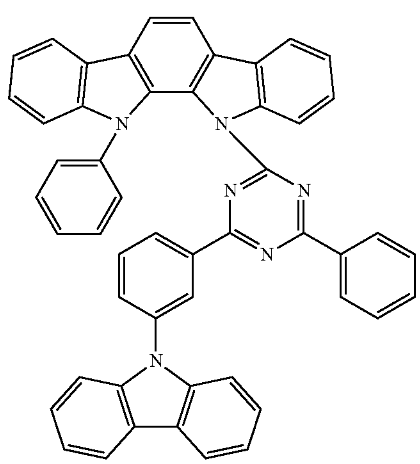

-continued
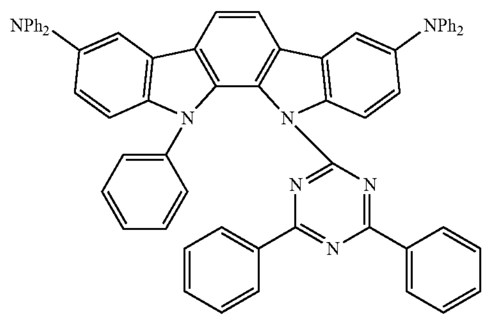
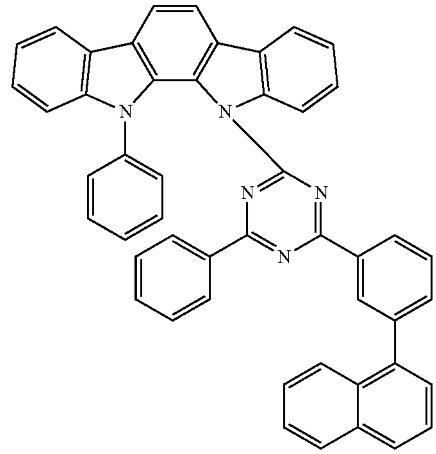
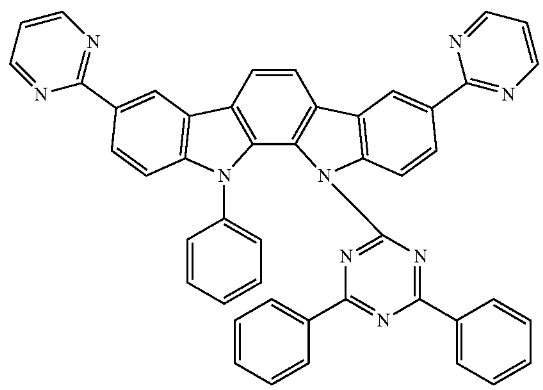
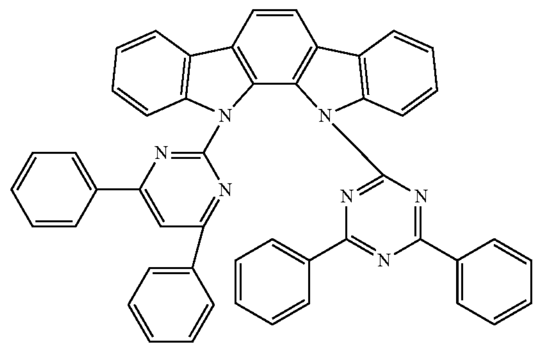
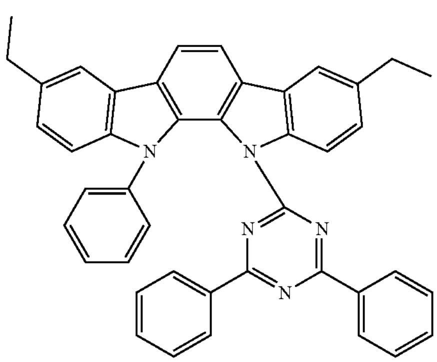
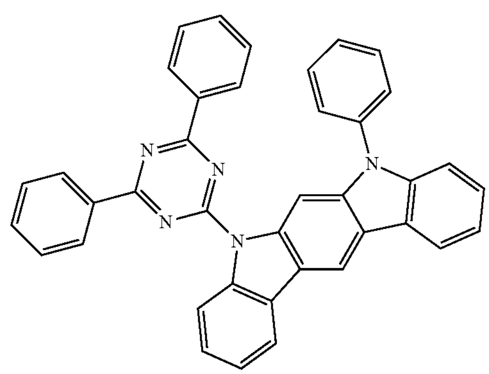
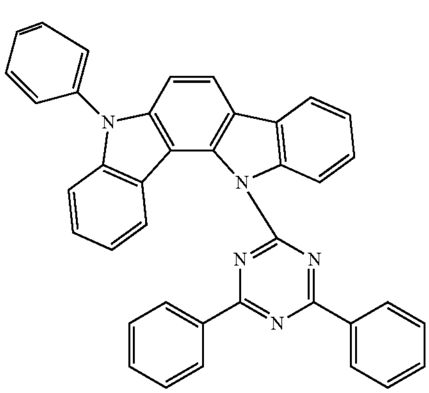
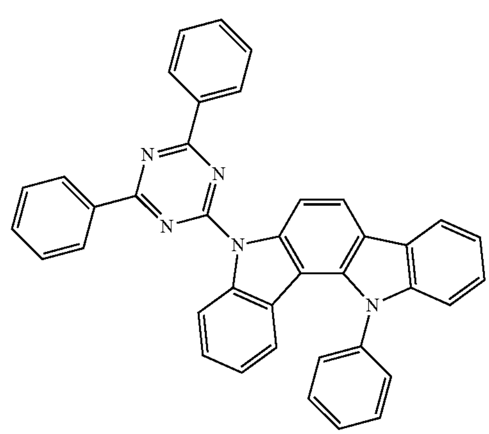

-continued
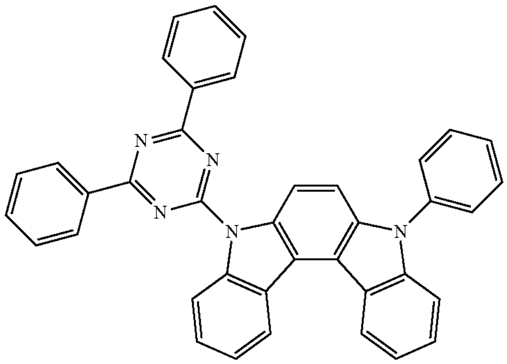
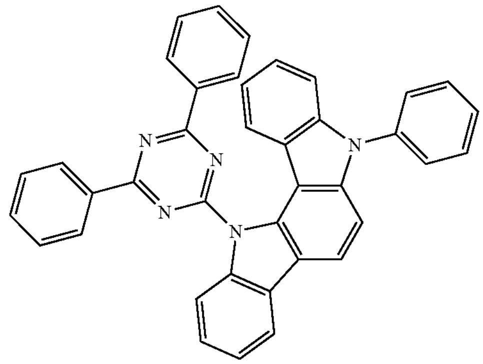
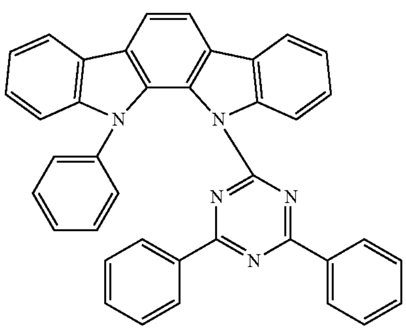
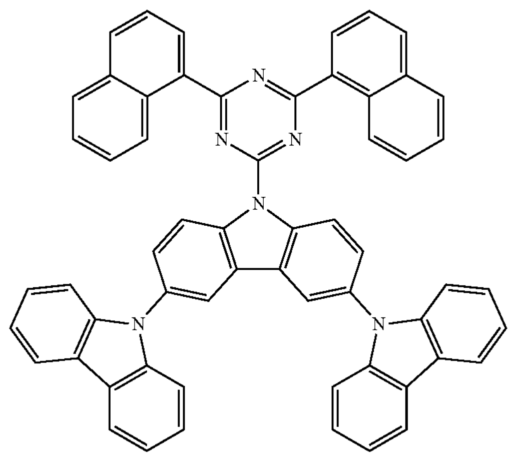
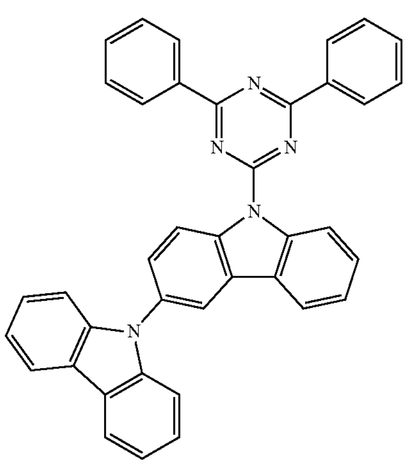
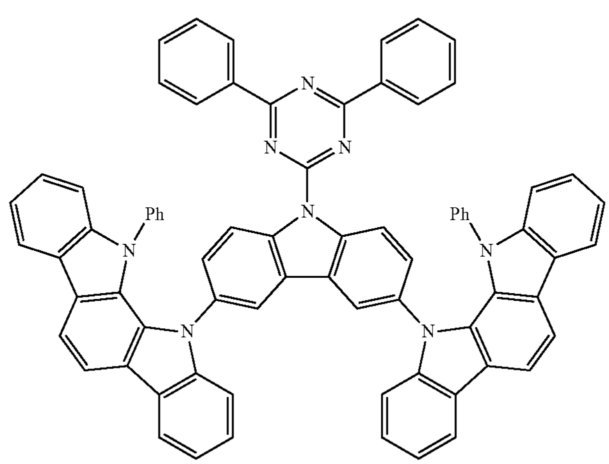

-continued
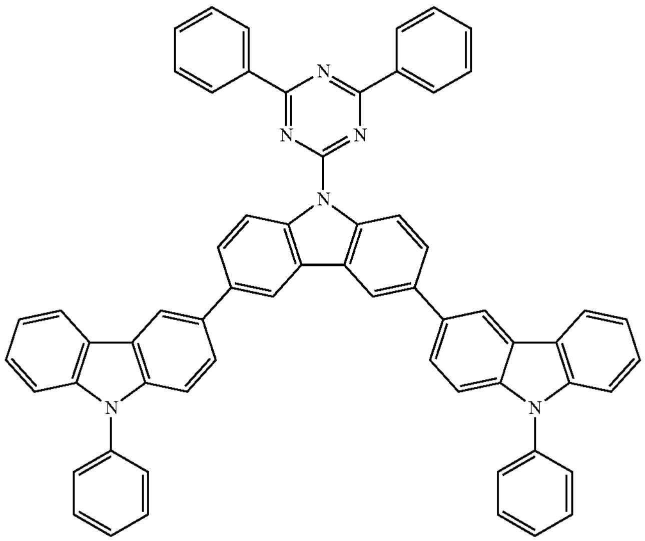
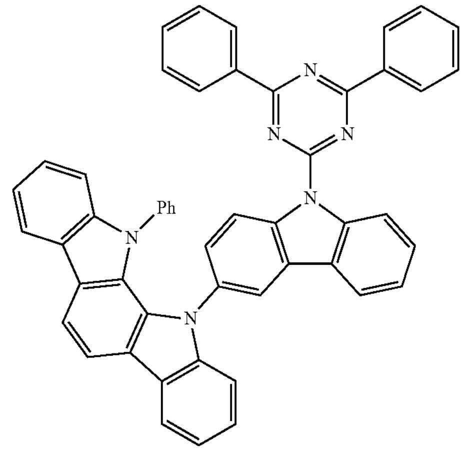
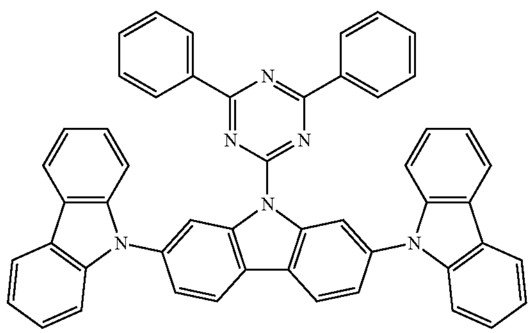
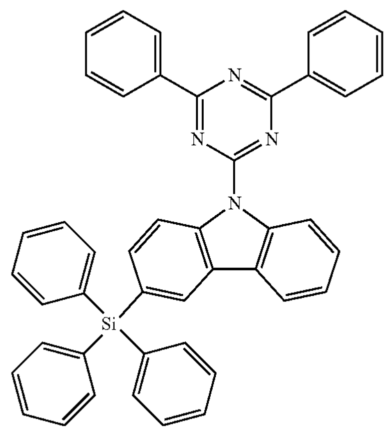
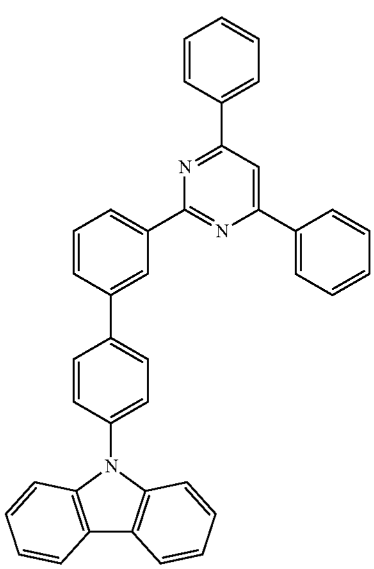
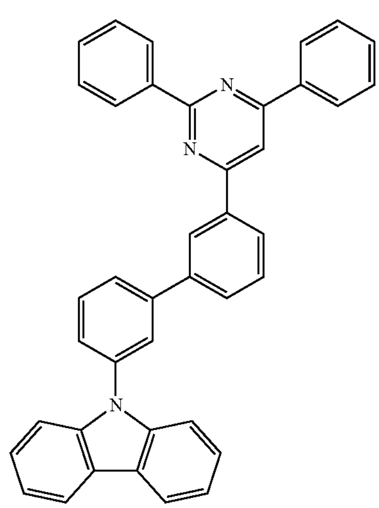

-continued
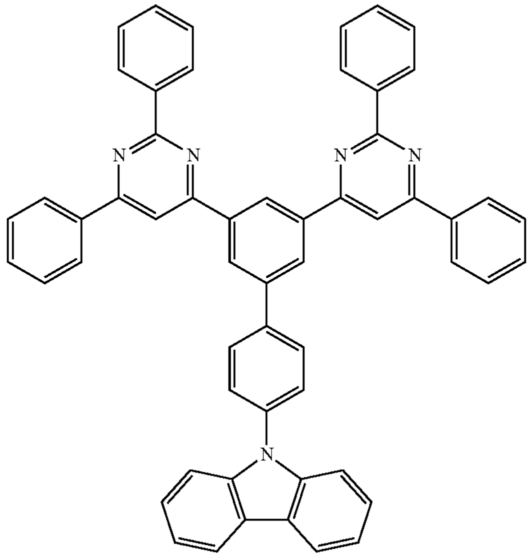
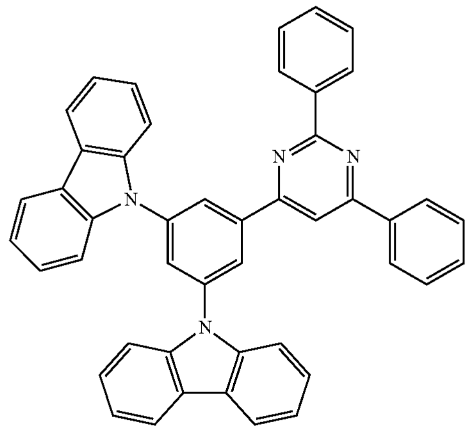
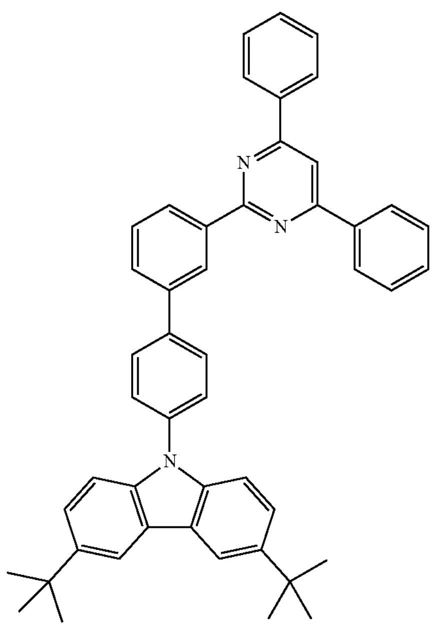
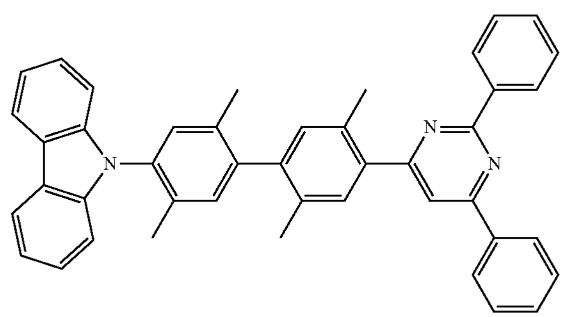
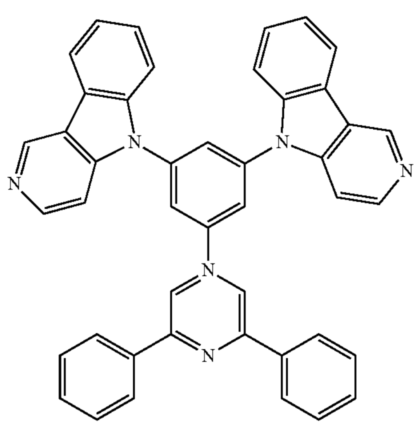
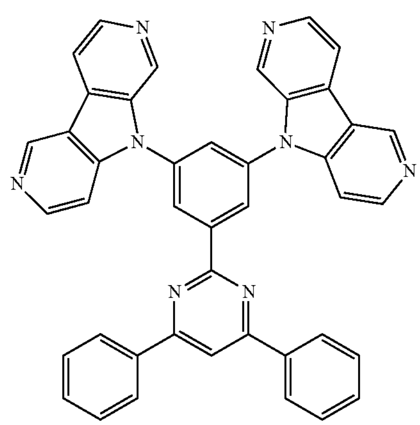

-continued
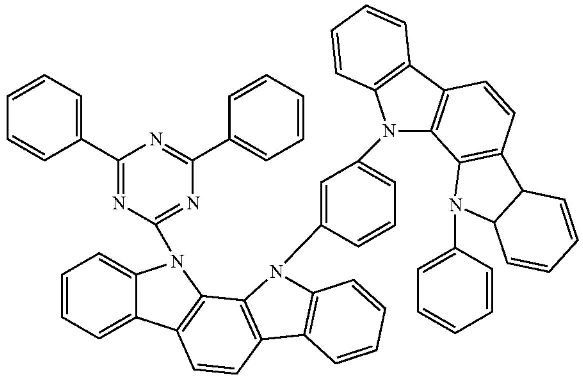
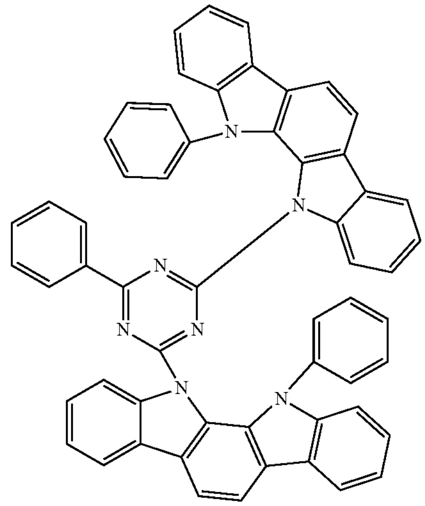
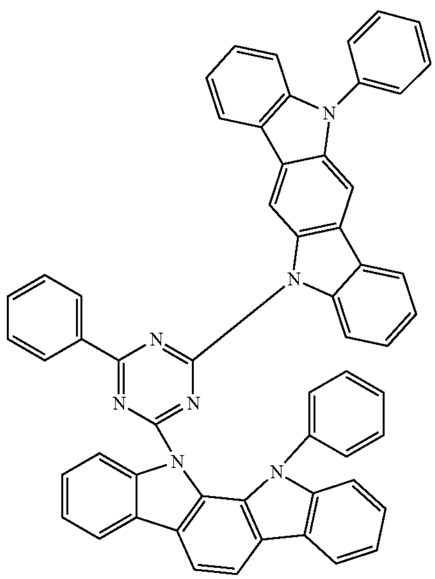
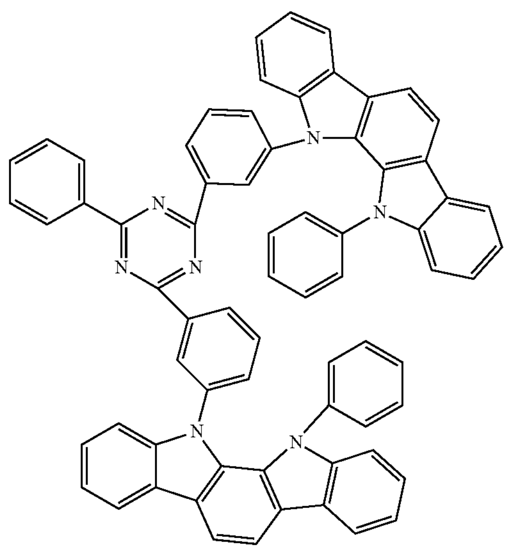
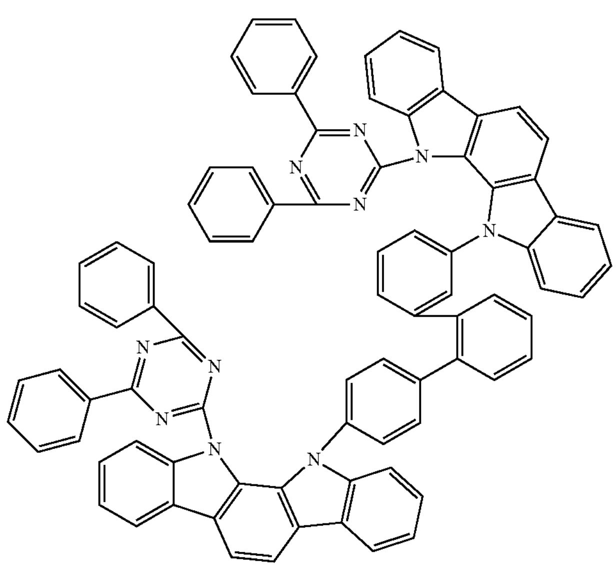
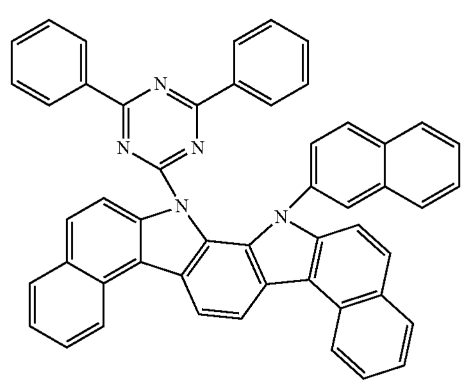

-continued
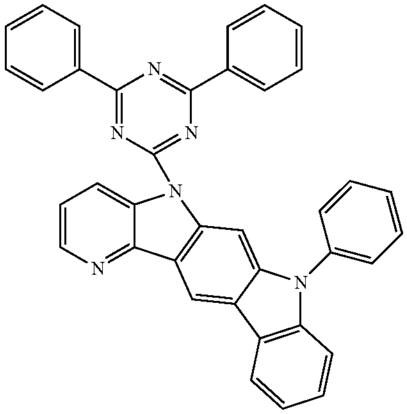
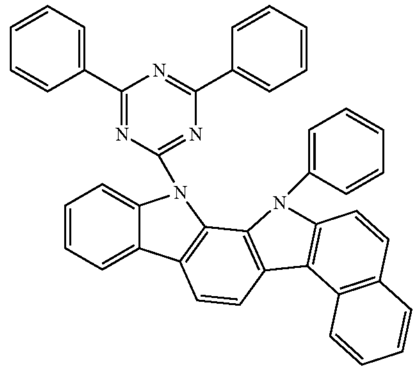
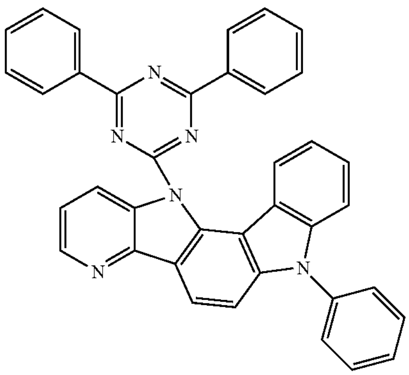
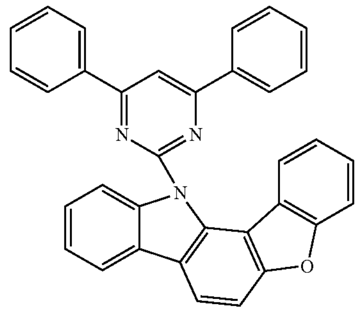
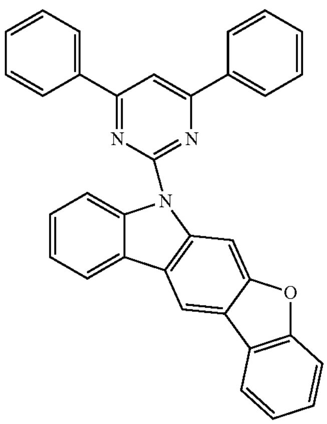
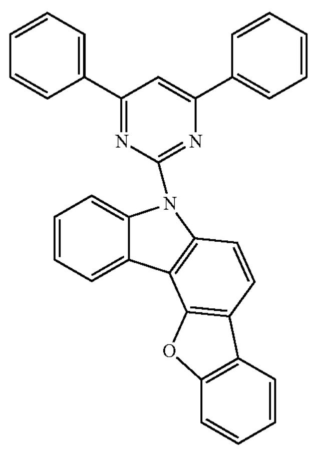
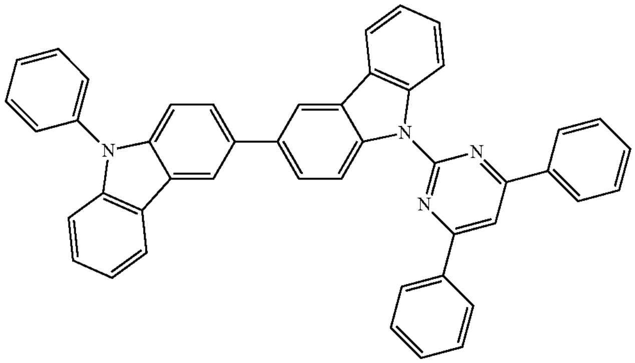
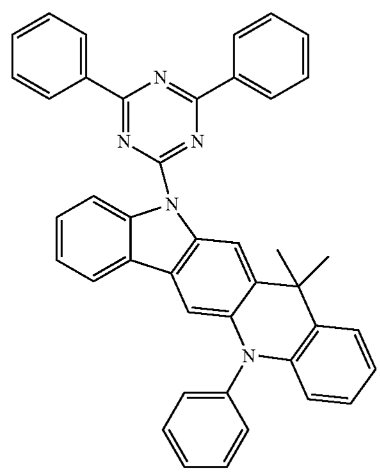

-continued
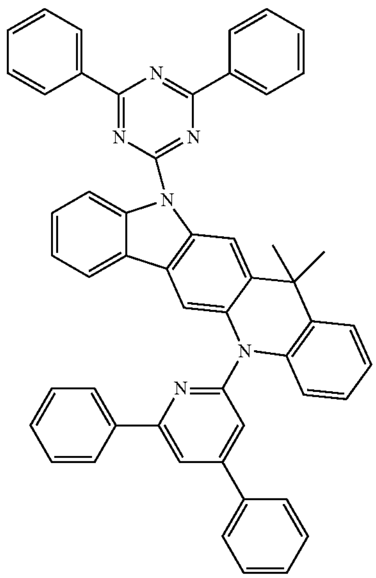
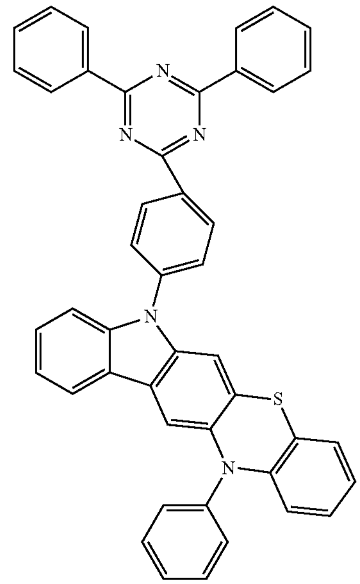
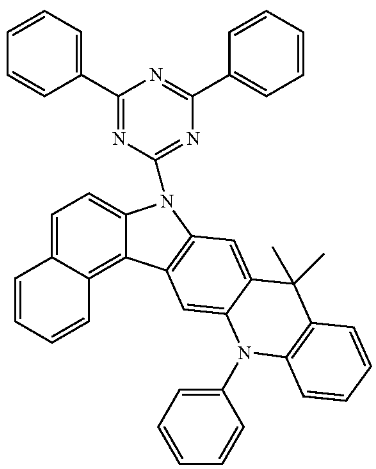
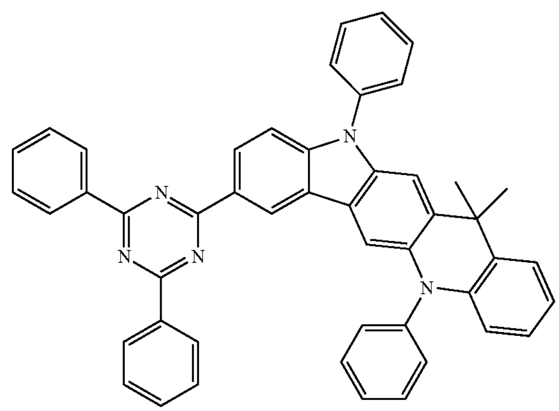
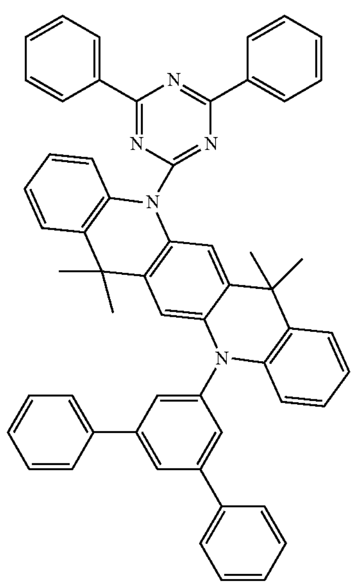
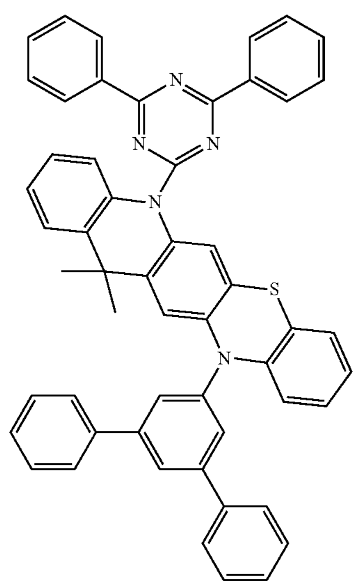
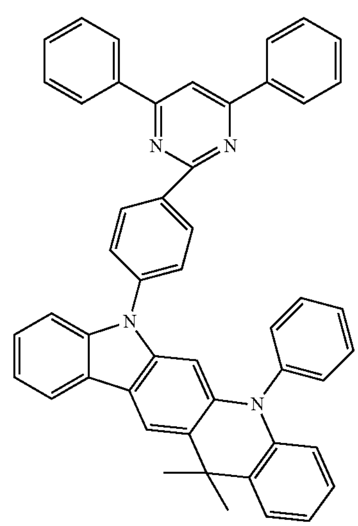

-continued
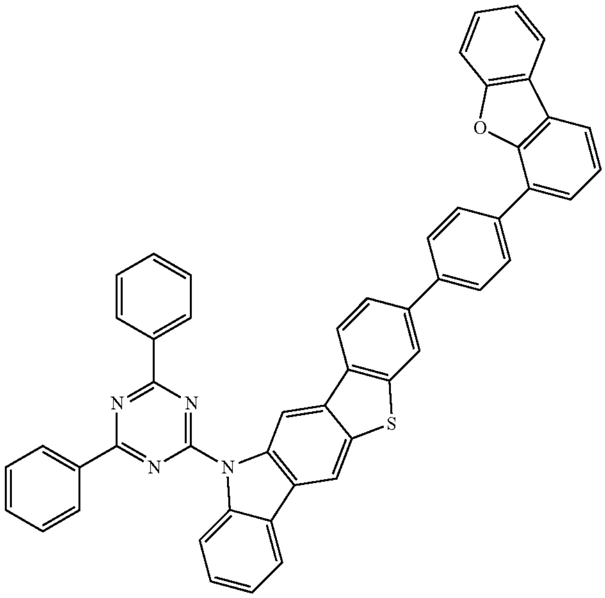
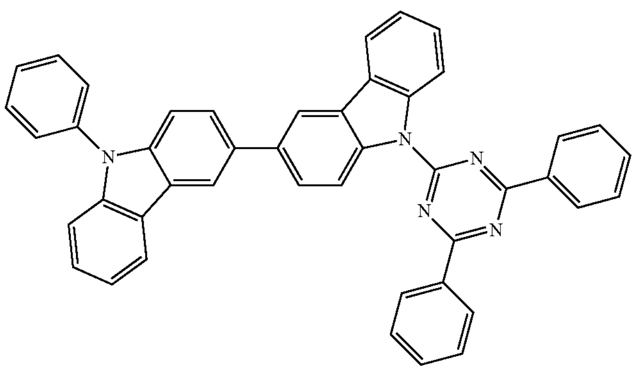
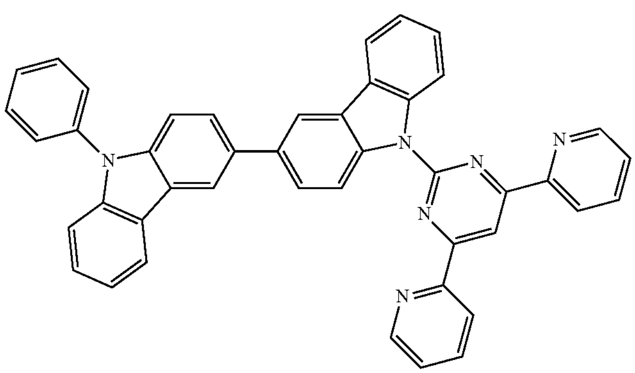
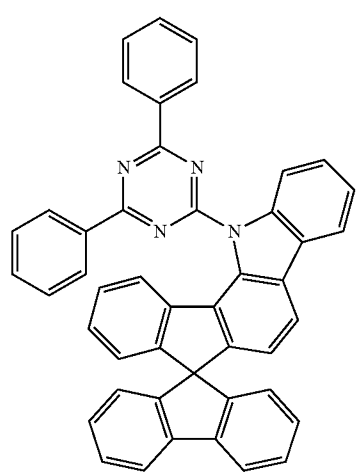

-continued
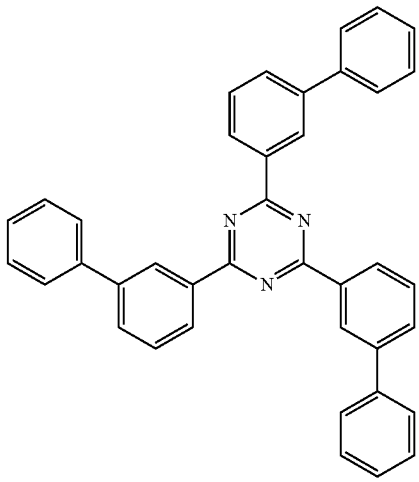
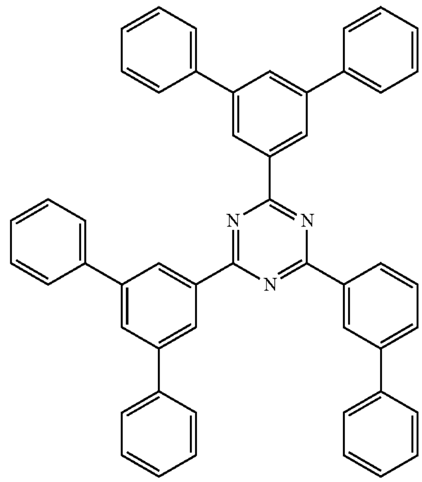
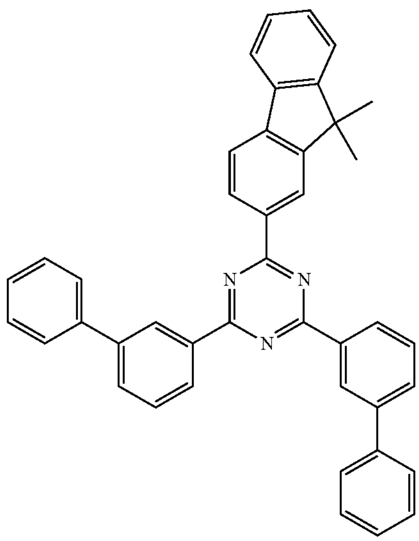
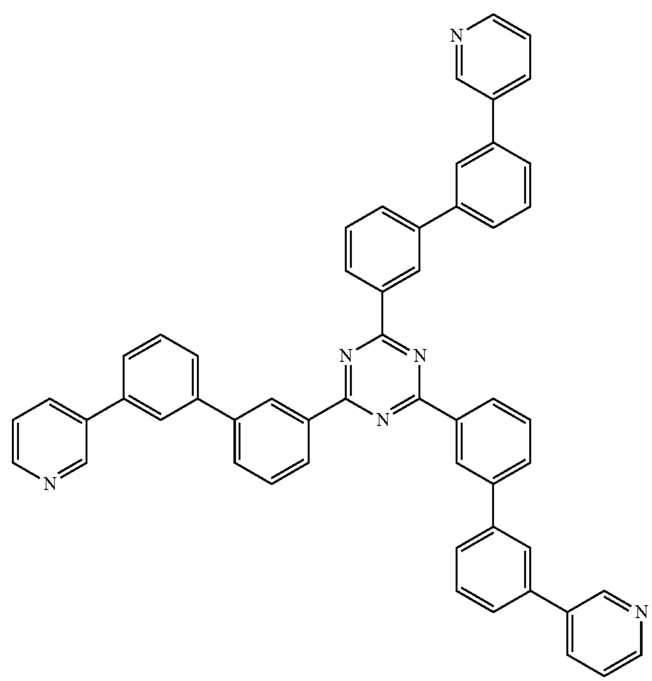
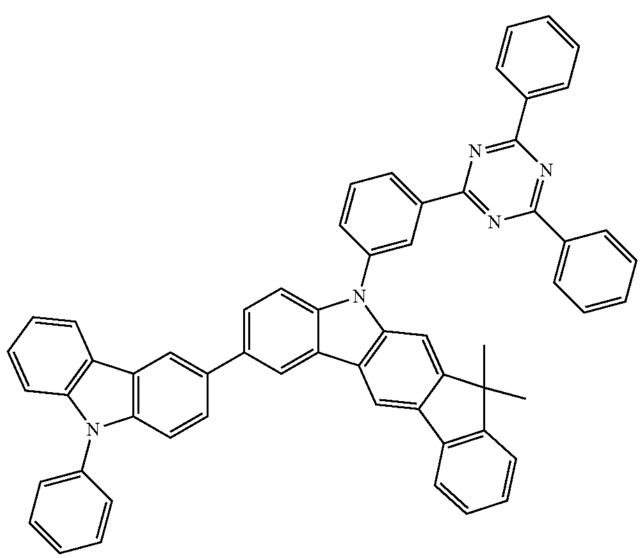

-continued
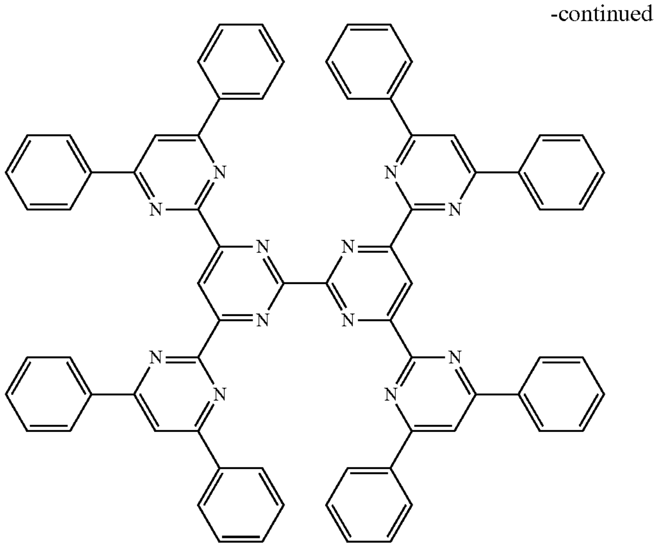
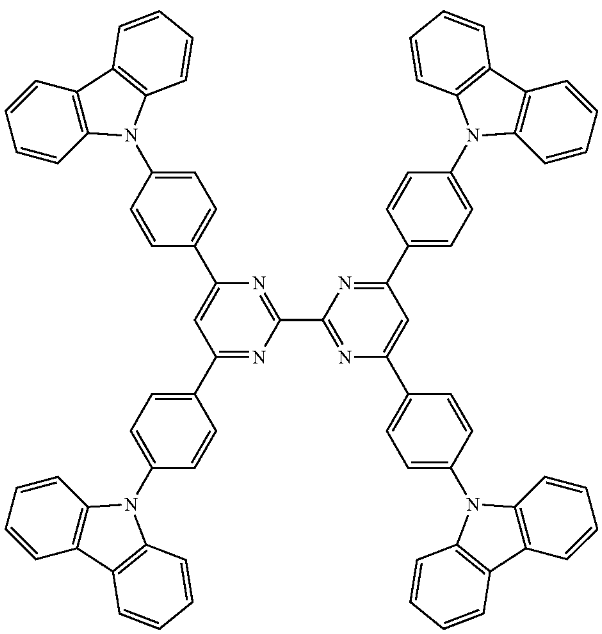
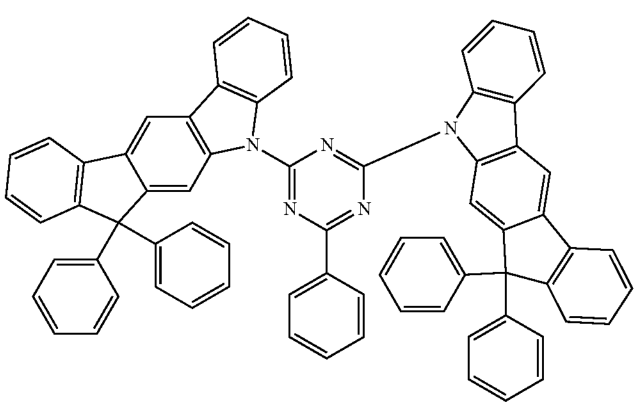

-continued
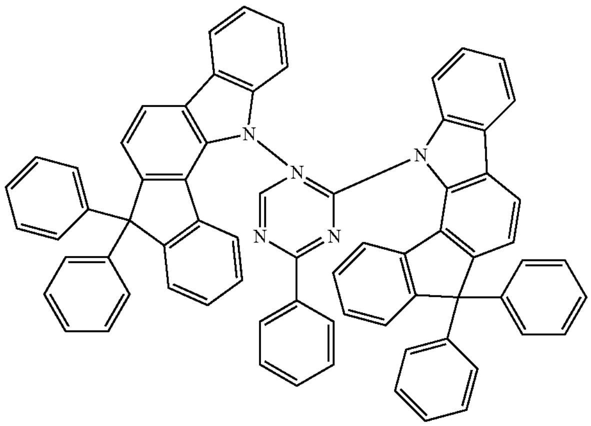
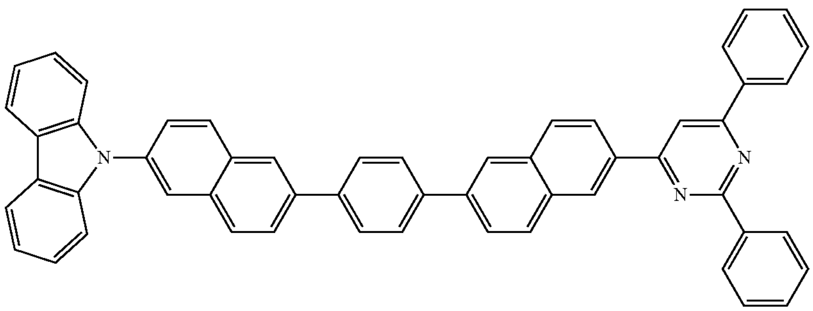
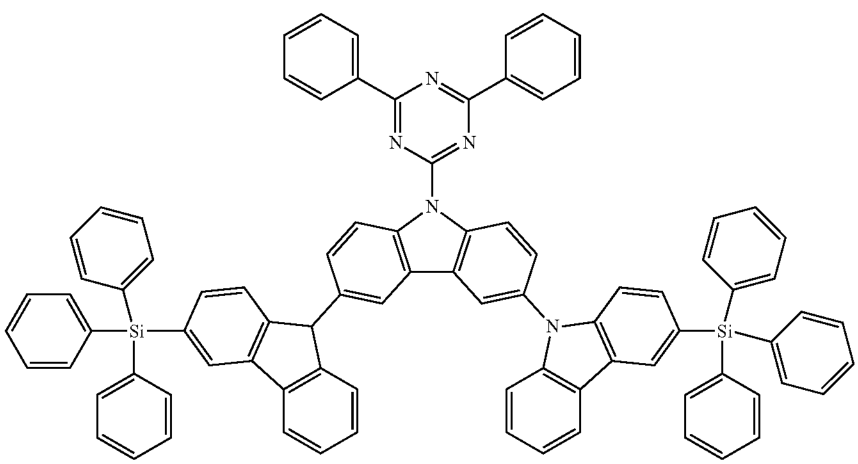
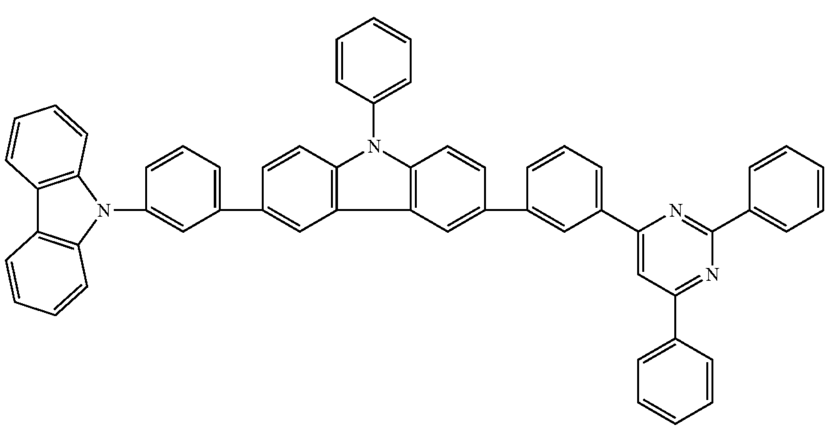

-continued
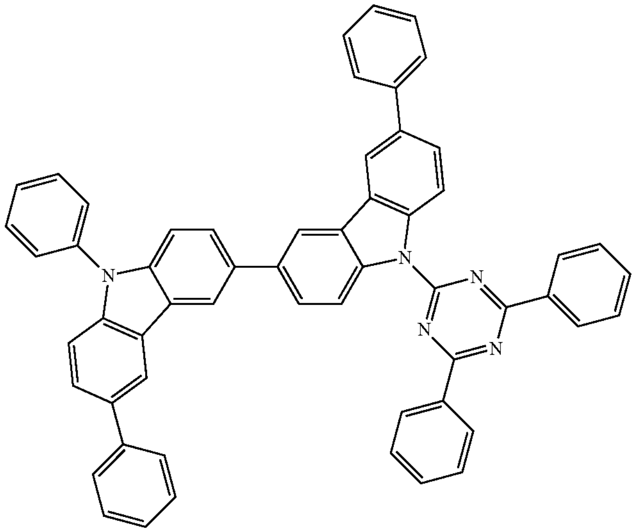
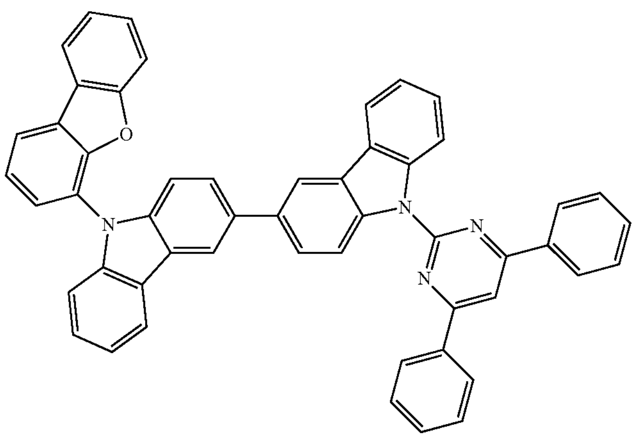
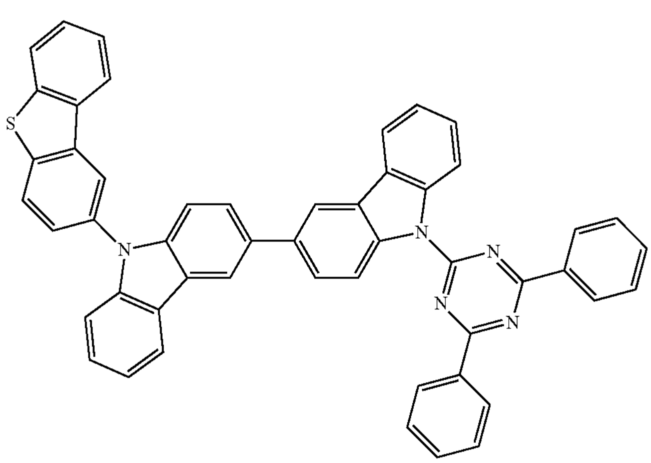

-continued
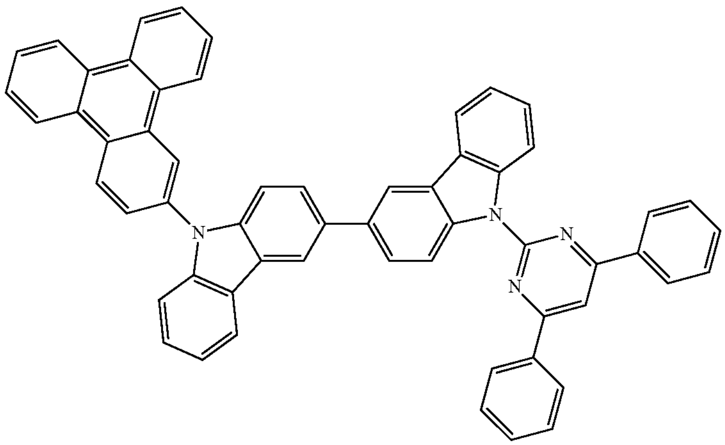
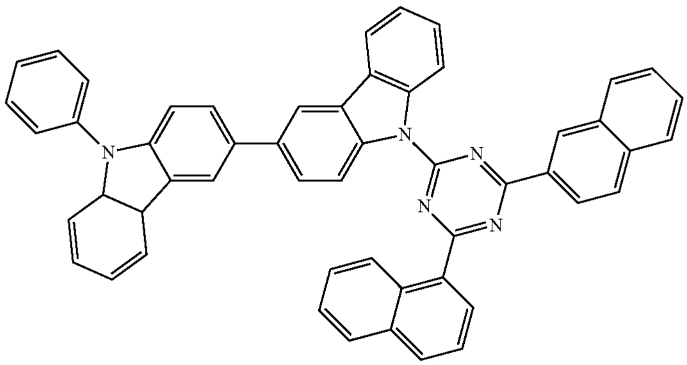
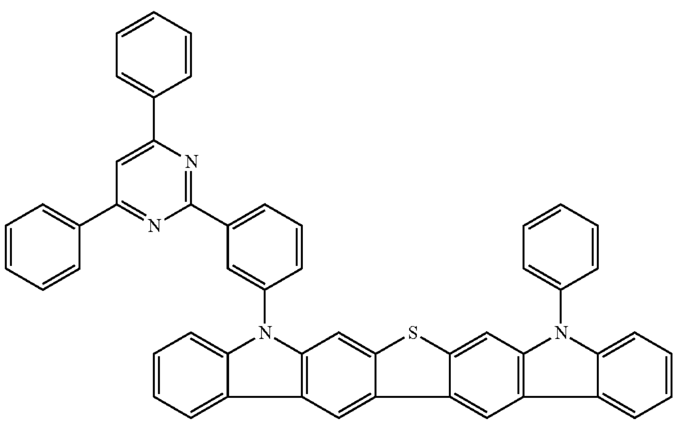
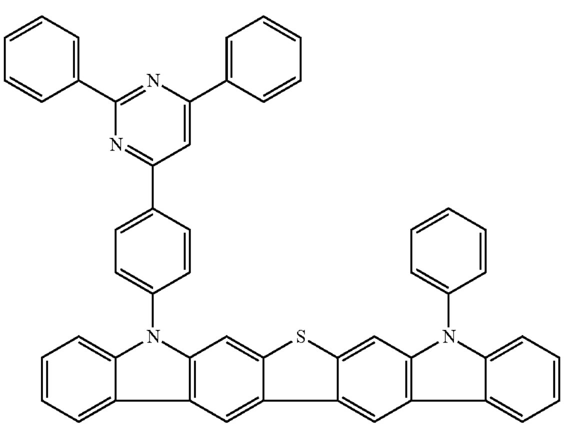

-continued
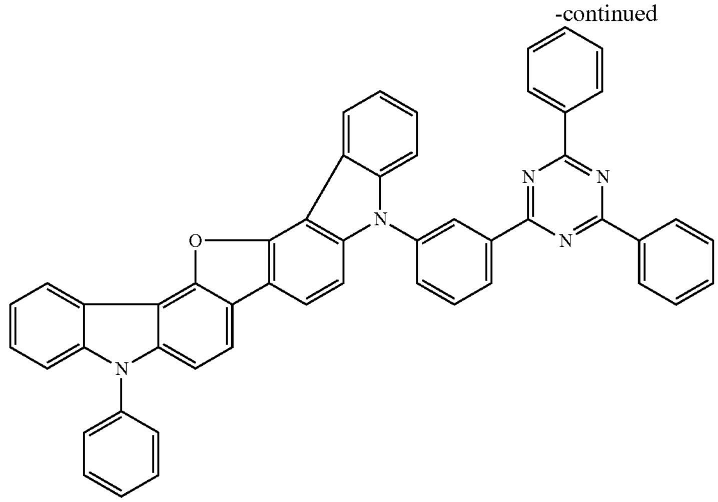
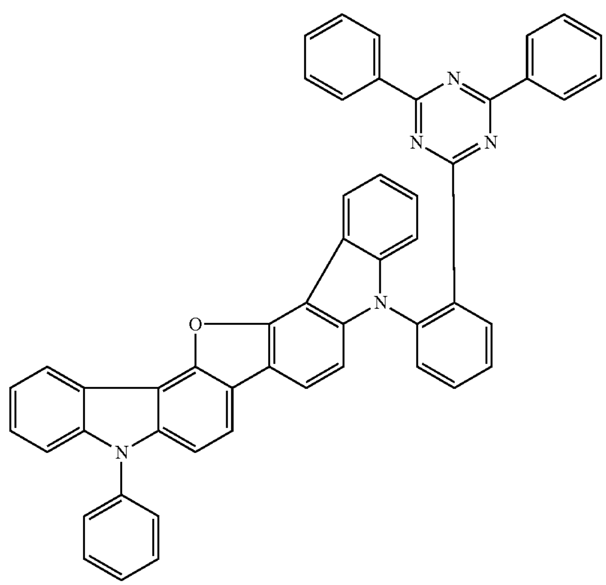
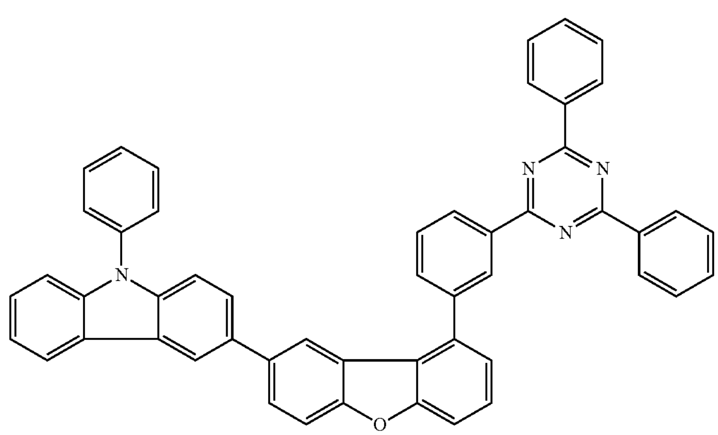

-continued
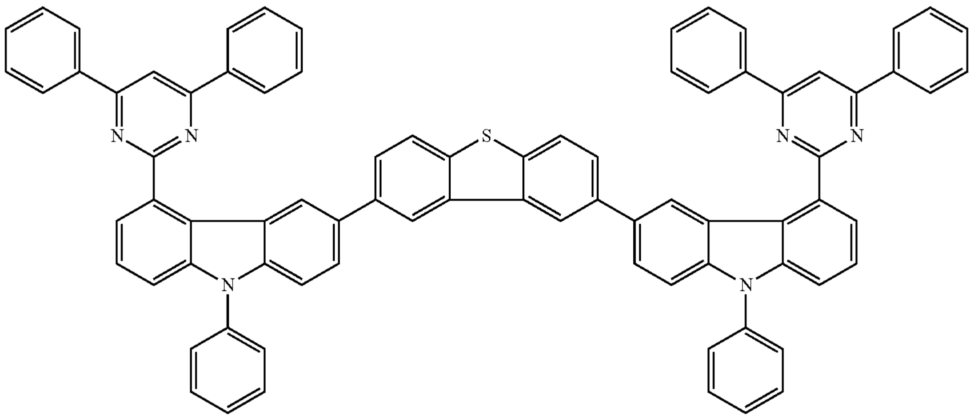
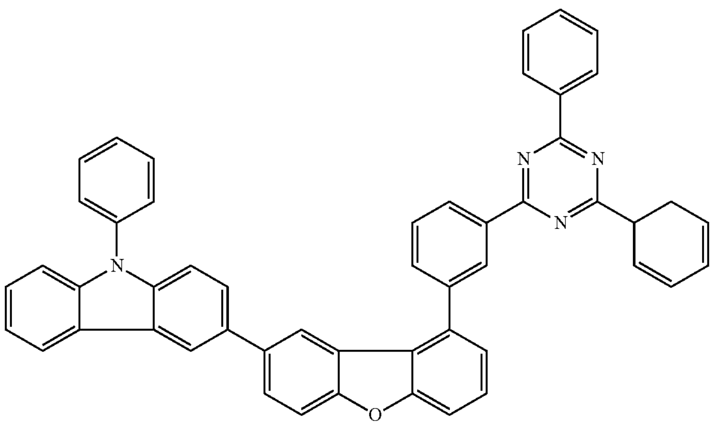
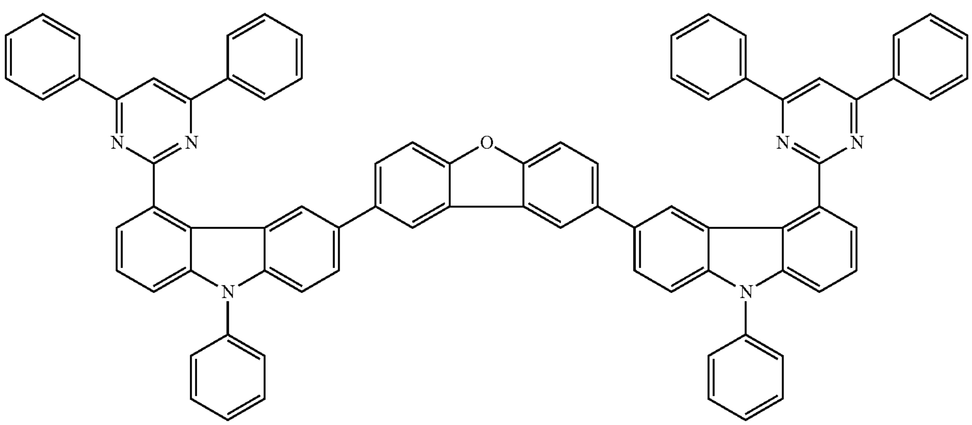
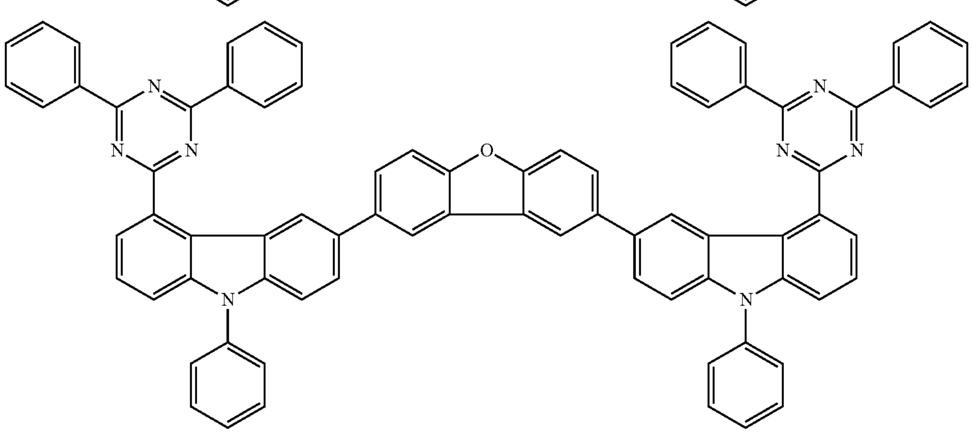

-continued
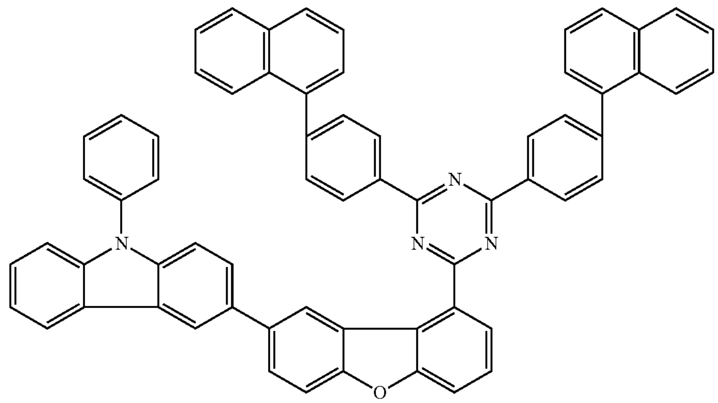
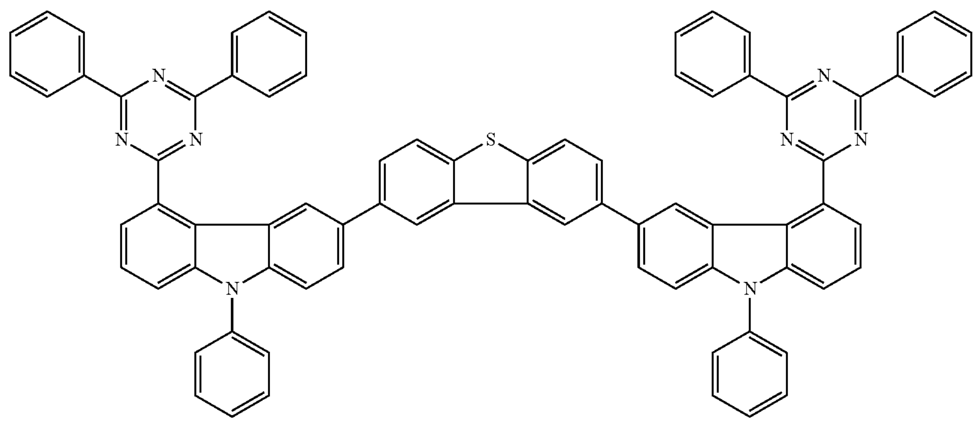
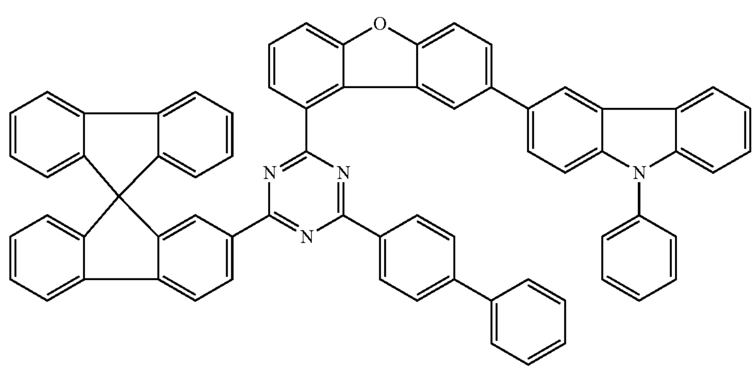
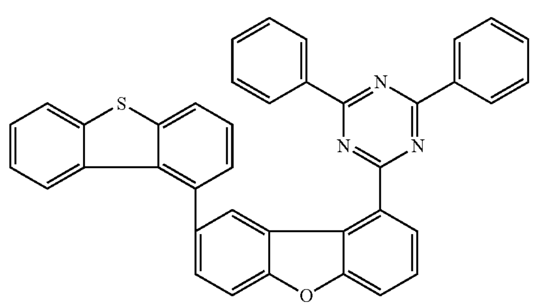

-continued
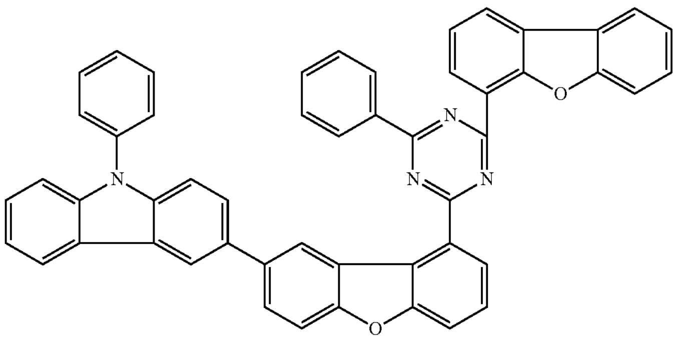
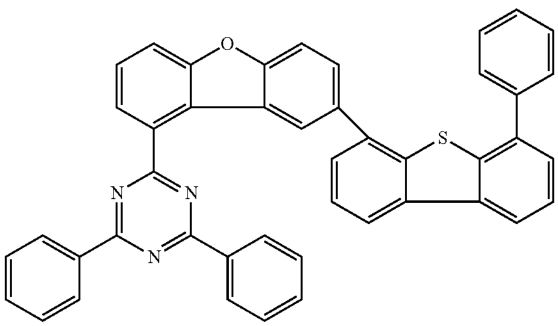
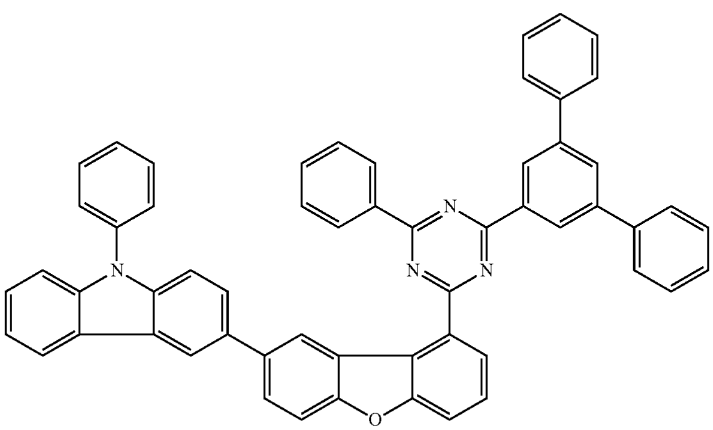
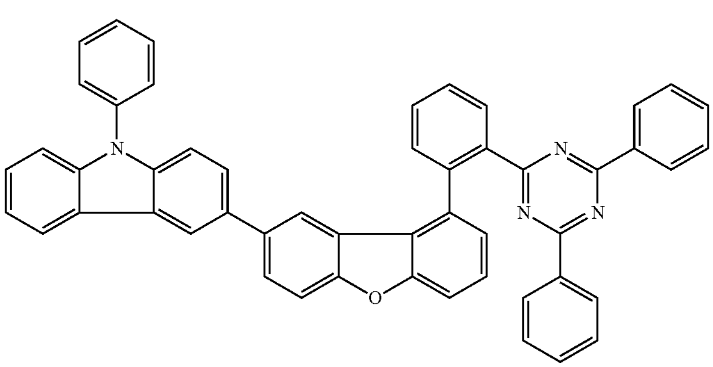

-continued
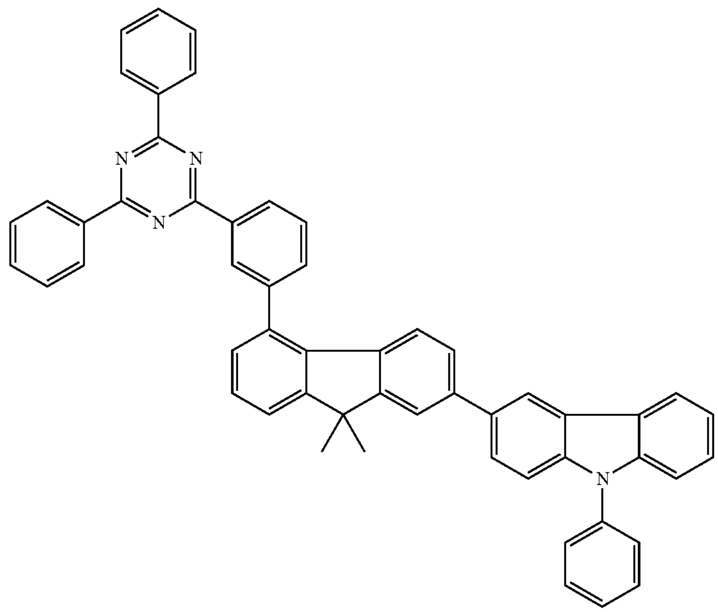
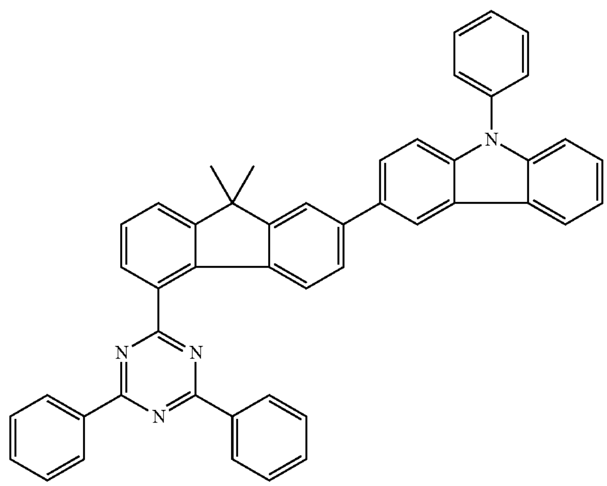
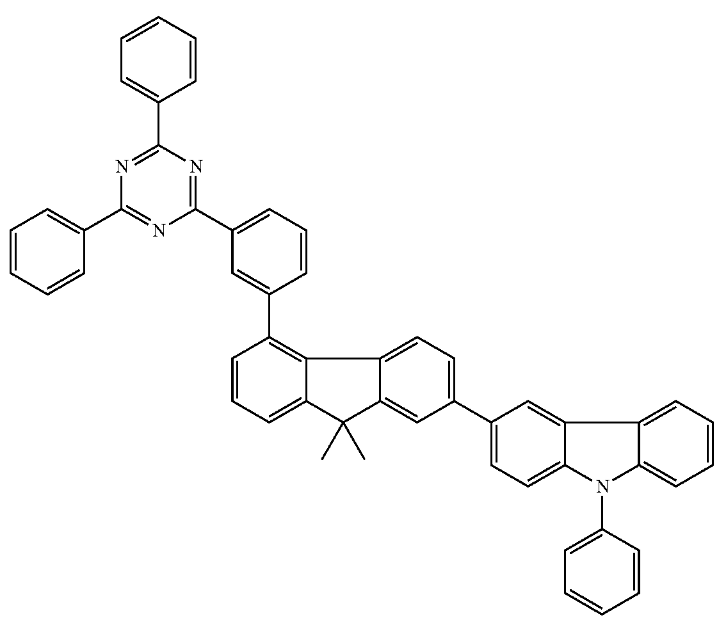

-continued
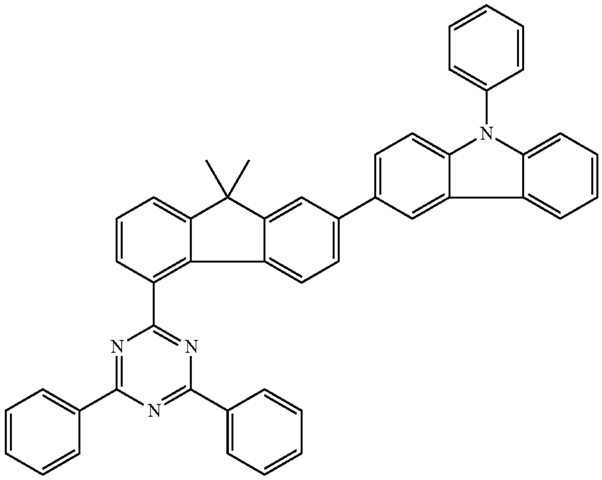
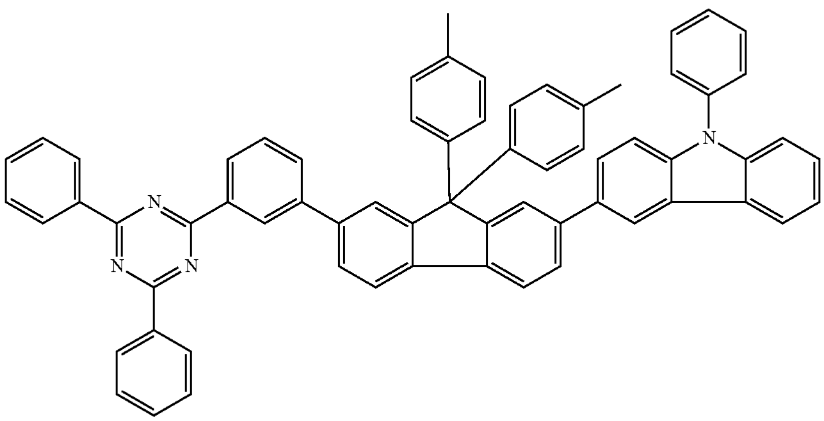
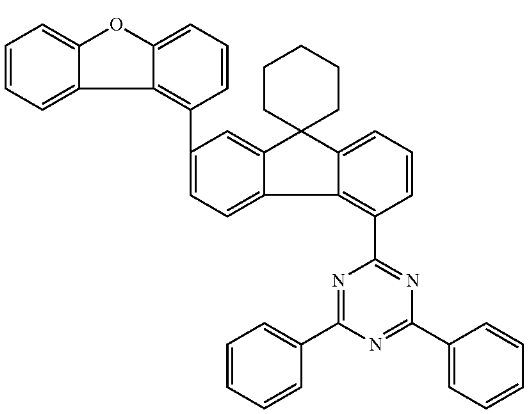
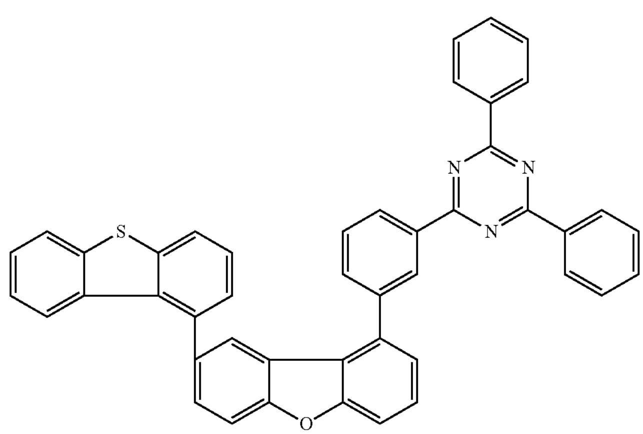

-continued
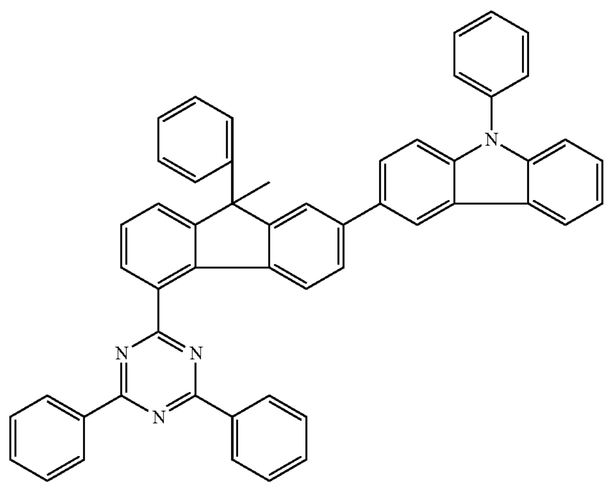
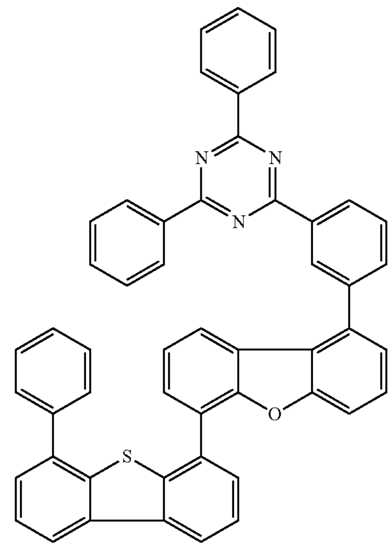
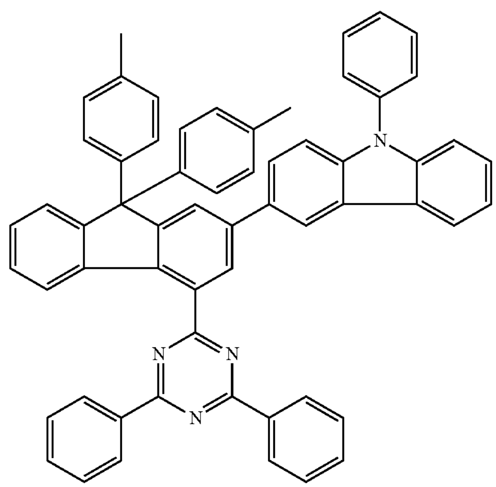
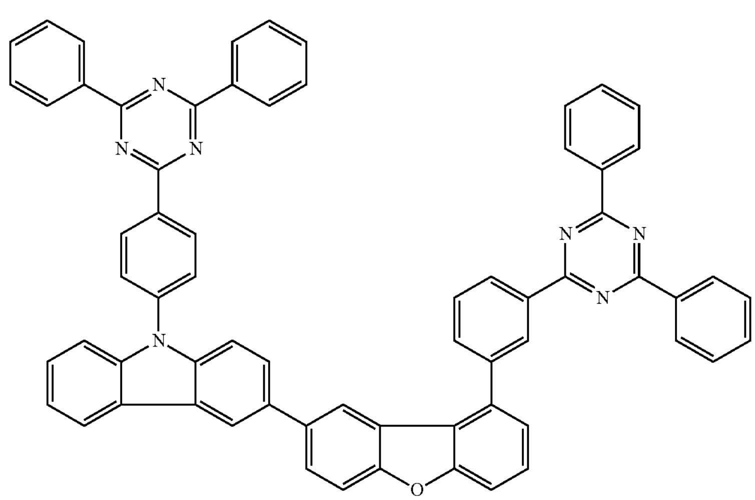

-continued
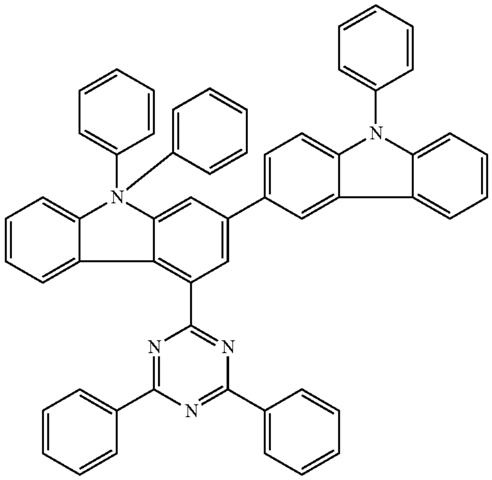
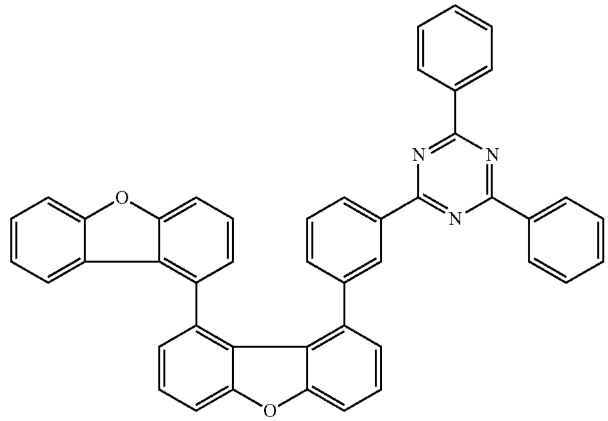
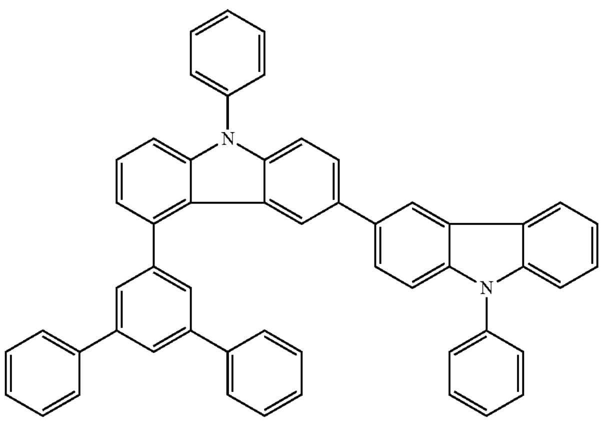
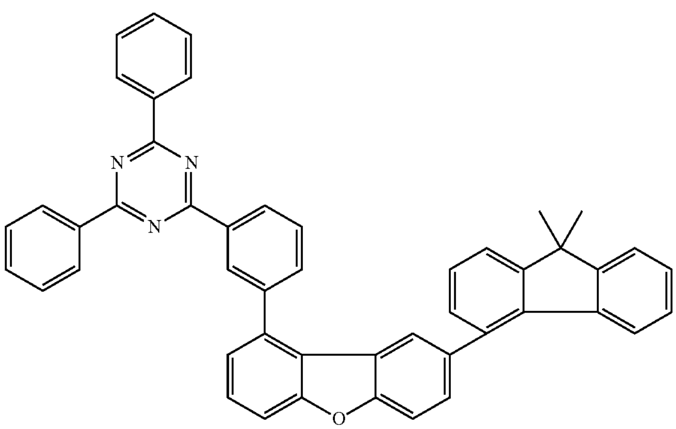
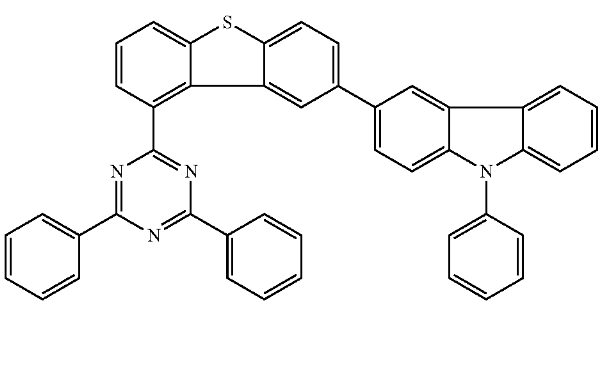

-continued
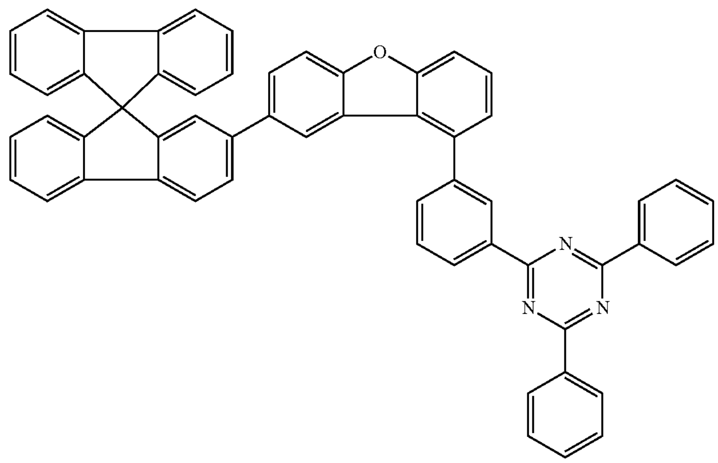
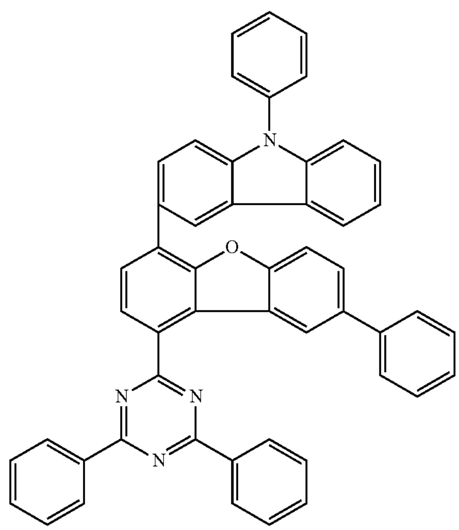
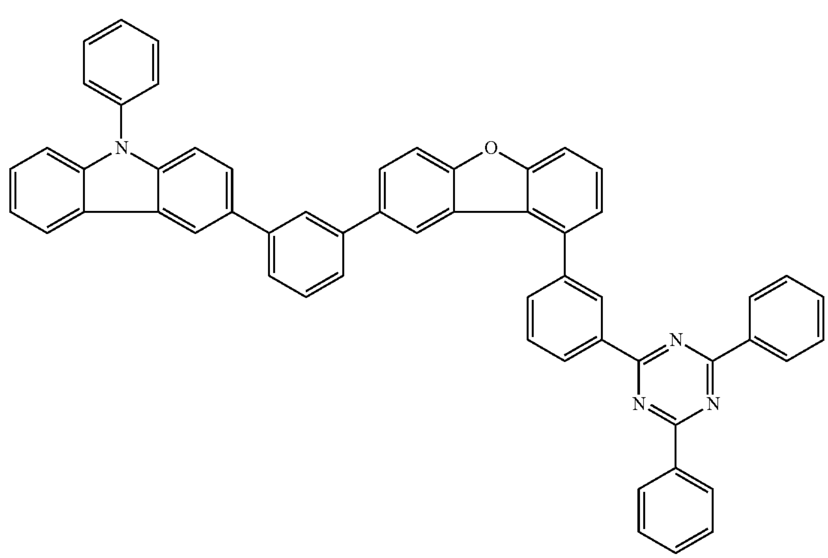

-continued
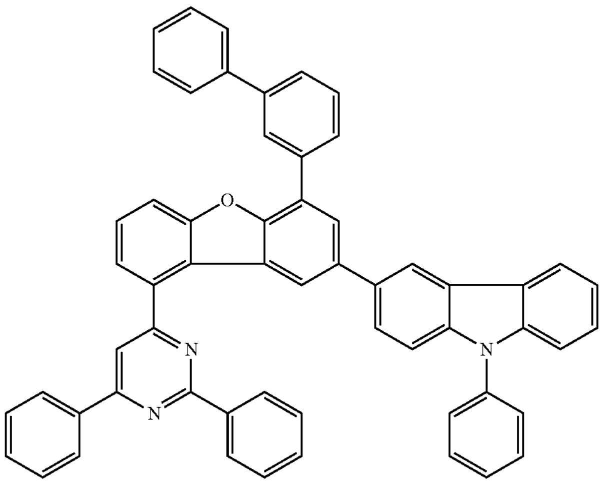
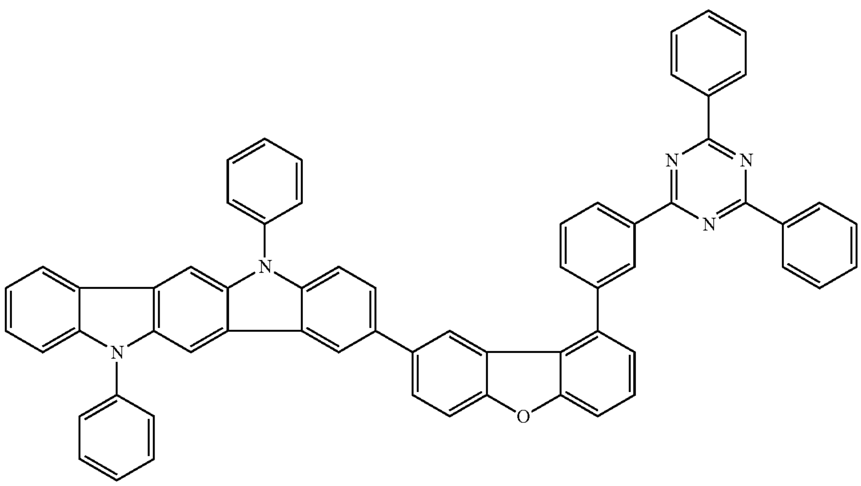
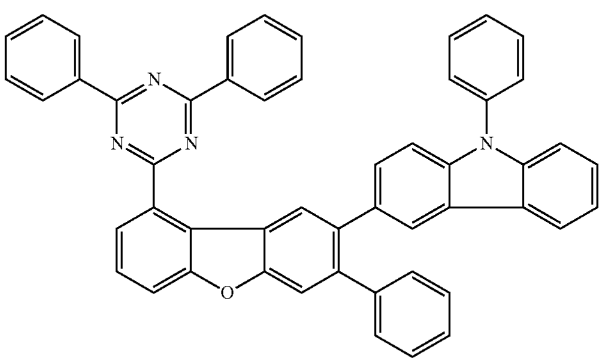
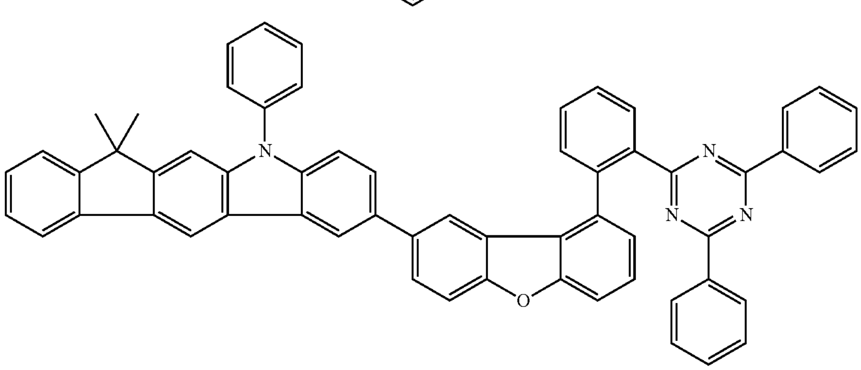

-continued
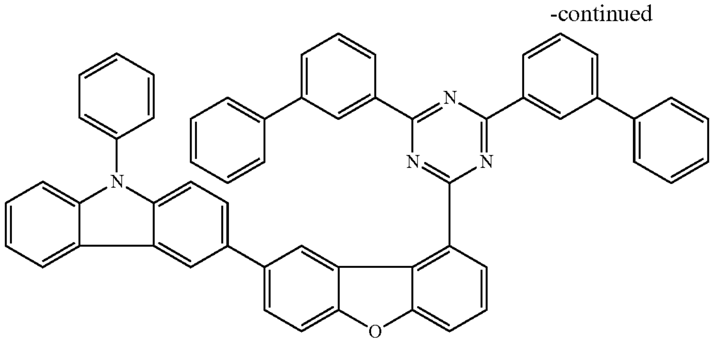
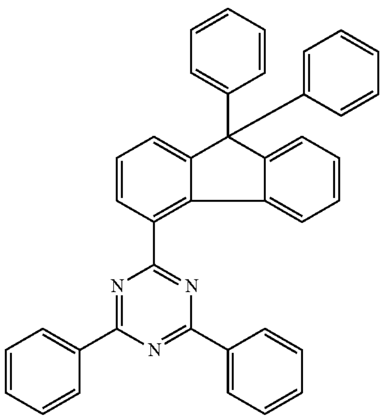
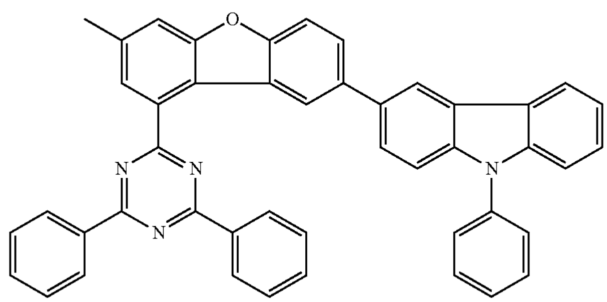
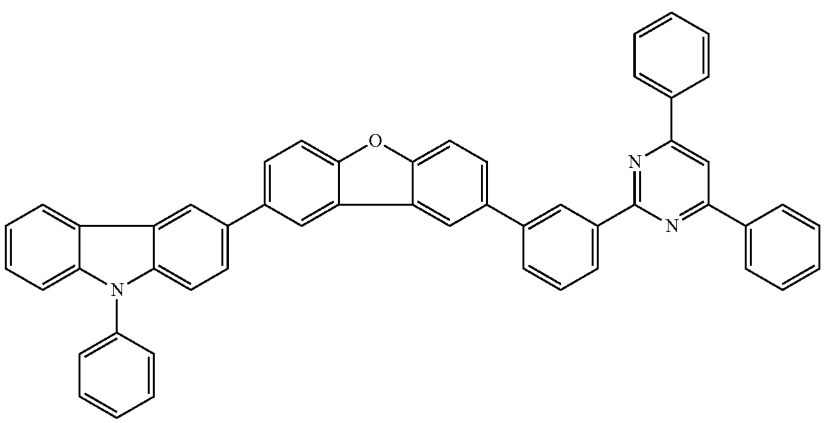
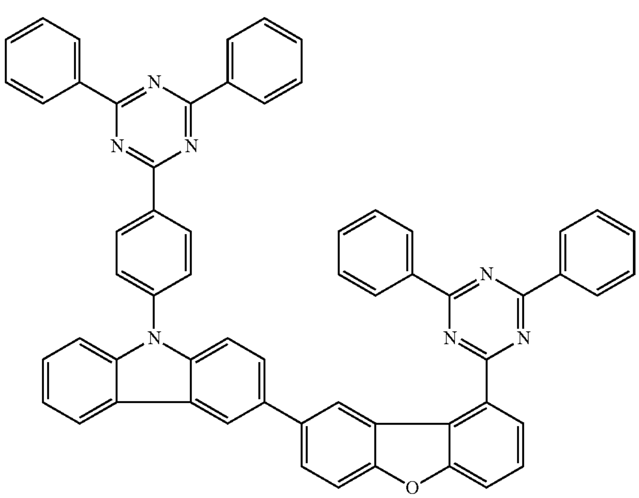

-continued
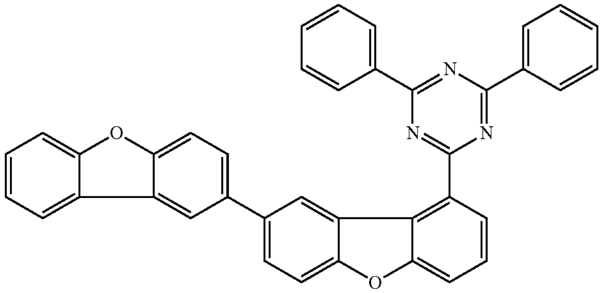
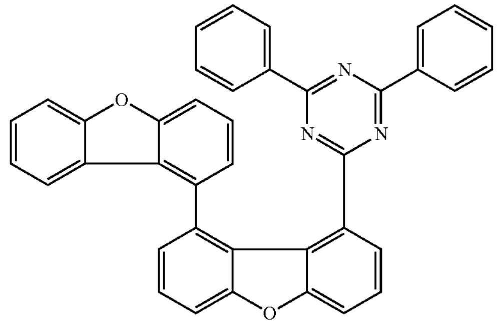
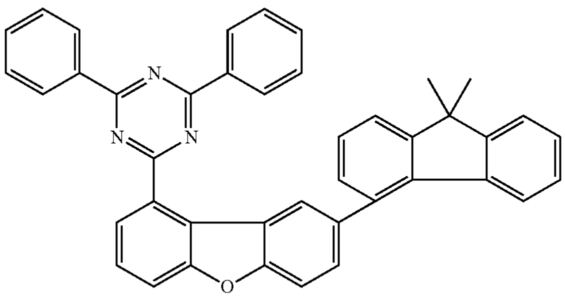
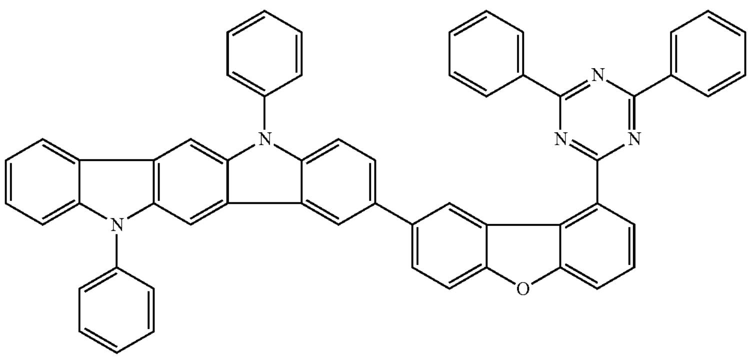
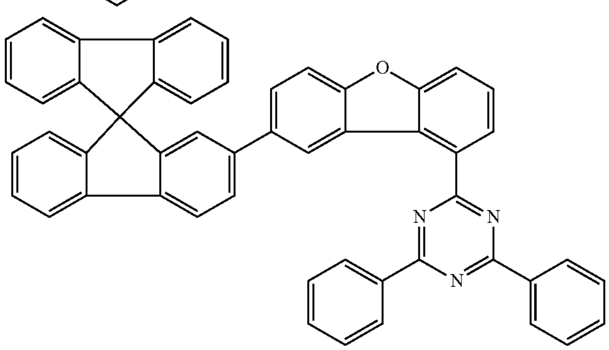
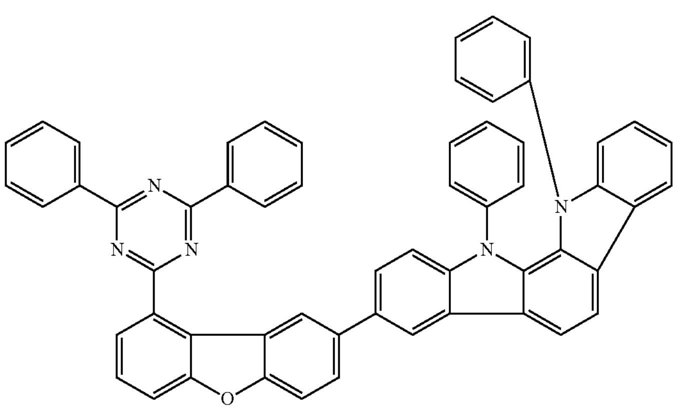

-continued
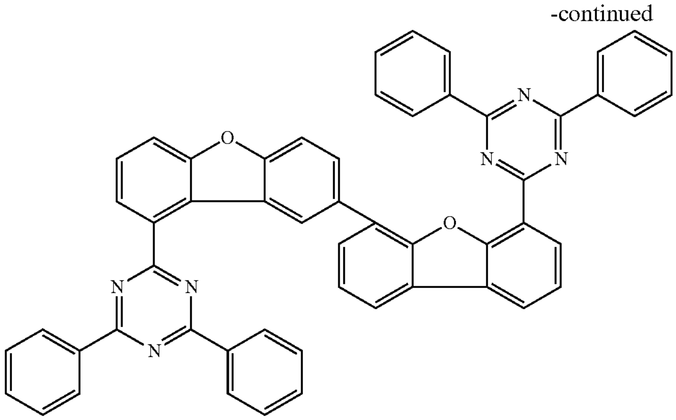
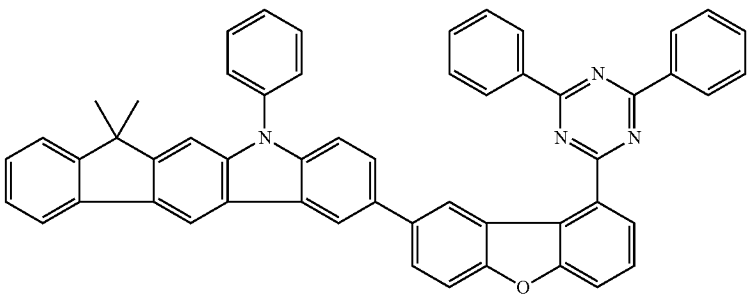
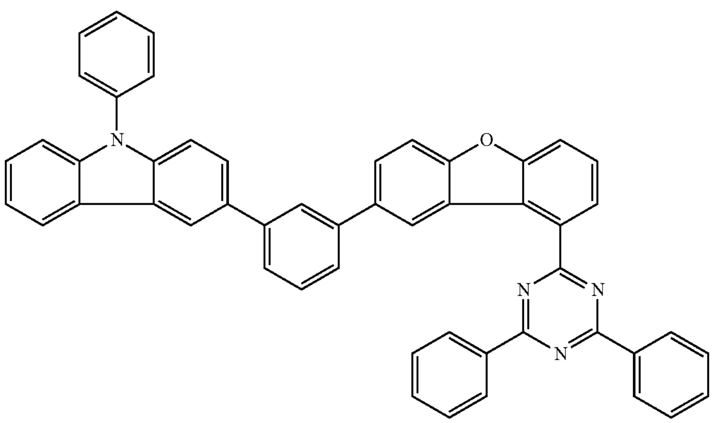
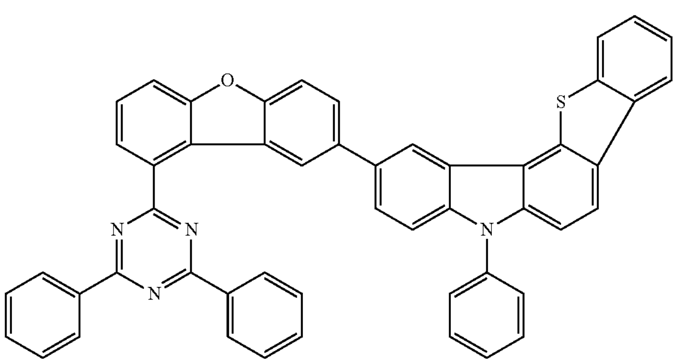

-continued
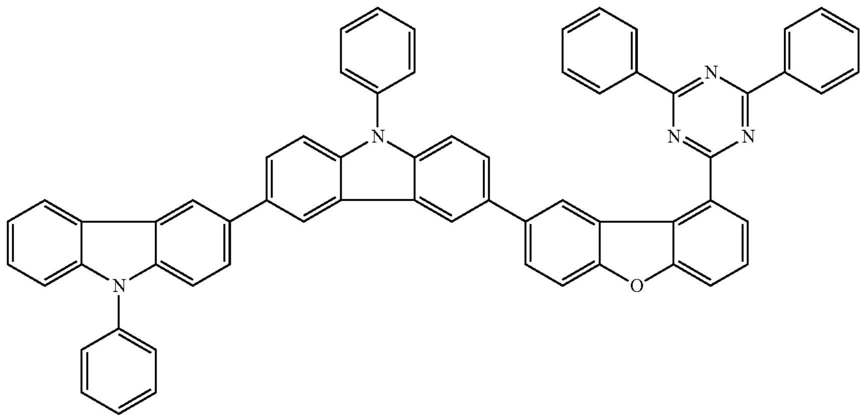
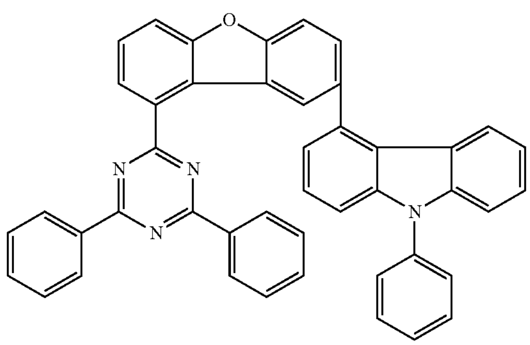
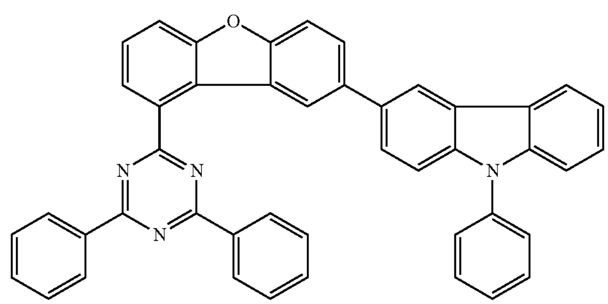
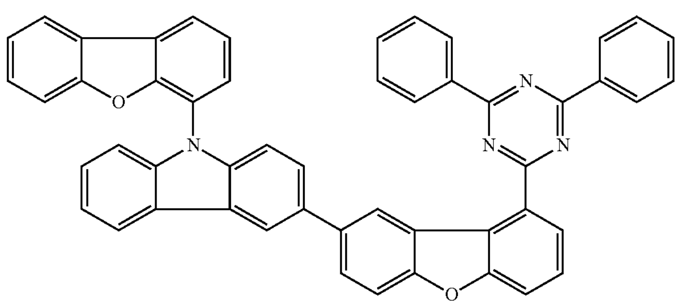
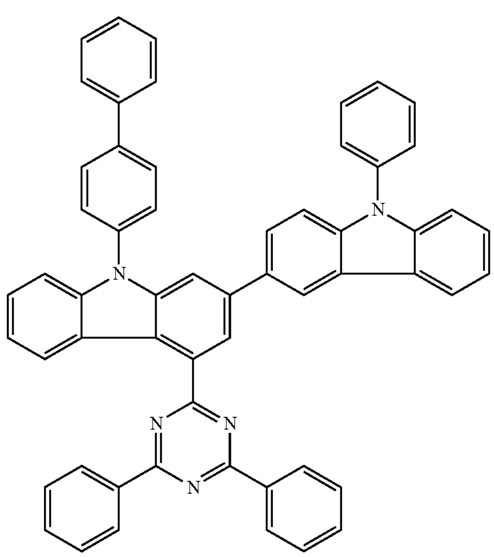
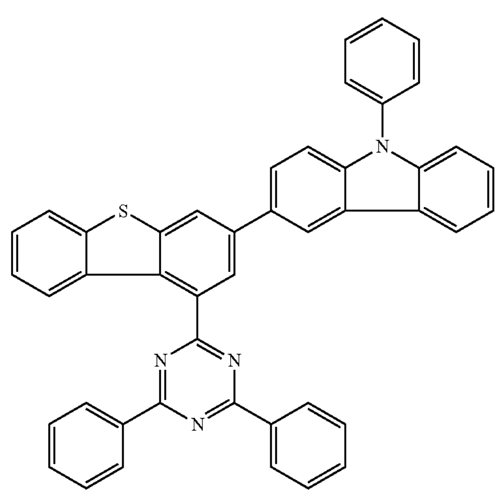

-continued
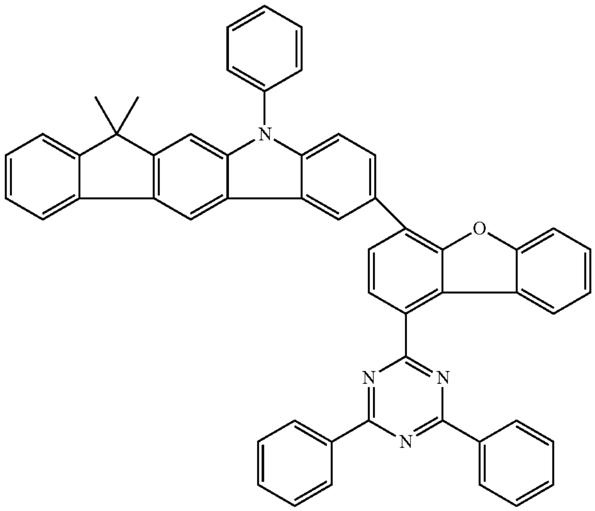
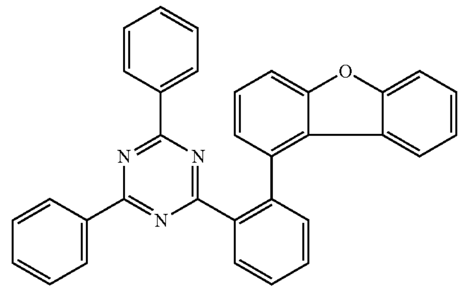
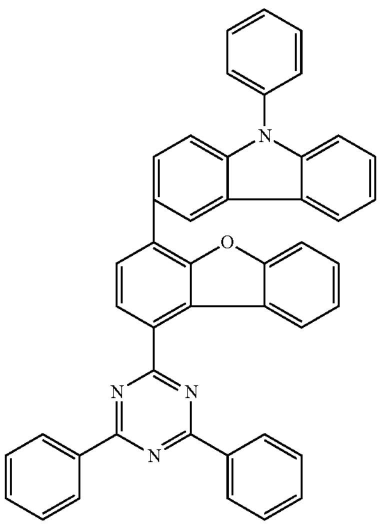
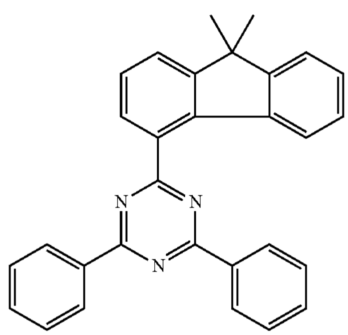
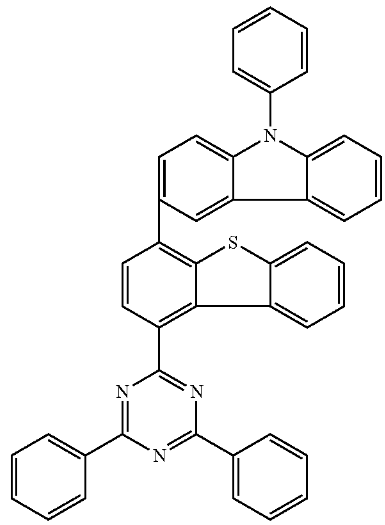
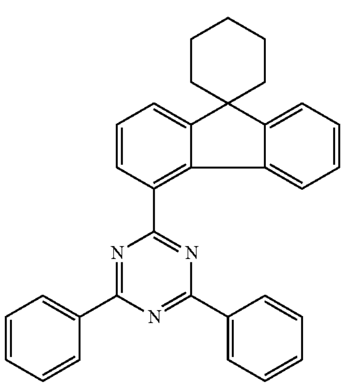
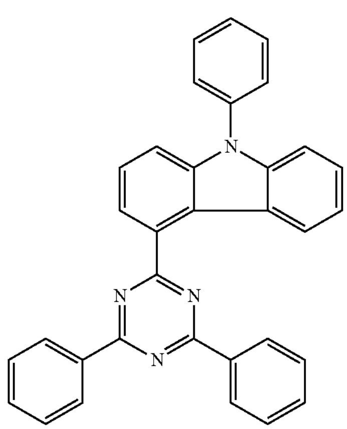

-continued
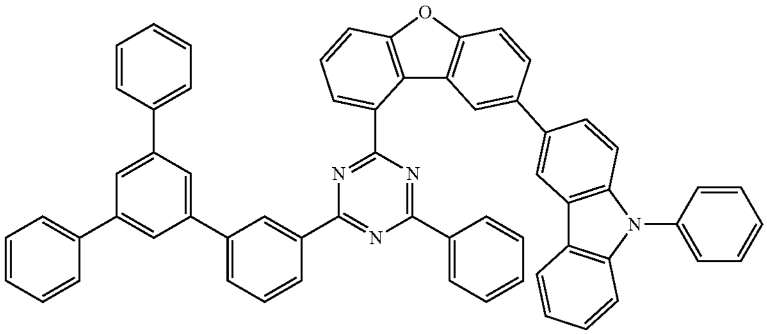
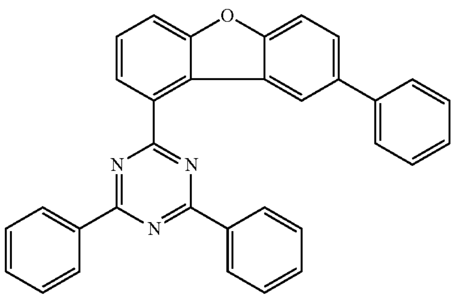
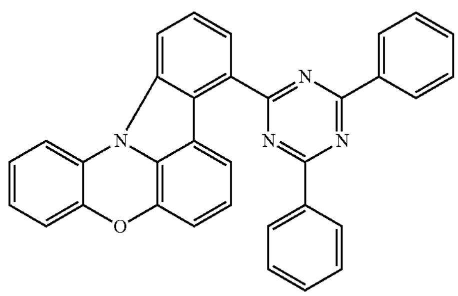
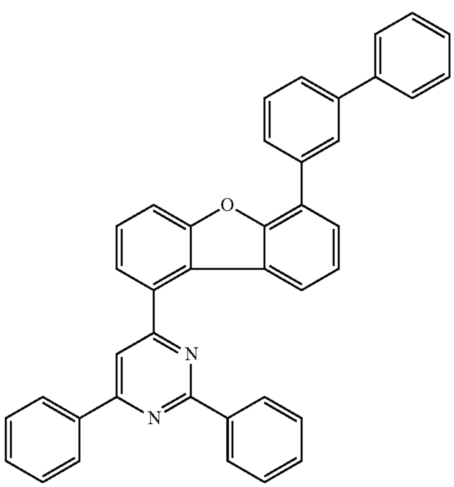
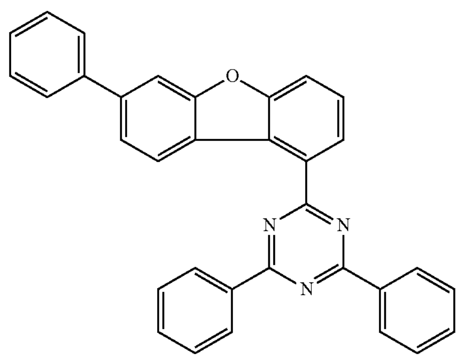
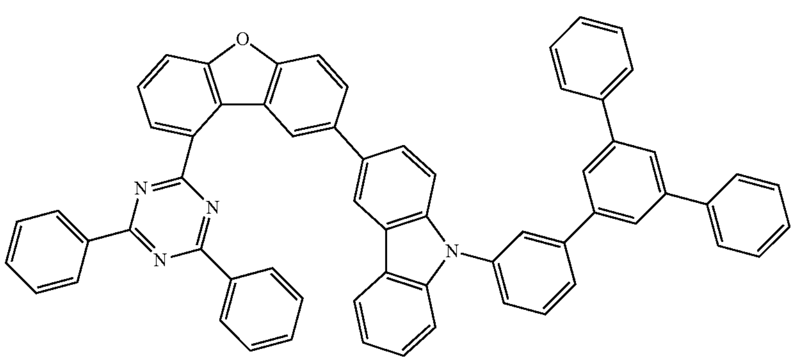

-continued
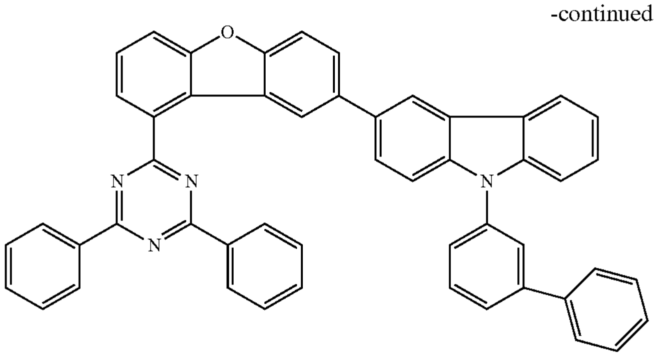
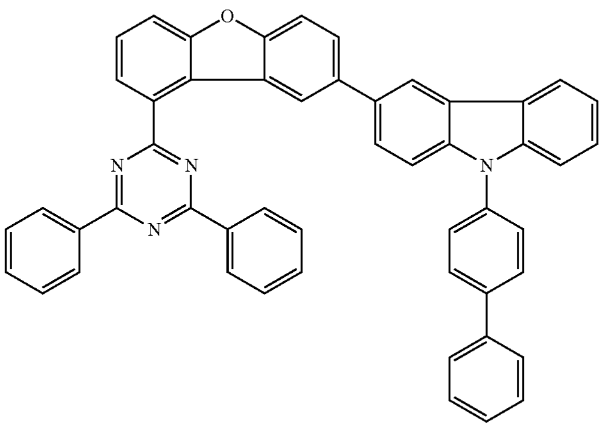
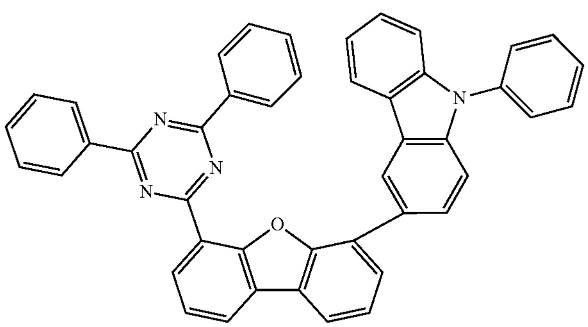
Examples of lactams which can be employed as electron-transporting matrix materials:
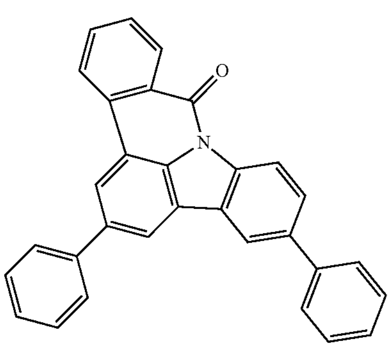
-continued
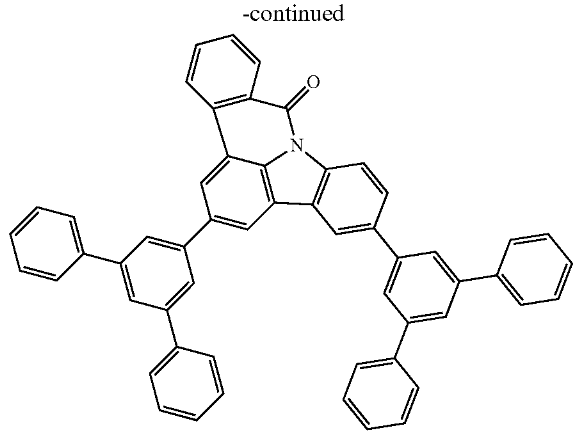

-continued
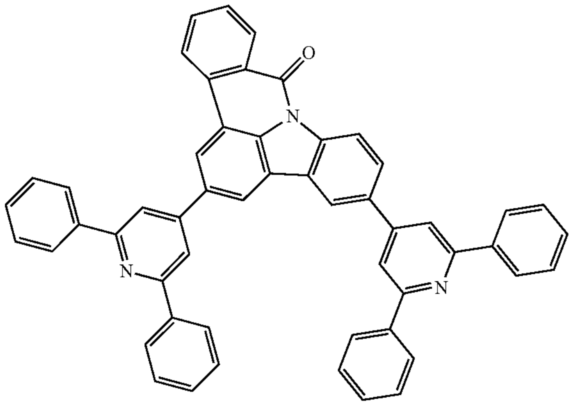
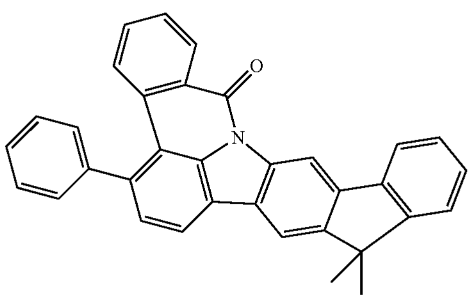
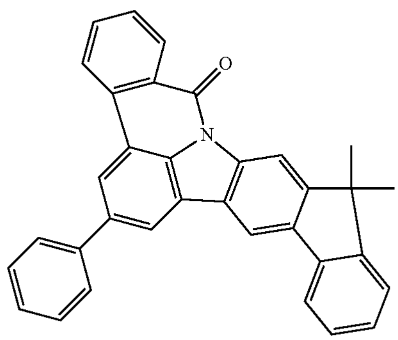
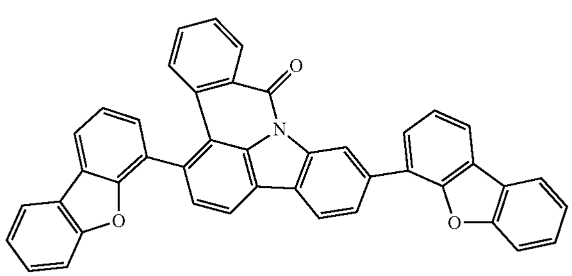
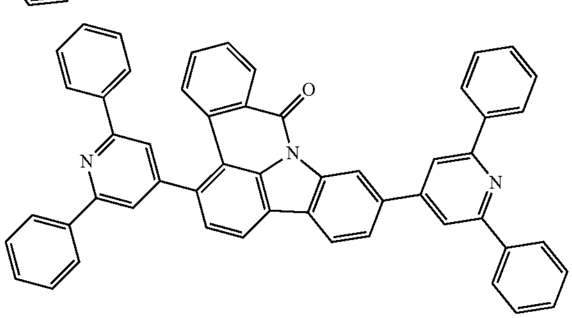
-continued
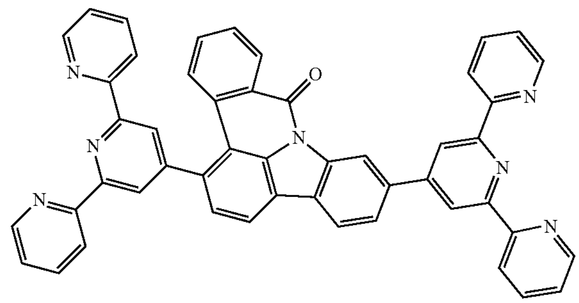
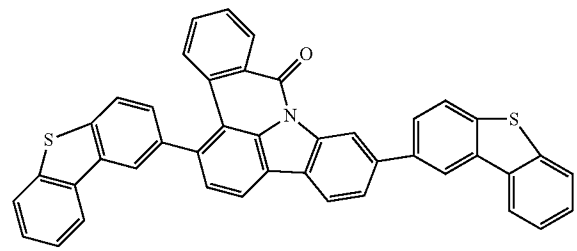
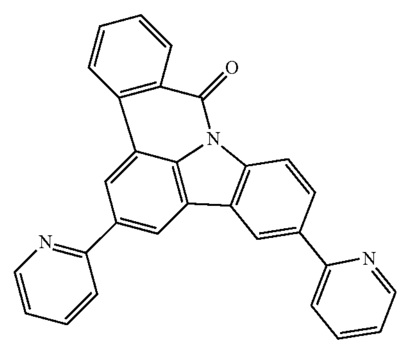
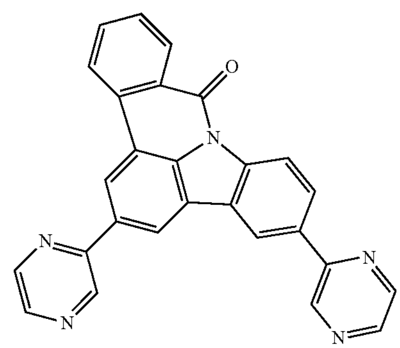
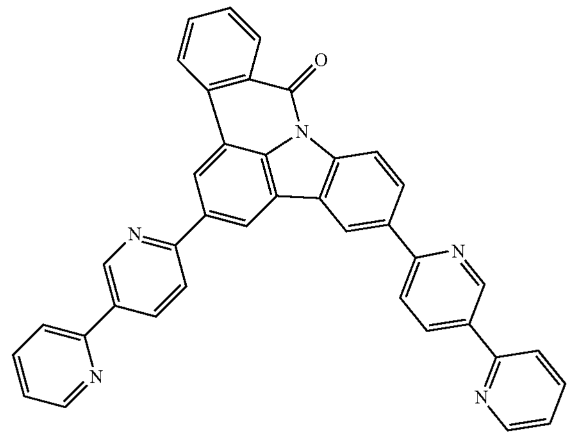

-continued
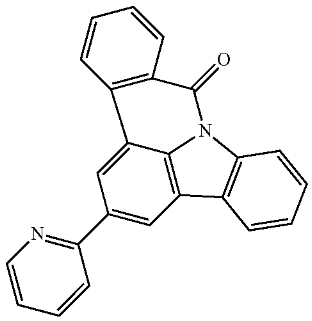
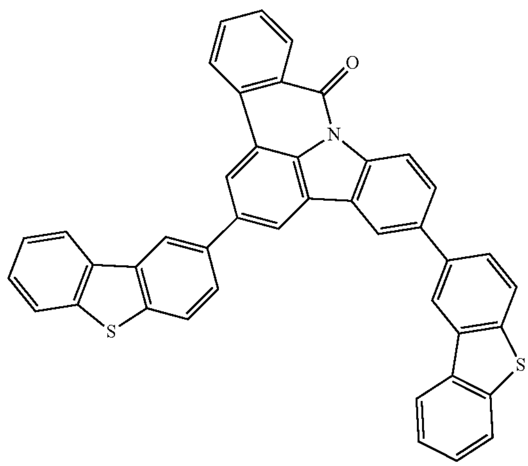
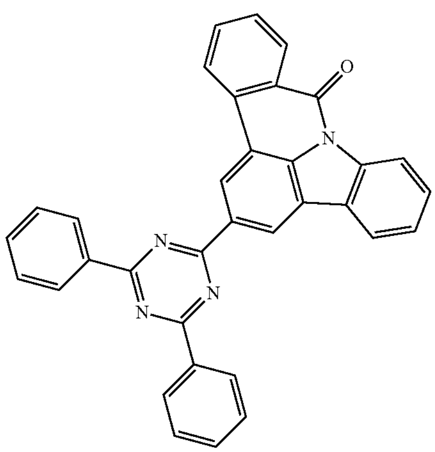
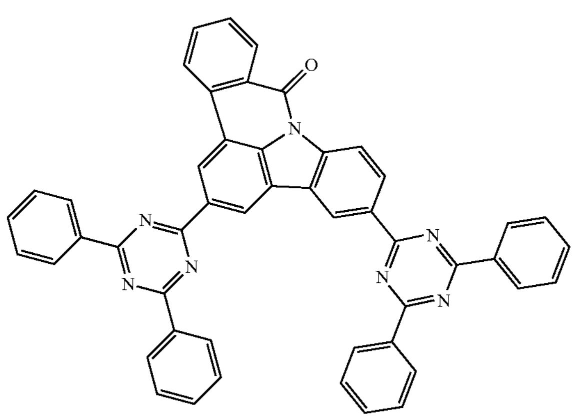
-continued
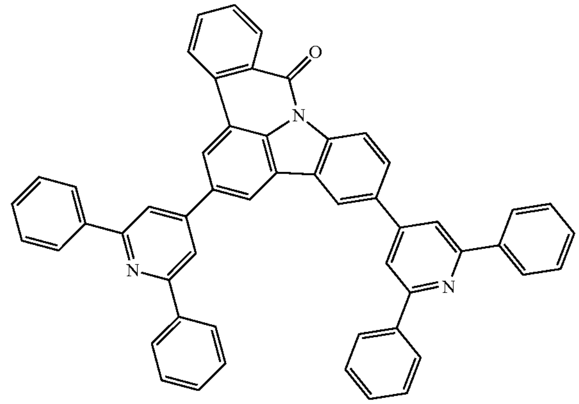
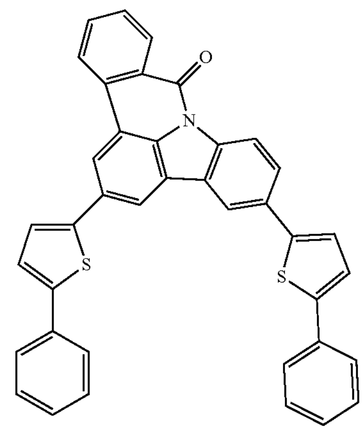
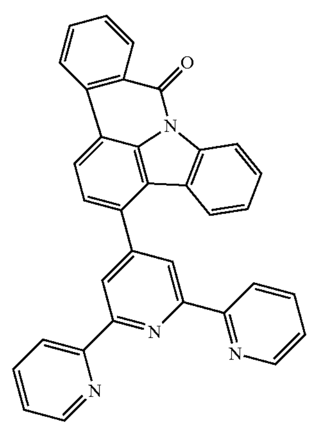
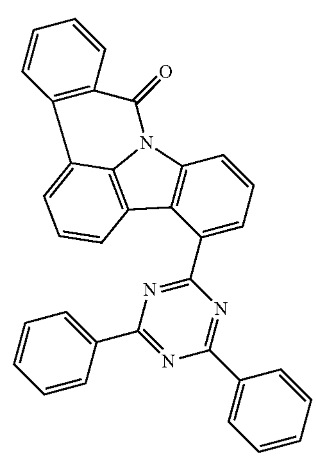

-continued
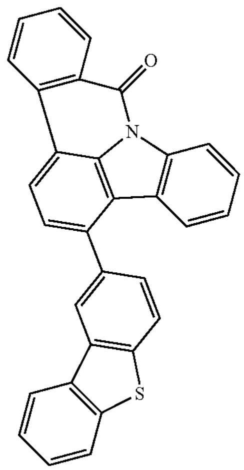
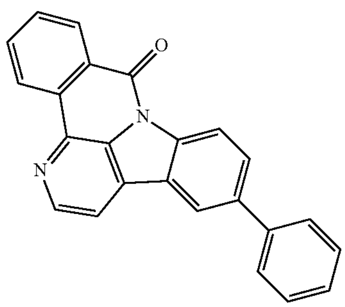
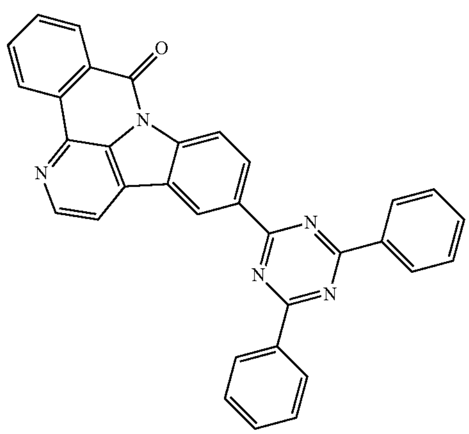
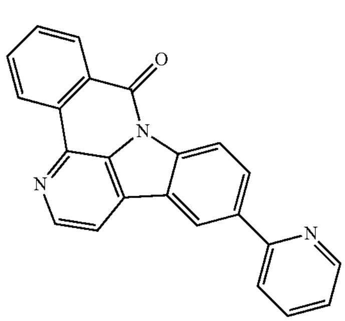
-continued
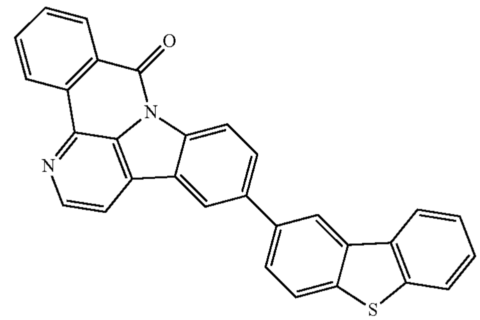
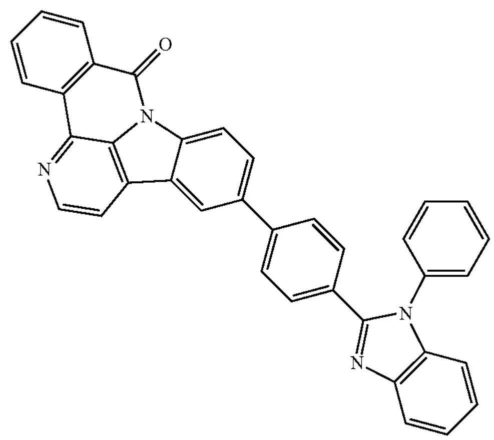
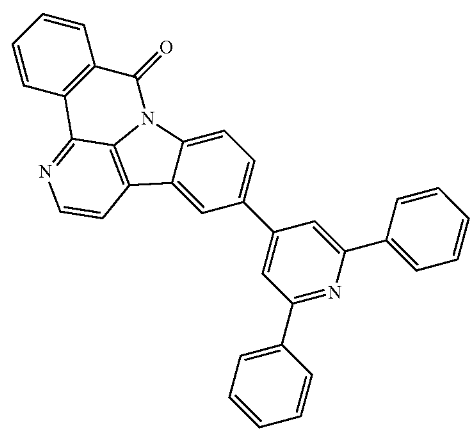
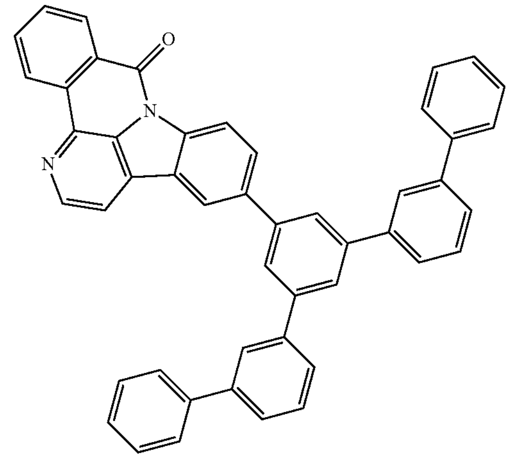

-continued
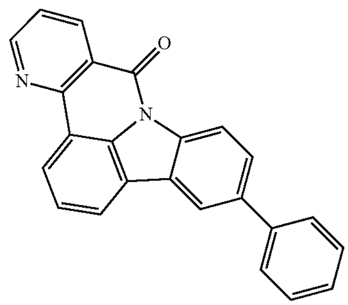
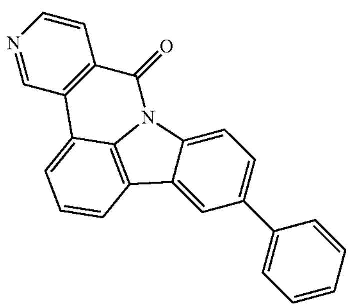
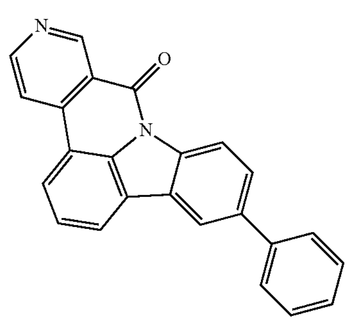
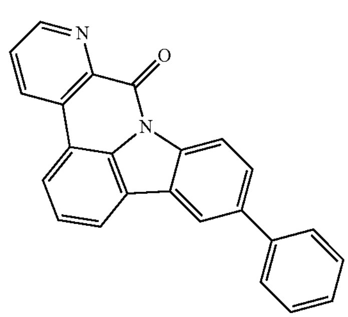
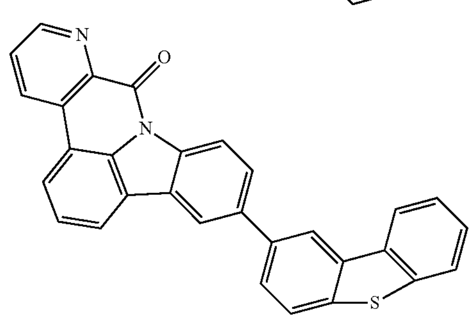
-continued
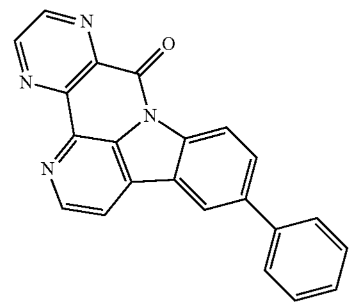
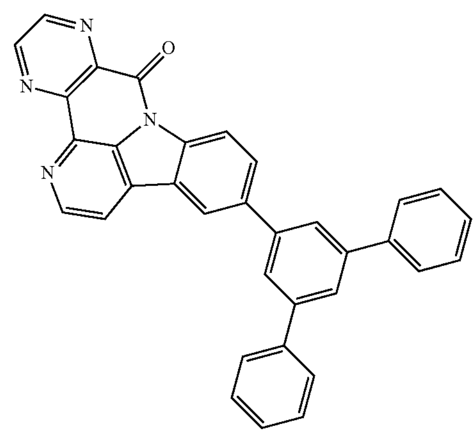
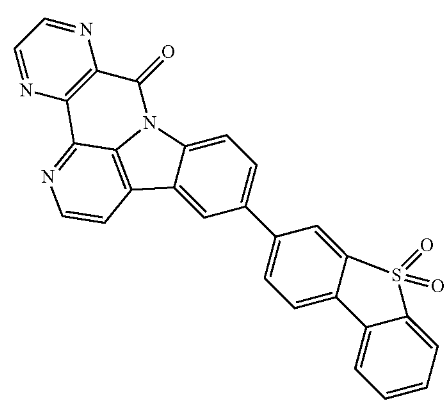
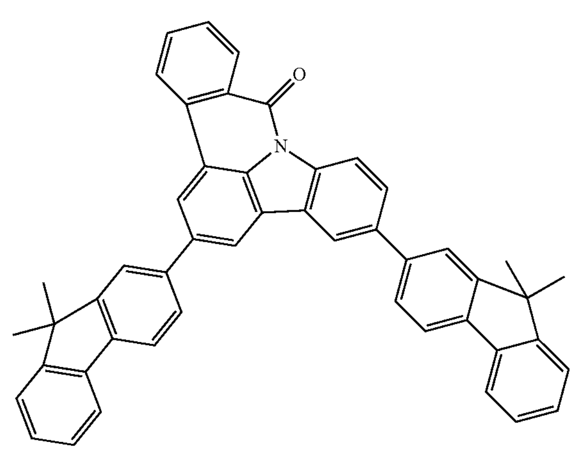

-continued
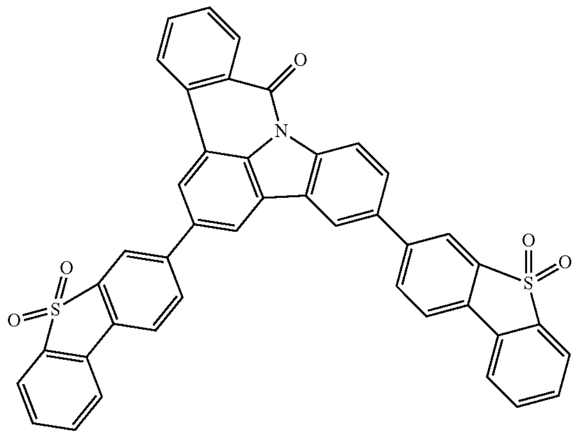
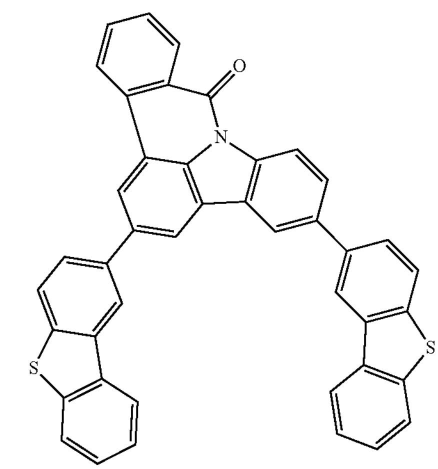
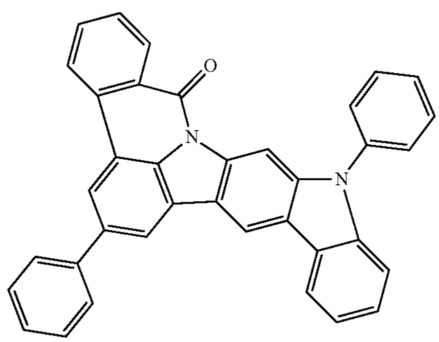
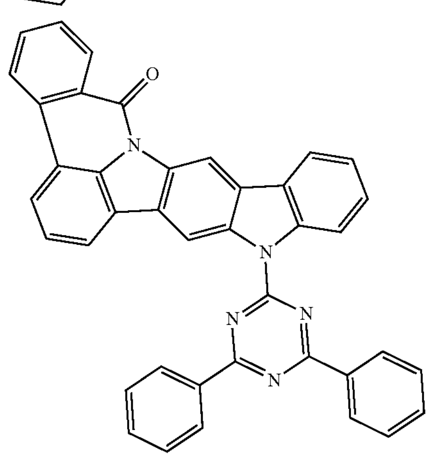
-continued
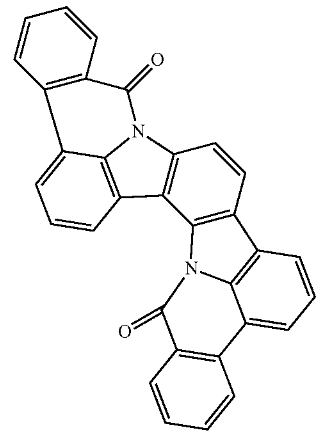
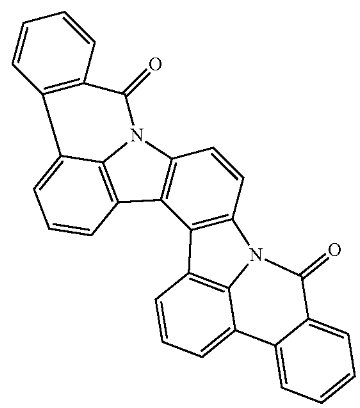
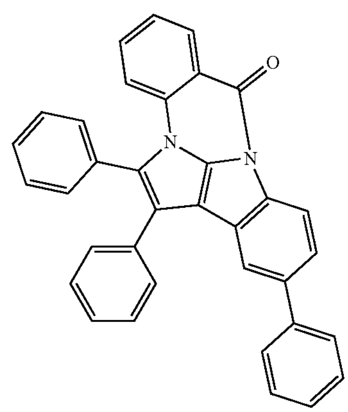
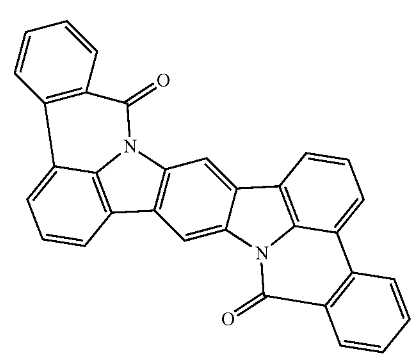

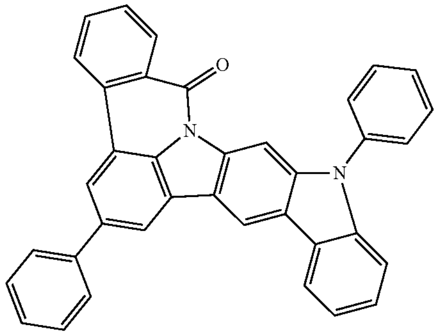
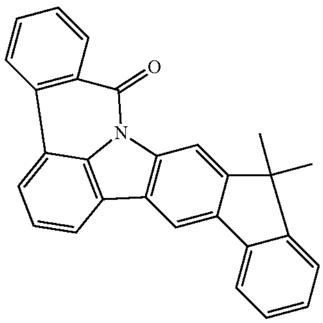
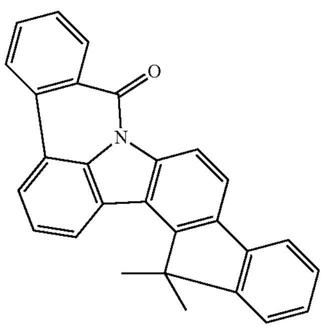
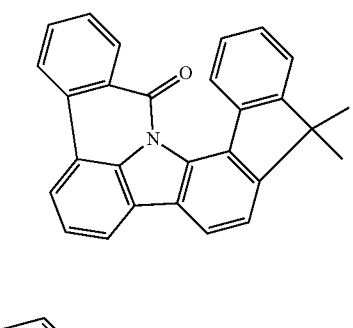
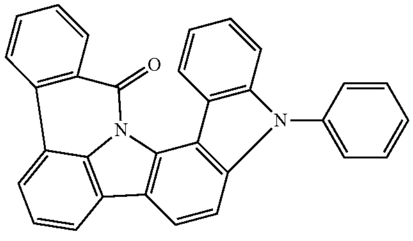
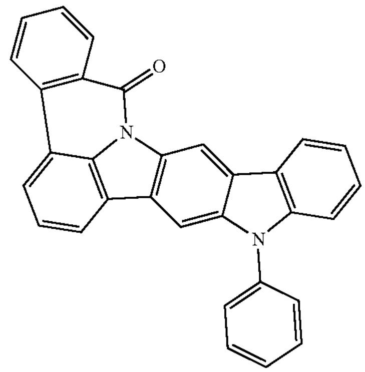
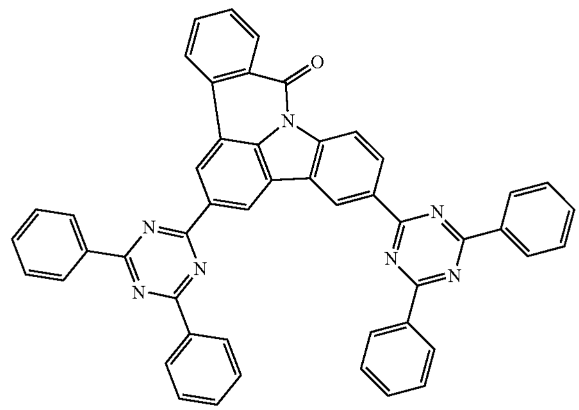
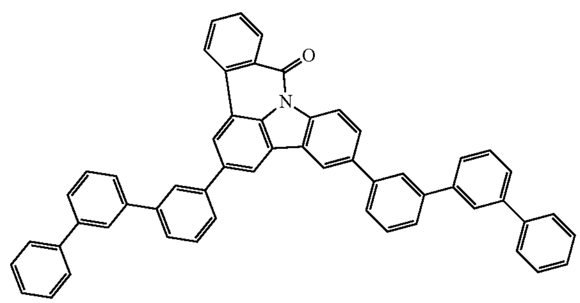
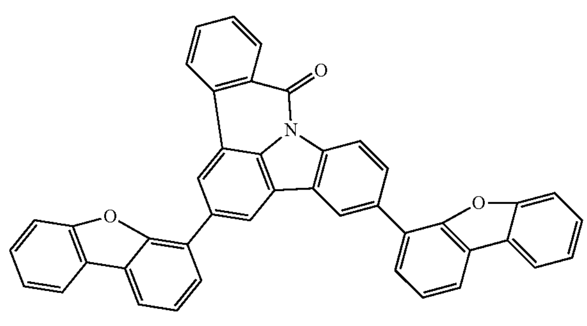

-continued
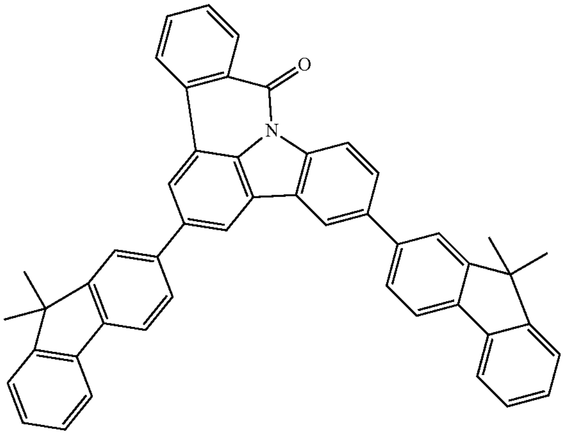
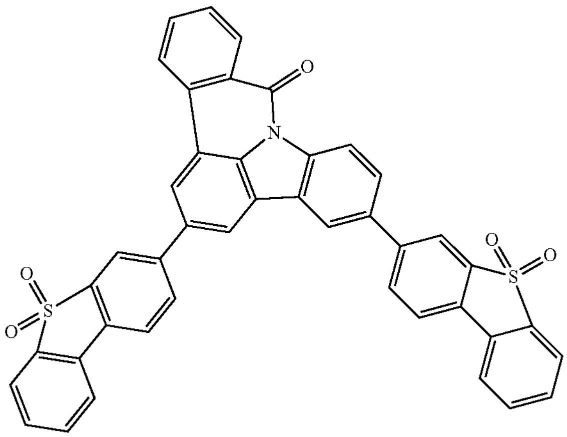
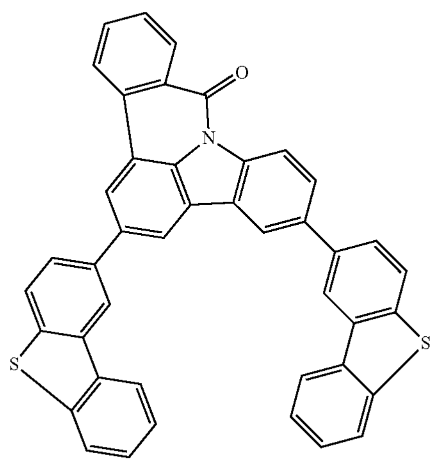
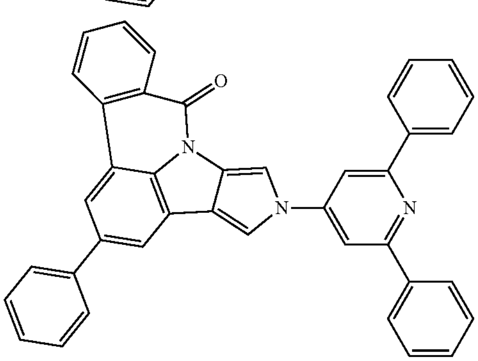
-continued
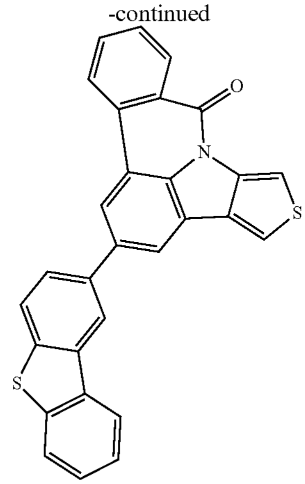
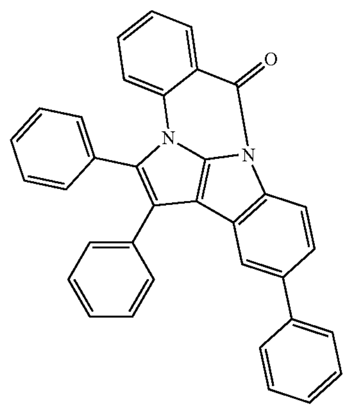
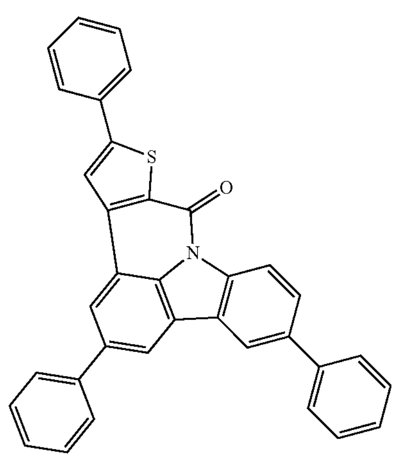

-continued
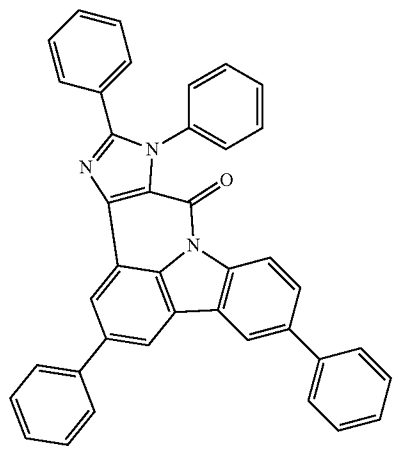
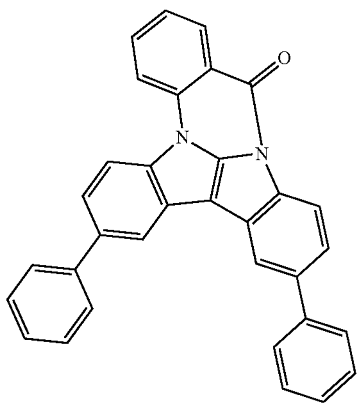
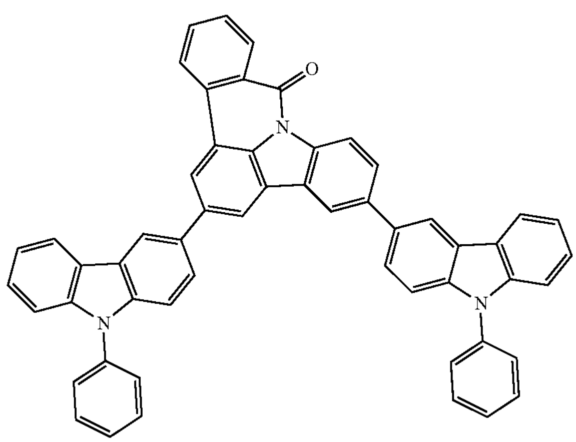
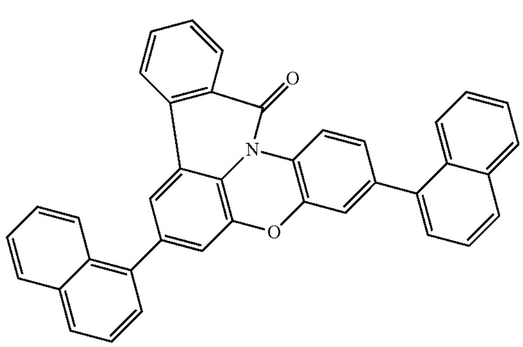
-continued
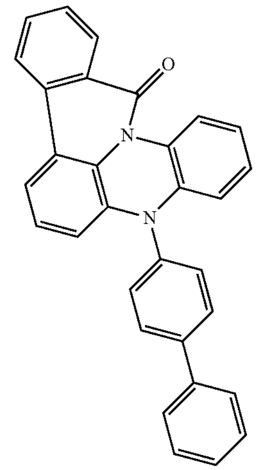
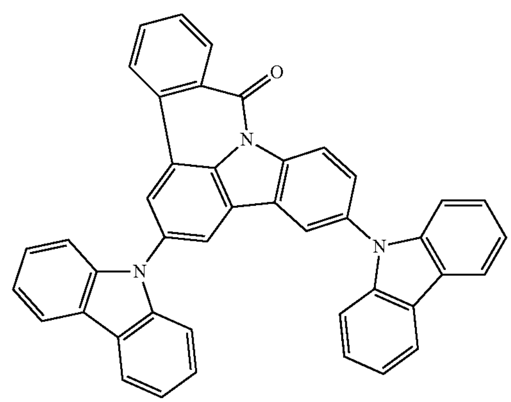
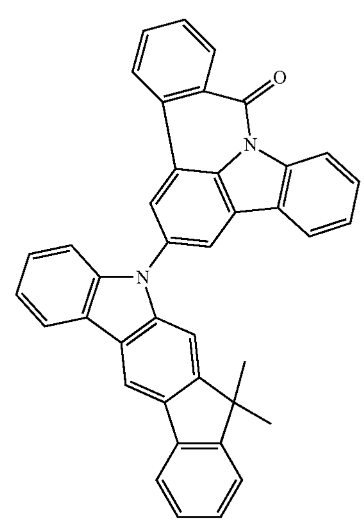

-continued
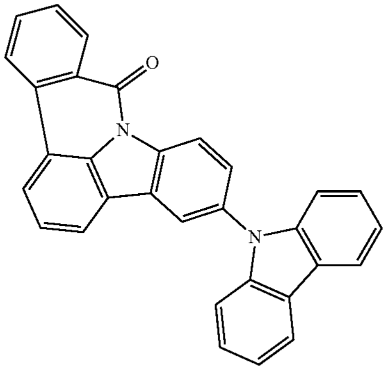
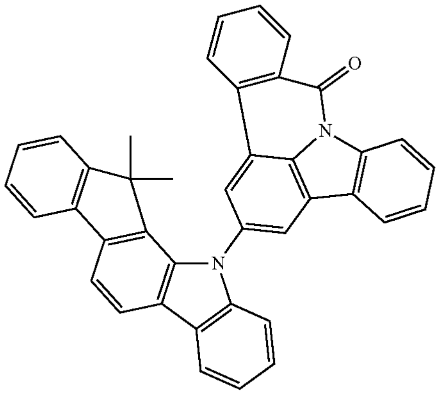
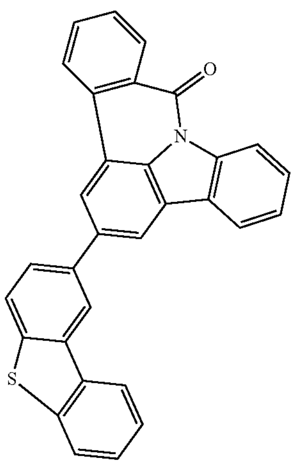
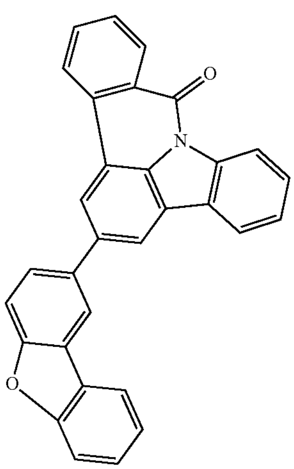
-continued
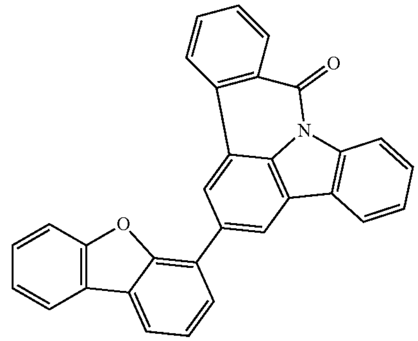
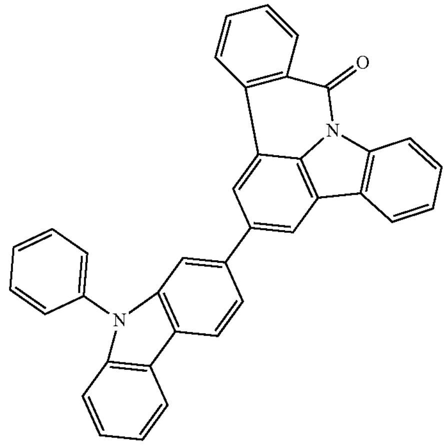
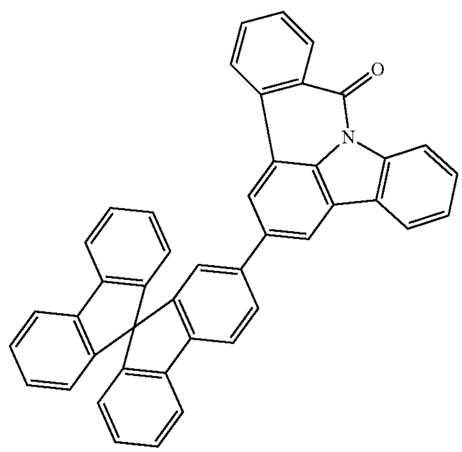
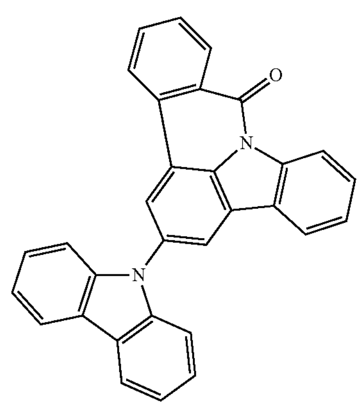

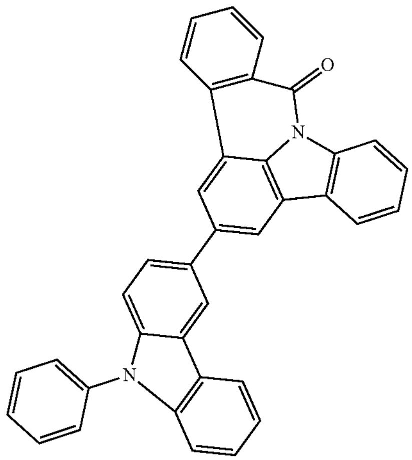
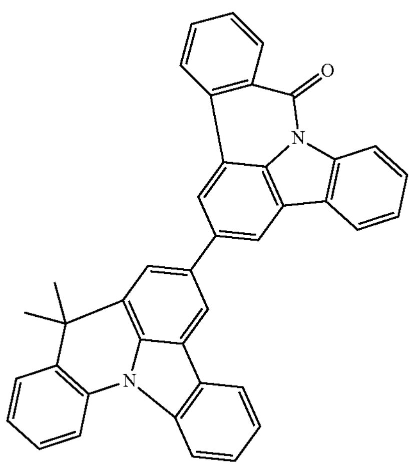
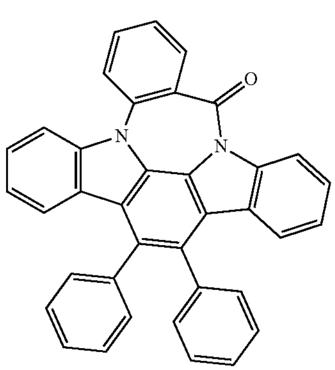
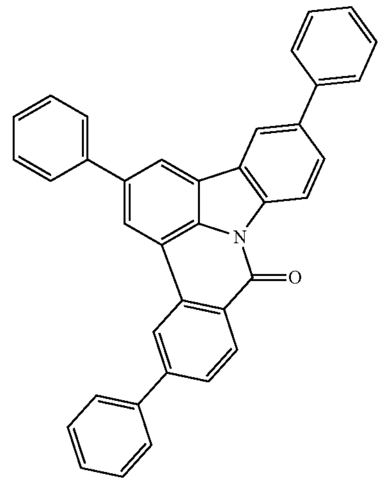
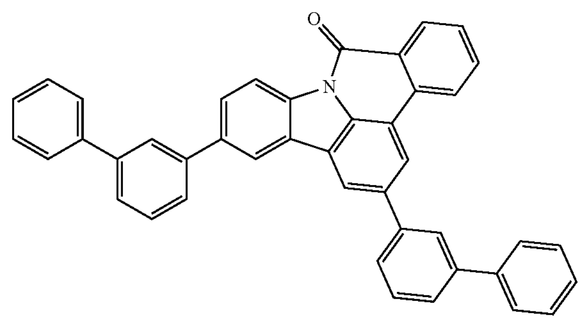
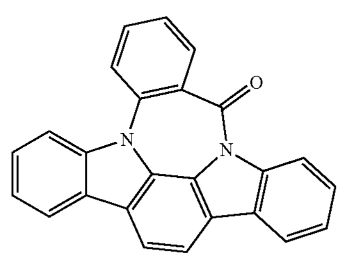
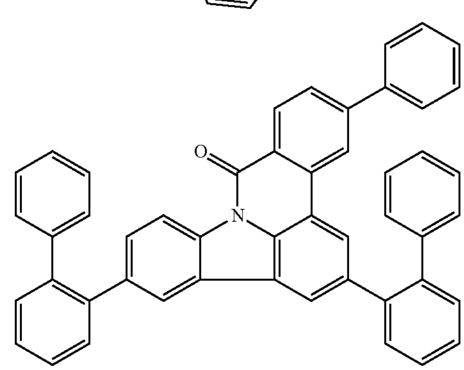

-continued
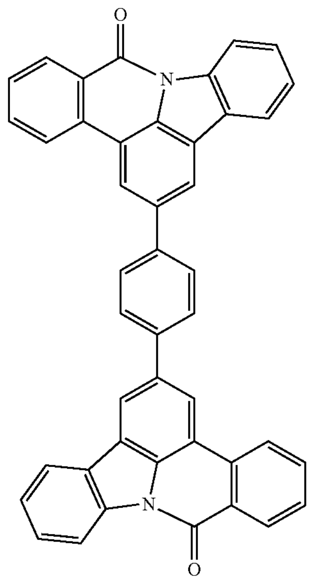
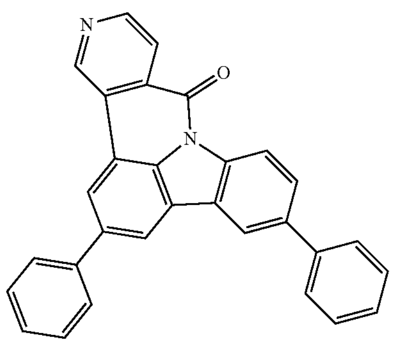
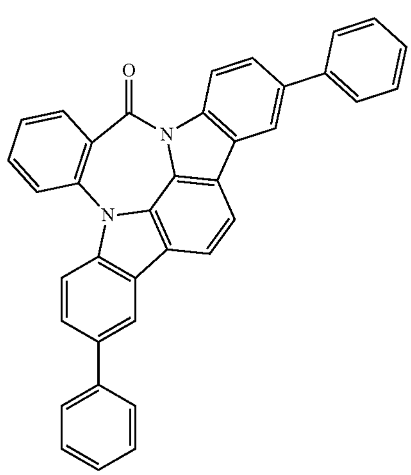
-continued
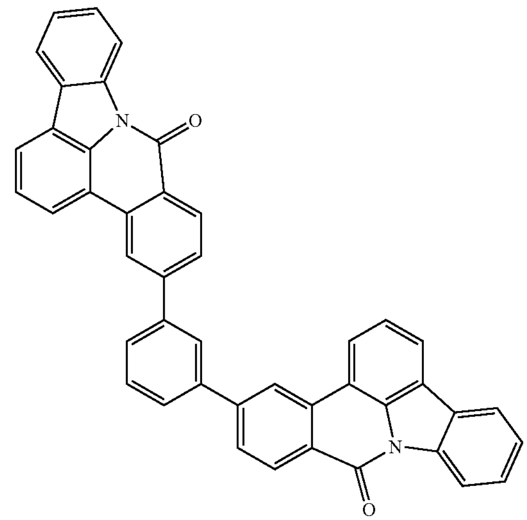
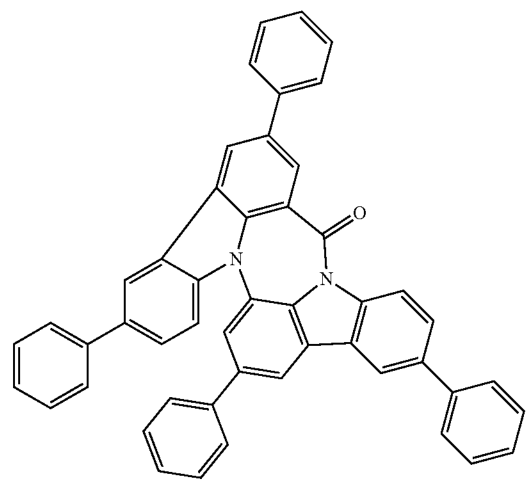
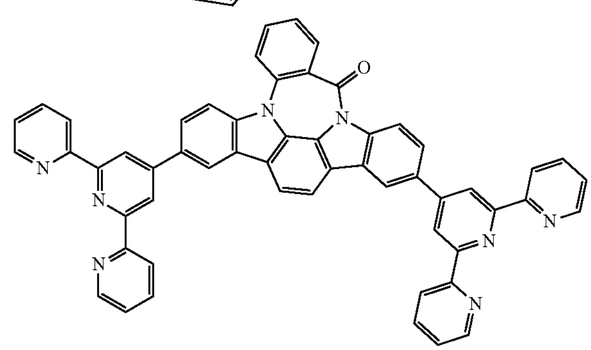
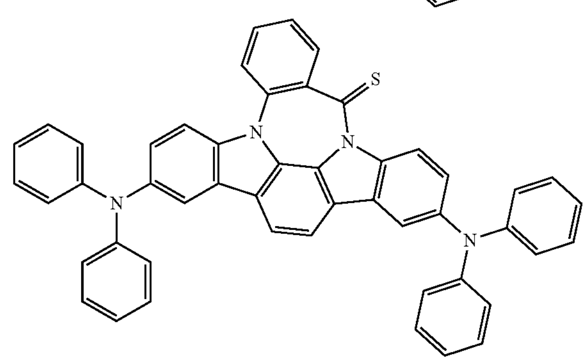

-continued
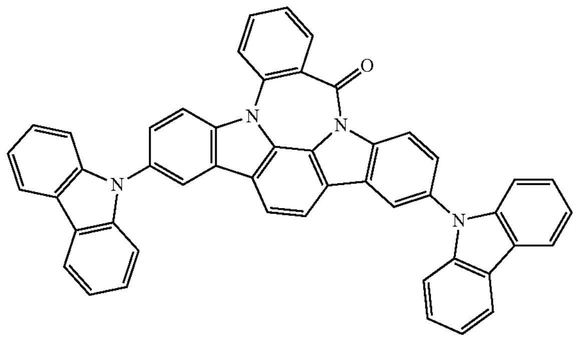
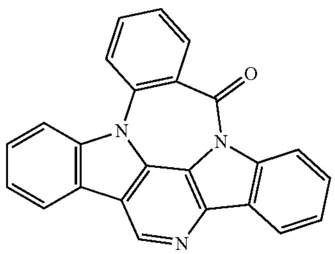
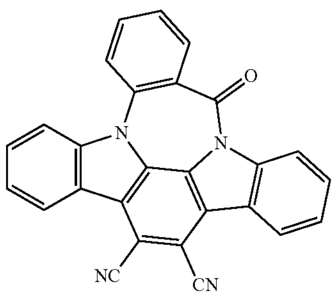
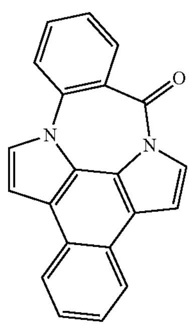
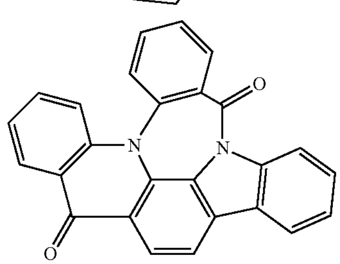
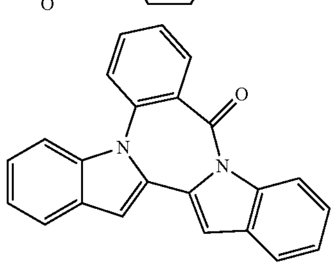
-continued
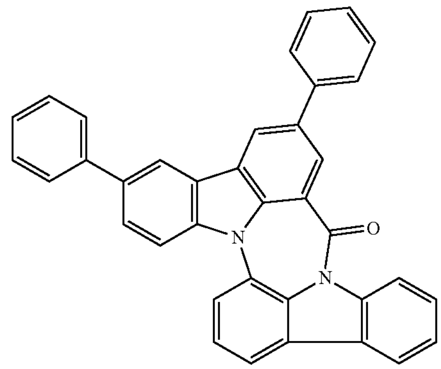
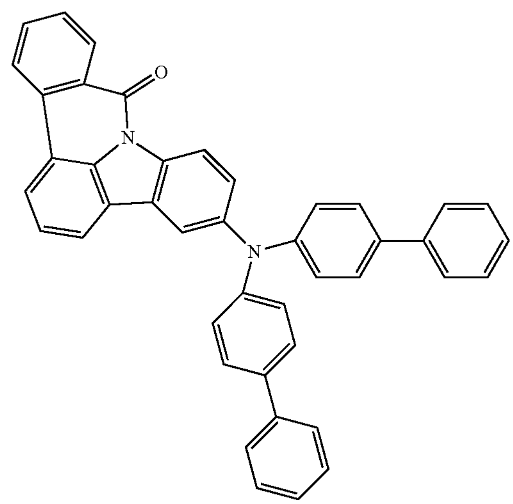
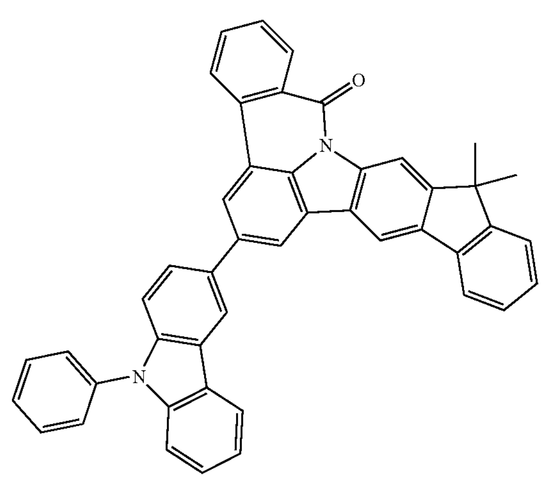

-continued
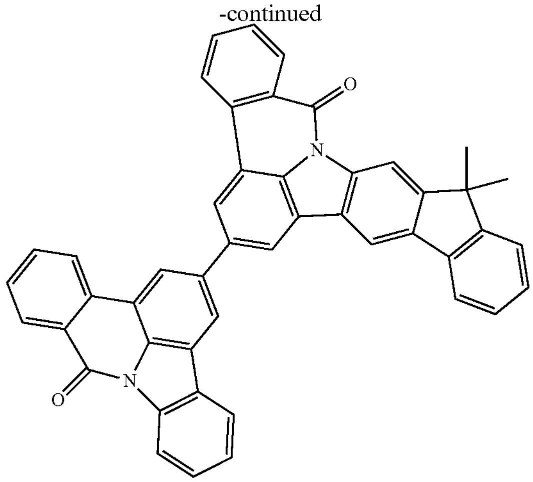
-continued
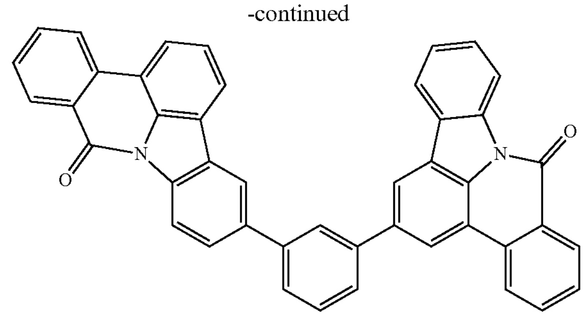
Examples of ketones which can be employed as electron-transporting matrix materials:
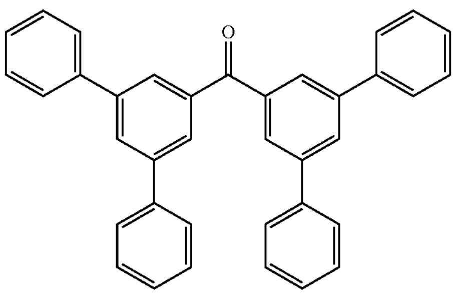
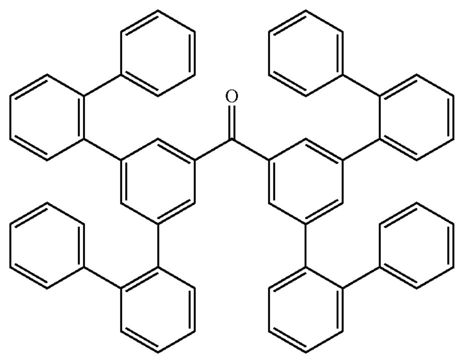
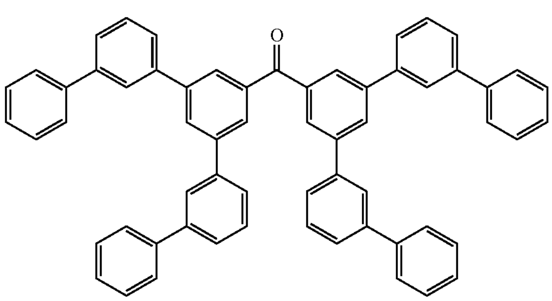
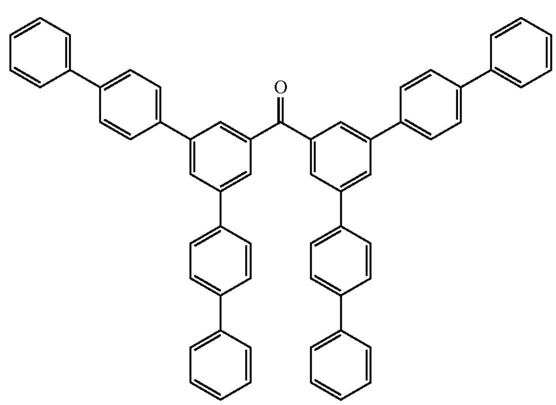

-continued
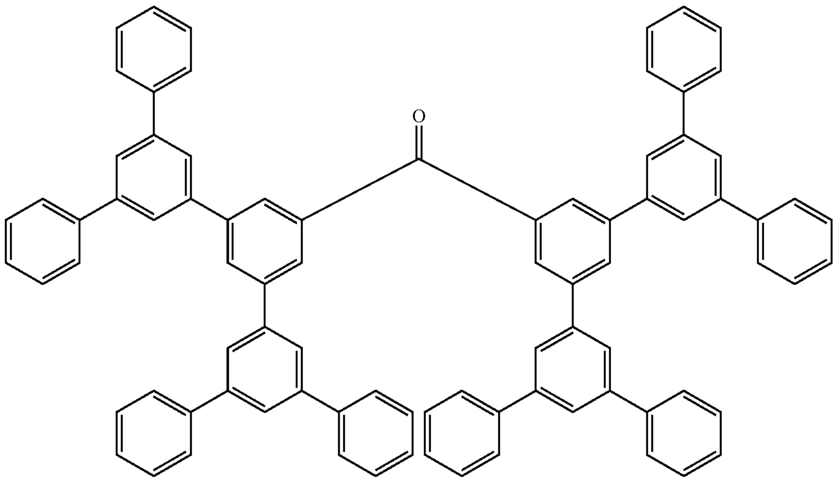
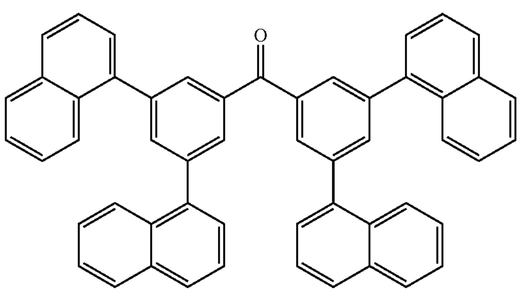
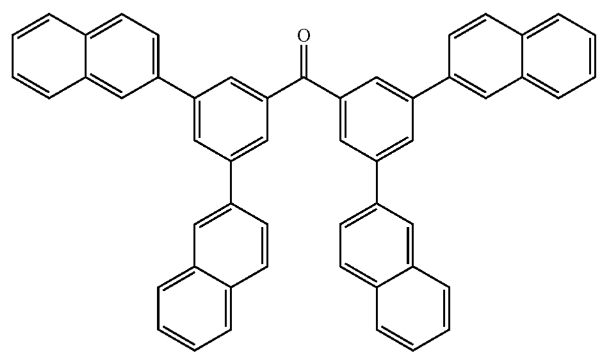
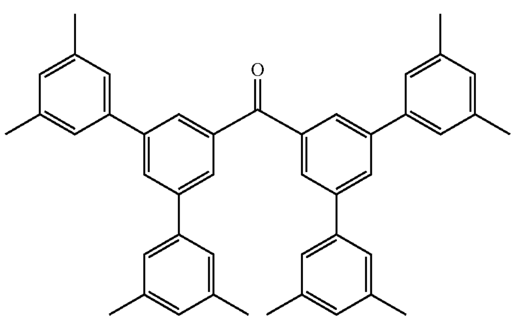
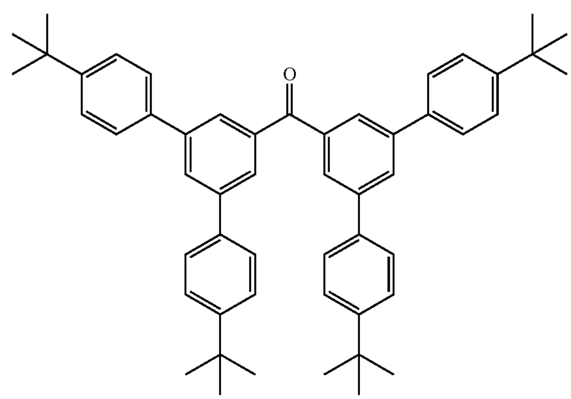
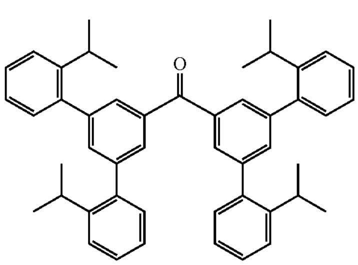
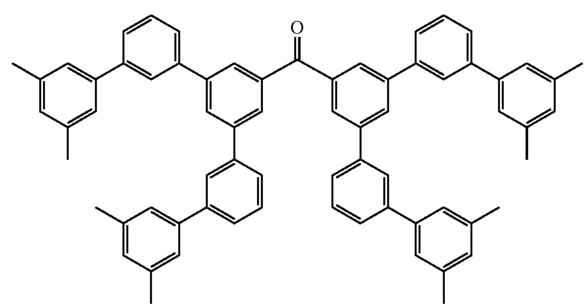

-continued
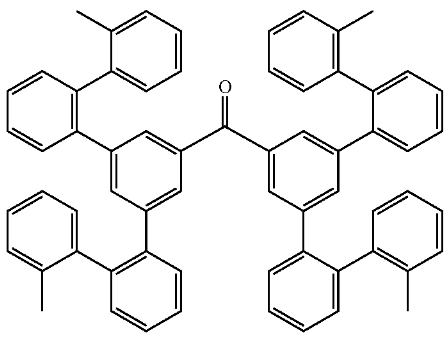
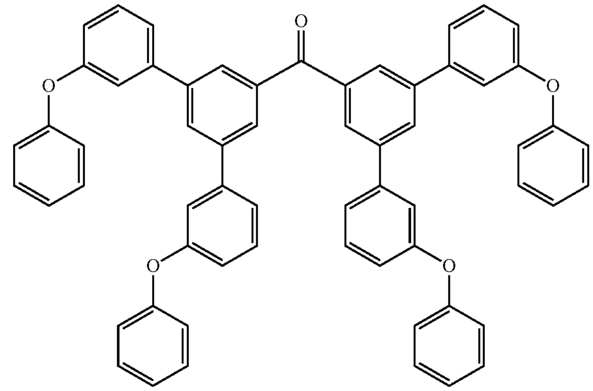
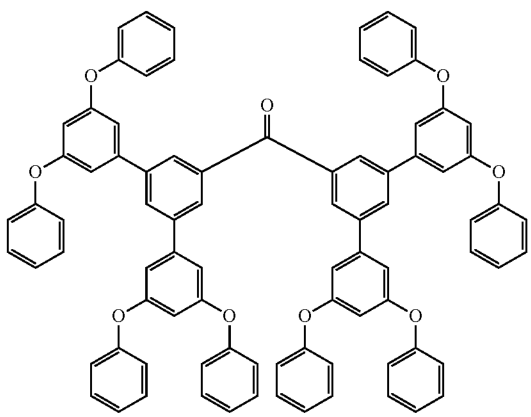
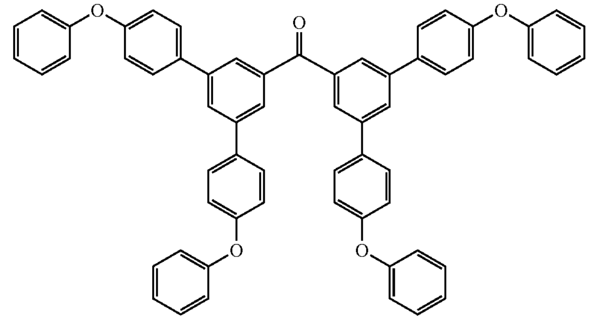
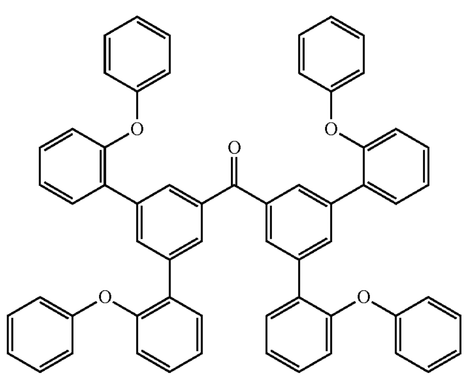
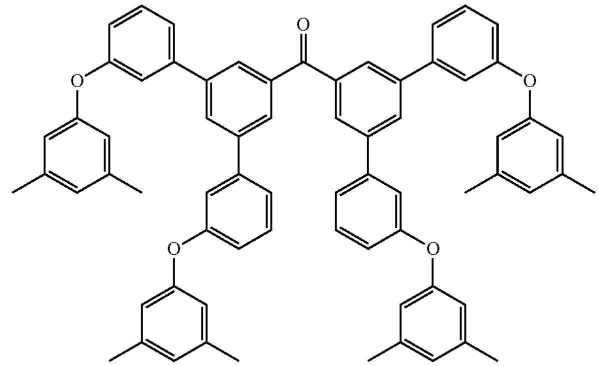
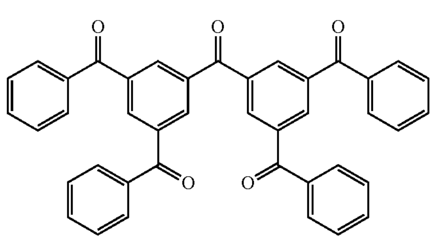
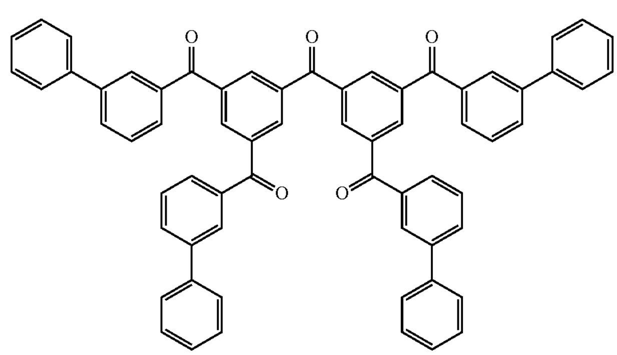

-continued
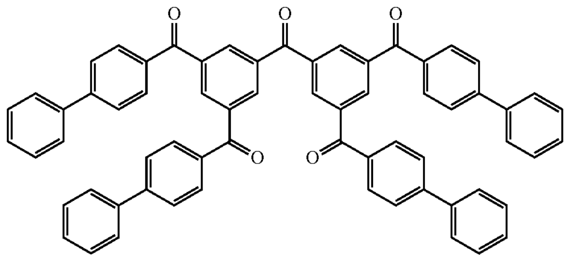
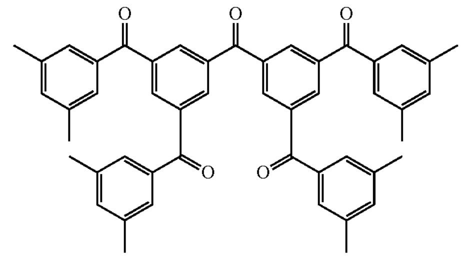
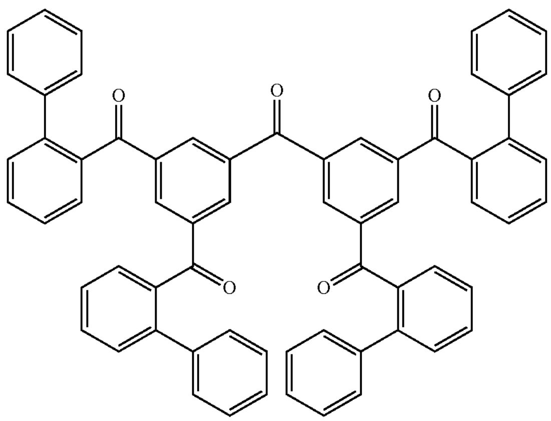
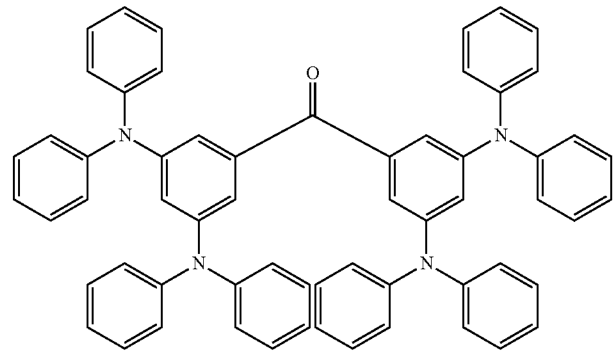
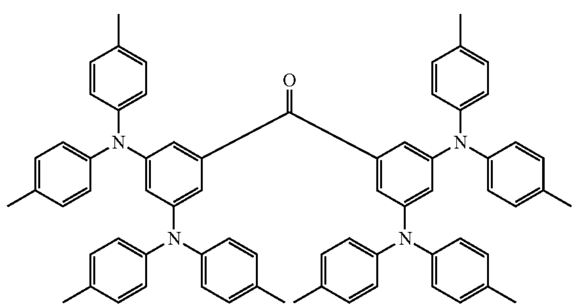
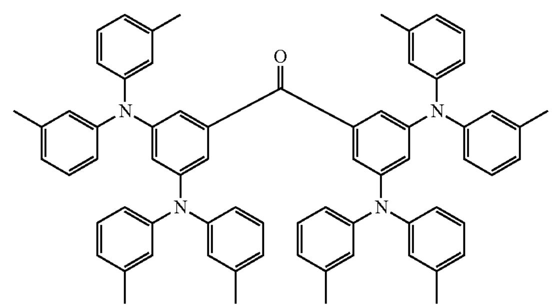
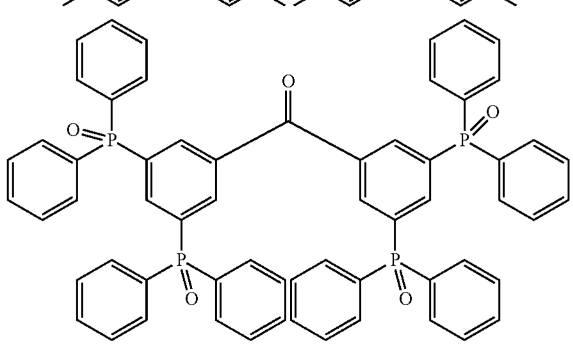
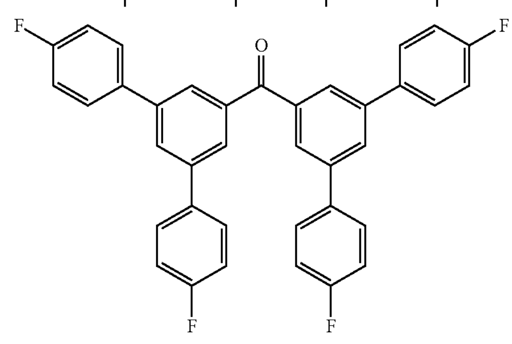
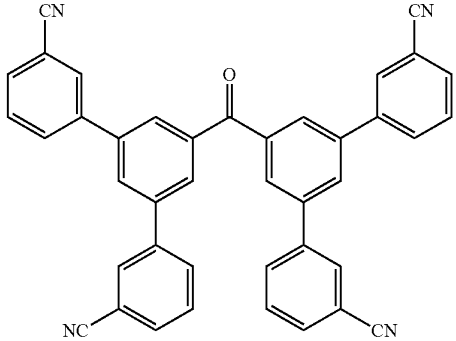
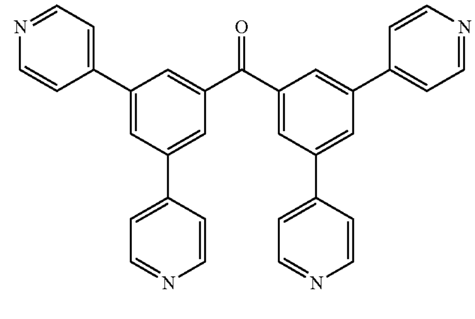

-continued
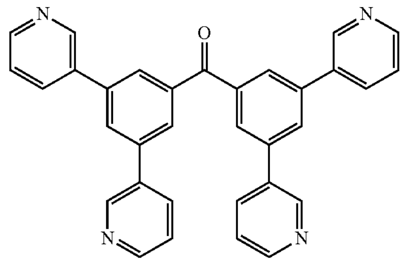
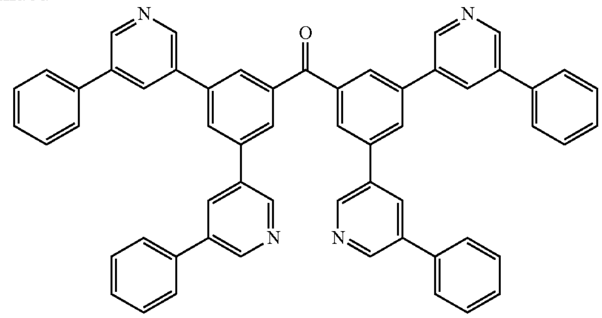
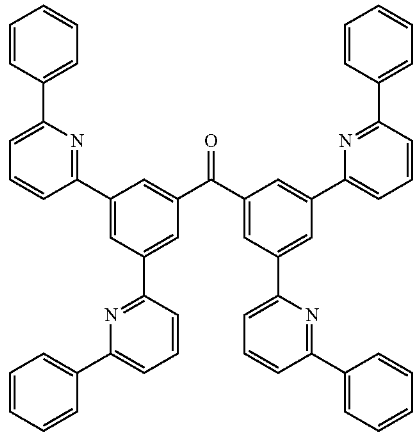
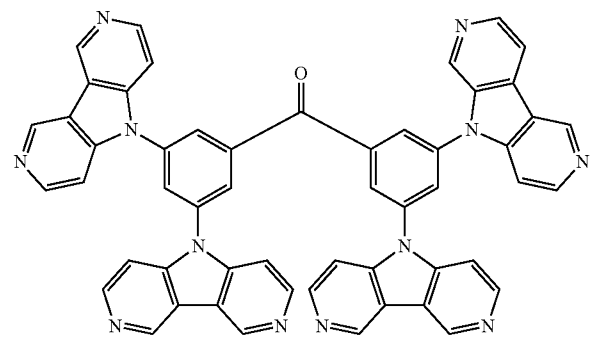
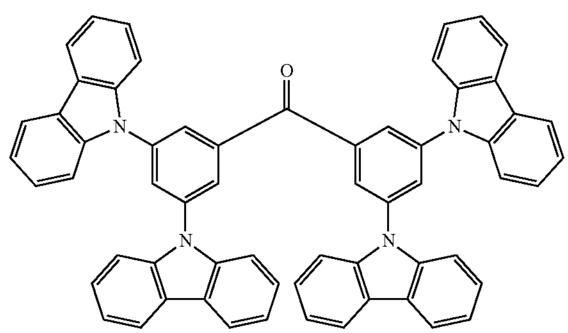
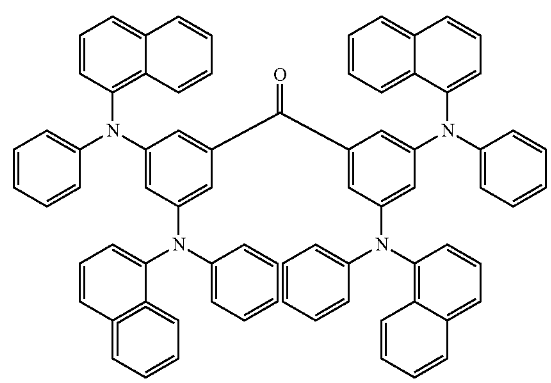
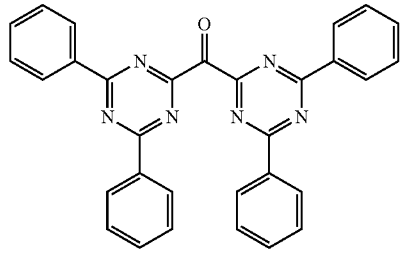
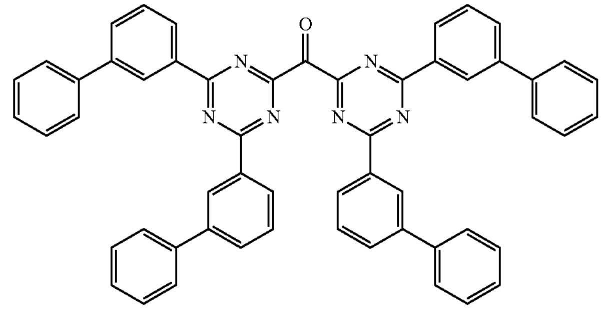

-continued
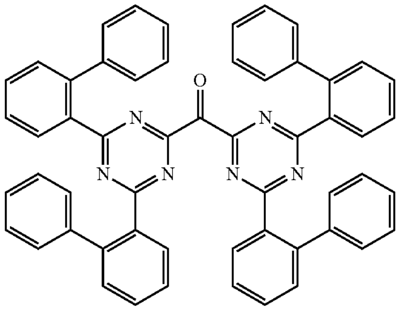
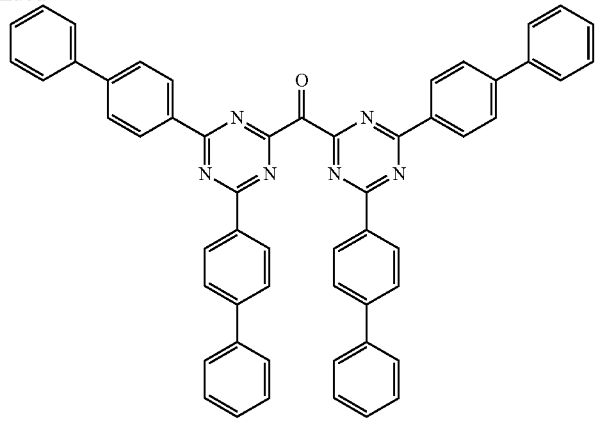
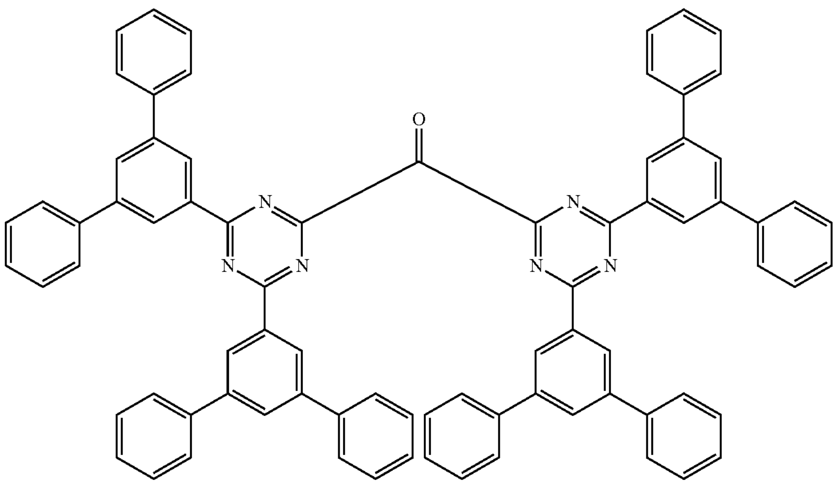
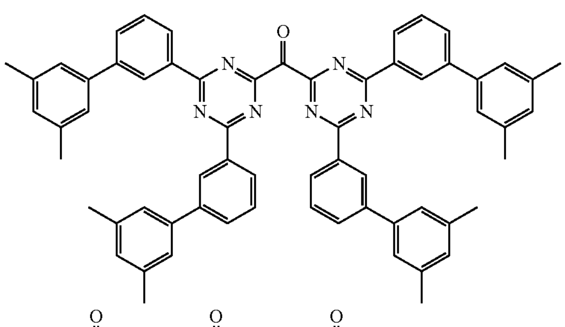
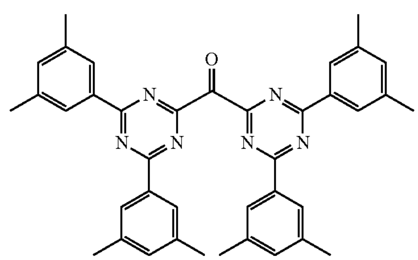
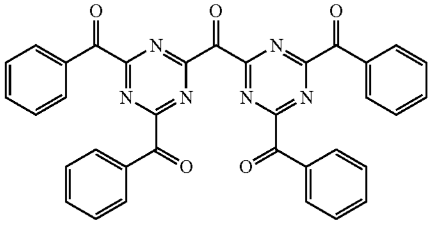
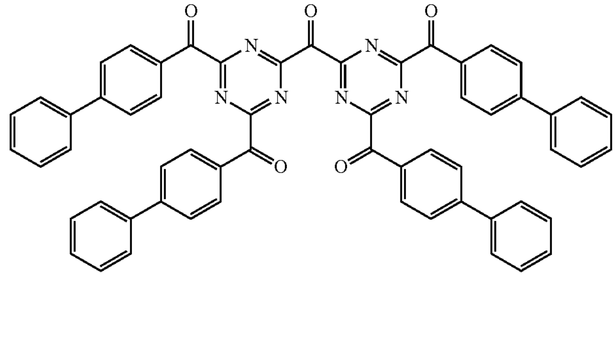

-continued
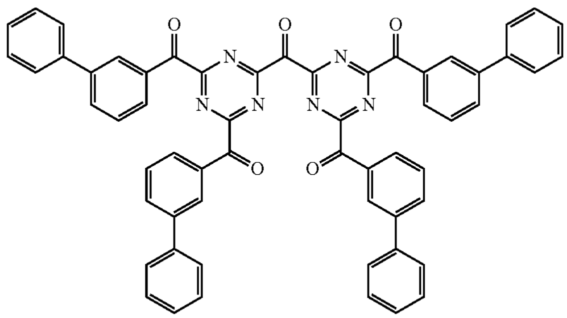
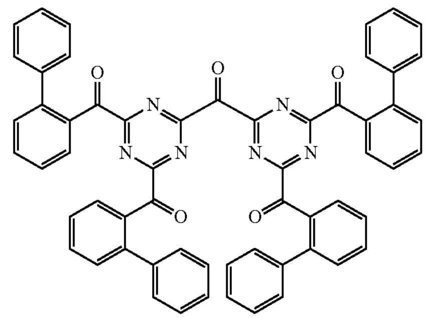
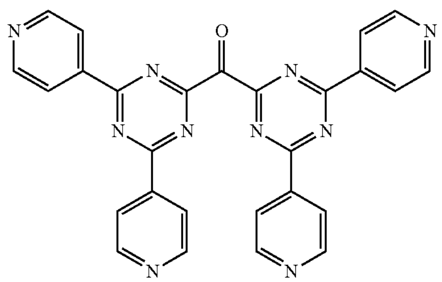
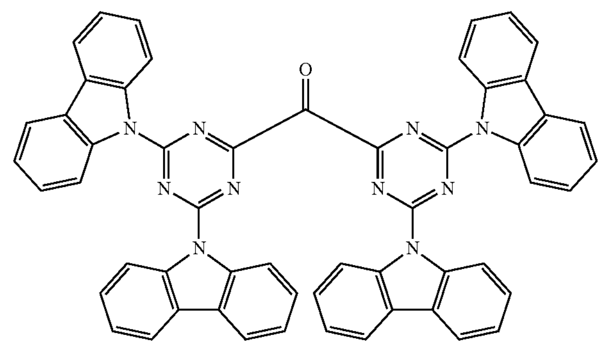
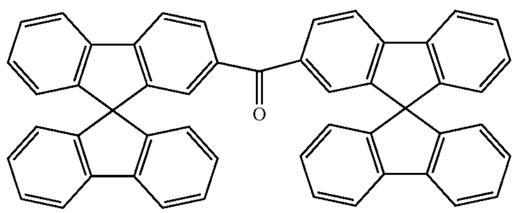
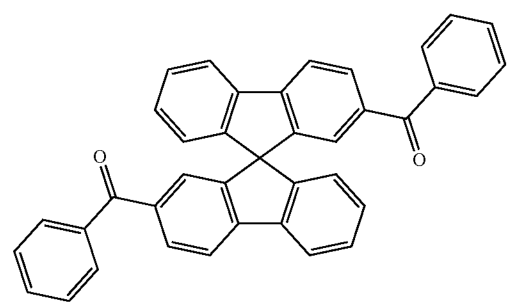
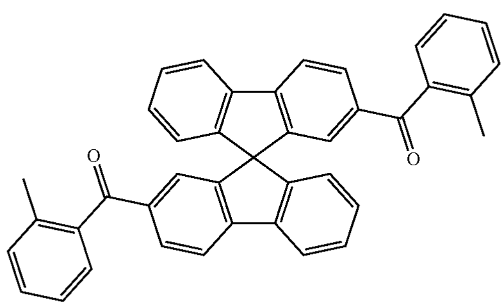
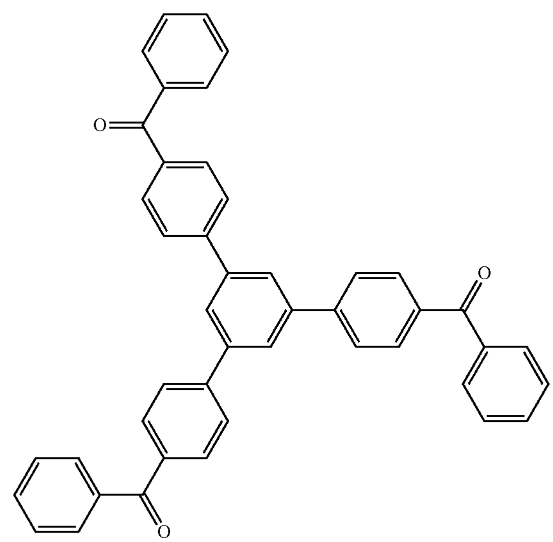
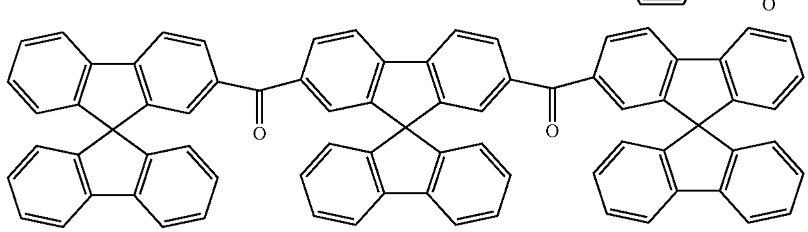

-continued
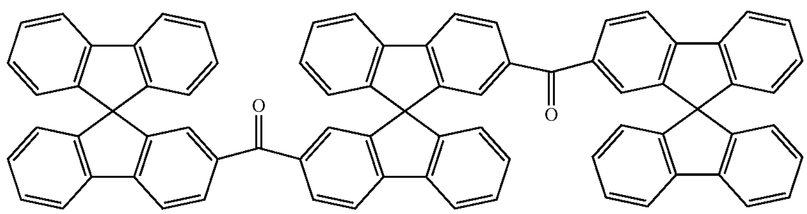
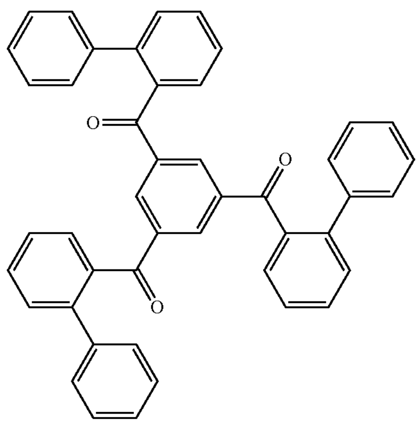
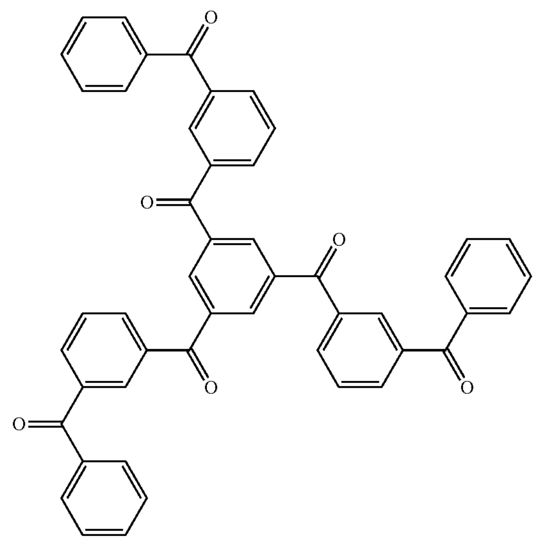
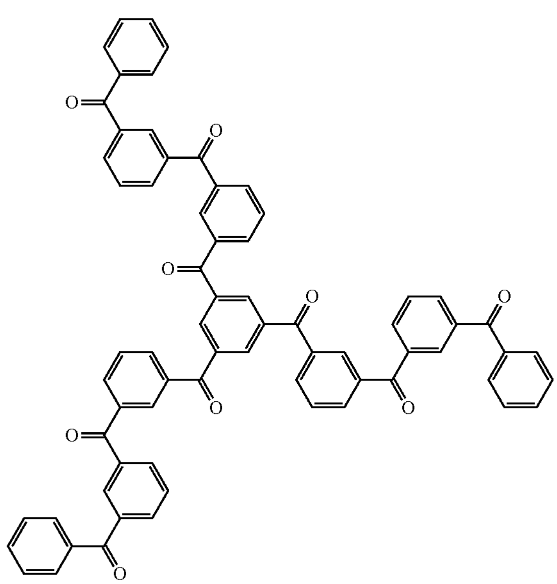
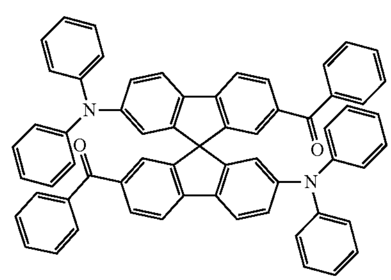

-continued
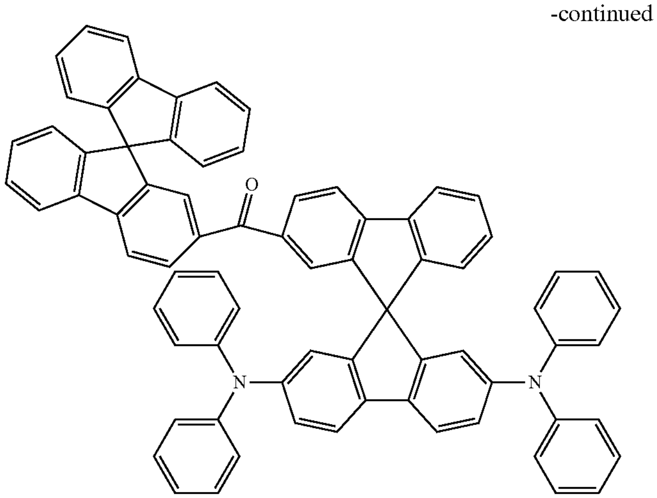
Examples of metal complexes which can be employed as electron-transporting matrix materials:
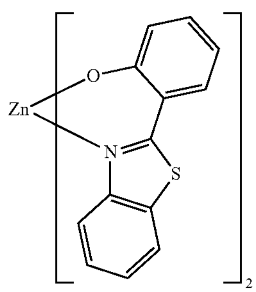
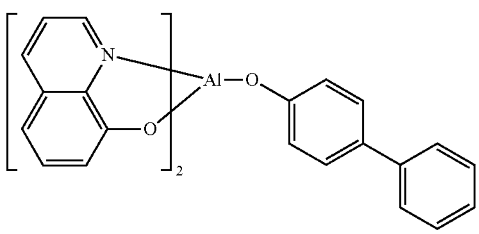
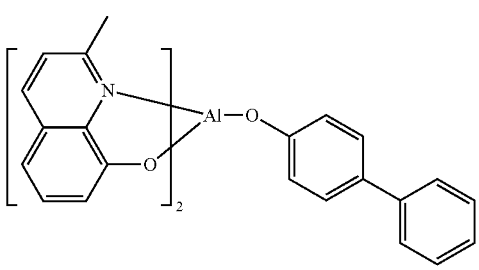
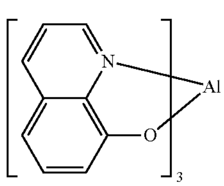
-continued
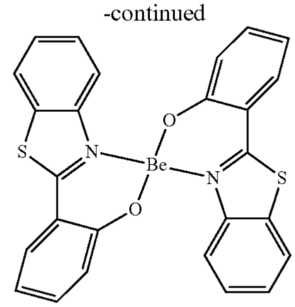
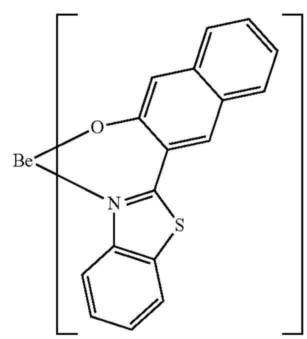
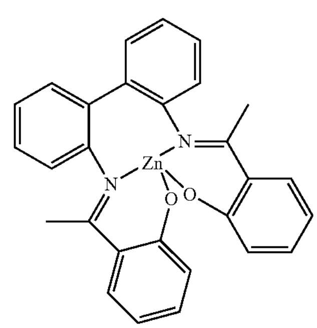

-continued
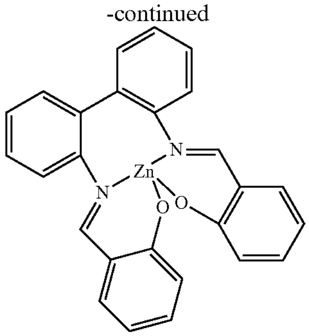
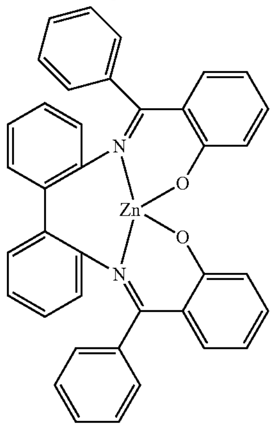
-continued
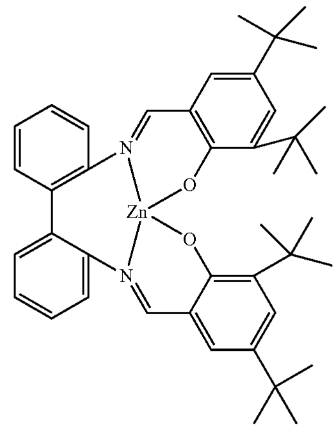
Examples of phosphine oxides which can be employed as electron-transporting matrix materials:
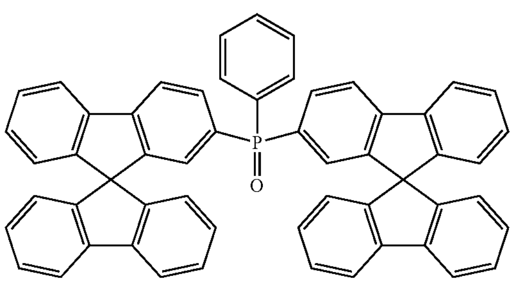
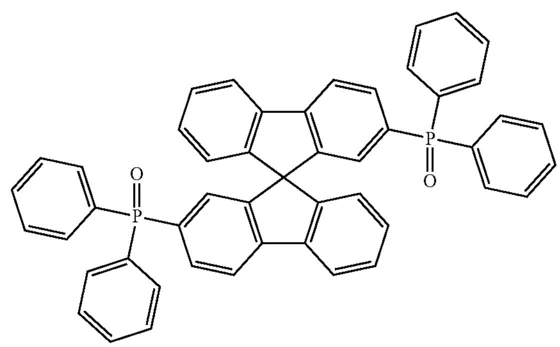
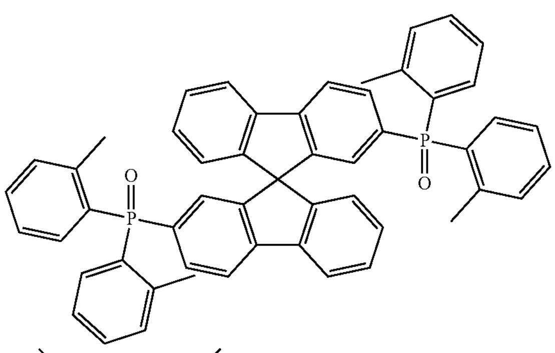
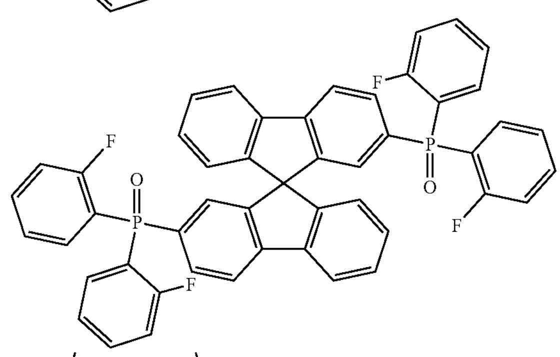
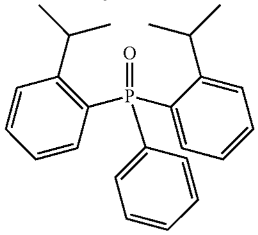
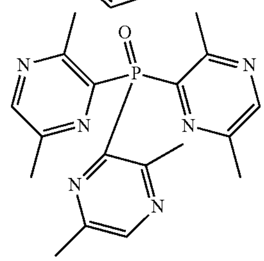

-continued
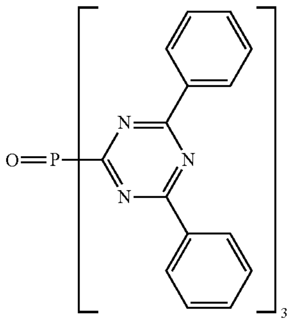
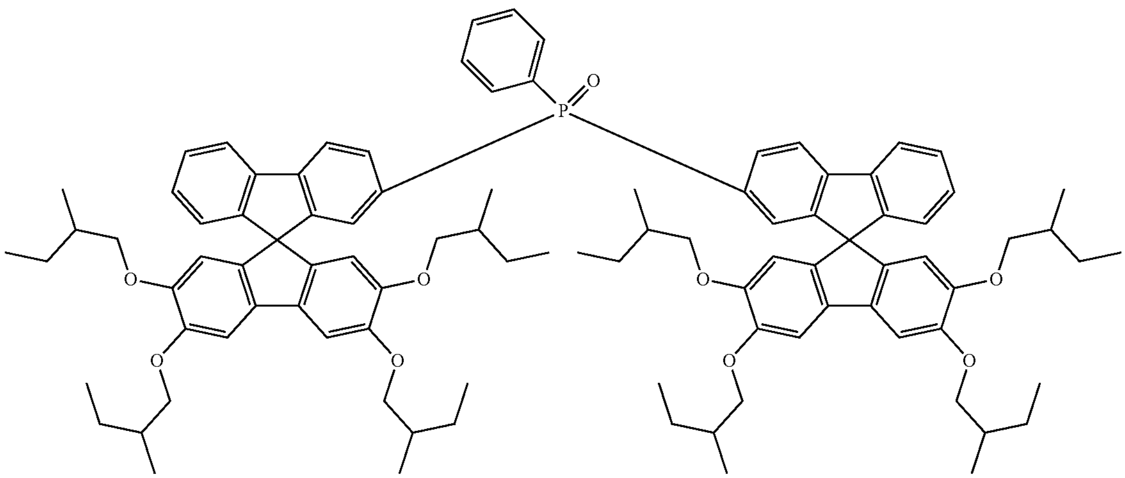
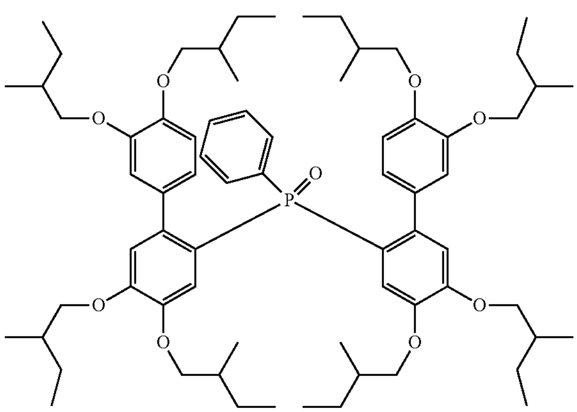
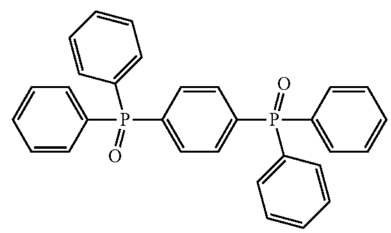
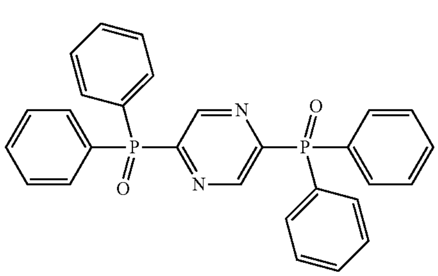
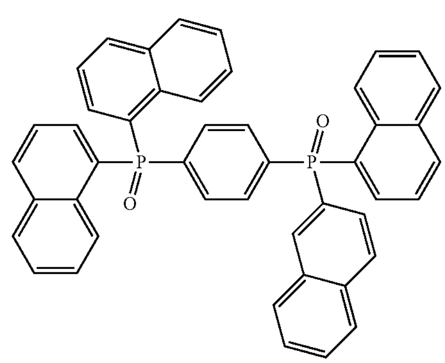

-continued
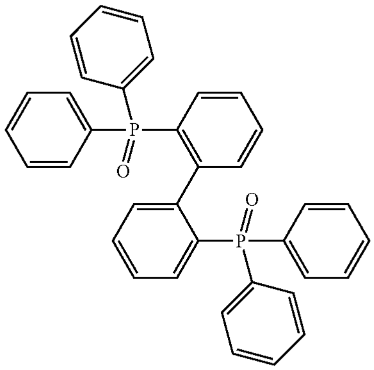
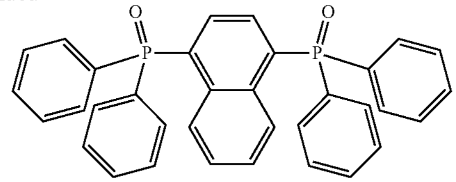
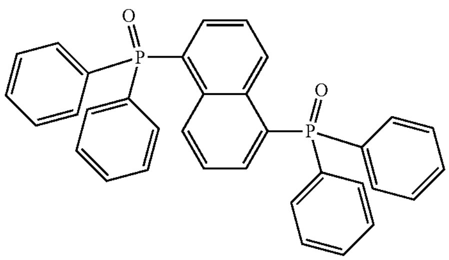
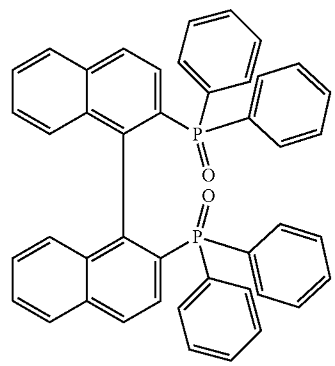
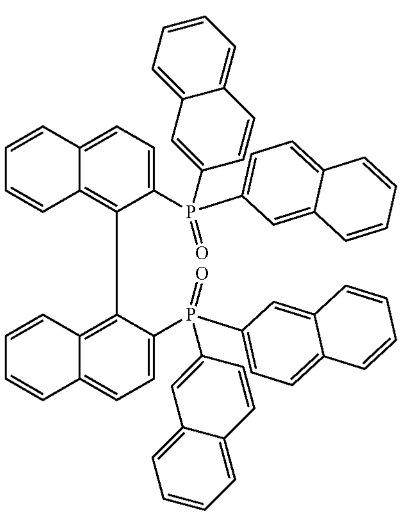
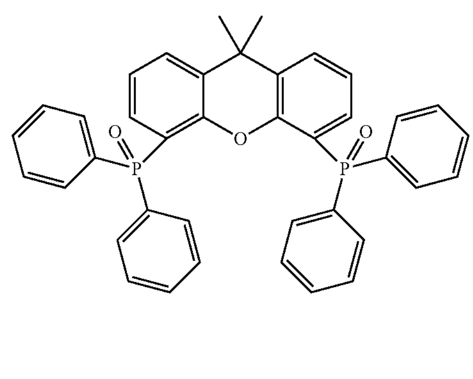
Examples of indolo- and indenocarbazole derivatives in the broadest sense which, depending on the substitution pattern, can be employed as hole- or electron-transporting matrix materials:

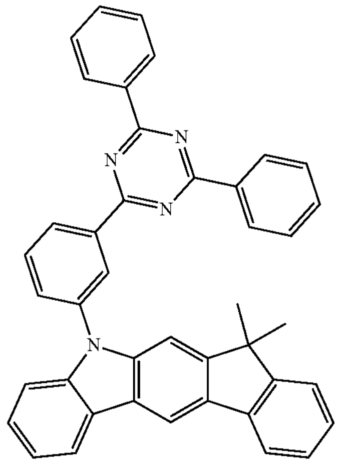
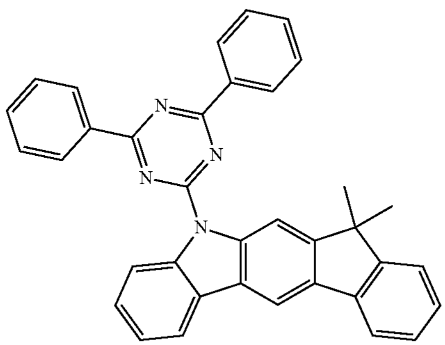
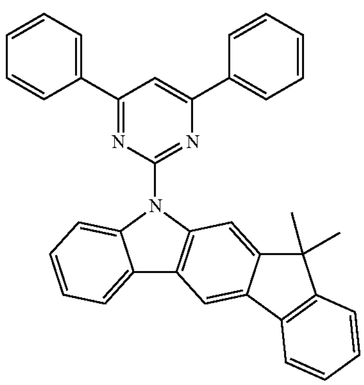
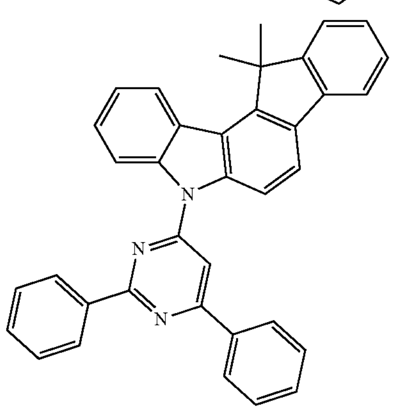
-continued
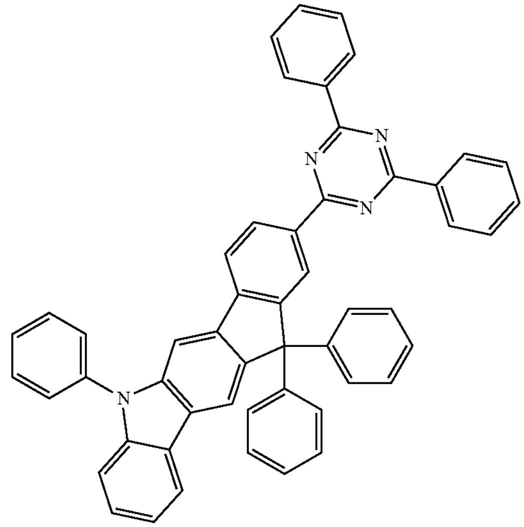
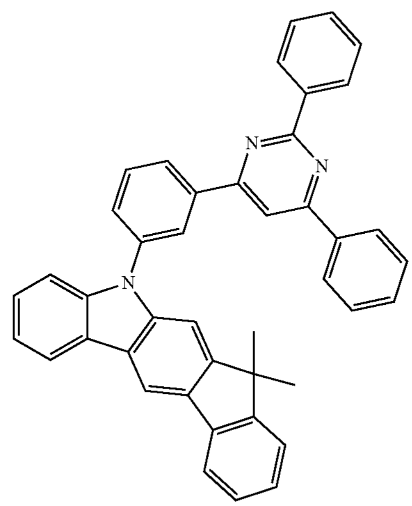
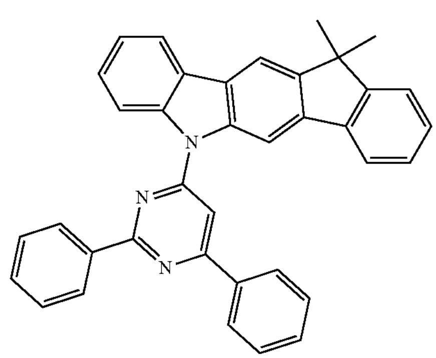

-continued
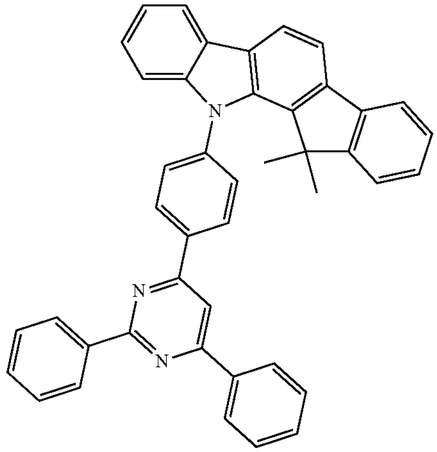
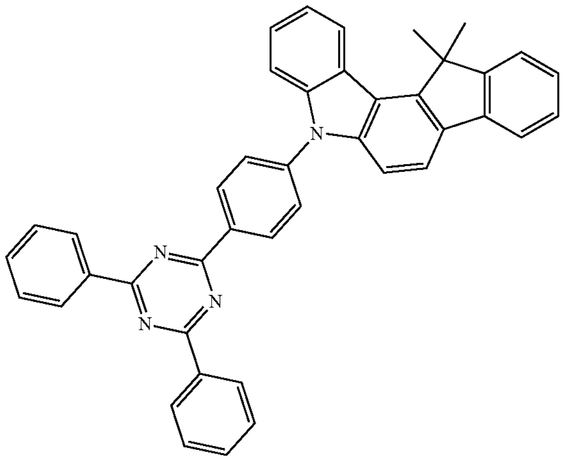
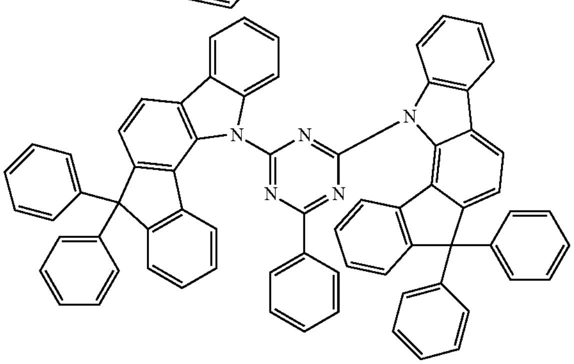
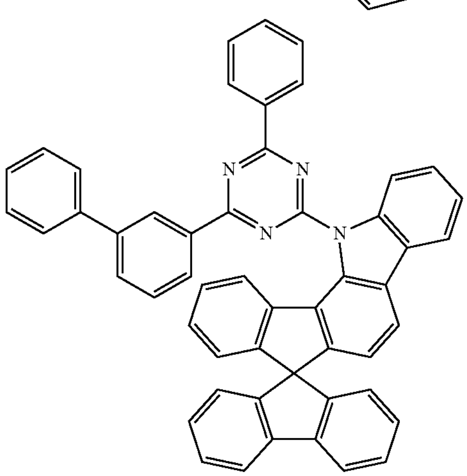
-continued
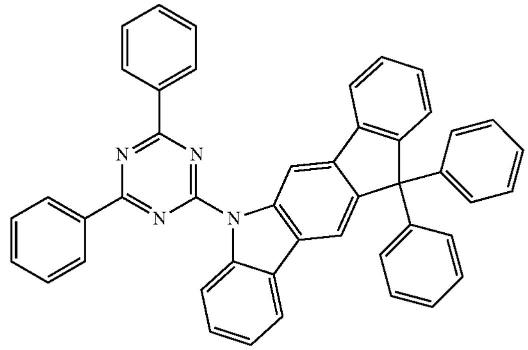
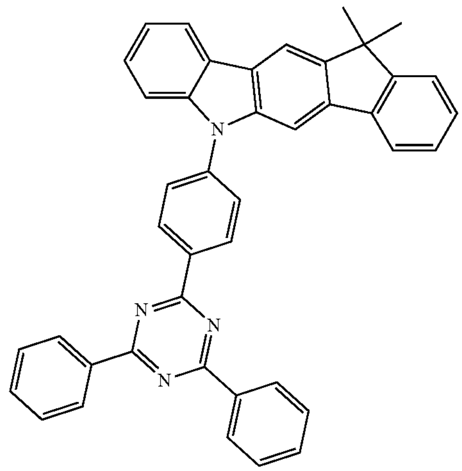
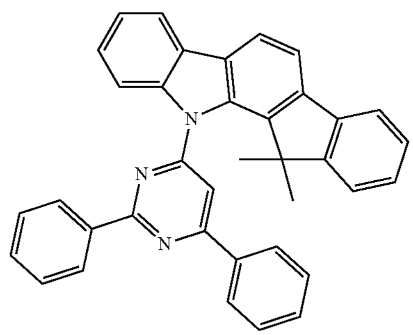
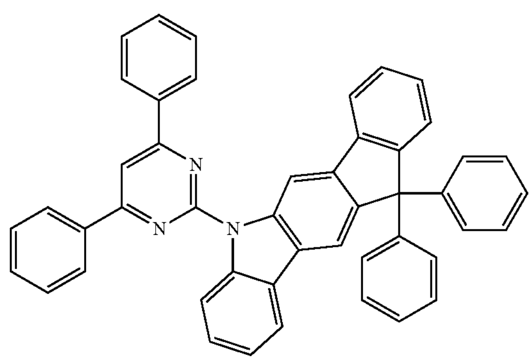

-continued
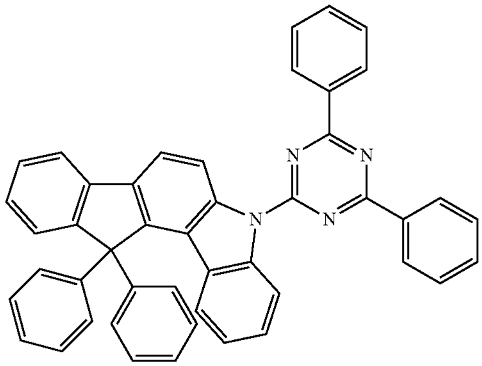
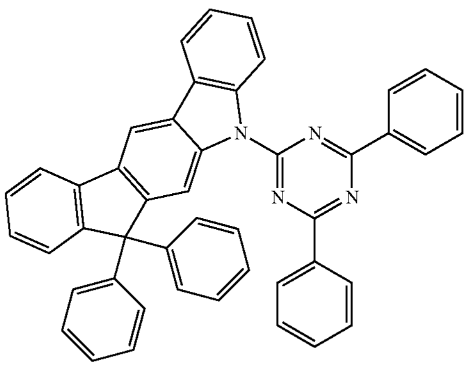
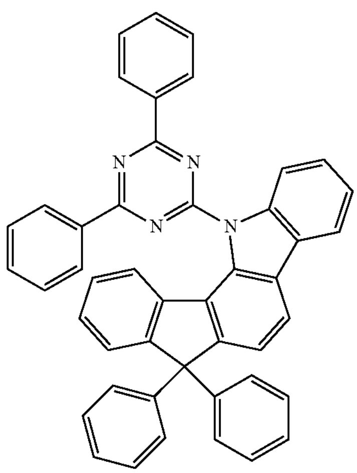
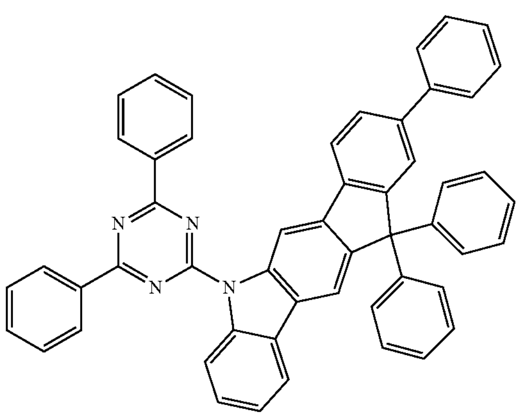
-continued
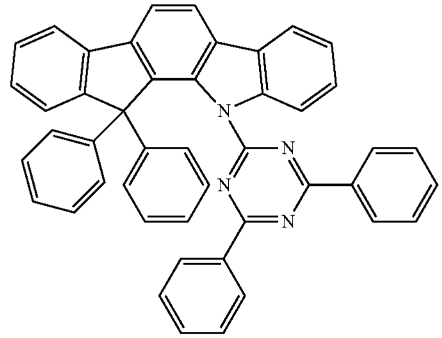
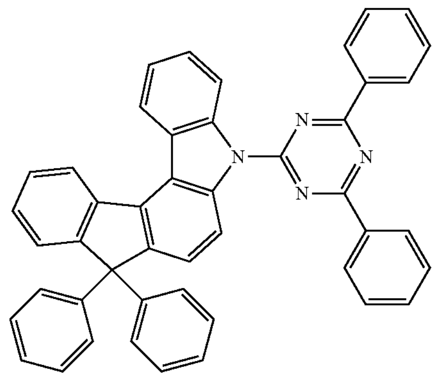
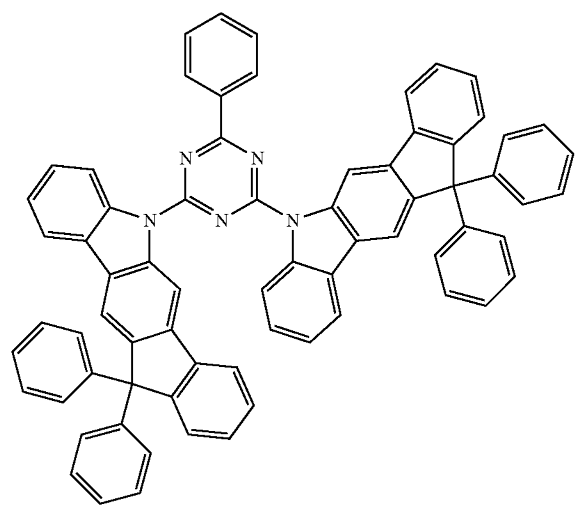
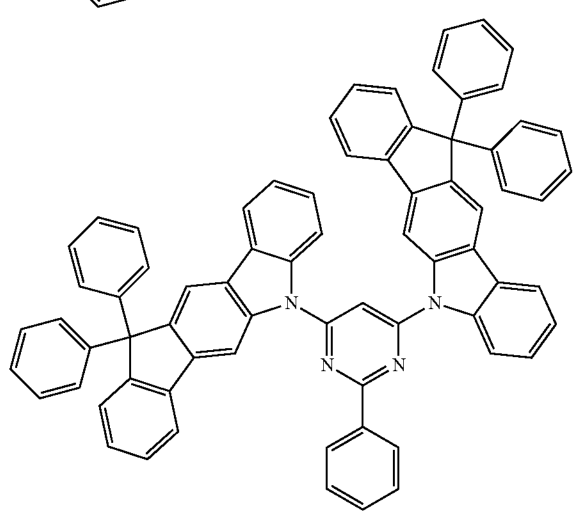

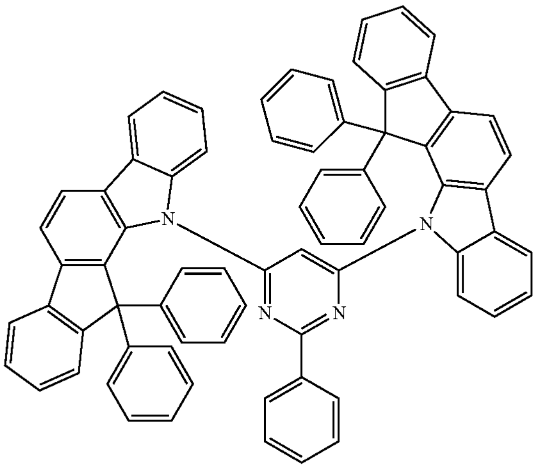
N
N
N
N
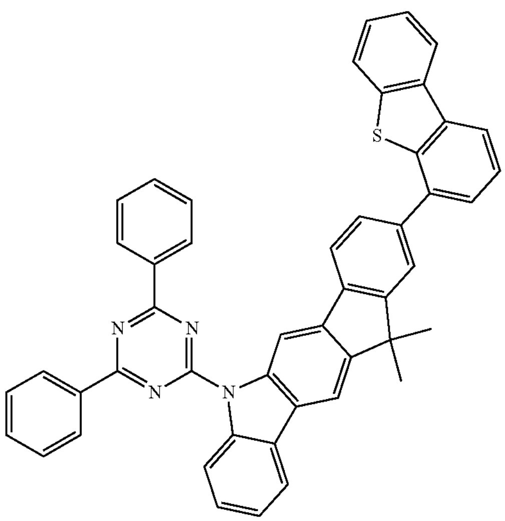
S
N
N
N
N
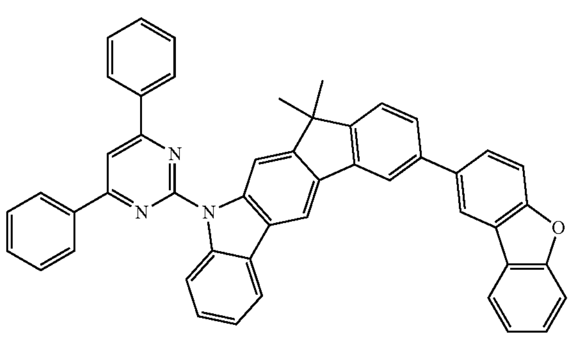
N
N
N
O
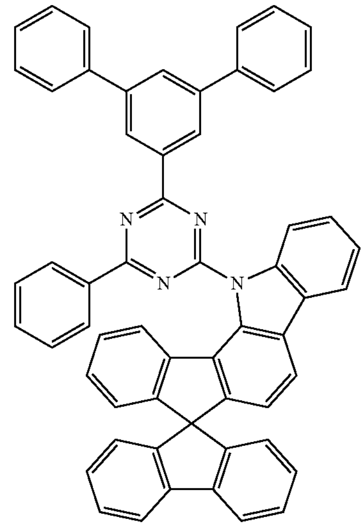
N
N
N
N
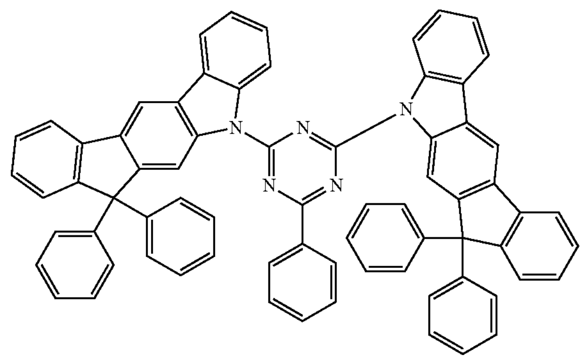
N
N
N
N
N
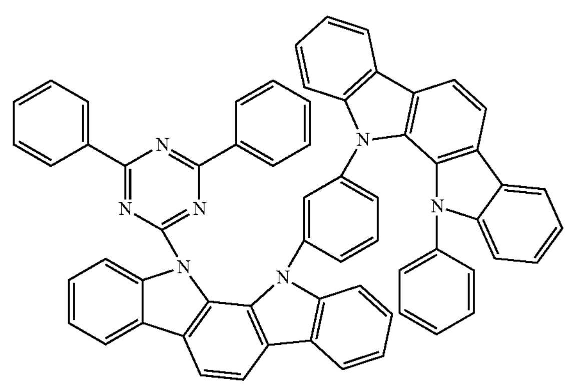
N
N
N
N
N
N
N
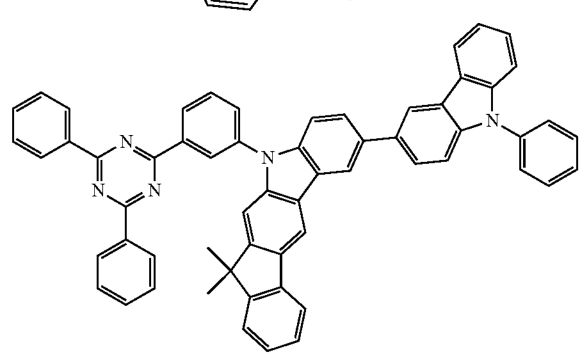
N
N
N
N
N -continued
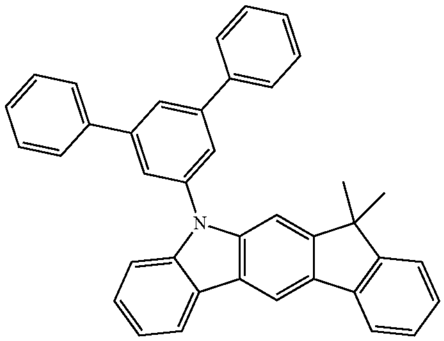
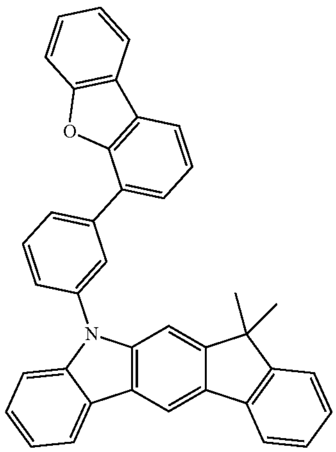
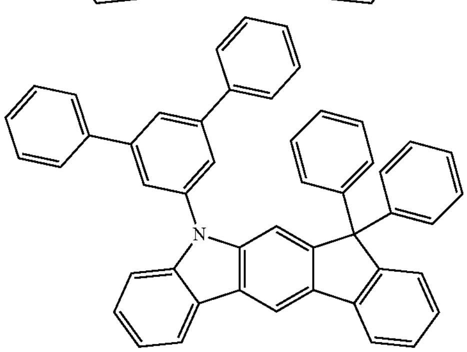
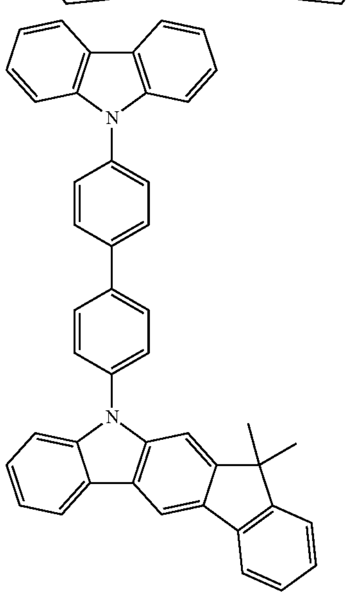
-continued
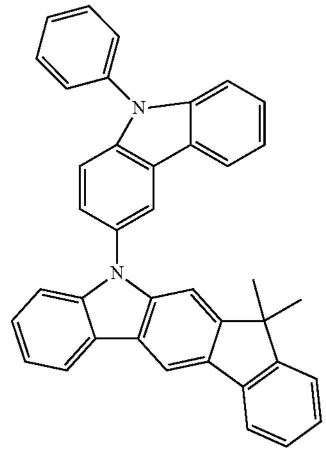
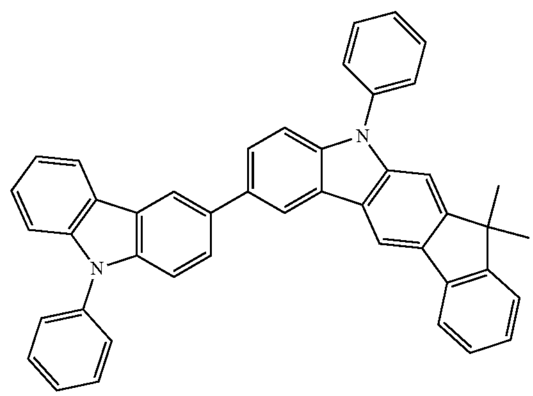
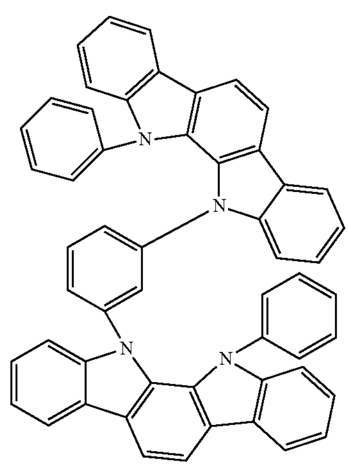

-continued
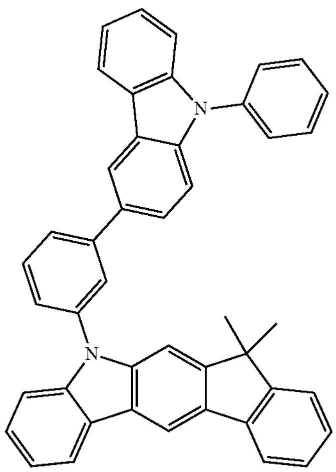
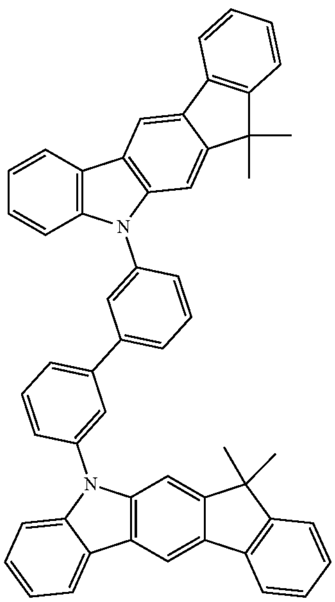
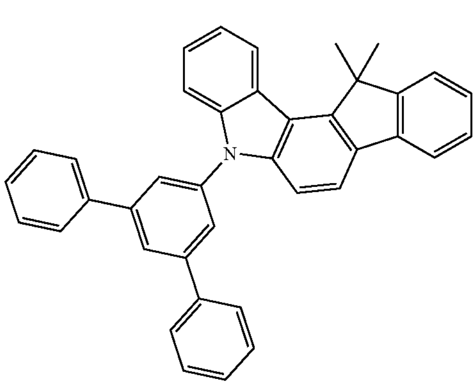
-continued
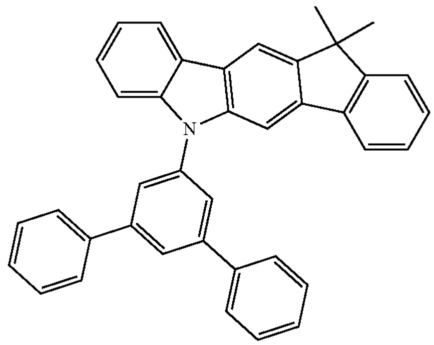
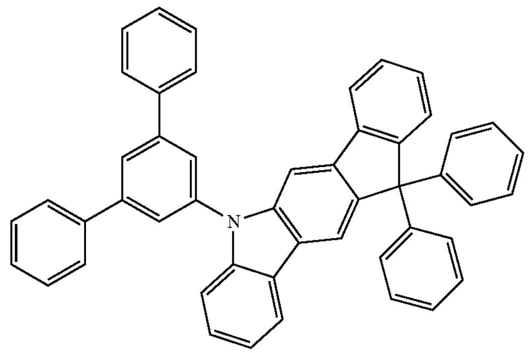
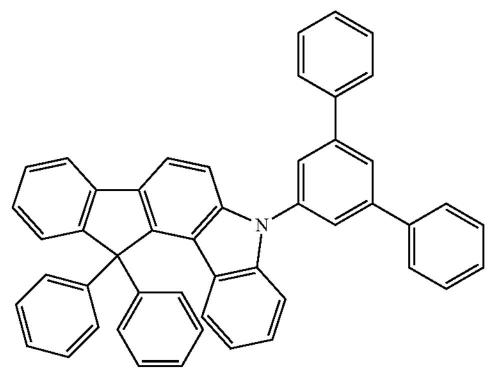
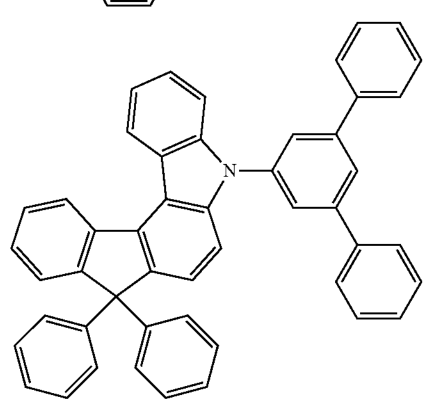

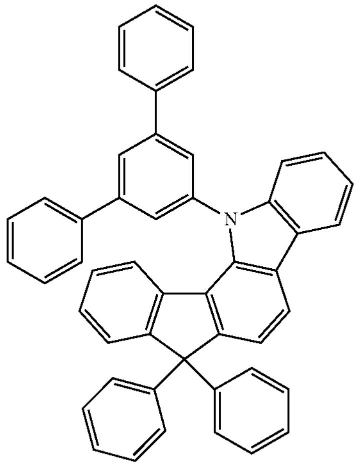
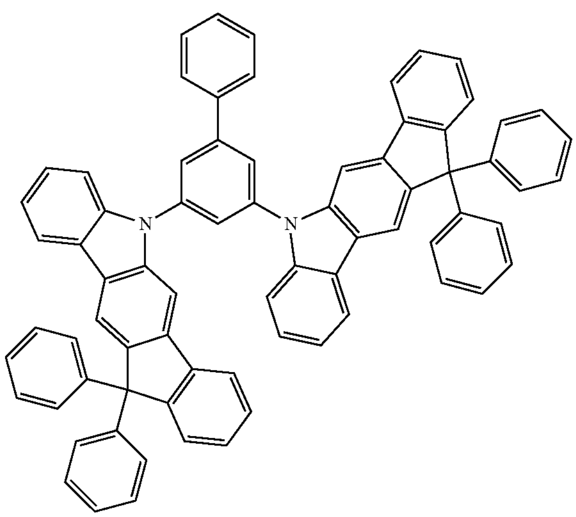
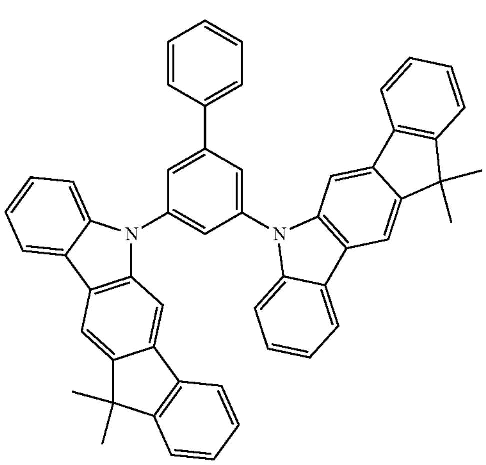
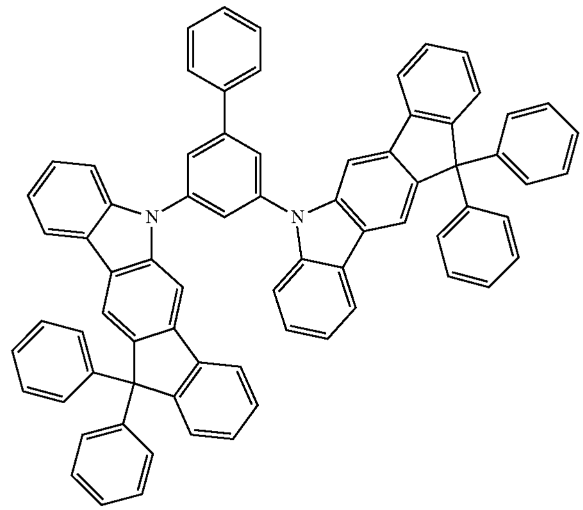
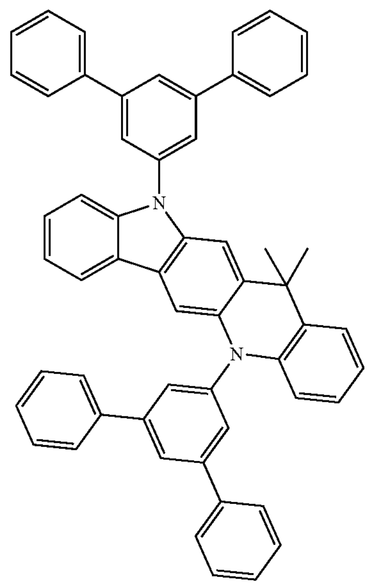
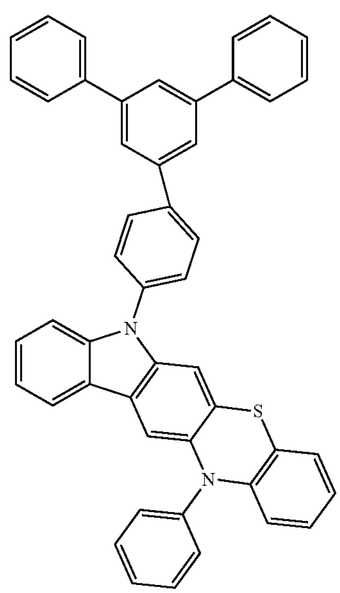

-continued
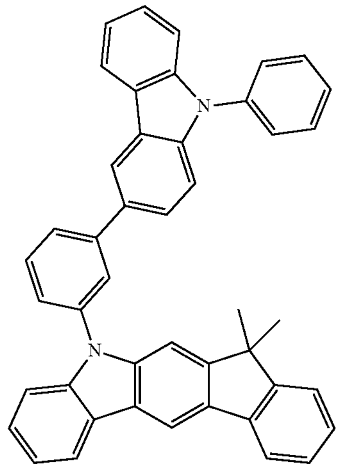
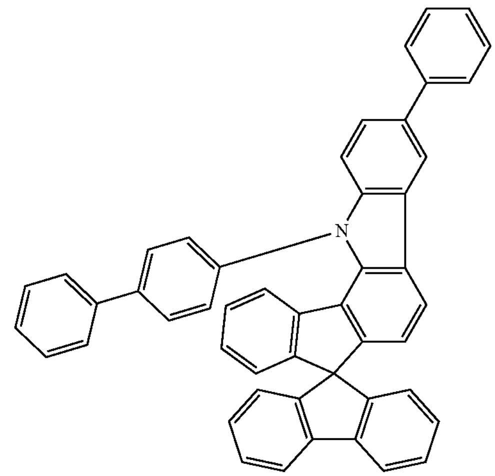
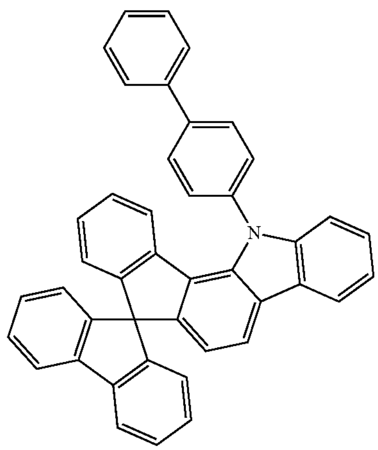
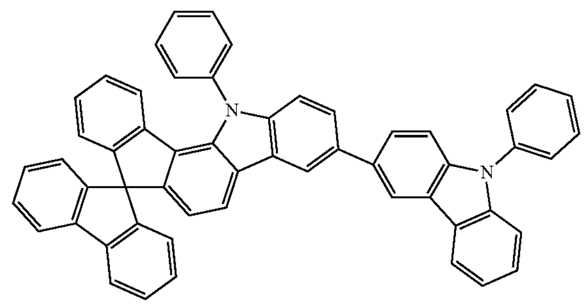
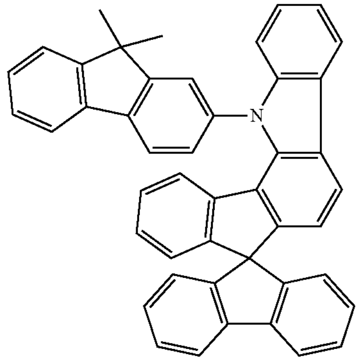
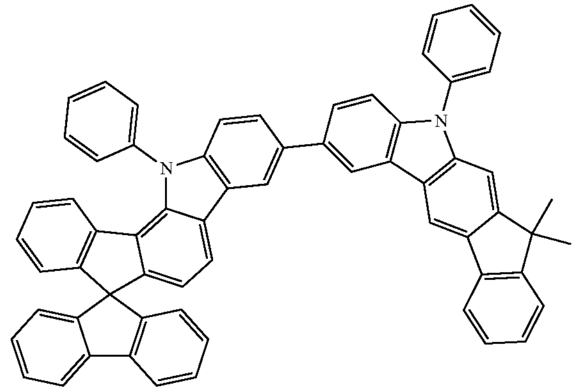
-continued -continued
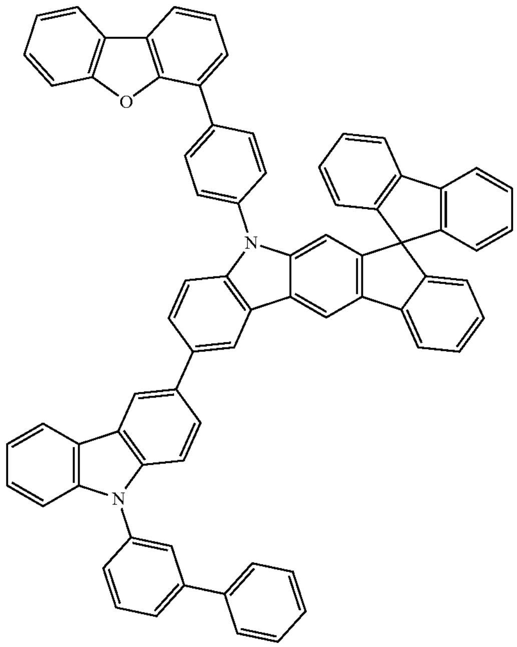
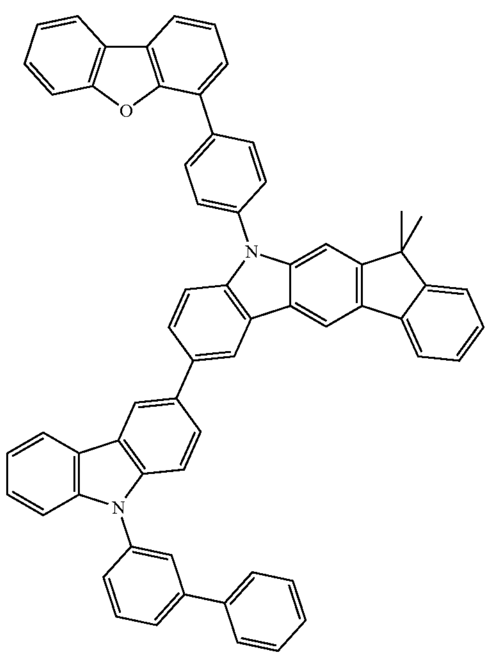
-continued
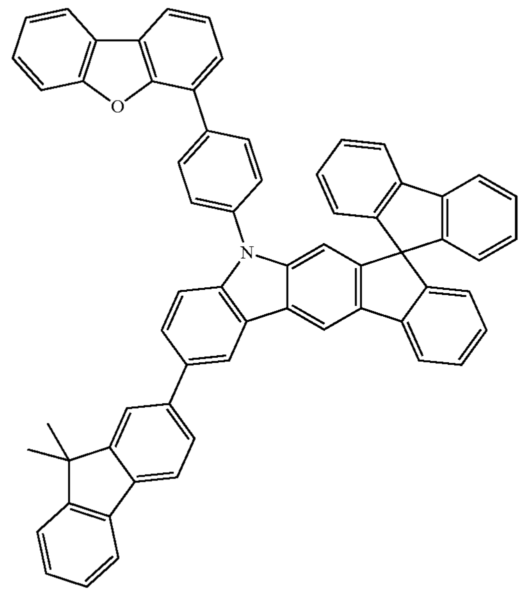
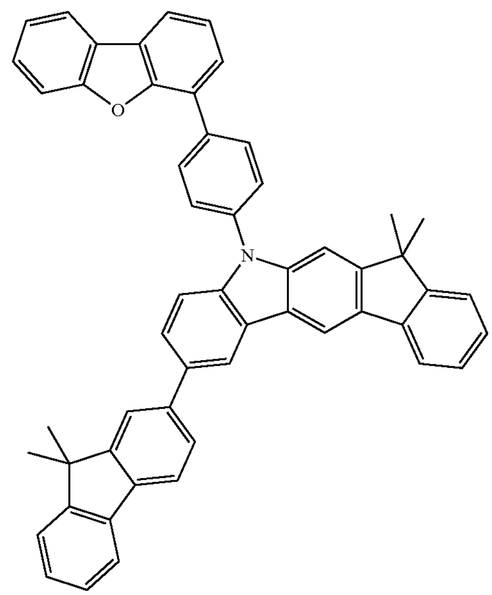
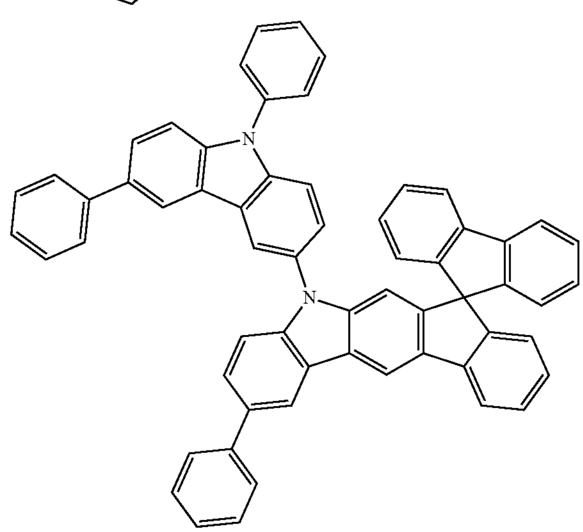

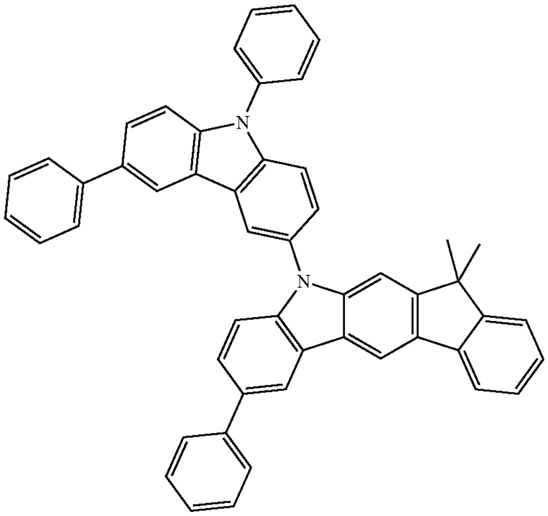
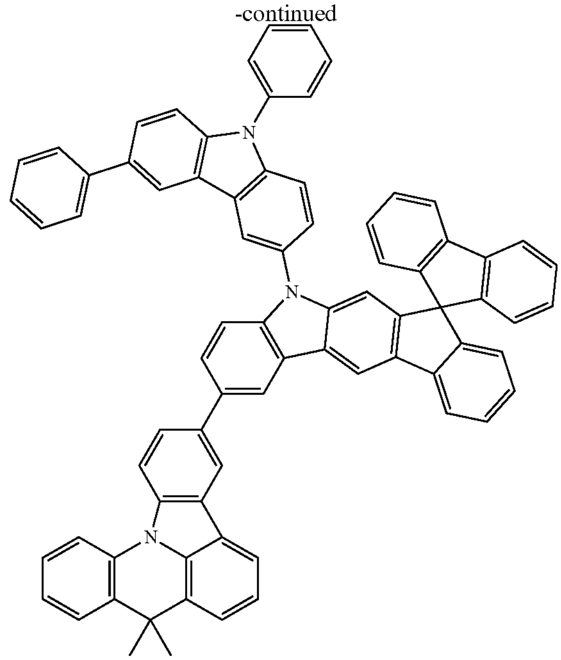
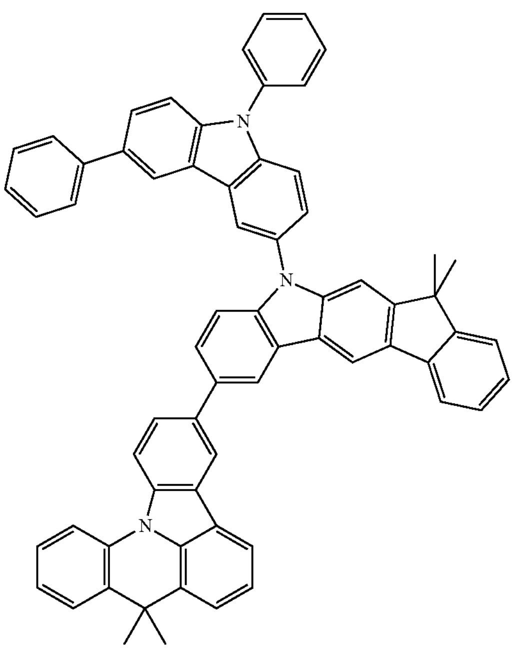
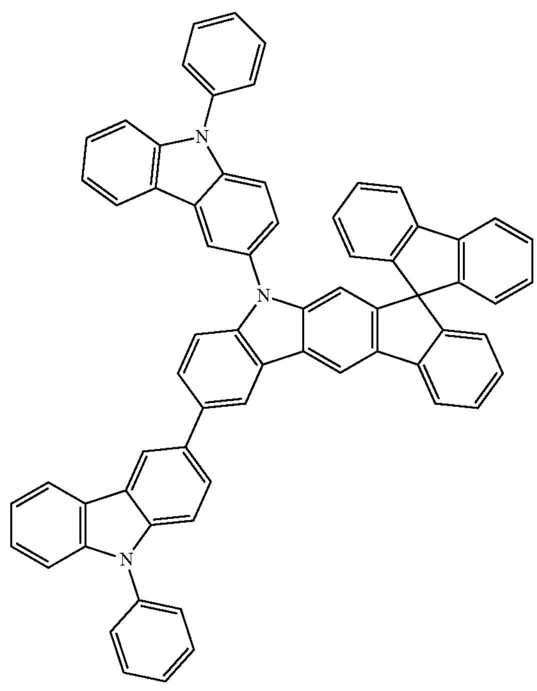
N
N
N
N
N
N
N
N
N
N
N
N

-continued
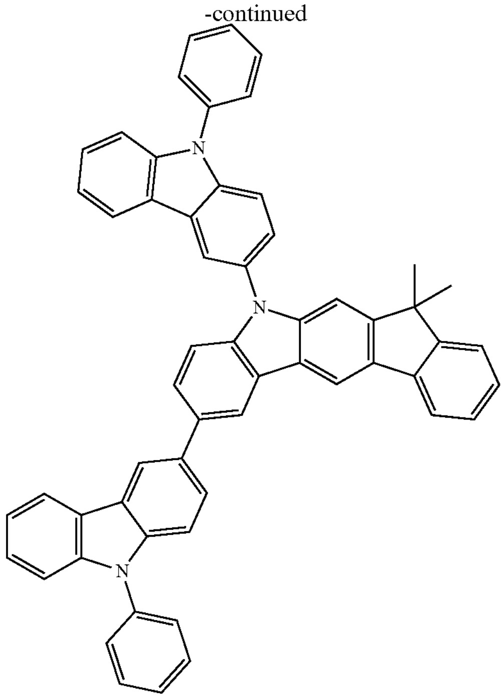
-continued
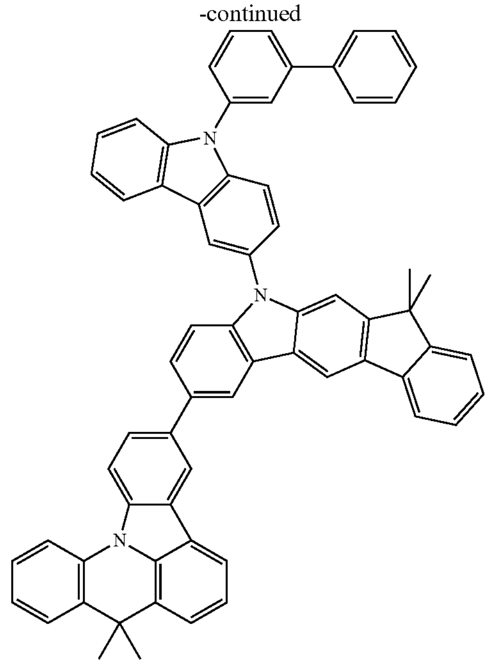
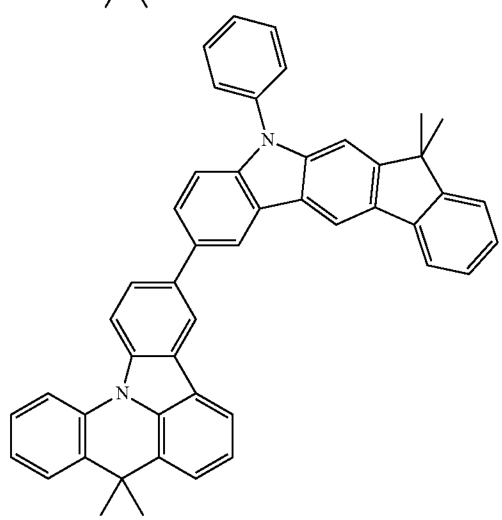
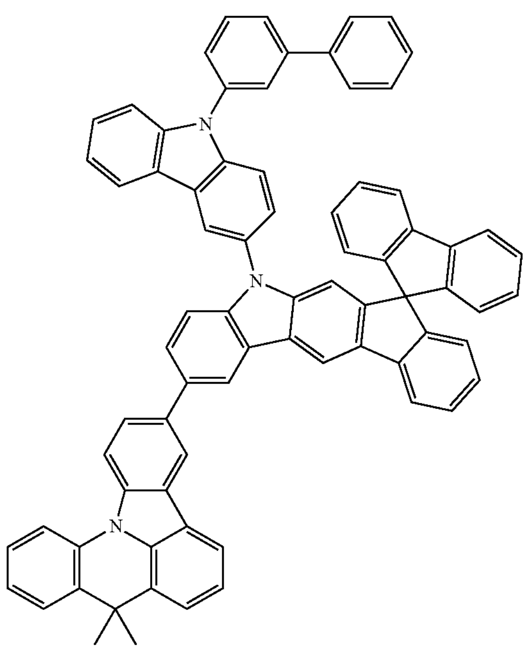
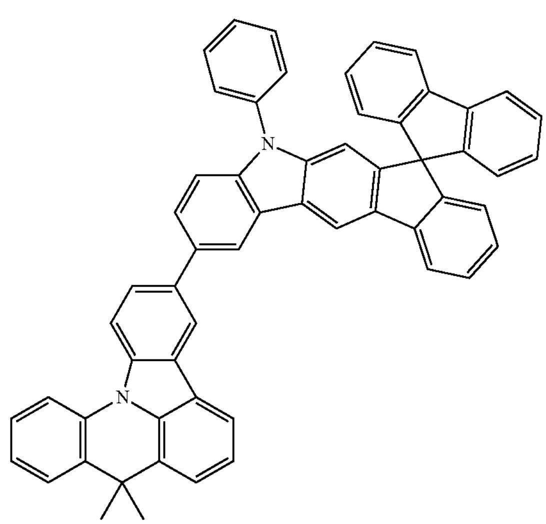

-continued
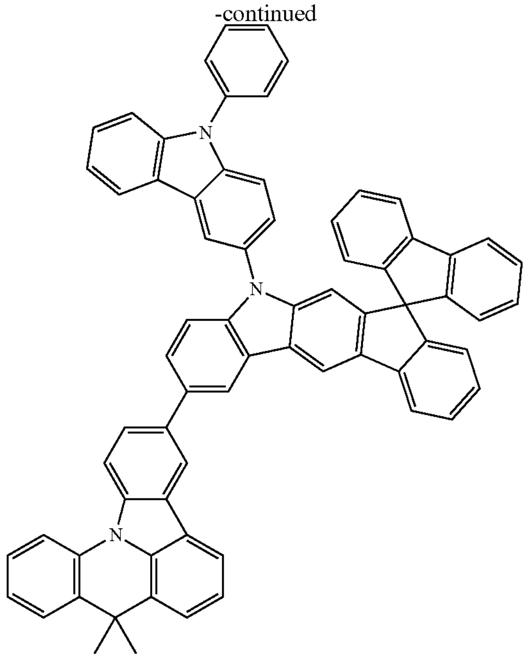
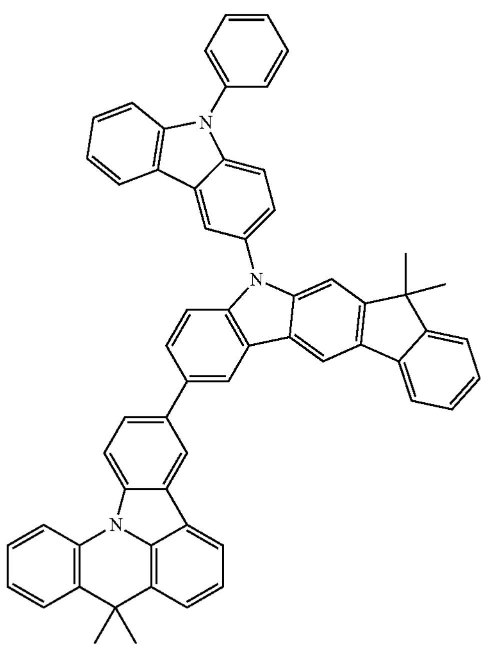
Examples of carbazole derivatives which, depending on the substitution pattern, can be employed as hole- or electron-transporting matrix materials:
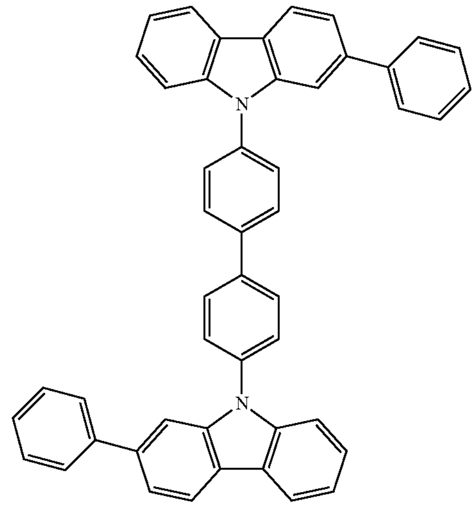
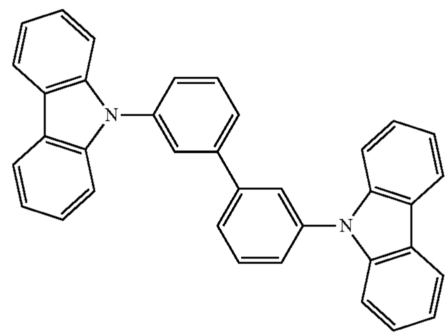
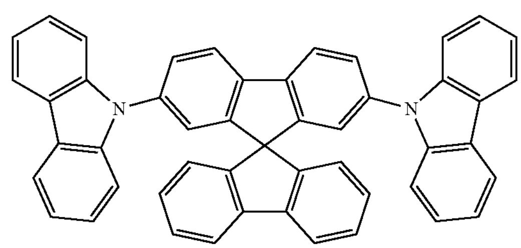
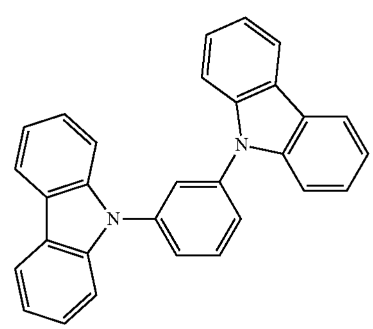
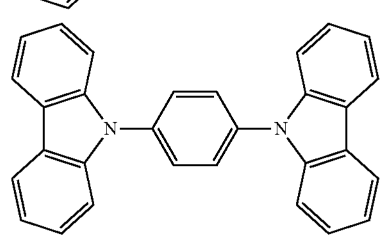

-continued
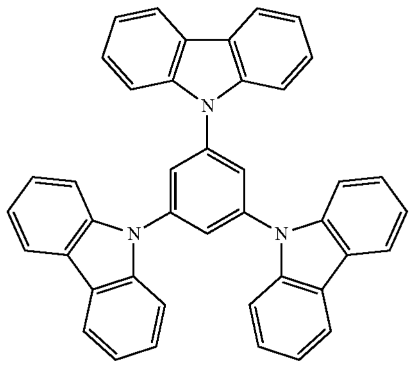
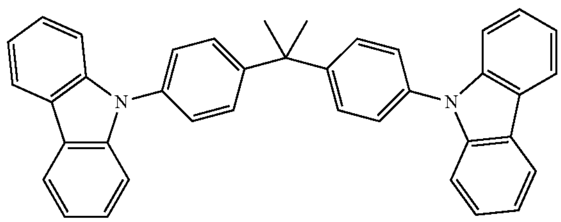
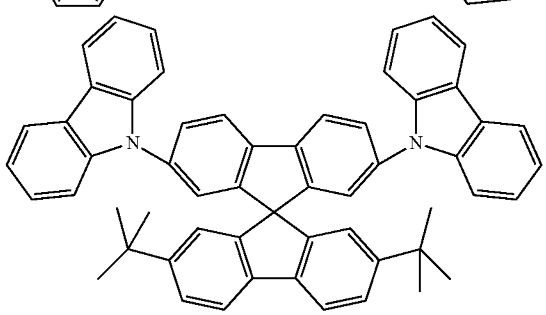
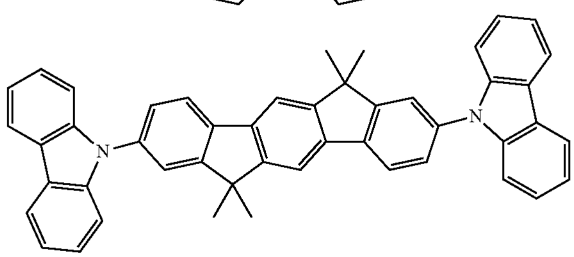
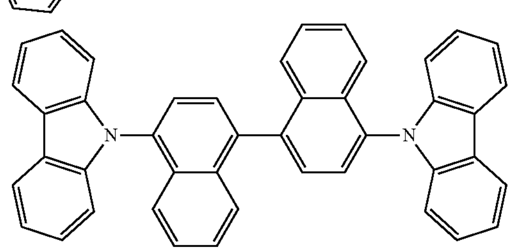
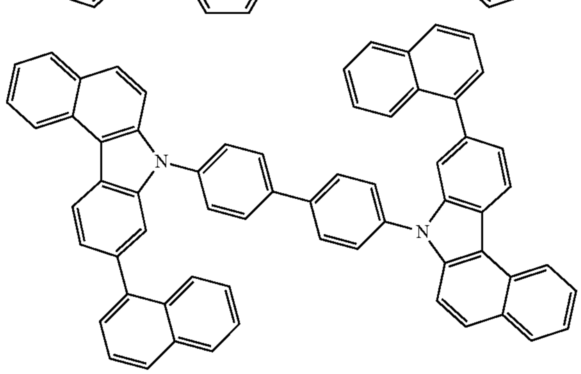
-continued
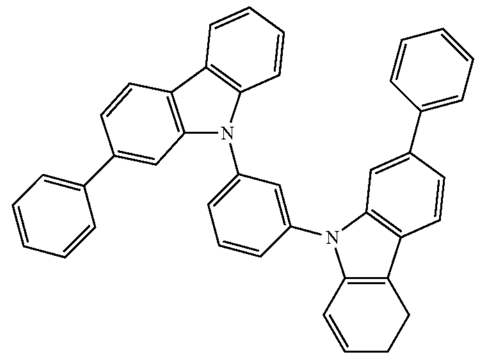
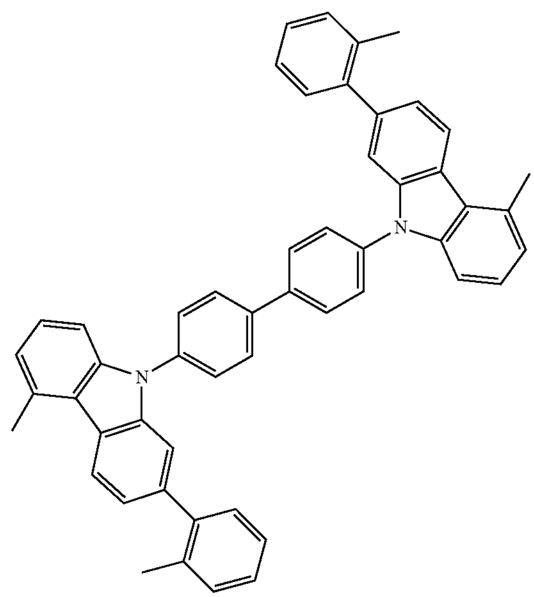
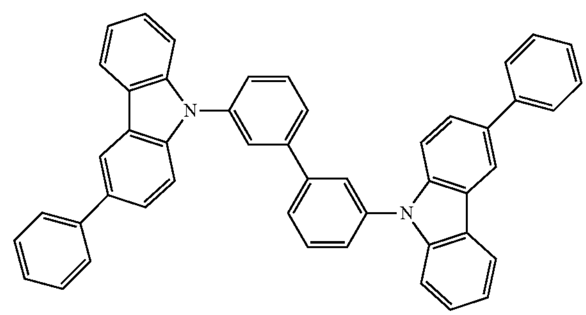
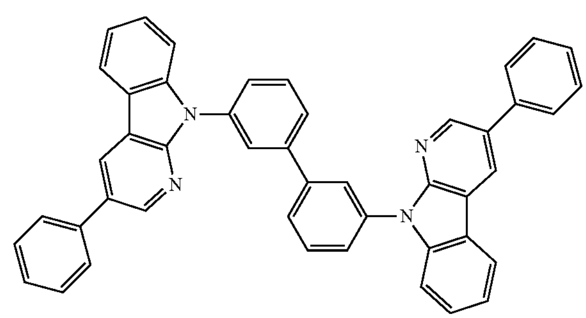

-continued
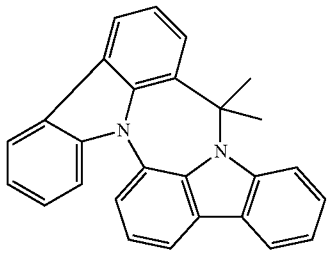
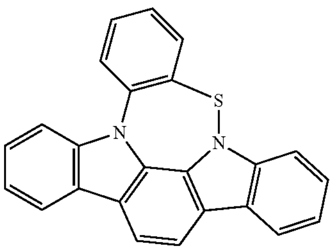
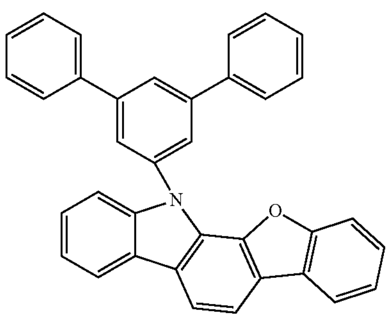
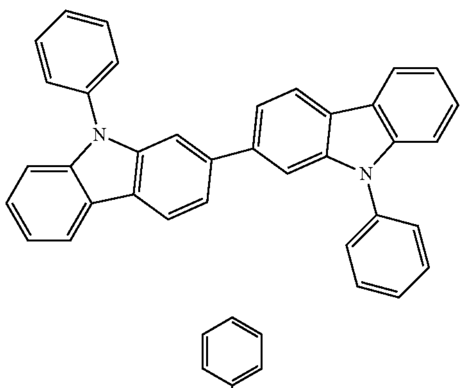
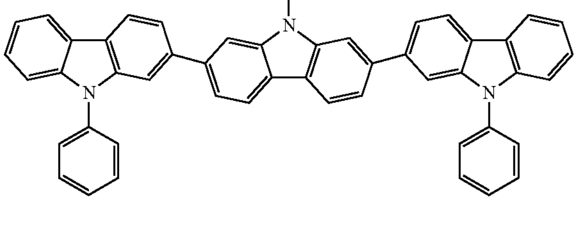
-continued
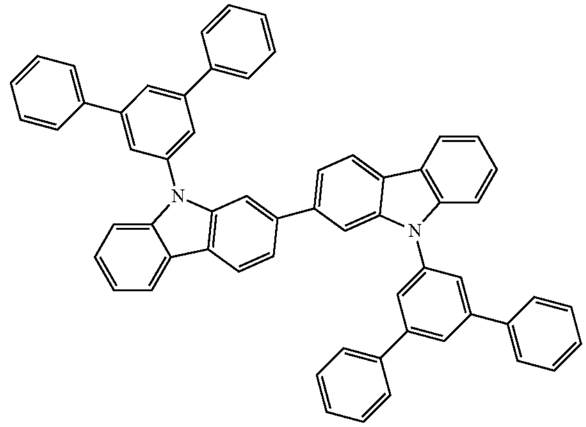
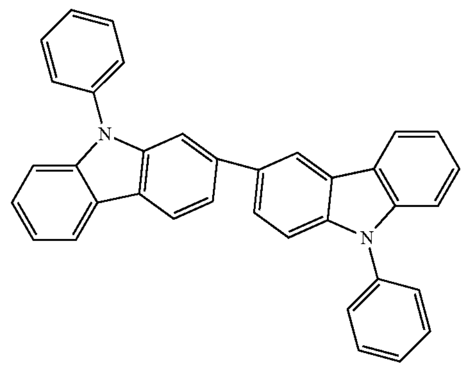
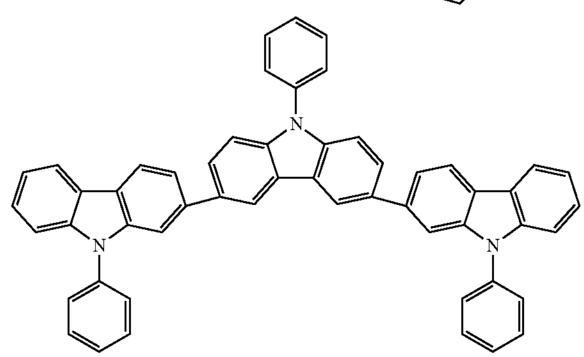
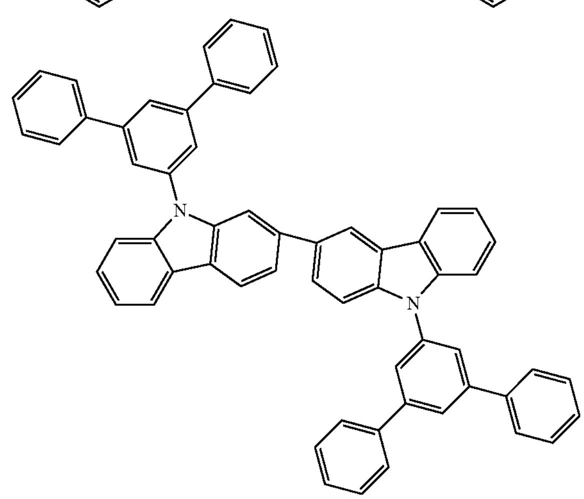

-continued
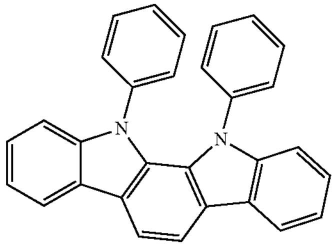
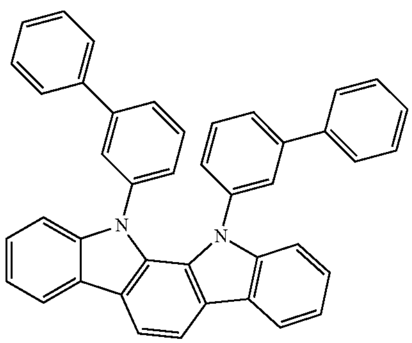
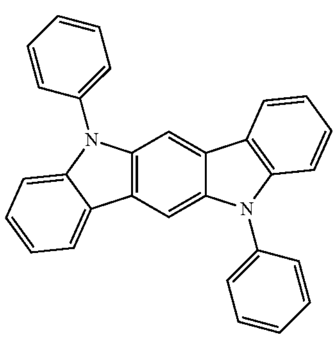
-continued
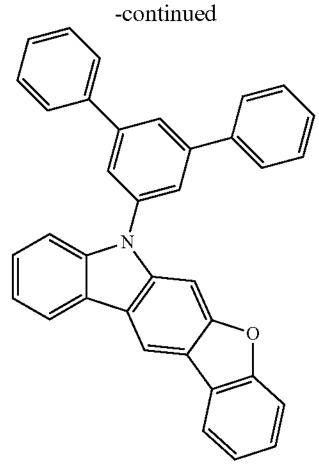
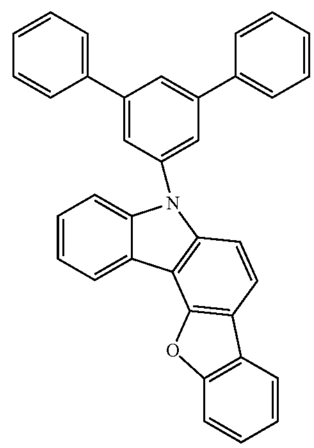
Examples of bridged carbazole derivatives which can be employed as hole-transporting matrix materials:
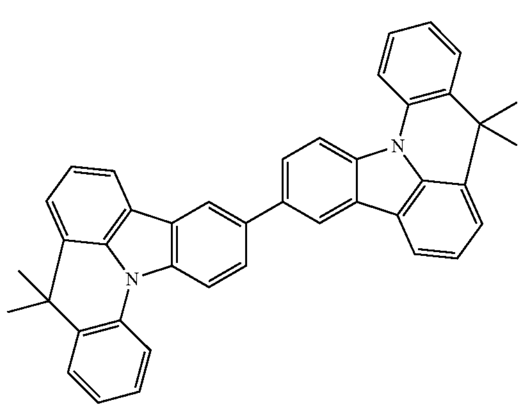
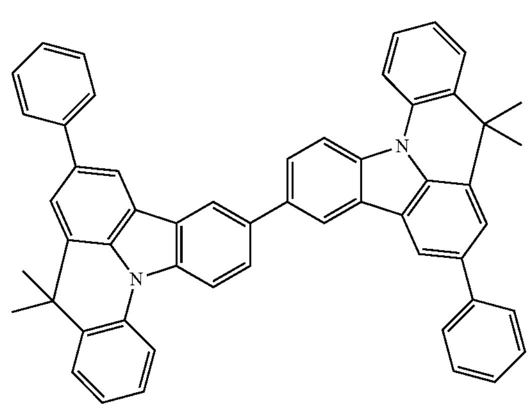

-continued
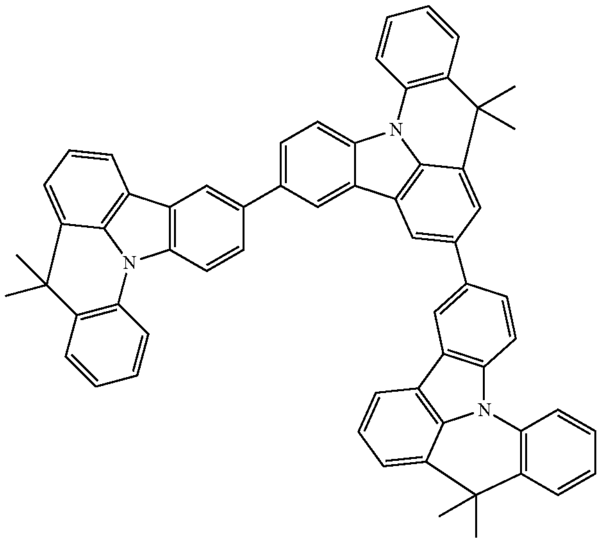
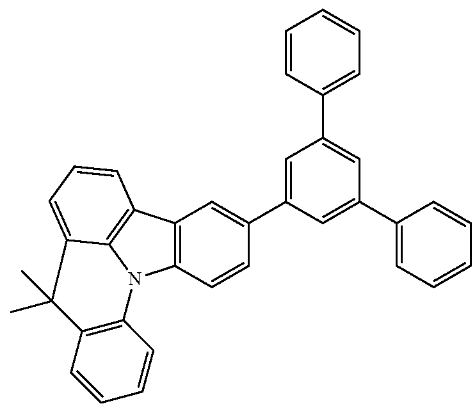
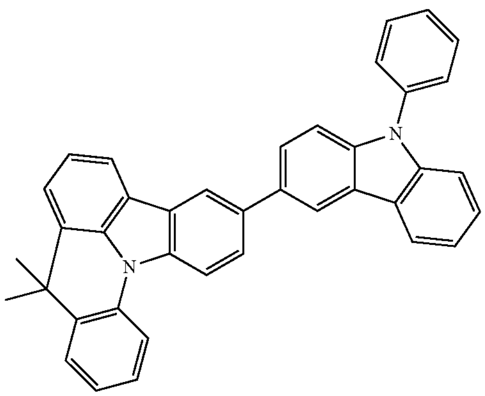
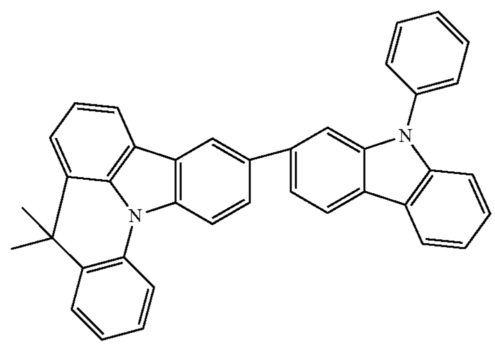
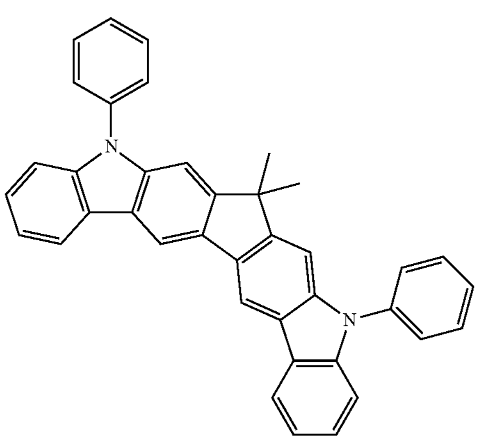
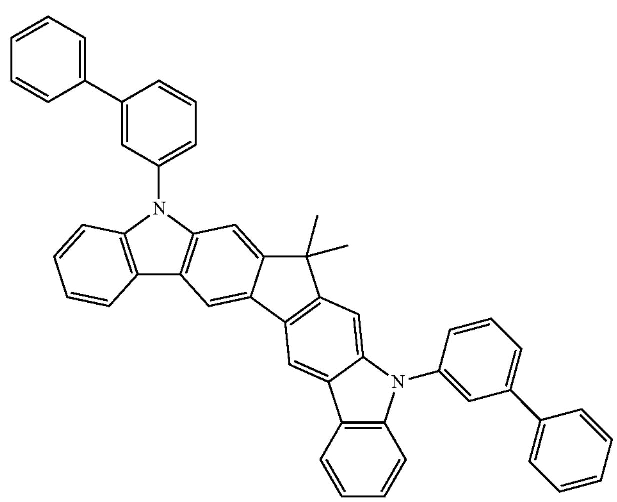

-continued
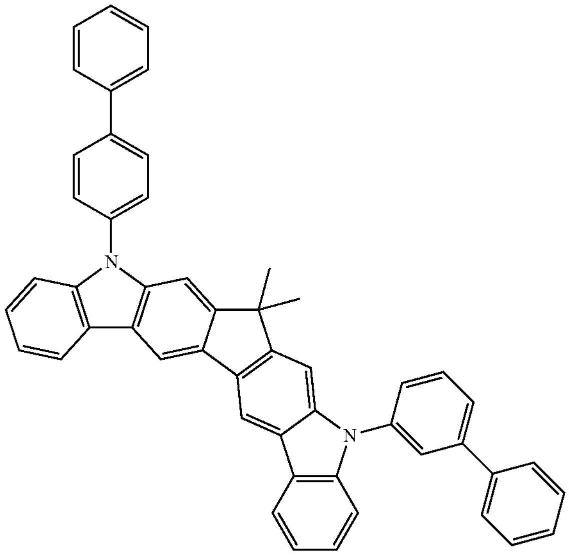
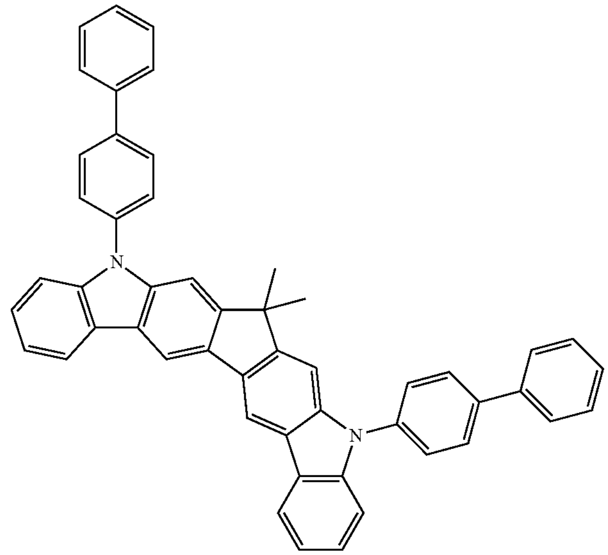
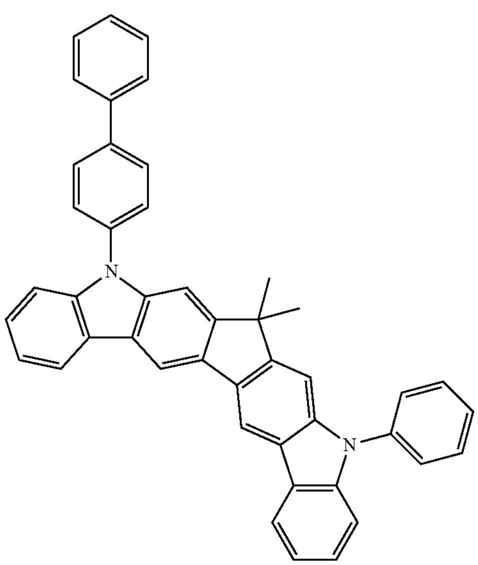
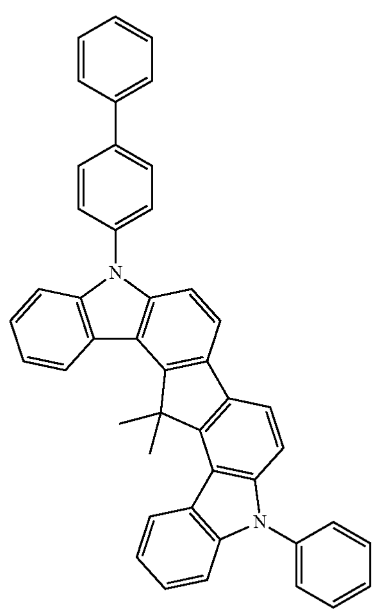

-continued
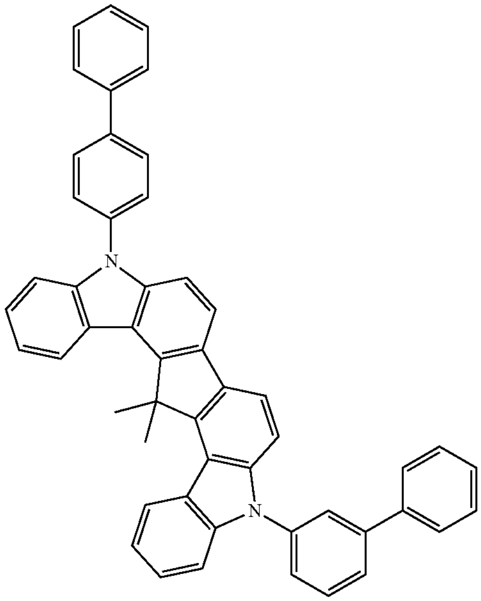
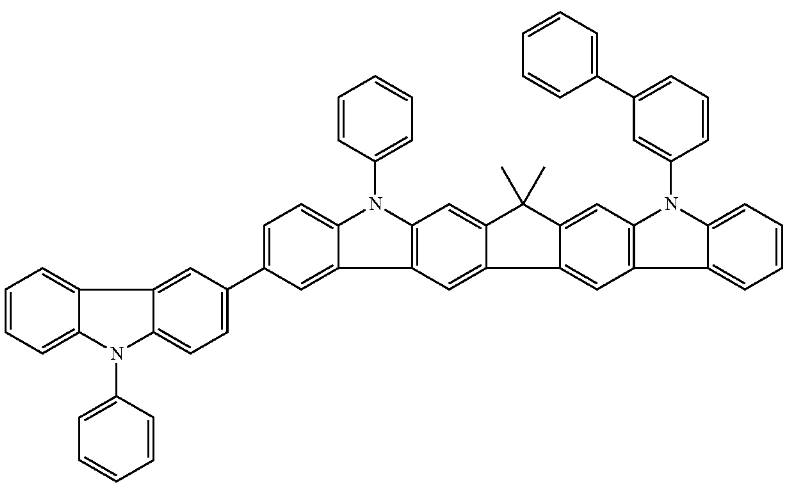
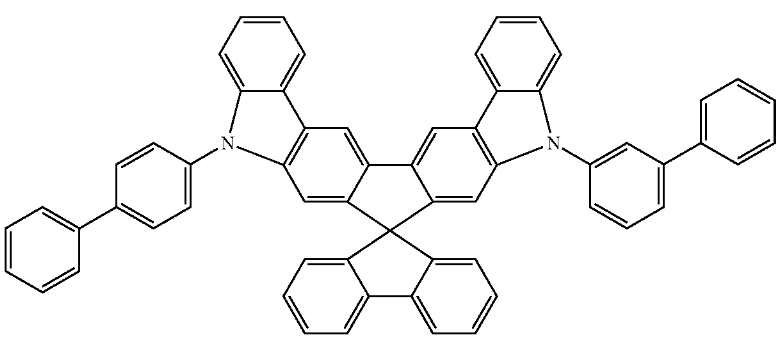

-continued
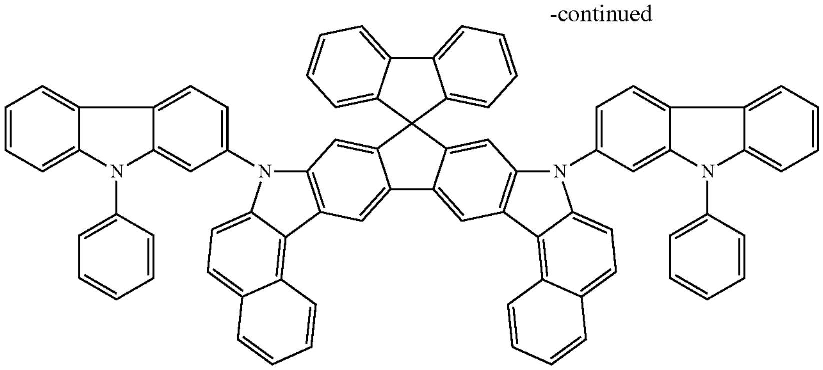
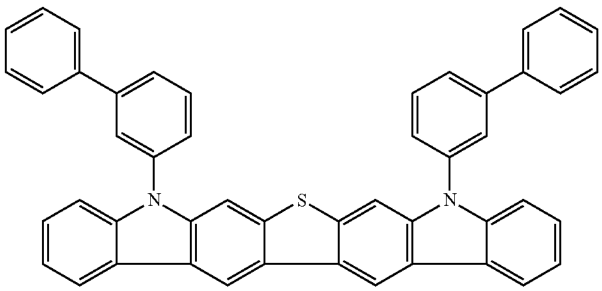
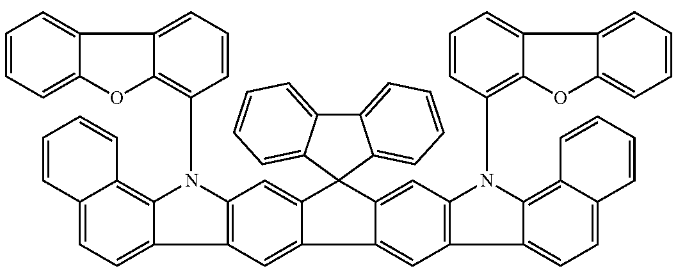
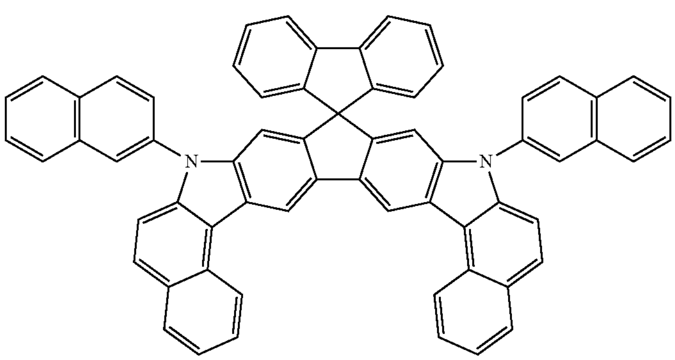
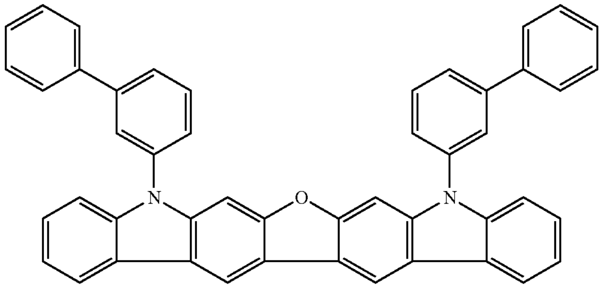

-continued
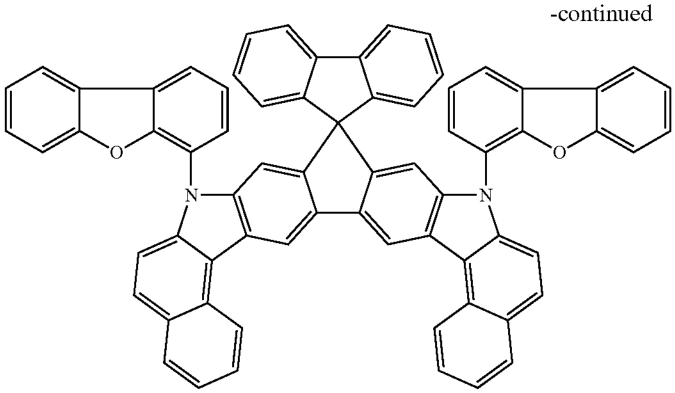
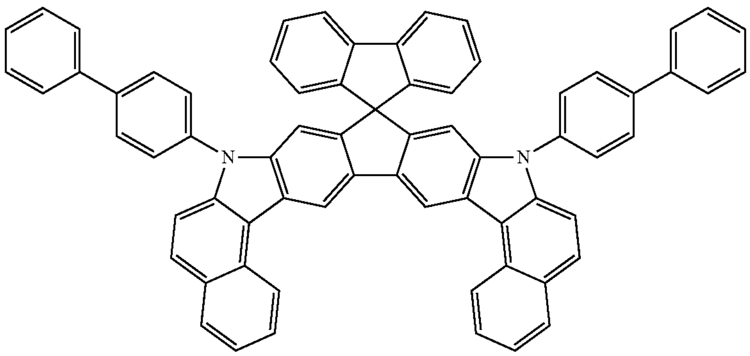
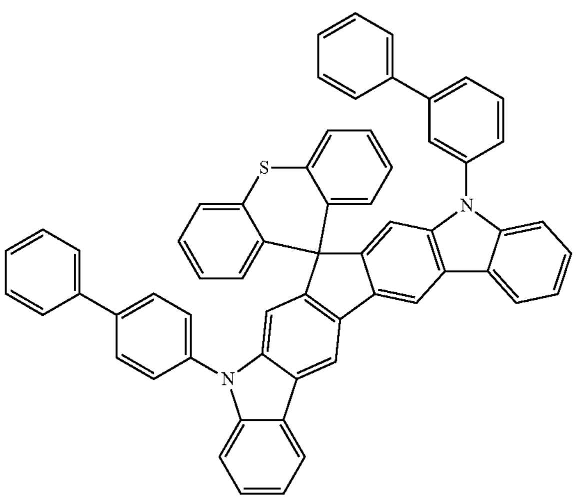
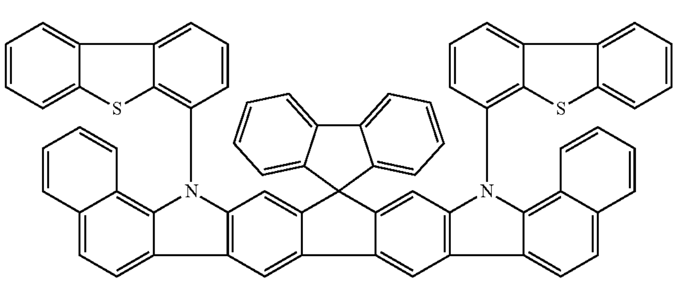

-continued
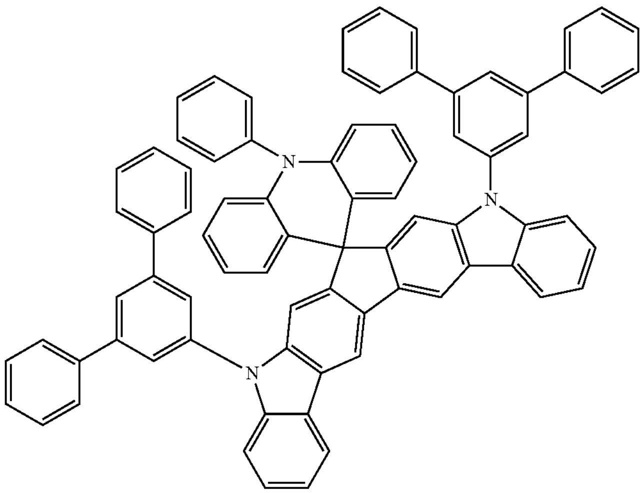
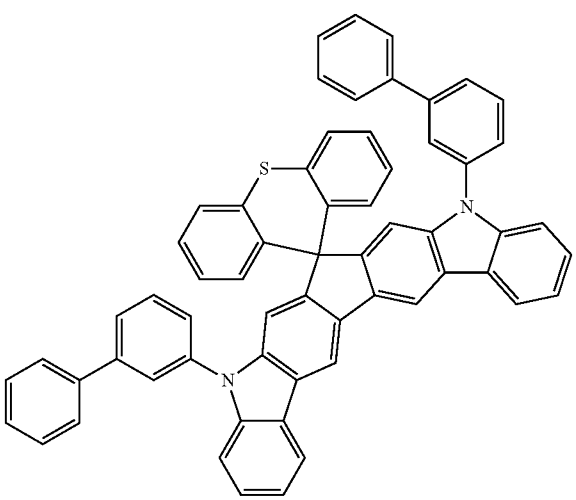
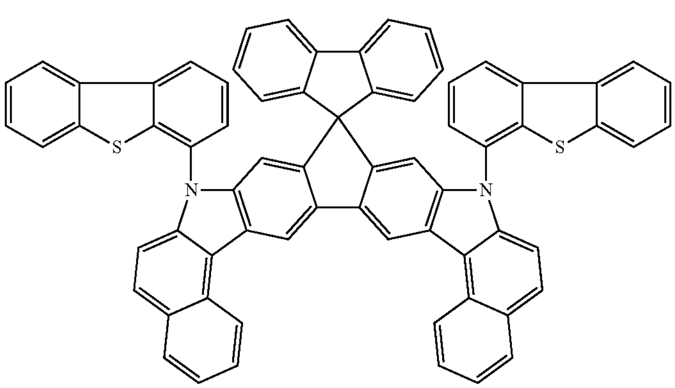

-continued
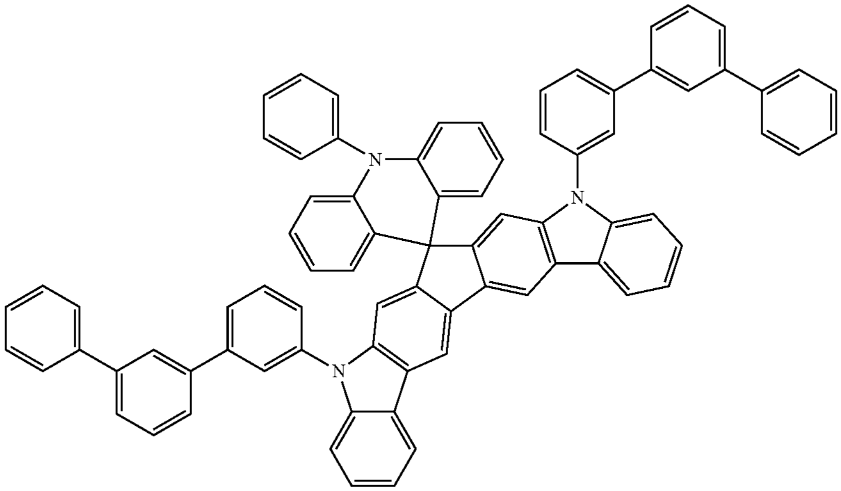
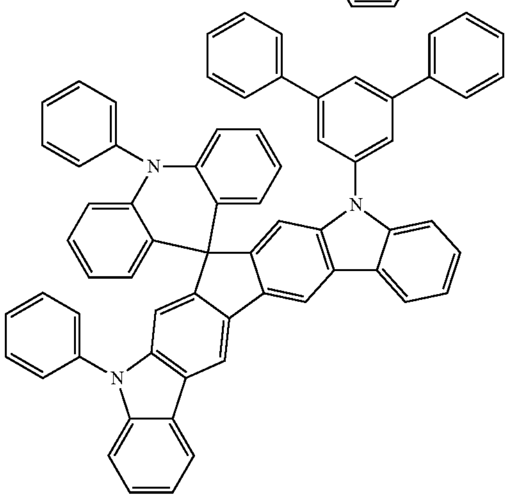
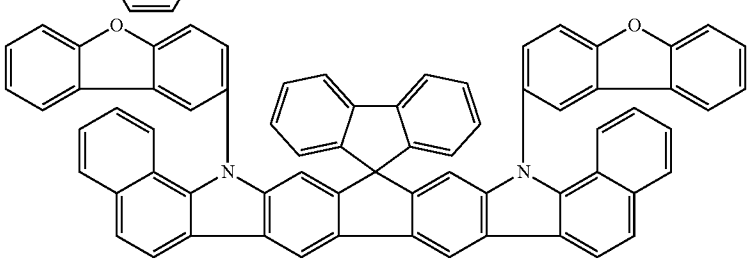
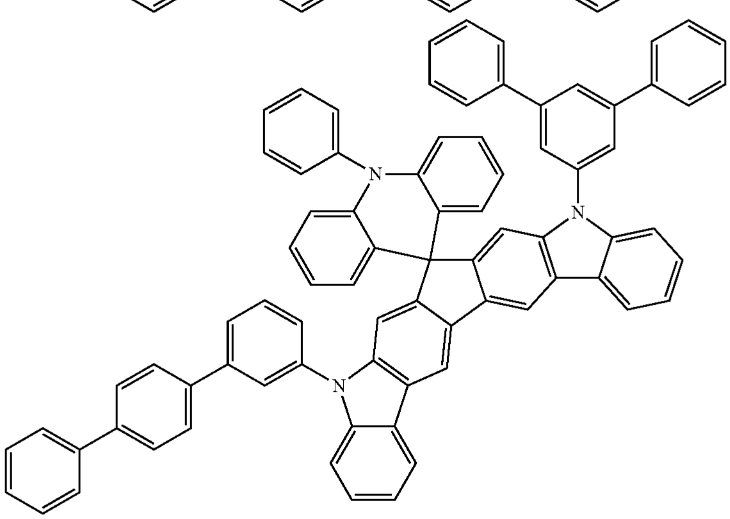

-continued
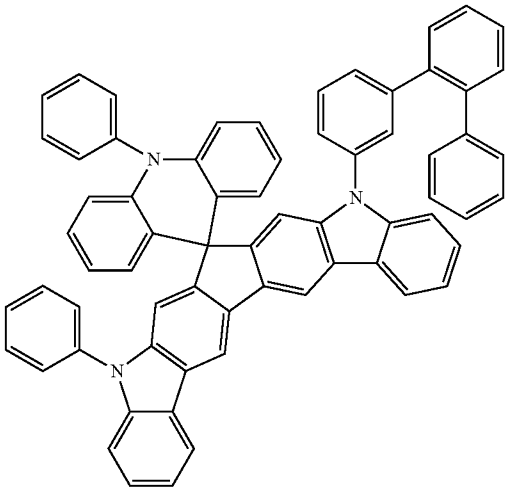
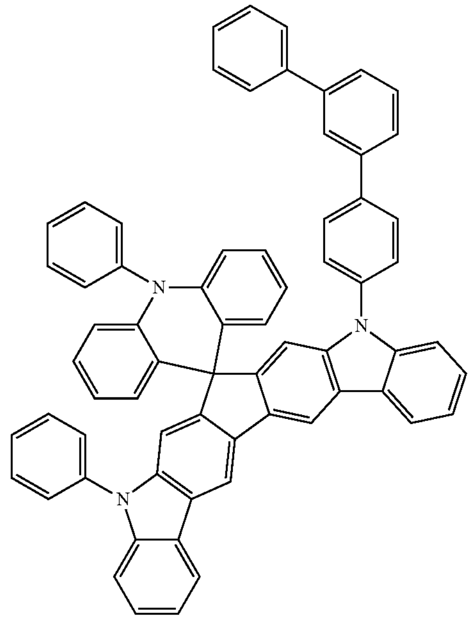
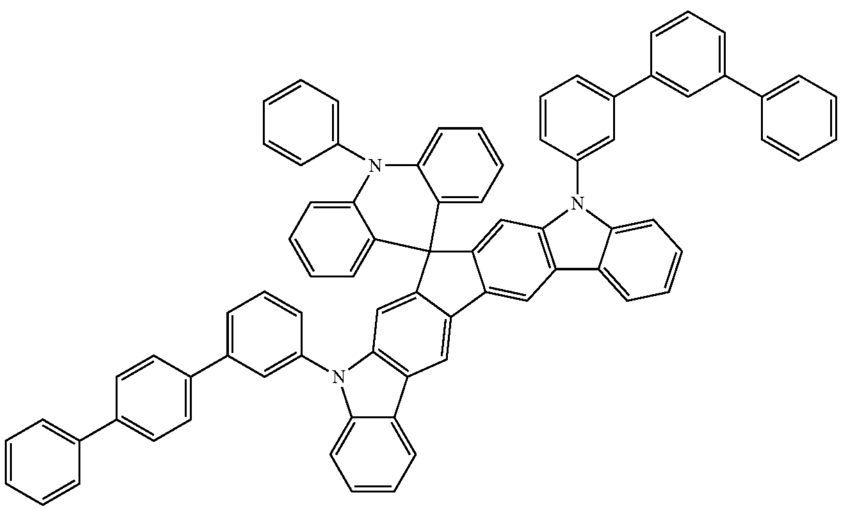
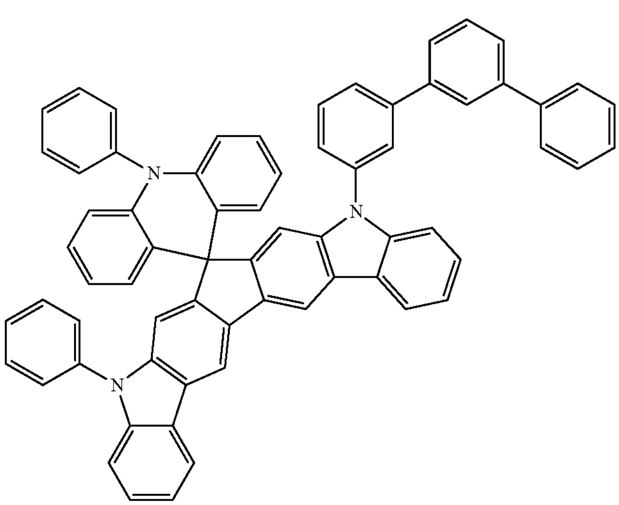
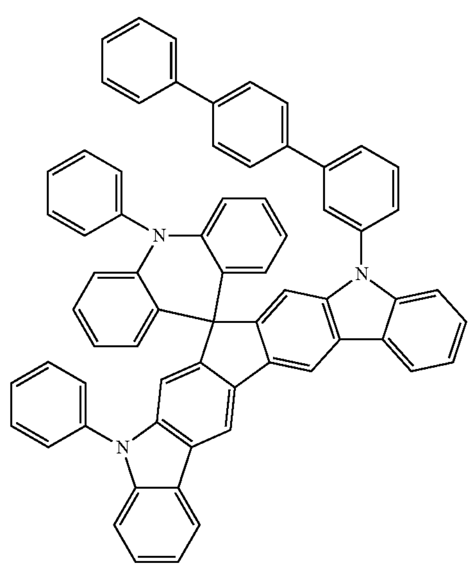

-continued
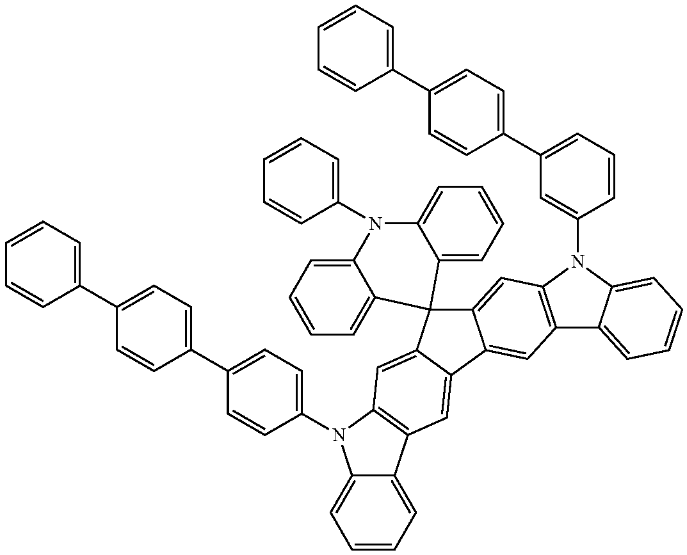
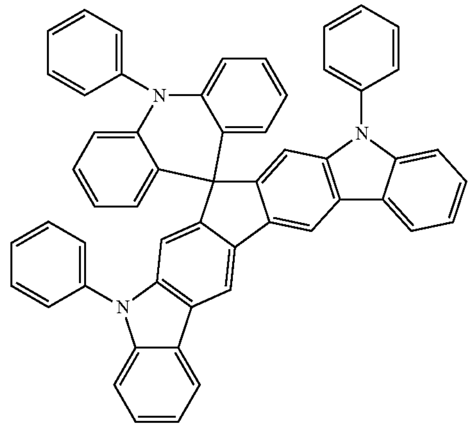
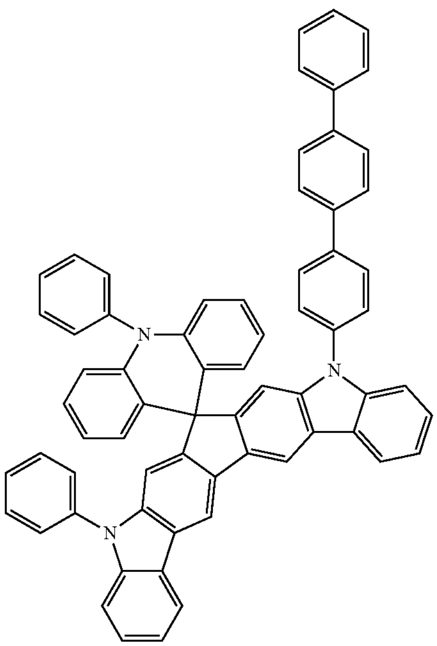
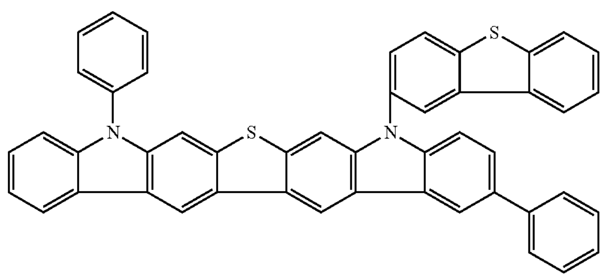
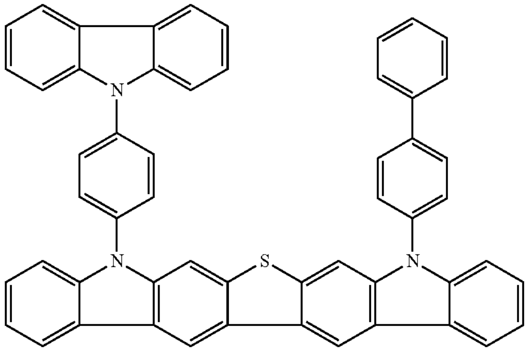
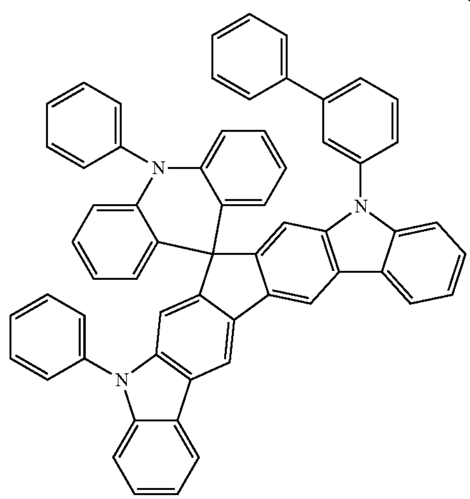

-continued
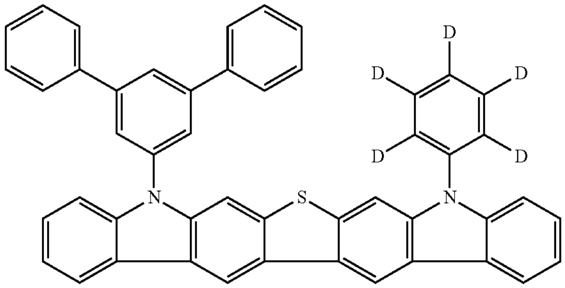
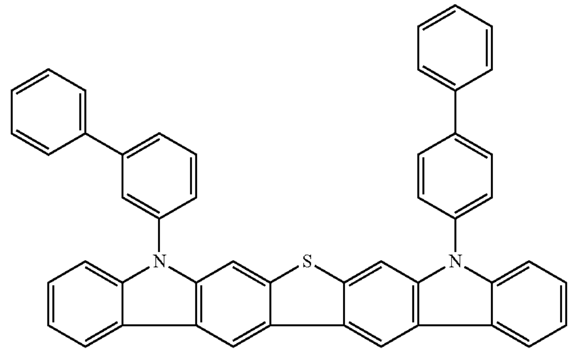
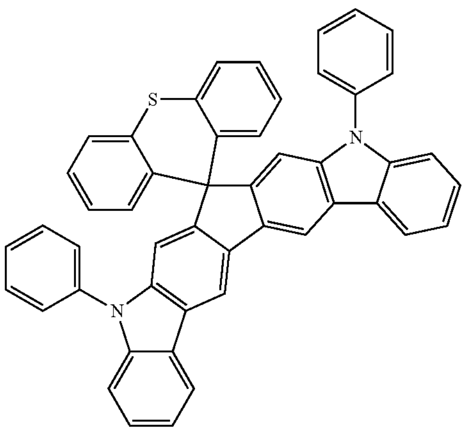
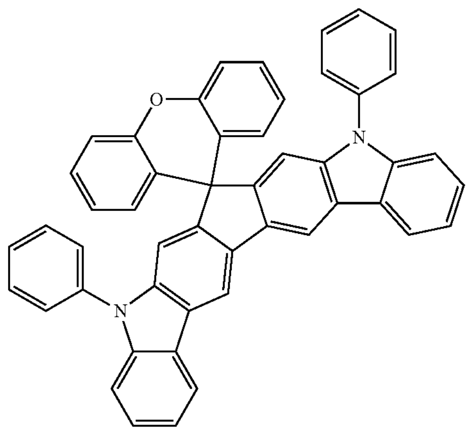
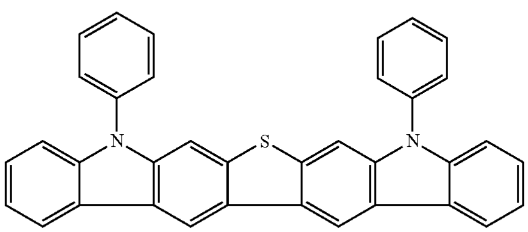
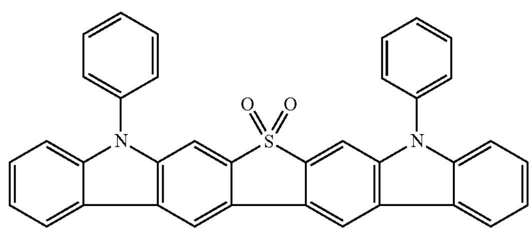
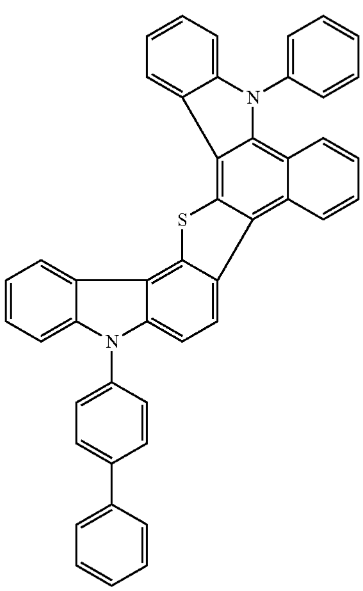
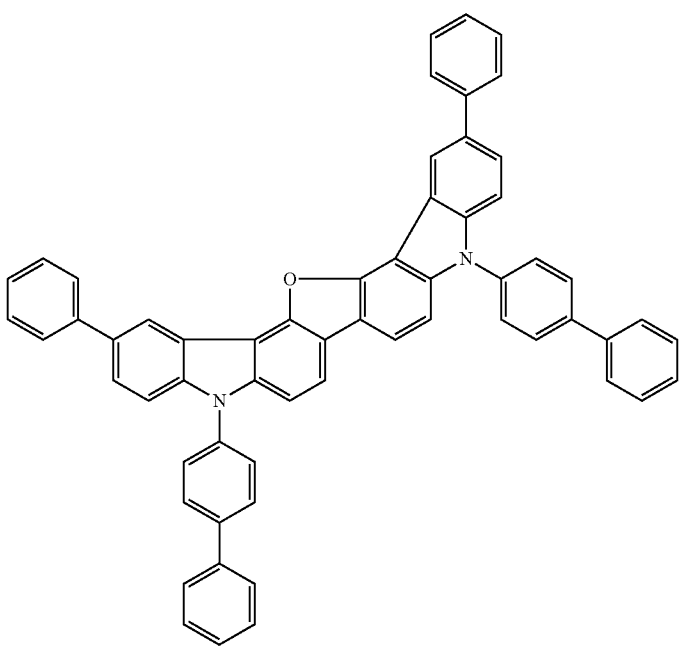

-continued
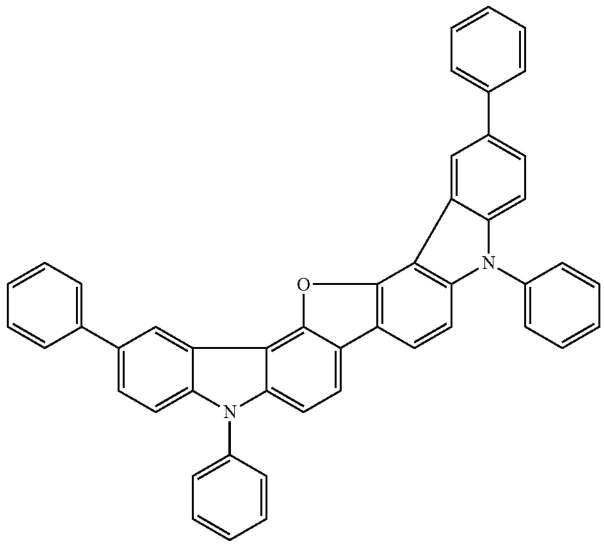
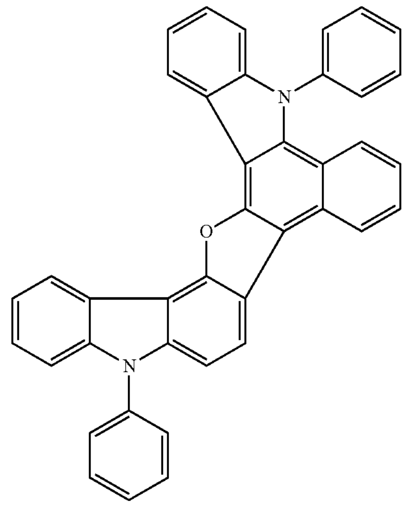
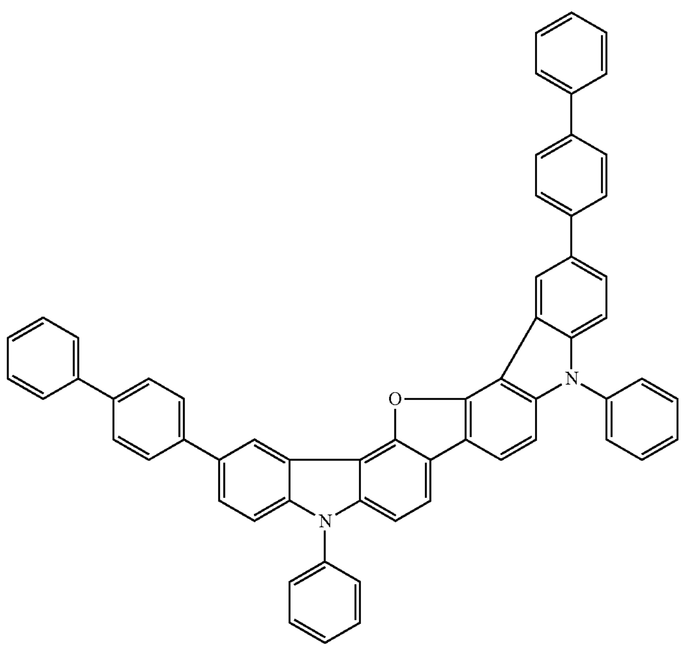
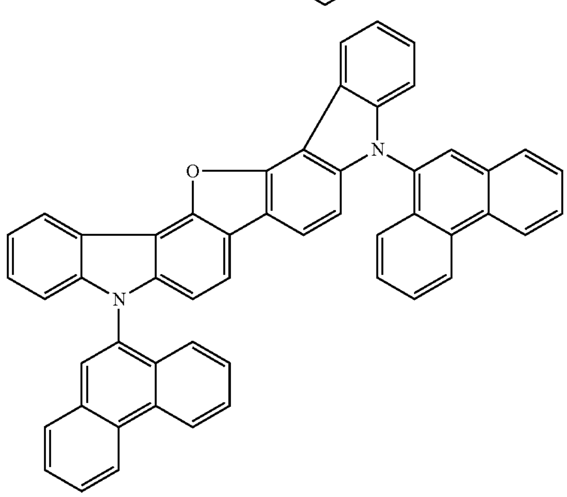
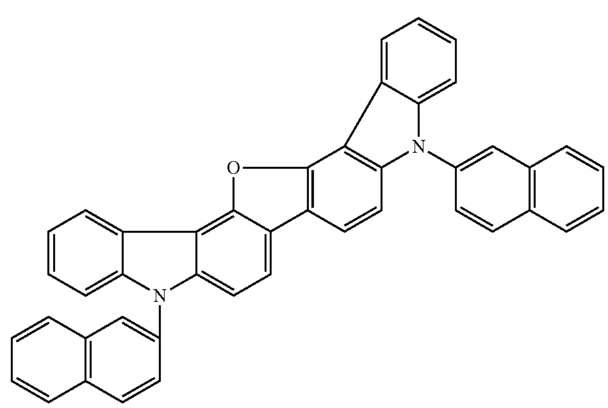

-continued
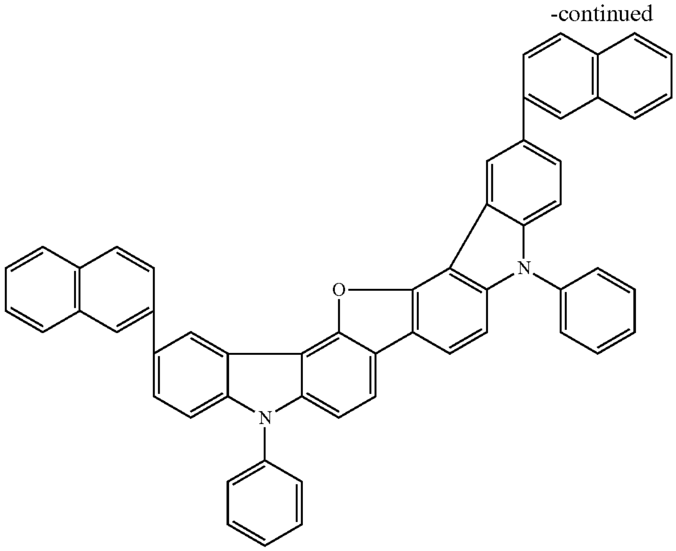
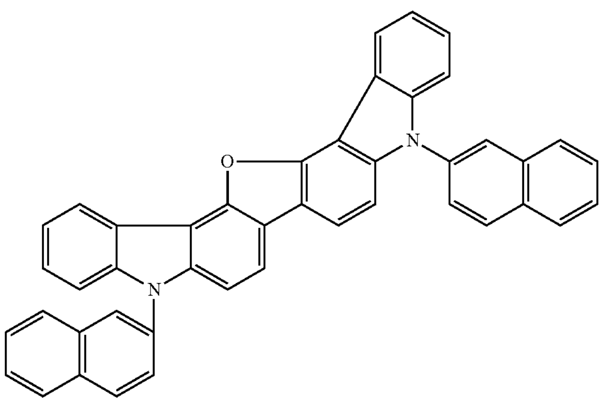
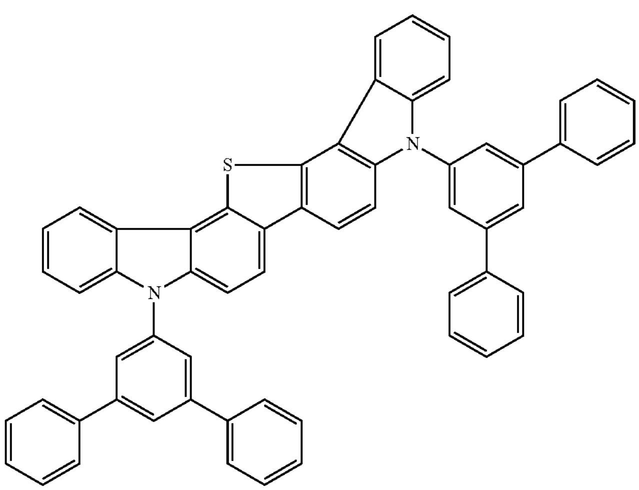

-continued
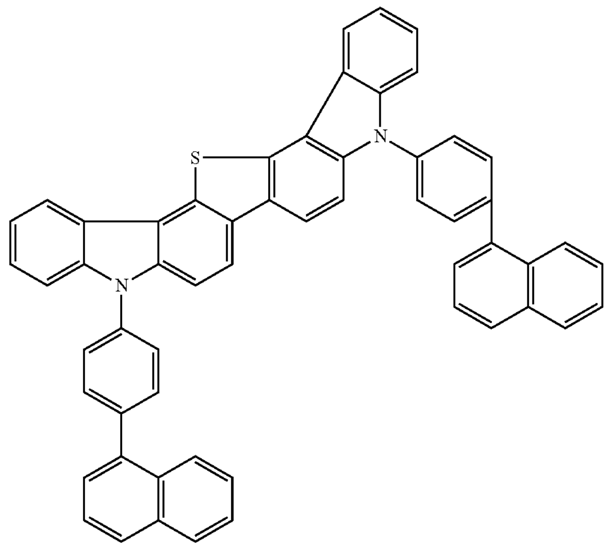
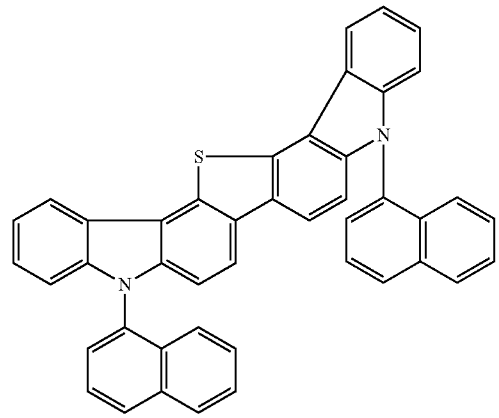
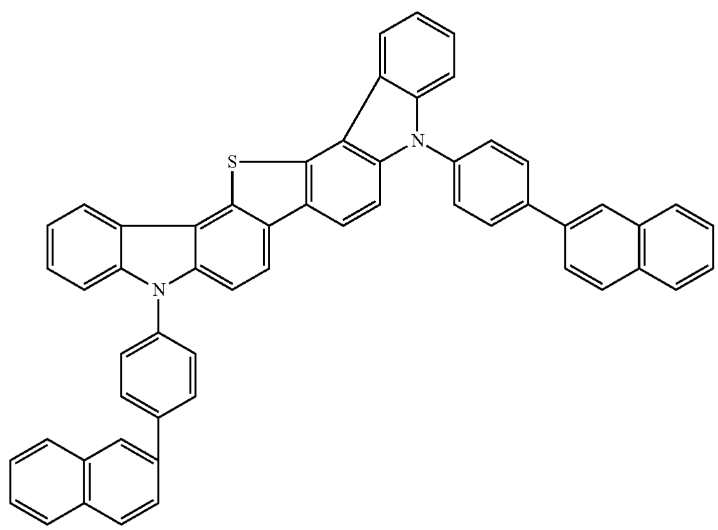
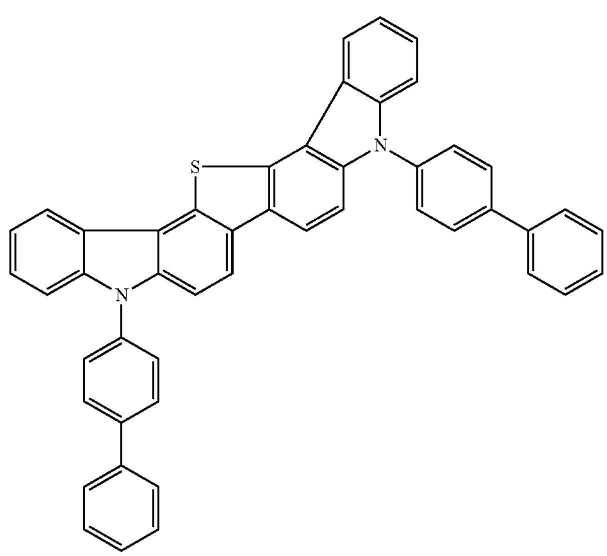

-continued
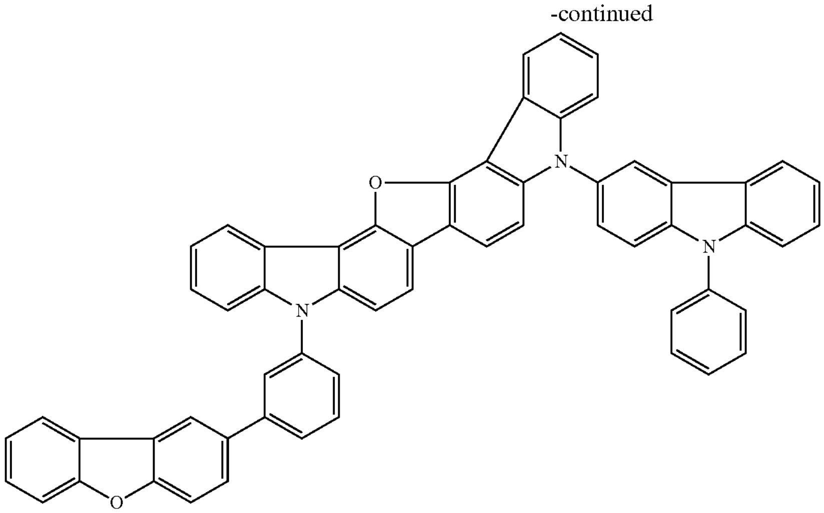
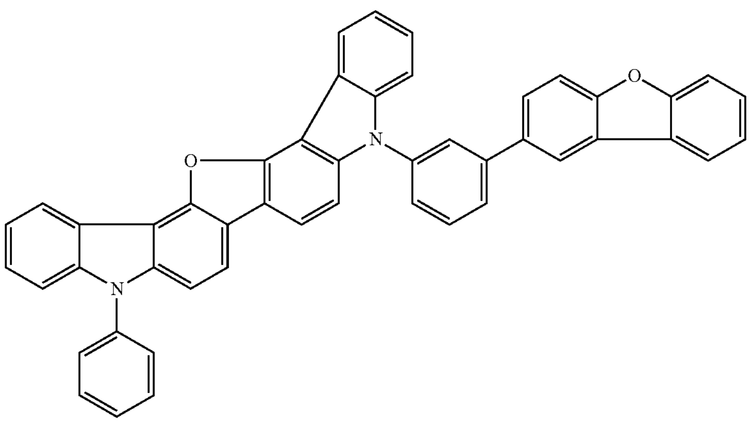
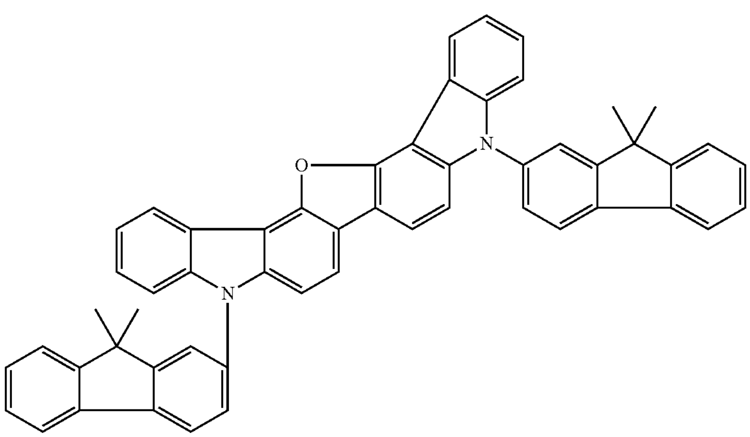

-continued
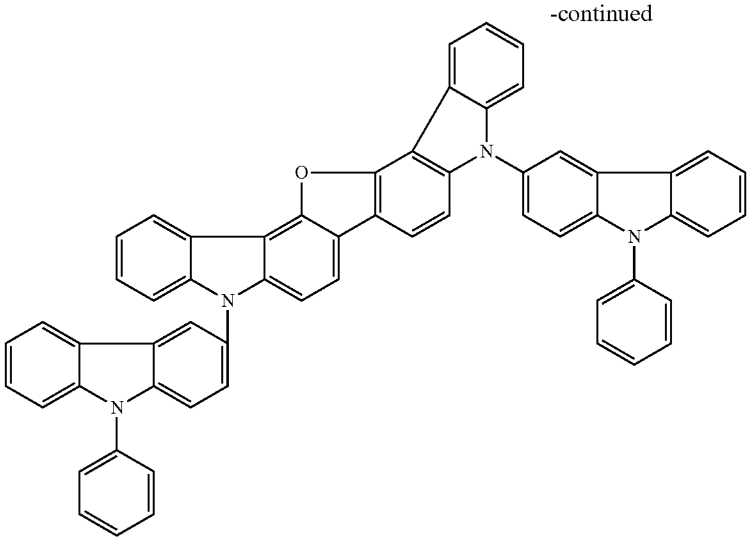
Examples of biscarbazole derivatives which can be employed as hole-transporting matrix materials:
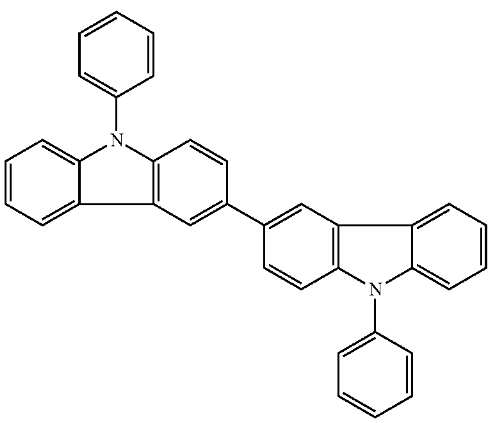
-continued
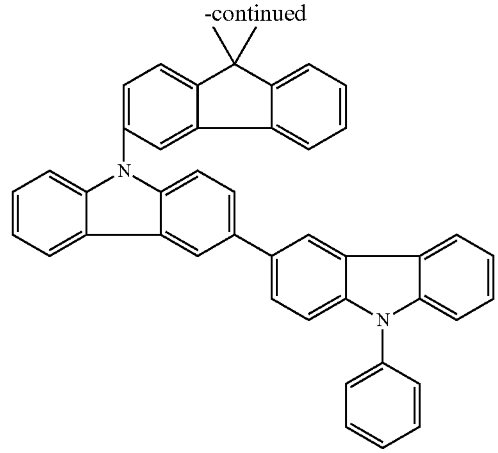
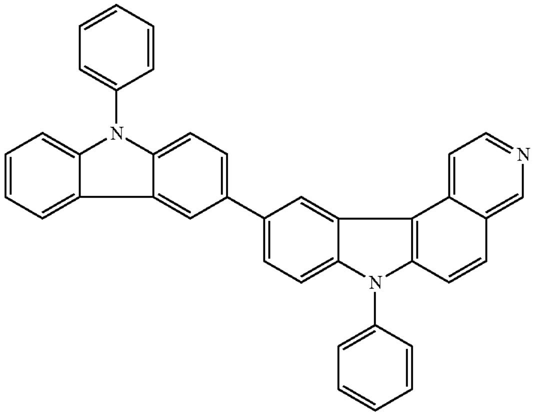
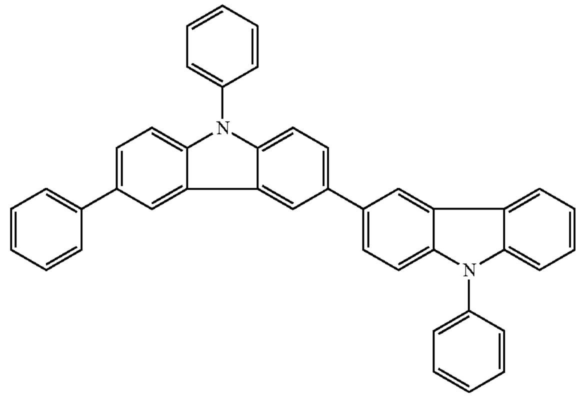

-continued
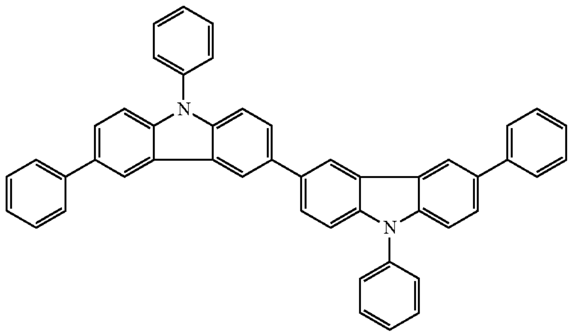
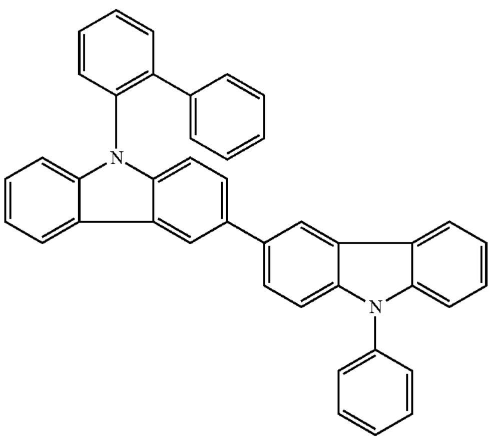
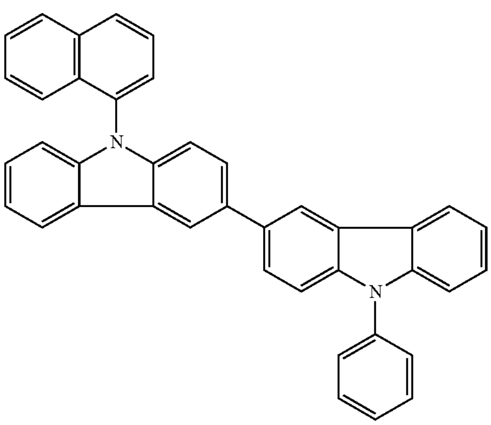
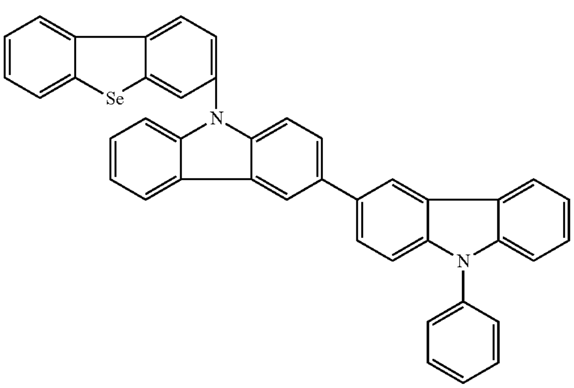
-continued
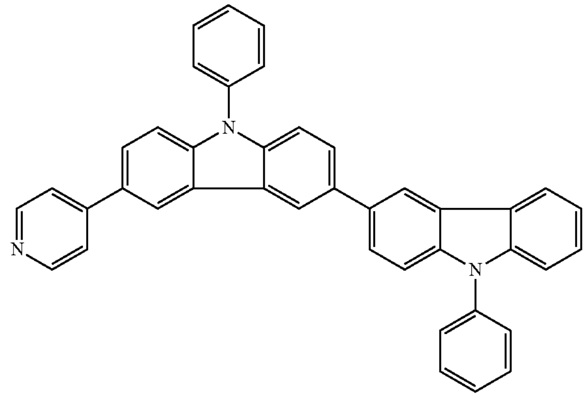
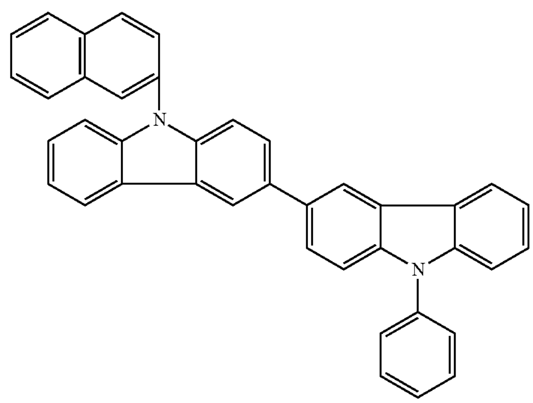
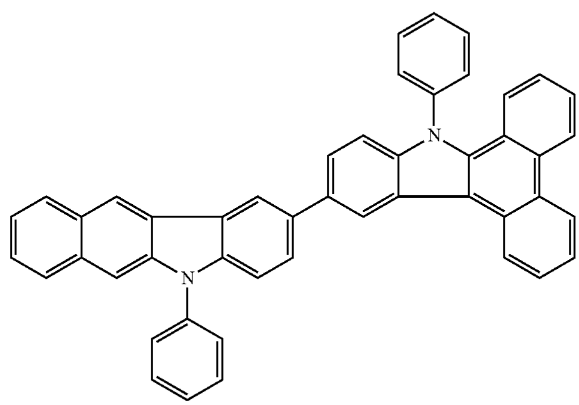
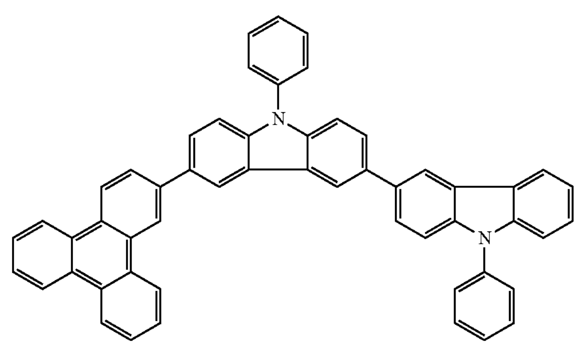

-continued
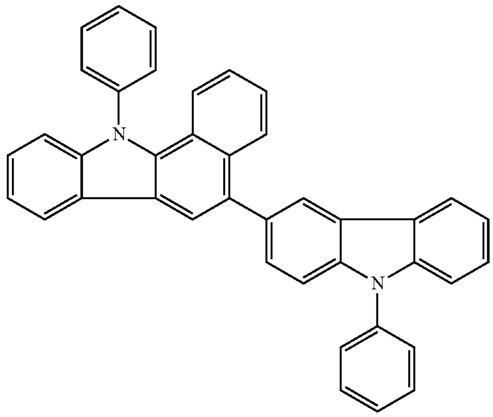
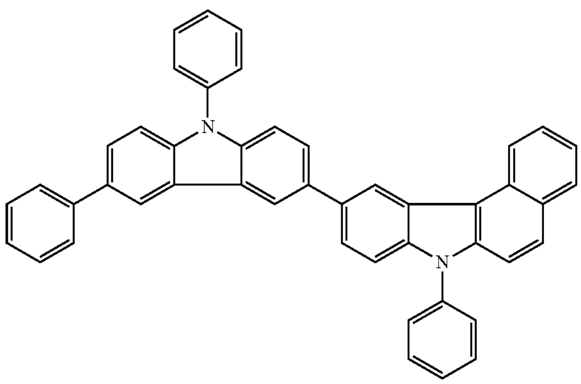
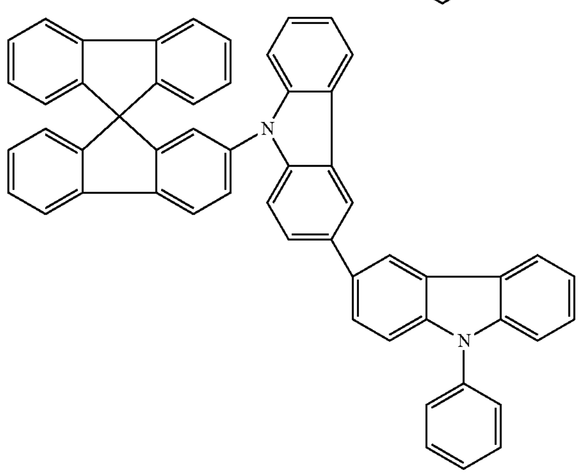
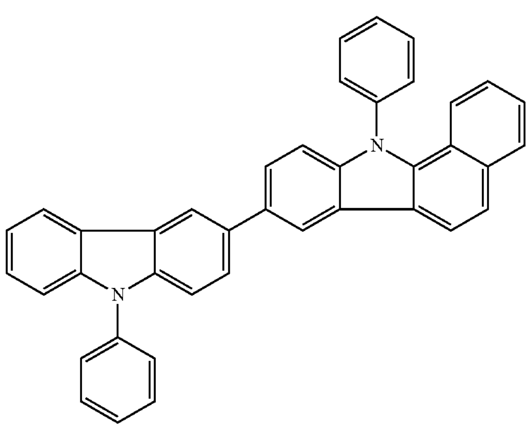
-continued
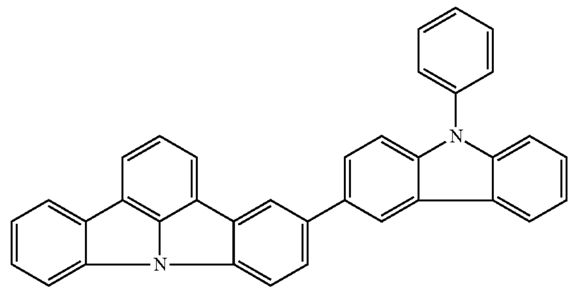
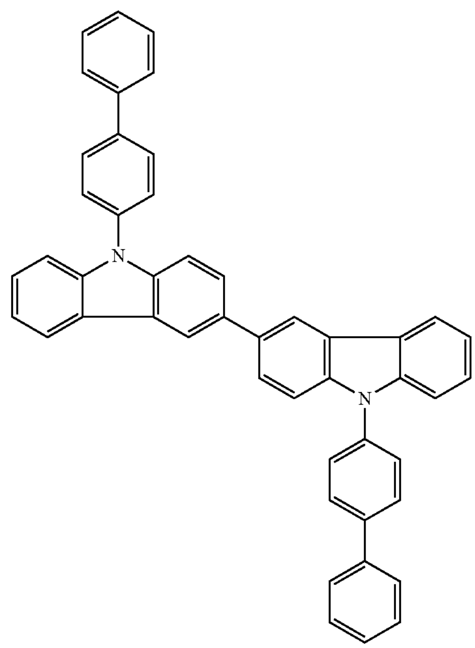
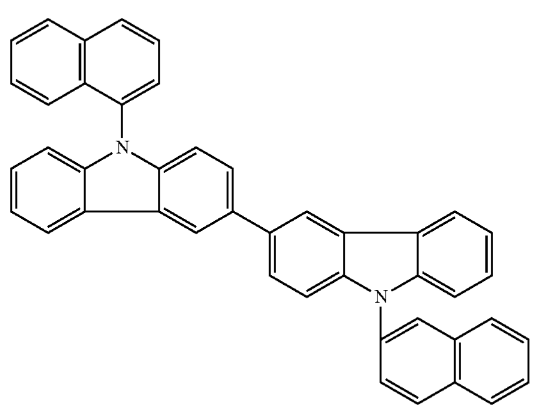

-continued
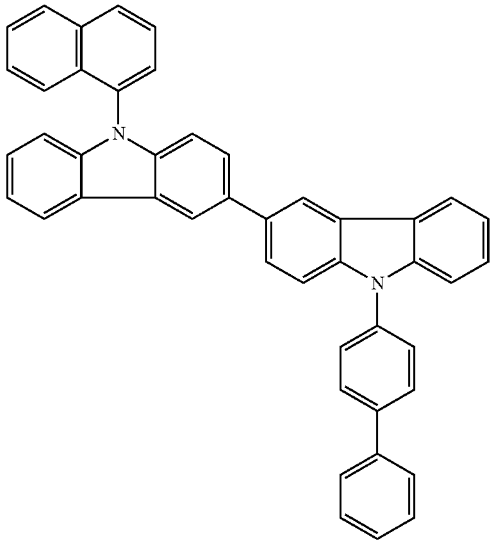
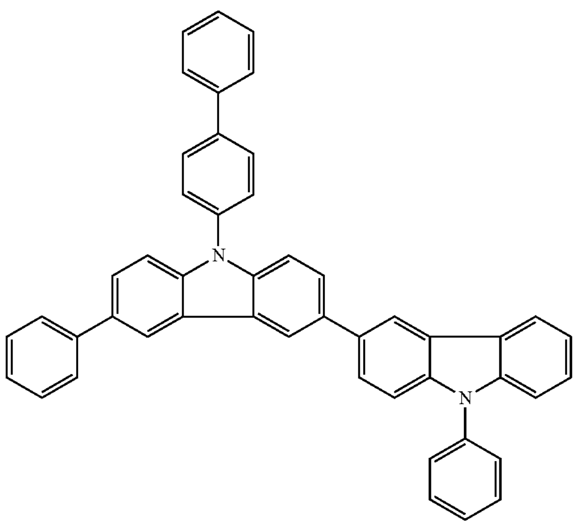
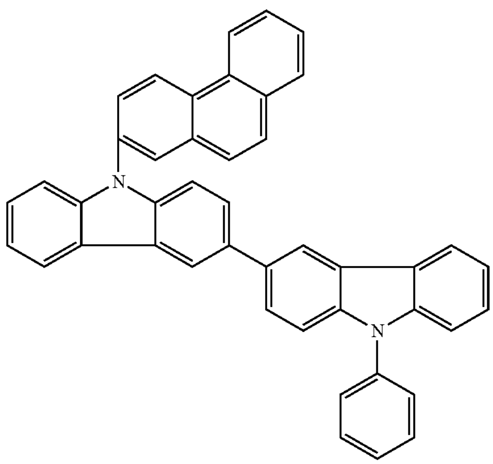
-continued
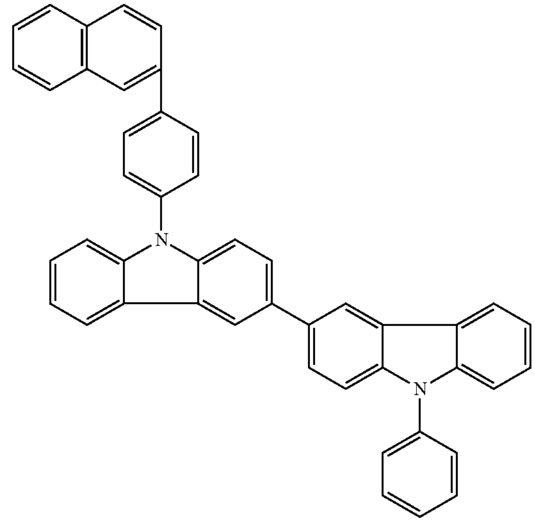
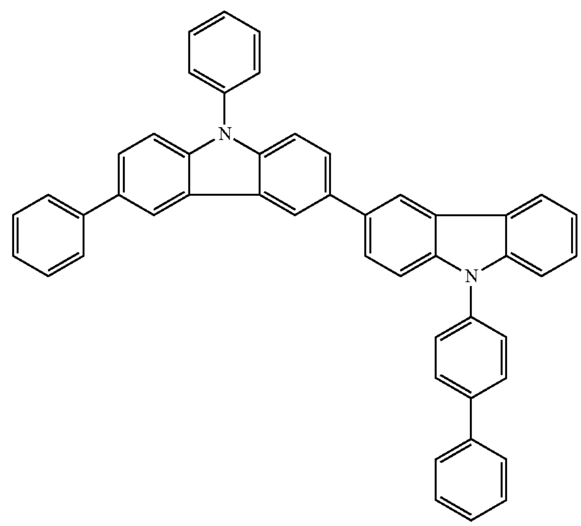
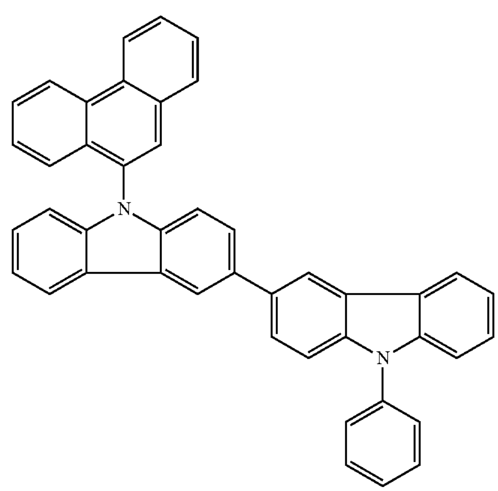

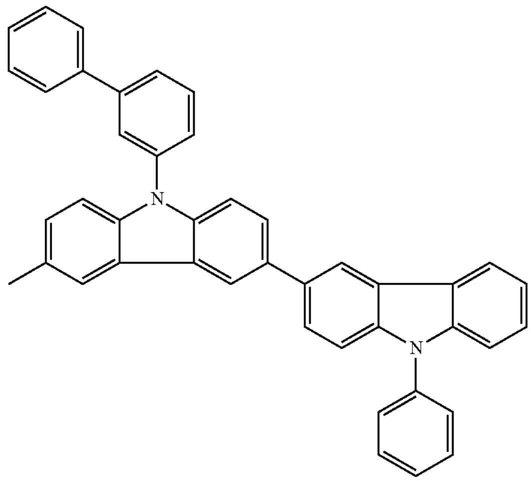
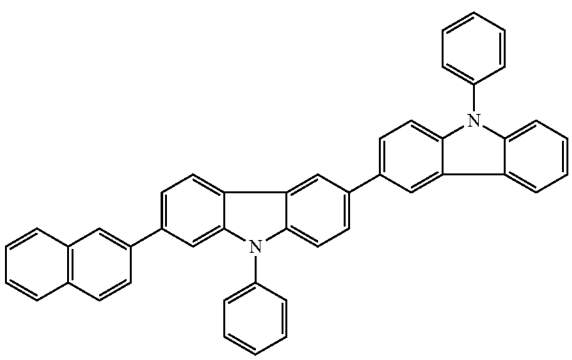
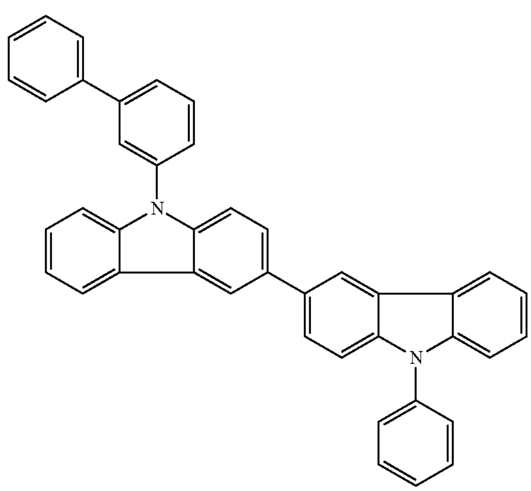
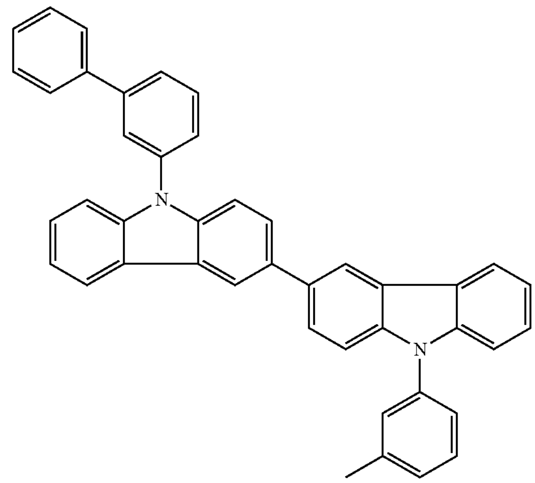
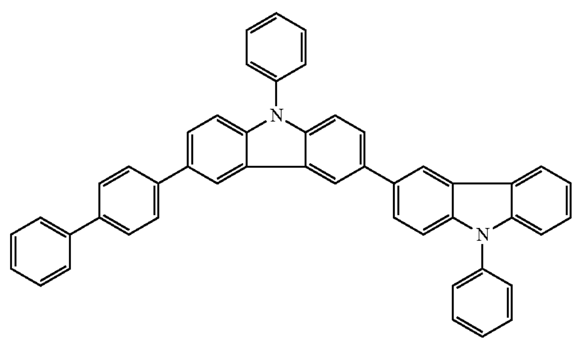
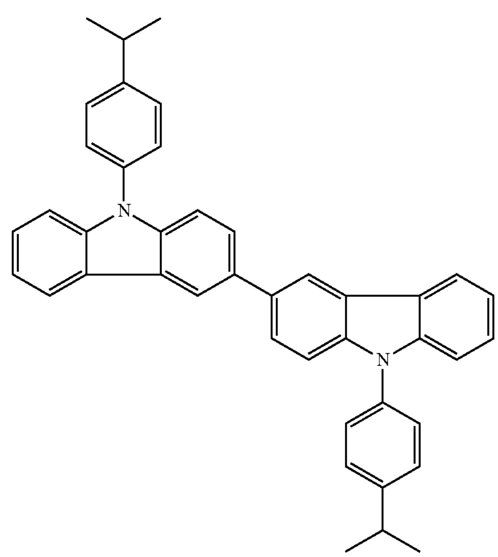

-continued
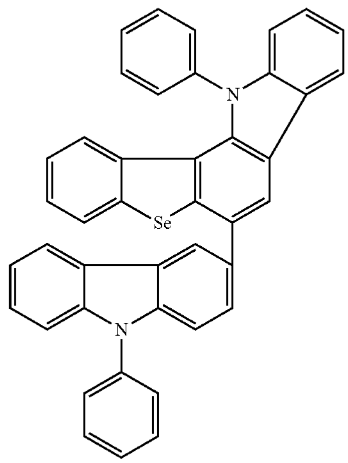
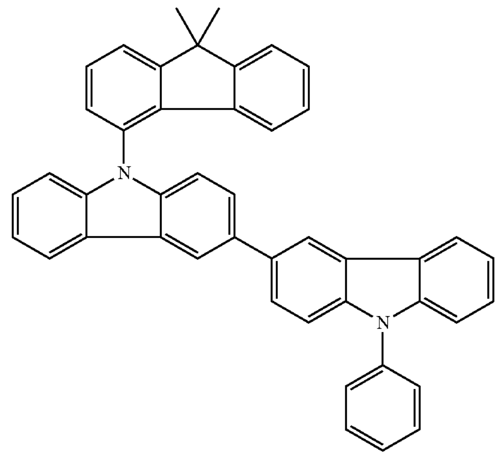
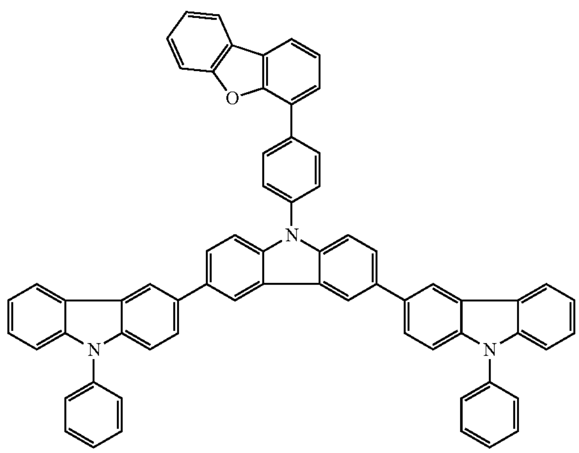
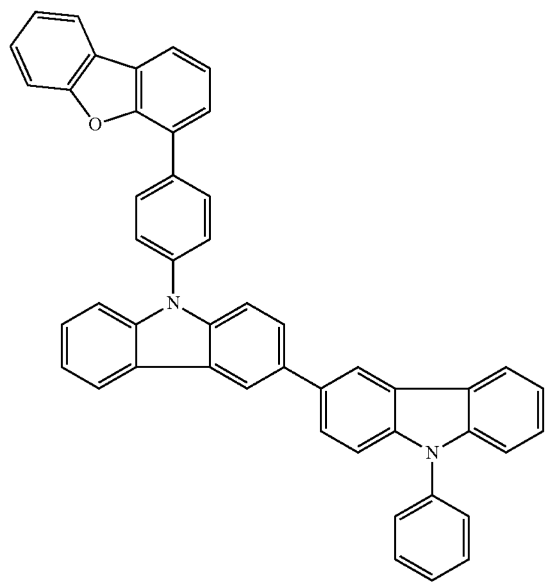
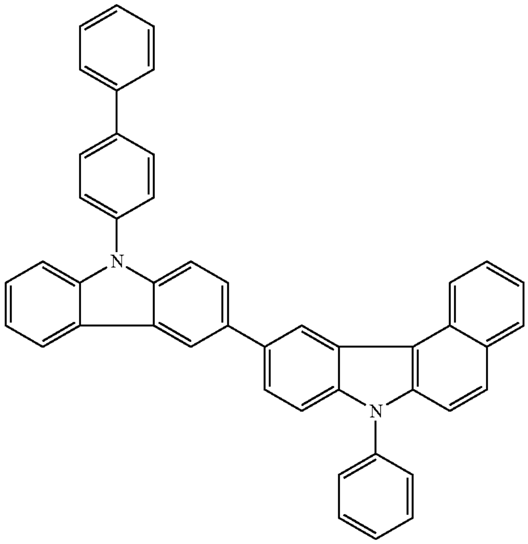
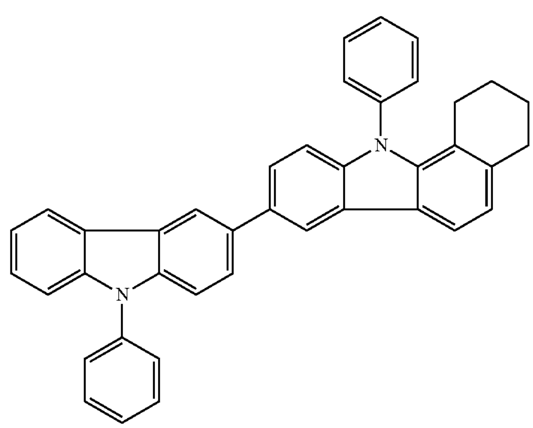

-continued
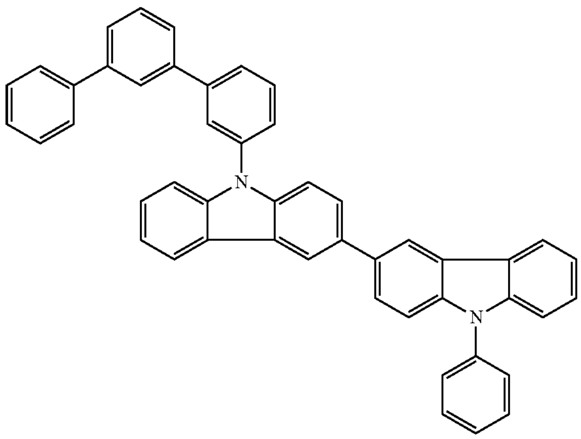
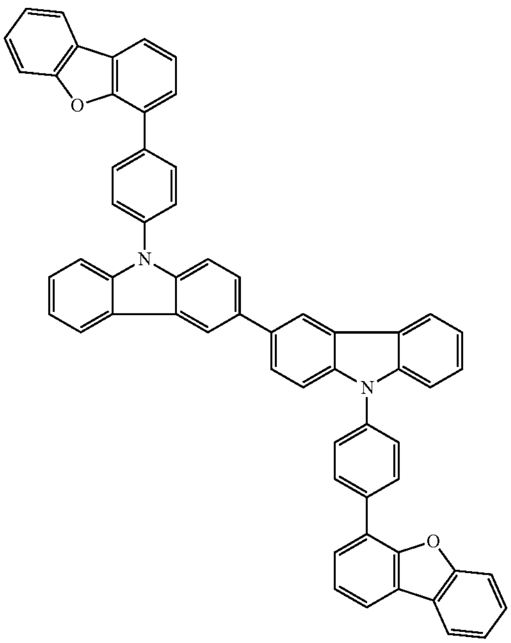
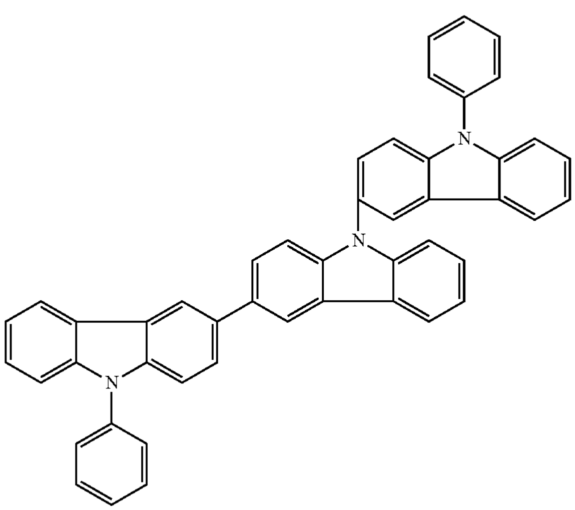
-continued
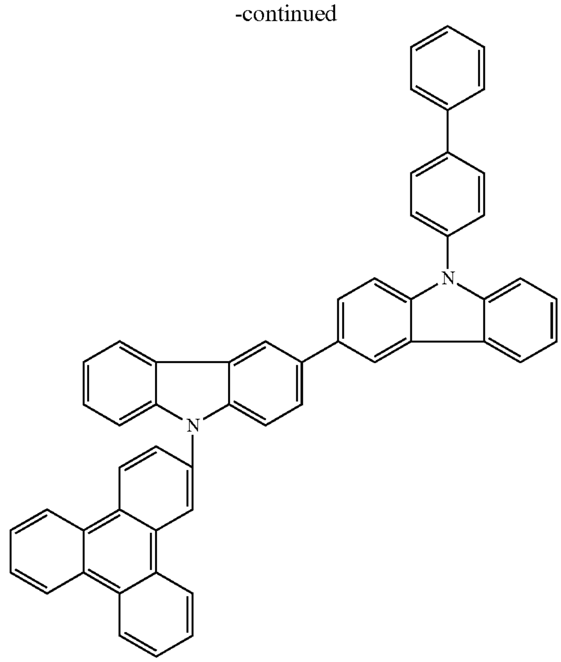
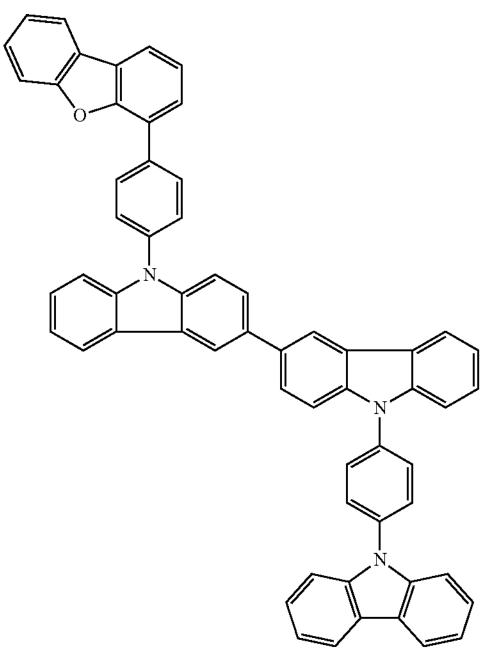

-continued
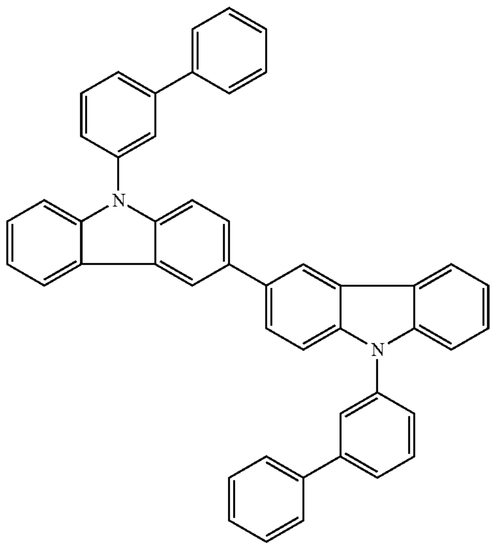
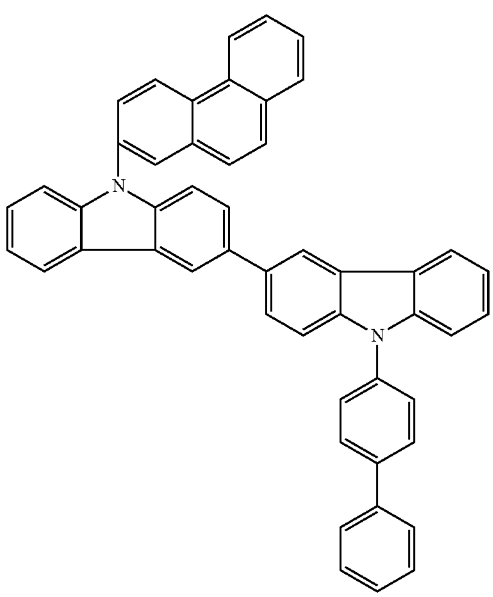
-continued
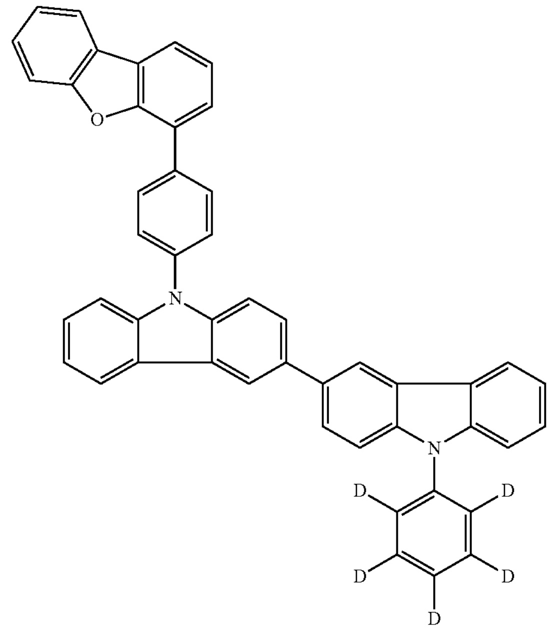
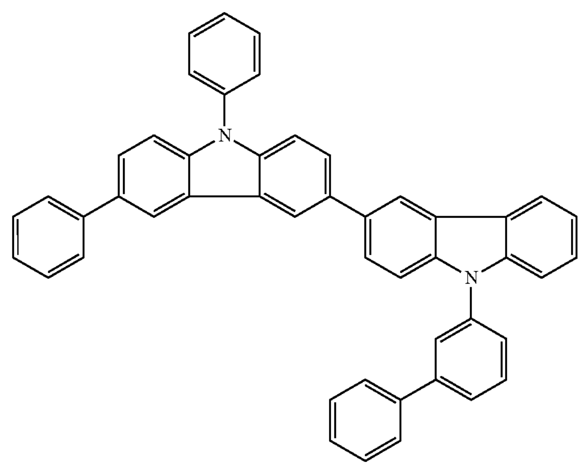
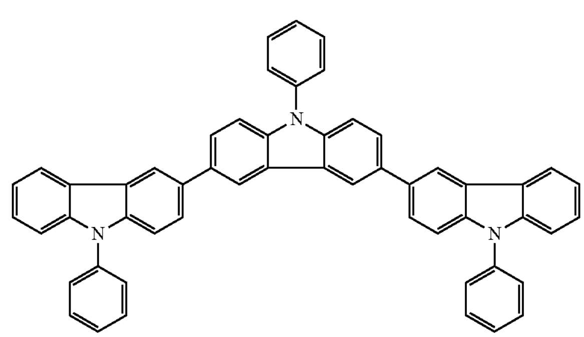

-continued
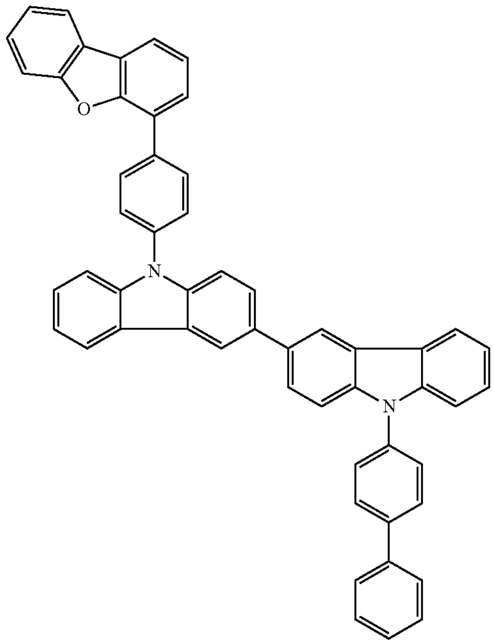
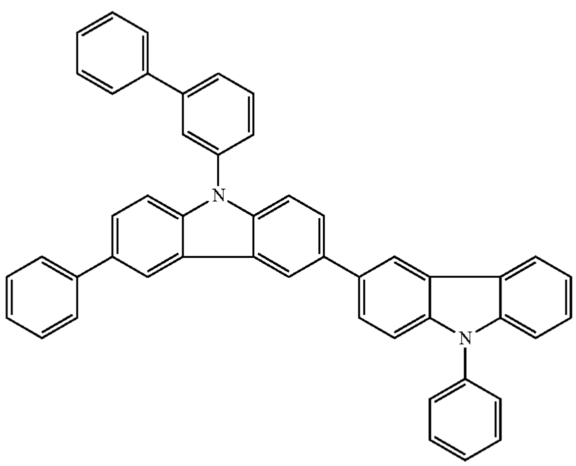
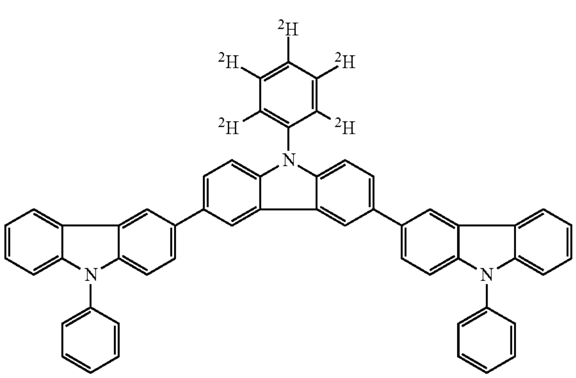
-continued
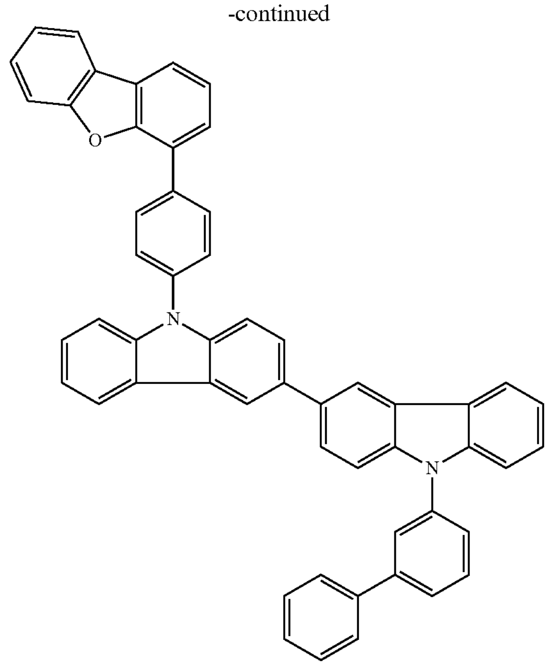
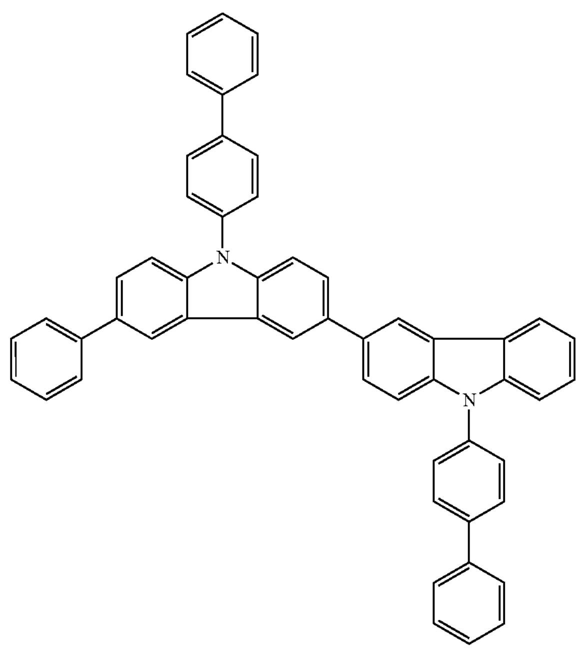

-continued
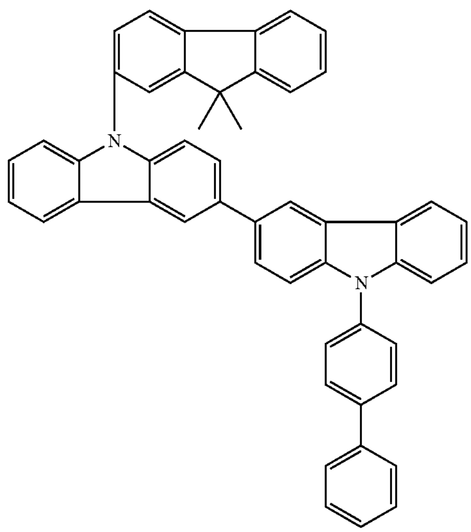
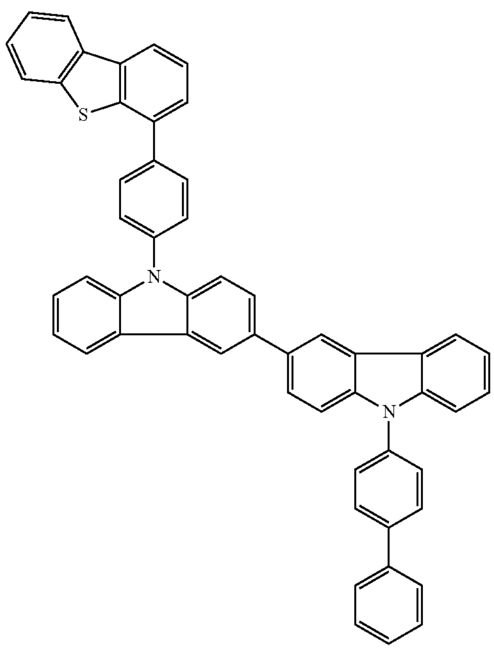
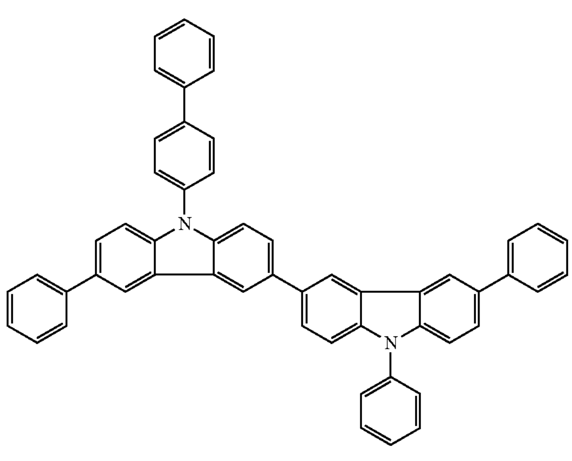
-continued
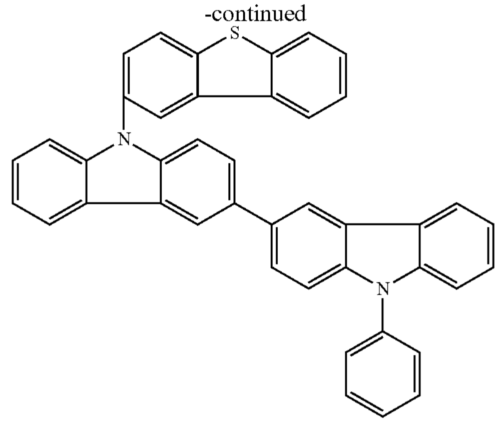
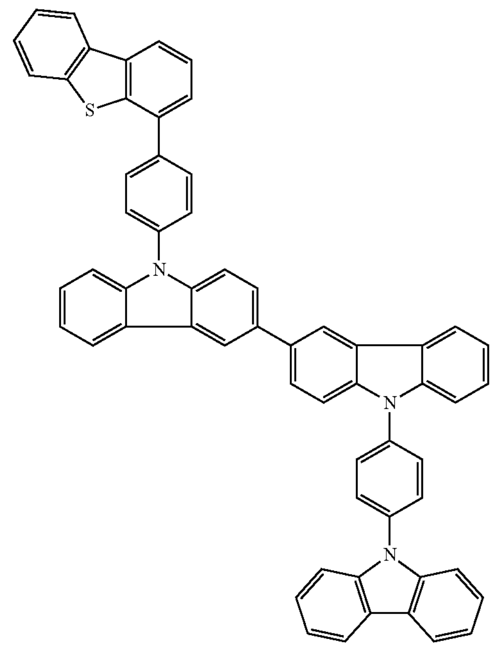
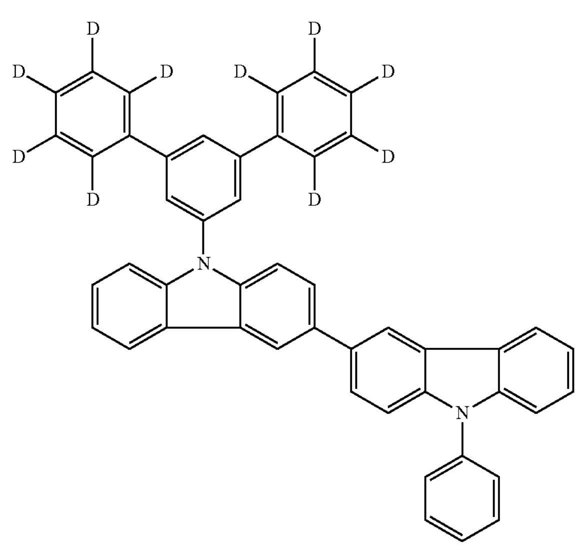

-continued
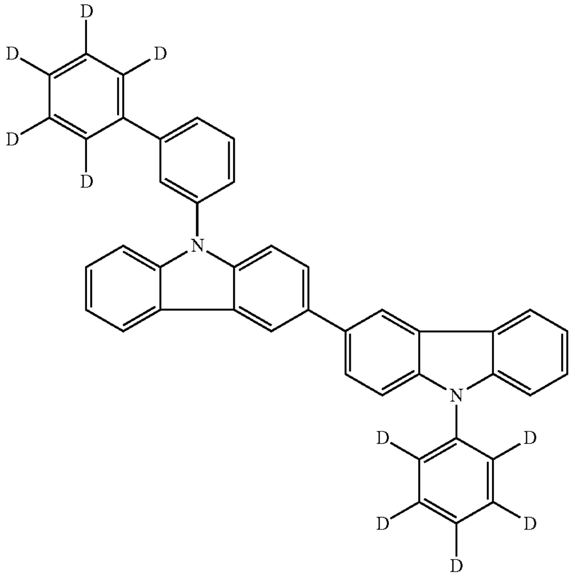
-continued
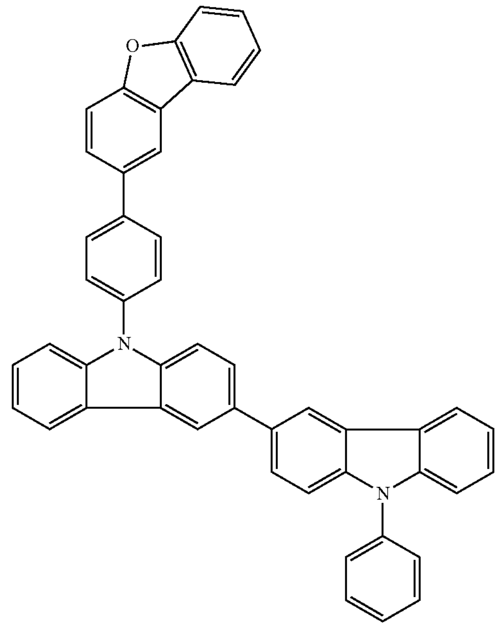
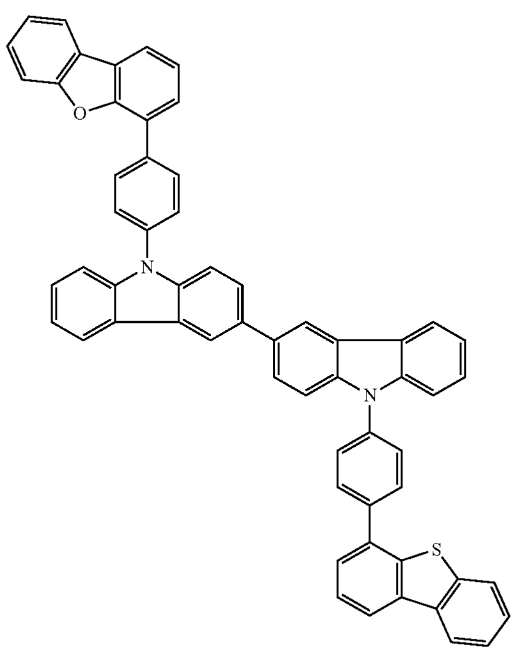
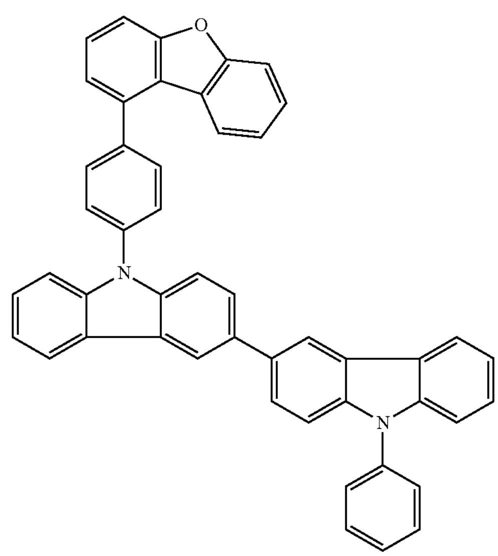

-continued
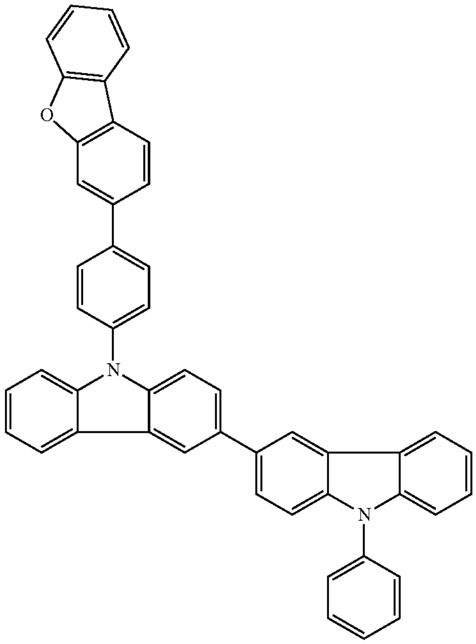
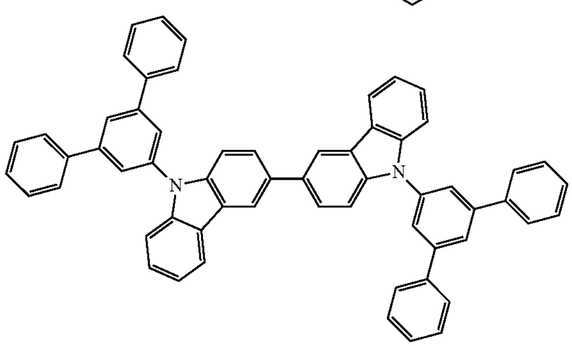
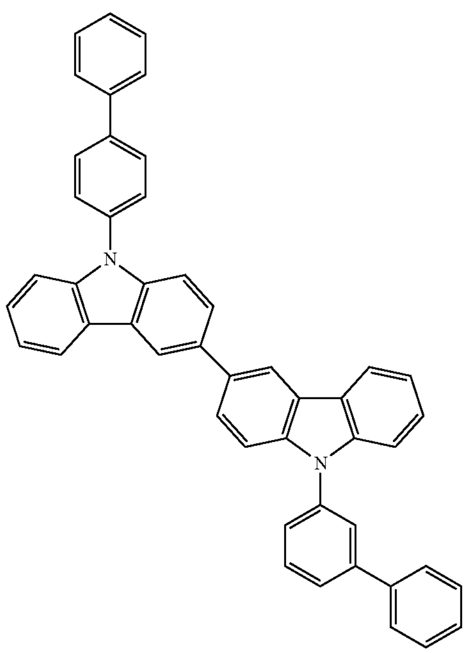
-continued
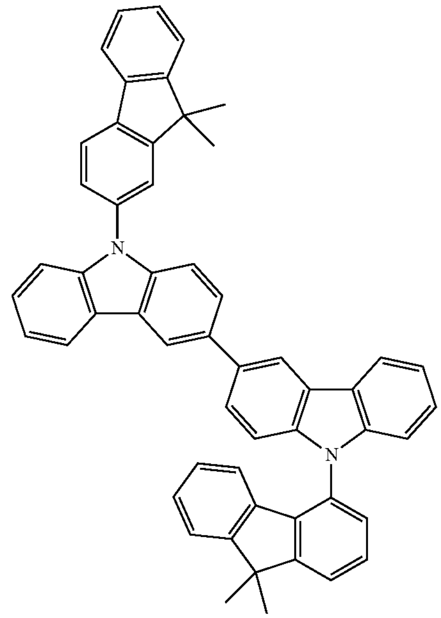 [SMILES: CC1(C)c2ccccc2-c2ccc(-n3c4ccccc4c4cc(-c5ccc6c(c5)c5ccccc5n6-c5cccc6c5-c5ccccc5C6(C)C)ccc43)cc21]
Examples of amines which can be employed as hole-transporting matrix materials:
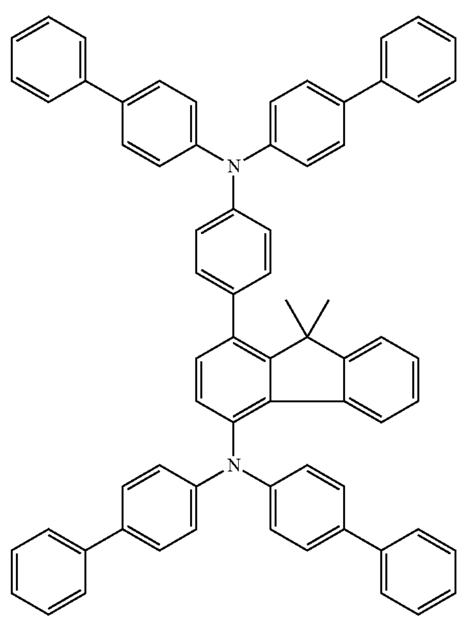

-continued
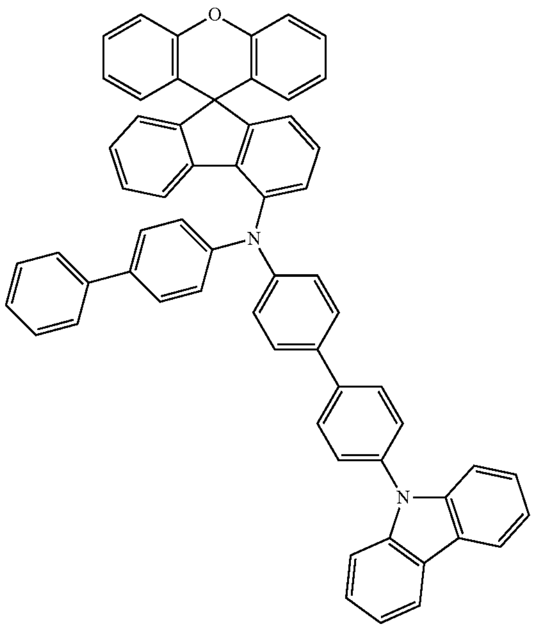
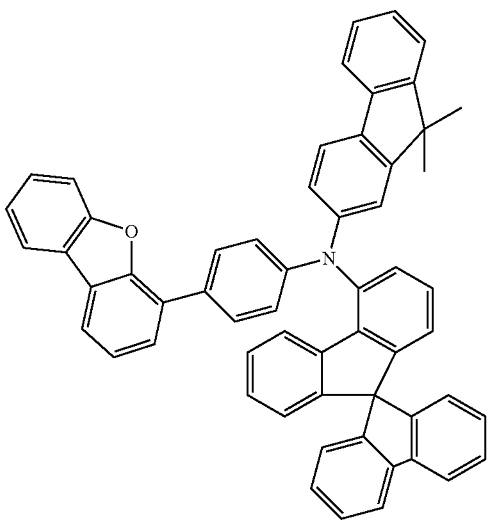
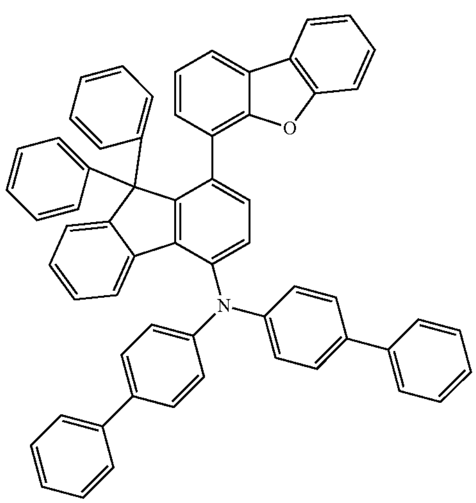
-continued
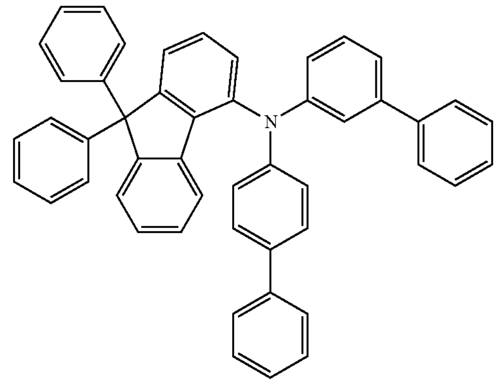
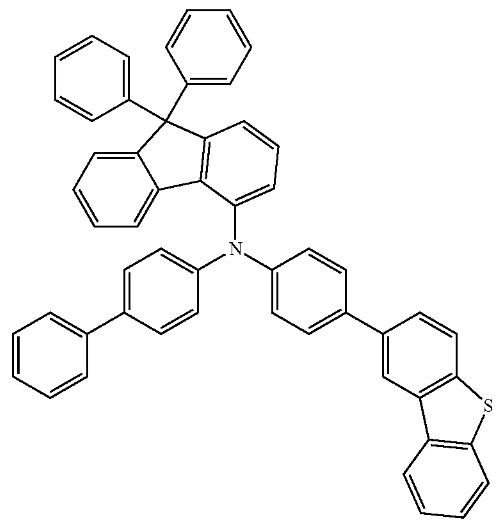
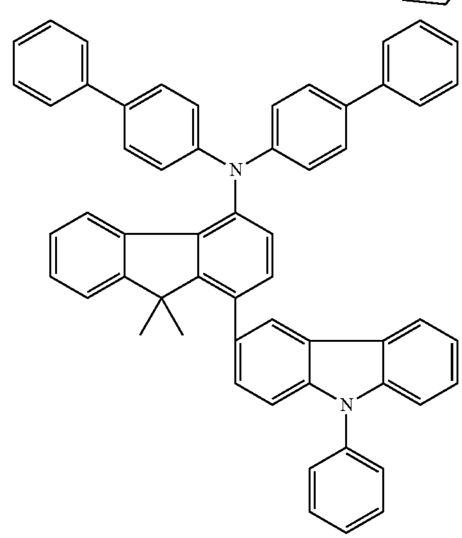
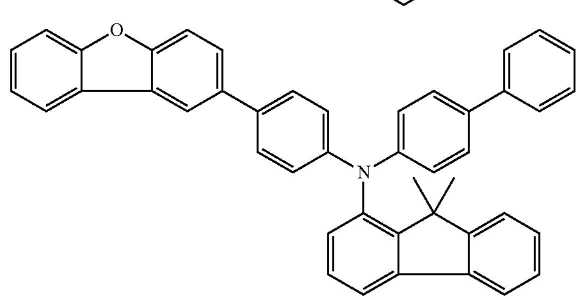

-continued
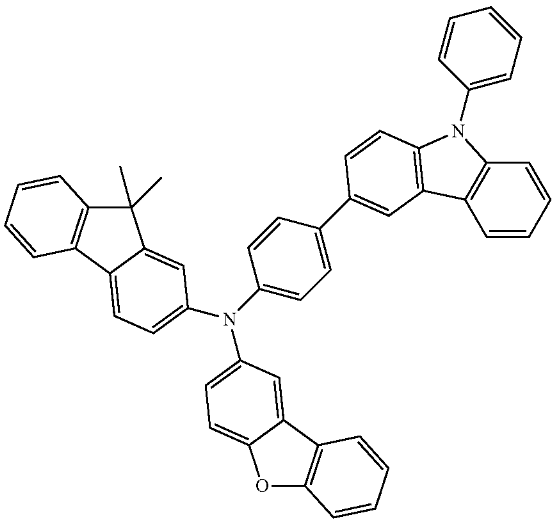
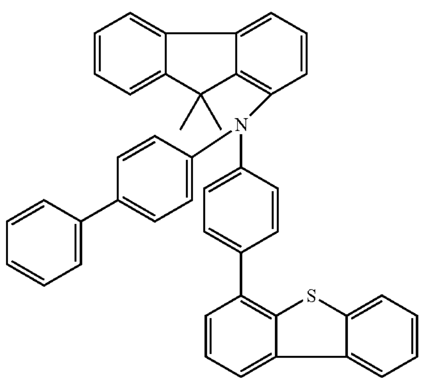
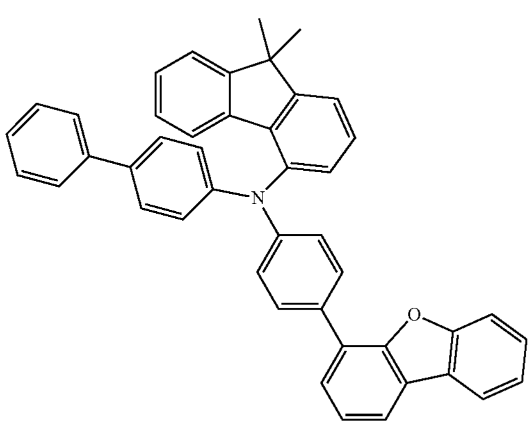
-continued
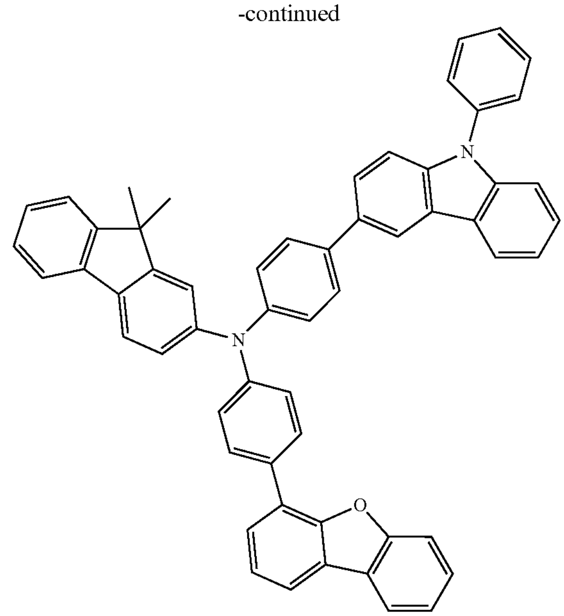
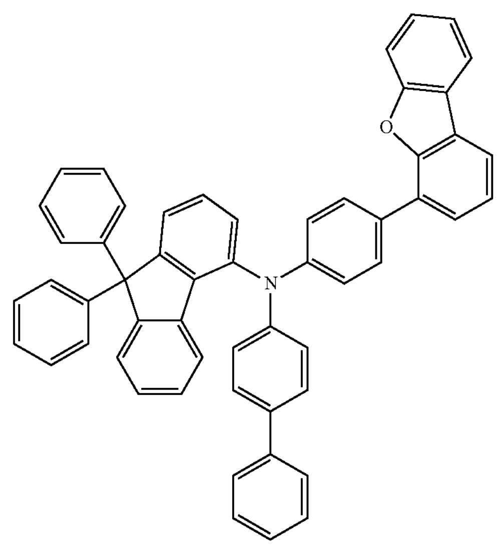
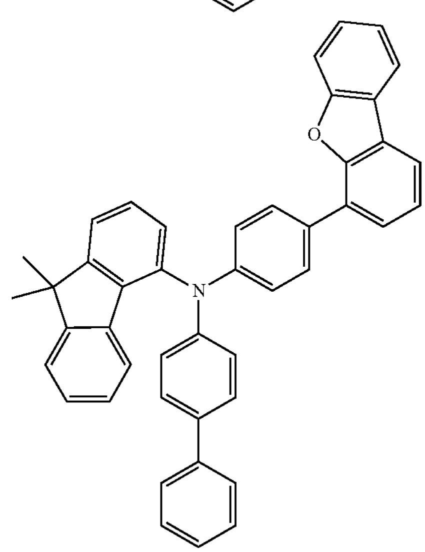

-continued
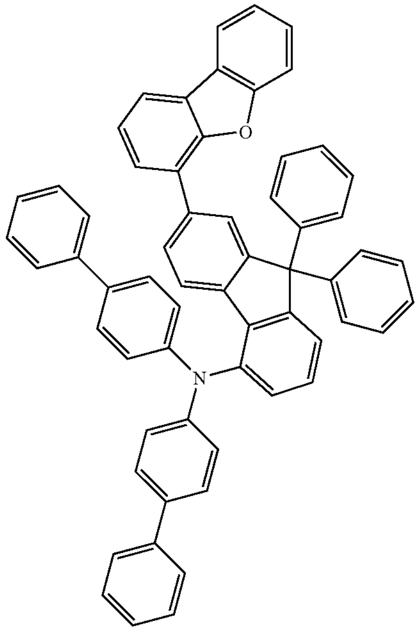
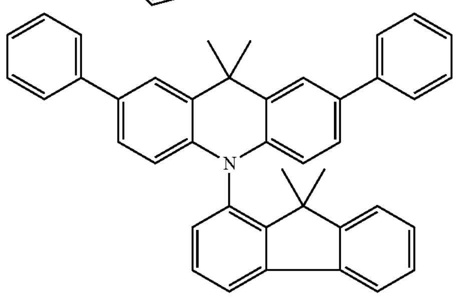
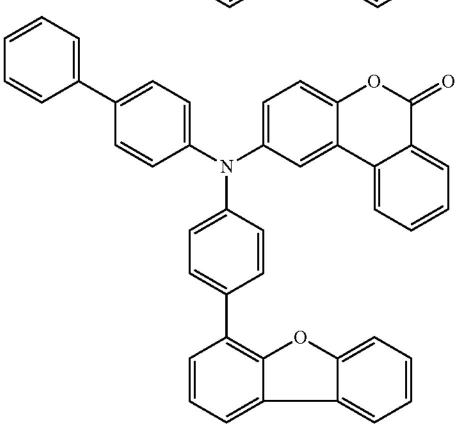
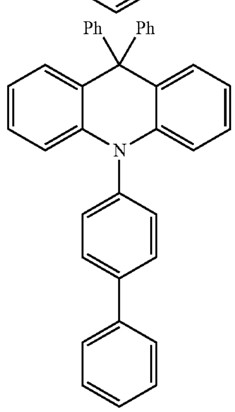
-continued
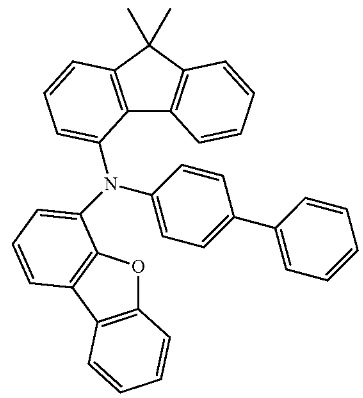
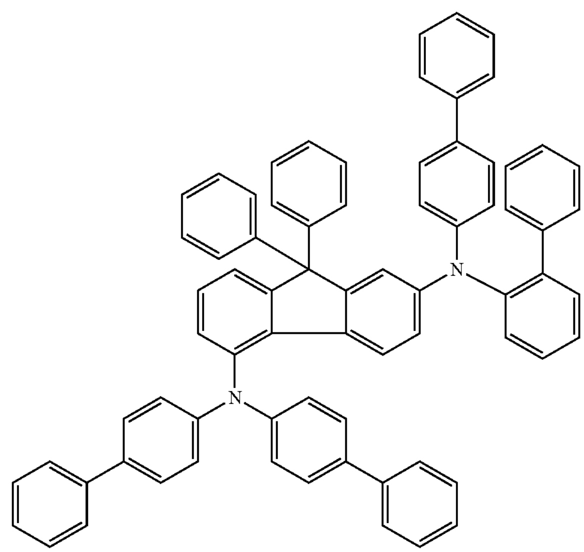
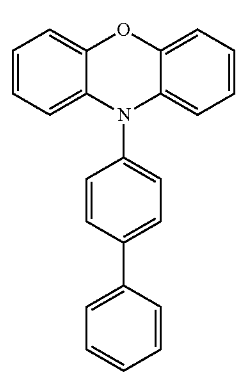

-continued
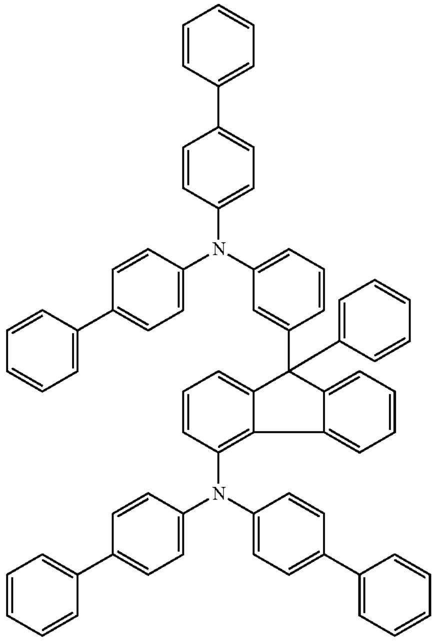
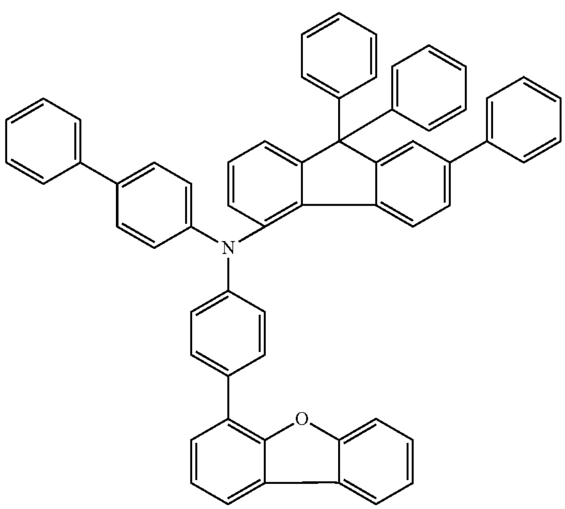
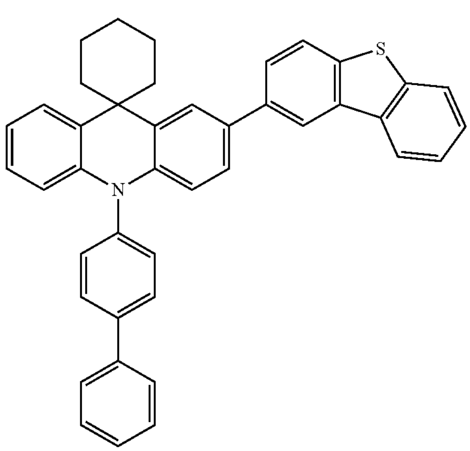
-continued
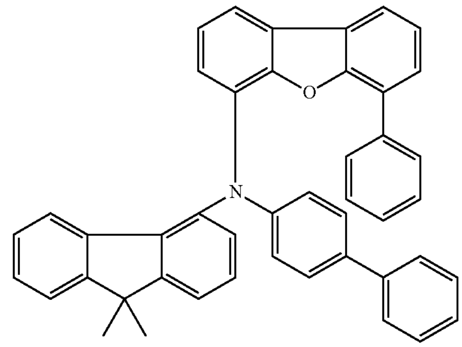
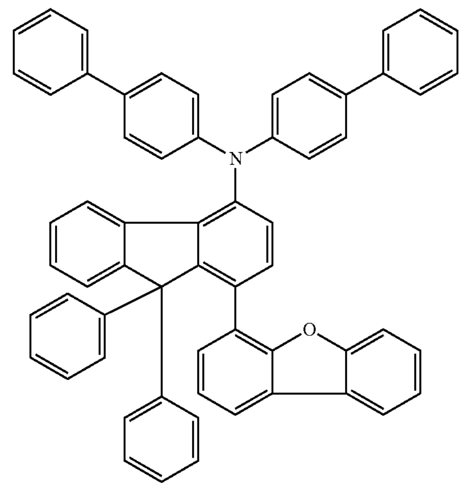
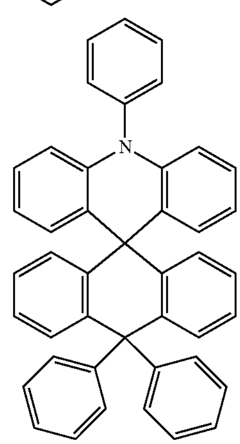
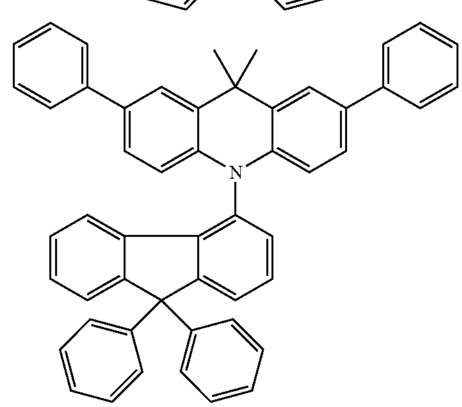

-continued
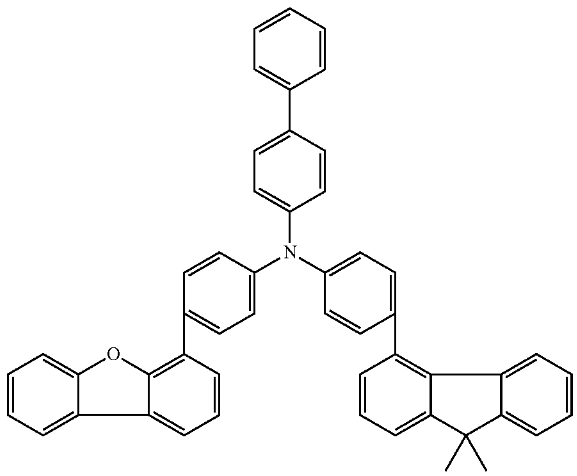
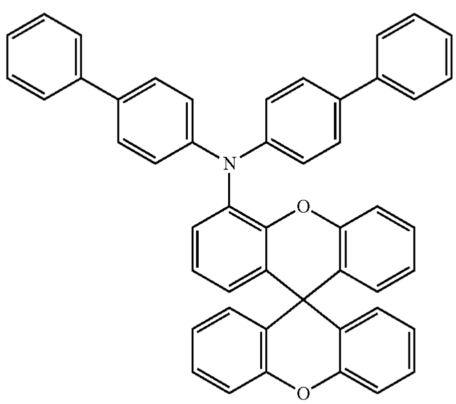
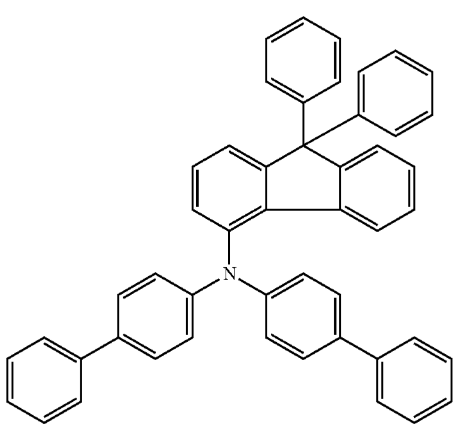
-continued
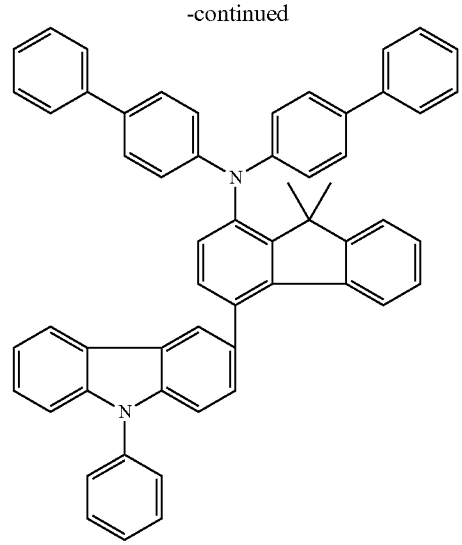
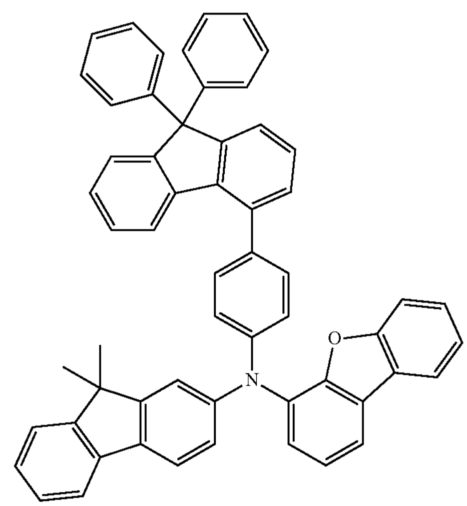
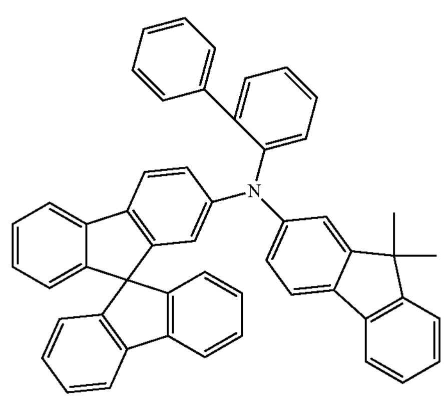

-continued
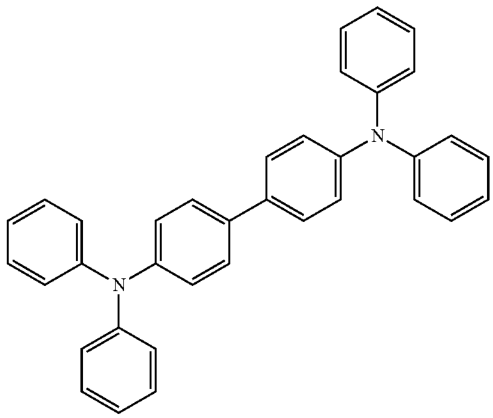
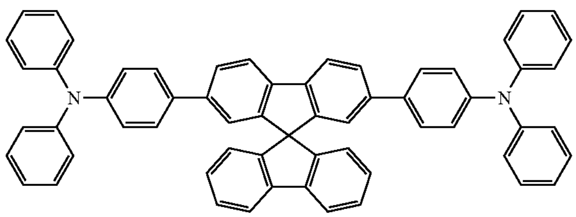
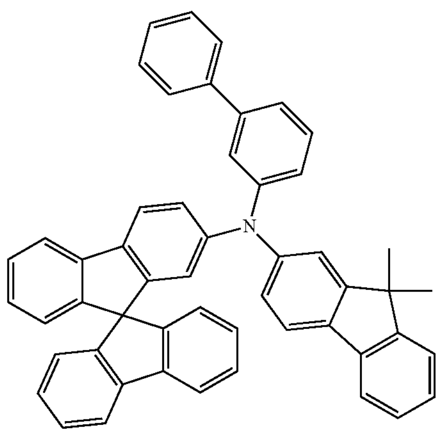
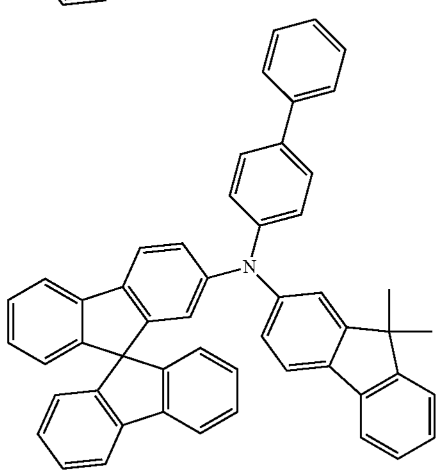
-continued
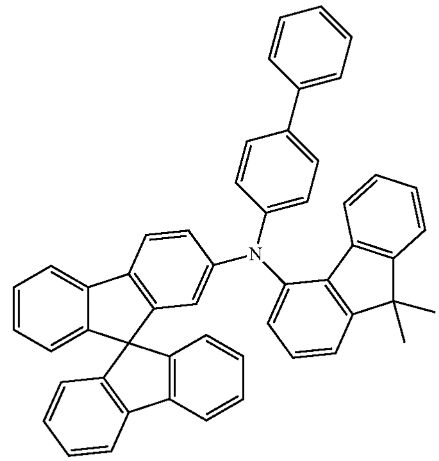
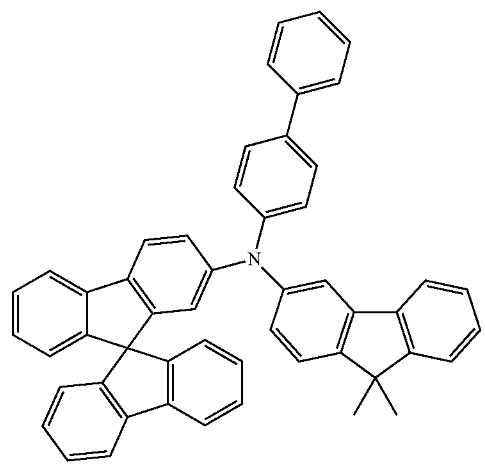
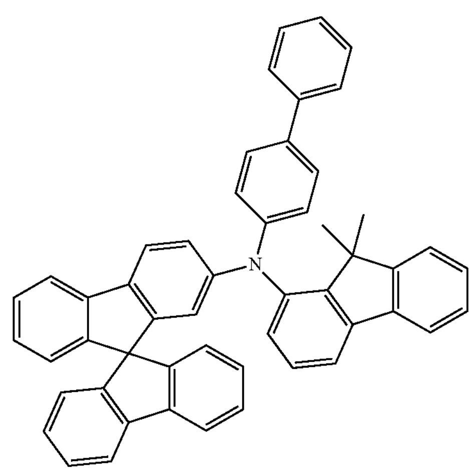

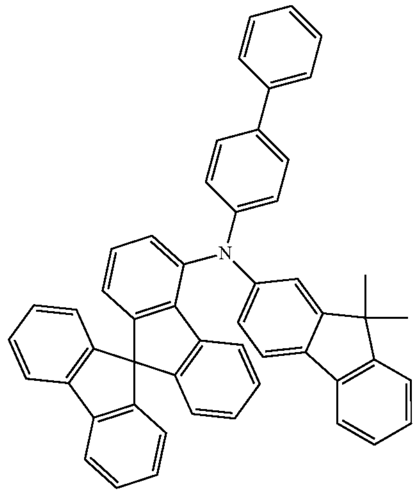
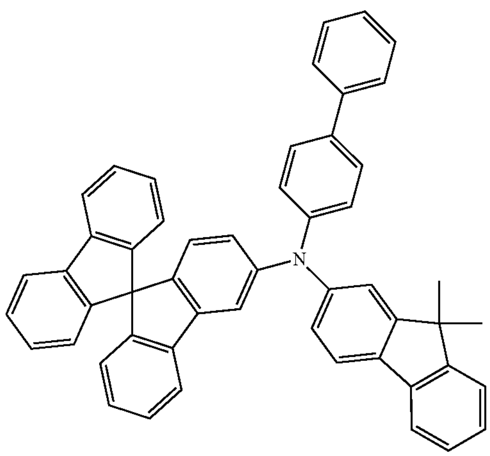
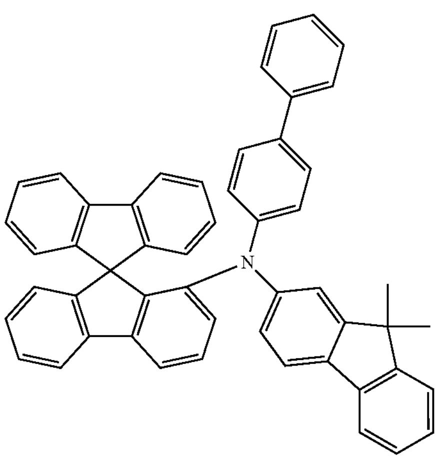
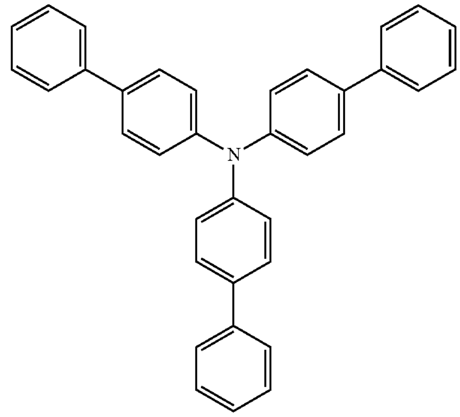
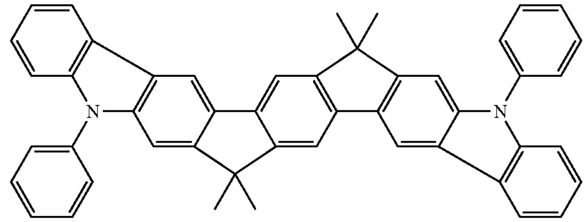
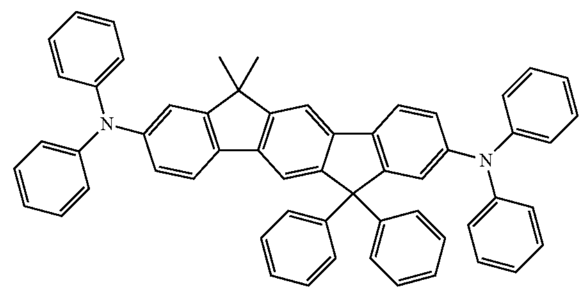
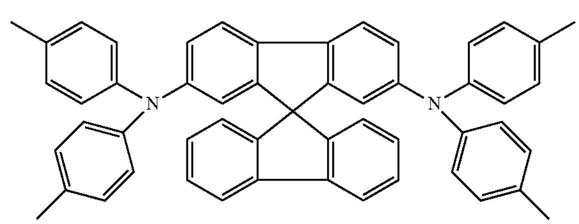
Examples of materials which can be employed as wide bandgap matrix materials:

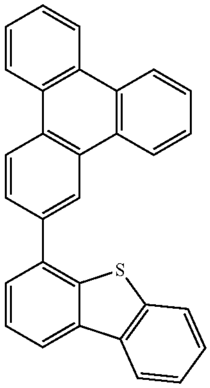
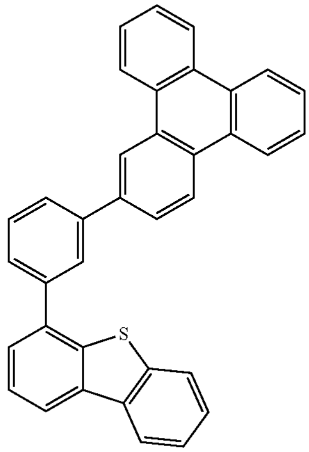
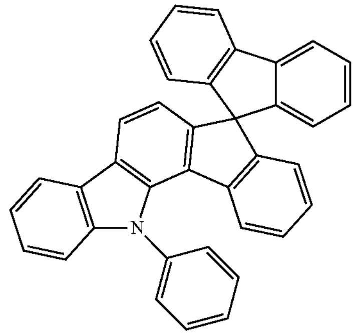
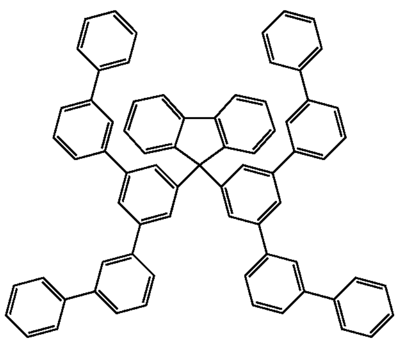
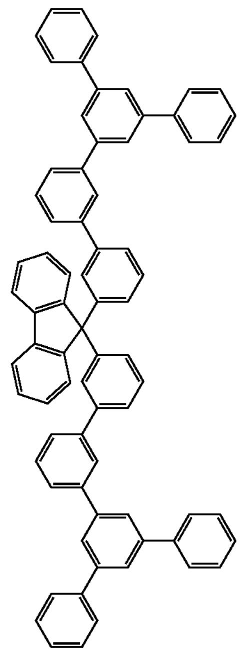
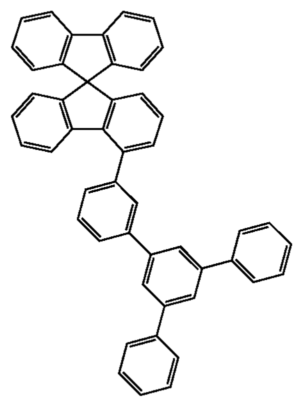
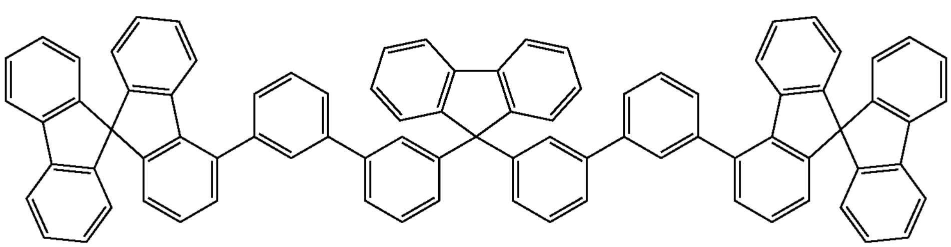
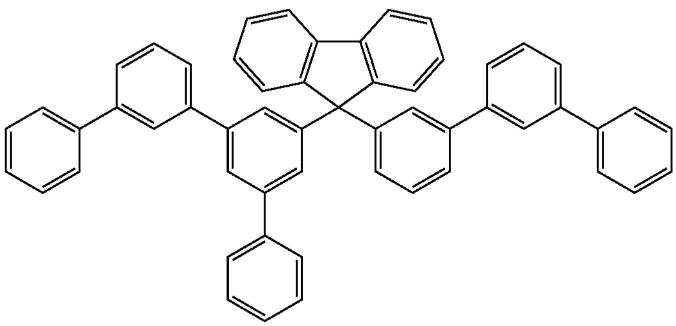

-continued

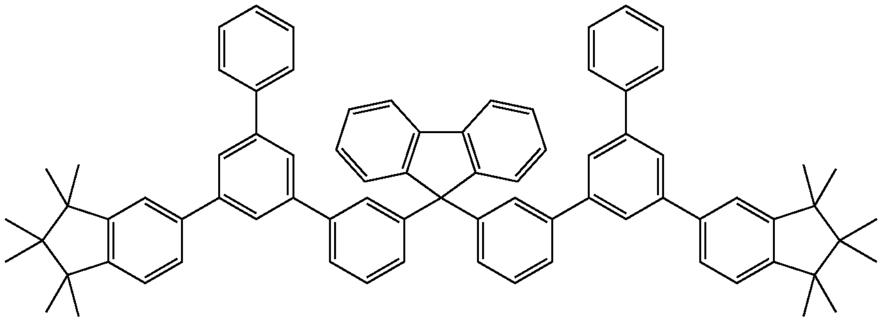

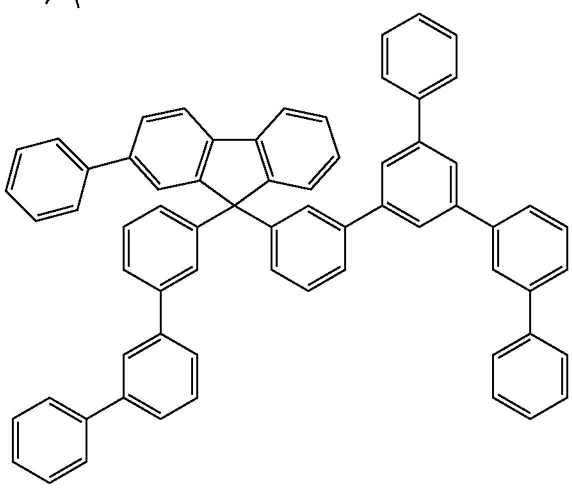

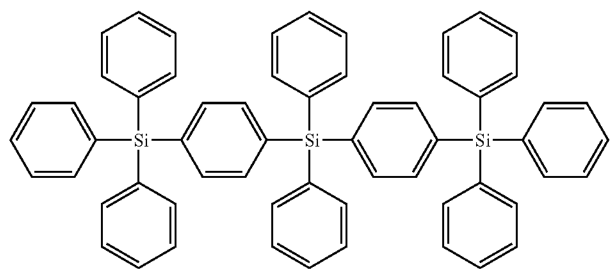

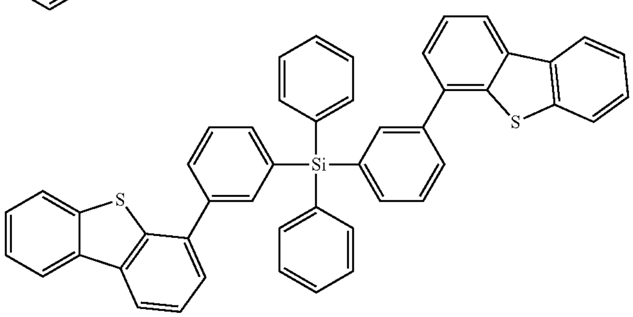

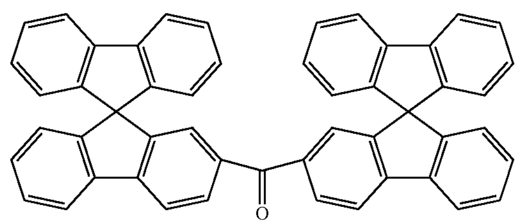

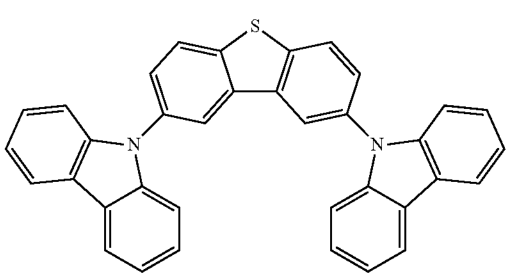

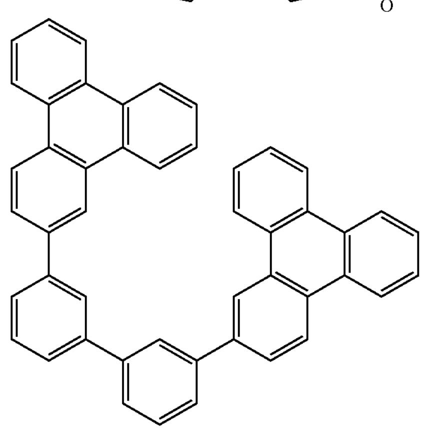

It is furthermore preferred to employ a mixture of two or more triplet emitters, in particular two or three triplet emitters, together with one or more matrix materials. The triplet emitter having the shorter-wave emission spectrum serves here as co-matrix for the triplet emitter having the longer-wave emission spectrum. Thus, for example, the metal complexes according to the invention can be combined with a metal complex emitting at a shorter wavelength, for example in blue, green or yellow, as co-matrix. Metal complexes according to the invention can also be employed, for example, as co-matrix for triplet emitters emitting at longer wavelength, for example for red-emitting triplet emitters. It may also be preferred here if both the metal complex emitting at shorter wavelength and also the metal complex emitting at longer wavelength is a compound according to the invention. A preferred embodiment in the case of the use of a mixture of three triplet emitters is if two are employed as co-host and one is employed as emitting material. These triplet emitters preferably have the emission colours green, yellow and red or blue, green and orange.

A preferred mixture in the emitting layer comprises an electron-transporting host material, a so-called "wide band-gap" host material, which, owing to its electronic properties, is not involved or is not involved to a significant extent in the charge transport in the layer, a co-dopant, which is a triplet emitter which emits at a shorter wavelength than the compound according to the invention, and a compound according to the invention.

A further preferred mixture in the emitting layer comprises an electron-transporting host material, a so-called "wide bandgap" host material, which, owing to its electronic properties, is not involved or is not involved to a significant extent in the charge transport in the layer, a hole-transporting host material, a co-dopant, which is a triplet emitter which emits at a shorter wavelength than the compound according to the invention, and a compound according to the invention.

Examples of suitable triplet emitters which can be employed as co-dopants for the compounds according to the invention are depicted in the following table.

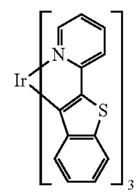

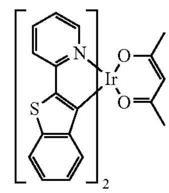

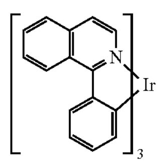

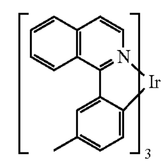

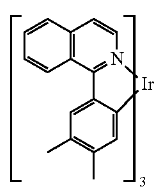

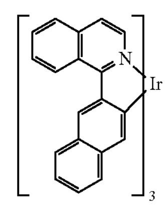

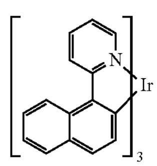

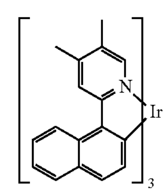

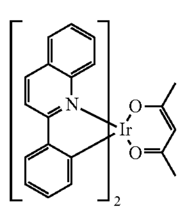

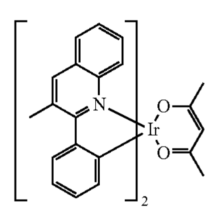

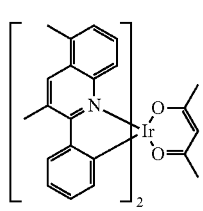

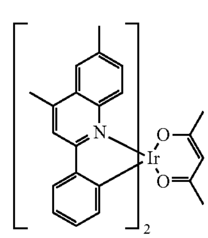

-continued
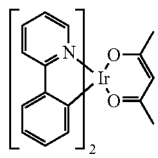
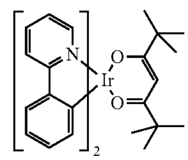
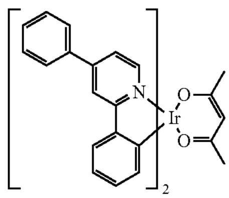
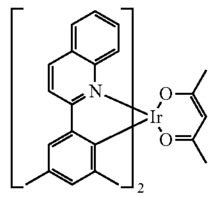
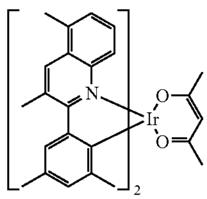
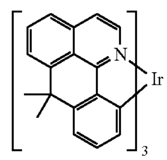
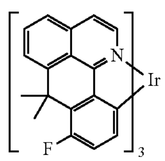
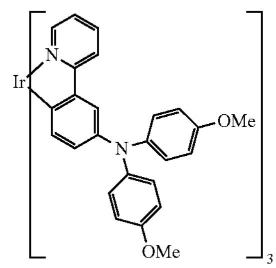
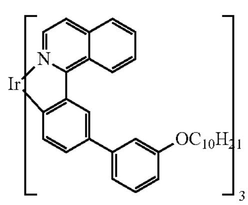
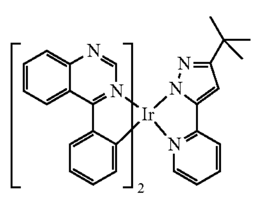
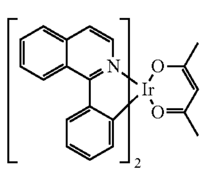
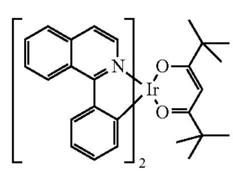
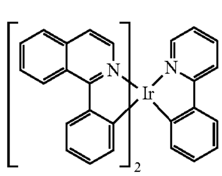
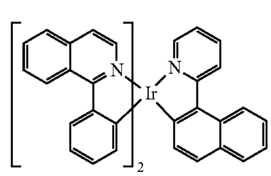
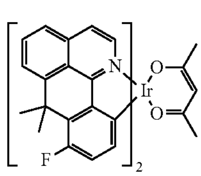
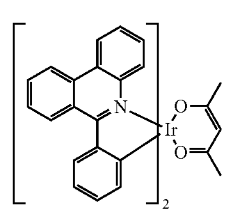

-continued
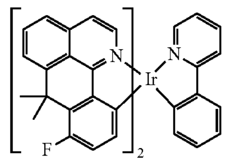
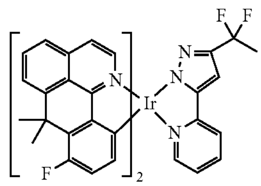
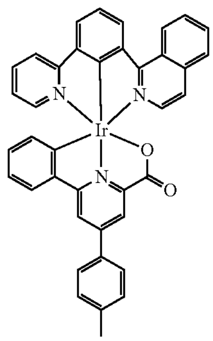
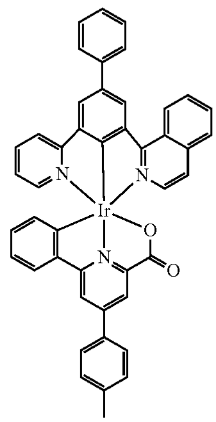
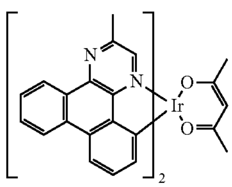
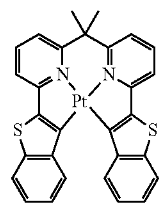
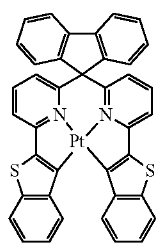
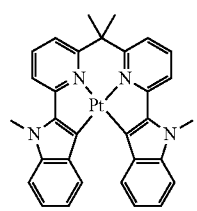
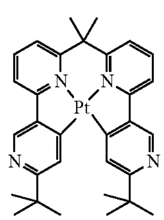
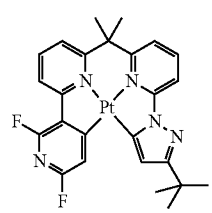
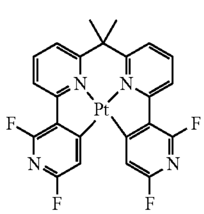
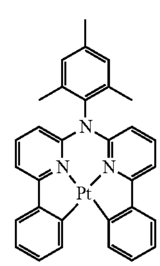

-continued
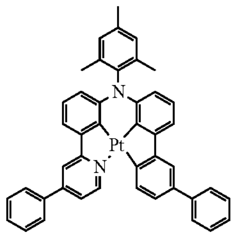
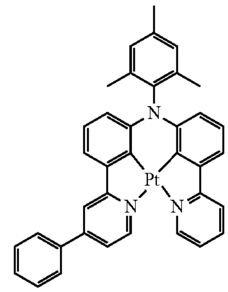
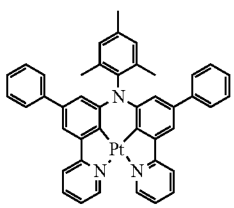
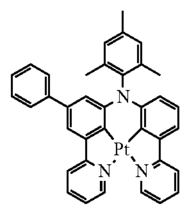
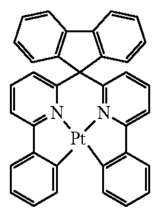
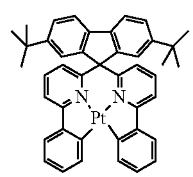
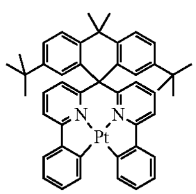
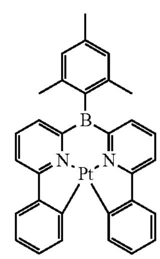
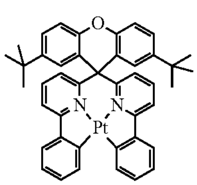
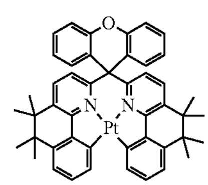
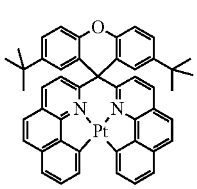
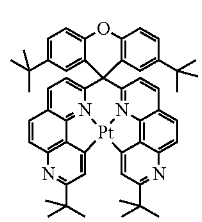

-continued
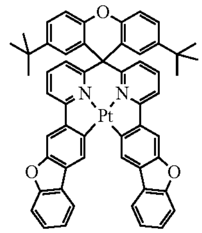
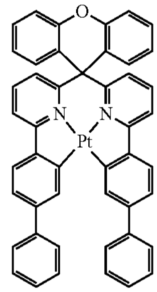
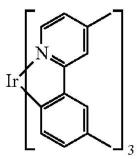
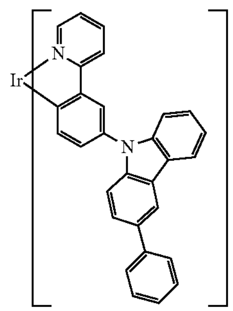
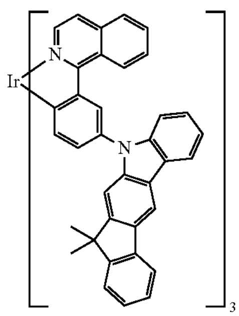
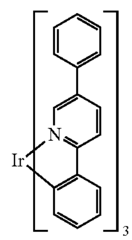
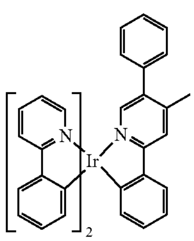
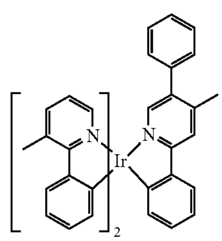
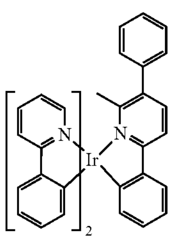
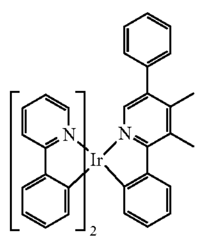
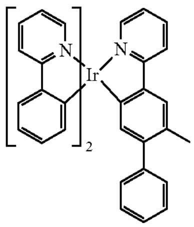
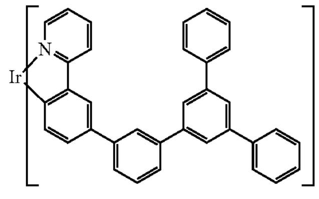

-continued
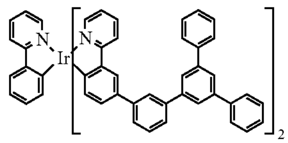
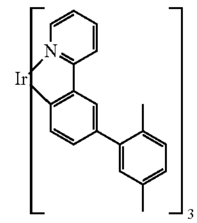
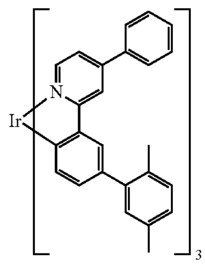
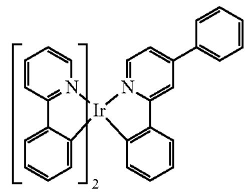
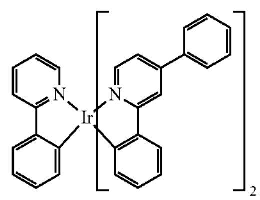
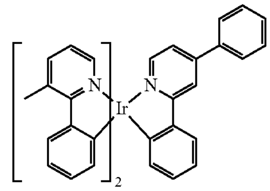
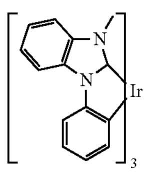
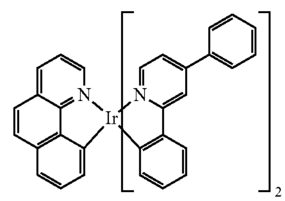
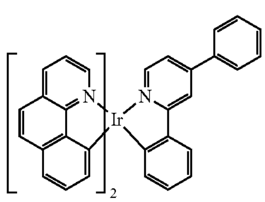
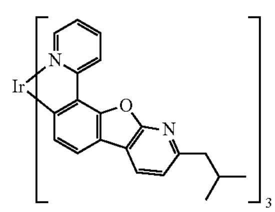
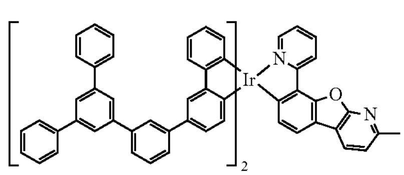
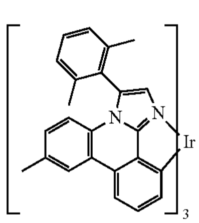
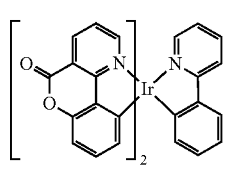

-continued
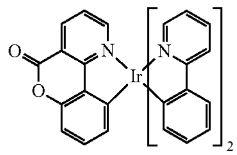
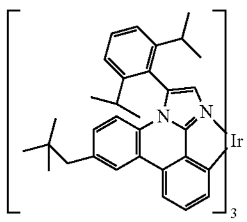
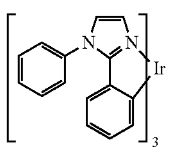
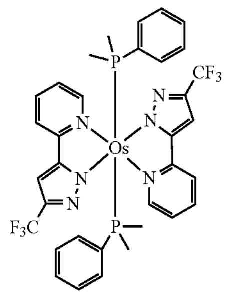
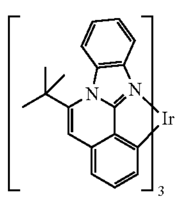
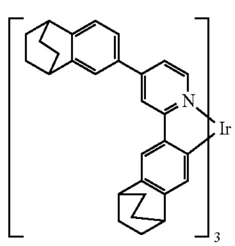
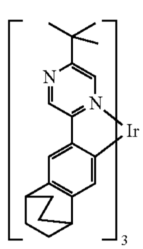
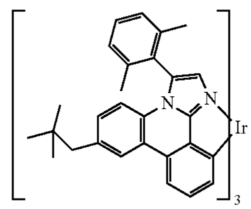
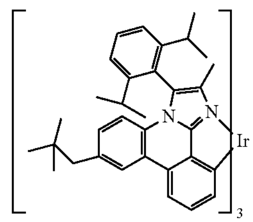
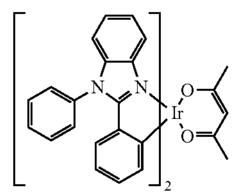
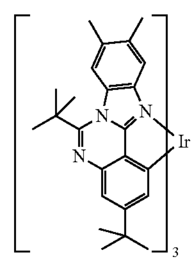
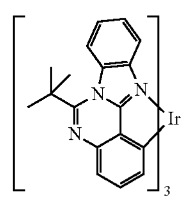
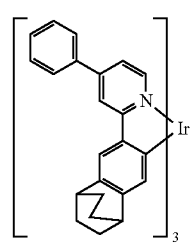
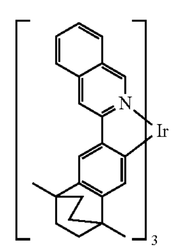

-continued
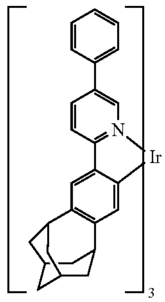
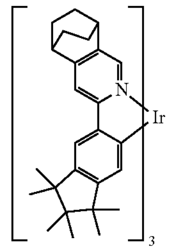
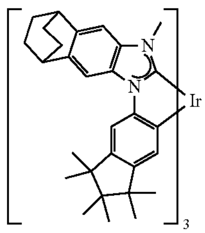
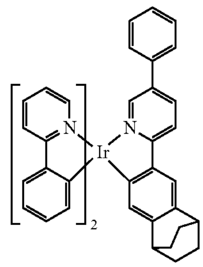
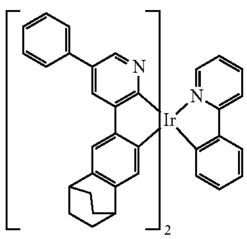
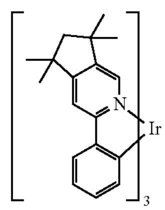
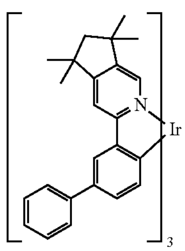
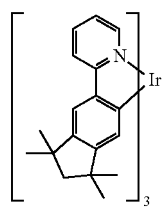
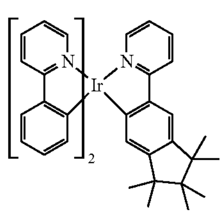
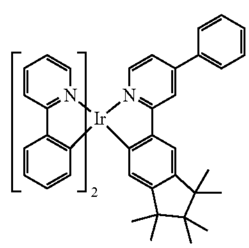
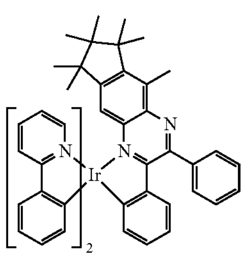
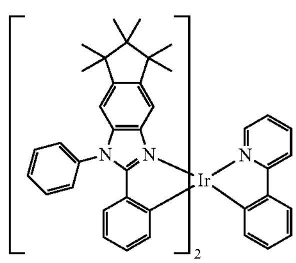

-continued
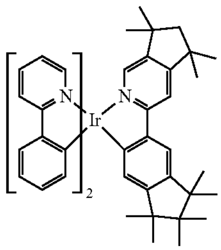
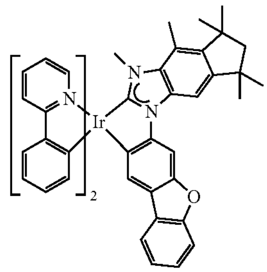
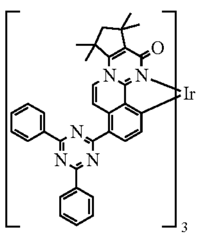
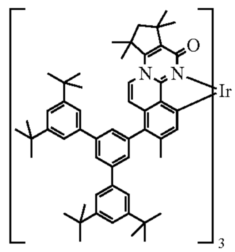
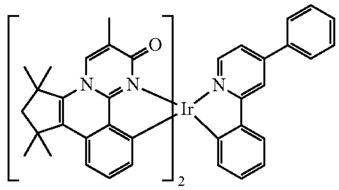
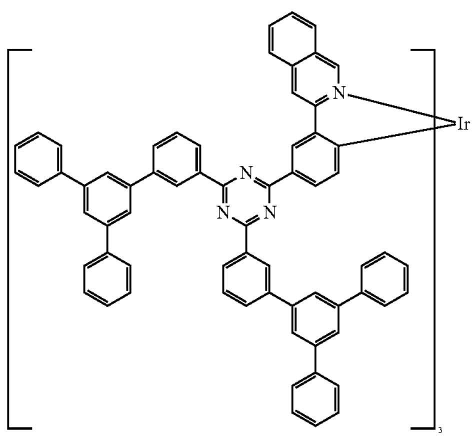
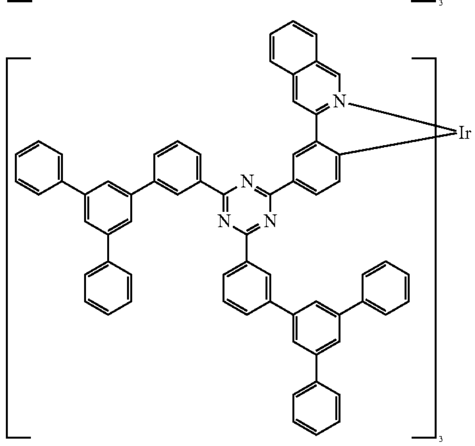

-continued
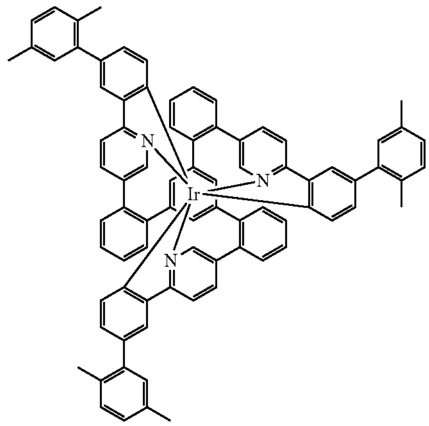
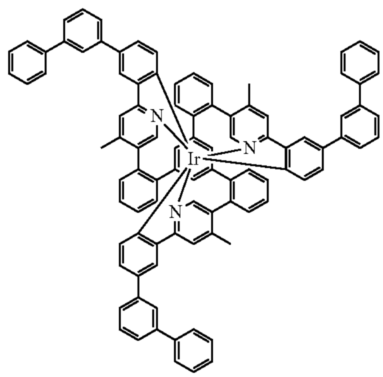
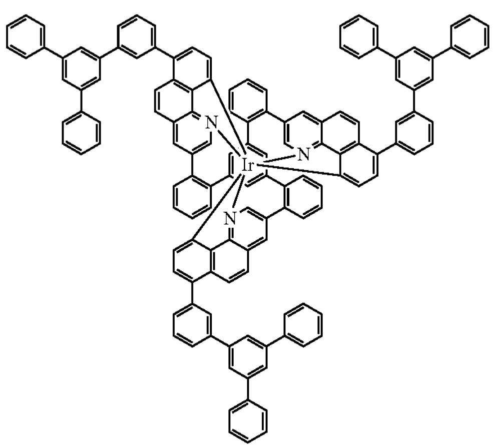
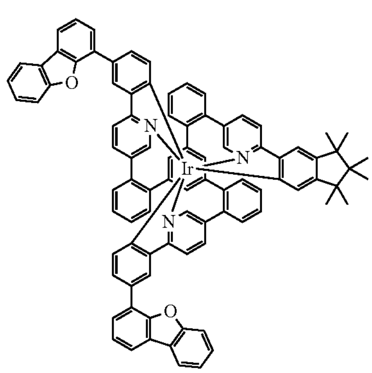

-continued
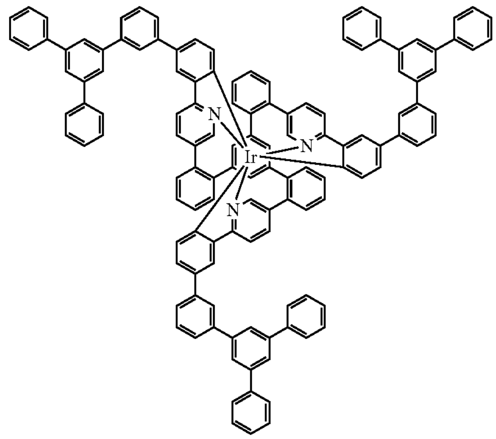
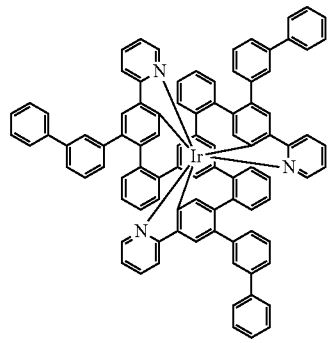
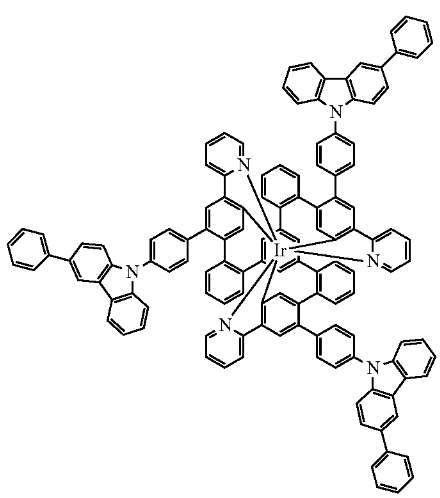

-continued
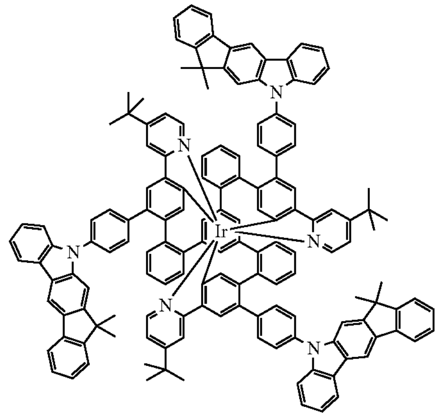
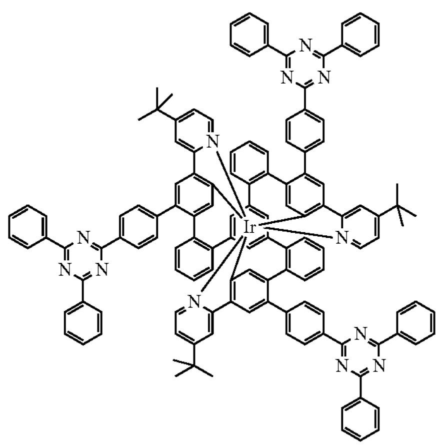
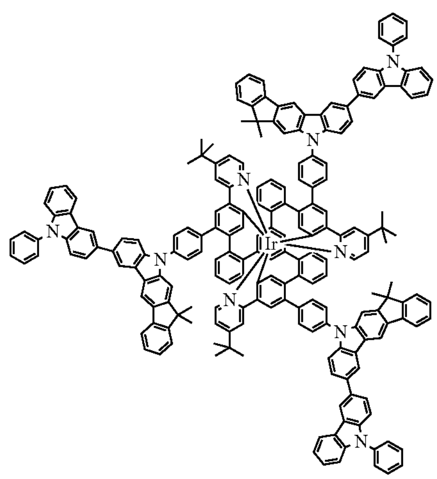

-continued
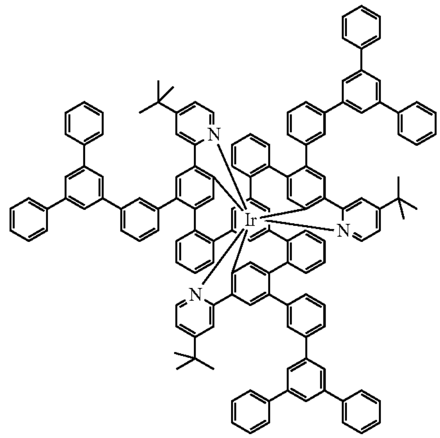
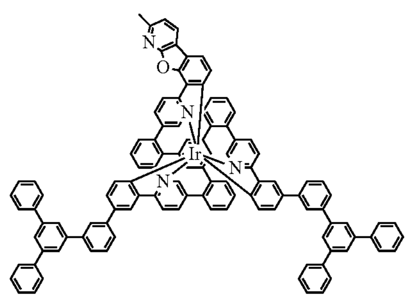
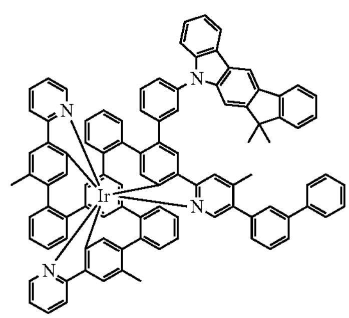
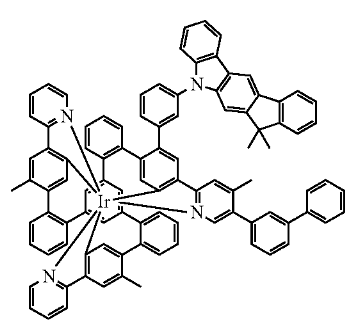

-continued
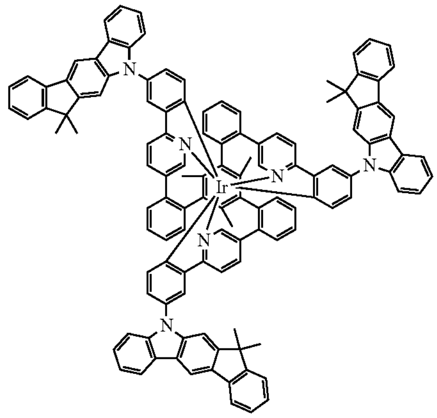
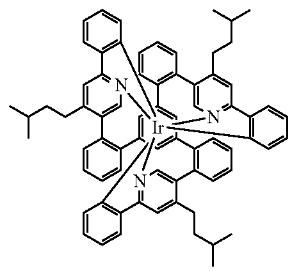
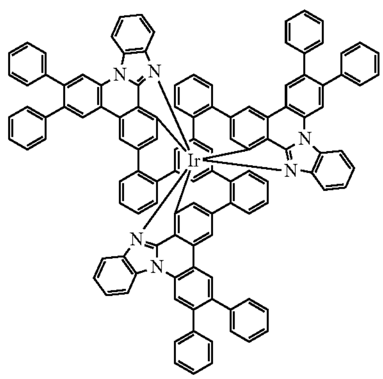
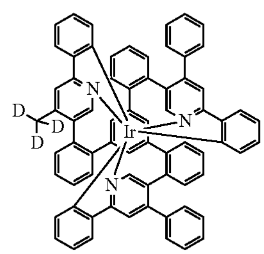
The polypodal complexes having the following GAS numbers are furthermore suitable:
| | | | |
|---|---|---|---|
| CAS-1269508-30-6 | CAS-1989601-68-4 | CAS-1989602-19-8 | CAS-1989602-70-1 |
| CAS-1215692-34-4 | CAS-1989601-69-5 | CAS-1989602-20-1 | CAS-1989602-71-2 |
| CAS-1370364-40-1 | CAS-1989601-70-8 | CAS-1989602-21-2 | CAS-1989602-72-3 |
| CAS-1370364-42-3 | CAS-1989601-71-9 | CAS-1989602-22-3 | CAS-1989602-73-4 |
| CAS-1989600-74-9 | CAS-1989601-72-0 | CAS-1989602-23-4 | CAS-1989602-74-5 |
| CAS-1989600-75-0 | CAS-1989601-73-1 | CAS-1989602-24-5 | CAS-1989602-75-6 |
| CAS-1989600-77-2 | CAS-1989601-74-2 | CAS-1989602-25-6 | CAS-1989602-76-7 |
| CAS-1989600-78-3 | CAS-1989601-75-3 | CAS-1989602-26-7 | CAS-1989602-77-8 |
| CAS-1989600-79-4 | CAS-1989601-76-4 | CAS-1989602-27-8 | CAS-1989602-78-9 |

-continued

| | | | |
|---|---|---|---|
| CAS-1989600-82-9 | CAS-1989601-77-5 | CAS-1989602-28-9 | CAS-1989602-79-0 |
| CAS-1989600-83-0 | CAS-1989601-78-6 | CAS-1989602-29-0 | CAS-1989602-80-3 |
| CAS-1989600-84-1 | CAS-1989601-79-7 | CAS-1989602-30-3 | CAS-1989602-82-5 |
| CAS-1989600-85-2 | CAS-1989601-80-0 | CAS-1989602-31-4 | CAS-1989602-84-7 |
| CAS-1989600-86-3 | CAS-1989601-81-1 | CAS-1989602-32-5 | CAS-1989602-85-8 |
| CAS-1989600-87-4 | CAS-1989601-82-2 | CAS-1989602-33-6 | CAS-1989602-86-9 |
| CAS-1989600-88-5 | CAS-1989601-83-3 | CAS-1989602-34-7 | CAS-1989602-87-0 |
| CAS-1989600-89-6 | CAS-1989601-84-4 | CAS-1989602-35-8 | CAS-1989602-88-1 |
| CAS-1989601-11-7 | CAS-1989601-85-5 | CAS-1989602-36-9 | CAS-1989604-00-3 |
| CAS-1989601-23-1 | CAS-1989601-86-6 | CAS-1989602-37-0 | CAS-1989604-01-4 |
| CAS-1989601-26-4 | CAS-1989601-87-7 | CAS-1989602-38-1 | CAS-1989604-02-5 |
| CAS-1989601-28-6 | CAS-1989601-88-8 | CAS-1989602-39-2 | CAS-1989604-03-6 |
| CAS-1989601-29-7 | CAS-1989601-89-9 | CAS-1989602-40-5 | CAS-1989604-04-7 |
| CAS-1989601-33-3 | CAS-1989601-90-2 | CAS-1989602-41-6 | CAS-1989604-05-8 |
| CAS-1989601-40-2 | CAS-1989601-91-3 | CAS-1989602-42-7 | CAS-1989604-06-9 |
| CAS-1989601-41-3 | CAS-1989601-92-4 | CAS-1989602-43-8 | CAS-1989604-07-0 |
| CAS-1989601-42-4 | CAS-1989601-93-5 | CAS-1989602-44-9 | CAS-1989604-08-1 |
| CAS-1989601-43-5 | CAS-1989601-94-6 | CAS-1989602-45-0 | CAS-1989604-09-2 |
| CAS-1989601-44-6 | CAS-1989601-95-7 | CAS-1989602-46-1 | CAS-1989604-10-5 |
| CAS-1989601-45-7 | CAS-1989601-96-8 | CAS-1989602-47-2 | CAS-1989604-11-6 |
| CAS-1989601-46-8 | CAS-1989601-97-9 | CAS-1989602-48-3 | CAS-1989604-13-8 |
| CAS-1989601-47-9 | CAS-1989601-98-0 | CAS-1989602-49-4 | CAS-1989604-14-9 |
| CAS-1989601-48-0 | CAS-1989601-99-1 | CAS-1989602-50-7 | CAS-1989604-15-0 |
| CAS-1989601-49-1 | CAS-1989602-00-7 | CAS-1989602-51-8 | CAS-1989604-16-1 |
| CAS-1989601-50-4 | CAS-1989602-01-8 | CAS-1989602-52-9 | CAS-1989604-17-2 |
| CAS-1989601-51-5 | CAS-1989602-02-9 | CAS-1989602-53-0 | CAS-1989604-18-3 |
| CAS-1989601-52-6 | CAS-1989602-03-0 | CAS-1989602-54-1 | CAS-1989604-19-4 |
| CAS-1989601-53-7 | CAS-1989602-04-1 | CAS-1989602-55-2 | CAS-1989604-20-7 |
| CAS-1989601-54-8 | CAS-1989602-05-2 | CAS-1989602-56-3 | CAS-1989604-21-8 |
| CAS-1989601-55-9 | CAS-1989602-06-3 | CAS-1989602-57-4 | CAS-1989604-22-9 |
| CAS-1989601-56-0 | CAS-1989602-07-4 | CAS-1989602-58-5 | CAS-1989604-23-0 |
| CAS-1989601-57-1 | CAS-1989602-08-5 | CAS-1989602-59-6 | CAS-1989604-24-1 |
| CAS-1989601-58-2 | CAS-1989602-09-6 | CAS-1989602-60-9 | CAS-1989604-25-2 |
| CAS-1989601-59-3 | CAS-1989602-10-9 | CAS-1989602-61-0 | CAS-1989604-26-3 |
| CAS-1989601-60-6 | CAS-1989602-11-0 | CAS-1989602-62-1 | CAS-1989604-27-4 |
| CAS-1989601-61-7 | CAS-1989602-12-1 | CAS-1989602-63-2 | CAS-1989604-28-5 |
| CAS-1989601-62-8 | CAS-1989602-13-2 | CAS-1989602-64-3 | CAS-1989604-29-6 |
| CAS-1989601-63-9 | CAS-1989602-14-3 | CAS-1989602-65-4 | CAS-1989604-30-9 |
| CAS-1989601-64-0 | CAS-1989602-15-4 | CAS-1989602-66-5 | CAS-1989604-31-0 |
| CAS-1989601-65-1 | CAS-1989602-16-5 | CAS-1989602-67-6 | CAS-1989604-32-1 |
| CAS-1989601-66-2 | CAS-1989602-17-6 | CAS-1989602-68-7 | CAS-1989604-33-2 |
| CAS-1989601-67-3 | CAS-1989602-18-7 | CAS-1989602-69-8 | CAS-1989604-34-3 |
| CAS-1989604-35-4 | CAS-1989604-88-7 | CAS-1989605-52-8 | CAS-1989606-07-6 |
| CAS-1989604-36-5 | CAS-1989604-89-8 | CAS-1989605-53-9 | CAS-1989606-08-7 |
| CAS-1989604-37-6 | CAS-1989604-90-1 | CAS-1989605-54-0 | CAS-1989606-09-8 |
| CAS-1989604-38-7 | CAS-1989604-92-3 | CAS-1989605-55-1 | CAS-1989606-10-1 |
| CAS-1989604-39-8 | CAS-1989604-93-4 | CAS-1989605-56-2 | CAS-1989606-11-2 |
| CAS-1989604-40-1 | CAS-1989604-94-5 | CAS-1989605-57-3 | CAS-1989606-12-3 |
| CAS-1989604-41-2 | CAS-1989604-95-6 | CAS-1989605-58-4 | CAS-1989606-13-4 |
| CAS-1989604-42-3 | CAS-1989604-96-7 | CAS-1989605-59-5 | CAS-1989606-14-5 |
| CAS-1989604-43-4 | CAS-1989604-97-8 | CAS-1989605-61-9 | CAS-1989606-15-6 |
| CAS-1989604-45-6 | CAS-1989605-09-5 | CAS-1989605-62-0 | CAS-1989606-16-7 |
| CAS-1989604-46-7 | CAS-1989605-10-8 | CAS-1989605-63-1 | CAS-1989606-17-8 |
| CAS-1989604-47-8 | CAS-1989605-11-9 | CAS-1989605-64-2 | CAS-1989606-18-9 |
| CAS-1989604-48-9 | CAS-1989605-13-1 | CAS-1989605-65-3 | CAS-1989606-19-0 |
| CAS-1989604-49-0 | CAS-1989605-14-2 | CAS-1989605-66-4 | CAS-1989606-20-3 |
| CAS-1989604-50-3 | CAS-1989605-15-3 | CAS-1989605-67-5 | CAS-1989606-21-4 |
| CAS-1989604-52-5 | CAS-1989605-16-4 | CAS-1989605-68-6 | CAS-1989606-22-5 |
| CAS-1989604-53-6 | CAS-1989605-17-5 | CAS-1989605-69-7 | CAS-1989606-23-6 |
| CAS-1989604-54-7 | CAS-1989605-18-6 | CAS-1989605-70-0 | CAS-1989606-24-7 |
| CAS-1989604-55-8 | CAS-1989605-19-7 | CAS-1989605-71-1 | CAS-1989606-26-9 |
| CAS-1989604-56-9 | CAS-1989605-20-0 | CAS-1989605-72-2 | CAS-1989606-27-0 |
| CAS-1989604-57-0 | CAS-1989605-21-1 | CAS-1989605-73-3 | CAS-1989606-28-1 |
| CAS-1989604-58-1 | CAS-1989605-22-2 | CAS-1989605-74-4 | CAS-1989606-29-2 |
| CAS-1989604-59-2 | CAS-1989605-23-3 | CAS-1989605-75-5 | CAS-1989606-30-5 |
| CAS-1989604-60-5 | CAS-1989605-24-4 | CAS-1989605-76-6 | CAS-1989606-31-6 |
| CAS-1989604-61-6 | CAS-1989605-25-5 | CAS-1989605-77-7 | CAS-1989606-32-7 |
| CAS-1989604-62-7 | CAS-1989605-26-6 | CAS-1989605-78-8 | CAS-1989606-33-8 |
| CAS-1989604-63-8 | CAS-1989605-27-7 | CAS-1989605-79-9 | CAS-1989606-34-9 |
| CAS-1989604-64-9 | CAS-1989605-28-8 | CAS-1989605-81-3 | CAS-1989606-35-0 |
| CAS-1989604-65-0 | CAS-1989605-29-9 | CAS-1989605-82-4 | CAS-1989606-36-1 |
| CAS-1989604-66-1 | CAS-1989605-30-2 | CAS-1989605-83-5 | CAS-1989606-37-2 |
| CAS-1989604-67-2 | CAS-1989605-31-3 | CAS-1989605-84-6 | CAS-1989606-38-3 |
| CAS-1989604-68-3 | CAS-1989605-32-4 | CAS-1989605-85-7 | CAS-1989606-39-4 |
| CAS-1989604-69-4 | CAS-1989605-33-5 | CAS-1989605-86-8 | CAS-1989606-40-7 |
| CAS-1989604-70-7 | CAS-1989605-34-6 | CAS-1989605-87-9 | CAS-1989606-41-8 |
| CAS-1989604-71-8 | CAS-1989605-35-7 | CAS-1989605-88-0 | CAS-1989606-42-9 |
| CAS-1989604-72-9 | CAS-1989605-36-8 | CAS-1989605-89-1 | CAS-1989606-43-0 |
| CAS-1989604-73-0 | CAS-1989605-37-9 | CAS-1989605-90-4 | CAS-1989606-44-1 |

-continued

| | | | |
|---|---|---|---|
| CAS-1989604-74-1 | CAS-1989605-38-0 | CAS-1989605-91-5 | CAS-1989606-45-2 |
| CAS-1989604-75-2 | CAS-1989605-39-1 | CAS-1989605-92-6 | CAS-1989606-46-3 |
| CAS-1989604-76-3 | CAS-1989605-40-4 | CAS-1989605-93-7 | CAS-1989606-48-5 |
| CAS-1989604-77-4 | CAS-1989605-41-5 | CAS-1989605-94-8 | CAS-1989606-49-6 |
| CAS-1989604-78-5 | CAS-1989605-42-6 | CAS-1989605-95-9 | CAS-1989606-53-2 |
| CAS-1989604-79-6 | CAS-1989605-43-7 | CAS-1989605-96-0 | CAS-1989606-55-4 |
| CAS-1989604-80-9 | CAS-1989605-44-8 | CAS-1989605-97-1 | CAS-1989606-56-5 |
| CAS-1989604-81-0 | CAS-1989605-45-9 | CAS-1989605-98-2 | CAS-1989606-61-2 |
| CAS-1989604-82-1 | CAS-1989605-46-0 | CAS-1989605-99-3 | CAS-1989606-62-3 |
| CAS-1989604-83-2 | CAS-1989605-47-1 | CAS-1989606-00-9 | CAS-1989606-63-4 |
| CAS-1989604-84-3 | CAS-1989605-48-2 | CAS-1989606-01-0 | CAS-1989606-67-8 |
| CAS-1989604-85-4 | CAS-1989605-49-3 | CAS-1989606-04-3 | CAS-1989606-69-0 |
| CAS-1989604-86-5 | CAS-1989605-50-6 | CAS-1989606-05-4 | CAS-1989606-70-3 |
| CAS-1989604-87-6 | CAS-1989605-51-7 | CAS-1989606-06-5 | CAS-1989606-74-7 |
| CAS-1989658-39-0 | CAS-2088184-56-7 | CAS-2088185-07-1 | CAS-2088185-66-2 |
| CAS-1989658-41-4 | CAS-2088184-57-8 | CAS-2088185-08-2 | CAS-2088185-67-3 |
| CAS-1989658-43-6 | CAS-2088184-58-9 | CAS-2088185-09-3 | CAS-2088185-68-4 |
| CAS-1989658-47-0 | CAS-2088184-59-0 | CAS-2088185-10-6 | CAS-2088185-69-5 |
| CAS-1989658-49-2 | CAS-2088184-60-3 | CAS-2088185-11-7 | CAS-2088185-70-8 |
| CAS-2088184-07-8 | CAS-2088184-61-4 | CAS-2088185-12-8 | CAS-2088185-71-9 |
| CAS-2088184-08-9 | CAS-2088184-62-5 | CAS-2088185-13-9 | CAS-2088185-72-0 |
| CAS-2088184-09-0 | CAS-2088184-63-6 | CAS-2088185-14-0 | CAS-2088185-73-1 |
| CAS-2088184-10-3 | CAS-2088184-64-7 | CAS-2088185-15-1 | CAS-2088185-74-2 |
| CAS-2088184-11-4 | CAS-2088184-65-8 | CAS-2088185-16-2 | CAS-2088185-75-3 |
| CAS-2088184-13-6 | CAS-2088184-66-9 | CAS-2088185-17-3 | CAS-2088185-76-4 |
| CAS-2088184-14-7 | CAS-2088184-67-0 | CAS-2088185-18-4 | CAS-2088185-77-5 |
| CAS-2088184-15-8 | CAS-2088184-68-1 | CAS-2088185-19-5 | CAS-2088185-78-6 |
| CAS-2088184-16-9 | CAS-2088184-69-2 | CAS-2088185-20-8 | CAS-2088185-79-7 |
| CAS-2088184-17-0 | CAS-2088184-70-5 | CAS-2088185-21-9 | CAS-2088185-80-0 |
| CAS-2088184-18-1 | CAS-2088184-71-6 | CAS-2088185-22-0 | CAS-2088185-81-1 |
| CAS-2088184-19-2 | CAS-2088184-72-7 | CAS-2088185-23-1 | CAS-2088185-82-2 |
| CAS-2088184-20-5 | CAS-2088184-73-8 | CAS-2088185-32-2 | CAS-2088185-83-3 |
| CAS-2088184-21-6 | CAS-2088184-74-9 | CAS-2088185-33-3 | CAS-2088185-84-4 |
| CAS-2088184-22-7 | CAS-2088184-75-0 | CAS-2088185-34-4 | CAS-2088185-85-5 |
| CAS-2088184-23-8 | CAS-2088184-76-1 | CAS-2088185-35-5 | CAS-2088185-86-6 |
| CAS-2088184-24-9 | CAS-2088184-77-2 | CAS-2088185-36-6 | CAS-2088185-87-7 |
| CAS-2088184-25-0 | CAS-2088184-78-3 | CAS-2088185-37-7 | CAS-2088185-88-8 |
| CAS-2088184-26-1 | CAS-2088184-79-4 | CAS-2088185-38-8 | CAS-2088185-89-9 |
| CAS-2088184-27-2 | CAS-2088184-80-7 | CAS-2088185-39-9 | CAS-2088185-90-2 |
| CAS-2088184-28-3 | CAS-2088184-81-8 | CAS-2088185-40-2 | CAS-2088185-91-3 |
| CAS-2088184-29-4 | CAS-2088184-82-9 | CAS-2088185-41-3 | CAS-2088185-92-4 |
| CAS-2088184-30-7 | CAS-2088184-83-0 | CAS-2088185-42-4 | CAS-2088185-93-5 |
| CAS-2088184-32-9 | CAS-2088184-84-1 | CAS-2088185-43-5 | CAS-2088185-94-6 |
| CAS-2088184-34-1 | CAS-2088184-85-2 | CAS-2088185-44-6 | CAS-2088185-95-7 |
| CAS-2088184-35-2 | CAS-2088184-86-3 | CAS-2088185-45-7 | CAS-2088185-96-8 |
| CAS-2088184-36-3 | CAS-2088184-87-4 | CAS-2088185-46-8 | CAS-2088185-97-9 |
| CAS-2088184-37-4 | CAS-2088184-88-5 | CAS-2088185-47-9 | CAS-2088185-98-0 |
| CAS-2088184-38-5 | CAS-2088184-89-6 | CAS-2088185-48-0 | CAS-2088185-99-1 |
| CAS-2088184-39-6 | CAS-2088184-90-9 | CAS-2088185-49-1 | CAS-2088186-00-7 |
| CAS-2088184-40-9 | CAS-2088184-91-0 | CAS-2088185-50-4 | CAS-2088186-01-8 |
| CAS-2088184-41-0 | CAS-2088184-92-1 | CAS-2088185-51-5 | CAS-2088186-02-9 |
| CAS-2088184-42-1 | CAS-2088184-93-2 | CAS-2088185-52-6 | CAS-2088195-88-2 |
| CAS-2088184-43-2 | CAS-2088184-94-3 | CAS-2088185-53-7 | CAS-2088195-89-3 |
| CAS-2088184-44-3 | CAS-2088184-95-4 | CAS-2088185-54-8 | CAS-2088195-90-6 |
| CAS-2088184-45-4 | CAS-2088184-96-5 | CAS-2088185-55-9 | CAS-2088195-91-7 |
| CAS-2088184-46-5 | CAS-2088184-97-6 | CAS-2088185-56-0 | CAS-861806-70-4 |
| CAS-2088184-47-6 | CAS-2088184-98-7 | CAS-2088185-57-1 | CAS-1269508-30-6 |
| CAS-2088184-48-7 | CAS-2088184-99-8 | CAS-2088185-58-2 | |
| CAS-2088184-49-8 | CAS-2088185-00-4 | CAS-2088185-59-3 | |
| CAS-2088184-50-1 | CAS-2088185-01-5 | CAS-2088185-60-6 | |
| CAS-2088184-51-2 | CAS-2088185-02-6 | CAS-2088185-61-7 | |
| CAS-2088184-52-3 | CAS-2088185-03-7 | CAS-2088185-62-8 | |
| CAS-2088184-53-4 | CAS-2088185-04-8 | CAS-2088185-63-9 | |
| CAS-2088184-54-5 | CAS-2088185-05-9 | CAS-2088185-64-0 | |
| CAS-2088184-55-6 | CAS-2088185-06-0 | CAS-2088185-65-1 | |

The metal complexes according to the invention can also be employed in other functions in the electronic device, for example as hole-transport material in a hole-injection or -transport layer, as charge-generation material, as electron-blocking material, as hole-blocking material or as electron-transport material, for example in an electron-transport layer, depending on the choice of the metal and the precise structure of the ligand. If the metal complex according to the invention is an aluminium complex, this is preferably employed in an electron-transport layer. The metal complexes according to the invention can likewise be employed as matrix material for other phosphorescent metal complexes in an emitting layer.

The cathode preferably comprises metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). Also suitable are alloys comprising an alkali metal or alkaline-earth metal and silver, for example an alloy comprising magnesium and silver. In the case of multilayered structures, further metals which have a relatively high work function, such as, for example, Ag, may also be used in addition to the said metals, in which case combinations of the metals, such as, for example, Mg/Ag, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, $BaF_2$, MgO, NaF, CsF, $Cs_2CO_3$, etc.). Organic alkali-metal complexes, for example Liq (lithium quinolinate), are likewise suitable for this purpose. The layer thickness of this layer is preferably between 0.5 and 5 nm.

The anode preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/NiOx, Al/PtOx) may also be preferred. For some applications, at least one of the electrodes must be transparent or partially transparent in order either to facilitate irradiation of the organic material (O-SCs) or the coupling-out of light (OLEDs/PLEDs, O-LASERs). Preferred anode materials here are conductive mixed metal oxides. Particular preference is given to indium tin oxide (ITO) or indium zinc oxide (IZO). Preference is furthermore given to conductive, doped organic materials, in particular conductive doped polymers, for example PEDOT, PANI or derivatives of these polymers. It is furthermore preferred for a p-doped hole-transport material to be applied to the anode as hole-injection layer, where suitable p-dopants are metal oxides, for example $MoO_3$ or $WO_3$, or (per)fluorinated electron-deficient aromatic compounds. Further suitable p-dopants are HAT-CN (hexacyanohexaazatriphenylene) or the compound NPD9 from Novaled. A layer of this type simplifies hole injection in materials having a low HOMO, i.e. a large value of the HOMO.

All materials as are used in accordance with the prior art for the layers can generally be used in the further layers, and the person skilled in the art will be able to combine each of these materials with the materials according to the invention in an electronic device without inventive step.

The device is correspondingly structured (depending on the application), provided with contacts and finally hermetically sealed, since the lifetime of such devices is drastically shortened in the presence of water and/or air.

Preference is furthermore given to an organic electroluminescent device, characterised in that one or more layers are applied by means of a sublimation process, in which the materials are vapour-deposited in vacuum sublimation units at an initial pressure of usually less than $10^{-5}$ mbar, preferably less than $10^{-6}$ mbar. It is also possible for the initial pressure to be even lower or even higher, for example less than $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure of between $10^{-5}$ mbar and 1 bar. A special case of this process is the OVJP (organic vapour jet printing) process, in which the materials are applied directly through a nozzle and thus structured.

Preference is furthermore given to an organic electroluminescent device, characterised in that one or more layers are produced from solution, such as, for example, by spin coating, or by means of any desired printing process, such as, for example, screen printing, flexographic printing, offset printing or nozzle printing, but particularly preferably LITI (light induced thermal imaging, thermal transfer printing) or ink-jet printing. Soluble compounds are necessary for this purpose, which are obtained, for example, through suitable substitution. In a preferred embodiment of the invention, the layer which comprises the compound according to the invention is applied from solution.

The organic electroluminescent device may also be produced as a hybrid system by applying one or more layers from solution and applying one or more other layers by vapour deposition. Thus, for example, it is possible to apply an emitting layer comprising a metal complex according to the invention and a matrix material from solution and to apply a hole-blocking layer and/or an electron-transport layer on top by vacuum vapour deposition.

These processes are generally known to the person skilled in the art and can be applied by him without problems to organic electroluminescent devices containing compounds of the formula (1) or (2) or the preferred embodiments indicated above.

The electronic devices according to the invention, in particular organic electroluminescent devices, are distinguished over the prior art by one or more of the following advantages:

1. The compounds according to the invention have a very high photoluminescence quantum yield. On use in an organic electroluminescent device, this results in excellent efficiencies.
2. The compounds according to the invention have a very short luminescence lifetime. On use in an organic electroluminescent device, this results in improved roll-off behaviour and, through the avoidance of non-radiative relaxation channels, in a higher luminescence quantum yield.

These above-mentioned advantages are not accompanied by an impairment of the other electronic properties.

The invention is explained in greater detail by the following examples without wishing to restrict it thereby. The person skilled in the art will be able to use the descriptions to produce further electronic devices according to the invention without inventive step and thus carry out the invention through-out the range claimed.

EXAMPLES

The following syntheses are carried out, unless indicated otherwise, under a protective-gas atmosphere in dried solvents. The metal complexes are additionally handled with exclusion of light or under yellow light. The solvents and reagents can be purchased, for example, from Sigma-ALDRICH or ABCR. The respective numbers in square brackets or the numbers indicated for individual compounds refer to the CAS numbers of the compounds known from the literature.

A: Synthesis of Building Blocks B

Example B1

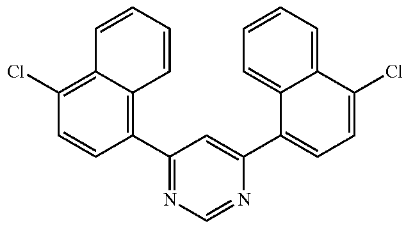 [SMILES: Clc1ccc(-c2cc(-c3ccc(Cl)c4ccccc34)ncn2)c2ccccc12]

A mixture of 23.8 g (100 mmol) of 4,6-dibromopyrimidine [36847-10-6], 41.3 g (200 mmol) of (4-chloronaphthalen-1-yl)boronic acid [147102-97-4], 63.6 g (600 mmol) of sodium carbonate, 5.8 g (5 mmol) of tetrakis-(triphenylphosphine)palladium(0) [14221-01-3], 800 ml of toluene, 300 ml of ethanol and 700 ml of water is heated under reflux for 24 h. After cooling, the organic phase is separated off, washed 2× with 300 ml of water and once with 200 ml of saturated NaCl solution, filtered through a Celite bed, and the filtrate is evaporated to dryness. The residue is purified twice by recrystallisation from acetonitrile. Yield 20.5 g (51 mmol), 51%; purity: 95% according to $^{1}$H-NMR.

Example B204

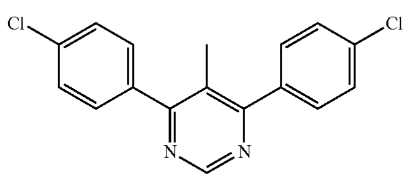 [SMILES: Cc1c(-c2ccc(Cl)cc2)ncnc1-c1ccc(Cl)cc1]

Building block B204 can be prepared analogously to the procedure for B1, replacing 4,6-dibromopyrimidine by 4,6-dibromo-5-methylpyrimidine [83941-93-9] and replacing (4-chloronaphthalen-1-yl)boronic acid by 4-chlorophenylboronic acid [1679-18-1]. Yield 55%.

Example B2

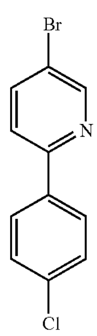

134 g of 4-chlorophenylboronic acid (860 mmol) [1679-18-1], 250.0 g of 5-bromo-2-iodopyridine (880 mmol) [223463-13-6] and 232.7 g of potassium carbonate (1.68 mol) are weighed out into a 4 l four-necked flask with reflux condenser, argon blanketing, precision glass stirrer and internal thermometer, the flask is inertised with argon, and 1500 ml of acetonitrile and 1000 ml of absolute ethanol are added. 100 g of glass beads (diameter 3 mm) are added, and the suspension is homogenised for 5 minutes. 5.8 g of bis(triphenylphosphine)palladium(II) chloride (8.3 mmol) [13965-03-2] are then added. The reaction mixture is warmed under reflux overnight with vigorous stirring. After cooling, the solvent is removed in a rotary evaporator, and the residue is worked up by extraction with toluene and water in a separating funnel. The organic phase is washed 2× with 500 ml of water and 1× with 300 ml of saturated sodium chloride solution, dried over anhydrous sodium sulfate, and the solvent is subsequently removed in vacuo. The residue is taken up in dichloromethane and filtered through a silica gel frit. The silica gel bed is rinsed twice with 500 ml of dichloromethane each time. 800 ml of ethanol are added to the filtrate, the dichloromethane is stripped off in a rotary evaporator to 500 mbar. After removal of the dichloromethane in the rotary evaporator, a solid precipitates out of the ethanol which remains and is filtered off with suction and washed with ethanol. The yellow solid obtained is recrystallised from 800 ml of acetonitrile under reflux, giving a beige solid. Yield: 152.2 g (567.0 mmol), 66%; purity: about 95% according to $^{1}$H-NMR.

Example B3

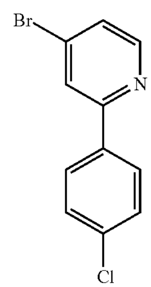 [SMILES: Clc1ccc(-c2cc(Br)ccn2)cc1]

Building block B3 can be prepared analogously to the procedure for B2, replacing 5-bromo-2-iodopyridine by 2,4-dibromopyridine [58530-53-3]. Yield 54%.

Example B4

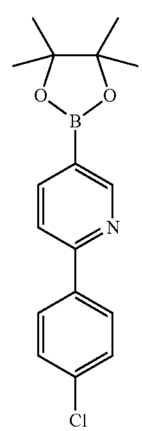

162.0 g (600 mmol) of B2, 158.0 g (622 mmol) of bis(pinacolato)diborane [73183-34-3], 180.1 g (1.83 mol) of potassium acetate [127-08-2] and 8.9 g (12.1 mmol) of trans-dichlorobis(tricyclohexylphosphine)palladium(II) [29934-17-6] are weighed out into a 4 l four-necked flask with reflux condenser, precision glass stirrer, heating bath and argon connection, and 2200 ml of 1,4-dioxane are added. 100 g of glass beads (diameter 3 mm) are added, the reaction mixture is inertised with argon and stirred under reflux for 24 h. After cooling, the solvent is removed in vacuo, the residue obtained is worked up by extraction with 1000 ml of ethyl acetate and 1500 ml of water in a separating funnel. The organic phase is washed 1× with 500 ml of water and 1× with 300 ml of saturated sodium chloride solution, dried over anhydrous sodium sulfate and filtered through a frit packed with silica gel. The silica gel bed is rinsed 2× with 500 ml of ethyl acetate, and the filtrate obtained is evaporated in vacuo. The brown solid obtained is recrystallised from 1000 ml of n-heptane under reflux, giving a beige solid. Yield: 150.9 g (478 mmol), 80%; purity: 97% according to $^{1}$H-NMR.

Example B5

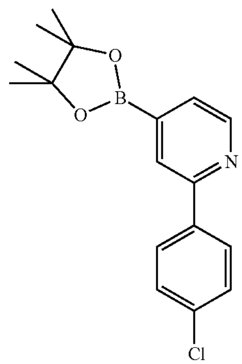 [SMILES: CC1(C)OB(c2ccnc(-c3ccc(Cl)cc3)c2)OC1(C)C]

Building block B5 can be prepared analogously to the procedure for B4 starting from compound B3. 12.1 mmol of trans-dichlorobis(tricyclohexyl-phosphine)palladium(II) are replaced by 12 mmol of [1,1'-bis(diphenyl-phosphino)ferrocene]palladium(II) dichloride complex with dichloromethane [95464-05-4]. Yield: 75%.

Example B6

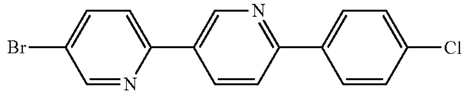 [SMILES: Clc1ccc(-c2ccc(-c3ccc(Br)cn3)cn2)cc1]

31.5 g (100 mmol) of B4, 28.4 g of 5-bromo-2-iodopyridine (100 mmol) [223463-13-6] and 34.6 g of potassium carbonate (250 mmol) are weighed out into a 2 l four-necked flask with reflux condenser, argon blanketing, precision glass stirrer and internal thermometer, the flask is inertised with argon, and 500 ml of acetonitrile and 350 ml of absolute ethanol are added. 30 g of glass beads (diameter 3 mm) are added, and the suspension is homogenised for 5 minutes. 702 mg of bis(triphenylphosphine)-palladium(II) chloride (1 mmol) [13965-03-2] are then added. The reaction mixture is warmed under reflux overnight with vigorous stirring. After cooling, the solvent is removed in a rotary evaporator, and the residue is worked up by extraction with toluene and water in a separating funnel. The organic phase is washed 2× with 500 ml of water and 1× with 300 ml of saturated sodium chloride solution, dried over anhydrous sodium sulfate, and the solvent is subsequently removed in vacuo. The residue is taken up in dichloromethane and filtered through a silica gel frit, the silica gel is rinsed twice with 200 ml of dichloromethane/ethyl acetate 1:1 each time, the dichloromethane is stripped off in a rotary evaporator to 500 mbar. During removal of the dichloromethane in the rotary evaporator, a solid precipitates out of the ethyl acetate which remains and is filtered off with suction and washed with ethyl acetate. The crude product is recrystallised again from ethyl acetate. Yield: 24.2 g (72 mmol), 72%; purity: about 95% according to $^{1}$H-NMR.

Example B7

Procedure analogous to the description for B6. Recrystallisation from acetonitrile instead of from ethyl acetate. Yield 68%.

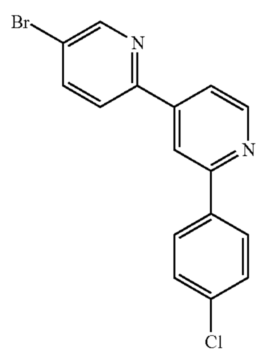 [SMILES: Clc1ccc(-c2cc(-c3ccc(Br)cn3)ccn2)cc1]

Example B8

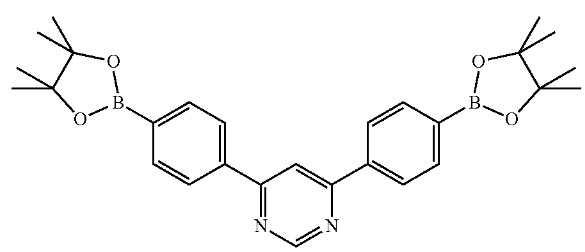

A mixture of 30.1 g (100 mmol) of 4,6-bis(4-chlorophenyl)pyrimidine [141034-82-4], 54.6 g (215 mmol) of bis(pinacolato)diborane [73183-34-3], 58.9 g (600 mmol) of potassium acetate, 2.3 g (8 mmol) of S-Phos [657408-07-6], 1.3 g (6 mmol) of palladium(II) acetate, 900 ml of 1,4-dioxane is heated under reflux for 16 h. The dioxane is removed in a rotary evaporator, and the black residue is worked up by extraction with 1000 ml of ethyl acetate and 500 ml of water in a separating funnel, the organic phase is washed 1× with 300 ml of water and once with 150 ml of saturated sodium chloride solution and filtered through a silica-gel bed. The silica gel is rinsed 2× with 250 ml of ethyl acetate. The filtrate is dried over sodium sulfate and evaporated to 150 ml. 400 ml of n-heptane are then added, and the remaining ethyl acetate is stripped off in the rotary evaporator to 200 mbar at a bath temperature of 55° C. During removal of the ethyl acetate in the rotary evaporator, a solid precipitates out of the n-heptane which remains. The precipitated solid is heated under reflux for 30 min and, after cooling, filtered off and washed 2× with 30 ml of n-heptane each time. Yield: 37.8 g (78 mmol), 78%. Purity: about 98% according to $^{1}$H NMR.

The following compounds can be prepared analogously:

| Ex. | Strarting material | Product/ reaction conditions if different | Yield |
|---|---|---|---|
| B9 | 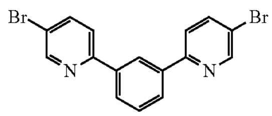 [1124297-90-0] | 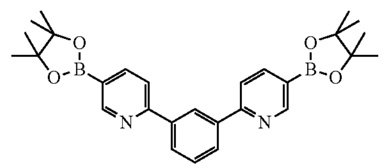 | 91% |
| B10 | 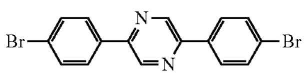 [55453-06-0] | 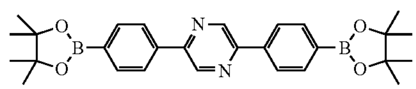 | 87% |
| B11 | 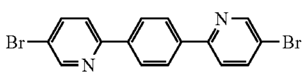 [183619-17-2] | 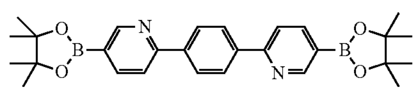 | 90% |
| B12 | 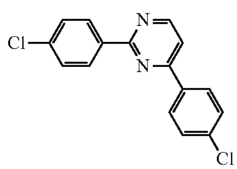 [1292783-80-2] | 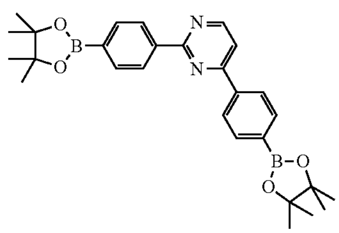 | 82% |
| B13 | 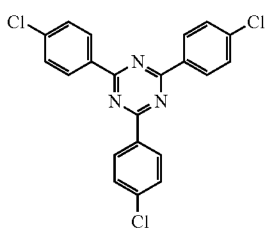 [3114-54-3] | 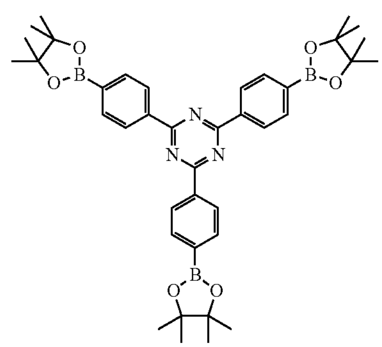 3.3 equiv. of bis(pinacolato)diborane, 9 equiv. of KOAc | 66% |
| B14 | 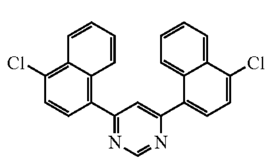 B1 | 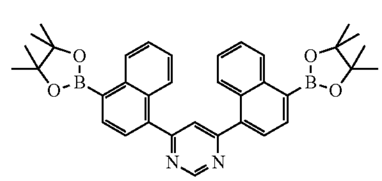 | 63% |
| B15 | 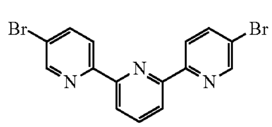 [223463-10-3] | 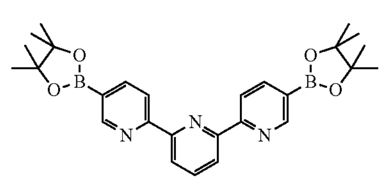 | 85% |

-continued
| Ex. | Strarting material | Product/ reaction conditions if different | Yield |
|---|---|---|---|
| B16 | 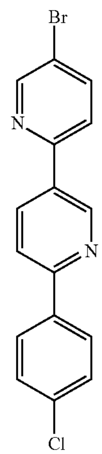 B6 | 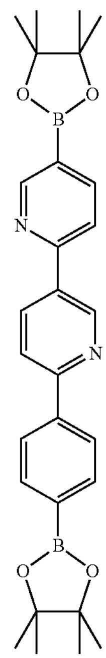 | 87% |
| B17 | 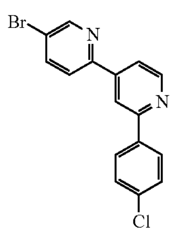 B7 | 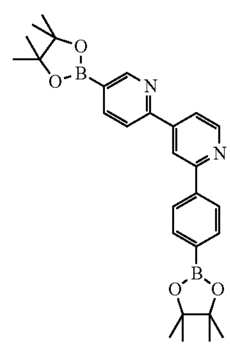 | 85% |
| B205 | 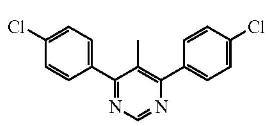 B204 | 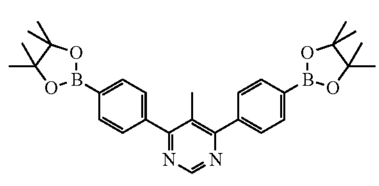 | 82% |

Example B18

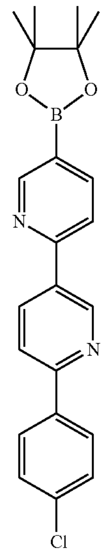

34.6 g (100 mmol) of B6, 25.4 g (100 mmol) of bis (pinacolato)diborane [73183-34-3], 29.4 g (300 mol) of potassium acetate [127-08-2] and 1.63 g (2 mmol) of ([1, 1'-bis(diphenylphosphino)ferrocene]palladium(II) dichloride complex with dichloromethane [95464-05-4] are weighed out into a 1000 ml four-necked flask with reflux condenser, precision glass stirrer, heating bath and argon connection, and 500 ml of 1,4-dioxane are added. 30 g of glass beads (diameter 3 mm) are added, and the reaction mixture is inertised with argon and stirred under reflux for 24 h. After cooling, the solvent is removed in vacuo, the residue obtained is worked up by extraction with 600 ml of ethyl acetate and 600 ml of water in a separating funnel. The organic phase is washed 1× with 500 ml of water and 1× with 300 ml of saturated sodium chloride solution, dried over anhydrous sodium sulfate and filtered through a frit packed with silica gel. The silica-gel bed is rinsed 2× with 500 ml of ethyl acetate, and the filtrate obtained is evaporated in vacuo. 500 ml of n-heptane are added to the brown solid obtained, and the suspension formed is boiled under reflux for 1 h. The solid is filtered off with suction and washed with 50 ml of n-heptane, giving a beige solid. Yield: 34.6 g (89 mmol), 89%; purity: 98% according to $^{1}$H-NMR.

Example B19

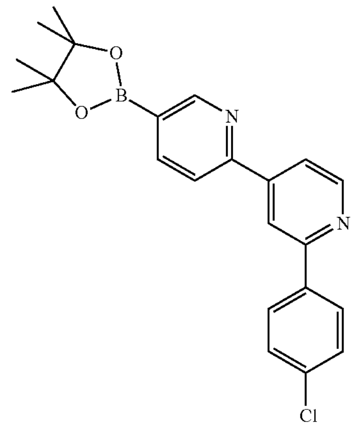 [SMILES: CC1(C)OB(c2ccc(-c3ccnc(-c4ccc(Cl)cc4)c3)nc2)OC1(C)C]

Procedure analogous to that of Example B18. B6 is replaced by B7 as starting material. Yield: 82%.

Example B20

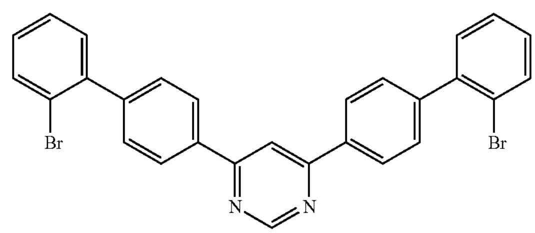 [SMILES: Brc1ccccc1-c1ccc(-c2cc(-c3ccc(-c4ccccc4Br)cc3)ncn2)cc1]

A mixture of 48.4 g (100 mmol) of B8, 56.6 g (200 mmol) of 1-bromo-2-iodobenzene [583-55-1], 63.6 g (600 mmol) of sodium carbonate, 5.8 g (5 mmol) of tetrakis(triphenylphosphine)palladium(0) [14221-01-3], 1000 ml of 1,2-dimethoxyethane and 500 ml of water is heated under reflux for 60 h. After cooling, the solid which has precipitated out is filtered off with suction and washed 3× with 100 ml of ethanol. The crude product is dissolved in 1000 ml of dichloromethane and filtered through a silica-gel bed which has been pre-slurried with dichloromethane. The silica gel is rinsed 3× with 100 ml of ethyl acetate each time. The dichloromethane is removed in a rotary evaporator to 500 mbar at a bath temperature of 50° C. During the removal of the dichloromethane in the rotary evaporator, a solid precipitates out of the ethyl acetate which remains. The solid which has precipitated out is filtered off and washed 2× with 20 ml of ethyl acetate. The solid obtained is recrystallised again from 2000 ml of boiling ethyl acetate. Yield 29.3 g (54 mmol), 54%; purity: 97% according to $^{1}$H-NMR.

The following compounds can be prepared analogously, where solvents such as, for example, ethyl acetate, cyclohexane, toluene, acetonitrile, n-heptane, ethanol or methanol can be used for the recrystallisation. It is also possible to carry out a hot extraction with these solvents, or the purification can be carried out by chromatography on silica gel on an automated column (Torrent from Axel Semrau).

| Ex. | Starting material | Product/reaction conditions if different | Yield |
|---|---|---|---|
| B21 | B9 | 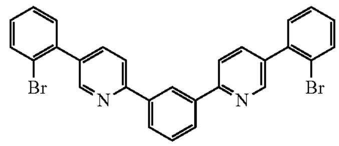 [SMILES: Brc1ccccc1-c1ccc(-c2cccc(-c3ccc(-c4ccccc4Br)cn3)c2)nc1] | 42% |
| B22 | B10 | 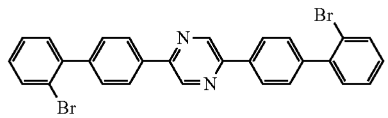 [SMILES: Brc1ccccc1-c1ccc(-c2cnc(-c3ccc(-c4ccccc4Br)cc3)cn2)cc1] | 53% |
| B23 | B11 | 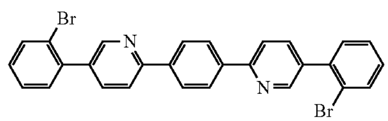 [SMILES: Brc1ccccc1-c1ccc(-c2ccc(-c3ccc(-c4ccccc4Br)cn3)cc2)nc1] | 47% |
| B24 | B12 | 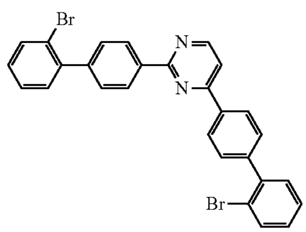 [SMILES: Brc1ccccc1-c1ccc(-c2ccnc(-c3ccc(-c4ccccc4Br)cc3)n2)cc1] | 40% |
| B25 | B13 | 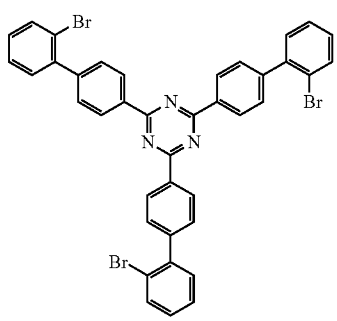 3 equiv. of 1-bromo-2-iodo-benzene, 9 equiv. of $Na_2CO_3$, 7 mol % of tetrakis(triphenyl-phosphine)palladium (0) | 32% |
| B26 | B14 | 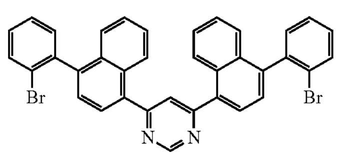 [SMILES: Brc1ccccc1-c1ccc(-c2cc(-c3ccc(-c4ccccc4Br)c4ccccc34)ncn2)c2ccccc12] | 35% |
| B27 | B15 | 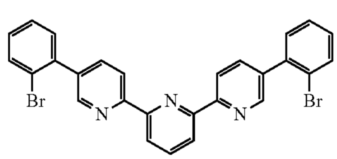 [SMILES: Brc1ccccc1-c1ccc(-c2cccc(-c3ccc(-c4ccccc4Br)cn3)n2)nc1] | 47% |

-continued
| Ex. | Starting material | Product/reaction conditions if different | Yield |
|---|---|---|---|
| B28 | B16 | 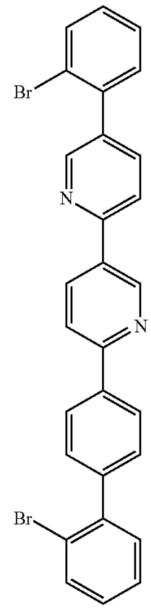 [SMILES: Brc1ccccc1-c1ccc(-c2ccc(-c3ccc(-c4ccccc4Br)cn3)cn2)cc1] | 41% |
| B29 | B17 | 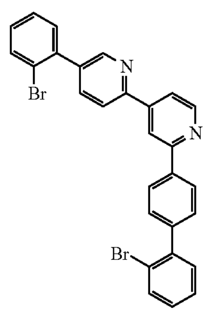 [SMILES: Brc1ccccc1-c1ccc(-c2cc(-c3ccc(-c4ccccc4Br)cn3)ccn2)cc1] | 44% |
| B30 | B18, 1 equiv. of 1-bromo-2-iodobenzene | 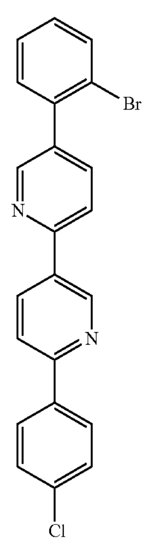 | 67% |

-continued

| Ex. | Starting material | Product/reaction conditions if different | Yield |
|---|---|---|---|
| B31 | B19, 1 equiv. of 1-bromo-2-iodobenzene | 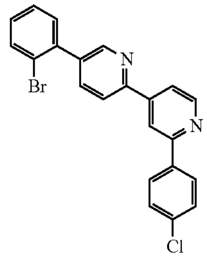 [SMILES: Clc1ccc(-c2cc(-c3ccc(-c4ccccc4Br)cn3)ccn2)cc1] | 52% |
| B206 | B205 | 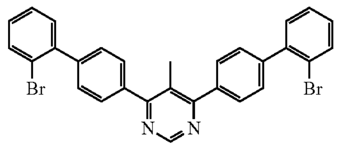 [SMILES: Cc1c(-c2ccc(-c3ccccc3Br)cc2)ncnc1-c1ccc(-c2ccccc2Br)cc1] | 46% |

Example B32

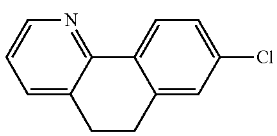

A mixture of 18.1 g (100 mmol) of 6-chlorotetralone [26673-31-4], 16.5 g (300 mmol) of propargylamine [2450-71-7], 796 mg (2 mmol) of sodium tetrachloroaurate(III) dihydrate and 200 ml of ethanol is stirred at 120° C. in an autoclave for 24 h. After cooling, the ethanol is removed in vacuo, the residue is taken up in 200 ml of ethyl acetate, the solution is washed three times with 200 ml of water, once with 100 ml of saturated sodium chloride solution, dried over magnesium sulfate and then filtered off from the latter through a pre-slurried silica-gel bed. After removal of the ethyl acetate in vacuo, the residue is chromatographed on silica gel with n-heptane/ethyl acetate (1:2 vv). Yield: 9.7 g (45 mmol), 45%. Purity: about 98% according to $^{1}$H-NMR.

Example B33

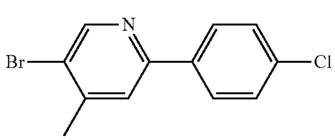

A mixture of 25.1 g (100 mmol) of 2,5-dibromo-4-methylpyridine [3430-26-0], 15.6 g (100 mmol) of 4-chlorophenylboronic acid [1679-18-1], 27.6 g (200 mmol) of potassium carbonate, 1.57 g (6 mmol) of triphenylphosphine [603-35-0], 676 mg (3 mmol) of palladium(II) acetate [3375-31-3], 200 g of glass beads (diameter 3 mm), 200 ml of acetonitrile and 100 ml of ethanol is heated under reflux for 48 h. After cooling, the solvents are removed in vacuo, 500 ml of toluene are added, the mixture is washed twice with 300 ml of water each time, once with 200 ml of saturated sodium chloride solution, dried over magnesium sulfate, filtered off through a pre-slurried silica-gel bed, and the latter is rinsed with 300 ml of toluene. After removal of the toluene in vacuo, the product is recrystallised once from methanol/ethanol (1:1 vv) and once from n-heptane. Yield: 17.3 g (61 mmol), 61%. Purity: about 95% according to $^{1}$H-NMR.

Example B34

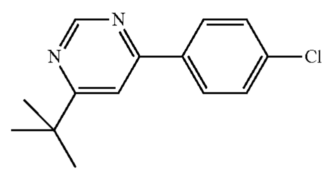 [SMILES: CC(C)(C)c1cc(-c2ccc(Cl)cc2)ncn1]

B34 can be prepared analogously to the procedure described for Example B33. To this end, 2,5-dibromo-4-methylpyridine is replaced by 4-bromo-6-tert-butylpyrimidine [19136-36-8]. Yield: 70%.

Example B35

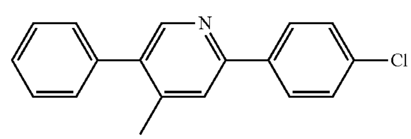 [SMILES: Cc1cc(-c2ccc(Cl)cc2)ncc1-c1ccccc1]

A mixture of 28.3 g (100 mmol) of B33, g (105 mmol) of phenylboronic acid, 31.8 g (300 mmol) of sodium carbonate, 787 mg (3 mmol) of triphenylphosphine, 225 mg (1 mmol) of palladium(II) acetate, 300 ml of toluene, 150 ml of ethanol and 300 ml of water is heated under reflux for 48 h. After cooling, the mixture is extended with 300 ml of toluene, the organic phase is separated off, washed once with 300 ml of water, once with 200 ml of saturated sodium chloride solution and dried over magnesium sulfate. After removal of the solvent, the residue is chromatographed on silica gel (toluene/ethyl acetate, 9:1 vv). Yield: 17.1 g (61 mmol), 61%. Purity: about 97% according to $^1$H-NMR.

The following compounds can be synthesised analogously:

| Ex. | Boronic ester | Product | Yield |
|---|---|---|---|
| B36 | 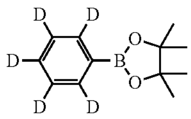 [245043-33-8] | 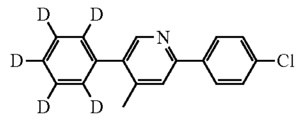 [SMILES: [2H]c1c([2H])c([2H])c(-c2cnc(-c3ccc(Cl)cc3)cc2C)c([2H])c1[2H]] | 56% |
| B37 | 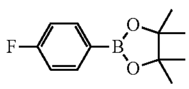 [214360-58-4] | 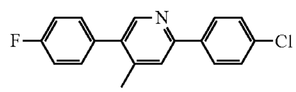 [SMILES: Cc1cc(-c2ccc(Cl)cc2)ncc1-c1ccc(F)cc1] | 61% |
| B38 | 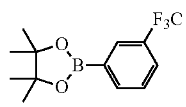 [325142-82-3] | 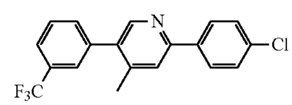 | 55% |
| B199 | 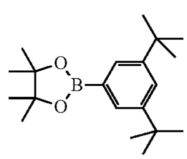 [1071924-13-4] | 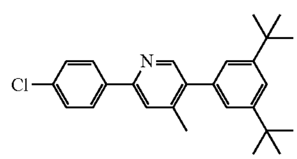 [SMILES: Cc1cc(-c2ccc(Cl)cc2)ncc1-c1cc(C(C)(C)C)cc(C(C)(C)C)c1] | 65% |

Example B39

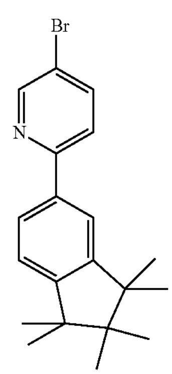 [SMILES: CC1(C)c2ccc(-c3ccc(Br)cn3)cc2C(C)(C)C1(C)C]

A mixture of 164.2 g (500 mmol) of 2-(1,1,2,2,3,3-hexamethylindan-5-yl)-4,4,5,5-tetramethyl-1,3,2-dioxaborolane [152418-16-9] (boronic acids can be employed analogously), 142.0 g (500 mmol) of 5-bromo-2-iodopyridine [223463-13-6], 159.0 g (1.5 mol) of sodium carbonate, 5.8 g (5 mmol) of tetrakis(triphenylphosphino)palladium(0), 700 ml of toluene, 300 ml of ethanol and 700 ml of water is heated under reflux for 16 h with vigorous stirring. After cooling, 1000 ml of toluene are added, the organic phase is separated off, and the aqueous phase is then extracted with 300 ml of toluene. The combined organic phases are washed once with 500 ml of saturated sodium chloride solution. After the organic phase has been dried over sodium sulfate and the solvent has been removed in vacuo, the crude product is recrystallised twice from about 300 ml of EtOH. Yield: 130.8 g (365 mmol), 73%. Purity: about 95% according to $^1$H-NMR.

The following compounds can be prepared analogously, where the pyridine derivative employed is generally 5-bromo-2-iodopyridine ([223463-13-6]), which is not shown separately in the following table: only different pyridine derivatives are explicitly shown in the table. Solvents such as ethyl acetate, cyclohexane, toluene, acetonitrile, n-heptane, ethanol or methanol can be used for the recrystallisation. It is also possible to carry out a hot extraction with these solvents, or the purification can be carried out by chromatography on silica gel on an automated column (Torrent from Axel Semrau).

| Ex. | Boronic acid/ester Pyridine | Product | Yield |
|---|---|---|---|
| B40 | 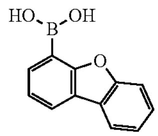 [100124-06-9] | 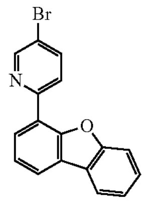 [SMILES: Brc1ccc(-c2cccc3c2oc2ccccc23)nc1] | 69% |
| B41 | 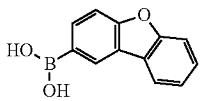 [402936-15-6] | 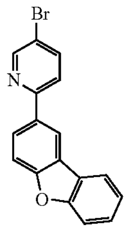 [SMILES: Brc1ccc(-c2ccc3oc4ccccc4c3c2)nc1] | 71% |
| B42 | 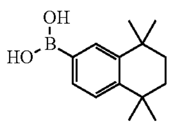 [169126-63-0] | 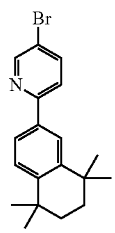 | 78% |
| B43 | 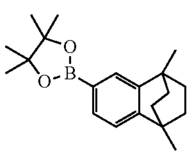 [1801624-61-2] | 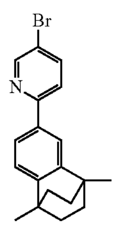 [SMILES: CC12CCC(C)(CC1)c1cc(-c3ccc(Br)cn3)ccc12] | 78% |
| B44 | 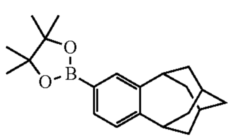 in accordance with WO 2016/124304 | 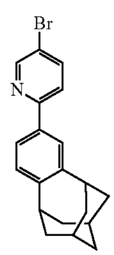 [SMILES: Brc1ccc(-c2ccc3c(c2)C2CC4CC(CC3C4)C2)nc1] | 81% |
| B45 | 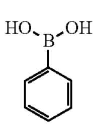 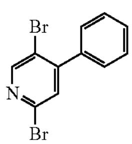 [98-80-6]/[1381937-40-1] | 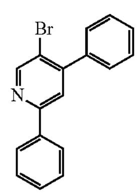 [SMILES: Brc1cnc(-c2ccccc2)cc1-c1ccccc1] | 73% |

-continued

| Ex. | Boronic acid/ester Pyridine | Product | Yield |
|---|---|---|---|
| B46 | 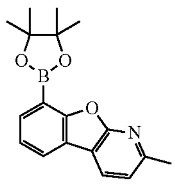 [1609374-04-0] | 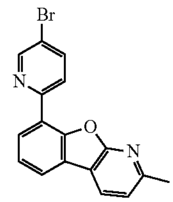 [SMILES: Cc1ccc2c(n1)oc1c(-c3ccc(Br)cn3)cccc12] | 68% |
| B47 | 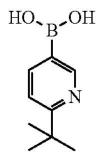 1174312-53-8 | 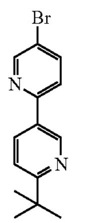 | 63% |

Example B48

Variant A:

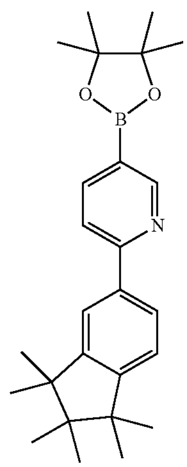

A mixture of 35.8 g (100 mmol) of B39, 25.4 g (100 mmol) of bis(pinacolato)diborane [73183-34-3], 49.1 g (500 mmol) of potassium acetate, 1.5 g (2 mmol) of 1,1-bis(diphenylphosphino)ferrocenepalladium(II) dichloride complex with dichloromethane [95464-05-4], 200 g of glass beads (diameter 3 mm), 700 ml of 1,4-dioxane and 700 ml of toluene is heated under reflux for 16 h. After cooling, the suspension is filtered through a Celite bed, and the solvent is removed in vacuo. The black residue is digested with 1000 ml of hot n-heptane, cyclohexane or toluene, filtered off while still hot through a Celite bed, then evaporated to about 200 ml, during which the product begins to crystallise. Alternatively, a hot extraction can be carried out with ethyl acetate. The crystallisation is completed overnight in the refrigerator, the crystals are filtered off and washed with a little n-heptane. A second product fraction can be obtained from the mother liquor. Yield: 31.6 g (78 mmol), 78%. Purity: about 95% according to $^{1}$H-NMR.

Variant B: Reaction of Aryl Chlorides

As for variant A, but the 1,1-bis(diphenylphosphino)ferrocenepalladium(II) dichloride complex with dichloromethane is replaced by 2 mmol of S-Phos [657408-07-6] and 1 mmol of palladium(II) acetate.

The following compounds can be prepared analogously, where cyclohexane, toluene, acetonitrile or mixtures of the said solvents can also be used instead of n-heptane for the purification:

| Ex. | Bromide—variant A Chloride—variant B | Product | Yield |
|---|---|---|---|
| B49 | 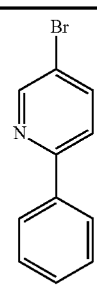 [27012-25-5] | 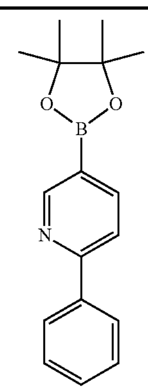 | 85% |

-continued
| Ex. | Bromide—variant A<br>Chloride—variant B | Product | Yield |
| --- | --- | --- | --- |
| B50 | 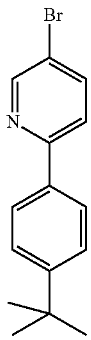<br>[1215073-34-9] | 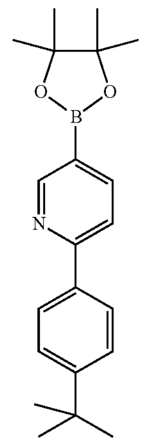 | 80% |
| B51 | 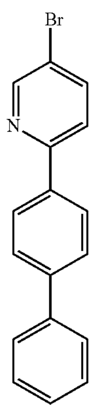<br>[1035556-84-3] | 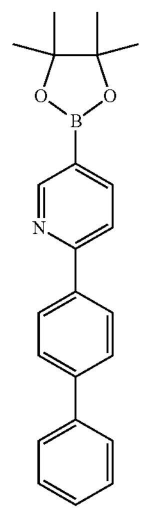 | 83% |
| B52 | 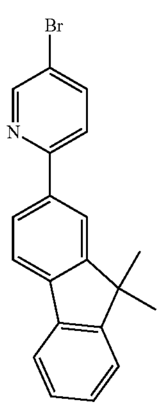<br>[1486482-87-4] | 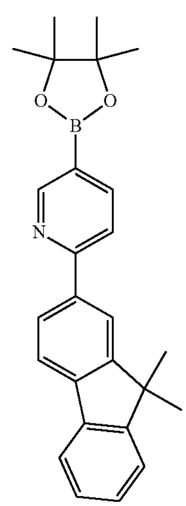 | 77% |

-continued
| Ex. | Bromide—variant A<br>Chloride—variant B | Product | Yield |
|---|---|---|---|
| B53 | 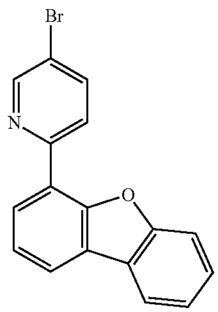<br>B40 | 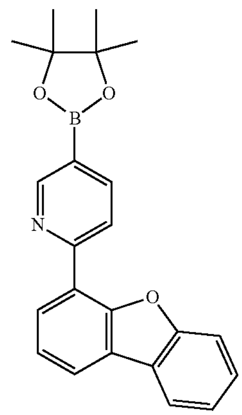 [SMILES: CC1(C)OB(c2ccc(-c3cccc4c3oc3ccccc34)nc2)OC1(C)C] | 67% |
| B54 | 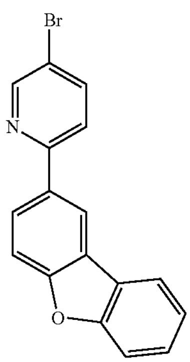<br>B41 | 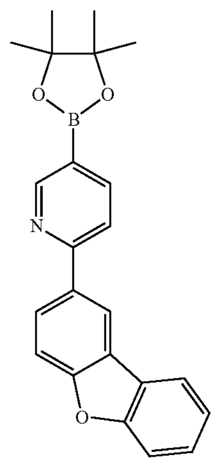 [SMILES: CC1(C)OB(c2ccc(-c3ccc4oc5ccccc5c4c3)nc2)OC1(C)C] | 70% |
| B55 | 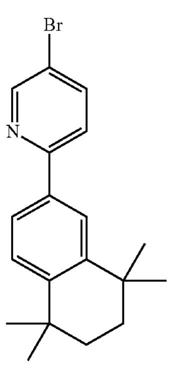<br>B42 | 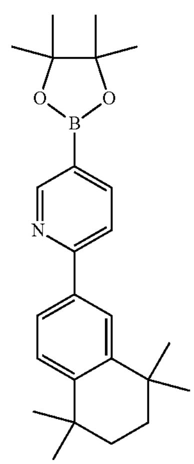 | 80% |

-continued
| Ex. | Bromide—variant A<br>Chloride—variant B | Product | Yield |
|---|---|---|---|
| B56 | 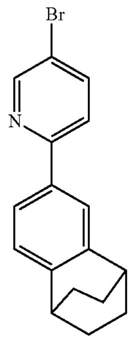<br>B43 | 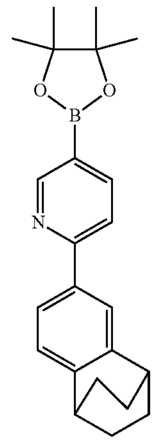 [SMILES: CC1(C)OB(c2ccc(-c3ccc4c(c3)C3CCC4CC3)nc2)OC1(C)C] | 80% |
| B57 | 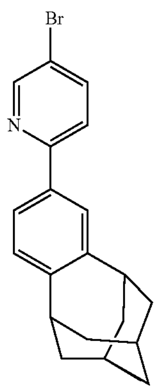<br>B44 | 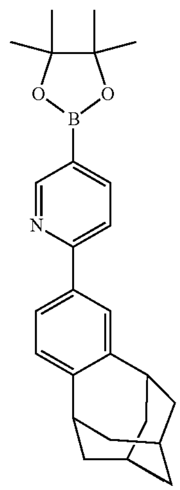 [SMILES: CC12CC3CC(C1)c1ccc(-c4ccc(B5OC(C)(C)C(C)(C)O5)cn4)cc1C(C3)C2] | 78% |
| B58 | 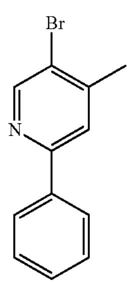<br>[31686-64-3] | 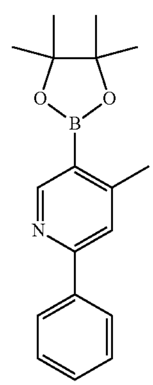 | 74% |

-continued
| Ex. | Bromide—variant A<br>Chloride—variant B | Product | Yield |
|---|---|---|---|
| B59 | 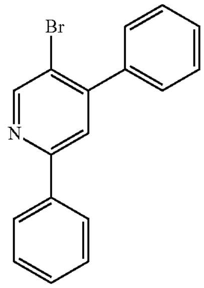<br>B45 | 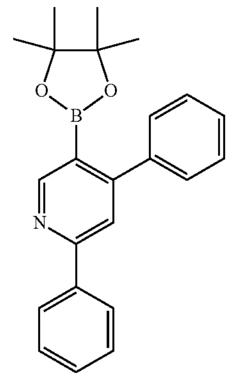 [SMILES: CC1(C)OB(c2cnc(-c3ccccc3)cc2-c2ccccc2)OC1(C)C] | 70% |
| B60 | 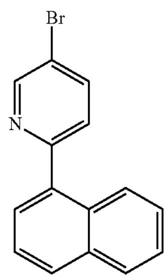<br>[88345-95-3] | 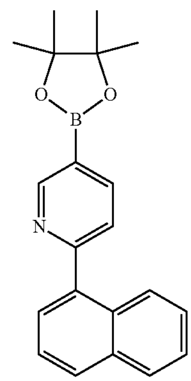 | 68% |
| B61 | 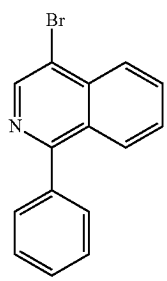<br>[22960-25-4] | 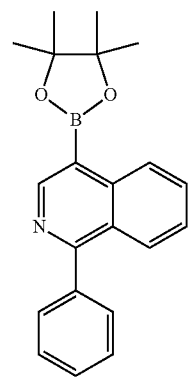 [SMILES: CC1(C)OB(c2cnc(-c3ccccc3)c3ccccc23)OC1(C)C] | 76% |
| B62 | 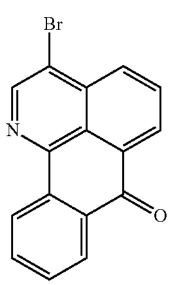<br>[57669-37-1] | 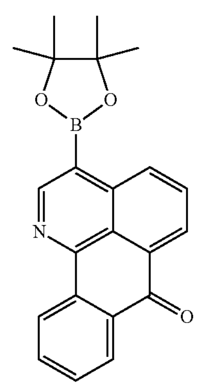 [SMILES: CC1(C)OB(c2cnc3c4c(cccc24)C(=O)c2ccccc2-3)OC1(C)C] | 83% |

-continued
| Ex. | Bromide—variant A<br>Chloride—variant B | Product | Yield |
|---|---|---|---|
| B63 | 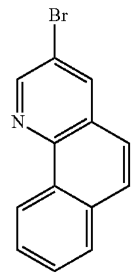<br>[68473-51-8] | 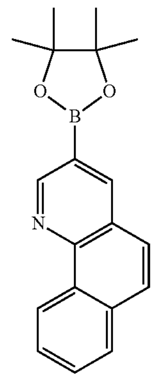 [SMILES: CC1(C)OB(c2cnc3c(ccc4ccccc43)c2)OC1(C)C] | 85% |
| B64 | 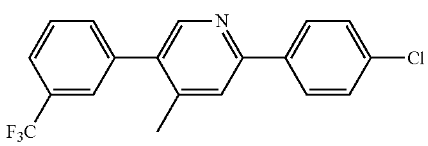<br>B38 | 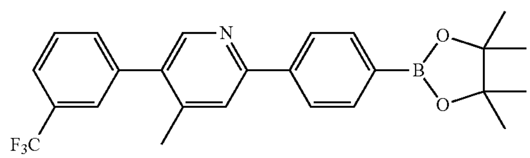 [SMILES: Cc1cc(-c2ccc(B3OC(C)(C)C(C)(C)O3)cc2)ncc1-c1cccc(C(F)(F)F)c1] | 55% |
| B65 | 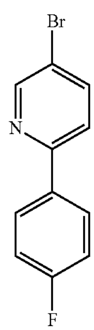<br>[463336-07-4] | 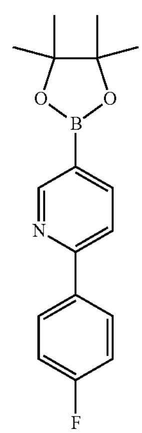 | 72% |
| B66 | 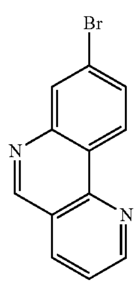<br>[1039080-00-6] | 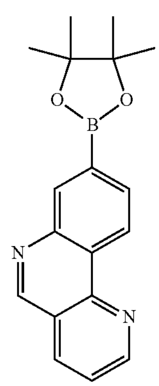 [SMILES: CC1(C)OB(c2ccc3c(c2)ncc2cccnc23)OC1(C)C] | 78% |

-continued
| Ex. | Bromide—variant A<br>Chloride—variant B | Product | Yield |
|---|---|---|---|
| B67 | 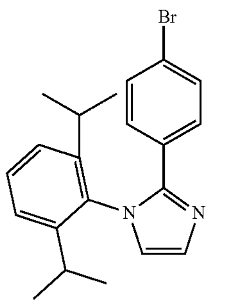<br>[1492036-00-6] | 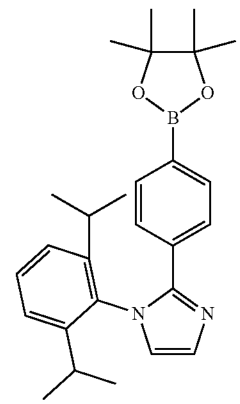 [SMILES: CC(C)c1cccc(C(C)C)c1-n1ccnc1-c1ccc(B2OC(C)(C)C(C)(C)O2)cc1] | 82% |
| B68 | 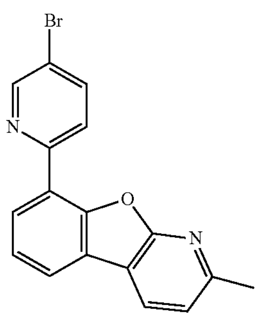<br>B45 | 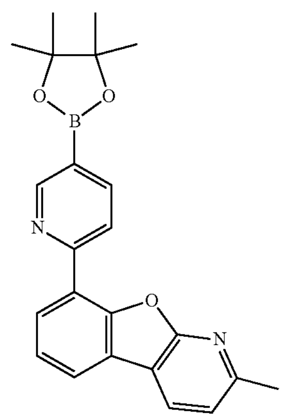 | 60% |
| B69 | 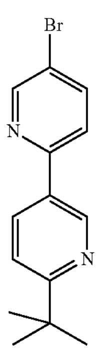<br>B47 | 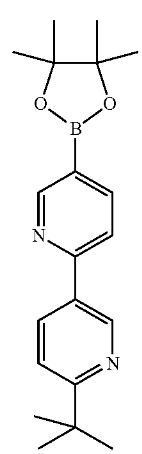 | 75% |

-continued
| Ex. | Bromide—variant A<br>Chloride—variant B | Product | Yield |
|---|---|---|---|
| B70 | 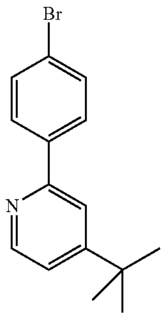<br>[1246851-70-6] | 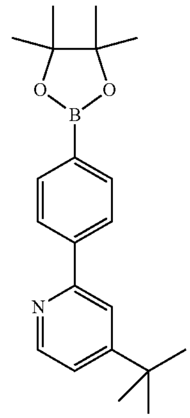 [SMILES: CC(C)(C)c1ccnc(-c2ccc(B3OC(C)(C)C(C)(C)O3)cc2)c1] | 88% |
| B71 | 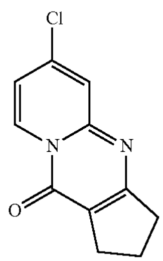<br>[60781-85-3] | 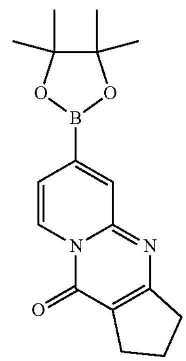 [SMILES: CC1(C)OB(c2ccn3c(=O)c4c(nc3c2)CCC4)OC1(C)C] | 78% |
| B72 | 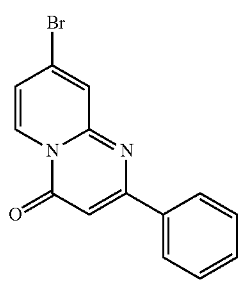<br>[1338923-08-2] | 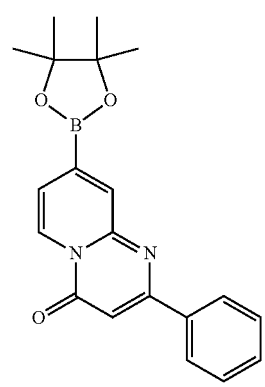 [SMILES: CC1(C)OB(c2ccn3c(=O)cc(-c4ccccc4)nc3c2)OC1(C)C] | 82% |
| B73 | 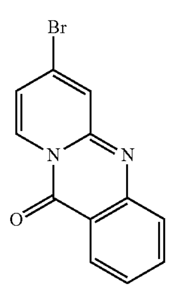<br>[1446208-20-3] | 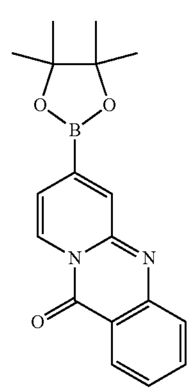 [SMILES: CC1(C)OB(c2ccn3c(=O)c4ccccc4nc3c2)OC1(C)C] | 80% |

-continued
| Ex. | Bromide—variant A<br>Chloride—variant B | Product | Yield |
|---|---|---|---|
| B74 | 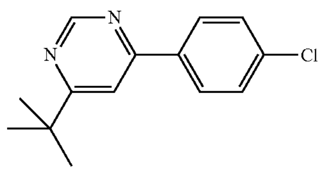<br>B34 | 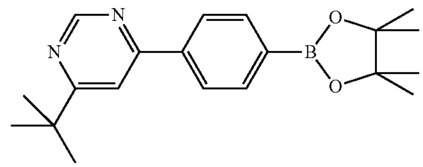 [SMILES: CC(C)(C)c1cc(-c2ccc(B3OC(C)(C)C(C)(C)O3)cc2)ncn1] | 85% |
| B75 | 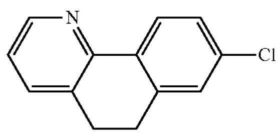<br>B32 | 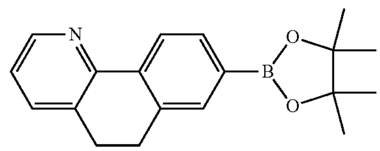 [SMILES: CC1(C)OB(c2ccc3c(c2)CCc2cccnc2-3)OC1(C)C] | 88% |
| B76 | 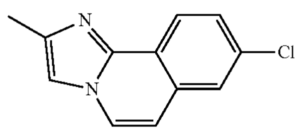<br>[102200-03-3] | 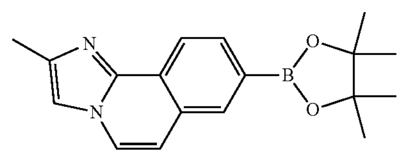 | 76% |
| B77 | 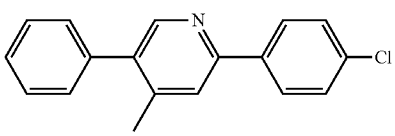<br>B35 | 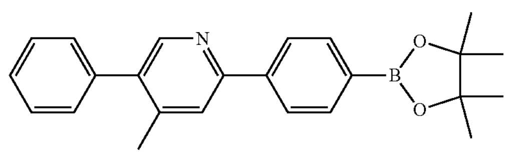 [SMILES: Cc1cc(-c2ccc(B3OC(C)(C)C(C)(C)O3)cc2)ncc1-c1ccccc1] | 81% |
| B78 | 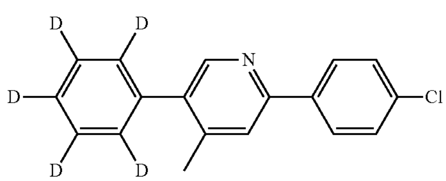<br>B36 | 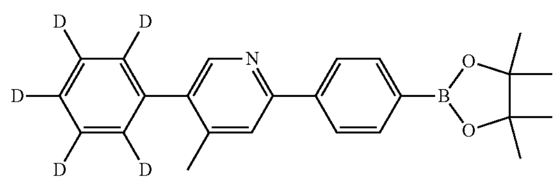 [SMILES: [2H]c1c([2H])c([2H])c(-c2cnc(-c3ccc(B4OC(C)(C)C(C)(C)O4)cc3)cc2C)c([2H])c1[2H]] | 78% |
| B79 | 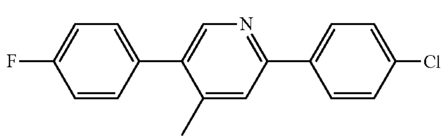<br>B37 | 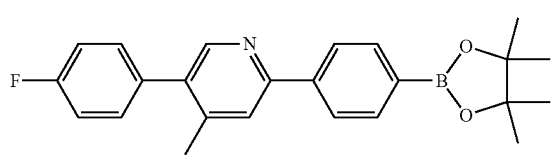 [SMILES: Cc1cc(-c2ccc(B3OC(C)(C)C(C)(C)O3)cc2)ncc1-c1ccc(F)cc1] | 75% |
| B200 | 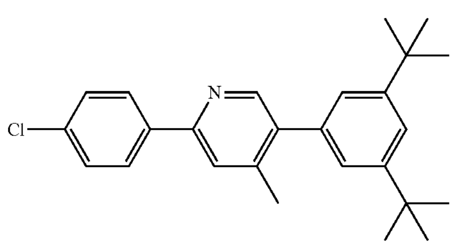<br>B199 | 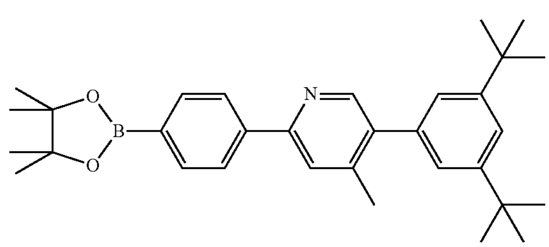 [SMILES: Cc1cc(-c2ccc(B3OC(C)(C)C(C)(C)O3)cc2)ncc1-c1cc(C(C)(C)C)cc(C(C)(C)C)c1] | 78% |

Example B80

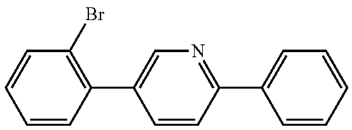 [SMILES: Brc1ccccc1-c1ccc(-c2ccccc2)nc1]

A mixture of 28.1 g (100 mmol) of B49, 28.2 g (100 mmol) of 1-bromo-2-iodobenzene [583-55-1], 31.8 g (300 mmol) of sodium carbonate, 787 mg (3 mmol) of triphenylphosphine, 225 mg (1 mmol) of palladium(II) acetate, 300 ml of toluene, 150 ml of ethanol and 300 ml of water is heated under reflux for 24 h. After cooling, the mixture is extended with 500 ml of toluene, the organic phase is separated off, washed once with 500 ml of water, once with 500 ml of saturated sodium chloride solution and dried over magnesium sulfate. After removal of the solvent, the residue is recrystallised from ethyl acetate/n-heptane or chromatographed on silica gel (toluene/ethyl acetate, 9:1 vv). Yield: 22.7 g (73 mmol), 73%. Purity: about 97% according to $^1$H-NMR.

The following compounds can be prepared analogously, where solvents such as, for example, ethyl acetate, cyclohexane, toluene, acetonitrile, n-heptane, ethanol or methanol can be used for the recrystallisation. It is also possible to carry out a hot extraction with these solvents, or the purification can be carried out by chromatography on silica gel on an automated column (Torrent from Axel Semrau).

| Ex. | Boronic ester | Product | Yield |
|---|---|---|---|
| B81 | 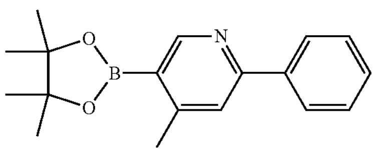 B58 | 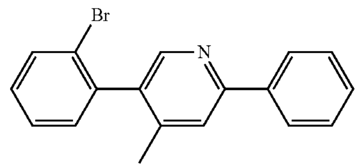 [SMILES: Cc1cc(-c2ccccc2)ncc1-c1ccccc1Br] | 56% |
| B82 | 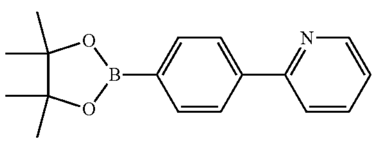 [908350-80-1] | 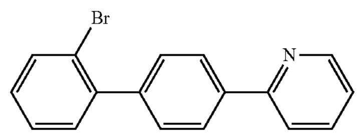 [SMILES: Brc1ccccc1-c1ccc(-c2ccccn2)cc1] | 72% |
| B83 | 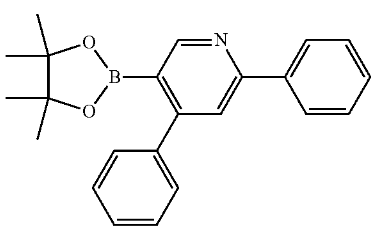 B59 | 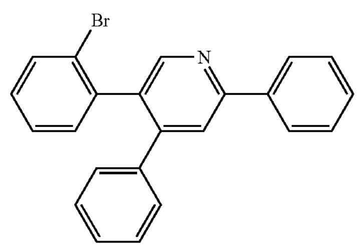 [SMILES: Brc1ccccc1-c1cnc(-c2ccccc2)cc1-c1ccccc1] | 71% |
| B84 | 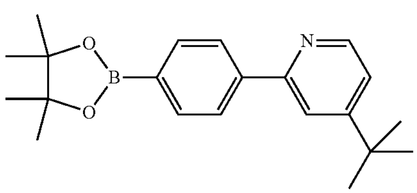 B70 | 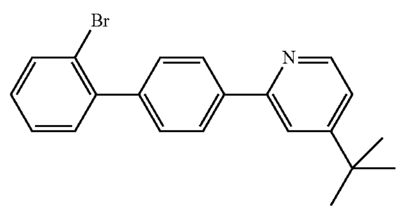 [SMILES: CC(C)(C)c1ccnc(-c2ccc(-c3ccccc3Br)cc2)c1] | 70% |
| B85 | 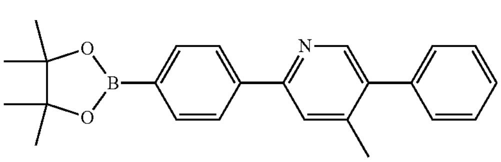 B77 | 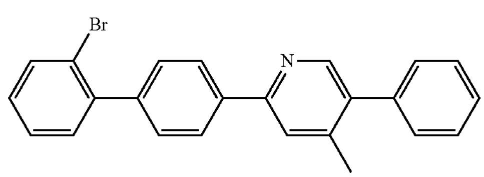 [SMILES: Cc1cc(-c2ccc(-c3ccccc3Br)cc2)ncc1-c1ccccc1] | 69% |

-continued
| Ex. | Boronic ester | Product | Yield |
|---|---|---|---|
| B86 | 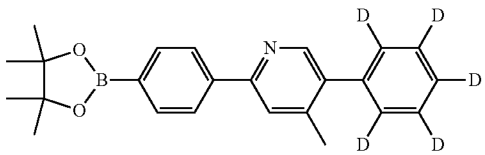<br>B78 | 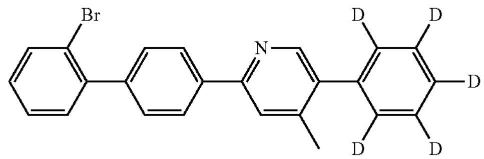 | 67% |
| B87 | 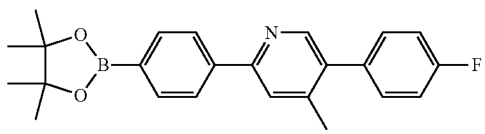<br>B79 | 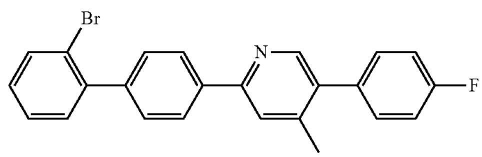 [SMILES: Cc1cc(-c2ccc(-c3ccccc3Br)cc2)ncc1-c1ccc(F)cc1] | 63% |
| B88 | 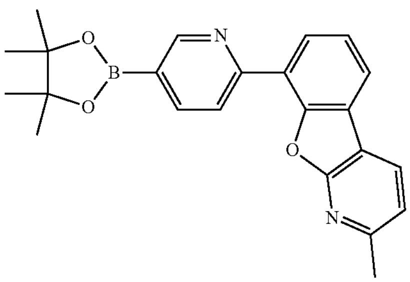<br>B68 | 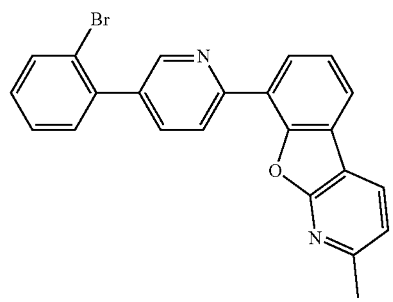 [SMILES: Cc1ccc2c(n1)oc1c(-c3ccc(-c4ccccc4Br)cn3)cccc12] | 70% |
| B89 | 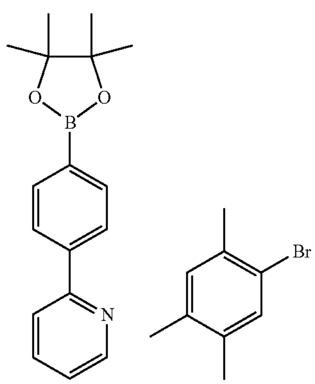<br>[908350-80-1]/[96843-22-0] | 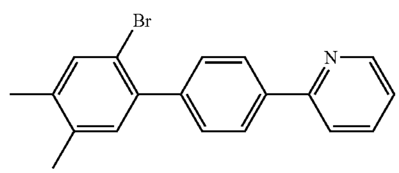 [SMILES: Cc1cc(Br)c(-c2ccc(-c3ccccn3)cc2)cc1C] | 73% |
| B90 | 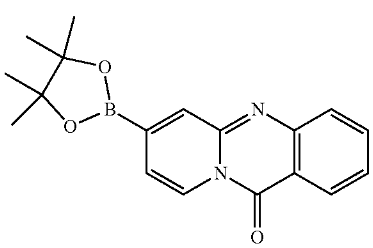<br>B73 | 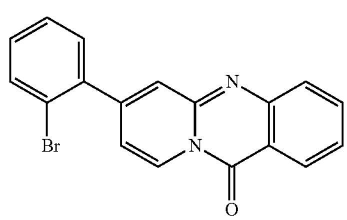 [SMILES: O=c1c2ccccc2nc2cc(-c3ccccc3Br)ccn12] | 72% |

-continued
| Ex. | Boronic ester | Product | Yield |
|---|---|---|---|
| B91 | 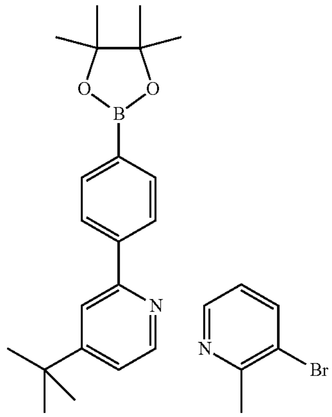 B70/[408502-43-2] | 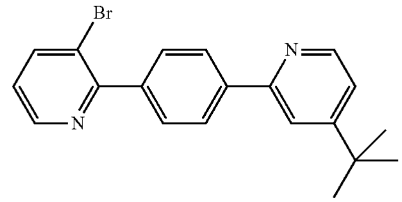 [SMILES: CC(C)(C)c1ccnc(-c2ccc(-c3ncccc3Br)cc2)c1] | 48% |
| B92 | 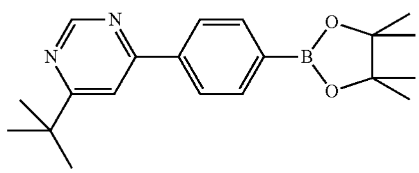 B74 | 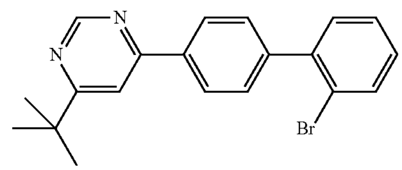 | 65% |
| B93 | 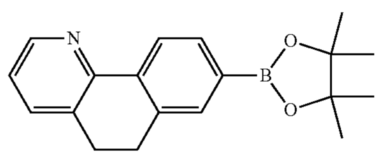 B75 | 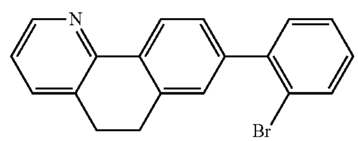 [SMILES: Brc1ccccc1-c1ccc2c(c1)CCc1cccnc1-2] | 65% |
| B94 | 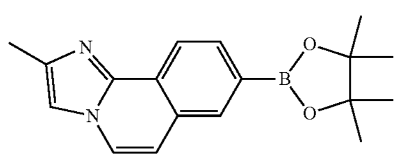 B76 | 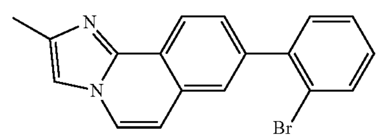 [SMILES: Cc1cn2ccc3cc(-c4ccccc4Br)ccc3c2n1] | 68% |
| B95 | 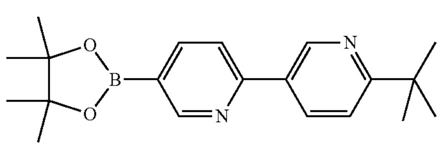 B69 | 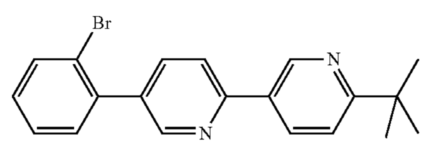 [SMILES: CC(C)(C)c1ccc(-c2ccc(-c3ccccc3Br)cn2)cn1] | 77% |
| B96 | 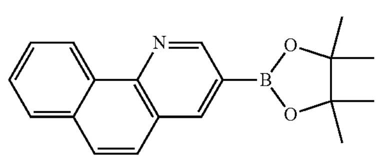 B63 | 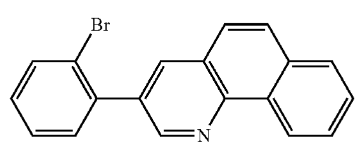 | 70% |
| B97 | 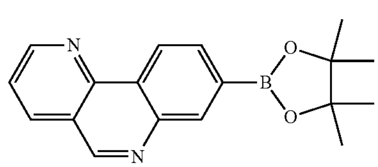 B66 | 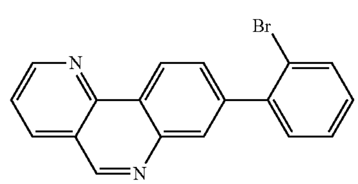 [SMILES: Brc1ccccc1-c1ccc2c(c1)ncc1cccnc12] | 66% |

-continued
| Ex. | Boronic ester | Product | Yield |
|---|---|---|---|
| B98 | 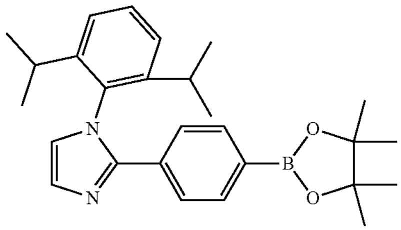 B67 | 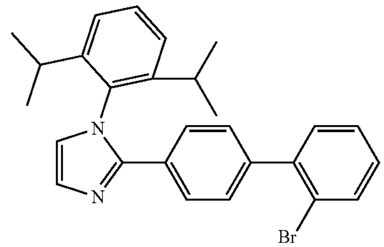 [SMILES: CC(C)c1cccc(C(C)C)c1-n1ccnc1-c1ccc(-c2ccccc2Br)cc1] | 71% |
| B99 | 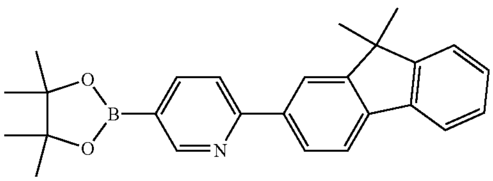 B52 | 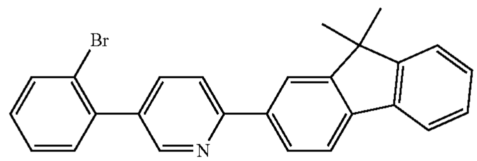 [SMILES: CC1(C)c2ccccc2-c2ccc(-c3ccc(-c4ccccc4Br)cn3)cc21] | 64% |
| B100 | 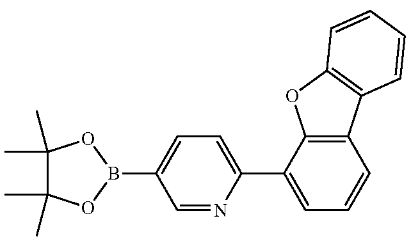 B53 | 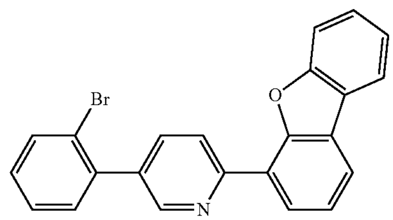 [SMILES: Brc1ccccc1-c1ccc(-c2cccc3c2oc2ccccc23)nc1] | 58% |
| B101 | 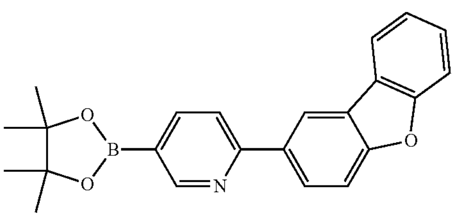 B54 | 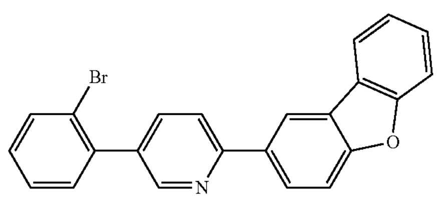 [SMILES: Brc1ccccc1-c1ccc(-c2ccc3oc4ccccc4c3c2)nc1] | 62% |
| B102 | 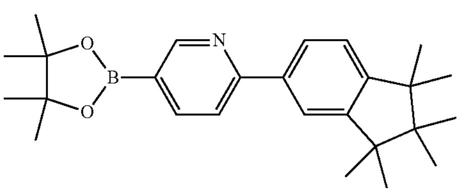 B48 | 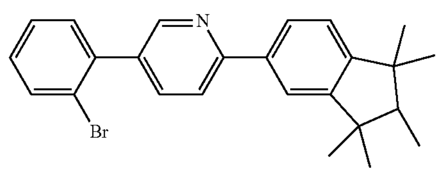 [SMILES: CC1C(C)(C)c2ccc(-c3ccc(-c4ccccc4Br)cn3)cc2C1(C)C] | 75% |
| B103 | 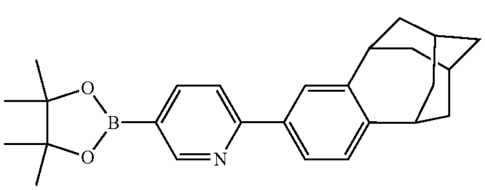 B57 | 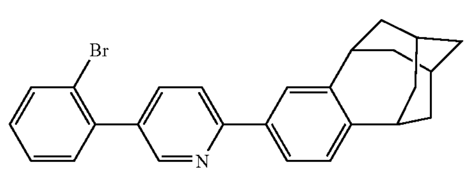 [SMILES: Brc1ccccc1-c1ccc(-c2ccc3c(c2)C2CC4CC(CC3C4)C2)nc1] | 78% |

-continued

| Ex. | Boronic ester | Product | Yield |
|---|---|---|---|
| B104 | 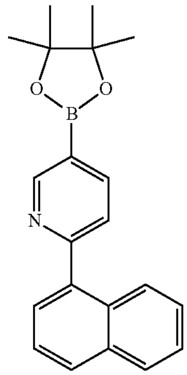 B60 | 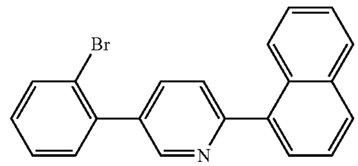 [SMILES: Brc1ccccc1-c1ccc(-c2cccc3ccccc23)nc1] | 82% |
| B201 | 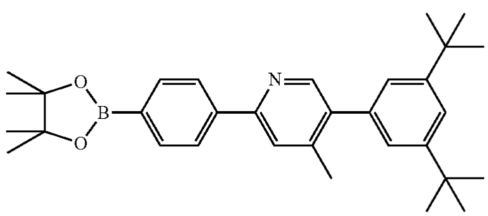 B200 | 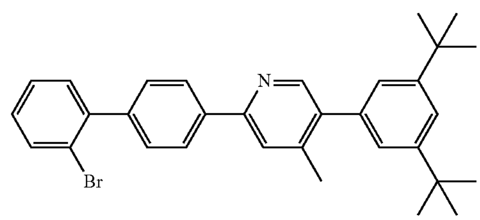 | 74% |

Example B106

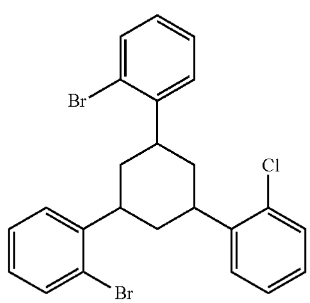 [SMILES: Clc1ccccc1C1CC(c2ccccc2Br)CC(c2ccccc2Br)C1]

a)

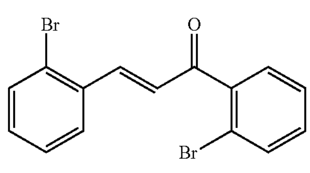 [SMILES: O=C(/C=C/c1ccccc1Br)c1ccccc1Br]

Preparation in accordance with G. Markopoulos et al., Angew. Chem., Int. Ed., 2012, 51, 12884.

b)

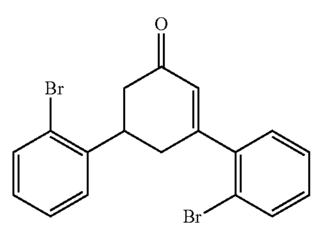 [SMILES: O=C1C=C(c2ccccc2Br)CC(c2ccccc2Br)C1]

Procedure in accordance with JP 2000-169400. 5.7 g (105 mmol) of sodium methoxide are added in portions to a solution of 36.6 g (100 mmol) of 1,3-bis(2-bromophenyl)-2-propen-1-one [126824-93-9], step a), in 300 ml of dry acetone, and the mixture is then stirred at 40° C. for 12 h. The solvent is removed in vacuo, the residue is taken up in ethyl acetate, washed three times with 200 ml of water each time, twice with 200 ml of saturated sodium chloride solution each time and dried over magnesium sulfate. The oil obtained after removal of the solvent in vacuo is subjected to flash chromatography (Torrent CombiFlash, Axel Semrau). Yield: 17.9 g (44 mmol), 44%. Purity: about 97% according to $^{1}$H-NMR.

c)

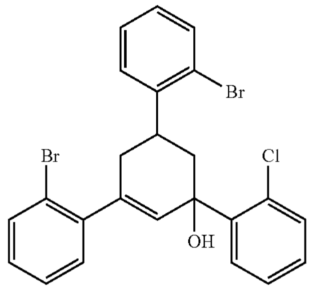 [SMILES: OC1(c2ccccc2Cl)C=C(c2ccccc2Br)CC(c2ccccc2Br)C1]

2.4 g (2.4 mmol) of anhydrous copper(I) chloride [7758-89-6] are added at 0° C. to a solution of 2-chlorophenyl-magnesium bromide (200 mmol) [36692-27-0] in 200 ml of di-n-butyl ether, and the mixture is stirred for a further 30 min. A solution of 40.6 g (100 mmol) of step b) in 200 ml of toluene is then added dropwise over the course of 30 min., and the mixture is stirred at 0° C. for a further 5 h. The reaction mixture is quenched by careful addition of 100 ml of water and then with 220 ml of 1N hydrochloric acid. The organic phase is separated off, washed twice with 200 ml of water each time, once with 200 ml of saturated sodium hydrogencarbonate solution, once with 200 ml of saturated sodium chloride solution and dried over magnesium sulfate. The oil obtained after removal of the solvent in vacuo is filtered through silica gel with toluene. The crude product obtained in this way is reacted further without further purification. Yield: 49.8 g (96 mmol), 96%. Purity: about 90-95% according to $^{1}$H-NMR.

d)

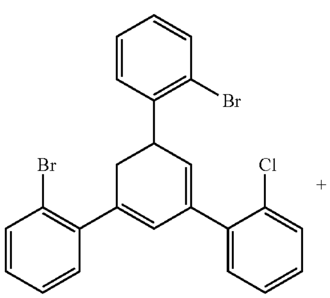

-continued

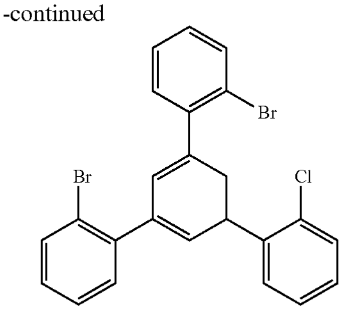

1.0 ml of trifluoromethanesulfonic acid and then, in portions, 50 g of phosphorus pentoxide are added to a solution, cooled to 0° C., of 51.9 g (100 mmol) of step c) in 500 ml of dichloromethane (DCM). The mixture is allowed to warm to room temperature and is stirred for a further 2 h. The supernatant is decanted off from the phosphorus pentoxide, the latter is suspended in 200 ml of DCM, and the supernatant is again decanted off. The combined DCM phases are washed twice with water and once with saturated sodium chloride solution and dried over magnesium sulfate. The wax obtained after removal of the solvent in vacuo is subjected to flash chromatography (Torrent CombiFlash, Axel Semrau). Yield: 31.5 g (63 mmol), 63%, isomer mixture. Purity: about 90-95% according to $^{1}$H-NMR.

e)

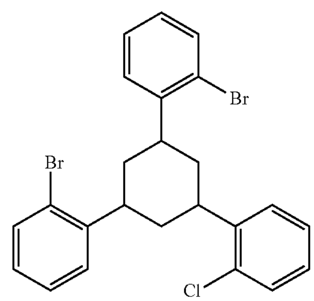 [SMILES: Clc1ccccc1C1CC(c2ccccc2Br)CC(c2ccccc2Br)C1]

A mixture of 25.0 g (50 mmol) of step d), 2 g of Pd/C (10%), 200 ml of methanol and 300 ml of ethyl acetate is charged with 3 bar of hydrogen in a stirred autoclave and hydrogenated at 30° C. until the uptake of hydrogen is complete. The mixture is filtered through a Celite bed which has been pre-slurried with ethyl acetate, the filtrate is evaporated to dryness. The oil obtained in this way is subjected to flash chromatography (Torrent CombiFlash, Axel Semrau). Yield: 17.2 g (34 mmol), 68%. Purity: about 95% according to $^{1}$H-NMR, cis,cis isomer.

The following compounds can be prepared analogously.

| Ex. | Starting materials if different from B106 | Product | Yield a) to e) |
|---|---|---|---|
| B107 | 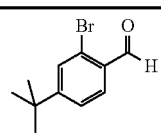 [246139-77-5] | 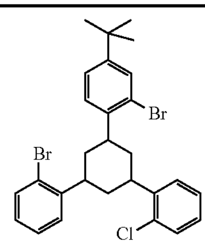 | 21% |

-continued

| Ex. | Starting materials if different from B106 | Product | Yield a) to e) |
|---|---|---|---|
| B108 | [246139-77-5] + [147438-85-5] 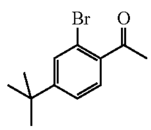 | 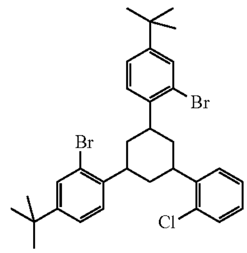 [SMILES: CC(C)(C)c1ccc(C2CC(c3ccccc3Cl)CC(c3ccc(C(C)(C)C)cc3Br)C2)c(Br)c1] | 19% |
| B109 | [246139-77-5] + [147438-85-5] 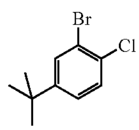 | 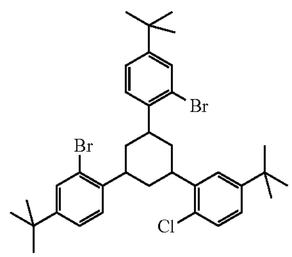 [SMILES: CC(C)(C)c1ccc(C2CC(c3cc(C(C)(C)C)ccc3Cl)CC(c3ccc(C(C)(C)C)cc3Br)C2)c(Br)c1] | 14% |

Example B110

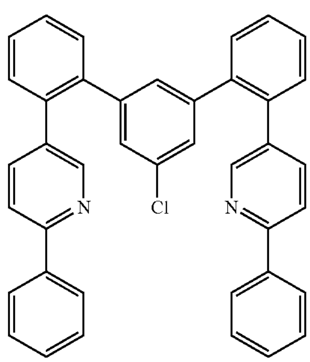 [SMILES: Clc1cc(-c2ccccc2-c2ccc(-c3ccccn3)cc2)cc(-c2ccccc2-c2ccc(-c3ccccn3)cc2)c1]

A mixture of 36.4 g (100 mmol) of 2,2'-(5-chloro-1,3-phenylene)-bis-[4,4,5,5-tetramethyl-1,3,2-dioxaborolane [1417036-49-7], 65.2 g (210 mmol) of B80, 42.4 g (400 mmol) of sodium carbonate, 1.57 g (6 mmol) of triphenylphosphine, 500 mg (2 mmol) of palladium(II) acetate, 500 ml of toluene, 200 ml of ethanol and 500 ml of water is heated under reflux for 48 h. After cooling, the mixture is extended with 500 ml of toluene, the organic phase is separated off, washed once with 500 ml of water, once with 500 ml of saturated sodium chloride solution and dried over magnesium sulfate. After removal of the solvent, the residue is chromatographed on silica gel (n-heptane/ethyl acetate 2:1 vv). Yield: 41.4 g (68 mmol), 68%. Purity: about 95% according to $^{1}$H-NMR.

The following compounds can be prepared analogously, where solvents such as, for example, ethyl acetate, cyclohexane, toluene, acetonitrile, n-heptane, ethanol or methanol can be used for the recrystallisation. It is also possible to carry out a hot extraction with these solvents, or the purification can be carried out by chromatography on silica gel on an automated column (Torrent from Axel Semrau).

| Ex. | Bromide | Product | Yield |
|---|---|---|---|
| B111 | 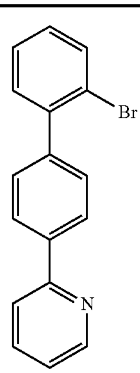 B82 | 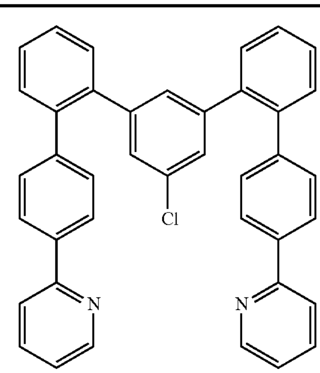 | 67% |

-continued
| Ex. | Bromide | Product | Yield |
| --- | --- | --- | --- |
| B112 | 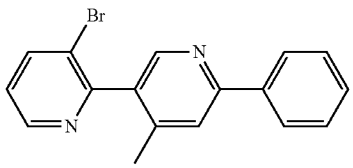 B81 | 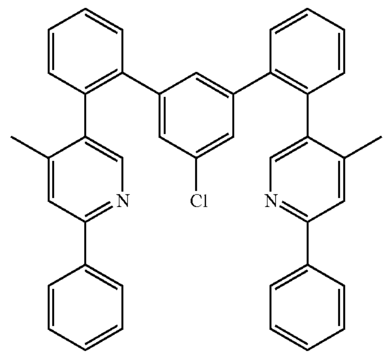 | 62% |
| B113 | 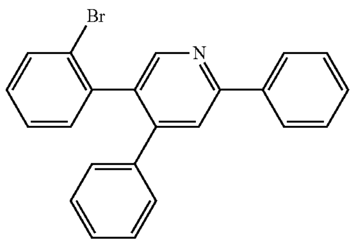 B83 | 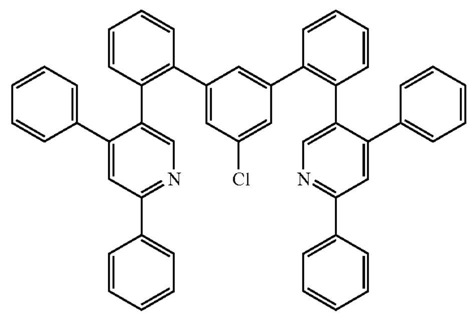 [SMILES: Clc1cc(-c2ccccc2-c2cnc(-c3ccccc3)cc2-c2ccccc2)cc(-c2ccccc2-c2cnc(-c3ccccc3)cc2-c2ccccc2)c1] | 55% |
| B114 | 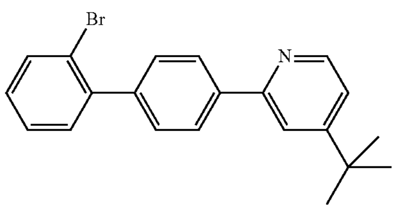 B84 | 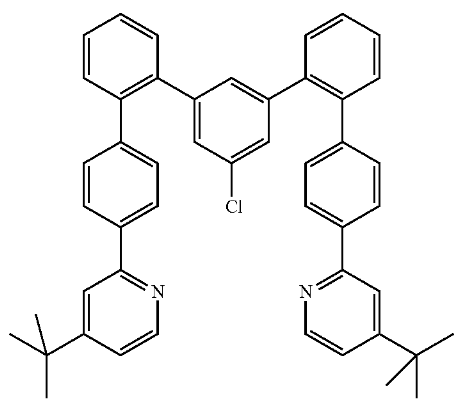 [SMILES: CC(C)(C)c1ccnc(-c2ccc(-c3ccccc3-c3cc(Cl)cc(-c4ccccc4-c4ccc(-c5cc(C(C)(C)C)ccn5)cc4)c3)cc2)c1] | 63% |
| B115 | 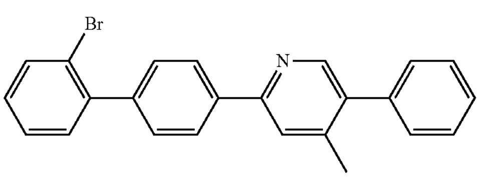 B85 | 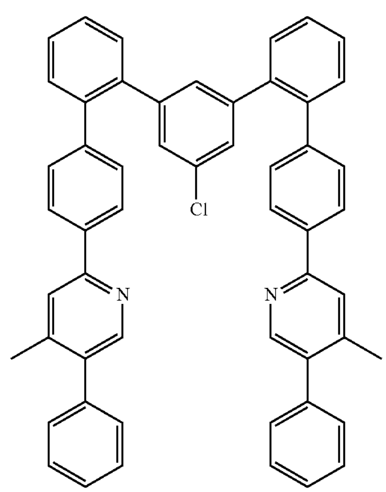 | 60% |

-continued
| Ex. | Bromide | Product | Yield |
|---|---|---|---|
| B116 | 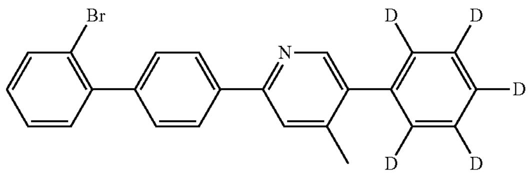 B86 | 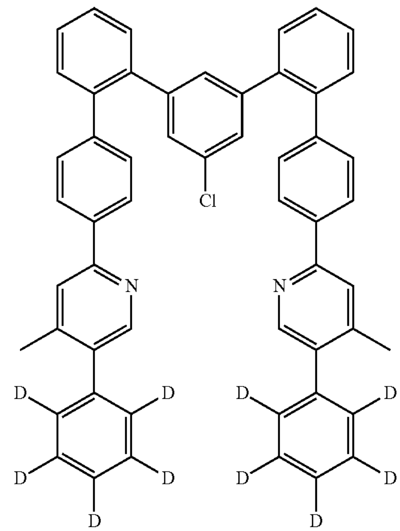 [SMILES: [2H]c1c([2H])c([2H])c(-c2cnc(-c3ccc(-c4ccccc4-c4cc(Cl)cc(-c5ccccc5-c5ccc(-c6cc(C)c(-c7c([2H])c([2H])c([2H])c([2H])c7[2H])cn6)cc5)c4)cc3)cc2C)c([2H])c1[2H]] | 61% |
| B117 | 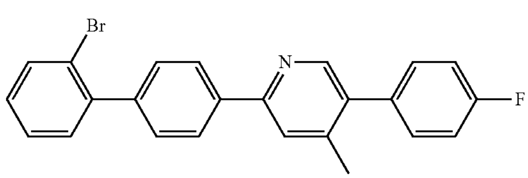 B87 | 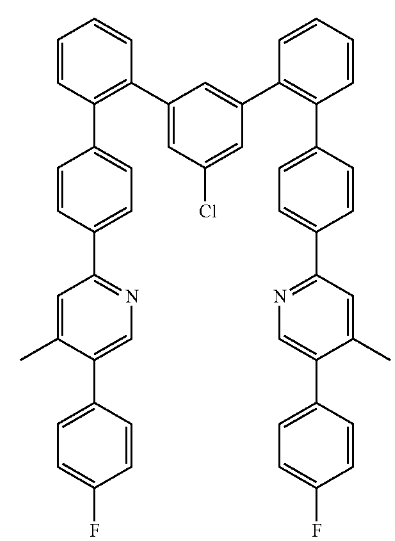 | 58% |

-continued
| Ex. | Bromide | Product | Yield |
|---|---|---|---|
| B118 | 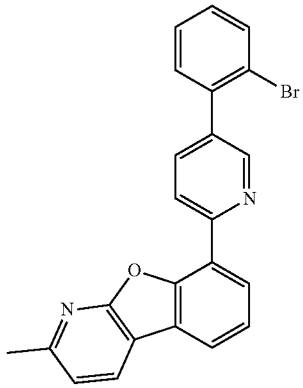<br>B88 | 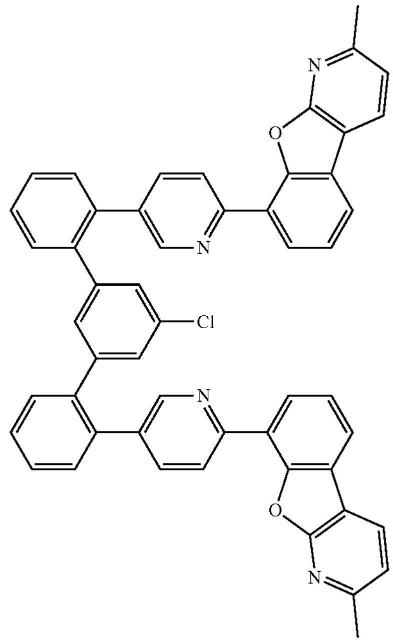 [SMILES: Cc1ccc2c(n1)oc1c(-c3ccc(-c4ccccc4-c4cc(Cl)cc(-c5ccccc5-c5ccc(-c6cccc7c6oc6nc(C)ccc67)nc5)c4)cn3)cccc12] | 56% |
| B119 | 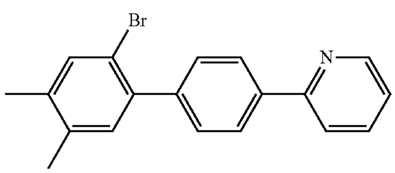<br>B89 | 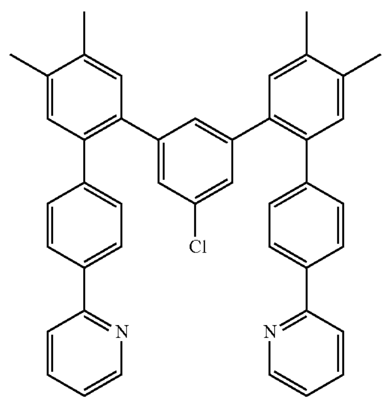 | 60% |
| B120 | 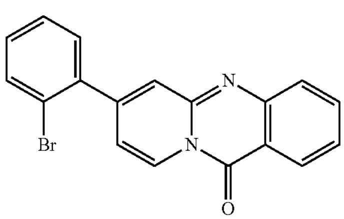<br>B90 | 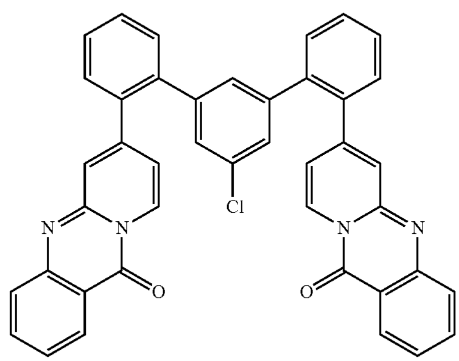 [SMILES: O=c1c2ccccc2nc2cc(-c3ccccc3-c3cc(Cl)cc(-c4ccccc4-c4ccn5c(=O)c6ccccc6nc5c4)c3)ccn12] | 64% |

-continued

| Ex. | Bromide | Product | Yield |
|---|---|---|---|
| B121 | 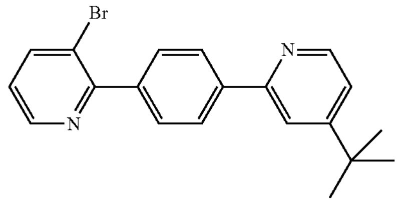 B91 | 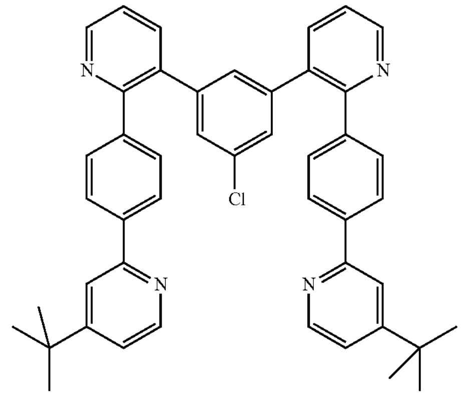 [SMILES: CC(C)(C)c1ccnc(-c2ccc(-c3ncccc3-c3cc(Cl)cc(-c4cccnc4-c4ccc(-c5cc(C(C)(C)C)ccn5)cc4)c3)cc2)c1] | 60% |
| B202 | 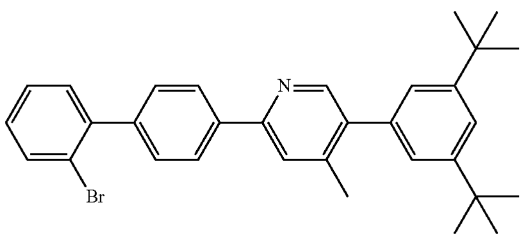 B201 | 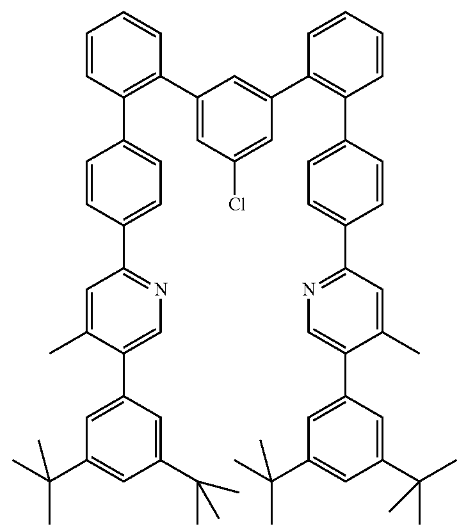 [SMILES: Cc1cc(-c2ccc(-c3ccccc3-c3cc(Cl)cc(-c4ccccc4-c4ccc(-c5cc(C)c(-c6cc(C(C)(C)C)cc(C(C)(C)C)c6)cn5)cc4)c3)cc2)ncc1-c1cc(C(C)(C)C)cc(C(C)(C)C)c1] | 65% |

Example B122

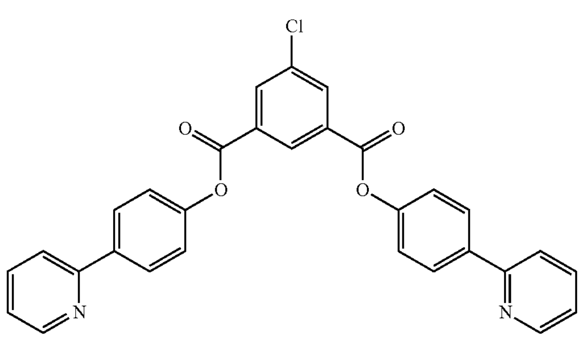 [SMILES: O=C(Oc1ccc(-c2ccccn2)cc1)c1cc(Cl)cc(C(=O)Oc2ccc(-c3ccccn3)cc2)c1]

A mixture of 17.1 g (100 mmol) of 4-(2-pyridyl)phenol [51035-40-6] and 12.9 g (100 mmol) of diisopropylethylamine [7087-68-5] is stirred in 400 ml of dichloromethane at room temperature for 10 min. 6.2 ml (40 mmol) of 5-chloroisophthaloyl dichloride, dissolved in 30 ml of dichloromethane, are added dropwise, and the reaction mixture is stirred at room temperature for 14 h. 10 ml of water are subsequently added dropwise, and the reaction mixture is transferred into a separating funnel. The organic phase is washed twice with 100 ml of water and once with 50 ml of saturated NaCl solution, dried over sodium sulfate and evaporated to dryness. Yield: 18.0 g (38 mmol), 95%. Purity: about 95% according to $^{1}$H-NMR.

The following compounds can be prepared analogously. The amounts of the starting materials employed are indicated if they differ from those described in the procedure for B122:

| Ex. | Alcohol or amine<br>Acid chloride<br>Reaction time | Product | Yield |
|---|---|---|---|
| B123 | 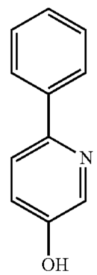<br>[66131-77-9] 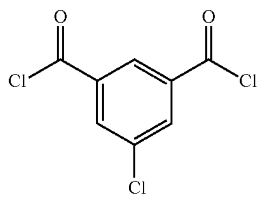 [2855-02-9]<br>12 h | 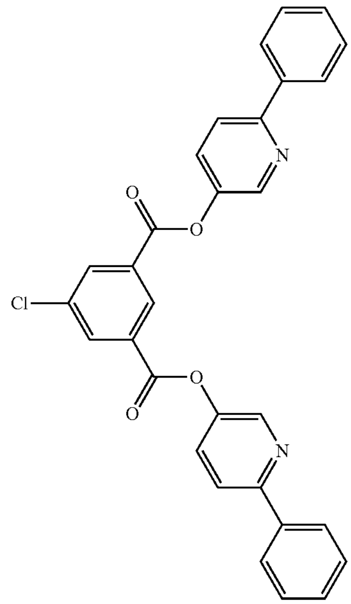 [SMILES: O=C(Oc1ccc(-c2ccccc2)nc1)c1cc(Cl)cc(C(=O)Oc2ccc(-c3ccccc3)nc2)c1] | 90% |
| B124 | 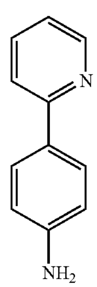<br>[18471-73-3] 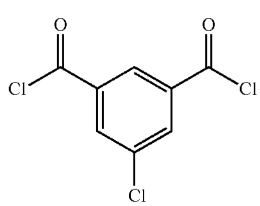 [2855-02-9]<br>1 h | 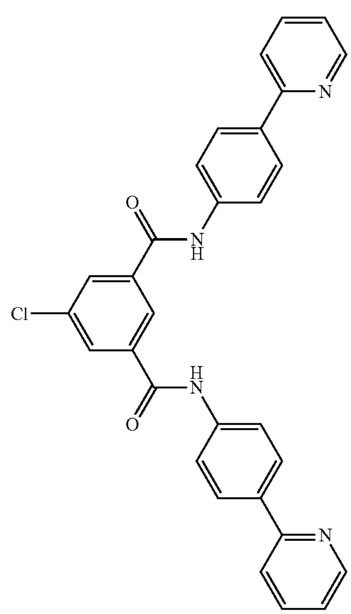 [SMILES: O=C(Nc1ccc(-c2ccccn2)cc1)c1cc(Cl)cc(C(=O)Nc2ccc(-c3ccccn3)cc2)c1] | 96% |

-continued
| Ex. | Alcohol or amine<br>Acid chloride<br>Reaction time | Product | Yield |
| --- | --- | --- | --- |
| B125 | 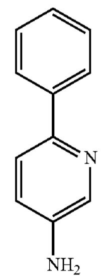<br>[26370-67-0]<br>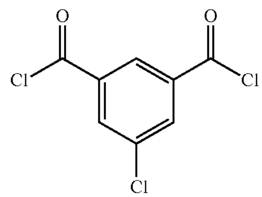<br>[2855-02-9]<br>0.5 h | 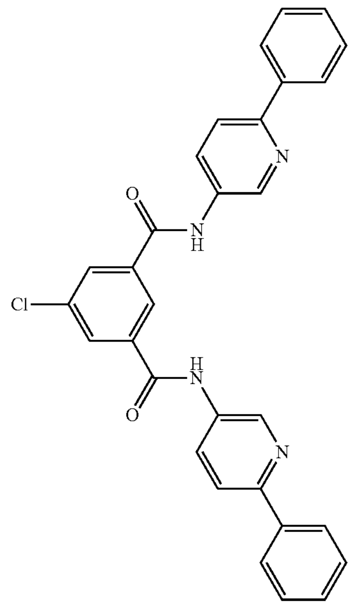 [SMILES: O=C(Nc1ccc(-c2ccccc2)nc1)c1cc(Cl)cc(C(=O)Nc2ccc(-c3ccccc3)nc2)c1] | 88% |
| B126 | 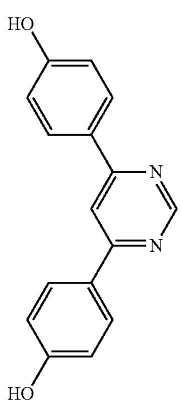<br>[183670-50-0<br>50 mmol<br>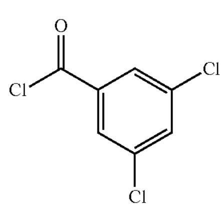<br>[2905-62-6]<br>100 mmol<br>24 h | 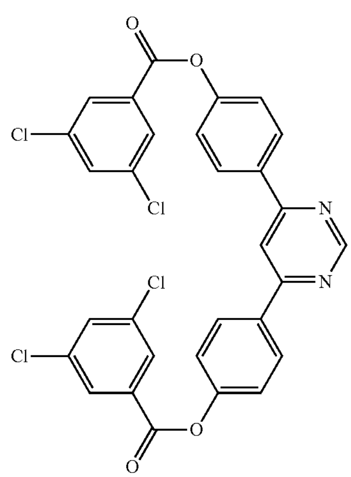 [SMILES: O=C(Oc1ccc(-c2cc(-c3ccc(OC(=O)c4cc(Cl)cc(Cl)c4)cc3)ncn2)cc1)c1cc(Cl)cc(Cl)c1] | 75% |

-continued
| Ex. | Alcohol or amine<br>Acid chloride<br>Reaction time | | Product | Yield |
|---|---|---|---|---|
| B127 | 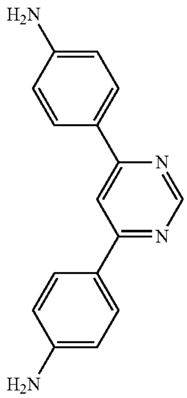<br>[85489-57-2]<br>50 mmol | 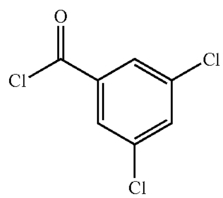<br>[2905-62-6]<br>100 mmol | 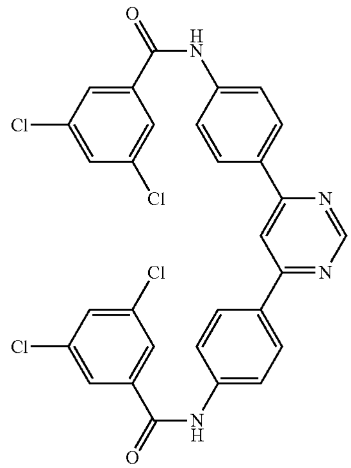 [SMILES: O=C(Nc1ccc(-c2cc(-c3ccc(NC(=O)c4cc(Cl)cc(Cl)c4)cc3)ncn2)cc1)c1cc(Cl)cc(Cl)c1] | 82% |
| | 2 h | | | |
| B128 | 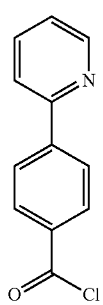<br>[190850-37-4]<br>100 mmol | 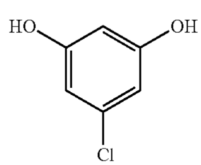<br>[52780-23-1]<br>50 mmol | 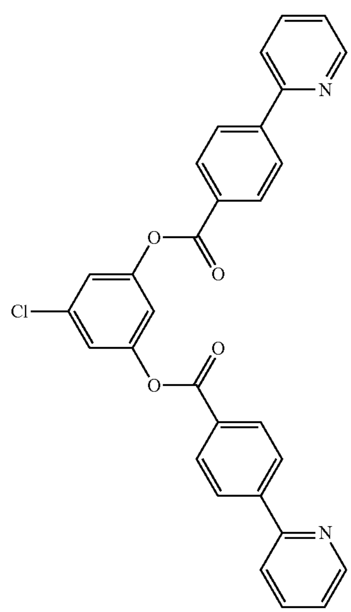 [SMILES: O=C(Oc1cc(Cl)cc(OC(=O)c2ccc(-c3ccccn3)cc2)c1)c1ccc(-c2ccccn2)cc1] | 76% |
| | 14 h, reflux | | | |

-continued
| Ex. | Alcohol or amine<br>Acid chloride<br>Reaction time | Product | Yield |
|---|---|---|---|
| B129 | 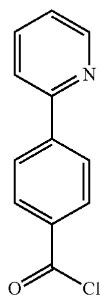 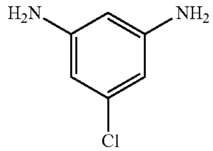<br>[190850-37-4] [33786-89-9]<br>100 mmol 50 mmol<br>10 h | 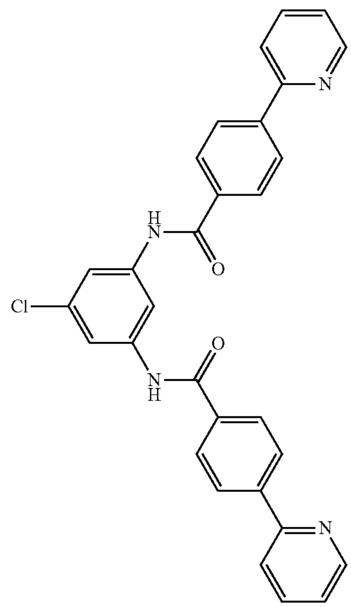 [SMILES: O=C(Nc1cc(Cl)cc(NC(=O)c2ccc(-c3ccccn3)cc2)c1)c1ccc(-c2ccccn2)cc1] | 80% |
| B130 | 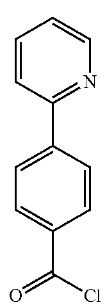 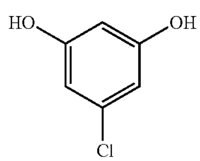<br>[190850-37-4] [52780-23-1]<br>100 mmol 50 mmol<br>18 h, reflux | 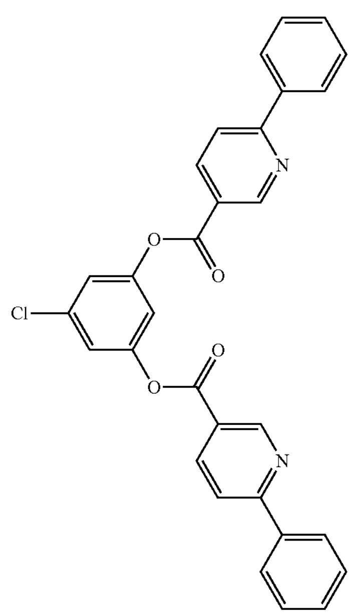 [SMILES: O=C(Oc1cc(Cl)cc(OC(=O)c2ccc(-c3ccccc3)nc2)c1)c1ccc(-c2ccccc2)nc1] | 73% |

-continued

| Ex. | Alcohol or amine<br>Acid chloride<br>Reaction time | Product | Yield |
|---|---|---|---|
| B131 | 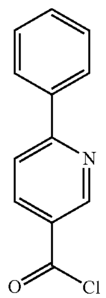<br>[257876-10-1]<br>100 mmol<br>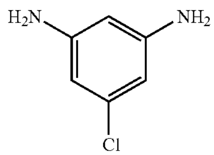<br>[33786-89-9]<br>50 mmol<br>5 h | 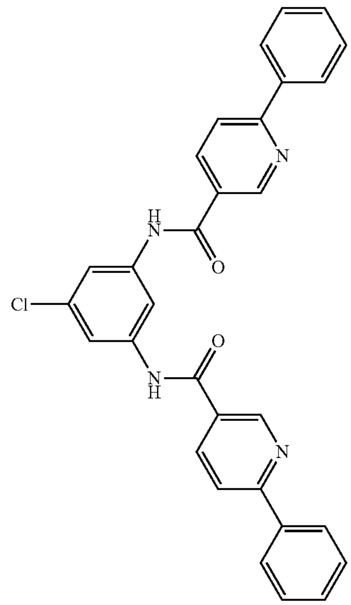 [SMILES: O=C(Nc1cc(Cl)cc(NC(=O)c2ccc(-c3ccccc3)nc2)c1)c1ccc(-c2ccccc2)nc1] | 78% |

Example B132

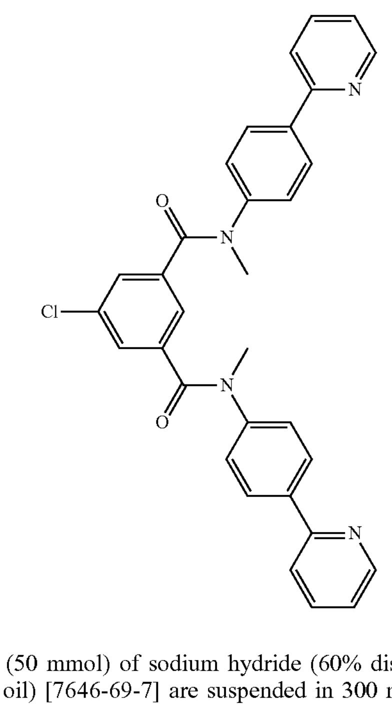

2.0 g (50 mmol) of sodium hydride (60% dispersion in paraffin oil) [7646-69-7] are suspended in 300 ml of THF, 5.0 g (10 mmol) of B124 are then added, and the suspension is stirred at room temperature for 30 minutes. 1.2 ml of iodomethane (50 mmol) [74-88-4] are subsequently added, and the reaction mixture is stirred at room temperature for 50 h. 20 ml of conc. ammonia solution are added, the mixture is stirred for a further 30 minutes, and the solvent is substantially stripped off in vacuo. The residue is taken up in 300 ml of dichloromethane, washed once with 200 ml of 5% by weight ammonia water, twice with 100 ml of water each time, once with 100 ml of saturated sodium chloride solution and then dried over magnesium sulfate. The dichloromethane is removed in vacuo, and the crude product is recrystallised from ethyl acetate/methanol. Yield: 4.3 g (8 mmol), 80%. Purity: about 98% according to $^{1}$H-NMR.

The following compounds can be prepared analogously:
| Ex. | Starting material | Product | Yield |
|---|---|---|---|
| B133 | 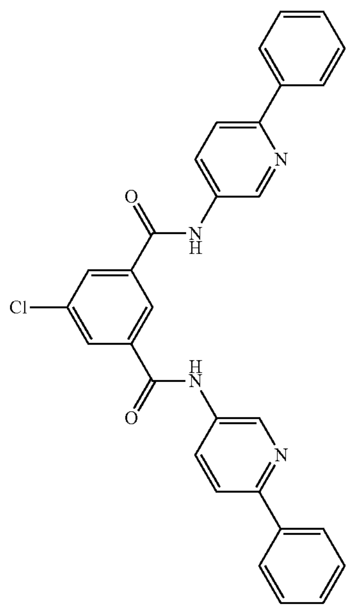 B125 | 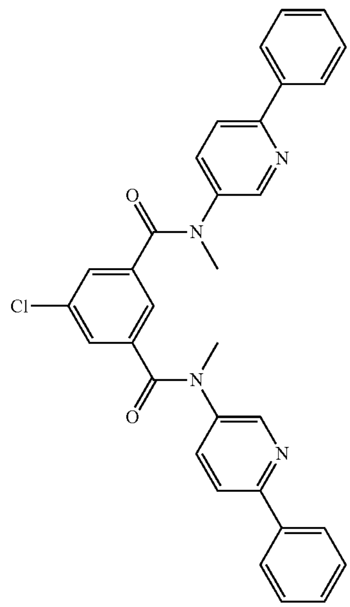 [SMILES: CN(C(=O)c1cc(Cl)cc(C(=O)N(C)c2ccc(-c3ccccc3)nc2)c1)c1ccc(-c2ccccc2)nc1] | 70% |
| B134 | 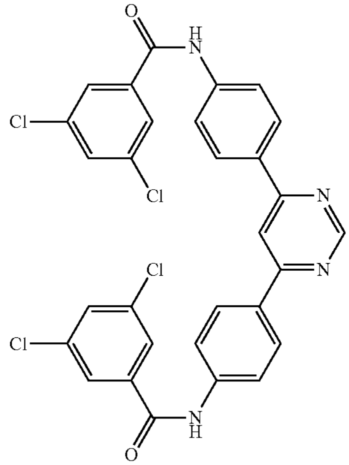 B127 | 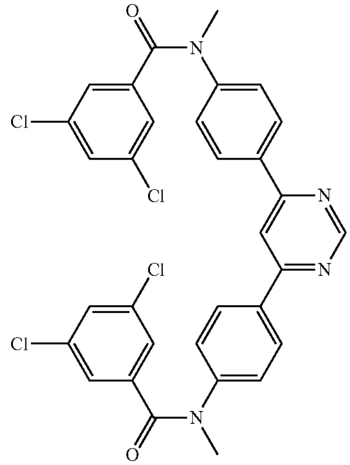 [SMILES: CN(C(=O)c1cc(Cl)cc(Cl)c1)c1ccc(-c2cc(-c3ccc(N(C)C(=O)c4cc(Cl)cc(Cl)c4)cc3)ncn2)cc1] | 75% |

-continued
| Ex. | Starting material | Product | Yield |
|---|---|---|---|
| B135 | 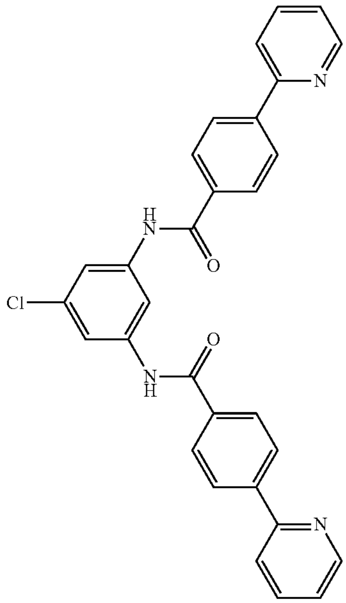 B129 | 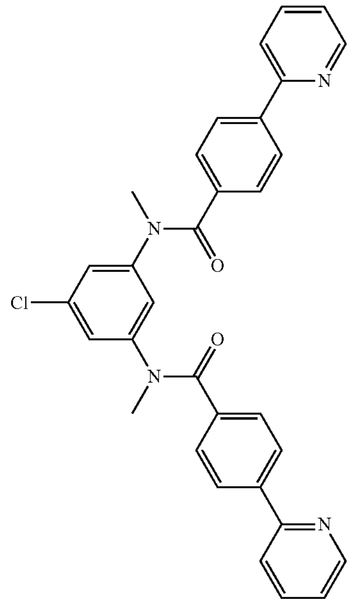 [SMILES: CN(C(=O)c1ccc(-c2ccccn2)cc1)c1cc(Cl)cc(N(C)C(=O)c2ccc(-c3ccccn3)cc2)c1] | 69% |
| B136 | 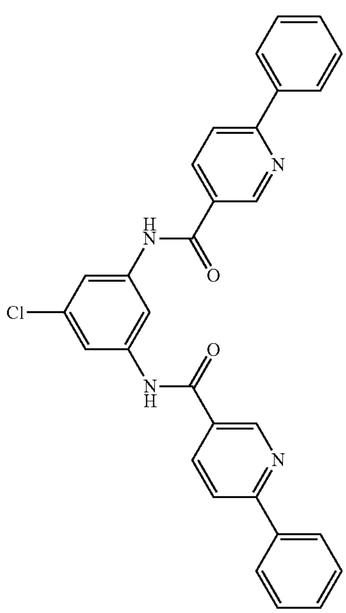 B131 | 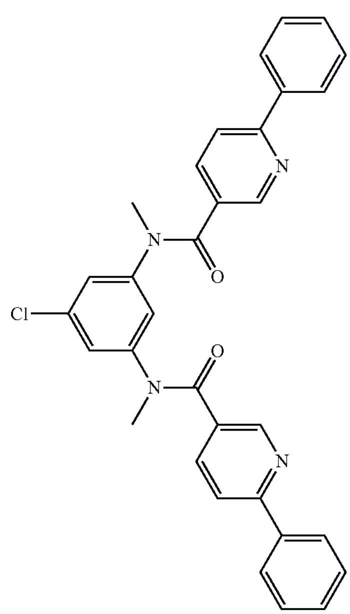 [SMILES: CN(C(=O)c1ccc(-c2ccccc2)nc1)c1cc(Cl)cc(N(C)C(=O)c2ccc(-c3ccccc3)nc2)c1] | 72% |

Example B137

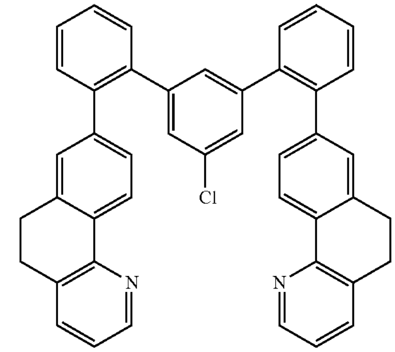 [SMILES: Clc1cc(-c2ccccc2-c2ccc3c(c2)CCc2cccnc2-3)cc(-c2ccccc2-c2ccc3c(c2)CCc2cccnc2-3)c1]

A mixture of 36.4 g (100 mmol) pf 2,2'-(5-chloro-1,3-phenylene)bis[4,4,5,5-tetramethyl-1,3,2-dioxaborolane [1417036-49-7], 70.6 g (210 mmol) of B93, 42.4 g (400 mmol) of sodium carbonate, 2.3 g (2 mmol) of tetrakis-(triphenylphosphine)palladium(0), 1000 ml of 1,2-dimethoxyethane and 500 ml of water is heated under reflux for 48 h. After cooling, the solid which has precipitated out is filtered off with suction and washed twice with 20 ml of ethanol. The solid is dissolved in 500 ml of dichloromethane and filtered off via a Celite bed. The filtrate is evaporated to 100 ml, 400 ml of methanol are then added, and the solid which has precipitated out is filtered off with suction. The crude product is recrystallised once from ethyl acetate. Yield: 43.6 g (70 mmol), 70%. Purity: about 96% according to $^{1}$H-NMR.

The following compounds can be prepared analogously, where solvents such as, for example, ethyl acetate, cyclohexane, toluene, acetonitrile, n-heptane, ethanol or methanol can be used for the recrystallisation. It is also possible to carry out a hot extraction using these solvents, or the purification can be carried out by chromatography on silica gel on an automated column (Torrent from Axel Semrau).

B138

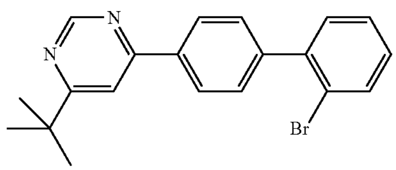

B92

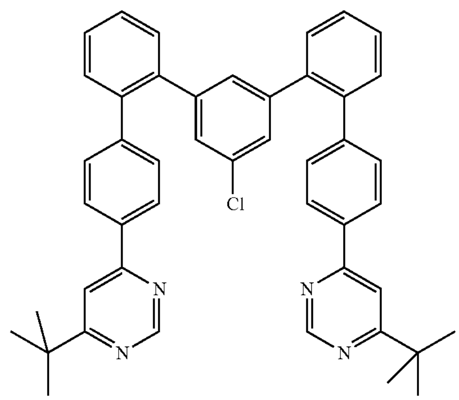

64%

B139

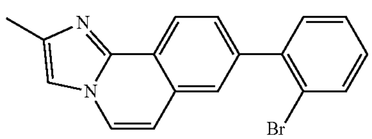

B94

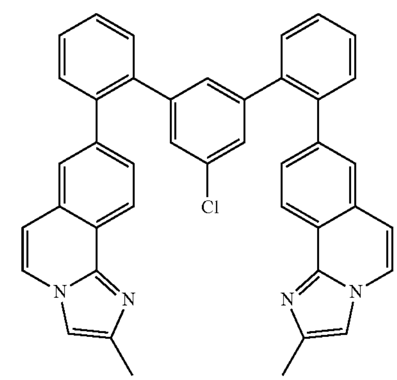 [SMILES: Cc1cn2ccc3cc(-c4ccccc4-c4cc(Cl)cc(-c5ccccc5-c5ccc6c(ccn7cc(C)nc67)c5)c4)ccc3c2n1]

54%

B140

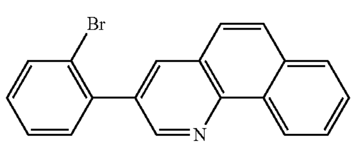

B96

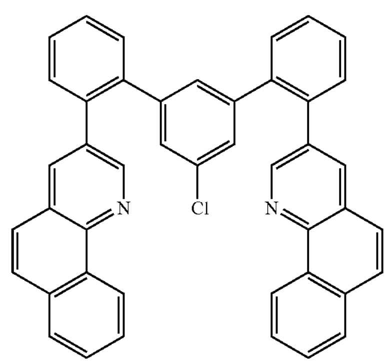 [SMILES: Clc1cc(-c2ccccc2-c2cnc3c(ccc4ccccc43)c2)cc(-c2ccccc2-c2cnc3c(ccc4ccccc43)c2)c1]

75%

-continued
B141
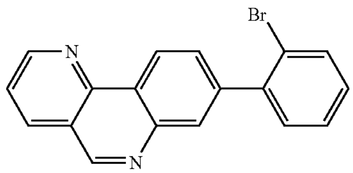
B97
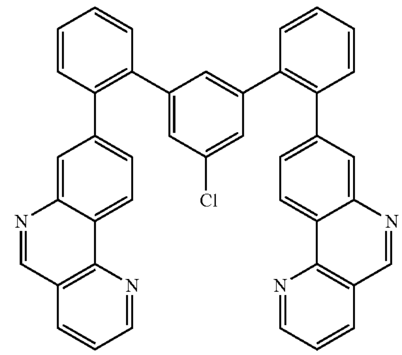 [SMILES: Clc1cc(-c2ccccc2-c2ccc3c(c2)ncc2cccnc23)cc(-c2ccccc2-c2ccc3c(c2)ncc2cccnc23)c1]
71%
B142
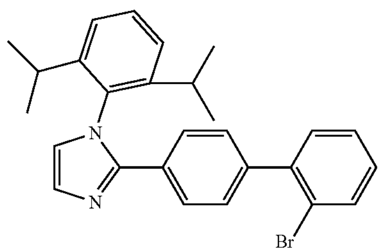
B98
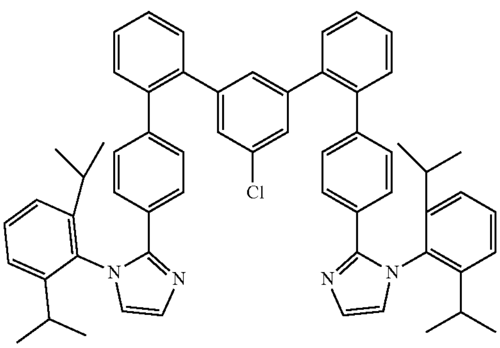 [SMILES: CC(C)c1cccc(C(C)C)c1-n1ccnc1-c1ccc(-c2ccccc2-c2cc(Cl)cc(-c3ccccc3-c3ccc(-c4nccn4-c4c(C(C)C)cccc4C(C)C)cc3)c2)cc1]
58%
B143
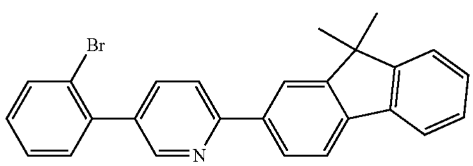
B99
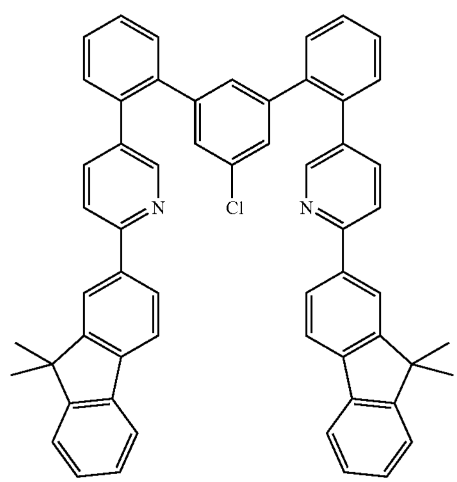
60%
B144
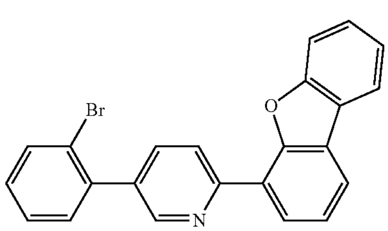
B100
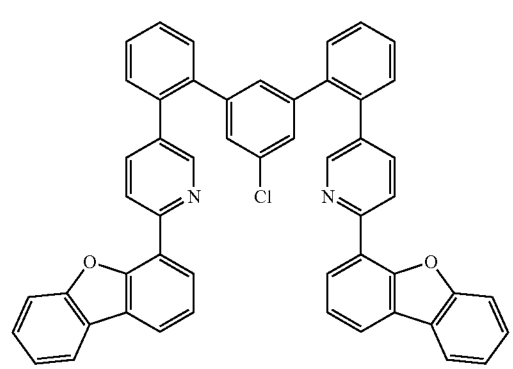 [SMILES: Clc1cc(-c2ccccc2-c2ccc(-c3cccc4c3oc3ccccc34)nc2)cc(-c2ccccc2-c2ccc(-c3cccc4c3oc3ccccc34)nc2)c1]
66%

-continued
B145
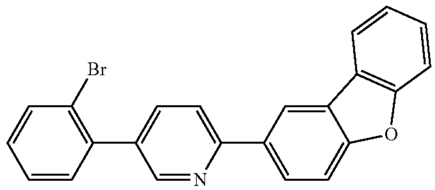
B101
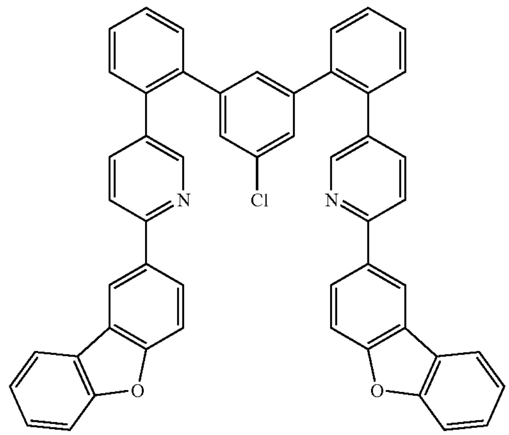 [SMILES: Clc1cc(-c2ccccc2-c2ccc(-c3ccc4oc5ccccc5c4c3)nc2)cc(-c2ccccc2-c2ccc(-c3ccc4oc5ccccc5c4c3)nc2)c1]
70%
B146
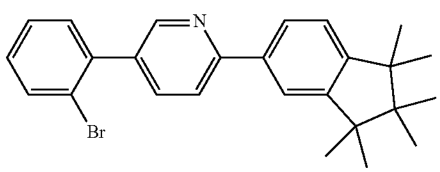
B102
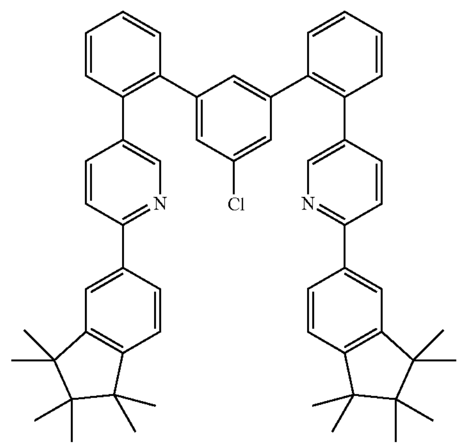
70%
B147
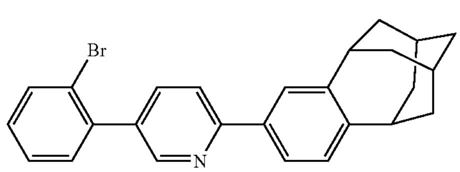
B103
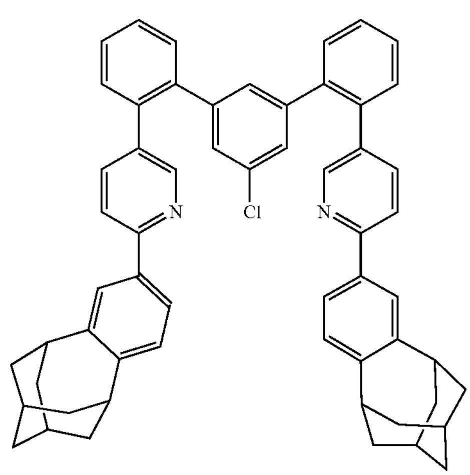 [SMILES: Clc1cc(-c2ccccc2-c2ccc(-c3ccc4c(c3)C3CC5CC(CC4C5)C3)nc2)cc(-c2ccccc2-c2ccc(-c3ccc4c(c3)C3CC5CC(CC4C5)C3)nc2)c1]
63%

-continued
B148
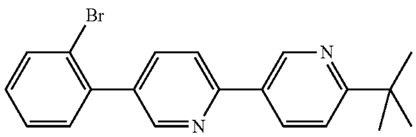
B95
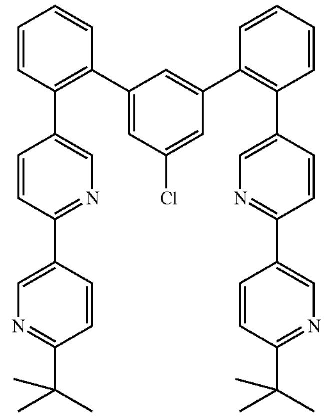 [SMILES: CC(C)(C)c1ccc(-c2ccc(-c3ccccc3-c3cc(Cl)cc(-c4ccccc4-c4ccc(-c5ccc(C(C)(C)C)nc5)nc4)c3)cn2)cn1]
60%
B149
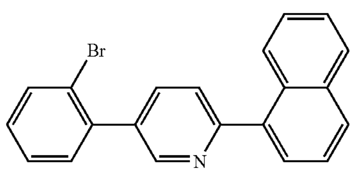
B104
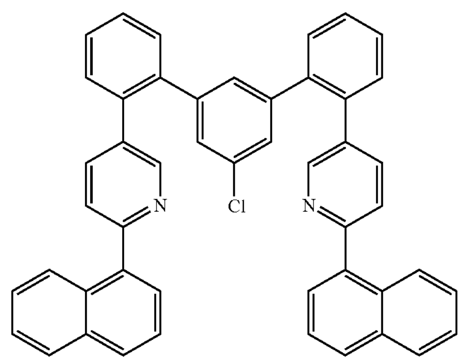 [SMILES: Clc1cc(-c2ccccc2-c2ccc(-c3cccc4ccccc34)nc2)cc(-c2ccccc2-c2ccc(-c3cccc4ccccc34)nc2)c1]
61%
B150
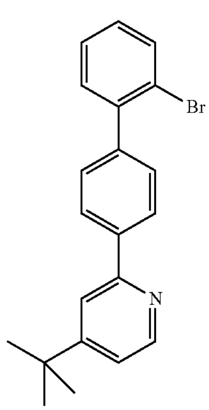
B105
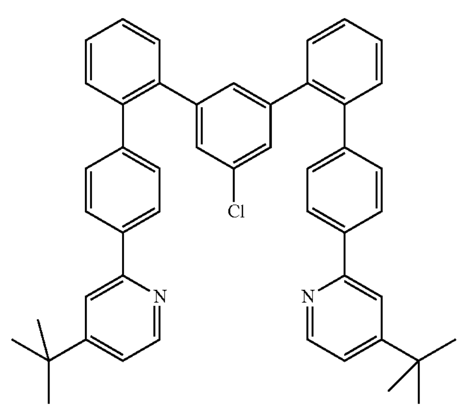 [SMILES: CC(C)(C)c1ccnc(-c2ccc(-c3ccccc3-c3cc(Cl)cc(-c4ccccc4-c4ccc(-c5cc(C(C)(C)C)ccn5)cc4)c3)cc2)c1]
58%

Example B151

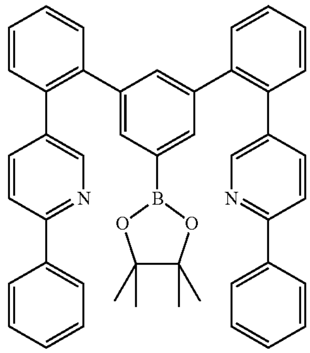 [SMILES: CC1(C)OB(c2cc(-c3ccccc3-c3ccc(-c4ccccc4)nc3)cc(-c3ccccc3-c3ccc(-c4ccccc4)nc3)c2)OC1(C)C]

A mixture of 57.1 g (100 mmol) of B110, 25.4 g (100 mmol) of bis(pinacolato)diborane [73183-34-3], 49.1 g (500 mmol) of potassium acetate, 2 mmol of S-Phos [657408-07-6] and 1 mmol of palladium(II) acetate, 200 g of glass beads (diameter 3 mm) an 700 ml of 1,4-dioxane is heated under reflux for 16 h with stirring. After cooling, the suspension is filtered through a Celite bed, and the solvent is removed in vacuo. The black residue is digested with 1000 ml of hot ethyl acetate, the mixture is filtered while still hot through a Celite bed, then evaporated to about 200 ml, during which the product begins to crystallise. The crystallisation is completed overnight in the refrigerator, the crystals are filtered off and washed with a little ethyl acetate. A second product fraction can be obtained from the mother liquor. Yield: 31.6 g (78 mmol), 78%. Purity: about 95% according to 1H-NMR.

The following compounds can be prepared analogously. Toluene, n-heptane, cyclohexane or acetonitrile can also be used instead of ethyl acetate for the recrystallisation or, in the case of low solubility, used for the hot extraction.

| Ex. | Bromide | Product | Yield |
|---|---|---|---|
| B152 | 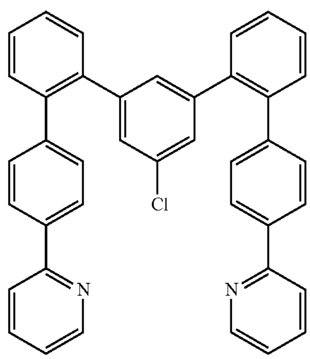 B111 | 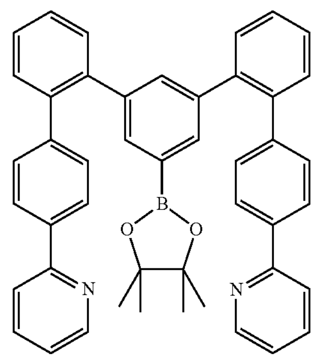 [SMILES: CC1(C)OB(c2cc(-c3ccccc3-c3ccc(-c4ccccn4)cc3)cc(-c3ccccc3-c3ccc(-c4ccccn4)cc3)c2)OC1(C)C] | 80% |
| B153 | 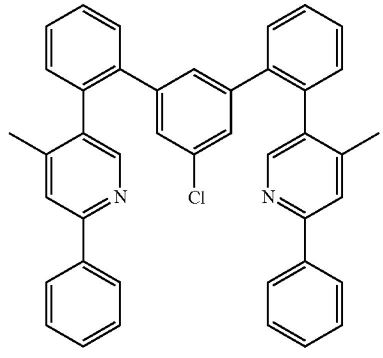 B112 | 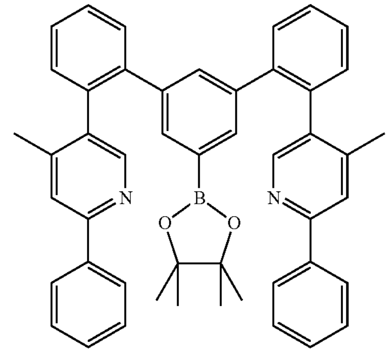 | 84% |

-continued
| Ex. | Bromide | Product | Yield |
|---|---|---|---|
| B154 | 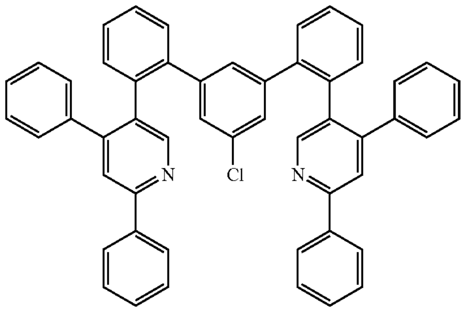 B113 | 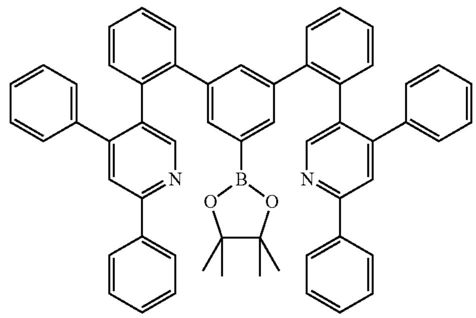 [SMILES: CC1(C)OB(c2cc(-c3ccccc3-c3cnc(-c4ccccc4)cc3-c3ccccc3)cc(-c3ccccc3-c3cnc(-c4ccccc4)cc3-c3ccccc3)c2)OC1(C)C] | 71% |
| B155 | 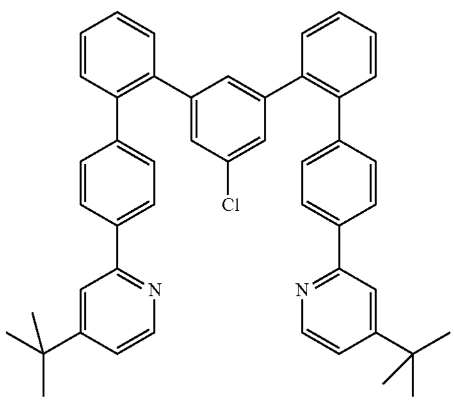 B114 | 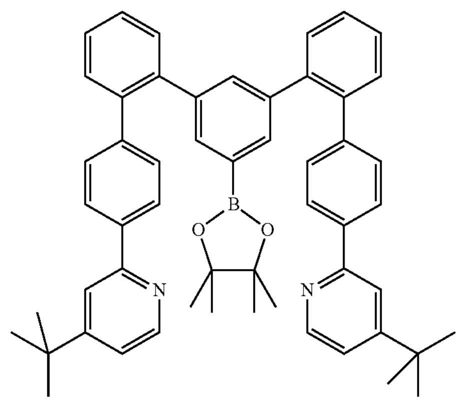 | 80% |
| B156 | 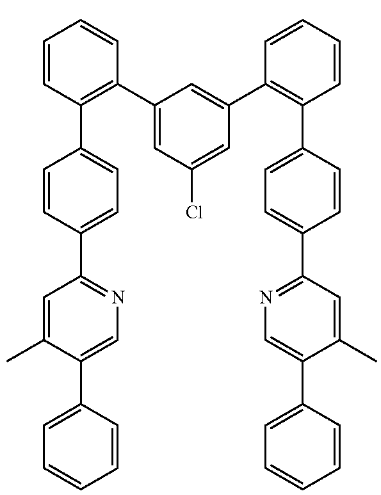 B115 | 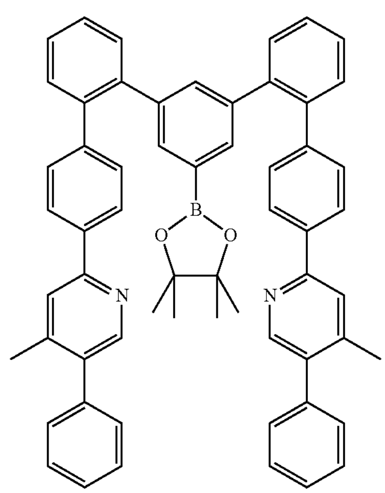 | 85% |

-continued
| Ex. | Bromide | Product | Yield |
| --- | --- | --- | --- |
| B157 | 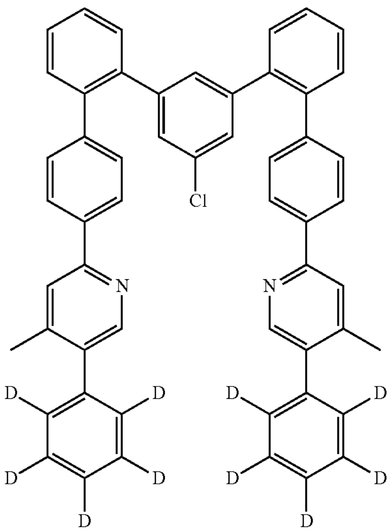 B116 | 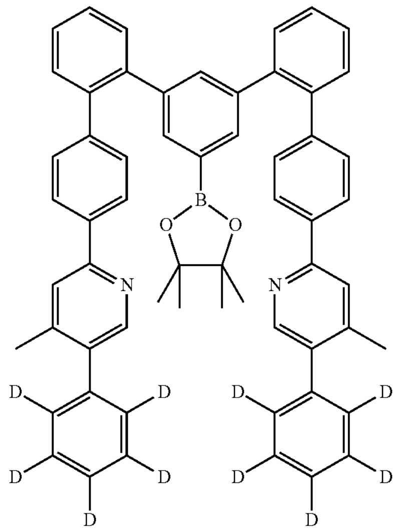 [SMILES: [2H]c1c([2H])c([2H])c(-c2cnc(-c3ccc(-c4ccccc4-c4cc(B5OC(C)(C)C(C)(C)O5)cc(-c5ccccc5-c5ccc(-c6cc(C)c(-c7c([2H])c([2H])c([2H])c([2H])c7[2H])cn6)cc5)c4)cc3)cc2C)c([2H])c1[2H]] | 82% |
| B158 | 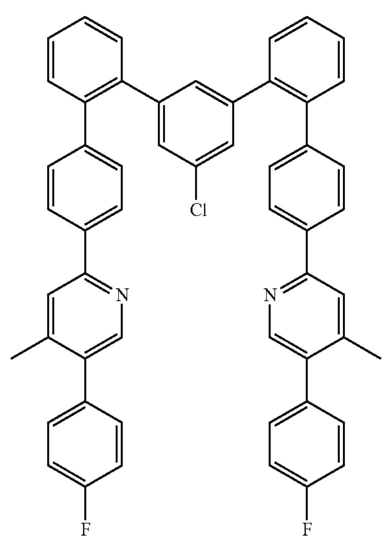 B117 | 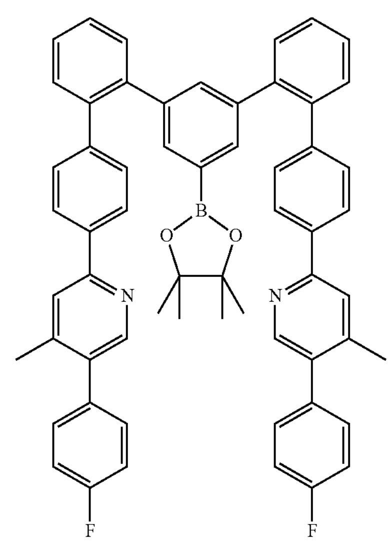 | 77% |

-continued
| Ex. | Bromide | Product | Yield |
|---|---|---|---|
| B159 | 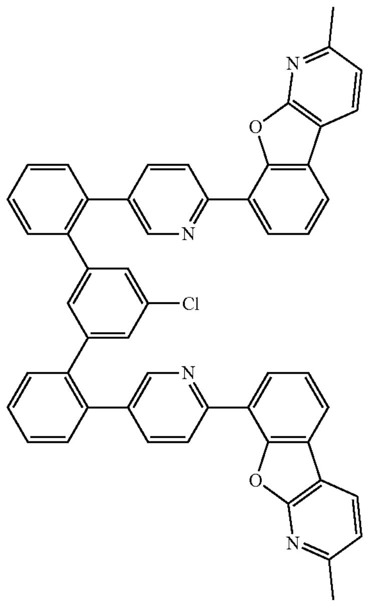 B118 | 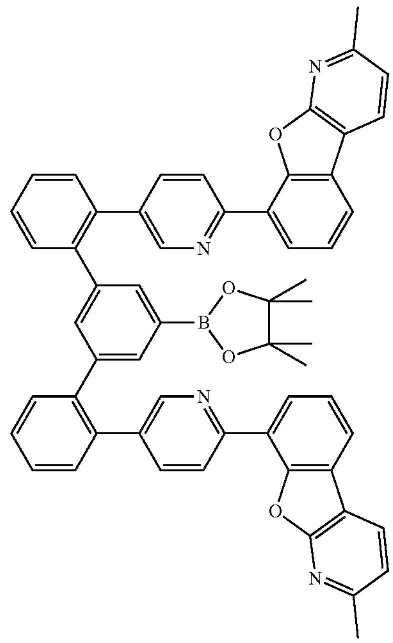 [SMILES: Cc1ccc2c(n1)oc1c(-c3ccc(-c4ccccc4-c4cc(B5OC(C)(C)C(C)(C)O5)cc(-c5ccccc5-c5ccc(-c6cccc7c6oc6nc(C)ccc67)nc5)c4)cn3)cccc12] | 72% |
| B160 | 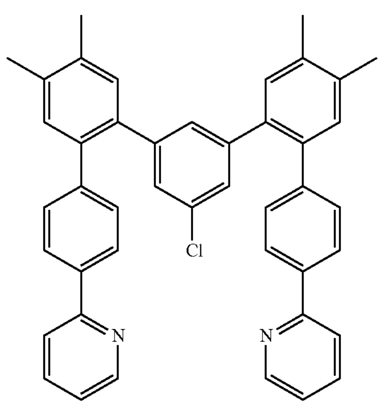 B119 | 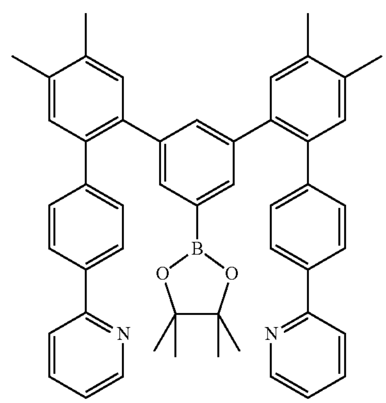 | 77% |
| B161 | 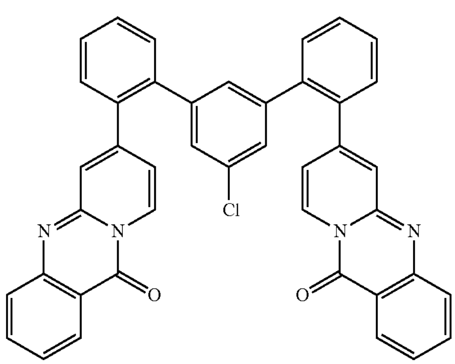 B120 | 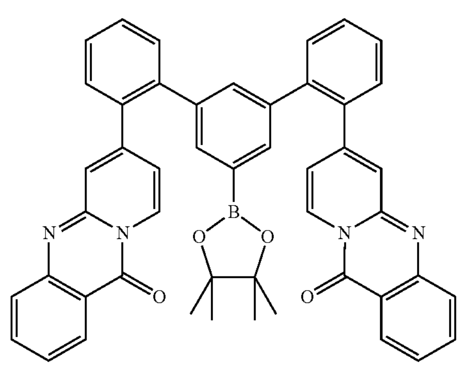 [SMILES: CC1(C)OB(c2cc(-c3ccccc3-c3ccn4c(=O)c5ccccc5nc4c3)cc(-c3ccccc3-c3ccn4c(=O)c5ccccc5nc4c3)c2)OC1(C)C] | 80% |

-continued
| Ex. | Bromide | Product | Yield |
|---|---|---|---|
| B162 | 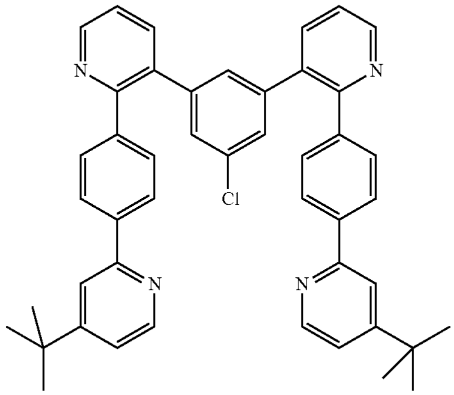<br>B121 | 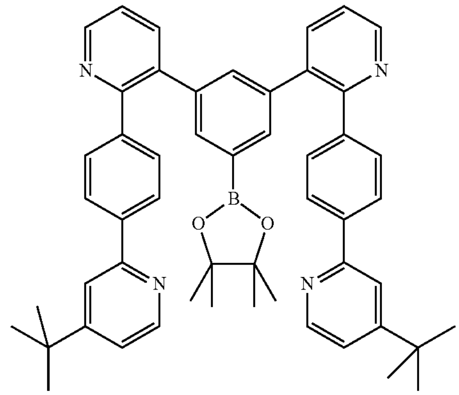 [SMILES: CC(C)(C)c1ccnc(-c2ccc(-c3ncccc3-c3cc(B4OC(C)(C)C(C)(C)O4)cc(-c4cccnc4-c4ccc(-c5cc(C(C)(C)C)ccn5)cc4)c3)cc2)c1] | 81% |
| B163 | 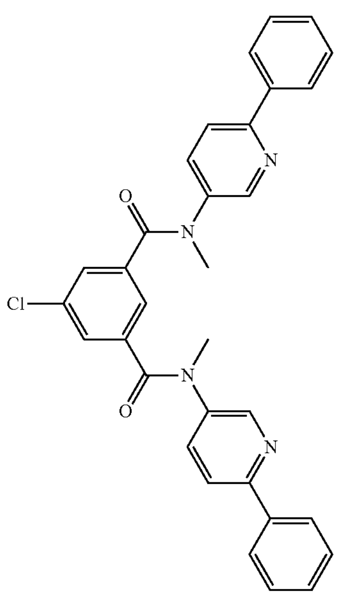<br>B133 | 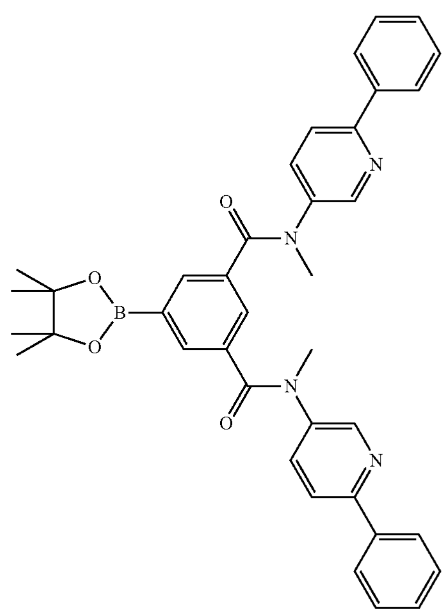 [SMILES: CN(C(=O)c1cc(B2OC(C)(C)C(C)(C)O2)cc(C(=O)N(C)c2ccc(-c3ccccc3)nc2)c1)c1ccc(-c2ccccc2)nc1] | 88% |

-continued
| Ex. | Bromide | Product | Yield |
|---|---|---|---|
| B164 | 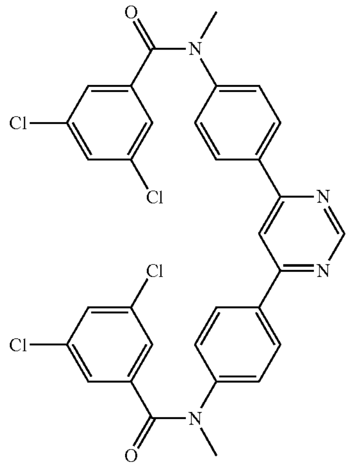 B134 4.1 equiv. of boronic ester, 4 mmol of S-Phos, 2 mmol of $Pd(OAc)_2$ | 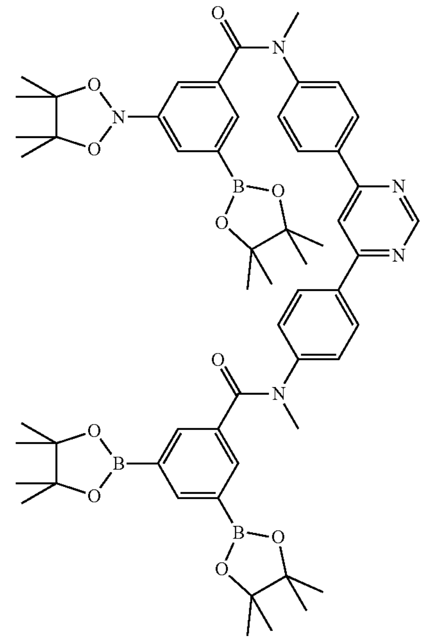 [SMILES: CN(C(=O)c1cc(B2OC(C)(C)C(C)(C)O2)cc(B2OC(C)(C)C(C)(C)O2)c1)c1ccc(-c2cc(-c3ccc(N(C)C(=O)c4cc(B5OC(C)(C)C(C)(C)O5)cc(N5OC(C)(C)C(C)(C)O5)c4)cc3)ncn2)cc1] | 55% |
| B165 | 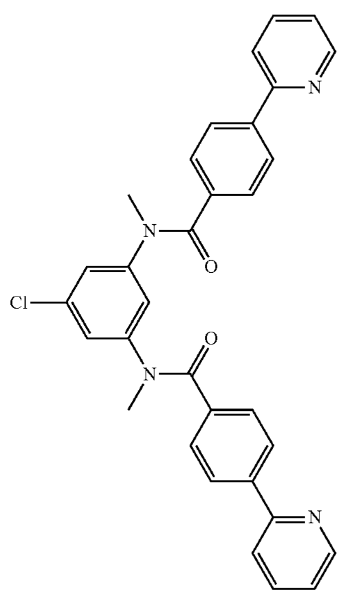 B135 | 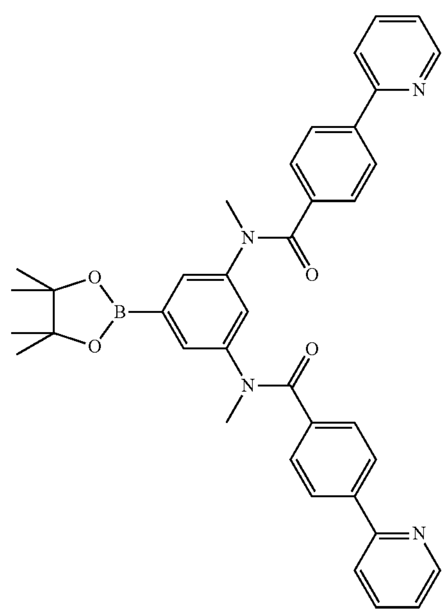 [SMILES: CN(C(=O)c1ccc(-c2ccccn2)cc1)c1cc(B2OC(C)(C)C(C)(C)O2)cc(N(C)C(=O)c2ccc(-c3ccccn3)cc2)c1] | 79% |

-continued
| Ex. | Bromide | Product | Yield |
|---|---|---|---|
| B166 | 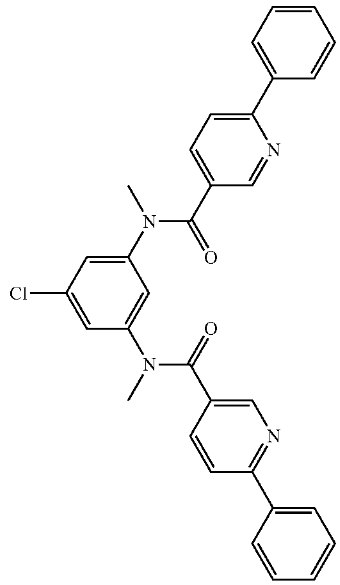 B136 | 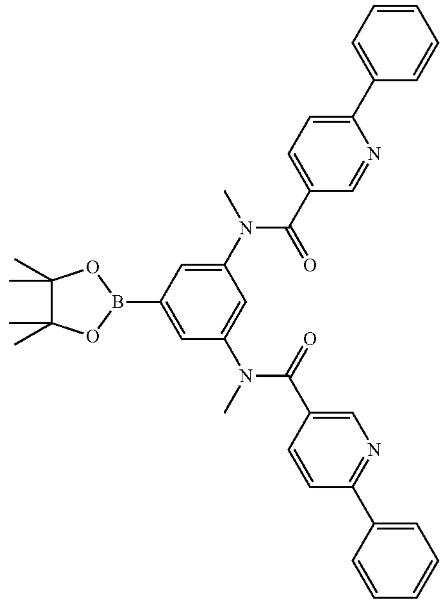 [SMILES: CN(C(=O)c1ccc(-c2ccccc2)nc1)c1cc(B2OC(C)(C)C(C)(C)O2)cc(N(C)C(=O)c2ccc(-c3ccccc3)nc2)c1] | 76% |
| B167 | 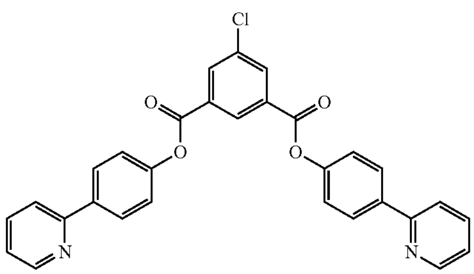 B122 | 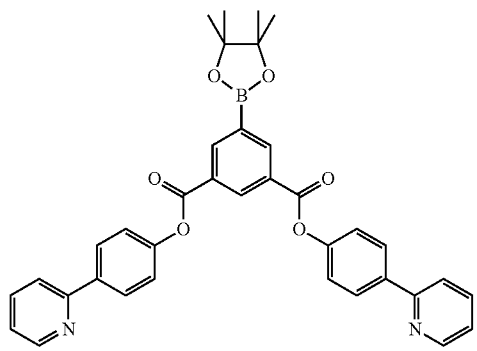 [SMILES: CC1(C)OB(c2cc(C(=O)Oc3ccc(-c4ccccn4)cc3)cc(C(=O)Oc3ccc(-c4ccccn4)cc3)c2)OC1(C)C] | 89% |
| B168 | 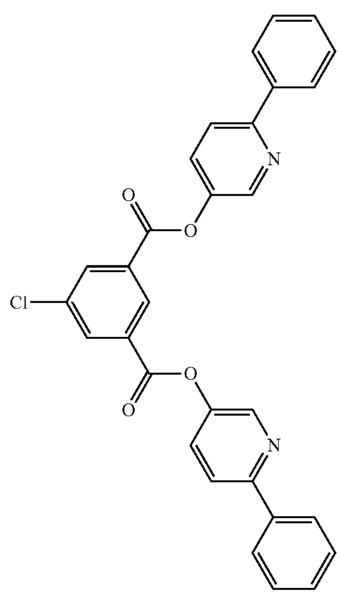 B123 | 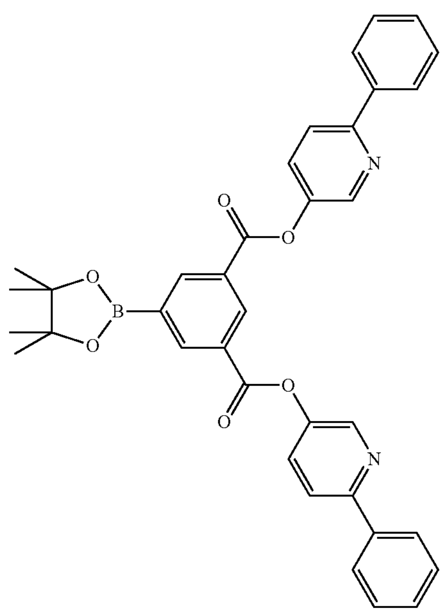 [SMILES: CC1(C)OB(c2cc(C(=O)Oc3ccc(-c4ccccc4)nc3)cc(C(=O)Oc3ccc(-c4ccccc4)nc3)c2)OC1(C)C] | 84% |

-continued
| Ex. | Bromide | Product | Yield |
|---|---|---|---|
| B169 | 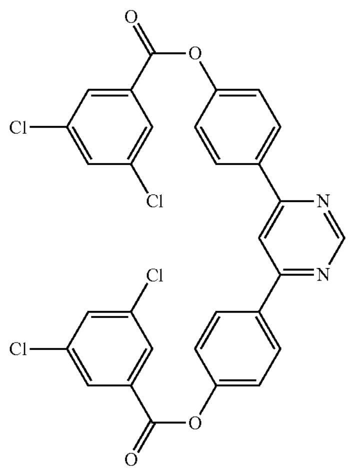<br>B126<br>4.1 equiv. of boronic ester,<br>4 mmol of S-Phos, 2 mmol<br>$Pd(OAc)_2$ | 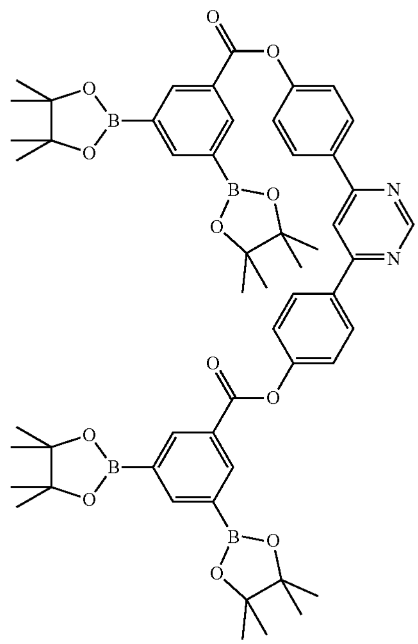 [SMILES: CC1(C)OB(c2cc(B3OC(C)(C)C(C)(C)O3)cc(C(=O)Oc3ccc(-c4cc(-c5ccc(OC(=O)c6cc(B7OC(C)(C)C(C)(C)O7)cc(B7OC(C)(C)C(C)(C)O7)c6)cc5)ncn4)cc3)c2)OC1(C)C] | 50% |
| B170 | 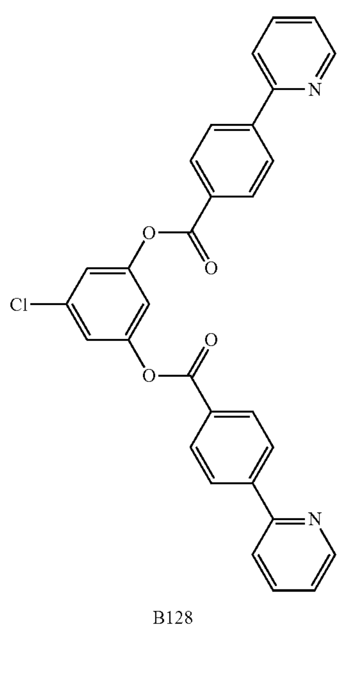 [SMILES: "B128" ; O=C(Oc1cc(Cl)cc(OC(=O)c2ccc(-c3ccccn3)cc2)c1)c1ccc(-c2ccccn2)cc1]<br>B128 | 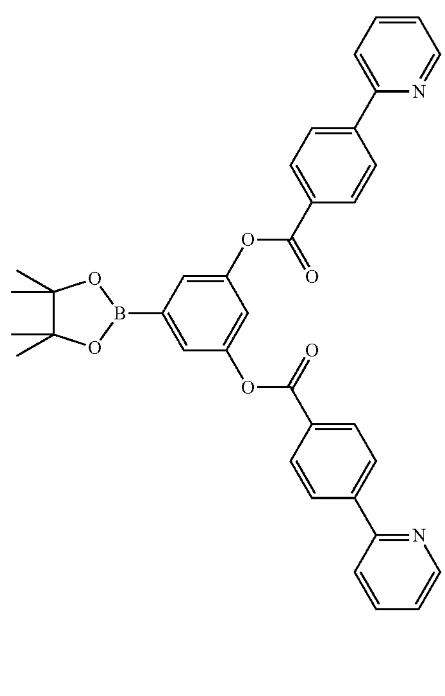 [SMILES: CC1(C)OB(c2cc(OC(=O)c3ccc(-c4ccccn4)cc3)cc(OC(=O)c3ccc(-c4ccccn4)cc3)c2)OC1(C)C] | 79% |

-continued
| Ex. | Bromide | Product | Yield |
|---|---|---|---|
| B171 | 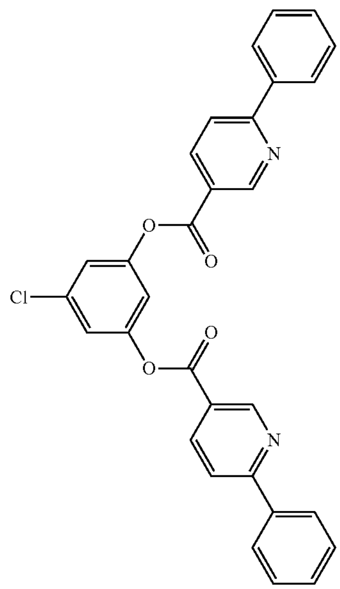 B130 | 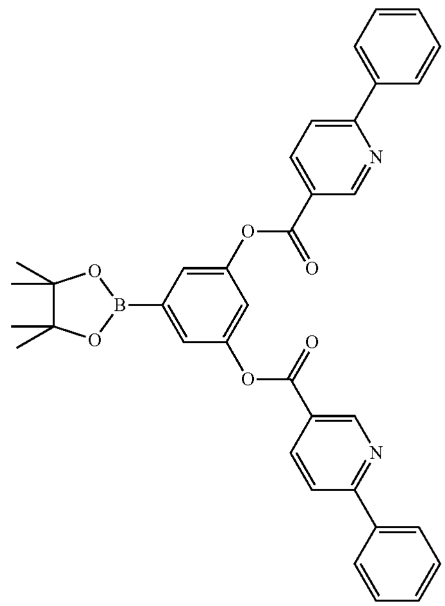 [SMILES: CC1(C)OB(c2cc(OC(=O)c3ccc(-c4ccccc4)nc3)cc(OC(=O)c3ccc(-c4ccccc4)nc3)c2)OC1(C)C] | 75% |
| B172 | 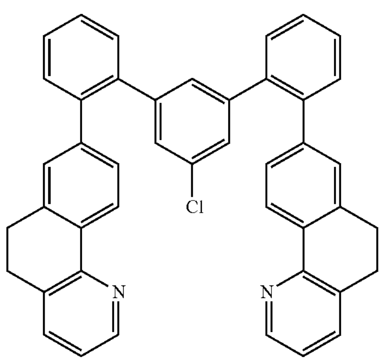 B137 | 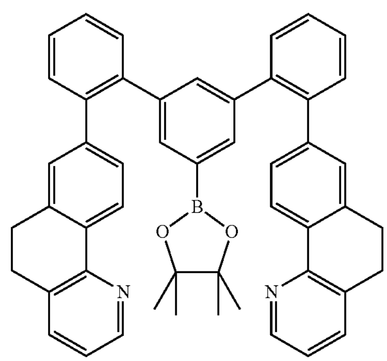 [SMILES: CC1(C)OB(c2cc(-c3ccccc3-c3ccc4c(c3)CCc3cccnc3-4)cc(-c3ccccc3-c3ccc4c(c3)CCc3cccnc3-4)c2)OC1(C)C] | 77% |
| B173 | 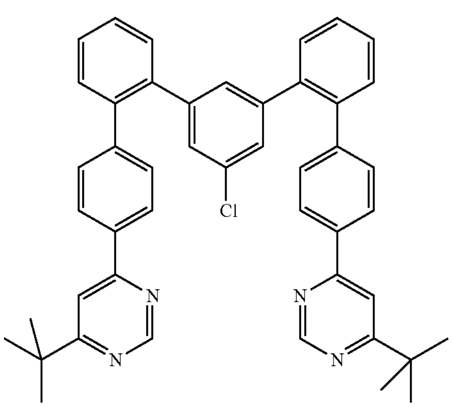 B138 | 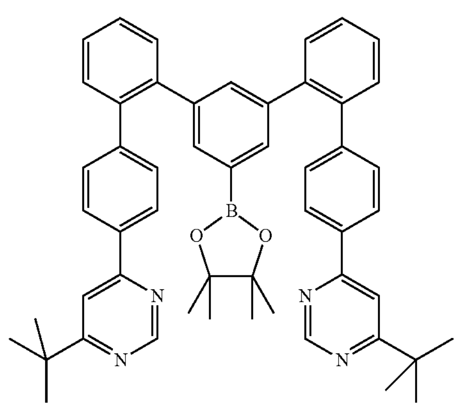 [SMILES: CC(C)(C)c1cc(-c2ccc(-c3ccccc3-c3cc(B4OC(C)(C)C(C)(C)O4)cc(-c4ccccc4-c4ccc(-c5cc(C(C)(C)C)ncn5)cc4)c3)cc2)ncn1] | 80% |

-continued
| Ex. | Bromide | Product | Yield |
|---|---|---|---|
| B174 | 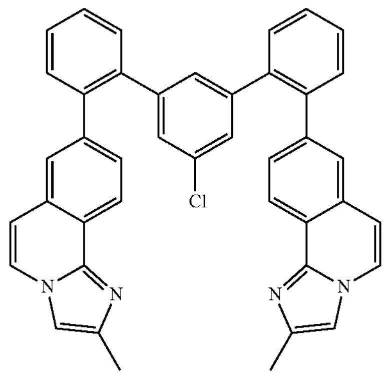 B139 | 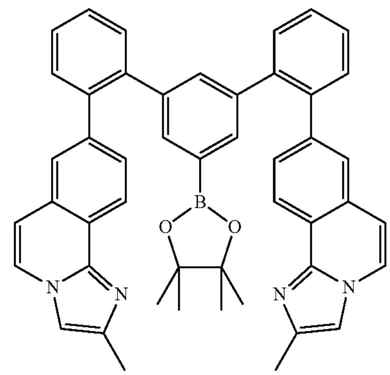 [SMILES: Cc1cn2ccc3cc(-c4ccccc4-c4cc(B5OC(C)(C)C(C)(C)O5)cc(-c5ccccc5-c5ccc6c(ccn7cc(C)nc67)c5)c4)ccc3c2n1] | 82% |
| B175 | 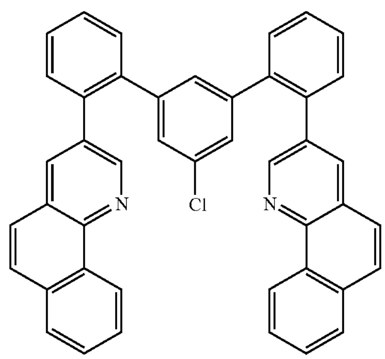 B50 | 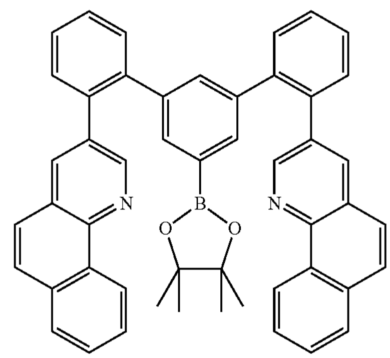 [SMILES: CC1(C)OB(c2cc(-c3ccccc3-c3cnc4c(ccc5ccccc54)c3)cc(-c3ccccc3-c3cnc4c(ccc5ccccc54)c3)c2)OC1(C)C] | 88% |
| B176 | 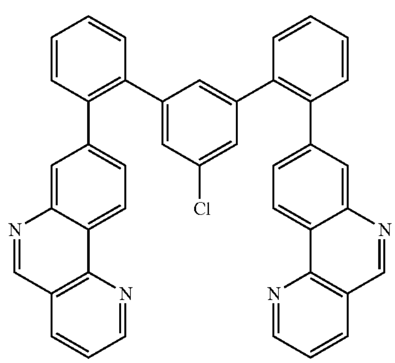 B141 | 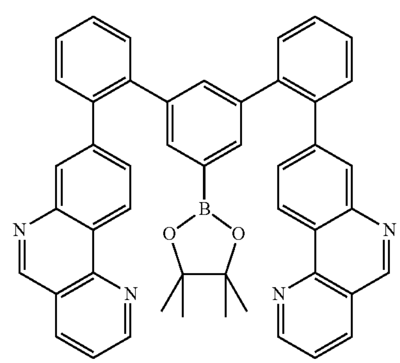 [SMILES: CC1(C)OB(c2cc(-c3ccccc3-c3ccc4c(c3)ncc3cccnc34)cc(-c3ccccc3-c3ccc4c(c3)ncc3cccnc34)c2)OC1(C)C] | 90% |
| B177 | 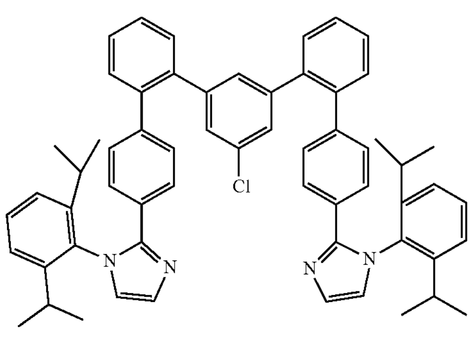 B142 | 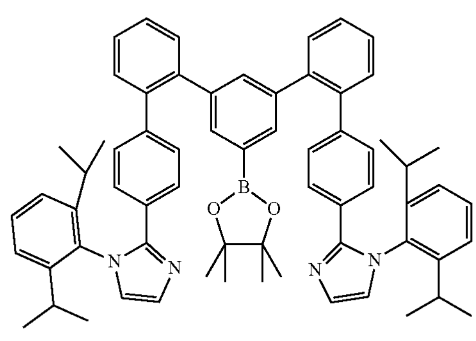 [SMILES: CC(C)c1cccc(C(C)C)c1-n1ccnc1-c1ccc(-c2ccccc2-c2cc(B3OC(C)(C)C(C)(C)O3)cc(-c3ccccc3-c3ccc(-c4nccn4-c4c(C(C)C)cccc4C(C)C)cc3)c2)cc1] | 76% |

-continued
| Ex. | Bromide | Product | Yield |
|---|---|---|---|
| B178 | 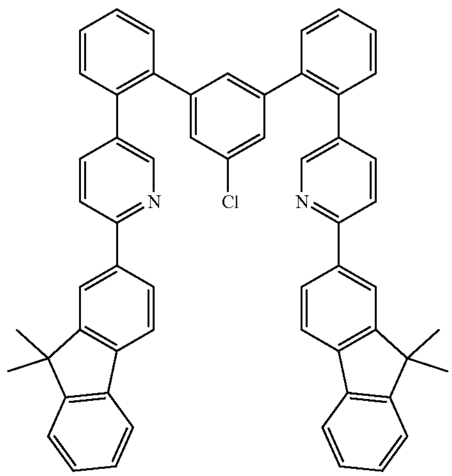 B143 | 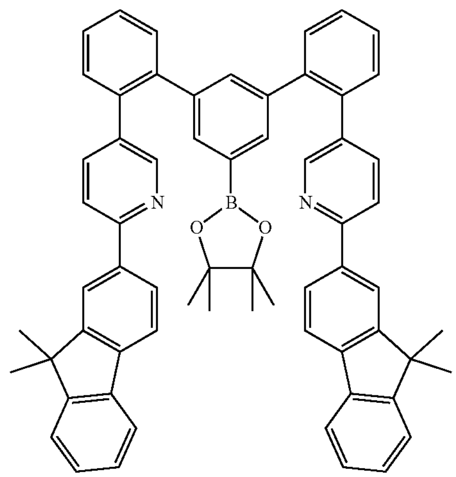 | 80% |
| B179 | 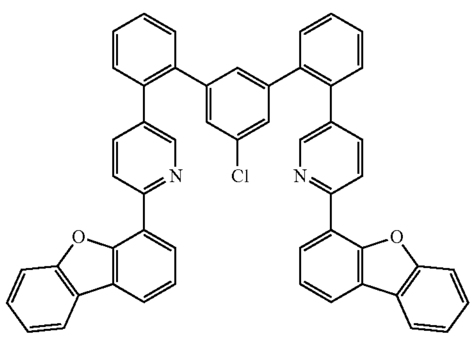 B144 | 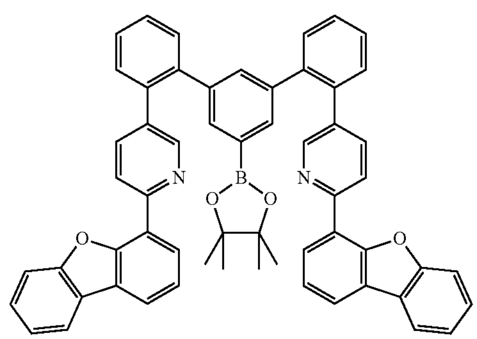 [SMILES: CC1(C)OB(c2cc(-c3ccccc3-c3ccc(-c4cccc5c4oc4ccccc45)nc3)cc(-c3ccccc3-c3ccc(-c4cccc5c4oc4ccccc45)nc3)c2)OC1(C)C] | 81% |
| B180 | 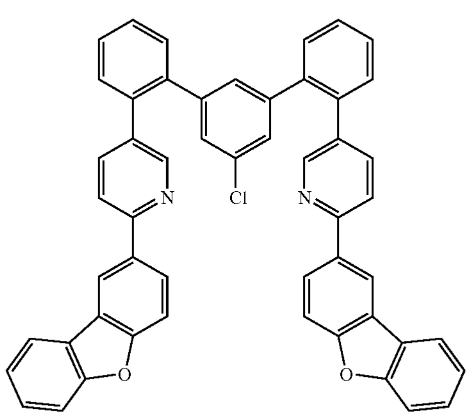 B145 | 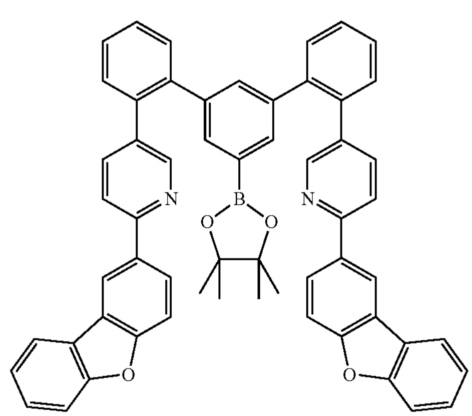 [SMILES: CC1(C)OB(c2cc(-c3ccccc3-c3ccc(-c4ccc5oc6ccccc6c5c4)nc3)cc(-c3ccccc3-c3ccc(-c4ccc5oc6ccccc6c5c4)nc3)c2)OC1(C)C] | 84% |

-continued
| Ex. | Bromide | Product | Yield |
|---|---|---|---|
| B181 | 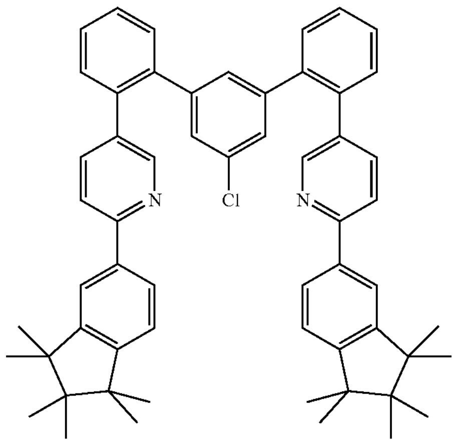 B146 | 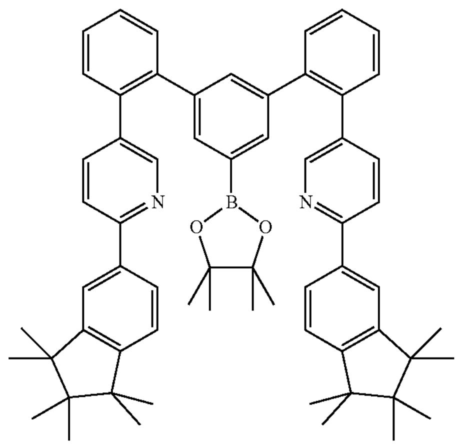 | 74% |
| B182 | 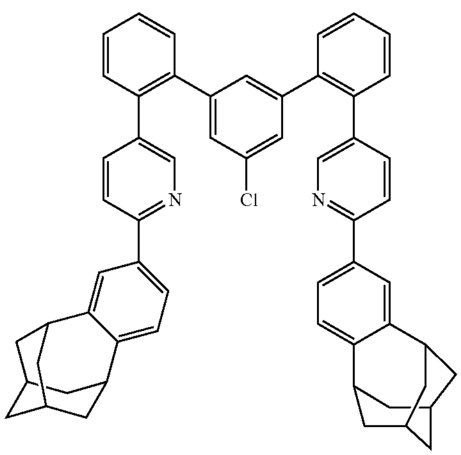 B147 | 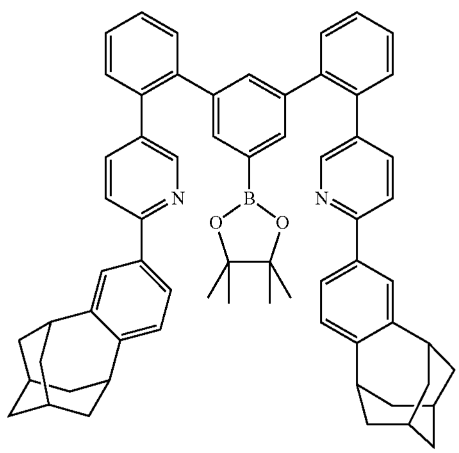 [SMILES: CC1(C)OB(c2cc(-c3ccccc3-c3ccc(-c4ccc5c(c4)C4CC6CC(CC5C6)C4)nc3)cc(-c3ccccc3-c3ccc(-c4ccc5c(c4)C4CC6CC(CC5C6)C4)nc3)c2)OC1(C)C] | 73% |
| B183 | 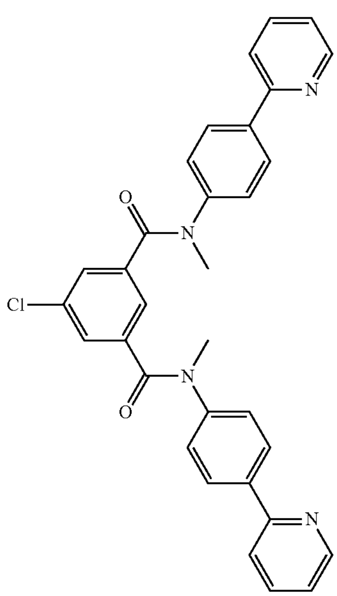 B132 | 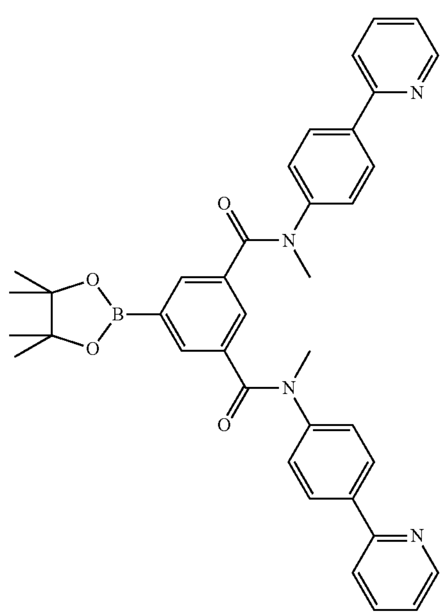 [SMILES: CN(C(=O)c1cc(B2OC(C)(C)C(C)(C)O2)cc(C(=O)N(C)c2ccc(-c3ccccn3)cc2)c1)c1ccc(-c2ccccn2)cc1] | 76% |

-continued
| Ex. | Bromide | Product | Yield |
| --- | --- | --- | --- |
| B184 | 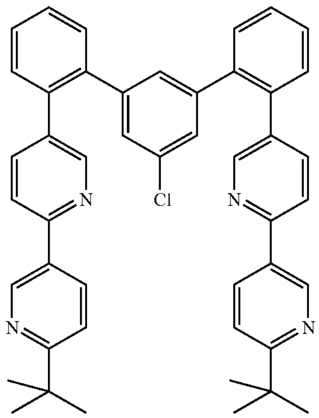 B148 | 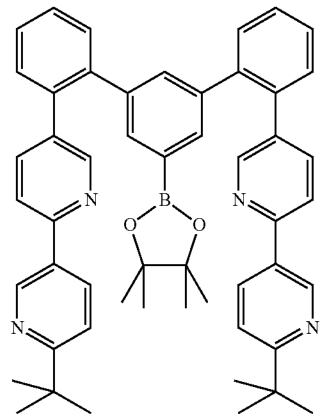 [SMILES: CC(C)(C)c1ccc(-c2ccc(-c3ccccc3-c3cc(B4OC(C)(C)C(C)(C)O4)cc(-c4ccccc4-c4ccc(-c5ccc(C(C)(C)C)nc5)nc4)c3)cn2)cn1] | 72% |
| B185 | 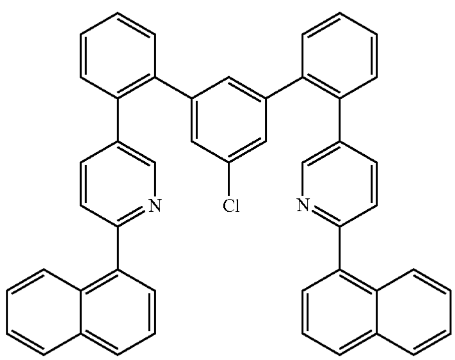 B149 | 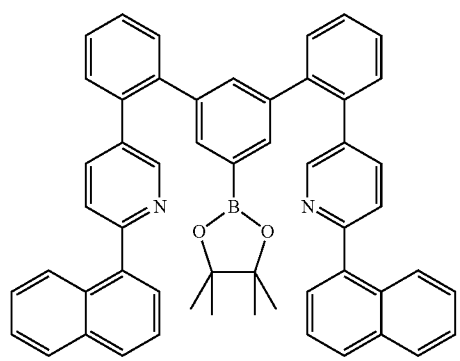 [SMILES: CC1(C)OB(c2cc(-c3ccccc3-c3ccc(-c4cccc5ccccc45)nc3)cc(-c3ccccc3-c3ccc(-c4cccc5ccccc45)nc3)c2)OC1(C)C] | 75% |
| B203 | 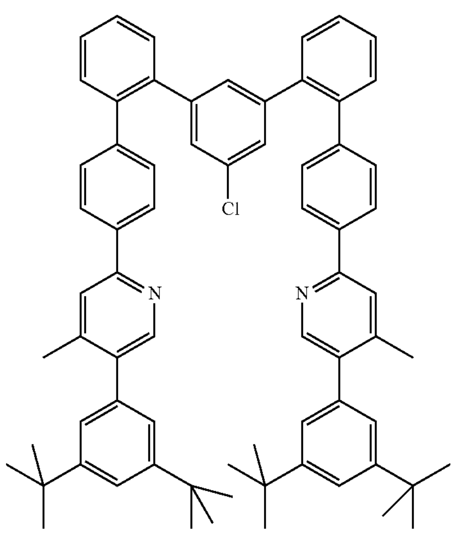 B202 | 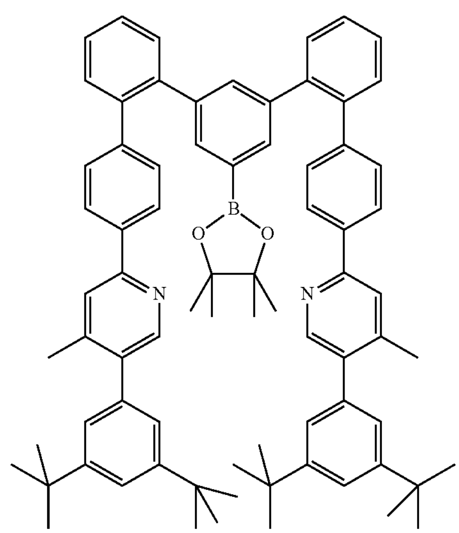 [SMILES: Cc1cc(-c2ccc(-c3ccccc3-c3cc(B4OC(C)(C)C(C)(C)O4)cc(-c4ccccc4-c4ccc(-c5cc(C)c(-c6cc(C(C)(C)C)cc(C(C)(C)C)c6)cn5)cc4)c3)cc2)ncc1-c1cc(C(C)(C)C)cc(C(C)(C)C)c1] | 81% |

Example B186

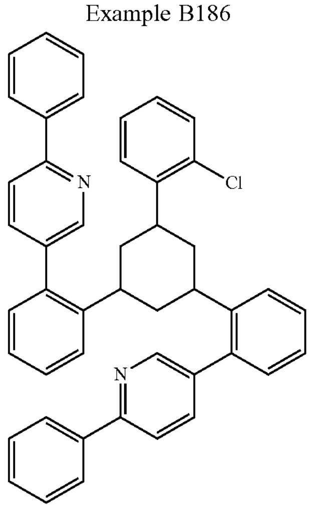

cis-, cis-

A mixture of 54.5 g (100 mmol) of B106, 59.0 g (210 mmol) of 2-phenyl-5-(4,4,5,5-tetramethyl-1,3,2-dioxaborolan-2-yl)pyridine [879291-27-7], 127.4 g (600 mmol) of tripotassium phosphate, 1.57 g (6 mmol) of triphenylphosphine and 449 mg (2 mmol) of palladium(II) acetate in 750 ml of toluene, 300 ml of dioxane and 500 ml of water is heated under reflux for 30 h. After cooling, the organic phase is separated off, washed twice with 300 ml of water each time, once with 300 ml of saturated sodium chloride solution and dried over magnesium sulfate. The magnesium sulfate is filtered off via a Celite bed which has been pre-slurried with toluene, the filtrate is evaporated to dryness in vacuo, and the foam which remains is recrystallised from acetonitrile/ethyl acetate. Yield: 41.8 g (64 mmol), 64%. Purity: about 95% according to $^{1}$H-NMR.

The following compounds can be prepared analogously

| Ex. | Starting materials | Product | Yield |
|---|---|---|---|
| B187 | B106 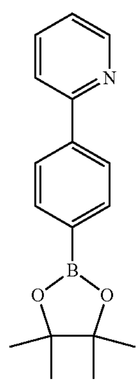 [908350-80-1] | 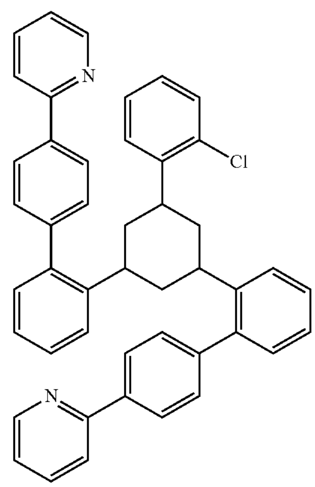 [SMILES: Clc1ccccc1C1CC(c2ccccc2-c2ccc(-c3ccccn3)cc2)CC(c2ccccc2-c2ccc(-c3ccccn3)cc2)C1] | 68% |
| B188 | B108 B70 | 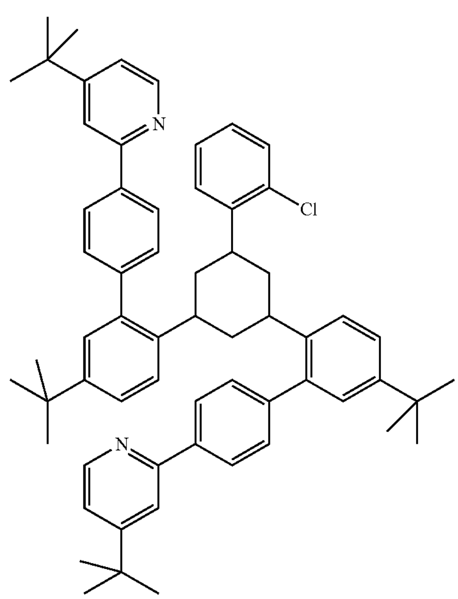 [SMILES: CC(C)(C)c1ccnc(-c2ccc(-c3cc(C(C)(C)C)ccc3C3CC(c4ccccc4Cl)CC(c4ccc(C(C)(C)C)cc4-c4ccc(-c5cc(C(C)(C)C)ccn5)cc4)C3)cc2)c1] | 60% |

-continued
| Ex. | Starting materials | Product | Yield |
|---|---|---|---|
| B189 | B108<br>B59 | 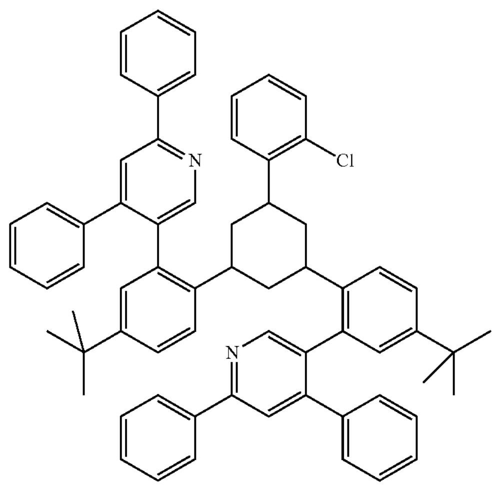 [SMILES: CC(C)(C)c1ccc(C2CC(c3ccccc3Cl)CC(c3ccc(C(C)(C)C)cc3-c3cnc(-c4ccccc4)cc3-c3ccccc3)C2)c(-c2cnc(-c3ccccc3)cc2-c2ccccc2)c1] | 60% |
| B190 | B108<br>B77 | 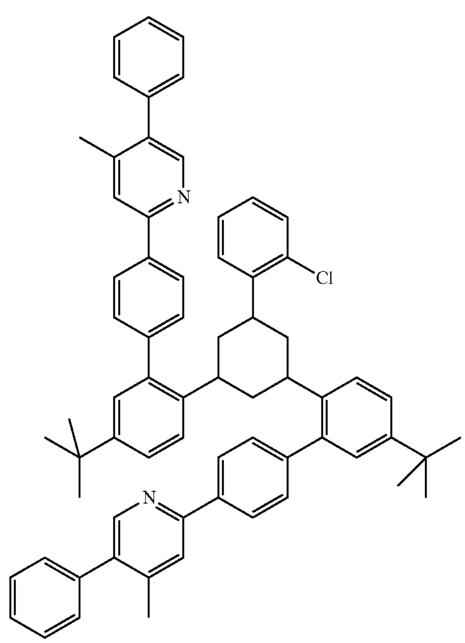 [SMILES: Cc1cc(-c2ccc(-c3cc(C(C)(C)C)ccc3C3CC(c4ccccc4Cl)CC(c4ccc(C(C)(C)C)cc4-c4ccc(-c5cc(C)c(-c6ccccc6)cn5)cc4)C3)cc2)ncc1-c1ccccc1] | 69% |

-continued
| Ex. | Starting materials | Product | Yield |
|---|---|---|---|
| B191 | B109<br>B79 | 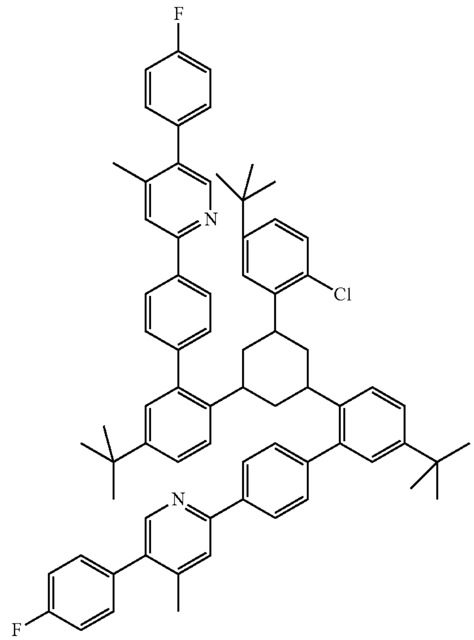 [SMILES: Cc1cc(-c2ccc(-c3cc(C(C)(C)C)ccc3C3CC(c4cc(C(C)(C)C)ccc4Cl)CC(c4ccc(C(C)(C)C)cc4-c4ccc(-c5cc(C)c(-c6ccc(F)cc6)cn5)cc4)C3)cc2)ncc1-c1ccc(F)cc1] | 61% |
| B192 | B107<br>B102 | 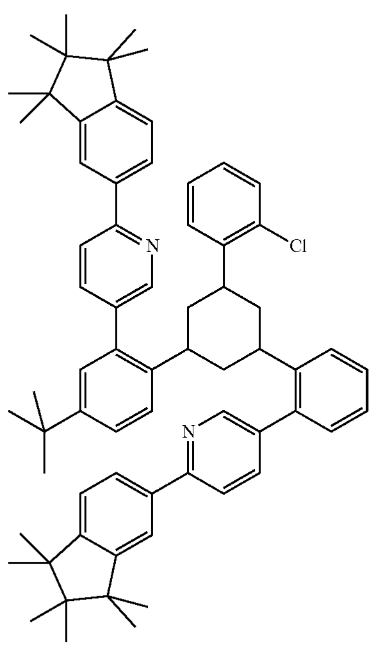 [SMILES: CC(C)(C)c1ccc(C2CC(c3ccccc3Cl)CC(c3ccccc3-c3ccc(-c4ccc5c(c4)C(C)(C)C(C)(C)C5(C)C)nc3)C2)c(-c2ccc(-c3ccc4c(c3)C(C)(C)C(C)(C)C4(C)C)nc2)c1] | 65% |

Example B193

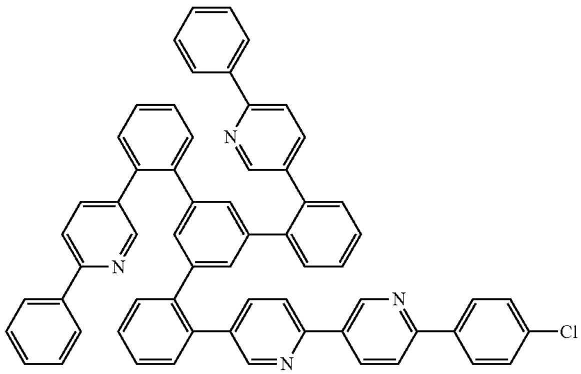 [SMILES: Clc1ccc(-c2ccc(-c3ccc(-c4ccccc4-c4cc(-c5ccccc5-c5ccc(-c6ccccc6)nc5)cc(-c5ccccc5-c5ccc(-c6ccccc6)nc5)c4)cn3)cn2)cc1]

A mixture of 42.1 g (100 mmol) of B30, 66.3 g (100 mmol) of B151, 31.8 g (300 mmol) of sodium carbonate, 580 mg (2.6 mmol) of triphenylphosphine, 200 mg (0.88 mmol) of palladium(II) acetate, 500 ml of toluene, 250 ml of ethanol and 500 ml of water is heated under reflux for 26 h. After cooling, the solid which has precipitated out is filtered off with suction and washed twice with 30 ml of ethanol each time. The crude product is dissolved in 300 ml of dichloromethane and filtered through a silica-gel bed. The silica-gel bed is rinsed three times with 200 ml of dichloromethane/ethyl acetate 1:1 each time. The filtrate is washed twice with water and once with saturated sodium chloride solution and dried over sodium sulfate. The dichloromethane is substantially stripped off in a rotary evaporator. During removal of the dichloromethane in the rotary evaporator, a solid precipitates out of the ethyl acetate which remains and is filtered off with suction and washed with ethyl acetate. The crude product is recrystallised again from ethyl acetate. Yield: 61.5 g (70 mmol), 70%. Purity: about 95% according to $^{1}$H-NMR.

Example B194

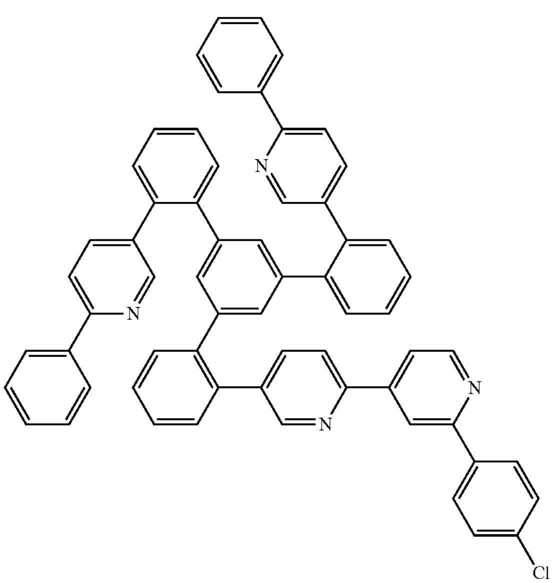 [SMILES: Clc1ccc(-c2cc(-c3ccc(-c4ccccc4-c4cc(-c5ccccc5-c5ccc(-c6ccccc6)nc5)cc(-c5ccccc5-c5ccc(-c6ccccc6)nc5)c4)cn3)ccn2)cc1]

Procedure analogous to that from Example B193, using building block B31 instead of B30. Yield: 66%.

Example B195

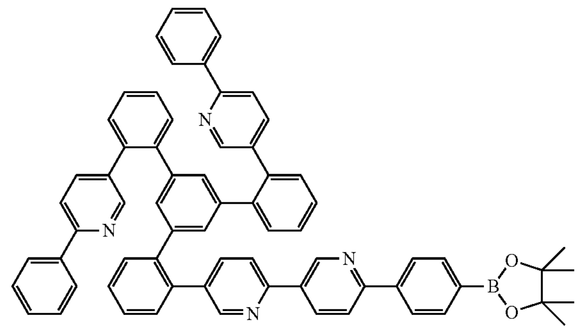 [SMILES: CC1(C)OB(c2ccc(-c3ccc(-c4ccc(-c5ccccc5-c5cc(-c6ccccc6-c6ccc(-c7ccccc7)nc6)cc(-c6ccccc6-c6ccc(-c7ccccc7)nc6)c5)cn4)cn3)cc2)OC1(C)C]

A mixture of 87.7 g (100 mmol) of B193, 25.4 g (100 mmol) of bis(pinacolato)diborane [73183-34-3], 49.1 g (500 mmol) of potassium acetate, 2 mmol of S-Phos [657408-07-6], 1 mmol of palladium(II) acetate, 100 g of glass beads (diameter 3 mm) and 700 ml of 1,4-dioxane is heated under reflux for 16 h. After cooling, the suspension is filtered through a Celite bed, the Celite is rinsed 3× with 200 ml of dioxane each time, and the solvent is removed in vacuo. The black residue is digested with 1000 ml of ethyl acetate, the mixture is filtered while still hot through a Celite bed, then evaporated to about 200 ml, during which the product begins to crystallise. The crystallisation is completed overnight in the refrigerator, the crystals are filtered off and washed with a little ethyl acetate. A second product fraction can be obtained from the mother liquor. Yield: 72.7 g (75 mmol), 75%. Purity: about 97% according to $^{1}$H-NMR.

Example B196

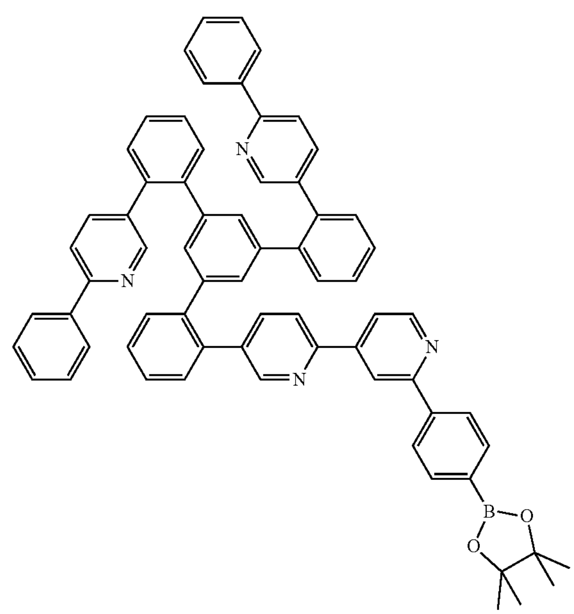 [SMILES: CC1(C)OB(c2ccc(-c3cc(-c4ccc(-c5ccccc5-c5cc(-c6ccccc6-c6ccc(-c7ccccc7)nc6)cc(-c6ccccc6-c6ccc(-c7ccccc7)nc6)c5)cn4)ccn3)cc2)OC1(C)C]

Procedure analogous to that from Example B195. B194 is employed instead of B193. Yield: 80%.

Example B197

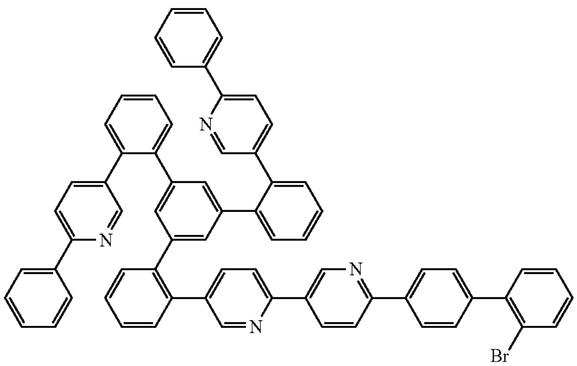 [SMILES: Brc1ccccc1-c1ccc(-c2ccc(-c3ccc(-c4ccccc4-c4cc(-c5ccccc5-c5ccc(-c6ccccc6)nc5)cc(-c5ccccc5-c5ccc(-c6ccccc6)nc5)c4)cn3)cn2)cc1]

A mixture of 48.5 g (50 mmol) of B195, 14.1 g (50 mmol) of 1-bromo-2-iodobenzene [583-55-1], 31.8 g (300 mmol) of sodium carbonate, 2.3 g (2 mmol) of tetrakis(triphenylphosphine)palladium(0) [14221-01-3], 500 ml of 1,2-dimethoxyethane and 250 ml of water is heated under reflux for 60 h. After cooling, the solid which has precipitated out is filtered off with suction and washed three times with 100 ml of ethanol. The crude product is dissolved in 300 ml of dichloromethane and filtered through a silica-gel bed which has been pre-slurried with dichloromethane. The silica gel is rinsed three times with 200 ml of ethyl acetate each time. The dichloromethane is removed in a rotary evaporator to 500 mbar at a bath temperature of 50° C. During removal of the dichloromethane in the rotary evaporator, a solid precipitates out of the ethyl acetate which remains and is filtered off with suction and washed with ethyl acetate. The solid obtained is recrystallised again from boiling ethyl acetate. Yield 31.9 g (32 mmol), 64%. Purity: 95% according to $^{1}$H-NMR.

Example B198

Procedure analogous to Example B197. Yield: 60%.

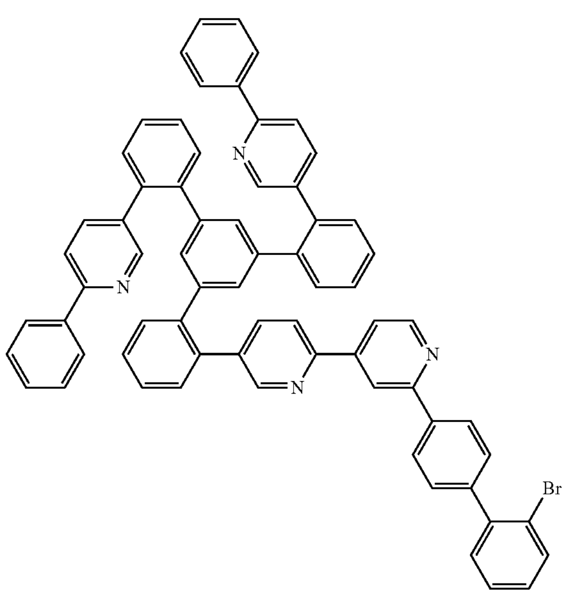 [SMILES: Brc1ccccc1-c1ccc(-c2cc(-c3ccc(-c4ccccc4-c4cc(-c5ccccc5-c5ccc(-c6ccccc6)nc5)cc(-c5ccccc5-c5ccc(-c6ccccc6)nc5)c4)cn3)ccn2)cc1]

B: Synthesis of the Ligands:

Example L1

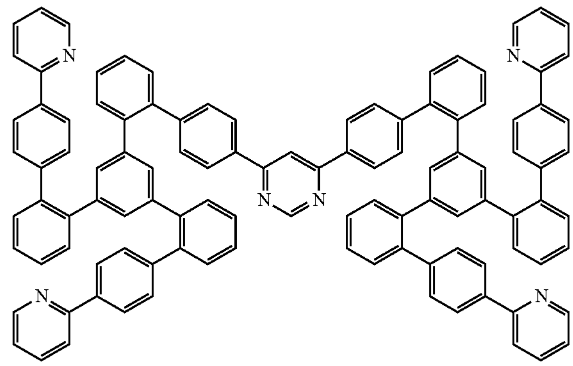

A mixture of 7.9 g (14.5 mmol) of B20, 20.2 g (30.5 mmol) of B152, 63.7 g (87 mmol) of sodium carbonate, 340 mg (1.3 mmol) of triphenylphosphine, 98 mg (0.44 mmol) of palladium(II) acetate, 200 ml of toluene, 100 ml of ethanol and 200 ml of water is heated under reflux for 40 h. After cooling, the solid which has precipitated out is filtered off with suction and washed twice with 30 ml of ethanol each time. The crude product is dissolved in 300 ml of dichloromethane and filtered through a silica-gel bed. The silica-gel bed is rinsed three times with 200 ml of dichloromethane/ethyl acetate 1:1 each time. The filtrate is washed twice with water and once with saturated sodium chloride solution and dried over sodium sulfate. The dichloromethane is substantially stripped off in a rotary evaporator. During removal of the dichloromethane in the rotary evaporator, a solid precipitates out of the ethyl acetate which remains and is filtered off with suction and washed with ethyl acetate. Yield: 12.5 g (8.6 mmol), 59%. Purity: about 98% according to $^{1}$H-NMR.

The following compounds can be prepared analogously, where solvents such as, for example, ethyl acetate, cyclohexane, toluene, acetonitrile, n-heptane, ethanol, DMF, DMAC or methanol can be used for the recrystallisation. It is also possible to carry out a hot extraction with these solvents, or the purification can be carried out by chromatography on silica gel on an automated column (Torrent from Axel Semrau).

| Ex. | Starting materials | Product/ reaction conditions, if different | Yield |
|---|---|---|---|
| L2 | B157 + B20 | 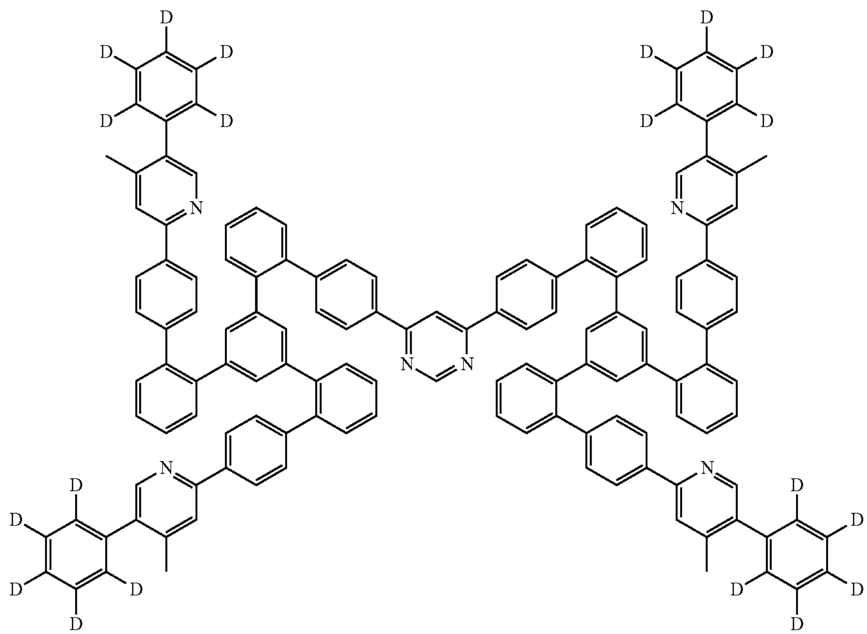 [SMILES: [2H]c1c([2H])c([2H])c(-c2cnc(-c3ccc(-c4ccccc4-c4cc(-c5ccccc5-c5ccc(-c6cc(-c7ccc(-c8ccccc8-c8cc(-c9ccccc9-c9ccc(-c%10cc(C)c(-c%11c([2H])c([2H])c([2H])c([2H])c%11[2H])cn%10)cc9)cc(-c9ccccc9-c9ccc(-c%10cc(C)c(-c%11c([2H])c([2H])c([2H])c([2H])c%11[2H])cn%10)cc9)c8)cc7)ncn6)cc5)cc(-c5ccccc5-c5ccc(-c6cc(C)c(-c7c([2H])c([2H])c([2H])c([2H])c7[2H])cn6)cc5)c4)cc3)cc2C)c([2H])c1[2H]] | 56% |
| L3 | B161 + B20 | 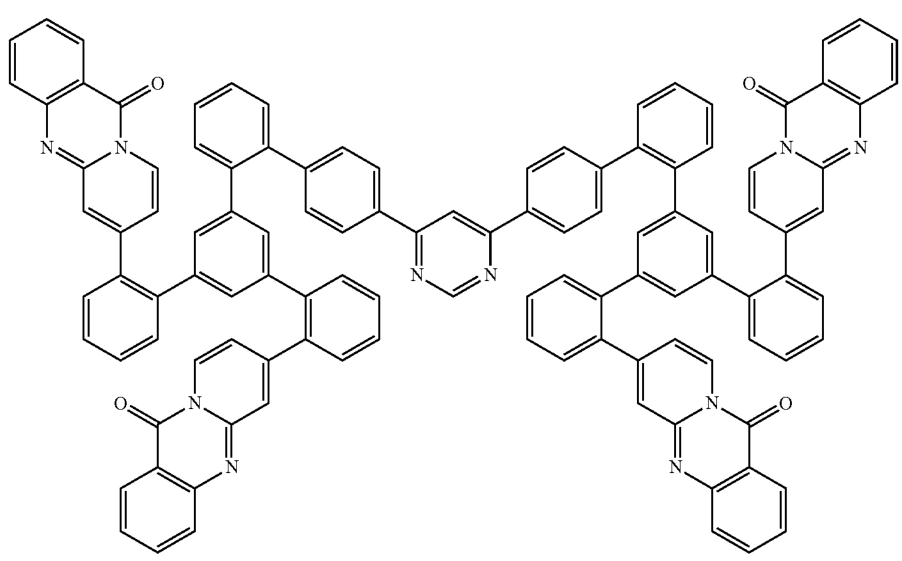 [SMILES: O=c1c2ccccc2nc2cc(-c3ccccc3-c3cc(-c4ccccc4-c4ccc(-c5cc(-c6ccc(-c7ccccc7-c7cc(-c8ccccc8-c8ccn9c(=O)c%10ccccc%10nc9c8)cc(-c8ccccc8-c8ccn9c(=O)c%10ccccc%10nc9c8)c7)cc6)ncn5)cc4)cc(-c4ccccc4-c4ccn5c(=O)c6ccccc6nc5c4)c3)ccn12] | 50% |

-continued
| Ex. | Starting materials | Product/ reaction conditions, if different | Yield |
|---|---|---|---|
| L4 | B162 + B20 | 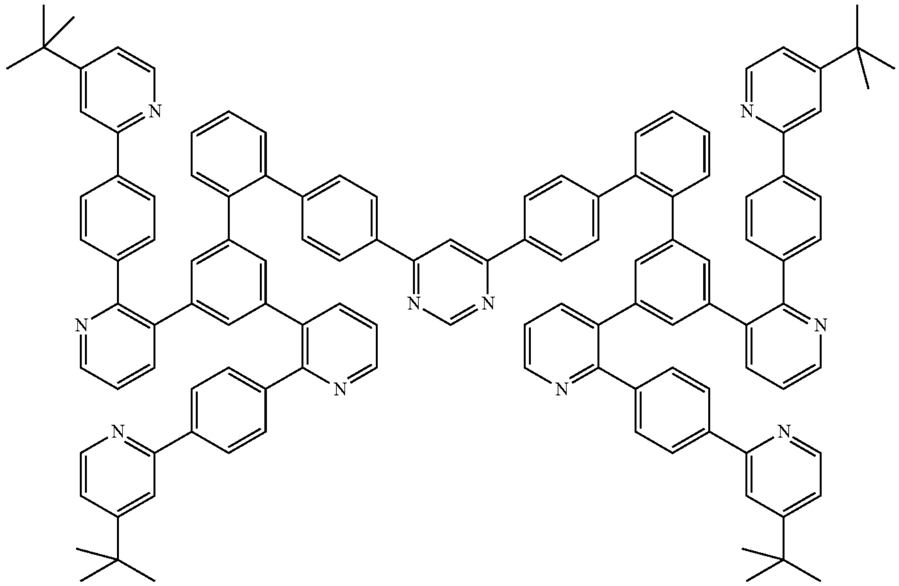 [SMILES: CC(C)(C)c1ccnc(-c2ccc(-c3ncccc3-c3cc(-c4ccccc4-c4ccc(-c5cc(-c6ccc(-c7ccccc7-c7cc(-c8cccnc8-c8ccc(-c9cc(C(C)(C)C)ccn9)cc8)cc(-c8cccnc8-c8ccc(-c9cc(C(C)(C)C)ccn9)cc8)c7)cc6)ncn5)cc4)cc(-c4cccnc4-c4ccc(-c5cc(C(C)(C)C)ccn5)cc4)c3)cc2)c1] | 48% |
| L5 | B165 + B20 | 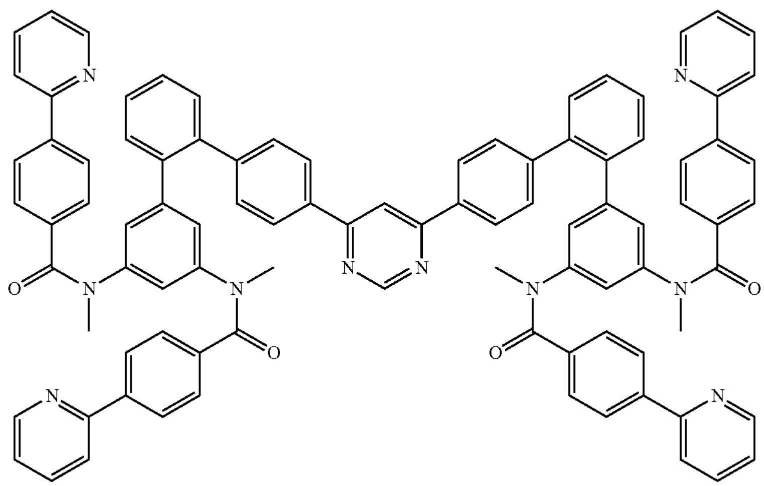 [SMILES: CN(C(=O)c1ccc(-c2ccccn2)cc1)c1cc(-c2ccccc2-c2ccc(-c3cc(-c4ccc(-c5ccccc5-c5cc(N(C)C(=O)c6ccc(-c7ccccn7)cc6)cc(N(C)C(=O)c6ccc(-c7ccccn7)cc6)c5)cc4)ncn3)cc2)cc(N(C)C(=O)c2ccc(-c3ccccn3)cc2)c1] | 52% |
| L6 | B167 + B20 | 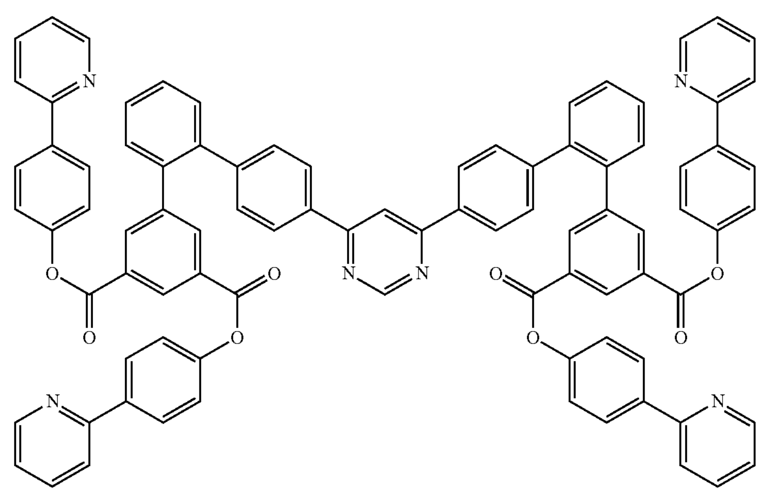 [SMILES: O=C(Oc1ccc(-c2ccccn2)cc1)c1cc(C(=O)Oc2ccc(-c3ccccn3)cc2)cc(-c2ccccc2-c2ccc(-c3cc(-c4ccc(-c5ccccc5-c5cc(C(=O)Oc6ccc(-c7ccccn7)cc6)cc(C(=O)Oc6ccc(-c7ccccn7)cc6)c5)cc4)ncn3)cc2)c1] | 43% |

-continued
| Ex. | Starting materials | Product/ reaction conditions, if different | Yield |
|---|---|---|---|
| L8 | B170 + B20 | 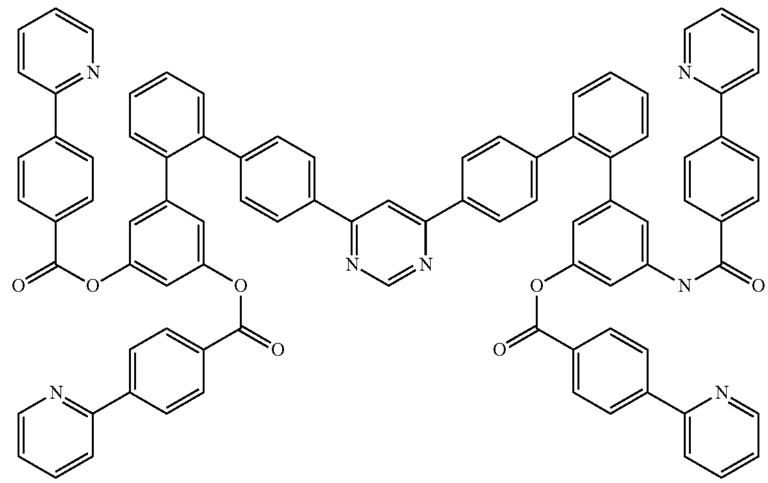 [SMILES: O=C(Nc1cc(OC(=O)c2ccc(-c3ccccn3)cc2)cc(-c2ccccc2-c2ccc(-c3cc(-c4ccc(-c5ccccc5-c5cc(OC(=O)c6ccc(-c7ccccn7)cc6)cc(OC(=O)c6ccc(-c7ccccn7)cc6)c5)cc4)ncn3)cc2)c1)c1ccc(-c2ccccn2)cc1] | 41% |
| L9 | B172 + B20 | 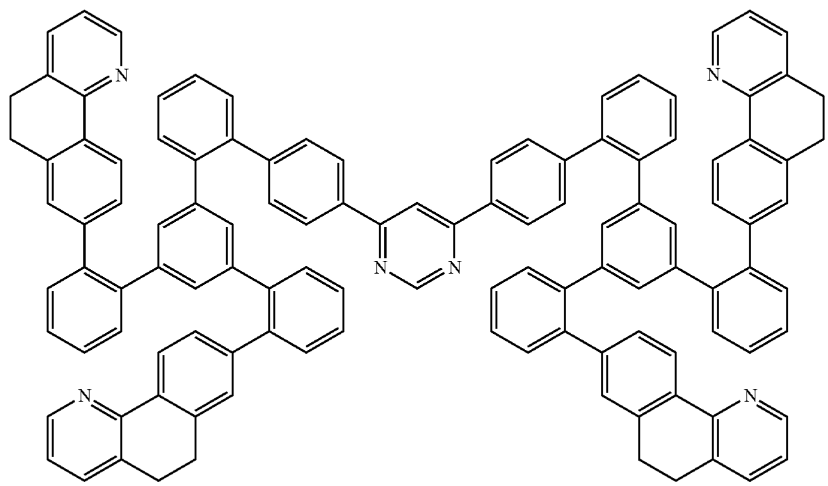 [SMILES: c1cnc2c(c1)CCc1cc(-c3ccccc3-c3cc(-c4ccccc4-c4ccc(-c5cc(-c6ccc(-c7ccccc7-c7cc(-c8ccccc8-c8ccc9c(c8)CCc8cccnc8-9)cc(-c8ccccc8-c8ccc9c(c8)CCc8cccnc8-9)c7)cc6)ncn5)cc4)cc(-c4ccccc4-c4ccc5c(c4)CCc4cccnc4-5)c3)ccc1-2] | 45% |
| L10 | B173 + B20 | 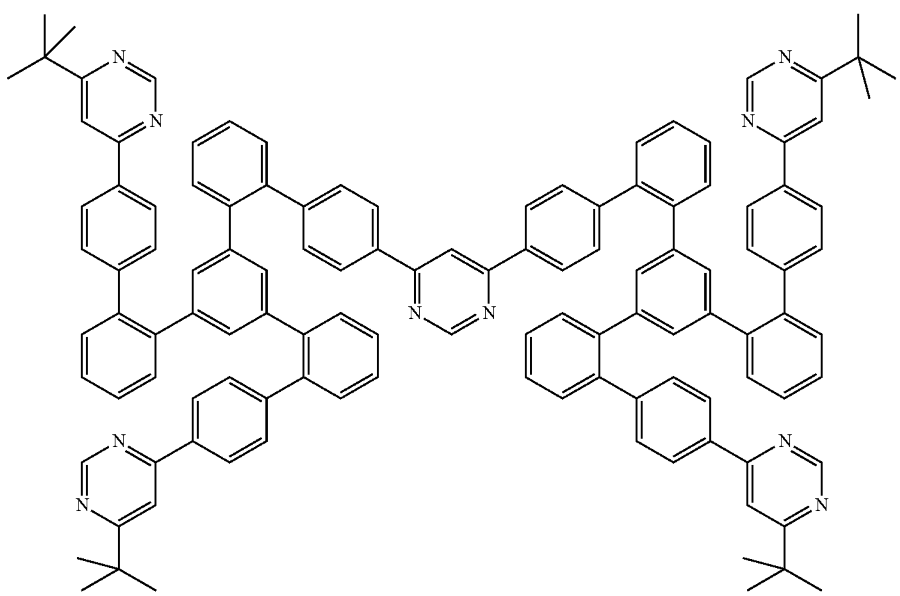 [SMILES: CC(C)(C)c1cc(-c2ccc(-c3ccccc3-c3cc(-c4ccccc4-c4ccc(-c5cc(-c6ccc(-c7ccccc7-c7cc(-c8ccccc8-c8ccc(-c9cc(C(C)(C)C)ncn9)cc8)cc(-c8ccccc8-c8ccc(-c9cc(C(C)(C)C)ncn9)cc8)c7)cc6)ncn5)cc4)cc(-c4ccccc4-c4ccc(-c5cc(C(C)(C)C)ncn5)cc4)c3)cc2)ncn1] | 55% |

-continued
| Ex. | Starting materials | Product/ reaction conditions, if different | Yield |
|---|---|---|---|
| L11 | B174 + B20 | 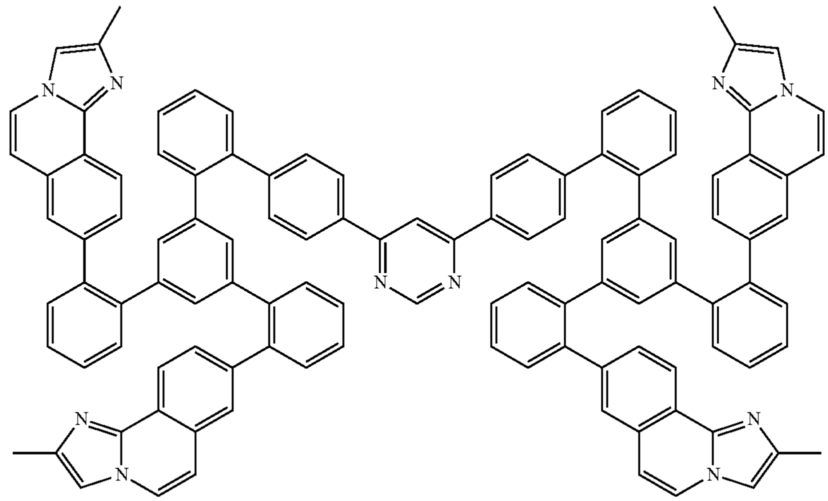 [SMILES: Cc1cn2ccc3cc(-c4ccccc4-c4cc(-c5ccccc5-c5ccc(-c6cc(-c7ccc(-c8ccccc8-c8cc(-c9ccccc9-c9ccc%10c(ccn%11cc(C)nc%10%11)c9)cc(-c9ccccc9-c9ccc%10c(ccn%11cc(C)nc%10%11)c9)c8)cc7)ncn6)cc5)cc(-c5ccccc5-c5ccc6c(ccn7cc(C)nc67)c5)c4)ccc3c2n1] | 41% |
| L12 | B177 + B20 | 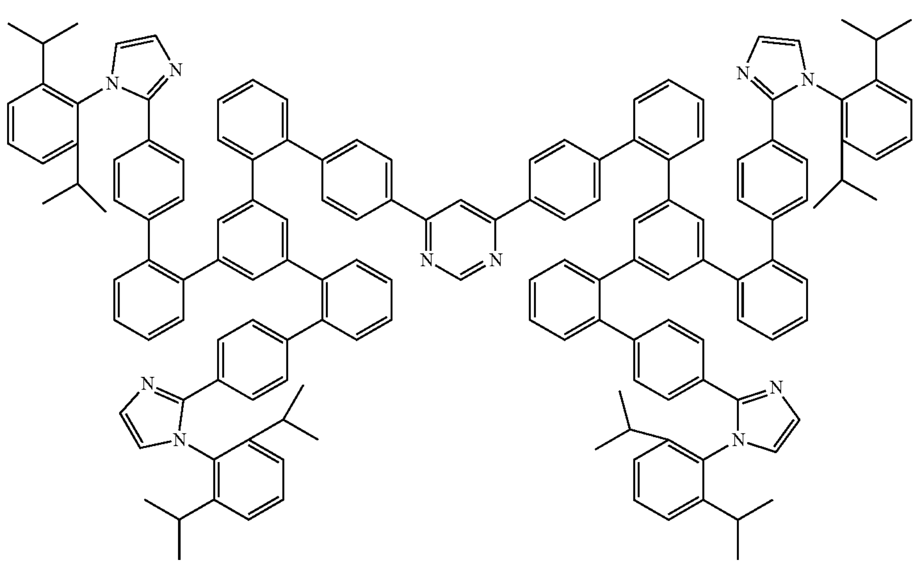 [SMILES: CC(C)c1cccc(C(C)C)c1-n1ccnc1-c1ccc(-c2ccccc2-c2cc(-c3ccccc3-c3ccc(-c4cc(-c5ccc(-c6ccccc6-c6cc(-c7ccccc7-c7ccc(-c8nccn8-c8c(C(C)C)cccc8C(C)C)cc7)cc(-c7ccccc7-c7ccc(-c8nccn8-c8c(C(C)C)cccc8C(C)C)cc7)c6)cc5)ncn4)cc3)cc(-c3ccccc3-c3ccc(-c4nccn4-c4c(C(C)C)cccc4C(C)C)cc3)c2)cc1] | 44% |

-continued
| Ex. | Starting materials | Product/ reaction conditions, if different | Yield |
|---|---|---|---|
| L13 | B164 + B82 4.4 equiv. of B82, 12 eq. of base, 10 mol %, catalyst | 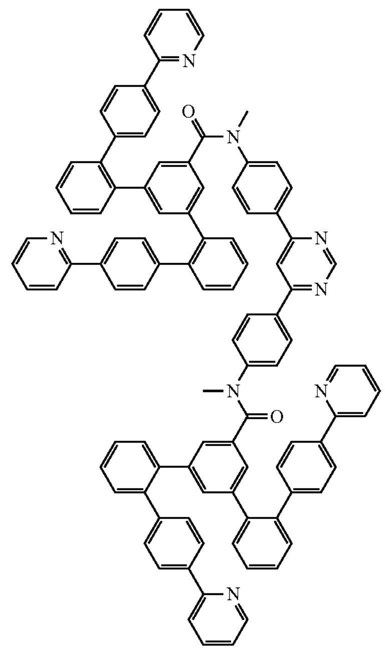 [SMILES: CN(C(=O)c1cc(-c2ccccc2-c2ccc(-c3ccccn3)cc2)cc(-c2ccccc2-c2ccc(-c3ccccn3)cc2)c1)c1ccc(-c2cc(-c3ccc(N(C)C(=O)c4cc(-c5ccccc5-c5ccc(-c6ccccn6)cc5)cc(-c5ccccc5-c5ccc(-c6ccccn6)cc5)c4)cc3)ncn2)cc1] | 28% |
| L14 | B169 + B100 4.4 equiv. of B100, 12 equiv. of base, 10 mol %, catalyst | 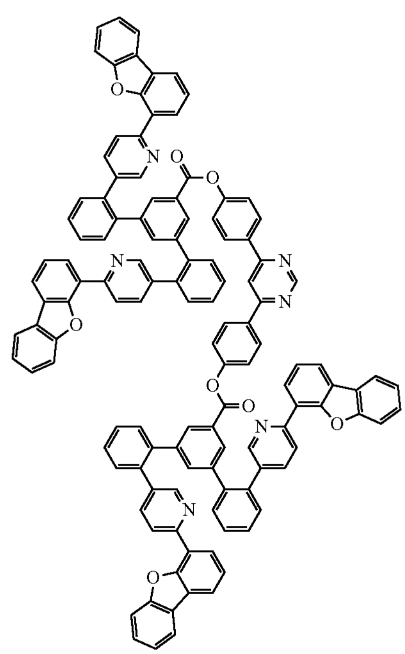 [SMILES: O=C(Oc1ccc(-c2cc(-c3ccc(OC(=O)c4cc(-c5ccccc5-c5ccc(-c6cccc7c6oc6ccccc67)nc5)cc(-c5ccccc5-c5ccc(-c6cccc7c6oc6ccccc67)nc5)c4)cc3)ncn2)cc1)c1cc(-c2ccccc2-c2ccc(-c3cccc4c3oc3ccccc34)nc2)cc(-c2ccccc2-c2ccc(-c3cccc4c3oc3ccccc34)nc2)c1] | 32% |

-continued
| Ex. | Starting materials | Product/ reaction conditions, if different | Yield |
|---|---|---|---|
| L15 | B181 + B20 | 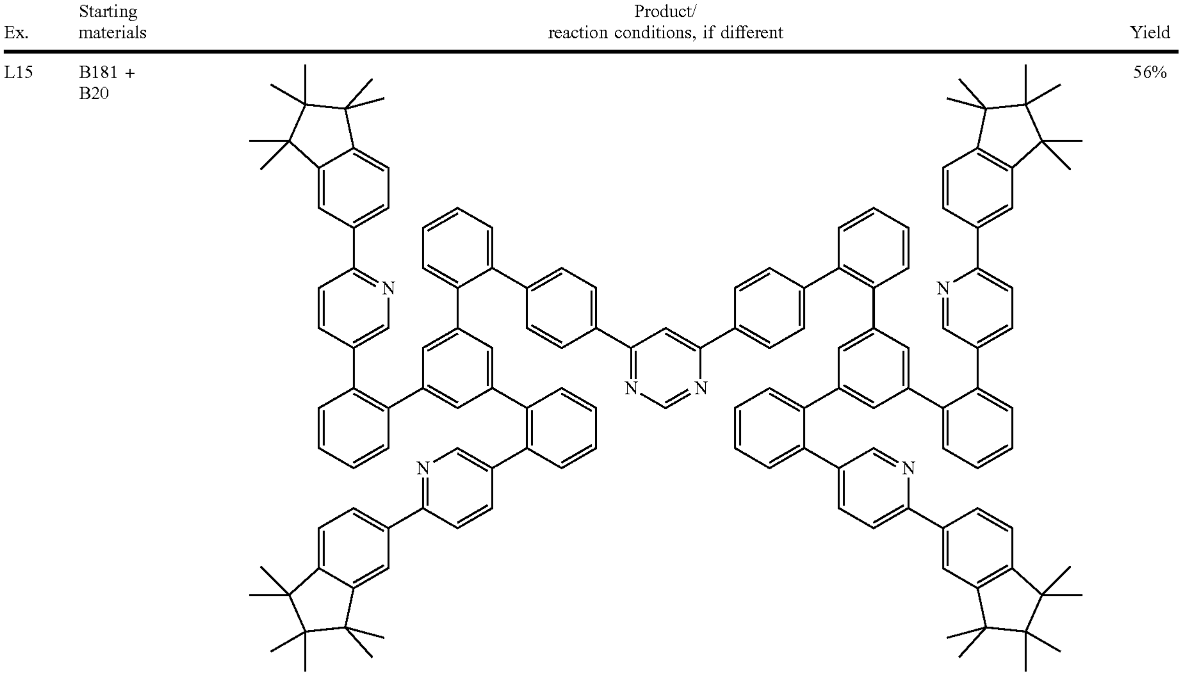 | 56% |
| L16 | B21 + B151 | 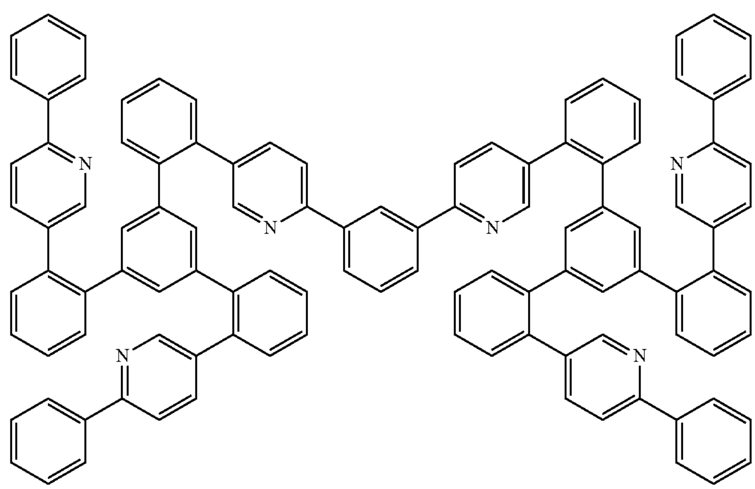 [SMILES: c1ccc(-c2ccc(-c3ccccc3-c3cc(-c4ccccc4-c4ccc(-c5ccccc5)nc4)cc(-c4ccccc4-c4ccc(-c5cccc(-c6ccc(-c7ccccc7-c7cc(-c8ccccc8-c8ccc(-c9ccccc9)nc8)cc(-c8ccccc8-c8ccc(-c9ccccc9)nc8)c7)cn6)c5)nc4)c3)cn2)cc1] | 55% |
| L17 | B21 + B152 | 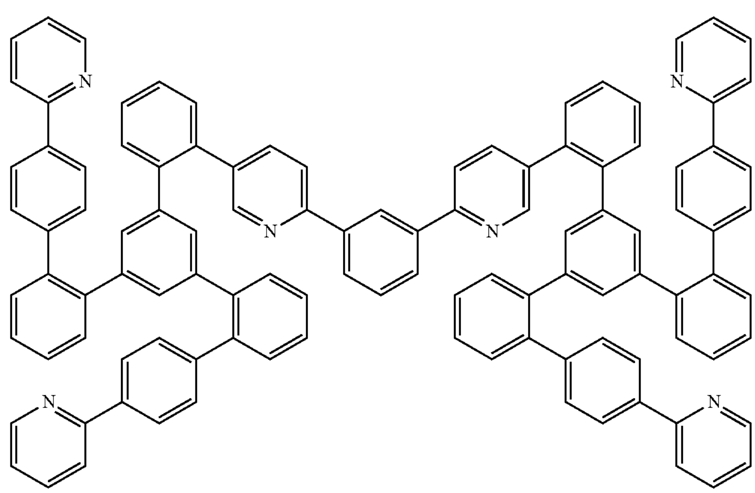 [SMILES: c1ccc(-c2ccc(-c3ccccc3-c3cc(-c4ccccc4-c4ccc(-c5ccccn5)cc4)cc(-c4ccccc4-c4ccc(-c5cccc(-c6ccc(-c7ccccc7-c7cc(-c8ccccc8-c8ccc(-c9ccccn9)cc8)cc(-c8ccccc8-c8ccc(-c9ccccn9)cc8)c7)cn6)c5)nc4)c3)cc2)nc1] | 52% |

-continued
| Ex. | Starting materials | Product/ reaction conditions, if different | Yield |
|---|---|---|---|
| L18 | B21 + B182 | 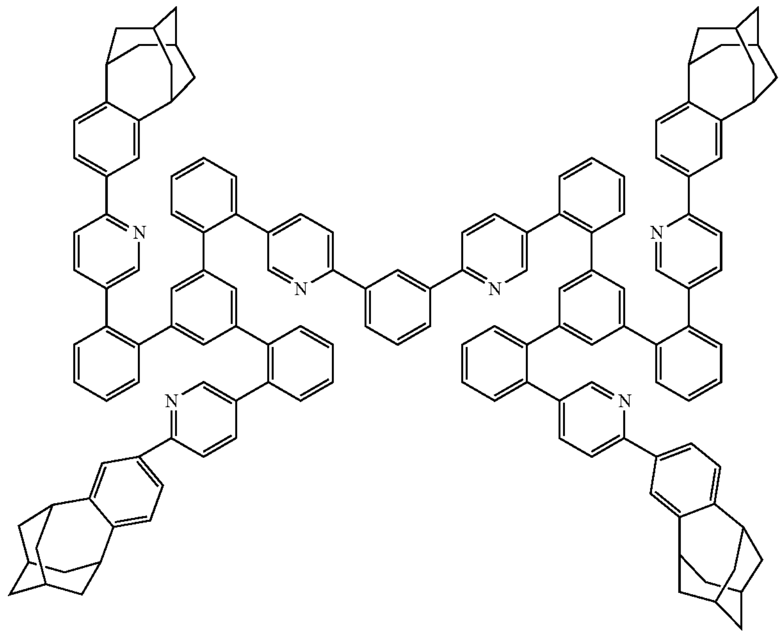 [SMILES: c1cc(-c2ccc(-c3ccccc3-c3cc(-c4ccccc4-c4ccc(-c5ccc6c(c5)C5CC7CC(CC6C7)C5)nc4)cc(-c4ccccc4-c4ccc(-c5ccc6c(c5)C5CC7CC(CC6C7)C5)nc4)c3)cn2)cc(-c2ccc(-c3ccccc3-c3cc(-c4ccccc4-c4ccc(-c5ccc6c(c5)C5CC7CC(CC6C7)C5)nc4)cc(-c4ccccc4-c4ccc(-c5ccc6c(c5)C5CC7CC(CC6C7)C5)nc4)c3)cn2)c1] | 46% |
| L19 | B21 + B178 | 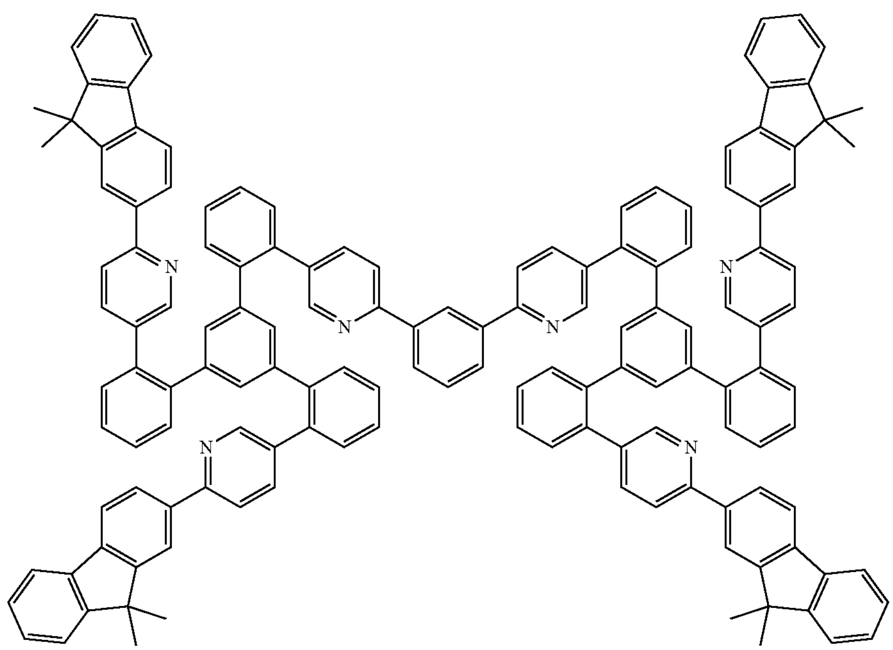 [SMILES: CC1(C)c2ccccc2-c2ccc(-c3ccc(-c4ccccc4-c4cc(-c5ccccc5-c5ccc(-c6cccc(-c7ccc(-c8ccccc8-c8cc(-c9ccccc9-c9ccc(-c%10ccc%11c(c%10)C(C)(C)c%10ccccc%10-%11)nc9)cc(-c9ccccc9-c9ccc(-c%10ccc%11c(c%10)C(C)(C)c%10ccccc%10-%11)nc9)c8)cn7)c6)nc5)cc(-c5ccccc5-c5ccc(-c6ccc7c(c6)C(C)(C)c6ccccc6-7)nc5)c4)cn3)cc21] | 48% |

-continued
| Ex. | Starting materials | Product/ reaction conditions, if different | Yield |
|---|---|---|---|
| L20 | S 8 + B159 | 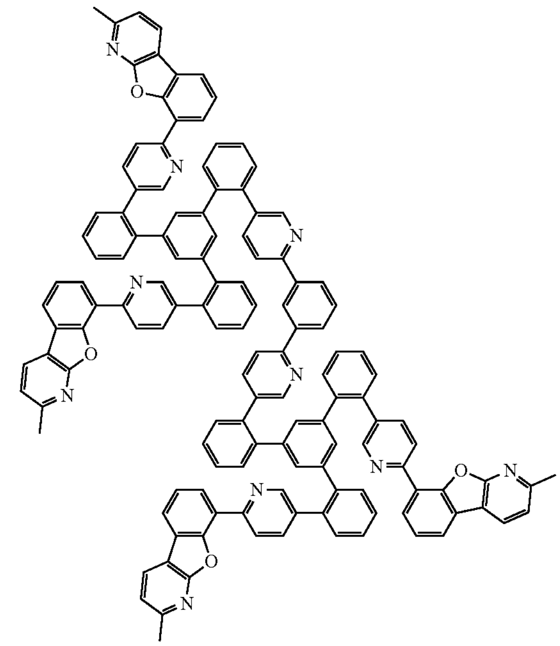 [SMILES: Cc1ccc2c(n1)oc1c(-c3ccc(-c4ccccc4-c4cc(-c5ccccc5-c5ccc(-c6cccc(-c7ccc(-c8ccccc8-c8cc(-c9ccccc9-c9ccc(-c%10cccc%11c%10oc%10nc(C)ccc%10%11)nc9)cc(-c9ccccc9-c9ccc(-c%10cccc%11c%10oc%10nc(C)ccc%10%11)nc9)c8)cn7)c6)nc5)cc(-c5ccccc5-c5ccc(-c6cccc7c6oc6nc(C)ccc67)nc5)c4)cn3)cccc12] | 45% |
| L21 | B21 + B163 | 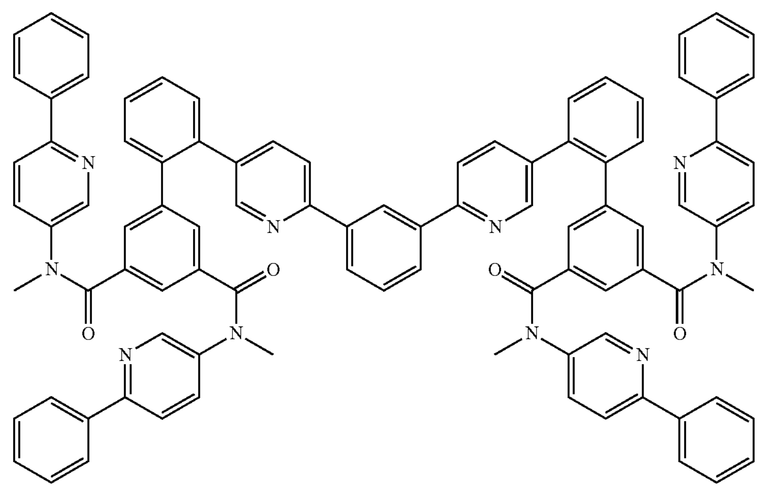 [SMILES: CN(C(=O)c1cc(C(=O)N(C)c2ccc(-c3ccccc3)nc2)cc(-c2ccccc2-c2ccc(-c3cccc(-c4ccc(-c5ccccc5-c5cc(C(=O)N(C)c6ccc(-c7ccccc7)nc6)cc(C(=O)N(C)c6ccc(-c7ccccc7)nc6)c5)cn4)c3)nc2)c1)c1ccc(-c2ccccc2)nc1] | 50% |
| L22 | B21 + B171 | 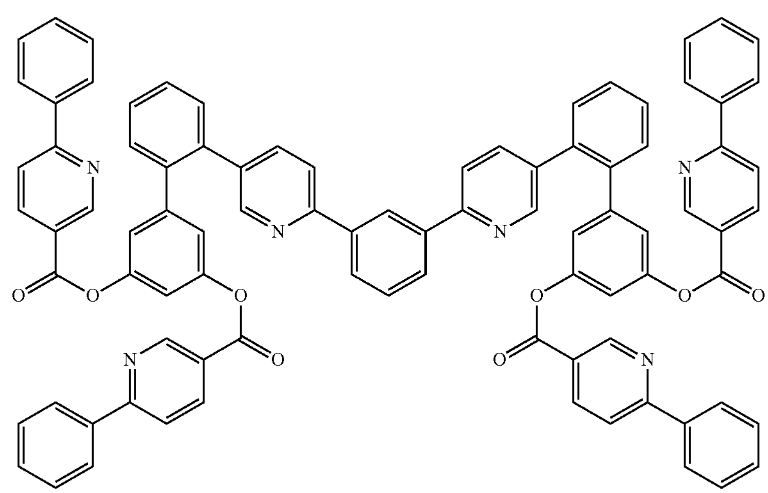 [SMILES: O=C(Oc1cc(OC(=O)c2ccc(-c3ccccc3)nc2)cc(-c2ccccc2-c2ccc(-c3cccc(-c4ccc(-c5ccccc5-c5cc(OC(=O)c6ccc(-c7ccccc7)nc6)cc(OC(=O)c6ccc(-c7ccccc7)nc6)c5)cn4)c3)nc2)c1)c1ccc(-c2ccccc2)nc1] | 52% |

-continued
| Ex. | Starting materials | Product/ reaction conditions, if different | Yield |
|---|---|---|---|
| L23 | B22 + B152 | 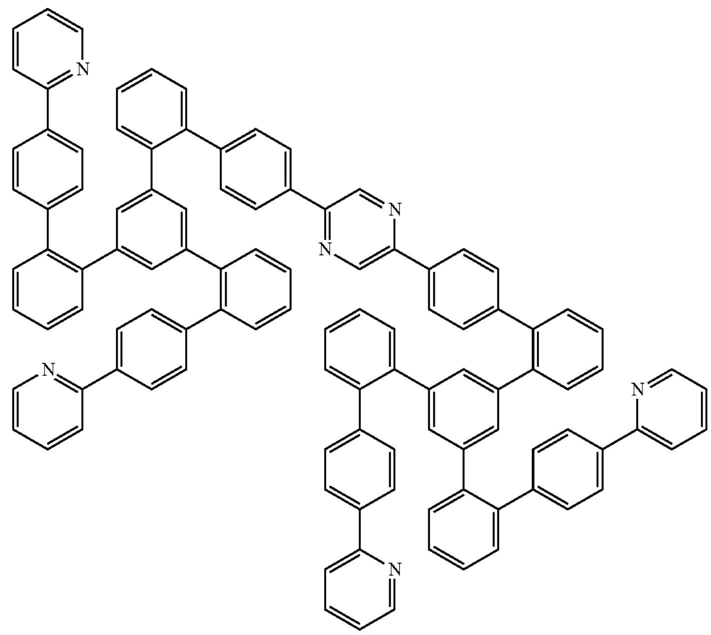 [SMILES: c1ccc(-c2ccc(-c3ccccc3-c3cc(-c4ccccc4-c4ccc(-c5ccccn5)cc4)cc(-c4ccccc4-c4ccc(-c5cnc(-c6ccc(-c7ccccc7-c7cc(-c8ccccc8-c8ccc(-c9ccccn9)cc8)cc(-c8ccccc8-c8ccc(-c9ccccn9)cc8)c7)cc6)cn5)cc4)c3)cc2)nc1] | 55% |
| L24 | B22 + B162 | 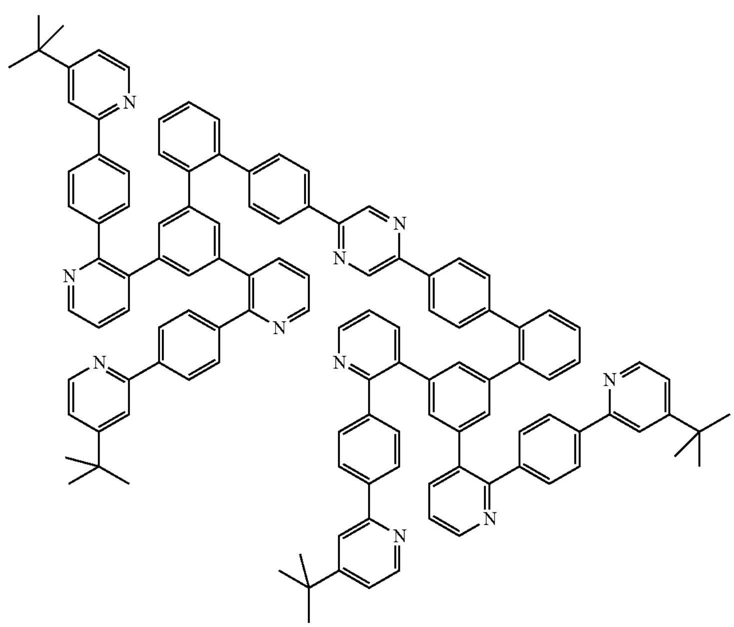 [SMILES: CC(C)(C)c1ccnc(-c2ccc(-c3ncccc3-c3cc(-c4ccccc4-c4ccc(-c5cnc(-c6ccc(-c7ccccc7-c7cc(-c8cccnc8-c8ccc(-c9cc(C(C)(C)C)ccn9)cc8)cc(-c8cccnc8-c8ccc(-c9cc(C(C)(C)C)ccn9)cc8)c7)cc6)cn5)cc4)cc(-c4cccnc4-c4ccc(-c5cc(C(C)(C)C)ccn5)cc4)c3)cc2)c1] | 58% |

-continued
| Ex. | Starting materials | Product/ reaction conditions, if different | Yield |
|---|---|---|---|
| L25 | B22 + B173 | 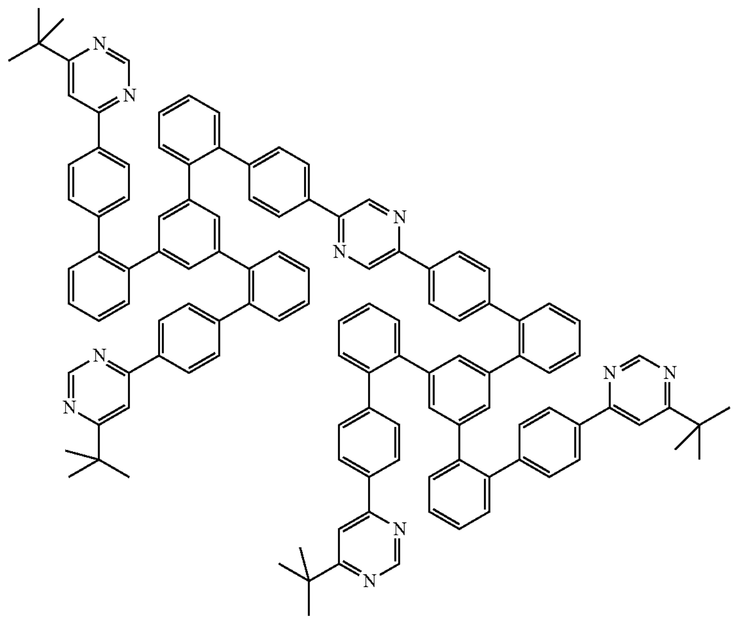 [SMILES: CC(C)(C)c1cc(-c2ccc(-c3ccccc3-c3cc(-c4ccccc4-c4ccc(-c5cnc(-c6ccc(-c7ccccc7-c7cc(-c8ccccc8-c8ccc(-c9cc(C(C)(C)C)ncn9)cc8)cc(-c8ccccc8-c8ccc(-c9cc(C(C)(C)C)ncn9)cc8)c7)cc6)cn5)cc4)cc(-c4ccccc4-c4ccc(-c5cc(C(C)(C)C)ncn5)cc4)c3)cc2)ncn1] | 48% |
| L26 | B22 + B180 | 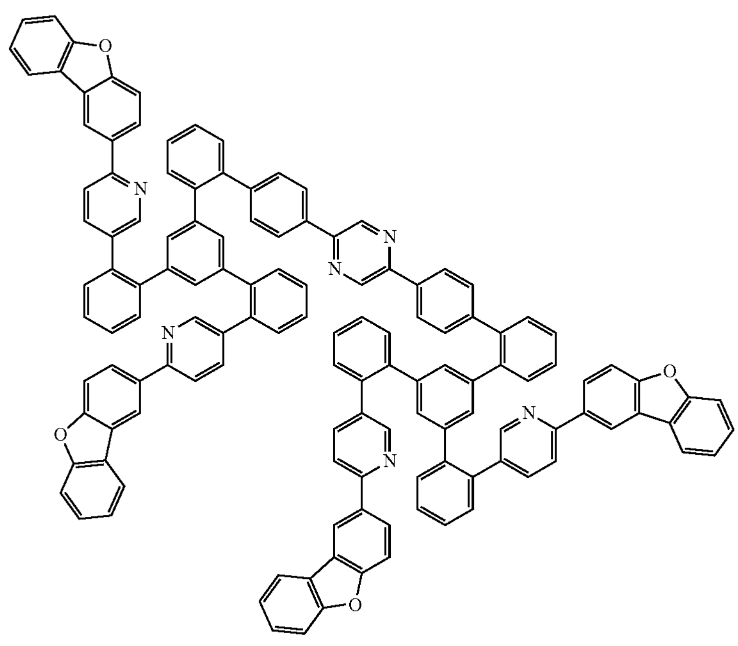 [SMILES: c1ccc(-c2cc(-c3ccccc3-c3ccc(-c4ccc5oc6ccccc6c5c4)nc3)cc(-c3ccccc3-c3ccc(-c4ccc5oc6ccccc6c5c4)nc3)c2)c(-c2ccc(-c3cnc(-c4ccc(-c5ccccc5-c5cc(-c6ccccc6-c6ccc(-c7ccc8oc9ccccc9c8c7)nc6)cc(-c6ccccc6-c6ccc(-c7ccc8oc9ccccc9c8c7)nc6)c5)cc4)cn3)cc2)c1] | 46% |

-continued
| Ex. | Starting materials | Product/ reaction conditions, if different | Yield |
|---|---|---|---|
| L27 | B22 + B177 | 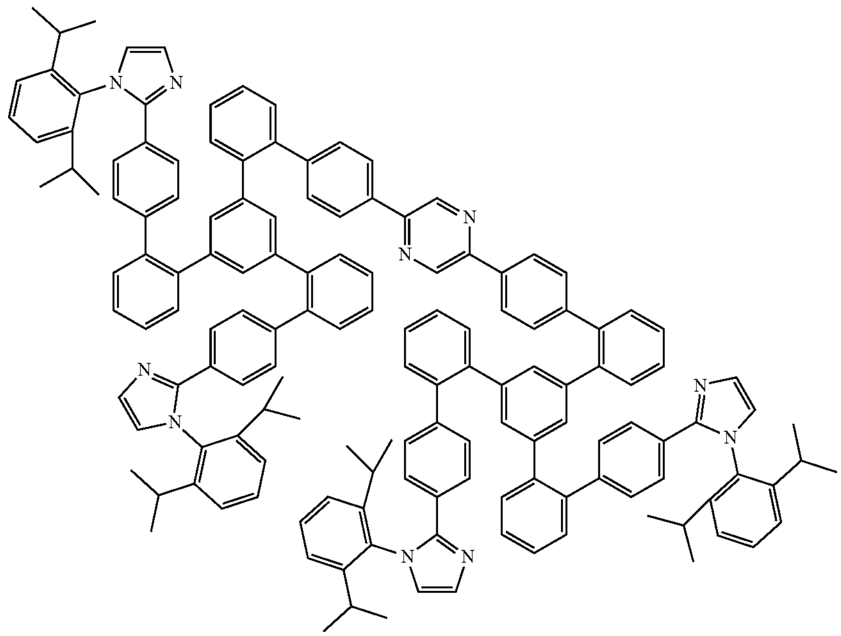 [SMILES: CC(C)c1cccc(C(C)C)c1-n1ccnc1-c1ccc(-c2ccccc2-c2cc(-c3ccccc3-c3ccc(-c4cnc(-c5ccc(-c6ccccc6-c6cc(-c7ccccc7-c7ccc(-c8nccn8-c8c(C(C)C)cccc8C(C)C)cc7)cc(-c7ccccc7-c7ccc(-c8nccn8-c8c(C(C)C)cccc8C(C)C)cc7)c6)cc5)cn4)cc3)cc(-c3ccccc3-c3ccc(-c4nccn4-c4c(C(C)C)cccc4C(C)C)cc3)c2)cc1] | 55% |
| L28 | B22 + B165 | 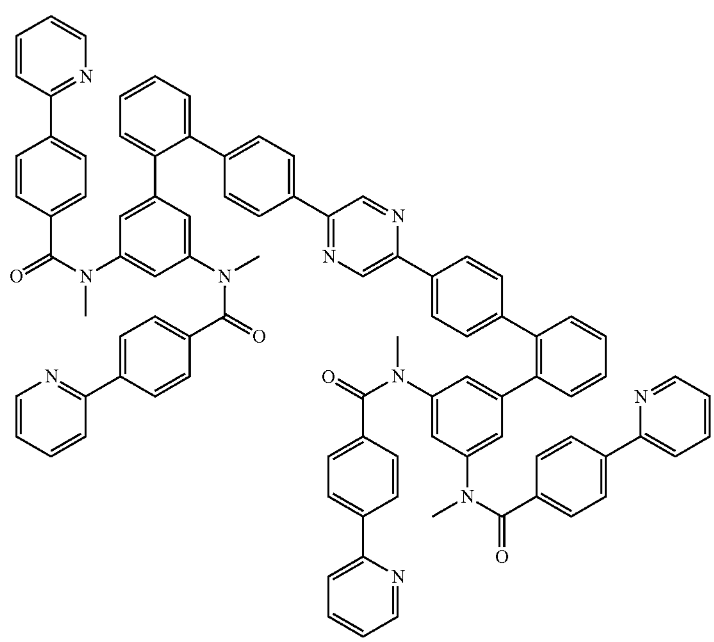 [SMILES: CN(C(=O)c1ccc(-c2ccccn2)cc1)c1cc(-c2ccccc2-c2ccc(-c3cnc(-c4ccc(-c5ccccc5-c5cc(N(C)C(=O)c6ccc(-c7ccccn7)cc6)cc(N(C)C(=O)c6ccc(-c7ccccn7)cc6)c5)cc4)cn3)cc2)cc(N(C)C(=O)c2ccc(-c3ccccn3)cc2)c1] | 54% |

-continued
| Ex. | Starting materials | Product/ reaction conditions, if different | Yield |
|---|---|---|---|
| L29 | B22 + B167 | 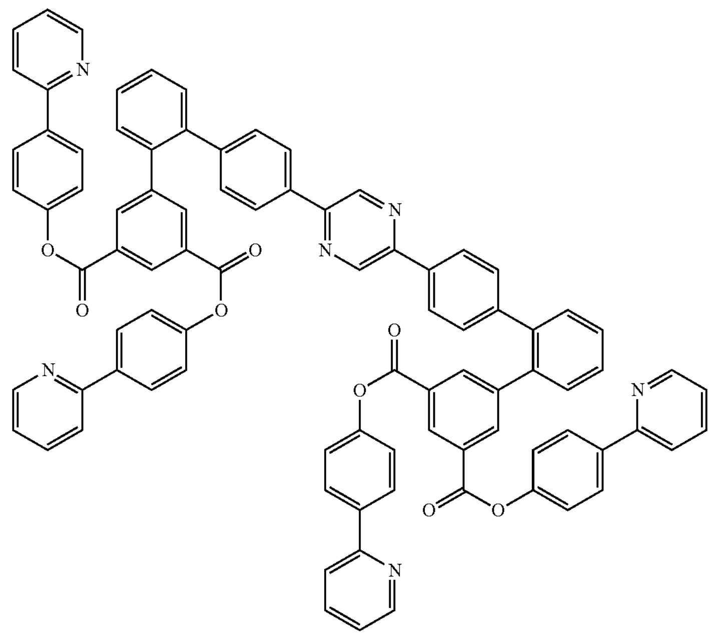 [SMILES: O=C(Oc1ccc(-c2ccccn2)cc1)c1cc(C(=O)Oc2ccc(-c3ccccn3)cc2)cc(-c2ccccc2-c2ccc(-c3cnc(-c4ccc(-c5ccccc5-c5cc(C(=O)Oc6ccc(-c7ccccn7)cc6)cc(C(=O)Oc6ccc(-c7ccccn7)cc6)c5)cc4)cn3)cc2)c1] | 49% |
| L30 | B22 + B183 | 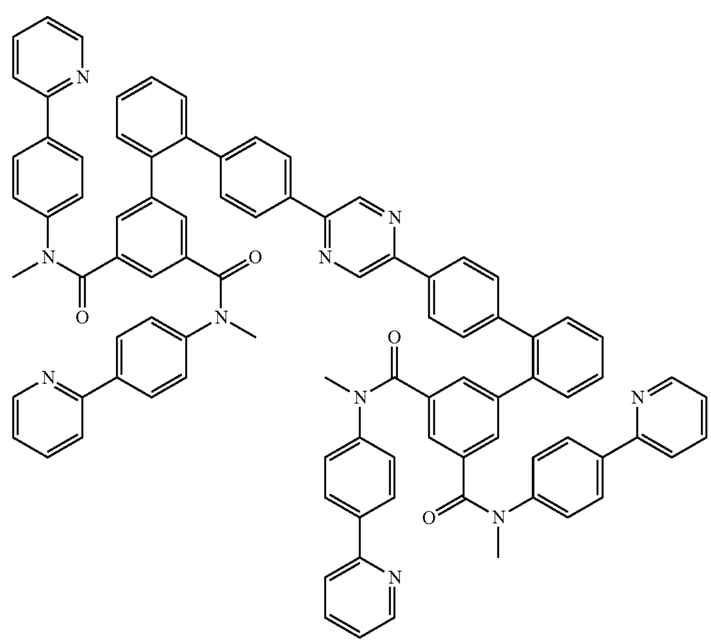 [SMILES: CN(C(=O)c1cc(C(=O)N(C)c2ccc(-c3ccccn3)cc2)cc(-c2ccccc2-c2ccc(-c3cnc(-c4ccc(-c5ccccc5-c5cc(C(=O)N(C)c6ccc(-c7ccccn7)cc6)cc(C(=O)N(C)c6ccc(-c7ccccn7)cc6)c5)cc4)cn3)cc2)c1)c1ccc(-c2ccccn2)cc1] | 56% |

-continued
| Ex. | Starting materials | Product/ reaction conditions, if different | Yield |
| --- | --- | --- | --- |
| L31 | B22 + B158 | 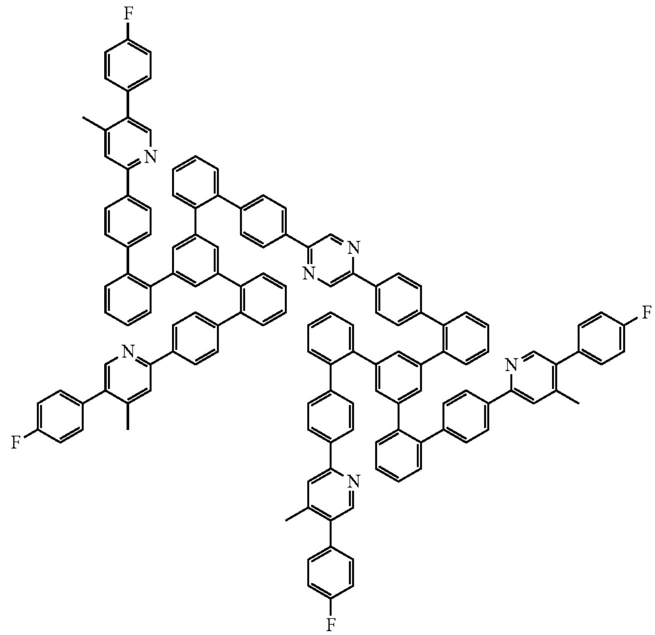 [SMILES: Cc1cc(-c2ccc(-c3ccccc3-c3cc(-c4ccccc4-c4ccc(-c5cnc(-c6ccc(-c7ccccc7-c7cc(-c8ccccc8-c8ccc(-c9cc(C)c(-c%10ccc(F)cc%10)cn9)cc8)cc(-c8ccccc8-c8ccc(-c9cc(C)c(-c%10ccc(F)cc%10)cn9)cc8)c7)cc6)cn5)cc4)cc(-c4ccccc4-c4ccc(-c5cc(C)c(-c6ccc(F)cc6)cn5)cc4)c3)cc2)ncc1-c1ccc(F)cc1] | 60% |
| L32 | B22 + B161 | 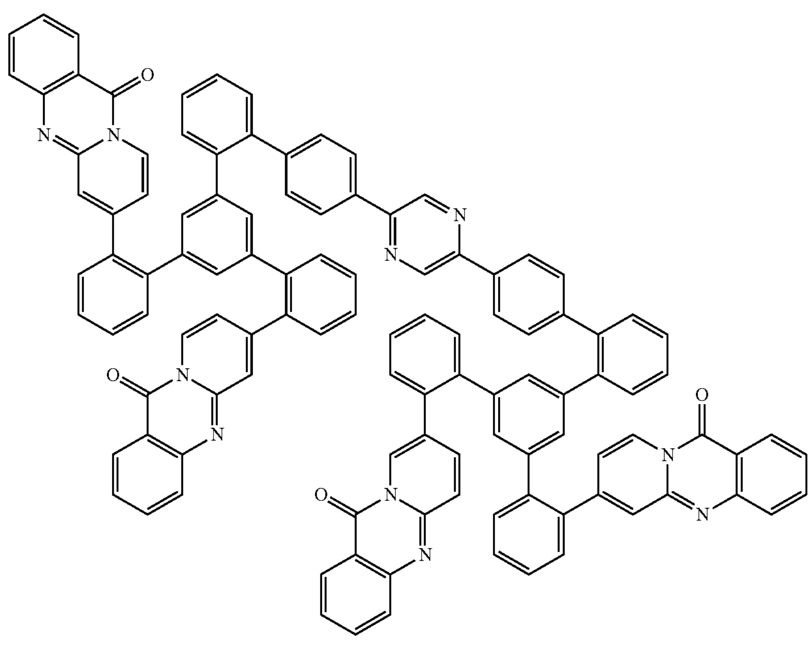 [SMILES: O=c1c2ccccc2nc2cc(-c3ccccc3-c3cc(-c4ccccc4-c4ccc(-c5cnc(-c6ccc(-c7ccccc7-c7cc(-c8ccccc8-c8ccn9c(=O)c%10ccccc%10nc9c8)cc(-c8ccccc8-c8ccc9nc%10ccccc%10c(=O)n9c8)c7)cc6)cn5)cc4)cc(-c4ccccc4-c4ccn5c(=O)c6ccccc6nc5c4)c3)ccn12] | 57% |

-continued
| Ex. | Starting materials | Product/ reaction conditions, if different | Yield |
|---|---|---|---|
| L33 | B22 + B151 | 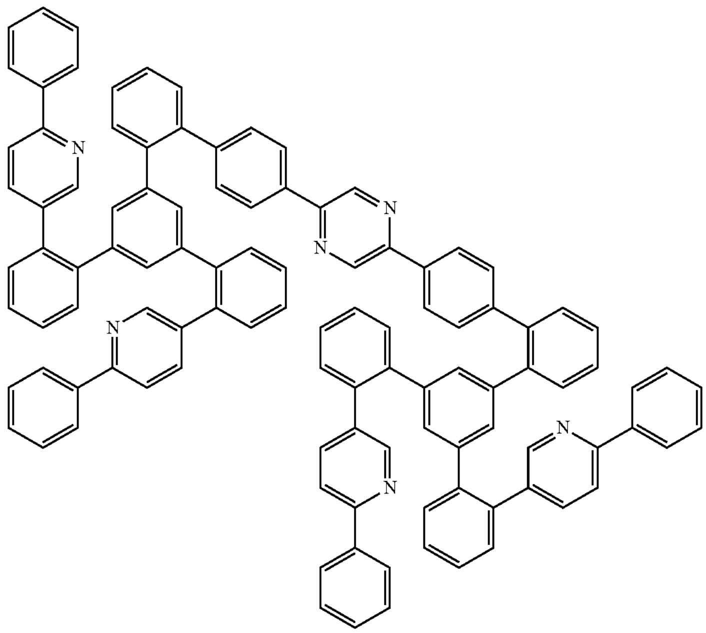 [SMILES: c1ccc(-c2ccc(-c3ccccc3-c3cc(-c4ccccc4-c4ccc(-c5cnc(-c6ccc(-c7ccccc7-c7cc(-c8ccccc8-c8ccc(-c9ccccc9)nc8)cc(-c8ccccc8-c8ccc(-c9ccccc9)nc8)c7)cc6)cn5)cc4)cc(-c4ccccc4-c4ccc(-c5ccccc5)nc4)c3)cn2)cc1] | 62% |
| L34 | B23 + B151 | 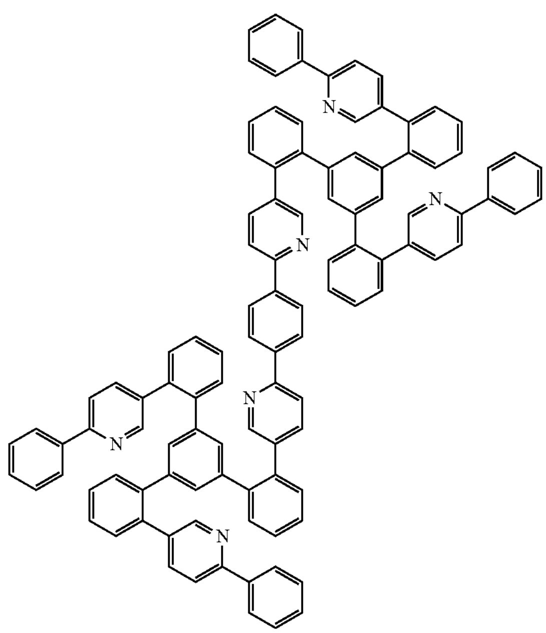 [SMILES: c1ccc(-c2ccc(-c3ccccc3-c3cc(-c4ccccc4-c4ccc(-c5ccccc5)nc4)cc(-c4ccccc4-c4ccc(-c5ccc(-c6ccc(-c7ccccc7-c7cc(-c8ccccc8-c8ccc(-c9ccccc9)nc8)cc(-c8ccccc8-c8ccc(-c9ccccc9)nc8)c7)cn6)cc5)nc4)c3)cn2)cc1] | 65% |

-continued
| Ex. | Starting materials | Product/ reaction conditions, if different | Yield |
|---|---|---|---|
| L35 | B23 + S176 | 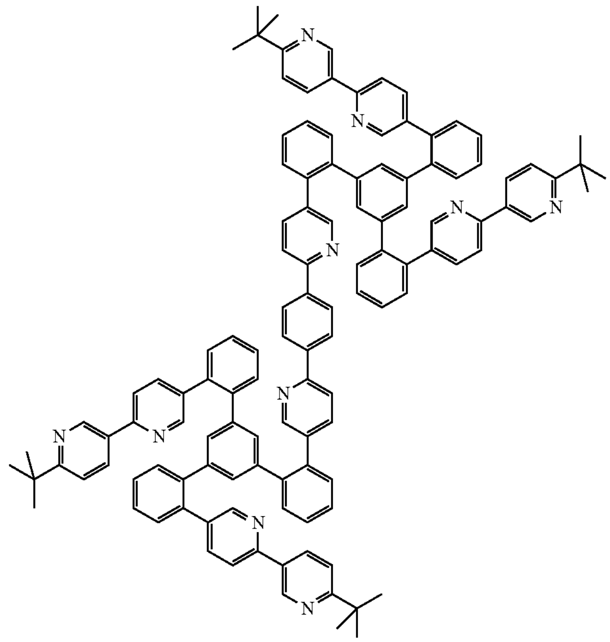 [SMILES: CC(C)(C)c1ccc(-c2ccc(-c3ccccc3-c3cc(-c4ccccc4-c4ccc(-c5ccc(-c6ccc(-c7ccccc7-c7cc(-c8ccccc8-c8ccc(-c9ccc(C(C)(C)C)nc9)nc8)cc(-c8ccccc8-c8ccc(-c9ccc(C(C)(C)C)nc9)nc8)c7)cn6)cc5)nc4)cc(-c4ccccc4-c4ccc(-c5ccc(C(C)(C)C)nc5)nc4)c3)cn2)cn1] | 62% |
| L36 | B23 + B154 | 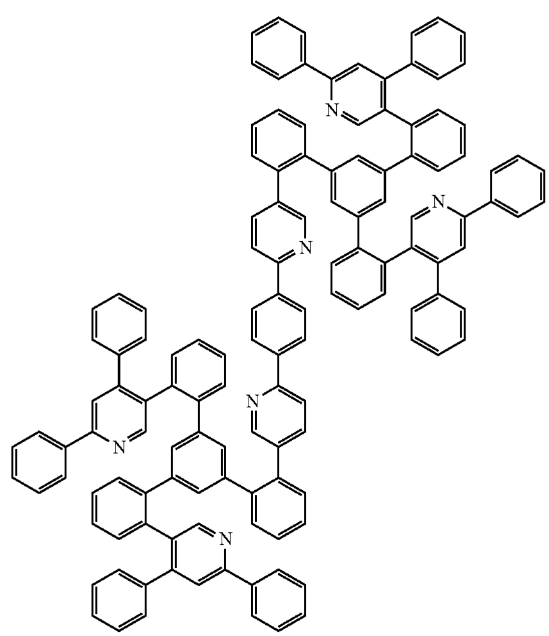 [SMILES: c1ccc(-c2cc(-c3ccccc3)c(-c3ccccc3-c3cc(-c4ccccc4-c4ccc(-c5ccc(-c6ccc(-c7ccccc7-c7cc(-c8ccccc8-c8cnc(-c9ccccc9)cc8-c8ccccc8)cc(-c8ccccc8-c8cnc(-c9ccccc9)cc8-c8ccccc8)c7)cn6)cc5)nc4)cc(-c4ccccc4-c4cnc(-c5ccccc5)cc4-c4ccccc4)c3)cn2)cc1] | 58% |

-continued
| Ex. | Starting materials | Product/ reaction conditions, if different | Yield |
|---|---|---|---|
| L37 | B23 + B159 | 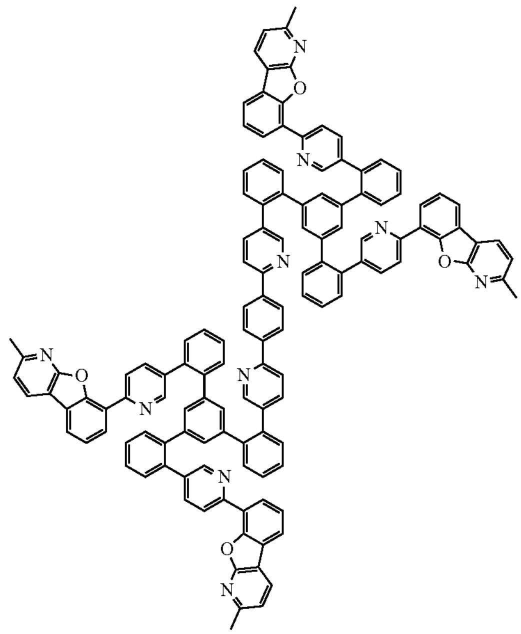 | 49% |
| L38 | B23 + B152 | 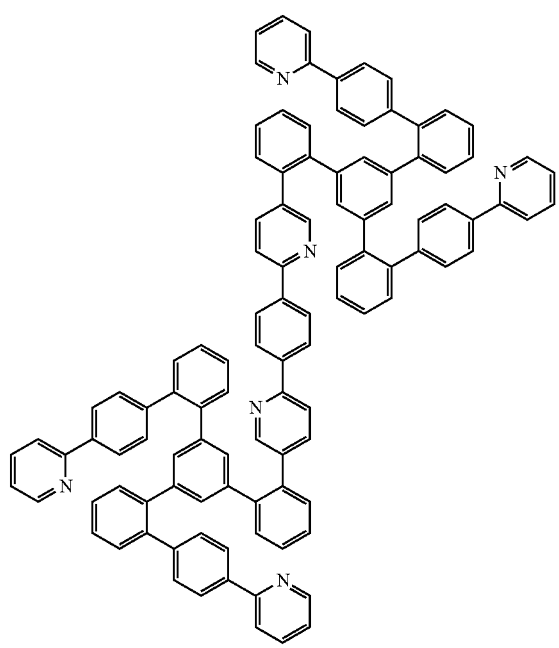 [SMILES: c1ccc(-c2ccc(-c3ccccc3-c3cc(-c4ccccc4-c4ccc(-c5ccccn5)cc4)cc(-c4ccccc4-c4ccc(-c5ccc(-c6ccc(-c7ccccc7-c7cc(-c8ccccc8-c8ccc(-c9ccccn9)cc8)cc(-c8ccccc8-c8ccc(-c9ccccn9)cc8)c7)cn6)cc5)nc4)c3)cc2)nc1] | 60% |

-continued
| Ex. | Starting materials | Product/ reaction conditions, if different | Yield |
|---|---|---|---|
| L39 | B23 + B163 | 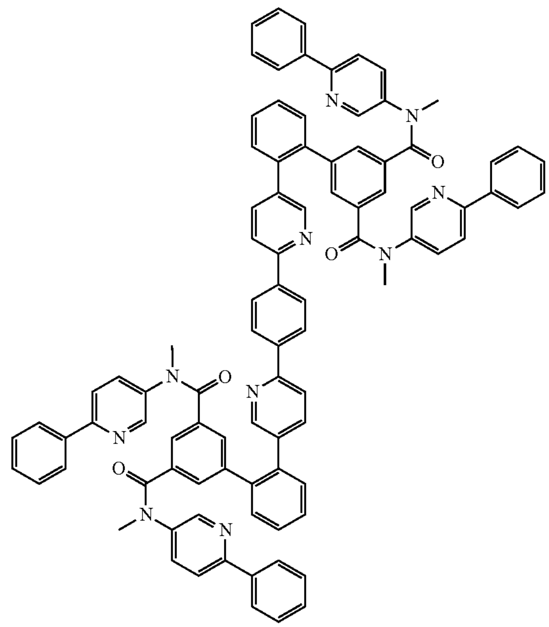 [SMILES: CN(C(=O)c1cc(C(=O)N(C)c2ccc(-c3ccccc3)nc2)cc(-c2ccccc2-c2ccc(-c3ccc(-c4ccc(-c5ccccc5-c5cc(C(=O)N(C)c6ccc(-c7ccccc7)nc6)cc(C(=O)N(C)c6ccc(-c7ccccc7)nc6)c5)cn4)cc3)nc2)c1)c1ccc(-c2ccccc2)nc1] | 51% |
| L40 | B23 + 159 | 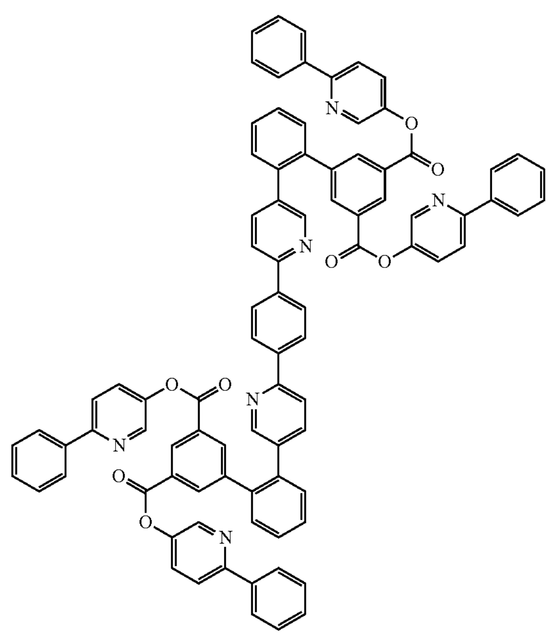 [SMILES: O=C(Oc1ccc(-c2ccccc2)nc1)c1cc(C(=O)Oc2ccc(-c3ccccc3)nc2)cc(-c2ccccc2-c2ccc(-c3ccc(-c4ccc(-c5ccccc5-c5cc(C(=O)Oc6ccc(-c7ccccc7)nc6)cc(C(=O)Oc6ccc(-c7ccccc7)nc6)c5)cn4)cc3)nc2)c1] | 50% |

-continued
| Ex. | Starting materials | Product/ reaction conditions, if different | Yield |
|---|---|---|---|
| L41 | B23 + B153 | 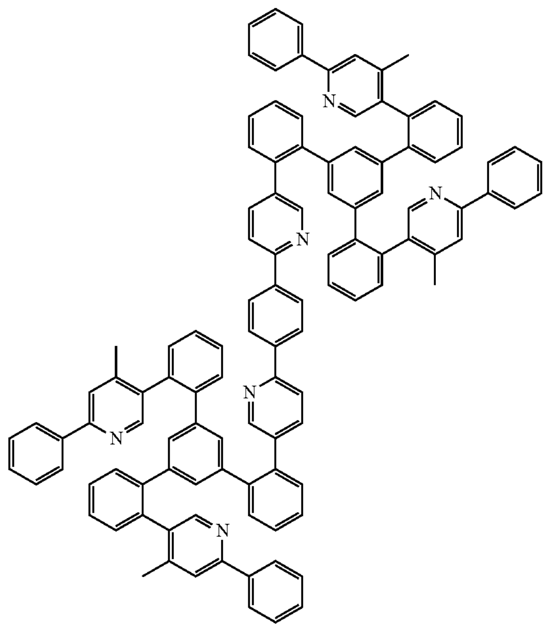 [SMILES: Cc1cc(-c2ccccc2)ncc1-c1ccccc1-c1cc(-c2ccccc2-c2ccc(-c3ccc(-c4ccc(-c5ccccc5-c5cc(-c6ccccc6-c6cnc(-c7ccccc7)cc6C)cc(-c6ccccc6-c6cnc(-c7ccccc7)cc6C)c5)cn4)cc3)nc2)cc(-c2ccccc2-c2cnc(-c3ccccc3)cc2C)c1] | 57% |
| L42 | B23 + B175 | 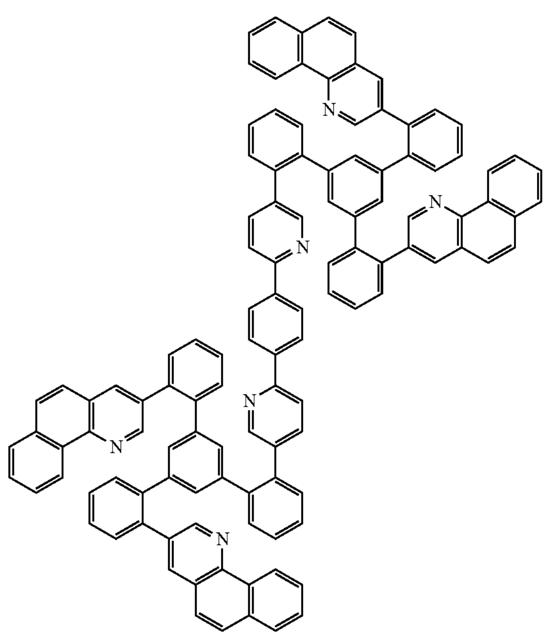 [SMILES: c1ccc(-c2cc(-c3ccccc3-c3cnc4c(ccc5ccccc54)c3)cc(-c3ccccc3-c3cnc4c(ccc5ccccc54)c3)c2)c(-c2ccc(-c3ccc(-c4ccc(-c5ccccc5-c5cc(-c6ccccc6-c6cnc7c(ccc8ccccc87)c6)cc(-c6ccccc6-c6cnc7c(ccc8ccccc87)c6)c5)cn4)cc3)nc2)c1] | 50 |

-continued
| Ex. | Starting materials | Product/ reaction conditions, if different | Yield |
| --- | --- | --- | --- |
| L43 | B24 + B151 | 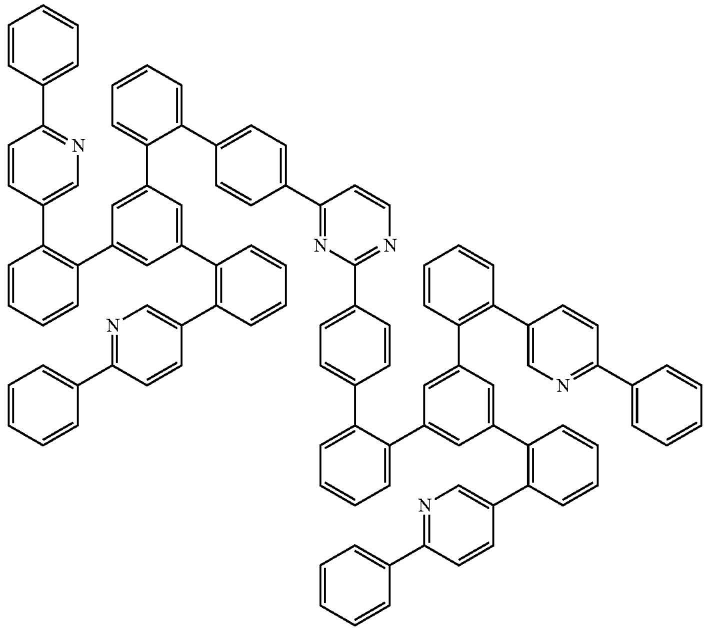 | 62% |
| L44 | B24 + B152 | 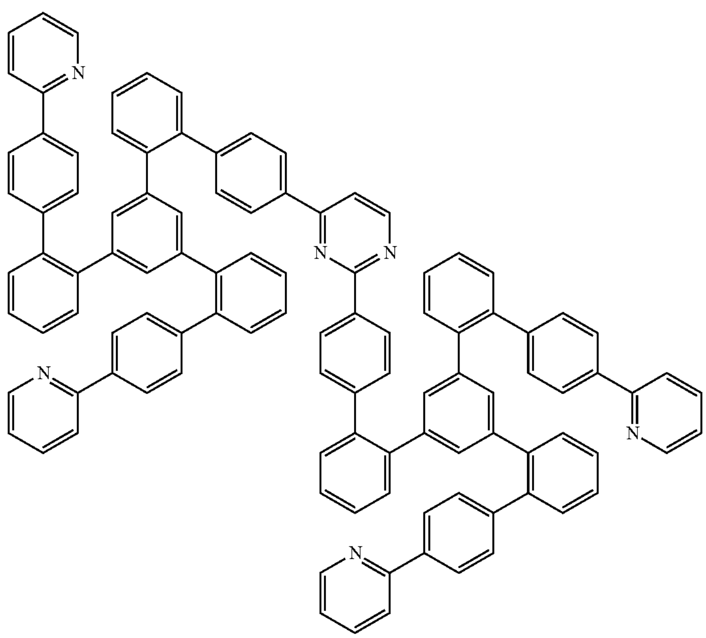 [SMILES: c1ccc(-c2ccc(-c3ccccc3-c3cc(-c4ccccc4-c4ccc(-c5ccccn5)cc4)cc(-c4ccccc4-c4ccc(-c5ccnc(-c6ccc(-c7ccccc7-c7cc(-c8ccccc8-c8ccc(-c9ccccn9)cc8)cc(-c8ccccc8-c8ccc(-c9ccccn9)cc8)c7)cc6)n5)cc4)c3)cc2)nc1] | 65% |

-continued
| Ex. | Starting materials | Product/ reaction conditions, if different | Yield |
|---|---|---|---|
| L45 | B24 + B157 | 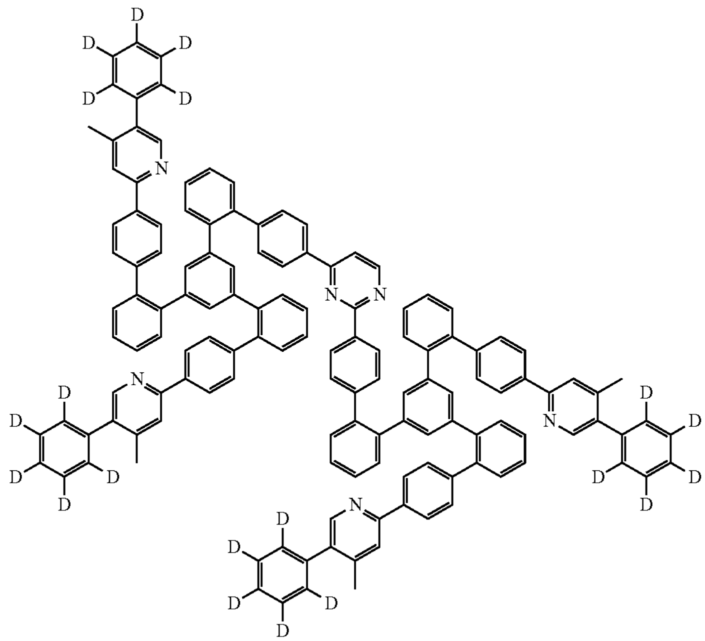 [SMILES: [2H]c1c([2H])c([2H])c(-c2cnc(-c3ccc(-c4ccccc4-c4cc(-c5ccccc5-c5ccc(-c6cc(C)c(-c7c([2H])c([2H])c([2H])c([2H])c7[2H])cn6)cc5)cc(-c5ccccc5-c5ccc(-c6ccnc(-c7ccc(-c8ccccc8-c8cc(-c9ccccc9-c9ccc(-c%10cc(C)c(-c%11c([2H])c([2H])c([2H])c([2H])c%11[2H])cn%10)cc9)cc(-c9ccccc9-c9ccc(-c%10cc(C)c(-c%11c([2H])c([2H])c([2H])c([2H])c%11[2H])cn%10)cc9)c8)cc7)n6)cc5)c4)cc3)cc2C)c([2H])c1[2H]] | 55% |
| L46 | B24 + B160 | 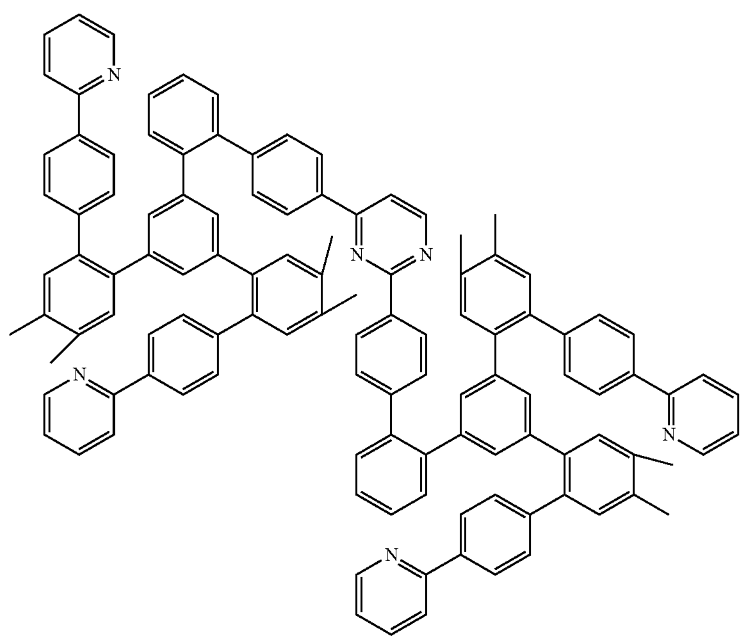 [SMILES: Cc1cc(-c2ccc(-c3ccccn3)cc2)c(-c2cc(-c3ccccc3-c3ccc(-c4ccnc(-c5ccc(-c6ccccc6-c6cc(-c7cc(C)c(C)cc7-c7ccc(-c8ccccn8)cc7)cc(-c7cc(C)c(C)cc7-c7ccc(-c8ccccn8)cc7)c6)cc5)n4)cc3)cc(-c3cc(C)c(C)cc3-c3ccc(-c4ccccn4)cc3)c2)cc1C] | 48% |

-continued
| Ex. | Starting materials | Product/ reaction conditions, if different | Yield |
|---|---|---|---|
| L47 | B24 + B183 | 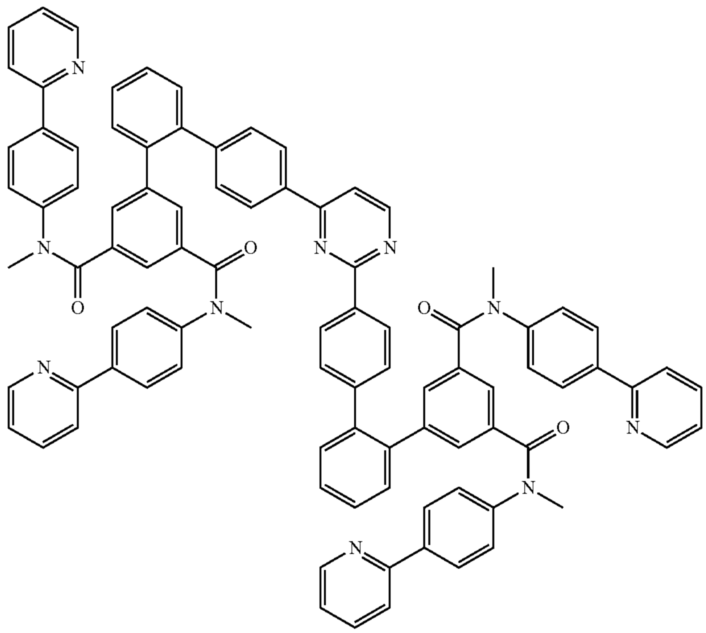 [SMILES: CN(C(=O)c1cc(C(=O)N(C)c2ccc(-c3ccccn3)cc2)cc(-c2ccccc2-c2ccc(-c3ccnc(-c4ccc(-c5ccccc5-c5cc(C(=O)N(C)c6ccc(-c7ccccn7)cc6)cc(C(=O)N(C)c6ccc(-c7ccccn7)cc6)c5)cc4)n3)cc2)c1)c1ccc(-c2ccccn2)cc1] | 53% |
| L48 | B24 + B174 | 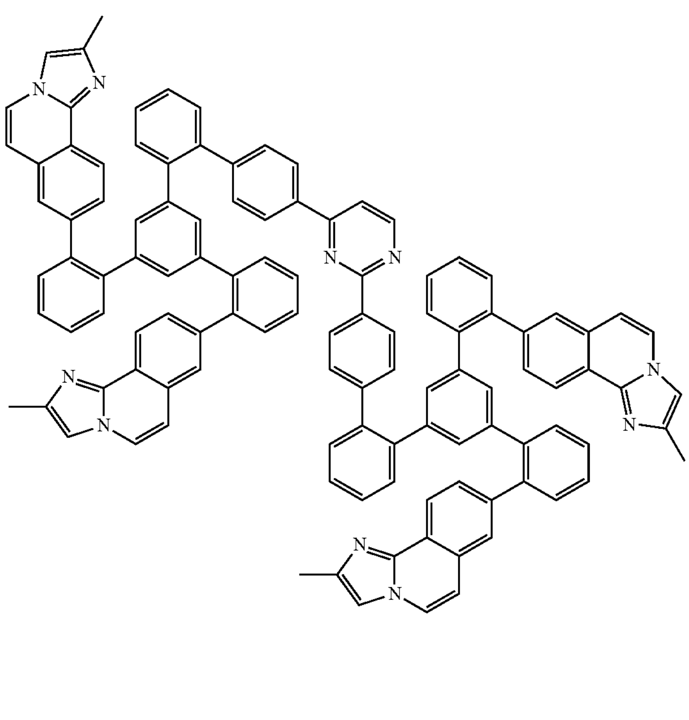 [SMILES: Cc1cn2ccc3cc(-c4ccccc4-c4cc(-c5ccccc5-c5ccc(-c6ccnc(-c7ccc(-c8ccccc8-c8cc(-c9ccccc9-c9ccc%10c(ccn%11cc(C)nc%10%11)c9)cc(-c9ccccc9-c9ccc%10c(ccn%11cc(C)nc%10%11)c9)c8)cc7)n6)cc5)cc(-c5ccccc5-c5ccc6c(ccn7cc(C)nc67)c5)c4)ccc3c2n1] | 52% |

-continued
| Ex. | Starting materials | Product/ reaction conditions, if different | Yield |
| --- | --- | --- | --- |
| L49 | B24 + S167 | 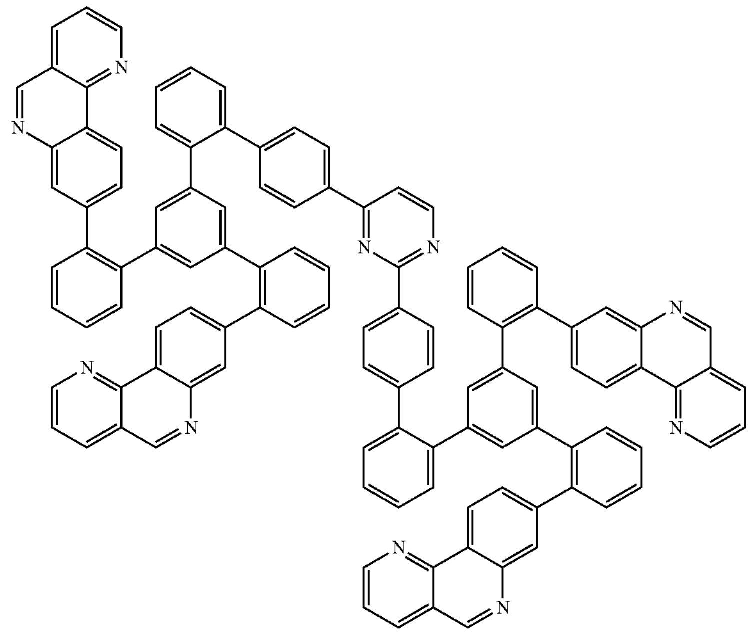 [SMILES: c1ccc(-c2cc(-c3ccccc3-c3ccc4c(c3)ncc3cccnc34)cc(-c3ccccc3-c3ccc4c(c3)ncc3cccnc34)c2)c(-c2ccc(-c3ccnc(-c4ccc(-c5ccccc5-c5cc(-c6ccccc6-c6ccc7c(c6)ncc6cccnc67)cc(-c6ccccc6-c6ccc7c(c6)ncc6cccnc67)c5)cc4)n3)cc2)c1] | 62% |
| L50 | B24 + 152 | 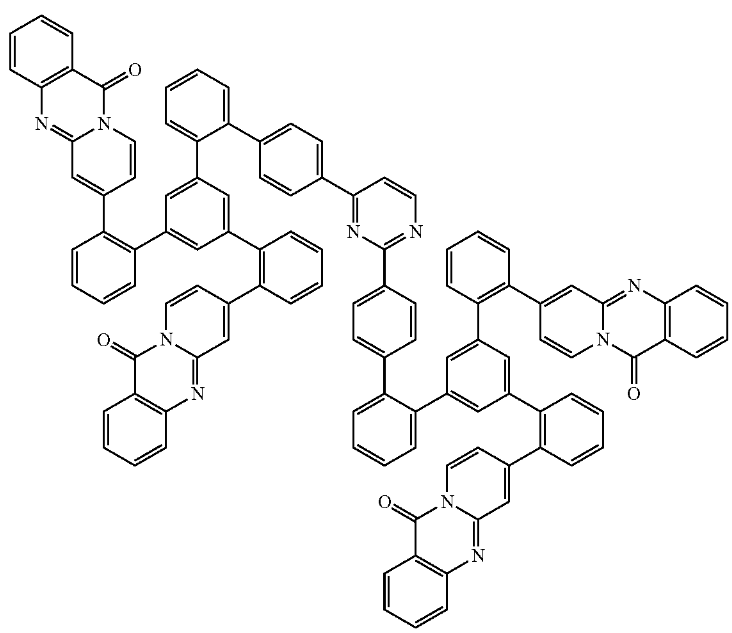 [SMILES: O=c1c2ccccc2nc2cc(-c3ccccc3-c3cc(-c4ccccc4-c4ccc(-c5ccnc(-c6ccc(-c7ccccc7-c7cc(-c8ccccc8-c8ccn9c(=O)c%10ccccc%10nc9c8)cc(-c8ccccc8-c8ccn9c(=O)c%10ccccc%10nc9c8)c7)cc6)n5)cc4)cc(-c4ccccc4-c4ccn5c(=O)c6ccccc6nc5c4)c3)ccn12] | 57% |

-continued
| Ex. | Starting materials | Product/ reaction conditions, if different | Yield |
|---|---|---|---|
| L51 | B24 + B181 | 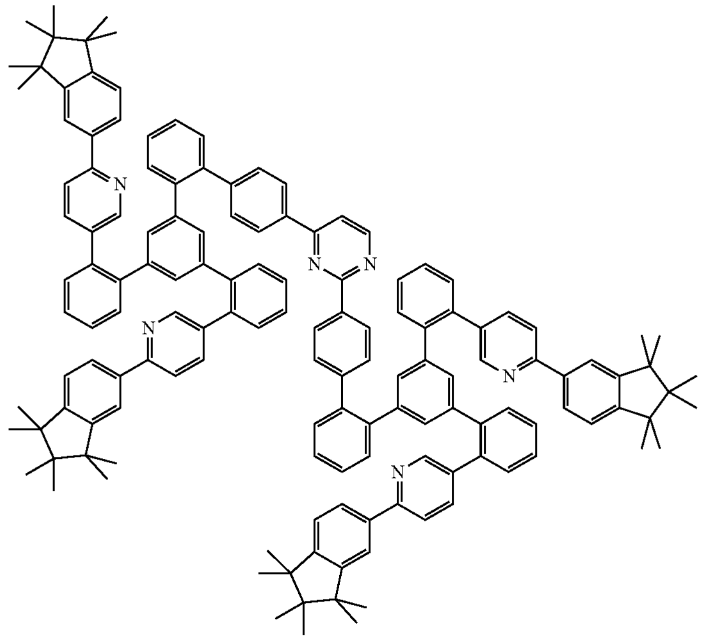 | 53% |
| L52 | B25 + B151 | 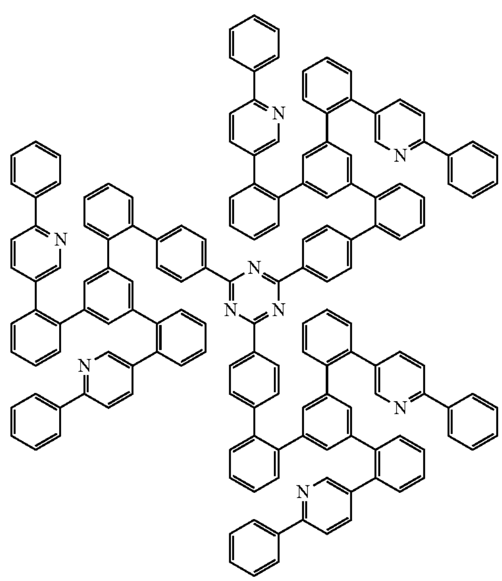 3.3 equiv. of B151, 9 equiv. of $Na_2CO_3$, 0.12 equiv. of $PPh_3$ and 0.04 equiv. of $Pd(OAc)_2$ | 39% |

-continued
| Ex. | Starting materials | Product/ reaction conditions, if different | Yield |
|---|---|---|---|
| L53 | B25 + B152 | 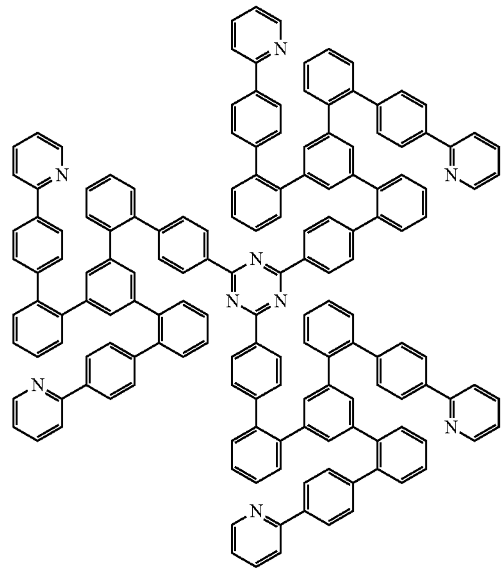 3.3 equiv. of B152, 9 equiv. of $Na_2CO_3$, 0.12 equiv. of $PP_3$ and 0.04 equiv. of $Pd(OAc)_2$ | 41% |
| L54 | B25 + S176 | 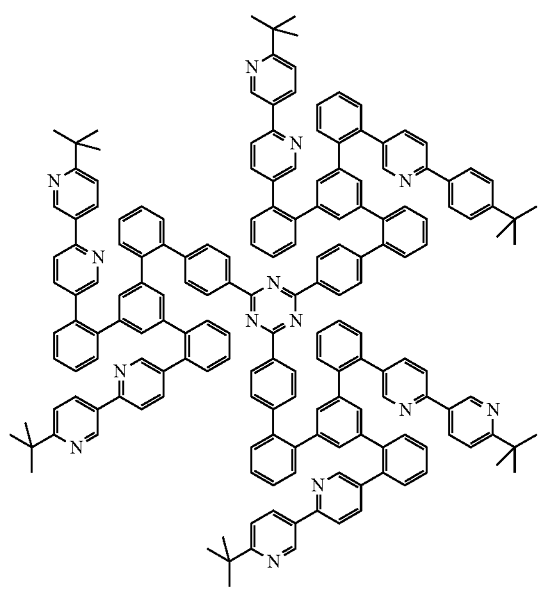 3.3 equiv. of S176, 9 equiv. of $Na_2CO_3$, 0.12 equiv. of $PPh_3$ and 0.04 Equiv $Pd(OAc)_2$ | 36% |

-continued
| Ex. | Starting materials | Product/ reaction conditions, if different | Yield |
|---|---|---|---|
| L55 | B25 + B172 | 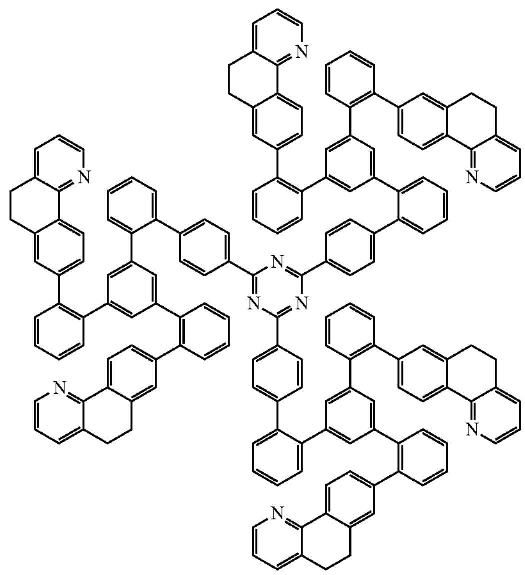 3.3 equiv. of B172, 9 equiv. of $Na_2CO_3$, 0.12 equiv. of $PPh_3$ and 0.04 equiv. of $Pd(OAc)_2$ | 41% |
| L56 | B25 + B183 | 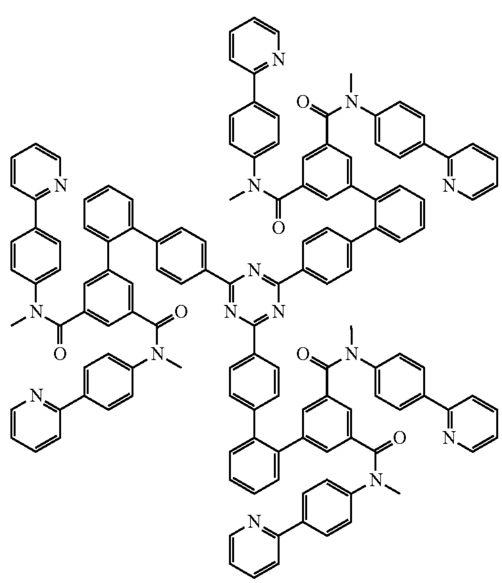 3.3 equiv. of B183, 9 equiv. of $Na_2CO_3$, 0.12 equiv. of $PPh_3$ and 0.04 equiv. of $Pd(OAc)_2$ | 35% |

-continued
| Ex. | Starting materials | Product/ reaction conditions, if different | Yield |
|---|---|---|---|
| L57 | B25 + B161 | 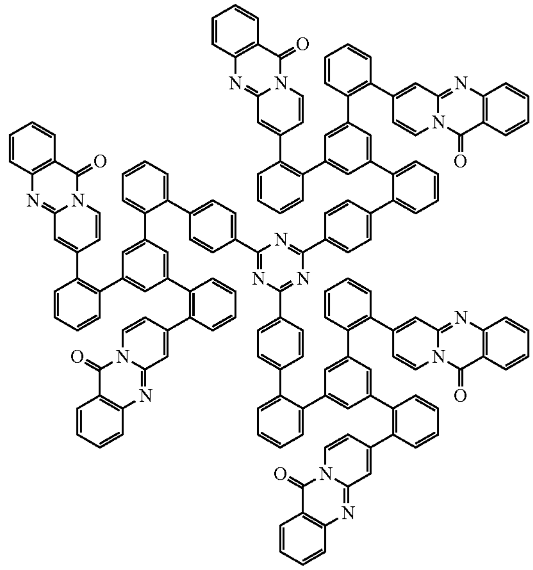 3.3 equiv. of B161, 9 equiv. of $Na_2CO_3$, 0.12 equiv. of $PPh_3$ and 0.04 equiv. of $Pd(OAc)_2$ | 43% |
| L58 | B20 + B185 | 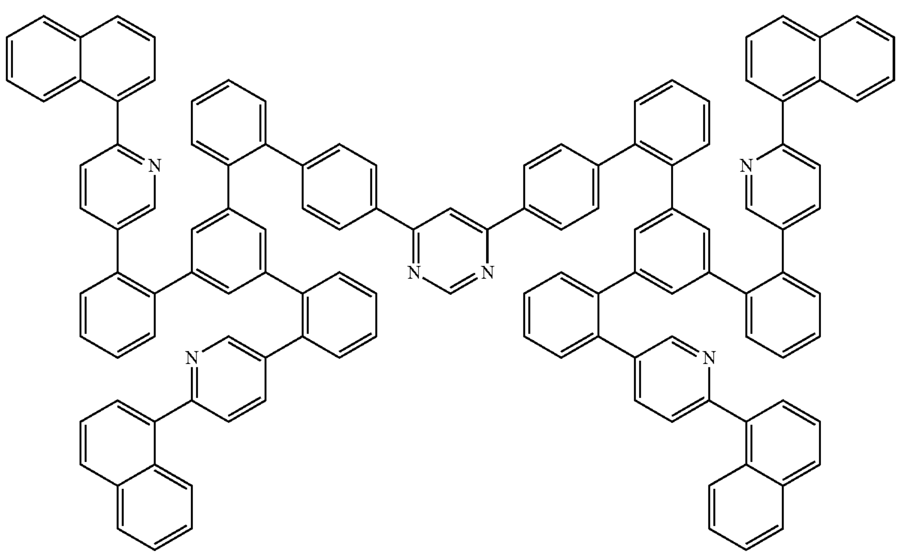 [SMILES: c1ccc(-c2cc(-c3ccccc3-c3ccc(-c4cccc5ccccc45)nc3)cc(-c3ccccc3-c3ccc(-c4cccc5ccccc45)nc3)c2)c(-c2ccc(-c3cc(-c4ccc(-c5ccccc5-c5cc(-c6ccccc6-c6ccc(-c7cccc8ccccc78)nc6)cc(-c6ccccc6-c6ccc(-c7cccc8ccccc78)nc6)c5)cc4)ncn3)cc2)c1] | 40% |

-continued
| Ex. | Starting materials | Product/ reaction conditions, if different | Yield |
|---|---|---|---|
| L59 | B197 + 1 equiv. of B152 | 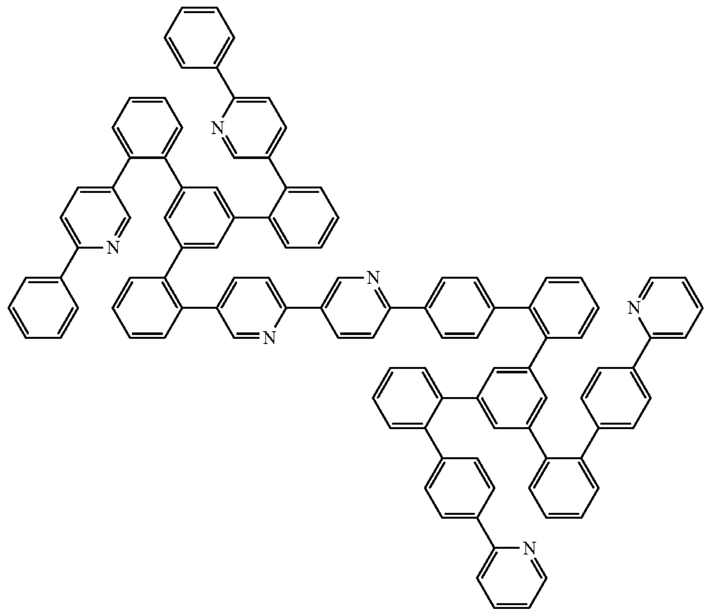 [SMILES: c1ccc(-c2ccc(-c3ccccc3-c3cc(-c4ccccc4-c4ccc(-c5ccccc5)nc4)cc(-c4ccccc4-c4ccc(-c5ccc(-c6ccc(-c7ccccc7-c7cc(-c8ccccc8-c8ccc(-c9ccccn9)cc8)cc(-c8ccccc8-c8ccc(-c9ccccn9)cc8)c7)cc6)nc5)nc4)c3)cn2)cc1] | 65% |
| L60 | B198 + 1 equiv. of B152 | 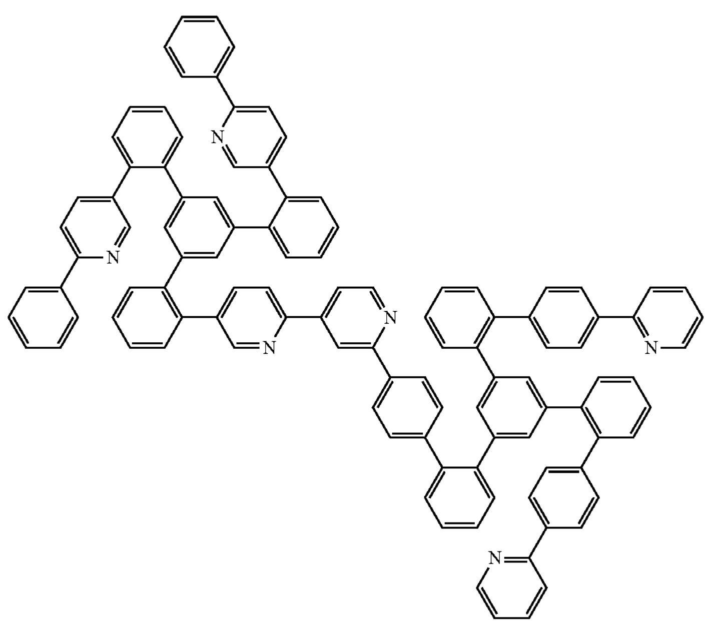 [SMILES: c1ccc(-c2ccc(-c3ccccc3-c3cc(-c4ccccc4-c4ccc(-c5ccccc5)nc4)cc(-c4ccccc4-c4ccc(-c5ccnc(-c6ccc(-c7ccccc7-c7cc(-c8ccccc8-c8ccc(-c9ccccn9)cc8)cc(-c8ccccc8-c8ccc(-c9ccccn9)cc8)c7)cc6)c5)nc4)c3)cn2)cc1] | 59% |

-continued
| Ex. | Starting materials | Product/ reaction conditions, if different | Yield |
|---|---|---|---|
| L61 | B26 + B155 | 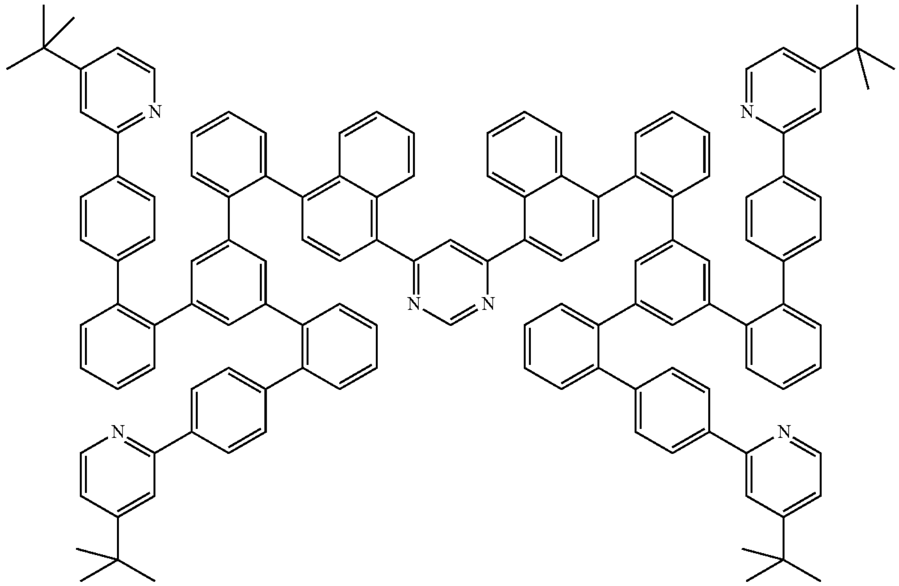 [SMILES: CC(C)(C)c1ccnc(-c2ccc(-c3ccccc3-c3cc(-c4ccccc4-c4ccc(-c5cc(C(C)(C)C)ccn5)cc4)cc(-c4ccccc4-c4ccc(-c5cc(-c6ccc(-c7ccccc7-c7cc(-c8ccccc8-c8ccc(-c9cc(C(C)(C)C)ccn9)cc8)cc(-c8ccccc8-c8ccc(-c9cc(C(C)(C)C)ccn9)cc8)c7)c7ccccc67)ncn5)c5ccccc45)c3)cc2)c1] | 32% |
| L62 | B27 + B151 | 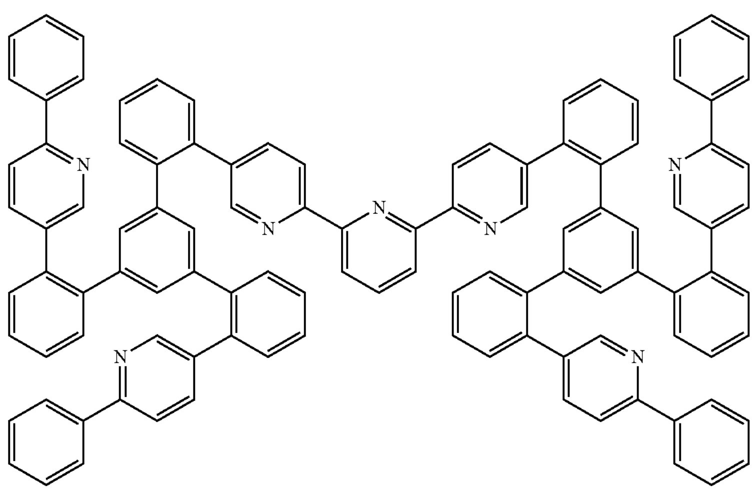 [SMILES: c1ccc(-c2ccc(-c3ccccc3-c3cc(-c4ccccc4-c4ccc(-c5ccccc5)nc4)cc(-c4ccccc4-c4ccc(-c5cccc(-c6ccc(-c7ccccc7-c7cc(-c8ccccc8-c8ccc(-c9ccccc9)nc8)cc(-c8ccccc8-c8ccc(-c9ccccc9)nc8)c7)cn6)n5)nc4)c3)cn2)cc1] | 42% |

-continued
| Ex. | Starting materials | Product/ reaction conditions, if different | Yield |
|---|---|---|---|
| L63 | B28 + B155 | 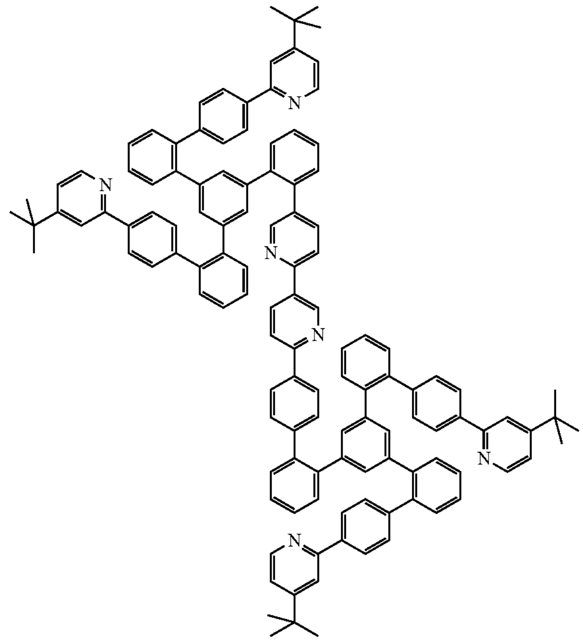 [SMILES: CC(C)(C)c1ccnc(-c2ccc(-c3ccccc3-c3cc(-c4ccccc4-c4ccc(-c5ccc(-c6ccc(-c7ccccc7-c7cc(-c8ccccc8-c8ccc(-c9cc(C(C)(C)C)ccn9)cc8)cc(-c8ccccc8-c8ccc(-c9cc(C(C)(C)C)ccn9)cc8)c7)cn6)cn5)cc4)cc(-c4ccccc4-c4ccc(-c5cc(C(C)(C)C)ccn5)cc4)c3)cc2)c1] | 38% |
| L64 | B29 + B151 | 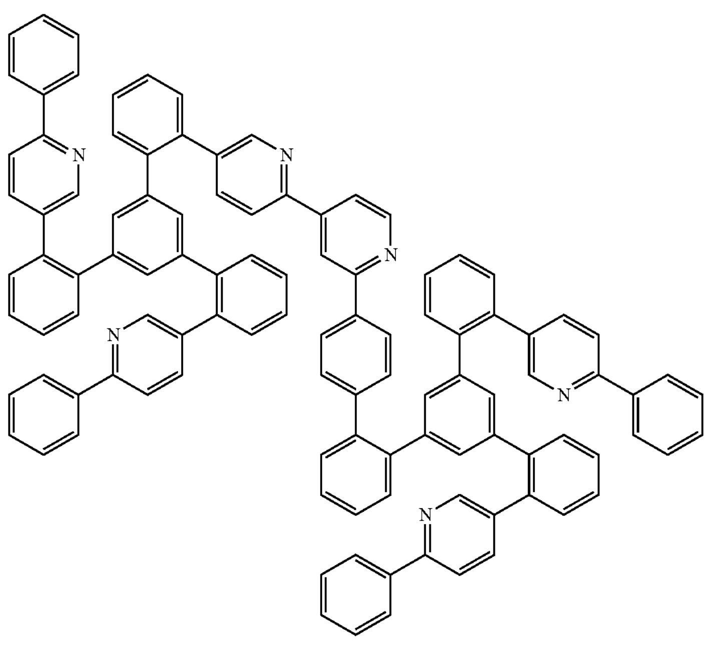 [SMILES: c1ccc(-c2ccc(-c3ccccc3-c3cc(-c4ccccc4-c4ccc(-c5cc(-c6ccc(-c7ccccc7-c7cc(-c8ccccc8-c8ccc(-c9ccccc9)nc8)cc(-c8ccccc8-c8ccc(-c9ccccc9)nc8)c7)cn6)ccn5)cc4)cc(-c4ccccc4-c4ccc(-c5ccccc5)nc4)c3)cn2)cc1] | 44% |

-continued
| Ex. | Starting materials | Product/ reaction conditions, if different | Yield |
|---|---|---|---|
| L65 | B155 + B20 | 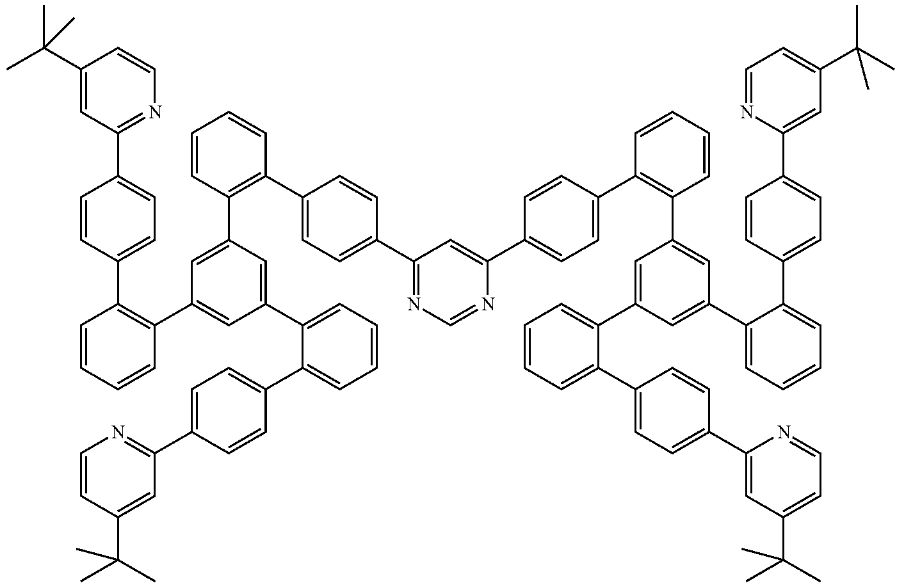 [SMILES: CC(C)(C)c1ccnc(-c2ccc(-c3ccccc3-c3cc(-c4ccccc4-c4ccc(-c5cc(C(C)(C)C)ccn5)cc4)cc(-c4ccccc4-c4ccc(-c5cc(-c6ccc(-c7ccccc7-c7cc(-c8ccccc8-c8ccc(-c9cc(C(C)(C)C)ccn9)cc8)cc(-c8ccccc8-c8ccc(-c9cc(C(C)(C)C)ccn9)cc8)c7)cc6)ncn5)cc4)c3)cc2)c1] | 45% |
| L75 | B203 + B20 | 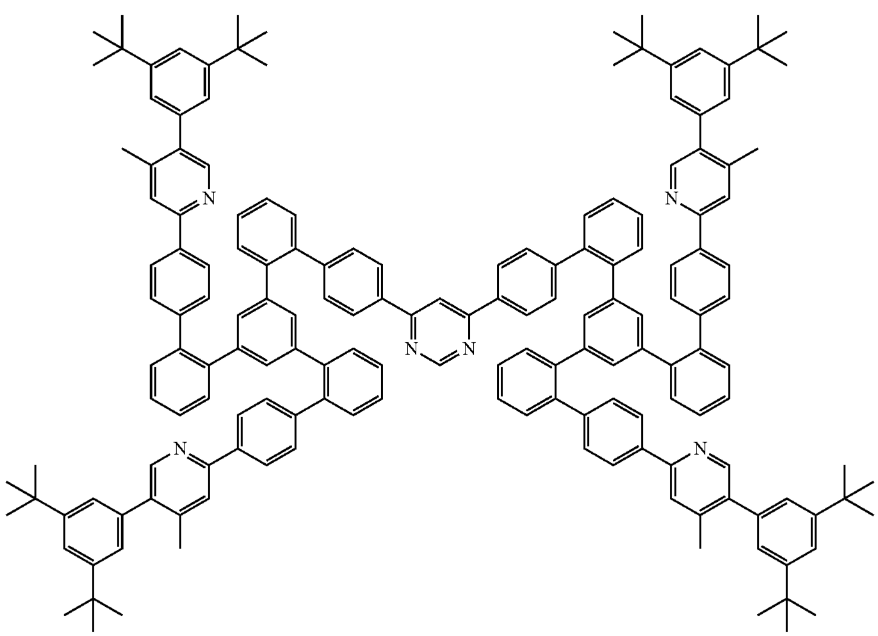 [SMILES: Cc1cc(-c2ccc(-c3ccccc3-c3cc(-c4ccccc4-c4ccc(-c5cc(-c6ccc(-c7ccccc7-c7cc(-c8ccccc8-c8ccc(-c9cc(C)c(-c%10cc(C(C)(C)C)cc(C(C)(C)C)c%10)cn9)cc8)cc(-c8ccccc8-c8ccc(-c9cc(C)c(-c%10cc(C(C)(C)C)cc(C(C)(C)C)c%10)cn9)cc8)c7)cc6)ncn5)cc4)cc(-c4ccccc4-c4ccc(-c5cc(C)c(-c6cc(C(C)(C)C)cc(C(C)(C)C)c6)cn5)cc4)c3)cc2)ncc1-c1cc(C(C)(C)C)cc(C(C)(C)C)c1] | 50% |

-continued

| Ex. | Starting materials | Product/ reaction conditions, if different | Yield |
|---|---|---|---|
| L76 | B152 + B206 | 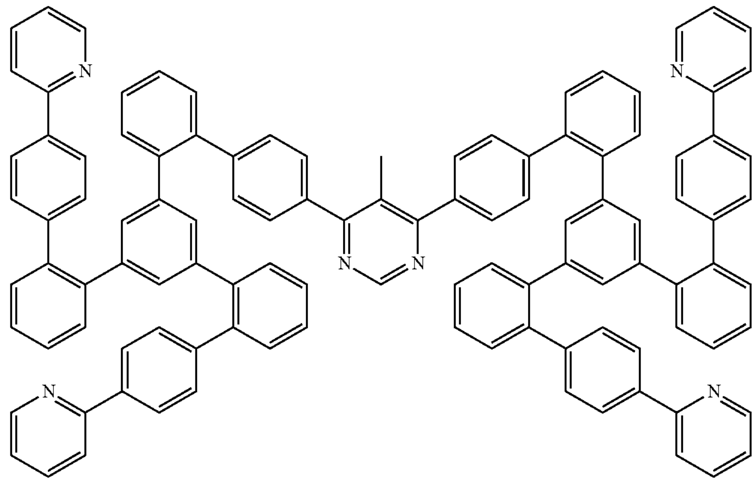 [SMILES: Cc1c(-c2ccc(-c3ccccc3-c3cc(-c4ccccc4-c4ccc(-c5ccccn5)cc4)cc(-c4ccccc4-c4ccc(-c5ccccn5)cc4)c3)cc2)ncnc1-c1ccc(-c2ccccc2-c2cc(-c3ccccc3-c3ccc(-c4ccccn4)cc3)cc(-c3ccccc3-c3ccc(-c4ccccn4)cc3)c2)cc1] | 48% |

Example L66

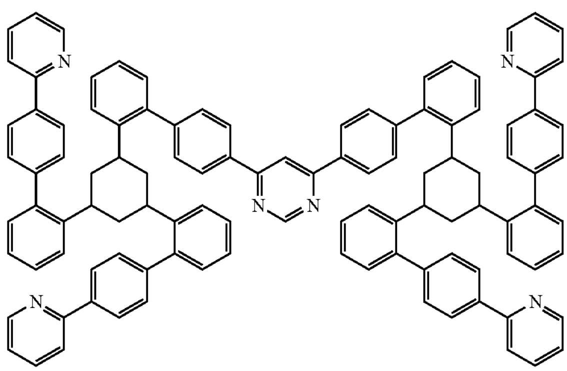 [SMILES: c1ccc(-c2ccc(-c3ccccc3C3CC(c4ccccc4-c4ccc(-c5ccccn5)cc4)CC(c4ccccc4-c4ccc(-c5cc(-c6ccc(-c7ccccc7C7CC(c8ccccc8-c8ccc(-c9ccccn9)cc8)CC(c8ccccc8-c8ccc(-c9ccccn9)cc8)C7)cc6)ncn5)cc4)C3)cc2)nc1]

A mixture of 13.7 g (21 mmol) of B187, 4.8 g (10 mmol) of B8, 12.7 g (60 mmol) of tripotassium phosphate, 250 mg (0.6 mmol) of S-Phos [657408-07-6], 90 mg (4 mmol) of palladium(II) acetate, 100 ml of toluene, 60 ml of dioxane and 60 ml of water is heated under reflux for 6 h. After cooling, the organic phase is separated off, washed twice with 50 ml of water and once with 30 ml of saturated sodium chloride solution, dried over magnesium sulfate and filtered through a Celite bed which has been pre-slurried with toluene. The Celite bed is rinsed with toluene. The filtrate is evaporated to dryness, and the residue is subsequently recrystallised twice from ethyl acetate. Yield: 56.5 g (4.5 mmol), 45%. Purity: about 97% according to $^{1}$H-NMR.

The following compounds can be prepared analogously, where solvents such as, for example, ethyl acetate, cyclohexane, toluene, acetonitrile, n-heptane, ethanol, DMF, DMAC or methanol can be used for the recrystallisation. It is also possible to carry out a hot extraction with these solvents, or the purification can be carried out by chromatography on silica gel on an automated column (Torrent from Axel Semrau).

| Ex. | Starting materials | Product/ reaction conditions, if different | Yield |
| --- | --- | --- | --- |
| L67 | B186 + B9 | 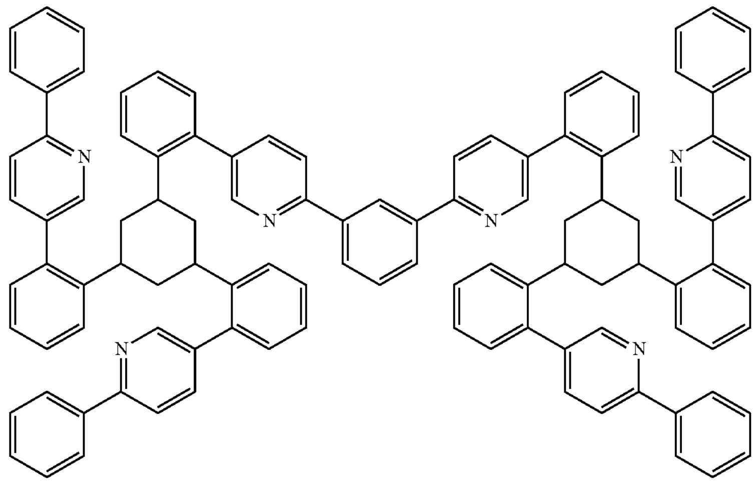 [SMILES: c1ccc(-c2ccc(-c3ccccc3C3CC(c4ccccc4-c4ccc(-c5ccccc5)nc4)CC(c4ccccc4-c4ccc(-c5cccc(-c6ccc(-c7ccccc7C7CC(c8ccccc8-c8ccc(-c9ccccc9)nc8)CC(c8ccccc8-c8ccc(-c9ccccc9)nc8)C7)cn6)c5)nc4)C3)cn2)cc1] | 40% |
| L68 | B188 + B10 | 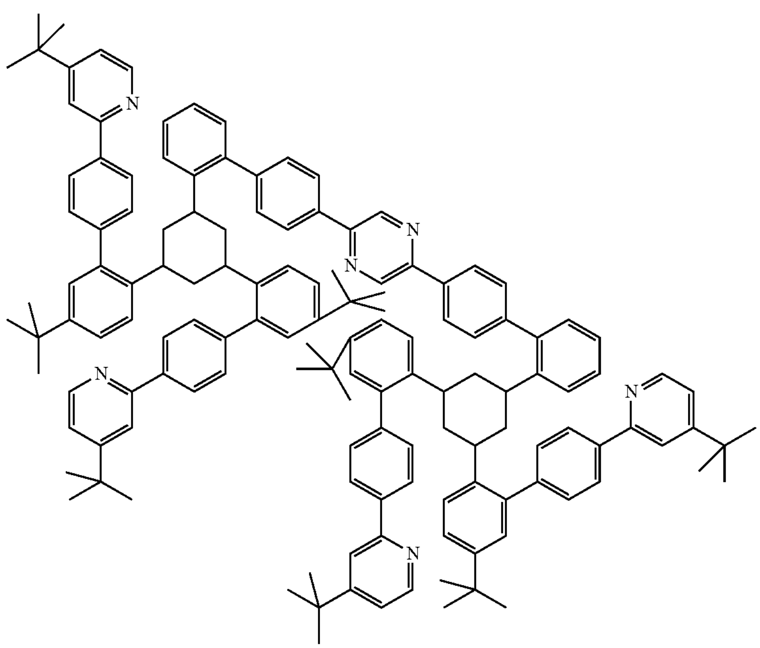 [SMILES: CC(C)(C)c1ccnc(-c2ccc(-c3cc(C(C)(C)C)ccc3C3CC(c4ccccc4-c4ccc(-c5cnc(-c6ccc(-c7ccccc7C7CC(c8ccc(C(C)(C)C)cc8-c8ccc(-c9cc(C(C)(C)C)ccn9)cc8)CC(c8ccc(C(C)(C)C)cc8-c8ccc(-c9cc(C(C)(C)C)ccn9)cc8)C7)cc6)cn5)cc4)CC(c4ccc(C(C)(C)C)cc4-c4ccc(-c5cc(C(C)(C)C)ccn5)cc4)C3)cc2)c1] | 42% |

-continued
| Ex. | Starting materials | Product/ reaction conditions, if different | Yield |
|---|---|---|---|
| L69 | B187 + B13 | 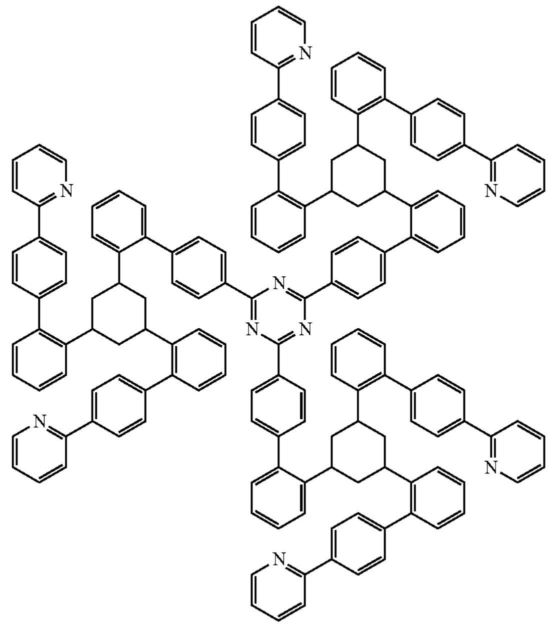 [SMILES: c1ccc(-c2ccc(-c3ccccc3C3CC(c4ccccc4-c4ccc(-c5ccccn5)cc4)CC(c4ccccc4-c4ccc(-c5nc(-c6ccc(-c7ccccc7C7CC(c8ccccc8-c8ccc(-c9ccccn9)cc8)CC(c8ccccc8-c8ccc(-c9ccccn9)cc8)C7)cc6)nc(-c6ccc(-c7ccccc7C7CC(c8ccccc8-c8ccc(-c9ccccn9)cc8)CC(c8ccccc8-c8ccc(-c9ccccn9)cc8)C7)cc6)n5)cc4)C3)cc2)nc1] | 27% |
| L70 | B12 + B187 | 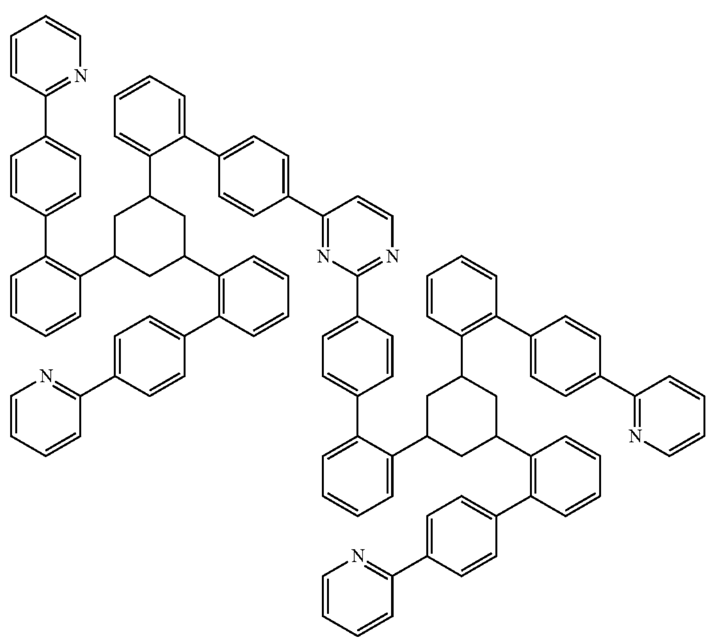 [SMILES: c1ccc(-c2ccc(-c3ccccc3C3CC(c4ccccc4-c4ccc(-c5ccccn5)cc4)CC(c4ccccc4-c4ccc(-c5ccnc(-c6ccc(-c7ccccc7C7CC(c8ccccc8-c8ccc(-c9ccccn9)cc8)CC(c8ccccc8-c8ccc(-c9ccccn9)cc8)C7)cc6)n5)cc4)C3)cc2)nc1] | 39% |

-continued
| Ex. | Starting materials | Product/ reaction conditions, if different | Yield |
|---|---|---|---|
| L71 | B190 + B8 | 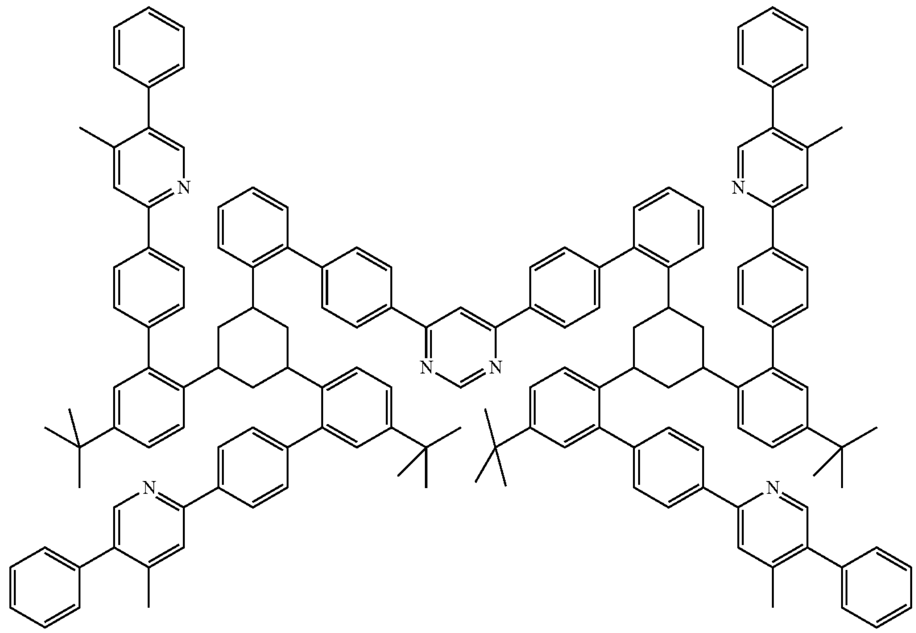 [SMILES: Cc1cc(-c2ccc(-c3cc(C(C)(C)C)ccc3C3CC(c4ccccc4-c4ccc(-c5cc(-c6ccc(-c7ccccc7C7CC(c8ccc(C(C)(C)C)cc8-c8ccc(-c9cc(C)c(-c%10ccccc%10)cn9)cc8)CC(c8ccc(C(C)(C)C)cc8-c8ccc(-c9cc(C)c(-c%10ccccc%10)cn9)cc8)C7)cc6)ncn5)cc4)CC(c4ccc(C(C)(C)C)cc4-c4ccc(-c5cc(C)c(-c6ccccc6)cn5)cc4)C3)cc2)ncc1-c1ccccc1] | 47% |
| L72 | B191 + B8 | 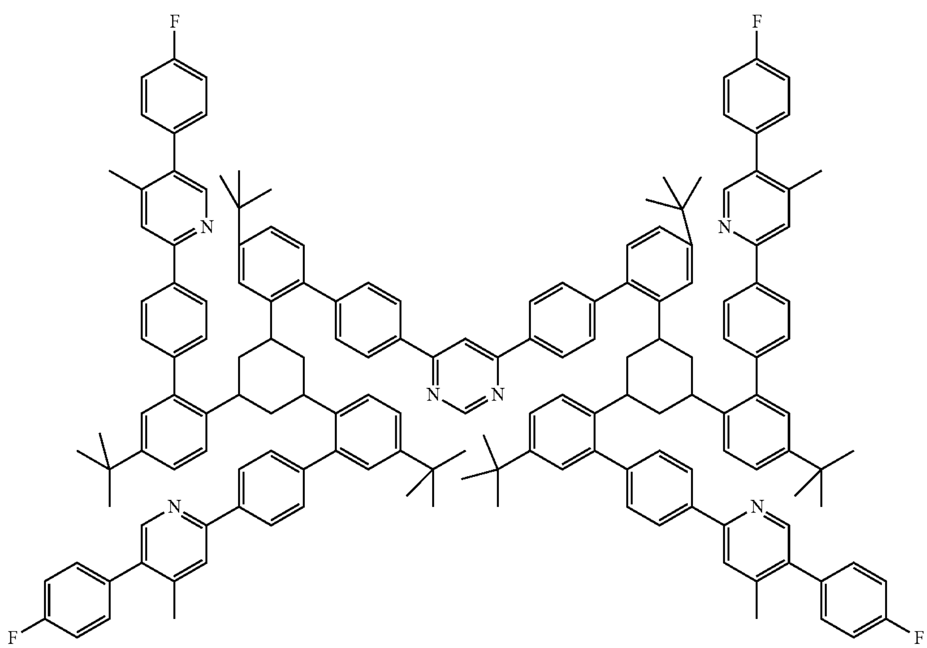 [SMILES: Cc1cc(-c2ccc(-c3cc(C(C)(C)C)ccc3C3CC(c4ccc(C(C)(C)C)cc4-c4ccc(-c5cc(C)c(-c6ccc(F)cc6)cn5)cc4)CC(c4cc(C(C)(C)C)ccc4-c4ccc(-c5cc(-c6ccc(-c7ccc(C(C)(C)C)cc7C7CC(c8ccc(C(C)(C)C)cc8-c8ccc(-c9cc(C)c(-c%10ccc(F)cc%10)cn9)cc8)CC(c8ccc(C(C)(C)C)cc8-c8ccc(-c9cc(C)c(-c%10ccc(F)cc%10)cn9)cc8)C7)cc6)ncn5)cc4)C3)cc2)ncc1-c1ccc(F)cc1] | 38% |

-continued
| Ex. | Starting materials | Product/ reaction conditions, if different | Yield |
|---|---|---|---|
| L73 | B192 + B11 | 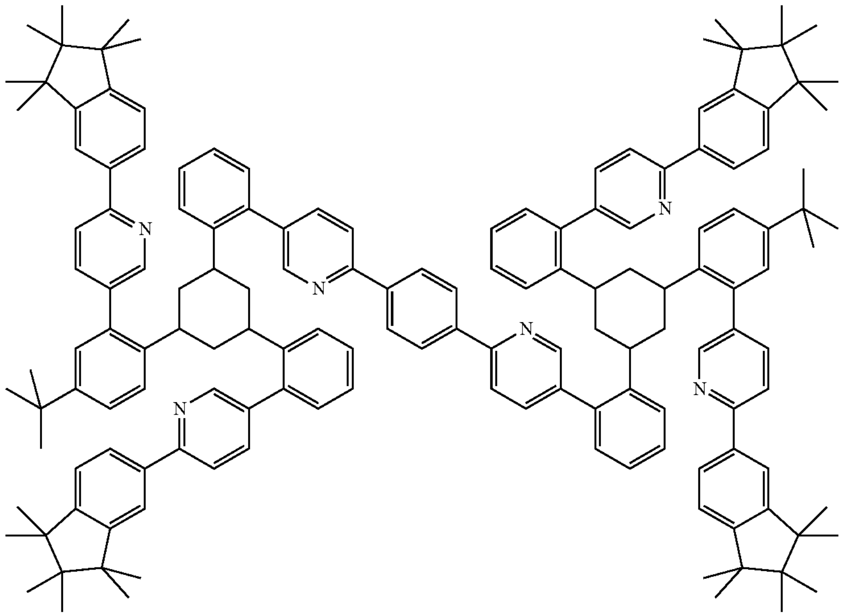 | 45% |
| L74 | B189 + B8 | 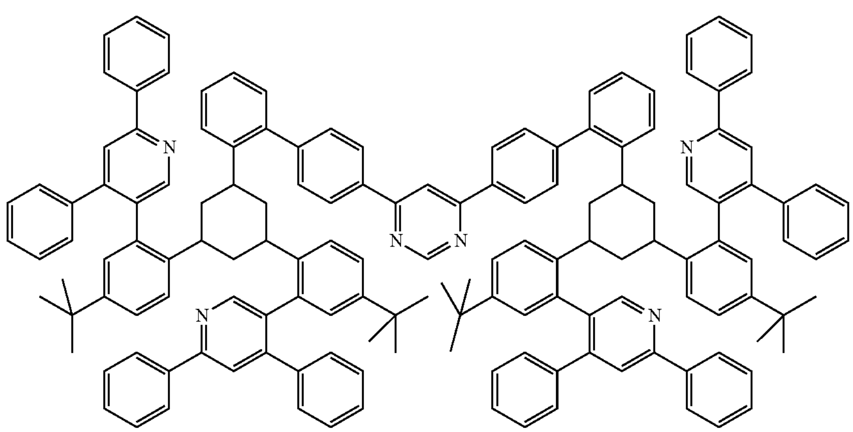 [SMILES: CC(C)(C)c1ccc(C2CC(c3ccccc3-c3ccc(-c4cc(-c5ccc(-c6ccccc6C6CC(c7ccc(C(C)(C)C)cc7-c7cnc(-c8ccccc8)cc7-c7ccccc7)CC(c7ccc(C(C)(C)C)cc7-c7cnc(-c8ccccc8)cc7-c7ccccc7)C6)cc5)ncn4)cc3)CC(c3ccc(C(C)(C)C)cc3-c3cnc(-c4ccccc4)cc3-c3ccccc3)C2)c(-c2cnc(-c3ccccc3)cc2-c2ccccc2)c1] | 43% |

C: Synthesis of the Metal Complexes

Example of Isomer 1-$Ir_2$(L1) and Isomer 2-$Ir_2$(L1) (Abbreviated to I1-$Ir_2$(L1) and I2-$Ir_2$(L1) Below)

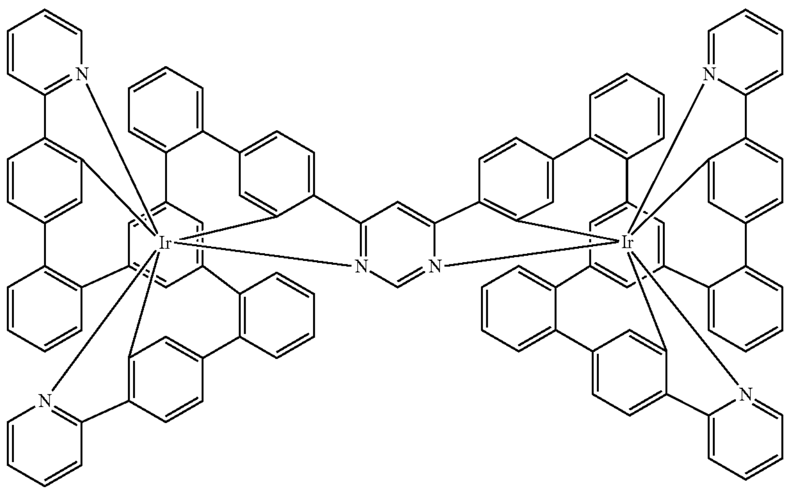

A mixture of 14.5 g (10 mmol) of ligand L1, 9.8 g (20 mmol) of trisacetylacetonatoiridium(III) [15635-87-7] and 100 g of hydroquinone [123-31-9] is initially introduced in a 1000 ml two-necked round-bottomed flask with a glass-clad magnetic stirrer bar. The flask is provided with a water separator (for media of lower density than water) and an air condenser with argon blanketing and is placed in a metal heating dish. The apparatus is flushed with argon from above via the argon blanketing for 15 min., during which the argon is allowed to stream out of the side neck of the two-necked flask. A glass-clad Pt-100 thermocouple is introduced into the flask via the side neck of the two-necked flask and the end is positioned just above the magnetic stirrer bar. The apparatus is thermally insulated by means of several loose coils of household aluminium foil, where the insulation is run as far as the centre of the riser tube of the water separator. The apparatus is then quickly heated to 250° C., measured at the Pt-100 temperature sensor, which dips into the molten, stirred reaction mixture, using a laboratory hotplate stirrer. During the next 2 h, the reaction mixture is held at 250° C., during which little condensate is distilled off and collects in the water separator. The reaction mixture is allowed to cool to 190° C., and 100 ml of ethylene glycol are then added dropwise. The mixture is allowed to cool further to 80° C., and 500 ml of methanol are then added dropwise, and the mixture is heated under reflux for 1 h. The suspension obtained in this way is filtered through a reverse frit, the solid is washed twice with 50 ml of methanol and then dried in vacuo. The solid obtained in this way is dissolved in 200 ml of dichloromethane and filtered through about 1 kg of silica gel which has been pre-slurried with dichloromethane (column diameter about 18 cm) with exclusion of air and light, where dark components remain at the start. The core fraction is cut out and evaporated in a rotary evaporator, with MeOH simultaneously being continuously added dropwise to crystallisation. The diastereomeric product mixture is filtered off with suction, washed with a little MeOH and dried in vacuo, then subjected to further purification.

The diastereomeric metal complex mixture comprising ΔΔ and ΛΛ isomers (racemic) and ΛΔ isomer (meso) in the molar ratio 1:1 (determined by $^1$H-NMR) is dissolved in 300 ml of dichloromethane, adsorbed onto 100 g of silica gel and separated by chromatography on a silica-gel column which has been pre-slurried with toluene/ethyl acetate 95:5 (amount of silica gel about 1.7 kg). The front spot is eluted first, and the amount of ethyl acetate is then increased stepwise to a toluene/ethyl acetate ratio of 6:1, giving 7.0 g (3.8 mmol, purity 99%) of the isomer eluting earlier, called isomer 1 (I1) below, and 7.7 g (4.2 mmol, purity 98%) of the isomer eluting later, called isomer 2 (12) below. Isomer 1 (I1) and isomer 2 (12) are purified further separately from one another by hot extraction four times with ethyl acetate for isomer 1 and dichloromethane for isomer 2 (initially introduced amount in each case about 150 ml, extraction thimble: standard cellulose Soxhlett thimbles from Whatman) with careful exclusion of air and light. Finally, the products are heated at 280° C. in a high vacuum. Yield: isomer 1 (I1) 5.3 g of red solid (2.9 mmol), 29%, based on the amount of ligand employed. Purity: >99.9% according to HPLC; isomer 2 (12) 4.9 g of red solid (2.7 mmol), 27%, based on the amount of ligand employed. Purity 99.8% according to HPLC.

The metal complexes shown below can in principle be purified by chromatography (typical use of an automated column (Torrent from Axel Semrau), recrystallisation or hot extraction. Residual solvents can be removed by heating in vacuo/high vacuum at typically 250-330° C. or by sublimation/fractional sublimation. The yields indicated for isomer 1 (I1) and isomer 2 (12) always relate to the amount of ligand employed.

The pictures of the complexes shown below usually show only one isomer. The isomer mixture can be separated, but can also be employed as an isomer mixture in the OLED device. However, there are also ligand systems in which for steric reasons only one diastereomer pair forms.

The following compounds can be synthesised analogously. The reaction conditions are indicated by way of example for isomer 1 (I1). The chromatographic separation of the diastereomer mixture usually formed is carried out on flash silica gel on an automated column (Torrent from Axel Semrau).

| Ex. | Starting material | Product/reaction conditions/hot extractant (HE) | Yield* |
|---|---|---|---|
| I1-$Rh_2$ (L1) | L1 $Rh(acac)_3$ [14284-92-5] instead of $Ir(acac)_3$ | 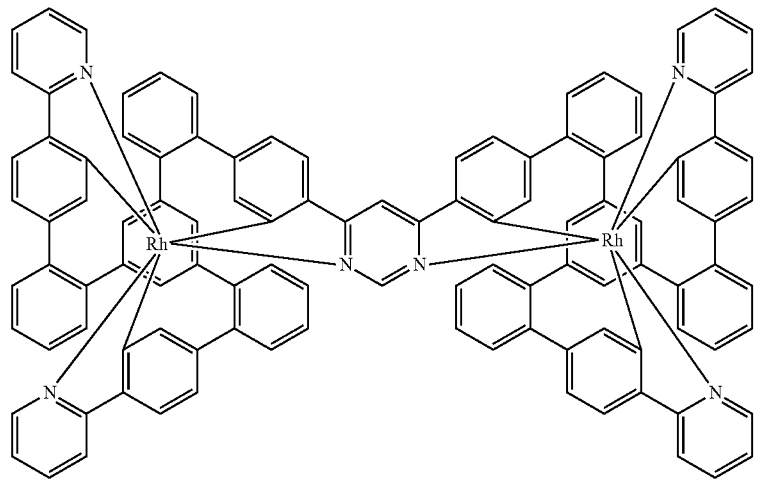 I1-$Rh_2$(L1) 250° C.; 2 h Hot extraction: toluene | 22% |
| I2-$Rh_2$ (L1) | L1 $Rh(acac)_3$ [14284-92-5] instead of $Ir(acac)_3$ | 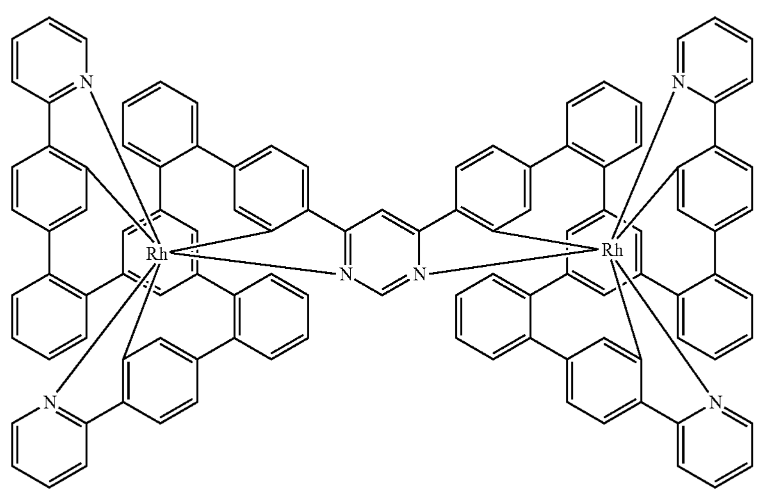 I2-$Rh_2$(L1) Hot extraction: toluene | 20% |

-continued
| Ex. | Starting material | Product/reaction conditions/hot extractant (HE) | Yield* |
|---|---|---|---|
| I1-$Ir_2$ (L2) | L2 | 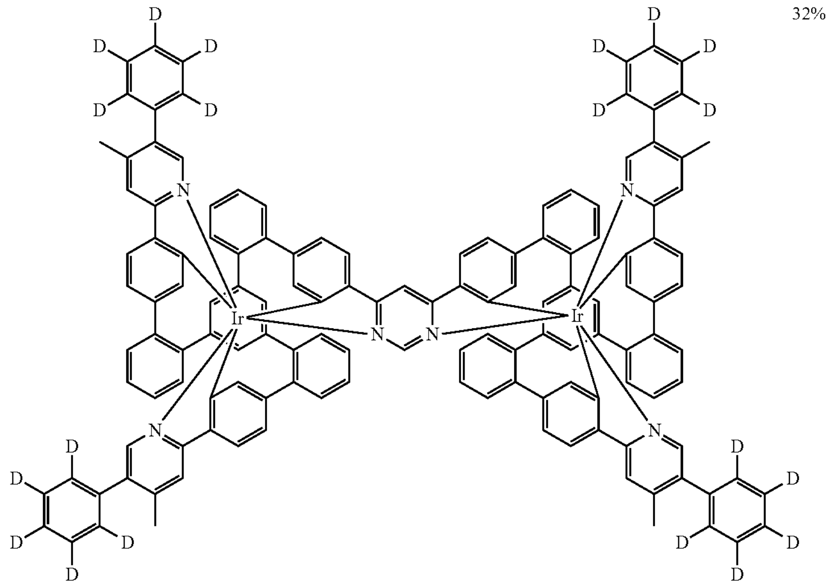 I1-$Ir_2$(L2) 250° C.; 2 h Hot extraction: ethyl acetate | 32% |
| I2-$Ir_2$ (L2) | L2 | I2-$Ir_2$(L2) Hot extraction: toluene | 34% |
| I1-$Ir_2$ (L3) | L3 | 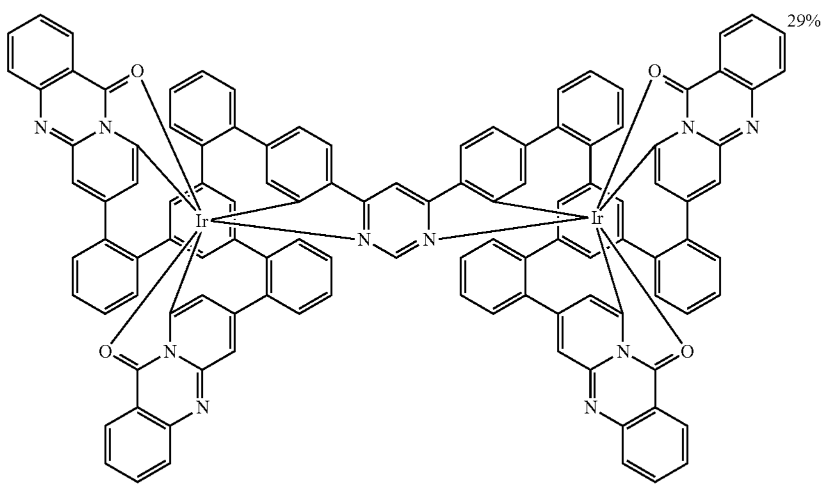 I1-$Ir_2$(L3) 230° C.; 1 h Hot extraction: ethyl acetate | 29% |
| I2-$Ir_2$ (L3) | L3 | I2-$Ir_2$(L3) Hot extraction: ethyl acetate | 30% |

-continued
| Ex. | Starting material | Product/reaction conditions/hot extractant (HE) | Yield* |
|---|---|---|---|
| $Ir_2$ (L4) | L4 | 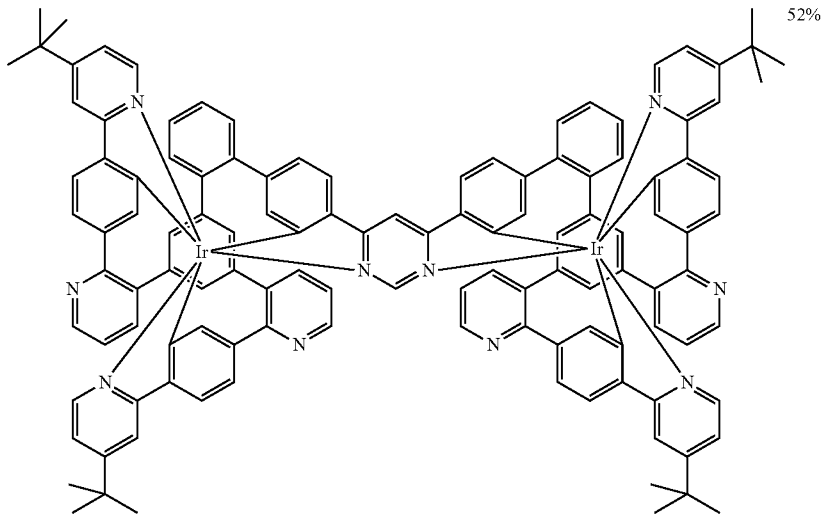 $Ir_2$(L4) 250° C.; 2 h Hot extraction: ethyl acetate Only the racemate of ΛΛ and ΔΔ isomers forms. | 52% |
| $Rh_2$ (L4) | L4 $Rh(acac)_3$ [14284-92-5] instead of $Ir(acac)_3$ | 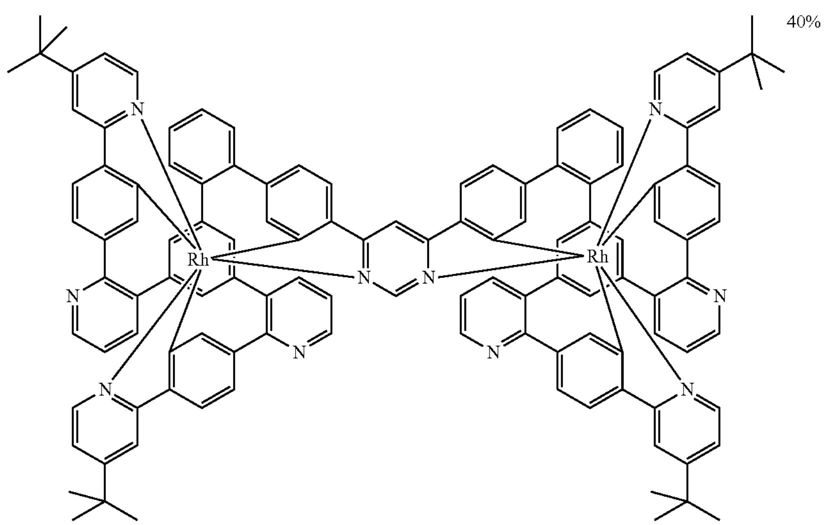 $Rh_2$(L4) 250° C.; 2 h Hot extraction: ethyl acetate Only the racemate of ΛΛ and ΔΔ isomers forms. | 40% |

-continued
| Ex. | Starting material | Product/reaction conditions/hot extractant (HE) | Yield* |
|---|---|---|---|
| I1-$Ir_2$ (L5) | L5 | 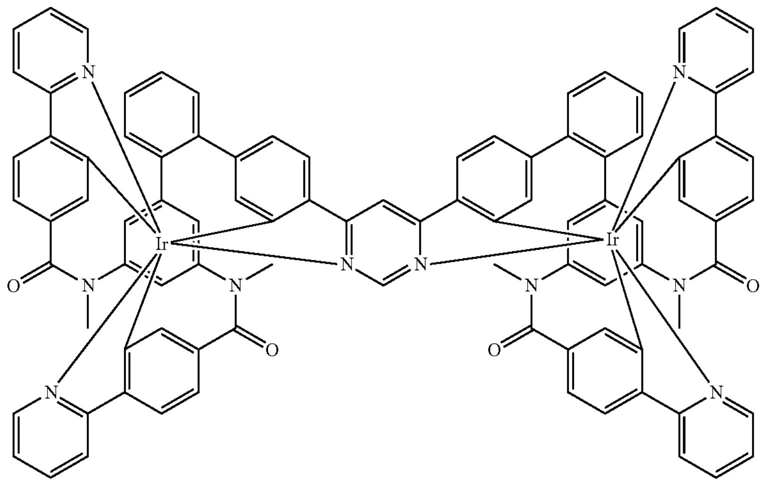 I1-$Ir_2$(L5) 250° C.; 3 h Hot extraction: n-butyl acetate | 30%% |
| I2-$Ir_2$ (L5) | L5 | I2-$Ir_2$(L5) Hot extraction: n-butyl acetate | 28%% |
| I1-$Ir_2$ (L6) | L6 | 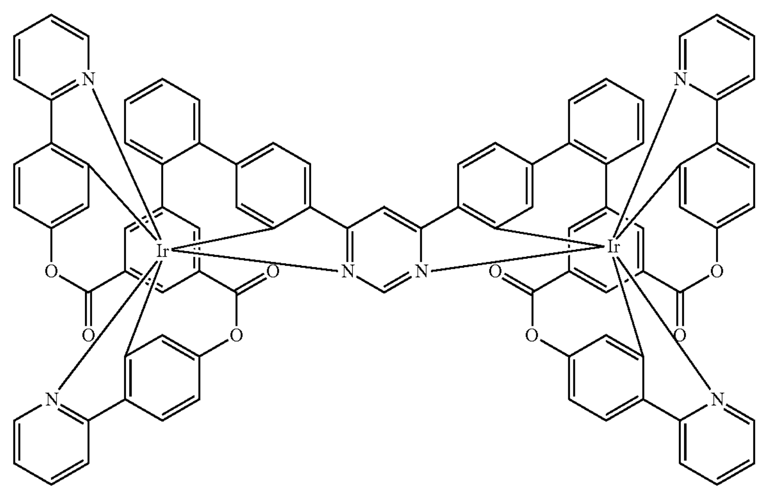 I1-$Ir_2$(L6) 220° C.; 5 h Hot extraction: butyl acetate | 21% |
| I2-$Ir_2$ (L6) | L6 | I2-$Ir_2$(L6) Hot extraction: ethyl acetate | 24% |

-continued
| Ex. | Starting material | Product/reaction conditions/hot extractant (HE) | Yield* |
|---|---|---|---|
| I1-$Ir_2$ (L8) | L8 | 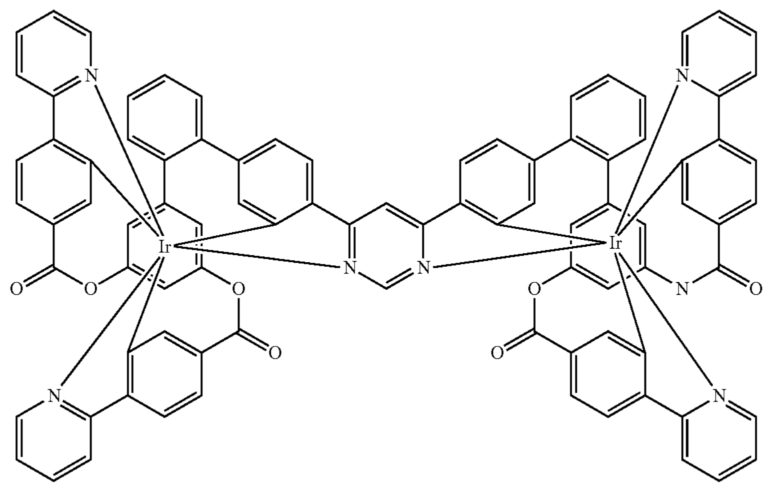 I1-$Ir_2$(L8) 220° C.; 5 h Hot extraction: toluene | 25% |
| I2-$Ir_2$ (L8) | L8 | I2-$Ir_2$(L8) Hot extraction: toluene | 25% |
| I1-$Ir_2$ (L9) | L9 | 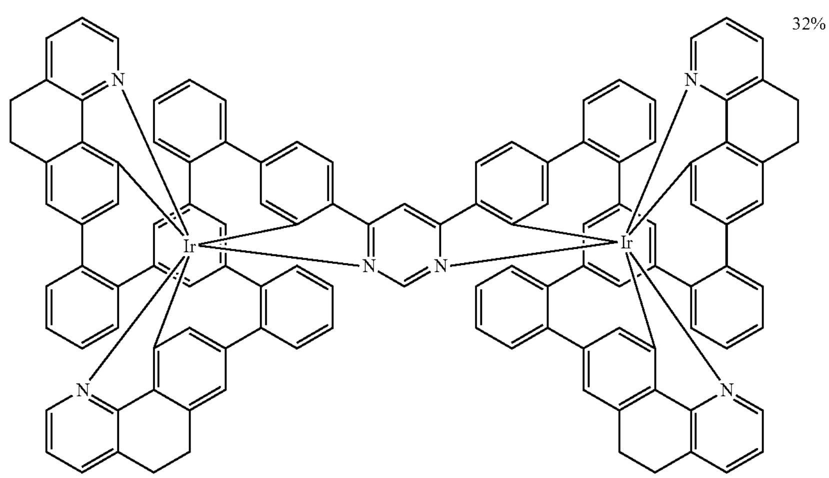 I1-$Ir_2$(L9) 250° C.; 3 h Hot extraction: o-xylene | 32% |
| I2-$Ir_2$ (L9) | L9 | I2-$Ir_2$(L9) Hot extraction: toluene | 26% |

-continued
| Ex. | Starting material | Product/reaction conditions/hot extractant (HE) | Yield* |
| --- | --- | --- | --- |
| $Ir_2$ (L10) | L10 | 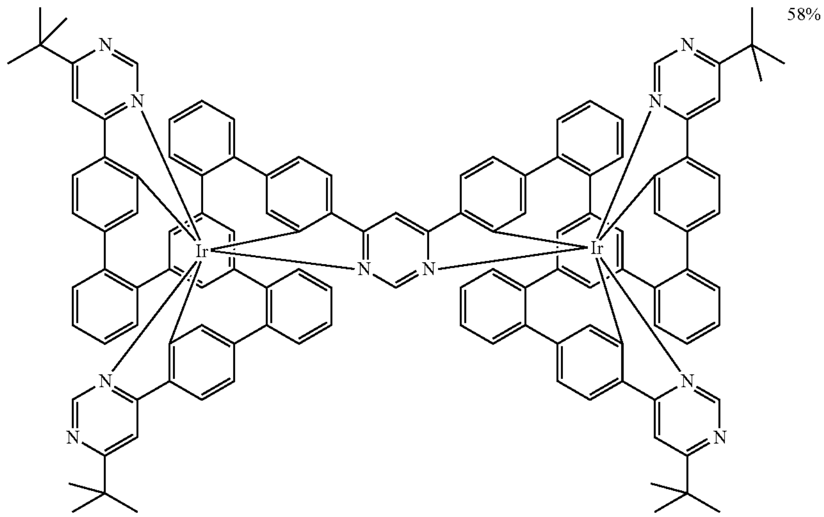 I1-$Ir_2$(L10)<br>250° C.; 1.5 h<br>Hot extraction: ethyl acetate/acetonitrile 4:1<br>Only the racemate of ΛΛ and ΔΔ isomers forms. | 58% |
| I1-$Ir_2$ (L11) | L11 | 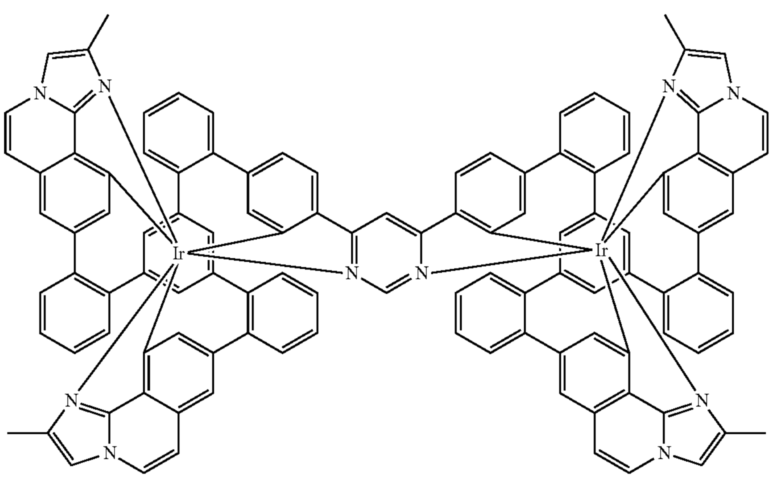 I1-$Ir_2$(L11)<br>260° C.; 2 h<br>Hot extraction: m-xylene | 27% |
| I2-$Ir_2$ (L11) | L11 | I2-$Ir_2$(L11)<br>Hot extraction: o-xylene | 30% |

-continued
| Ex. | Starting material | Product/reaction conditions/hot extractant (HE) | Yield* |
|---|---|---|---|
| I1-$Ir_2$ (L12) | L12 | 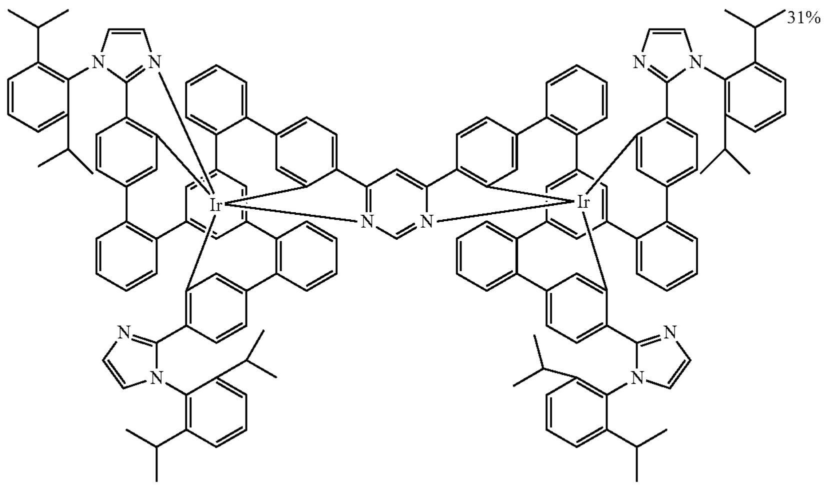 I1-$Ir_2$(L12) 265° C.; 2 h Hot extraction: toluene | 31% |
| I2-$Ir_2$ (L12) | L12 | I2-$Ir_2$(L12) Hot extraction: toluene | 33% |
| I1-$Ir_2$ (L13) | L13 | 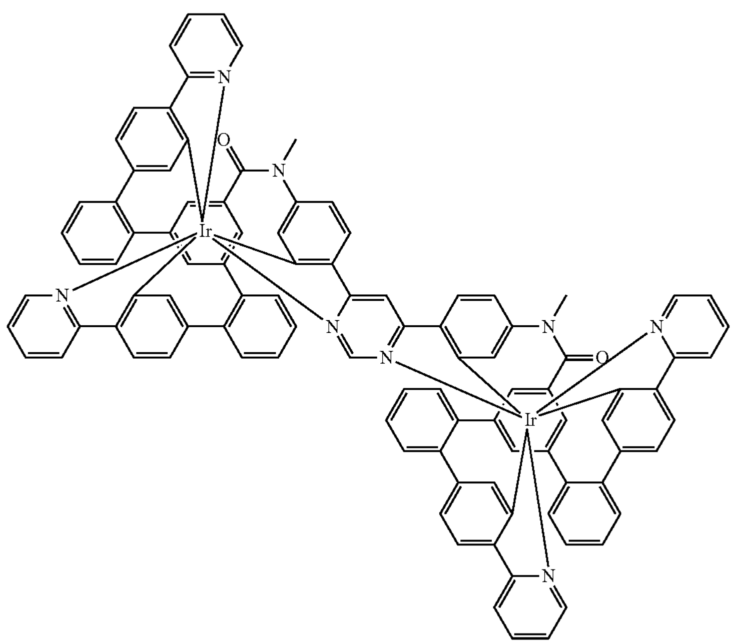 I1-$Ir_2$(L13) 250° C.; 3 h Hot extraction: butyl acetate | 30% |
| I2-$Ir_2$ (L13) | L13 | I1-$Ir_2$(L13) Hot extraction: butyl acetate | 30% |

-continued
| Ex. | Starting material | Product/reaction conditions/hot extractant (HE) | Yield* |
|---|---|---|---|
| I1-$Ir_2$ (L14) | L14 | 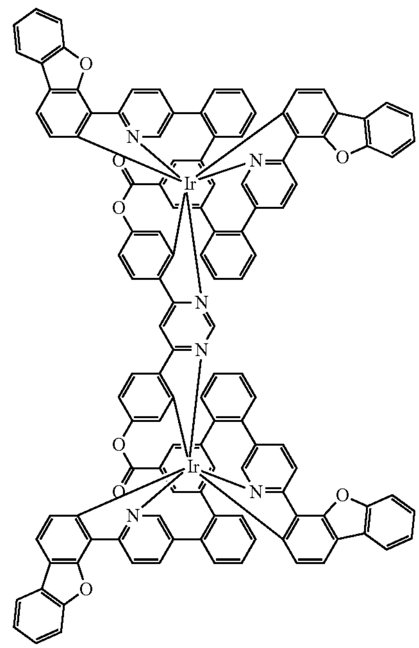 I1-$Ir_2$(L14) 250° C.; 3 h Hot extraction: ethyl acetate | 26% |
| I2-$Ir_2$ (L14) | L14 | I2-$Ir_2$(L14) Hot extraction: ethyl acetate | 23% |
| I1-$Ir_2$ (L15) | L15 | 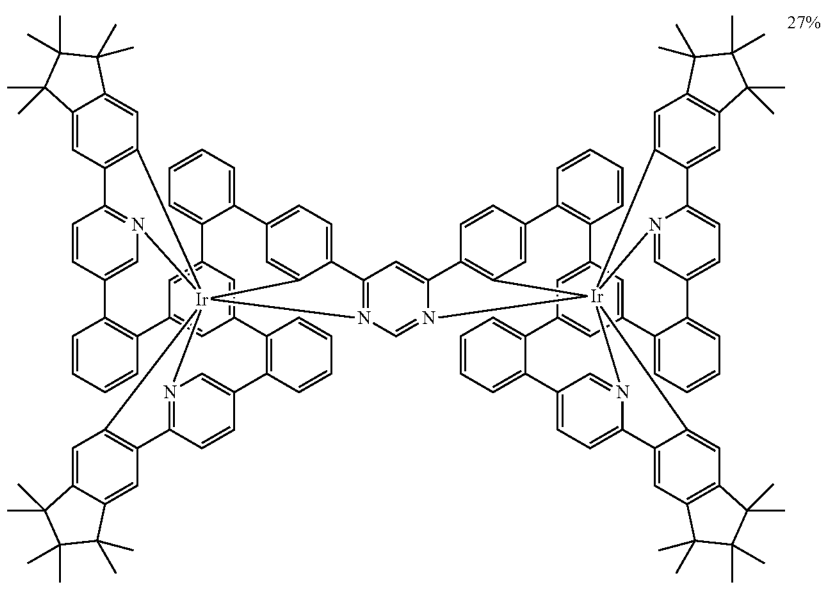 I1-$Ir_2$(L15) 250° C.; 2 h Hot extraction: cyclohexane | 27% |
| I2-$Ir_2$ (L15) | L15 | I2-$Ir_2$(L15) Hot extraction: toluene/heptane 3:1 | 33% |

-continued
| Ex. | Starting material | Product/reaction conditions/hot extractant (HE) | Yield* |
|---|---|---|---|
| I1-$Ir_2$ (L16) | L16 | 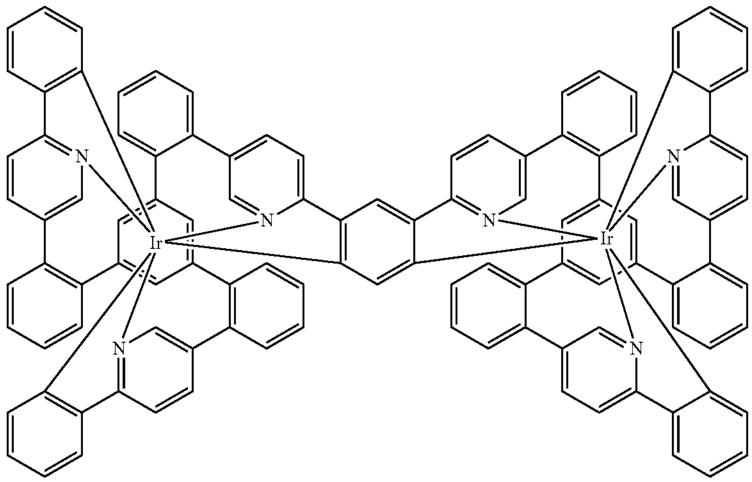 I1-$Ir_2$(L16) 270° C.; 2 h Hot extraction: dichloromethane | 33% |
| I2-$Ir_2$ (L16) | L16 | I2-$Ir_2$(L16) Hot extraction: dichloromethane | 30% |
| I1-$Ir_2$ (L17) | L17 | 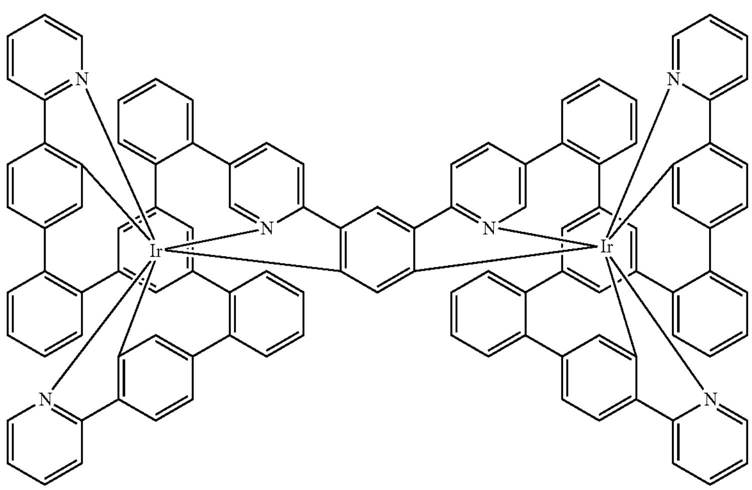 I1-$Ir_2$(L17) 265° C.; 3 h Hot extraction: toluene | 29% |
| I2-$Ir_2$ (L17) | L17 | I2-$Ir_2$(L17) Hot extraction: n-butyl acetate | 34% |

-continued
| Ex. | Starting material | Product/reaction conditions/hot extractant (HE) | Yield* |
| --- | --- | --- | --- |
| I1-$Ir_2$ (L18) | L18 | 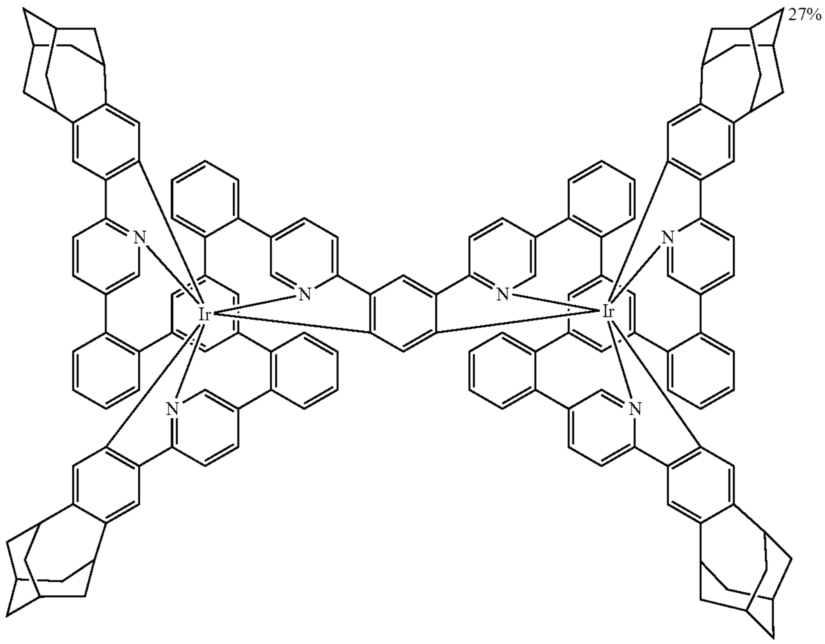<br>I1-$Ir_2$(L18)<br>265° C.; 3.5 h<br>Hot extraction: ethyl acetate | 27% |
| I2-$Ir_2$ (L18) | L18 | I2-$Ir_2$(L18)<br>Hot extraction: ethyl acetate/acetonitrile 4:1 | 25% |
| I1-$Ir_2$ (L19) | L19 | 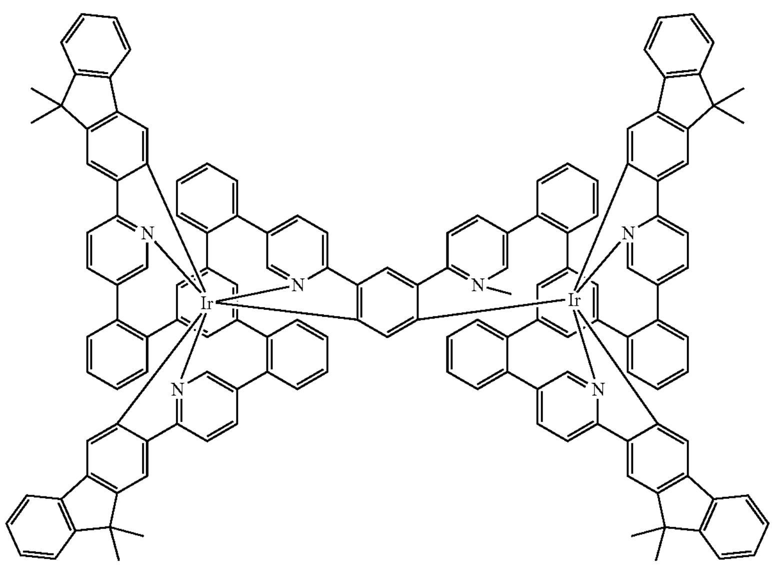<br>I1-$Ir_2$(L19)<br>270° C.; 3 h<br>Hot extraction: dichloromethane | 35% |
| I2-$Ir_2$ (L19) | L19 | I2-$Ir_2$(L19)<br>Hot extraction: o-xylene | 30% |

-continued
| Ex. | Starting material | Product/reaction conditions/hot extractant (HE) | Yield* |
|---|---|---|---|
| I1-$Ir_2$ (L20) | L20 | 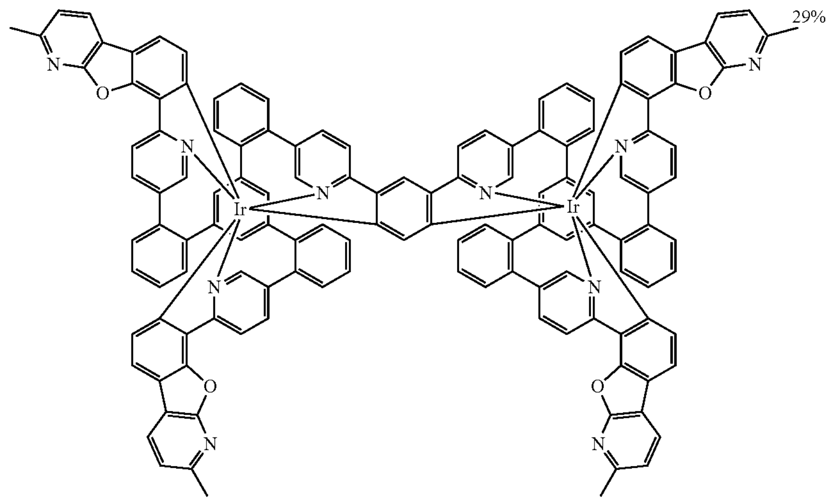 I1-$Ir_2$(L20) 265° C.; 5 h Hot extraction: dichloromethane | 29% |
| I2-$Ir_2$ (L20) | L20 | I2-$Ir_2$(L20) Hot extraction: dichloromethane | 31% |
| I1-$Ir_2$ (L21) | L21 | 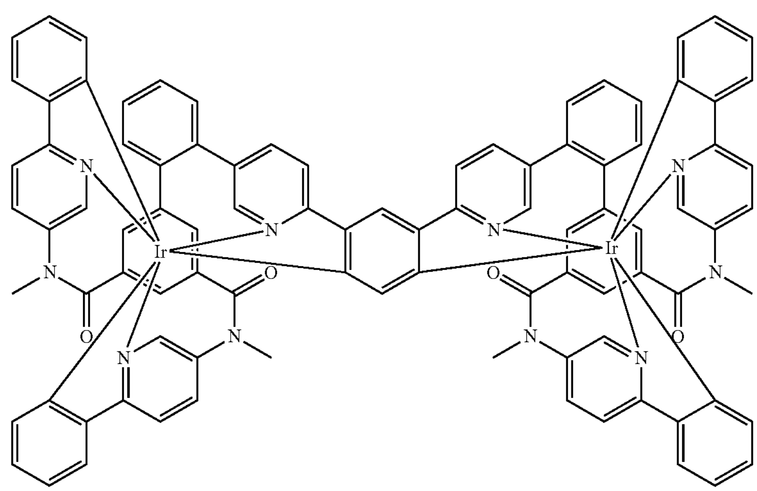 I1-$Ir_2$(L21) 255° C.; 3 h Hot extraction: ethyl acetate | 25% |
| I2-$Ir_2$ (L21) | L21 | I2-$Ir_2$(L21) Hot extraction: ethyl acetate | 30% |

-continued
| Ex. | Starting material | Product/reaction conditions/hot extractant (HE) | Yield* |
|---|---|---|---|
| I1-$Ir_2$ (L22) | L22 | 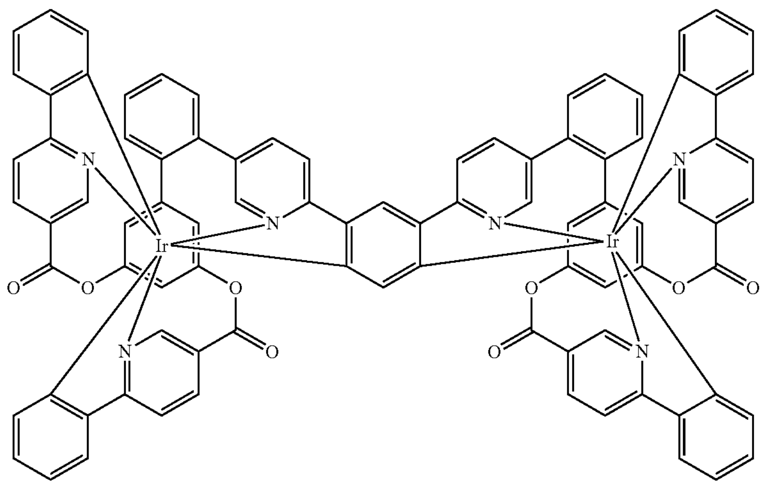<br>I1-$Ir_2$(L22)<br>235° C.; 3 h<br>Recrystallisation from DMF | 21% |
| I-$Ir_2$ (L22) | L22 | I2-$Ir_2$(L22)<br>Hot extraction: n-butyl acetate | 23% |
| I1-$Ir_2$ (L23) | L23 | 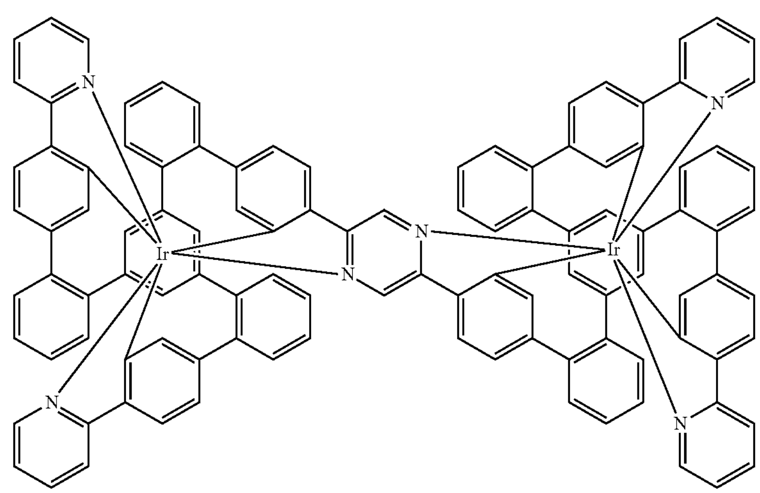<br>I1-$Ir_2$(L23)<br>250° C.; 2 h<br>Hot extraction: toluene | 31% |
| I2-$Ir_2$ (L23) | L23 | I2-$Ir_2$(L23)<br>Hot extraction: o-xylene | 38% |

-continued
| Ex. | Starting material | Product/reaction conditions/hot extractant (HE) | Yield* |
|---|---|---|---|
| I1-$Ir_2$ (L24) | L24 | 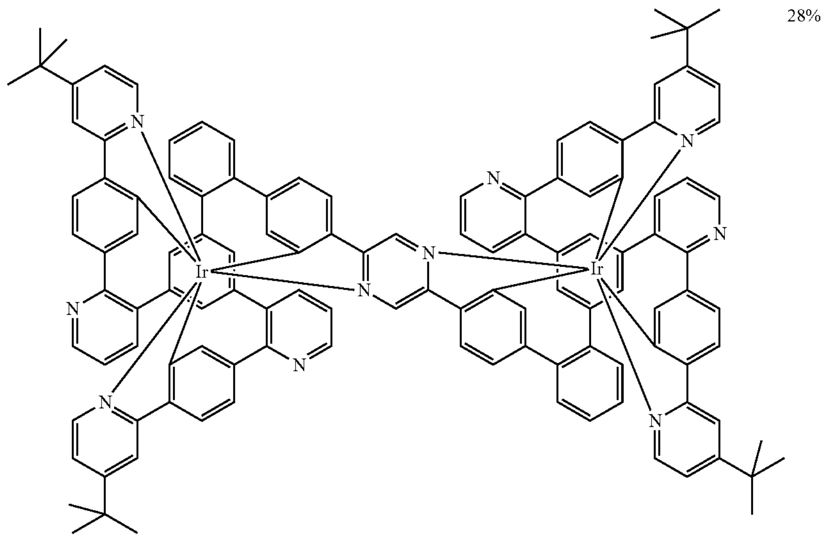 I1-$Ir_2$(L24) 250° C.; 2 h Hot extraction: toluene | 28% |
| I2-$Ir_2$ (L24) | L24 | I2-$Ir_2$(L24) Hot extraction: toluene | 27% |
| I1-$Ir_2$ (L25) | L25 | 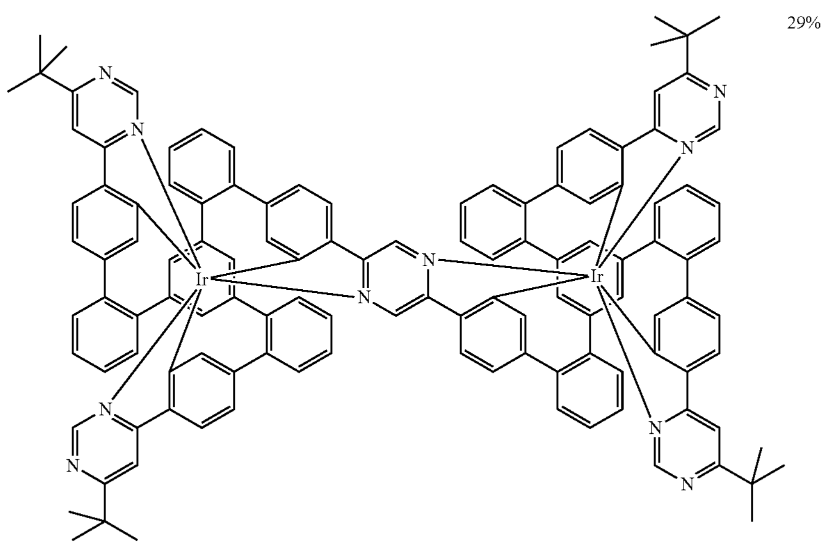 I1-$Ir_2$(L25) 250° C.; 2 h Hot extraction: ethyl acetate | 29% |
| I2-$Ir_2$ (L25) | L25 | I2-$Ir_2$(L25) Hot extraction: ethyl acetate | 30% |

-continued
| Ex. | Starting material | Product/reaction conditions/hot extractant (HE) | Yield* |
|---|---|---|---|
| I1-$Ir_2$ (L26) | L26 | 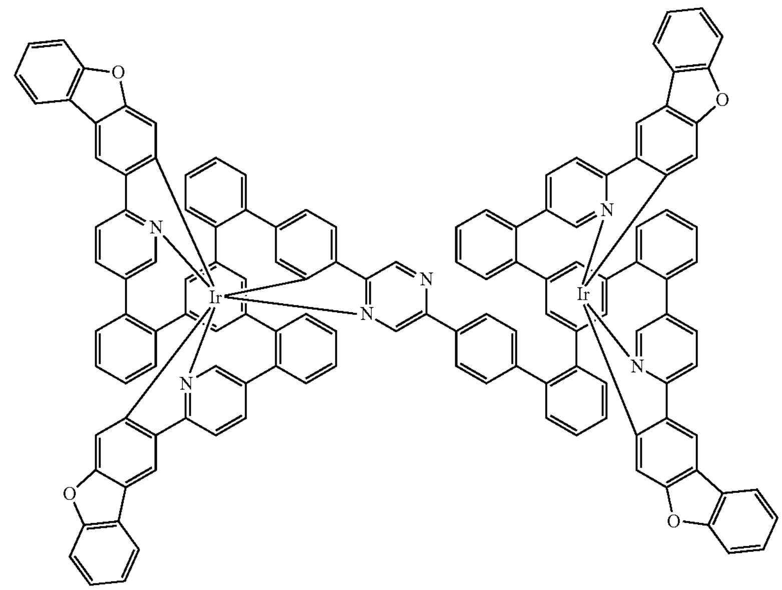 I1-$Ir_2$(L26) 250° C.; 3.5 h Hot extraction: p-xylene | 25% |
| I2-$Ir_2$ (L26) | L26 | I2-$Ir_2$(L26) Hot extraction: toluene | 25% |
| I1-$Ir_2$ (L27) | L27 | 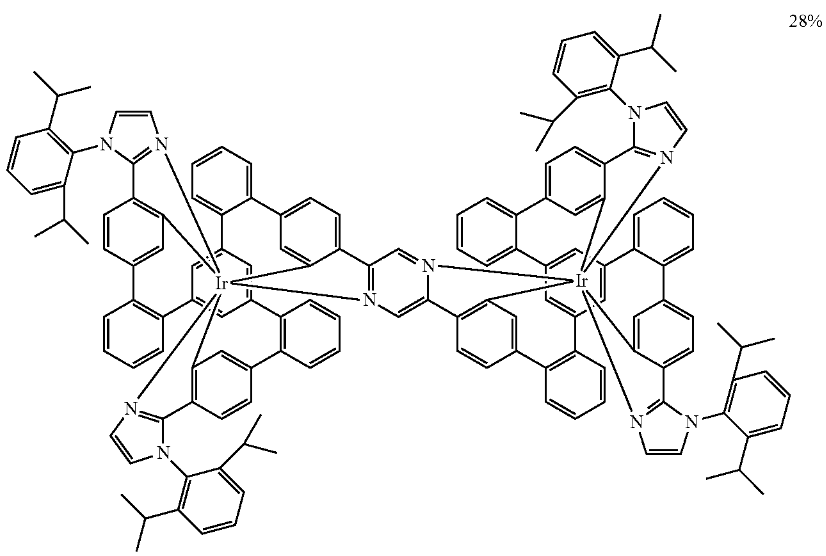 I1-$Ir_2$(L27) 260° C.; 3 h Hot extraction: toluene | 28% |
| I2-$Ir_2$ (L27) | L27 | I2-$Ir_2$(L27) Hot extraction: o-xylene | 32% |

-continued
| Ex. | Starting material | Product/reaction conditions/hot extractant (HE) | Yield* |
|---|---|---|---|
| I1-$Ir_2$ (L28) | L28 | 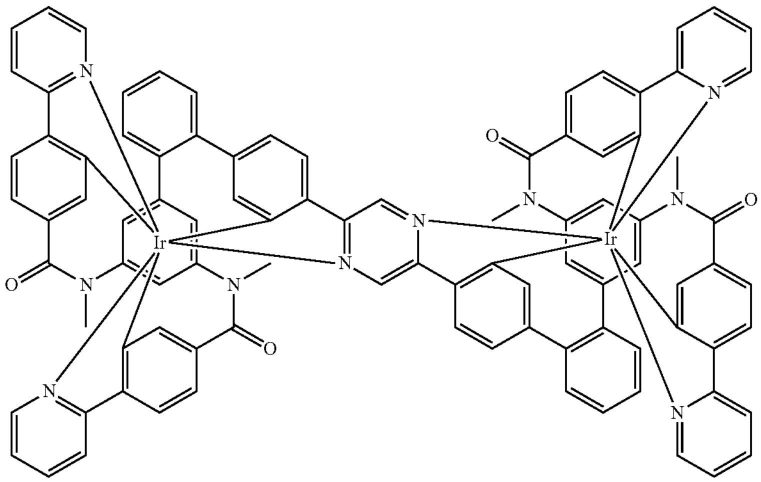 I1-$Ir_2$(L28) 250° C.; 3 h Recrystallisation from DMSO | 35% |
| I2-$Ir_2$ (L28) | L28 | I2-$Ir_2$(L28) Recrystallisation from DMF | 31% |
| I1-$Ir_2$ (L29) | L29 | 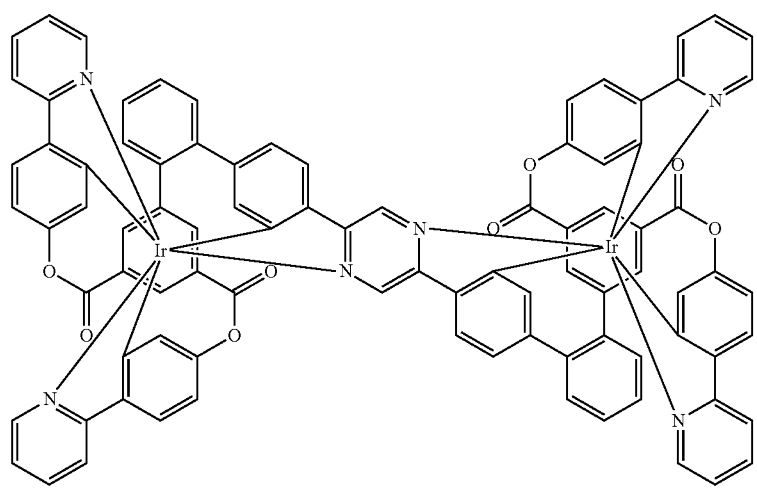 I1-$Ir_2$(L29) 235° C.; 2 h Hot extraction: ethyl acetate | 23% |
| I2-$Ir_2$ (L29) | L29 | I2-$Ir_2$(L29) Hot extraction: ethyl acetate | 26% |

-continued
| Ex. | Starting material | Product/reaction conditions/hot extractant (HE) | Yield* |
|---|---|---|---|
| I1-$Ir_2$ (L30) | L30 | 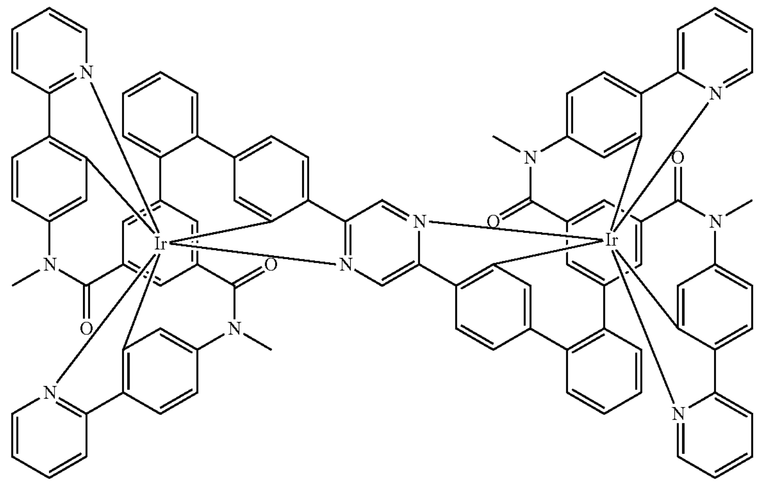 I1-$Ir_2$(L30) 250° C.; 2 h Recrystallisation from 1,4-dioxane | 31% |
| I2-$Ir_2$ (L30) | L30 | I2-$Ir_2$(L30) Recrystallisation from DMSO | 31% |
| I1-$Ir_2$ (L31) | L31 | 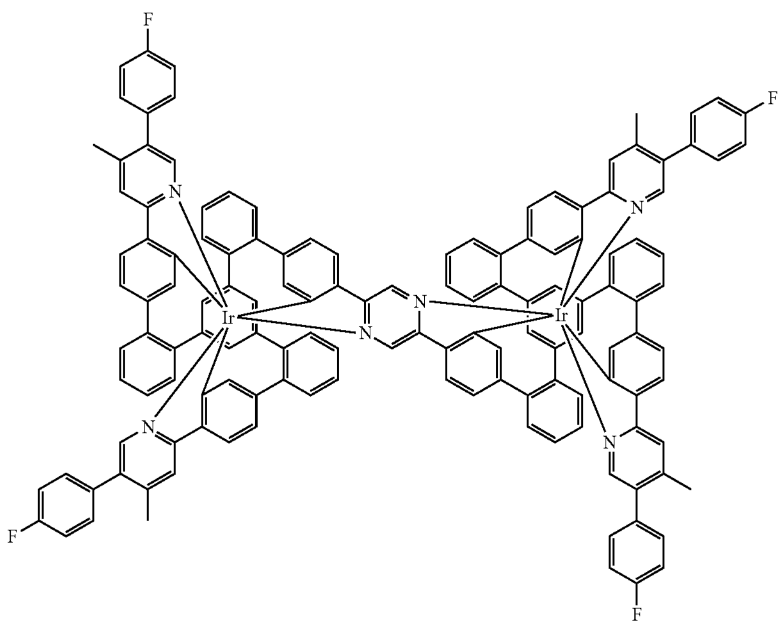 I1-$Ir_2$(L31) 250° C.; 2 h Hot extraction: n-butyl acetate | 30% |
| I2-$Ir_2$ (L31) | L31 | I2-$Ir_2$(L31) Hot extraction: n-butyl acetate | 27% |

-continued
| Ex. | Starting material | Product/reaction conditions/hot extractant (HE) | Yield* |
|---|---|---|---|
| I1-$Ir_2$ (L32) | L32 | 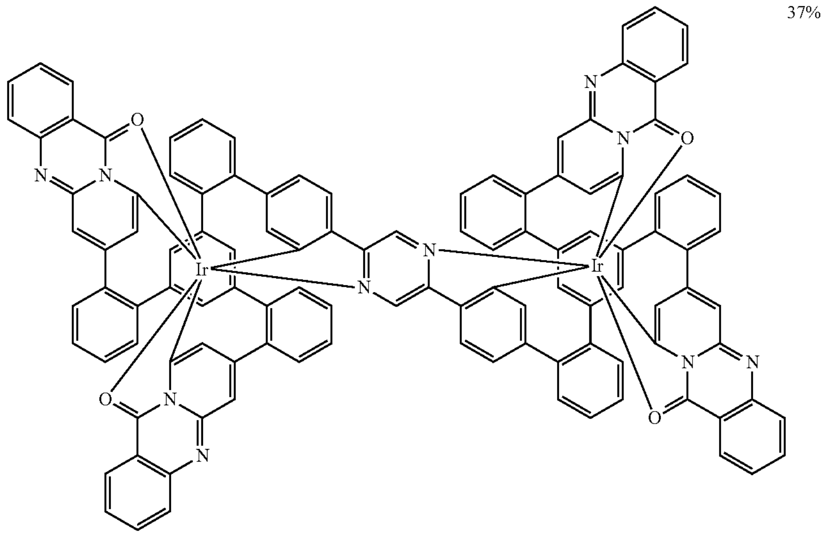 I1-$Ir_2$(L32) 230° C.; 2 h Hot extraction: ethyl acetate | 37% |
| I2-$Ir_2$ (L32) | L32 | I2-$Ir_2$(L32) Hot extraction: n-butyl acetate | 33% |
| I1-$Ir_2$ (L33) | L33 | 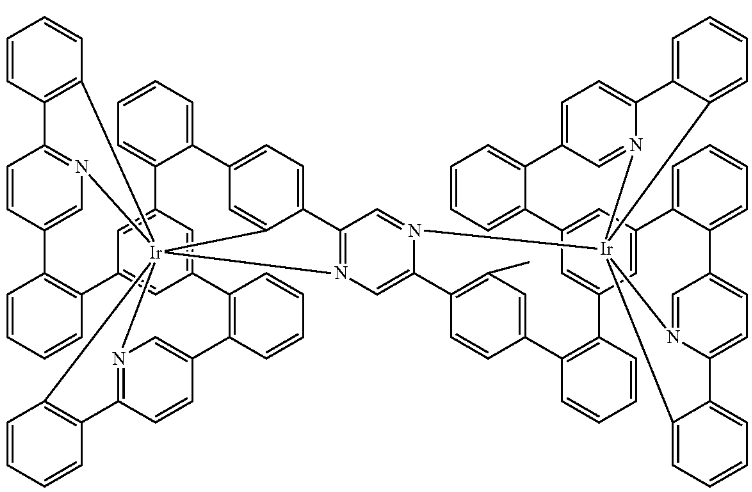 I1-$Ir_2$(L33) 250° C.; 2 h Hot extraction: o-xylene | 30% |
| I2-$Ir_2$ (L33) | L33 | I2-$Ir_2$(L33) Hot extraction: o-xylene | 24% |

-continued
| Ex. | Starting material | Product/reaction conditions/hot extractant (HE) | Yield* |
|---|---|---|---|
| I1-$Ir_2$ (L34) | L34 | 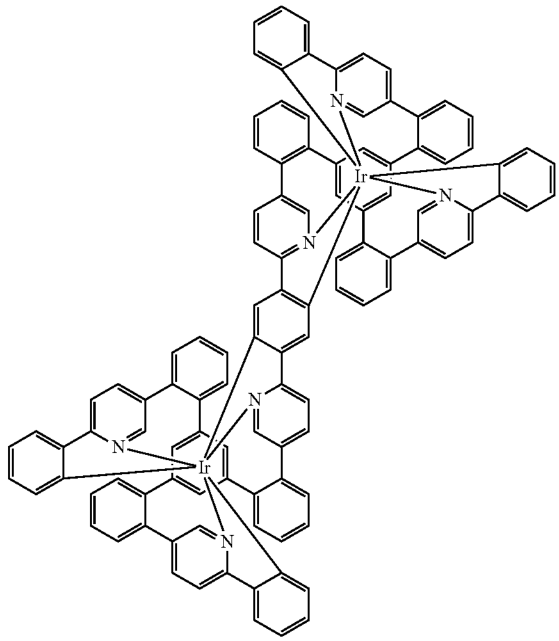 I1-$Ir_2$(L34) 270° C.; 3 h Hot extraction: toluene | 26% |
| I2-$Ir_2$ (L34) | L34 | I2-$Ir_2$(L34) Hot extraction: p-xylene | 28% |
| I1-$Ir_2$ (L35) | L35 | 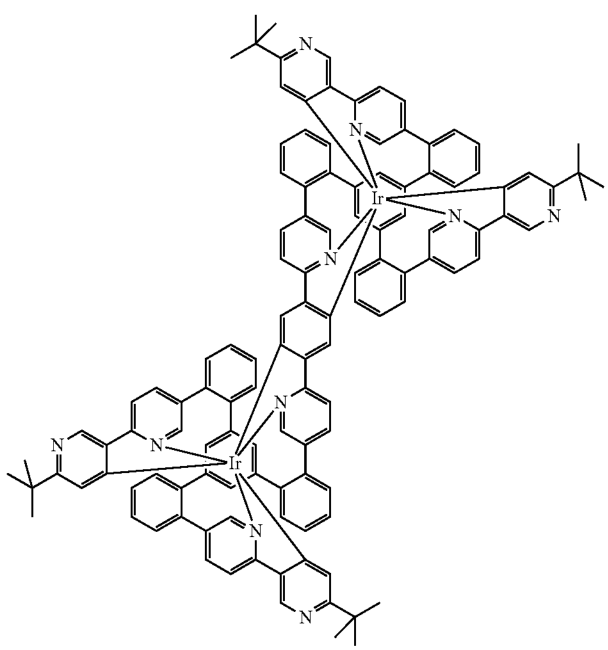 I1-$Ir_2$(L35) 270° C.; 3 h Hot extraction: n-butyl acetate | 29% |
| I2-$Ir_2$ (L35) | L35 | I2-$Ir_2$(L35) Hot extraction: n-butyl acetate | 29% |

-continued
| Ex. | Starting material | Product/reaction conditions/hot extractant (HE) | Yield* |
|---|---|---|---|
| I1-$Ir_2$ (L36) | L36 | 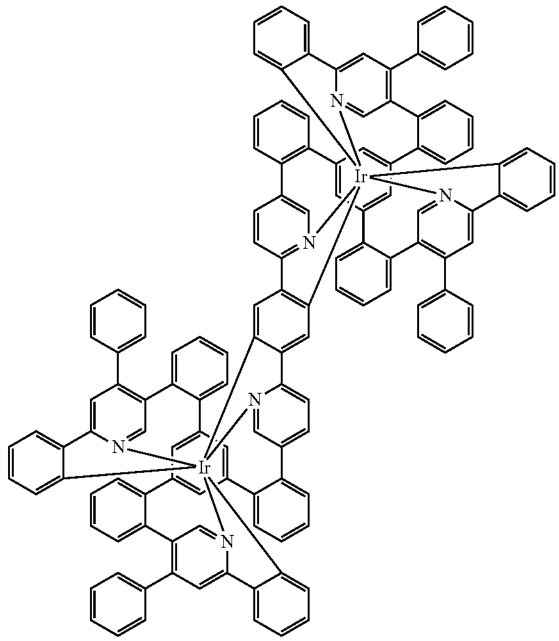 I1-$Ir_2$(L36) 270° C.; 3 h Hot extraction: toluene | 33% |
| I2-$Ir_2$ (L36) | L36 | I2-$Ir_2$(L36) Hot extraction: toluene | 31% |
| I1-$Ir_2$ (L37) + I2-$Ir_2$ (L37) | L37 | 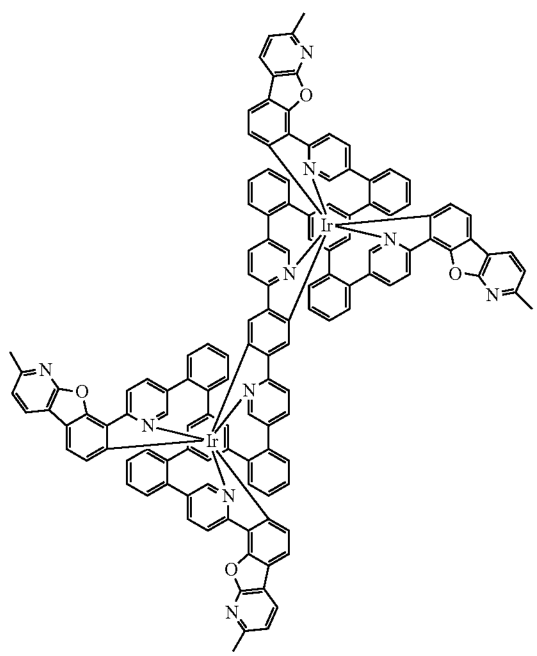 I1-$Ir_2$(L37) + I2-$Ir_2$(L37) 270° C.; 4 h Column: separation not possible, employed as isomer mixture. Hot extraction: xylene | 60% |

-continued
| Ex. | Starting material | Product/reaction conditions/hot extractant (HE) | Yield* |
|---|---|---|---|
| I1-$Ir_2$ (L38) | L38 | 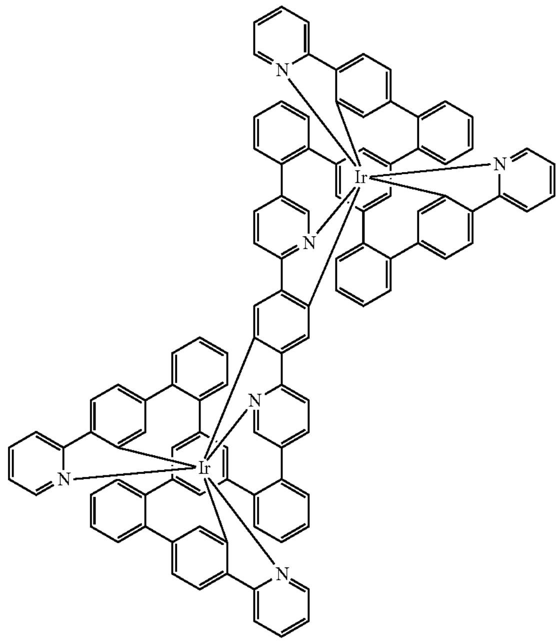 I1-$Ir_2$(L38) 270° C.; 3 h Hot extraction: toluene | 30% |
| I2-$Ir_2$ (L38) | L38 | I2-$Ir_2$(L38) Hot extraction: dichloromethane | 26% |
| I1-$Ir_2$ (L39) | L39 | 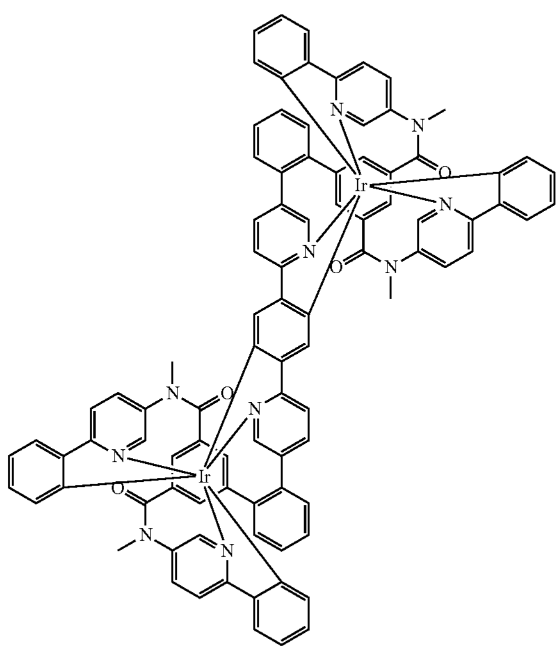 I1-$Ir_2$(L39) 260° C.; 3 h Recrystallisation from DMF | 32% |
| I2-$Ir_2$ (L39) | L39 | I2-$Ir_2$(L39) Recrystallisation from DMF | 24% |

-continued
| Ex. | Starting material | Product/reaction conditions/hot extractant (HE) | Yield* |
|---|---|---|---|
| I1-$Ir_2$ (L40) | L40 | 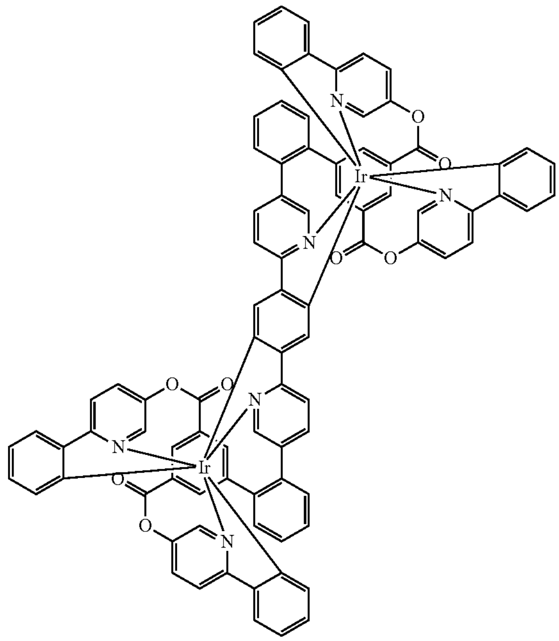<br>I1-$Ir_2$(L40)<br>250° C.; 3 h<br>Recrystallisation from DMSO | 22% |
| I2-$Ir_2$ (L40) | L40 | I2-$Ir_2$(L40)<br>Hot extraction: ethyl acetate | 30% |
| I1-$Ir_2$ (L41) | L41 | 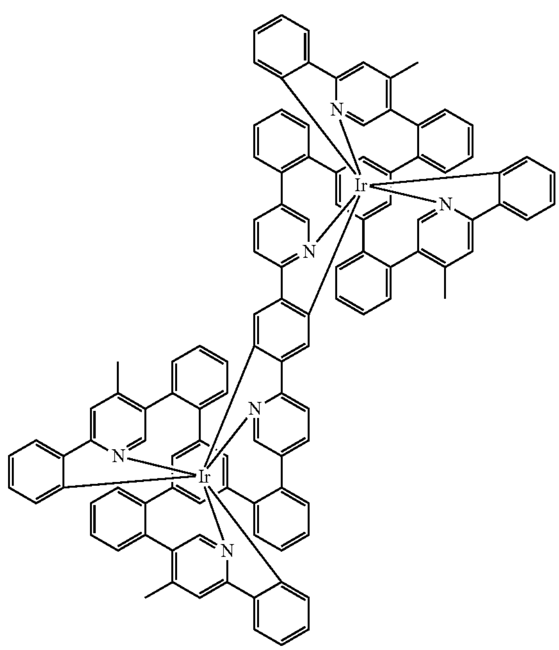<br>I1-$Ir_2$(L41)<br>270° C.; 2 h<br>Hot extraction: toluene | 27% |
| I2-$Ir_2$ (L41) | L41 | I2-$Ir_2$(L41)<br>Hot extraction: n-butyl acetate | 32% |

-continued
| Ex. | Starting material | Product/reaction conditions/hot extractant (HE) | Yield* |
|---|---|---|---|
| I1-$Ir_2$ (L42) | L42 | 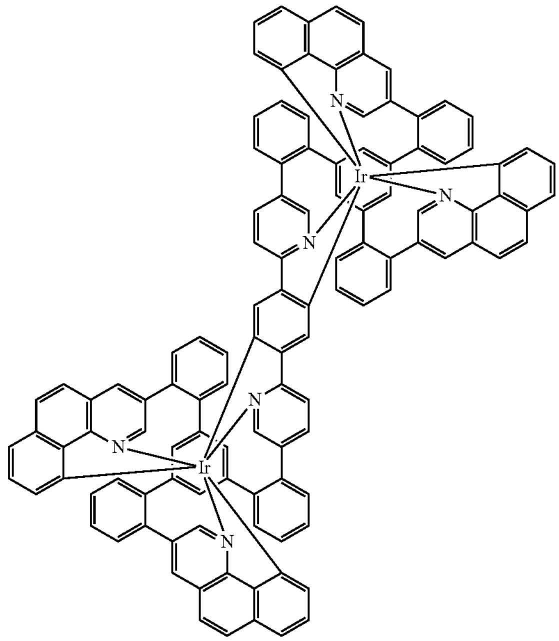 I1-$Ir_2$(L42) 270° C.; 6 h Hot extraction: o-xylene | 30% |
| I2-$Ir_2$ (L42) | L42 | I2-$Ir_2$(L42) Hot extraction: o-xylene | 35% |
| I1-$Ir_2$ (L43) | L43 | 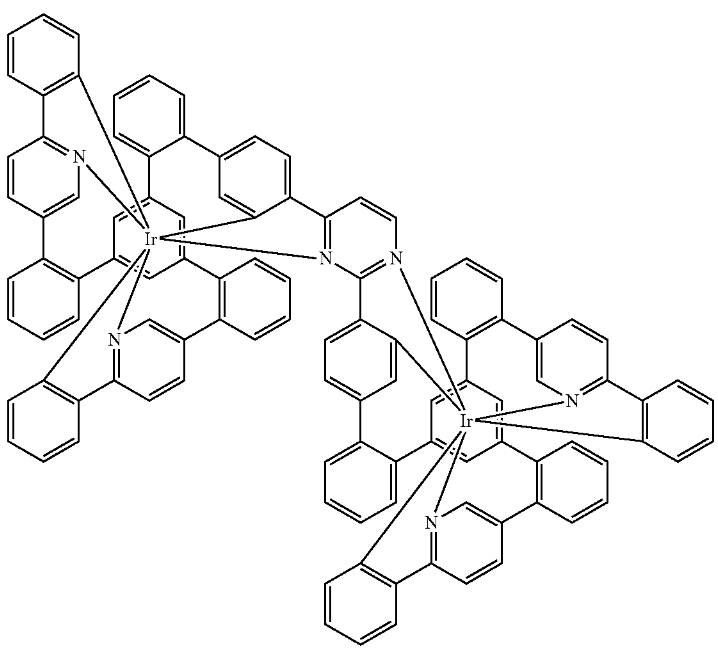 I1-$Ir_2$(L43) 260° C.; 2 h Hot extraction: butyl acetate | 30% |
| I2-$Ir_2$ (L43) | L43 | I2-$Ir_2$(L43) Hot extraction: toluene | 28% |

-continued
| Ex. | Starting material | Product/reaction conditions/hot extractant (HE) | Yield* |
|---|---|---|---|
| I1-$Ir_2$ (L44) | L44 | 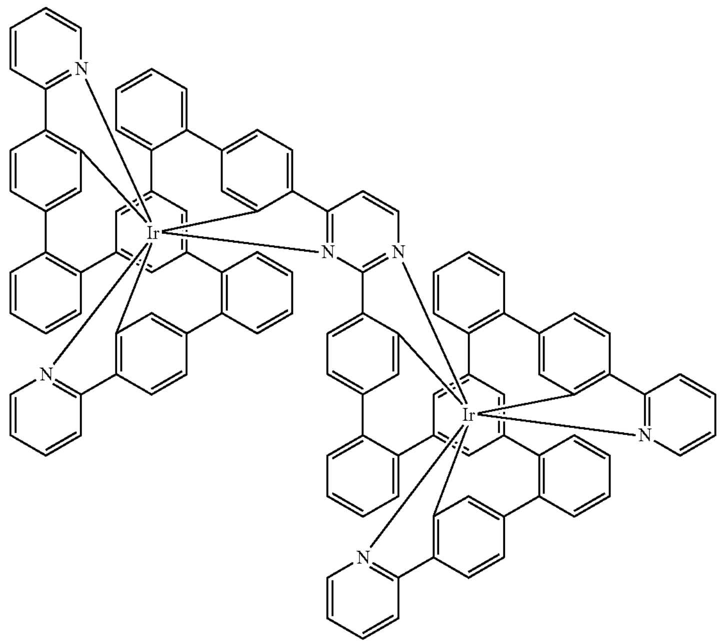 I1-$Ir_2$(L44) 260° C.; 2 h Hot extraction: toluene | 27% |
| I2-$Ir_2$ (L44) | L44 | I2-$Ir_2$(L44) Hot extraction: toluene | 33% |
| I1-$Ir_2$ (L45) | L45 | 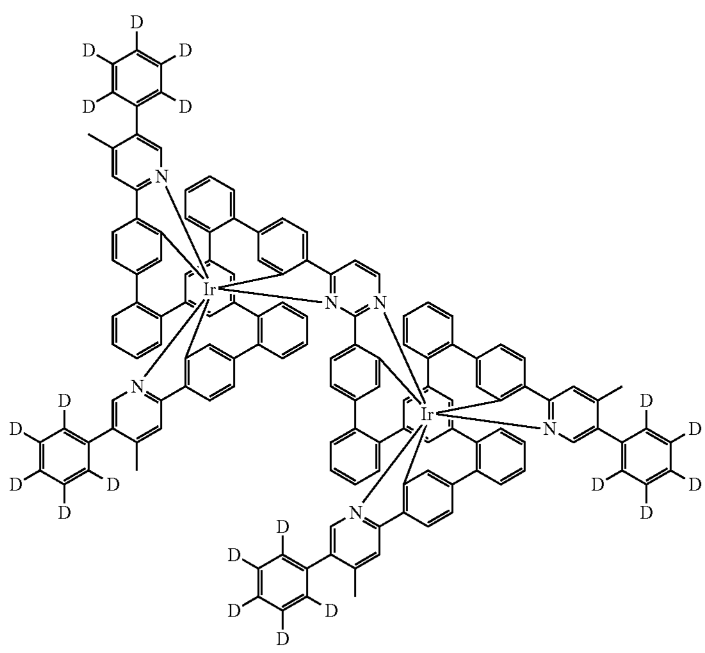 I1-$Ir_2$(L45) 260° C.; 2 h Hot extraction: ethyl acetate | 27% |
| I2-$Ir_2$ (L45) | L45 | I2-$Ir_2$(L45) Hot extraction: n-butyl acetate | 28% |

-continued
| Ex. | Starting material | Product/reaction conditions/hot extractant (HE) | Yield* |
|---|---|---|---|
| I1-$Ir_2$ (L46) | L46 | 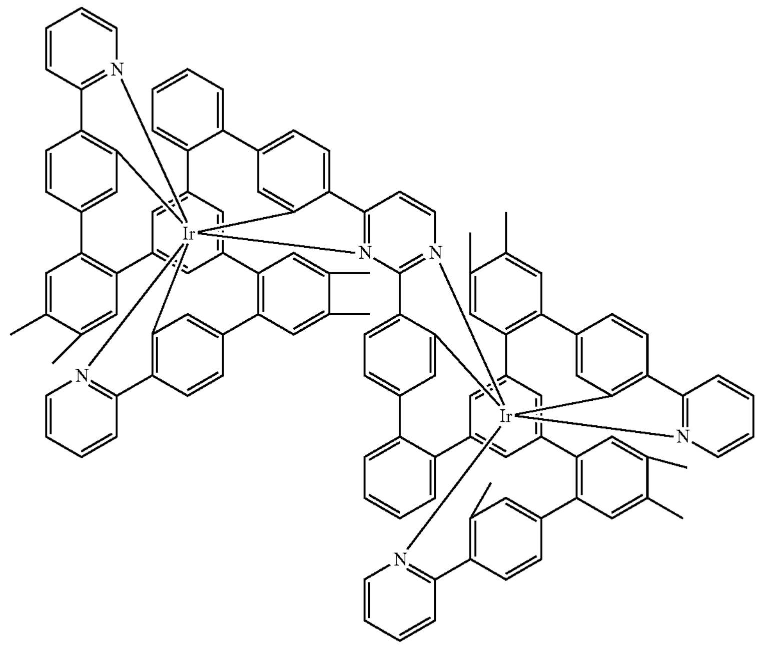 I1-$Ir_2$(L46) 260° C.; 2 h Hot extraction: ethyl acetate | 32% |
| I2-$Ir_2$ (L46) | L46 | I2-$Ir_2$(L46) Hot extraction: ethyl acetate | 26% |
| I1-$Ir_2$ (L47) | L47 | 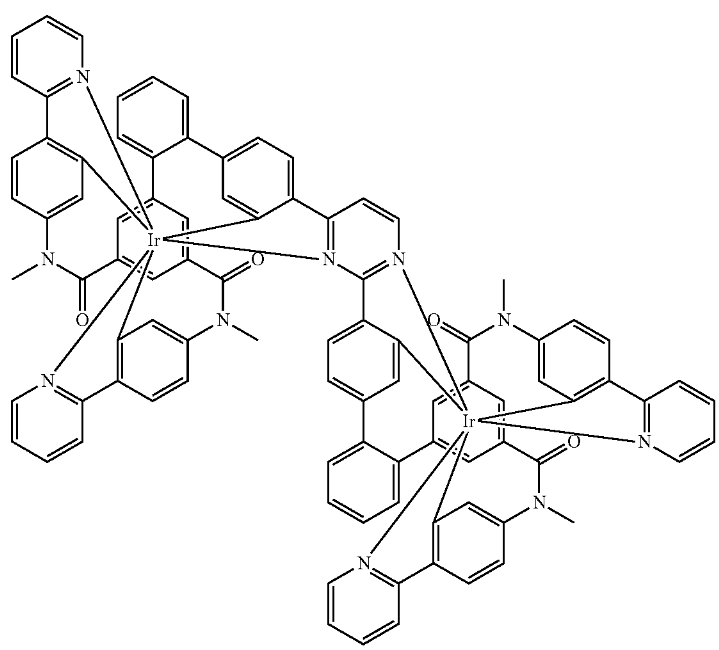 I1-$Ir_2$(L47) 250° C.; 2 h Recrystallisation: DMF | 25% |
| I2-$Ir_2$ (L47) | L47 | I2-$Ir_2$(L47) Recrystallisation: DMF | 28% |

-continued
| Ex. | Starting material | Product/reaction conditions/hot extractant (HE) | Yield* |
|---|---|---|---|
| I1-$Ir_2$ (L48) | L48 | 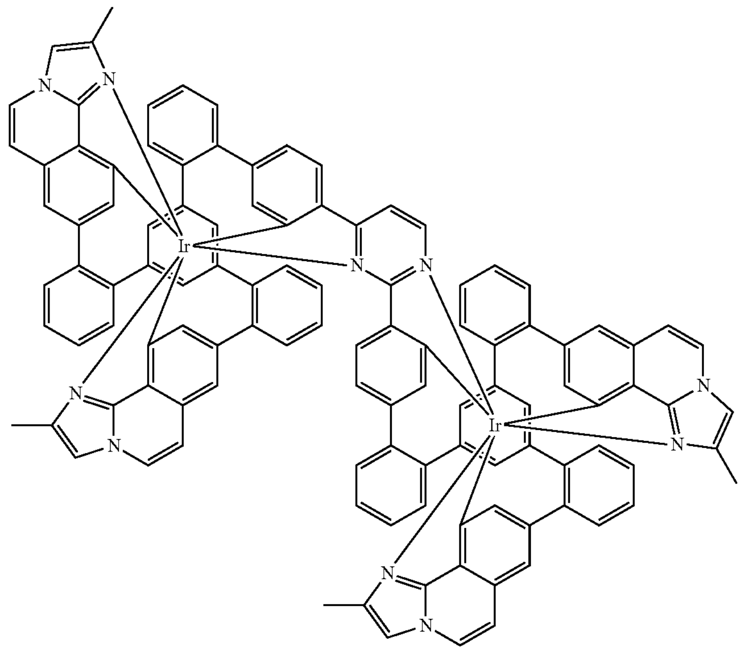 I1-$Ir_2$(L48) 270° C.; 2 h Hot extraction: butyl acetate | 23% |
| I2-$Ir_2$ (L48) | L48 | I2-$Ir_2$(L48) Hot extraction: ethyl acetate | 21% |
| I1-$Ir_2$ (L49) | L49 | 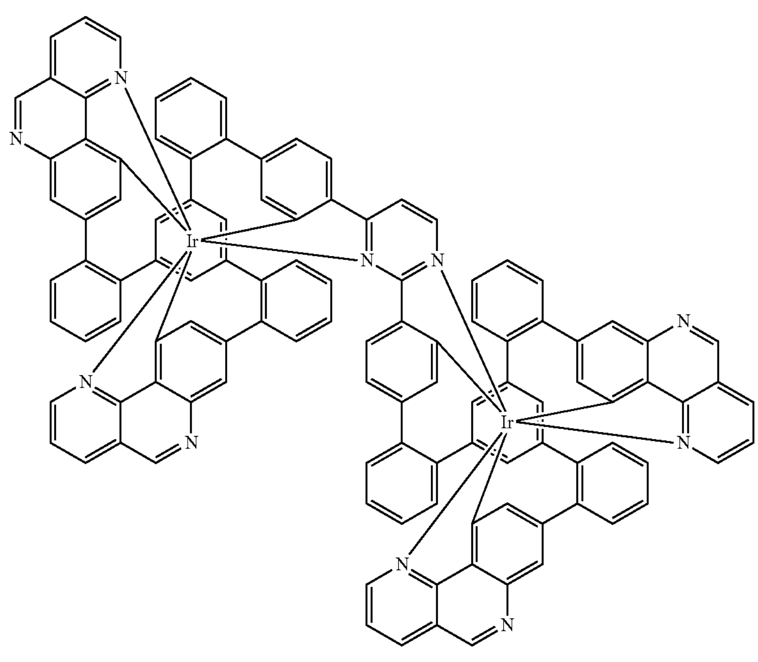 I1-$Ir_2$(L49) 270° C.; 2 h Hot extraction: o-xylene | 32% |
| I2-$Ir_2$ (L49) | L49 | I2-$Ir_2$(L49) Hot extraction: toluene | 30% |

-continued
| Ex. | Starting material | Product/reaction conditions/hot extractant (HE) | Yield* |
|---|---|---|---|
| I1-$Ir_2$ (L50) | L50 | 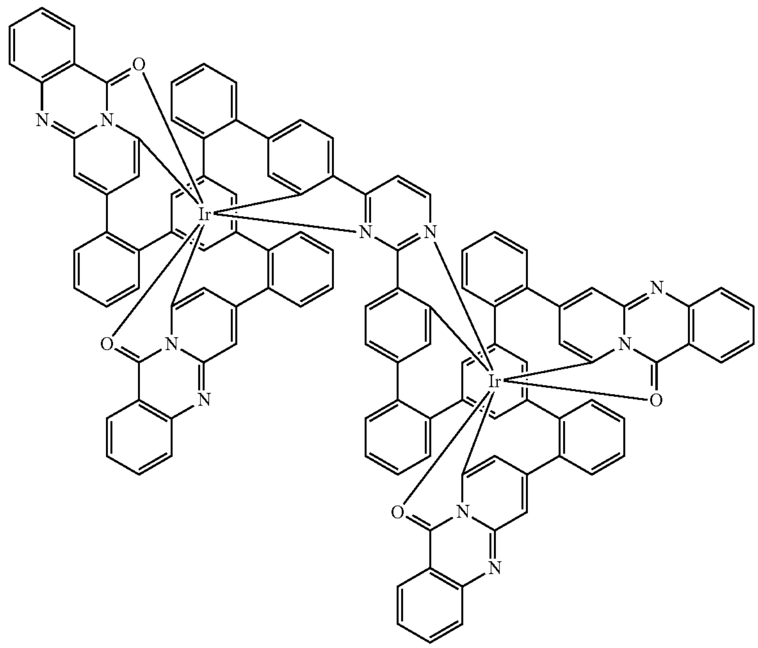<br>I1-$Ir_2$(L50)<br>240° C.; 2 h<br>Hot extraction: ethyl acetate/acetonitrile 1:1 | 27% |
| I2-$Ir_2$ (L50) | L50 | I2-$Ir_2$(L50)<br>Hot extraction: ethyl acetate/acetonitrile 1:1 | 25% |
| I1-$Ir_2$ (L51) | L51 | 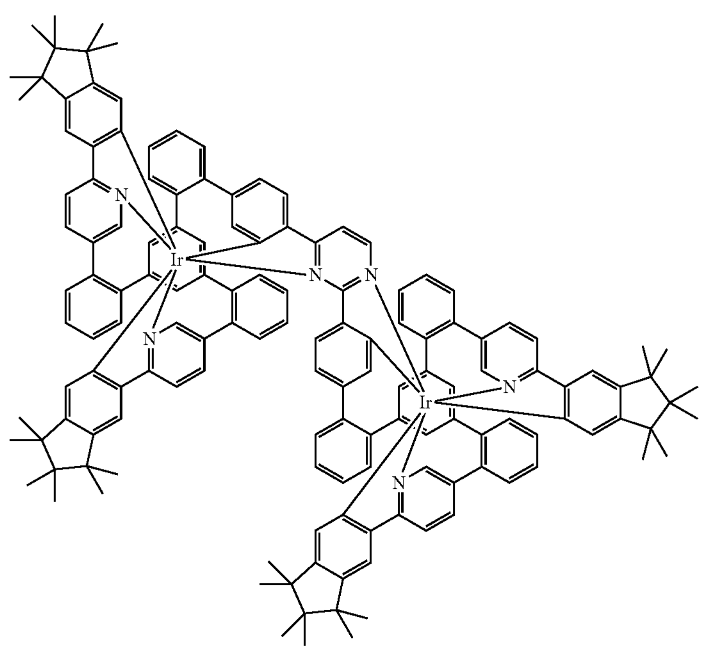<br>I1-$Ir_2$(L51)<br>260° C.; 2 h<br>Hot extraction: cyclohexane | 24% |
| I2-$Ir_2$ (L51) | L51 | I2-$Ir_2$(L51)<br>Hot extraction: cyclohexane | 23% |

-continued
| Ex. | Starting material | Product/reaction conditions/hot extractant (HE) | Yield* |
|---|---|---|---|
| $Ir_3$ (L52) | L52 | 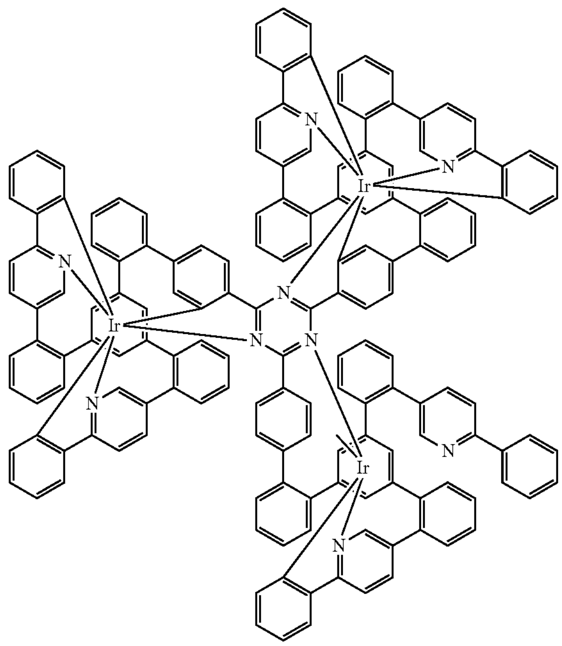<br>$Ir_2$(L52)<br>3 equiv. of $Ir(acac)_3$, 260° C.; 7 h<br>Only the racemate of ΛΛΛ and ΔΔΔ isomers forms<br>Hot extraction: toluene | 33% |
| $Ir_3$ (L53) | L53 | 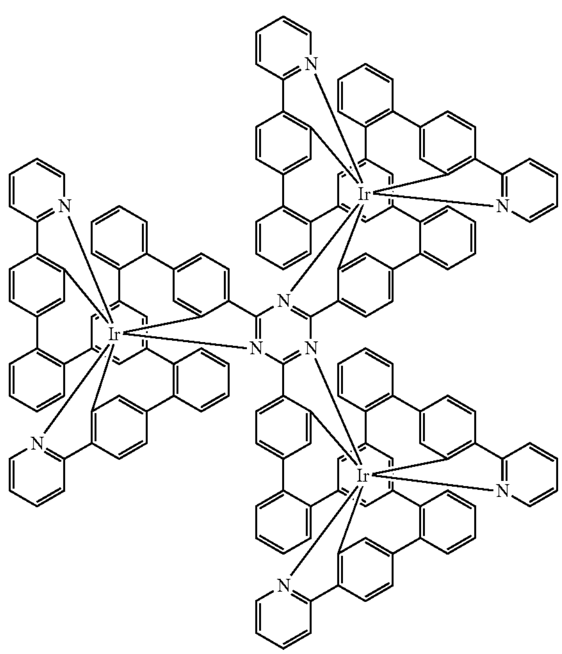<br>$Ir_2$(L53)<br>3 equiv. of $Ir(acac)_3$, 260° C.; 7 h<br>Hot extraction: o-xylene<br>Only the racemate of ΛΛΛ and ΔΔΔ isomers forms. | 30% |

-continued
| Ex. | Starting material | Product/reaction conditions/hot extractant (HE) | Yield* |
|---|---|---|---|
| $Ir_3$ (L54) | L54 | 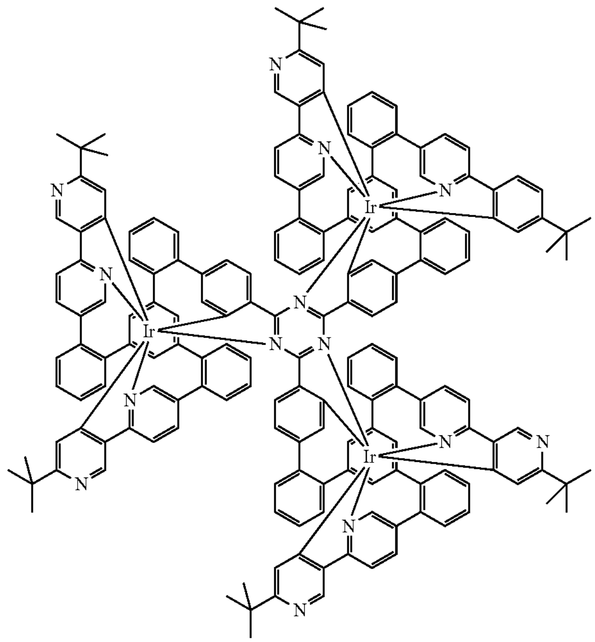<br>$Ir_2$(L54)<br>3 equiv. of $Ir(acac)_3$, 270° C.; 6 h<br>Hot extraction: n-butyl acetate<br>Only the racemate of ΛΛΛ and ΔΔΔ isomers forms. | 29% |
| $Ir_3$ (L55) | L55 | 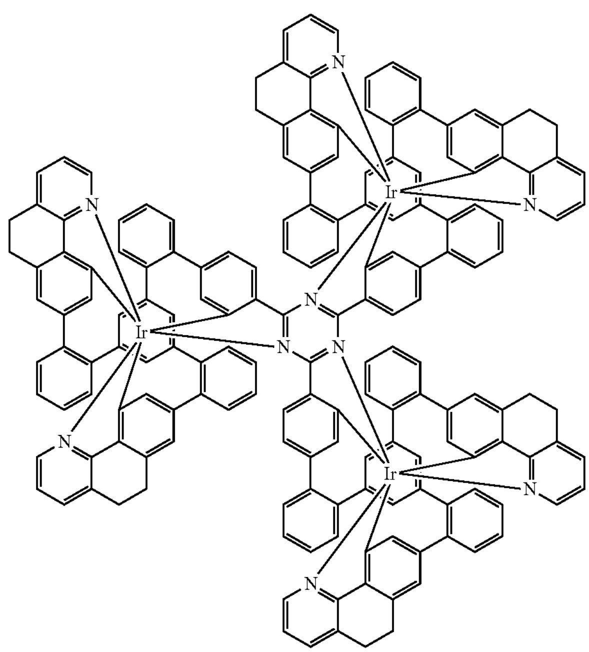<br>$Ir_2$(L55)<br>3 equiv. of $Ir(acac)_3$, 270° C.; 6 h<br>Hot extraction: p-xylene<br>Only the racemate of ΛΛΛ and ΔΔΔ isomers forms. | 28% |

-continued
| Ex. | Starting material | Product/reaction conditions/hot extractant (HE) | Yield* |
| --- | --- | --- | --- |
| $Ir_3$ (L56) | L56 | 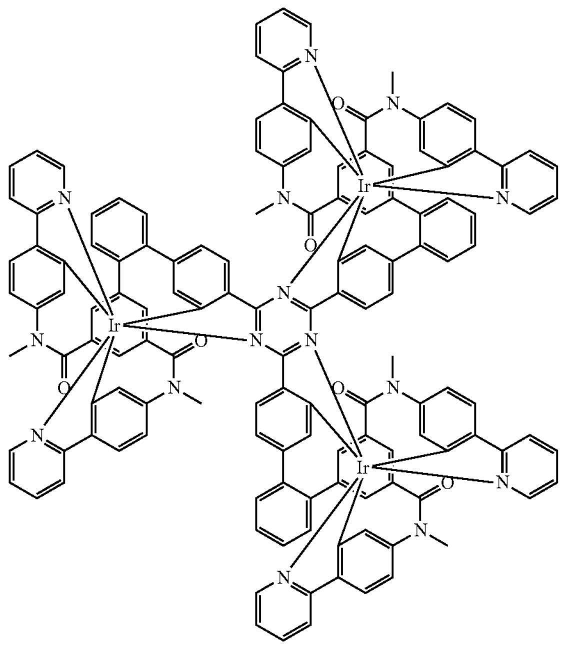<br>$Ir_2$(L56)<br>3 equiv. of $Ir(acac)_3$, 265° C.; 6 h<br>Recrystallisation: dimethylacetamide<br>Only the racemate of ΛΛΛ and ΔΔΔ isomers forms. | 26% |
| $Ir_3$ (L57) | L57 | 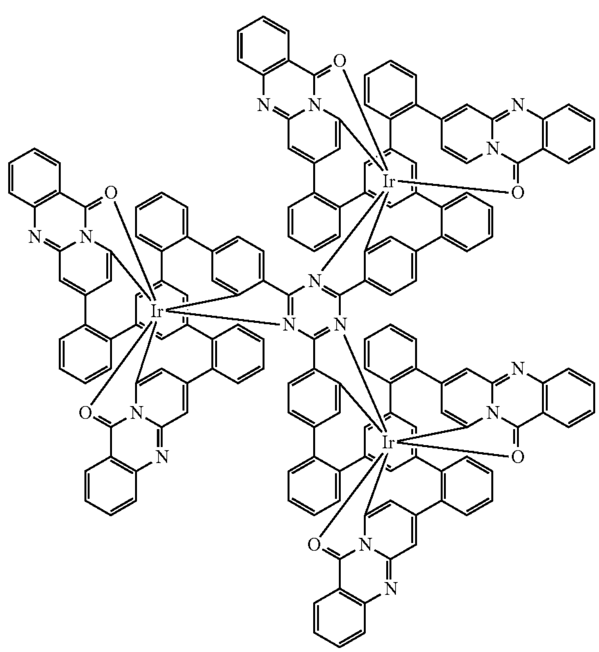<br>$Ir_2$(L57)<br>3 equiv. of $Ir(acac)_3$, 245° C.; 6 h<br>Hot extraction: n-butyl acetate<br>Only the racemate of ΛΛΛ and ΔΔΔ isomers forms. | 33% |

-continued
| Ex. | Starting material | Product/reaction conditions/hot extractant (HE) | Yield* |
|---|---|---|---|
| I1-$Ir_2$ (L58) | L58 | 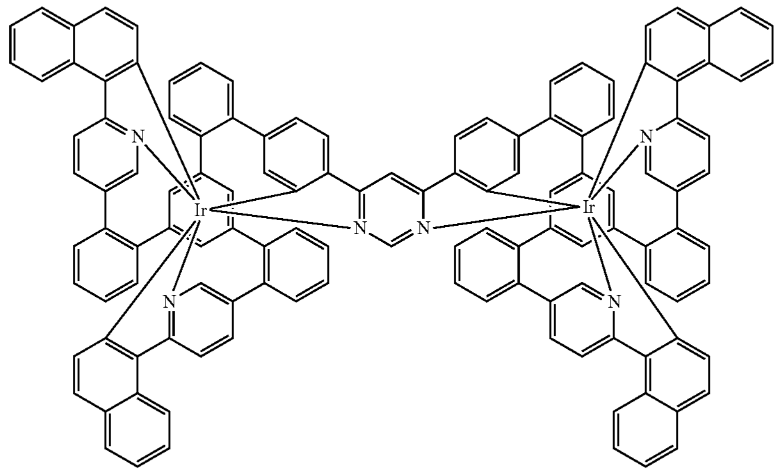 I1-$Ir_2$(L58) 250° C., 2 h Hot extraction: toluene | 24% |
| I2-$Ir_2$ (L58) | L58 | I2-$Ir_2$(L58) Hot extraction: toluene | 27% |
| $Ir_2$ (L59) | L59 | 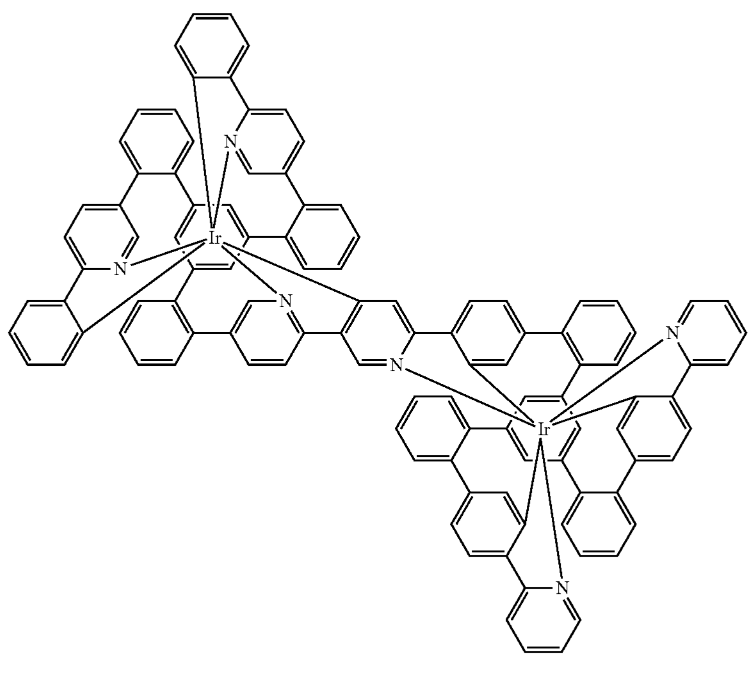 $Ir_2$(L59) 265° C., 4 h A mixture of 8 isomers forms, which is not separated, but instead is used as a mixture. Hot extraction: toluene | 52% |

-continued
| Ex. | Starting material | Product/reaction conditions/hot extractant (HE) | Yield* |
|---|---|---|---|
| $Ir_2$ (L60) | L60 | 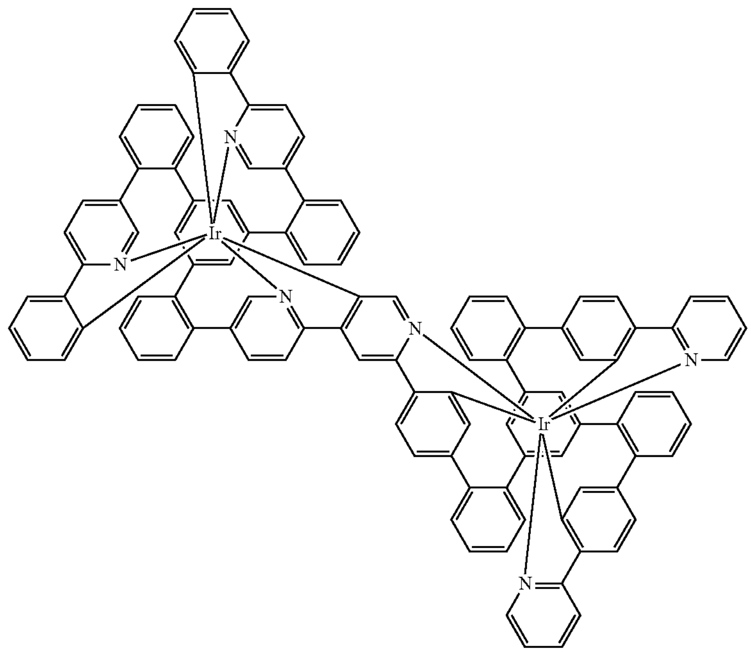 $Ir_2$(L60) 260° C., 4 h A mixture of 8 isomers forms, which is not separated, but instead is used further as a mixture Hot extraction: ethyl acetate | 29% |
| $Ir_2$ (L61) | L61 | 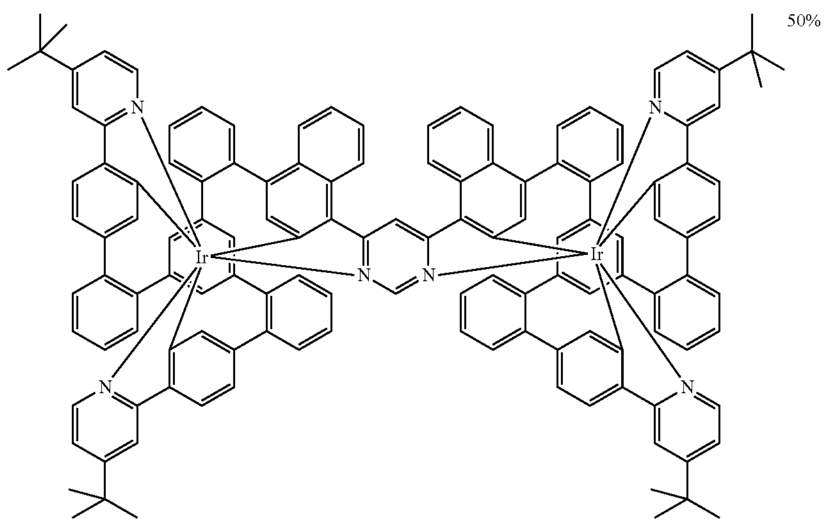 $Ir_2$(L61) 250° C., 8 h The steric reasons, only the enantiomer pair of ΔΔ and ΛΛ forms. | 50% |

-continued
| Ex. | Starting material | Product/reaction conditions/hot extractant (HE) | Yield* |
|---|---|---|---|
| I1-$Ir_2$ (L62) | L62 | 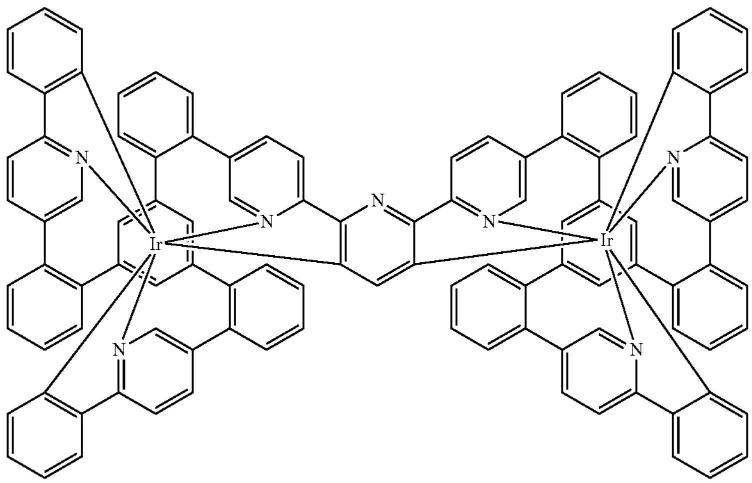<br>I1-$Ir_2$(L62)<br>265° C., 6 h<br>Hot extraction: dichloromethane | 24% |
| I1-$Ir_2$ (L62) | L62 | I2-$Ir_2$(L62)<br>Hot extraction: dichloromethane | 26% |
| I1-$Ir_2$ (L63) | L63 | 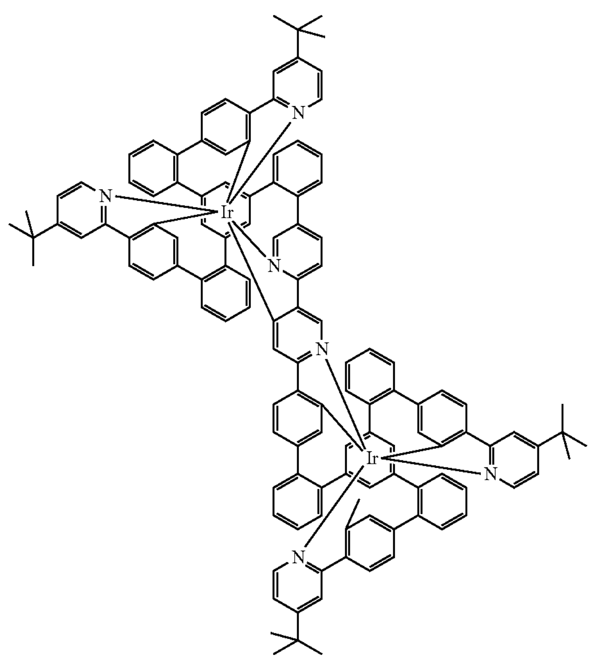<br>I1-$Ir_2$(L63)<br>260° C., 4 h<br>Hot extraction: ethyl acetate | 30% |

-continued
| Ex. | Starting material | Product/reaction conditions/hot extractant (HE) | Yield* |
|---|---|---|---|
| I2-$Ir_2$ (L63) | L63 | 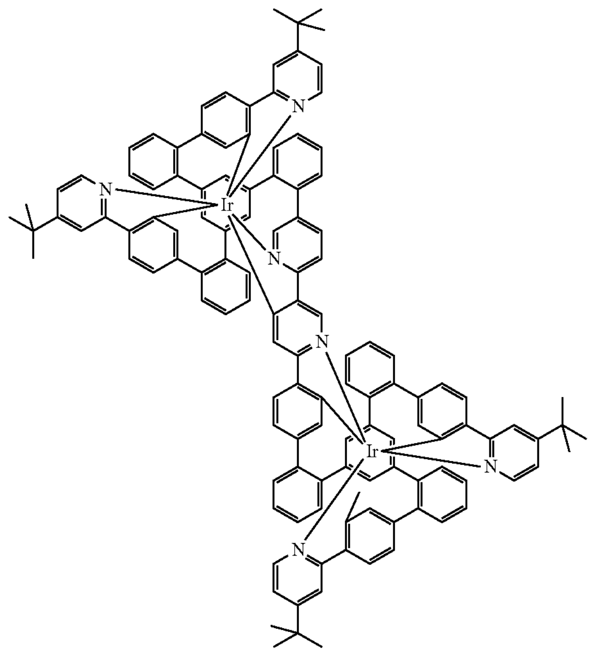 I2-$Ir_2$(L63) Hot extraction: toluene | 28% |
| I1-$Ir_2$ (L64) | L64 | 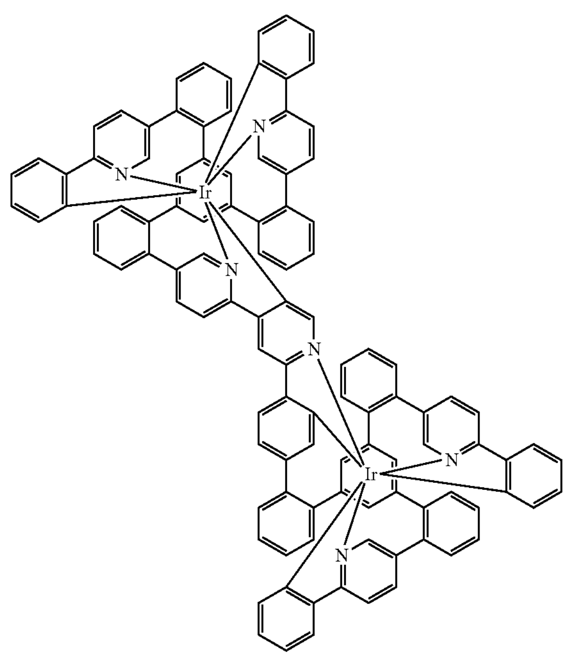 I1-$Ir_2$(L64) 260° C., 4 h Hot extraction: toluene | 25% |
| I2-$Ir_2$ (L64) | L64 | I2-$Ir_2$(L64) Hot extraction: toluene | 26% |

-continued
| Ex. | Starting material | Product/reaction conditions/hot extractant (HE) | Yield* |
|---|---|---|---|
| $Ir_2$ (L65) | L65 | 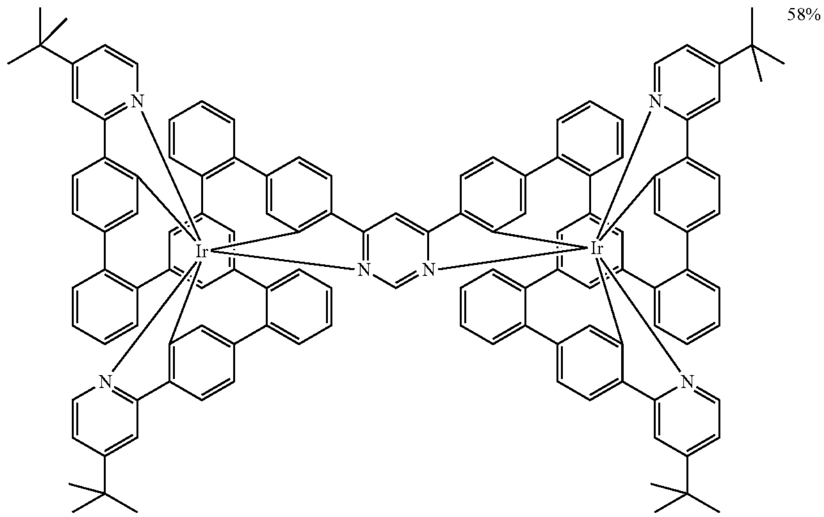 $Ir_2$(L65)<br>250° C., 2 h<br>Hot extraction: ethyl acetate<br>For steric reasons, only the ΔΔ and ΛΛ enantiomer pair forms. | 58% |
| I1-$Ir_2$ (L66) | L66 | 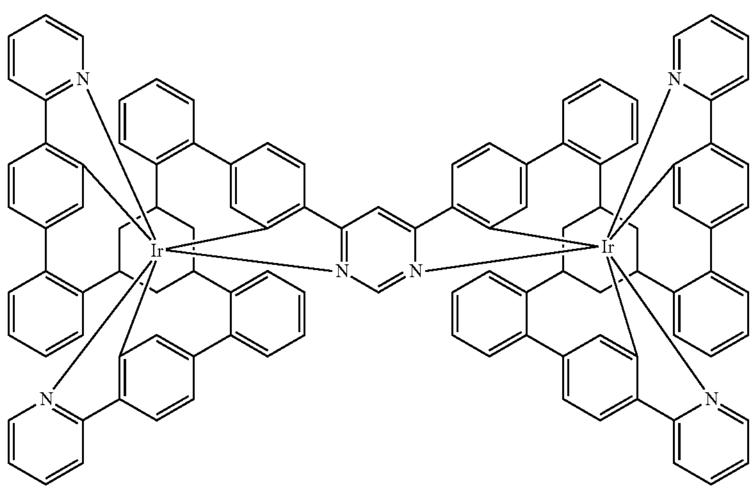 I1-$Ir_2$(L66)<br>250° C., 2 h<br>Hot extraction: toluene | 25% |
| I1-$Ir_2$ (L66) | L66 | I2-$Ir_2$(L66)<br>Hot extraction: toluene | 25% |

-continued
| Ex. | Starting material | Product/reaction conditions/hot extractant (HE) | Yield* |
|---|---|---|---|
| I1-$Ir_2$ (L67) | L67 | 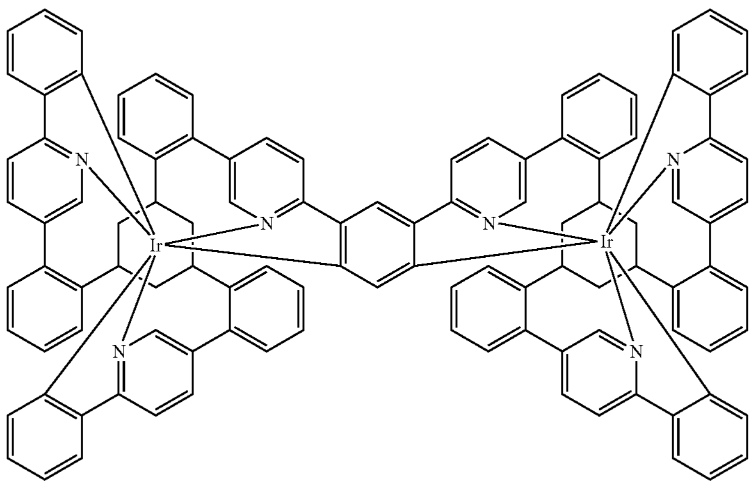 I1-$Ir_2$(L67) 250° C., 2 h Hot extraction: ethyl acetate | 23% |
| I2-$Ir_2$ (L67) | L67 | I2-$Ir_2$(L67) Hot extraction: n-butyl acetate | 24% |
| I1-$Ir_2$ (L68) | L68 | 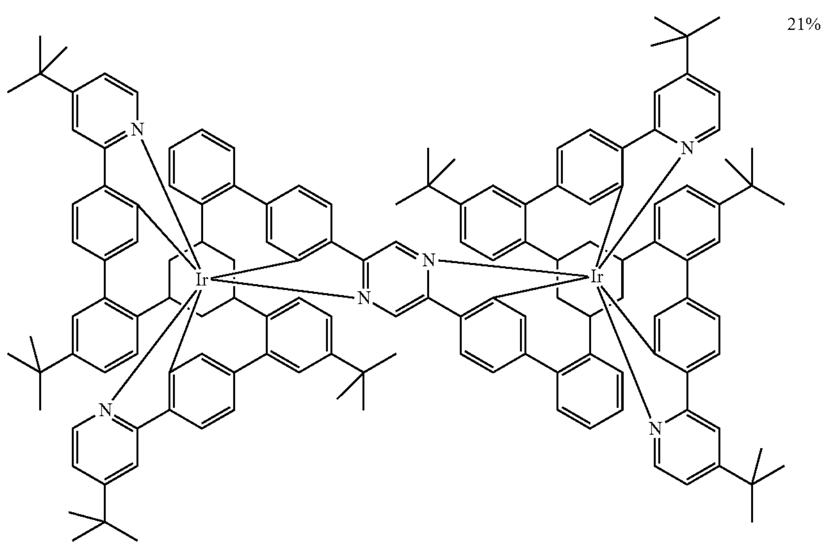 I1-$Ir_2$(L68) 250° C., 2 h Hot extraction: ethyl acetate | 21% |
| I2-$Ir_2$ (L68) | L68 | I2-$Ir_2$(L68) Hot extraction: ethyl acetate | 24% |

-continued
| Ex. | Starting material | Product/reaction conditions/hot extractant (HE) | Yield* |
|---|---|---|---|
| $Ir_3$ (L69) | L69 | 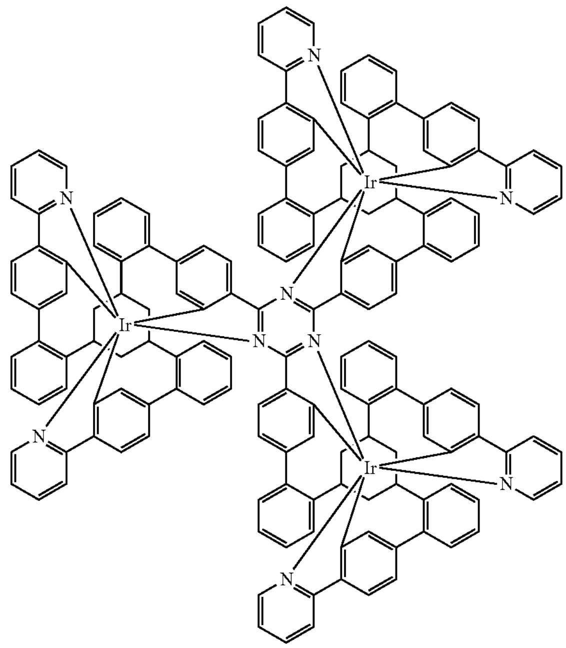<br>$Ir_2$(L69)<br>3 equiv. of $Ir(acac)_3$, 260° C.; 5 h<br>Hot extraction: toluene<br>Only the racemate of ΛΛΛ and ΔΔΔ isomers forms. | 17% |
| I1-$Ir_2$ (L70) | L70 | 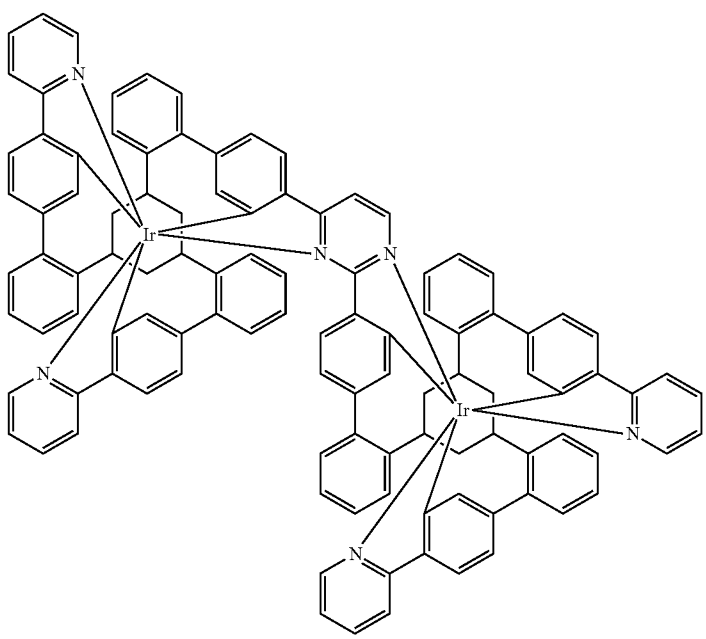<br>I1-$Ir_2$(L70)<br>250° C.; 2 h<br>Hot extraction: ethyl acetate | 26% |
| I2-$Ir_2$ (L70) | L70 | I2-$Ir_2$(L70)<br>Hot extraction: ethyl acetate | 28% |

-continued
| Ex. | Starting material | Product/reaction conditions/hot extractant (HE) | Yield* |
|---|---|---|---|
| I1-$Ir_2$ (L71) | L71 | 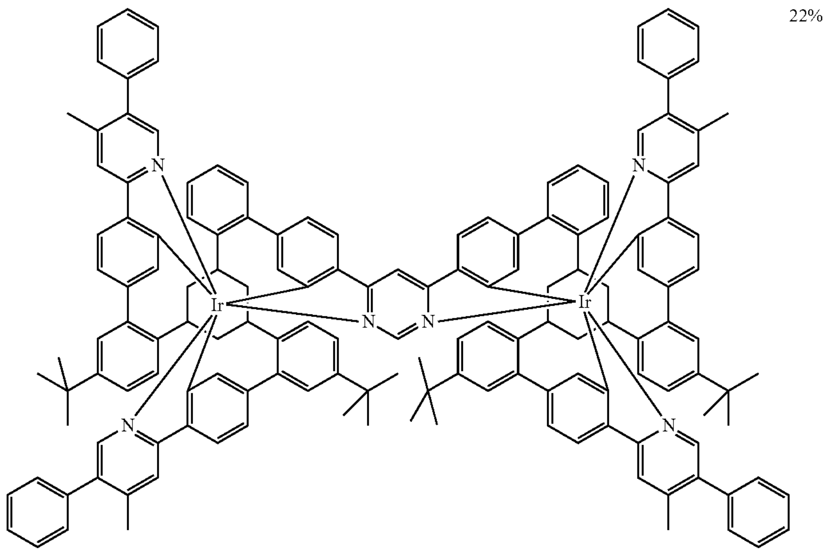 I1-$Ir_2$(L71) 250° C., 2 h Hot extraction: ethyl acetate | 22% |
| I2-$Ir_2$ (L71) | L71 | I2-$Ir_2$(L71) Hot extraction: ethyl acetate/acetonitrile 3:1 | 21% |
| I1-$Ir_2$ (L72) | L72 | 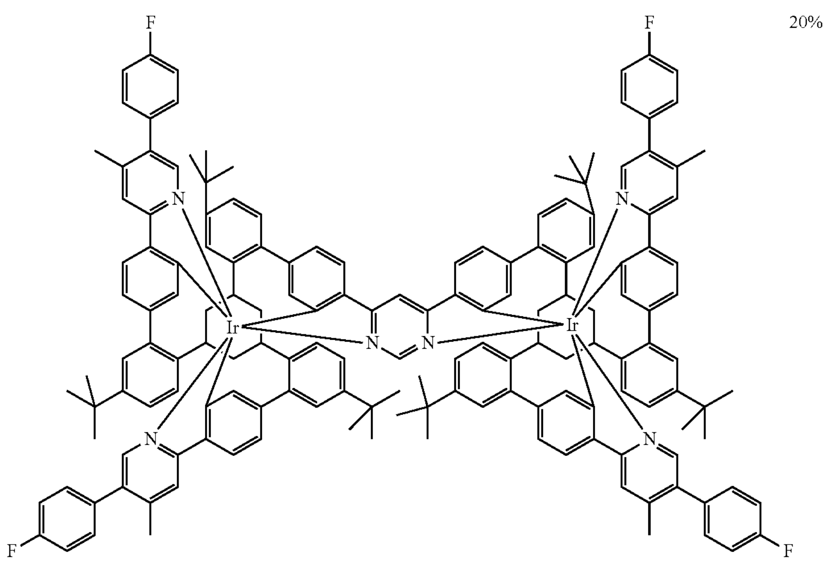 I1-$Ir_2$(L72) 250° C., 2 h Hot extraction: toluene | 20% |
| I2-$Ir_2$ (L72) | L72 | I2-$Ir_2$(L72) Hot extraction: toluene | 25% |

-continued
| Ex. | Starting material | Product/reaction conditions/hot extractant (HE) | Yield* |
|---|---|---|---|
| I1-$Ir_2$ (L73) | L73 | 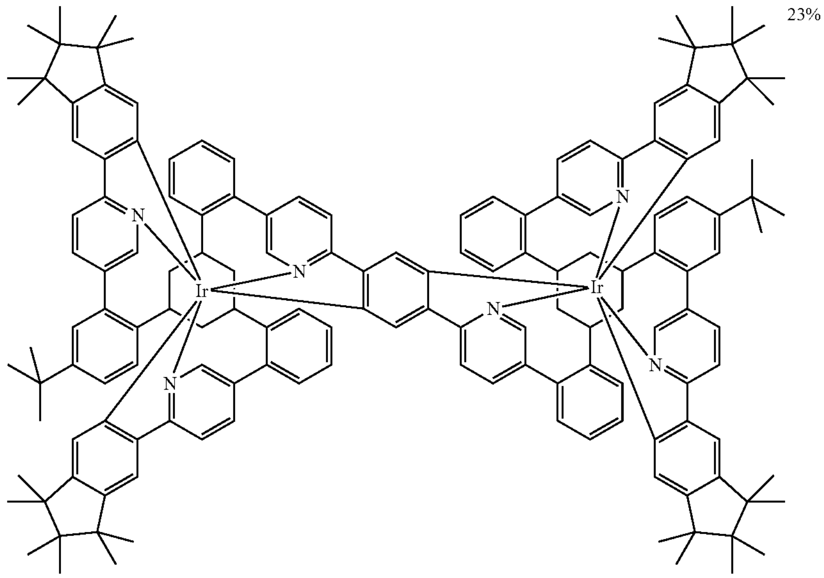 I1-$Ir_2$(L73) 250° C., 2 h Hot extraction: cyclohexane | 23% |
| I2-$Ir_2$ (L73) | L73 | I2-$Ir_2$(L73) Hot extraction: ethyl acetate/acetonitrile 1:1 | 19% |
| I1-$Ir_2$ (L74) | L74 | 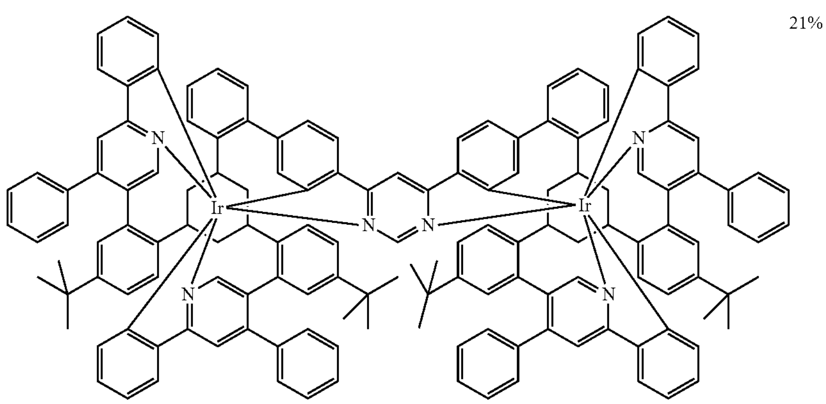 I1-$Ir_2$(L74) 250° C., 2 h Hot extraction: ethyl acetate | 21% |
| I2-$Ir_2$ (L74) | L74 | I2-$Ir_2$(L74) Hot extraction: n-butyl acetate | 24% |

-continued

| Ex. | Starting material | Product/reaction conditions/hot extractant (HE) | Yield* |
|---|---|---|---|
| I1-$Ir_2$ (L75) | L75 | 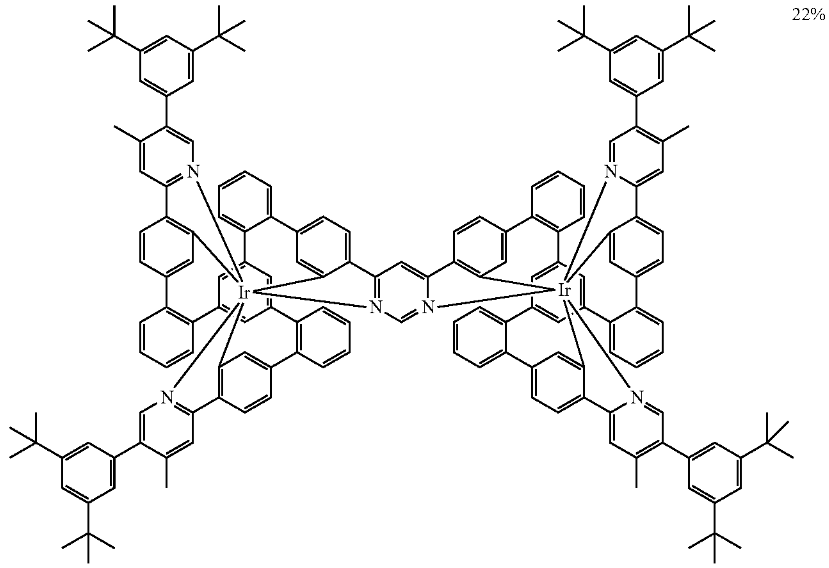 I1-$Ir_2$(L75) 265° C., 4 h Hot extraction: ethyl acetate/acetonitrile 2:1 | 22% |
| I2-$Ir_2$ (L75) | L75 | I2-$Ir_2$(L75) Hot extraction: n-butyl acetate | 16% |
| I1-$Ir_2$ (L76) | L76 | 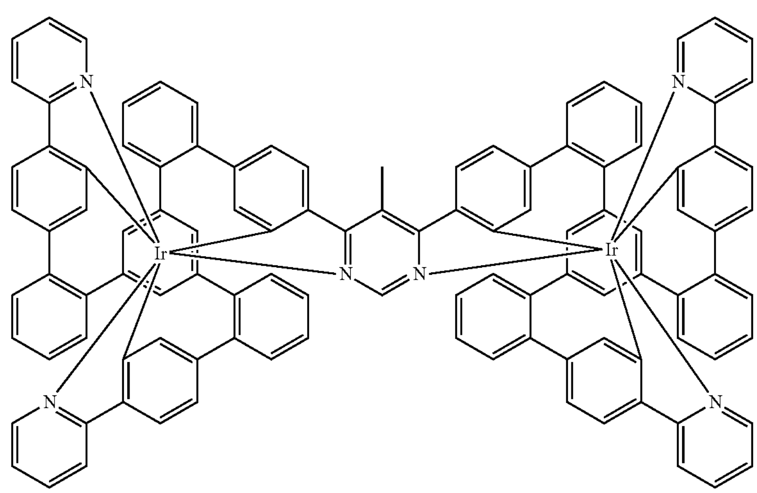 I1-$Ir_2$(L76) 250° C., 3 h Hot extraction: toluene | 21% |
| I2-$Ir_2$ (L76) | L76 | I2-$Ir_2$(L76) Hot extraction: toluene | 19% |

D: Functionalisation of the Metal Complexes

1) Halogenation of the Iridium Complexes:

A solution or suspension of 10 mmol of a complex which carries A×C—H groups (where A=1-6) in the para position to the iridium in 500 ml to 2000 ml of dichloromethane (DCM), depending on the solubility of the metal complex, is mixed with A×10.5 mmol of N-halosuccinimide (halogen: Cl, Br, I) at −30 to +30° C. with exclusion of light and air, and the mixture is stirred for 20 h. Complexes which have low solubility in DCM can also be reacted in other solvents (TCE, THF, DMF, chlorobenzene, etc.) and at elevated temperature. The solvent is subsequently substantially removed in vacuo. The residue is boiled with 100 ml of methanol, the solid is filtered off with suction, washed three times with 30 ml of methanol and dried in vacuo, giving the iridium complexes which are halogenated in the para position to the iridium. Complexes having an HOMO (CV) of about −5.1 to −5.0 eV or lower tend towards oxidation (Ir(III)-Ir(IV)), where the oxidant is bromine, liberated from NBS. This oxidation reaction is evident from a clear green coloration or brown coloration of the otherwise yellow to red solution/suspension of the complexes. In such cases, 1-2 further equivalents of NBS are added. For work-up, 300-500 ml of methanol and 4 ml of hydrazine hydrate as reducing agent are added, causing the green or brown solution/suspension to change colour to yellow or red (reduction Ir(IV)-Ir(III)). The solvent is then substantially stripped off in vacuo, 300 ml of methanol are added, the solid is filtered off with suction, washed three times with 100 ml of methanol each time and dried in vacuo.

Sub-stoichiometric brominations, for example mono- and dibrominations, of complexes having 3 C—H groups in the para position to the iridium usually proceed less selectively than the stoichiometric brominations. The crude products of these brominations can be separated by chromatography (CombiFlash Torrent from A. Semrau).

Synthesis of I1-$Ir_2$(L1-6Br)

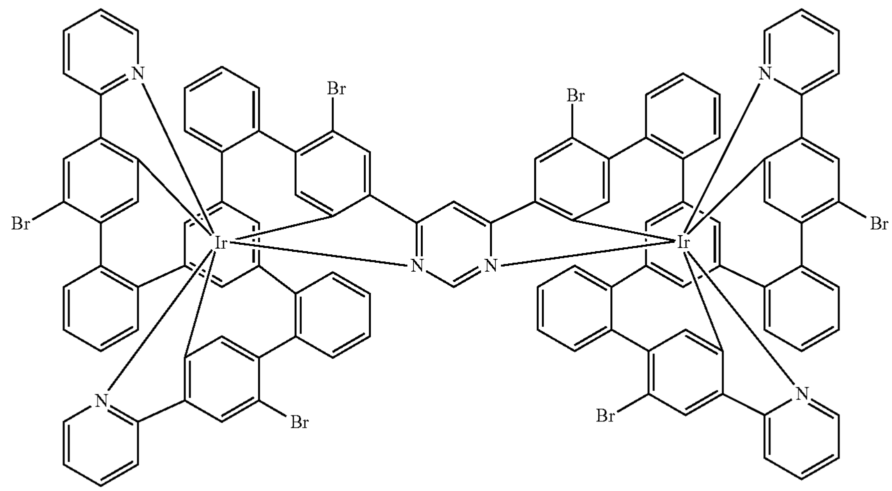

8.9 g (80 mmol) of N-bromosuccinimide (NBS) are added in one portion to a suspension of 18.3 g (10 mmol) of I1-$Ir_2$(L1) in 2000 ml of DCM, and the mixture is then stirred for 20 h. 4 ml of hydrazine hydrate and subsequently 300 ml of MeOH are added. The dichloromethane is substantially stripped off in vacuo. During removal of the dichloromethane in the rotary evaporator, a red solid precipitates out of the methanol which remains and is filtered off with suction and washed three times with about 50 ml of methanol and dried in vacuo. Yield: 21.9 g (9.5 mmol) 95%; purity: >99.0% according to NMR.

The following compounds can be synthesised analogously

| Ex. | Starting material | Product Amount of halosuccinimide | Yield* |
|---|---|---|---|
| I2-$Ir_2$ (L1-6Br) | I1-$Ir_2$ (L1) | 0.02 equiv. of HBr (aq), 10 equiv. of NBS I2-$Ir_2$(L1-6Br): | 90% |
| I1-$Ir_2$ (L2-6Br) | I1-$Ir_2$ (L2) | 0.02 equiv. of HBr (aq), 8 equiv. of NBS I2-$Ir_2$(L2-6Br) | 92% |
| I2-$Ir_2$ (L2-6Br) | I2-$Ir_2$ (L2) | 0.02 equiv. HBr (aq), 8 equiv. of NBS I2-$Ir_2$(L2-6Br) | 91% |

-continued

| Ex. | Starting material | Product<br>Amount of halosuccinimide | Yield* |
|---|---|---|---|
| I1-Ir$_2$<br>(L3-6Br) | I1-Ir$_2$<br>(L3) | 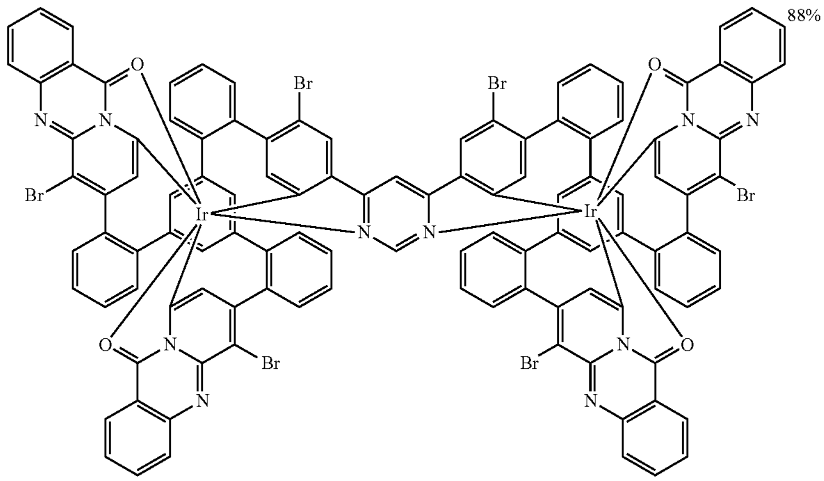<br>I1-Ir$_2$(L3-6Br)<br>6.6 equiv. of NBS | 88% |
| I2-Ir$_2$<br>(L3-6Br) | I2-Ir$_2$<br>(L3) | I2-Ir$_2$(L3-6Br)<br>8 equiv. of NBS | 85% |
| Ir$_2$<br>(L4-6Br) | Ir$_2$<br>(L4) | 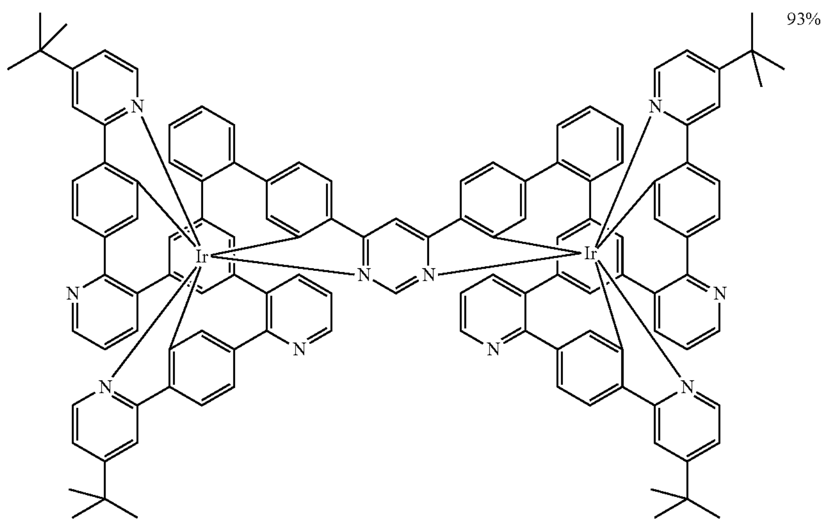<br>Ir$_2$(L4-6Br)<br>8 equiv. of NBS | 93% |
| I1-Ir$_2$<br>(L5-6Br) | I1-Ir$_2$<br>(L5) | I1-Ir$_2$(L5-6Br)<br>6.6 equiv. of NBS | 80% |
| I2-Ir$_2$<br>(L5-6Br) | I2-Ir$_2$<br>(L5) | I2-Ir$_2$(L5-6Br)<br>7.5 equiv. of NBS | 82% |
| I1-Ir$_2$<br>(L6-6Br) | I1-Ir$_2$<br>(L6) | I1-Ir$_2$(L6-6Br)<br>6.6 equiv. of NBS | 81% |
| I2-Ir$_2$<br>(L6-6Br) | I2-Ir$_2$<br>(L6) | I2-Ir$_2$(L6-6Br)<br>8 equiv. of NBS | 77% |
| I1-Ir$_2$<br>(L8-6Br) | I1-Ir$_2$<br>(L8) | I1-Ir$_2$(L8-6Br)<br>8 equiv. of NBS | 78% |
| I2-Ir$_2$<br>(L8-6Br) | I2-Ir$_2$<br>(L8) | I2-Ir$_2$(L8-6Br)<br>0.02 equiv. of HBr (aq), 7 equiv. of NBS | 82% |
| I1-Ir$_2$<br>(L9-6Br) | I1-Ir$_2$<br>(L9) | I1-Ir$_2$(L9-6Br)<br>8 equiv. of NBS | 90% |
| I2-Ir$_2$<br>(L9-6Br) | I2-Ir$_2$<br>(L9) | I2-Ir$_2$(L9-6Br)<br>8 equiv. of NBS | 86% |

-continued

| Ex. | Starting material | Product<br>Amount of halosuccinimide | Yield* |
|---|---|---|---|
| $Ir_2$ (L10-6Br) | $Ir_2$ (L10) | 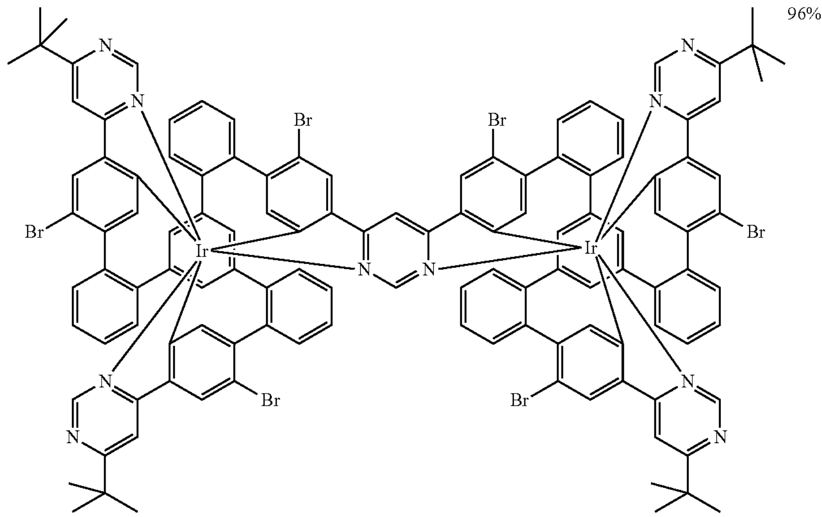<br>$Ir_2$(L10-6Br)<br>6.6 equiv. of NBS | 96%% |
| I1-$Ir_2$ (L11-6Br) | I1-$Ir_2$ (L11) | I1-$Ir_2$(L11-6Br)<br>8 equiv. of NBS | 88% |
| I2-$Ir_2$ (L11-6Br) | I2-$Ir_2$ (L11) | I2-$Ir_2$(L11-6Br)<br>0.02 equiv. of HBr (aq), 7 equiv. of NBS | 88% |
| I1-$Ir_2$ (L12-6Br) | I1-$Ir_2$ (L12) | 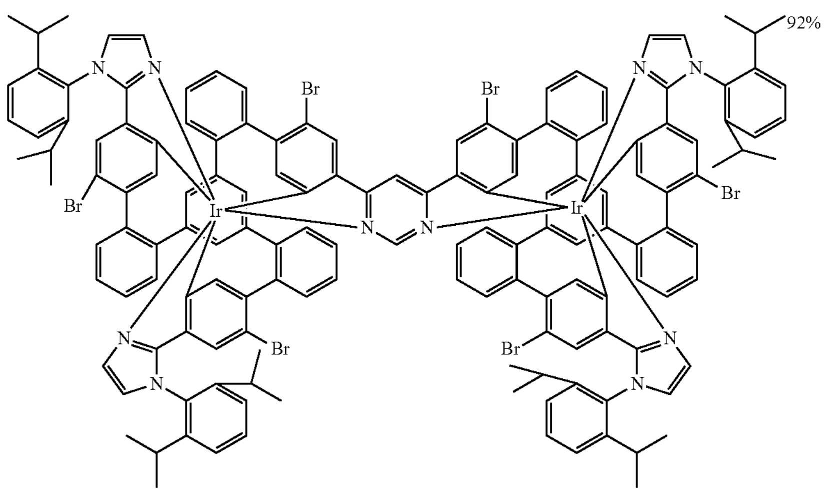<br>I1-$Ir_2$(L12-6Br)<br>8 equiv. of NBS | 92% |
| I2-$Ir_2$ (L12-6Br) | I2-$Ir_2$ (L12) | I2-$Ir_2$(L12-6Br)<br>8 equiv. of NBS | 90% |
| I1-$Ir_2$ (L13-6Br) | I1-$Ir_2$ (L13) | I1-$Ir_2$(L13-6Br)<br>10 equiv. of NBS | 90% |
| I2-$Ir_2$ (L13-6Br) | I2-$Ir_2$ (L13) | I1-$Ir_2$(L13-6Br)<br>0.02 equiv. of HBr (aq), 10 equiv. of NBS | 94% |

-continued
| Ex. | Starting material | Product Amount of halosuccinimide | Yield* |
| --- | --- | --- | --- |
| I1-Ir$_2$ (L15-2Br) | I1-Ir$_2$ (L15) | 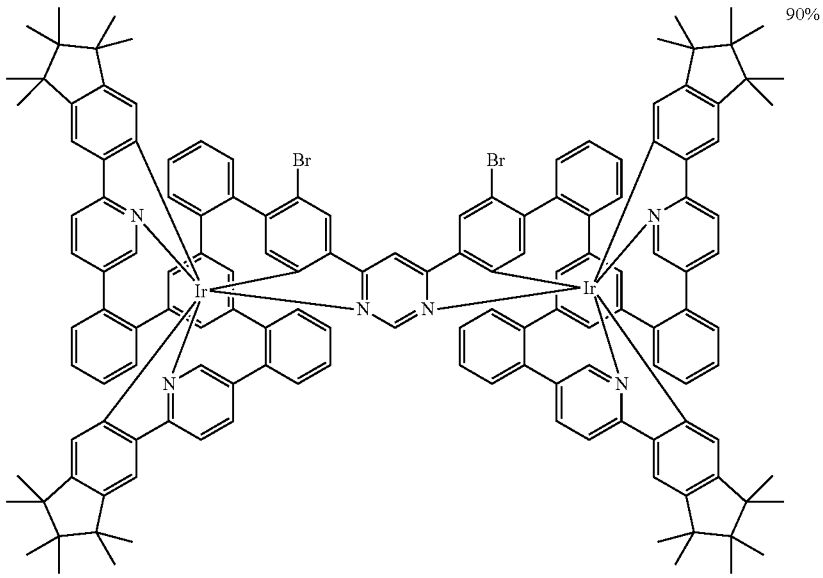 I1-Ir$_2$(L15-2Br) 2.2 equiv. of NBS | 90% |
| I2-Ir$_2$ (L15-2Br) | I2-Ir$_2$ (L15) | I2-Ir$_2$(L15-2Br) 2.2 equiv. of NBS | 83% |
| I1-Ir$_2$ (L16-4Br) | I1-Ir$_2$ (L16) | 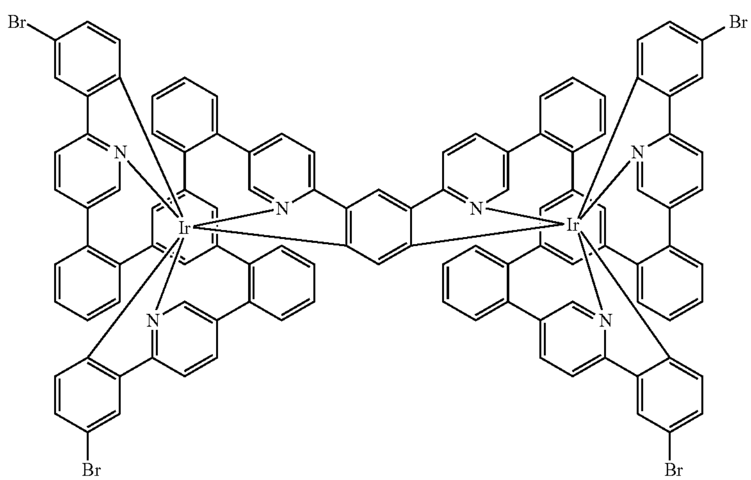 I1-Ir$_2$(L16-4Br) 5 equiv. of NBS | 89% |
| I2-Ir$_2$ (L16-4Br) | I2-Ir$_2$ (L16) | I2-Ir$_2$(L16-4Br) 4.5 equiv. of NBS | 87% |

-continued
| Ex. | Starting material | Product Amount of halosuccinimide | Yield* |
| --- | --- | --- | --- |
| I1-Ir$_2$ (L17-4Br) | I1-Ir$_2$ (L17) | 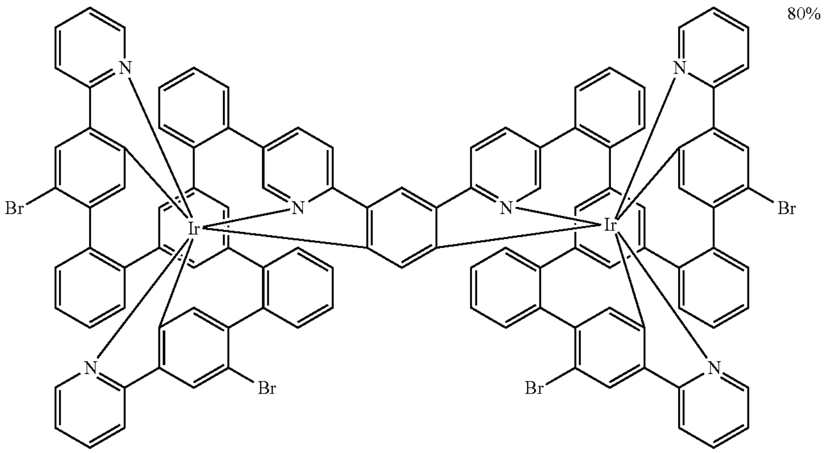 I1-Ir$_2$(L17-4Br) 4.4 equiv. of NBS | 80% |
| I2-Ir$_2$ (L17-4Br) | I2-Ir$_2$ (L17) | I2-Ir$_2$(L17-4Br) 4.4 equiv. of NBS | 82% |
| I1-Ir$_2$ (L21-4Br) | I1-Ir$_2$ (L21) | I1-Ir$_2$(L21-4Br) 5 equiv. of NBS | 75% |
| I2-Ir$_2$ (L21-4Br) | I2-Ir$_2$ (L21) | I2-Ir$_2$(L21-4Br) 5 equiv. of NBS | 72% |
| I1-Ir$_2$ (L22-4Br) | I1-Ir$_2$ (L22) | I1-Ir$_2$(L22-4Br) 4.4 equiv. of NBS | 81% |
| I2-Ir$_2$ (L22-4Br) | I2-Ir$_2$ (L22) | I2-Ir$_2$(L22-4Br) 4.4 equiv. of NBS | 79% |
| I1-Ir$_2$ (L23-6Br) | I1-Ir$_2$ (L23) | 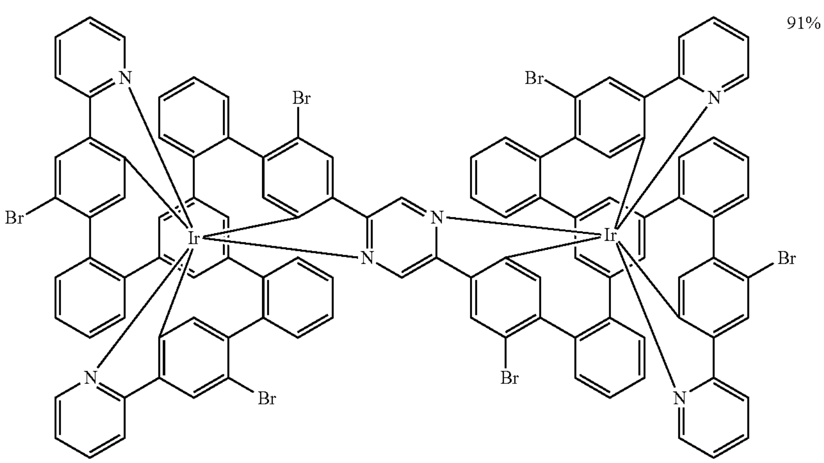 I1-Ir$_2$(L23-6Br) 7 equiv. of NBS | 91% |

-continued

| Ex. | Starting material | Product Amount of halosuccinimide | Yield* |
|---|---|---|---|
| I2-$Ir_2$ (L23-6Br) | I2-$Ir_2$ (L23) | 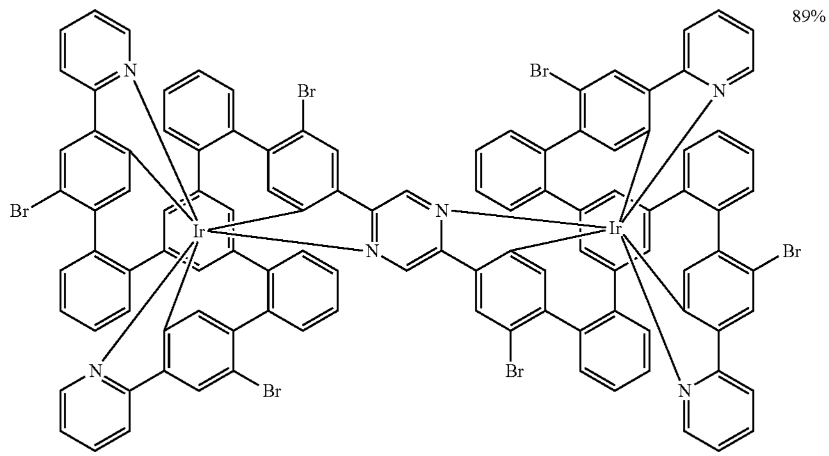 I2-$Ir_2$(L23-6Br) 6.6 equiv. of NBS | 89% |
| I1-$Ir_2$ (L24-6Br) | I1-$Ir_2$ (L24) | I1-$Ir_2$(L24-6Br) 7 equiv. of NBS, 0.02 equiv. of HBr (aq) | 84% |
| I2-$Ir_2$ (L24-6Br) | I2-$Ir_2$ (L24) | I2-$Ir_2$(L24-6Br) 7 equiv. of NBS, 0.02 equiv. of HBr (aq) | 80% |
| I1-$Ir_2$ (L25-6Br) | I1-$Ir_2$ (L25) | I1-$Ir_2$(L25-6Br) 7 equiv. of NBS | 90% |
| I2-$Ir_2$ (L25-6Br) | I2-$Ir_2$ (L25) | I2-$Ir_2$(L25-6Br) 7 equiv. of NBS | 97% |
| I1-$Ir_2$ (L27-6Br) | I1-$Ir_2$ (L27) | I1-$Ir_2$(L27-6Br) 7 equiv. of NBS | 82% |
| I2-$Ir_2$ (L27-6Br) | I2-$Ir_2$ (L27) | I2-$Ir_2$(L27-6Br) 7 equiv. of NBS | 83% |
| I1-$Ir_2$ (L28-6Br) | I1-$Ir_2$ (L28) | I1-$Ir_2$(L28-6Br) 8 equiv. of NBS | 81% |
| I2-$Ir_2$ (L28-6Br) | I2-$Ir_2$ (L28) | I2-$Ir_2$(L28-6Br) 7.5 equiv. of NBS | 77% |
| I1-$Ir_2$ (L29-6Br) | I1-$Ir_2$ (L29) | I1-$Ir_2$(L29-6Br) 10 equiv. of NBS | 84% |
| I2-$Ir_2$ (L29-6Br) | I2-$Ir_2$ (L29) | I2-$Ir_2$(L29-6Br) 10 equiv. of NBS | 86% |
| I1-$Ir_2$ (L30-6Br) | I1-$Ir_2$ (L30) | I1-$Ir_2$(L30-6Br) 8 equiv. of NBS | 81% |
| I2-$Ir_2$ (L30-6Br) | I2-$Ir_2$ (L30) | I2-$Ir_2$(L30-6Br) 8 equiv. of NBS | 76% |
| I1-$Ir_2$ (L31-6Br) | I1-$Ir_2$ (L31) | I1-$Ir_2$(L31-6Br) 8 equiv. of NBS, 0.02 equiv. of HBr (aq) | 92% |
| I2-$Ir_2$ (L31-6Br) | I2-$Ir_2$ (L31) | I2-$Ir_2$(L31-6Br) 8 equiv. of NBS, 0.05 equiv. of HBr (aq) | 95% |

-continued

| Ex. | Starting material | Product Amount of halosuccinimide | Yield* |
|---|---|---|---|
| I1-$Ir_2$ (L32-6Br) | I1-$Ir_2$ (L32) | 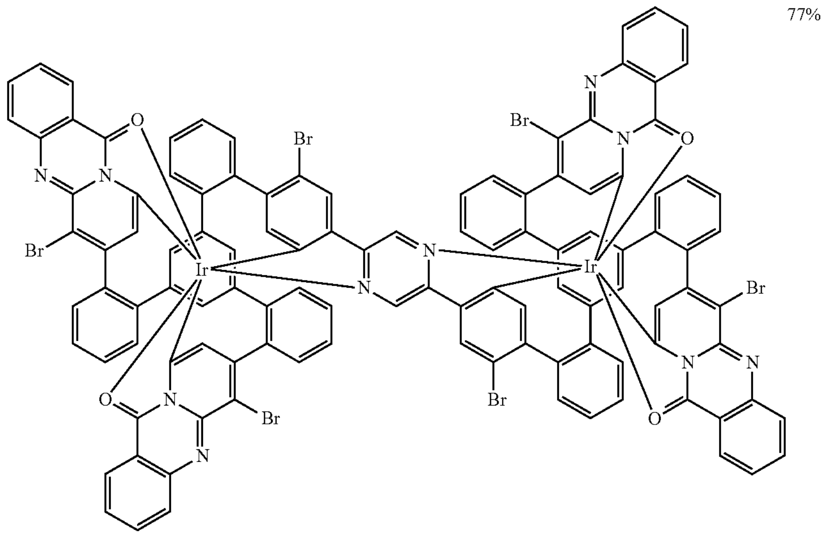 I1-$Ir_2$(L32-6Br) 6.6 equiv. of NBS | 77% |
| I2-$Ir_2$ (L32-6Br) | I2-$Ir_2$ (L32) | I2-$Ir_2$(L32-6Br) 6.6 equiv. of NBS | 72% |
| I1-$Ir_2$ (L33-6Br) | I1-$Ir_2$ (L33) | I1-$Ir_2$(L33-6Br) 8 equiv. of NBS, 0.01 equiv. of HBr (aq) | 91% |
| I2-$Ir_2$ (L33-6Br) | I2-$Ir_2$ (L33) | I2-$Ir_2$(L33-6Br) 8 equiv. of NBS, 0.01 equiv. of HBr (aq) | 94% |
| I1-$Ir_2$ (L34-4Br) | I1-$Ir_2$ (L34) | 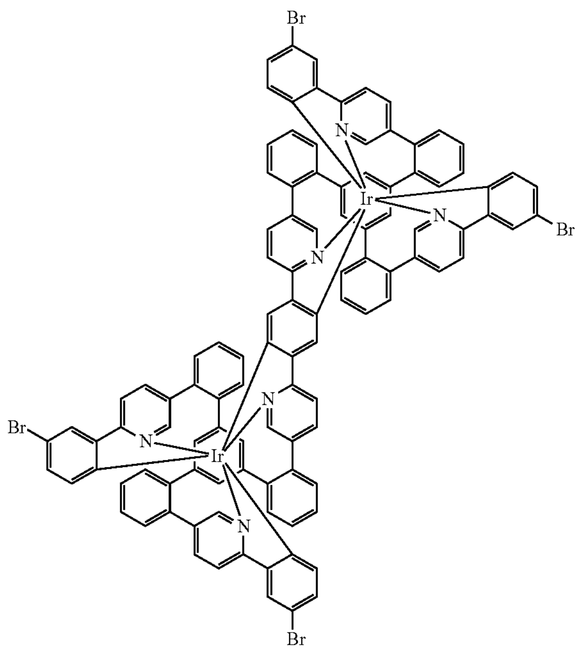 I1-$Ir_2$(L34-4Br) 4.4 equiv. of NBS | 82% |
| I2-$Ir_2$ (L34-4Br) | I2-$Ir_2$ (L34) | I2-$Ir_2$(L34-4Br) 4.4 equiv. of NBS | 86% |
| I1-$Ir_2$ (L36-4Br) | I1-$Ir_2$ (L36) | I1-$Ir_2$(L36-4Br) 5 equiv. of NBS, 0.02 equiv. of HBr (aq) | 93% |
| I2-$Ir_2$ (L36-4Br) | I2-$Ir_2$ (L36) | I2-$Ir_2$(L36-4Br) 4.4 equiv. of NBS | 91% |
| I1-$Ir_2$ (L38-4Br) | I1-$Ir_2$ (L38) | I1-$Ir_2$(L38-4Br) 4.4 equiv. of NBS | 85% |

-continued

| Ex. | Starting material | Product Amount of halosuccinimide | Yield* |
|---|---|---|---|
| I2-$Ir_2$ (L38-4Br) | I2-$Ir_2$ (L38) | I2-$Ir_2$(L38-4Br) 4.4 equiv. of NBS | 91% |
| I1-$Ir_2$ (L39-4Br) | I1-$Ir_2$ (L39) | I1-$Ir_2$(L39-4Br) 4.4 equiv. of NBS | 75% |
| I2-$Ir_2$ (L39-4Br) | I2-$Ir_2$ (L39) | I2-$Ir_2$(L39-4Br) 4.4 equiv. of NBS | 74% |
| I1-$Ir_2$ (L40-4Br) | I1-$Ir_2$ (L40) | I1-$Ir_2$(L40-4Br) 5 equiv. of NBS | 78% |
| I2-$Ir_2$ (L40-4Br) | I2-$Ir_2$ (L40) | I2-$Ir_2$(L40-4Br) 5 equiv. of NBS | 77% |
| I1-$Ir_2$ (L41-4Br) | I1-$Ir_2$ (L41) | I1-$Ir_2$(L41-4Br) 5 equiv. of NBS, 0.01 equiv. of HBr (aq) | 85% |
| I2-$Ir_2$ (L41-4Br) | I2-$Ir_2$ (L41) | I2-$Ir_2$(L41-4Br) 6 equiv. of NBS, 0.01 equiv. of HBr (aq) | 88% |
| I1-$Ir_2$ (L42-4Br) | I1-$Ir_2$ (L42) | I1-$Ir_2$(L42-4Br) 4.4 equiv. of NBS, 0.01 equiv. of HBr (aq) | 90% |
| I2-$Ir_2$ (L42-4Br) | I2-$Ir_2$ (L42) | I2-$Ir_2$(L42-4Br) 4.4 equiv. of NBS, 0.01 equiv. of HBr (aq) | 86% |
| I1-$Ir_2$ (L43-6Br) | I1-$Ir_2$ (L43) | 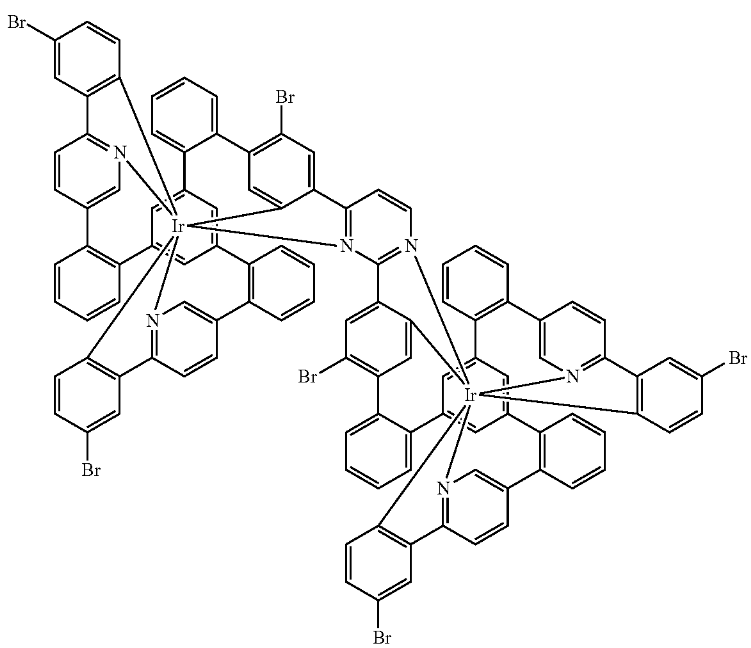 I1-$Ir_2$(L43-6Br) 8 equiv. of NBS, 0.01 equiv. of HBr (aq) | 90% |
| I2-$Ir_2$ (L43-6Br) | I2-$Ir_2$ (L43) | I2-$Ir_2$(L43-6Br) 8 equiv. of NBS, 0.01 equiv. of HBr (aq) | 85% |
| I1-$Ir_2$ (L44-6Br) | I1-$Ir_2$ (L44) | I1-$Ir_2$(L44-6Br) 8 equiv. of NBS | 89% |
| I2-$Ir_2$ (L44-6Br) | I2-$Ir_2$ (L44) | I2-$Ir_2$(L44-6Br) 8 equiv. of NBS, 0.01 equiv. of HBr (aq) | 93% |
| I1-$Ir_2$ (L47-6Br) | I1-$Ir_2$ (L47) | I1-$Ir_2$(L47-6Br) 8 equiv. of NBS | 82% |
| I2-$Ir_2$ (L47-6Br) | I2-$Ir_2$ (L47) | I2-$Ir_2$(L47-6Br) 8 equiv. of NBS, 0.01 equiv. of HBr (aq) | 81% |
| I1-$Ir_2$ (L50-6Br) | I1-$Ir_2$ (L50) | I1-$Ir_2$(L50-6Br) 8 equiv. of NBS | 82% |
| I2-$Ir_2$ (L50-6Br) | I2-$Ir_2$ (L50) | I2-$Ir_2$(L50-6Br) 8 equiv. of NBS, 0.01 equiv. of HBr (aq) | 81% |

-continued
| Ex. | Starting material | Product Amount of halosuccinimide | Yield* |
|---|---|---|---|
| I1-$Ir_2$ (L66-6Br) | I1-$Ir_2$ (L66) | 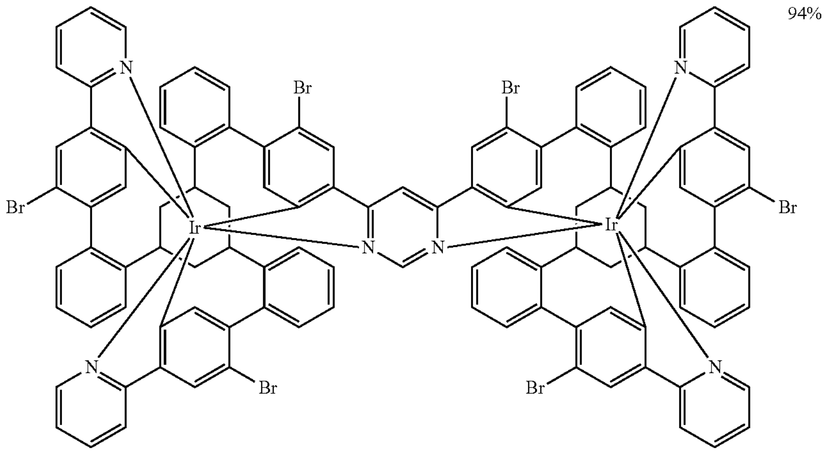 I1-$Ir_2$(L66-6Br) 8 equiv. of NBS | 94% |
| I2-$Ir_2$ (L66-6Br) | I2-$Ir_2$ (L66) | I2-$Ir_2$(L66-6Br) 8 equiv. of NBS, 0.1 equiv. of HBr (aq) | 94% |
| I1-$Ir_2$ (L91-4Br) | I1-$Ir_2$ (L91) | 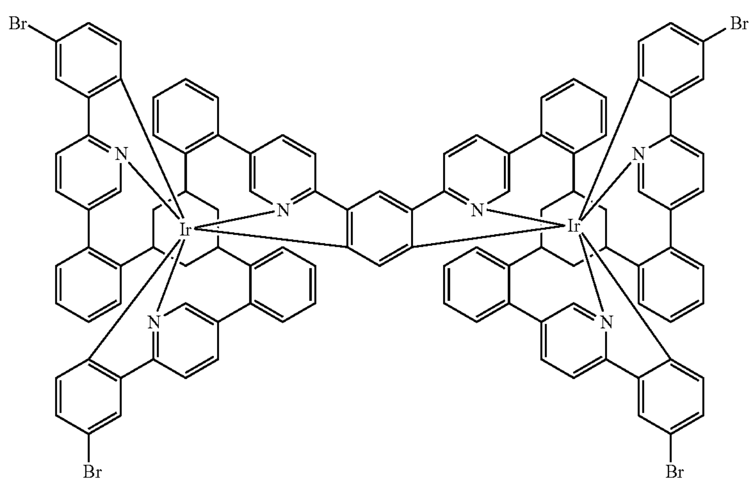 I1-$Ir_2$(L91-4Br) 5 equiv. of NBS | 90% |
| I2-$Ir_2$ (L91-4Br) | I2-$Ir_2$ (L91) | I2-$Ir_2$(L91-4Br) 5 equiv. of NBS | 92% |

-continued
| Ex. | Starting material | Product<br>Amount of halosuccinimide | Yield* |
|---|---|---|---|
| I1-$Ir_2$ (L92-6Br) | | 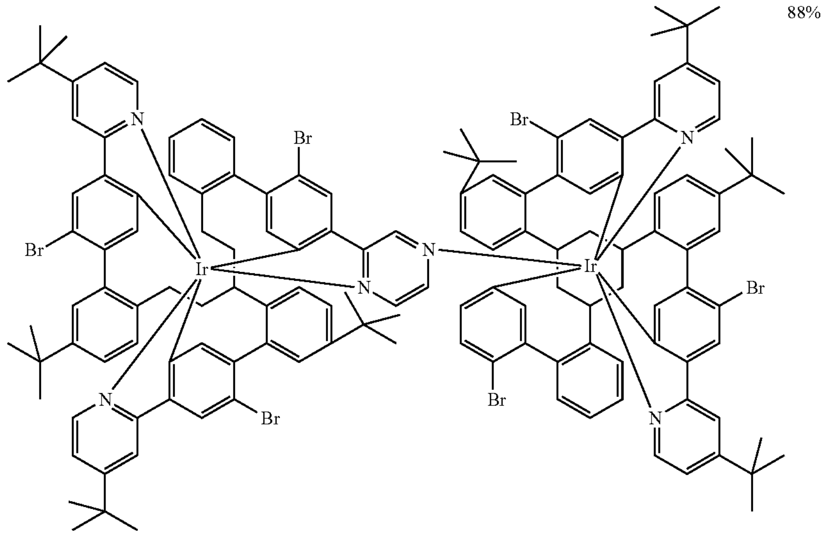 I1-$Ir_2$(L92)<br>8 equiv. of NBS | 88% |
| I2-$Ir_2$ (L92-6Br) | | I2-$Ir_2$(L92-6Br)<br>8 equiv. of NBS | 86% |
| I1-$Ir_2$ (L70-6Br) | I1-$Ir_2$ (L70) | 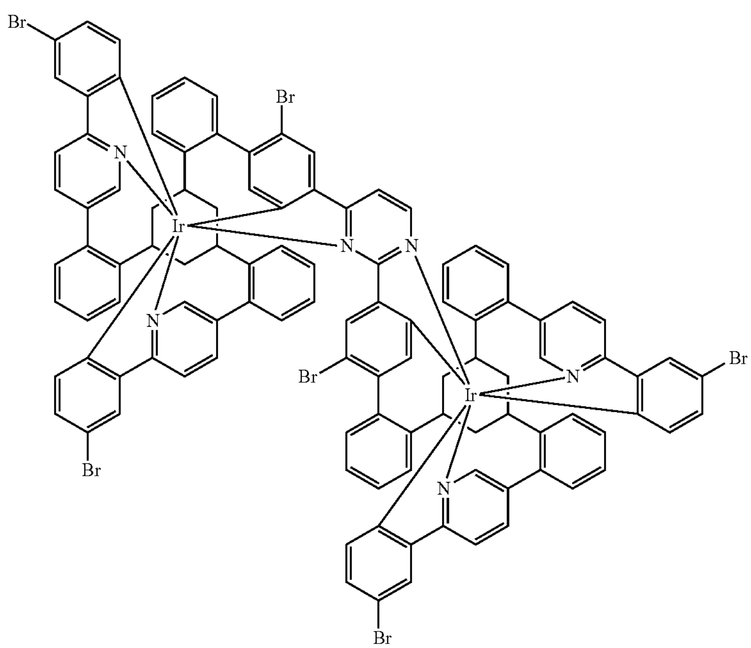 I1-$Ir_2$(L70-6Br)<br>10 equiv. of NBS, 0.02 equiv. of HBr (aq) | 81% |
| I2-$Ir_2$ (L70-6Br) | I2-$Ir_2$ (L70) | I2-$Ir_2$(L70-6Br)<br>10 equiv. of NBS | 78% |

-continued

| Ex. | Starting material | Product Amount of halosuccinimide | Yield* |
|---|---|---|---|
| I1-$Ir_2$ (L71-6Br) | I1-$Ir_2$ (L71) | 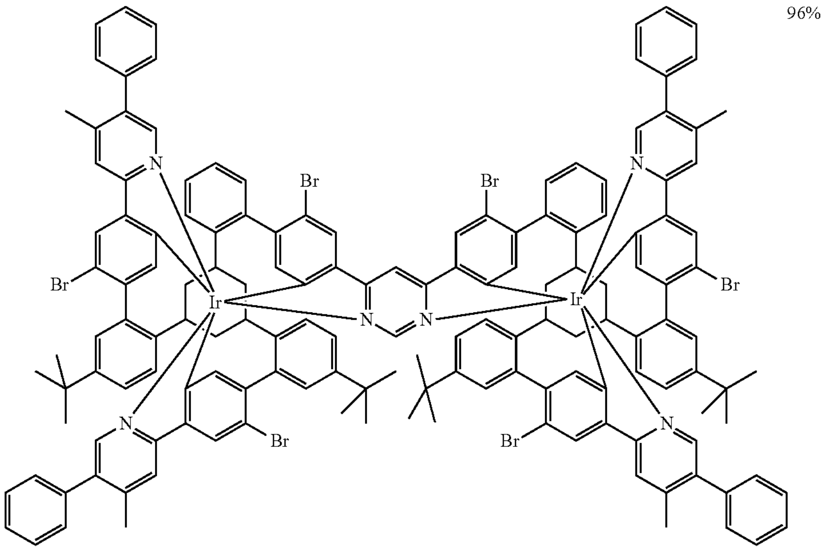  I1-$Ir_2$(L71-6Br) 6.6 equiv. of NBS | 96% |
| I2-$Ir_2$ (L71-6Br) | I2-$Ir_2$ (L71) | I2-$Ir_2$(L71-6Br) 6.6 equiv. of NBS | 96% |
| I1-$Ir_2$ (L72-6Br) | I1-$Ir_2$ (L72) | I1-$Ir_2$(L72-6Br) 8 equiv. of NBS | 91% |
| I2-$Ir_2$ (L72-6Br) | I2-$Ir_2$ (L72) | I2-$Ir_2$(L72-6Br) 8 equiv. of NBS | 92% |

2) Suzuki Coupling to the Brominated Iridium Complexes

Variant a, Two-Phase Reaction Mixture:

0.6 mmol of tri-o-tolylphosphine and then 0.1 mmol of palladium(II) acetate are added to a suspension of 10 mmol of a brominated complex, 12-20 mmol of boronic acid or boronic acid ester per Br function and 60-100 mmol of tripotassium phosphate in a mixture of 300 ml of toluene, 100 ml of dioxane and 300 ml of water, and the mixture is heated under reflux for 16 h. After cooling, 500 ml of water and 200 ml of toluene are added, the aqueous phase is separated off, the organic phase is washed three times with 200 ml of water and once with 200 ml of saturated sodium chloride solution and dried over magnesium sulfate. The mixture is filtered through a Celite bed, the latter is rinsed with toluene, the toluene is removed virtually completely in vacuo, 300 ml of methanol are added, the crude product which has precipitated out is filtered off with suction, washed three times with 50 ml of methanol each time and dried in vacuo. The crude product is passed through an automated silica-gel column (Torrent from Semrau). The complex is subsequently purified further by hot extraction in solvents such as ethyl acetate, toluene, dioxane, acetonitrile, cyclohexane, ortho- or para-xylene, n-butyl acetate, etc. Alternatively, the complex can be recrystallised from these solvents and high-boiling solvents, such as dimethylformamide, dimethyl sulfoxide or mesitylene. The metal complex is finally heated or sublimed. The heating is carried out in a high vacuum (p about $10^{-6}$ mbar) in the temperature range of about 200-300° C.

Variant B, Single-Phase Reaction Mixture:

0.2 mmol of tetrakis(triphenylphosphine)palladium(0) [14221-01-3] is added to a suspension of 10 mmol of a brominated complex, 12-20 mmol of boronic acid or boronic acid ester per Br function and 100-180 mmol of a base (potassium fluoride, tripotassium phosphate (anhydrous or monohydrate or trihydrate), potassium carbonate, caesium carbonate, etc.) and 100 g of glass beads (diameter 3 mm) in 100-500 ml of an aprotic solvent (THF, dioxane, xylene, mesitylene, dimethylacetamide, NMP, DMSO, etc.), and the mixture is heated under reflux for 24 h. Alternatively, other phosphines, such as triphenylphosphine, tri-tert-butylphosphine, S-Phos, X-Phos, RuPhos, XanthPhos, etc. can be employed in combination with $Pd(OAc)_2$, where the preferred phosphine:palladium ratio in the case of these phosphines is 3:1 to 1.2:1. The solvent is removed in vacuo, the product is taken up in a suitable solvent (toluene, dichloromethane, ethyl acetate, etc.) and purified as described under Variant A.

Synthesis of $Ir_2100$

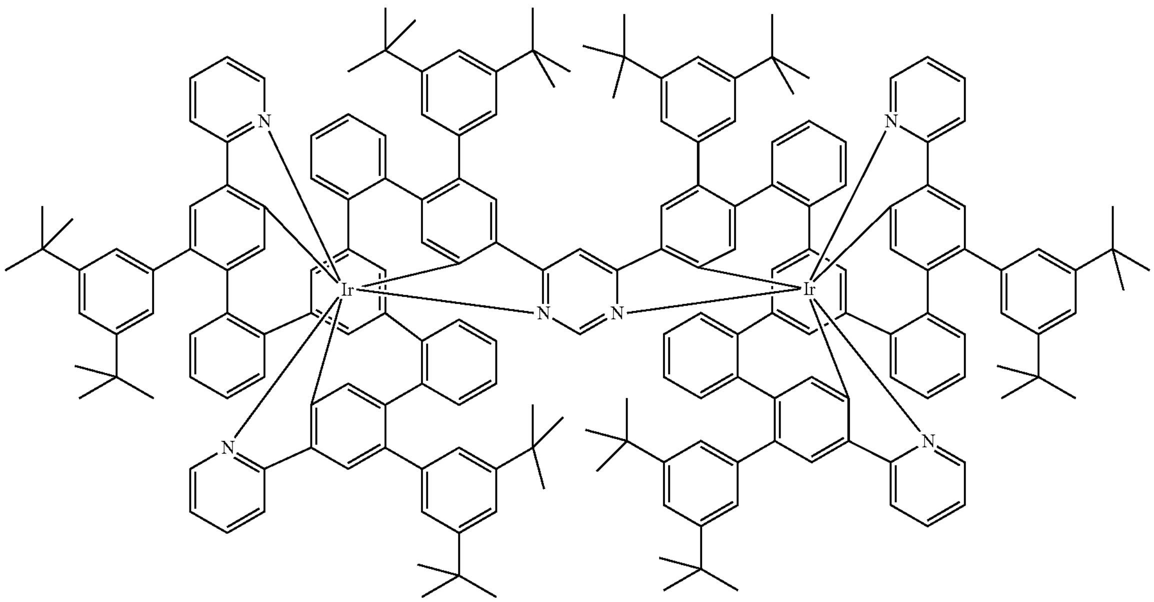

Variant B:

Use of 23.1 g (10.0 mmol) of I1-Ir(L1-6Br) and 38.0 g (120.0 mmol) of 2-(3,5-di-tert-butylphenyl)-4,4,5,5-tetramethyl-1,3,2-dioxaborolane [1071924-13-4], 17.7 g (180 mmol) of tripotassium phosphate monohydrate, 231 mg of tetrakis(triphenylphosphine)palladium(0), 500 ml of dry dimethyl sulfoxide, reflux, 16 h. Chromatographic separation twice on silica gel with toluene/heptane (automated column, Torrent from Axel Semrau), subsequently hot extraction five times with ethyl acetate/acetonitrile 1:1. Yield: 15.4 g (5.2 mmol) 52%; purity: about 99.9% according to HPLC.

The following compounds can be prepared analogously:

| Ex. | Starting material Variant/reaction conditions Boronic acid | Product/hot extractant (HE) or Recrystallisation agent | Yield |
|---|---|---|---|
| $Ir_2$101 | I2-Ir(L1-6Br) Variant B $Pd(OAc)_2$/S-Phos, 1:1.3, $Cs_2CO_3$, dioxane 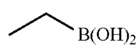  [4433-63-0] | 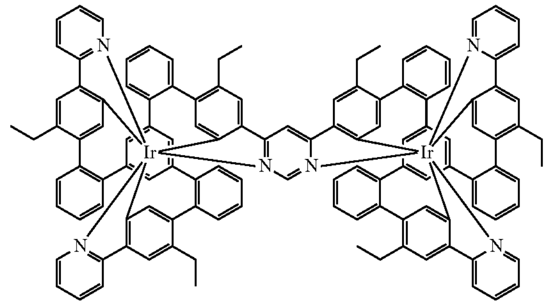  HE: ethyl acetate | 30% |
| $Ir_2$102 | I1-Ir(L2-6Br) Variant A as described in A 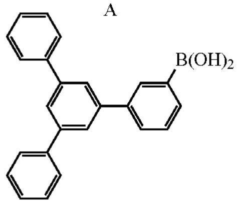  [1233200-59-3] | 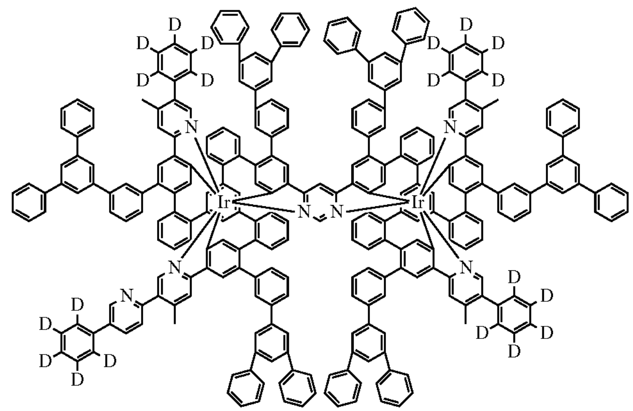  HE: ethyl acetate | 50% |

-continued
| | | | |
|---|---|---|---|
| $Ir_2103$ | Il-$Ir_2$(L3-6Br) Variant B 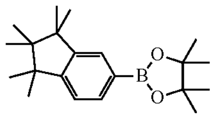 [1562418-16-9] | 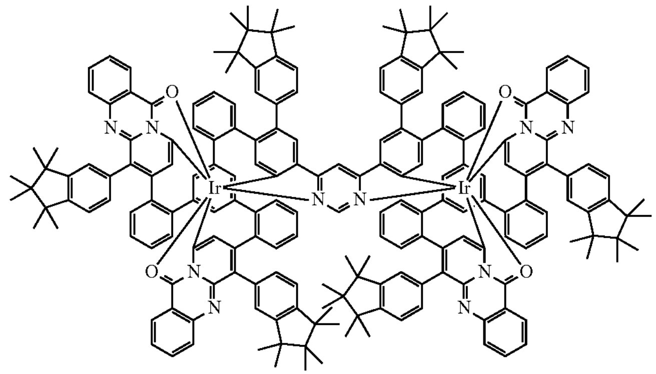 HE: cyclohexane | 49% |
| $Ir_2104$ | I2-$Ir_2$(L3-6Br) Variant A 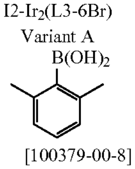 [100379-00-8] | 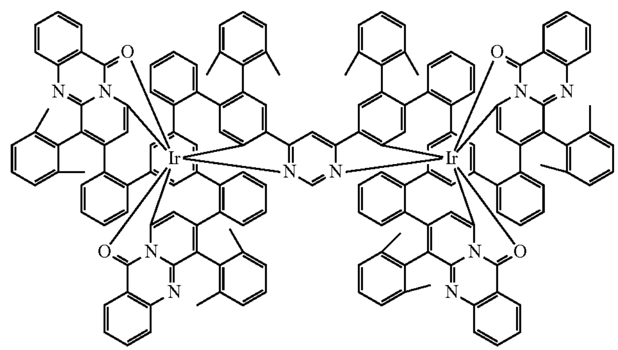 HE: toluene | 35% |

-continued
| | | | |
|---|---|---|---|
| $Ir_2$105 | $Ir_2$(L4-6Br) Variant A 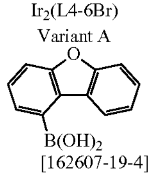 [162607-19-4] | 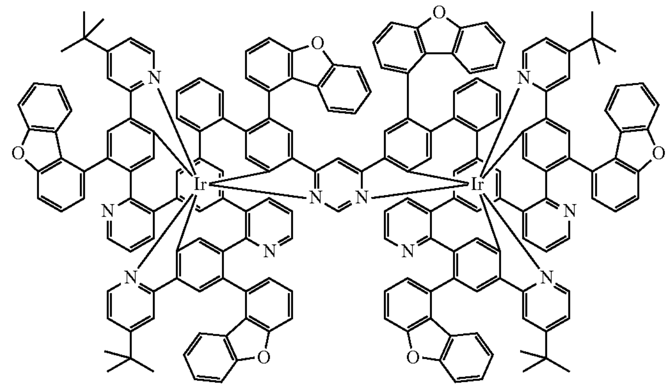 HE: toluene | 39% |
| $Ir_2$107 | I1-$Ir_2$(L5-6Br) Variant A 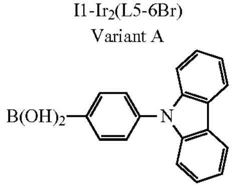 [419536-33-7] | 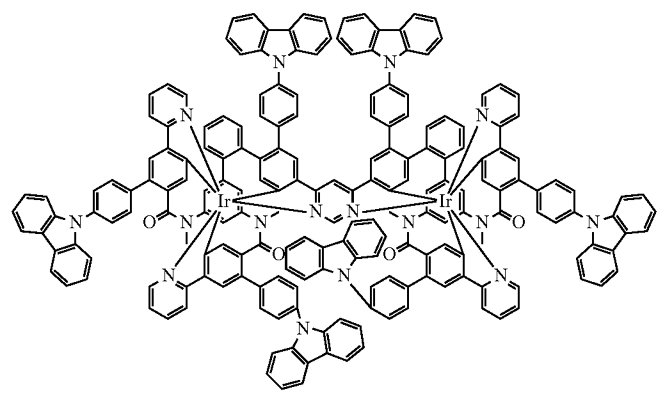 HE: n-butyl acetate | 44% |

-continued
| | | | |
|---|---|---|---|
| $Ir_2108$ | I2-$Ir_2$(L5-6Br)<br>Variant A<br>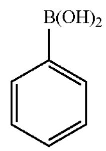<br>[98-80-6] | 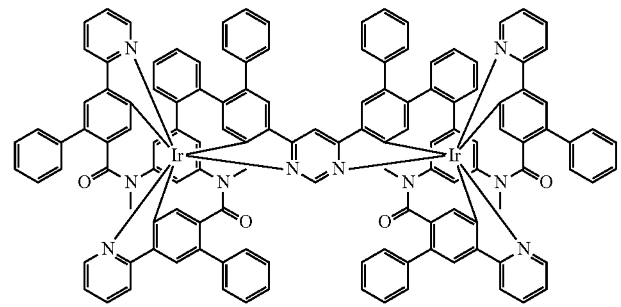<br>HE: n-butyl acetate | 40% |
| $Ir_2109$ | I1-$Ir_2$(L6-6Br)<br>Variant B<br>$Pd(OAc)_2$/<br>S-Phos, 1:1.3,<br>$Cs_2CO_3$,<br>dioxane<br>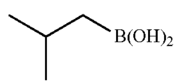<br>[84110-40-7] | 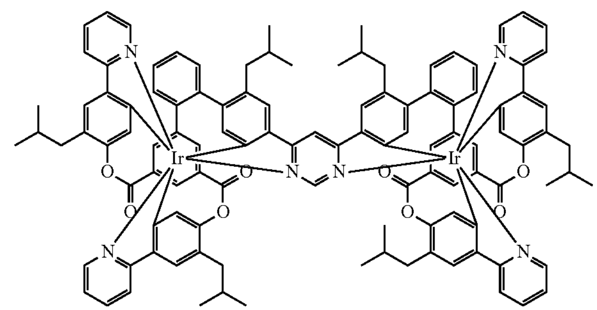<br>Recrystallisation: DMF | 23% |
| $Ir_2110$ | I1-$Ir_2$(L8-6Br)<br>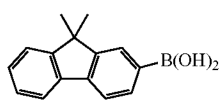<br>[333432-28-3] | 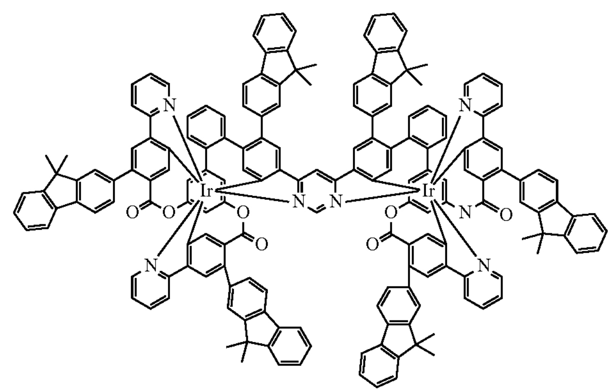<br>HE: toluene | 45% |

-continued
| | | | |
|---|---|---|---|
| $Ir_2$111 | I1-$Ir_2$(L9-6Br) Variant B 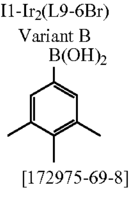 [172975-69-8] | 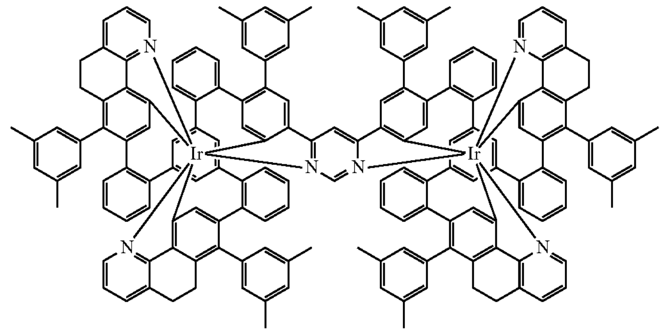 HE: o-xylene | 50% |
| $Ir_2$112 | I2-$Ir_2$(L9-6Br) Variant B 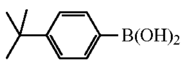 [123324-71-0] | 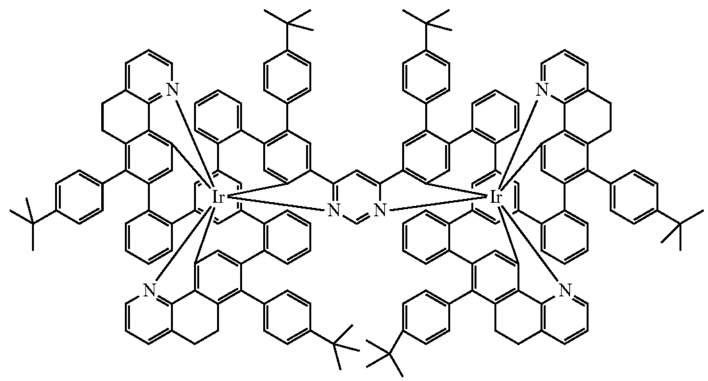 HE: toluene | 52% |

-continued
| | | | |
|---|---|---|---|
| $Ir_2113$ | $Ir_2$(L10-6Br) Variant A 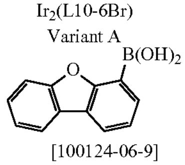 [SMILES: OB(O)c1cccc2c1oc1ccccc12] [100124-06-9] | 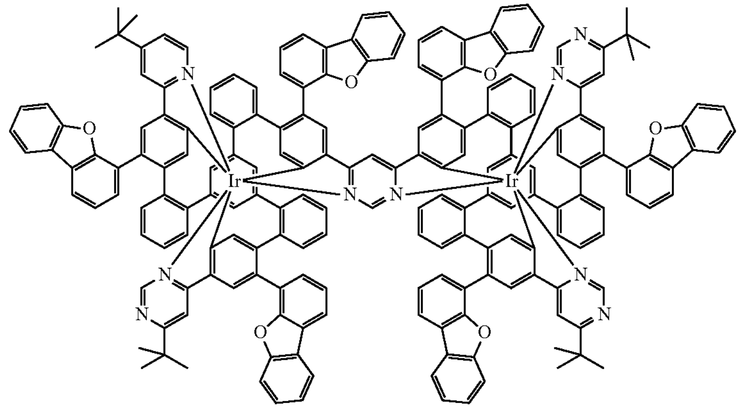 HE: toluene | 36% |
| $Ir_2115$ | I2-$Ir_2$(L11-6Br) Variant B 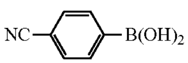 [126747-14-6] | 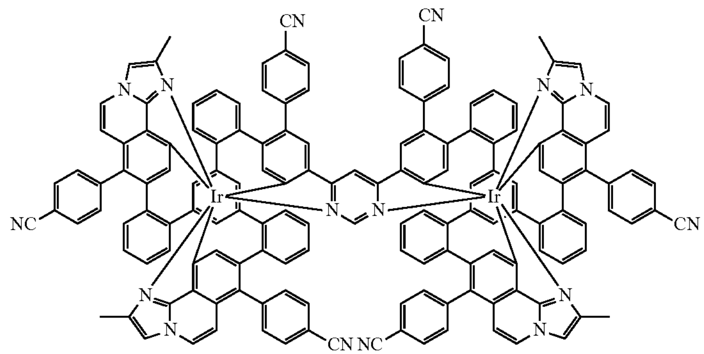 I1-$Ir_2$(L11) Recrystallisation: DMSO | 40% |

-continued
| | | | |
|---|---|---|---|
| $Ir_2116$ | I1-$Ir_2$(L12-6Br) Variant B $Pd(OAc)_2$/Xanthphos, 1:1.3, $K_2CO_3$, dioxane 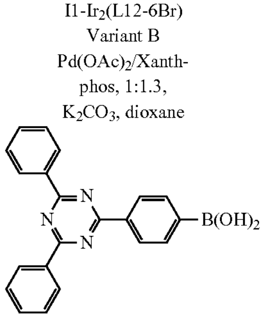 [1313018-07-3] | 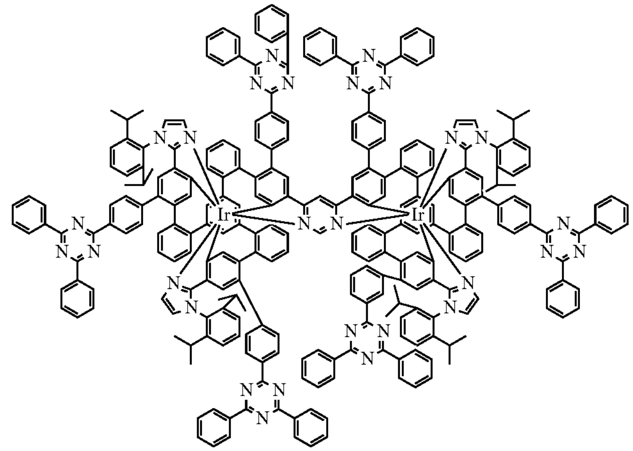 Recrystallisation: DMF | 36% |
| $Ir_2117$ | I1-$Ir_2$(L13-6Br) Variant B 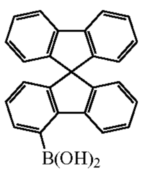 [1421789-05-0] | 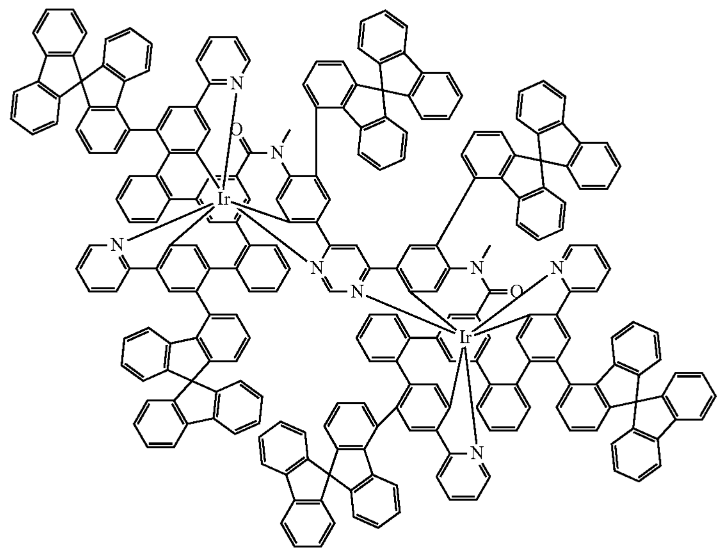 HE: butyl acetate | 40% |

-continued
| | | | |
|---|---|---|---|
| $Ir_2118$ | I2-$Ir_2$(L13-6Br)<br>Variant B<br>P(o-Tol)$_3$/<br>Pd(OAc)$_2$ 6:1<br>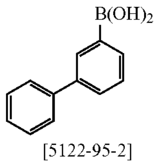<br>[5122-95-2] | 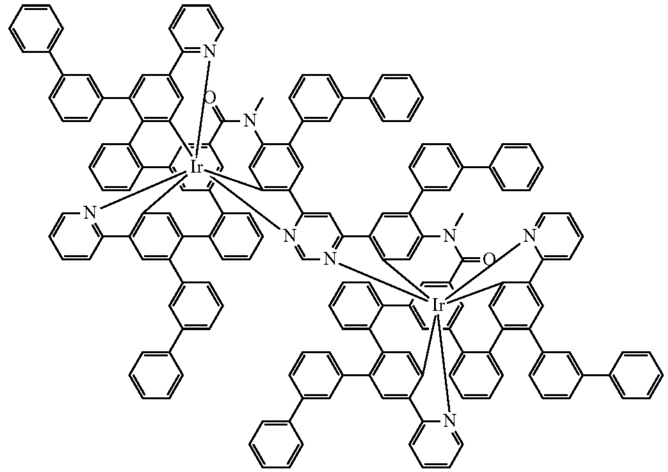<br>HE: toluene | 55% |
| $Ir_2119$ | I1-$Ir_2$(L15-2Br)<br>Pd(OAc)$_2$/S-Phos<br>1:1.3, KF, dioxane<br>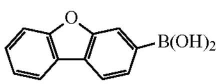<br>[395087-89-5] | 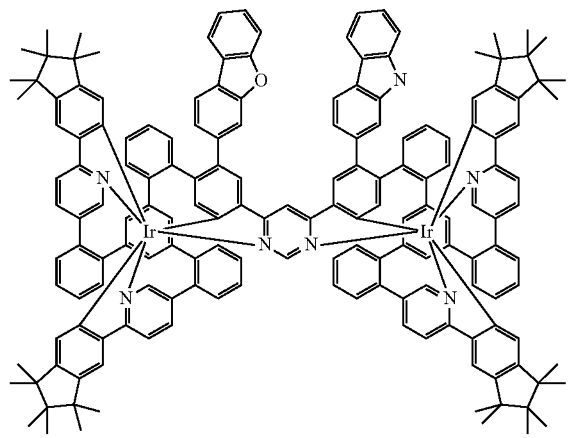<br>HE: ethyl acetate | 60% |

-continued
| | | | |
|---|---|---|---|
| $Ir_2120$ | I2-$Ir_2$(L15-2Br)<br>Variant A:<br>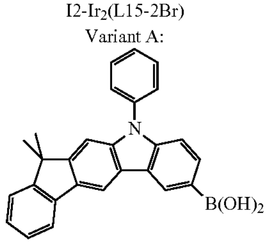<br>[1379585-25-7] | 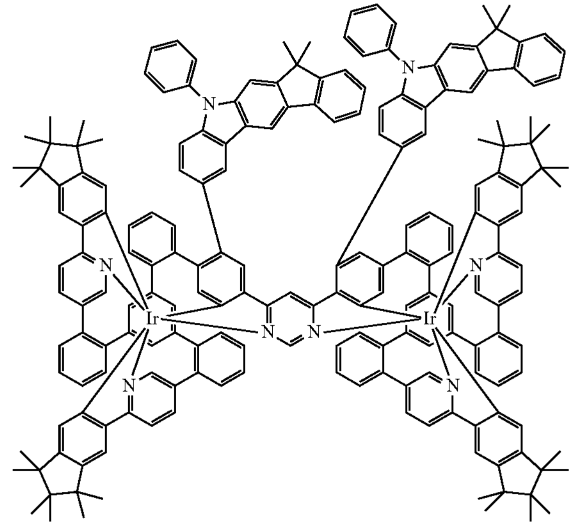<br>Hot extraction: toluene/heptane 3:1 | 52% |
| $Ir_2121$ | I1-$Ir_2$(L16-4Br)<br>Variant A<br>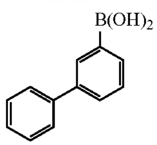<br>[5122-95-2] | 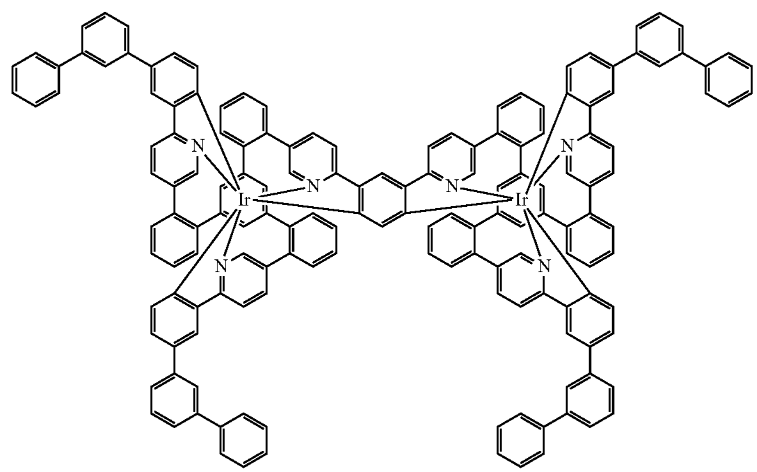<br>Hot extraction: toluene | 51% |

-continued
| | | | |
|---|---|---|---|
| $Ir_2122$ | I2-$Ir_2$(L16-4Br) Variant A 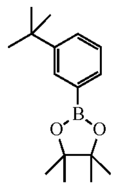 [627526-15-2] | 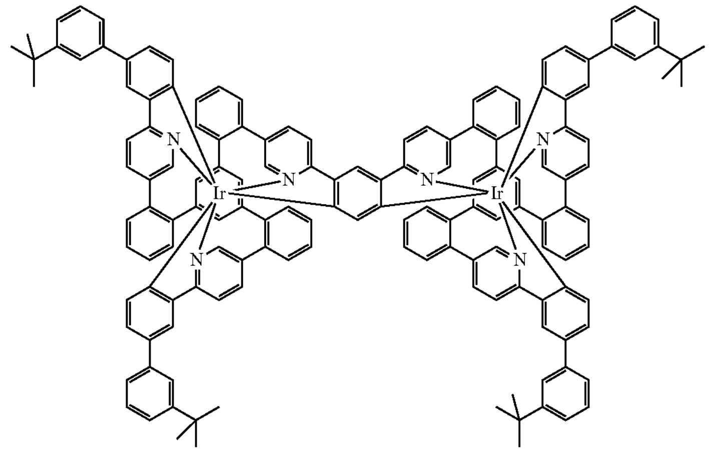 Hot extraction: ethyl acetate | 57% |
| $Ir_2123$ | I2-$Ir_2$(L16-4Br) Variant A 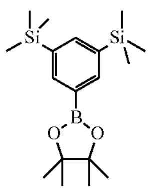 [1111096-37-7] | 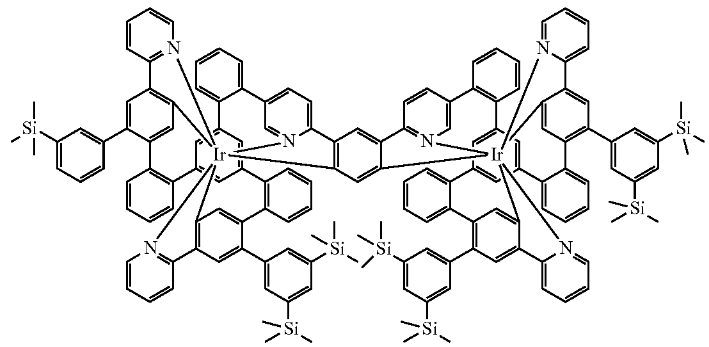 Hot extraction: ethyl acetate | 51% |

-continued
| | | | |
|---|---|---|---|
| $Ir_2124$ | I2-$Ir_2$(L17-4Br) Variant B 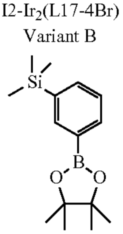 [1208070-18-1] | 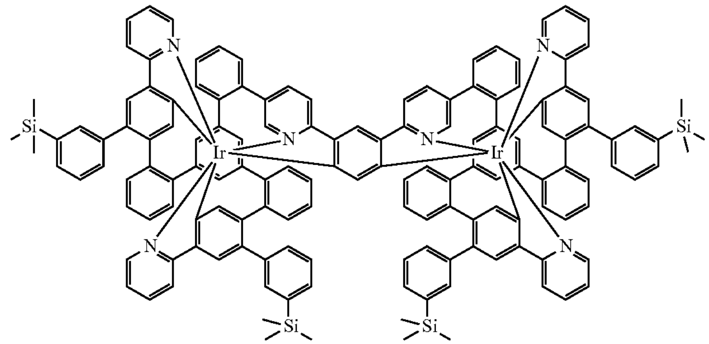 Hot extractino: n-butyl acetate | 56% |
| $Ir_2125$ | I1-$Ir_2$(L21-4Br) Variant B 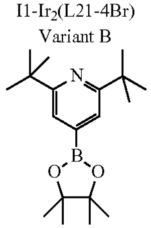 [1392146-23-4] | 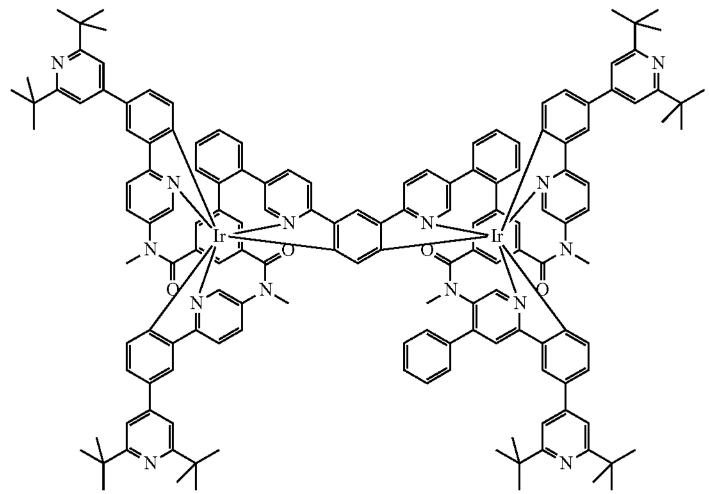 Recrystallisation: dioxane | 46% |

-continued
| | | | |
|---|---|---|---|
| $Ir_2126$ | I2-$Ir_2$(L22-4Br) Variant B 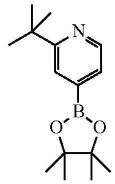 [1627722-65-9] | 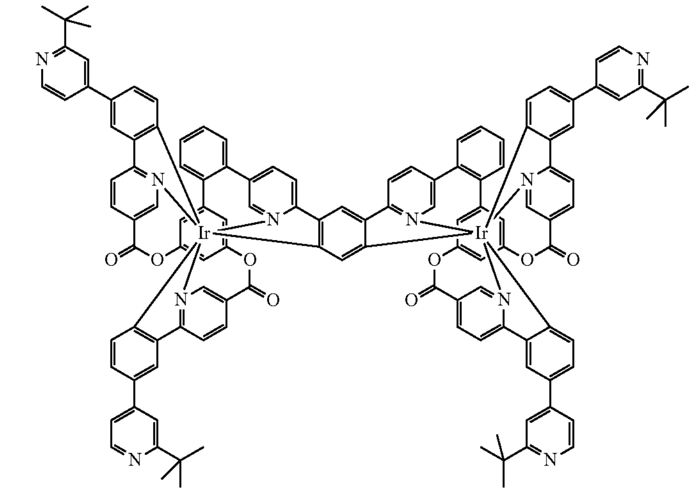 Recrystallisation: DMF | 44% |
| $Ir_2127$ | I1-$Ir_2$(L23-6Br) Variant B 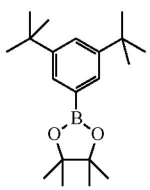 [1071924-13-4] | 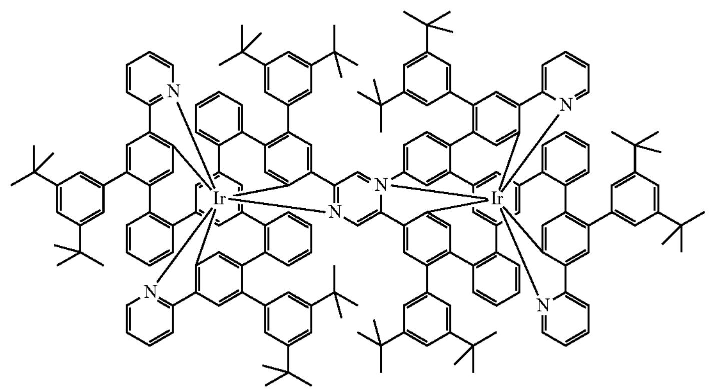 Hot extraction: cyclohexane | 51% |

-continued
| | | | |
|---|---|---|---|
| $Ir_2128$ | I2-$Ir_2$(L23-6Br) Variant A 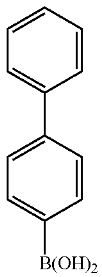 [5122-94-1] | 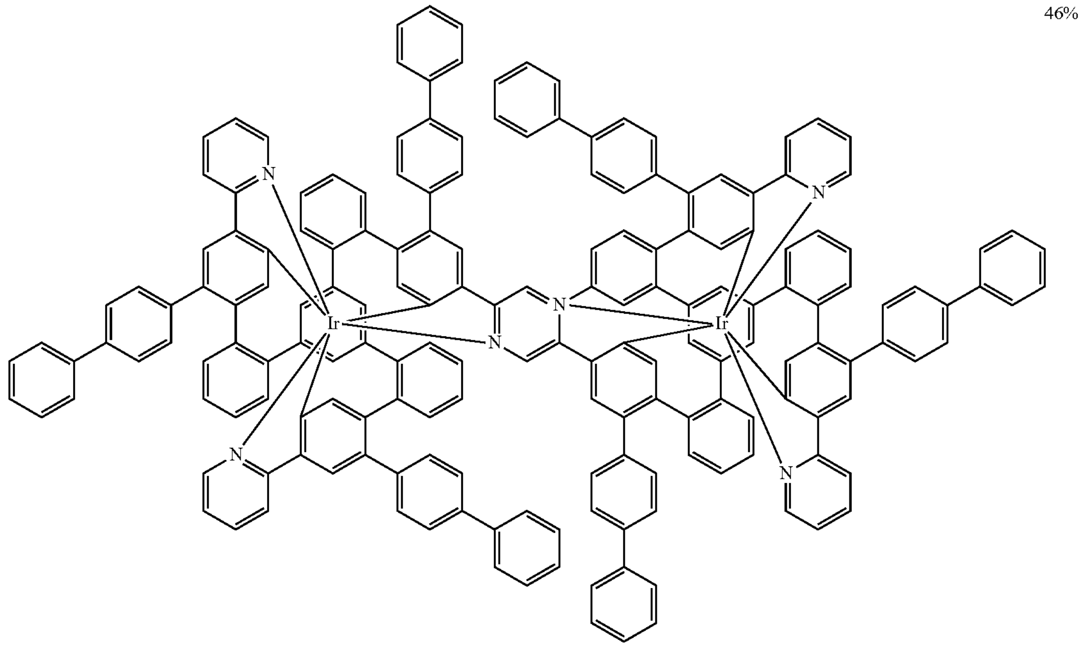 Hot extraction: dichloromethane | 46% |

-continued
| | | | |
|---|---|---|---|
| $Ir_2129$ | I1-$Ir_2$(L24-6Br) Variant A 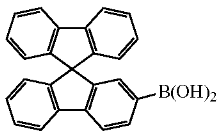 [236389-21-2] | 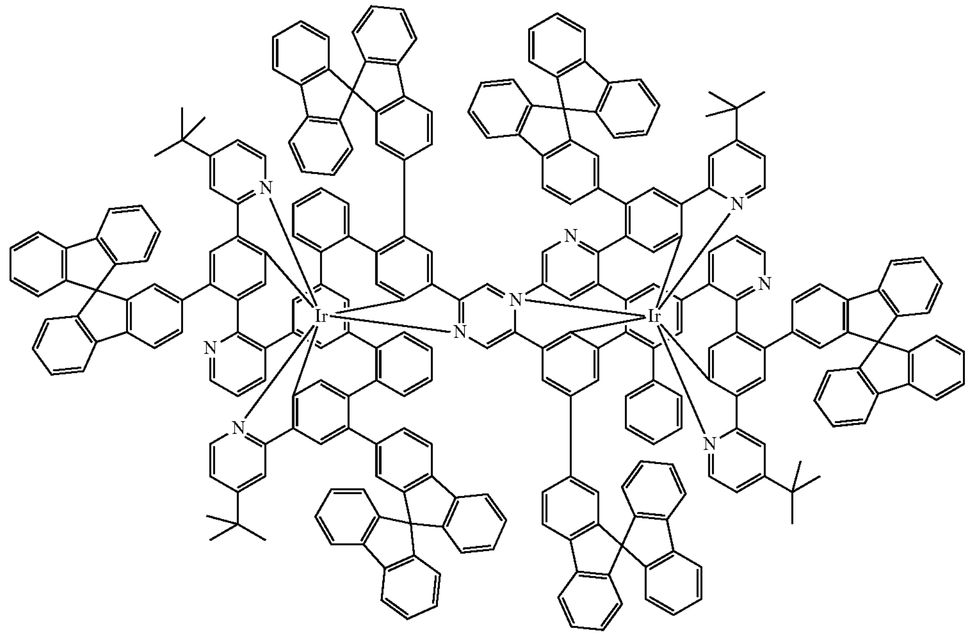 Hot extraction: toluene | 42% |
| $Ir_2130$ | I2-$Ir_2$(L24-6Br) Variant A 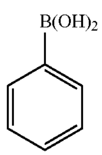 [98-80-6] | 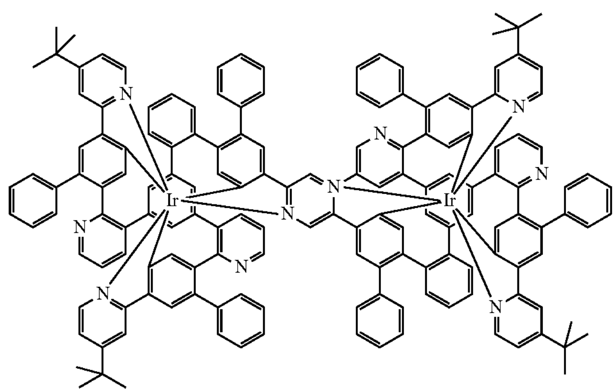 Hot extraction: n-butyl acetate | 49% |

-continued
| | | | |
|---|---|---|---|
| $Ir_2131$ | I1-$Ir_2$(L25-6Br) Variant A 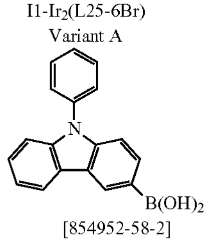 [SMILES: OB(O)c1ccc2c(c1)c1ccccc1n2-c1ccccc1] B(OH)$_2$ [854952-58-2] | 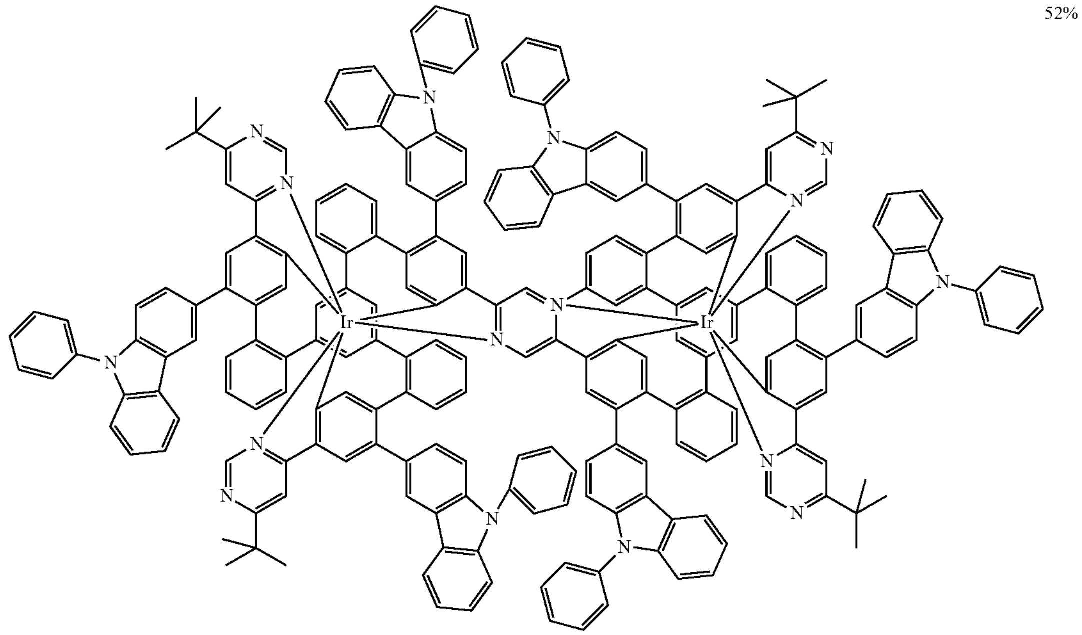 Hot extraction: toluene | 52% |
| $Ir_2132$ | I1-$Ir_2$(L25-6Br) Variant B $Pd(OAc)_2$/ S-Phos 1:1.3, $Cs_2CO_3$, toluene 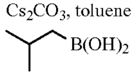 B(OH)$_2$ [84110-40-7] | 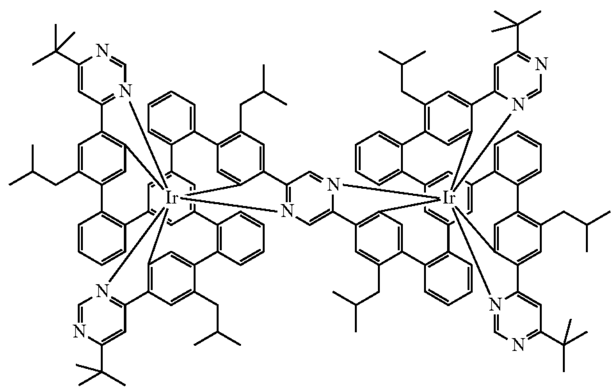 | 24% |

-continued
| | | | |
|---|---|---|---|
| $Ir_2133$ | I1-$Ir_2$(L28-6Br) Variant B 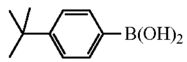 [123324-71-0] | HE: ethyl acetate/acetonitrile 3:1 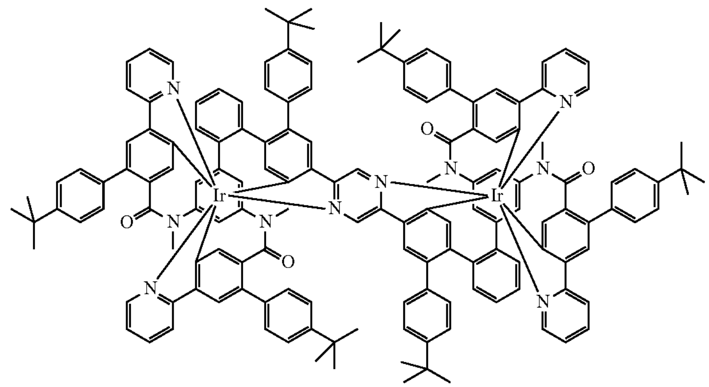 HE: n-butyl acetate | 45% |
| $Ir_2134$ | I2-$Ir_2$(L29-6Br) $Pd(OAc)_2$/ S-Phos, 1:1.3, $Cs_2CO_2$, dioxane 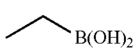 [4433-63-0] | 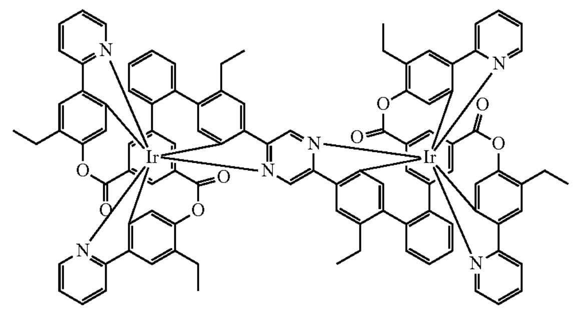 Hot extraction: ethyl acetate | 22% |

-continued
| | | | |
|---|---|---|---|
| $Ir_2135$ | I1-$Ir_2$(L30-6Br) Variant A 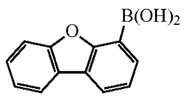 [100124-06-9] | 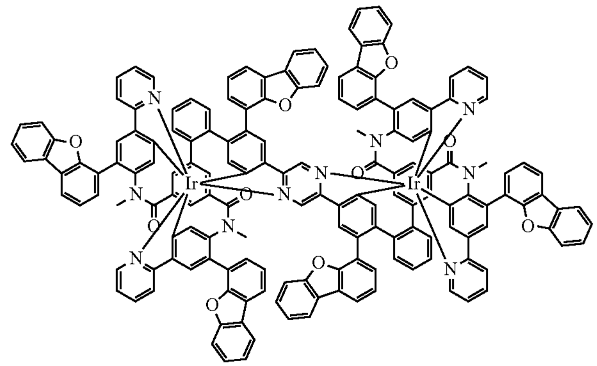 HE: 1,4-dioxane | 35% |
| $Ir_2136$ | I1-$Ir_2$(L31-6Br) Variant A 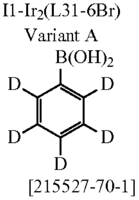 [215527-70-1] | 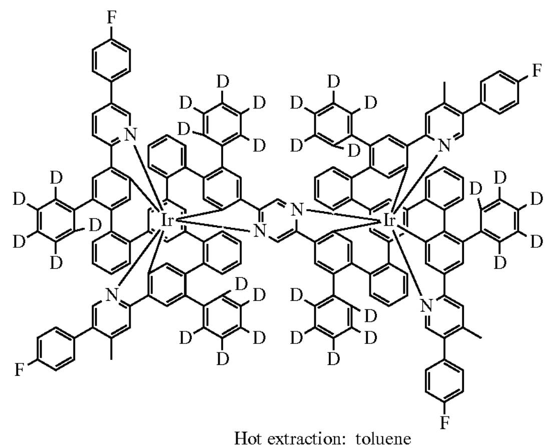 Hot extraction: toluene | 50% |

-continued
| | | | |
|---|---|---|---|
| $Ir_2$137 | I2-$Ir_2$(L31-6Br) Variant A 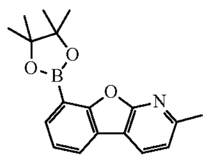 [1609374-04-0] | 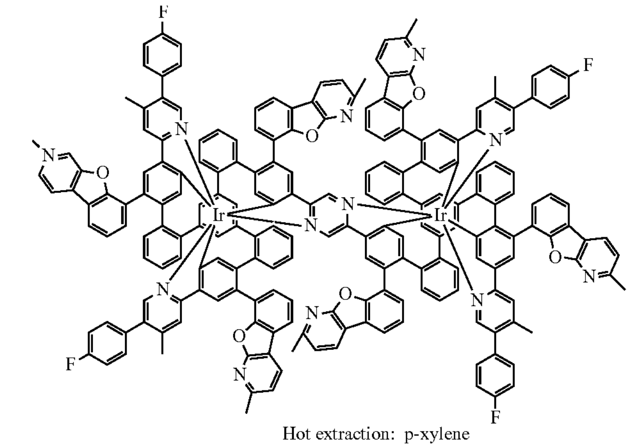 Hot extraction: p-xylene | 41% |
| $Ir_2$138 | I1-$Ir_2$(L32-6Br) Variant A 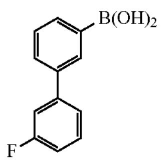 [1106676-79-2] | 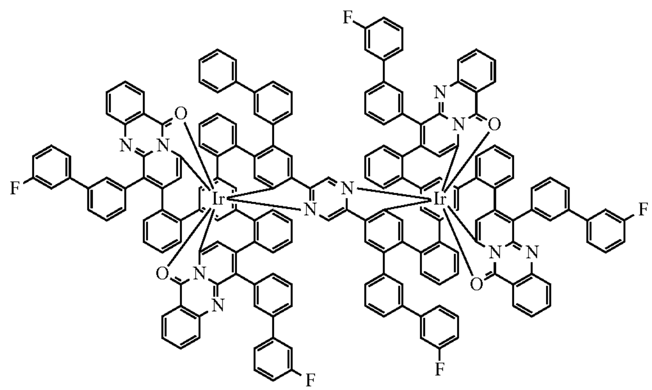 Hot extraction: ethyl acetate | 48% |

-continued
| | | | |
|---|---|---|---|
| $Ir_2139$ | I1-$Ir_2$(L33-6Br) Variant A 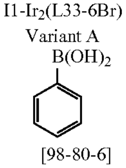 [98-80-6] | 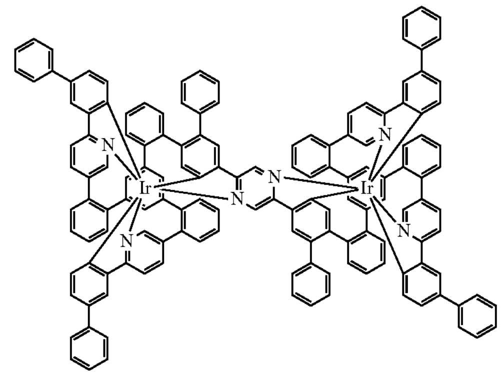 Hot extraction: toluene | 51% |
| $Ir_2140$ | I1-$Ir_2$(L34-4Br) Variant B 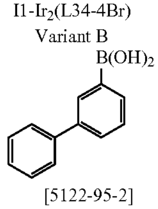 [5122-95-2] | 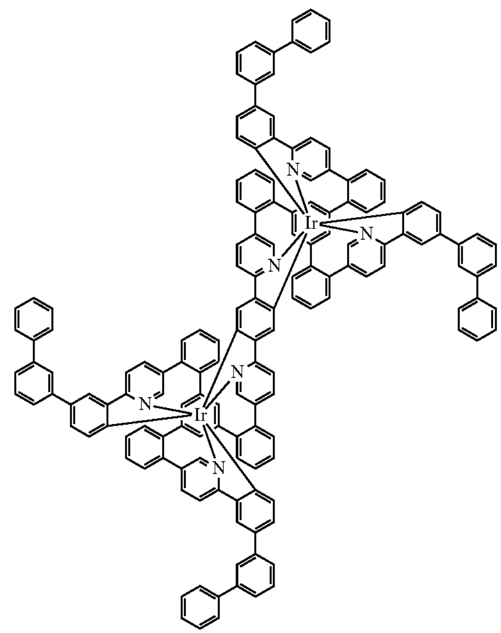 Hot extraction: n-butyl acetate | 57% |

-continued
| | | | |
|---|---|---|---|
| $Ir_2141$ | I2-$Ir_2$(L34-4Br) Variant B $Pd(OAc)_2$/ S-Phos 1:1.3, $K_3PO_4$ ´ 3 $H_2O$, toluene 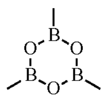 [823-96-1] | 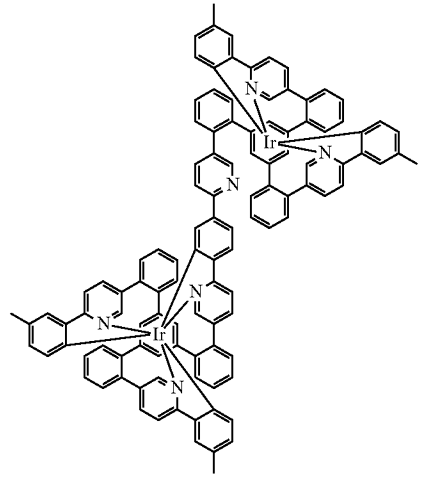 Hot extraction: ethyl acetate | 26% |
| $Ir_2142$ | I2-$Ir_2$(L38-4B3) Variant B 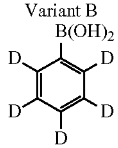 [215527-70-1] | 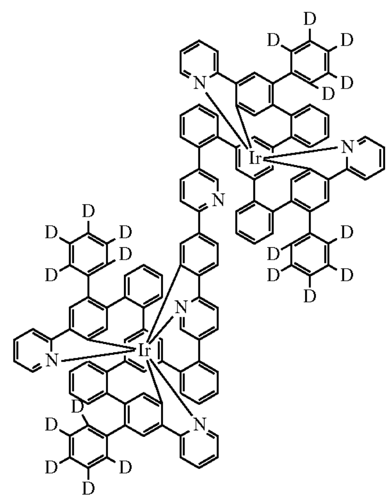 Hot extraction: toluene | 45% |

-continued
| | | | |
|---|---|---|---|
| $Ir_2143$ | I1-$Ir_2$L39-4Br)<br>Variant B<br>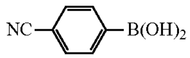<br>[126747-14-6] | 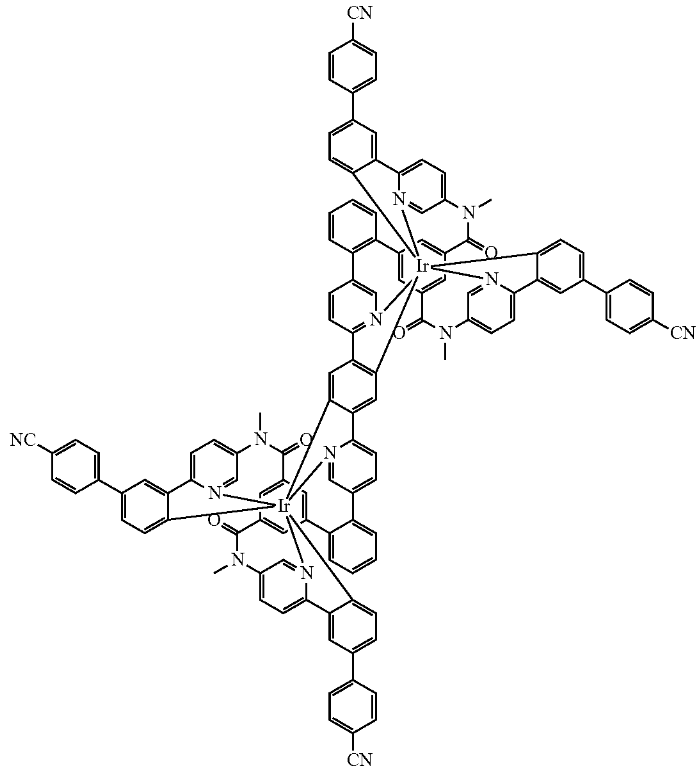<br>Recrystallisation: DMF | 38% |

-continued
| | | | |
|---|---|---|---|
| $Ir_2144$ | I2-$Ir_2$(L40-4Br)<br>$Pd(OAc)_2$/<br>S-Phos, 1:1.3,<br>$CsCO_3$, dioxane<br> B(OH)$_2$<br>[4433-63-0] | 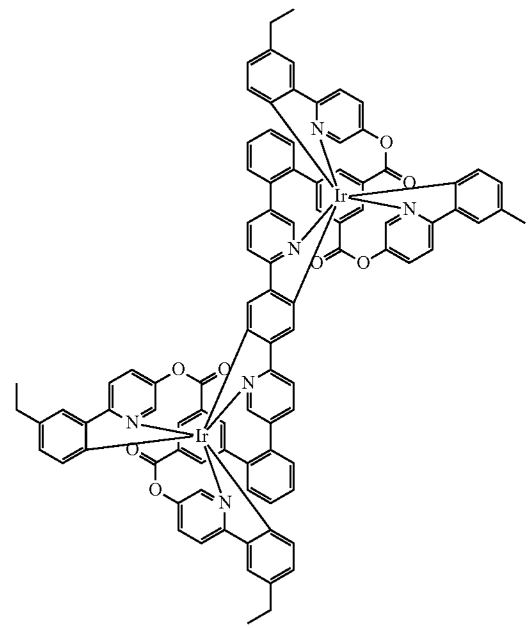<br>Recrystallisation: dimethylacetamide | 22% |

-continued
| | | | |
|---|---|---|---|
| $Ir_2$145 | I1-$Ir_2$(L41-4Br)<br>Variant A<br>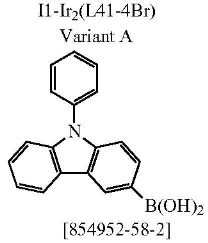 [SMILES: OB(O)c1ccc2c(c1)c1ccccc1n2-c1ccccc1]<br>[854952-58-2] | 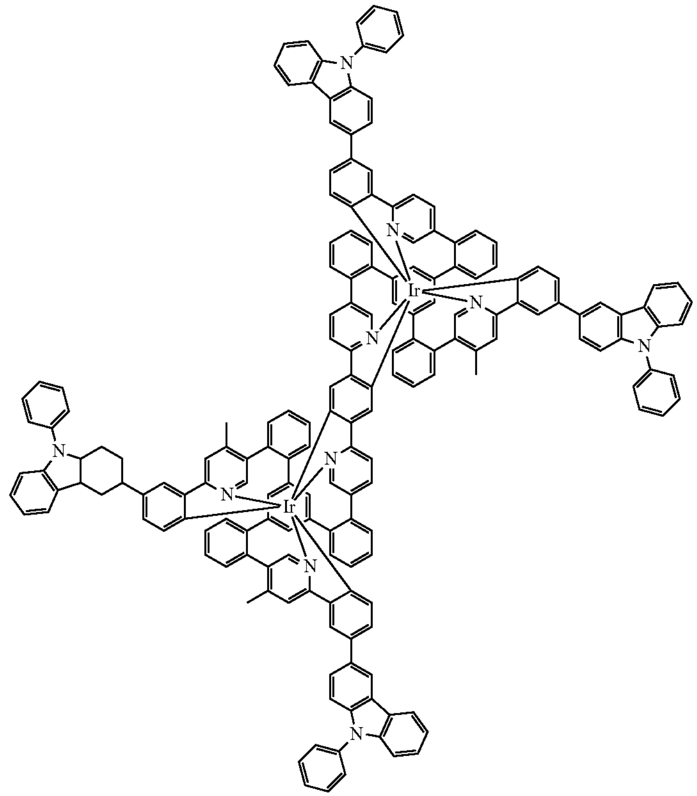<br>Hot extraction: toluene | 53% |

-continued
| | | | |
|---|---|---|---|
| $Ir_2146$ | I1-$Ir_2$(L42-4Br)<br>Variant A<br>$B(OH)_2$<br>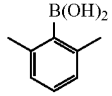<br>[100379-00-8] | 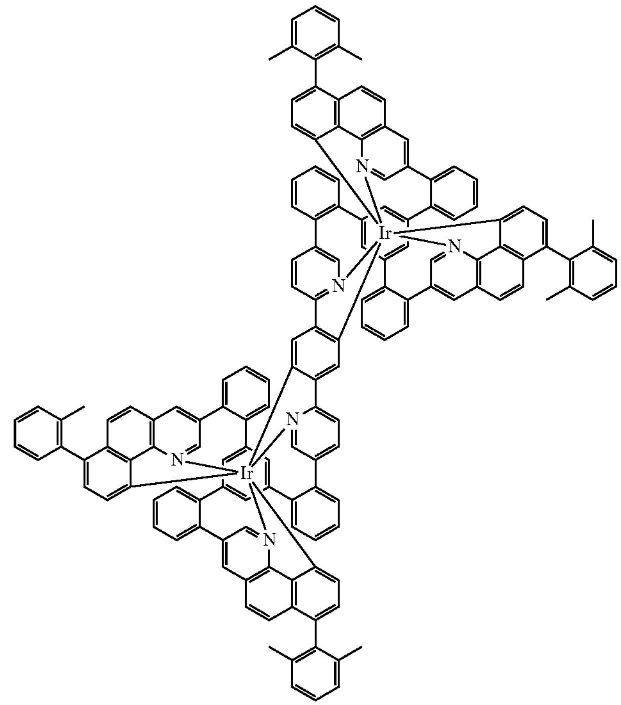<br>Hot extraction: toluene | 42% |

-continued
| | | | |
|---|---|---|---|
| $Ir_2147$ | I2-$Ir_2$(L42-4Br) Variant A 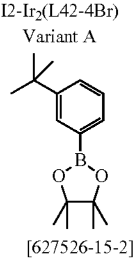 [627526-15-2] | 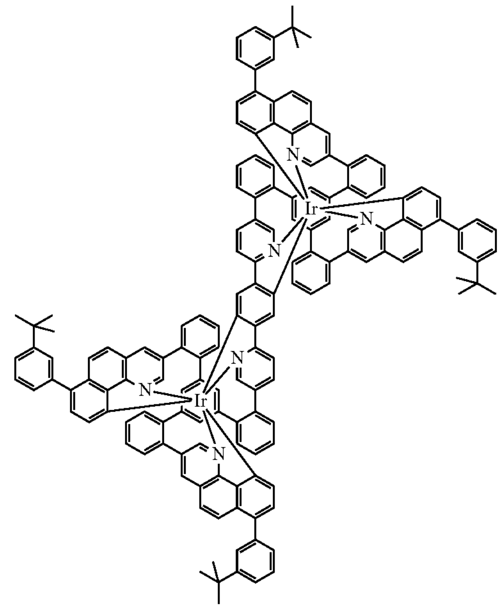 I2-$Ir_2$(L42-4Br) Hot extraction: toluene | 55% |
| $Ir_2148$ | I1-$Ir_2$(L43-6Br) Variant B 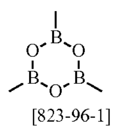 [823-96-1] | 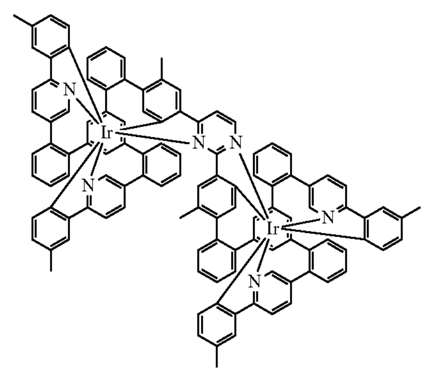 Hot extraction: n-butyl acetate | 22% |

-continued
| | | | |
|---|---|---|---|
| $Ir_2$149 | I1-$Ir_2$(L44-6Br) Variant B $Pd(OAc)_2$/ S-Phos, 1:1.3, $Cs_2CO_3$, dioxane 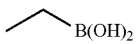 [4433-63-0] | 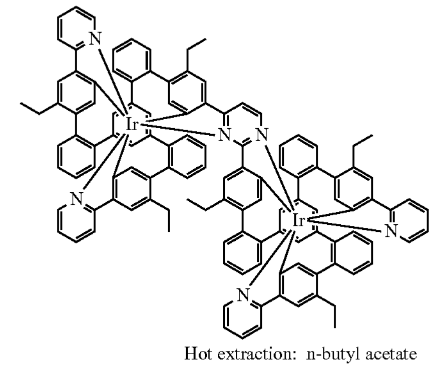 Hot extraction: n-butyl acetate | 24% |
| $Ir_2$150 | I2-$Ir_2$(L44-6Br) Variant B 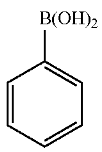 [98-80-6] | 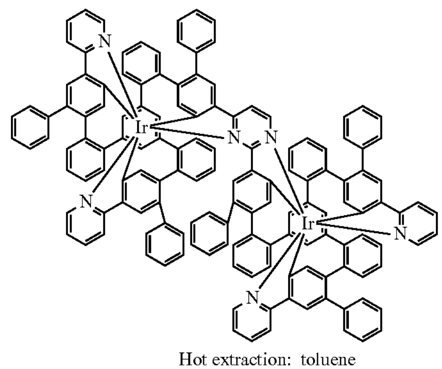 Hot extraction: toluene | 40% |

-continued
| | | | |
|---|---|---|---|
| $Ir_2$151 | I2-$Ir_2$(L47-6Br)<br>Variant B<br>$Pd(OAc)_2$/<br>S-Phos 1:1.3,<br>$Cs_2CO_3$, toluene<br>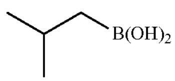<br>[84110-40-7] | 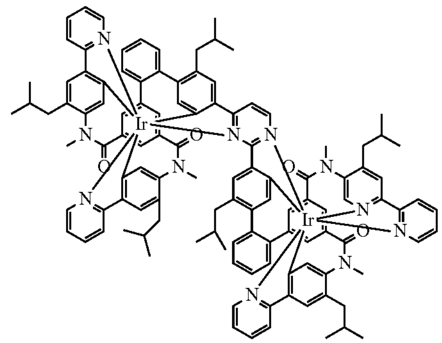<br>Hot extraction: ethyl acetate | 20% |
| $Ir_2$152 | I1-$Ir_2$(L66-6Br)<br>Variant A<br>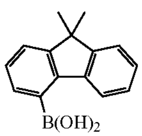<br>[1246022-50-3] | 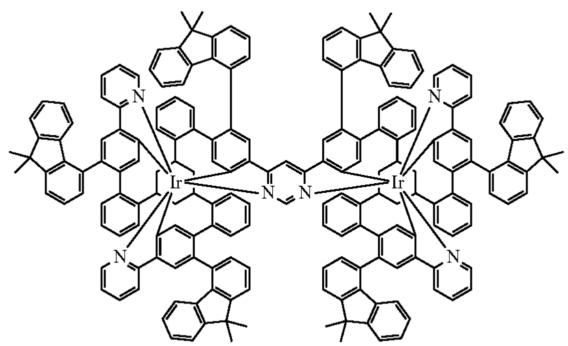<br>Hot extraction: n-butyl acetate | 43% |
| $Ir_2$153 | I2-$Ir_2$(L66-6Br)<br>Variant B<br>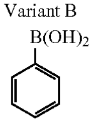<br>[98-80-6] | 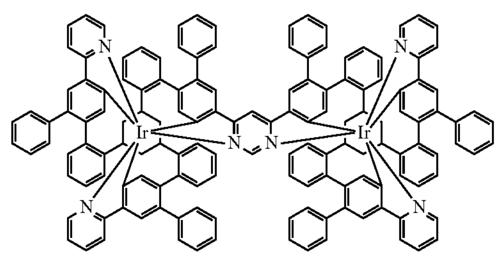<br>Hot extraction: toluene | 40% |

-continued
| | | | |
|---|---|---|---|
| $Ir_2154$ | I1-$Ir_2$(L91-4Br) Variant B 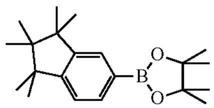 [1562418-16-9] | 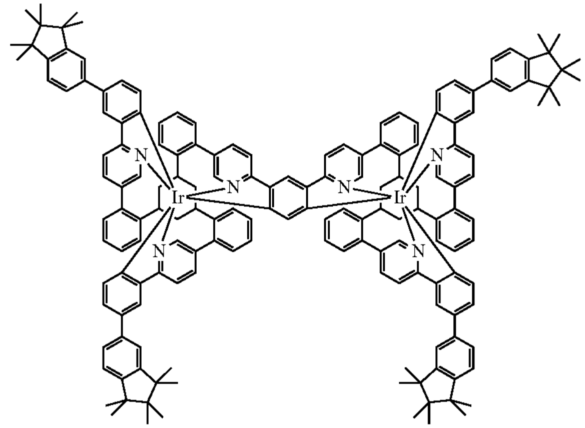 Hot extraction: ethyl acetate | 50% |
| $Ir_2155$ | I2-$Ir_2$(L91-4Br) Variant B 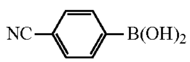 [126747-14-6] | 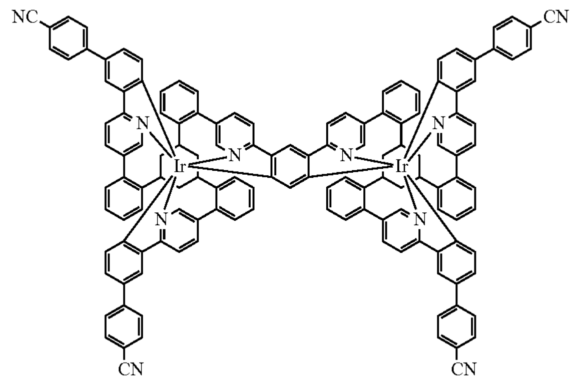 Hot extraction: n-butyl acetate | 44% |

-continued
| | | | |
|---|---|---|---|
| $Ir_2156$ | I1-$Ir_2$(L92-6Br)<br>Variant A<br>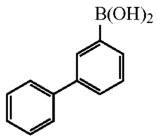<br>[5122-95-2] | 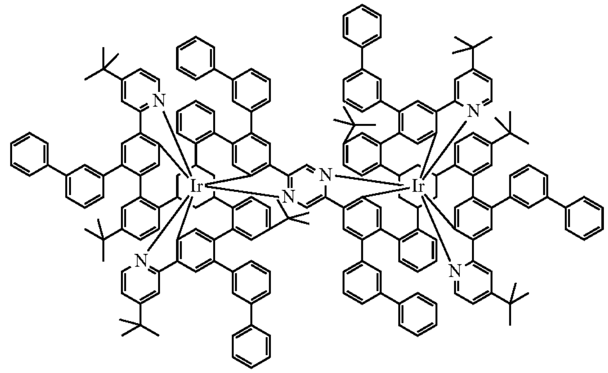<br>I1-$Ir_2$(L92)<br>Hot extraction: ethyl acetate | 25% |
| $Ir_2157$ | I2-$Ir_2$(L92-6Br)<br>Variant B<br>$Pd(OAc)_2$/<br>S-Phos 1:1.3,<br>$CsCO_3$, toluene<br>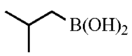<br>[84110-40-7] | 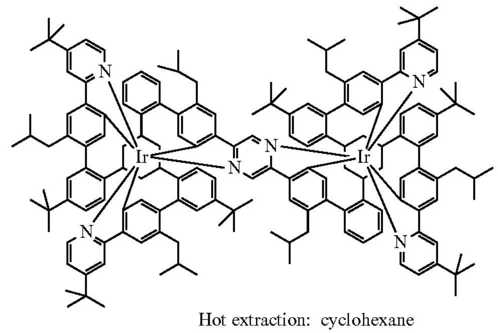<br>Hot extraction: cyclohexane | 24% |

-continued
| | | | |
|---|---|---|---|
| $Ir_2158$ | I1-$Ir_2$(L70-6Br) Variant A 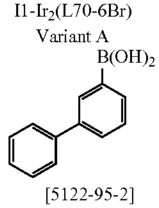  [5122-95-2] | 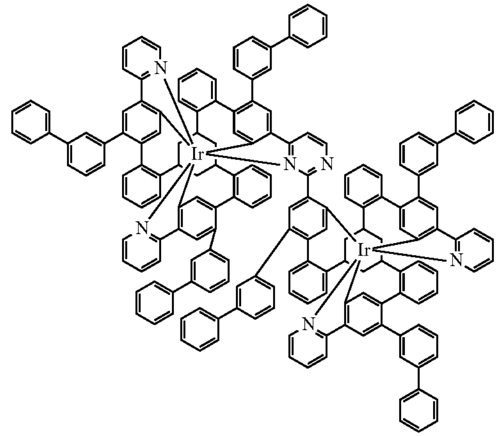  Hot extraction: n-butyl acetate | 33% |
| $Ir_2159$ | I1-$Ir_2$(L71-6Br) Variant A 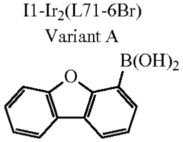  [100124-06-9] | 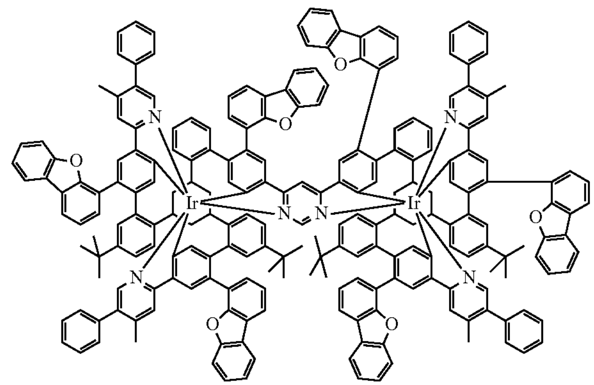  Hot extraction: toluene | 36% |

-continued
| | | | |
|---|---|---|---|
| $Ir_2160$ | I1-$Ir_2$(L72-6Br) Variant B 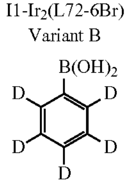 [215527-70-1] | 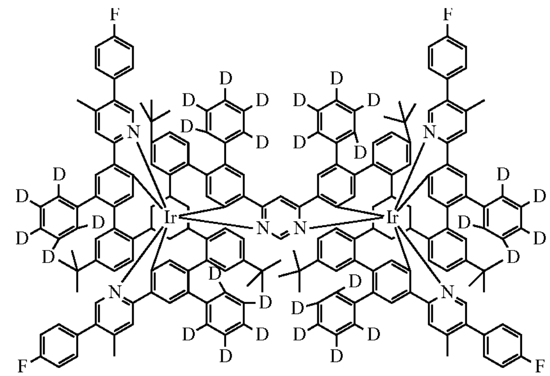 Hot extraction: toluene | 49% |
| $Ir_2161$ | I2-$Ir_2$(L72-6Br) Variant A 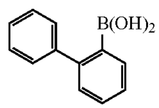 [4688-76-0] | 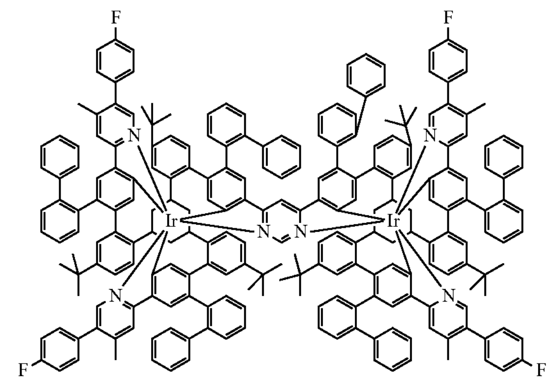 Hot extraction: ethyl acetate | 29% |

-continued
| | | | |
|---|---|---|---|
| $Ir_2162$ | I1-$Ir_2$(L50-6Br) Variant A 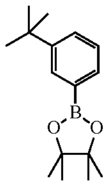 [627526-15-2] | 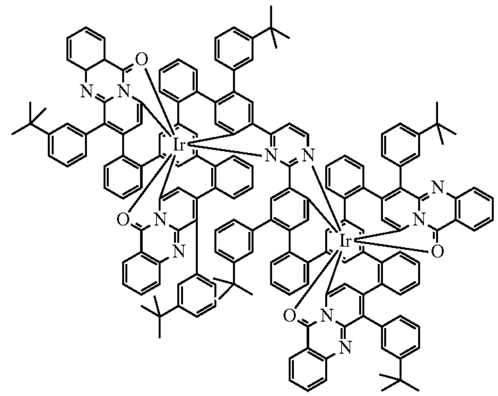 Hot extraction: cyclohexane | 38% |
| $Ir_2163$ | I2-$Ir_2$(L33-6Br) Variant A 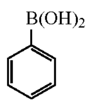 [98-80-6] | 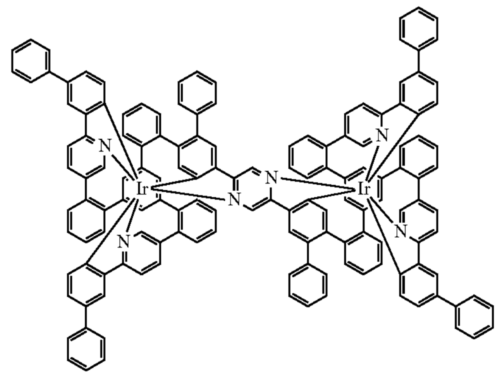 Hot extraction: n-butyl acetate | 55% |

General synthetic scheme for the preparation of further metal complexes P1 to P240:
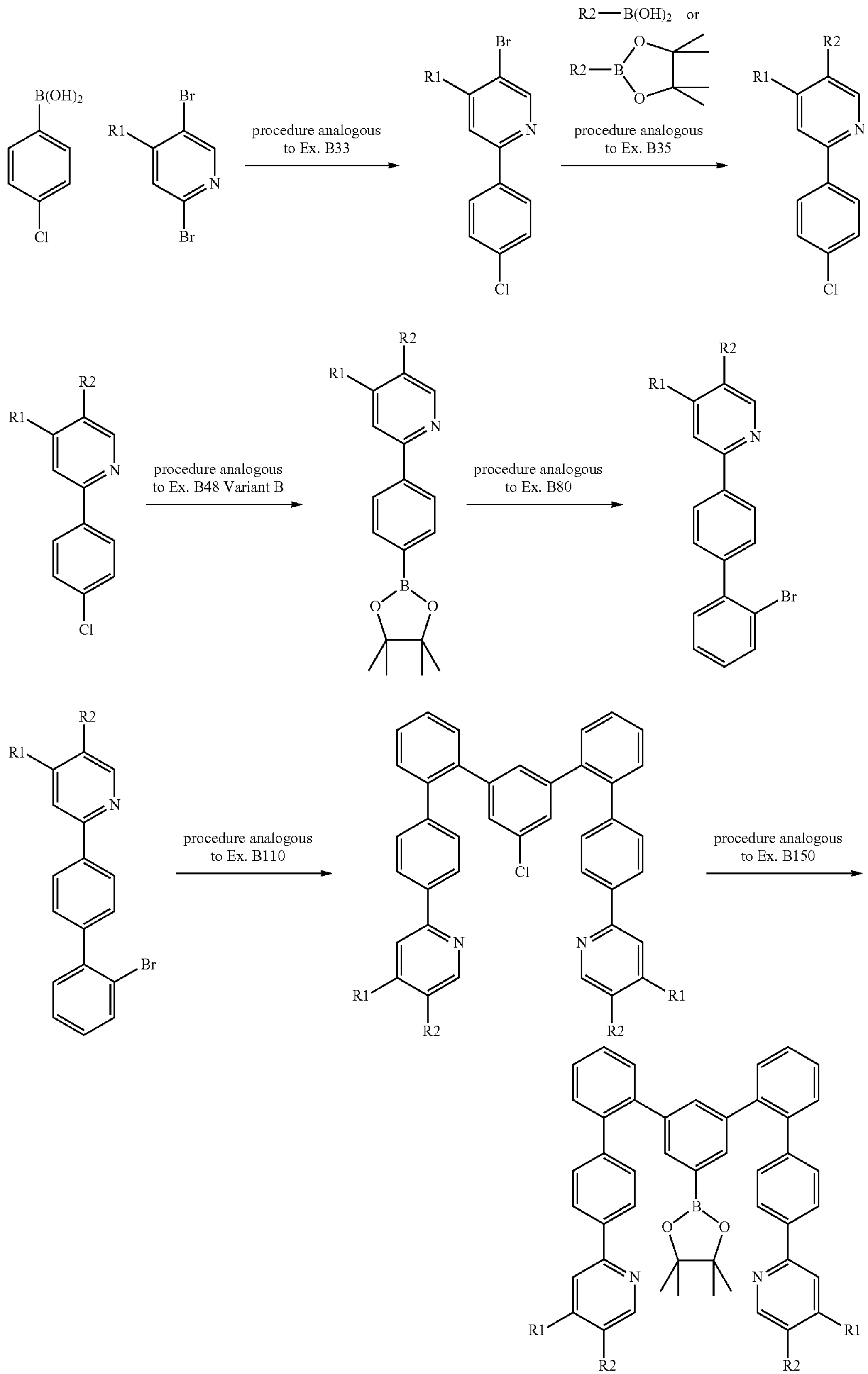

-continued
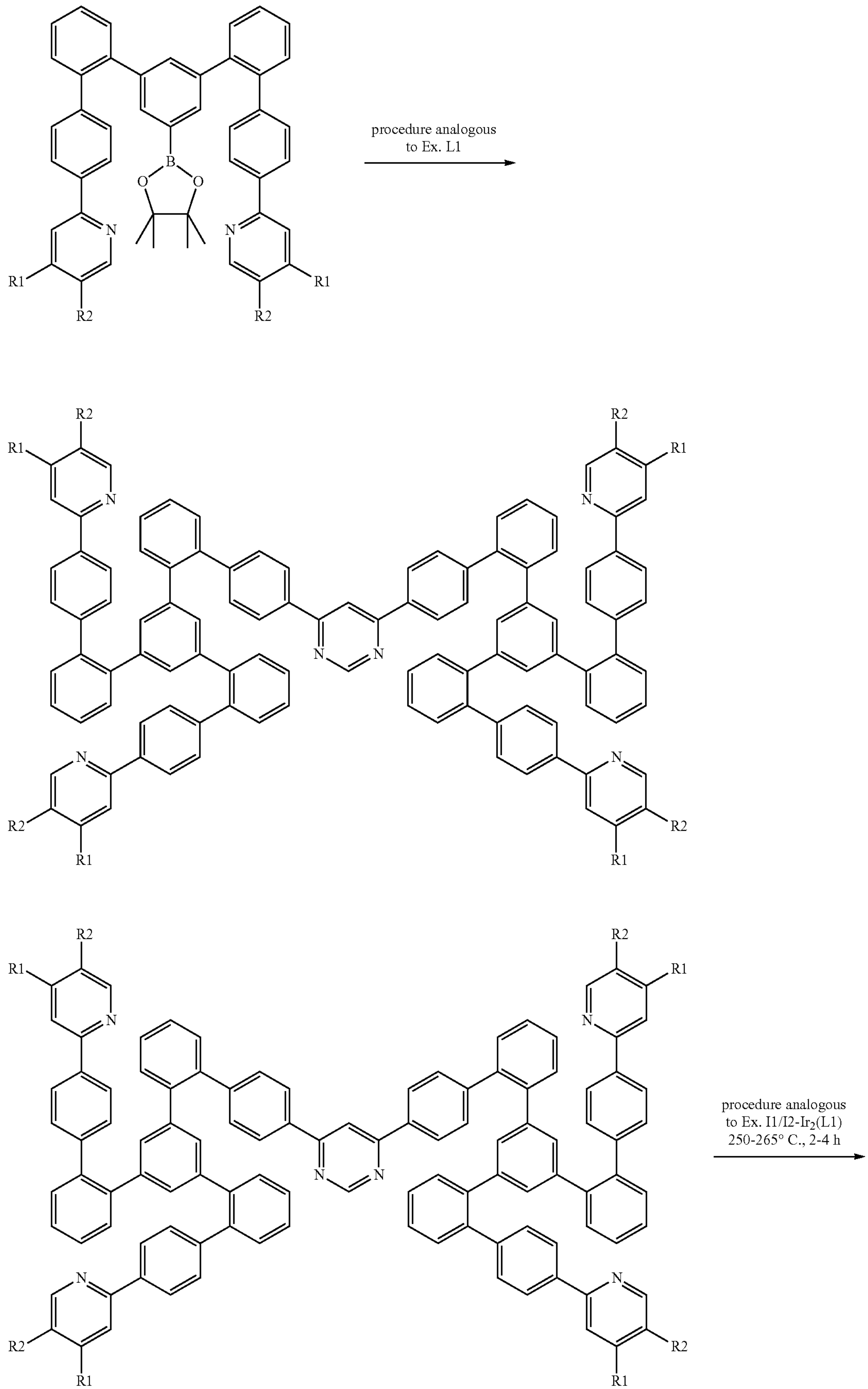

-continued
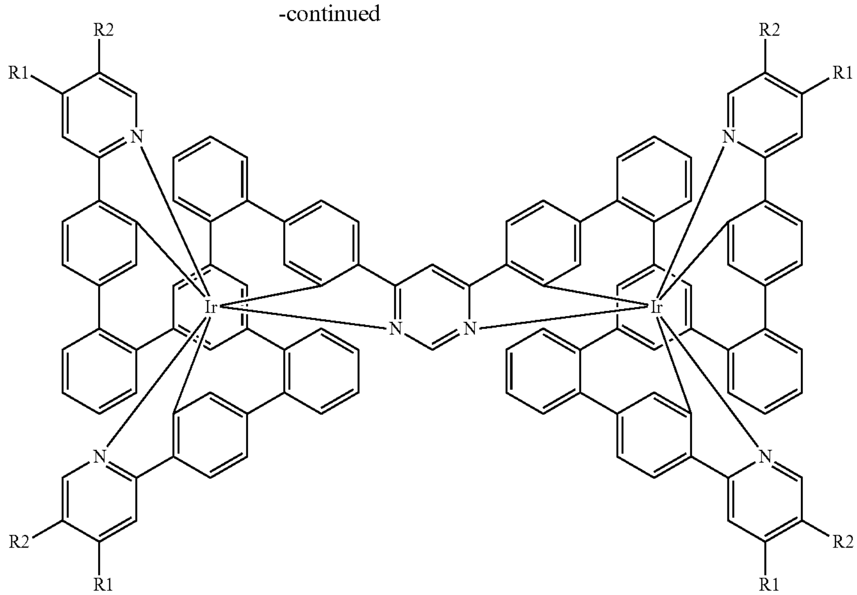
The metal complexes depicted in the table below can be prepared by the synthetic scheme depicted above starting from the starting materials indicated:

| Ex. | Starting materials | |
|---|---|---|
| P1 | 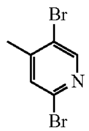 [3430-26-0] 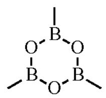 [823-96-1] | 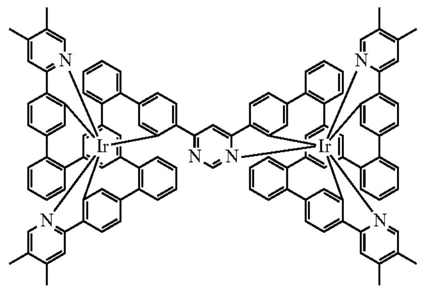 |
| P2 | [3430-26-0] 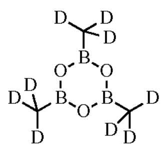 [1321518-31-3] | 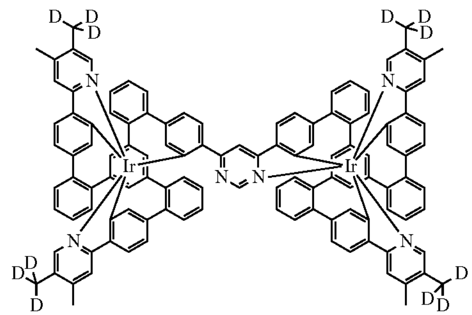 |
| P3 | [3430-26-0] 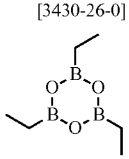 [3043-60-5] | 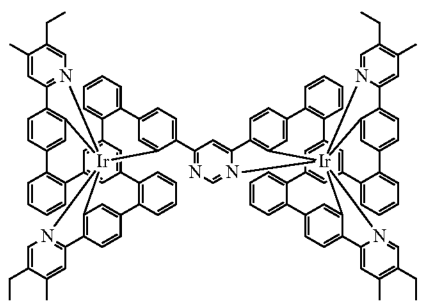 |

-continued
| | | |
|---|---|---|
| P4 | [3430-26-0] 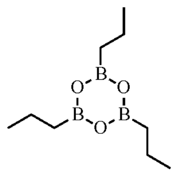 [7325-08-8] | 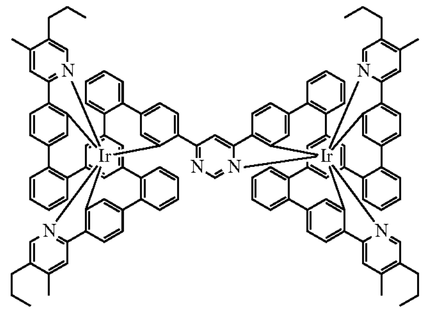 |
| P5 | [3430-26-0] 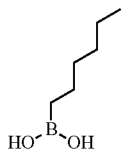 [16343-08-1] | 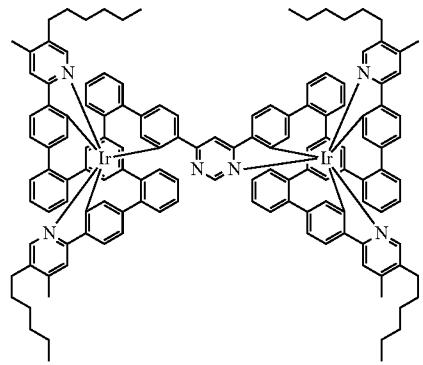 |
| P6 | [3430-26-0] 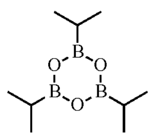 [66740-05-4] | 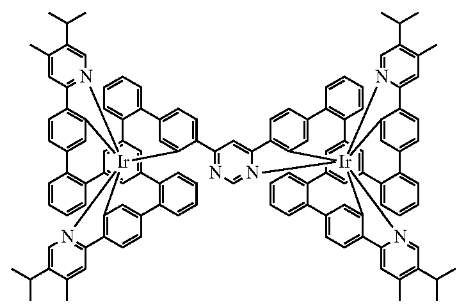 |

-continued
| | | | |
|---|---|---|---|
| P7 | [3430-26-0] | 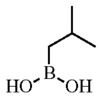 [84110-40-7] | 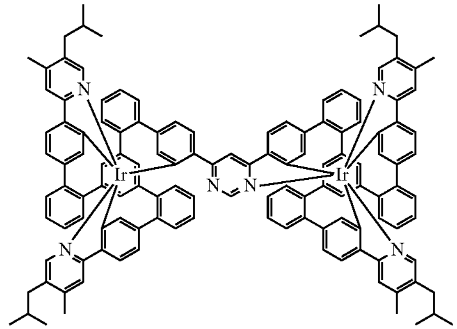 |
| P8 | [3430-26-0] | 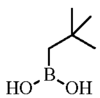 [701261-35-0] | 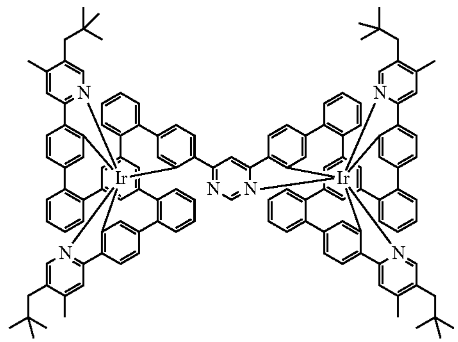 |
| P9 | [3430-26-0] | 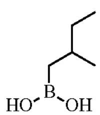 [125228-70-8] | 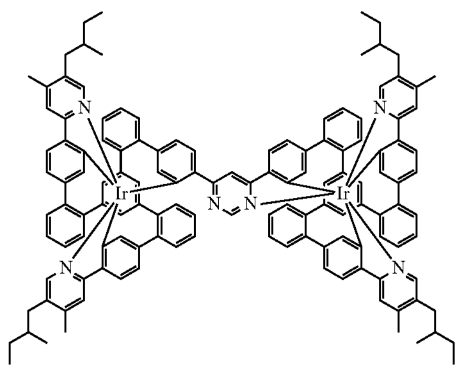 |

-continued
| | | | |
|---|---|---|---|
| P10 | [3430-26-0]<br>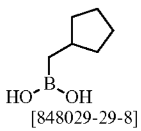<br>[848029-29-8] | 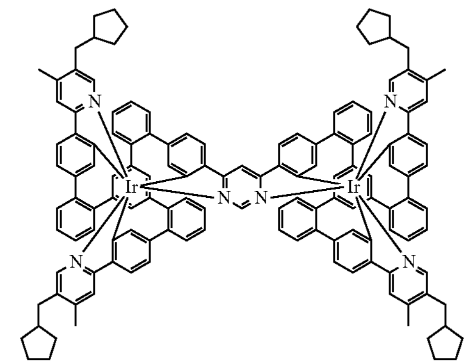 | |
| P11 | [3430-26-0]<br>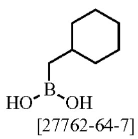<br>[27762-64-7] | 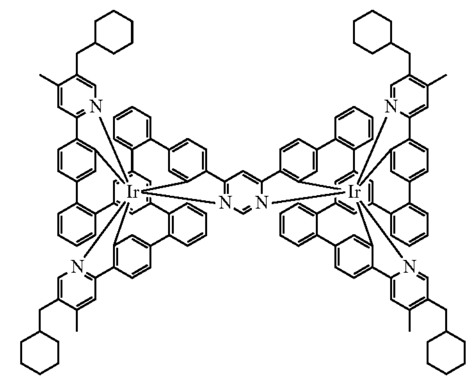 | |

-continued
| | | |
|---|---|---|
| P12 | [3430-26-0] 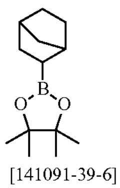 [141091-39-6] | 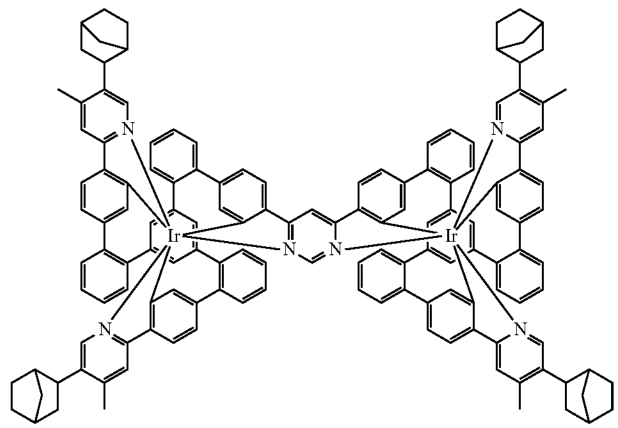 |
| P13 | [3430-26-0] 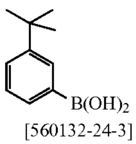 [560132-24-3] | 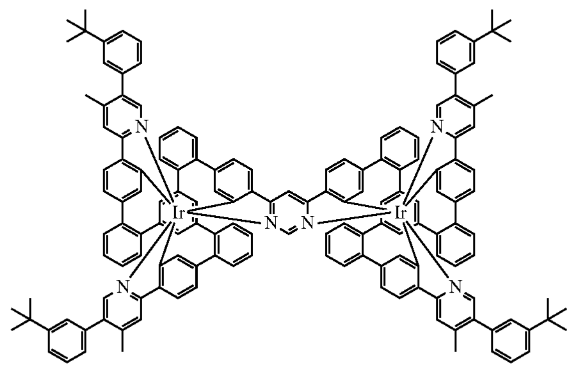 |

-continued
| | | |
|---|---|---|
| P14 | [3430-26-0] 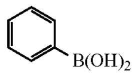 [98-80-6] | 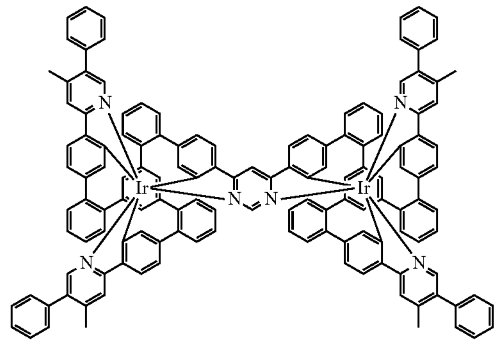 |
| P15 | [3430-26-0] 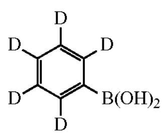 [215527-70-1] | 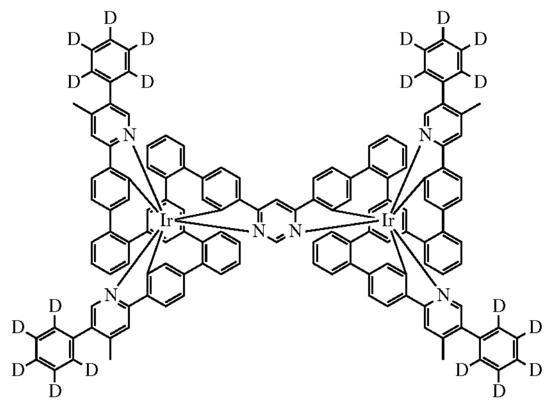 |
| P16 | [3430-26-0] 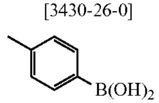 [5720-05-8] | 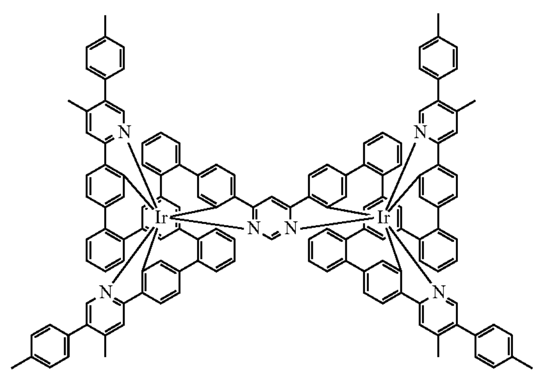 |

-continued
| | | | |
|---|---|---|---|
| P17 | [3430-26-0]<br>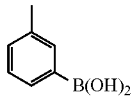<br>[17933-03-8] | 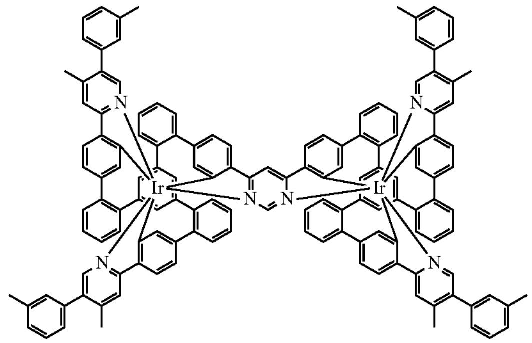 | |
| P18 | [3430-26-0]<br>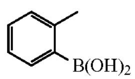<br>[16419-90-6] | 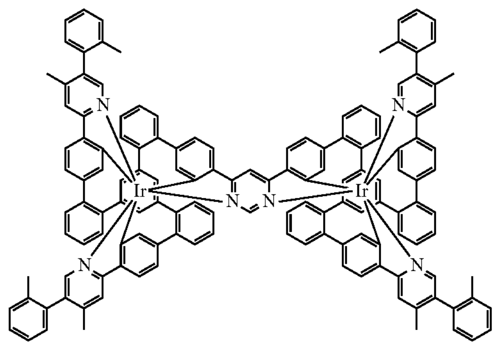 | |
| P19 | [3430-26-0]<br>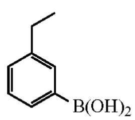<br>[90555-65-0] | 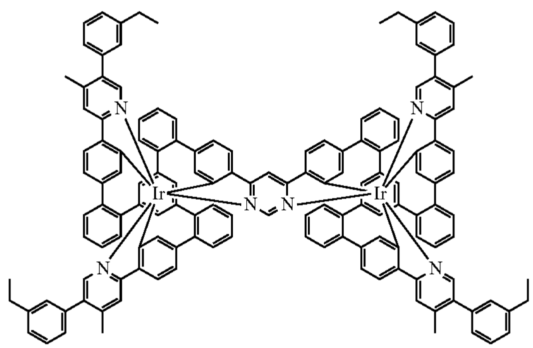 | |

-continued
P20 [3430-26-0]
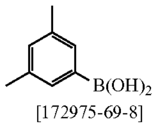
[172975-69-8]
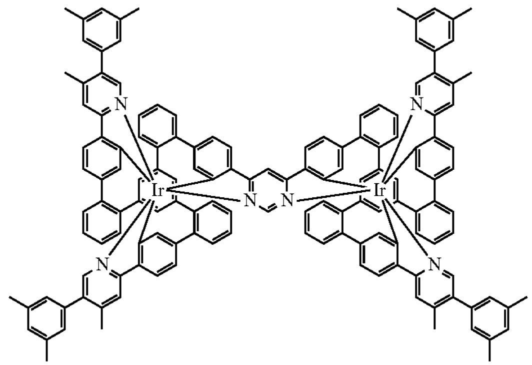
P21 [3430-26-0]
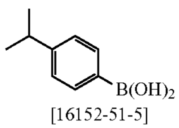
[16152-51-5]
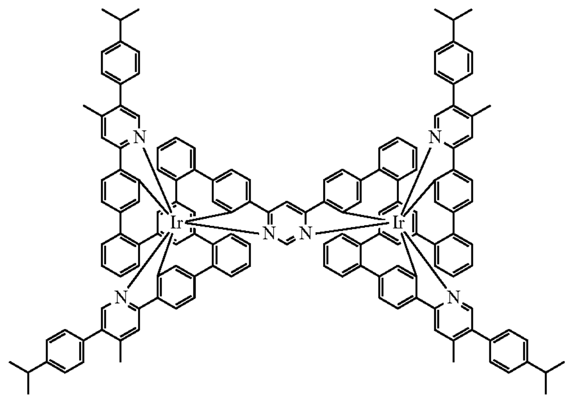

-continued
| | | |
|---|---|---|
| P22 | [3430-26-0] 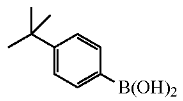 [123324-71-0] | 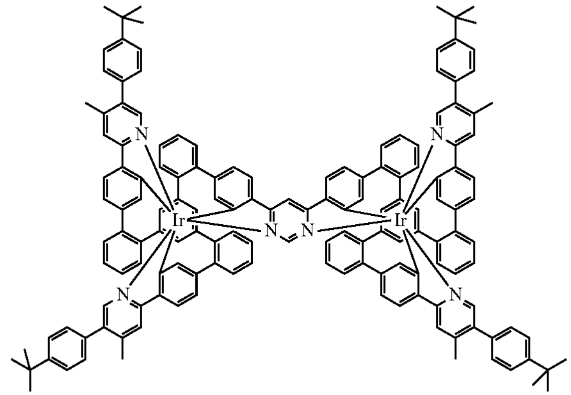 |
| P23 | [3430-26-0] 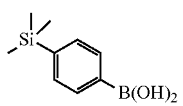 [17865-11-1] | 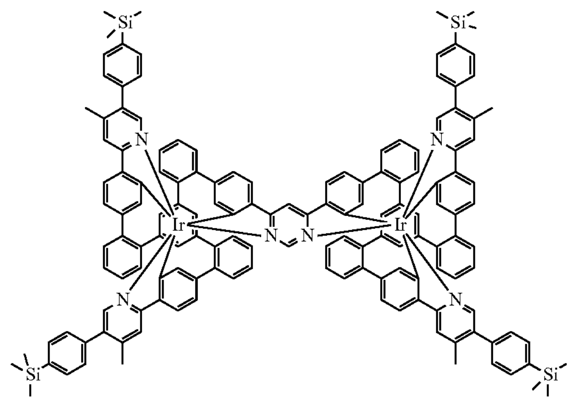 |

-continued
| | | |
|---|---|---|
| P24 | [3430-26-0] 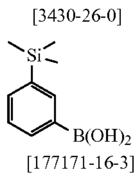 [177171-16-3] | 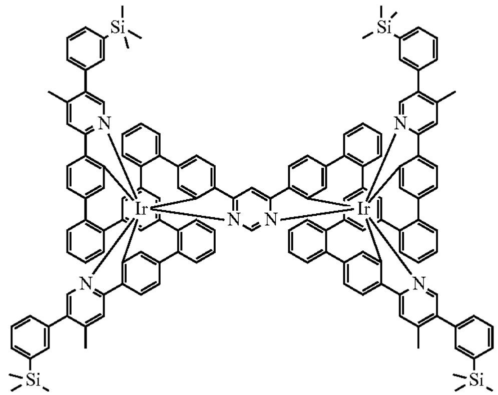 |
| P25 | [3430-26-0] 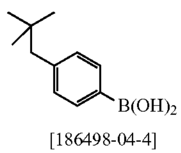 [186498-04-4] | 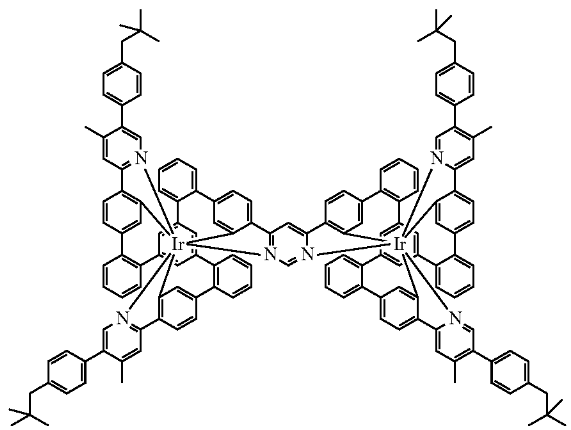 |

-continued
| | | | |
|---|---|---|---|
| P26 | [3430-26-0] 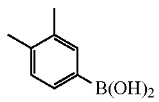 [55499-43-9] | | 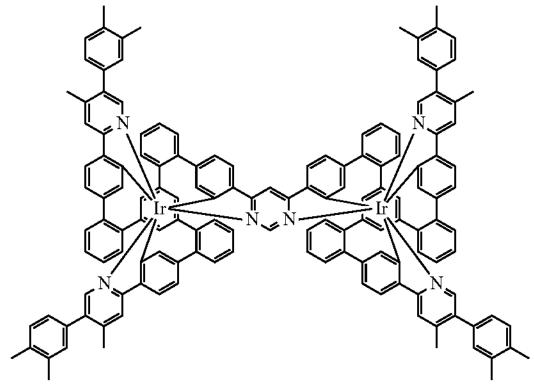 |
| P27 | [3430-26-0] 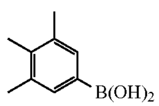 [1246-22-53-6] | | 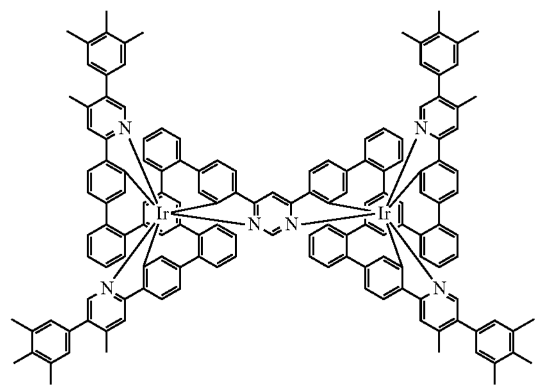 |

-continued
| | | | |
|---|---|---|---|
| P28 | [3430-26-0] 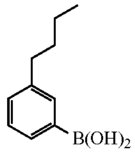 [743437-84-5] | 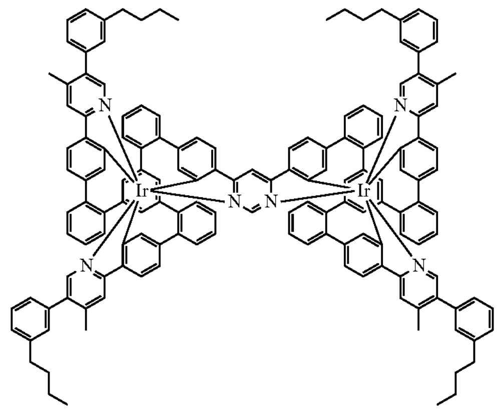 | |
| P29 | [3430-26-0] 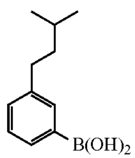 [179251-20-8] | 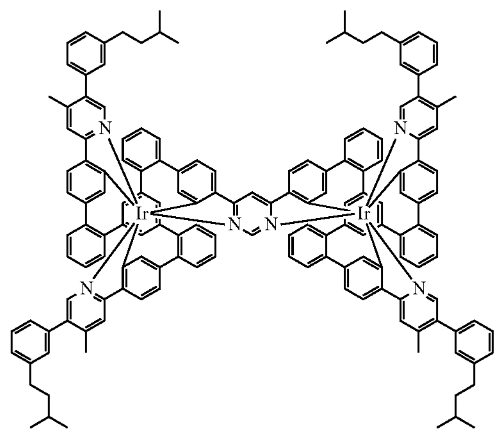 | |

-continued
| | | |
|---|---|---|
| P30 | [3430-26-0] 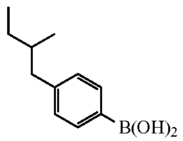  [179251-35-5] | 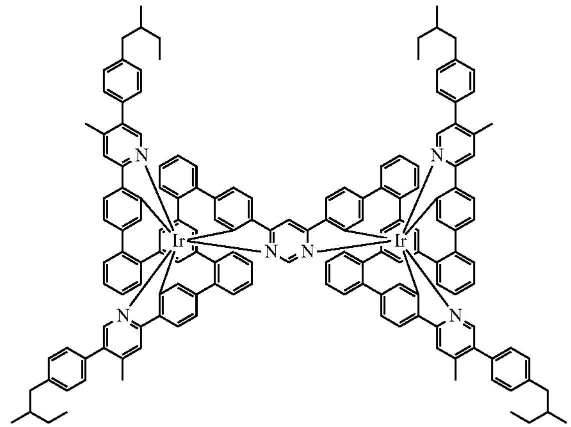  |
| P31 | [3430-26-0] 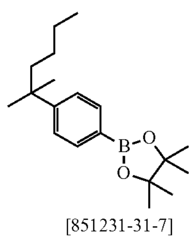  [851231-31-7] | 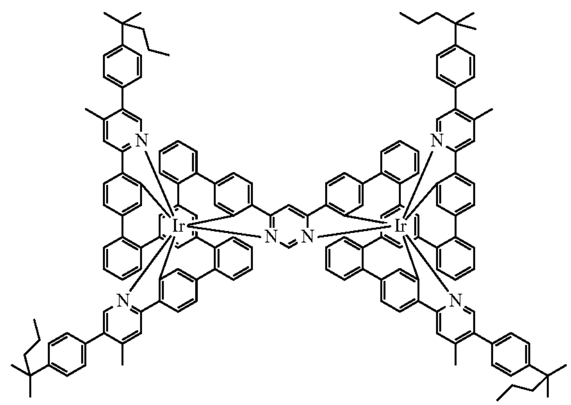  |

-continued
| | | |
|---|---|---|
| P32 | [3430-26-0] 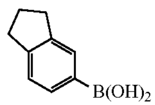 [196861-31-1] | 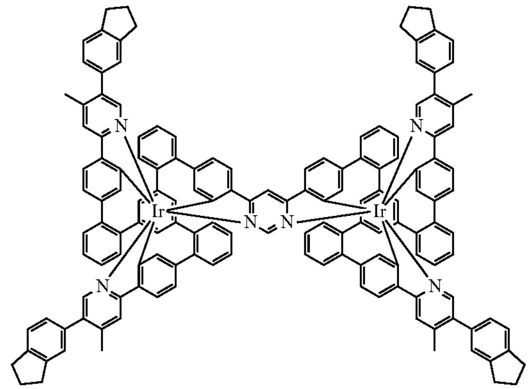 |
| P33 | [3430-26-0] 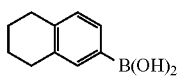 [405888-56-4] | 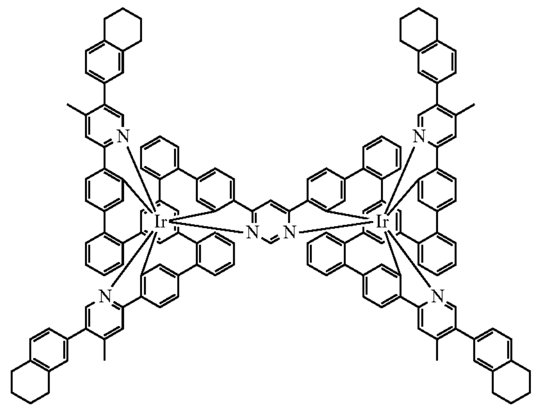 |

-continued
P34 [3430-26-0]
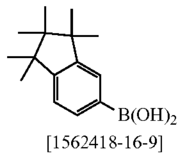
[1562418-16-9]
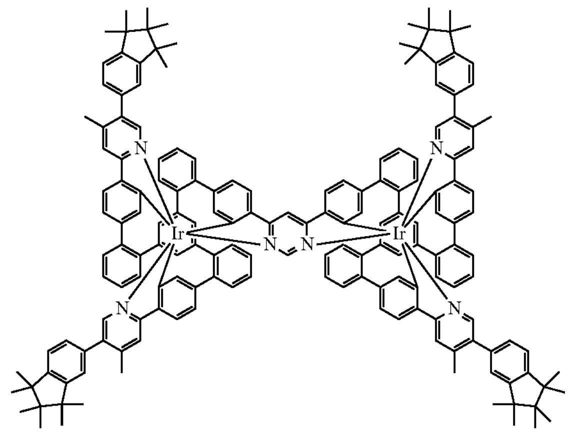
P35 [3430-26-0]
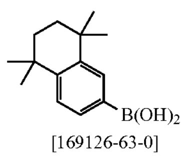
[169126-63-0]
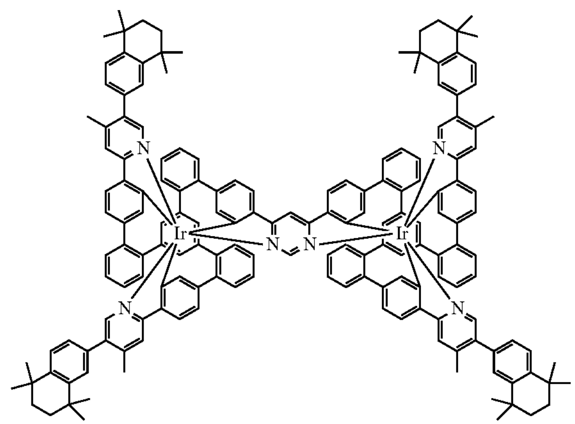

-continued
P36
[3430-26-0]
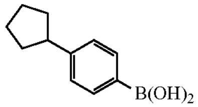
[945837-57-0]
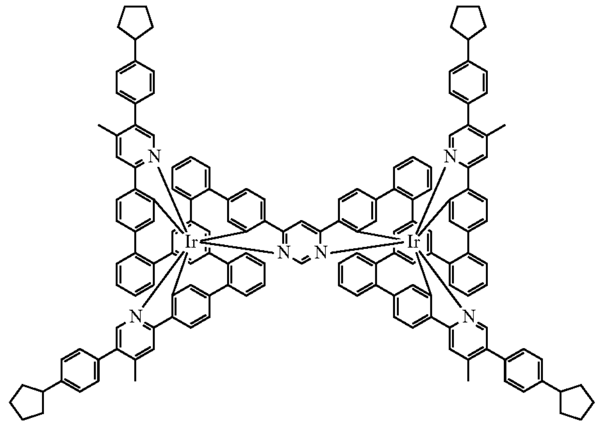
P37
[3430-26-0]
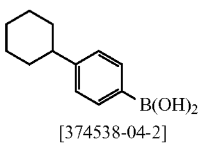
[374538-04-2]
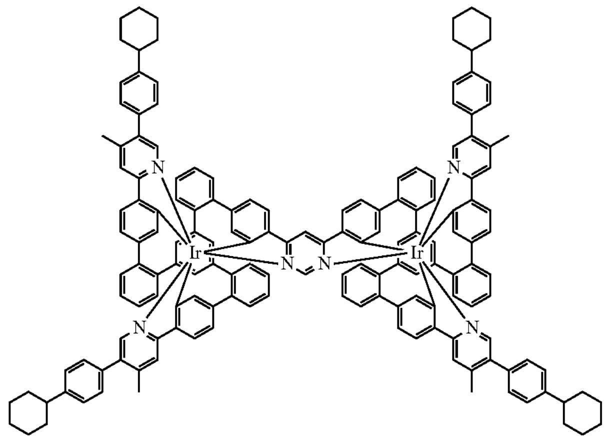

-continued
| | | |
|---|---|---|
| P38 | [3430-26-0]<br>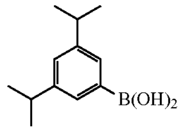<br>[263397-82-6] | 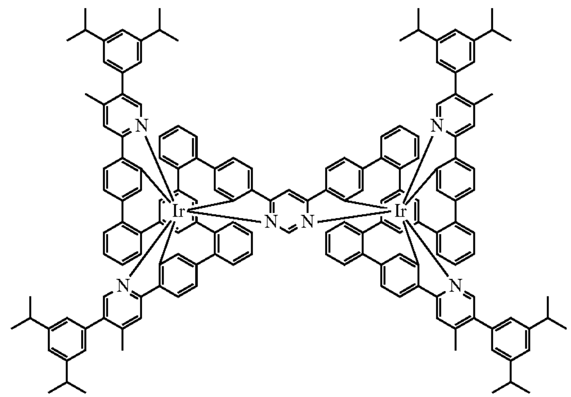 |
| P39 | [3430-26-0]<br>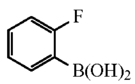<br>[1993-03-9] | 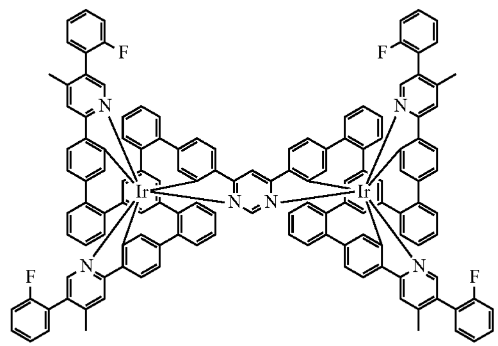 |

-continued
| | | |
|---|---|---|
| P40 | [3430-26-0]<br>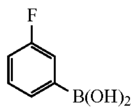<br>[768-35-4] | 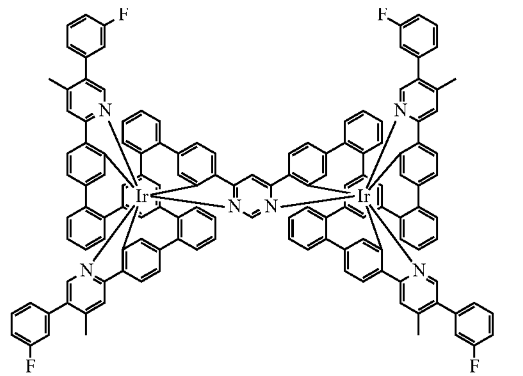 |
| P41 | [3430-26-0]<br>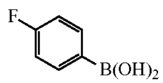<br>[1765-93-1] | 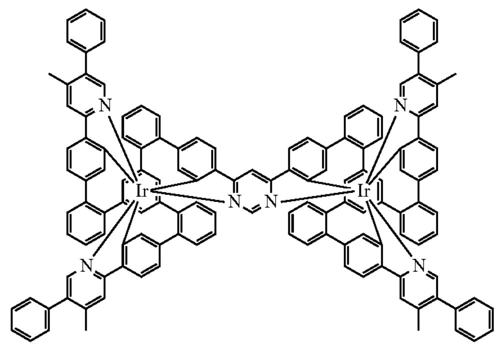 |
| P42 | [3430-26-0]<br>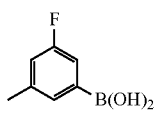<br>[850593-06-5] | 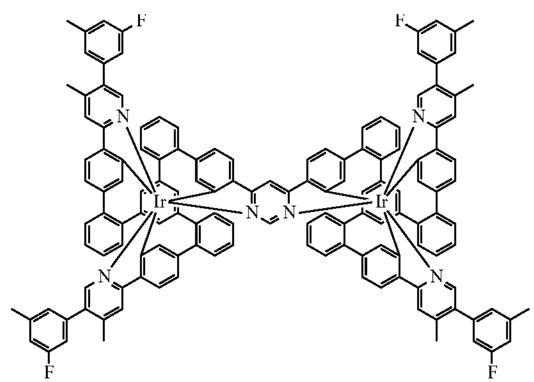 |

-continued
P43 [3430-26-0]
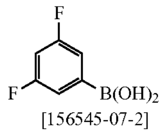
[156545-07-2]
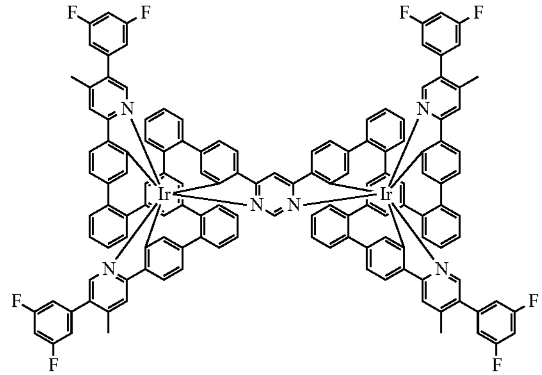
P44 [3430-26-0]
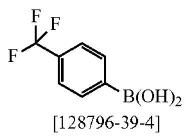
[128796-39-4]
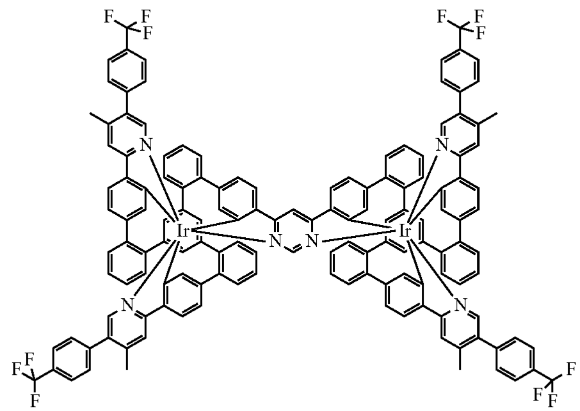

-continued
| | | |
|---|---|---|
| P45 | [3430-26-0] 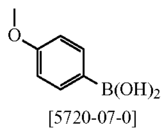 [5720-07-0] | 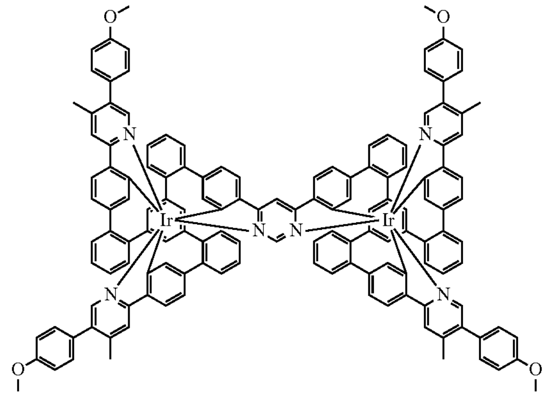 |
| P46 | [3430-26-0] 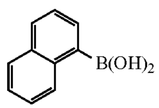 [13922-41-3] | 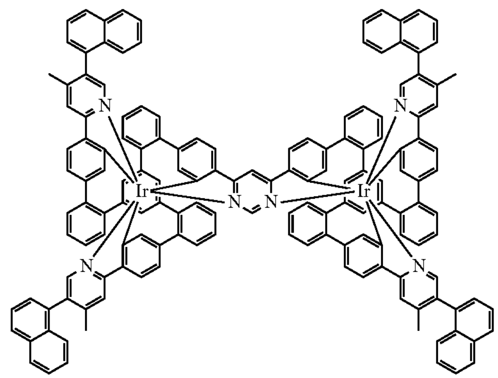 |

-continued
P47 [3430-26-0]
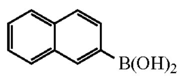
[32316-92-0]
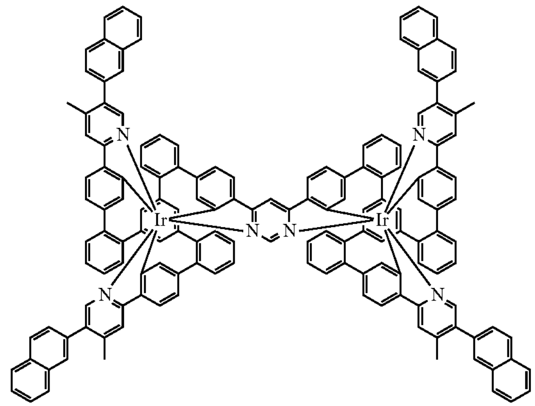
O48 [3430-26-0]
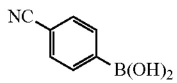
[161664-51-3]
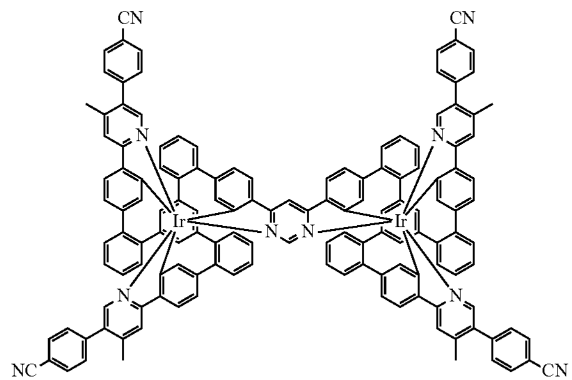

-continued
P49
[3430-36-0]
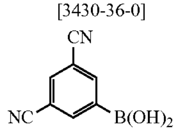
[1212021-54-9]
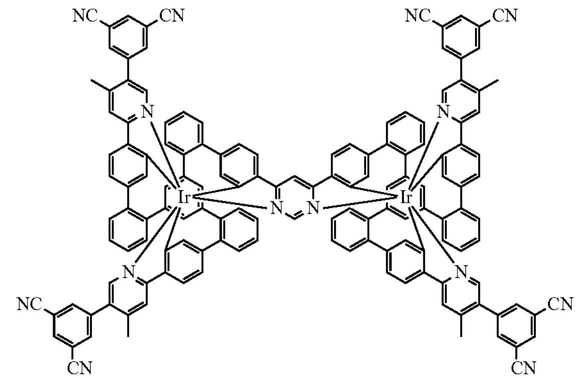
P50
[3430-26-0]
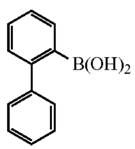
[4688-76-0]
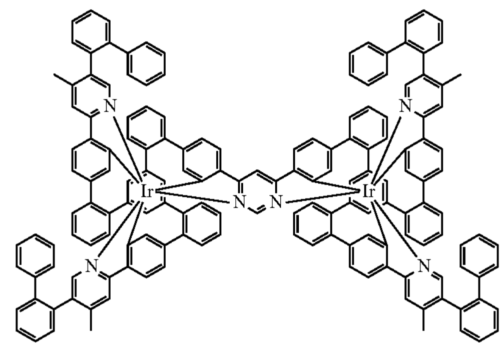
P51
[3430-26-0]
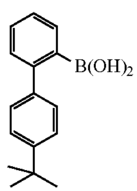
[1228458-46-5]
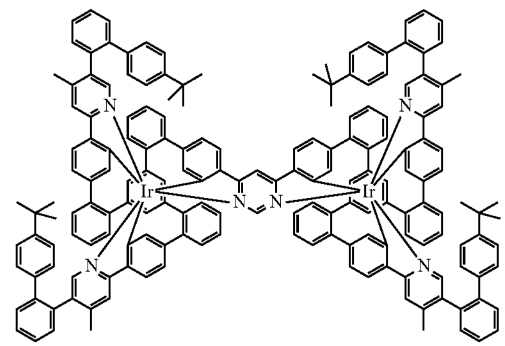

-continued
| | | |
|---|---|---|
| P52 | [3430-26-0] 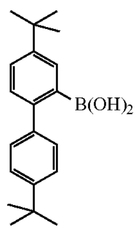  [1252935-66-2] | 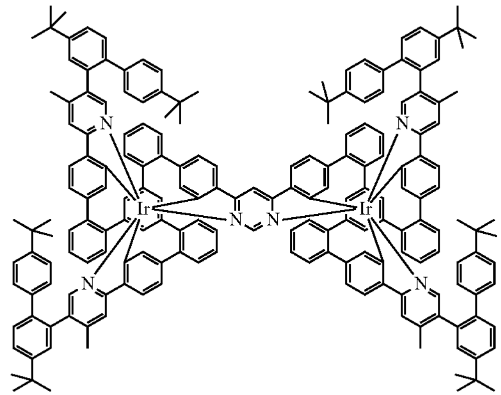  |
| P53 | [3430-26-0] 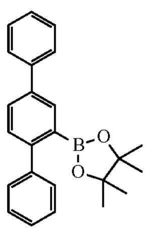  [1283088-35-6] | 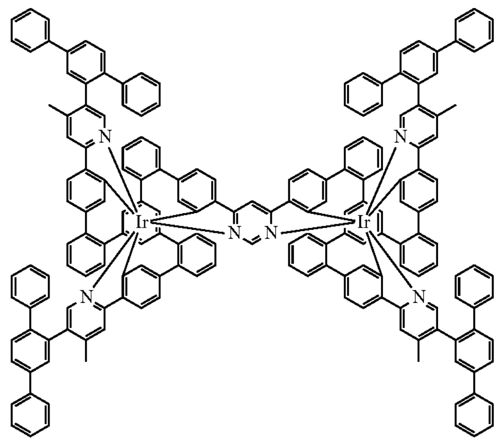  |

-continued
P54
[3430-26-0]
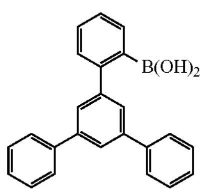
[1891052-65-5]
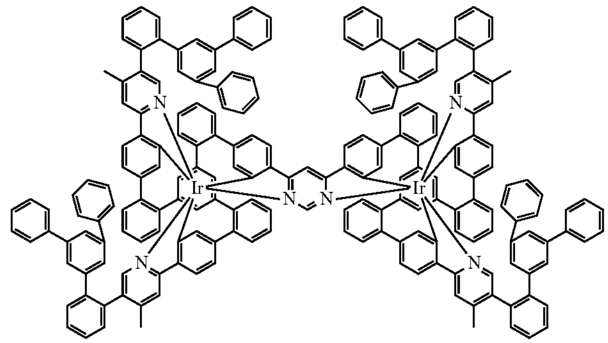
P55
[3430-26-0]
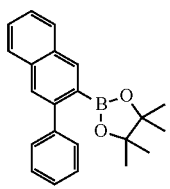
[1166381-29-8]
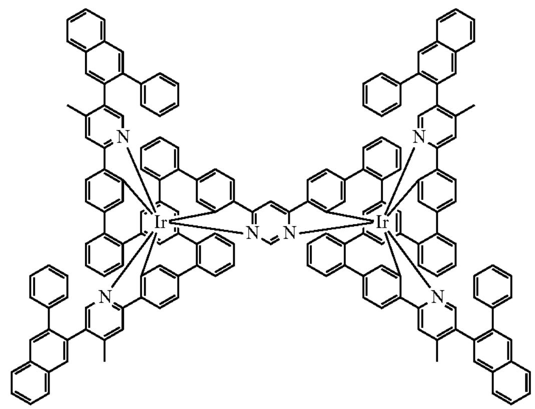
P56
[3430-26-0]
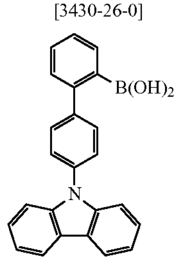
[1215228-59-3]
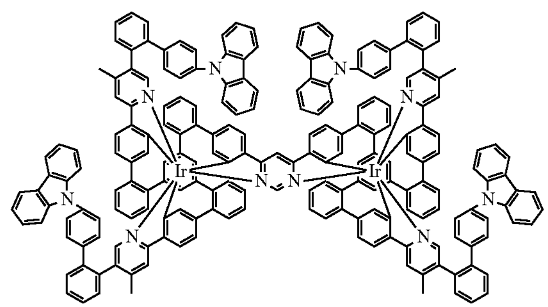

-continued
P57
[3430-26-0]
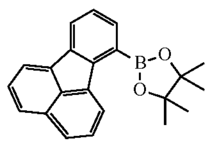
[1005770-96-6]
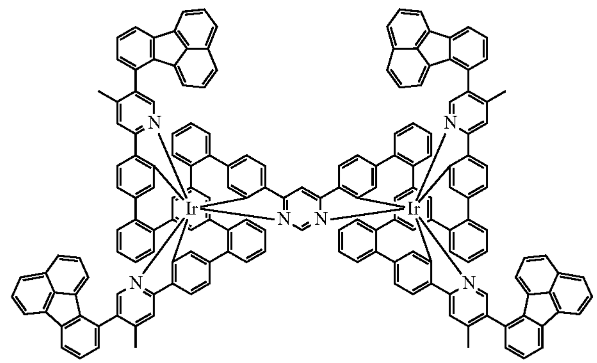
P58
[3430-26-0]
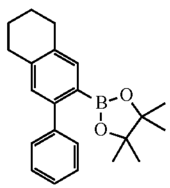
[781645-71-4]
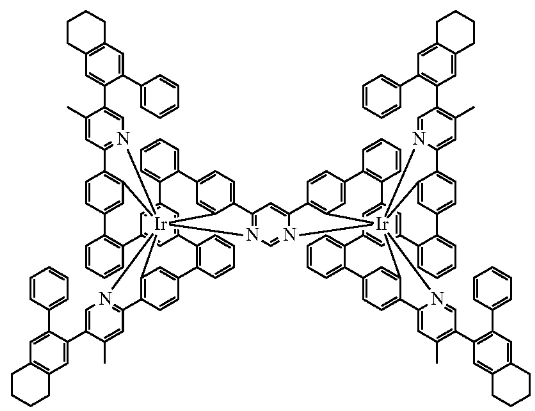

-continued
P59 [3430-26-0]
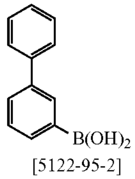
[5122-95-2]
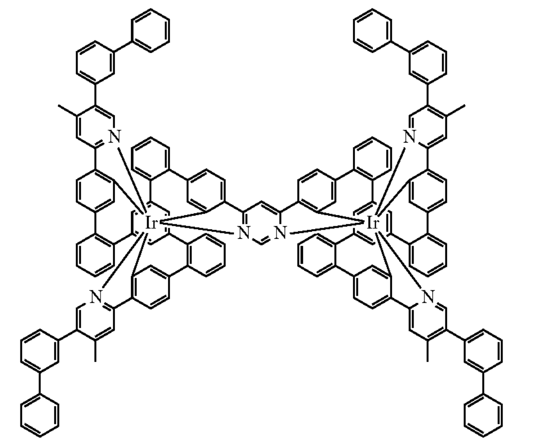
P60 [3430-26-0]
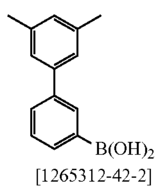
[1265312-42-2]
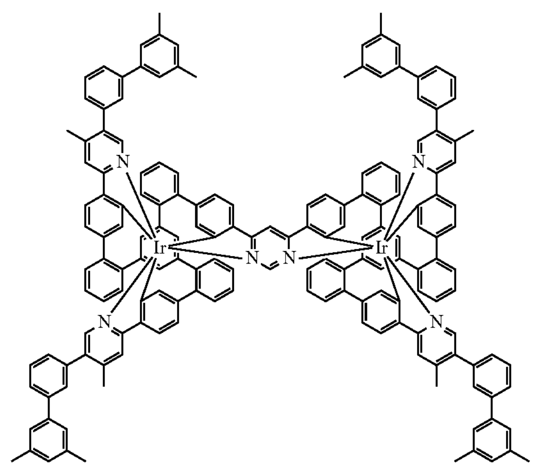

-continued
P61 [3430-26-0]
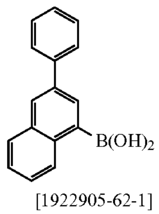
[1922905-62-1]
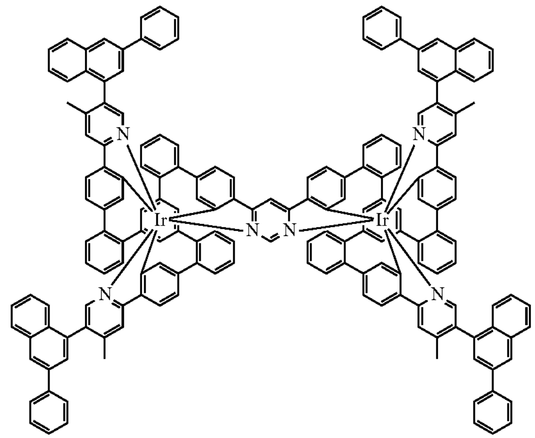
P62 [3430-26-0]
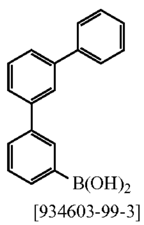
[934603-99-3]
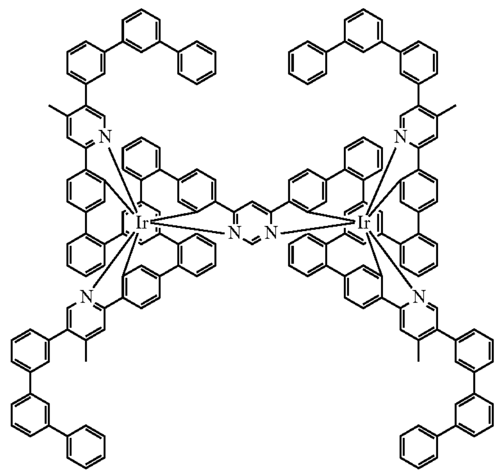

-continued
P63 [3430-26-0]
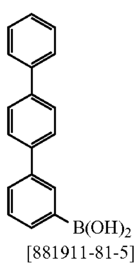
[881911-81-5]
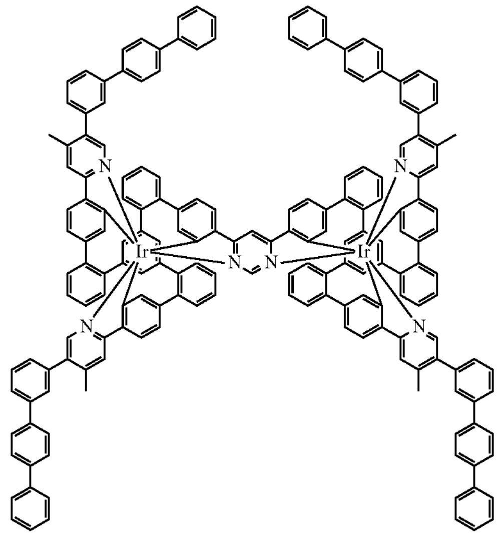
P64 [3430-26-0]
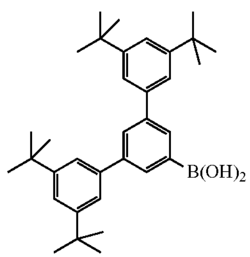
[501928-23-0]
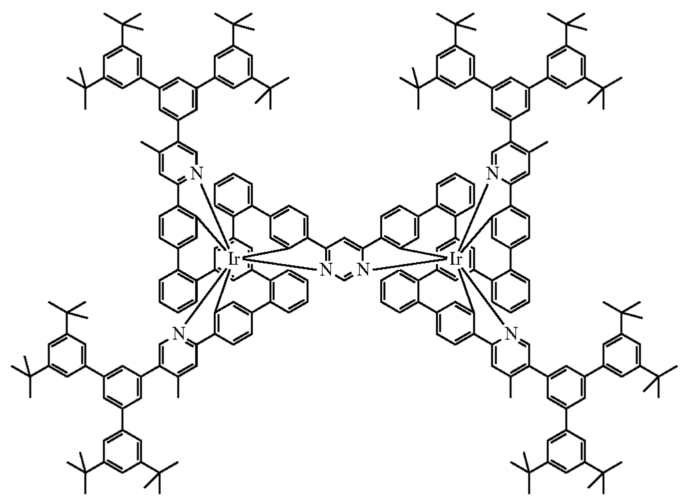

-continued
P65
[3430-26-0]
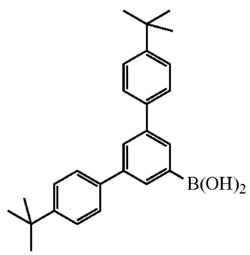
[142180-21-6]
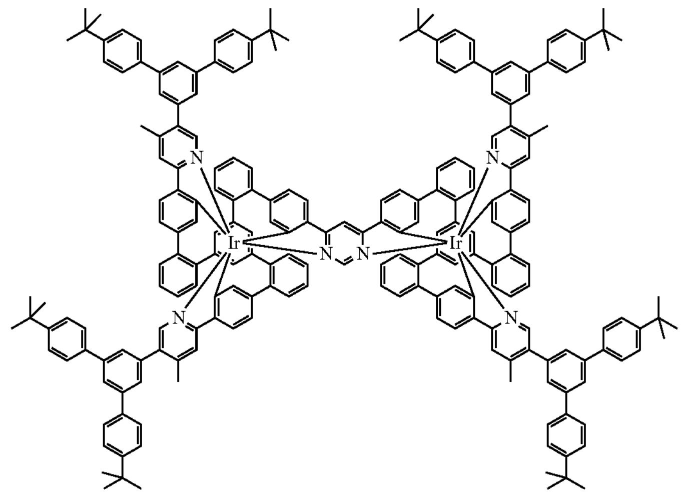
P66
[3430-26-0]
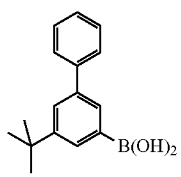
[1345508-82-8]
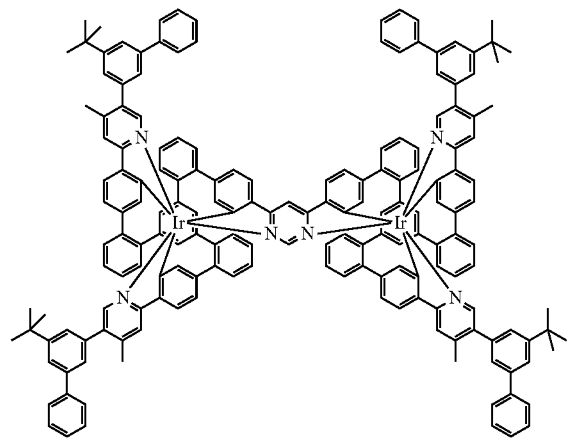

-continued
P67
[3430-26-0]
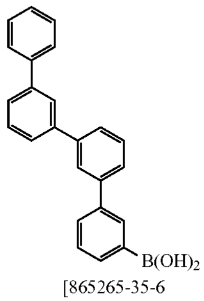
[865265-35-6
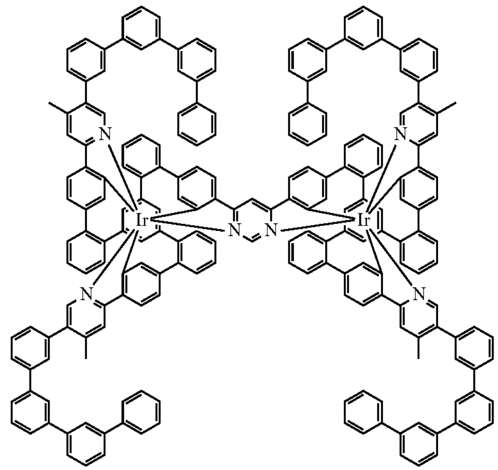
P68
[3430-26-0]
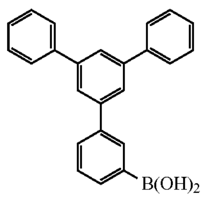
[1233200-59-3]
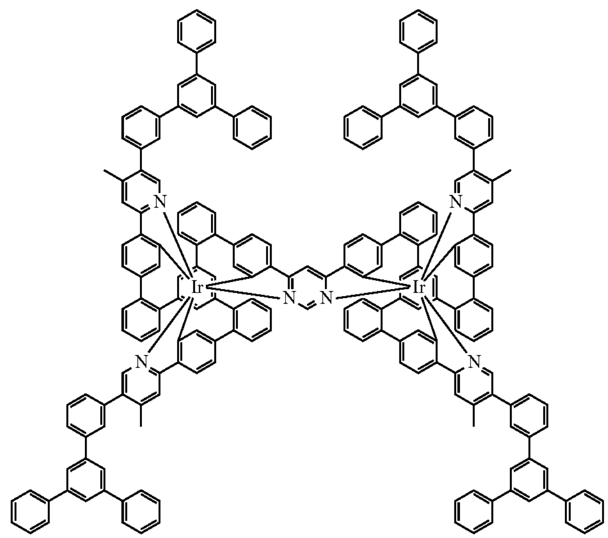

-continued
P69 [3430-26-0]
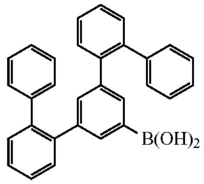
[1821431-53-1]
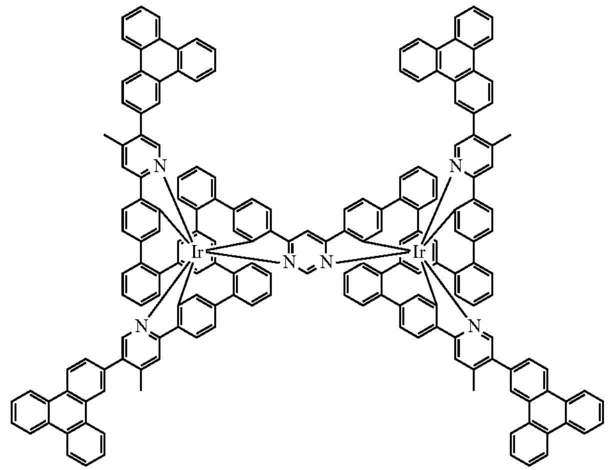
P70 [3430-26-0]
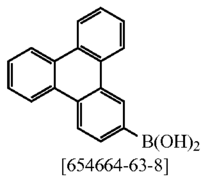
[654664-63-8]
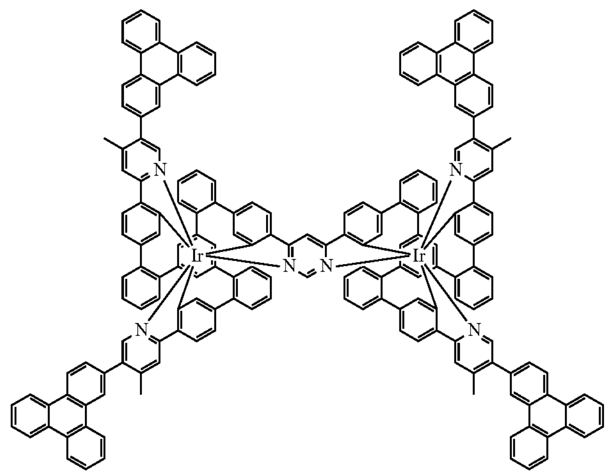

-continued
| | | | |
|---|---|---|---|
| P71 | [3430-26-0] 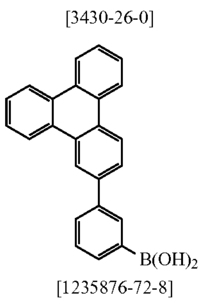 [SMILES: OB(O)c1cccc(-c2ccc3c4ccccc4c4ccccc4c3c2)c1] [1235876-72-8] | | 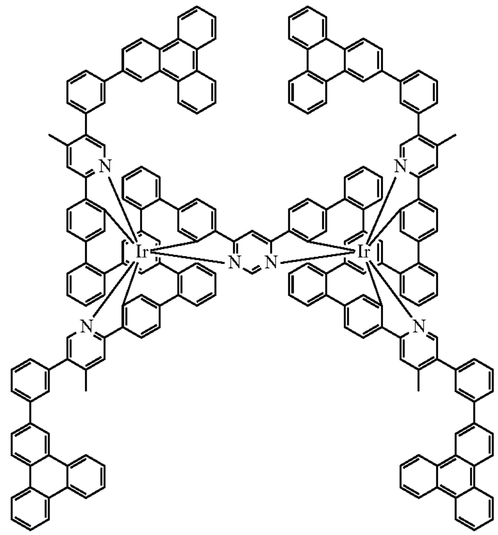 |
| P72 | [3430-26-0] 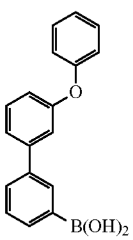 [346418-36-8] | | 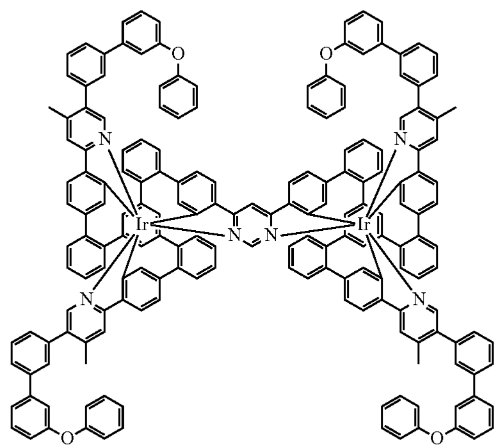 |

-continued
| | | |
|---|---|---|
| P73 | [3430-26-0] 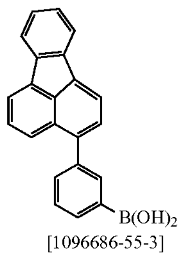 [1096686-55-3] | 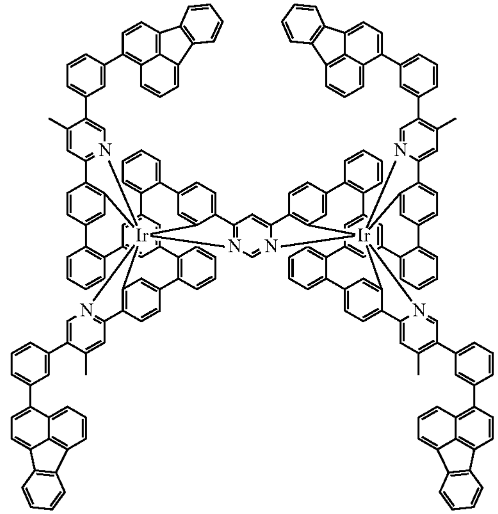 |
| P74 | [3430-26-0] 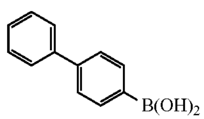 [5122-94-1] | 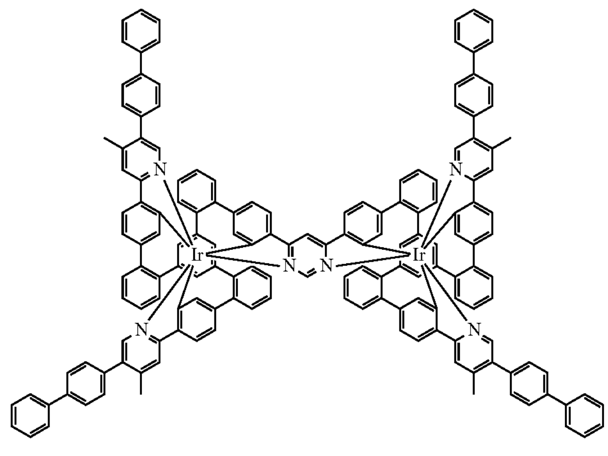 |

-continued
| | | | |
|---|---|---|---|
| P75 | [3430-26-0] 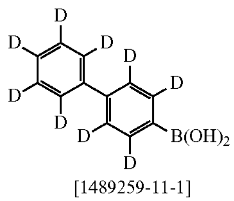 [1489259-11-1] | 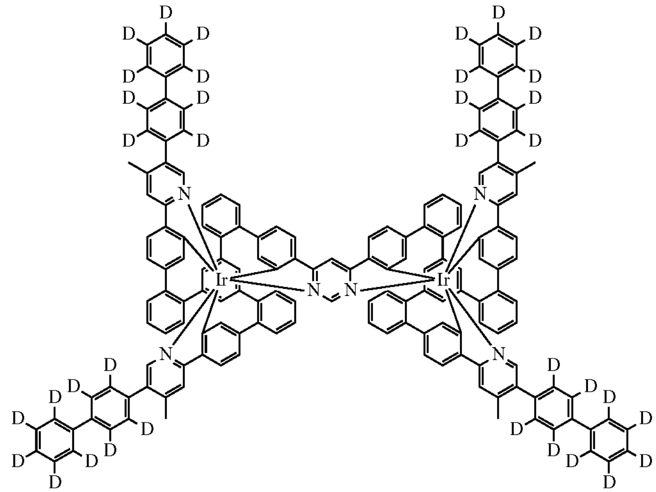 | |
| P76 | [3430-26-0] 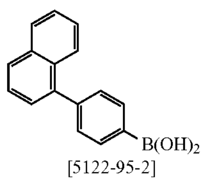 [5122-95-2] | 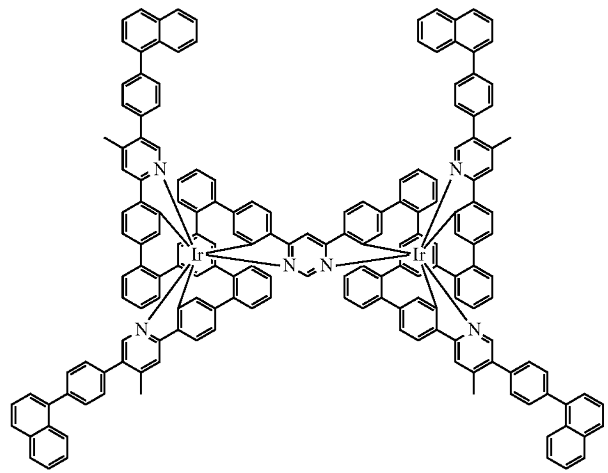 | |

-continued
P77 [3430-26-0]
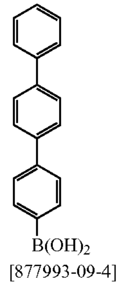
[877993-09-4]
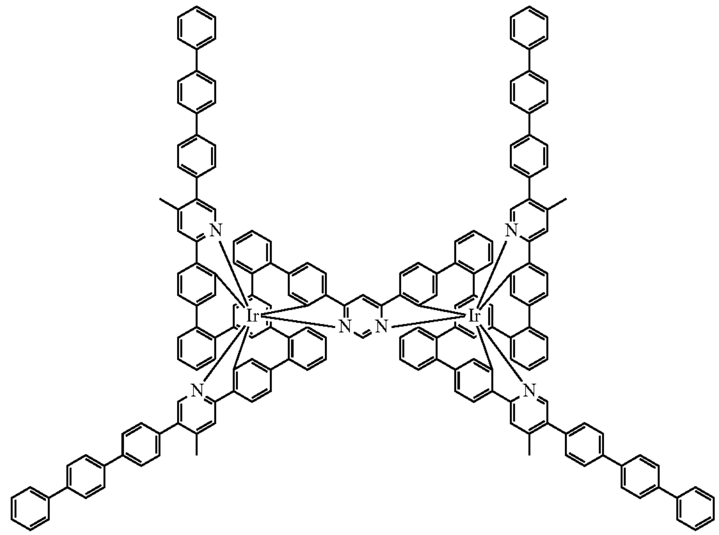
P78 [3430-26-0]
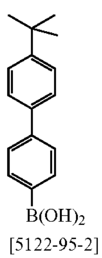
[5122-95-2]
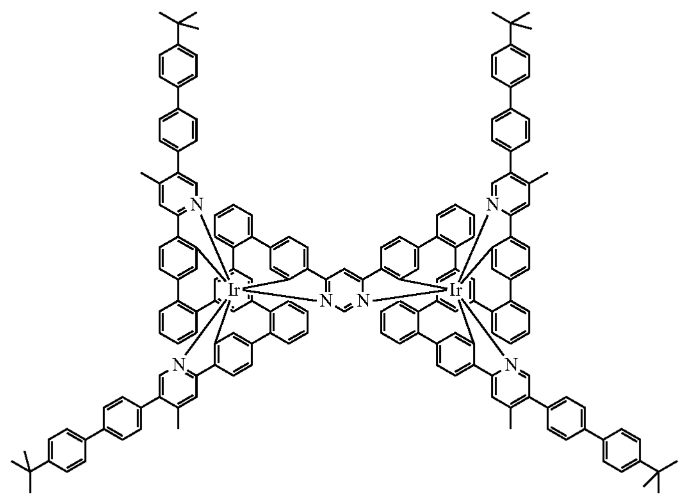

-continued
P79 [3430-26-0]
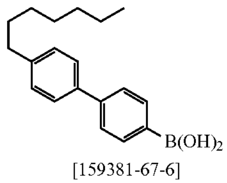
[159381-67-6]
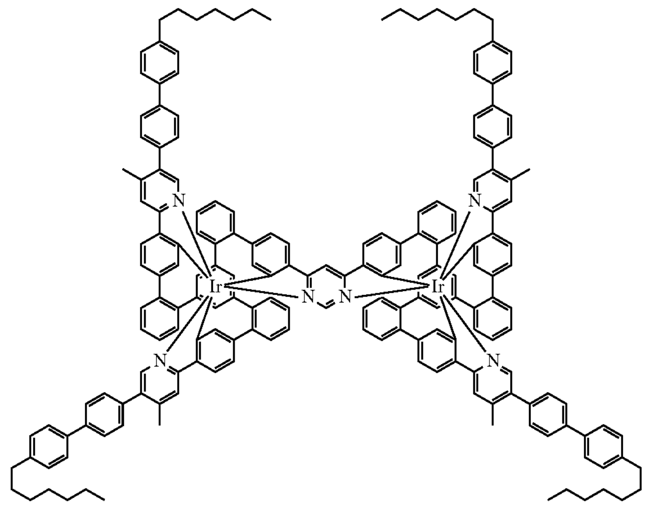
P80 [3430-26-0]
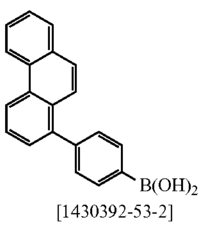
[1430392-53-2]
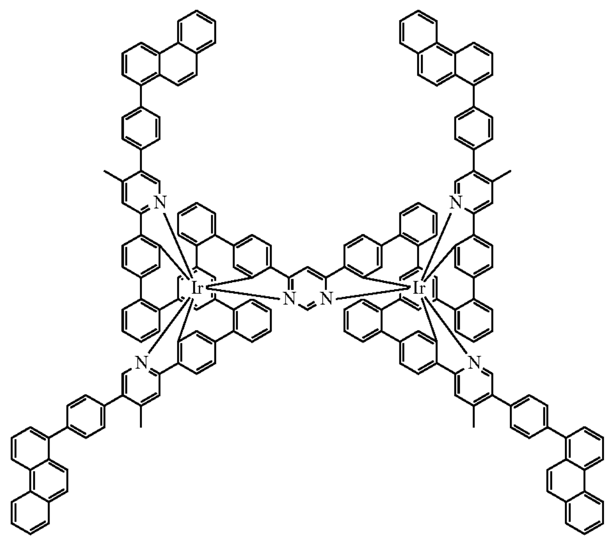

-continued
| | | | |
|---|---|---|---|
| P81 | [3430-26-0] | 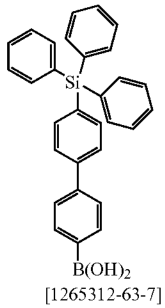 [1265312-63-7] | 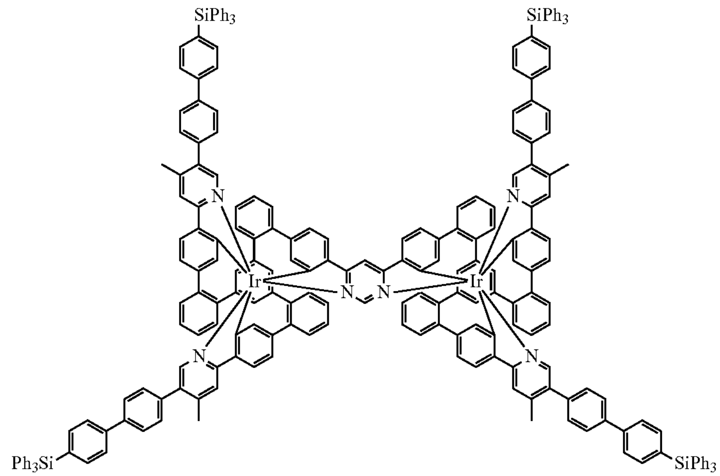 |
| P82 | [3430-26-0] | 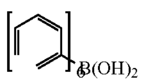 p-phenylene [1388226-18-3] | 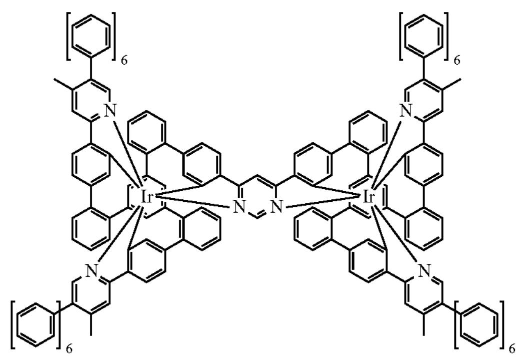 |

-continued
P83 [3430-26-0]
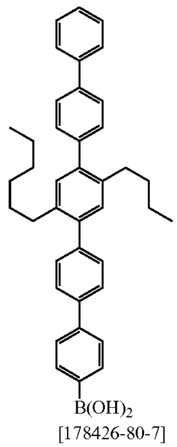
[178426-80-7]
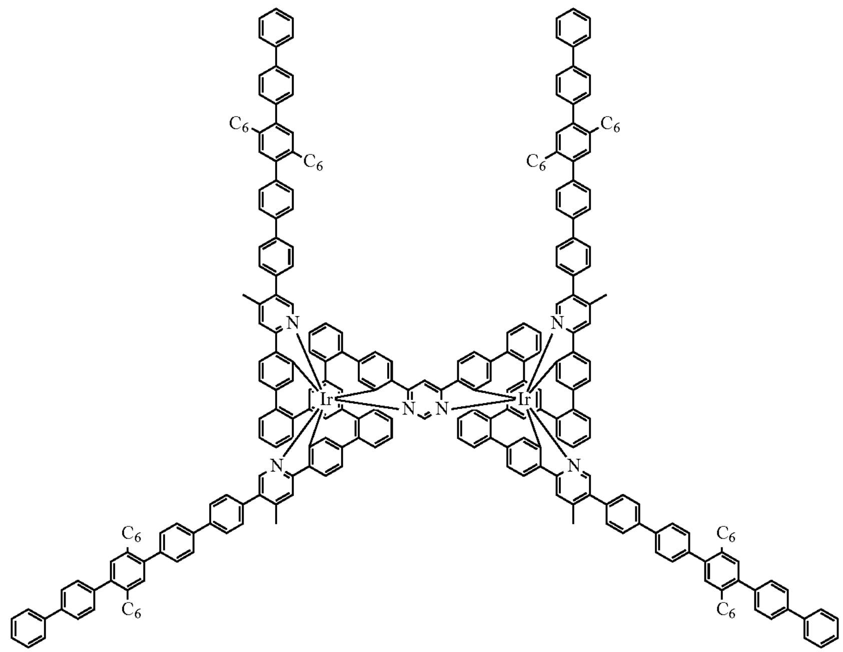

-continued
| | | |
|---|---|---|
| P84 | [3430-26-0] 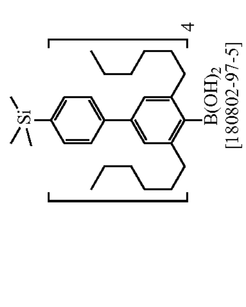  [180802-97-5] | 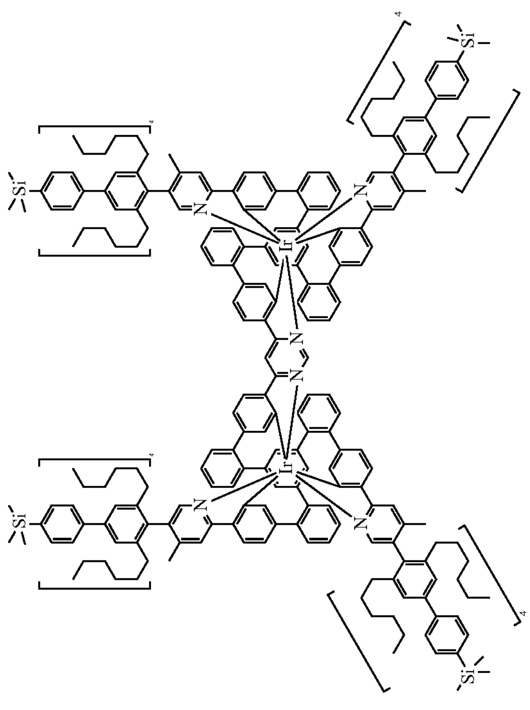  |

-continued
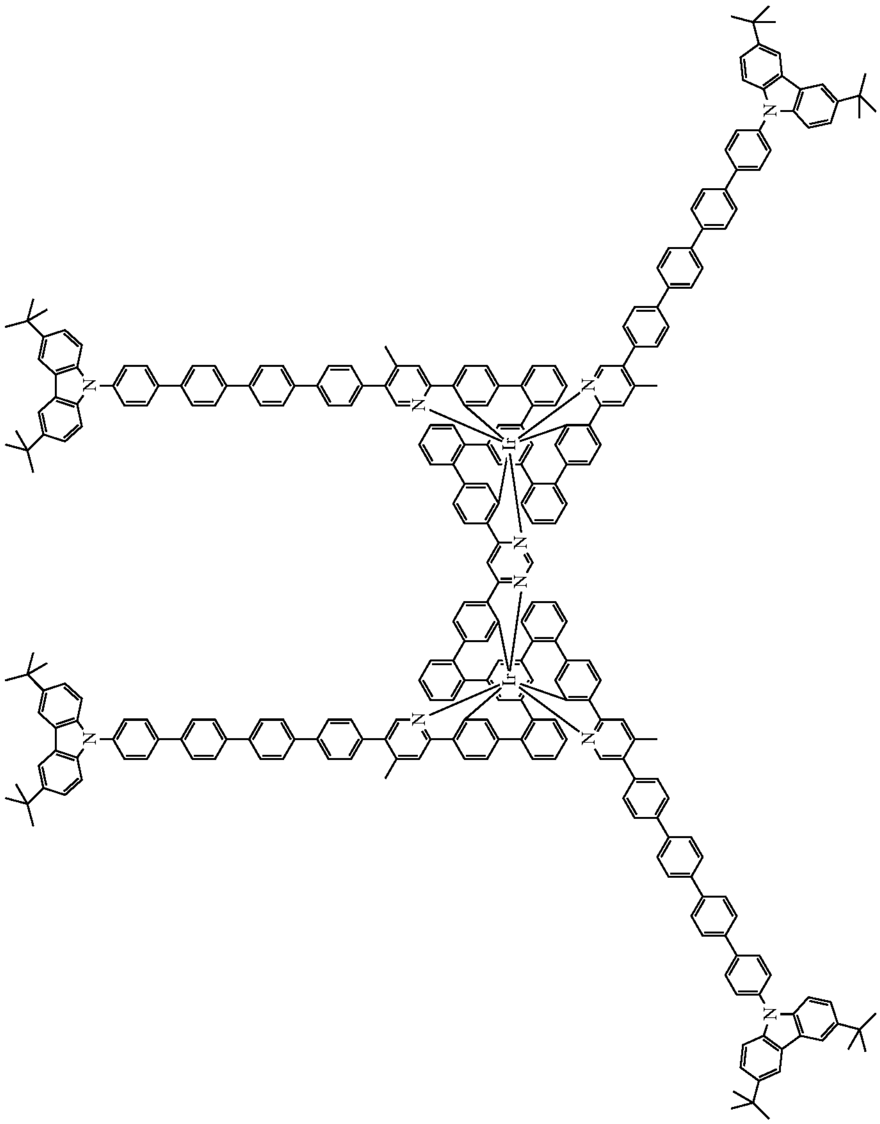
P85
[3430-26-0]
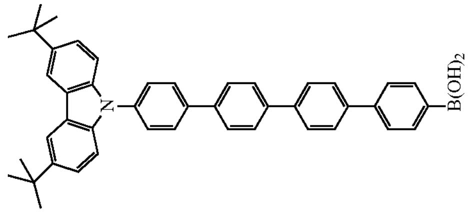
[1639930-93-0]

-continued
| | | |
|---|---|---|
| P86 | [3430-26-0]<br>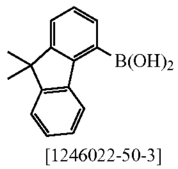<br>[1246022-50-3] | 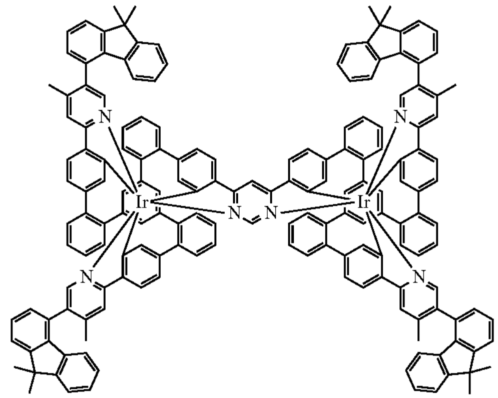 |
| P87 | [3430-26-0]<br>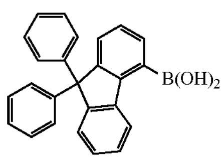<br>[1224976-40-2] | 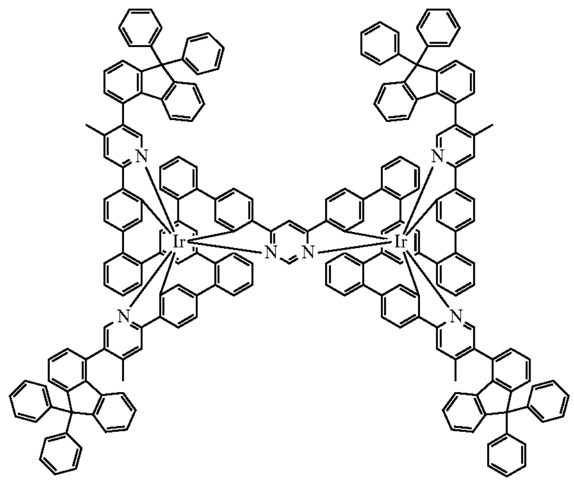 |

-continued
| | | |
|---|---|---|
| P88 | [3430-26-0]<br>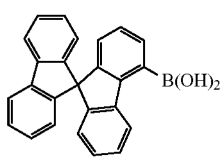<br><br>[1421789-050] | 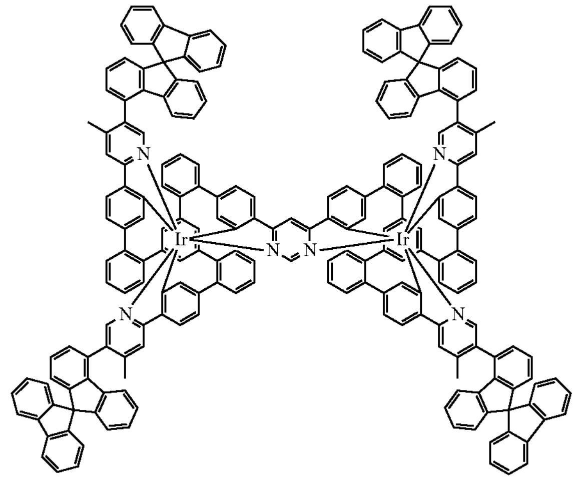<br> |
| P89 | [3430-26-0]<br>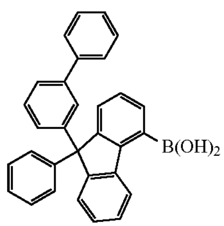<br><br>[1421789-050] | 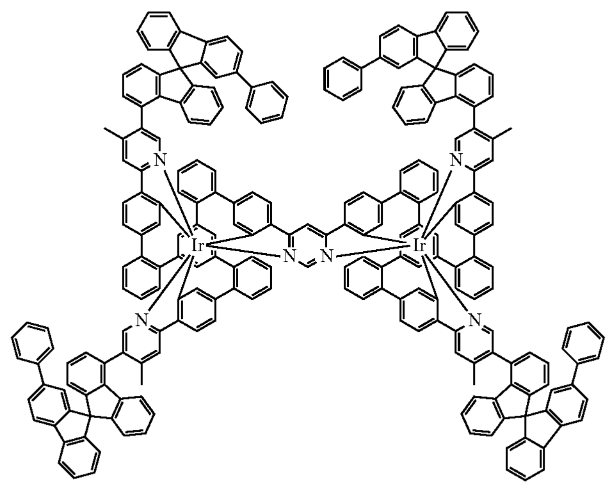<br> |

-continued
P90
[3430-26-0]
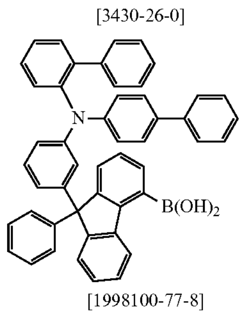 [SMILES: OB(O)c1cccc2c1-c1ccccc1C2(c1ccccc1)c1cccc(N(c2ccc(-c3ccccc3)cc2)c2ccccc2-c2ccccc2)c1]
[1998100-77-8]
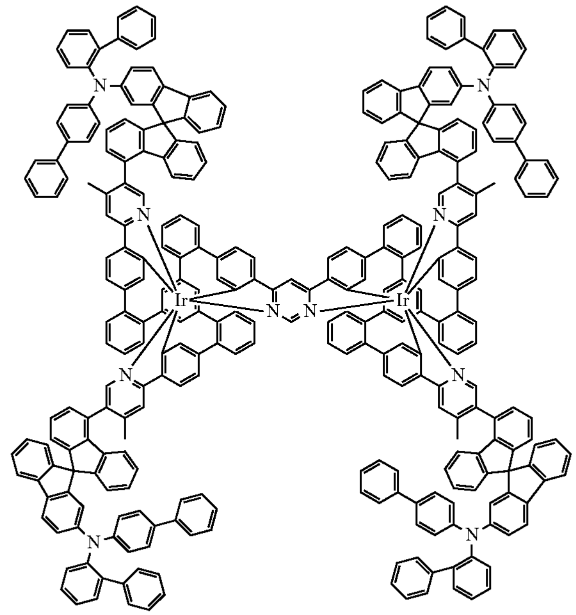
P91
[3430-26-0]
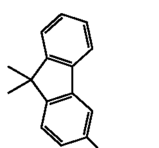
[1251773-34-8]
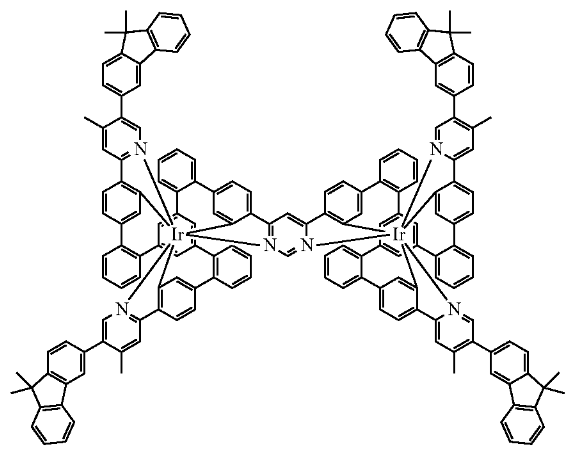

-continued
P92 [3430-26-0]
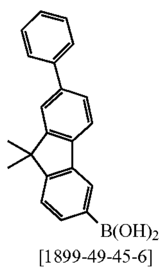
[1899-49-45-6]
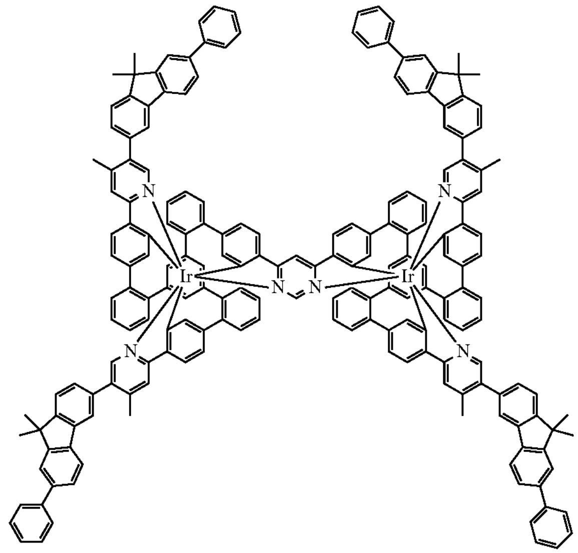
P93 [3430-26-0]
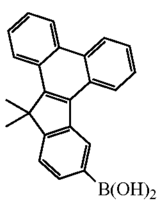
[1955546-97-0]
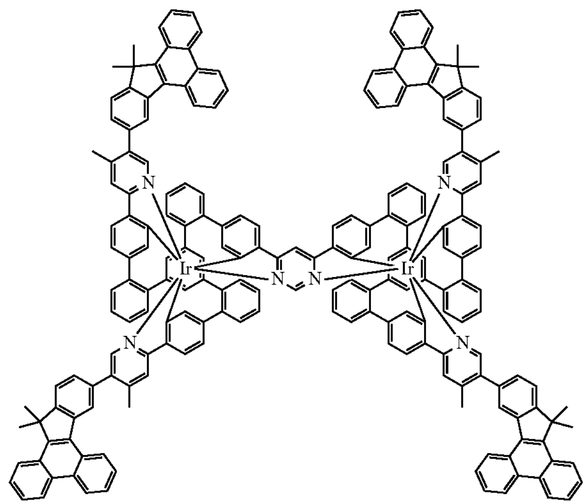

-continued
| | | |
|---|---|---|
| P94 | [3430-26-0]<br>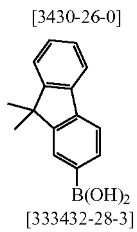<br>[333432-28-3] | 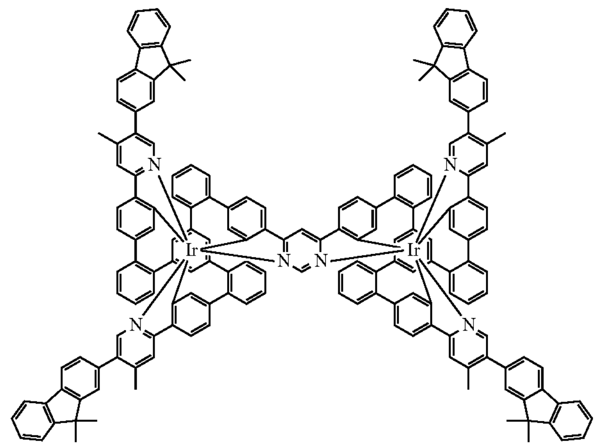 |
| P95 | [3430-26-0]<br>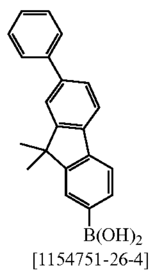<br>[1154751-26-4] | 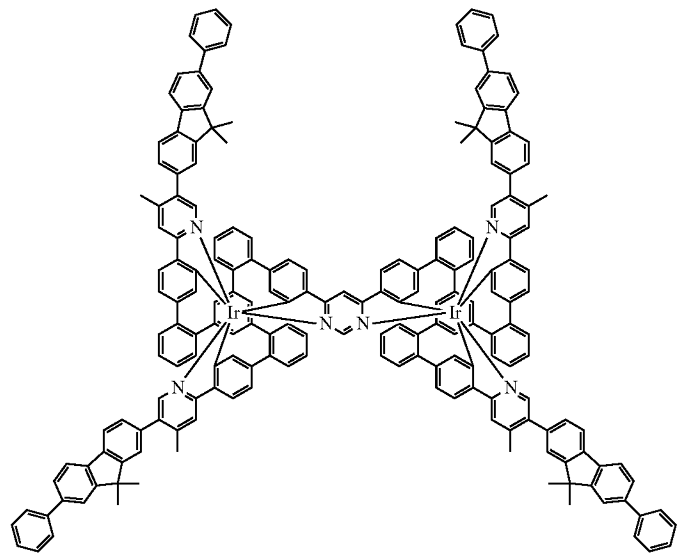 |

-continued
P96 [3430-26-0]
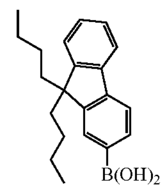
[400607-56-9]
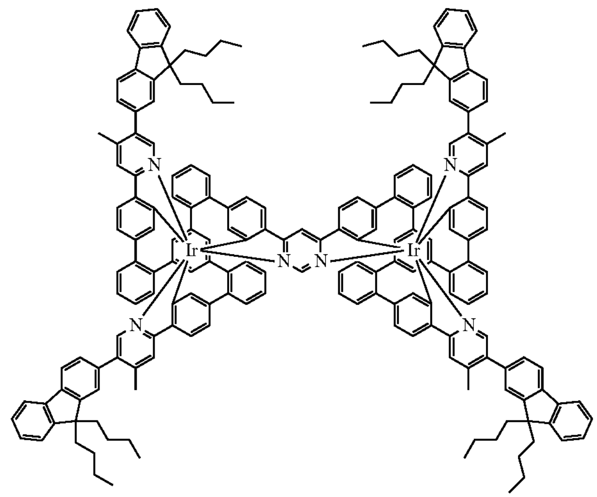
P97 [3430-26-0]
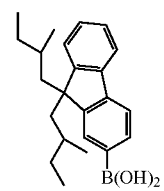
[446878-93-9]
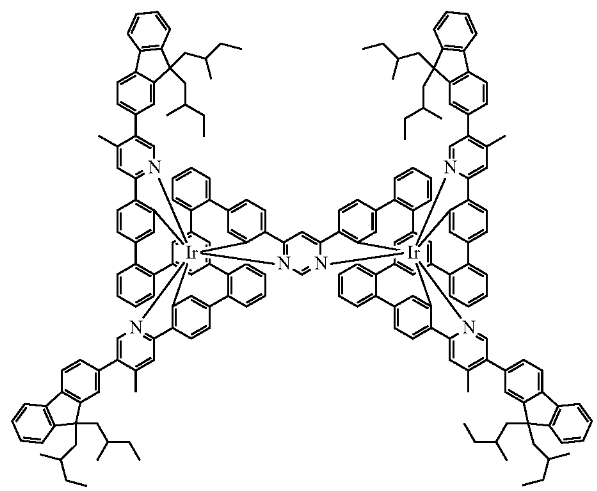

-continued
| | | |
|---|---|---|
| P98 | [3430-26-0]<br>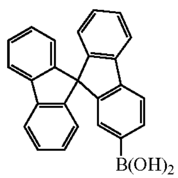<br>[236389-21-2] | 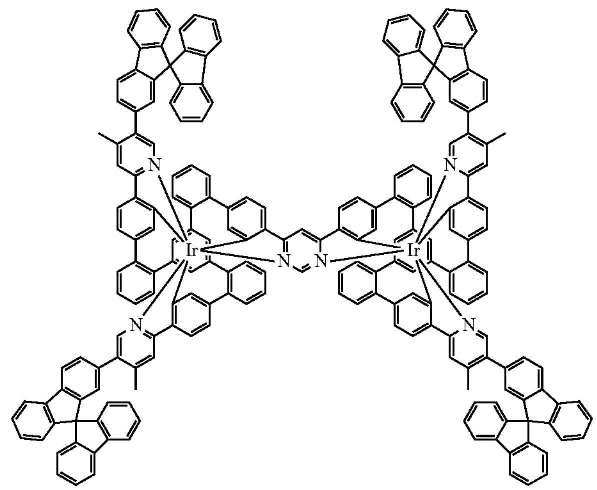 |
| P99 | [3430-26-0]<br>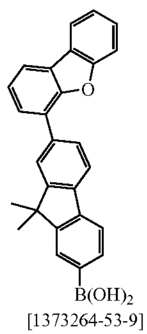<br>[1373264-53-9] | 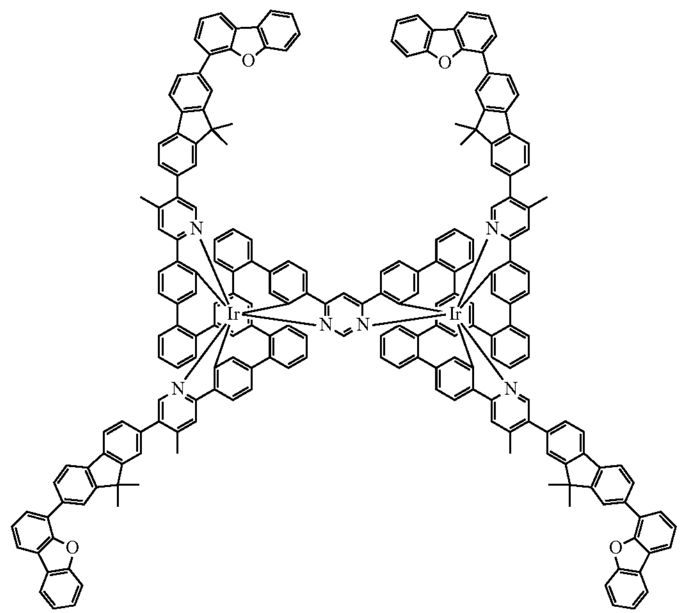 |

-continued
P100 [3430-26-0]
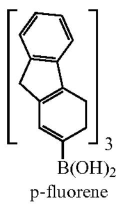
p-fluorene
[333432-28-3]
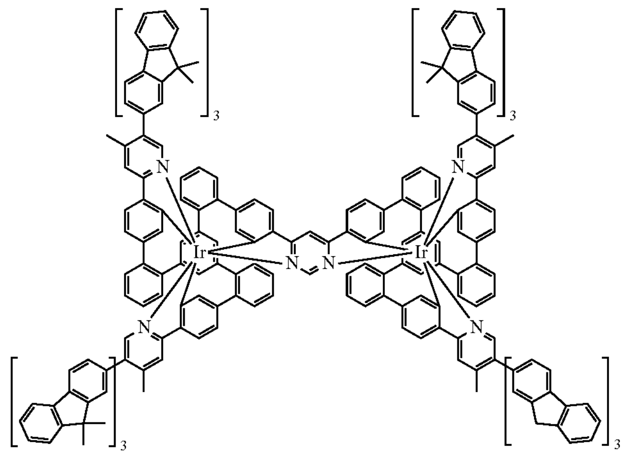
P101 [3430-26-0]
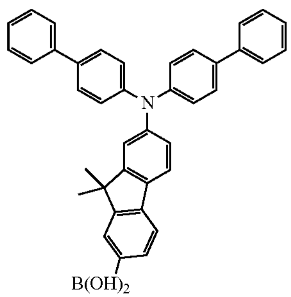
[1265177-39-6]
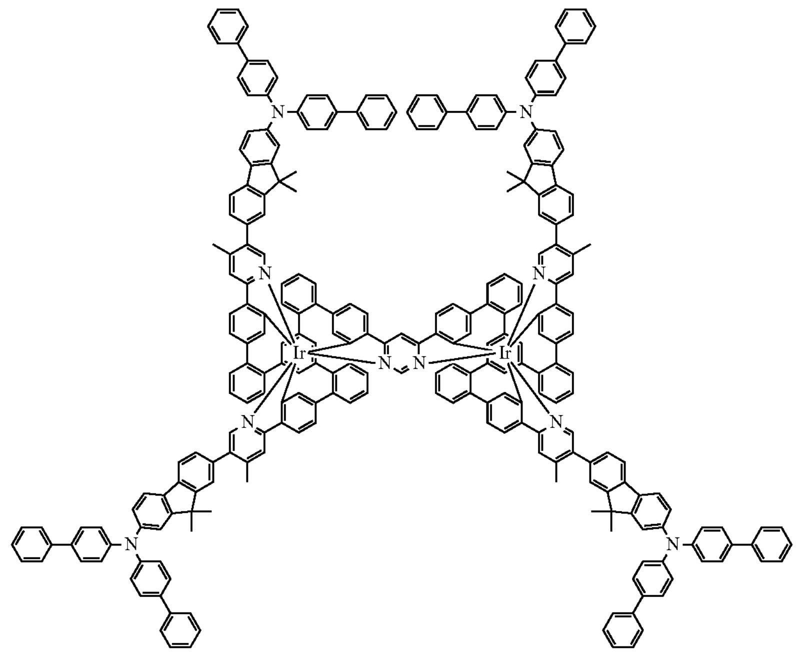

-continued
| | | |
|---|---|---|
| P102 | [3430-26-0] 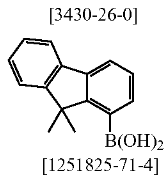 [SMILES: CC1(C)c2ccccc2-c2cccc(B(O)O)c21] [1251825-71-4] | 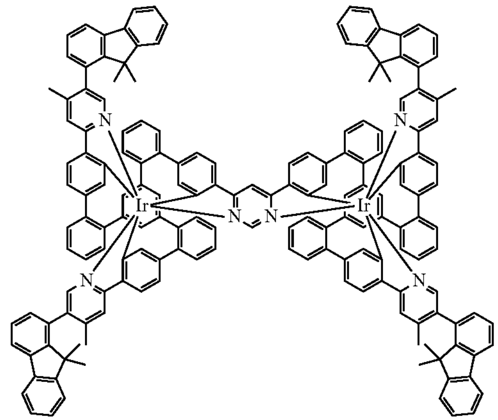 |
| P103 | [3430-26-0] 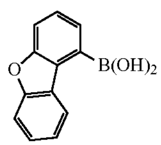 [162607-19-4] | 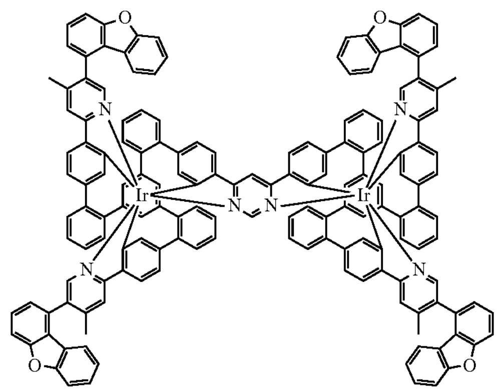 |

-continued
| | | |
|---|---|---|
| P104 | [3430-26-0] 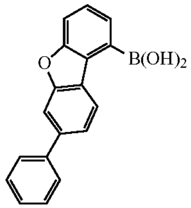 [162607-19-4] | 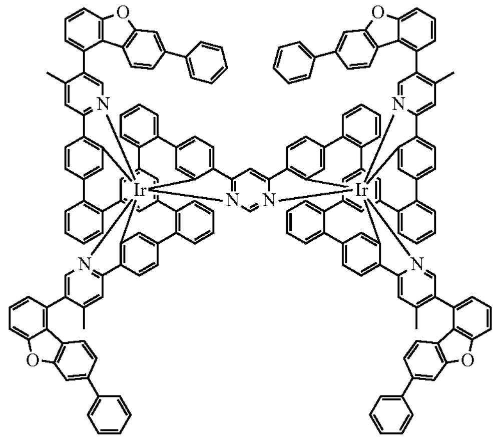 |
| P105 | [3430-26-0] 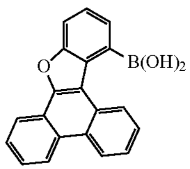 [162607-19-4] | 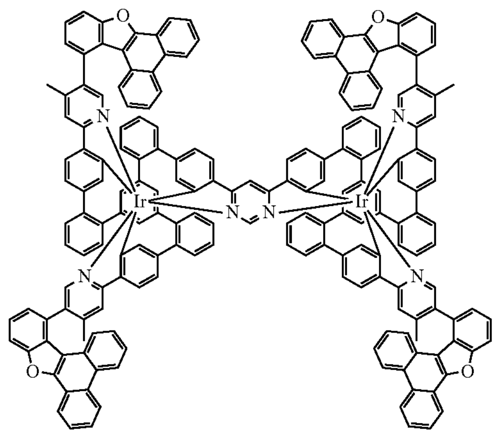 |

-continued
| | | |
|---|---|---|
| P106 | [3430-26-0] 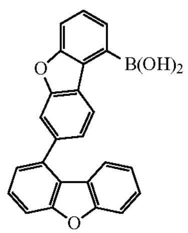 [1822320-55-7] | 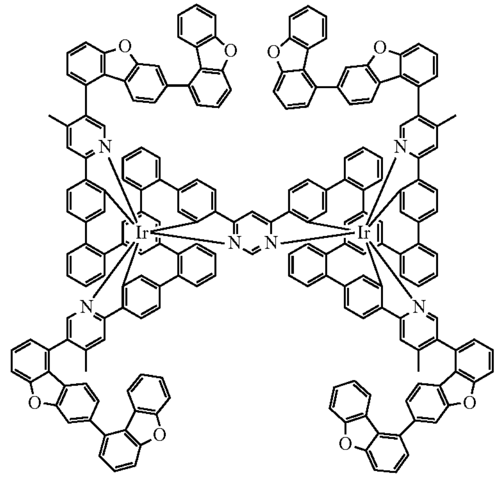 |
| P107 | [3430-26-0] 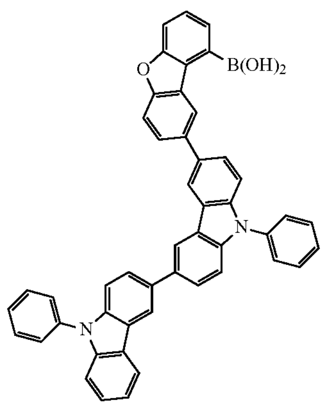 [1822311-31-8] | 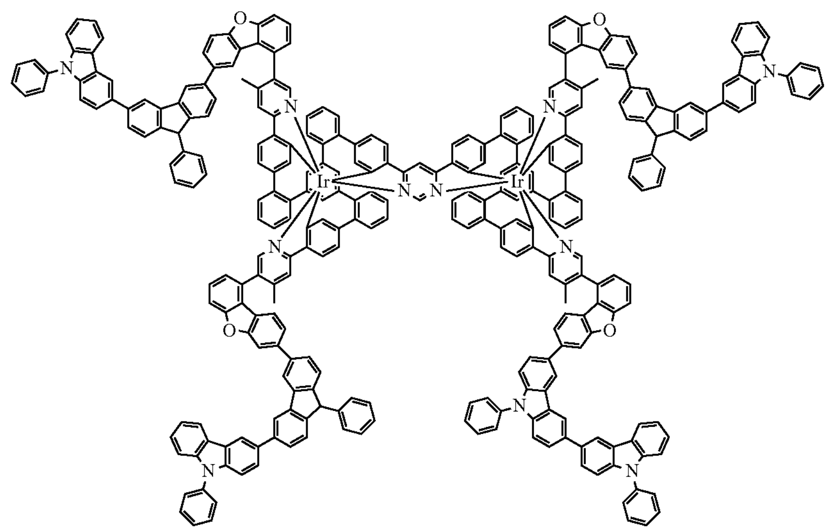 |

-continued
| | | | |
|---|---|---|---|
| P108 | [3430-26-0]<br>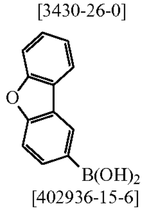 [SMILES: OB(O)c1ccc2oc3ccccc3c2c1]<br>[402936-15-6] | 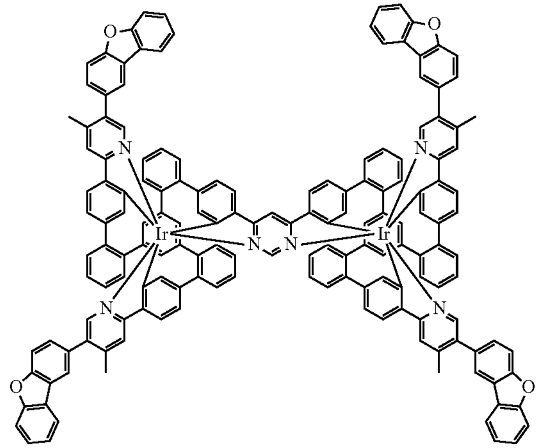 | |
| P109 | [3430-26-0]<br>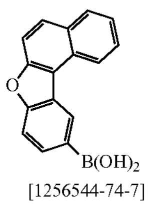<br>[1256544-74-7] | [3430-26-0]<br>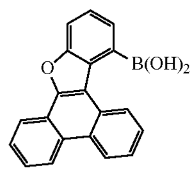<br>[162607-19-4] | |

-continued
| | | |
|---|---|---|
| P110 | [3430-26-0]<br>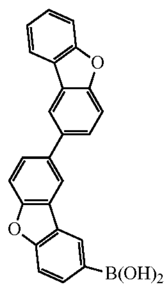<br>[1427560-52-8] | 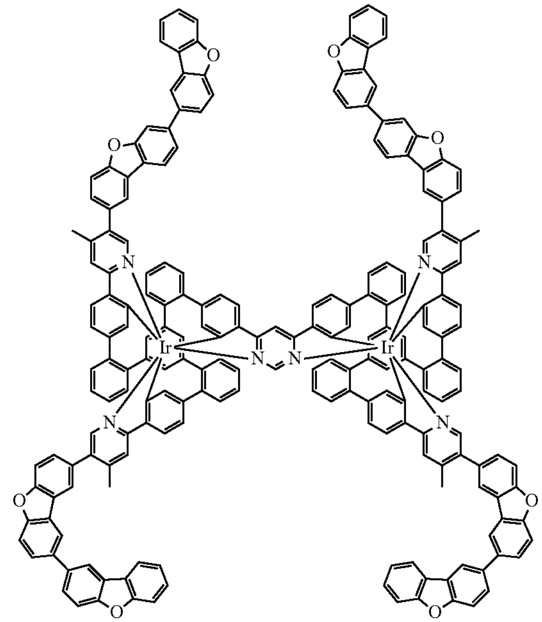 |

-continued
P111 [3430-26-0]
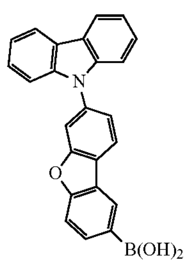
[1426818-76-9]
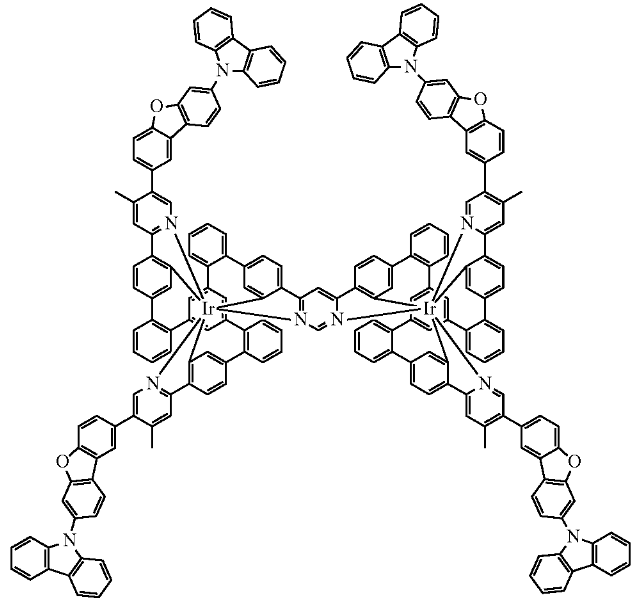
P112 [3430-26-0]
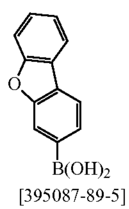
[395087-89-5]
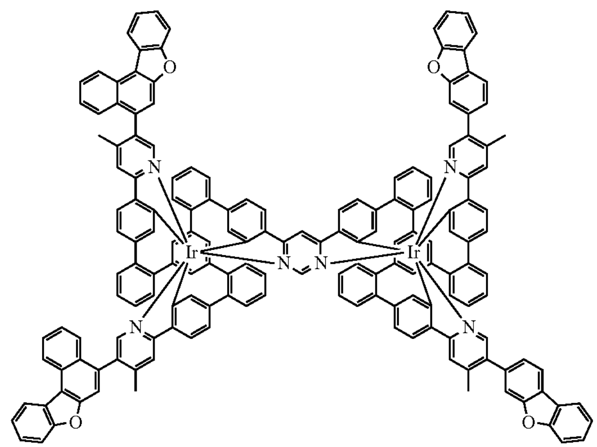

-continued
| | | | |
|---|---|---|---|
| P113 | [3430-26-0] 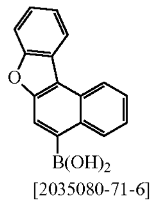  [2035080-71-6] | 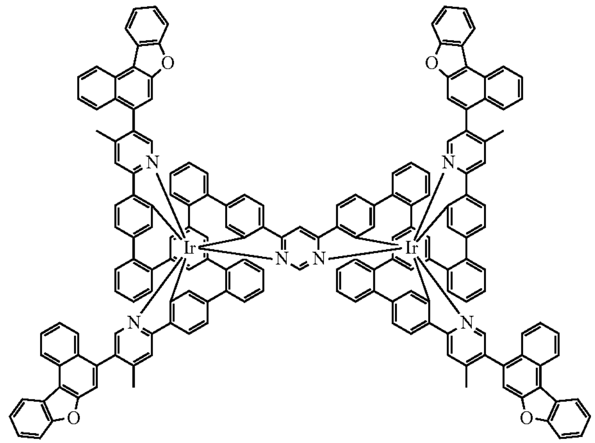  | |
| P114 | [3430-26-0] 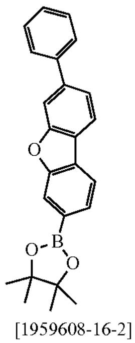  [1959608-16-2] | 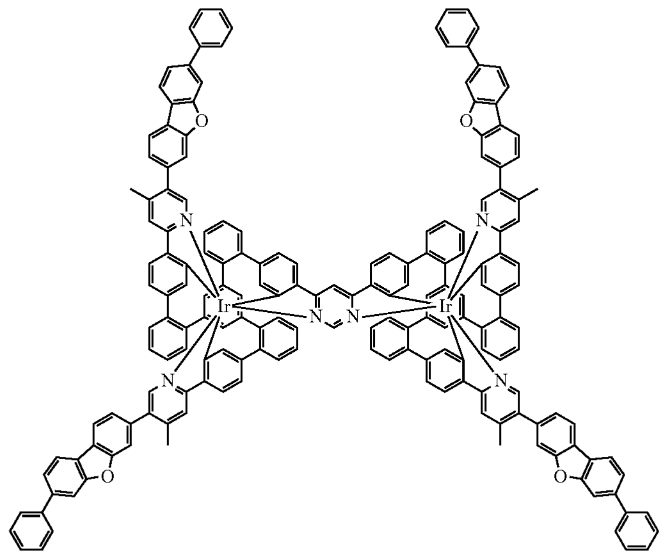  | |

-continued
| | | |
|---|---|---|
| P115 | 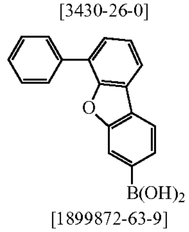 [SMILES: OB(O)c1ccc2c(c1)oc1c(-c3ccccc3)cccc12] [3430-26-0] [1899872-63-9] | 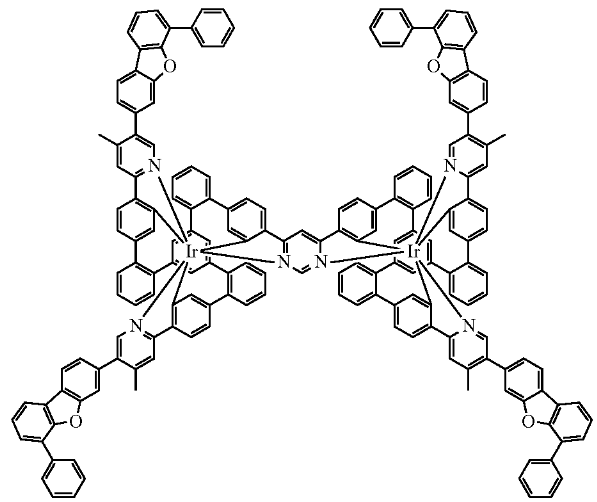 |

-continued
P116 [3430-26-0]
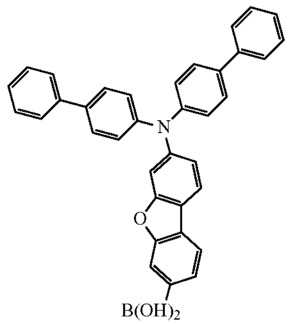
[1889263-25-5]
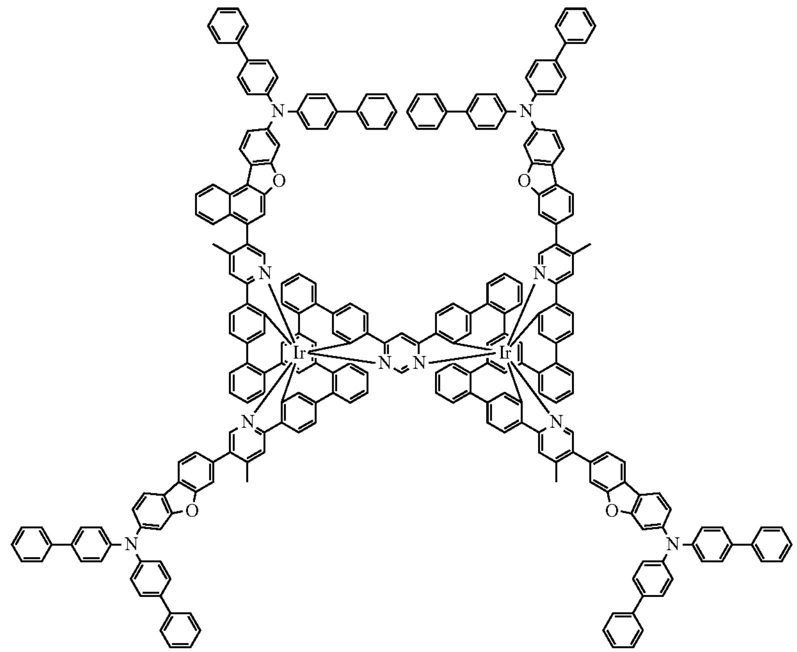
P117 [3430-26-0]
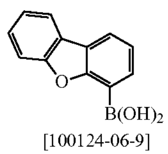
[100124-06-9]
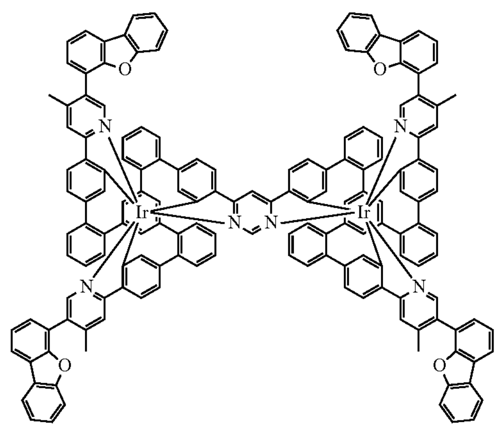

-continued
P118 [3430-26-0]
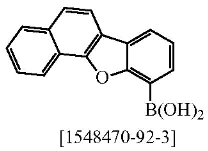
[1548470-92-3]
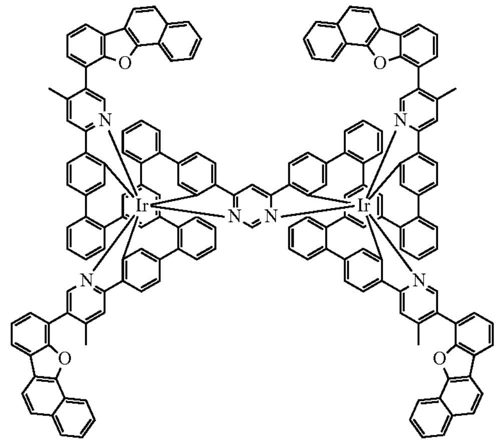
P119 [3430-26-0]
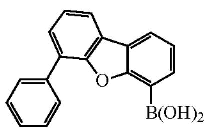
[1010068-85-5]
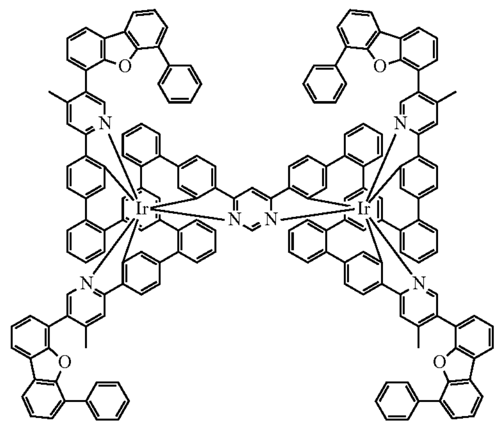

-continued
| | | |
|---|---|---|
| P120 | [3430-26-0] 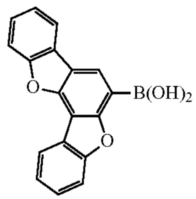 [1377187-97-7] | 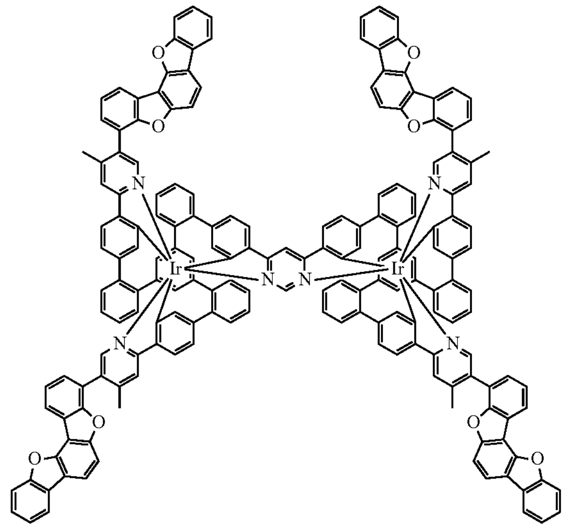 |
| P121 | [3430-26-0] 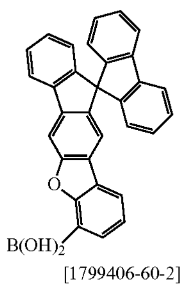 [1799406-60-2] | 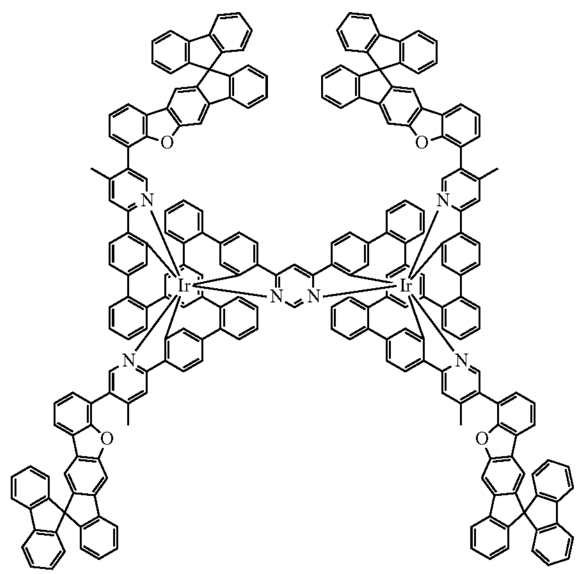 |

-continued
P122
[3430-26-0]
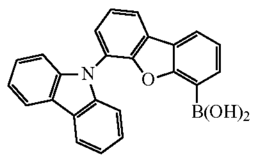
[1651195-16-2]
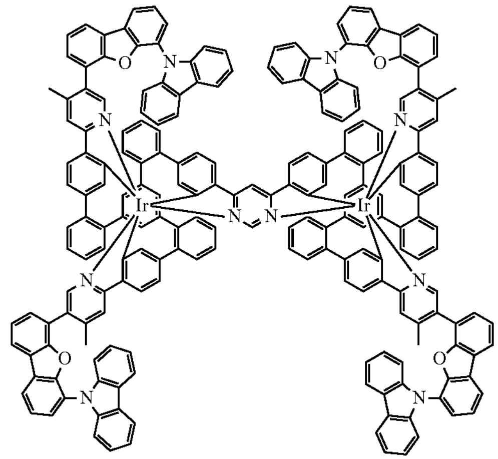
P123
[3430-26-0]
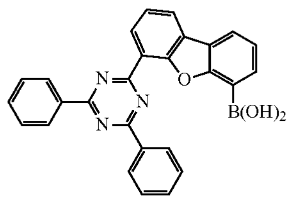
[1449739-29-0]
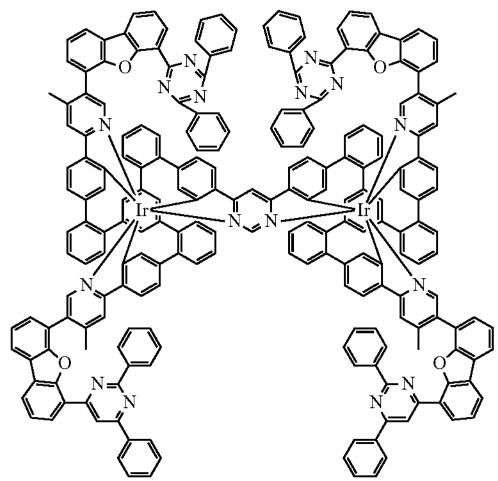

-continued
P124 [3430-26-0]
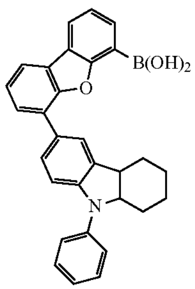
[100124-06-9]
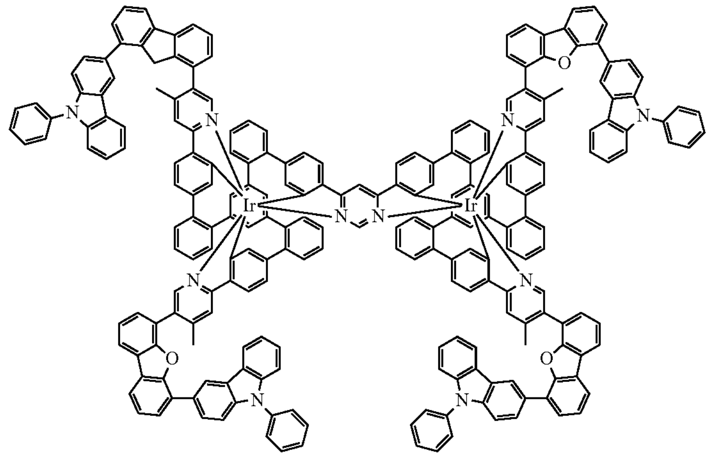
P125 [3430-26-0]
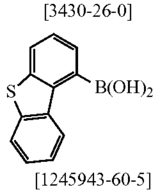 [SMILES: OB(O)c1cccc2sc3ccccc3c12]
[1245943-60-5]
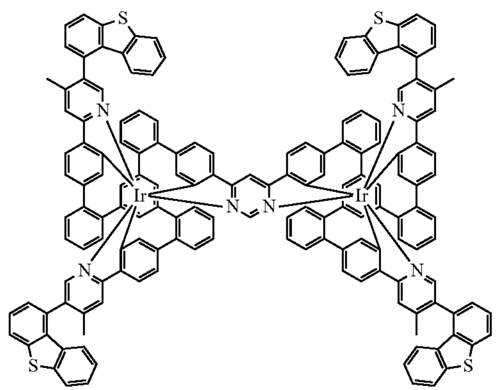

-continued
| | | | |
|---|---|---|---|
| P126 | [3430-26-0]<br>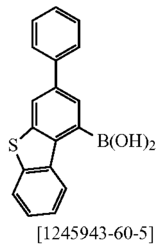<br>[1245943-60-5] | 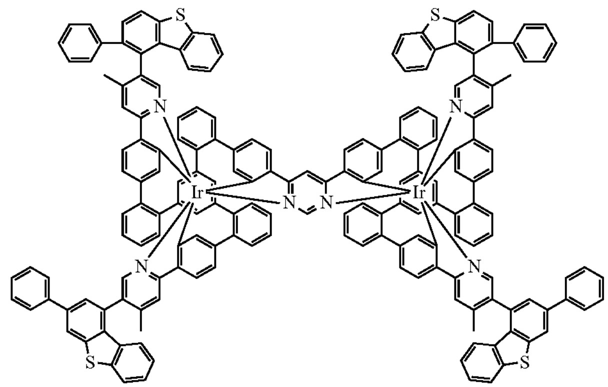 | |
| P127 | [3430-26-0]<br>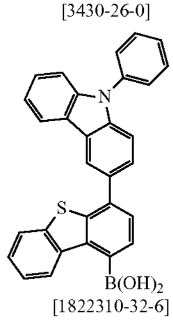 [SMILES: OB(O)c1ccc(-c2ccc3c(c2)c2ccccc2n3-c2ccccc2)c2sc3ccccc3c12]<br>[1822310-32-6] | 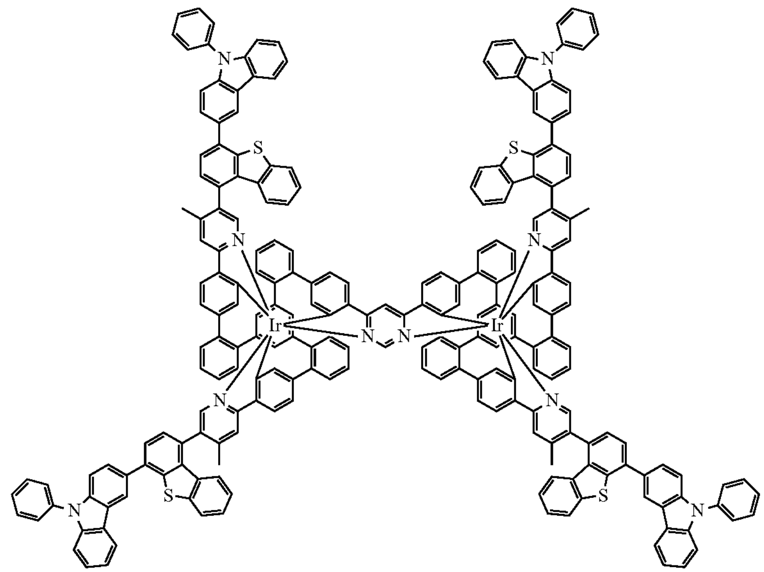 | |

-continued
| | | |
|---|---|---|
| P128 | [3430-26-0] 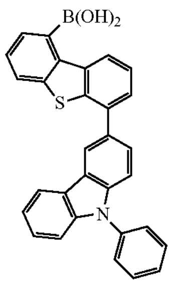 [1821233-93-5] | 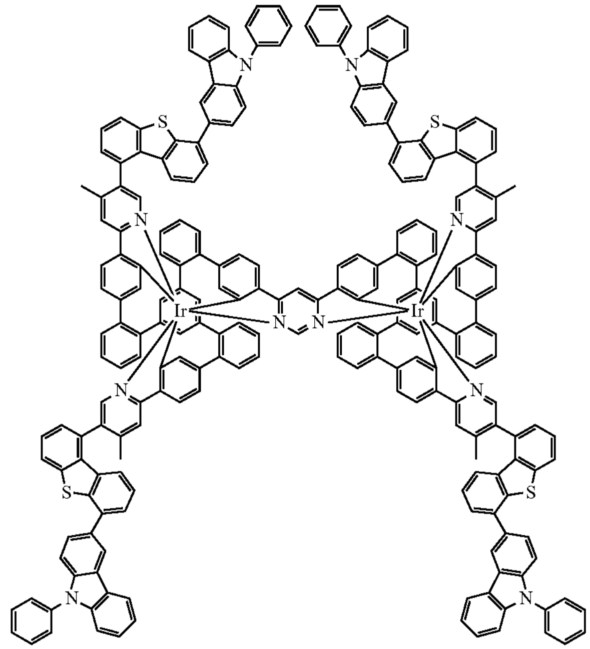 |
| P129 | [3430-26-0] 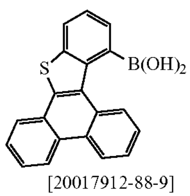 [20017912-88-9] | 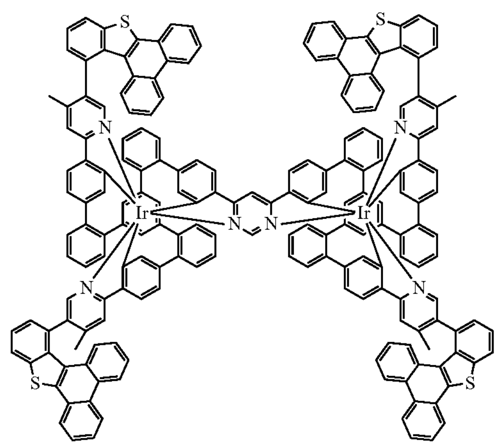 |

-continued
| | | | |
|---|---|---|---|
| P130 | [3430-26-0] | 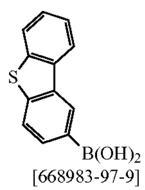 B(OH)2 [668983-97-9] | 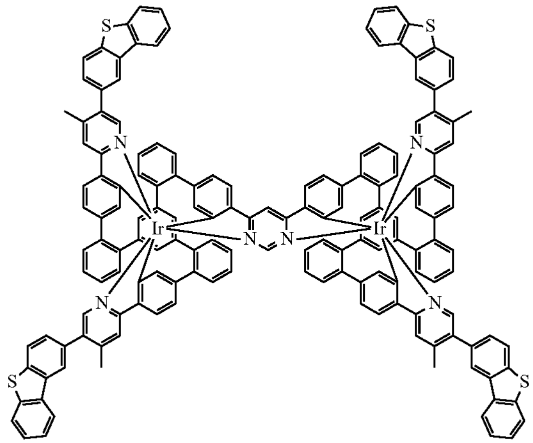 |
| P131 | [3430-26-0] | 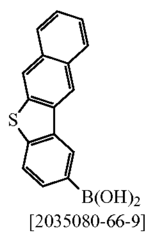 B(OH)2 [2035080-66-9] | 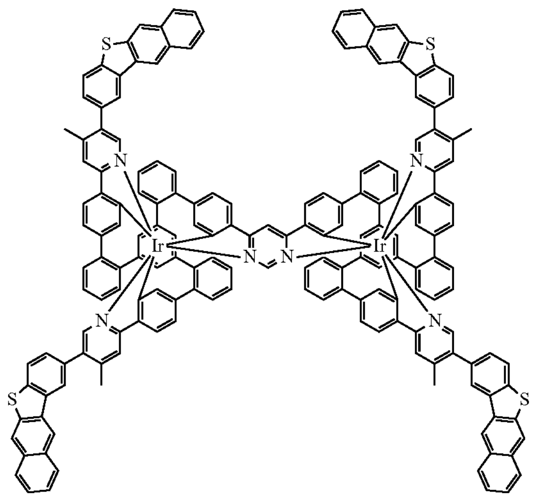 |

-continued
P132 [3430-26-0]
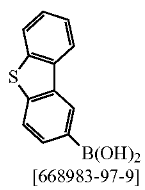
[668983-97-9]
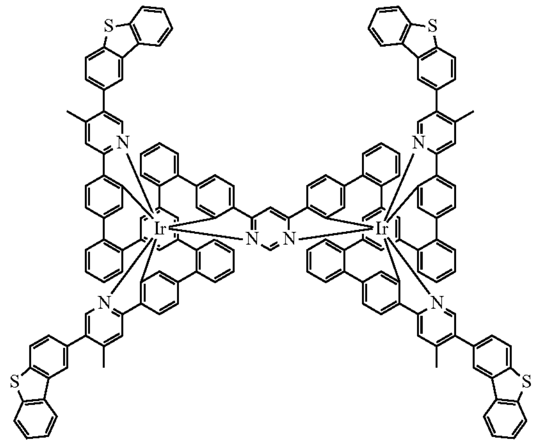
P133 [3430-26-0]
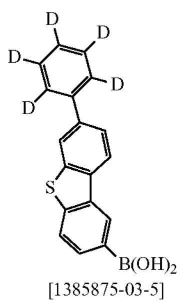
[1385875-03-5]
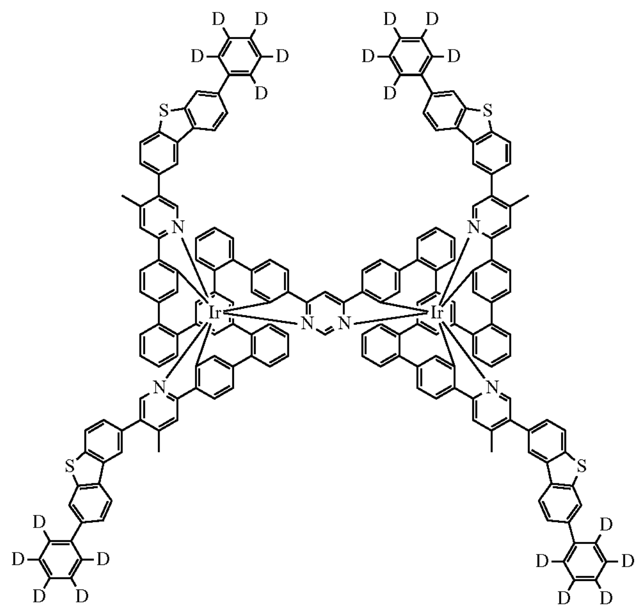

-continued
P134
[3430-26-0]
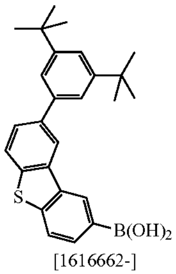
[1616662-]
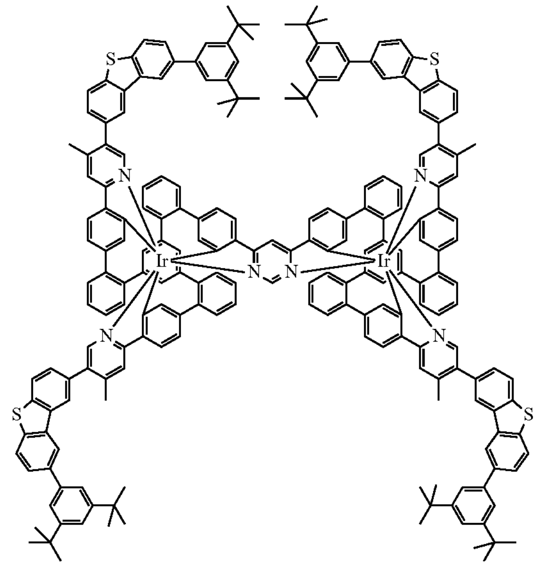
P135
[3430-26-0]
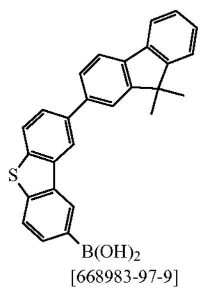
[668983-97-9]
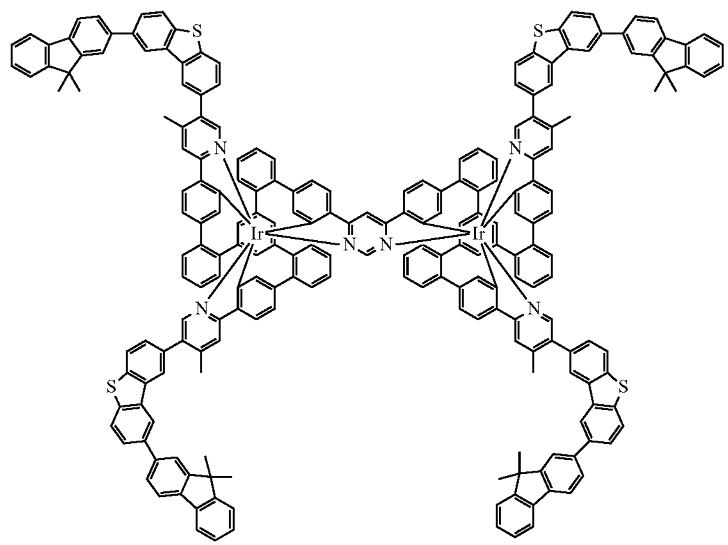

-continued
P136 [3430-26-0]
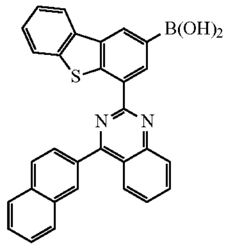
[1852465-42-9]
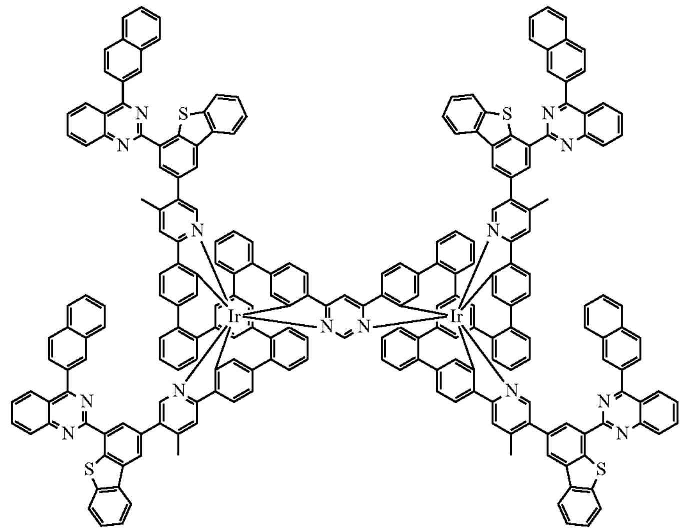

-continued
| | | |
|---|---|---|
| P137 | [3430-26-0] 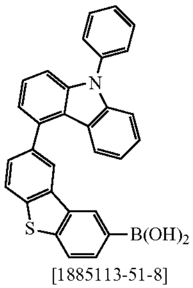 [1885113-51-8] | 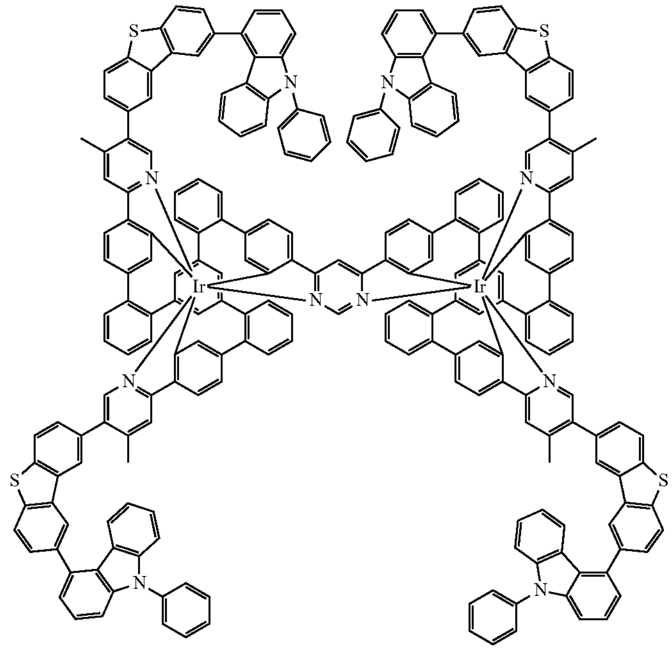 |

-continued
P138 [3430-26-0]
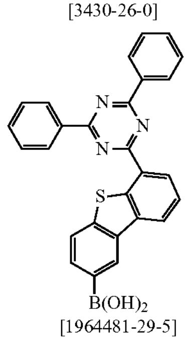 [SMILES: OB(O)c1ccc2sc3c(-c4nc(-c5ccccc5)nc(-c5ccccc5)n4)cccc3c2c1]
[1964481-29-5]
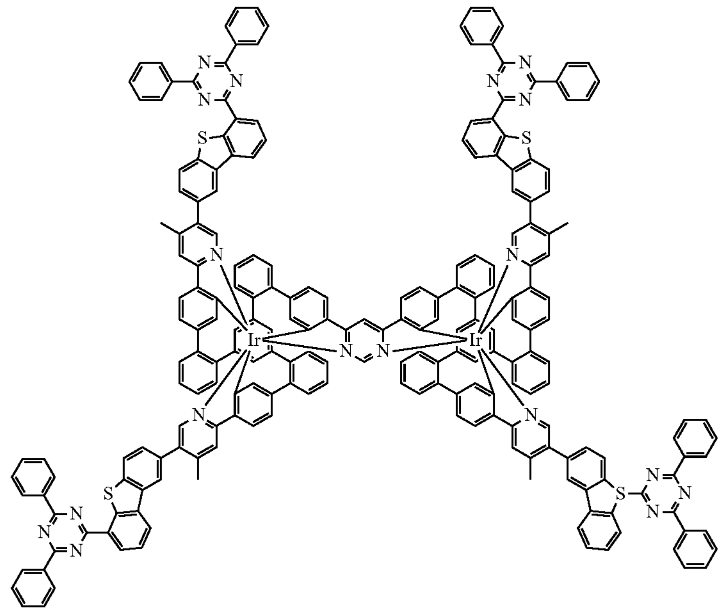
P139 [3430-26-0]
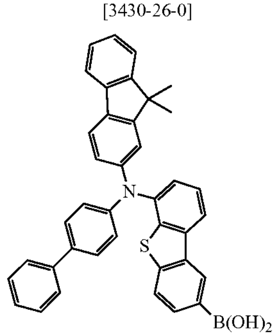
[1946844-63-8]
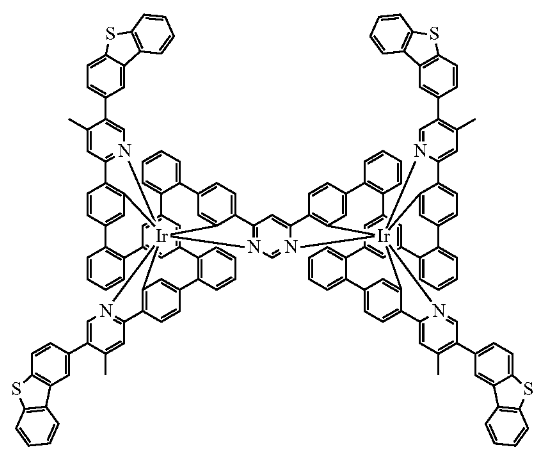

-continued
| | | |
|---|---|---|
| P140 | [3430-26-0] 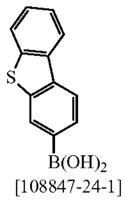 $B(OH)_2$ [108847-24-1] | 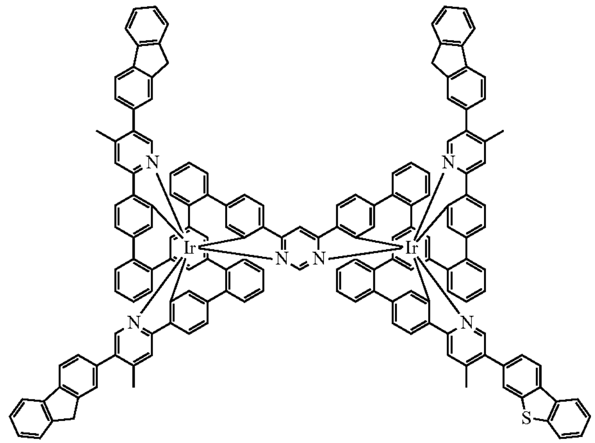 |
| P141 | [3430-26-0] 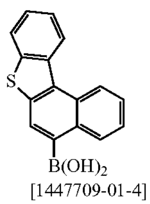 $B(OH)_2$ [1447709-01-4] | 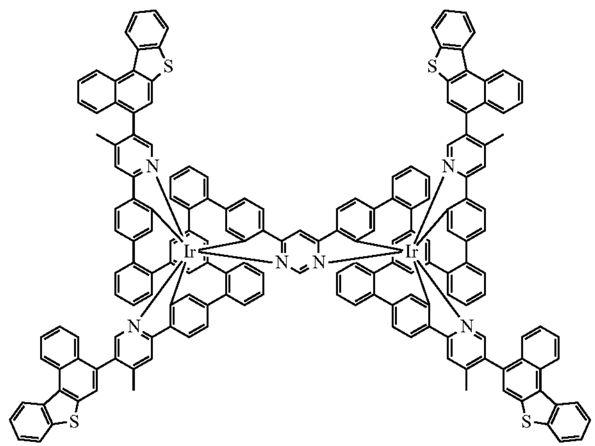 |

-continued
| | | |
|---|---|---|
| P142 | [3430-26-0] 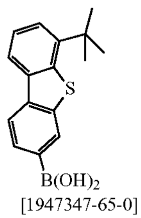  [1947347-65-0] | 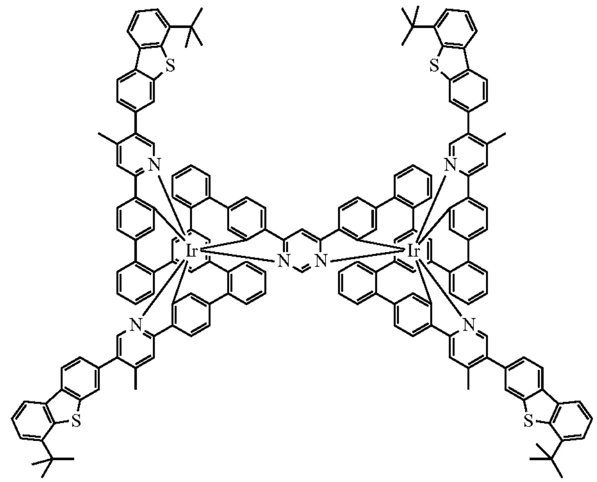  |
| P143 | [3430-26-0] 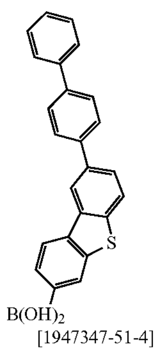  [1947347-51-4] | 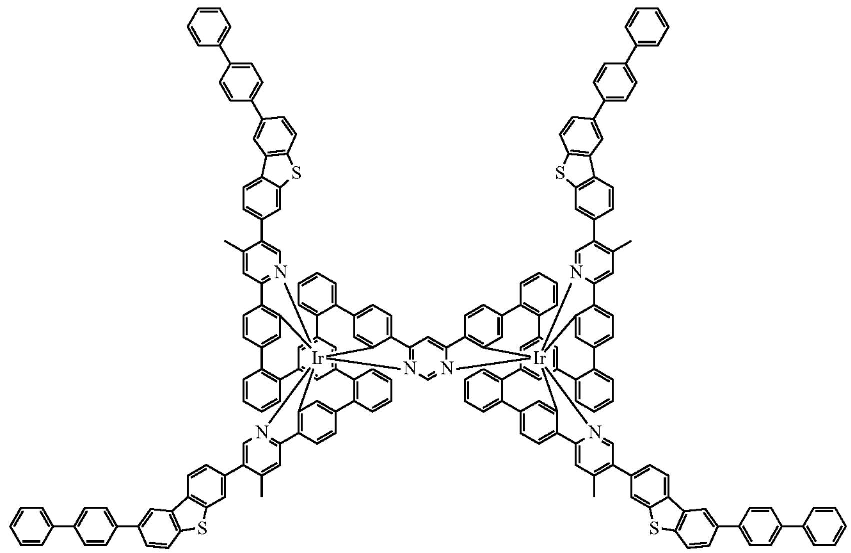  |

-continued
| | | |
|---|---|---|
| P144 | [3430-26-0] 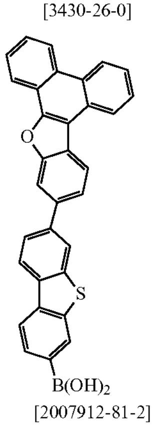 [SMILES: OB(O)c1ccc2c(c1)sc1cc(-c3ccc4c(c3)oc3c5ccccc5c5ccccc5c43)ccc12] B(OH)$_2$ [2007912-81-2] | 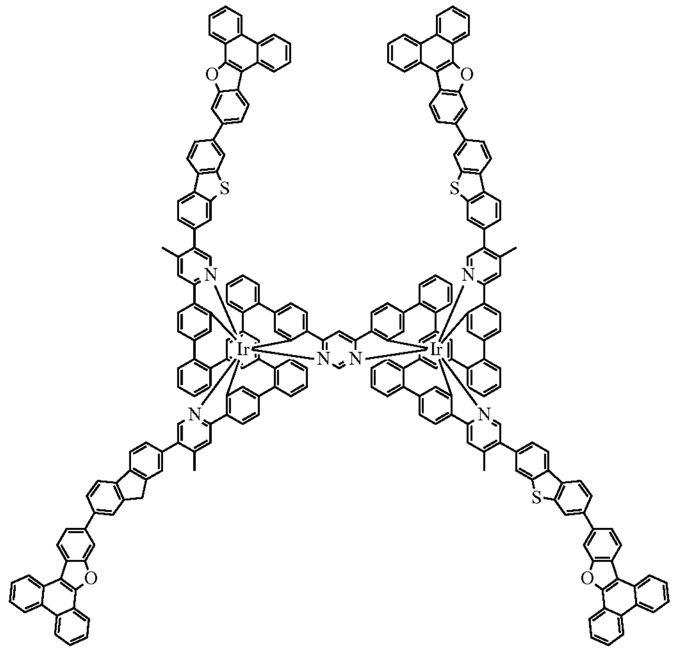 |

-continued
P145 [3430-26-0]
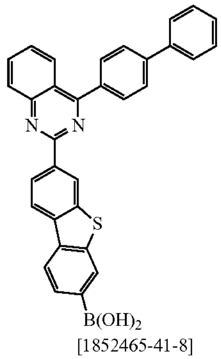
[1852465-41-8]
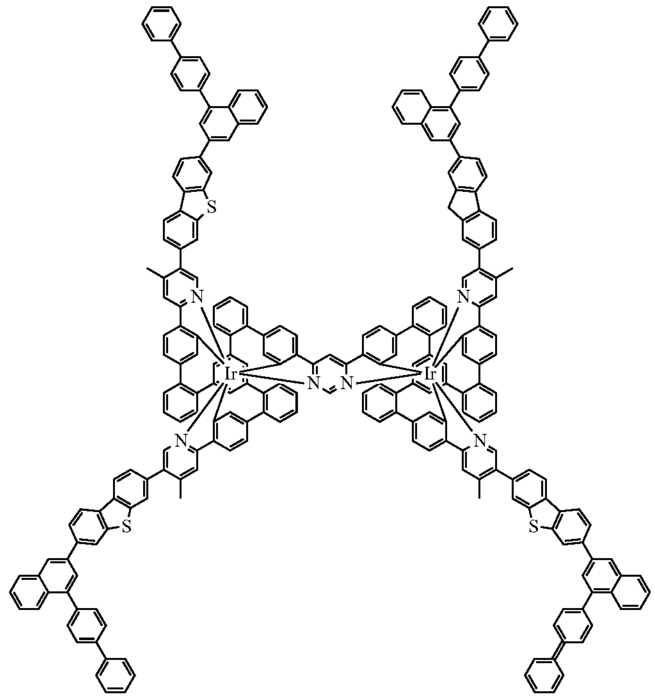
P146 [3430-26-0]
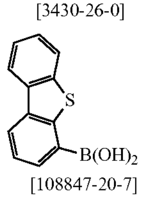
[108847-20-7]
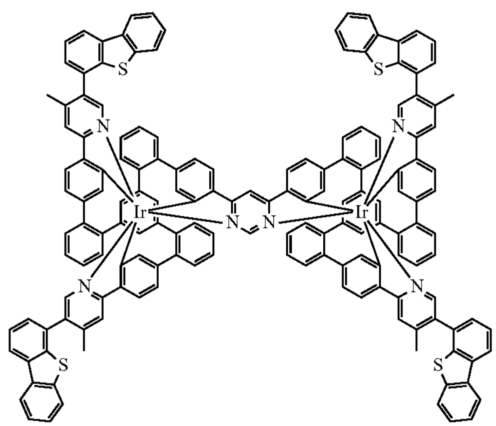

-continued
P146 [3430-26-0]
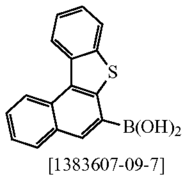
[1383607-09-7]
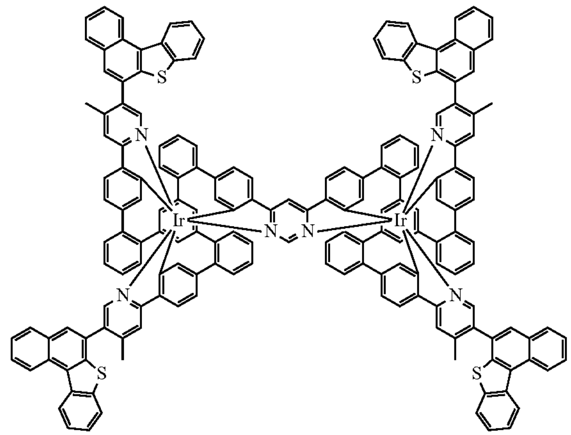
P147 [3430-26-0]
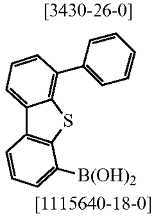 [SMILES: OB(O)c1cccc2c1sc1c(-c3ccccc3)cccc12]
[1115640-18-0]
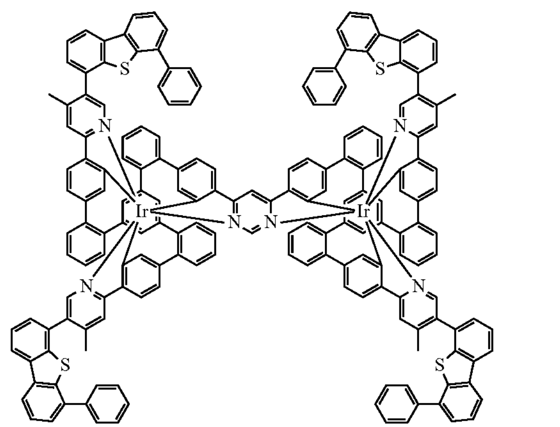

-continued
P148
[3430-26-0]
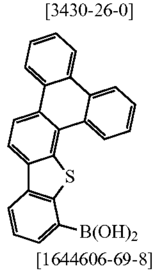 [SMILES: OB(O)c1cccc2c1sc1c2ccc2c3ccccc3c3ccccc3c21]
[1644606-69-8]
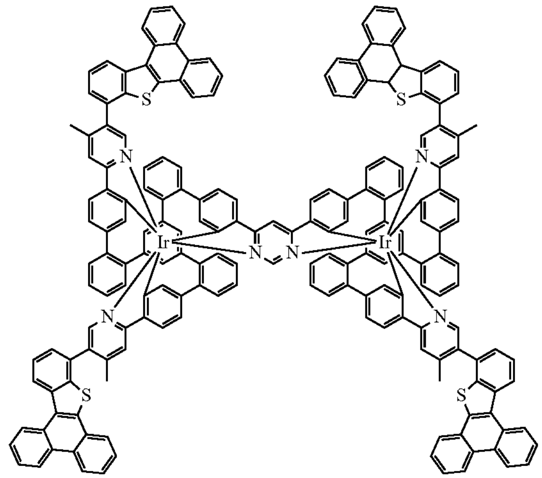
P149
[3430-26-0]
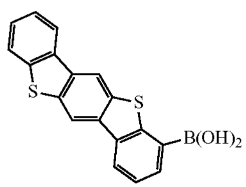
[1673534-11-6]
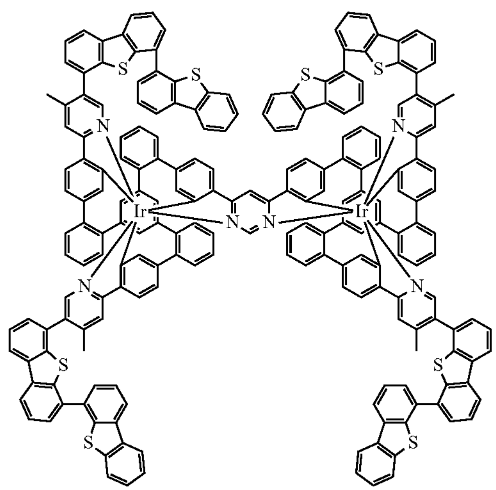

-continued
| | | | |
|---|---|---|---|
| P150 | [3430-26-0] 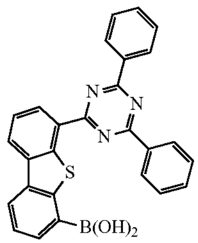 [1883282-22-1] | | 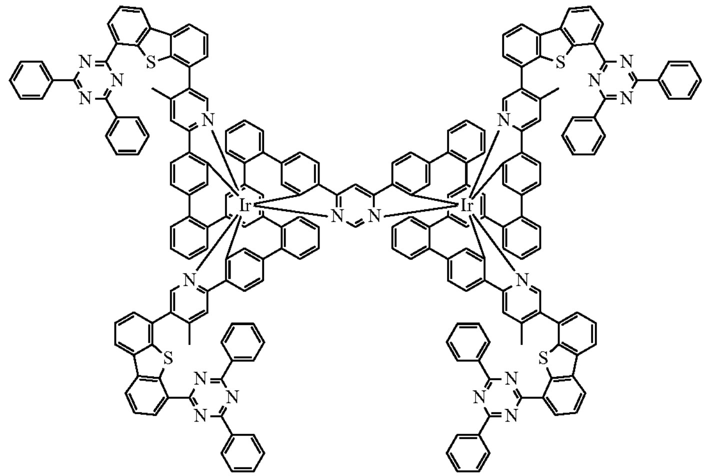 |
| P151 | [3430-26-0] 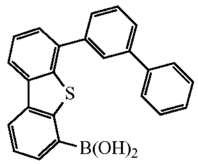 [1858289-64-1] | | 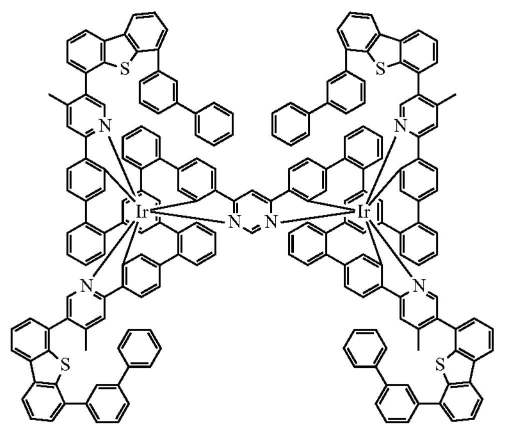 |

-continued
| | | |
|---|---|---|
| P152 | [3430-26-0] 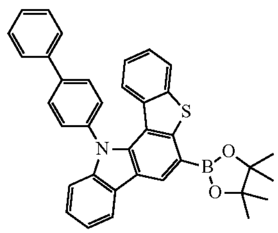 [2012551-71-0] | 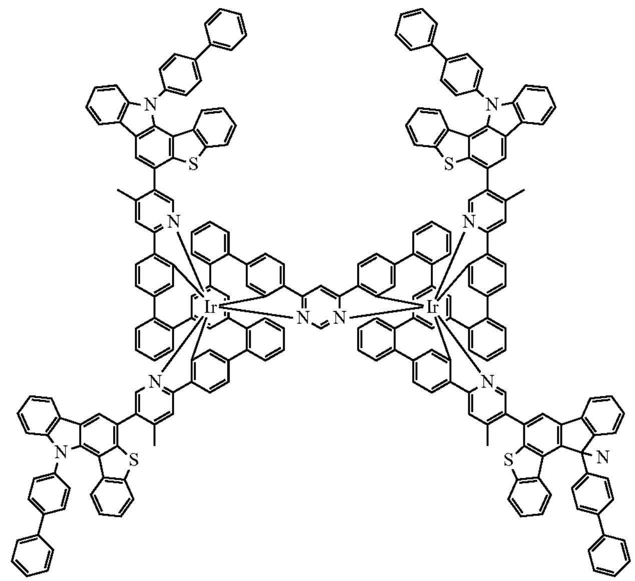 |
| P153 | [3430-26-0] 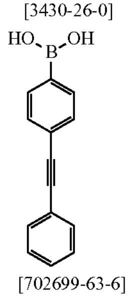 [702699-63-6] | 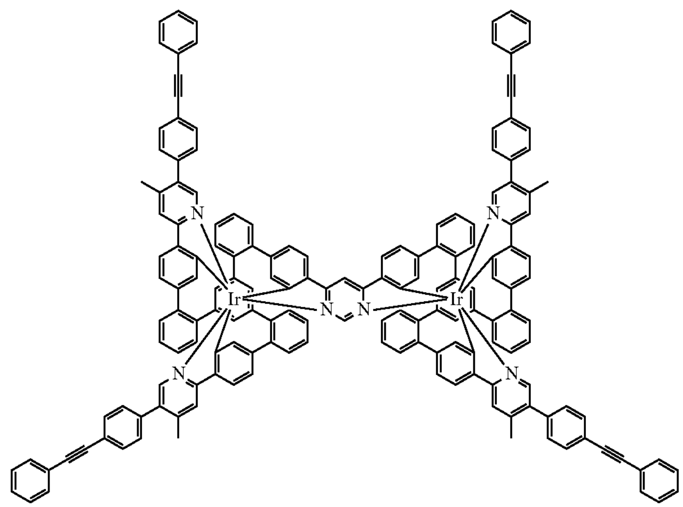 |

-continued
P154 [3430-26-0]
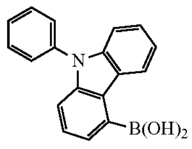
[1370555-65-9]
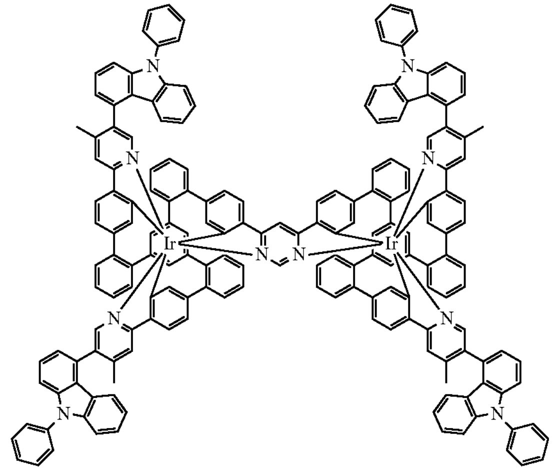
P155 [3430-26-0]
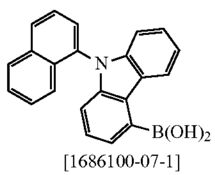
[1686100-07-1]
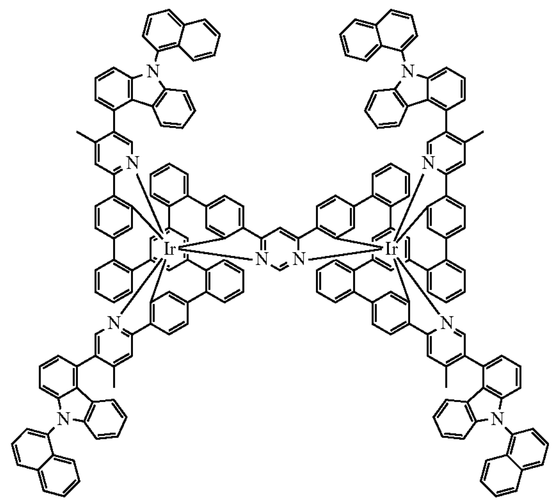

-continued
P156 [3430-26-0]
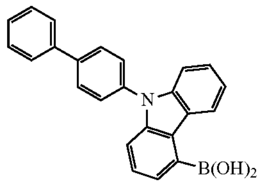
[1686100-09-3]
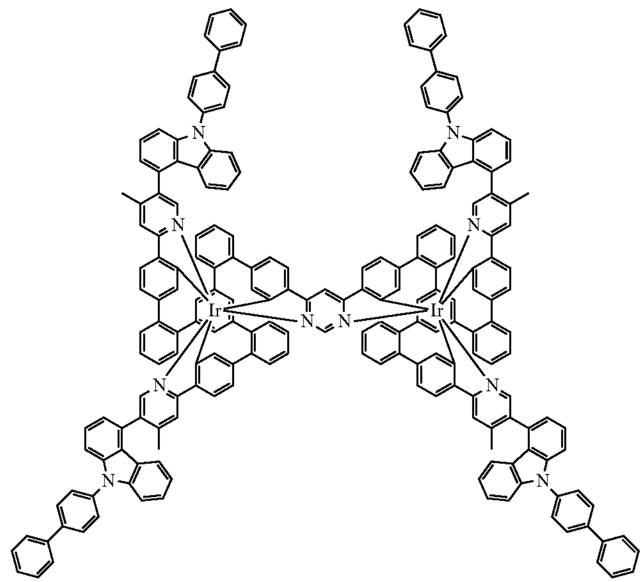
P157 [3430-26-0]
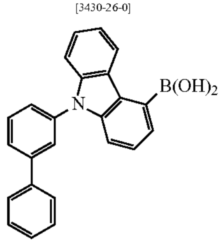
[1843213-11-6]
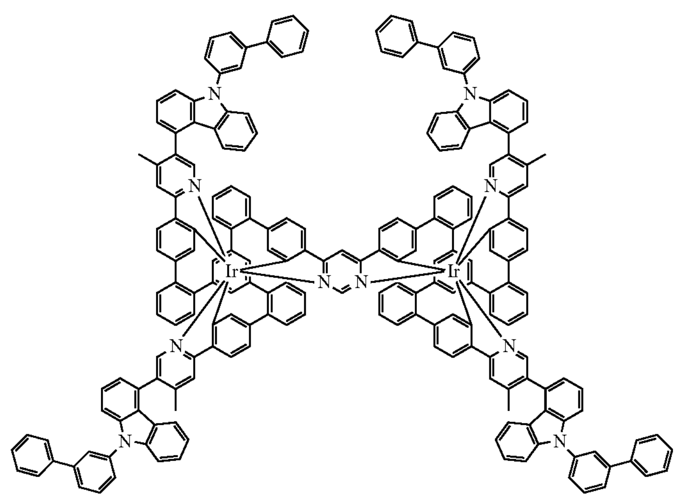

-continued
P158
[3430-26-0]
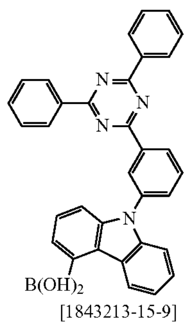
[1843213-15-9]
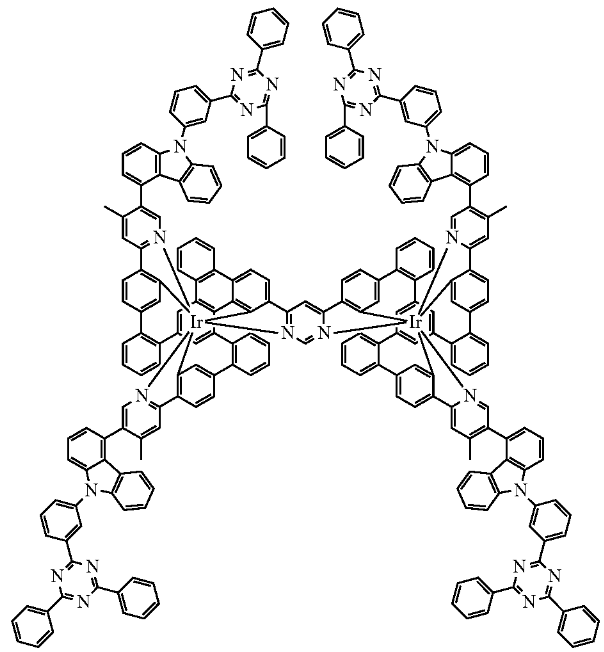

-continued
| | | |
|---|---|---|
| P159 | [3430-26-0] 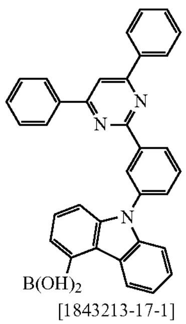 [1843213-17-1] | 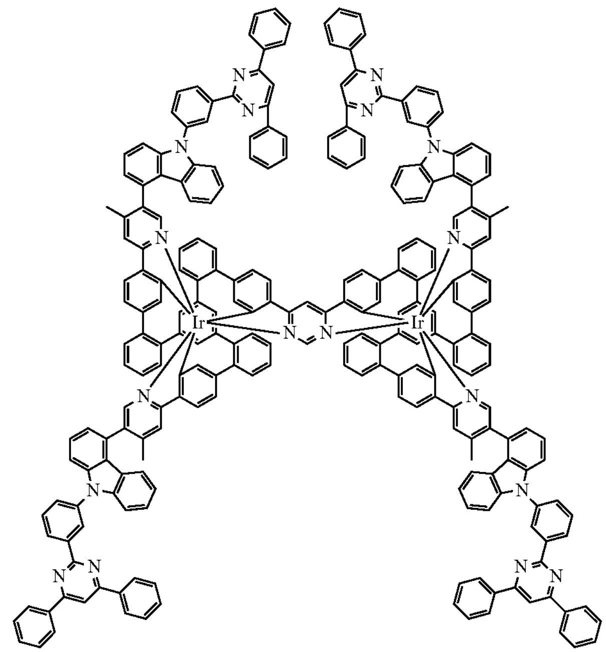 |
| P160 | [3430-26-0] 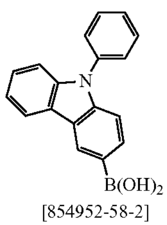 [854952-58-2] | 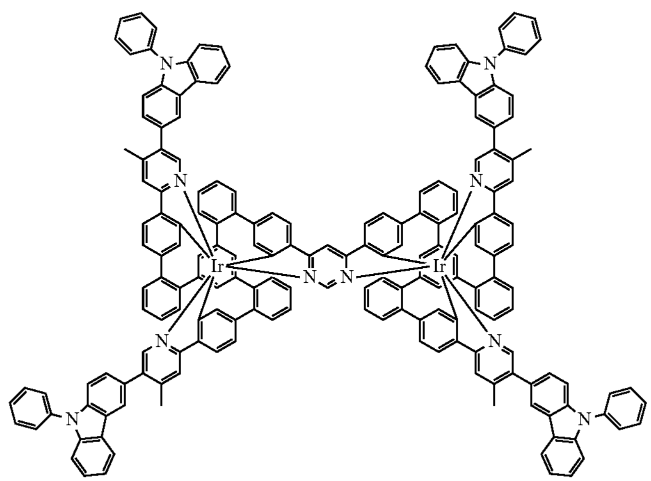 |

-continued
| | | |
|---|---|---|
| P161 | [3430-26-0] 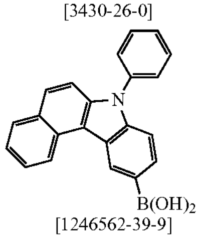 [SMILES: OB(O)c1ccc2c(c1)c1c3ccccc3ccc1n2-c1ccccc1] [1246562-39-9] | 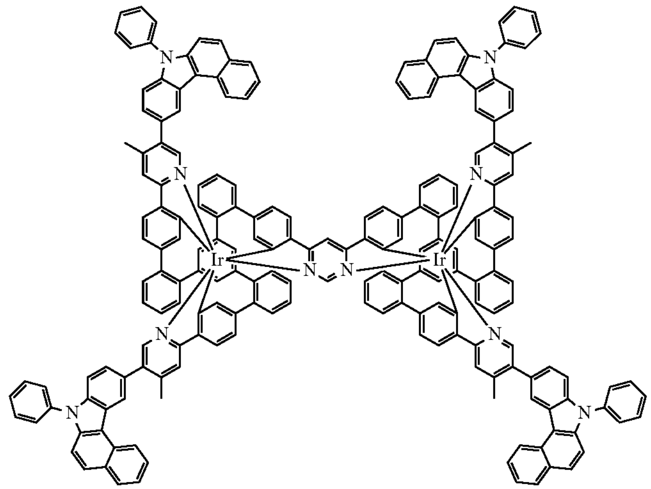 |
| P162 | [3430-26-0] 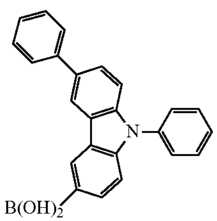 [1133058-06-6] | 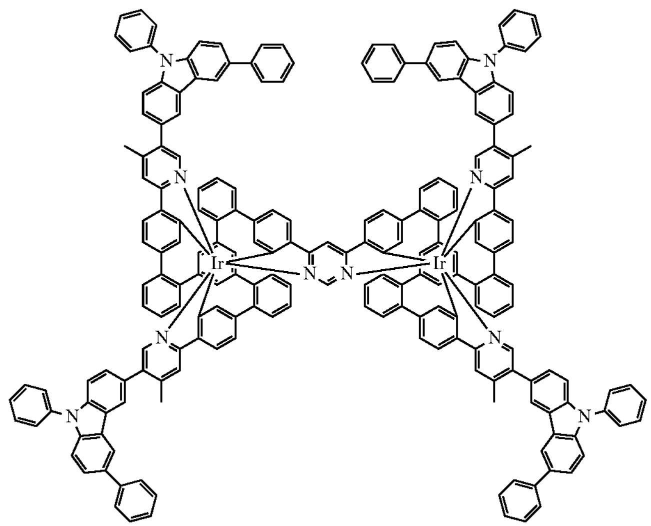 |

-continued
| | | |
|---|---|---|
| P163 | [3430-26-0]<br>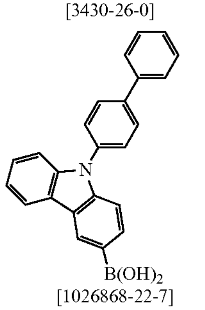 [SMILES: OB(O)c1ccc2c(c1)c1ccccc1n2-c1ccc(-c2ccccc2)cc1]<br>[1026868-22-7] | 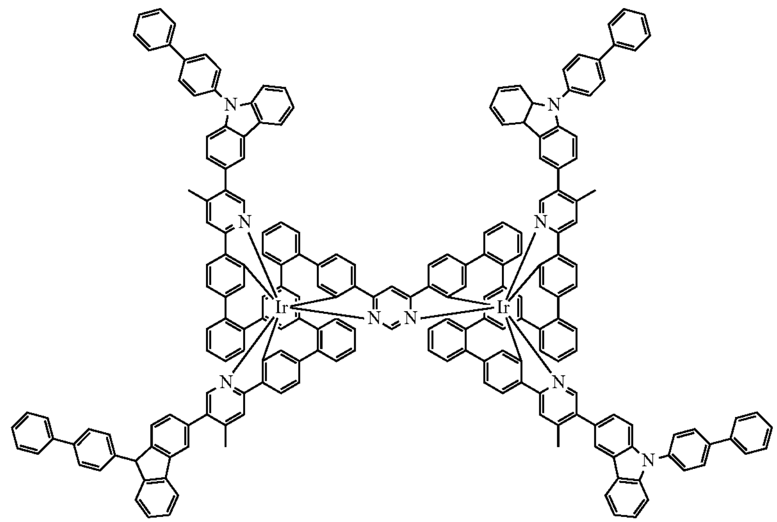 |
| P164 | [3430-26-0]<br>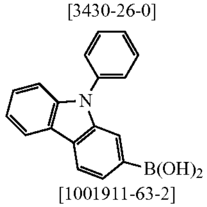 [SMILES: OB(O)c1ccc2c3ccccc3n(-c3ccccc3)c2c1]<br>[1001911-63-2] | 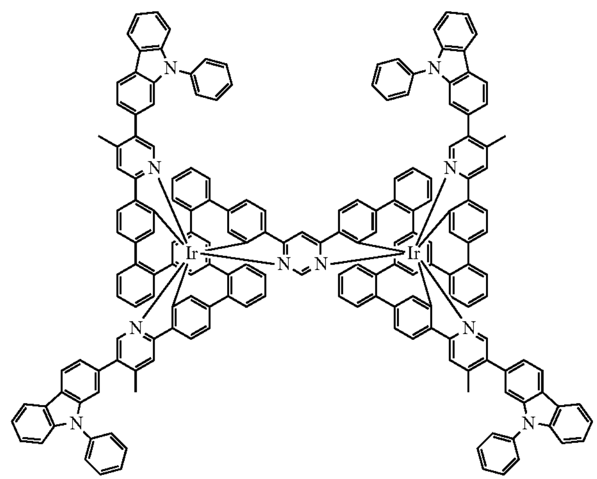 |

-continued
P165 [3430-26-0]
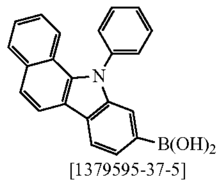
[1379595-37-5]
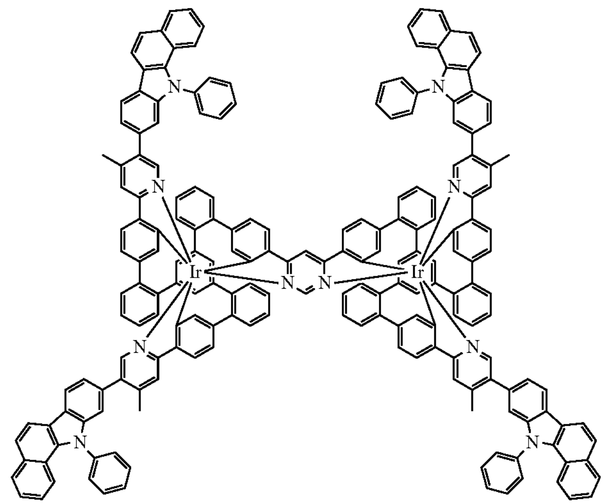
P166 [3430-26-0]
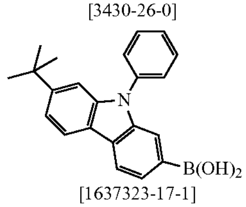 [SMILES: CC(C)(C)c1ccc2c3ccc(B(O)O)cc3n(-c3ccccc3)c2c1]
[1637323-17-1]
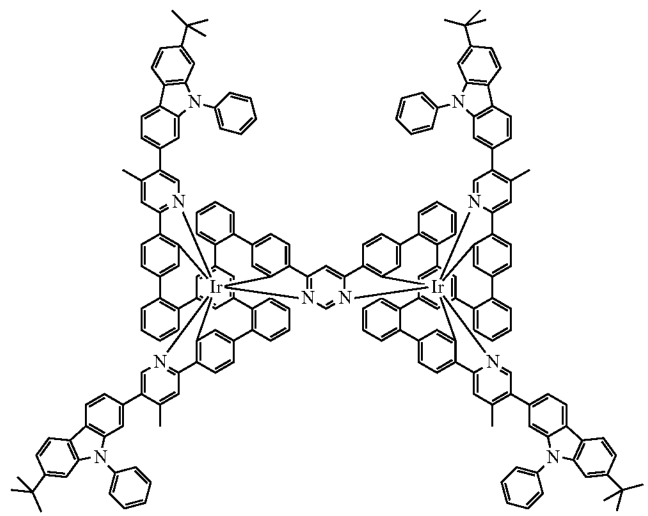

-continued
| | | |
|---|---|---|
| P167 | [3430-26-0] 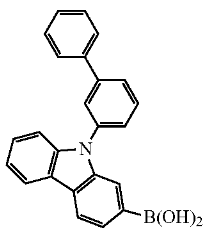 [1835251-21-2] | 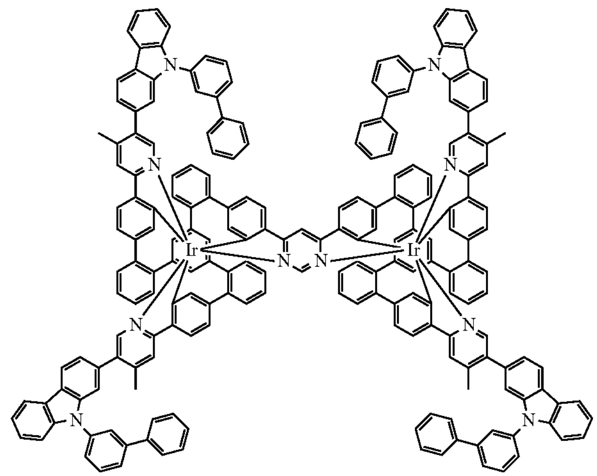 |
| P168 | [3430-26-0] 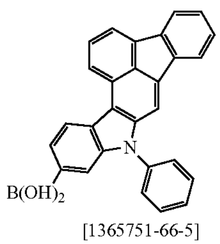 [1365751-66-5] | 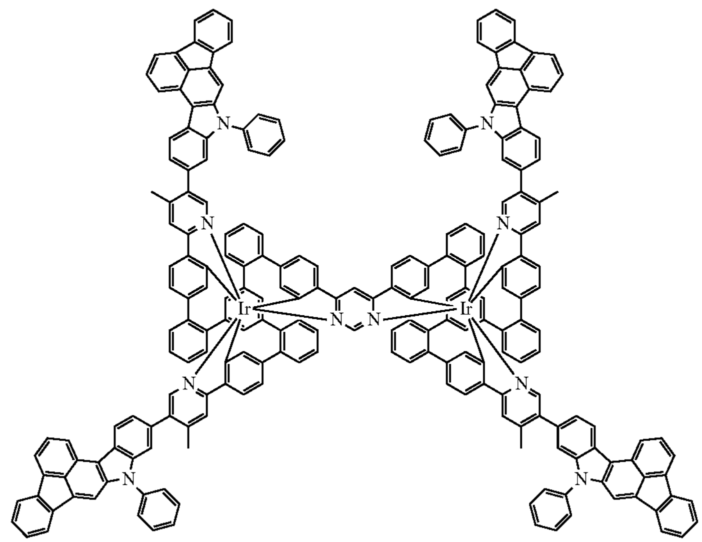 |

-continued
| | | | |
|---|---|---|---|
| P169 | [3430-26-0] 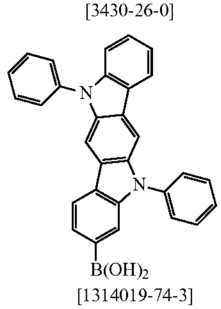 [SMILES: OB(O)c1ccc2c3cc4c(cc3n(-c3ccccc3)c2c1)c1ccccc1n4-c1ccccc1] [1314019-74-3] | | 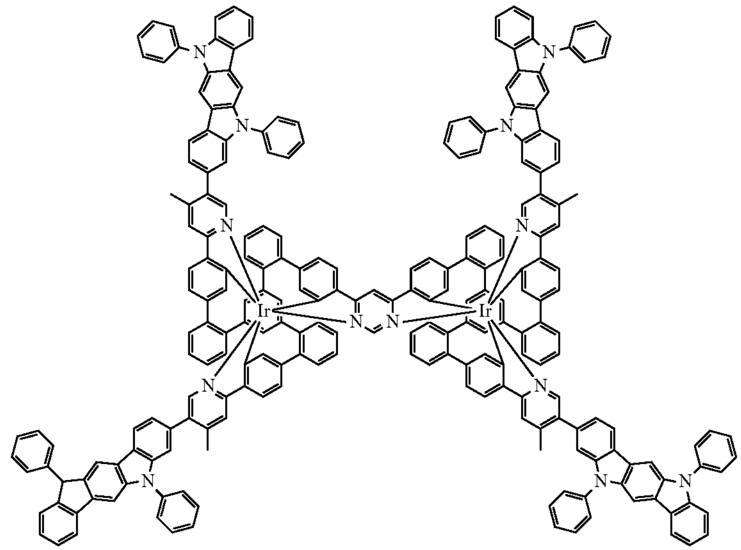 |
| P170 | [3430-26-0] 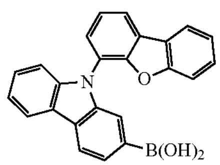 [1637388-04-5] | | 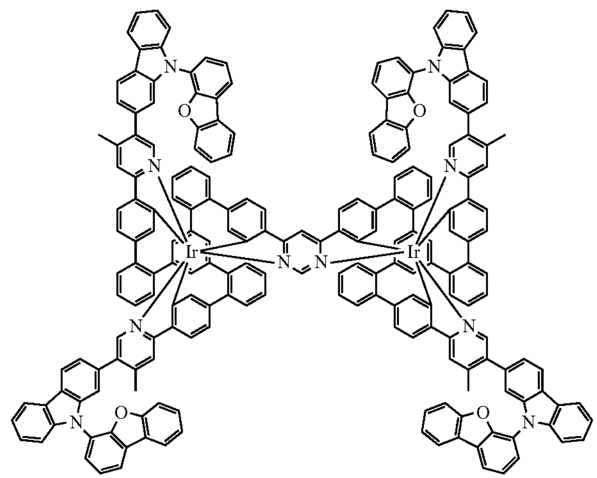 |

-continued
P171 [3430-26-0]
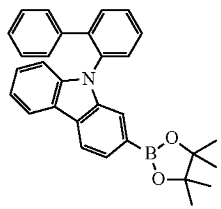
[1801609-61-9]
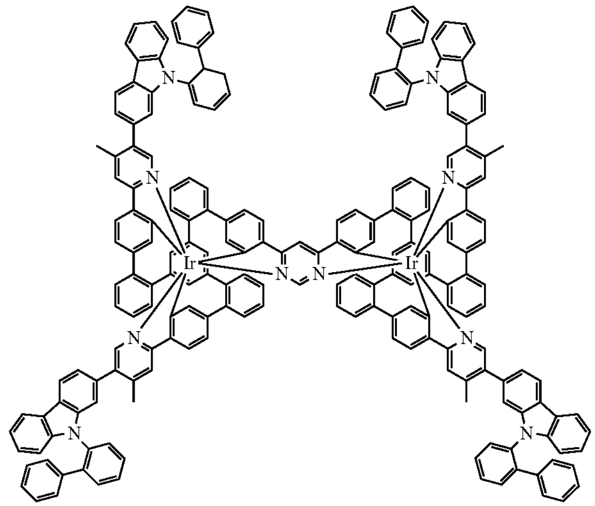
P172 [3430-26-0]
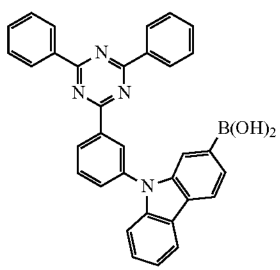
[16242121-56-9]
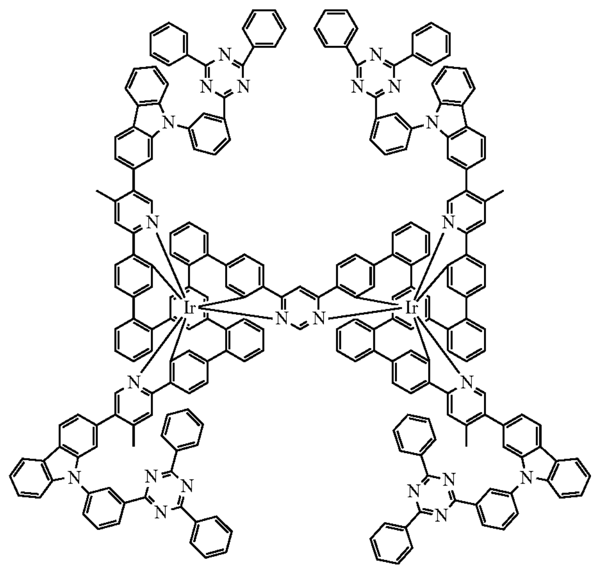

-continued
| | | |
|---|---|---|
| P173 | [3430-26-0] 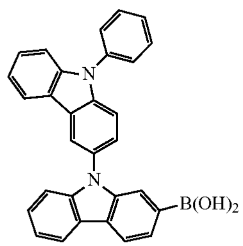 [1656982-87-4] | 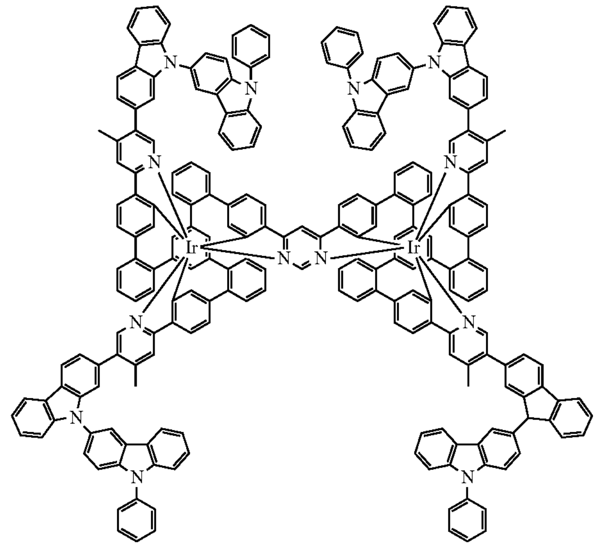 |
| P174 | [3430-26-0] 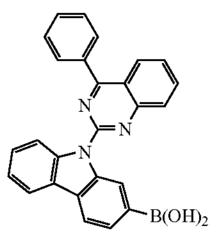 [1642121-59-2] | 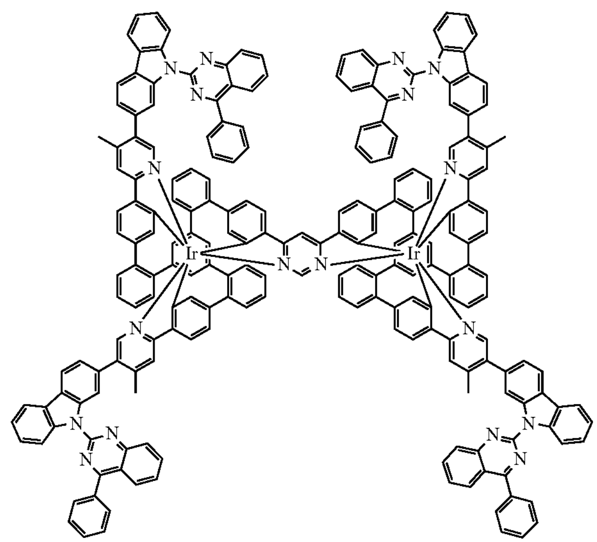 |

-continued
P175 [3430-26-0]
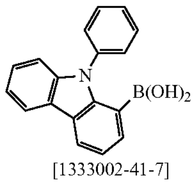
[1333002-41-7]
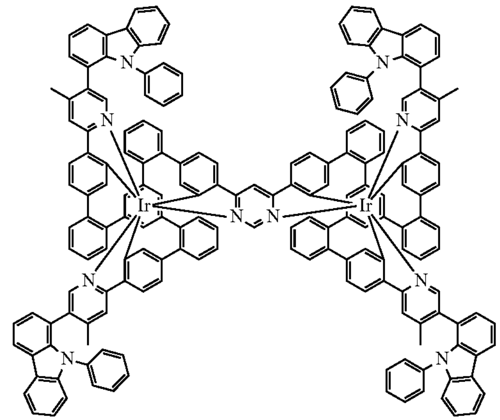
P176 [3430-26-0]
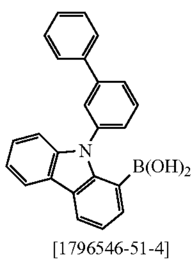
[1796546-51-4]
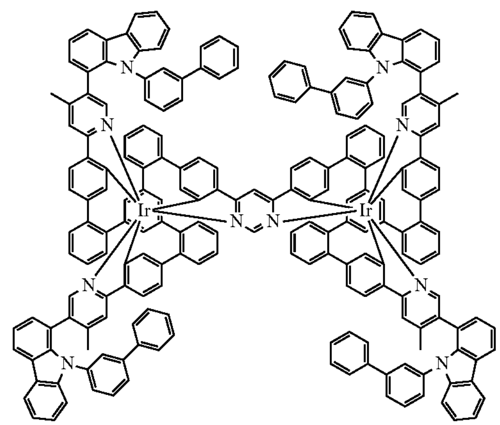

-continued
P177
[3430-26-0]
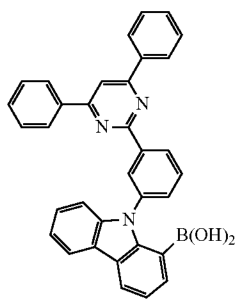
[1843211-08-4]
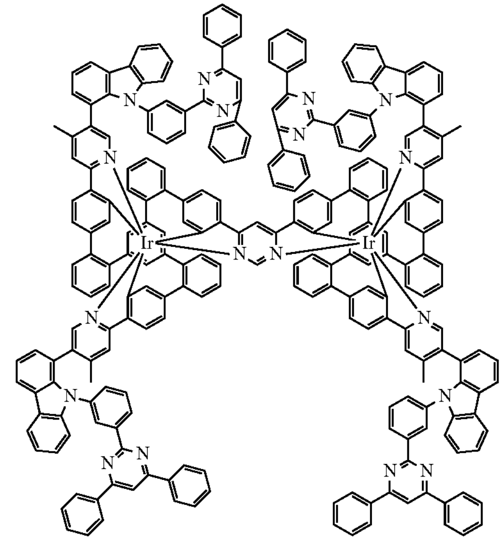
P178
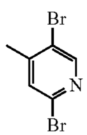
[3430-26-0]
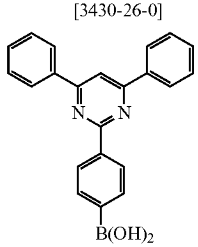
[1260393-76-7]
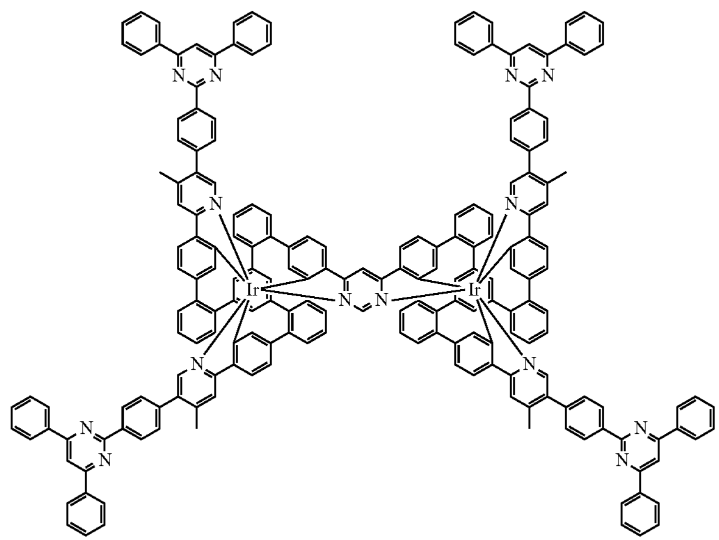

-continued
| | | |
|---|---|---|
| P179 | 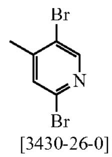 [3430-26-0] 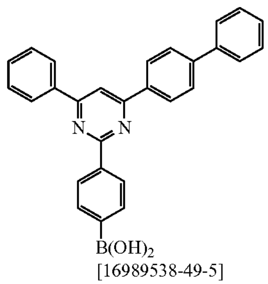 [16989538-49-5] | 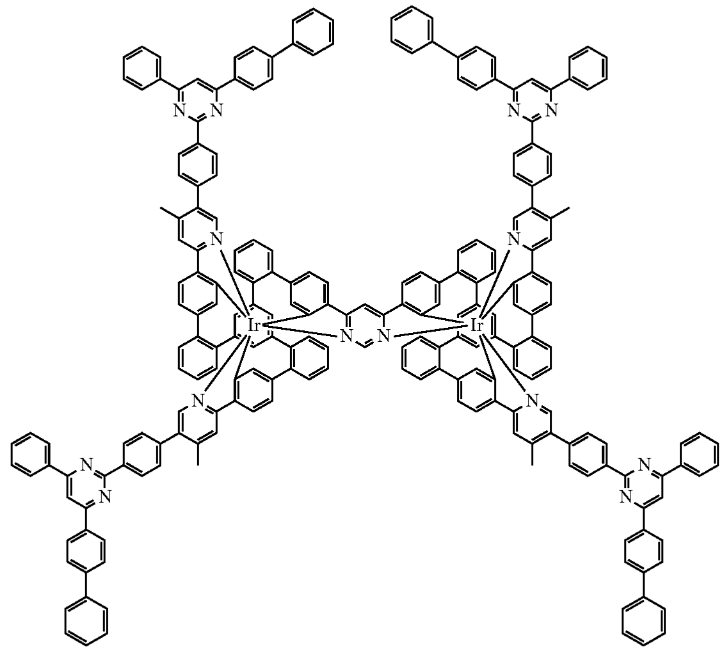 |

-continued
| | | |
|---|---|---|
| P180 | 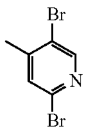 [3430-26-0] 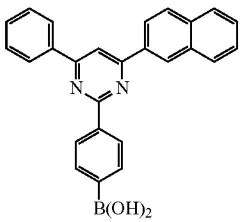 [1616841-80-5] | 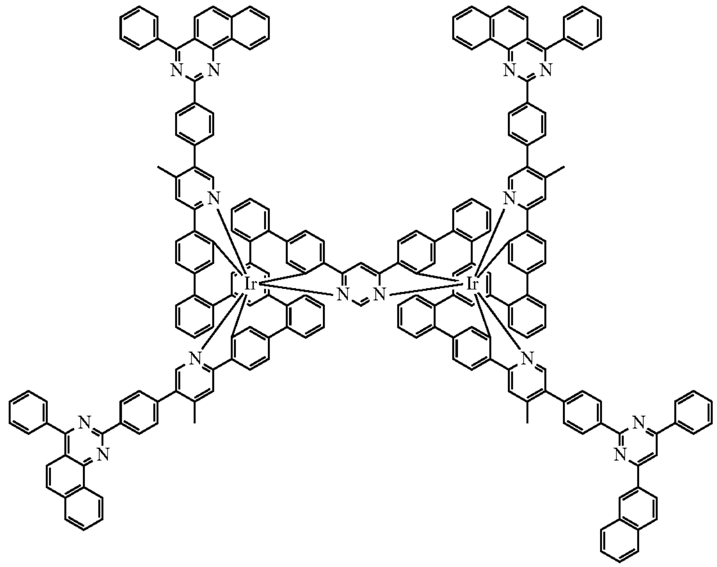 |
| P181 | 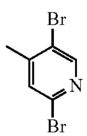 [3430-26-0] 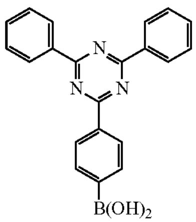 [1313018-07-3] | 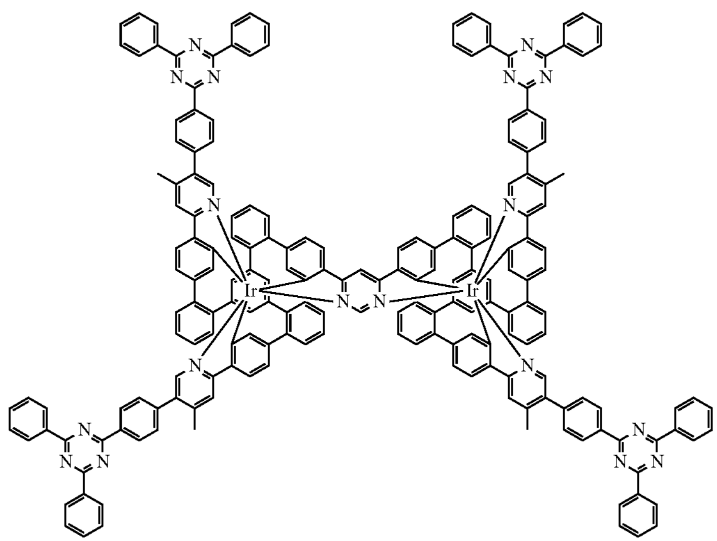 |

-continued
P182
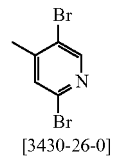
[3430-26-0]
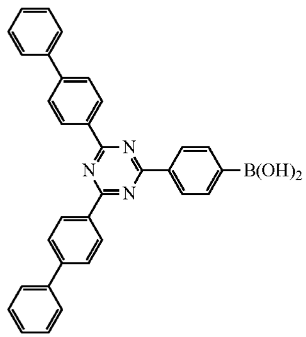
[1821675-79-9]
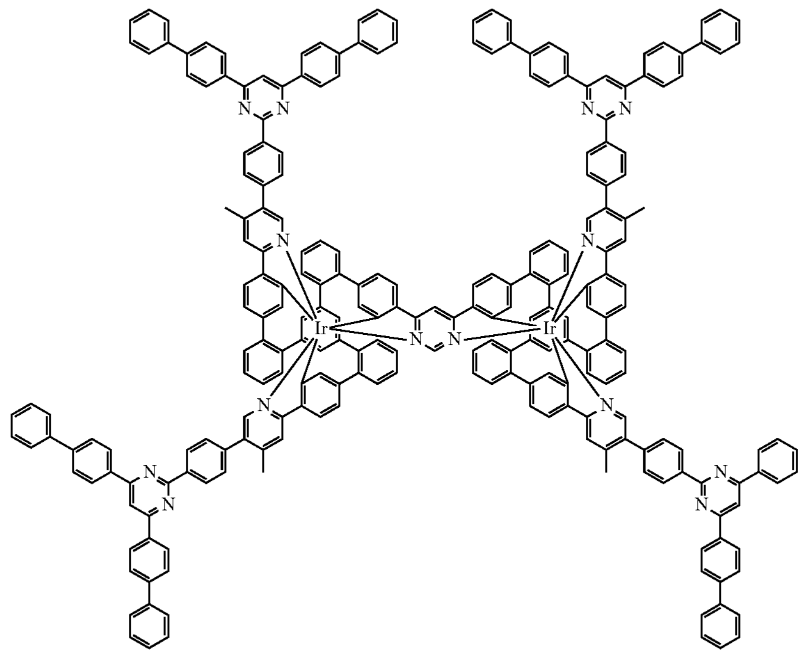

-continued
P183
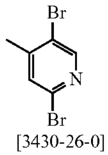
[3430-26-0]
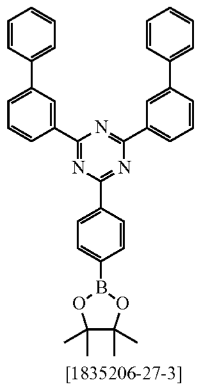
[1835206-27-3]
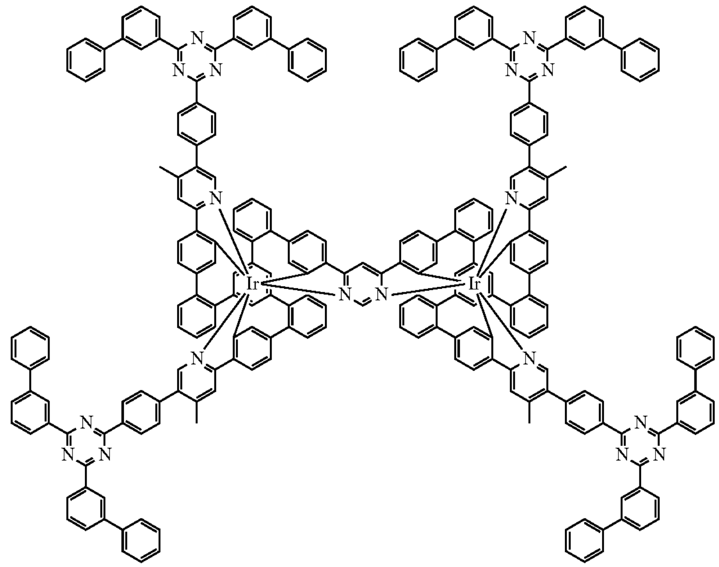

-continued
P184
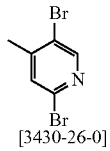
[3430-26-0]
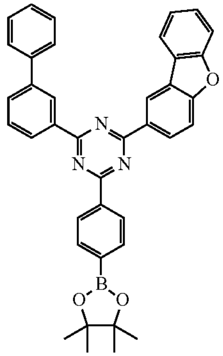
[1835206-50-2]
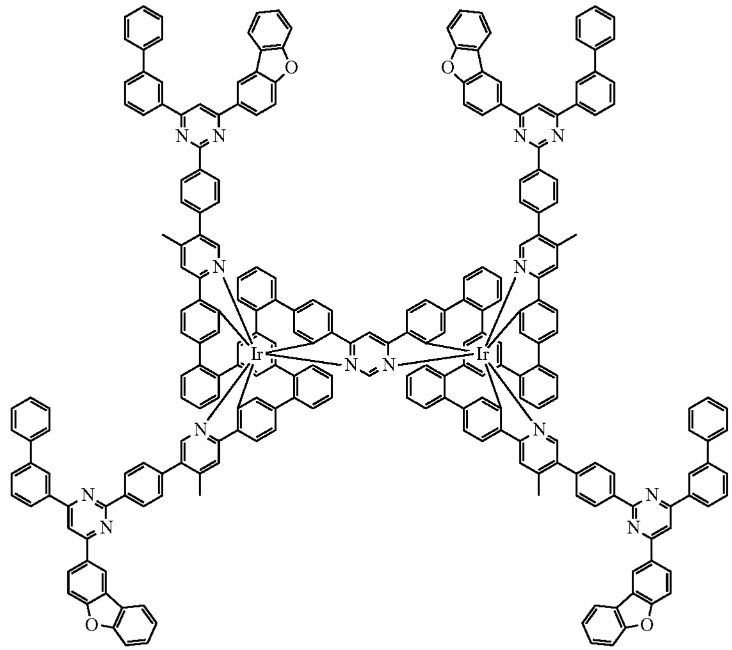

-continued
P185
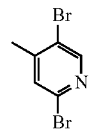
[3430-26-0]
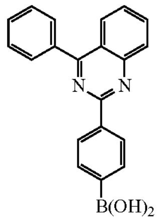
[1801285-72-2]
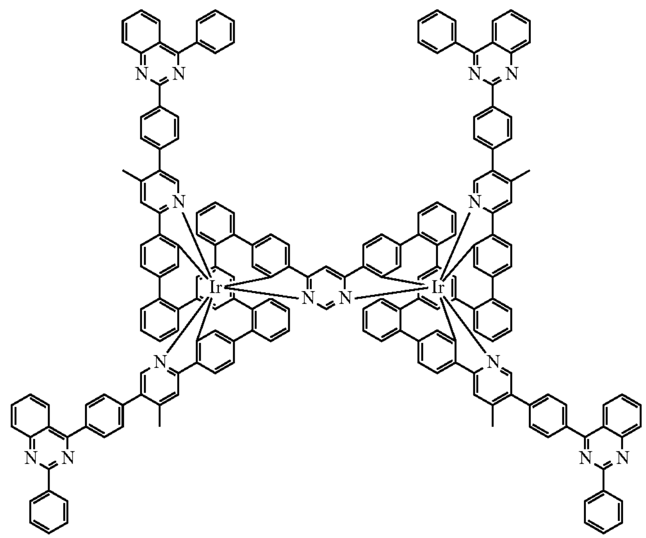
P186
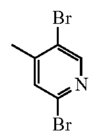
[3430-26-0]
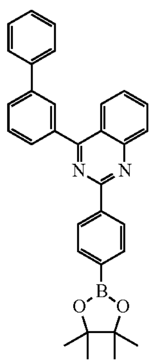
[1637377-59-3]
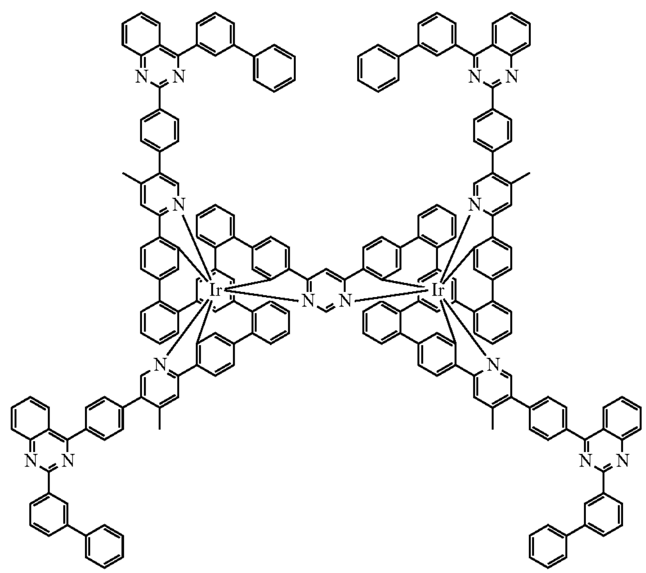

-continued
P187
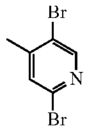
[3430-26-0]
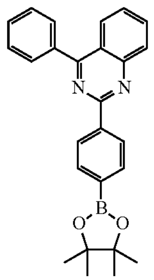
[1621468-52-7]
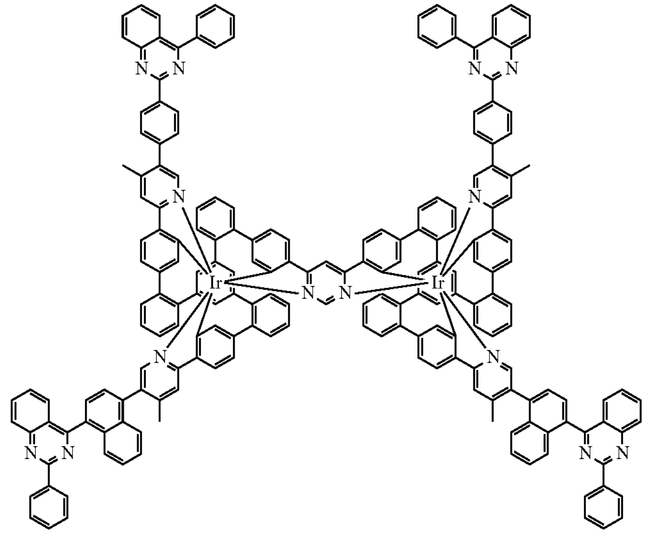
P188
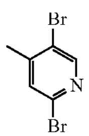
[3430-26-0]
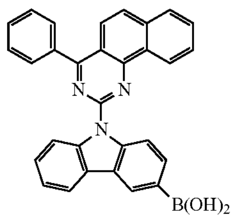
[1813537-15-3]
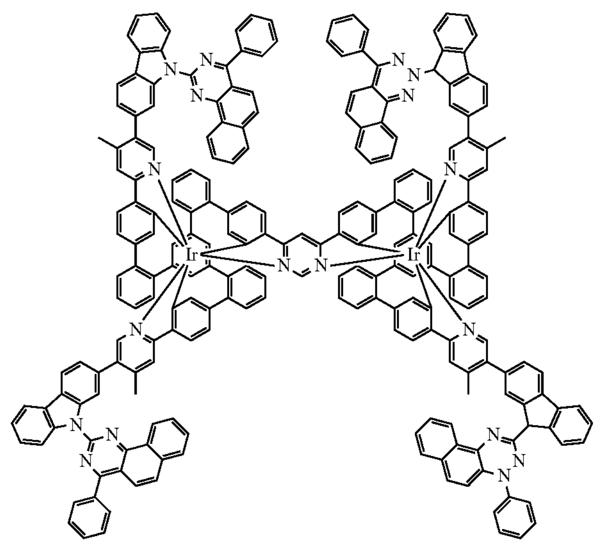

-continued
P189
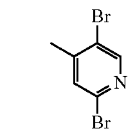
[3430-26-0]
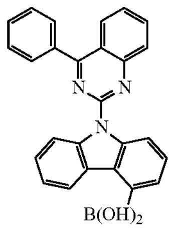
[1813537-15-3]
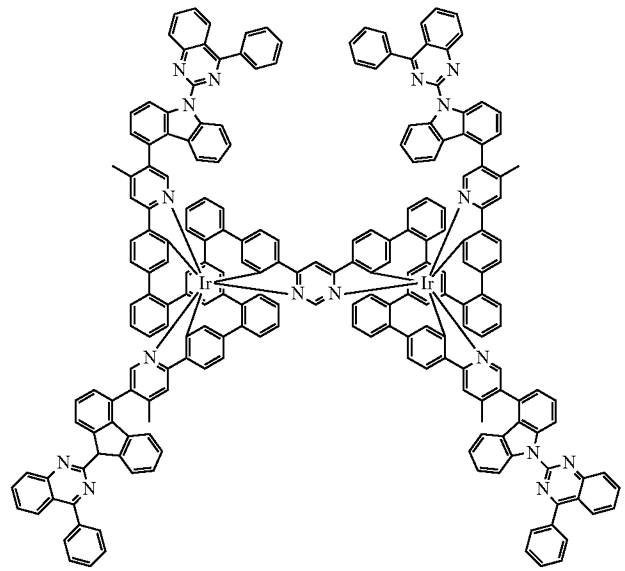
P190
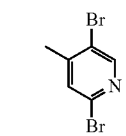
[3430-26-0]
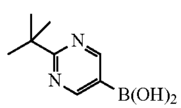
[1352570-51-4]
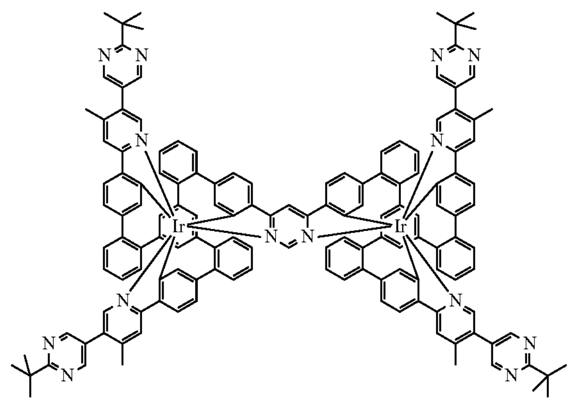

-continued
P191
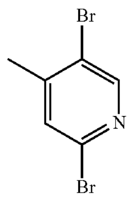
[3430-26-0]
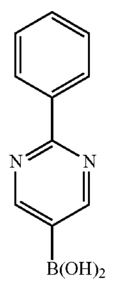
[1264510-78-2]
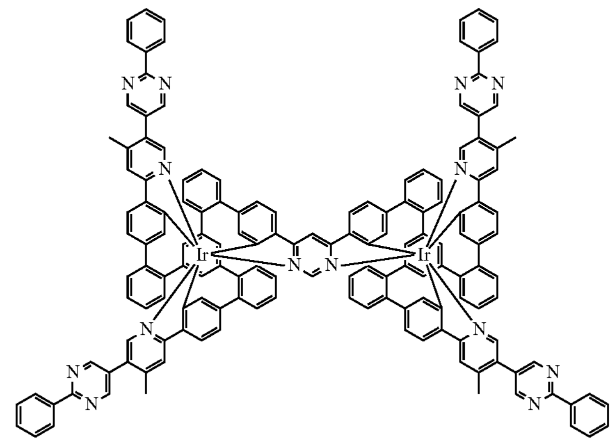
P192
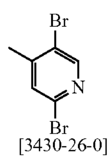
[3430-26-0]
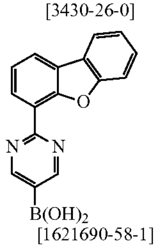
[1621690-58-1]
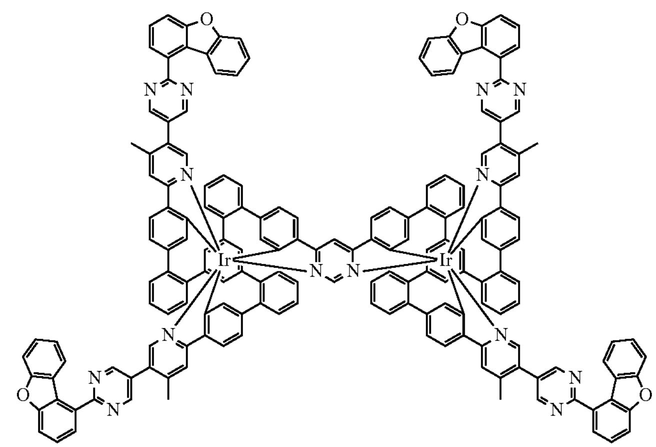

-continued
| | | |
|---|---|---|
| P193 | 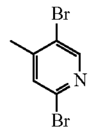 [3430-26-0] 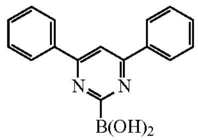 [1314221-56-1] | 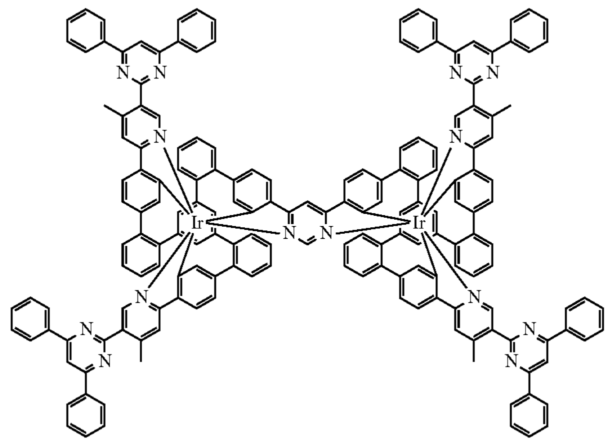 |
| P194 | 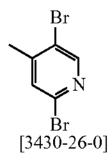 [3430-26-0] 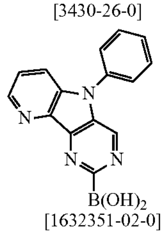 [1632351-02-0] | 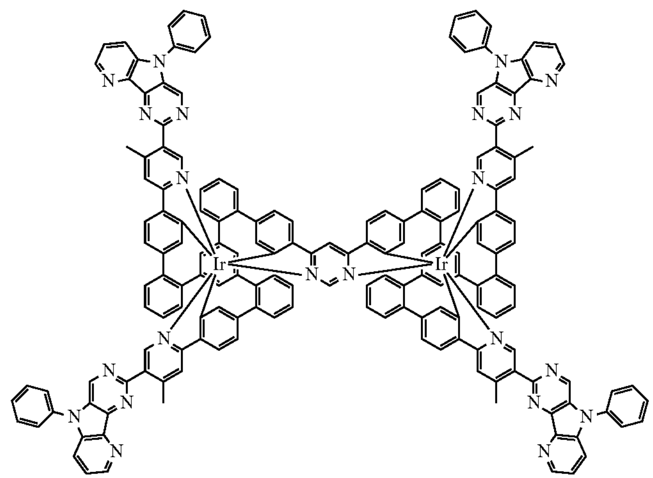 |

-continued
| | | |
|---|---|---|
| P195 | 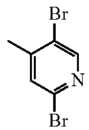 [3430-26-0] 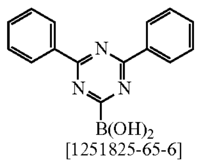 [1251825-65-6] | 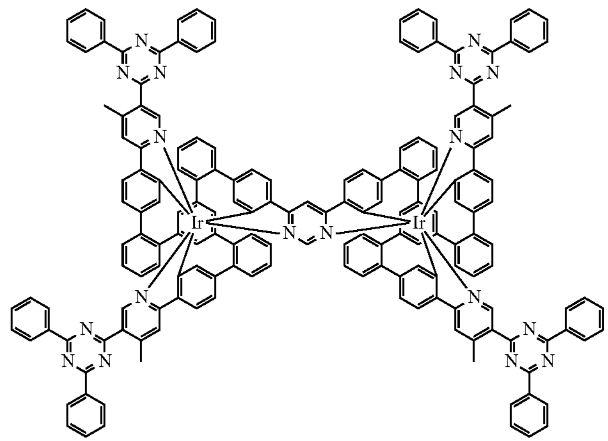 |
| P196 | 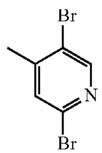 [3430-26-0] 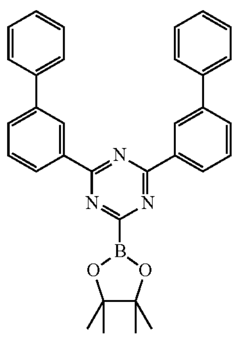 [1946760-59-3] | 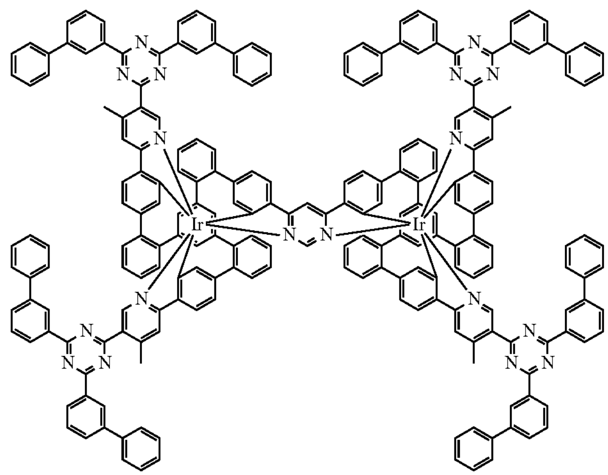 |

-continued
| | | |
|---|---|---|
| P197 | 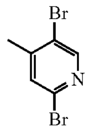 [3430-26-0] 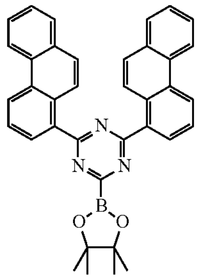 [1646151-66-7] | 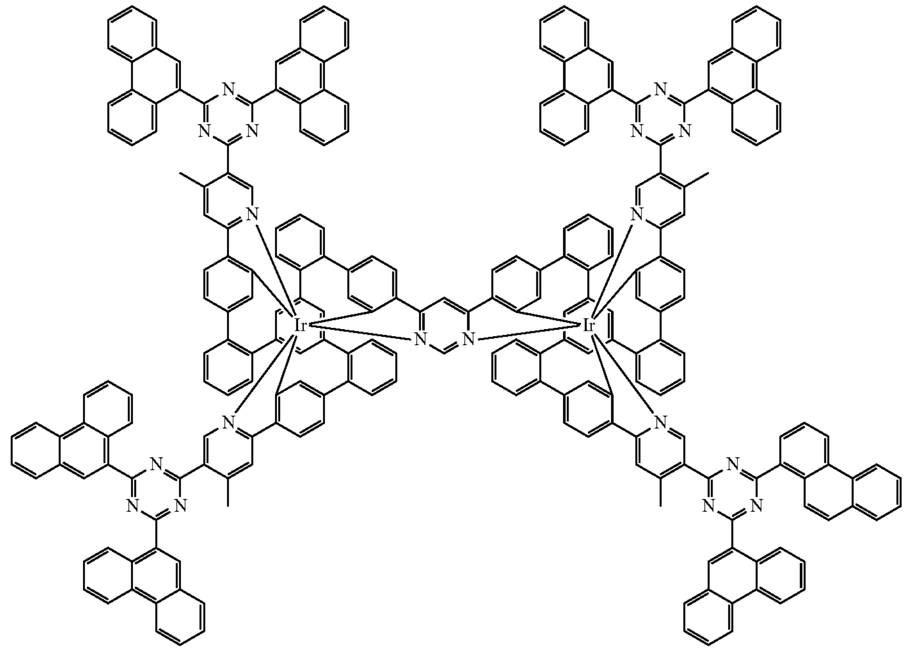 |
| P198 | 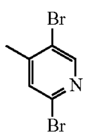 [3430-26-0] 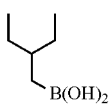 [140614-19-3] | 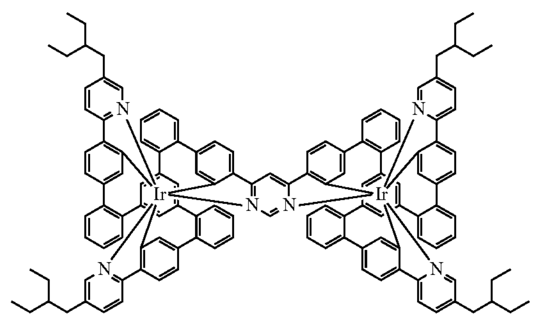 |

-continued
| | | |
|---|---|---|
| P199 | 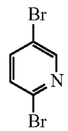<br>[624-28-2]<br>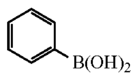<br>[98-80-6] | 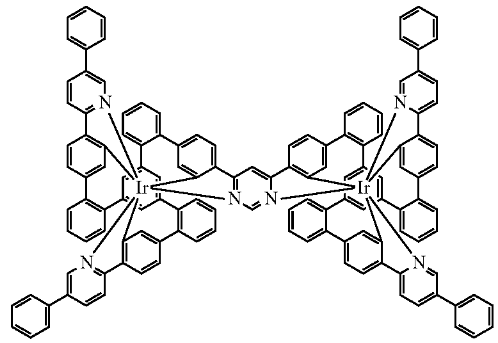 |
| P200 | 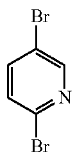<br>[624-28-2]<br>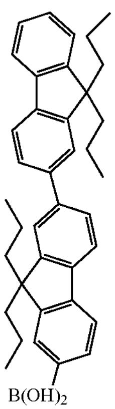<br>[409093-94-3] | 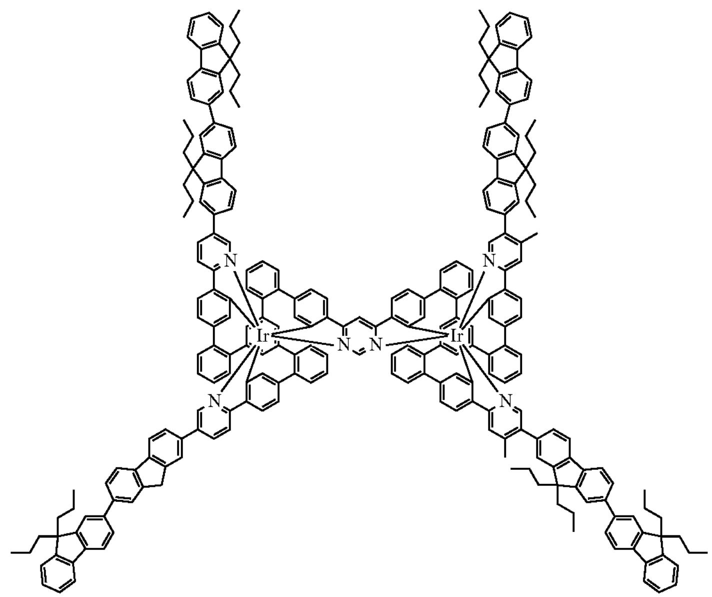 |

-continued
P201
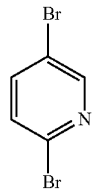
[624-28-2]
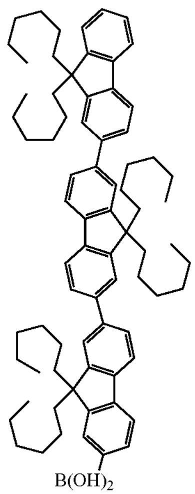
[797789-74-3]
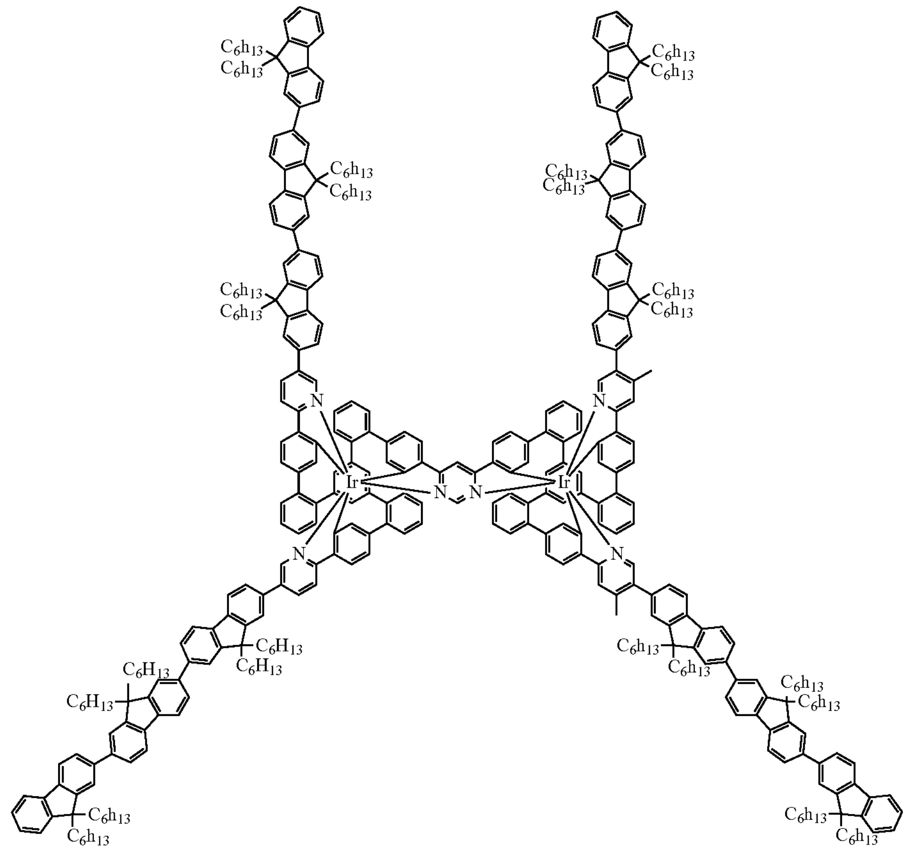

-continued
P202
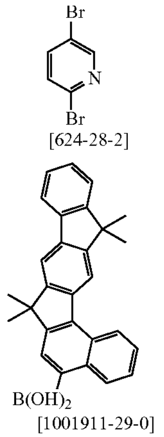 [SMILES: Brc1ccc(Br)nc1 ; CC1(C)c2ccccc2-c2cc3c(cc21)-c1c(cc(B(O)O)c2ccccc12)C3(C)C]
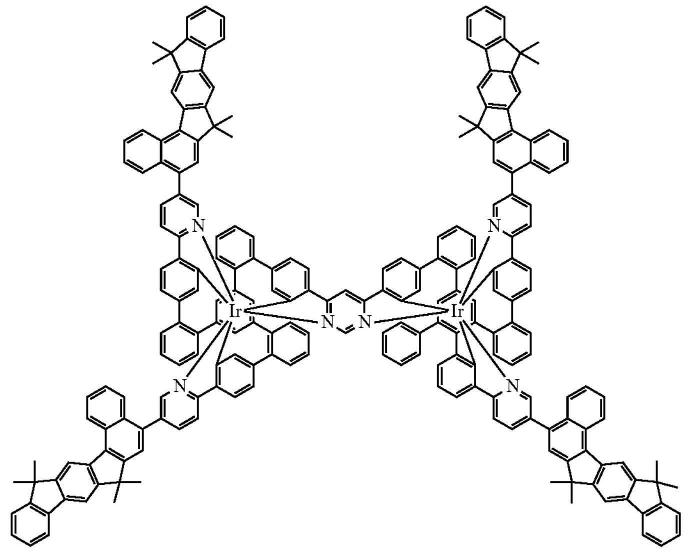
P203
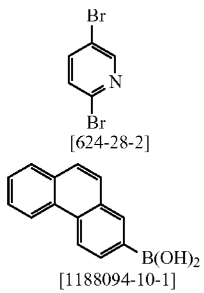 [SMILES: Brc1ccc(Br)nc1 ; OB(O)c1ccc2c(ccc3ccccc32)c1]
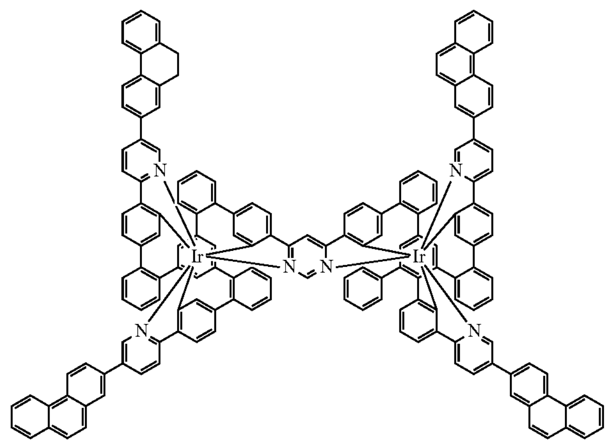

-continued
P204
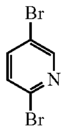
[624-28-2]
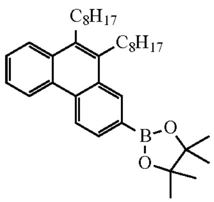
[1616106-39-8]
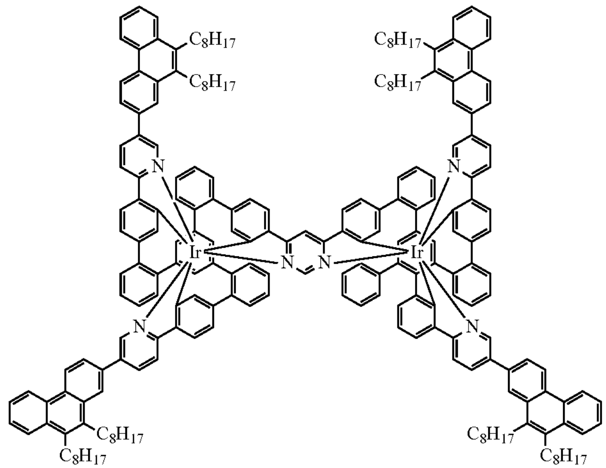
P205
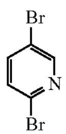
[624-28-2]
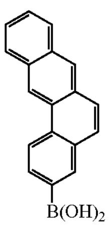
[1087346-77-7]
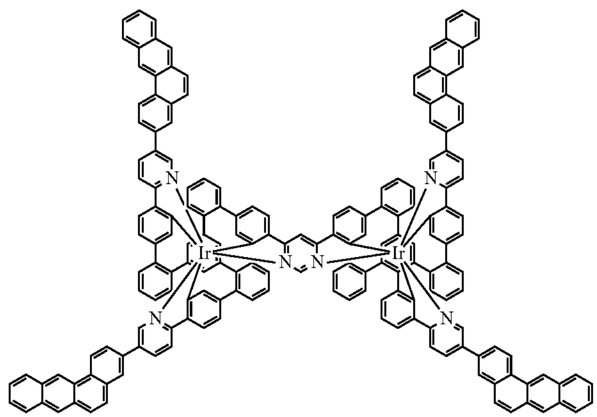

-continued
P206
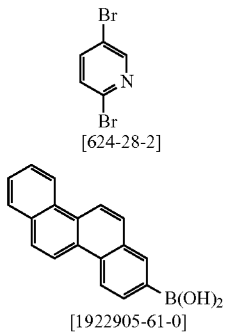 [SMILES: Brc1ccc(Br)nc1 ; OB(O)c1ccc2c(ccc3c4ccccc4ccc23)c1]
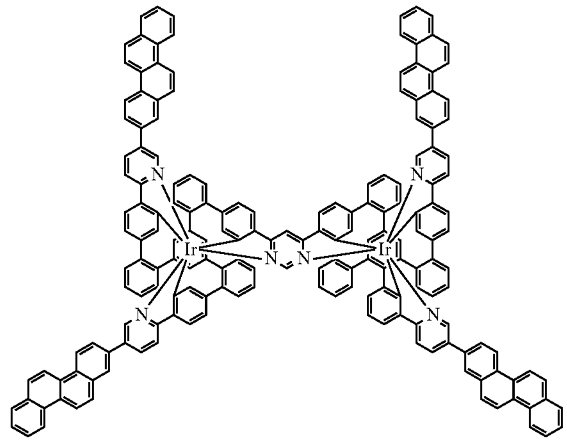
P207
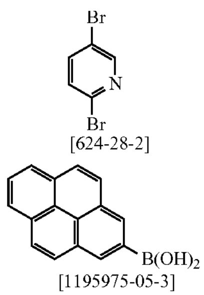 [SMILES: Brc1ccc(Br)nc1 ; OB(O)c1cc2ccc3cccc4ccc(c1)c2c34]
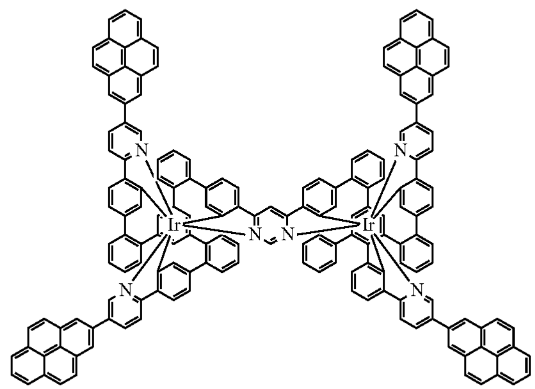

-continued
| | | |
|---|---|---|
| P208 | 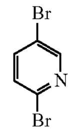<br>[624-28-2]<br>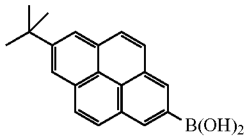<br>[1962181-43-6] | 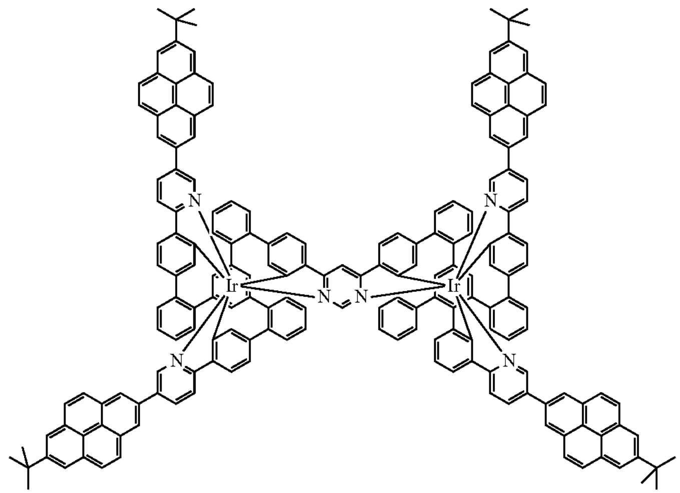 |
| P209 | 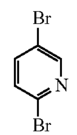<br>[624-28-2]<br>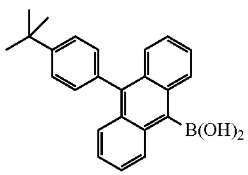<br>[870119-38-3] | 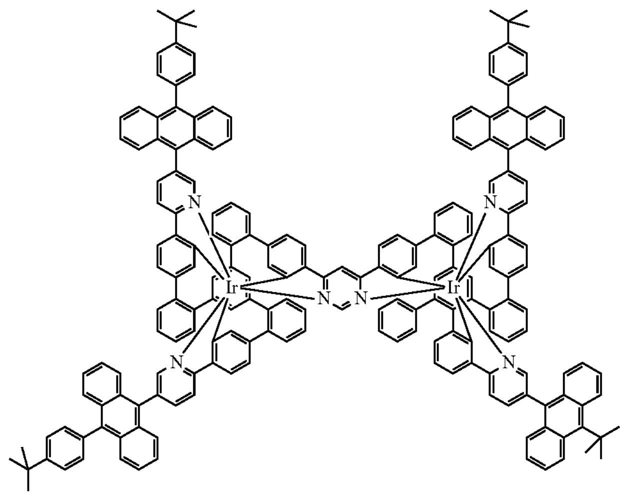 |

-continued
P210
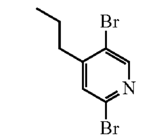
[1254043-54-3]
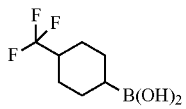
[1895004-33-7]
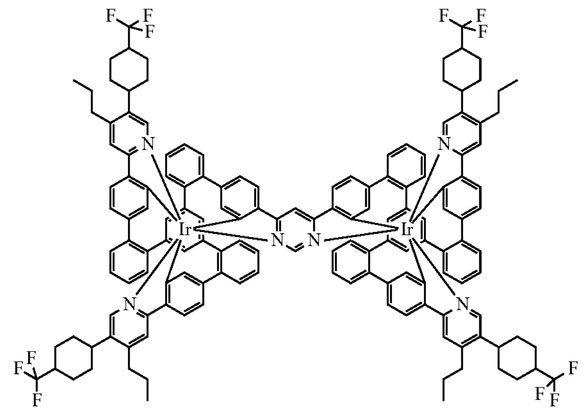
P211
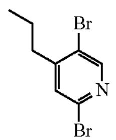
[1254043-54-3]
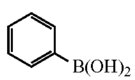
[98-80-6]
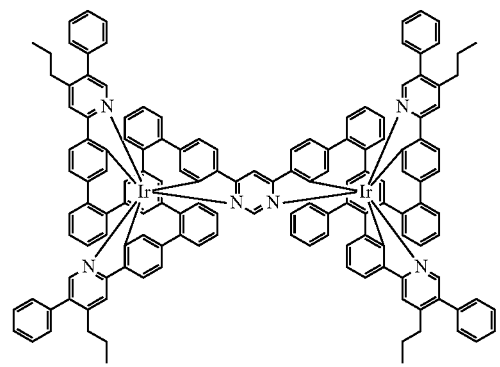

-continued
P212
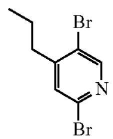
[1254043-54-3]
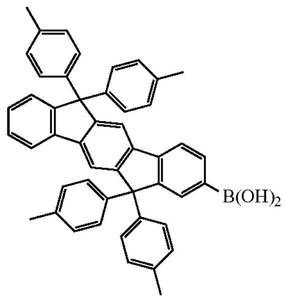
[1193104-86-7]
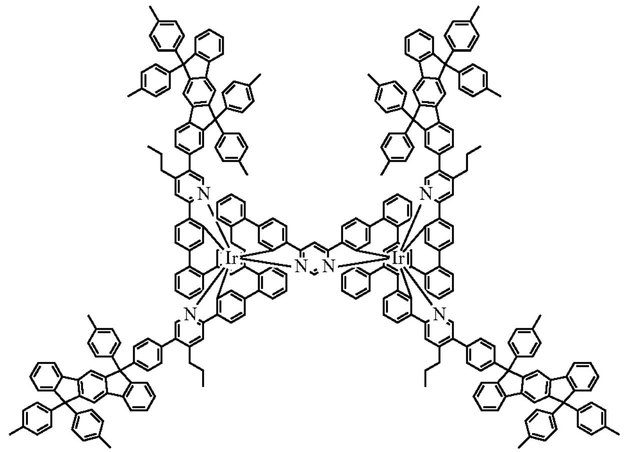
P213
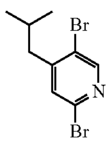
[1957986-14-9]
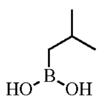
[84110-40-7]
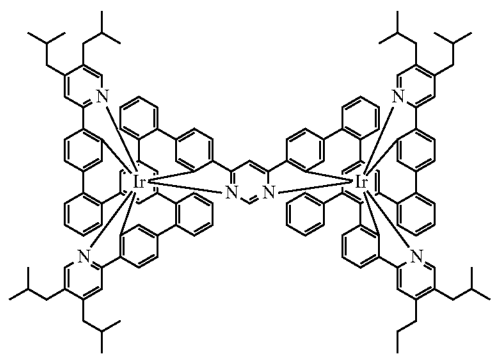

-continued
P214
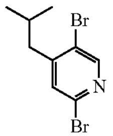
[1957986-14-9]
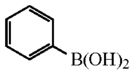
[98-80-6]
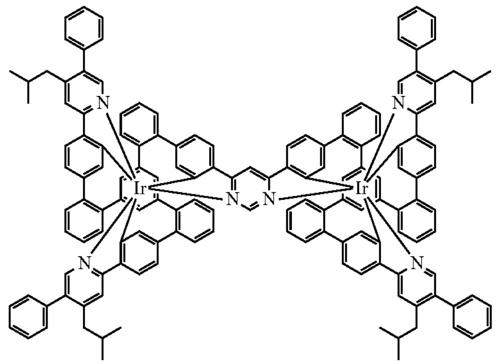
P215
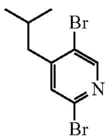
[1957986-14-9]
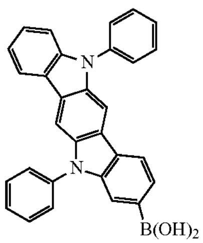
[1314019-74-3]
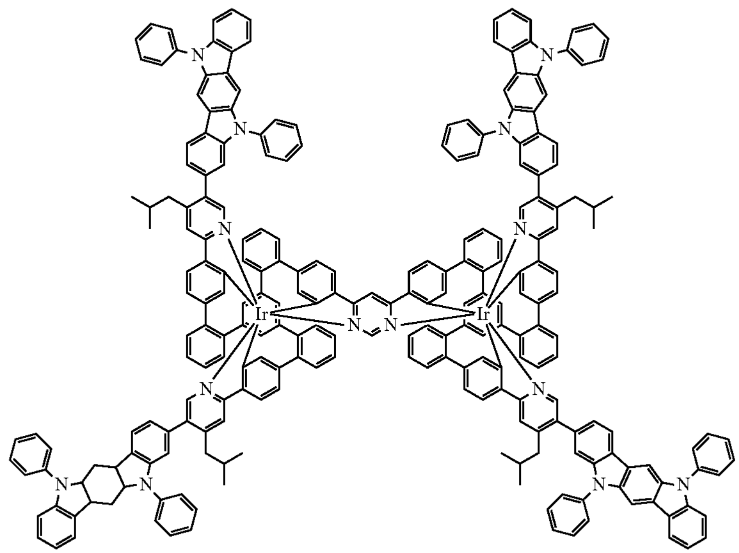

-continued
P216
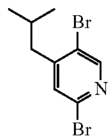
[1957986-14-9]
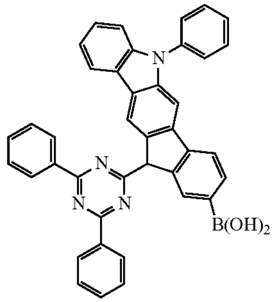
[1314019-71-0]
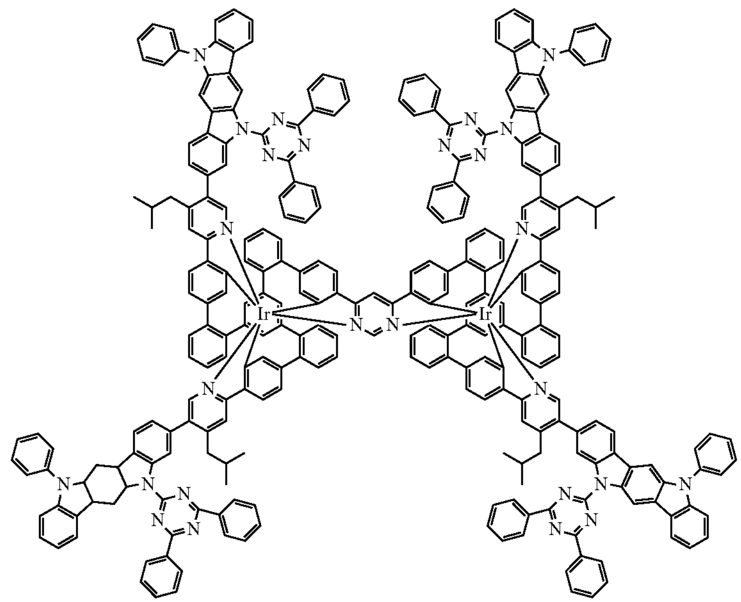
P217
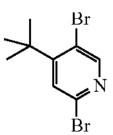
[1256798-90-8]
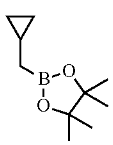
[1344115-77-0]
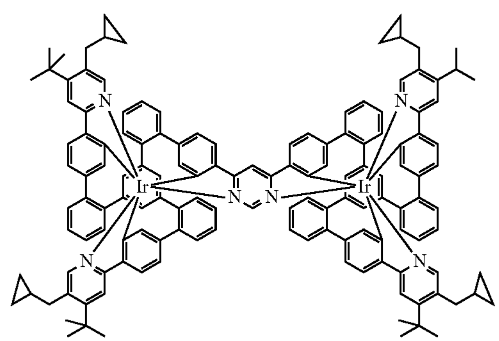

-continued
| | | |
|---|---|---|
| P218 | 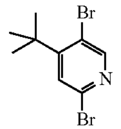 [1256798-90-8] 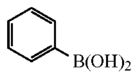 [98-80-6] | 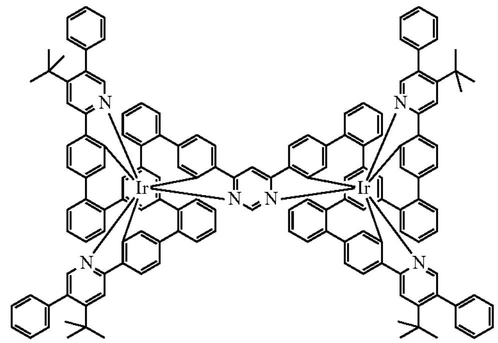 |
| P219 | 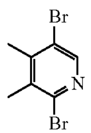 [125419-92-3] 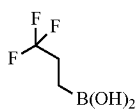 [1148113-74-9] | 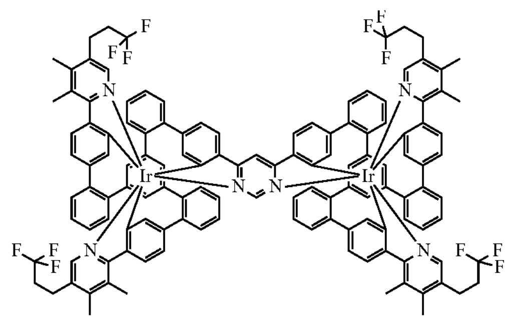 |
| P220 | 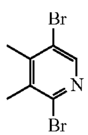 [125419-92-3] 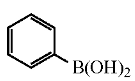 [98-80-6] | 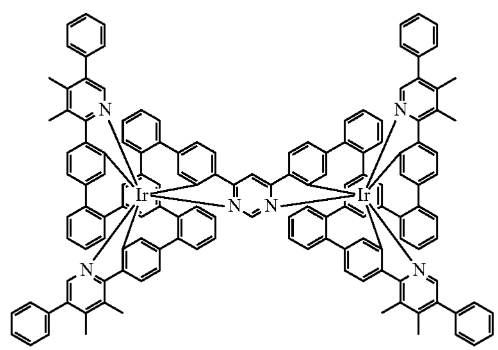 |

-continued
P221
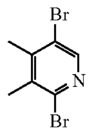
[125419-92-3]
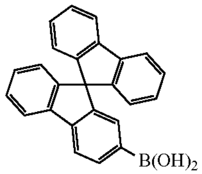
[236389-21-2]
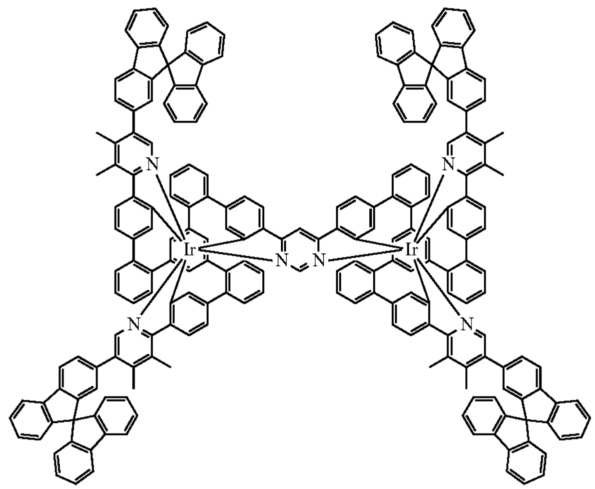
P222
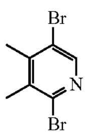
[125419-92-3]
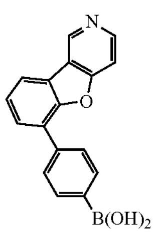
[2055375-26-1]
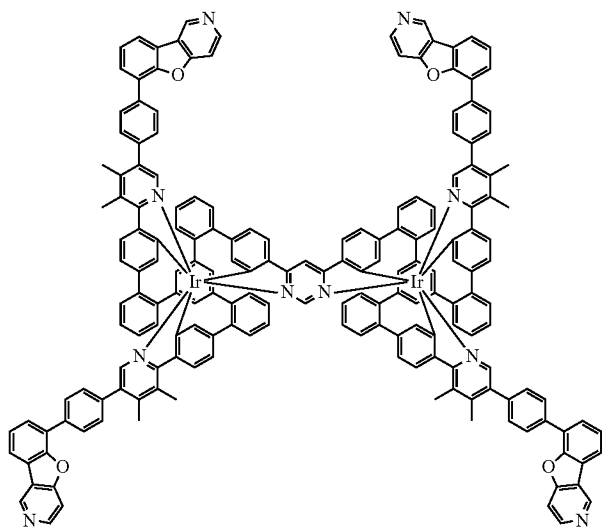

-continued
| | | |
|---|---|---|
| P223 | 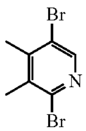 [125419-92-3] 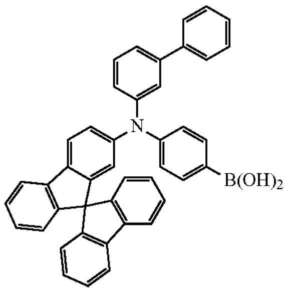 [2020399-15-7] | 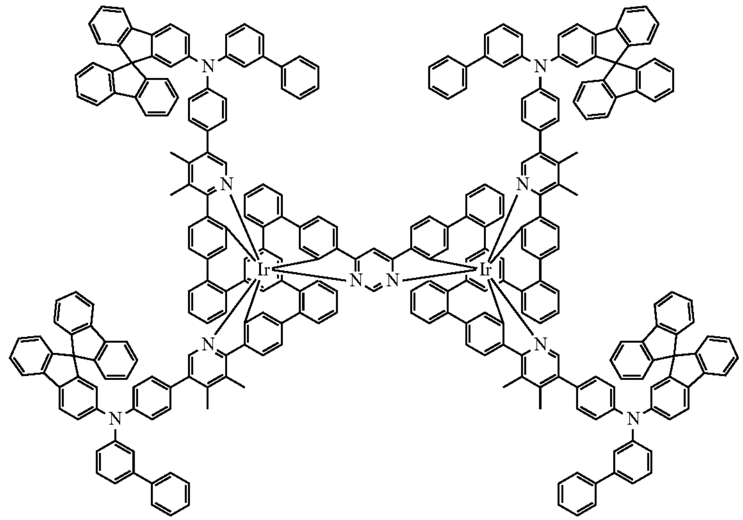 |
| P224 | 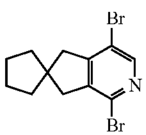 [11612855-00-1] 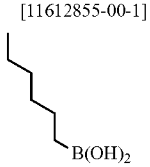 [16343-08-1] | 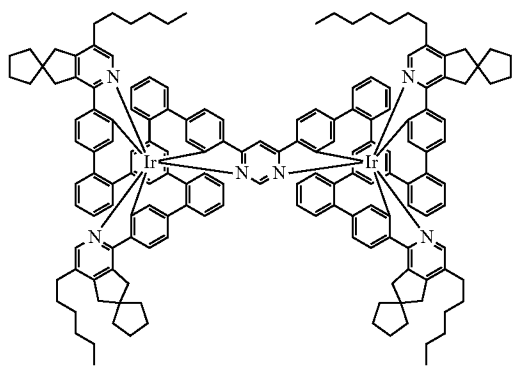 |

-continued
P225
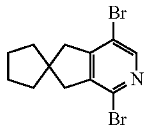
[11612855-00-1]
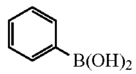
[98-80-6]]
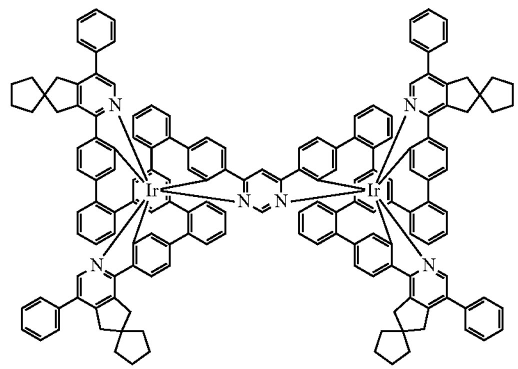
P226
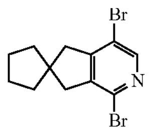
[11612855-00-1]
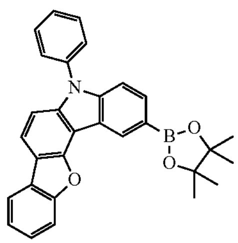
[1993414-82-6]
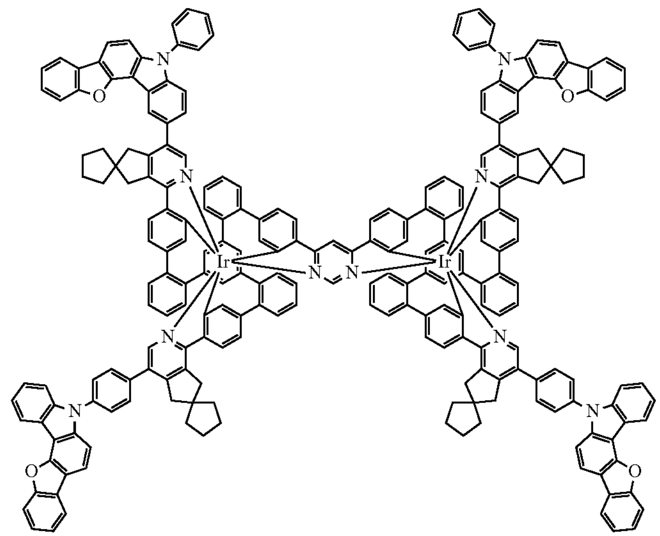

-continued
P227
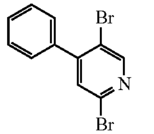
[1381937-40-1]
[4433-63-0]
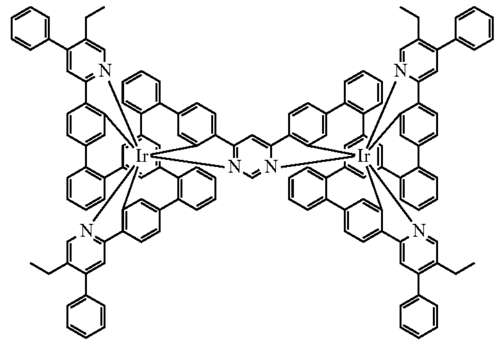
P228
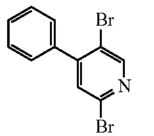
[1381937-40-1]
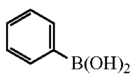
[98-80-6]
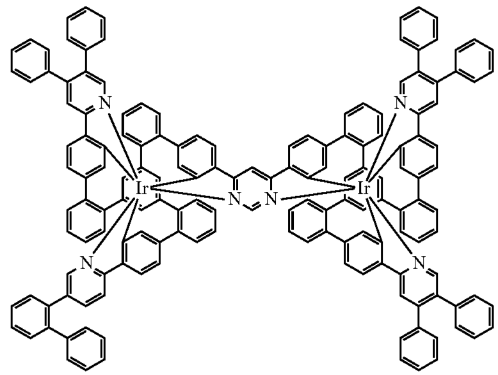

-continued
P229
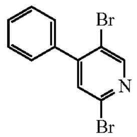
[1381937-40-1]
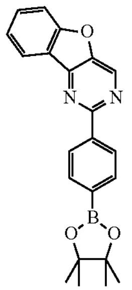
[1989603-59-9]
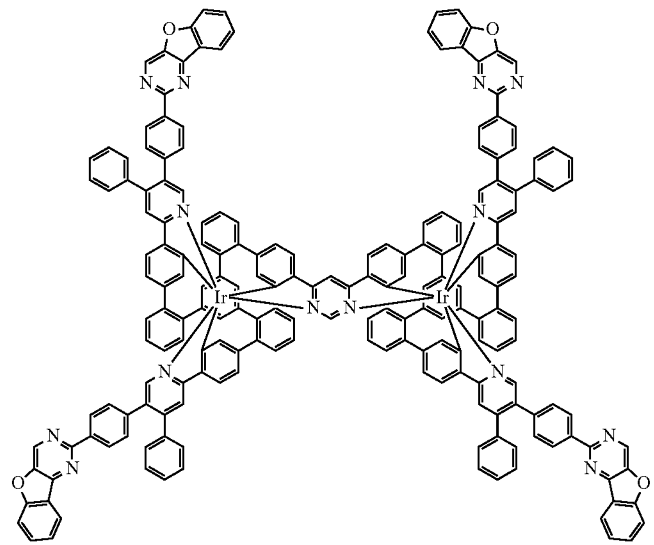
P230
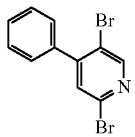
[1381937-40-1]
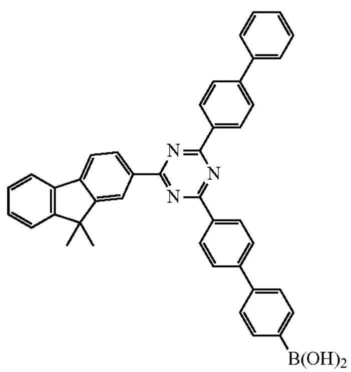
[1987895-27-1]
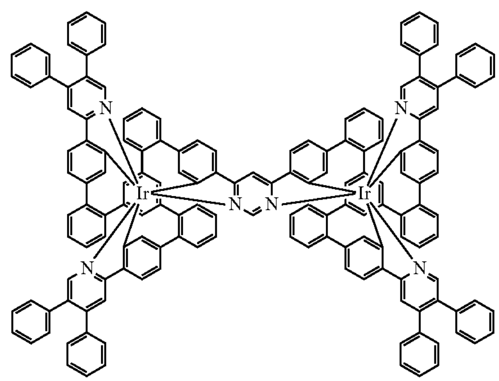

-continued
| | | |
|---|---|---|
| P231 | 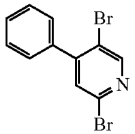<br>[1381937-40-1]<br>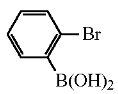<br>[244205-40-1]<br>300 mmol of $K_2CO_3$ and addition of 150 mmol of pivalic acid | 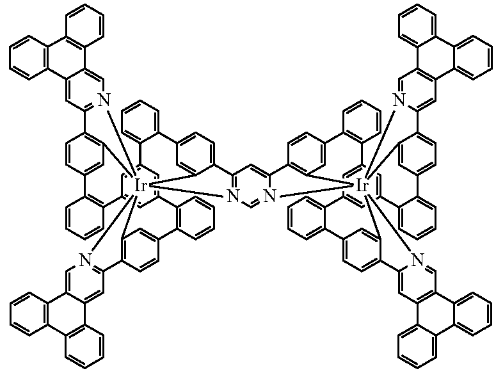 |
| P232 | 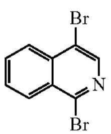<br>[51206-40-7]<br>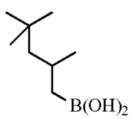<br>[98-80-6] | 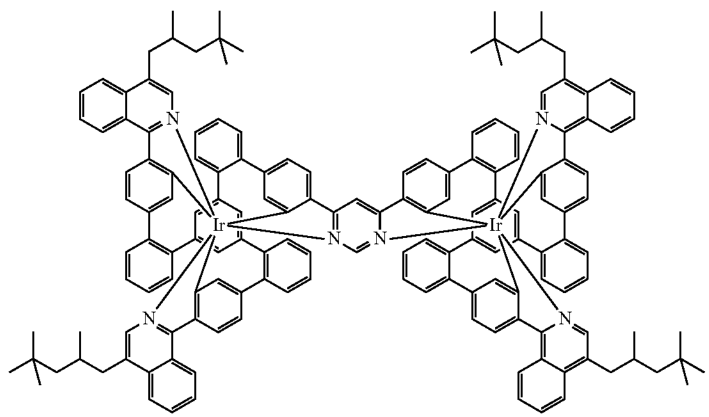 |

-continued
| | | |
|---|---|---|
| P233 | 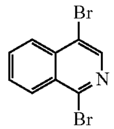 [51206-40-7] 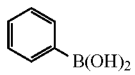 [98-80-6] | 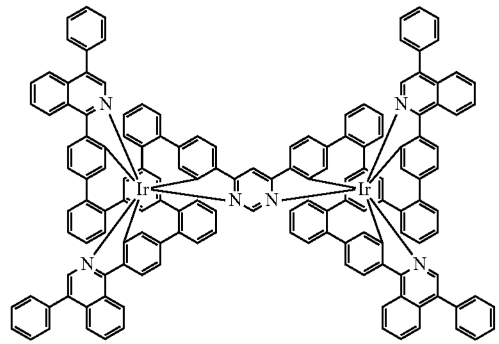 |
| P234 | 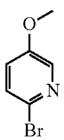 [105170-27-2] | 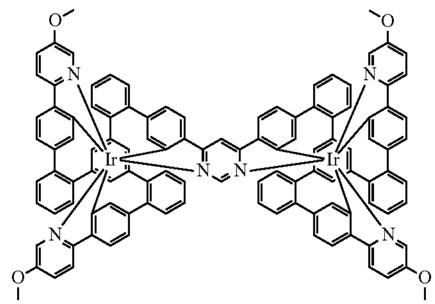 |
| P235 | 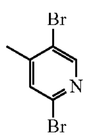 [3430-26-0] 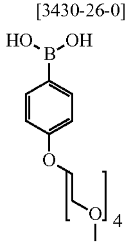 [1181210-13-8] | 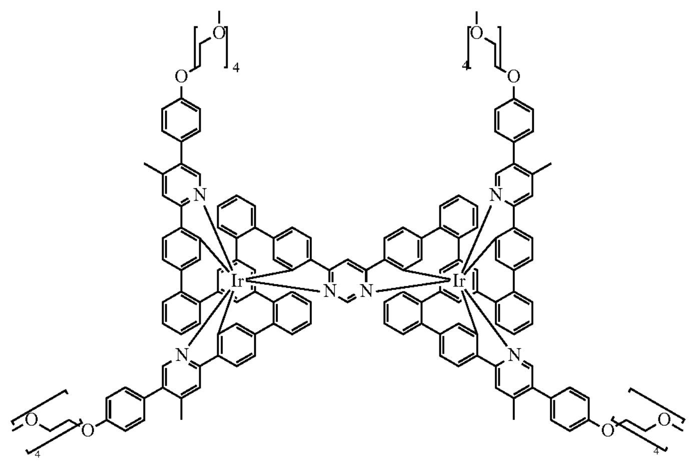 |

-continued
P236
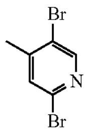
[3430-26-0]
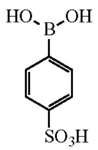
[913836-00-7]
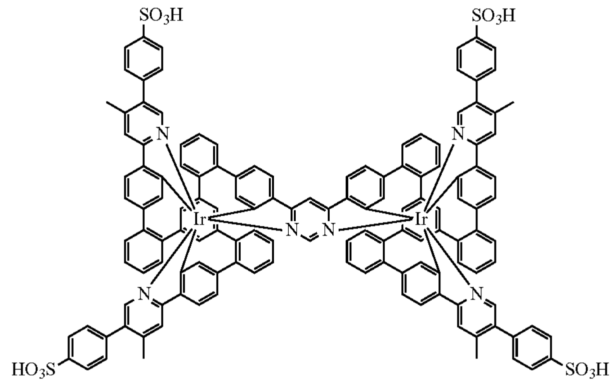
P237
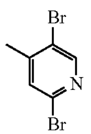
[3430-26-0]
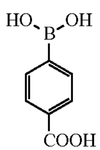
[14047-29-1]
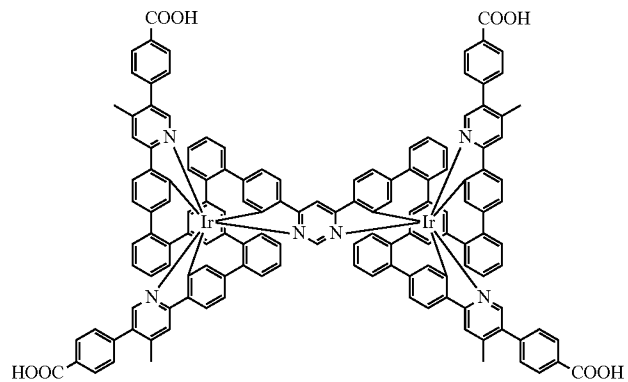

-continued
| | | |
|---|---|---|
| P238 | 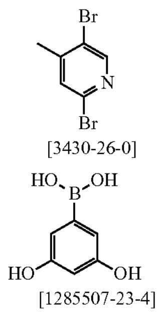 | 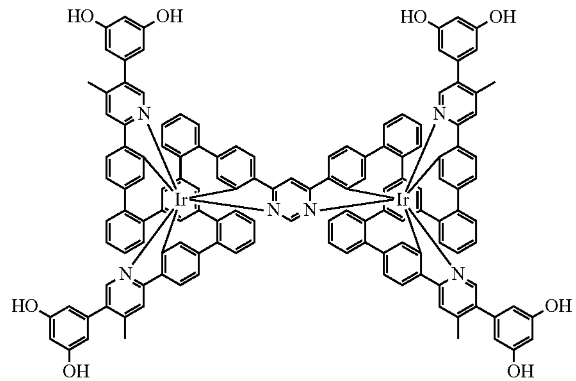 |
| P239 | 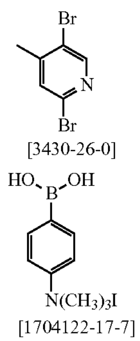 | 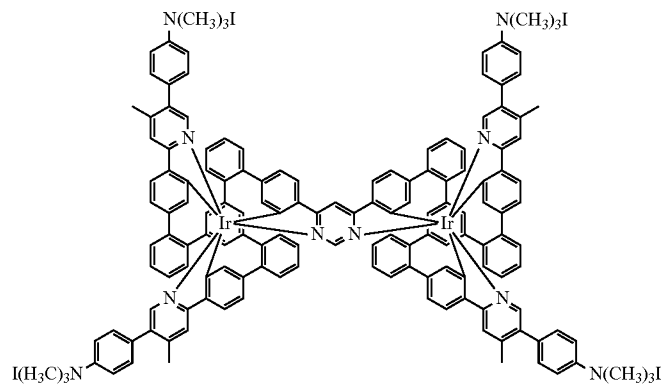 |

-continued
| | | |
|---|---|---|
| P240 | 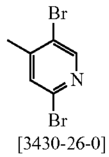<br>[3430-26-0]<br>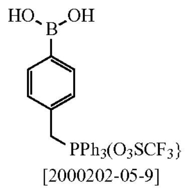<br>[2000202-05-9] | 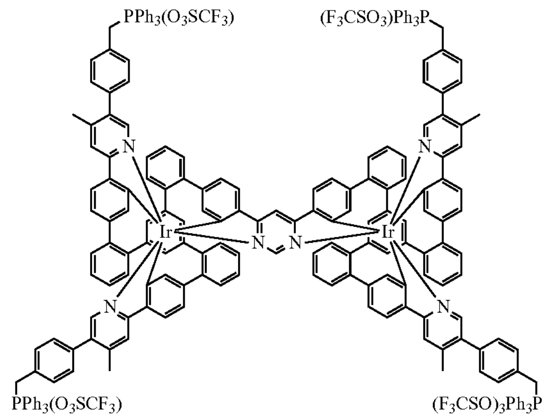 |

Entirely analogously to Example is P1 to P240, it is also possible to employ the following boronic acids or esters of the di-, tri- and oligophenylenes, -fluorenes, -dibenzofurans, -dibenzothiophenes and -carbazoles:

CAS: [439120-88-4], [881912-24-9], [952586-63-9], [797780-74-3], [875928-51-1], [1056044-60-0], [1268012-82-3], [1356465-28-5], [1860030-34-7], [2007912-81-2], [1343990-89-5], [1089154-61-9].

In the syntheses of ligands L1 to L76, the boronic acids or esters of Examples P1 to P240 can be employed and the derived metal complexes can be obtained from the resultant ligands, by the process described for the synthesis of I1-$Ir_2$(L1) and I2-$Ir_2$(L1).

General Synthesis Scheme the Preparation of Further Metal Complexes:

Starting from 2-bromo-4-$R^1$-5-methoxypyridines, tetra-methoxy-substituted metal complexes, for example P234, are obtained analogously to the reaction sequence shown above. These can be demethylated using pyridinium hydrochloride in the melt at 200° C. or using $BBr_3$ in dichloromethane by generally known standard methods. The tetrahydroxy complexes obtained in this way can be reacted with trifluoromethanesulfonic acid in the presence of a base (for example triethylamine) in dichloromethane by standard methods to give tetratriflates, which can be coupled to boronic acids or boronic acid esters by standard methods (Suzuki coupling) to give compounds according to the invention. The tetratriflates can in addition be functionalised with alkyl, silyl, germanyl, stannyl, aryl, heteroaryl, alkoxy, amino or carbazolyl radicals in further transition-metal-promoted coupling reactions, for example Negisgi, Yamamoto, Stille, Sonogashira, Glaser, Ullmann, Grignard-Cross or Buchwald couplings.

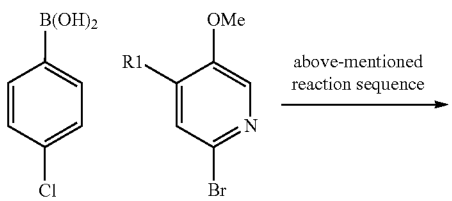

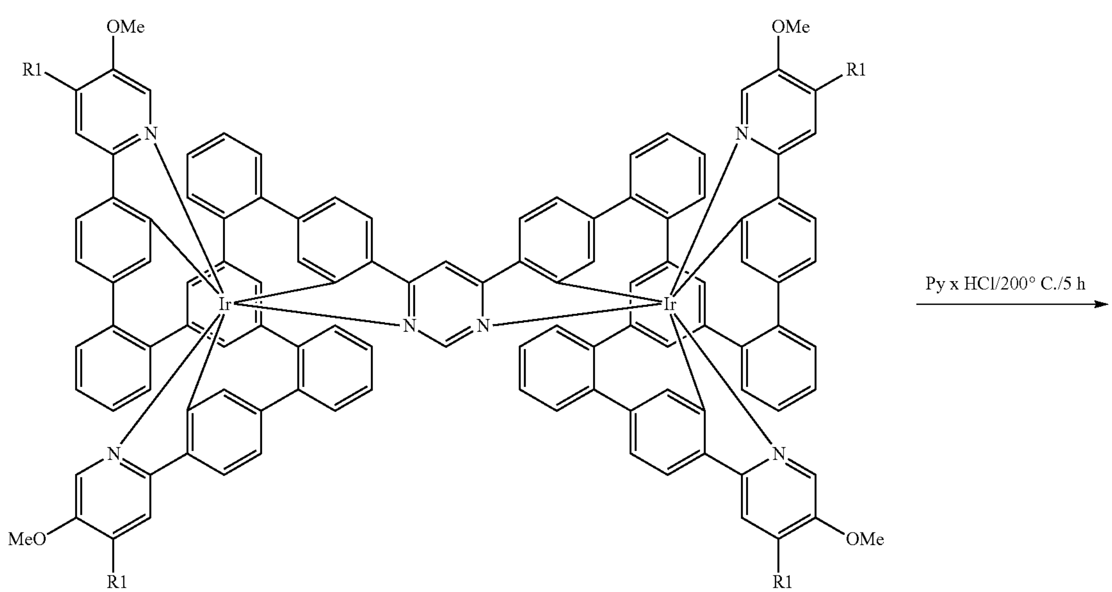

-continued
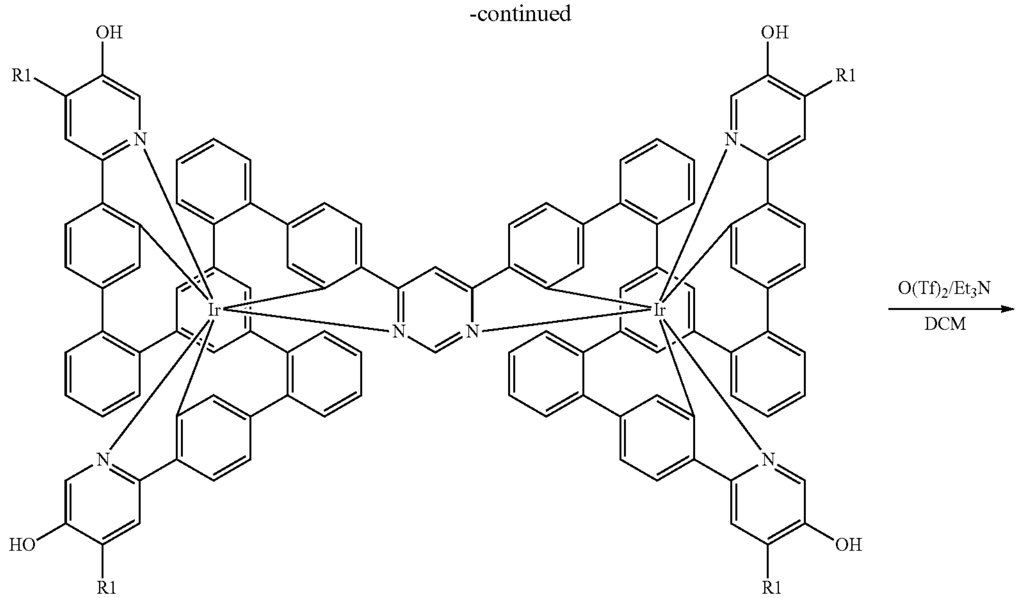
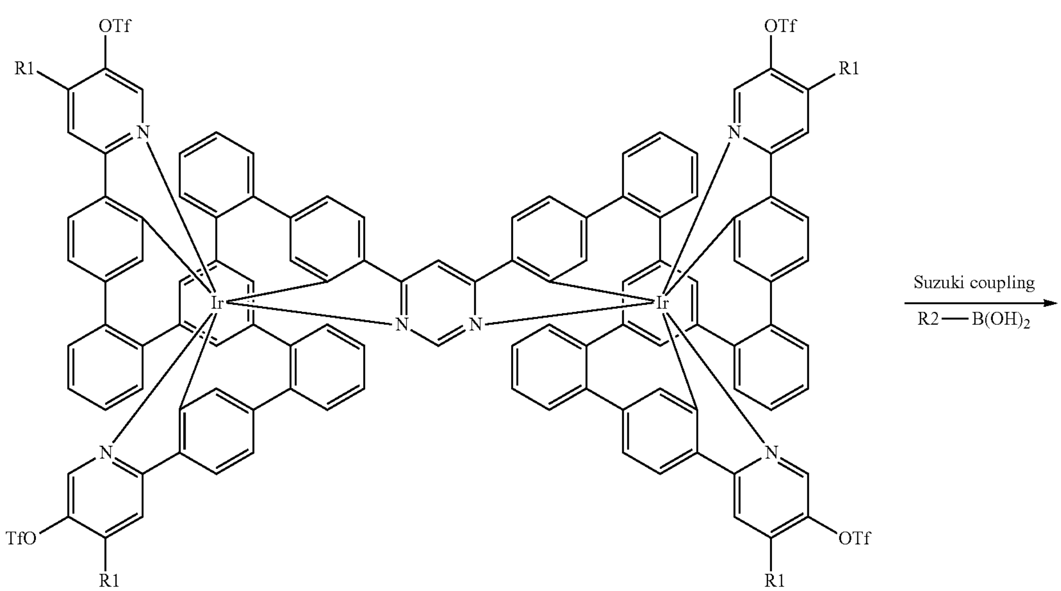

-continued
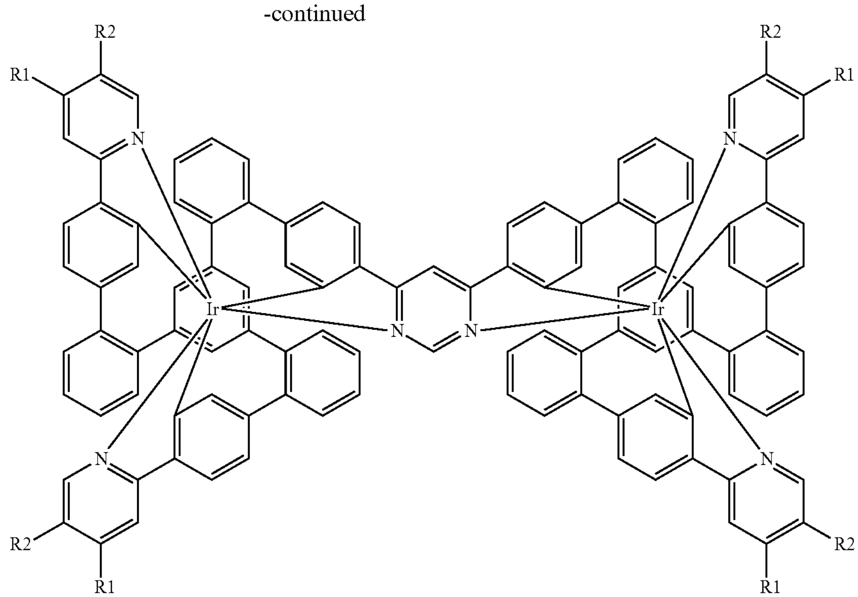
Deuteration of the Complexes:
Example P1-D25
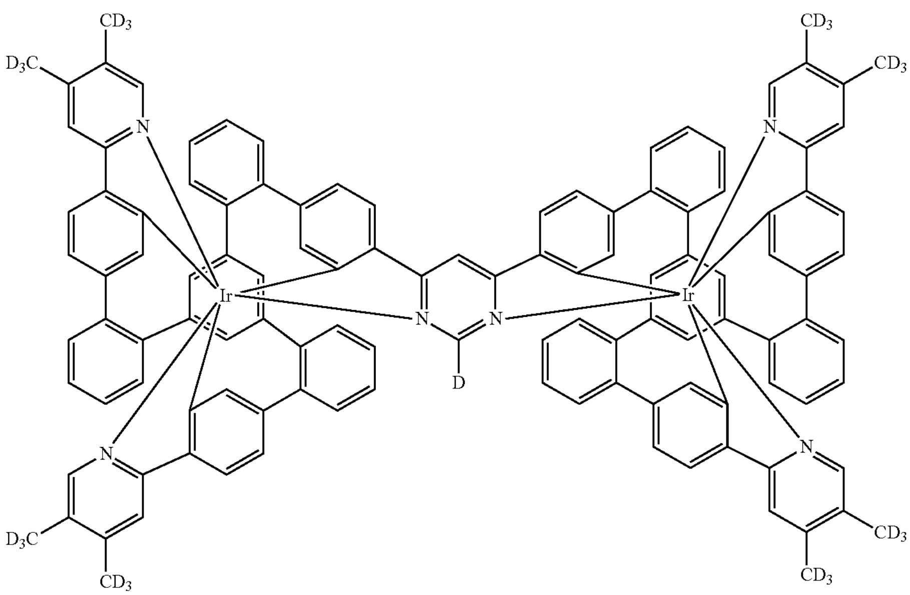
A mixture of 1.95 g (1 mmol) of P1, 68 mg (1 mmol) of sodium ethoxide, 3 ml of ethanol-D1 and 50 ml of DMSO-D6 is heated at 120° C. for 8 h. After cooling, a mixture of 0.5 ml of DCI in D20, 5 molar, and 3 ml of ethanol-D1 is added, the solvent is then removed in vacuo, and the residue is chromatographed on silica gel with DCM. Yield: 1.78 g (0.9 mmol), 90%, degree of deuteration >95%.

The following compounds can be prepared analogously:
| Ex. | Starting material | Product |
|---|---|---|
| P4-D21 | P4 | 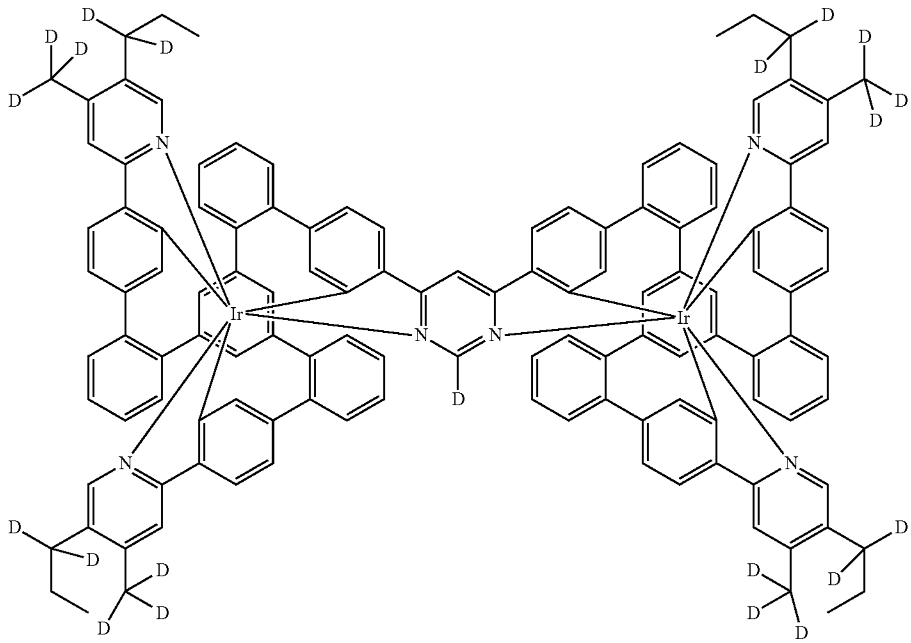 |
| P6-D17 | P6 | 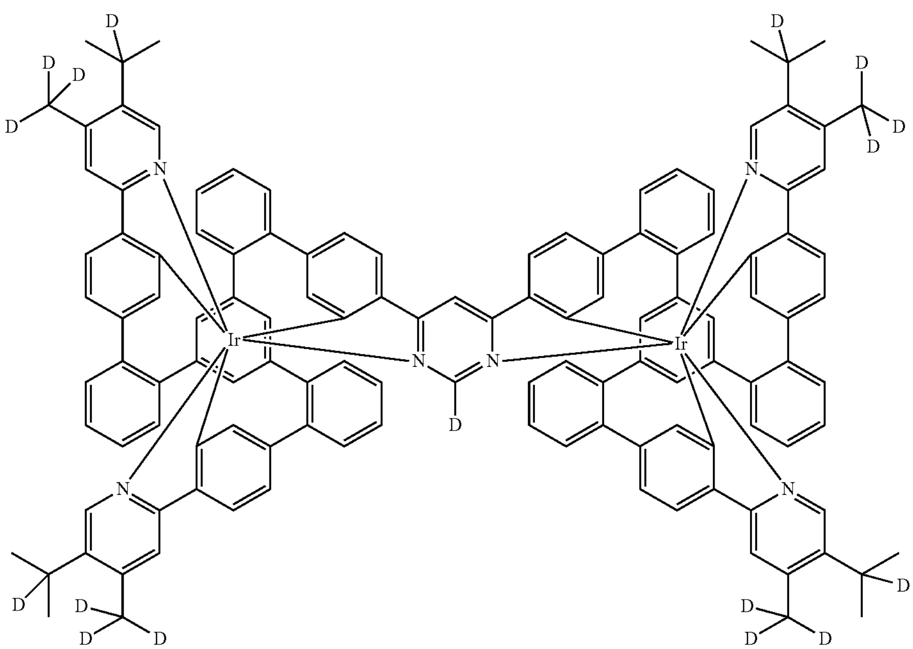 |

-continued
| Ex. | Starting material | Product |
|---|---|---|
| P7-D21 | P7 | 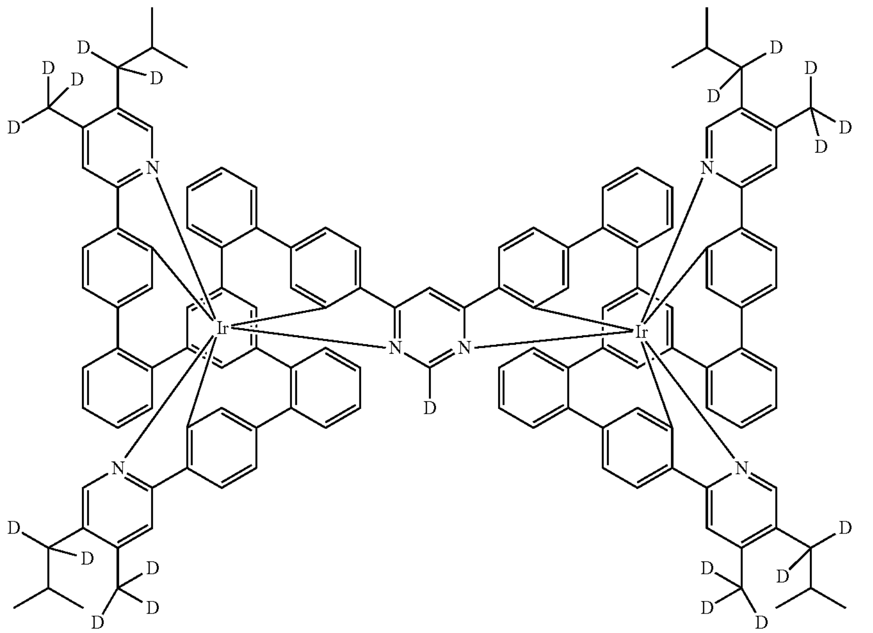 |
| P14-D13 | P14 | 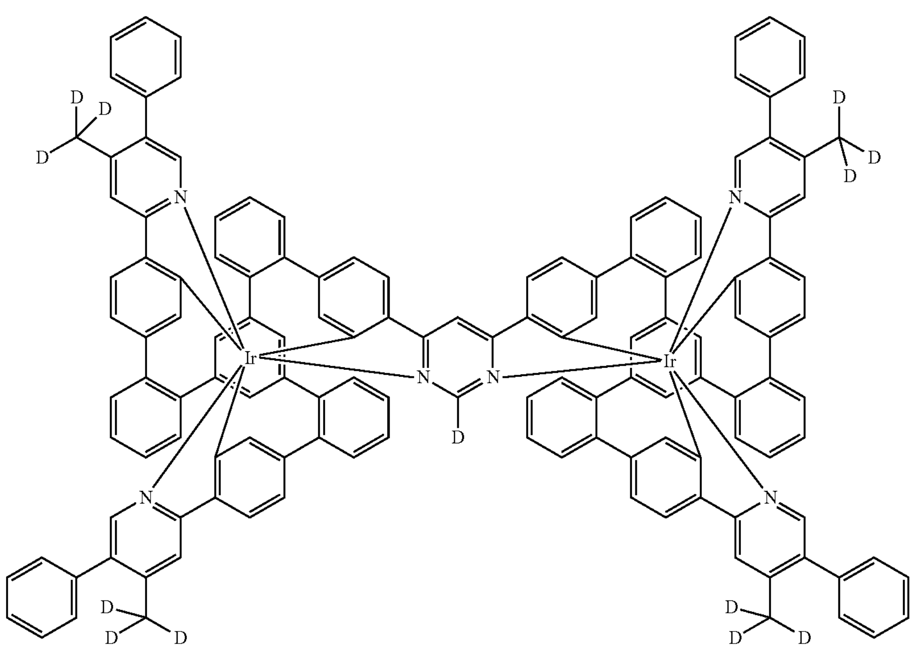 |

-continued
| Ex. | Starting material | Product |
|---|---|---|
| P15-D13 | P15 | 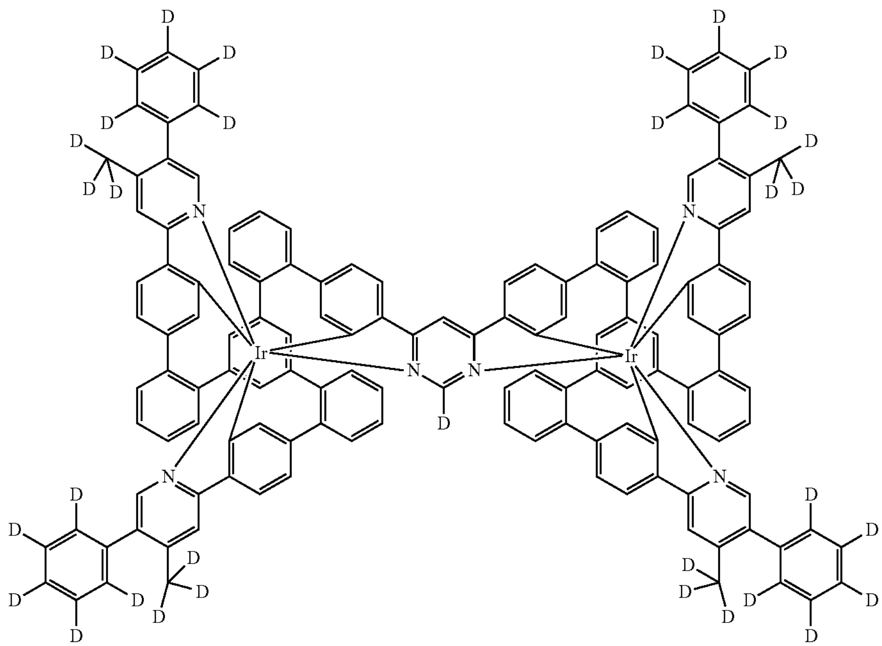 |
| P34-D13 | P34 | 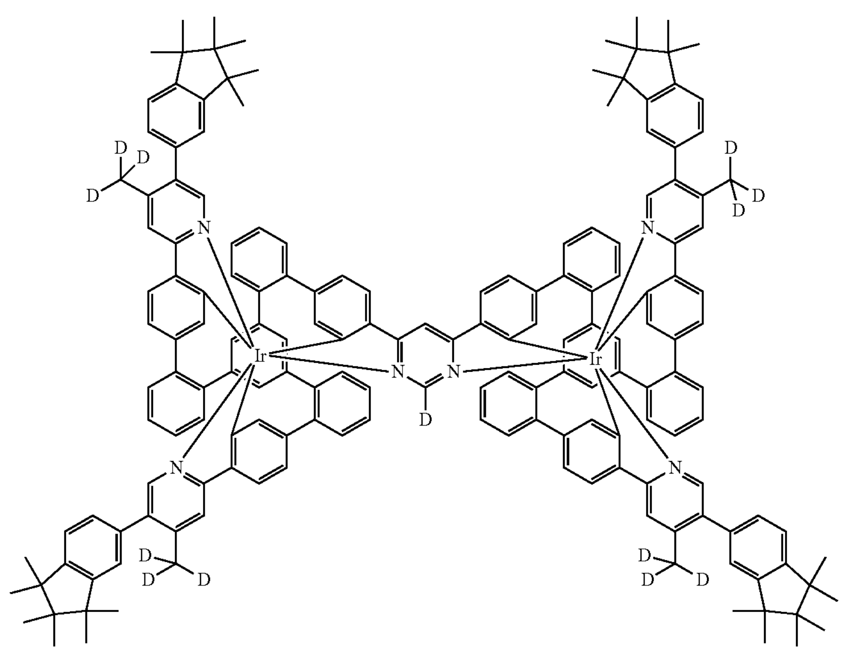 |

-continued
| Ex. | Starting material | Product |
|---|---|---|
| P50-D13 | P50 | 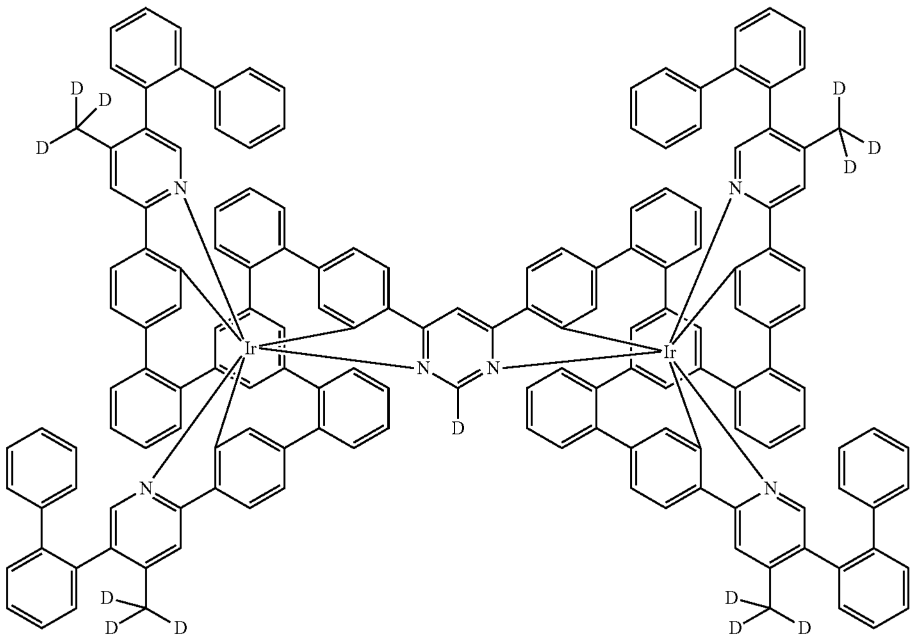 |
| P77-D13 | P77 | 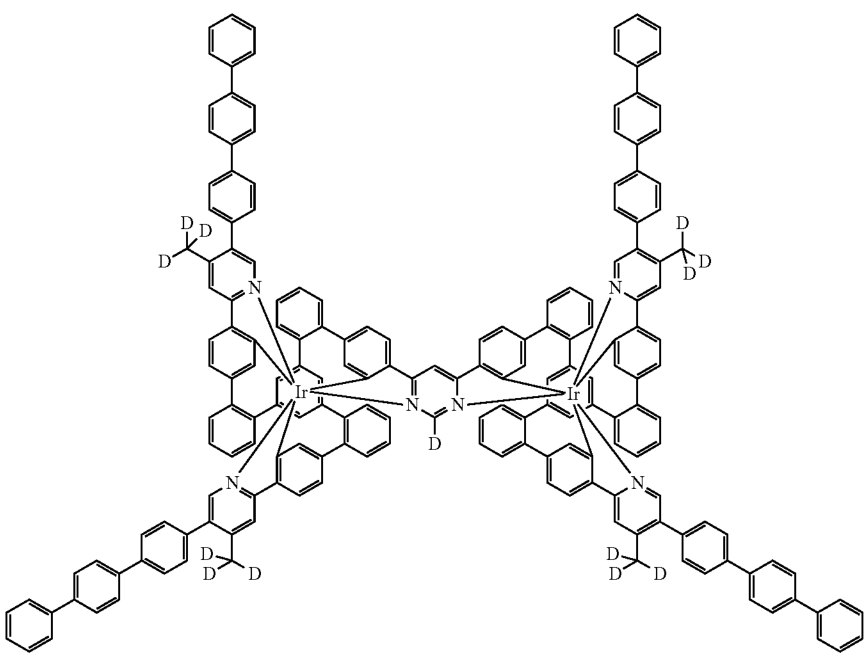 |

-continued
| Ex. | Starting material | Product |
| --- | --- | --- |
| P104-D13 | P104 | 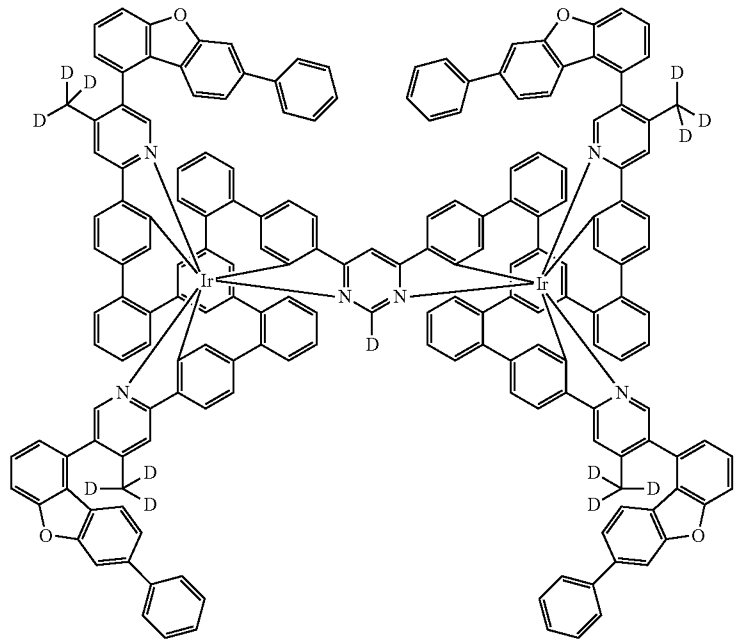 |
| P160-D13 | P160 | 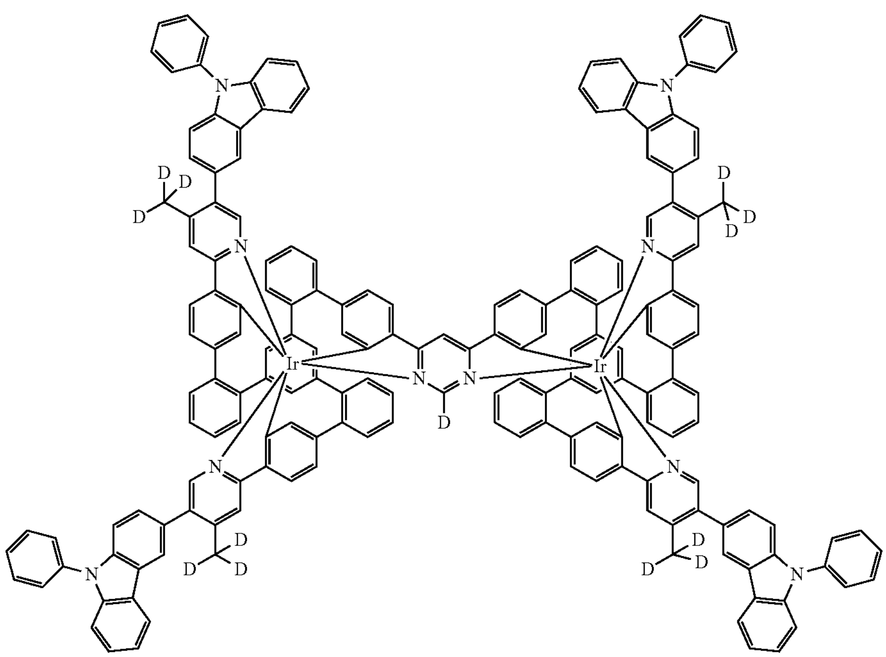 |

-continued

| Ex. | Starting material | Product |
| --- | --- | --- |
| P198-D9 | P198 | 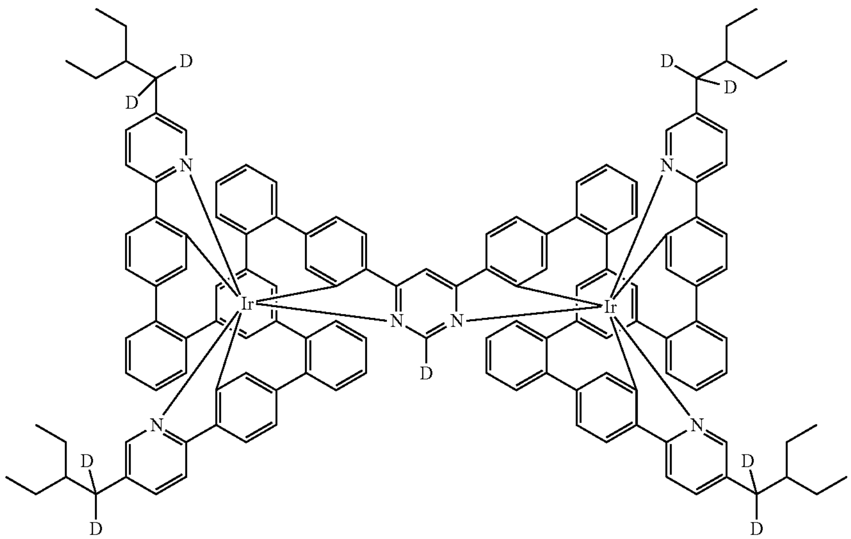 |
| P222-D33 | P222 | 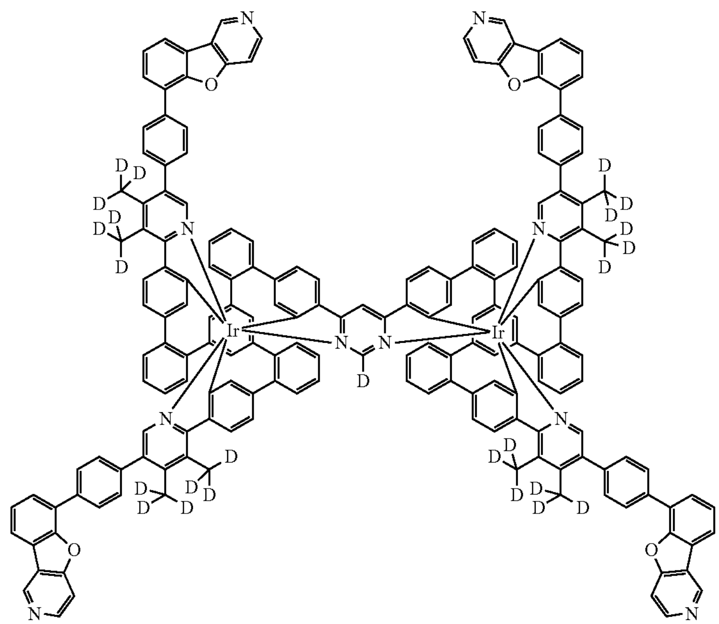 |

Synthesis of the Complexes by Sequential Ortho-Metallation:

1) Sequential Ortho-Metallation for the Preparation of Bimetallic Complexes

The bimetallic complexes can also be obtained by sequential ortho-metallation. In this process, a monometallic complex Ir(L1) or Rh(L1) can firstly be isolated specifically. The subsequent reaction with a further equivalent of $Ir(acac)_3$ or $Rh(acac)_3$ gives the bicyclic homo- or heterometallic complexes $Ir_2$(L1), Rh2(L1) or Ir—Rh(L1). The bimetallic complexes are likewise formed here as a mixture of ΛΛ and ΔΔ isomers and ΔΛ and ΛΔ isomers. ΛΛ and ΔΔ isomers form an enantiomer pair, as do the ΔΛ and ΛΔ isomers. The diastereomer pairs can be separated using conventional methods, for example by chromatography or fractional crystallisation. Depending on the symmetry of the ligands, stereocentres may also coincide, so that meso forms are also possible. Thus, for example in the case of the ortho-metallation of ligands having $C_{2v}$ Or $C_s$ symmetry, ΛΛ and ΔΔ isomers (racemate, $C_2$ symmetry) and a ΛΔ isomer (meso compound, $C_s$ symmetry) form.

Step 1: Monometallic Complexes

For the preparation of the monometallic complexes, 25 g (11 mmol) of ligand L1, 4.9 g (11 mmol) of tris(acetylacetonato)iridium(III) [15635-87-7] and 200 g of hydroquinone [123-31-9] are introduced into a 1000 ml two-necked round-bottomed flask with a glass-clad magnetic stirrer bar. The flask is provided with a water separator (for media of lower density than water) and an air condenser with argon blanket and is placed in a metal heating dish. The apparatus is flushed with argon from above via the argon blanket for 15 min, during which the argon is allowed to flow out of the side neck of the two-necked flask. A glass-clad Pt-100 thermocouple is introduced into the flask via the side neck of the two-necked flask and the end is positioned just above the magnetic stirrer bar. The apparatus is then thermally insulated by means of several loose coils of household aluminium foil, with the insulation extending as far as the centre of the riser tube of the water separator. The apparatus is then quickly heated to 250° C., measured at the Pt-100 temperature sensor, which dips into the molten, stirred reaction mixture, using a laboratory hotplate stirrer. During the next 2 h, the reaction mixture is held at 250° C., during which little condensate distils off and collects in the water separator. The reaction mixture is allowed to cool to 190° C., and 100 ml of ethylene glycol are then added dropwise. The mixture is allowed to cool further to 80° C., and 500 ml of methanol are then added dropwise, and the mixture is heated under reflux for 1 h. The suspension obtained in this way is filtered through a reverse frit, and the solid is washed twice with 50 ml of methanol and then dried in vacuo. The solid obtained in this way is dissolved in 200 ml of dichloromethane and filtered through about 1 kg of silica gel which has been pre-slurried with dichloromethane (column diameter about 18 cm) with exclusion of air and light, with dark components remaining at the start. The core fraction is cut out and evaporated in a rotary evaporator, during which MeOH is simultaneously continuously added dropwise until crystallisation occurs. After suction filtration, washing with a little MeOH and drying in vacuo, the monometallated complex Ir(L1) is obtained. The rhodium complex Rh(L1) can be prepared analogously starting from $Rh(acac)_3$ [14284-92-5].

All ligands shown in this invention can be converted into monometallic complexes of the Ir(L1) or Rh(L1) type through the use of 1 equivalent of $Ir(acac)_3$ or $Rh(acac)_3$. Just a few examples are shown below.

| Comp. | Starting material | Product/reaction conditions/ hot extractant (HE) | Yield* |
|---|---|---|---|
| Ir(L1) | L1 $Ir(acac)_3$ [15635-87-7] | 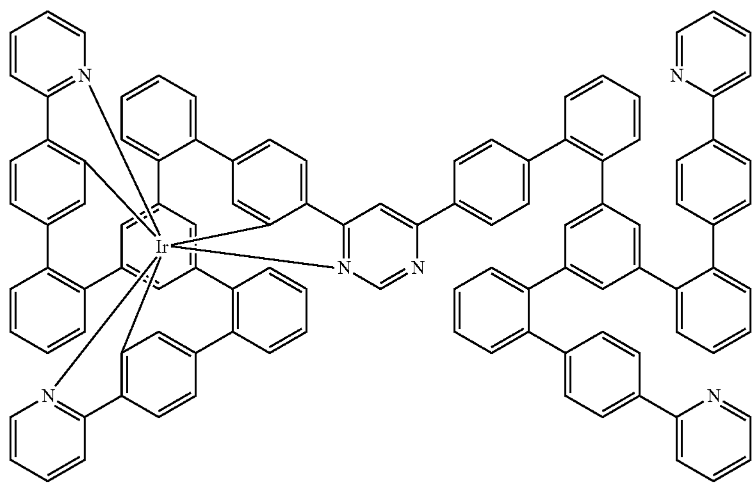 Ir(L1) 250° C.; 2 h Hot extraction: toluene | 48% |
| Rh(L1) | L1 $Rh(acac)_3$ [14284-92-5] | 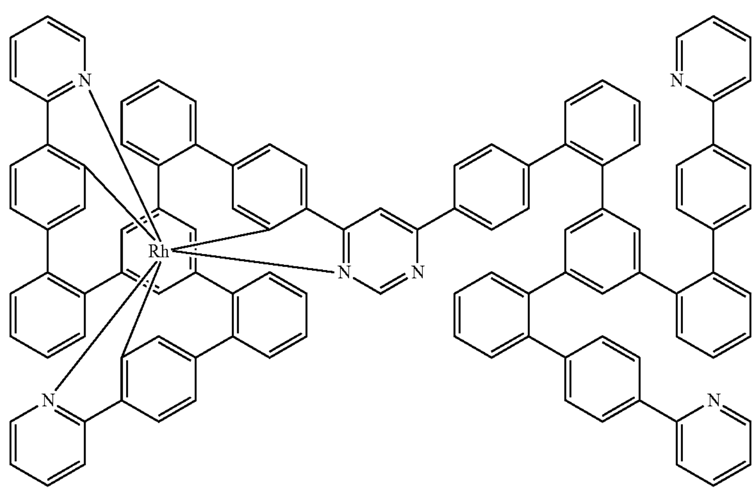 Ir(L1) 250° C.; 2 h Hot extraction: toluene | 43% |

-continued
| Comp. | Starting material | Product/reaction conditions/ hot extractant (HE) | Yield* |
|---|---|---|---|
| Ir(L57) | L1 Ir(acac)$_3$ [15635-87-7] | 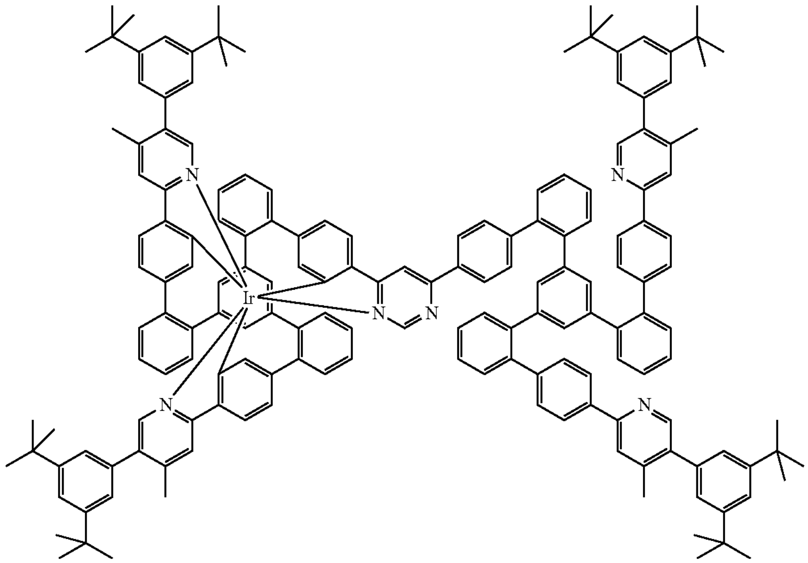 Ir(L57) 250° C.; 2 h Hot extraction: heptane | 40% |
| Rh(L57) | L1 Rh(acac)$_3$ [14284-92-5] | 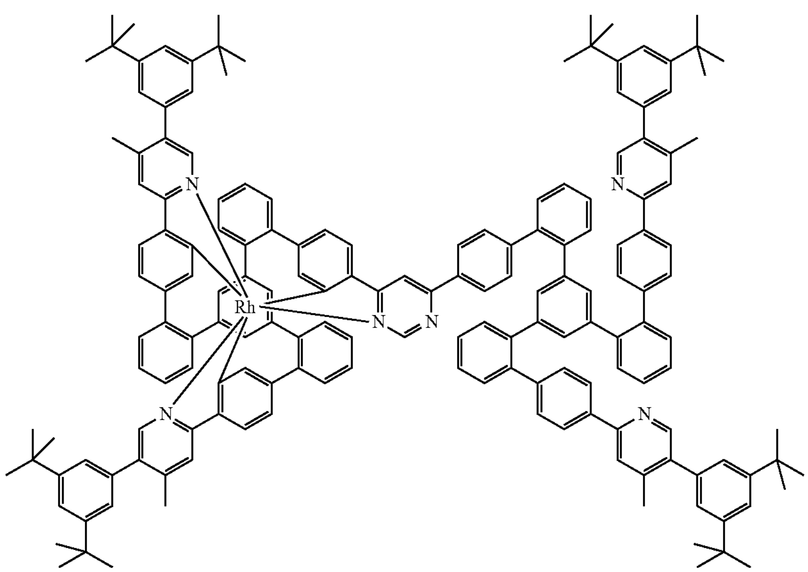 Rh(L57) 250° C.; 2 h Hot extraction: heptane | 45% |

The complexes Ir(L1) and Rh(L1) can now be reacted with a further equivalent of $Ir(acac)_3$ or $Rh(acac)_3$ to give the bimetallic complexes I1-$Ir_2$(L1), I2-$Ir_2$(L1), I1-Rh2(L1), 12-Rh(L1), I1-Ir—Rh(L1) and 12-Ir—Rh(L1). It is unimportant here which metal is introduced first.

Step 2: Bimetallic Complex

For the preparation of the bimetallic complexes from the monometallic complexes, 24.5 g (10 mmol) of the complex Ir1(L1), 4.9 g (10 mmol) of tris(acetylacetonato)iridium(III) [15635-87-7] and 200 g of hydroquinone [123-31-9] are introduced into a 1000 ml two-necked round-bottomed flask with a glass-clad magnetic stirrer bar. The flask is provided with a water separator (for media of lower density than water) and an air condenser with argon blanket and is placed in a metal heating dish. The apparatus is flushed with argon from above via the argon blanket for 15 min, during which the argon is allowed to flow out of the side neck of the two-necked flask. A glass-clad Pt-100 thermocouple is introduced into the flask via the side neck of the two-necked flask and the end is positioned just above the magnetic stirrer bar. The apparatus is then thermally insulated by means of several loose coils of household aluminium foil, with the insulation extending as far as the centre of the riser tube of the water separator. The apparatus is then quickly heated to 250° C., measured at the Pt-100 temperature sensor, which dips into the molten, stirred reaction mixture, using a laboratory hotplate stirrer. During the next 2 h, the reaction mixture is held at 250° C., during which little condensate distils off and collects in the water separator. The reaction mixture is allowed to cool to 190° C., and 100 ml of ethylene glycol are then added dropwise. The mixture is allowed to cool further to 80° C., and 500 ml of methanol are then added dropwise, and the mixture is heated under reflux for 1 h. The suspension obtained in this way is filtered through a reverse frit, and the solid is washed twice with 50 ml of methanol and then dried in vacuo. The solid obtained in this way is dissolved in 200 ml of dichloromethane and filtered through about 1 kg of silica gel which has been pre-slurried with dichloromethane (column diameter about 18 cm) with exclusion of air and light, with dark components remaining at the start. The core fraction is cut out and evaporated in a rotary evaporator, during which MeOH is simultaneously continuously added dropwise until crystallisation occurs. After suction filtration, washing with a little MeOH and drying in vacuo, the diastereomeric product mixture is purified further.

The bimetallic complexes obtained by sequential ortho-metallation are likewise formed as a mixture of ΛΛ and ΔΔ isomers and ΔΛ and ΛΔ isomers. ΛΛ and ΔΔ isomers form an enantiomer pair, as do the ΔΛ and ΛΔ isomers. The diastereomer pairs can be separated using conventional methods, for example by chromatography or fractional crystallisation. Depending on the symmetry of the ligands, stereocentres may also coincide, so that meso forms are also possible. Thus, for example in the case of the ortho-metallation of ligands having $C_{2v}$ or $C_s$ symmetry, ΛΛ and ΔΔ isomers (racemate, $C_2$ symmetry) and a ΛΔ isomer (meso compound, $C_s$ symmetry) form.

All complexes of the ligands shown herein which are shown in this invention for two iridium or rhodium atoms can also be prepared by sequential ortho-metallation. Likewise, heterometallic complexes of the Ir—Rh(L) type can be prepared from all ligands shown in this invention by sequential ortho-metallation.

The sequential ortho-metallation can also be carried out as a one-pot reaction. To this end, firstly step 1 is carried out to give the monometallic complexes. After a reaction time of 2 h, a further equivalent of $Ir(acac)_3$ or $Rh(acac)_3$ is added. After a reaction time of a further 2 h at 250° C., the mixture is worked up as described above in step 2, and the crude products obtained in this way are purified.

Just a few selected examples are shown below. The drawings of complexes usually show only one isomer. The isomer mixture can be separated, but can equally well be employed as an isomer mixture in the OLED device. However, there are also ligand systems in the case of which, for steric reasons, only one diastereomer pair forms.

| Ex. | Starting material | Product/reaction conditions/ hot extractant (HE) | Yield* |
|---|---|---|---|
| I1-Ir—Rh(L1) | Ir(L1) or Rh(L1) $Rh(acac)_3$ or $Ir(acac)_3$ [14284-92-5] or [15635-87-7] | 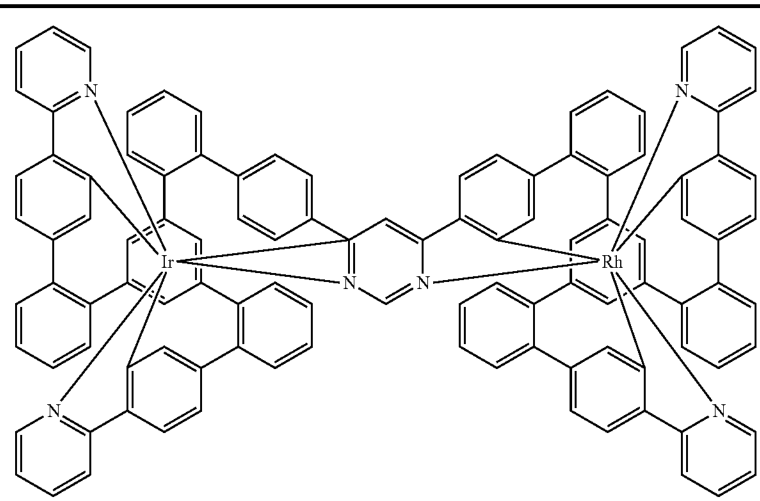 I1-Ir—$Rh_2$(L1) 250° C.; 2 h Hot extraction: toluene | 20% |

-continued
| Ex. | Starting material | Product/reaction conditions/ hot extractant (HE) | Yield* |
|---|---|---|---|
| I2-Ir—Rh(L1) | Ir(L1) or Rh(L1) $Rh(acac)_3$ or $Ir(acac)_3$ [14284-95-5] or [15635-87-7] | 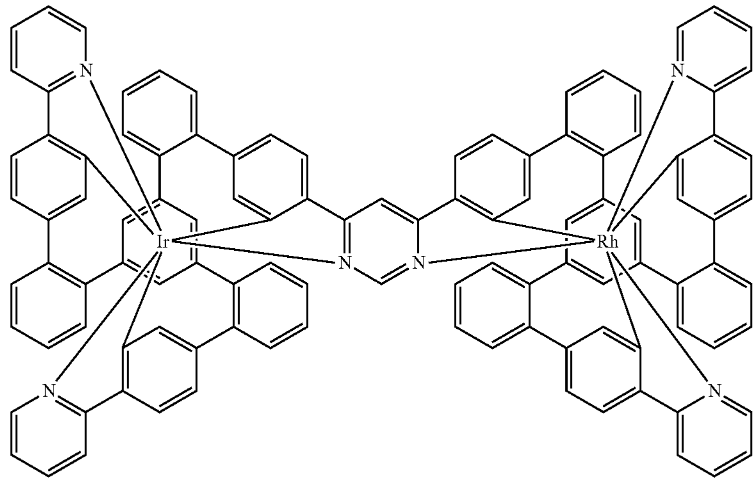 I2-Ir—Rh(L1) 250° C.; 2 h Hot extraction: toluene | 20% |
| Ir—Rh(L57) | Ir(L1) or Rh(L1) $Rh(acac)_3$ or $Ir(acac)_3$ [14284-92-5] or [15635-87-7] | 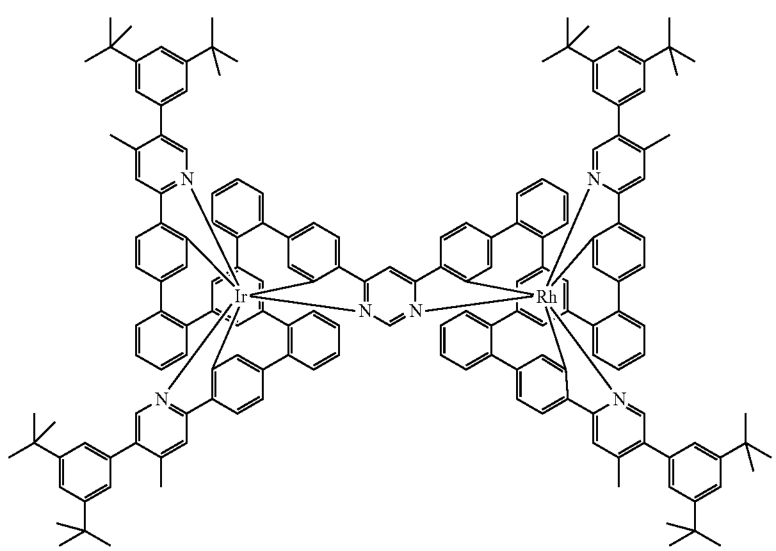 Ir—$Rh_2$(L57) 250° C.; 2 h Hot extraction: toluene | 20% |

-continued

| Ex. | Starting material | Product/reaction conditions/ hot extractant (HE) | Yield* |
|---|---|---|---|
| Ir—Rh(L57) | Ir(L1) or Rh(L1) $Rh(acac)_3$ or $Ir(acac)_3$ [14284-92-5] or [15635-87-7] | 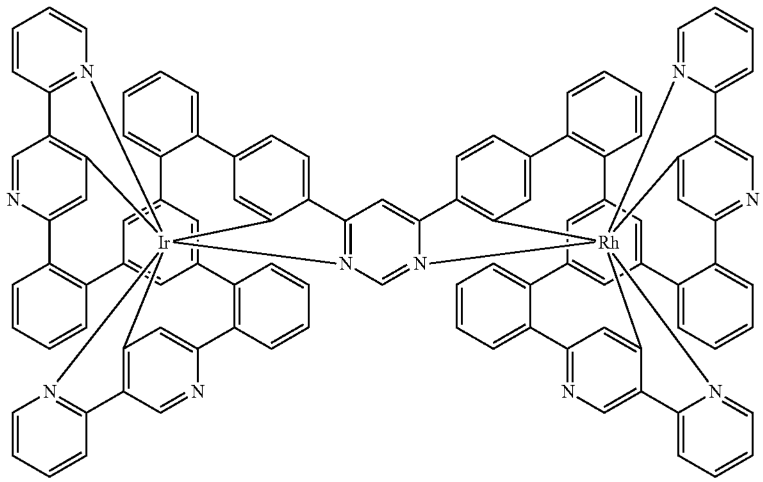 Ir—$Rh_2$(L57) 250° C.; 2 h Hot extraction: toluene | 20% |

2) Sequential Ortho-Metallation for the Preparation of Trimetallic Complexes

Introduction of the First Metal

The sequential ortho-metallation can also be utilised to build up trimetallic complexes of the $Ir_3$(L52), Ir—Rh2 (L52), $Ir_2$—Rh(L52) or Rh3(L52) type. To this end, 22 g (10 mmol) of the complex Ir1(L1), 4.9 g (10 mmol) of tris-(acetylacetonato)iridium(III) [15635-87-7] and 200 g of hydroquinone [123-31-9] are introduced into a 1000 ml two-necked round-bottomed flask with a glass-clad magnetic stirrer bar. The flask is provided with a water separator (for media of lower density than water) and an air condenser with argon blanket and is placed in a metal heating dish. The apparatus is flushed with argon from above via the argon blanket for 15 min, during which the argon is allowed to flow out of the side neck of the two-necked flask. A glass-clad Pt-100 thermocouple is introduced into the flask via the side neck of the two-necked flask and the end is positioned just above the magnetic stirrer bar. The apparatus is then thermally insulated by means of several loose coils of household aluminium foil, with the insulation extending as far as the centre of the riser tube of the water separator. The apparatus is then quickly heated to 260° C., measured at the Pt-100 temperature sensor, which dips into the molten, stirred reaction mixture, using a laboratory hotplate stirrer. During the next 2 h, the reaction mixture is held at 260° C., during which little condensate distils off and collects in the water separator. The reaction mixture is allowed to cool to 190° C., and 100 ml of ethylene glycol are then added dropwise. The mixture is allowed to cool further to 80° C., and 500 ml of methanol are then added dropwise, and the mixture is heated under reflux for 1 h. The suspension obtained in this way is filtered through a reverse frit, and the solid is washed twice with 50 ml of methanol and then dried in vacuo. The solid obtained in this way is dissolved in 400 ml of toluene and filtered through about 1 kg of silica gel which has been pre-slurried with dichloromethane (column diameter about 18 cm) with exclusion of air and light, with dark components remaining at the start. The core fraction is cut out and evaporated in a rotary evaporator, during which MeOH is simultaneously continuously added dropwise until crystallisation occurs. After suction filtration, washing with a little MeOH and drying in vacuo, the monometallic complex Ir(L52) is obtained.

Introduction of the Second Metal

The complex Ir(L52) together with 4.9 g (10 mmol) of tris(acetylacetonato)-iridium(III) [15635-87-7] and 200 g of hydroquinone [123-31-9] are introduced into a 1000 ml two-necked round-bottomed flask with a glass-clad magnetic stirrer bar. The flask is provided with a water separator (for media of lower density than water) and an air condenser with argon blanket and is placed in a metal heating dish. The apparatus is flushed with argon from above via the argon blanket for 15 min, during which the argon is allowed to flow out of the side neck of the two-necked flask. A glass-clad Pt-100 thermocouple is introduced into the flask via the side neck of the two-necked flask and the end is positioned just above the magnetic stirrer bar. The apparatus is then thermally insulated by means of several loose coils of household aluminium foil, with the insulation extending as far as the centre of the riser tube of the water separator. The apparatus is then quickly heated to 260° C., measured at the Pt-100 temperature sensor, which dips into the molten, stirred reaction mixture, using a laboratory hotplate stirrer. During the next 2 h, the reaction mixture is held at 260° C., during which little condensate distils off and collects in the water separator. The reaction mixture is allowed to cool to 190° C., and 100 ml of ethylene glycol are then added dropwise. The mixture is allowed to cool further to 80° C., and 500 ml of methanol are then added dropwise, and the mixture is heated under reflux for 1 h. The suspension obtained in this way is filtered through a reverse frit, and the solid is washed twice with 50 ml of methanol and then dried in vacuo. The solid obtained in this way is dissolved in 400 ml of toluene and filtered through about 1 kg of silica gel which has been pre-slurried with dichloromethane (column diameter about 18 cm) with exclusion of air and light, with dark components remaining at the start. The core fraction is cut out and evaporated in a rotary evaporator, during which MeOH is simultaneously continuously added dropwise until crystallisation occurs. After suction filtration, washing with a little MeOH and drying in vacuo, the bimetallic complex $Ir_2$(L52) is obtained.

Introduction of the Third Metal

The complex $Ir_2$(L52) together with 4.9 g (10 mmol) of tris(acetyl-acetonato)iridium(III) [15635-87-7] and 200 g of hydroquinone [123-31-9] are introduced into a 1000 ml two-necked round-bottomed flask with a glass-clad magnetic stirrer bar. The flask is provided with a water separator (for media of lower density than water) and an air condenser with argon blanket and is placed in a metal heating dish. The apparatus is flushed with argon from above via the argon blanket for 15 min, during which the argon is allowed to flow out of the side neck of the two-necked flask. A glass-clad Pt-100 thermocouple is introduced into the flask via the side neck of the two-necked flask and the end is positioned just above the magnetic stirrer bar. The apparatus is then thermally insulated by means of several loose coils of household aluminium foil, with the insulation extending as far as the centre of the riser tube of the water separator. The apparatus is then quickly heated to 260° C., measured at the Pt-100 temperature sensor, which dips into the molten, stirred reaction mixture, using a laboratory hotplate stirrer. During the next 2 h, the reaction mixture is held at 260° C., during which little condensate distils off and collects in the water separator. The reaction mixture is allowed to cool to 190° C., and 100 ml of ethylene glycol are then added dropwise. The mixture is allowed to cool further to 80° C., and 500 ml of methanol are then added dropwise, and the mixture is heated under reflux for 1 h. The suspension obtained in this way is filtered through a reverse frit, and the solid is washed twice with 50 ml of methanol and then dried in vacuo. The solid obtained in this way is dissolved in 400 ml of toluene and filtered through about 1 kg of silica gel which has been pre-slurried with dichloromethane (column diameter about 18 cm) with exclusion of air and light, with dark components remaining at the start. The core fraction is cut out and evaporated in a rotary evaporator, during which MeOH is simultaneously continuously added dropwise until crystallisation occurs. After suction filtration, washing with a little MeOH and drying in vacuo, the trimetallic complex $Ir_3$(L52) is obtained.

The trimetallic complex is purified further by hot extraction. The trimetallic complex $Ir_3$(L52) shown below can be prepared by sequential metallation in accordance with the above reaction sequence or by reaction of L52 with 3 equivalents of $Ir(acac)_3$ or $Rh(acac)_3$.

For the preparation of a heterotrimetallic complex, such as, for example, Ir—Rh2(L52) or $Ir_2$—Rh(L52), $Rh(acac)_3$ is used instead of $Ir(acac)_3$ in one or two steps in accordance with the above reaction sequence. The sequence in which the metals are introduced is unimportant here.

| Ex. | Starting material | Product/reaction conditions/ hot extractant (HE) | Yield* |
|---|---|---|---|
| $Ir_3$(L52) | L52 $Ir(acac)_3$ [15635-87-7] | 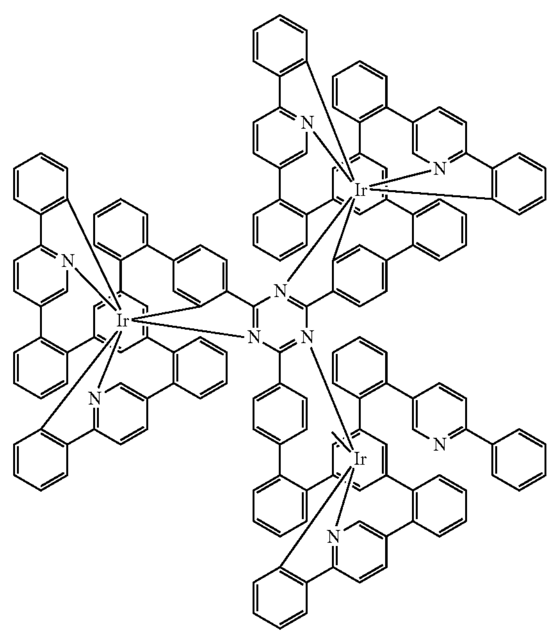<br>$Ir_3$(L52)<br>3 equiv. of $Ir(acac)_3$, 260° C.; 7 h<br>Only the racemate of the ΛΛΛ and ΔΔΔ isomers is formed<br>Hot extraction: toluene | 33% |

-continued

| Ex. | Starting material | Product/reaction conditions/ hot extractant (HE) | Yield* |
| --- | --- | --- | --- |
| $Rh_3$(L52) | L52<br>$Rh(acac)_3$<br>[14284-92-5] | 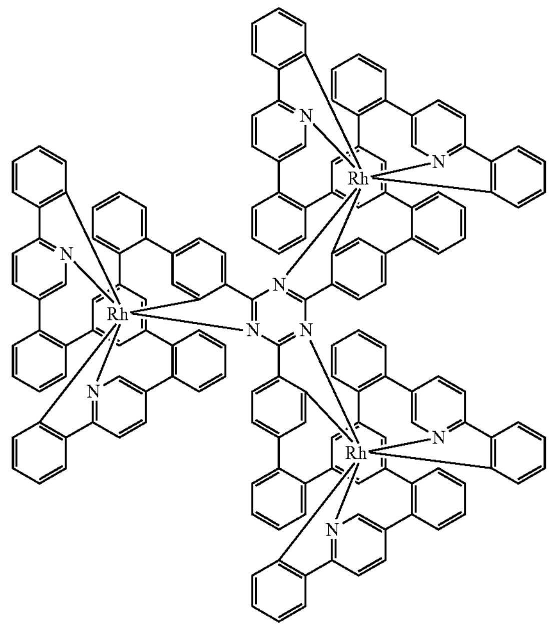<br>$Ir_3$(L52)<br>3 equiv. of $Rh(acac)_3$, 260° C.; 7 h<br>Only the racemate of the ΛΛΛ and ΔΔΔ isomers is formed<br>Hot extraction: toluene | 32% |
| $Ir_3$(L53) | L53<br>$Ir(acac)_3$<br>[15635-87-7] | 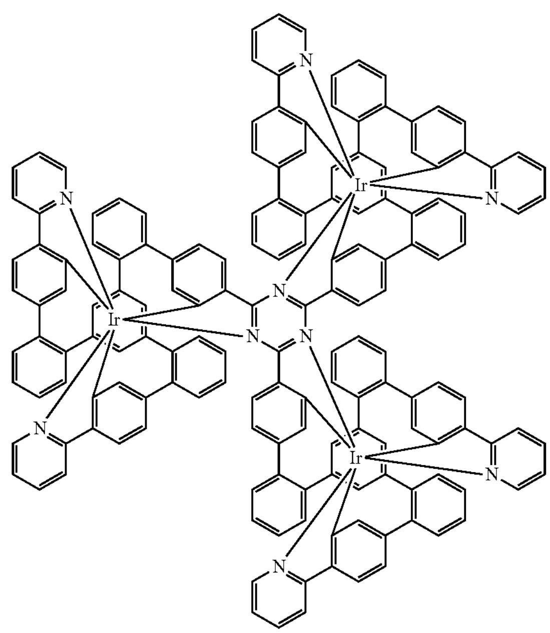<br>$Ir_3$(L53)<br>3 equiv. of $Ir(acac)_3$, 260° C.; 7 h<br>Only the racemate of the ΛΛΛ and ΔΔΔ isomers is formed<br>Hot extraction: toluene | 29% |

-continued

| Ex. | Starting material | Product/reaction conditions/ hot extractant (HE) | Yield* |
|---|---|---|---|
| $Rh_3$(L53) | L53 $Rh(acac)_3$ [14284-92-5] | 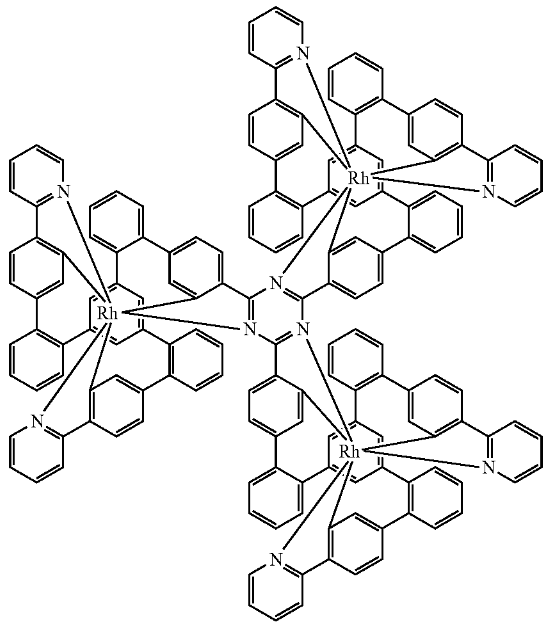 $Rh_3$(L53) 3 equiv. of $Rh(acac)_3$, 260° C.; 7 h Only the racemate of the ΛΛΛ and ΔΔΔ isomers is formed Hot extraction: toluene | 33% |
| $Ir_2$—Rh (L53) | L53 $Rh(acac)_3$ or $Ir(acac)_3$ [14284-92-5] or [15635-87-7] | 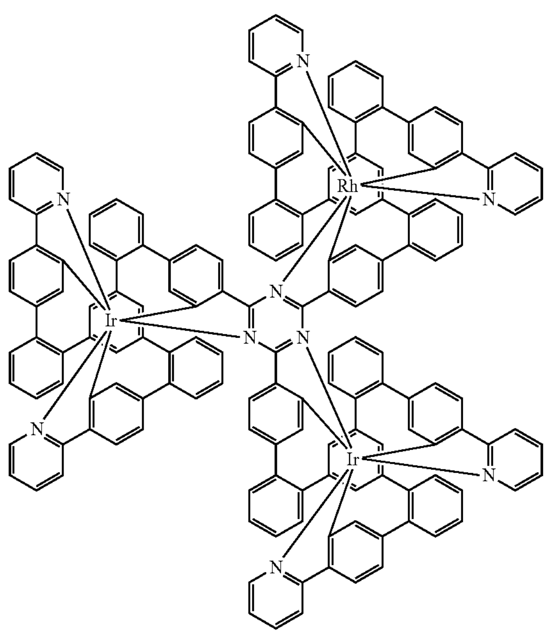 $Ir_2$—Rh(L53) Sequentially 2 equiv. of $Ir(acac)_3$, 1 equiv. of $Rh(acac)_3$, 260° C.; 7 h Hot extraction: o-xylene Only the racemate of the ΛΛΛ and ΔΔΔ isomers is formed | 30% |

-continued

| Ex. | Starting material | Product/reaction conditions/ hot extractant (HE) | Yield* |
|---|---|---|---|
| Ir—$Rh_2$ (L53) | L53 $Rh(acac)_3$ or $Ir(acac)_3$ [14284-92-5] or [15635-87-7] | 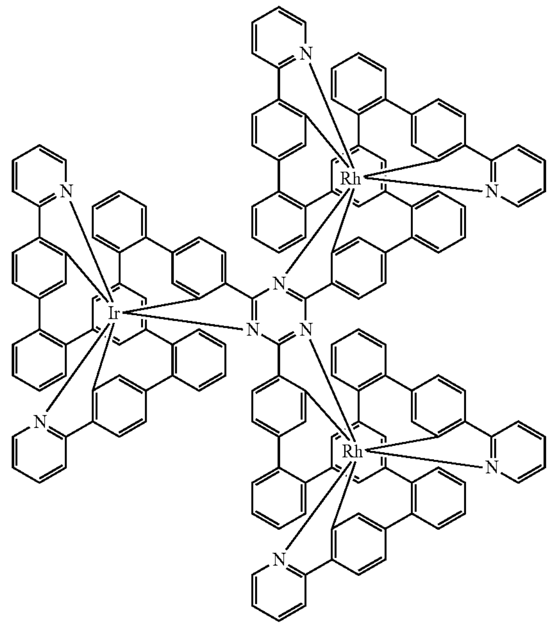 Ir—$Rh_2$(L53) Sequentially 1 equiv. of $Ir(acac)_3$, 2 equiv. of $Rh(acac)_3$, 260° C.; 7 h Hot extraction: o-xylene Only the racemate of the $\Lambda\Lambda\Lambda$ and $\Delta\Delta\Delta$ isomers is formed | 29% |
| $Ir_2$—Rh (L54) | L54 $Rh(acac)_3$ or $Ir(acac)_3$ [14284-92-5] or [15635-87-7] | 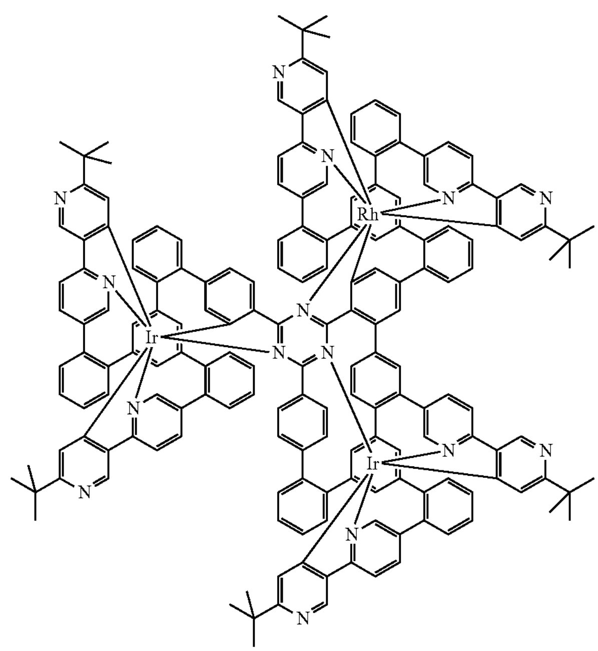 $Ir_2$—Rh(L54) Sequentially 2 equiv. of $Ir(acac)_3$, 1 equiv. of $Rh(acac)_3$, 260° C.; 7 h Hot extraction: n-butyl acetate Only the racemate of the $\Lambda\Lambda\Lambda$ and $\Delta\Delta\Delta$ isomers is formed | 20% |

-continued

| Ex. | Starting material | Product/reaction conditions/ hot extractant (HE) | Yield* |
|---|---|---|---|
| Ir—$Rh_2$ (L54) | L54 $Rh(acac)_3$ or $Ir(acac)_3$ [14284-92-5] or [15635-87-7] | 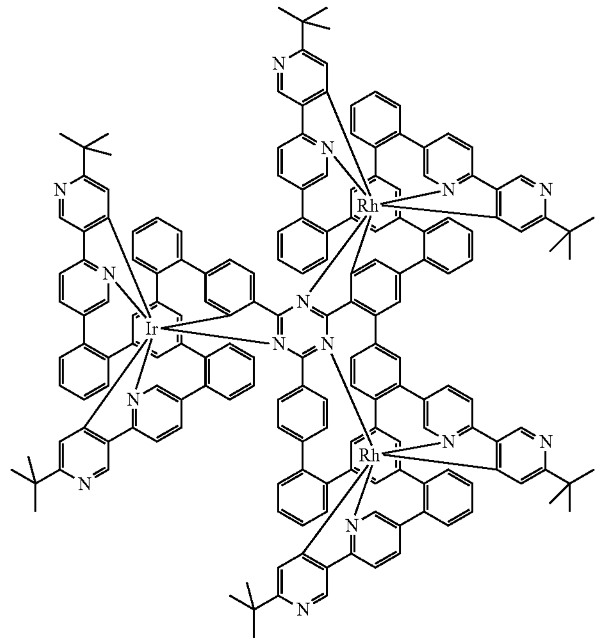<br>$Ir_2$—Rh(L54)<br>Sequentially 1 equiv. of $Ir(acac)_3$, 2 equiv. of $Rh(acac)_3$, 260° C.; 7 h<br>Hot extraction: n-butyl acetate<br>Only the racemate of the ΛΛΛ and ΔΔΔ isomers is formed | 18% |
| $Ir_2$—Rh (L55) | L55 $Rh(acac)_3$ or $Ir(acac)_3$ [14284-92-5] or [15635-87-7] | 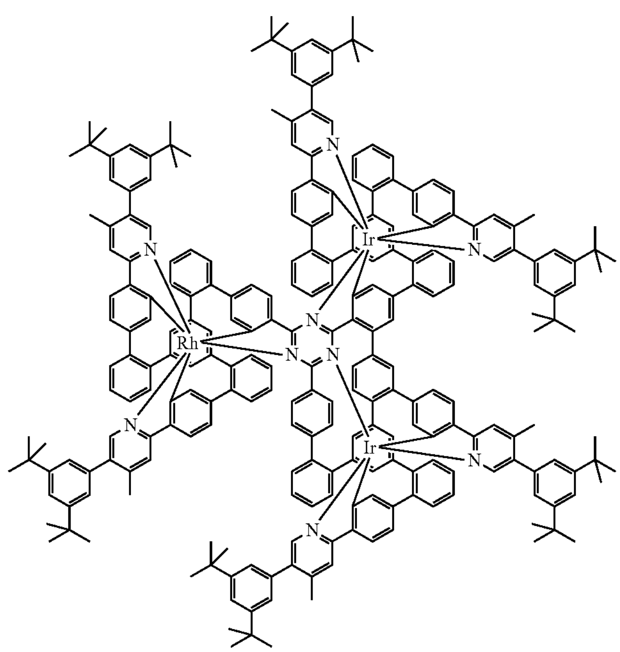<br>$Ir_2$—Rh(L55)<br>Sequentially 2 equiv. of $Ir(acac)_3$, 1 equiv. of $Rh(acac)_3$, 260° C.; 7 h<br>Hot extraction: toluene<br>Only the racemate of the ΛΛΛ and ΔΔΔ isomers is formed | 21% |

-continued

| Ex. | Starting material | Product/reaction conditions/ hot extractant (HE) | Yield* |
|---|---|---|---|
| Ir—$Rh_2$ (L55) | L55 $Rh(acac)_3$ or $Ir(acac)_3$ [14284-92-5] or [15635-87-7] | 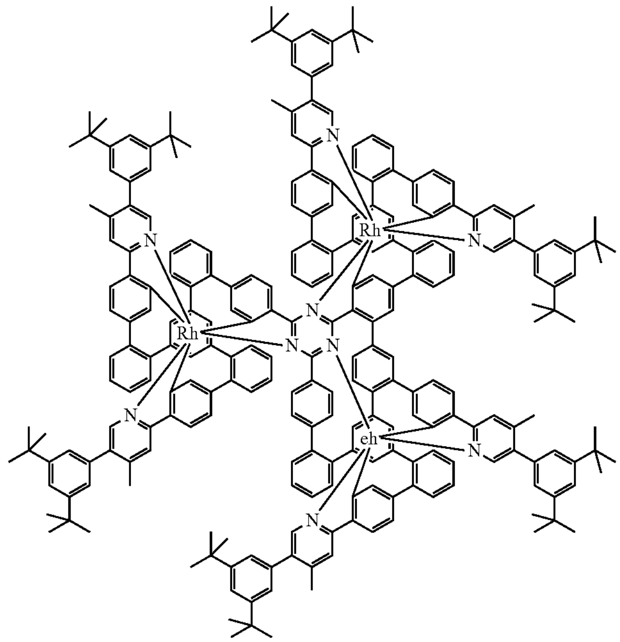 Ir—$Rh_2$(L55) Sequentially 1 equiv. of $Ir(acac)_3$, 2 equiv. of $Rh(acac)_3$, 260° C.; 7 h Hot extraction: toluene Only the racemate of the ΛΛΛ and ΔΔΔ isomers is formed | 19% |

Example 1: Thermal and Photophysical Properties and Oxidation and Reduction Potentials Table 1 summarises the thermal and photochemical properties and oxidation and reduction potentials of the comparative materials and the selected materials according to the invention. The compounds according to the invention have improved thermal stability and photostability compared with the non-polypodal materials in accordance with the prior art. While non-polypodal materials in accordance with the prior art exhibit brown colorations and ashing after thermal storage at 380° C. for seven days and secondary components in the range >2 mol % can be detected in the 1H-NMR, the complexes according to the invention are inert under these conditions. In addition, the compounds according to invention have very good photostability in anhydrous $C_6D_6$ solution on irradiation with light having a wavelength of about 455 nm. In particular, in contrast to non-polypodal complexes in accordance with the prior art which contain bidentate ligands, facial-meridional isomerisation is not evident in the $^1$H-NMR. As is evident from Table 1, the compounds according to the invention are all distinguished by very high PL quantum efficiencies in solution.

Structures in Photoluminescence of Investigated Complexes According to the Invention and Associated Comparative Complexes (the numbers in square brackets indicate the corresponding CAS numbers; the synthesis of complexes without CAS numbers is described in the patent applications cited). Synthesis of Ref15 and Ref16 analogous to the synthetic procedure for complexes Ref13 and Ref14 described in US 2003/0152802. Starting from the following starting materials:

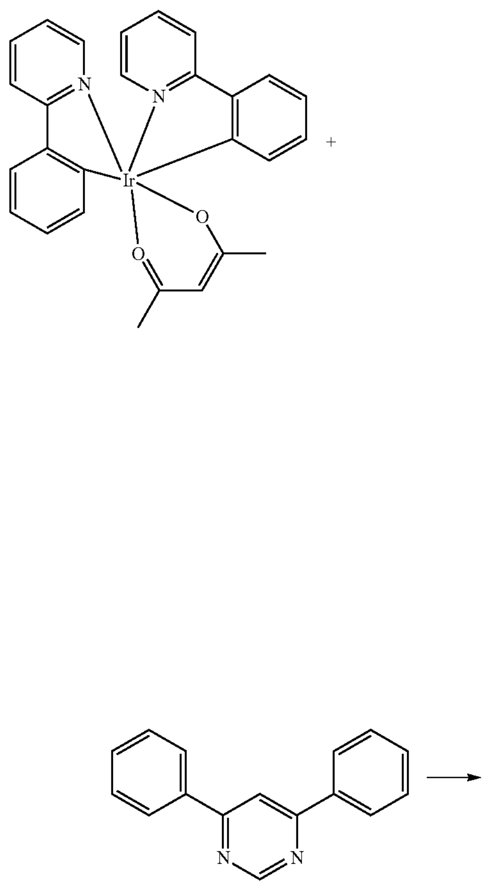

-continued

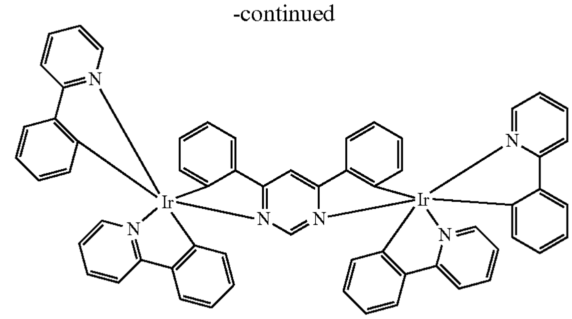

A mixture of 2.3 g (10 mmol) of 4,6-diphenylpyrimidine [3977-48-8] and 12.0 g (20 mmol) of (acetylacetonato)bis (2-phenylpyridinato-N,C2')iridium [945028-21-7] is suspended in 500 ml of glycerol, degassed by passing argon through for 30 min and then stirred at 180° C. for 3 h. After cooling, 1000 ml of methanol are added to the reaction mixture, and the solid which has precipitated out is filtered off with suction. The diastereomers are separated by column chromatography on an automated column from Axel Semrau on flash silica gel with toluene/ethyl acetate as eluent mixture. The compounds Ref15 and Ref16 are subsequently purified further separately by hot extraction. For Ref15 hot extraction five times from ethyl acetate, for Ref16 hot extraction 3 times from n-butyl acetate. Finally, the compounds are heated a high vacuum. Yield of Ref15: 1.2 g (1.0 mmol), 10%. Yield of Ref16: 1.5 g (1.2 mmol), 12%. The yield is based on the amount of ligand employed

| Complex |
| --- |
| 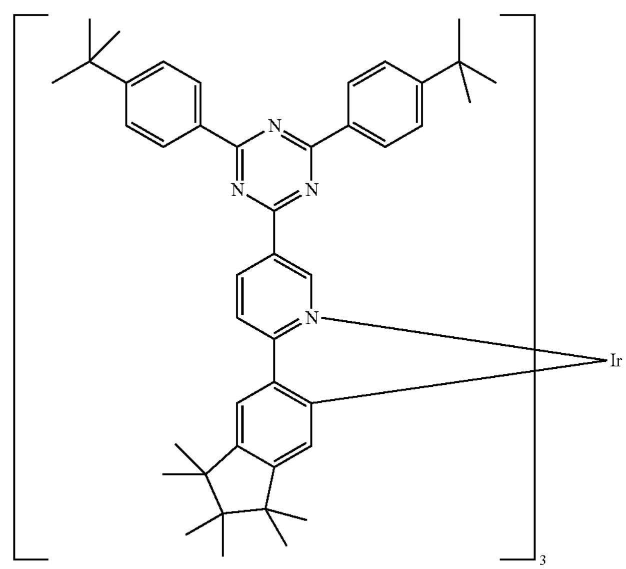 Ref1 [1870013-87-8] |

-continued
| Complex |
| --- |
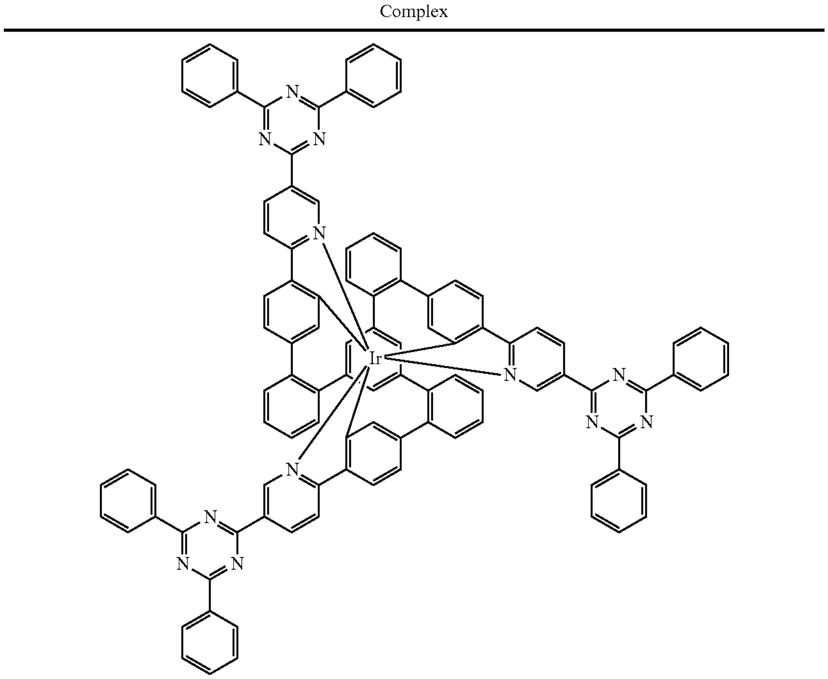
Ref2
see WO 2016/124304
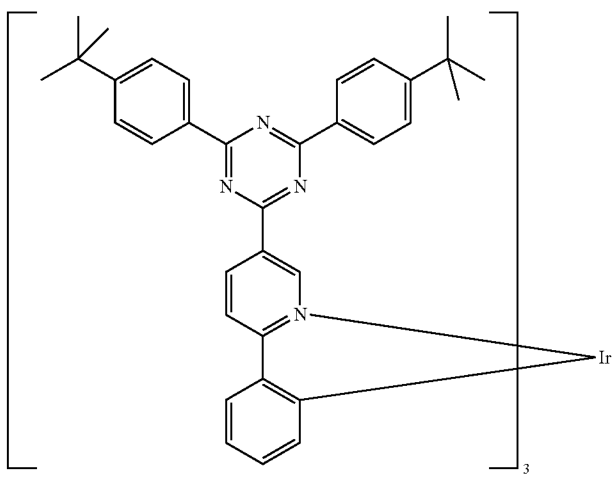
Ref3
[1202823-72-0]
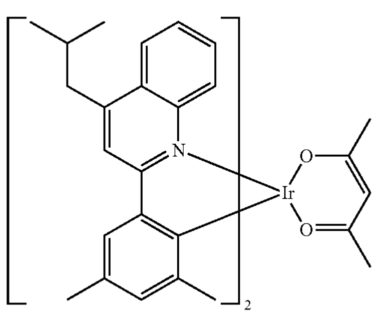
Ref4
[1935740-05-8]

-continued
| Complex |
| --- |
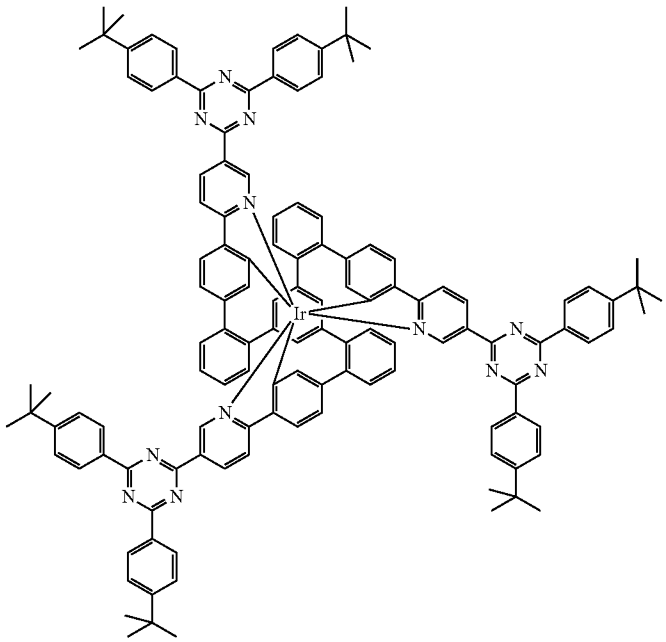
Ref5
see WO 2016/124304
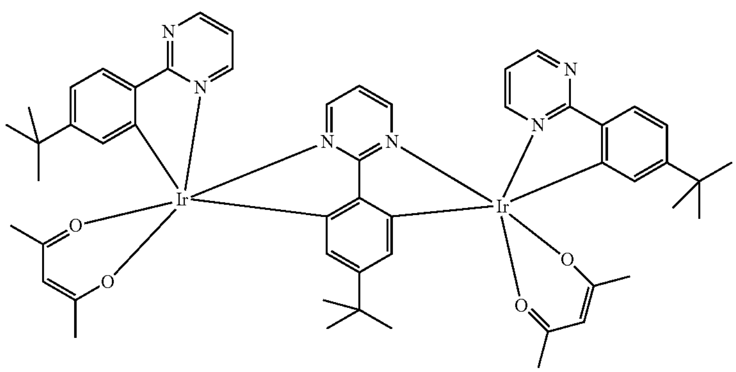
Ref6*
[1859110-77-2]
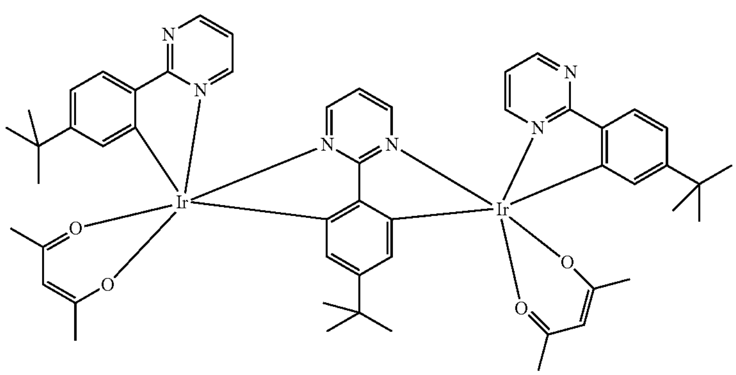
Ref7*
[1859924-65-4]

-continued
| Complex |
| --- |
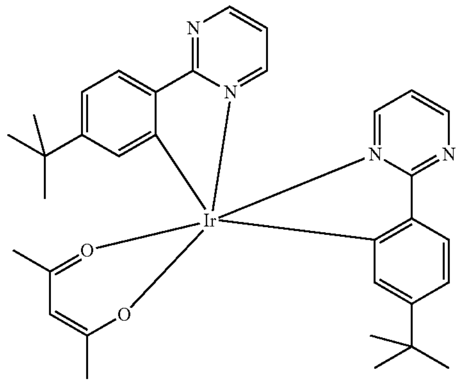
Ref8
[1904599-30-9]
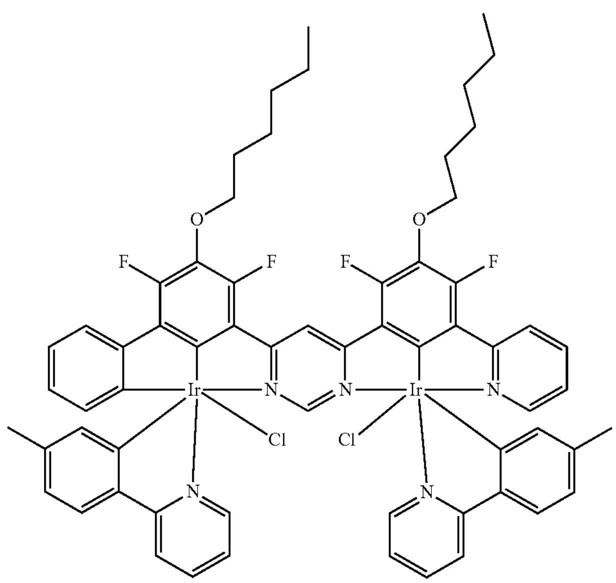
Ref9*
[1562104-35-1]

-continued
| Complex |
| --- |
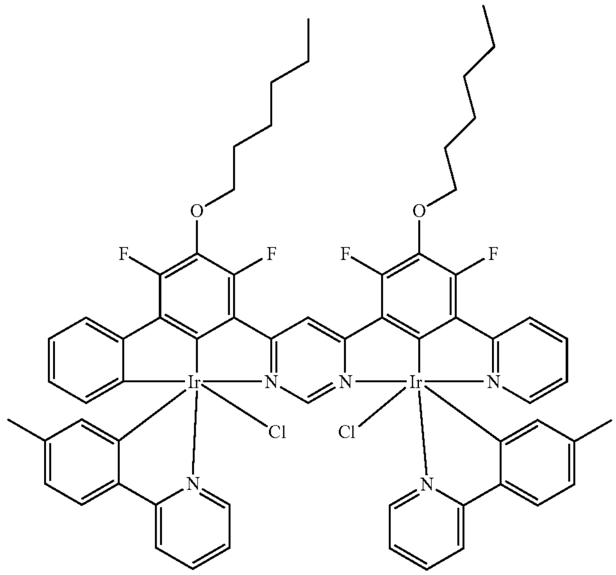
Ref10*
[1562395-58-7]
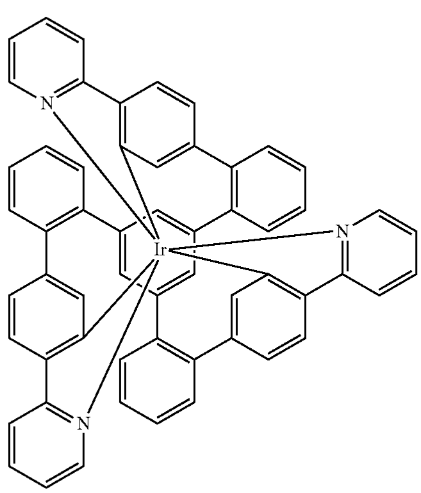
Ref11
see WO 2016/124304

-continued
| Complex |
|---|
| 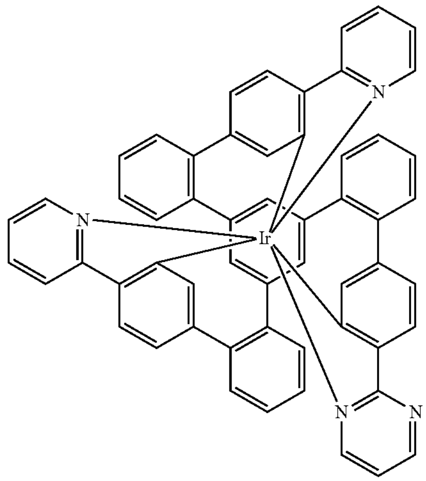 |
| Ref12 see WO 2016/124304 |
| 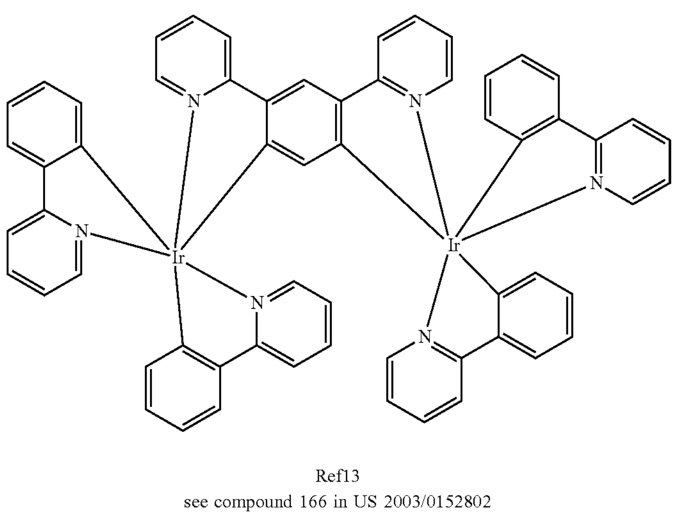 |
| Ref13 see compound 166 in US 2003/0152802 |

-continued
| Complex |
|---|
| 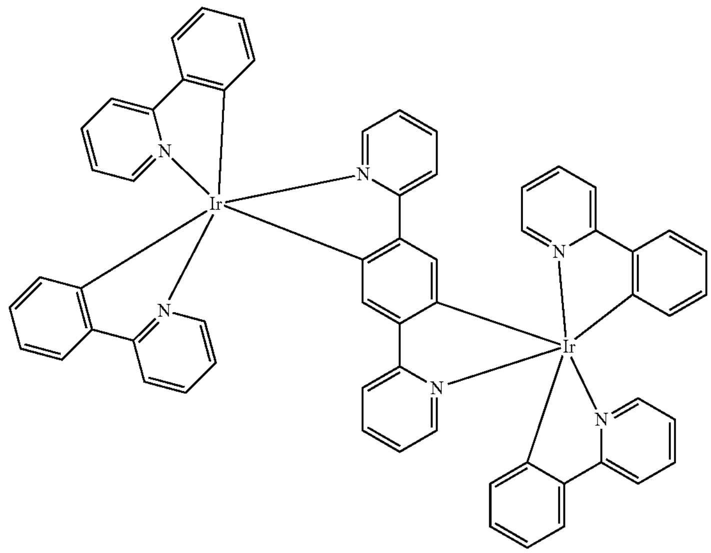 |
| Ref14 [501097-40-1] |
| 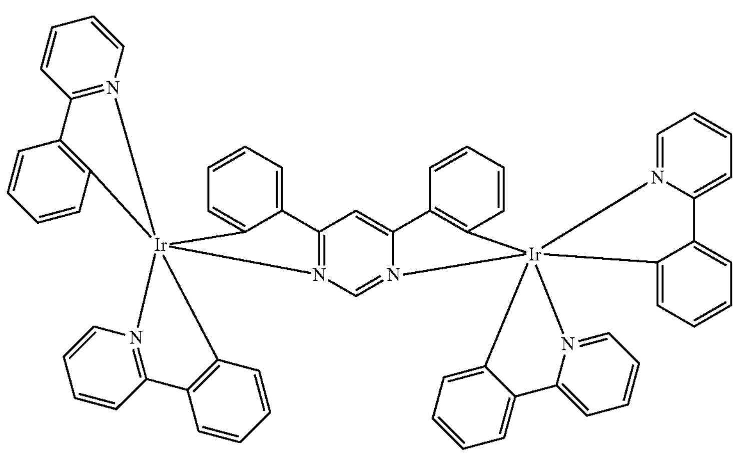 |
| Ref15 |

-continued

| Complex |
|---|
| 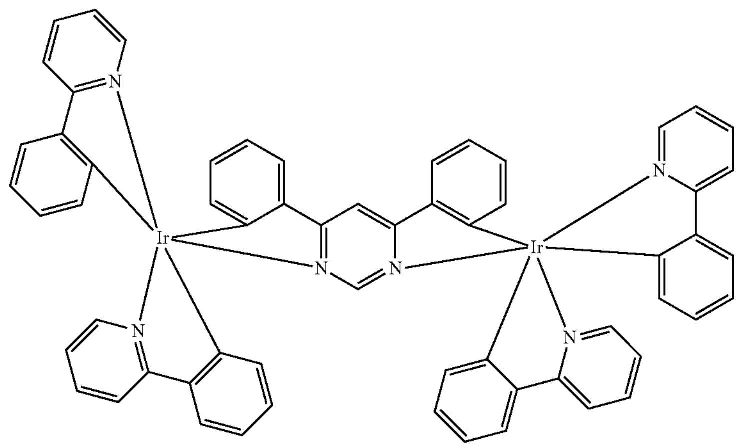 |
| Ref16 |

*Ref6 and Ref7 form a diastereomer pair, as do Ref9 and Ref10.

TABLE 1

| Complex | HOMO [eV] LUMO [eV] | PL-max [nm] FWHM [nm] | PLQE Solvent | Decay time $_T$ [µS] | Therm. stability Photochem. stab. |
|---|---|---|---|---|---|
| Comparative examples, structures see Table 13 | | | | | |
| Ref1 | −4.96 | 619 | 0.80 | 0.71 | Decomposition |
| | −2.60 | 48 | Toluene | | Decomposition |
| Ref2 | −5.21 | 605 | 0.84 | 0.70 | No decomp. |
| | −2.80 | 49 | Toluene | | No decomp. |
| Ref 3 | −5.18 | 595 | 0.82 | 0.72 | Decomposition |
| | −2.70 | 63 | Toluene | | Decomposition |
| Ref 4 | −5.00 | 615 | 0.86 | 1.38 | Decomposition |
| | −2.32 | 55 | Toluene | | Decomposition |
| Ref5 | −5.17 | 599 | 0.86 | 0.75 | No decomp. |
| | −2.70 | 51 | Toluene | | No decomp. |
| Ref6*[1] | −5.25 | 606 | 0.61 | 0.18 | — |
| | −2.59 | — | DCM | | — |
| Ref7*[1] | −5.30 | 607 | 0.49 | 0.18 | — |
| | −2.64 | — | DCM | | — |
| Ref8*[1] | −5.45 | 525 | 0.99 | 1.02 | — |
| | −2.51 | — | DCM | | — |
| Ref9*[2] | — | 622 | 0.65 | 0.75 | — |
| | | — | DCM | | — |
| Ref10*[2] | — | 625 | 0.65 | 0.73 | — |
| | | — | DCM | | — |
| Ref11 | — | 520 | 0.98 | 1.65 | No decomp. |
| | — | 64 | Toluene | | No decomp. |
| Ref12 | −5.11 | 528 | 0.81 | 1.6 | No decomp. |
| | −2.24 | 70 | Toluene | | No decomp. |
| Ref13 | — | 570 | — | — | Decomp. |
| | — | 69 | — | | Decomp. |
| Ref14* | — | 651 | 0.67 | — | Decomp. |
| | — | 52 | Toluene | | Decomp. |

TABLE 1-continued

| Complex | HOMO [eV] LUMO [eV] | PL-max [nm] FWHM [nm] | PLQE Solvent | Decay time $_T$ [µS] | Therm. stability Photochem. stab. |
|---|---|---|---|---|---|
| Ref15 | −5.12 | 607 | 0.84 | | Decomp. |
| | −2.52 | 65 | Toluene | | Decomp. |
| Ref16 | −5.10 | 603 | 0.85 | | Decomp. |
| | −2.55 | 67 | Toluene | | Decomp. |
| Examples according to the invention | | | | | |
| I1-$Ir_2$(L1) | −5.12 | 608 | 0.91 | 0.43 | No decomp. |
| | −2.56. | 58 | Toluene | | No decomp. |
| I2-$Ir_2$(L1) | −5.11 | 609 | 0.92 | 0.41 | No decomp. |
| | −2.63 | 56 | Toluene | | No decomp. |
| I1-$Ir_2$(L75) | −5.08 | 626 | 0.90 | 0.53 | No decomp. |
| | −2.48 | 49 | Toluene | | |
| I2-$Ir_2$(L75) | | 614 | 0.85 | 0.49 | No decomp. |
| | | 52 | Toluene | | |
| $Ir_2$100 | −5.09 | 612 | 0.93 | 0.39 | — |
| | −2.53 | 45 | Toluene | | — |
| I1-$Ir_2$(L16) | — | 576 | — | — | — |
| | — | 61 | — | | — |
| I1-$Ir_2$(L44) | — | 601 | — | — | — |
| | — | 54 | — | | — |
| $Ir_3$(L53) | — | 626 | — | — | — |
| | — | 43 | — | | — |
| I2-$Ir_2$(L23) | — | 672 | — | — | — |
| | — | 41 | | | — |
| $Ir_2$101 | — | 617 | — | — | — |
| | — | 44 | | | — |
| I1-$Ir_2$(L66) | — | 602 | — | — | — |
| | — | 49 | | | — |
| $Ir_2$(L59) | — | 613 | — | — | — |
| | — | 48 | | | — |
| $Ir_2$(L60) | — | 682 | — | — | — |
| | — | 62 | | | — |
| I1-$Ir_2$(L76) | — | 621 | — | — | — |
| | — | 71 | | | |

TABLE 1-continued

| Complex | HOMO [eV] LUMO [eV] | PL-max [nm] FWHM [nm] | PLQE Solvent | Decay time $\tau$ [µS] | Therm. stability Photochem. stab. |
|---|---|---|---|---|---|
| I2-$Ir_2$(L76) | — <br> — | 619 <br> 66 | — | — | — |

*[1]Values from Inorg. Chem., 2016, 55, 1720-1727.
*[2]Values from Chem. Commun, 2014, 50, 6831.
Legend:
Therm. stab. (thermal stability):
Storage in ampules sealed in vacuo, 7 days at 380° C. Visual assessment for colour change/brown coloration/ashing and analysis by means of $^1$H-NMR spectroscopy.
Photo. stab. (photochemical stability):
Irradiation of approx. 1 mmolar solution in anhydrous $C_6D_6$ (degassed and sealed NMR tubes) with blue light (about 455 nm, 1.2 W Lumispot from Dialight Corporation, USA) at room temperature.
PL-max.:
Maximum of the PL spectrum in nm of a degassed, approx. $10^{-5}$ molar solution at room temperature, excitation wavelength 370 nm, solvent: see PLQE column.
FWHM:
Full width at half maximum of the PL spectrum in nm at room temperature.
PLQE:
Absolute photoluminescence quantum efficiency of a degassed, approx. $10^{-5}$ molar solution in the solvent indicated at room temperature, measured as absolute value via Ulbricht sphere.
Decay time:
Determination of the $T_1$ lifetime by time correlated single photon counting of a degassed $10^{-5}$ molar solution in toluene at room temperature.
HOMO, LUMO:
Value in eV vs. vacuum, determined in dichloromethane solution (oxidation) or THF (reduction) with internal ref. ferrocene (−4.8 eV vs. vacuum).

DEVICE EXAMPLES

Example 1: Production of OLEDs

The complexes according to the invention can be processed from solution. The production of fully solution-based OLEDs has already been described many times in the literature, for example in WO 2004/037887 by means of spin coating. The production of vacuum-based OLEDs has likewise already been described many times, inter alia in WO 2004/058911. In the examples discussed below, layers applied on a solution basis and layers applied on a vacuum basis are combined within an OLED, so that the processing up to and including the emission layer is carried out from solution and the processing in the subsequent layers (hole-blocking layer and electron-transport layer) is carried out from vacuum. For this purpose, the general processes described previously are adapted to the circumstances described here (layer-thickness variation, materials) and combined. The general structure is as follows: substrate/ITO (50 nm)/hole-injection layer (HIL)/hole-transport layer (HTL)/emission layer (EML)/hole-blocking layer (HBL)/electron-transport layer (ETL)/cathode (aluminium, 100 nm). The substrate used is glass plates which have been coated with structured ITO (indium tin oxide) in a thickness of 50 nm. For better processing, these are coated with PEDOT:PSS (poly(3,4-ethylenedioxy-2,5-thiophene): polystyrene sulfonate, purchased from Heraeus Precious Metals GmbH & Co. KG, Germany). PEDOT:PSS is applied by spin-coating from water in air and subsequently dried by heating in air at 180° C. for 10 minutes in order to remove residual water. The hole-transport layer and the emission layer are applied to these coated glass plates. The hole-transport layer used is crosslinkable. A polymer having the structures depicted below is used, which can be synthesised in accordance with WO 2010/097155 or WO 2013/156130:

HTL-1

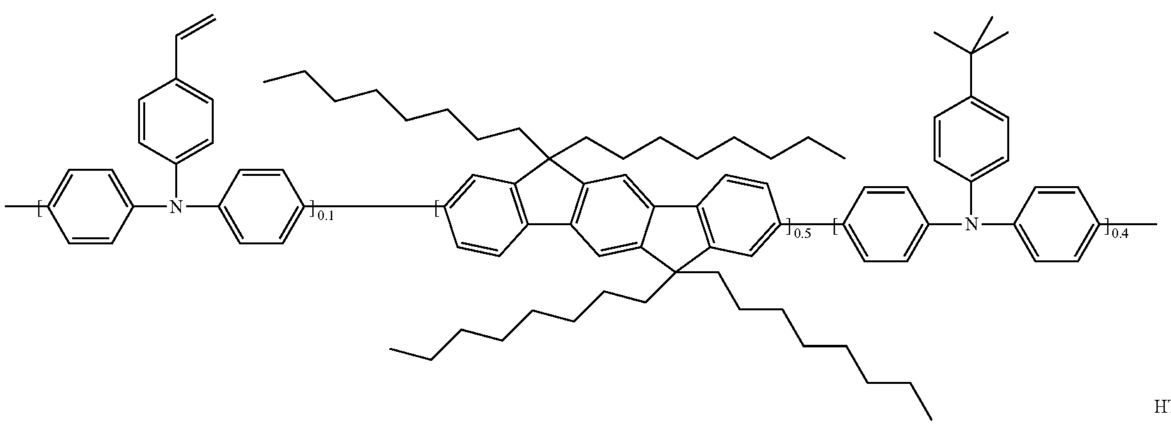

HTL-2

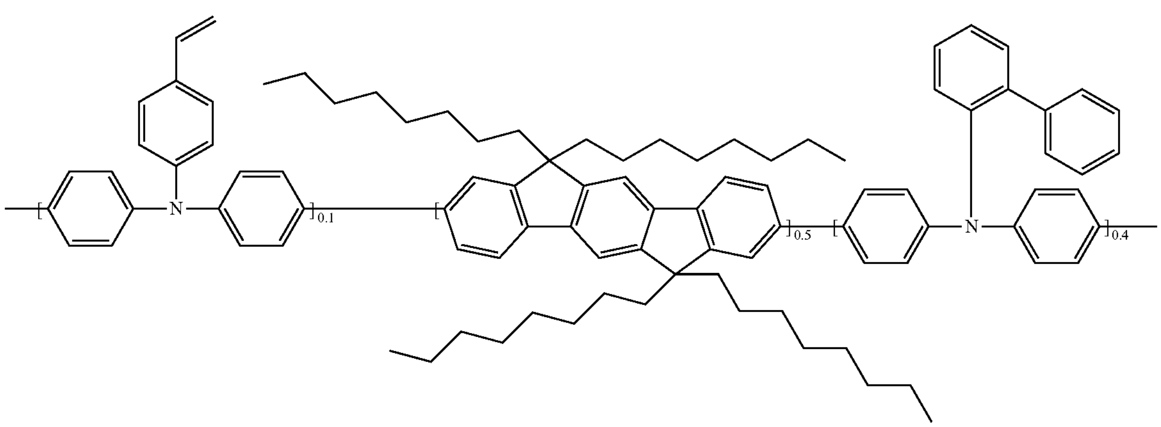

The hole-transport polymer is dissolved in toluene. The typical solids content of such solutions is approx. 5 g/l if, as here, the typical layer thickness of 20 nm for a device is to be achieved by means of spin coating. The layers are applied by spin coating in an inert-gas atmosphere, in the present case argon, and dried at 180° C. for 60 minutes.

The emission layer is always composed of at least one matrix material (host material) and an emitting dopant (emitter). Furthermore, mixtures of a plurality of matrix materials and co-dopants can be used. An expression such as TMM-A (92%): dopant (8%) here means that the material TMM-A is present in the emission layer in a proportion by weight of 92% and the dopant is present in the emission layer in a proportion by weight of 8%. The mixture for the emission layer is dissolved in toluene or optionally chlorobenzene. The typical solids content of such solutions is approx. 17 g/l if, as here, the typical layer thickness of 60 nm for a device is to be achieved by means of spin coating. The layers are applied by spin coating in an inert-gas atmosphere, in the present case argon, and dried by heating at 150° C. for 10 minutes. The materials used in the present case are shown in Table 2.

TABLE 2

EML materials used

A-1

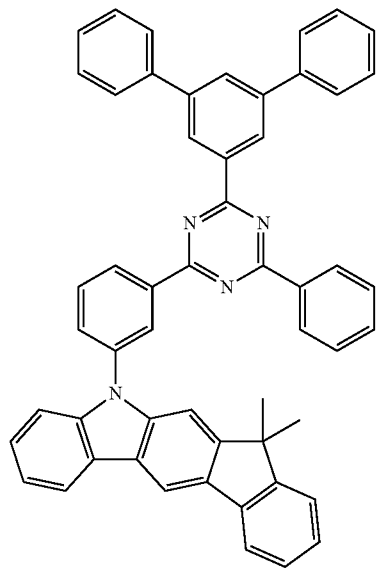

[1616231-83-4]

A-2

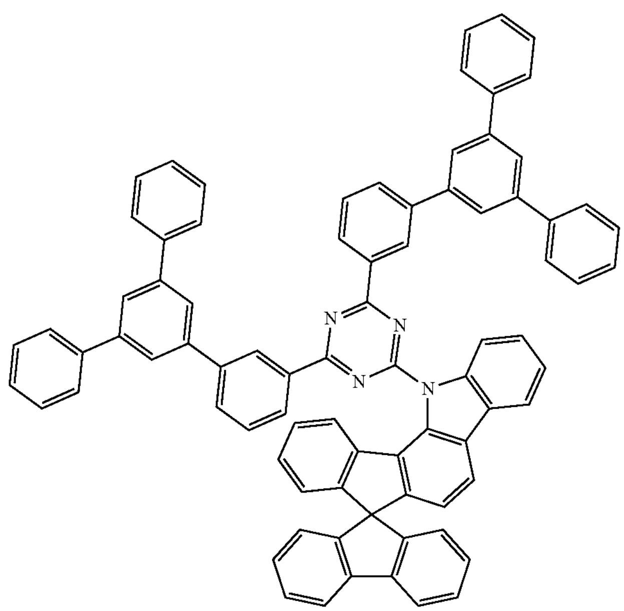

see WO14094963

TABLE 2-continued
| EML materials used |
| --- |
B-1
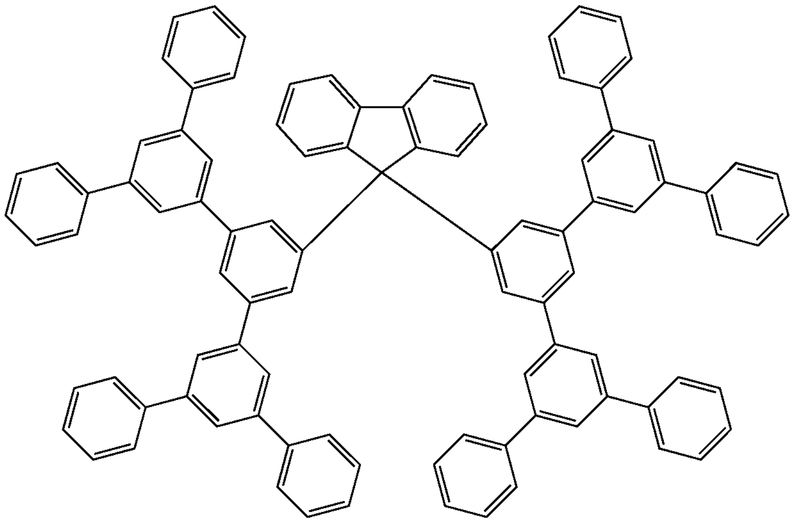
[1257248-89-7]
B-2
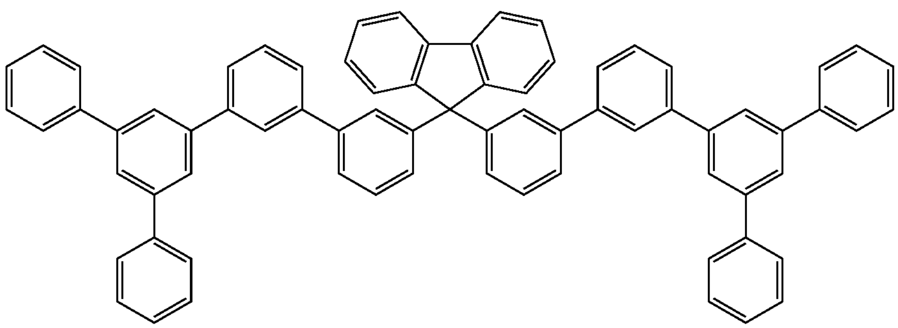
[2047361-36-2]
B-3
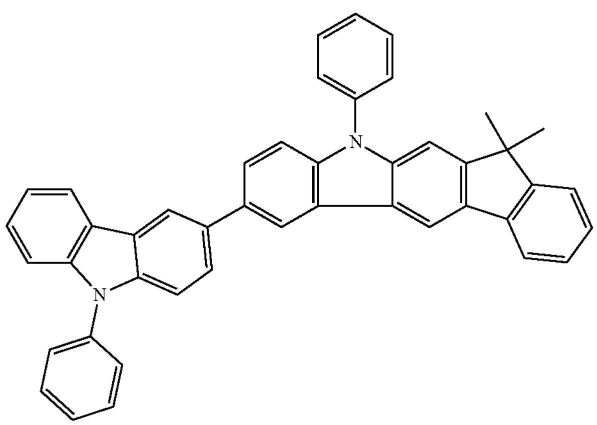
[1357150-54-99]

TABLE 2-continued
| EML materials used |
|---|
B-4
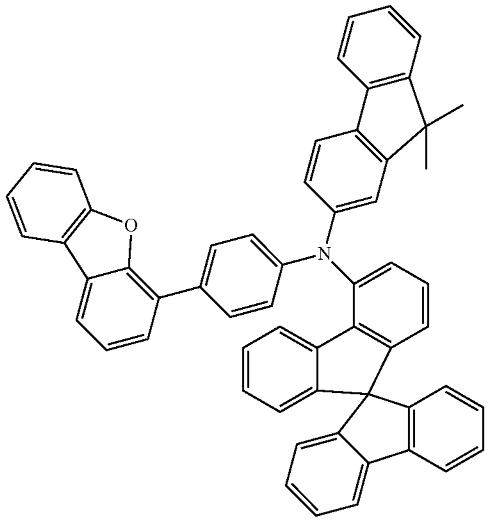
1906885-65-1
C-1
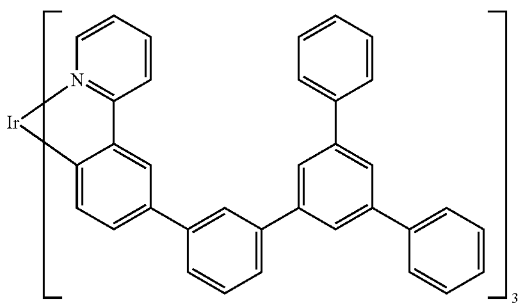
[1269508-30-6]
C-2
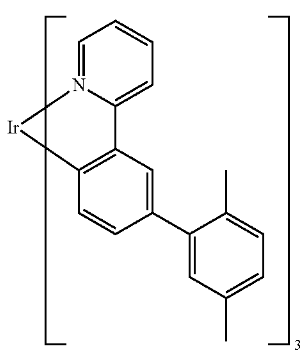
[1338784-40-9]

TABLE 2-continued

| EML materials used |
| --- |
| C-3 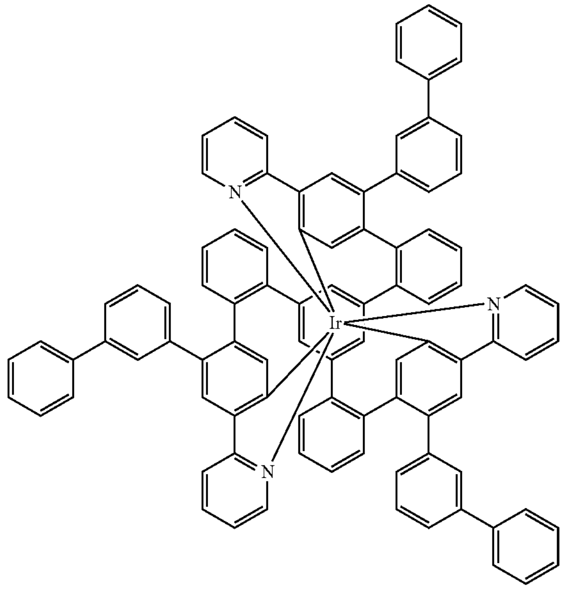 see WO 2016/124304 |

The materials for the hole-blocking layer and electron-transport layer are applied by thermal vapour deposition in a vacuum chamber. The electron-transport layer here may, for example, consist of more than one material which are admixed with one another in a certain proportion by volume by co-evaporation. An expression such as ETM1:ETM2 (50%:50%) here means that the materials ETM1 and ETM2 are present in the layer in a proportion by volume of 50% each. The materials used in the present case are shown in Table 3.

TABLE 3

| HBL and ETL materials used |
| --- |
| ETM1 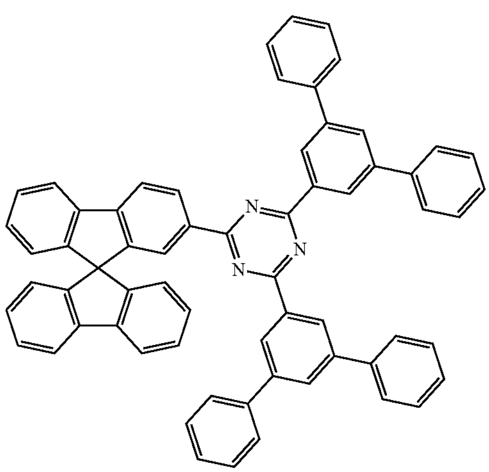 [1233200-52-6] |

TABLE 3-continued

| HBL and ETL materials used |
| --- |
| ETM2 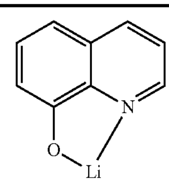 [25387-93-3] |
| ETM3 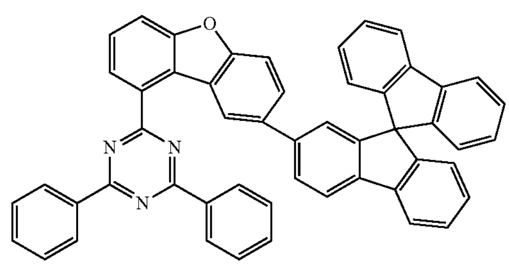 [1822310-88-29] |

The cathode is formed by thermal evaporation of a 100 nm aluminium layer. The OLEDs are characterised by standard methods. For this purpose, the electroluminescence spectra, current/voltage/luminous density characteristic lines (IUL characteristic lines), assuming Lambert emission characteristics, and the (operating) lifetime are determined. The IUL characteristic lines are used to determine characteristic numbers such as the operating voltage (in V) and the efficiency (cd/A) at a certain brightness. The electroluminescence spectra are measured at a luminous density of 1000 cd/m$^2$, and the CIE 1931 x and y colour coordinates are calculated therefrom. The EML mixtures and structures of the OLED components investigated are shown in Table 4 and Table 5. The associated results can be found in Table 6.

TABLE 4

| EML mixtures of the OLED components investigated | | | | | | | | | | |
|---|---|---|---|---|---|---|---|---|---|---|
| | Matrix A | | Co-matrix B | | Co-dopant C | | Dopant D | | Further co-matrix B | |
| Ex. | Material | % | Material | % | Material | % | Material | % | Material | % |
| V1 | A-2 | 30 | B-1 | 47 | C-1 | 17 | Ref1 | 6 | — | — |
| V2 | A-2 | 30 | B-1 | 45 | C-1 | 17 | Ref1 | 8 | — | — |
| V3 | A-2 | 30 | B-1 | 34 | C-1 | 30 | Ref2 | 6 | — | — |
| E-1 | A-2 | 30 | B-1 | 47 | C-1 | 17 | I1-$Ir_2$(L1) | 6 | — | — |
| E-2 | A-2 | 30 | B-1 | 45 | C-1 | 17 | I1-$Ir_2$(L1) | 8 | — | — |
| E-3 | A-2 | 30 | B-1 | 47 | C-1 | 17 | I2-$Ir_2$(L1) | 6 | — | — |
| E-4 | A-2 | 30 | B-1 | 47 | C-1 | 17 | $Ir_2$100 | 6 | — | — |
| E-5 | A-2 | 30 | B-1 | 47 | C-1 | 17 | I1-$Ir_2$(L44) | 6 | — | — |
| E-6 | A-2 | 30 | B-1 | 47 | C-2 | 17 | $Ir_3$(L53) | 6 | — | — |
| E-7 | A-2 | 30 | B-1 | 45 | C-1 | 17 | $Ir_2$101 | 8 | — | — |
| E-8 | A-2 | 30 | B-1 | 47 | C-2 | 17 | I1-$Ir_2$(L66) | 6 | — | — |
| E-9 | A-2 | 30 | B-1 | 47 | C-1 | 17 | $Ir_2$(L59) | 6 | — | — |
| V4 | A-1 | 40 | B-1 | 45 | — | — | Ref1 | 15 | — | — |
| V5 | A-1 | 40 | B-1 | 55 | — | — | Ref2 | 5 | — | — |
| E-10 | A-1 | 40 | B-1 | 45 | — | — | I1-$Ir_2$(L1) | 15 | — | — |
| E-11 | A-1 | 40 | B-1 | 45 | — | — | I2-$Ir_2$(L1) | 15 | — | — |
| E-12 | A-1 | 40 | B-1 | 45 | — | — | $Ir_2$100 | 15 | — | — |
| E-13 | A-1 | 40 | B-1 | 55 | — | — | I1-$Ir_2$(L44) | 5 | — | — |
| E-14 | A-1 | 40 | B-1 | 45 | — | — | I1-$Ir_2$(L16) | 15 | — | — |
| E-15 | A-1 | 40 | B-1 | 45 | — | — | I1-$Ir_2$(L66) | 15 | — | — |
| E-16 | A-1 | 40 | B-1 | 45 | — | — | $Ir_2$(L59) | 15 | — | — |
| E-17 | A-2 | 30 | B-1 | 47 | C-3 | 17 | I1-$Ir_2$(L1) | 6 | — | — |
| E-18 | A-2 | 30 | B-1 | 47 | C-1 | 17 | Ref14 | 6 | — | — |
| E-19 | A-1 | 40 | B-1 | 45 | — | — | Ref13 | 15 | — | — |
| E-20 | A-2 | 40 | B-1 | 40 | — | — | Ir2(100) | 20 | — | — |
| E-21 | A-2 | 40 | B-1 | 40 | — | — | I1-$Ir_2$(L75) | 20 | — | — |
| E-22 | A-2 | 30 | B-1 | 47 | — | — | I2-$Ir_2$(L75) | 6 | — | — |
| E-23 | A-2 | 30 | B-1 | 37 | C-1 | 25 | I1-$Ir_2$(L75) | 8 | — | — |
| E-24 | A-2 | 30 | B-1 | 40 | C-1 | 22 | I1-$Ir_2$(L75) | 8 | — | — |
| E-25 | A-2 | 30 | B-1 | 32 | C-1 | 20 | I1-$Ir_2$(L75) | 8 | B-3 | 10 |
| E-26 | A-2 | 30 | B-1 | 27 | C-1 | 20 | I1-$Ir_2$(L75) | 8 | B-4 | 15 |

TABLE 5

| Structure of the OLED components investigated | | | | | |
|---|---|---|---|---|---|
| Ex. | HIL (thickness) | HTL (thickness) | EML thickness | HBL (thickness) | ETL (thickness) |
| V1 | PEDOT (60 nm) | HTL2 (20 nm) | 60 nm | ETM-1 (10 nm) | ETM-1(50%): ETM-2(50%) (40 nm) |
| V2 | PEDOT (60 nm) | HTL2 (20 nm) | 60 nm | ETM-1 (10 nm) | ETM-1(50%): ETM-2(50%) (40 nm) |
| V3 | PEDOT (60 nm) | HTL2 (20 nm) | 60 nm | ETM-1 (10 nm) | ETM-1(50%): ETM-2(50%) (40 nm) |
| E-1 | PEDOT (60 nm) | HTL2 (20 nm) | 60 nm | ETM-1 (10 nm) | ETM-1(50%): ETM-2(50%) (40 nm) |
| E-2 | PEDOT (60 nm) | HTL2 (20 nm) | 60 nm | ETM-1 (10 nm) | ETM-1(50%): ETM-2(50%) (40 nm) |
| E-3 | PEDOT (60 nm) | HTL2 (20 nm) | 60 nm | ETM-1 (10 nm) | ETM-1(50%): ETM-2(50%) (40 nm) |
| E-4 | PEDOT (60 nm) | HTL2 (20 nm) | 60 nm | ETM-1 (10 nm) | ETM-1(50%): ETM-2(50%) (40 nm) |
| E-5 | PEDOT (60 nm) | HTL2 (20 nm) | 60 nm | ETM-1 (10 nm) | ETM-1(50%): ETM-2(50%) (40 nm) |
| E-6 | PEDOT (60 nm) | HTL2 (20 nm) | 60 nm | ETM-1 (10 nm) | ETM-1(50%): ETM-2(50%) (40 nm) |
| E-7 | PEDOT (80 nm) | HTL1 (20 nm) | 60 nm | ETM-1 (10 nm) | ETM-1(50%): ETM-2(50%) (40 nm) |

TABLE 5-continued

| Structure of the OLED components investigated | | | | | |
|---|---|---|---|---|---|
| Ex. | HIL (thickness) | HTL (thickness) | EML thickness | HBL (thickness) | ETL (thickness) |
| E-8 | PEDOT (60 nm) | HTL1 (20 nm) | 60 nm | ETM-1 (10 nm) | ETM-1(50%): ETM-2(50%) (40 nm) |
| E-9 | PEDOT (60 nm) | HTL2 (20 nm) | 60 nm | ETM-1 (10 nm) | ETM-1(50%): ETM-2(50%) (40 nm) |
| V4 | PEDOT (70 nm) | HTL1 (20 nm) | 60 nm | ETM-1 (10 nm) | ETM-1(50%): ETM-2(50%) (40 nm) |
| V5 | PEDOT (70 nm) | HTL1 (20 nm) | 60 nm | ETM-1 (10 nm) | ETM-1(50%): ETM-2(50%) (40 nm) |
| E-10 | PEDOT (70 nm) | HTL1 (20 nm) | 60 nm | ETM-1 (10 nm) | ETM-1(50%): ETM-2(50%) (40 nm) |
| E-11 | PEDOT (70 nm) | HTL1 (20 nm) | 60 nm | ETM-1 (10 nm) | ETM-1(50%): ETM-2(50%) (40 nm) |
| E-12 | PEDOT (70 nm) | HTL1 (20 nm) | 60 nm | ETM-1 (10 nm) | ETM-1(50%): ETM-2(50%) (40 nm) |
| E-13 | PEDOT (70 nm) | HTL1 (20 nm) | 60 nm | ETM-1 (10 nm) | ETM-1(50%): ETM-2(50%) (40 nm) |
| E-14 | PEDOT (70 nm) | HTL1 (20 nm) | 60 nm | ETM-1 (10 nm) | ETM-1(50%): ETM-2(50%) (40 nm) |
| E-15 | PEDOT (70 nm) | HTL1 (20 nm) | 60 nm | ETM-1 (10 nm) | ETM-1(50%): ETM-2(50%) (40 nm) |

TABLE 5-continued

| Structure of the OLED components investigated | | | | | |
|---|---|---|---|---|---|
| Ex. | HIL (thickness) | HTL (thickness) | EML thickness | HBL (thickness) | ETL (thickness) |
| E-16 | PEDOT (70 nm) | HTL1 (20 nm) | 60 nm | ETM-1 (10 nm) | ETM-1(50%): ETM-2(50%) (40 nm) |
| E-17 | PEDOT (60 nm) | HTL2 (20 nm) | 60 nm | ETM-1 (10 nm) | ETM-1(50%): ETM-2(50%) (40 nm) |
| E-18 | PEDOT (60 nm) | HTL2 (20 nm) | 60 nm | ETM-1 (10 nm) | ETM-1(50%): ETM-2(50%) (40 nm) |
| E-19 | PEDOT (70 nm) | HTL1 (20 nm) | 60 nm | ETM-1 (10 nm) | ETM-1(50%): ETM-2(50%) (40 nm) |
| E-20 | PEDOT (60 nm) | HTL2 (20 nm) | 60 nm | ETM-1 (10 nm) | ETM-1(50%): ETM-2(50%) (40 nm) |
| E-21 | PEDOT (60 nm) | HTL2 (20 nm) | 60 nm | ETM-1 (10 nm) | ETM-1(50%): ETM-2(50%) (40 nm) |
| E-22 | PEDOT (60 nm) | HTL2 (20 nm) | 60 nm | ETM-1 (10 nm) | ETM-1(50%): ETM-2(50%) (40 nm) |
| E-23 | PEDOT (60 nm) | HTL2 (20 nm) | 60 nm | ETM-1 (10 nm) | ETM-1(50%): ETM-2(50%) (40 nm) |
| E-24 | PEDOT (60 nm) | HTL2 (20 nm) | 60 nm | ETM-3 (10 nm) | ETM-1(50%): ETM-2(50%) (40 nm) |
| E-25 | PEDOT (60 nm) | HTL2 (20 nm) | 60 nm | ETM-3 (10 nm) | ETM-1(50%): ETM-2(50%) (60 nm) |
| E-26 | PEDOT (60 nm) | HTL2 (20 nm) | 60 nm | ETM-3 (10 nm) | ETM-1(50%): ETM-2(50%) (40 nm) |

TABLE 6

| Results of solution-processed OLEDs (measured at a brightness of 1000 cd/m$^2$) | | | | |
|---|---|---|---|---|
| Ex. | EQE [%] | CIE x | CIE y | LT90 @60 mA/cm$^2$ |
| V1 | 16.2 | 0.66 | 0.34 | 276 |
| V2 | 15.7 | 0.67 | 0.33 | 123 |
| V3 | 18.2 | 0.64 | 0.36 | 298 |
| E-1 | 20.0 | 0.65 | 0.35 | 359 |
| E-2 | 19.9 | 0.66 | 0.34 | 317 |
| E-3 | 18.6 | 0.66 | 0.34 | 315 |
| E-4 | 18.6 | 0.64 | 0.35 | 304 |
| E-5 | 20.1 | 0.63 | 0.37 | 277 |
| E-6 | 19.8 | 0.68 | 0.32 | 221 |
| E-7 | 18.7 | 0.68 | 0.32 | 298 |
| E-8 | 19.7 | 0.63 | 0.37 | 248 |
| E-9 | 18.4 | 0.67 | 0.33 | 199 |
| V4 | 15.0 | 0.68 | 0.33 | 70 |
| V5 | 8.6 | 0.65 | 0.35 | 34 |
| E-10 | 19.1 | 0.67 | 0.33 | 171 |
| E-11 | 18.9 | 0.67 | 0.33 | 165 |
| E-12 | 18.8 | 0.67 | 0.33 | 154 |
| E-13 | 16.7 | 0.65 | 0.35 | 93 |
| E-14 | 18.5 | 0.55 | 0.45 | 137 |
| E-15 | 19.4 | 0.65 | 0.35 | 133 |
| E-16 | 18.8 | 0.68 | 0.32 | 85 |

TABLE 6-continued

| Results of solution-processed OLEDs (measured at a brightness of 1000 cd/m$^2$) | | | | |
|---|---|---|---|---|
| Ex. | EQE [%] | CIE x | CIE y | LT90 @60 mA/cm$^2$ |
| E-17 | 19.8 | 0.65 | 0.35 | 348 |
| E18 | 10.2 | 0.71 | 0.28 | 112 |
| E-19 | 14.8 | 0.55 | 0.44 | 84 |
| E-20 | 18.2 | 0.68 | 0.32 | 16 |
| E-21 | 18.0 | 0.70 | 0.31 | 92 |
| E-22 | 13.3 | 0.65 | 0.35 | 111 |
| E-23 | 21.6 | 0.68 | 0.32 | 569 |
| E-24 | 24.6 | 0.68 | 0.32 | 493 |
| E-25 | 23.6 | 0.68 | 0.32 | 93 |
| E-26 | 23.8 | 0.68 | 0.32 | 236 |

All compounds P1 to P234 shown above and the deuterated compounds shown above can be employed analogously and lead to comparable results.

As an alternative to production by means of spin coating, the solution-processed layers can also be produced, inter alia, by means of ink-jet printing. In the examples discussed below, layers applied on a solution basis and layers applied on a vacuum basis are again combined within an OLED, so that the processing up to and including the emission layer is carried out from solution and the processing in the subsequent layers (hole-blocking layer and electron-transport layer) is carried out from vacuum. The general structure is furthermore as follows: substrate/ITO (50 nm)/hole-injection layer (HIL)/hole-transport layer (HTL)/emission layer (EML)/hole-blocking layer (HBL)/electron-transport layer (ETL)/cathode (aluminium, 100 nm). The substrate used is glass plates which have been coated with structured ITO (indium tin oxide) in a thickness of 50 nm and pixelated bank material.

The hole-injection layer is printed onto the substrate, dried in vacuo and subsequently heated at 180° C. in air for 30 minutes. The hole-transport layer is printed onto the hole-injection layer, dried in vacuo and subsequently heated at 230° C. in a glove box for 30 minutes. The emission layer is subsequently printed, dried in vacuo and heated at 160° C. in a glove box for 10 minutes. All printing steps are carried out in air under yellow light. The hole-injection material used is a composition comprising a polymer (for example polymer P2) and a salt (for example salt D1) in accordance with PCT/EP2015/002476. It is dissolved in 3-phenoxytoluene and diethylene glycol butyl methyl ether in the ratio 7:3. The hole-transport material is processed from the same solvent mixture. The emission layer is printed from pure 3-phenoxytoluene.

The EML mixtures and structures of the OLED components investigated are shown in Table 7 and Table 8. The associated results can be found in Table 9. Good pixel homogeneities are achieved.

TABLE 7

| EML mixtures of the OLED components investigated | | | | | | | | | | |
|---|---|---|---|---|---|---|---|---|---|---|
| | Matrix A | | Co-matrix B | | Co-dopant C | | Dopant D | | Further co-matrix B | |
| Ex. | Material | % | Material | % | Material | % | Material | % | Material | % |
| E-28 | A-2 | 30 | B-1 | 47 | C-1 | 17 | I1-Ir2(L1) | 6 | — | — |
| E-29 | A-2 | 40 | B-1 | 40 | — | — | I1-Ir2(L1) | 20 | — | — |
| E-30 | A-2 | 30 | B-1 | 40 | C-1 | 22 | I1-$Ir_2$(L75) | 8 | | |

TABLE 8

| Structure of the OLED components investigated | | | | | |
|---|---|---|---|---|---|
| Ex. | HIL (thickness) | HTL (thickness) | EML thickness | HBL (thickness) | ETL (thickness) |
| E-28 | HIL (60 nm) | HTL2 (20 nm) | 60 nm | ETM-1 (10 nm) | ETM-1(50%): ETM-2(50%) (40 nm) |
| E-29 | HIL (60 nm) | HTL2 (20 nm) | 60 nm | ETM-1 (10 nm) | ETM-1(50%): ETM-2(50%) (40 nm) |
| E-30 | HIL (60 nm) | HTL2 (20 nm) | 60 nm | ETM-1 (10 nm) | ETM-1(50%): ETM-2(50%) (40 nm) |

TABLE 9

| Results of solution-processed OLEDs (measured at a brightness of 1000 cd/m$^2$) | | | | |
|---|---|---|---|---|
| Ex. | EQE [%] | CIE x | CIE y | LT90 @60 mA/cm$^2$ |
| E-28 | 21.0 | 0.66 | 0.34 | 503 |
| E-29 | 19.4 | 0.67 | 0.33 | 64 |
| E-30 | 20.8 | 0.68 | 0.32 | 156 |

a) Side view of the ligand bridging the iridium centres.

b) Top view of the ligand bridging the iridium centres.

For better clarity, the hydrogen atoms are not shown.

Figure 1:
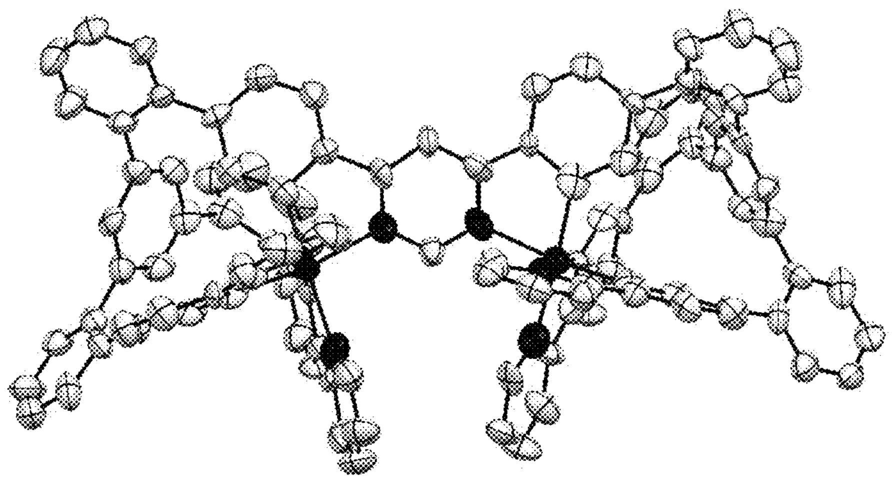
FIG. 1: Single-crystal structure of compound I2-$Ir_2$(L1) (ORTEP representation with 50% probability level)
Figure 1:
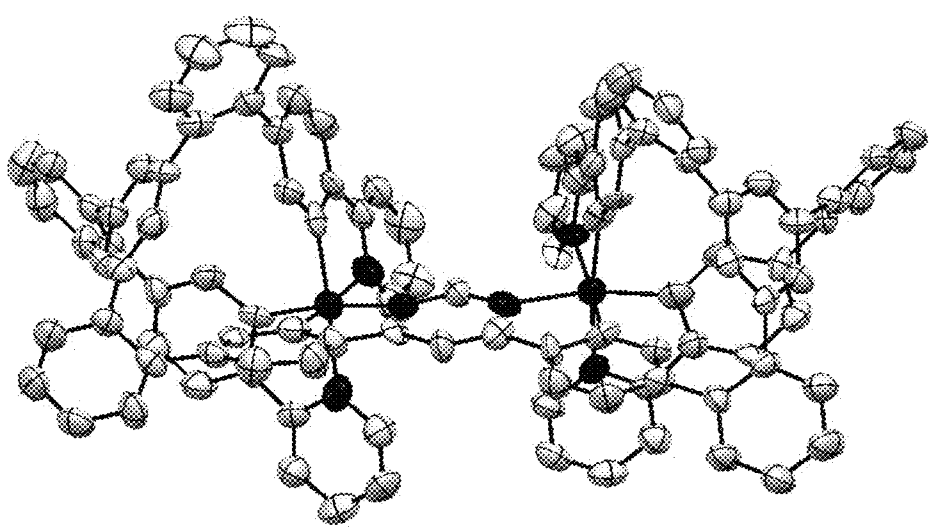
Figure 2:
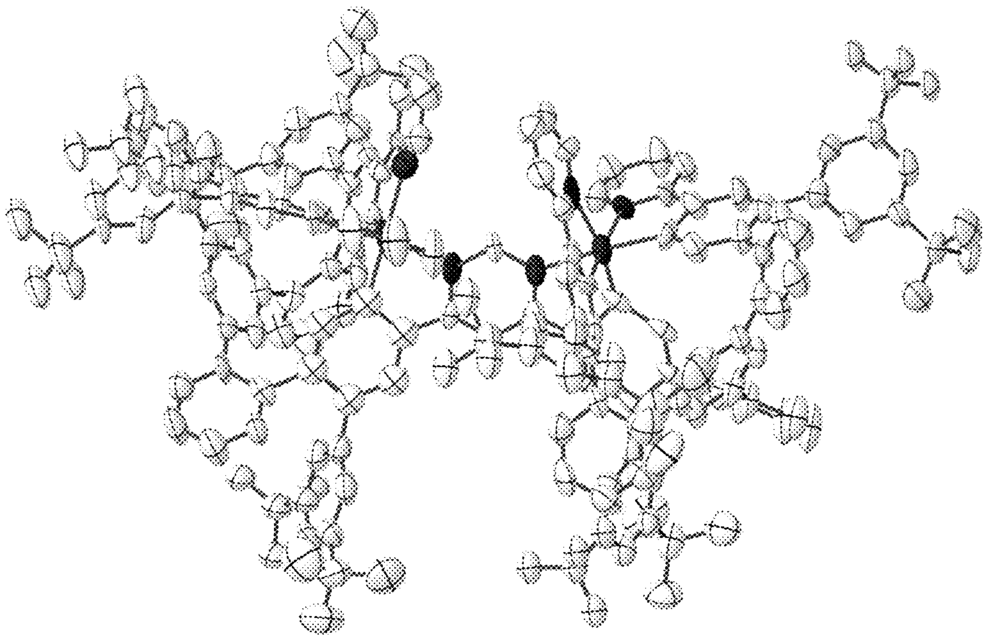
Figure 2:
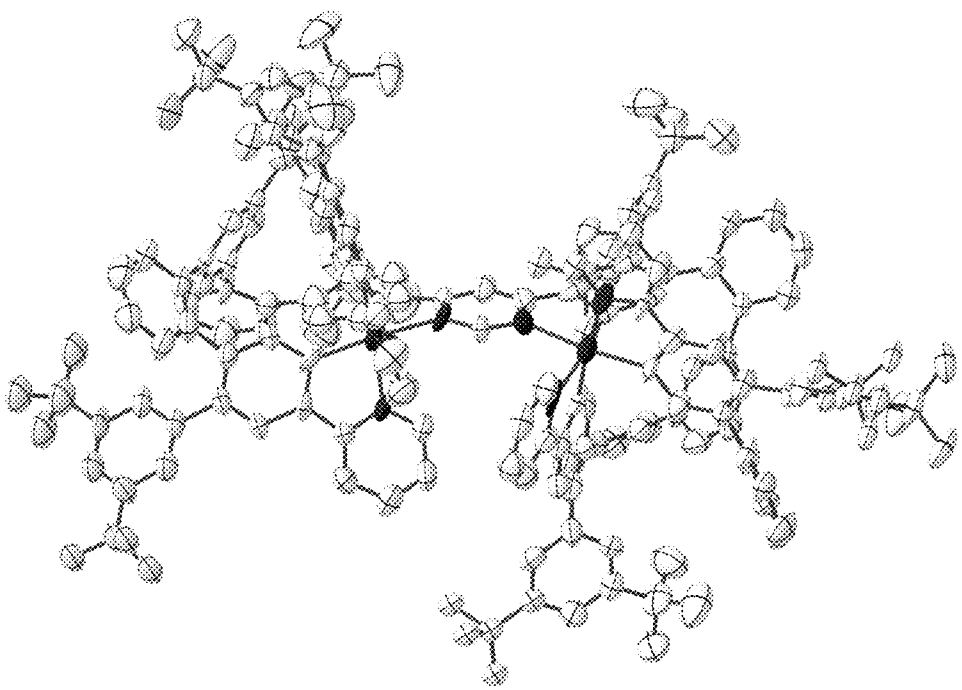

FIG. 2: Single-crystal structure of compound $Ir_{2100}$ (ORTEP representation with 50% probability level)

a) Side view of the ligand bridging the iridium centres.

b) Top view of the ligand bridging the iridium centres.

For better clarity, the hydrogen atoms are not shown.

Figure 3:
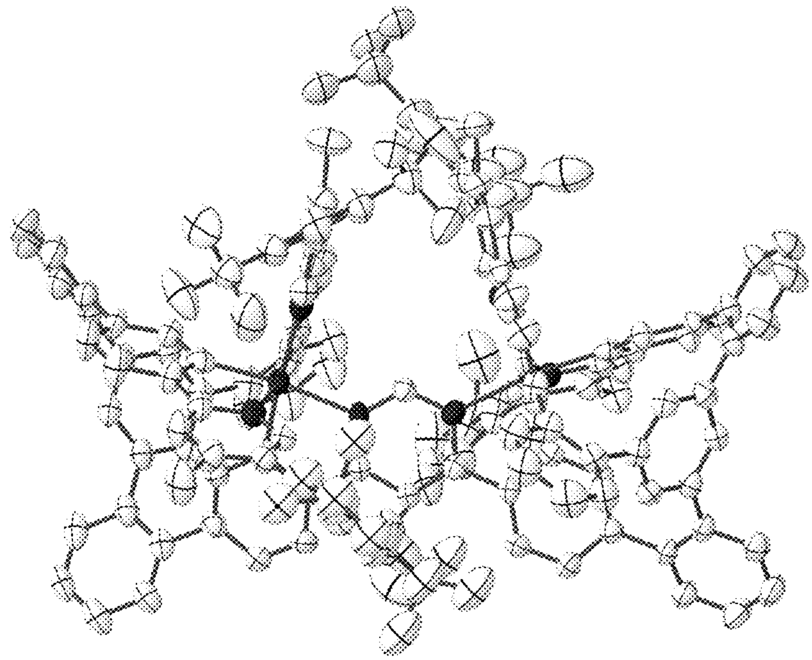
Figure 3:
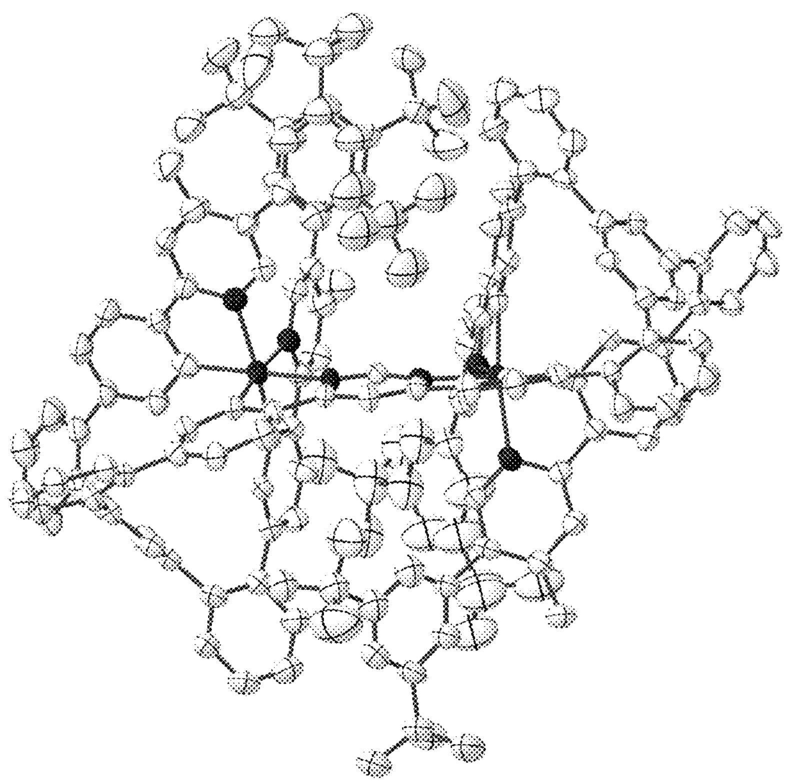

FIG. 3: Single-crystal structure of compound I1-$Ir_2$(L75) (ORTEP representation with 50% probability level)

a) Side view of the ligand bridging the iridium centres.

b) Top view of the ligand bridging the iridium centres.

For better clarity, the hydrogen atoms are not shown.

The invention claimed is:

1. A compound of formula (1) or formula (2):

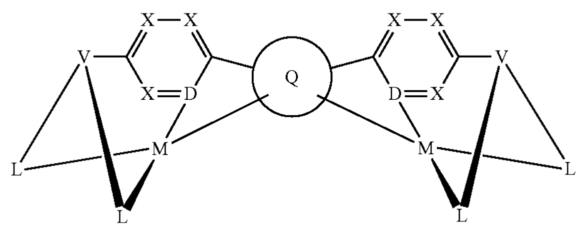

(1)

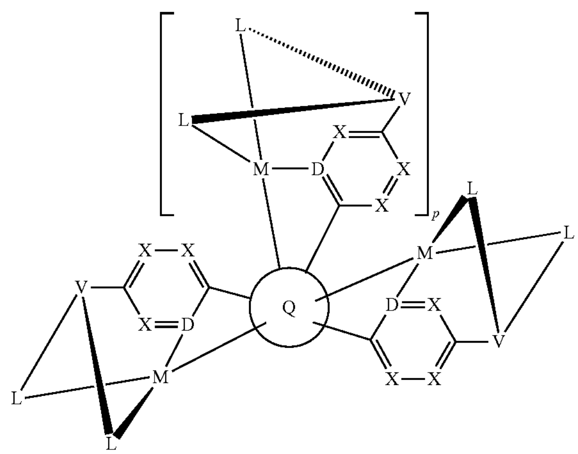

(2)

wherein

M is on each occurrence, identically or differently, iridium or rhodium;

Q is an aryl or heteroaryl group having 6 to 10 aromatic ring atoms and which is coordinated to each of the two or three M identically or differently in each case via a carbon or nitrogen atom and which is optionally substituted by one or more radicals R; and wherein the coordinating atoms in Q are not bonded in the ortho position to one another;

D is on each occurrence, identically or differently, C or N;

X is on each occurrence, identically or differently, CR or N;

p is 0 or 1;

V is on each occurrence, identically or differently, a group of formulae (3) or (4):

(3)

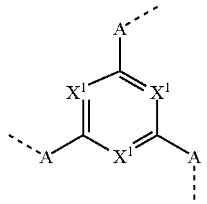

(4)

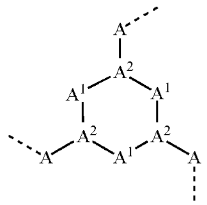

wherein one of the dashed bonds is the bond to the corresponding 6-membered aryl or heteroaryl ring group of formula (1) or (2) and the two other dashed bonds are each the bonds to part-ligands L;

L is on each occurrence, identically or differently, a bidentate, monoanionic part-ligand;

$X^1$ is on each occurrence, identically or differently, CR or N;

$A^1$ is on each occurrence, identically or differently, $C(R)_2$ or O;

$A^2$ is on each occurrence, identically or differently, CR, P(═O), B, or SiR, with the proviso that, when $A^2$ is P(═O), B, or SiR, $A^1$ is O and the A bonded to this $A^2$ is not —C(═O)—NR'— or —C(═O)—O—;

A is on each occurrence, identically or differently, —CR═CR—, —C(═O)—NR'—, —C(═O)—O—, $—CR_2—CR_2—$, $—CR_2—O—$, or a group of formula (5):

(5)

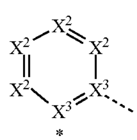

wherein the dashed bond is the position of the bond from a bidentate part-ligand L or from the corresponding 6-membered aryl or heteroaryl ring group of formula (1) or (2) to this structure and * is the position of the linking of the unit of formula (5) to the central cyclic group of formulae (3) or (4);

$X^2$ is on each occurrence, identically or differently, CR or N or two adjacent groups $X^2$ together are NR, O, or S, so as to define a five-membered ring, and the remaining $X^2$ are, identically or differently on each occurrence, CR or N; or two adjacent groups $X^2$ together are CR or N if one of the groups $X^3$ in the ring are N, so as to define a five-membered ring; with the proviso that a maximum of two adjacent groups $X^2$ are N;

$X^3$ is on each occurrence C, or one group $X^3$ is N and the other group $X^3$ in the same ring is C; with the proviso that two adjacent groups $X^2$ together are CR or N if one of the groups $X^3$ in the ring is N;

R is on each occurrence, identically or differently, H, D, F, Cl, Br, I, $N(R^1)_2$, CN, $NO_2$, $OR^1$, $SR^1$, COOH, $C(═O)N(R^1)_2$, $Si(R^1)_3$, $B(OR^1)_2$, $C(═O)R^1$, $P(═O)(R^1)_2$, $S(═O)R^1$, $S(═O)_2R^1$, $OSO_2R^1$, COO(cation), $SO_3$(cation), $OSO_3$(cation), $OPO_3(\text{cation})_2$, O(cation), $N(R^1)_3$(anion), $P(R^1)_3$(anion), a straight-chain alkyl group having 1 to 20 C atoms or an alkenyl or alkynyl group having 2 to 20 C atoms or a branched or cyclic alkyl group having 3 to 20 C atoms, wherein the alkyl, alkenyl, or alkynyl group is in each case optionally substituted by one or more radicals $R^1$, wherein one or more non-adjacent $CH_2$ groups are optionally replaced by $Si(R^1)_2$, C═O, $NR^1$, O, S, or $CONR^1$, or an aromatic or heteroaromatic ring system having 5 to 40 aromatic ring atoms, which in each case is optionally substituted by one or more radicals $R^1$; and wherein two radicals R also optionally define a ring system with one another;

R' is on each occurrence, identically or differently, H, D, a straight-chain alkyl group having 1 to 20 C atoms or a branched or cyclic alkyl group having 3 to 20 C atoms, wherein the alkyl group is in each case optionally substituted by one or more radicals $R^1$ and wherein one or more non-adjacent $CH_2$ groups are optionally replaced by $Si(R^1)_2$, or an aromatic or heteroaromatic ring system having 5 to 40 aromatic ring atoms, which is in each case optionally substituted by one or more radicals $R^1$;

$R^1$ is on each occurrence, identically or differently, H, D, F, Cl, Br, I, $N(R^2)_2$, CN, $NO_2$, $OR^2$, $SR^2$, $Si(R^2)_3$, $B(OR^2)_2$, $C(═O)R^2$, $P(═O)(R^2)_2$, $S(═O)R^2$, $S(═O)_2R^2$, $OSO_2R^2$, COO(cation), $SO_3$(cation), $OSO_3$(cation), $OPO_3(\text{cation})_2$, O(cation), $N(R^2)_3$(anion), $P(R^2)_3$(anion), a straight-chain alkyl group having 1 to 20 C atoms or an alkenyl or alkynyl group having 2 to 20 C atoms or a branched or cyclic alkyl group having 3 to 20 C atoms, wherein the alkyl, alkenyl, or alkynyl group is in each case optionally substituted by one or more radicals $R^2$, wherein one or more non-adjacent $CH_2$ groups are optionally replaced by $Si(R^2)_2$, C═O, $NR^2$, O, S, or $CONR^2$, or an aromatic or heteroaromatic ring system having 5 to 40 aromatic ring atoms, which is in each case optionally substituted by one or more radicals $R^2$; and wherein two or more radicals $R^1$ also optionally define a ring system with one another;

$R^2$ is on each occurrence, identically or differently, H, D, F, or an aliphatic, aromatic, or heteroaromatic organic radical having 1 to 20 C atoms, wherein one or more H atoms are optionally replaced by F;

cation is selected on each occurrence, identically or differently, from the group consisting of proton, deuteron, alkali metal ions, alkaline-earth metal ions, ammonium, tetraalkylammonium, and tetraalkylphosphonium; and anion is selected on each occurrence, identically or differently, from the group consisting of halides, carboxylates $R^2—COO^-$, cyanide, cyanate, isocyanate, thiocyanate, thioisocyanate, hydroxide, $BF_4^-$, $PF_6^-$, $B(C_6F_5)_4^-$, carbonate, and sulfonates.

2. The compound of claim 1, wherein the compound is selected from the group consisting of compounds of formulae (1a) and (2a):

(1a)

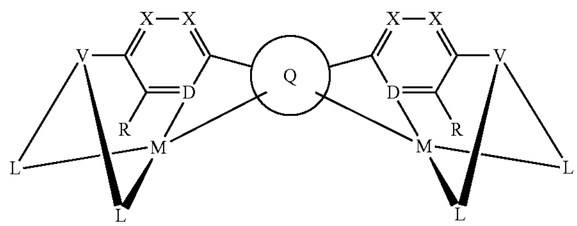

(2a)

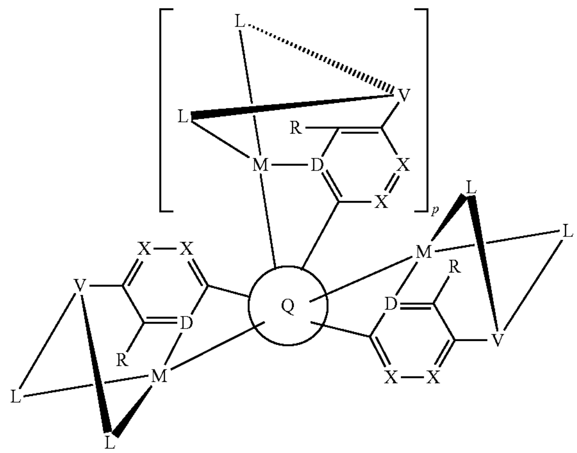

wherein the radical R in the ortho position to D is in each case selected, identically or differently on each occurrence, from the group consisting of H, D, F, $CH_3$, and $CD_3$.

3. The compound of claim 1, wherein Q in formula (1) is a group of formulae (Q-1) through (Q3) and Q in formula (2) is a group of one of formulae (Q-4) through (Q-15) when p is 0 or a group of formulae (Q-16) through (Q-19) when p is 1:

(Q-1)

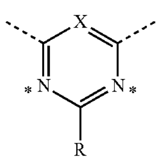

(Q-2)

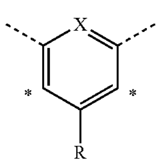

(Q-3)

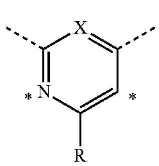

(Q-4)

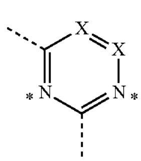

-continued (Q-5)

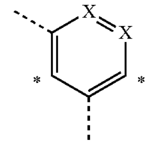

(Q-6)

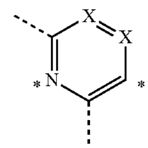

(Q-7)

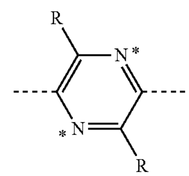

(Q-8)

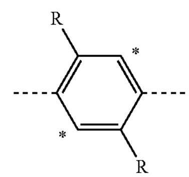

(Q-9)

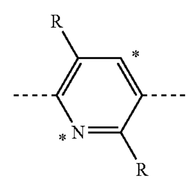

(Q-10)

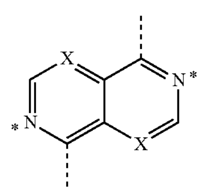

(Q-11)

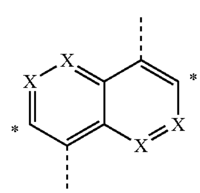

(Q-12)

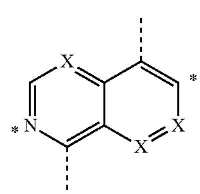

-continued (Q-13)

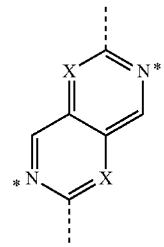

(Q-14)

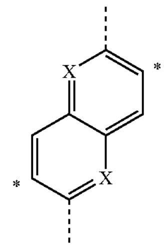

(Q-15)

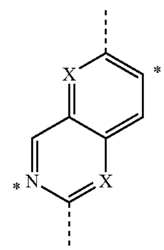

(Q-16)

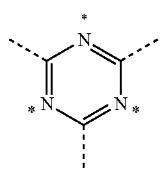

(Q-17)

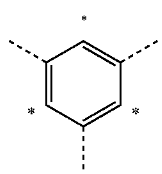

(Q-18)

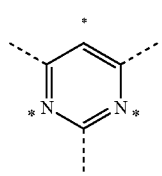

(Q-19)

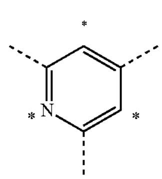

wherein the dashed bond in each case indicates the linking within the formula (1) or (2); and

* indicates the position at which the group is coordinated to M.

4. The compound of claim 1, wherein the group of formula (3) is selected from the group consisting of structures of formulae (6) through (9) and wherein the group of formula (4) is selected from group consisting of structures of formulae (10) to (14):

(6)

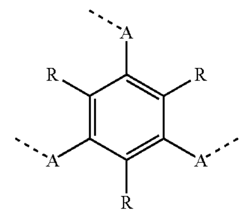

(7)

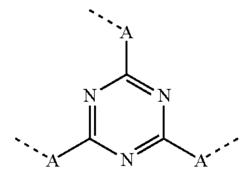

(8)

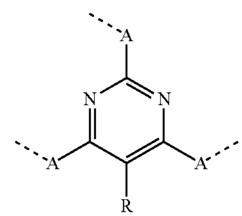

(9)

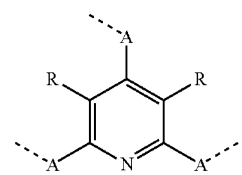

(10)

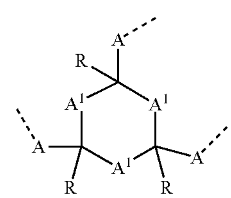

(11)

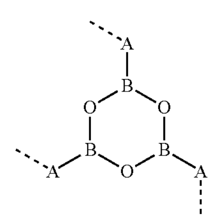

(12)

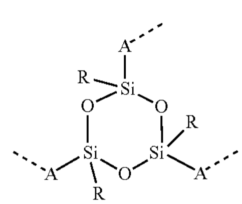

-continued (13)

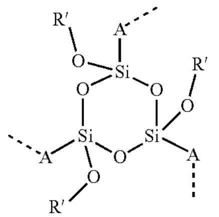

(14)

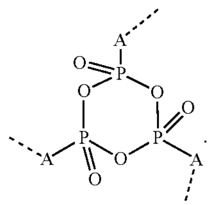

5. The compound of claim 1, wherein the group of formula (3) has a structure of formula (6') and wherein the group of formula (4) has a structure of formula (10') or (10"):

(6')

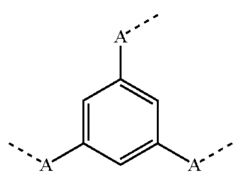

(10')

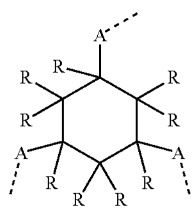

(10")

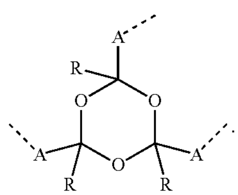

6. The compound of claim 1, wherein A is selected, identically or differently on each occurrence, from the group consisting of —C(═O)—O—, —C(═O)—NR'— or a group of formula (5), wherein the group of formula (5) is selected from the group consisting of structures of formulae (15) through (39):

(15)

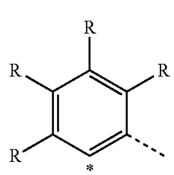

-continued (16)

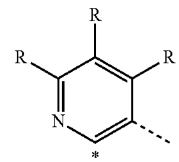

(17)

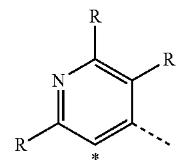

(18)

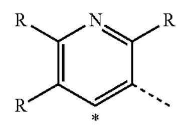

(19)

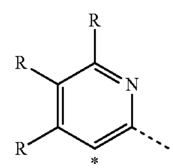

(20)

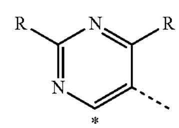

(21)

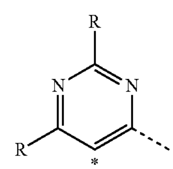

(22)

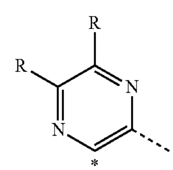

(23)

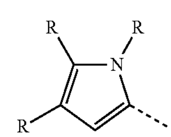

(24)

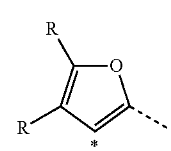

-continued
(25)
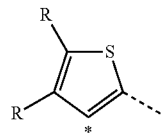
(26)
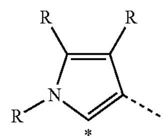
(27)
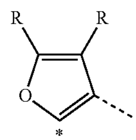
(28)
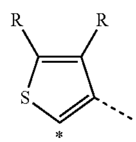
(29)
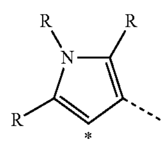
(30)
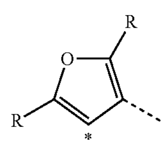
(31)
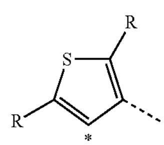
(32)
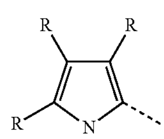
(33)
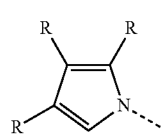
(34)
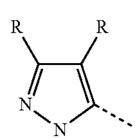
-continued
(35)
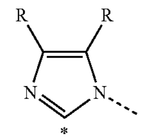
(36)
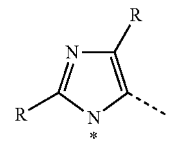
(37)
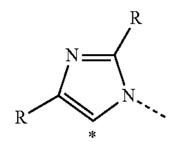
(38)
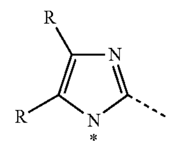
(39)
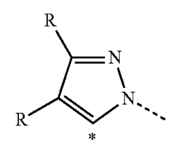
7. The compound of claim 1, wherein the group of formula (3) is selected from the group consisting of formulae (3a) through (3m) and the group of formula (4) is selected from the group consisting of formulae (4a) through (4m):
(3a)
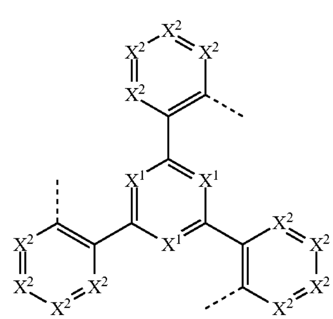
(3b)
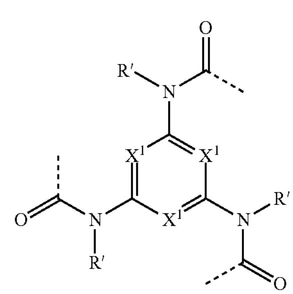

(3c)
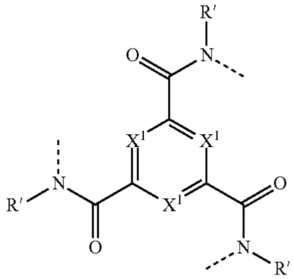
(3d)
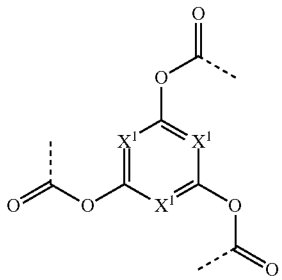
(3e)
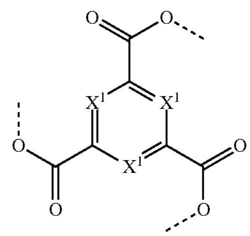
(3f)
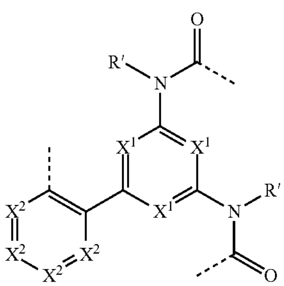
(3g)
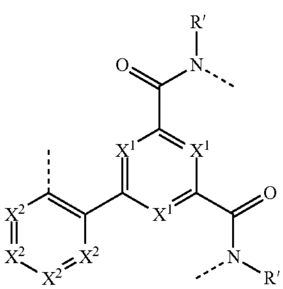
(3h)
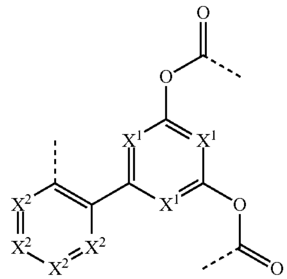
(3i)
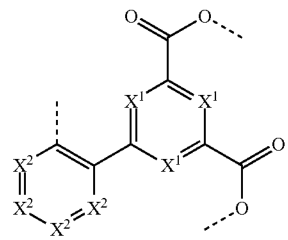
(3j)
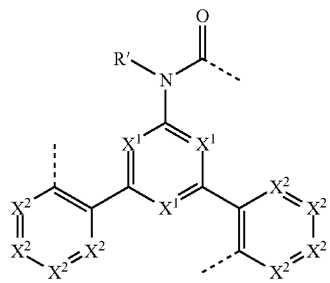
(3k)
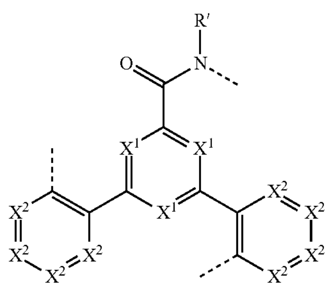
(3l)
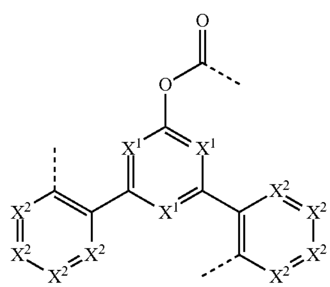
(3m)
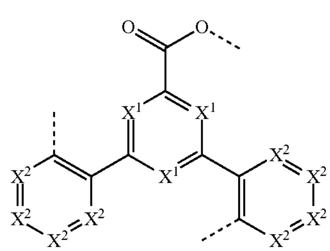

-continued
(4a)
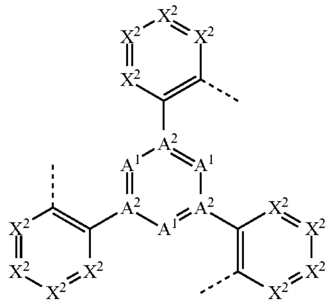
(4b)
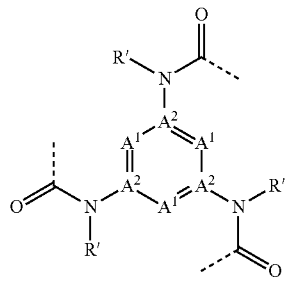
(4c)
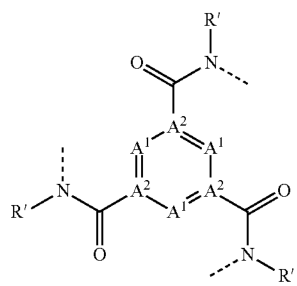
(4d)
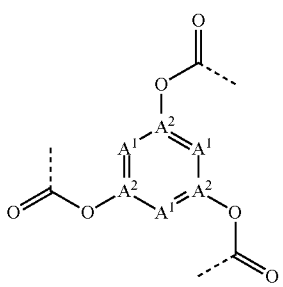
(4e)
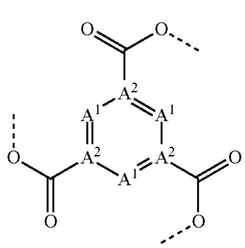
-continued
(4f)
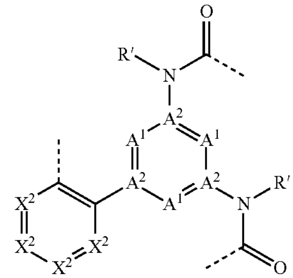
(4g)
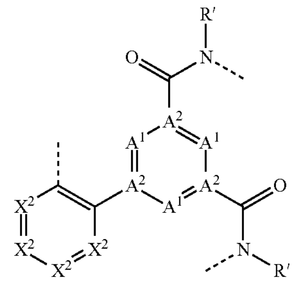
(4h)
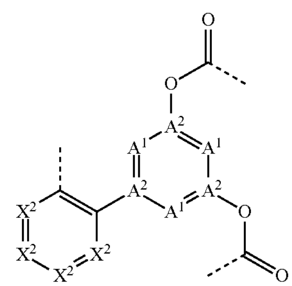
(4i)
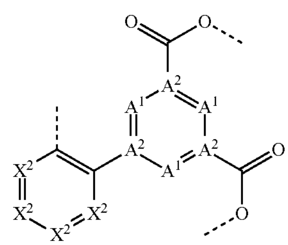
(4j)
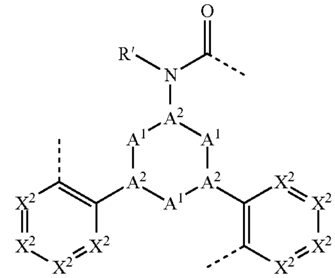

-continued (4k)

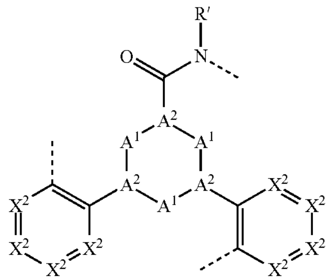

(4l)

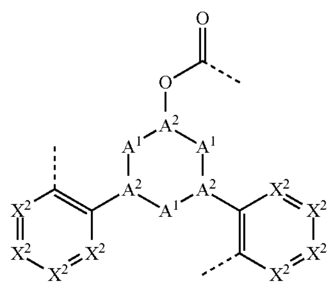

(4m)

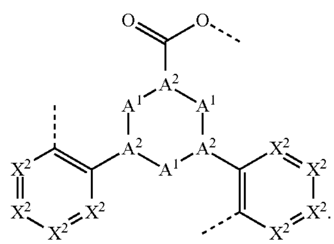

8. The compound of claim 1, wherein the group of formula (3) is a group of formula (6a'''):

(6a''')

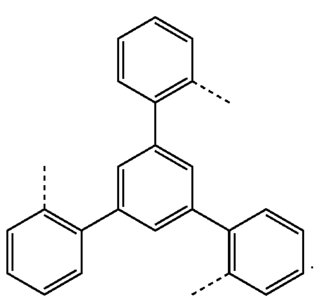

9. The compound of claim 1, wherein all four part-ligands L when p is 0 or all six part-ligands L when p is 1 are identical and are identically substituted.

10. The compound of claim 1, wherein the bidentate part-ligands L are selected, identically or differently on each occurrence, from the structures of formulae (L-1), (L-2), and (L-3):

(L-1)

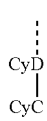

-continued (L-2)

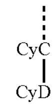

(L-3)

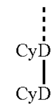

wherein the dashed bond is the bond from the part-ligand L to the group of formula (3) or (4);

CyC is, identically or differently on each occurrence, a substituted or unsubstituted aryl or heteroaryl group having 5 to 14 aromatic ring atoms, which is coordinated to M via a carbon atom and which is bonded to CyD via a covalent bond;

CyD is, identically or differently on each occurrence, a substituted or unsubstituted heteroaryl group having 5 to 14 aromatic ring atoms, which is coordinated to M via a nitrogen atom or via a carbene carbon atom and which is bonded to CyC via a covalent bond; and a plurality of the optional substituents optionally define a ring system with one another.

11. A process for preparing the compound of claim 1, comprising reacting the free ligand with metal alkoxides of formula (58), metal ketoketonates of formula (59), metal halides of formula (60), or metal carboxylates of formula (61), or with iridium or rhodium compounds which carry both alkoxide and/or halide and/or hydroxyl and ketoketonate radicals, $$M(OR)_3 \tag{58}$$

(59)

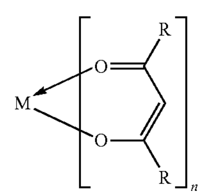

$$MHal_3 \tag{60}$$

$$M(OOCR)_3 \tag{61}$$

wherein

Hal is F, Cl, Br, or I; and the iridium and rhodium starting materials are optionally in the form of the corresponding hydrates.

12. A mixture comprising at least one compound of claim 1 and at least one further compound, in particular a host material.

13. The mixture of claim 12, wherein the at least one further compound is a host material.

14. A formulation comprising at least one mixture of 12 and at least one solvent.

15. A formulation comprising at least one compound of claim 1 and at least one solvent.

16. An electronic device comprising at least one compound of claim 1.

17. The electronic device of claim 16, wherein the electronic device is an organic electroluminescent device, wherein the at least one compound is employed as an emitting compound in one or more emitting layers of the organic electroluminescent device.

18. The compound of claim 1, wherein $R^2$ is a hydrocarbon radical.

* * * * *